US006933556B2

(12) United States Patent
Endoh et al.

(10) Patent No.: US 6,933,556 B2
(45) Date of Patent: Aug. 23, 2005

(54) SEMICONDUCTOR MEMORY WITH GATE AT LEAST PARTIALLY LOCATED IN RECESS DEFINED IN VERTICALLY ORIENTED SEMICONDUCTOR LAYER

(75) Inventors: Tetsuo Endoh, Natori (JP); Fujio Masuoka, 2-33-18, Higashikatsuyama, Aoba-ku, Sendai, Miyagi (JP); Takuji Tanigami, Fukuyama (JP); Takashi Yokoyama, Sendai (JP); Noboru Takeuchi, Fukuyama (JP)

(73) Assignees: Fujio Masuoka, Miyagi (JP); Sharp Kabushiki Kaisha, Osaka (JP)

( * ) Notice: Subject to any disclaimer, the term of this patent is extended or adjusted under 35 U.S.C. 154(b) by 269 days.

(21) Appl. No.: 10/174,903

(22) Filed: Jun. 20, 2002

(65) Prior Publication Data

US 2002/0195668 A1 Dec. 26, 2002

(30) Foreign Application Priority Data

Jun. 22, 2001 (JP) ....................................... 2001-190386
Jun. 22, 2001 (JP) ....................................... 2001-190416
Jun. 22, 2001 (JP) ....................................... 2001-190495

(51) Int. Cl.$^{7}$ .............................................. H01L 29/788
(52) U.S. Cl. ........................ 257/315; 257/316; 257/314
(58) Field of Search ................................ 257/314, 315, 257/316, 317, 318, 319, 320, 321, 322, 323, 324, 325, 326

(56) References Cited

U.S. PATENT DOCUMENTS

| | | | |
|---|---|---|---|
| 5,617,351 A | | 4/1997 | Bertin et al. |
| 5,828,602 A | | 10/1998 | Wong |
| 5,929,477 A | | 7/1999 | McAllister Burns, Jr. et al. |
| 5,990,509 A | | 11/1999 | Burns, Jr. et al. |
| 6,069,041 A | * | 5/2000 | Tanigami et al. |
| 6,107,670 A | | 8/2000 | Masuda |
| 6,114,767 A | | 9/2000 | Nagai et al. |
| 6,157,061 A | | 12/2000 | Kawata |
| 6,387,757 B1 | | 5/2002 | Chu et al. |
| 6,433,382 B1 | * | 8/2002 | Orlowski et al. |
| 6,483,136 B1 | | 11/2002 | Yoshida et al. |
| 6,501,125 B2 | | 12/2002 | Kobayashi |
| 6,593,231 B2 | | 7/2003 | Endoh et al. |
| 2002/0036308 A1 | | 3/2002 | Endoh et al. |
| 2002/0154556 A1 | | 10/2002 | Endoh et al. |
| 2002/0197868 A1 | | 12/2002 | Endoh et al. |

FOREIGN PATENT DOCUMENTS

| | | |
|---|---|---|
| JP | 8-162547 | 6/1996 |
| JP | 2877462 B2 | 1/1999 |

OTHER PUBLICATIONS

"Performance of the 3–D Pencil Flash EPROM Cell and Memory Array", Pein et al., XP000582412 IEEE Transactions, Nov. 1995, No. 11, pp. 1982–1991.

* cited by examiner

*Primary Examiner*—Nathan J. Flynn
*Assistant Examiner*—Kevin Quinto
(74) *Attorney, Agent, or Firm*—Nixon & Vanderhye P.C.

(57) ABSTRACT

A semiconductor memory comprises: a first conductivity type semiconductor substrate and one or more memory cells each constituted of an island-like semiconductor layer having a recess on a sidewall thereof, a charge storage layer formed to entirely or partially encircle a sidewall of the island-like semiconductor layer, and a control gate formed on the charge storage layer, wherein at least one charge storage layer of said one or more memory cells is partially situated within the recess formed on the sidewall of the island-like semiconductor layer.

46 Claims, 493 Drawing Sheets

SEMICONDUCTOR MEMORY WITH GATE AT LEAST PARTIALLY LOCATED IN RECESS DEFINED IN VERTICALLY ORIENTED SEMICONDUCTOR LAYER

CROSS-REFERENCES TO RELATED APPLICATIONS

This application is related to Japanese Patent Application No. 2001-190495, No. 2001-190386 and No. 2001-190416 filed on Jun. 22, 2001, whose priority is claimed under 35 USC §119, the disclosure of which is incorporated by reference in its entirety.

BACKGROUND OF THE INVENTION

1. Field of the Invention

The present invention relates to a semiconductor memory and its production process, and more particularly, the invention relates to a semiconductor memory provided with a memory transistor having a charge storage layer and a control gate, and its production process.

2. Description of Related Art

As a memory cell of an EEPROM, is known a device of a MOS transistor structure having a charge storage layer and a control gate in a gate portion, in which an electric charge is injected into and released from the charge storage layer by use of a tunnel current. In this memory cell, data “0” and “1” is stored as changes in a threshold voltage by the state of the charge in the charge storage layer. For example, in the case of an n-channel memory cell using a floating gate as the charge storage layer, when a source/drain diffusion layer and a substrate are grounded and a high positive voltage is applied to the control gate, electrons are injected from the substrate into the floating gate by a tunnel current. This injection of electrons shifts the threshold voltage of the memory cell toward positive. When the control gate is grounded and a high positive voltage is applied to the source/drain diffusion layer or the substrate, electrons are released from the floating gate to the substrate by the tunnel current. This release of electrons shifts the threshold voltage of the memory cell toward negative.

In the above-described operation, a relationship of capacity coupling between the floating gate and the control gate with capacity coupling between the floating agate and the substrate plays an important role in effective injection and release of electrons, i.e., effective writing and erasure. That is, the larger the capacity between the floating gate and the control gate, the more effectively the potential of the control gate can be transmitted to the floating gate and the easier the writing and erasure become.

With recent development in semiconductor technology, especially, in micro-patterning techniques, the size reduction and the capacity increase of memory cells of EEPROM are rapidly progressing. Accordingly, it is an important how large capacity can be ensured between the floating gate and the control gate.

For increasing the capacity between the floating gate and the control gate, it is necessary to thin a gate insulating film therebetween, to increase the dielectric constant of the gate insulating film or to enlarge an area where the floating gate opposes the control gate.

However, the thinning of the gate insulating film is limited in view of reliability of memory cells. For increasing the dielectric constant of the gate insulating film, a silicon nitride film is used as the gate insulating film instead of a silicon oxide film. This is also questionable in view of reliability and is not practical. Therefore, in order to ensure a sufficient capacity between the floating gate and the control gate, it is necessary to set a sufficient overlap area therebetween. This is, however, contradictory to the size reduction of memory cells and the capacity increase of EEPROM.

In an EEPROM disclosed by Japanese Patent No.2877462, memory transistors are formed by use of sidewalls of a plurality of pillar-form semiconductor layers arranged in matrix on a semiconductor substrate, the pillar-form semiconductor layers being separated by trenches in a lattice form. A memory transistor is composed of a drain diffusion layer formed on the top of a pillar-form semiconductor layer, a common source diffusion layer formed at the bottom of the trenches, and a charge storage layer and a control gate which are around all the periphery of the sidewall of the pillar-form semiconductor layer. The control gates are provided continuously for a plurality of pillar-form semiconductor layers lined in one direction so as to form a control gate line, and a bit line is connected to drain diffusion layers of a plurality of memory transistors lined in a direction crossing the control gate line. The charge storage layer and the control gate are formed in a lower part of the pillar-form semiconductor layer. This construction can prevent a problem in a one transistor/one cell structure, that is, if a memory cell is over-erased (a reading potential is 0 V and the threshold is negative), a cell current flows in the memory cell even if it is not selected.

With this construction, a sufficiently large capacity can be ensured between the charge storage layer and the control gate with a small area occupied. The drain regions of the memory cells connected to the bit lines are formed on the top of the pillar-form semiconductor layers and completely insulated from each other by the trenches. A device isolation region can further be decreased and the memory cells are reduced in size. Accordingly, it is possible to obtain a mass-storage EEPROM with memory cells which provide excellent writing and erasing efficiency.

The prior-art EEPROM is explained with reference to figures. FIG. 486 is a plan view of a prior-art EEPROM, and FIGS. 487(*a*) and 487(*b*) are sectional views taken on lines A–A' and B–B', respectively, in FIG. 486.

In FIG. 486, pillar-form silicon semiconductor layers 2 are columnar, that is, the top thereof is circular. However, the shape of the pillar-form silicon semiconductor layers need not be columnar. In the plan view of FIG. 486, selection gate lines formed by continuing gate electrodes of selection gate transistors are not shown for avoiding complexity of the figure.

In the prior art, is used a P-type silicon substrate 1, on which a plurality of pillar-form P-type silicon layers 2 are arranged in matrix. The pillar-form P-type silicon layers 2 are separated by trenches 3 in a lattice form and functions as memory cell regions. Drain diffusion layers 10 are formed on the top of the silicon layers 2, common source diffusion layers 9 are formed at the bottom of the trenches 3, and oxide films 4 are buried at the bottom of the trenches 3. Floating gates 6 are formed in a lower part of the silicon layers 2 with intervention of tunnel oxide films 5 so as to surround the silicon layers 2. Outside the floating gates 6, control gates 8 are formed with intervention of interlayer insulating films 7. Thus memory transistors are formed.

Here, as shown in FIGS. 486 and 487(*b*), the control gates 8 are provided continuously for a plurality of memory cells in one direction so as to form control gate lines (CG1, CG2, . . . ). Gate electrodes 32 are provided around an upper part of the silicon layers 2 with intervention of gate oxides films 31 to form the selection gate transistors, like the memory transistors. The gate electrodes 32 of the selection gate transistors, like the control gates 8 of the memory cells, are provided continuously in the same direction as that of the control gates 8 of the memory cells so as to form selection gate lines, i.e., word lines WL (WL1, WL2, . . . ).

Thus, the memory transistors and the selection gate transistors are buried in the trenches in a stacked state. The control gate lines leave end portions as contact portions 14 on the surface of silicon layers, and the selection gate lines leaves contact portions 15 on silicon layers on an end opposite to the contact portions 14 of the control gates. Al wires 13 and 16 to be control gate lines CG and the word lines WL, respectively, are contacted to the contact portion 14 and 15, respectively. At the bottom of the trenches 3, common source diffusion layers 9 of the memory cells are formed, and on the top of the silicon layers 2, drain diffusion layers 10 are formed for every memory cell. The resulting substrate with the thus formed memory cells is covered with a CVD oxide film 11, where contact holes are opened. Al wires 12 are provided which are to be bit lines BL which connects the drain diffusion layers 10 of memory cells lined in a direction crossing the word lines WL. When patterning is carried out for the control gate lines, a mask is formed of PEP on pillar-form silicon layers at an end of a cell array to leave, on the surface of the silicon layers, the contact portions 14 of a polysilicon film which connect with the control gate lines. To the contact portions 14, the Al wires 13 which are to be control gate lines are contacted by Al films formed simultaneously with the bit lines BL.

A production process for obtaining the structure shown in FIGS. 487(*a*) and 487(*b*) is explained with reference to FIGS. 488(*a*) to 491(*g*).

A P-type silicon layer 2 with a low impurity concentration is epitaxially grown on a P-type silicon substrate 1 with a high impurity concentration to give a wafer. A mask layer 21 is deposited on the wafer and a photoresist pattern 22 is formed by a known PEP process. The mask layer 21 is etched using the photoresist pattern 22 (see FIG. 488(*a*)).

The silicon layer 2 is etched by a reactive ion etching method using the resulting mask layer 21 to form trenches 3 in a lattice form which reach the substrate. Thereby the silicon layer 21 is separated into a plurality of pillar-form islands. A silicon oxide film 23 is deposited by a CVD method and anisotropically etched to remain on the sidewalls of the pillar-form silicon layers 2. By implantation of N-type impurity ions, drain diffusion layers 10 are formed on the top of the pillar-form silicon layers 2 and common source diffusion layers 9 are formed at the bottom of the trenches (see FIG. 488(*b*)).

The oxide films 23 around the pillar-form silicon layers 2 are etched away by isotropic etching. Channel ion implantation is carried out on the sidewalls of the pillar-form silicon layers 2 by use of a slant ion implantation as required. Instead of the channel ion implantation, an oxide film containing boron may be deposited by a CVD method with a view to utilizing diffusion of boron from the oxide film. A silicon oxide film 4 is deposited by a CVD method and isotropically etched to be buried at the bottom of trenches 3. Tunnel oxide films 5 are formed to a thickness of about 10 nm around the silicon layers 2 by thermal oxidation. A first-layer polysilicon film 5 is deposited and anisotropically etched to remain on lower sidewalls of the pillar-form silicon layers 2 as floating gates 6 around the silicon layers 2 (see FIG. 489(*c*)).

Interlayer insulating films 7 are formed on the surface of the floating gates 5 formed around the pillar-form silicon layers 2. The interlayer insulating films 7 are formed of an ONO film, for example. The ONO film is formed by oxidizing the surface of the floating gate 6 by a predetermined thickness, depositing a silicon nitride film by a plasma-CVD method and then thermal-oxidizing the surface of the silicon nitride film. A second-layer polysilicon film is deposited and anisotropically etched to form control gates 8 on lower parts of the pillar-form silicon layers 2 (see FIG. 489(*d*)). At this time, the control gates 8 are formed as control gate lines continuous in a longitudinal direction in FIG. 486 without need to perform a masking process by previously setting intervals between the pillar-form silicon layers 2 in the longitudinal direction at a predetermined value or less. Unnecessary parts of the interlayer insulating films 7 and underlying tunnel oxide films 2 are etched away. A silicon oxide film 111 is deposited by a CVD method and etched halfway down the trenches 3, that is, to a depth such that the floating gates 6 and control gates 8 of the memory cells are buried and hidden (see FIG. 490(*e*)).

A gate oxide film 31 is formed to a thickness of about 20 nm on exposed upper parts of the pillar-form silicon layers 2 by thermal oxidation. A third-layer polysilicon film is deposited and anisotropically etched to form gate electrodes 32 of MOS transistors (see FIG. 490(*f*)). The gate electrodes 32 are patterned to be continuous in the same direction as the control gate lines run, and form selection gate lines. The selection gate lines can be formed continuously in self-alignment, but this is more difficult than the control gates 8 of the memory cells. For, the selection gate transistors are single-layer gates while the memory transistors are two-layered gates, and therefore, the intervals between adjacent selection gates are wider than the intervals between the control gates. Accordingly, in order to ensure that the gate electrodes 32 are continuous, the gate electrodes may be formed in a two-layer polysilicon structure, a first polysilicon film may be patterned to remain only in locations to connect the gate electrodes by use of a masking process, and a second polysilicon film may be left on the sidewalls.

Masks for etching the polysilicon films are so formed that contact portions 14 and 15 of the control gate lines and the selection gate lines are formed on the top of the pillar-form silicon layers at different ends. A silicon oxide film 112 is deposited by a CVD method and, as required, is flattened. Contact holes are opened. An Al film is deposited and patterned to form Al wires 12 to be bit lines BL, Al wires 13 to be control gate lines CG and Al wires 16 to be word lines WL at the same time (see FIG. 491(*g*)).

FIG. 492(*a*) schematically shows a sectional structure of a major part of one memory cell of the prior-art EEPROM, and FIG. 492(*b*) shows an equivalent circuit of the memory cell. The operation of the prior-art EEPROM is briefly explained with reference to FIGS. 492(*a*) to 492(*b*).

For writing by use of injection of hot carriers, a sufficiently high positive potential is applied to a selected word line WL, and positive potentials are applied to a selected control gate line CG and a selected bit line BL. Thereby, a positive potential is transmitted to the drain of a memory transistor Qc to let a channel current flow in the memory transistor Qc and inject hot carriers. Thereby, the threshold of the memory cell is shifted toward positive. For erasure, 0 V is applied to a selected control gate CG and high positive potentials are applied to the word line WL and the bit line BL to release electrons from the floating gate to the drain. For erasing all the memory cells, a high positive potential may be applied to the common sources to release electrons to the sources. Thereby, the thresholds of the memory cells are shifted toward negative. For reading, the selection gate transistor is rendered ON by the word line WL and the reading potential is applied to the control gate line CG. The judgement of a "0" or a "1" is made from the presence or absence of a current.

In the case where an FN tunneling is utilized for injecting electrons, high potentials are applied to a selected control gate line CG and a selected word line WL and 0 V is applied to a selected bit line BL to inject electrons from the substrate to the floating gate.

This prior art provides an EEPROM which does not mis-operate even in an over-erased state thanks to the presence of the selection gate transistors.

The prior-art EEPROM does not have diffusion layers between the selection gate transistors Qs and the memory transistors Qc as shown in FIG. 492(*a*). For, it is hard to form the diffusion layers selectively on the sidewalls of the pillar-form silicon layers. Therefore, in the structure shown in FIGS. 487(*a*) and 487(*b*), desirably, separation oxide films between the gates of the memory transistors and the gates of the selection gate transistors are as thin as possible. In the case of utilizing the injection of hot electrons, in particular, the separation oxide films need to be about 30 to 40 nm thick for allowing a sufficient "H" level potential to be transmitted to the drain of a memory transistor. Such fine intervals cannot be practically made only by burying the oxide films by the CVD method as described above in the production process. Accordingly, desirably, the oxide films are buried in such a manner that the floating gates 6 and the control gates 8 are exposed, and thin oxide films are formed on exposed parts of the floating gates 6 and the control gates 8 simultaneously with the formation of the gate oxide films for the selection gate transistors.

Further, according to the prior art, since the pillar-form silicon layers are arranged with the bottom of the lattice-form trenches forming an isolation region and the memory cells are constructed to have the floating gates formed to surround the pillar-form silicon layers, it is possible to obtain a highly integrated EEPROM in which the area occupied by the memory cells are small. Furthermore, although the memory cells occupy a small area, the capacity between the floating gates and the control gates can be ensured to be sufficiently large.

According to the prior art, the control gates of the memory cells are formed to be continuous in one direction without using a mask. This is possible, however, only when the pillar-form silicon layers are arranged at intervals different between a longitudinal direction and a lateral direction. That is, by setting the intervals between adjacent pillar-form silicon layers in a word line direction to be smaller than the intervals between adjacent pillar-form silicon layers in a bit line direction, it is possible to obtain control gate lines that are separated in the bit line direction and are continuous in the word line direction automatically without using a mask.

In contrast, when the pillar-form silicon layers are arranged at the same intervals both in the longitudinal direction and in the lateral direction, a PEP process is required. More particularly, the second-layer polysilicon film is deposited thick, and through the PEP process to form a mask, the second-layer polysilicon film is selectively etched to remain in locations to be continuous as control gate lines. The third-layer polysilicon film is deposited and etched to remain on the sidewalls as described regarding the production process of the prior art. Even in the case where the pillar-form silicon layers are arranged at intervals different between the longitudinal direction and the lateral direction, the continuous control gate lines cannot be automatically formed depending upon the intervals of the pillar-form silicon layers. In this case, the mask process by the PEP process as described above can be used for forming the control gate lines continuous in one direction.

Although the memory cells of the prior art as described above are of a floating gate structure, the charge storage layers do not necessarily have the floating gate structure and may have a structure such that the storage of a charge is realized by a trap in a laminated insulating film, e.g., a MNOS structure.

FIG. 493 is a sectional view of a prior-art memory with memory cells of the MNOS structure, corresponding to FIG. 487(*a*). A laminated insulating film 24 functioning as the charge storage layer is of a laminated structure of a tunnel oxide film and a silicon nitride film, or of a tunnel oxide film, a silicon nitride film and further an oxide film formed on the silicon nitride film.

FIG. 494 is a sectional view of a prior-art memory in which the memory transistors and the selection gate transistors of the above-described prior art are exchanged, i.e., the selection gate transistors are formed in the lower parts of the pillar-form silicon layers 2 and the memory transistors are formed in the upper parts of the pillar-form silicon layers 2. FIG. 494 corresponds to FIG. 487(*a*). This structure in which the selection gate transistors are provided on a common source side can apply to the case where the injection of hot electrons is used for writing.

FIG. 495 shows a prior-art memory in which a plurality of memory cells are formed on one pillar-form silicon layer. Like numbers denote like components in the above-described prior-art memories and the explanation thereof is omitted.

In this memory, a selection gate transistor Qs1 is formed in the lowermost part of a pillar-form silicon layer 2, three memory transistors Qc1, Qc2 and Qc3 are laid above the selection gate transistor Qs1, and another selection gate transistor Qs2 is formed above. This structure can be obtained basically by repeating the aforesaid production process.

As described above, the prior-art techniques can provide highly integrated EEPROMs whose control gates and charge storage layers have a sufficient capacity therebetween and whose memory cells occupy a decreased area, by constructing the memory cells using memory transistors having the charge storage layers and the control gates by use of the sidewalls of the pillar-form semiconductor layers separated by the lattice-form trenches.

However, if a plurality of memory cells are connected in series on one pillar-form semiconductor layer and the thresholds of the memory cells are supposed to be the same, significant changes take place in the thresholds of memory cells at both ends of the memory cells connected in series owing to a back-bias effect of the substrate in a reading operation. In the reading operation, the reading potential is applied to the control gate lines CG and the "0" or "1" is judged from the presence of a current. For this reason, the number of memory cells connected in series is limited-in view of the performance of memories. Therefore, the production of mass-storage memories is difficult to realize.

The problem that the thresholds of memory cells are changed owing to a back-bias effect is true not only of the case where a plurality of memory cells are connected in series on one pillar-form semiconductor layer but also of the case where one memory cell is formed on one pillar-form semiconductor, depending upon variations in the back-bias effect of the substrate in an inplanar direction.

In the prior art memory, an impurity diffusion layer is not formed between memory cells on the same pillar-form semiconductor layer. However, it is preferable that an impurity diffusion layer is formed therebetween.

Furthermore, in the prior-art memories, the charge storage layers and the control gates are formed in self-alignment with the pillar-form semiconductor layers. Taking mass storage of the cell array into consideration, the pillar-form semiconductor layers are preferably formed at the minimum photoetching dimension.

In the case where the floating gates are used as the charge storage layers, the capacity coupling between the floating gates and the control gates and between the floating gates and the substrate is determined by the area of the outer periphery of the pillar-form semiconductor layers, the area of the outer periphery of the floating gate, the thickness of the tunnel oxide films insulating the floating gates from the pillar-form semiconductor layers and the thickness of the interlayer insulating films insulating the floating gates form the control gates. In the prior-art memories, the charge storage layers and the control gates are formed to surround the pillar-form semiconductor layers by utilizing the sidewalls of the pillar-form semiconductor layers in order that the capacity between the charge storage layers and the control gates is ensured to be sufficiently large. However, in the case where the pillar-form semiconductor layers are formed at the minimum photoetching dimension and the thickness of the tunnel oxide films and that of the interlayer insulating film are fixed, the capacity between the charge storage layers and the control gates is determined simply by the area of the outer periphery of the floating gates, that is, the thickness of the floating gates. Therefore, it is difficult to increase the capacity between the charge storage layers and the control gates without increasing the area occupied by the memory cells. In other words, it is difficult to increase the ratio of the capacity between the floating gates and the control gates to the capacity between the floating gates and the pillar-form semiconductor layers without increasing the area occupied by the memory cells.

Further, if transistors are formed in a direction vertical to the substrate stage by stage, there occur variations in characteristics of the memory cells owing to differences in the properties of the tunnel oxide films and differences in the profile of diffusion layers. Such differences are generated by thermal histories different stage by stage.

SUMMARY OF THE INVENTION

The present invention has been made in view of the above-mentioned problems and the following objects are intended. That is, according to the present invention, a semiconductor memory is constructed such that an electric field transmitting from the control gate to the active region of the memory cell is enhanced instead of increasing capacitance between the charge storage layer and the control gate. Device characteristics which allow high speed operation are obtained and an influence of the back-bias effect on the semiconductor memory having the charge storage layer and the control gate is reduced in order to achieve higher integration. The capacitance between the charge storage layer and the control gate is enlarged without increasing an area occupied by the memory cells. Variations in gate lengths of the memory cell transistors during the formation thereof are minimized to suppress variations in characteristics of the memory cells. The height of the island-like semiconductor layers is set smaller so that the island-like semiconductor layers are easily provided by forming a trench by etching. The open area ratio during the etching for forming the trench is reduced without increasing the area occupied by the memory cells, so that the island-like semiconductor layers are formed in an almost vertical direction with respect to the semiconductor substrate. Finally, itinerancy of thermal history of the memory cell transistors is minimized, thereby obtaining the semiconductor memory capable of suppressing variations in characteristics of the memory cells.

The present invention provides a semiconductor memory comprising:

a first conductivity type semiconductor substrate and one or more memory cells each constituted of an island-like semiconductor layer having a recess on a sidewall thereof, a charge storage layer formed to entirely or partially encircle a sidewall of the island-like semiconductor layer, and a control gate formed on the charge storage layer, wherein at least one charge storage layer of said one or more memory cells is partially situated within the recess formed on the sidewall of the island-like semiconductor layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
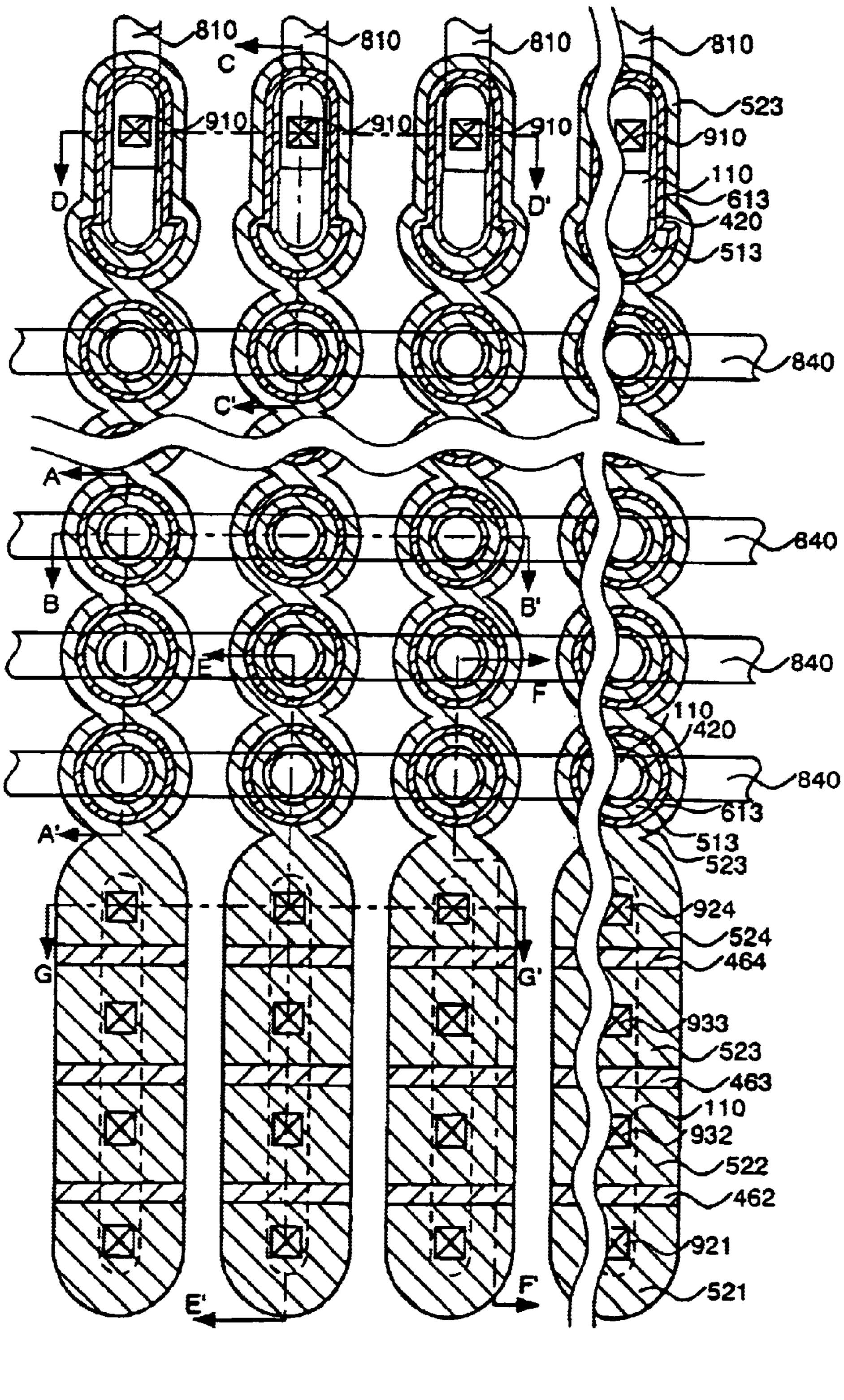
FIGS. 1 to 8 are cross-sectional views illustrating various memory cell arrays of EEPROMs having floating gates as charge storage layers in semiconductor memory devices in accordance with the present invention.

In the semiconductor memory of the present invention, a plurality of memory cells having a charge storage layer and a third electrode to be a control gate are connected in series in the direction vertical to the semiconductor substrate. The memory cells are formed on the sidewalls of a plurality of island-like semiconductor layers arranged in matrix and separated by a lattice-form trench on the semiconductor substrate. At least a part of the charge storage layer is disposed in a recess formed on the sidewall of the island-like semiconductor layer and at least a part of the control gate is disposed in a recess formed on the sidewall of the charge storage layer. Selection gate transistors having a thirteenth electrode to be a selection gate are connected to at least one end, preferably both ends of a plurality of memory cells connected in series. At least a part of the selection gate is disposed in the recess formed on the sidewall of the island-like semiconductor layer. Impurity diffusion layers formed in the island-like semiconductor layers function as sources or drains of the memory cells. The control gates have a control gate line (third wiring) which is continuous with regard to a plurality of island-like semiconductor layers in one direction and is disposed in a direction horizontal to the surface of the semiconductor substrate. A bit line (fourth wiring) is electrically connected to the impurity diffusion layers in a direction crossing the control gate line and is disposed in a direction horizontal to the surface of the semiconductor substrate.

The charge storage layer and the control gate may be formed all around the sidewall of the island-like semiconductor layer or on a part of the sidewall.

Only one memory cell or two or more memory cells may be formed on one island-like semiconductor layer. If three or more memory cells are formed, a selection gate is preferably formed below or above the memory cells to form a selection transistor together with the island-like semiconductor layer.

That "at least one of said one or more memory cells is electrically insulated from the semiconductor substrate" means that the island-like semiconductor layer is electrically insulated from the semiconductor substrate. If two or more memory cells are formed in one island-like semiconductor layer, memory cells are electrically insulated and thereby a memory cell/memory cells above an insulating site is/are electrically insulated from the semiconductor substrate. If a selection gate (memory gate) is formed below the memory cell(s), a selection transistor composed of the selection gate is electrically insulated from the semiconductor substrate or the selection transistor is electrically insulated from a memory cell and thereby a memory cell/memory cells above an insulating site is/are electrically insulated from the semiconductor substrate. It is preferably in particular that the selection transistor is formed between the semiconductor substrate and the island-like semiconductor layer or below the memory cell(s) and the selection transistor is electrically insulated from the semiconductor substrate.

Electric insulation may be made, for example, by forming a second conductivity type (different conductivity type of the semiconductor substrate) impurity diffusion layer over a region to be insulated, by forming the second conductivity type impurity diffusion layer in part of the region to be insulated and utilizing a depletion layer at a junction of the second conductivity type impurity diffusion layer, or by providing a distance not allowing electric conduction and achieving electric insulation as a result.

The semiconductor substrate may be electrically insulated from the memory cell(s) or the selection transistor by an insulating film of $SiO_2$ or the like. In the case where a plurality of memory cells are formed in one island-like semiconductor layer and selection transistors are optionally formed above or below the memory cells, the electric insulation may be formed between optional memory cells and/or a selection transistor and a memory cell.

Embodiments of Memory Cell Arrays as Shown in Cross-sectional Views

In a memory cell array of the semiconductor memory of the present invention to be described below, a plurality of memory cells having a charge storage layer and a third electrode to be a control gate are connected in series in the direction vertical to the semiconductor substrate. A plurality of memory cells, for example, two memory cells, are formed on the sidewalls of a plurality of island-like semiconductor layers arranged in matrix and separated by a lattice-form trench on the semiconductor substrate. At least a part of the charge storage layer and a part of the control gate are arranged in a recess formed on the sidewall of the island-like semiconductor layer. Impurity diffusion layers formed in the island-like semiconductor layers function as sources or drains of the memory cells. A control gate line (third wiring) is formed which is continuous with regard to a plurality of island-like semiconductor layers in one direction and is disposed in a direction horizontal to the surface of the semiconductor substrate. A bit line (fourth wiring) is formed which is electrically connected to the impurity diffusion layers in a direction crossing the control gate line and is disposed in a direction horizontal to the surface of the semiconductor substrate. Further, a selection gate line (second or fifth wiring) and a source line (first wiring) are formed. In the present invention, the control gate line and the bit line orthogonal to the control gate may be formed in any three-dimensional directions.

The above-mentioned memory cell array is described with reference to cross-sectional views shown in FIG. 1 to FIG. 9.

FIG. 1 to FIG. 8 are cross-sectional views (in a direction horizontal to the surface of the semiconductor substrate) illustrating a memory cell array of an EEPROM having floating gates as charge storage layers. FIG. 9 is cross-sectional view illustrating a memory cell array of MONOS structure having laminated insulating films as charge storage layers. The cross-sectional views shown in FIG. 1 to FIG. 9 are taken at the recess where the diameter of the island-like semiconductor layer 110 comprising the memory cell is small.

First, explanation is given of the EEPROM memory cell arrays having floating gates as charge storage layers.

In FIG. 1, island-like semiconductor layers in a columnar form for constituting memory cells are arranged to be located at intersections where a group of parallel lines and another group of parallel lines cross at right angles. First, second, third and fourth wiring layers for selecting and controlling the memory cells are disposed in parallel to the surface of the substrate, respectively.

By changing intervals between island-like semiconductor layers between an A–A' direction which crosses fourth wiring layers 840 and a B–B' direction which is parallel to the fourth wiring layers 840, second conductive films which act as the control gates of the memory cells are formed continuously in one direction, in the A–A' direction in FIG. 1, to be the third wiring layers. Likewise, second conductive films which act as the gates of the selection gate transistors are formed continuously in one direction to be the second wiring layers.

A terminal for electrically connecting with the first wiring layer disposed on a substrate side of island-like semiconductor layers is provided, for example, at an A' side end of a row of memory cells connected in the A–A' direction in FIG. 1, and terminals for electrically connecting with the second and third wiring layers are provided at an A side end of the row of memory cells connected in the A–A' direction in FIG. 1. The fourth wiring layers 840 disposed on a side of the island-like semiconductor layers opposite to the substrate are electrically connected to the island-like semiconductor layers in the columnar form for constituting memory cells. In FIG. 1, the fourth wiring layers 840 are formed in the direction crossing the second and third wiring layers.

The terminals for electrically connecting with the first wiring layers are formed of island-like semiconductor layers, and the terminals for electrically connecting with the second and third wiring layers are formed of second conductive films covering the island-like semiconductor layers, respectively.

The terminals for electrically connecting with the first, second and third wiring layers are connected to first contacts 910, second contacts 921, 924 and third contacts 932, 933, respectively. In FIG. 1, the first wiring layers 910 are lead out onto the top of the semiconductor memory via the first contacts.

The island-like semiconductor layers in the columnar form for constituting the memory cells may be not only in the form of a column but also in the form of a prism, a polygonalar prism or the like. In the case where they are patterned in columns, it is possible to avoid occurrence of local field concentration on the surface of active regions and have an easy electrical control.

The arrangement of the island-like semiconductor layers in the columnar form is not particularly limited to that shown in FIG. 1 but may be any arrangement so long as the above-mentioned positional relationship and electric connection between the wiring layers are realized.

The island-like semiconductor layers connected to the first contacts 910 are all located at the A' side ends of the memory cells connected in the A–A' direction in FIG. 1. However, they may be located entirely or partially located on the A side ends or may be located at any of the island-like semiconductor layers constituting the memory cells connected in the A–A' direction which crosses the fourth wiring layers.

The island-like semiconductor layers covered with the second conductive films connected to the second contacts 921 and 924 and the third contacts 932 and 932 may be located at the ends where the first contacts 910 are not disposed, may be located adjacently to the island-like semiconductor layers connected to the first contacts 910 at the ends where the first contacts 910 are disposed, and may be located at any of the island-like semiconductor layers constituting the memory cells connected in the A–A' direction which crosses the fourth wiring layers. The second contacts 921 and 924 and the third contacts 932 and 933 may be located at different places. The width and shape of the first wiring layers 810 and the fourth wiring layers 840 are not particularly limited so long as a desired wiring can be obtained.

In the case where the first wiring layers, which are disposed on the substrate side of the island-like semiconductor layers, are formed in self-alignment with the second and third wiring layers formed of the second conductive films, the island-like semiconductor layers which act as the terminals for electrically connecting with the first wiring layers are electrically insulated from the second and third wiring layers but contact the second and third wiring layers with intervention of insulating films. In FIG. 1, for example, first conductive films are formed partially on the sidewalls of the island-like semiconductor layers connected to the first contacts 910 with intervention of insulating films. The first conductive films are located to face the island-like semiconductor layers for constituting the memory cells. The second conductive films are formed on the first conductive films with intervention of insulating films. The second conductive films are connected to the second and third wiring layers formed continuously in the A–A' direction which crosses the fourth wiring layers. At this time, the shape of the first and the second conductive films is not particularly limited.

The first conductive films on the sidewalls of the island-like semiconductor layers which act as the terminals for electrically connecting with the first wiring layers may be removed by setting the distance from said island-like semiconductor layers to the first conductive films on the island-like semiconductor layers for constituting the memory cells, for example, to be two or less times larger than the thickness of the second conductive films.

In FIG. 1, the second and third contacts are formed on the second wiring layers 821 and 824 and the third wiring layers 832 and the like which are formed to cover the top of the island-like semiconductor layers. However, the shape of the second and third wiring layers is not particularly limited so long as their connection is realized. In FIG. 1, the selection gate transistors are not shown for avoiding complexity. FIG. 1 also shows lines for sectional views to be used for explaining examples of production processes, i.e., A–A' line, B–B' line, C–C' line, D–D' line, E–E' line and F–F' line.

Figure 2:
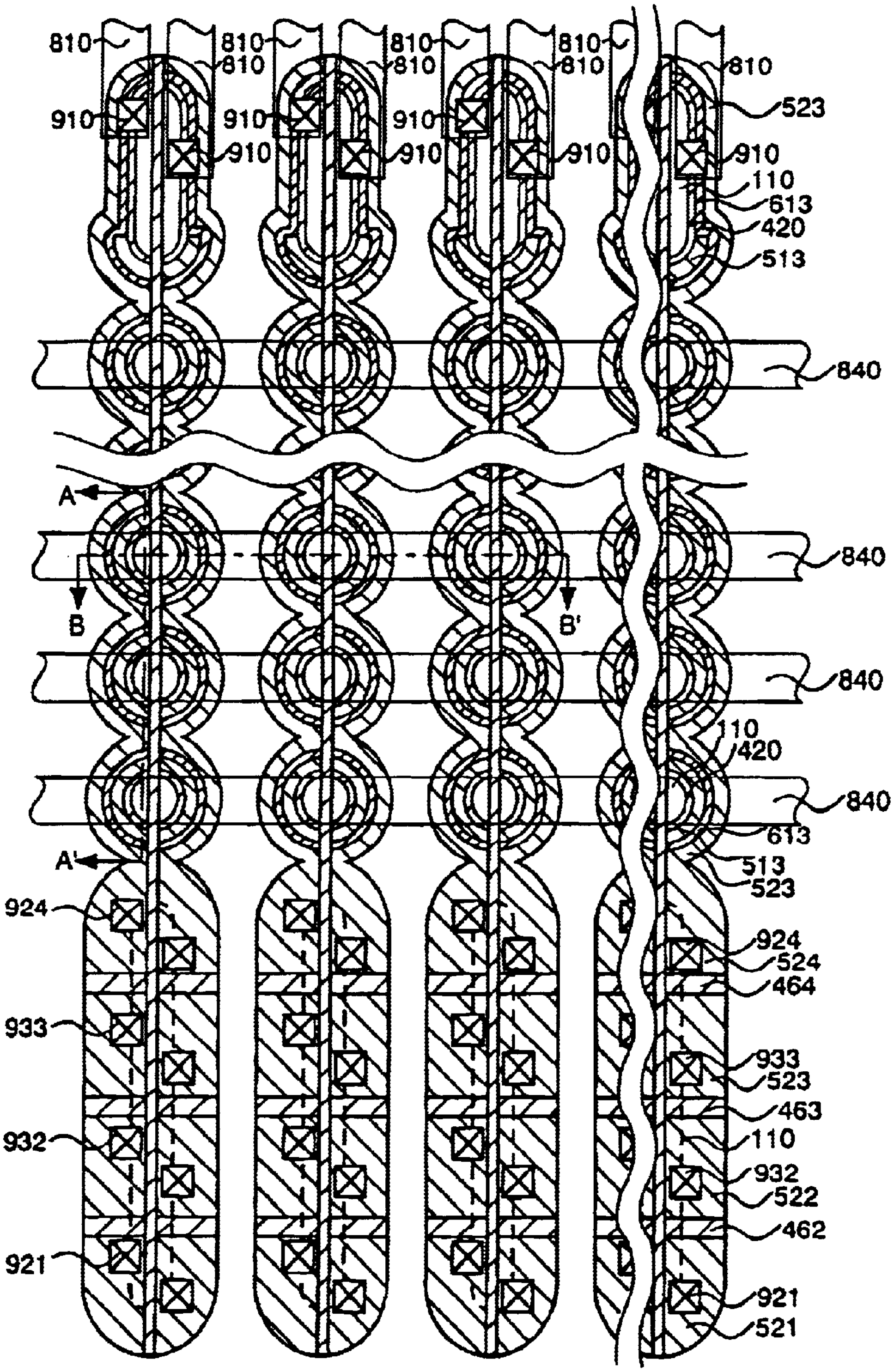

In FIG. 2, in contrast to FIG. 1, the memory cells continuously formed in a direction of A–A' are separated in two groups. As shown in FIG. 2, all the memory cells continuously formed in the direction of A–A' may be separated, or at least one of the memory cells continuously formed in the direction of A–A' may be separated. Positions of the first contact 910 and the second contacts 921 to 924 are not limited as long as a desired wiring can be lead out.

FIG. 2 also shows lines for sectional views, i.e., line A–A' and line B–B' to be used for explaining examples of production processes.

Figure 3:
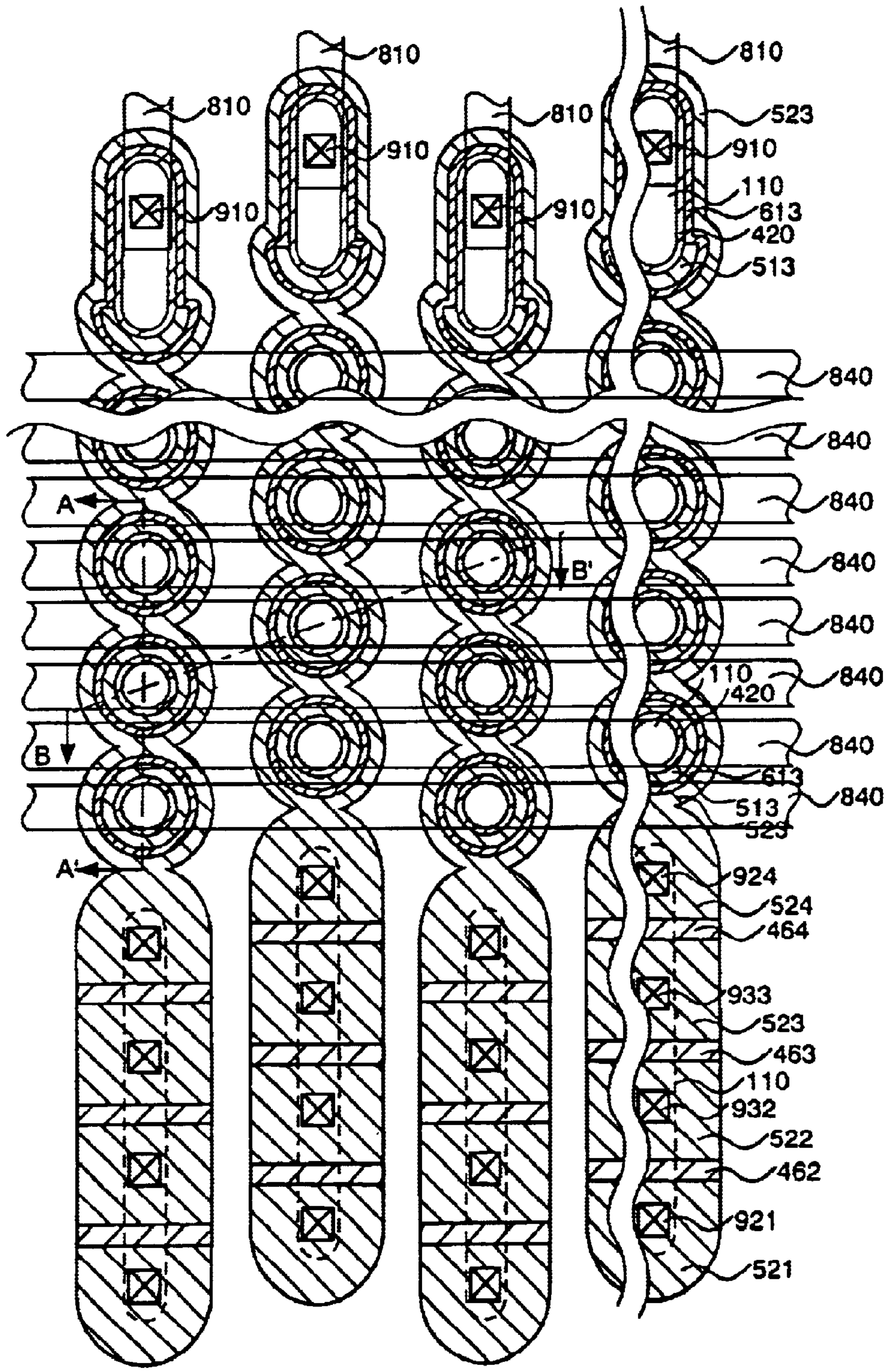

In FIG. 3, the island-like semiconductor layers in a columnar form for constituting memory cells are located at intersections where a group of parallel lines and another group of parallel lines cross at oblique angles. First, second, third and fourth wiring layers for selecting and controlling the memory cells are disposed in parallel to the surface of the substrate.

By changing intervals between the island-like semiconductor layers between the A–A' direction which crosses the fourth wiring layers 840 and the B–B' direction, second conductive films which act as the control gates of the memory cells are formed continuously in one direction, in the A–A' direction in FIG. 3, to form the third wiring layers. Likewise, second conductive films which act as the gates of the selection gate transistors are formed continuously in one direction to form the second wiring layers.

Further, terminals for electrically connecting with the first wiring layers disposed on a substrate side of the island-like semiconductor layers are provided at the A' side end of rows of memory cells connected in the A–A' direction in FIG. 3, and terminals for electrically connecting with the second and third wiring layers are provided at the A side end of the rows of memory cells connected in the A–A' direction in FIG. 3. The fourth wiring layers 840 disposed on a side of the island-like semiconductor layers opposite to the substrate are electrically connected to the island-like semiconductor layers in the columnar form for constituting the memory cells. In FIG. 3, the fourth wiring layers 840 are formed in the direction crossing the second and third wiring layers.

The terminals for electrically connecting with the first wiring layers are formed of island-like semiconductor layers, and the terminals for electrically connecting with the second and third wiring layers are formed of the second conductive film covering the island-like semiconductor layers.

The terminals for electrically connecting with the first, second and third wiring layers are connected to first contacts 910, second contacts 921 and 924 and third contacts 932 and 933, respectively.

In FIG. 3, the first wiring layers 810 are lead out to the top of the semiconductor memory via the first contacts 910.

The arrangement of the island-like semiconductor layers in the columnar form is not particularly limited to that shown in FIG. 3 but may be any arrangement so long as the above-mentioned positional relationship and electric connection between the wiring layers are realized.

The island-like semiconductor layers connected to the first contacts 910 are all located at the A' side end of the rows of memory cells connected in the A–A' direction in FIG. 3. However, they may be located entirely or partially located on the A side end or may be located at any of the island-like semiconductor layers for constituting the memory cells connected in the A–A' direction which crosses the fourth wiring layers. The island-like semiconductor layers coated with the second conductive film and connected to the second contacts 921, 924 and the third contacts 932, 933 may be located at an end where the first contacts 910 are not disposed, may be continuously located at the end where the first contacts 910 are disposed or may be located at any of the island-like semiconductor layers for constituting the memory cells connected in the A–A' direction. The second contacts 921 and 924 and the third contacts 932 or the like may be located at different places. The width and shape of the first wiring layers 810 and the fourth wiring layers 840 are not particularly limited so long as desired wiring can be obtained.

In the case where the first wiring layers are formed in self-alignment with the second and third wiring layers formed of the second conductive film, the island-like semiconductor layers which are the terminal for electrically connecting with the first wiring layers are electrically insulated from the second and third wiring layers but contact the second and third wiring layers with intervention of an insulating film. In FIG. 3, for example, the first conductive films are formed on part of the sidewalls of the island-like semiconductor layers connected to the first contacts 910 with intervention of insulating films. The first conductive films are located to face the island-like semiconductor layers for constituting the memory cells. The second conductive films are formed on the side faces of the first conductive films with intervention of insulating films. The second conductive films are connected to the second and third wiring layers formed continuously in the A–A' direction which crosses the fourth wiring layers 840. The shape of the first and the second conductive films is not particularly limited.

The first conductive films on the sidewalls of the island-like semiconductor layers which act as the terminals for electrically connecting with the first wiring layers may be removed by setting the distance between said island-like semiconductor layers and the first conductive films on the island-like semiconductor layers for constituting the memory cells, for example, to be two or less times larger than the thickness of the second conductive films.

In FIG. 3, the second and third contacts are formed on the second wiring layers 821 and 824 and the third wiring layers 832 which are formed to cover the top of the island-like semiconductor layers. However, the shape of the second and third wiring layers are not particularly limited so long as their connection is realized. In FIG. 3, the selection gate transistors are not shown for avoiding complexity. FIG. 3 also shows lines for sectional views, i.e., line A–A' and line B–B' to be used for explaining examples of production processes.

Figure 4:
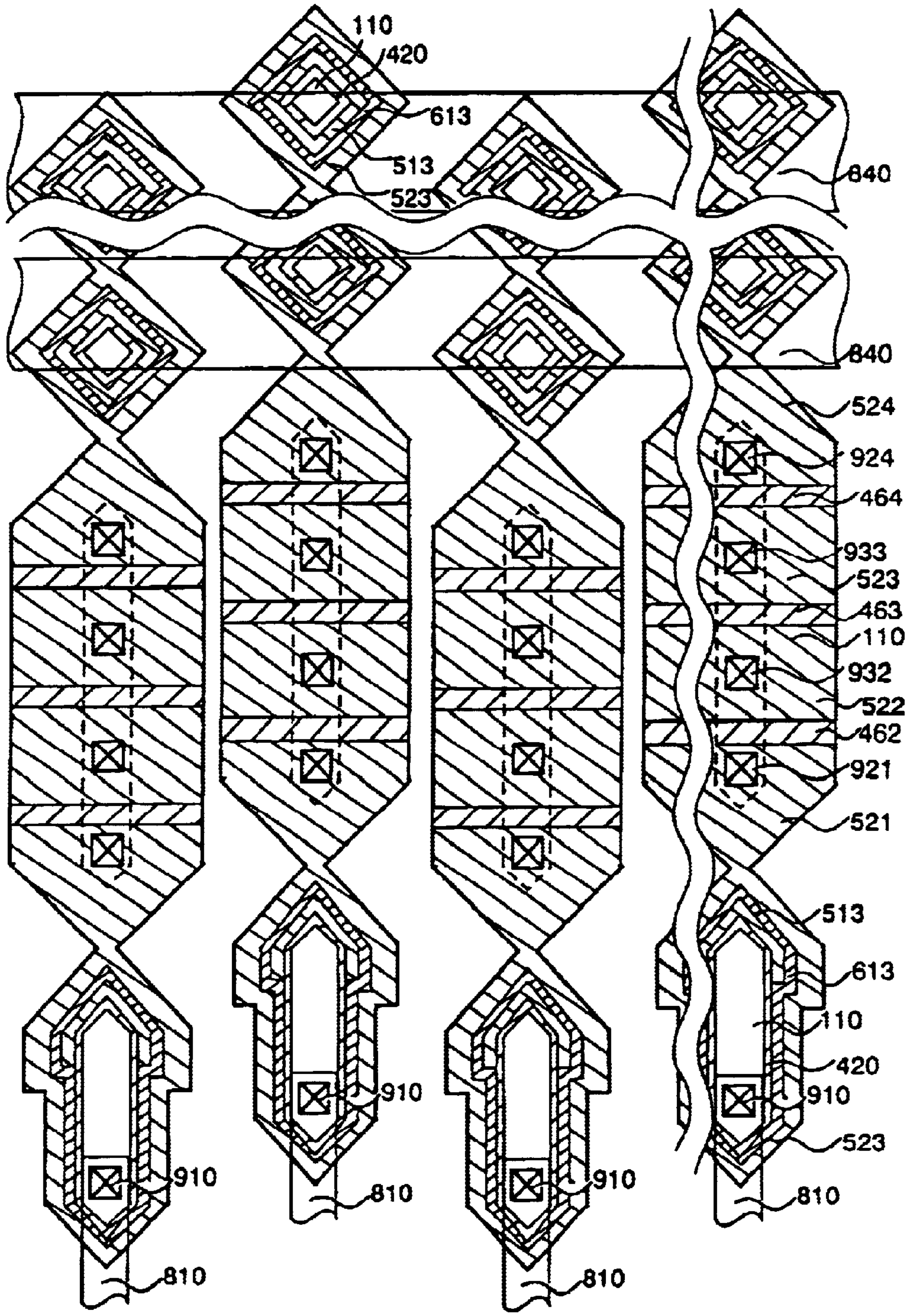
Figure 5:
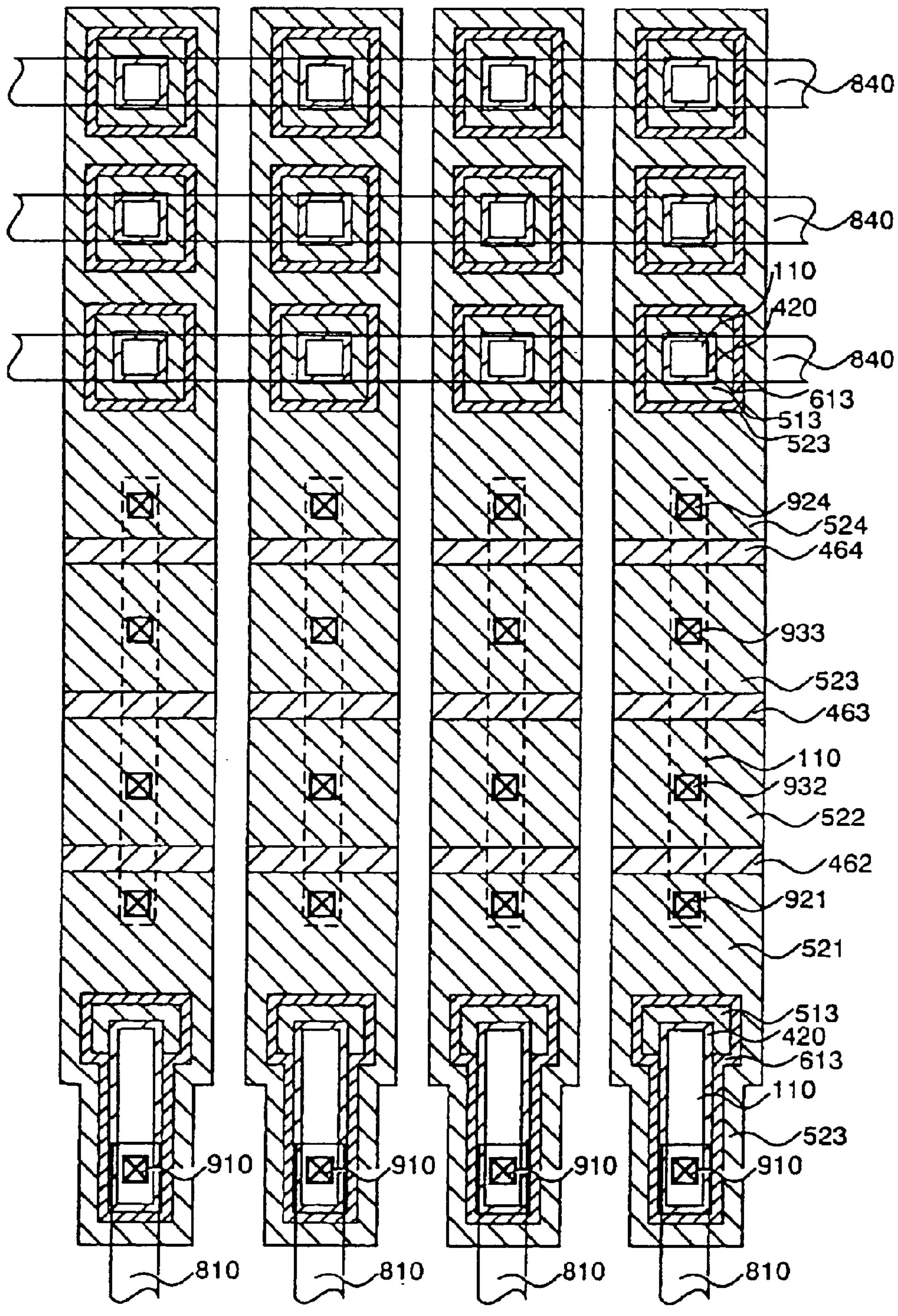

FIG. 4 and FIG. 5, in contrast to FIG. 1 and FIG. 3, the island-like semiconductor layers for constituting the memory cells have a square cross section. In FIG. 4 and FIG. 5, the island-like semiconductor layers are differently oriented. The cross section of the island-like semiconductor layers is not particularly limited to circular or square but may be elliptic, hexagonal or octagonal, for example. However, if the island-like semiconductor layers have a dimension close to the minimum photoetching dimension, the island-like semiconductor layers, even if they are designed to have corners like square, hexagon or octagon, may be rounded by photolithography and etching, so that the island-like semiconductor layers may have a cross section near to circle or ellipse. In FIGS. 4 and FIG. 5, the selection gate transistors are not shown for avoiding complexity.

Figure 6:
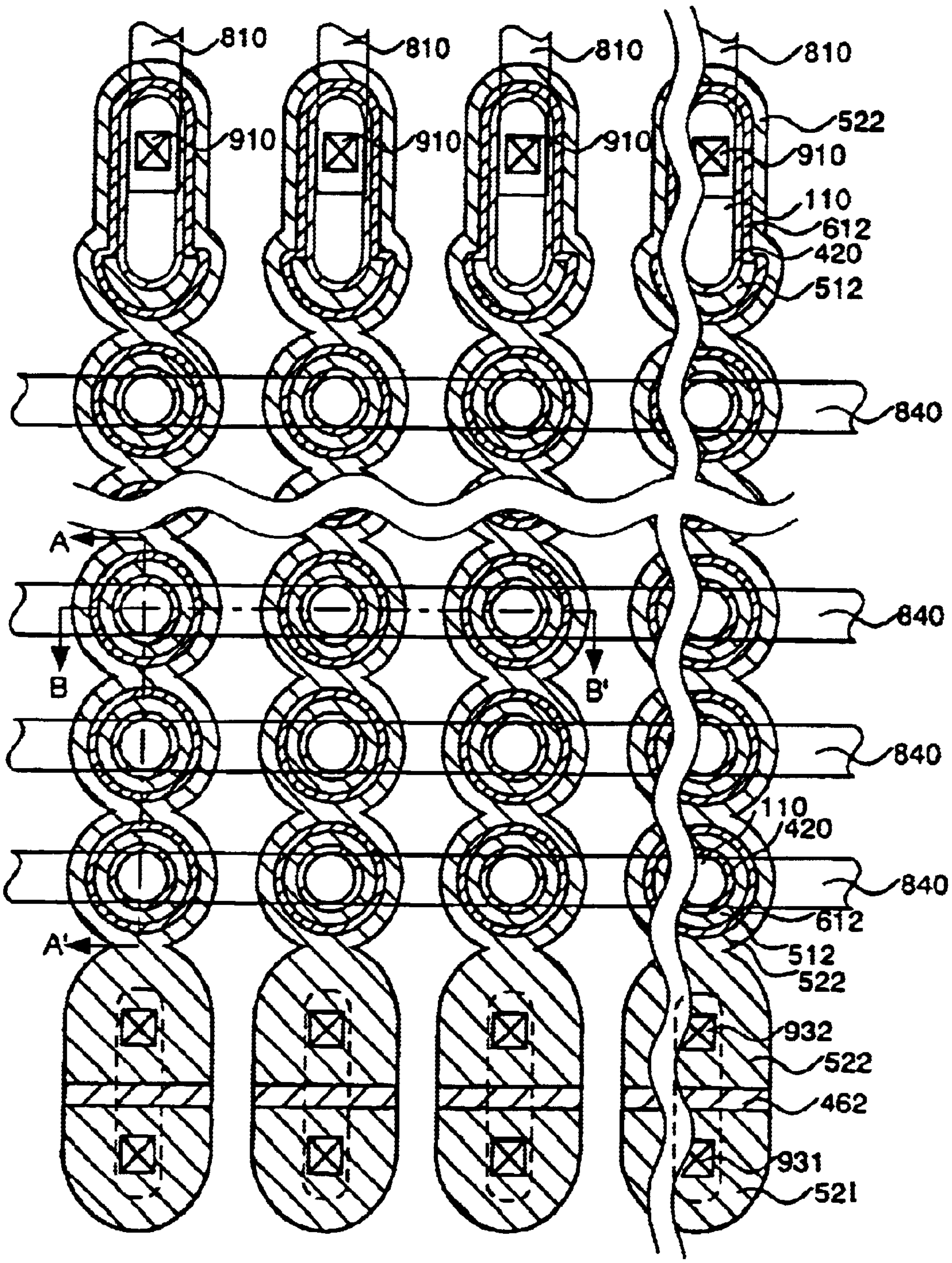

In FIG. 6, in contrast to FIG. 1, two memory cells are formed in series on an island-like semiconductor layer for constituting memory cells, and the selection gate transistor is not formed. FIG. 6 also shows lines for sectional views, i.e., line A–A' and line B–B' to be used for explaining examples of production processes.

Figure 7:
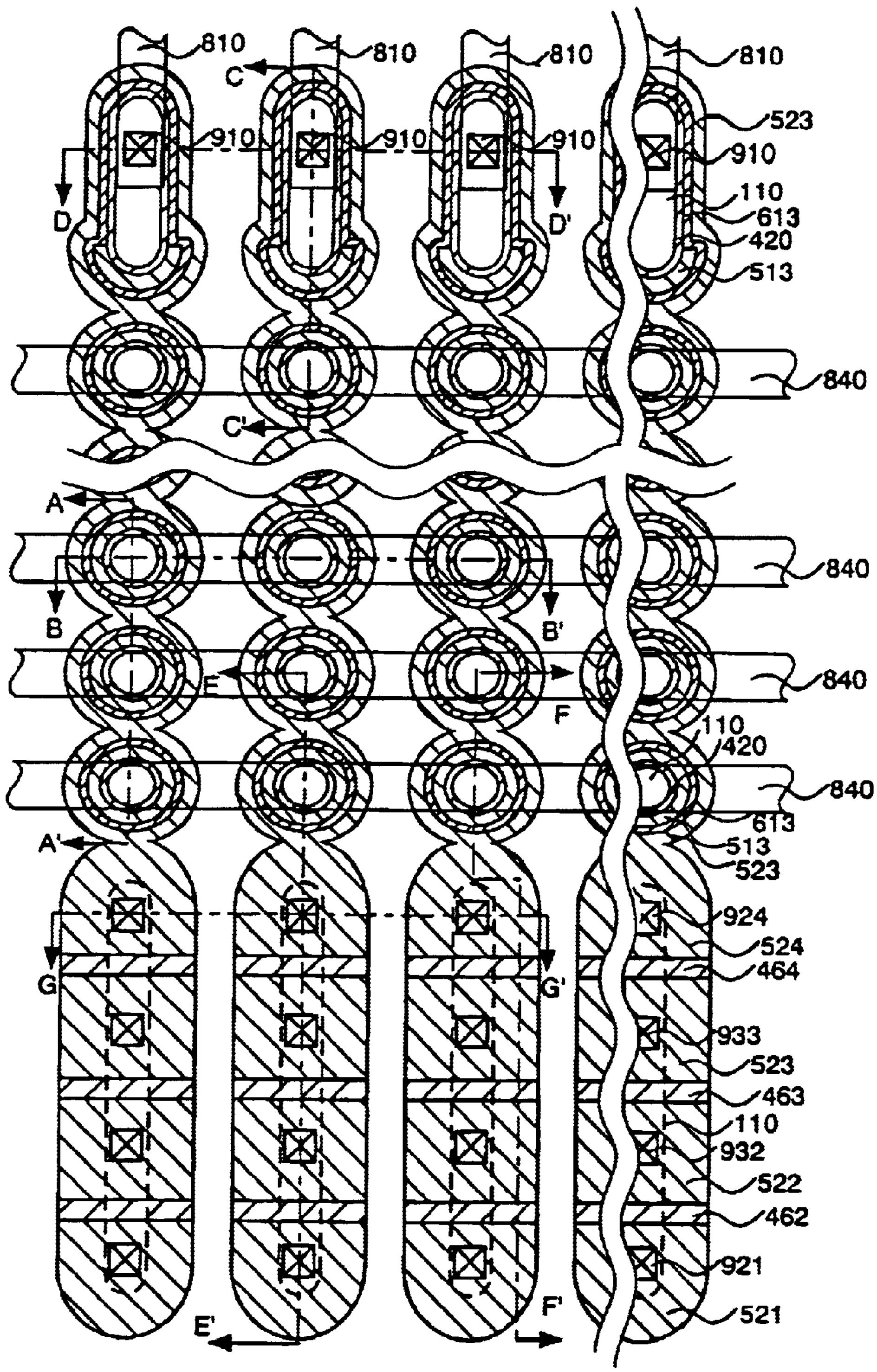

In FIG. 7, in contrast to FIG. 1, the island-like semiconductor layers for constituting the memory cells do not have a circular cross section, but have an elliptic cross section, and the major axis of ellipse is in the B–B' direction.

Figure 8:
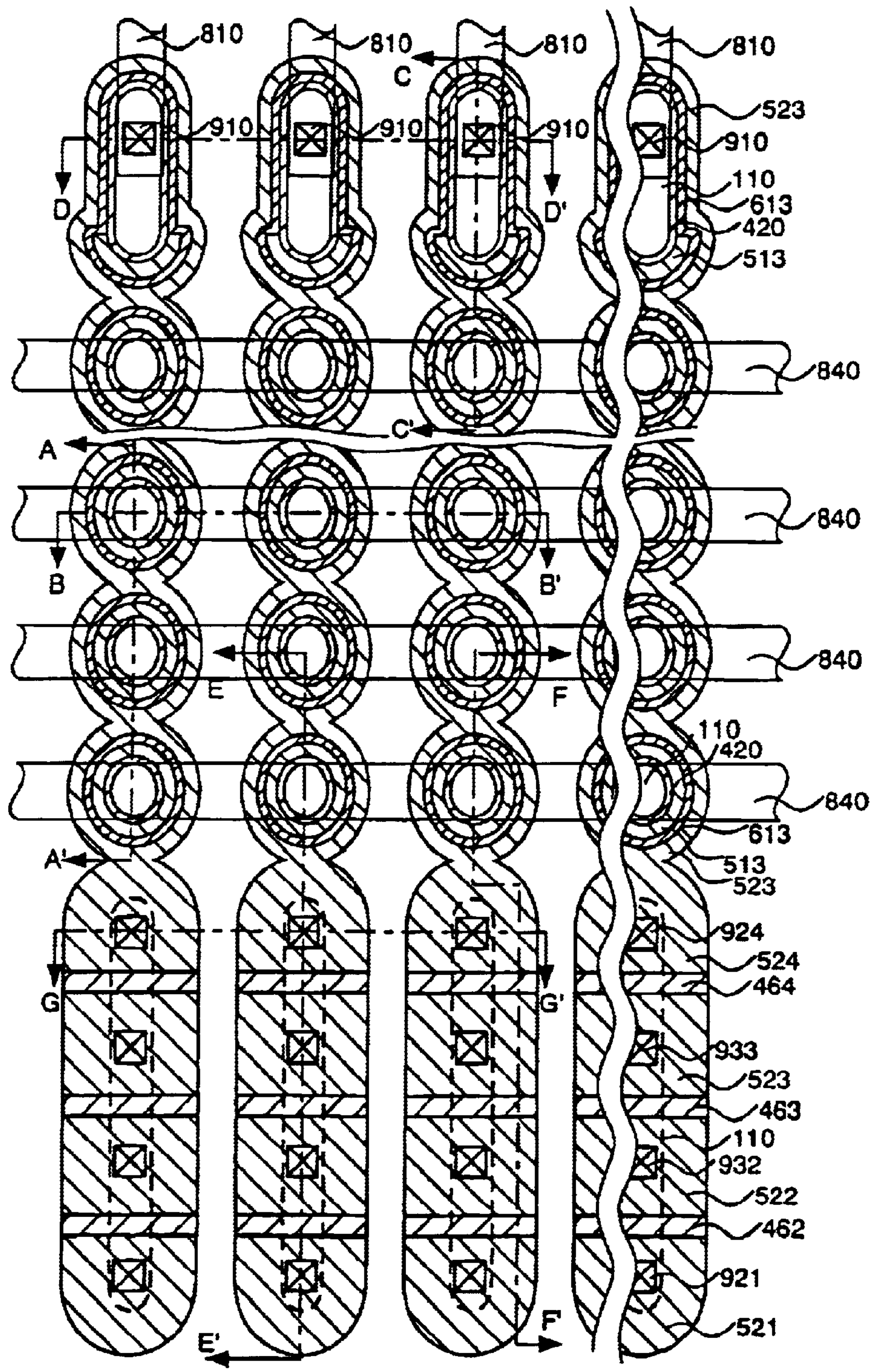
Figure 9:
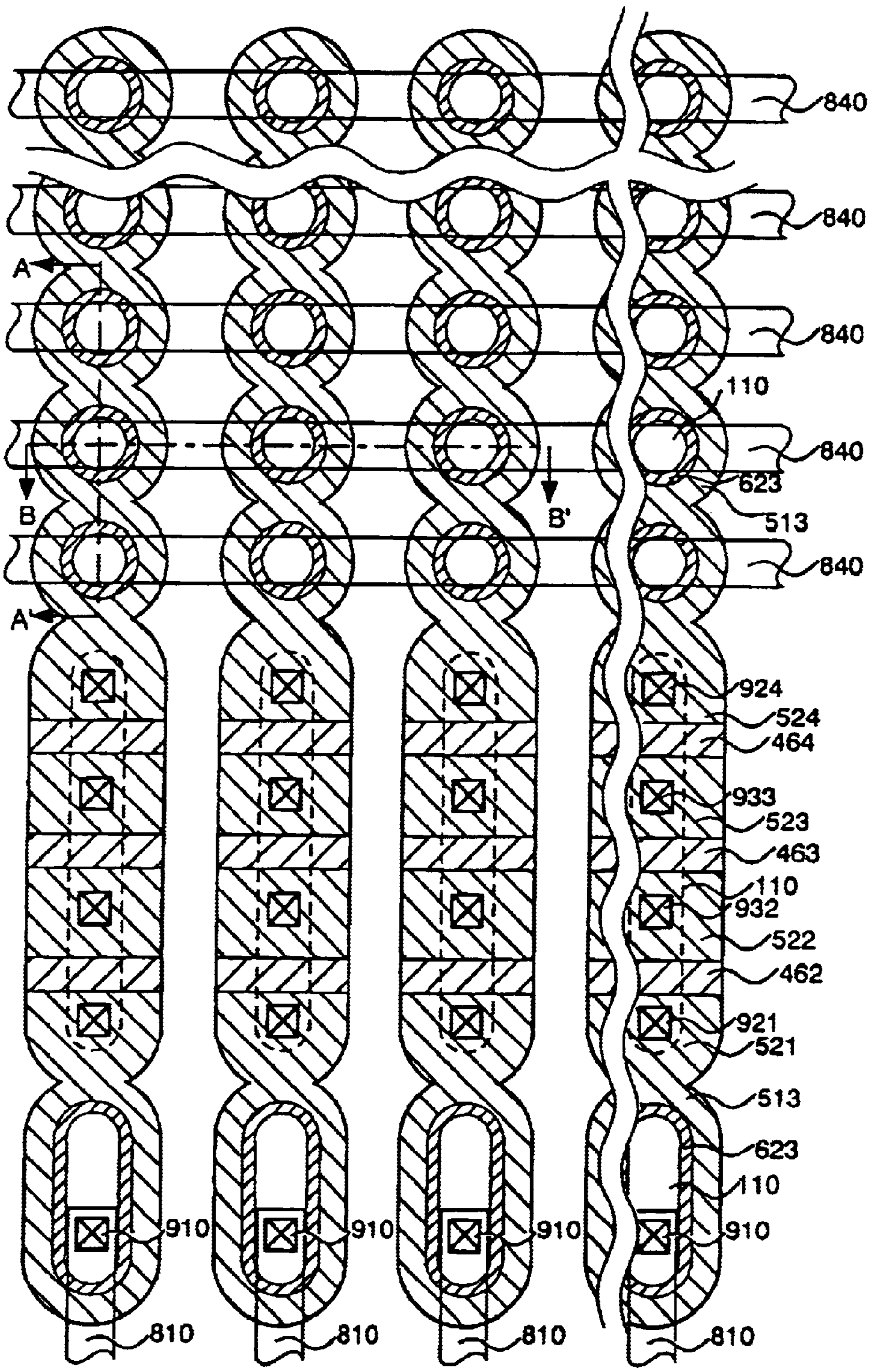
FIG. 9 is a cross-sectional view illustrating a memory cell array of MONOS structure having a layered insulating film as a charge storage layer in a semiconductor memory device in accordance with the present invention.

In FIG. 8, in contrast to FIG. 7, the major axis of ellipse is in the A–A' direction. The major axis may be not only in the A–A' or B–B' direction but in any direction.

In FIGS. 7 and FIG. 8, the selection gate transistors are not shown for avoiding complexity.

Next, explanation is given of the memory cell arrays having other than floating gates as charge storage layers.

In FIG. 9, in contrast to FIG. 1, there is shown an example in which laminated insulating films are used as the charge storage layers as in the MONOS structure. The example of FIG. 9 is the same as the example of FIG. 1, except that the charge storage layers are changed from the floating gates to the laminated insulating films. FIG. 9 also shows lines for sectional views, i.e., line A–A' and line B–B', to be used for explaining examples of production processes.

In the above descriptions, the semiconductor memories with reference to their cross-sectional views, FIGS. 1 to 9. However, the arrangements and structures shown in these figures may be combined in various ways.

Embodiments of Memory Cell Arrays as Shown in Sectional Views

FIG. 10 to FIG. 23 show sectional views of semiconductor memories having floating gates as charge storage layers. Of FIG. 10 to FIG. 23, even-numbered figures show sectional views taken on line A–A' in FIG. 1 and odd-numbered figures show sectional views taken on line B–B' in FIG. 1.

In these embodiments, a plurality of island-like semiconductor layers 110 having, for example, at least one recess on the sidewalls thereof are formed in matrix on a P-type silicon substrate 100. Transistors having a second or fifth electrode as a selection gate are disposed in an upper part and in a lower part of each island-like semiconductor layer 110. Between these selection gate transistors, a plurality of memory transistors, e.g., two memory transistors, are disposed in FIG. 10 to FIG. 23. The transistors are connected in series along each island-like semiconductor layer. More particularly, a silicon oxide film 460 having a predetermined thickness is formed as an eighth insulating film at the bottom of trenches between the island-like semiconductor layers. The second electrode 500 functioning as the selection gate is disposed in a recess formed on the sidewall of the island-like semiconductor layer with intervention of a gate insulating film, so as to surround the island-like semiconductor layer. Thus a selection gate transistor is formed. A floating gate 510 is disposed in the recess formed on the sidewall of the island-like semiconductor layer above the selection gate transistor with intervention of a tunnel oxide film 420, so as to surround the island-like semiconductor layer. Outside the floating gate 510, a control gate 520 is disposed in the recess formed on the sidewall of the floating gate 510 with intervention of an interlayer insulating film 610 of a multi-layered film. Thus a memory transistor is formed. A plurality of memory transistors are formed in the same manner and above them, a transistor having the fifth electrode 500 as the selection gate is disposed in the recess in the same manner as described above.

Figure 11:
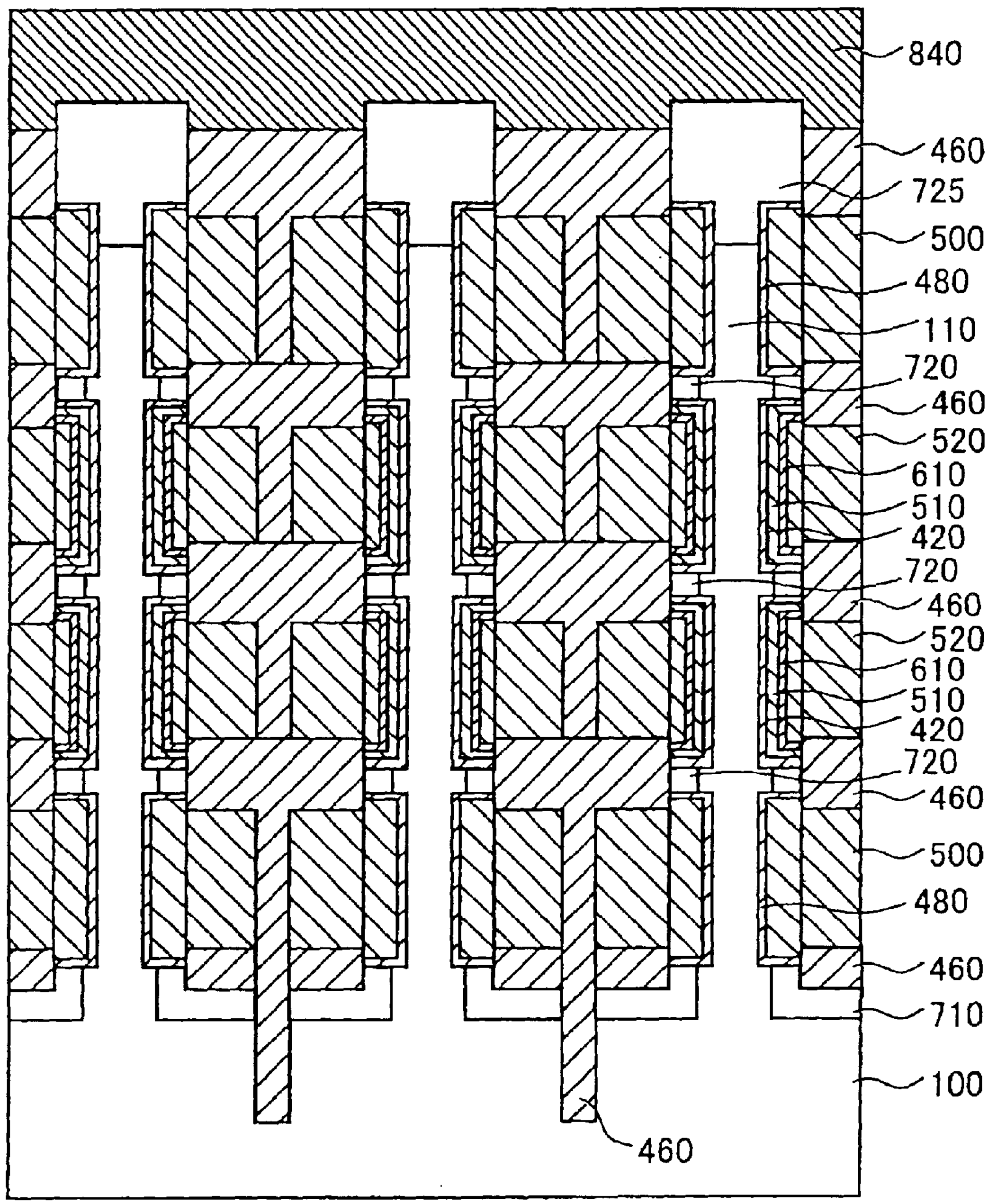

As shown in FIG. 1 and FIG. 11, the selection gate 500 and the control gate 520 are provided continuously along a plurality of transistors in one direction to form a selection gate line which is a second or fifth wiring and a control gate line which is a third wiring.

A source diffusion layer 710 is formed on the surface of the semiconductor substrate so that the active regions of memory cells are in a floating state with respect to the semiconductor substrate. Further, diffusion layers 720 are formed between memory cells, and between the selection gate transistors and memory cells so that the active region of each memory cell is in the floating state. Drain diffusion layers 725 for the memory cells are formed on the tops of the respective island-like semiconductor layers 110. Instead of arranging the source diffusion layer 710 of the memory cell so that the active regions of the memory cells are in a floating state with respect to the semiconductor substrate, a structure in which an insulating film is inserted below the semiconductor substrate surface, for example, an SOI substrate, may be used.

Oxide films 460 are formed as eighth insulating films between the thus arranged memory cells in such a manner that the tops of the drain diffusion layers 725 are exposed. Al wirings 840 are provided as bit lines to connect drain diffusion layers 725 for memory cells in a direction crossing the control gate lines. Preferably, the diffusion layers 720 have an impurity concentration distribution such that the impurity concentration gradually decreases from the surface of the island-like semiconductor layers 110 to the inside thereof rather than a uniform impurity concentration distribution. Such an impurity concentration distribution may be obtained, for example, by a thermal diffusion process after an impurity is introduced into the island-like semiconductor layers 110. Thereby, the junction breakdown voltage between the diffusion layers 720 and the island-like semiconductor layers 110 improves and the parasitic capacity decreases.

It is also preferably that the source diffusion layers 710 have an impurity concentration distribution such that the impurity concentration gradually decreases from the surface of the semiconductor substrate 100 to the inside thereof. Thereby, the junction breakdown voltage between the source diffusion layer 710 and the semiconductor substrate 100 improves and the parasitic capacity decreases in the first wiring layer.

Figure 10:
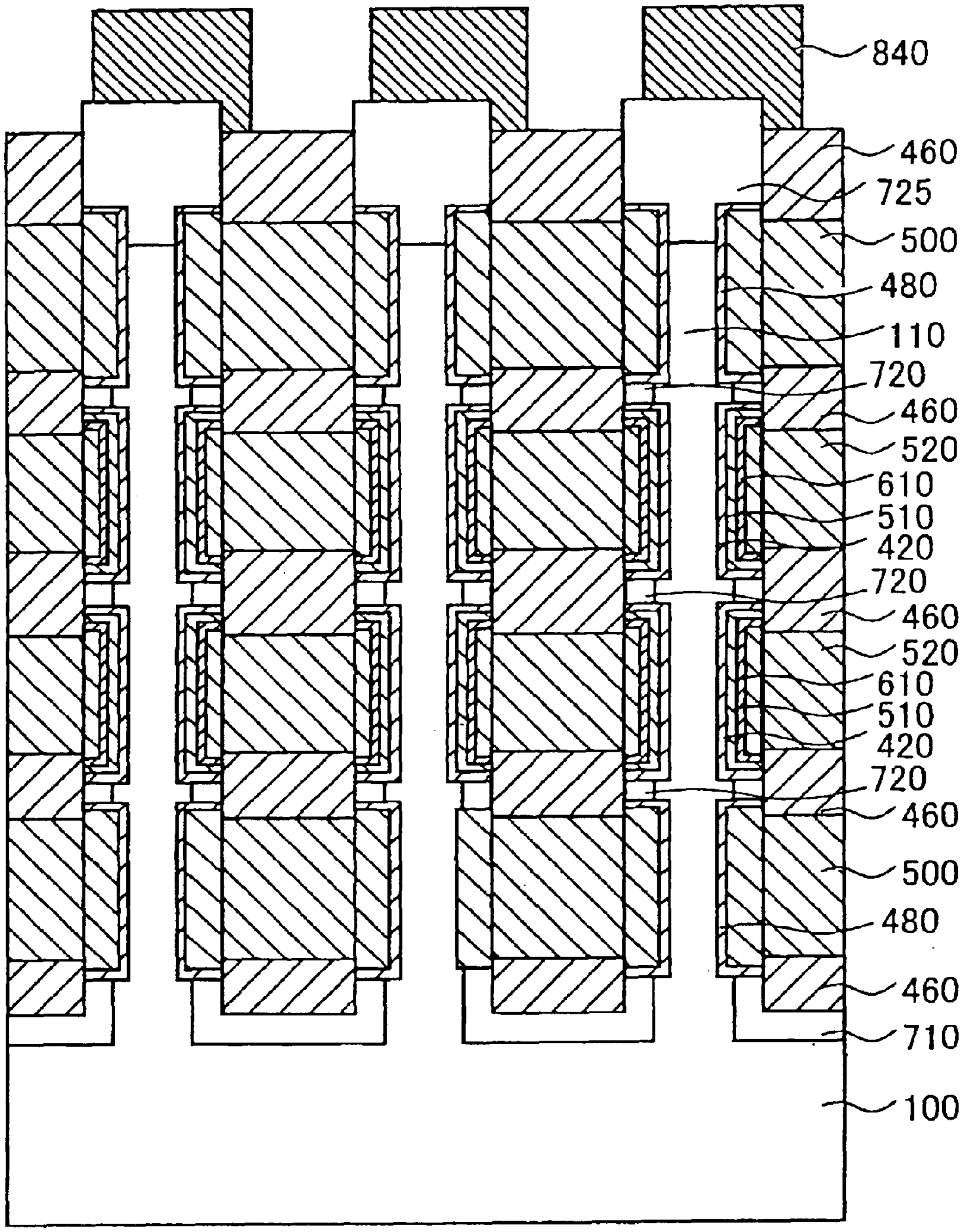
FIGS. 10 to 63 are sectional views of various semiconductor memory devices having floating gates as charge storage layers in accordance with the present invention, the sectional views corresponding to those taken on line A–A' and line B–B' in FIG. 1 or FIG.9.

In an example shown in FIG. 10 and FIG. 11, the height of the control gate 520 from the surface of the semiconductor substrate is smaller than that of the floating gate 510.

Figure 12:
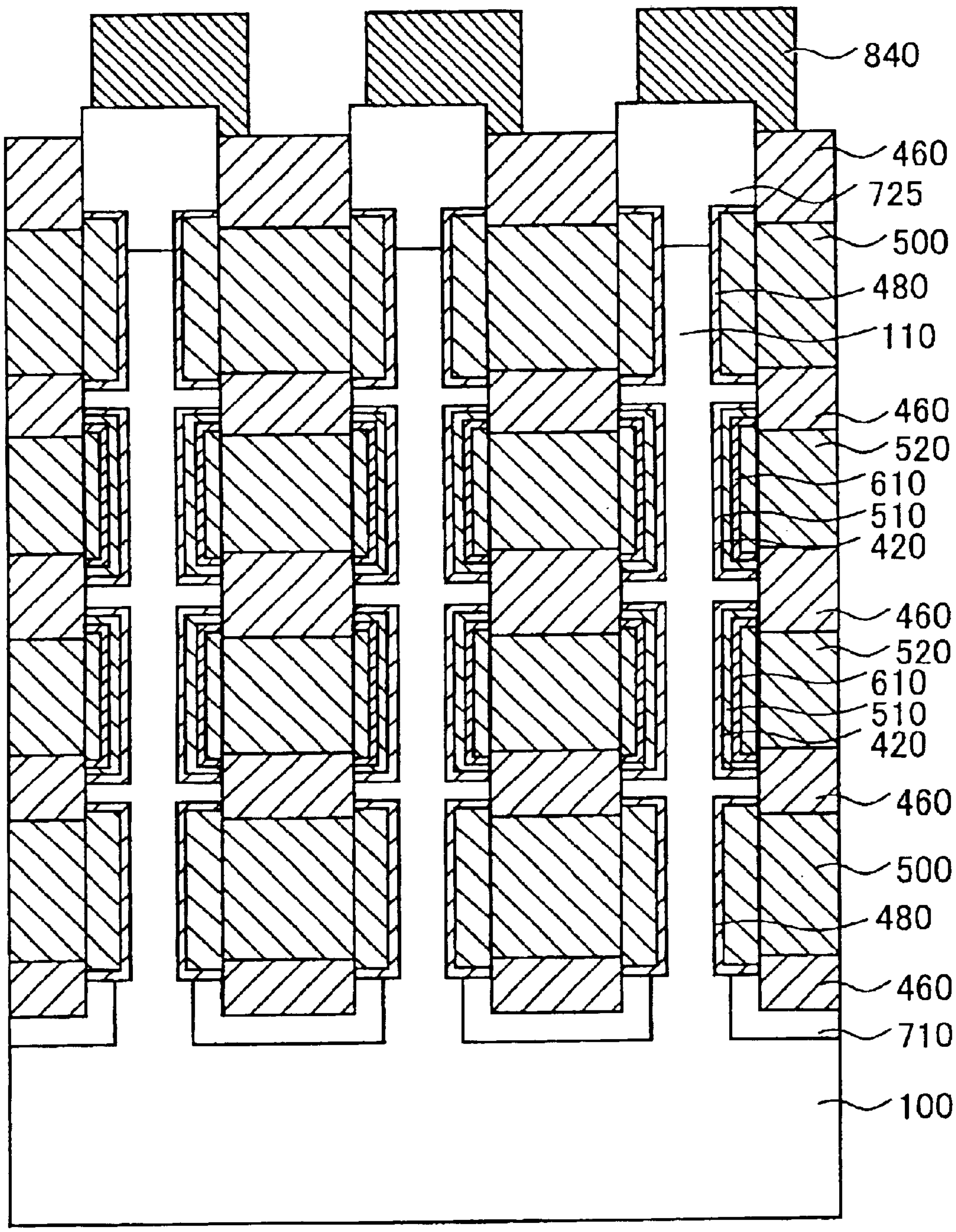
Figure 13:
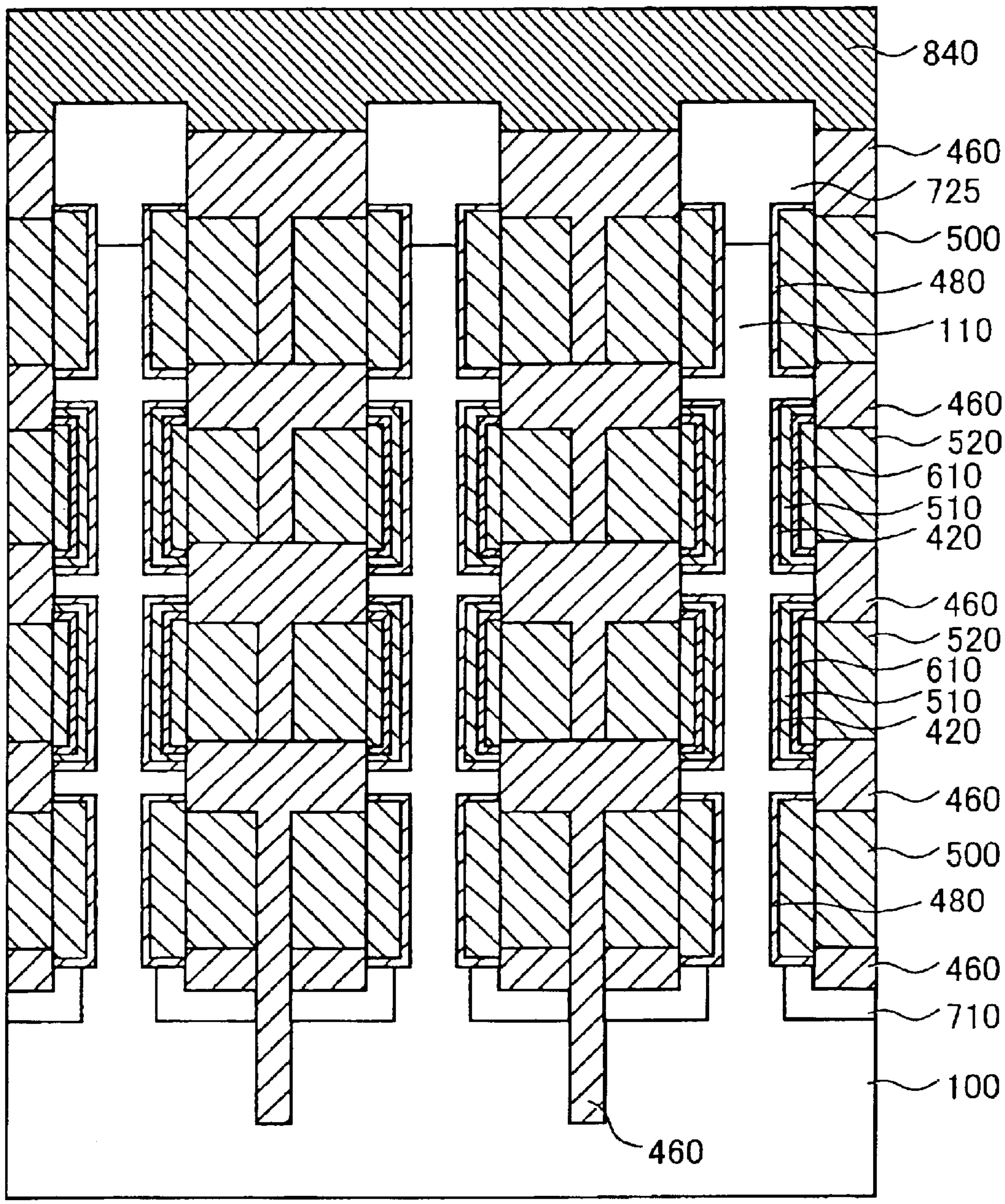

In an example shown in FIG. 12 and FIG. 13, the diffusion layers 720 are not provided between the transistors.

Figure 14:
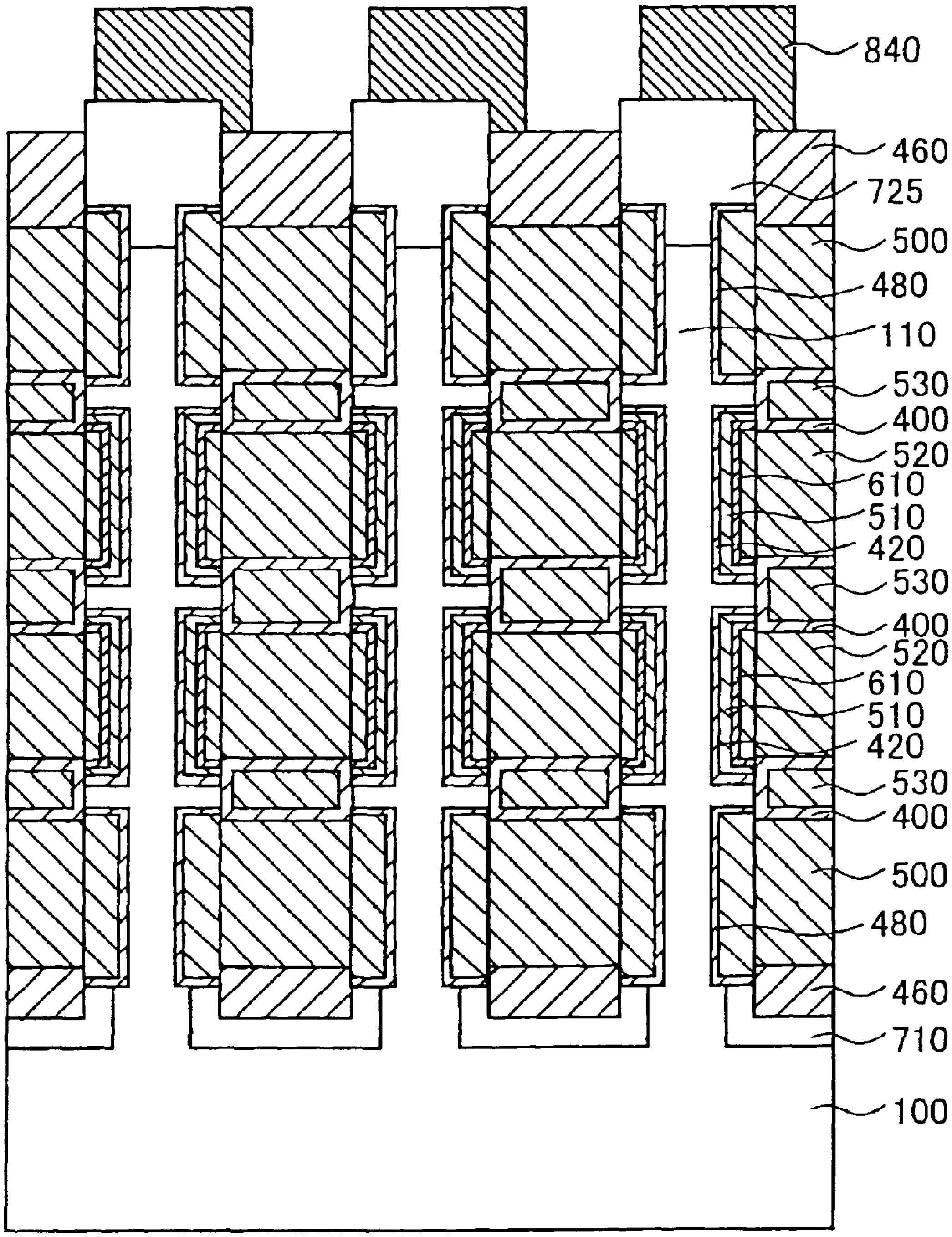
Figure 15:
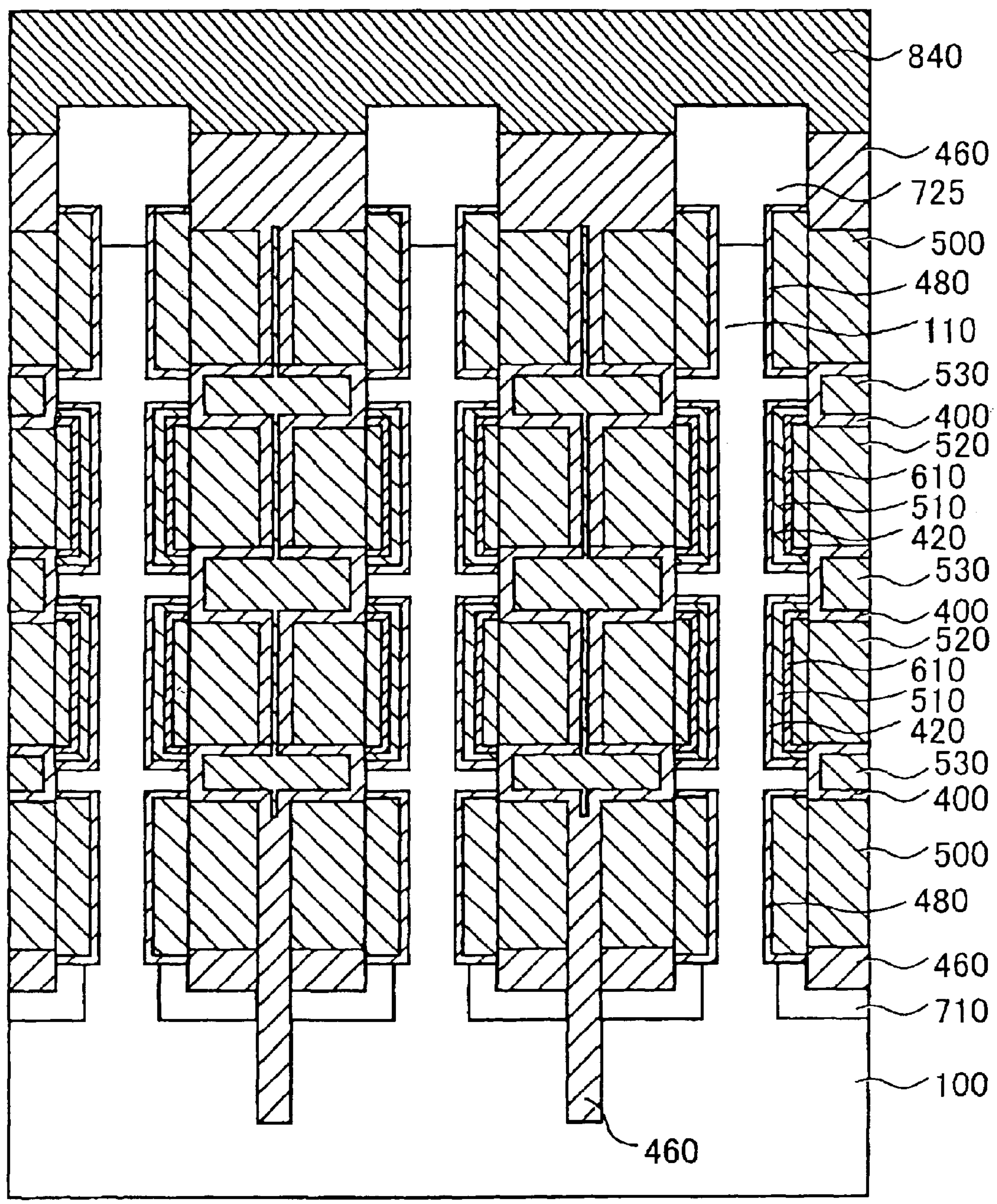

In an example shown in FIG. 14 and FIG. 15, the diffusion layers 720 are not provided and polysilicon films 530 are formed as third electrodes between the gate electrodes 500, 510 and 520 of the memory transistors and the selection gate transistors. FIGS. 14–15 also illustrate dielectric layer 4000. In FIG. 1, the polysilicon films 530 as the third electrodes are not shown for avoiding complexity.

Figure 16:
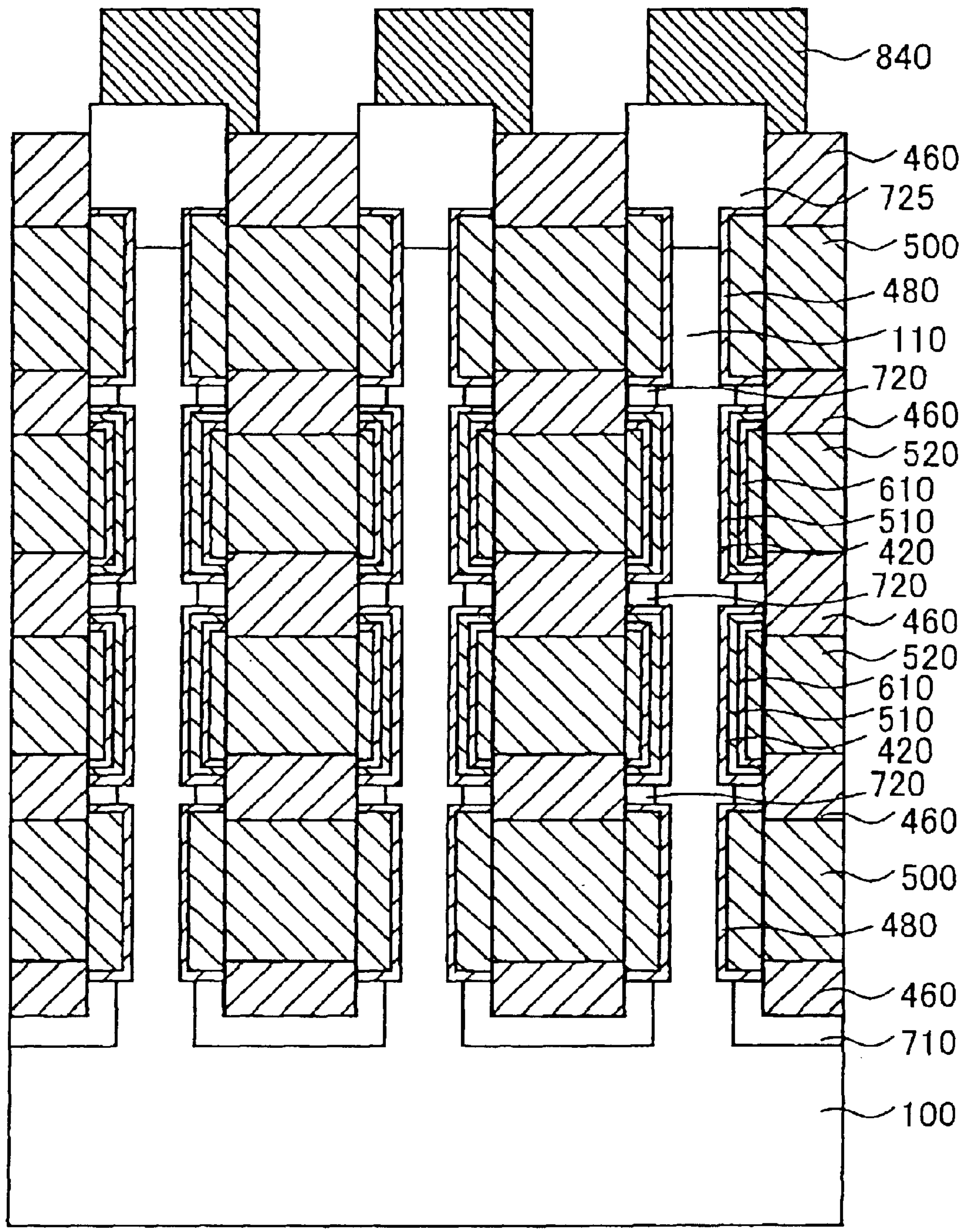
Figure 17:
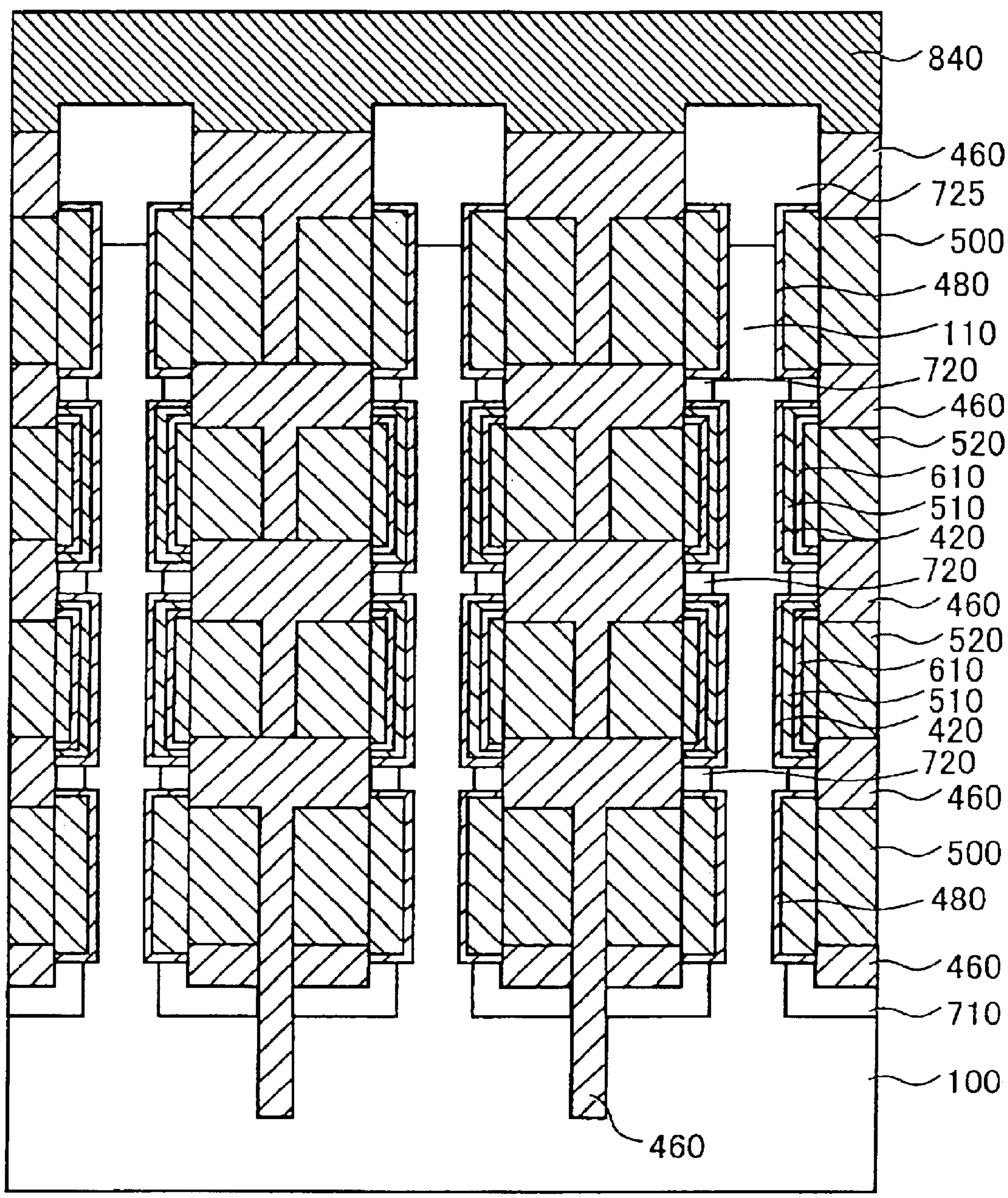

In an example shown in FIG. 16 and FIG. 17, the interlayer insulating film 610 is formed of a single layer film.

Figure 18:
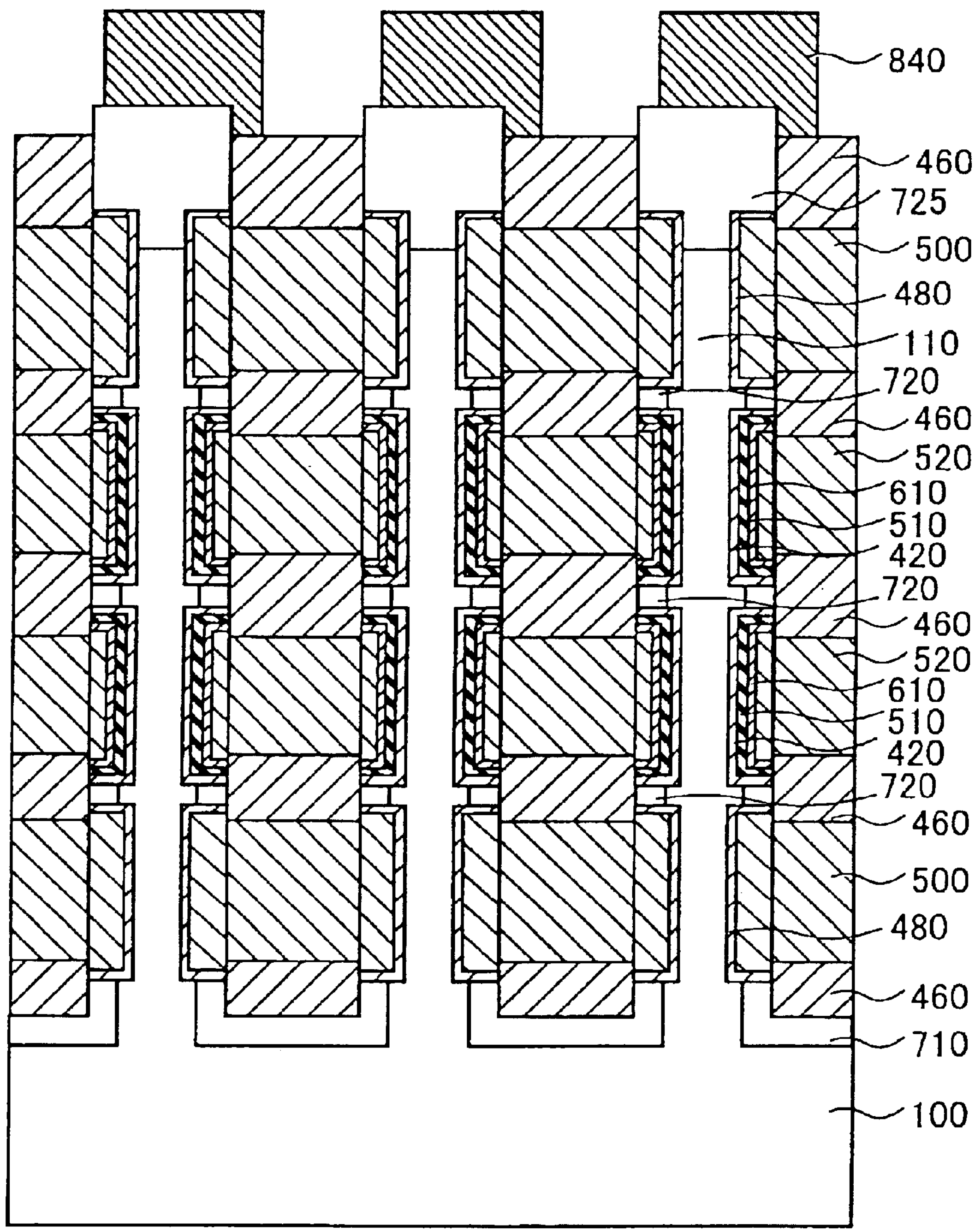
Figure 19:
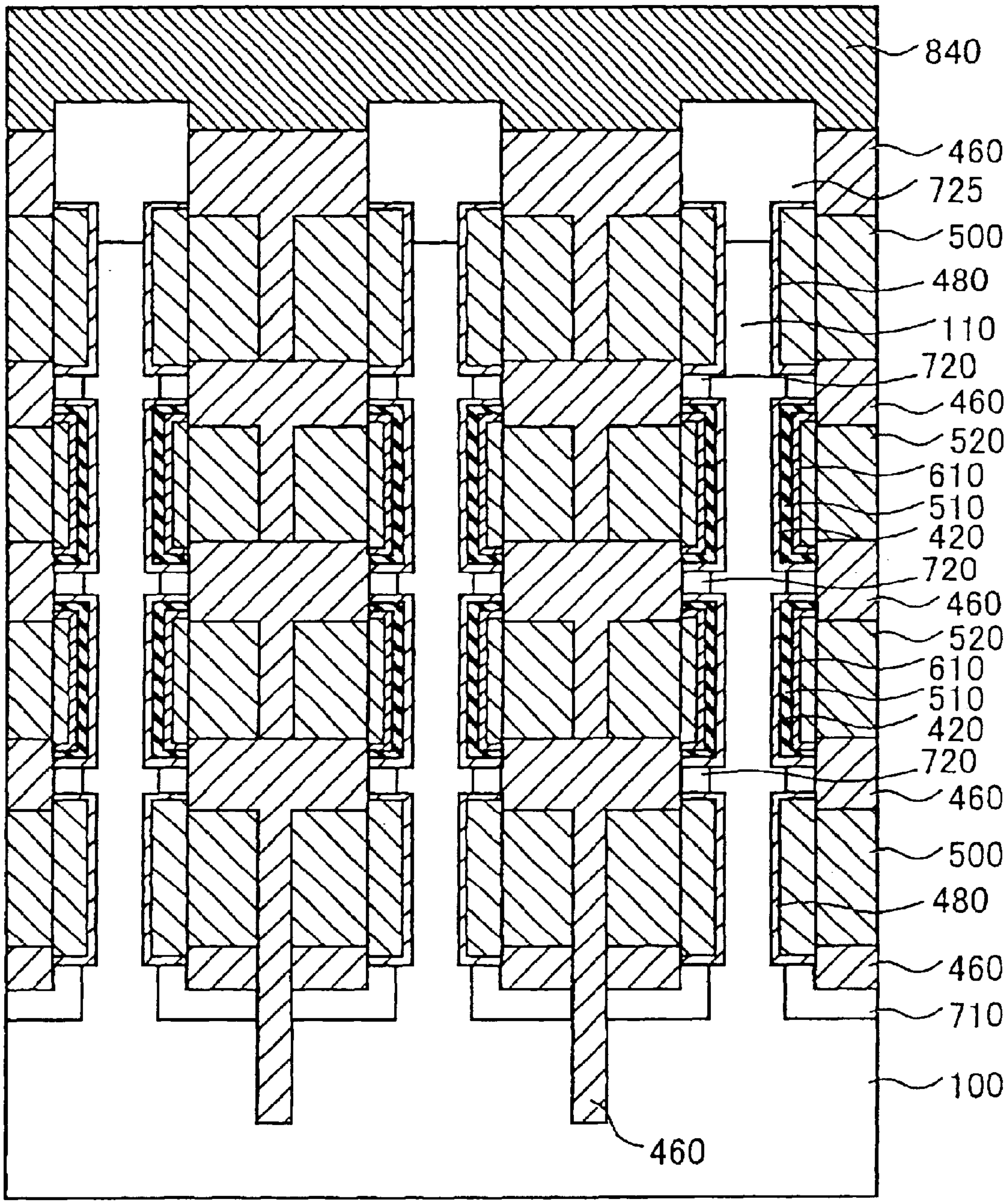

In an example shown in FIG. 18 and FIG. 19, a gate is formed of a material different from that of other gates. More specifically, the control gate 520 and the floating gate 510 of the memory cell are formed of different materials.

Figure 20:
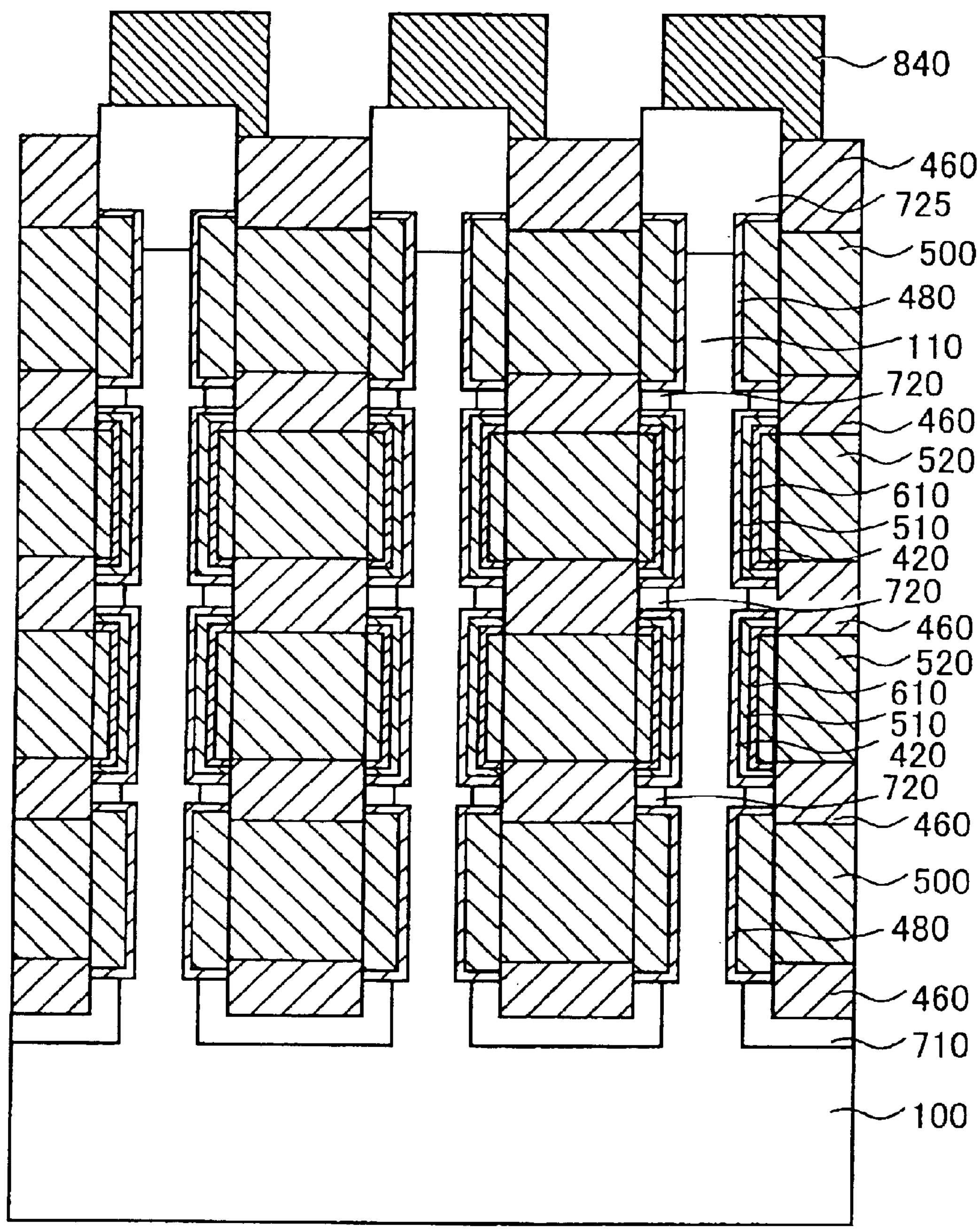
Figure 21:
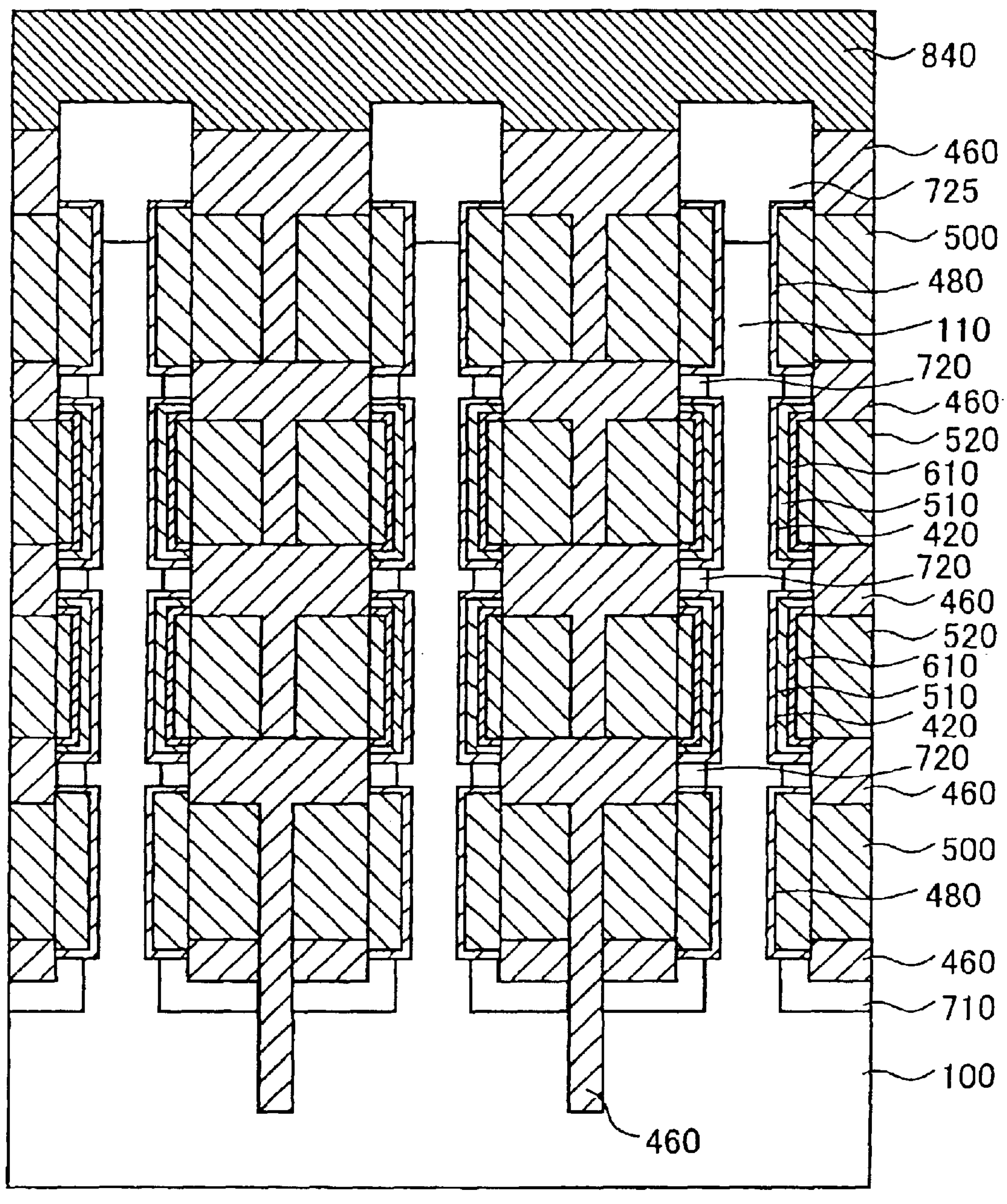

In an example shown in FIG. 20 and FIG. 21, in contrast to FIG. 10 and FIG. 11, the height of the control gate 520 from the surface of the semiconductor substrate is equal to that of the floating gate 510.

Figure 22:
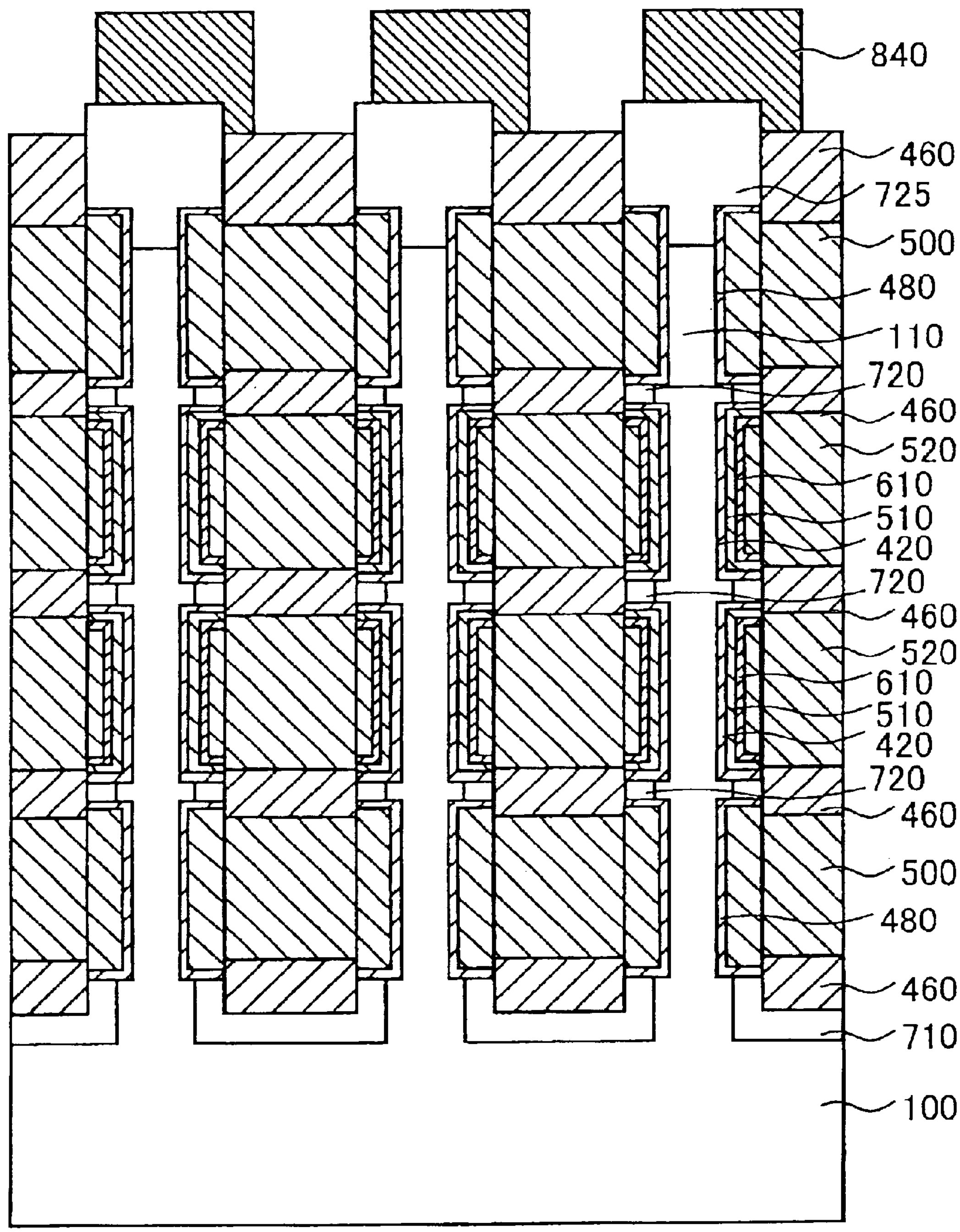
Figure 23:
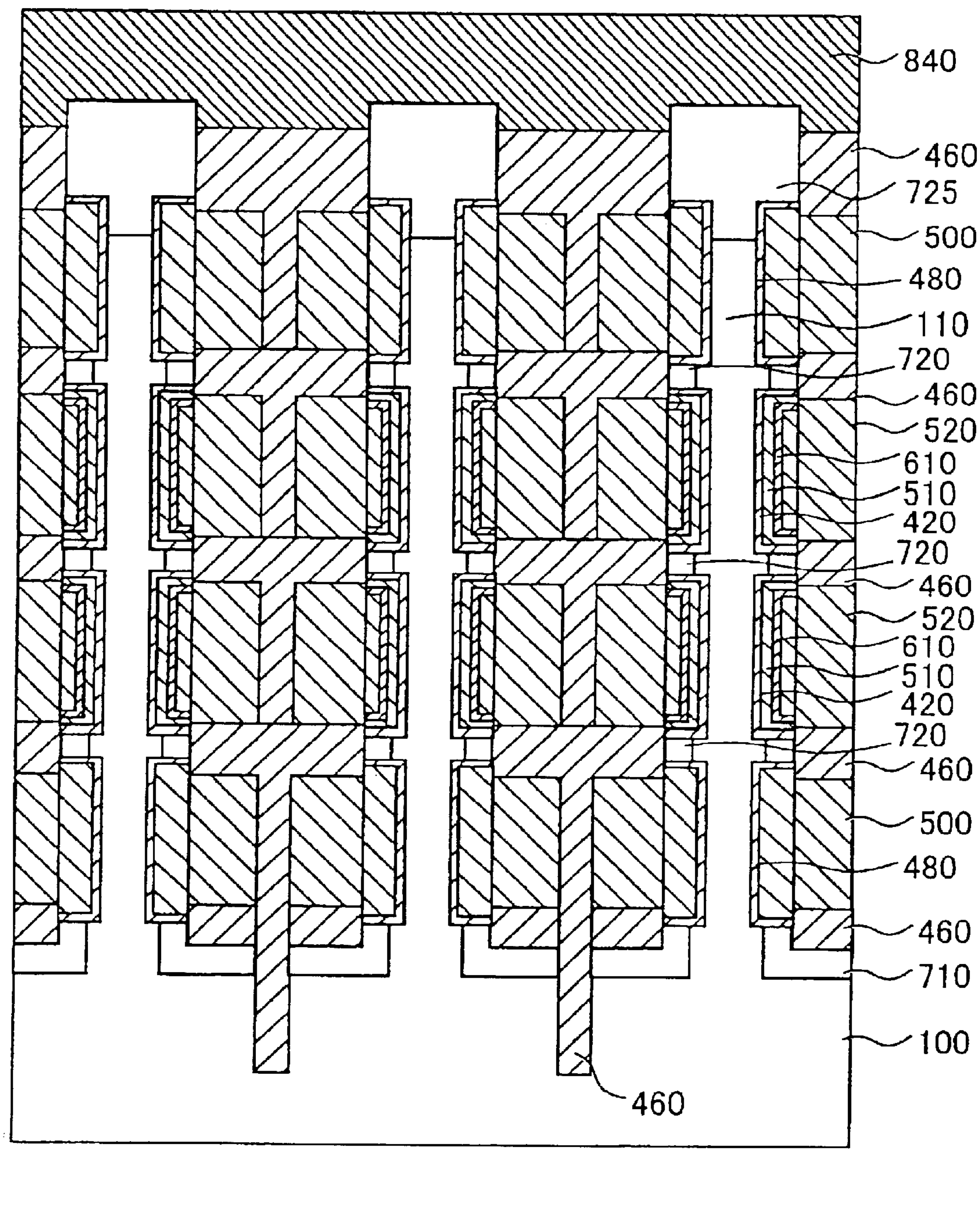
Figure 24:
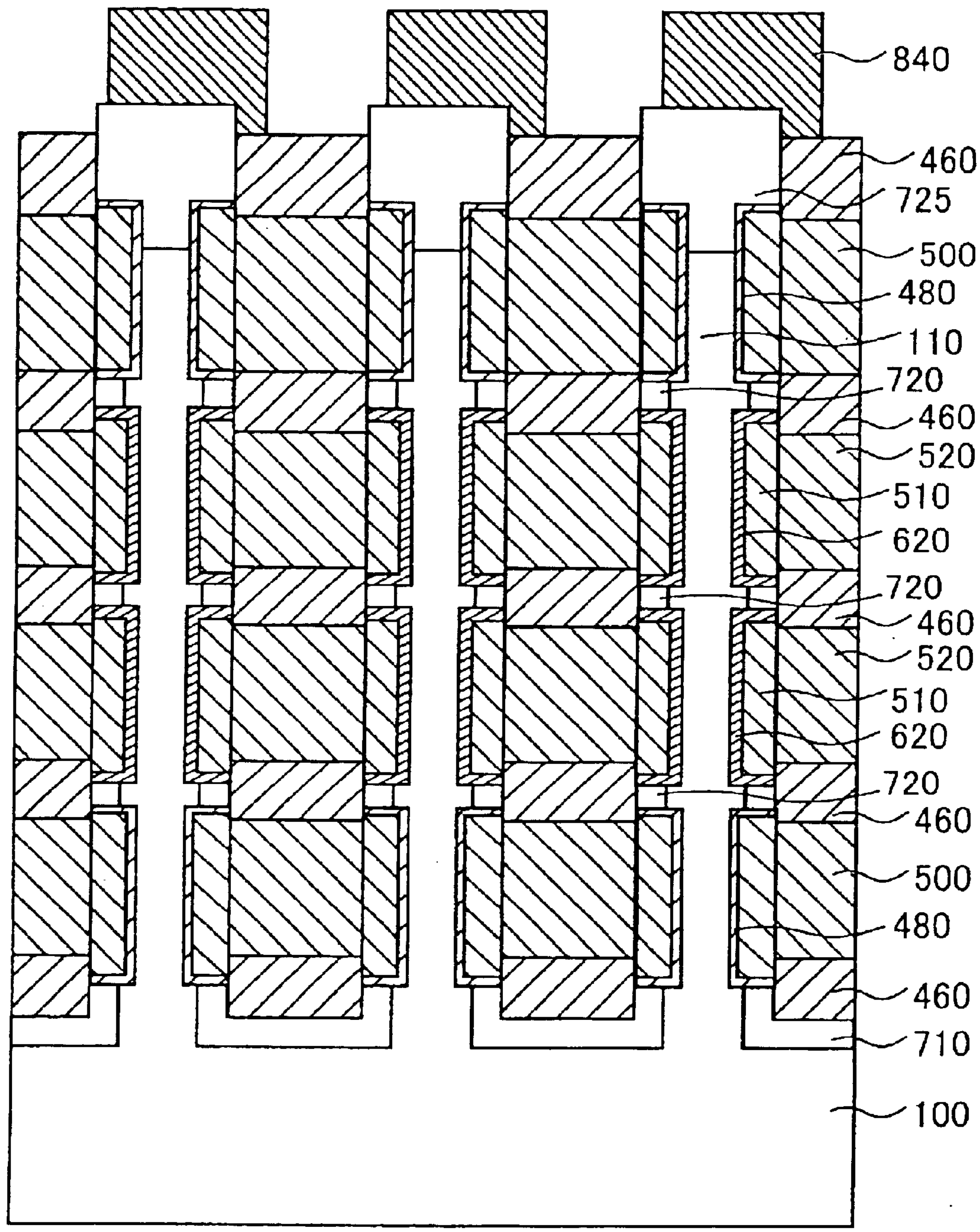
Figure 25:
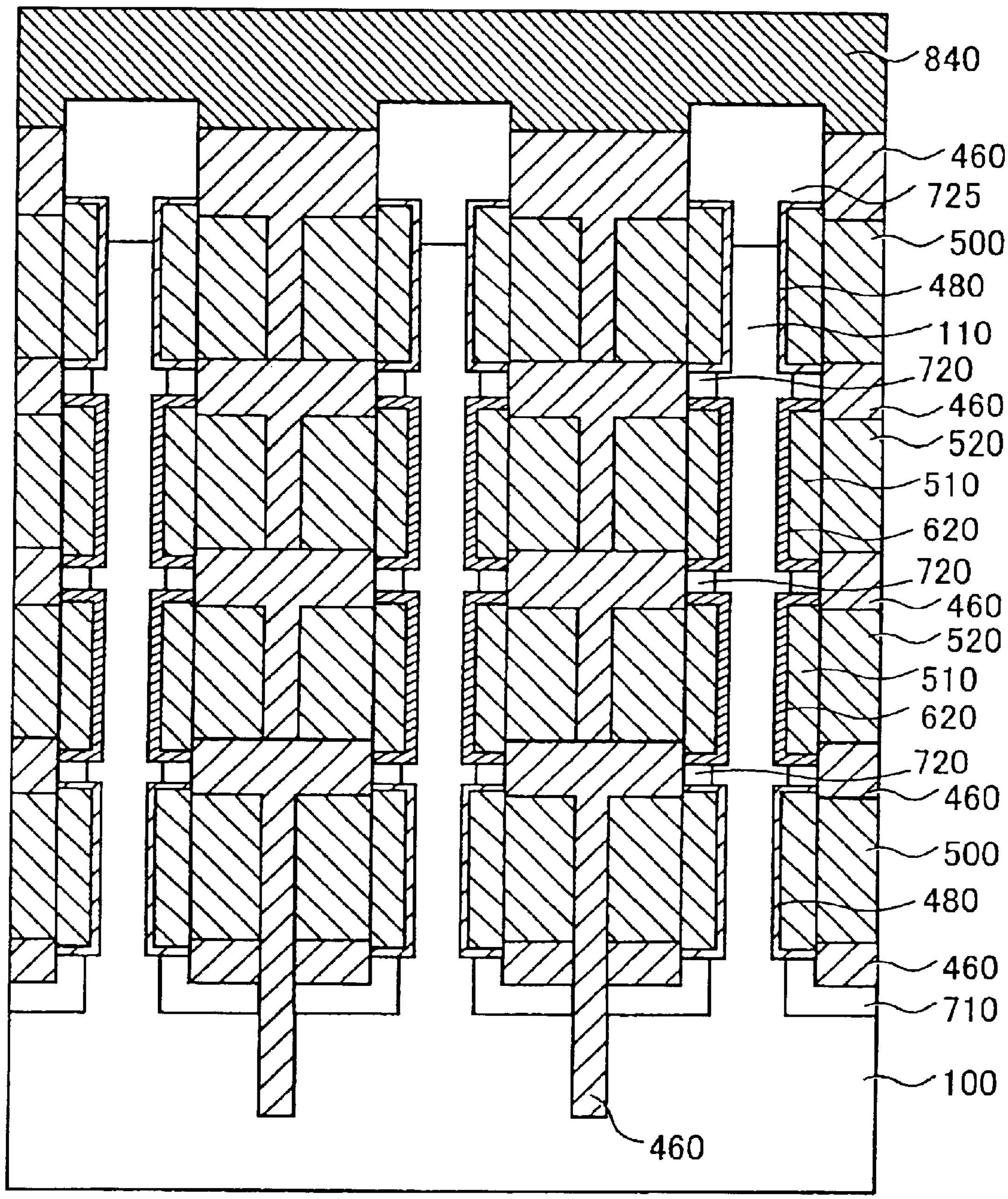
Figure 26:
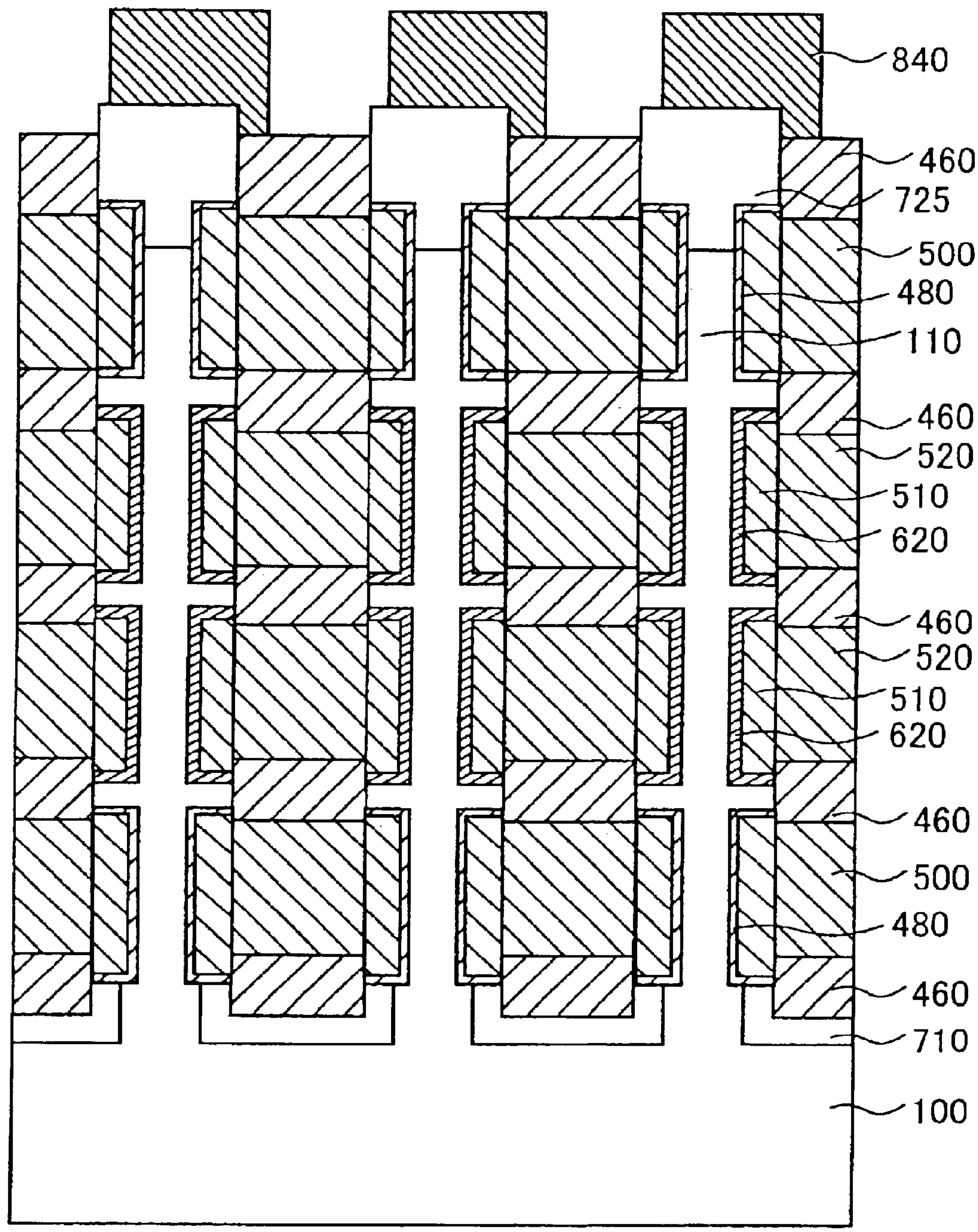
Figure 27:
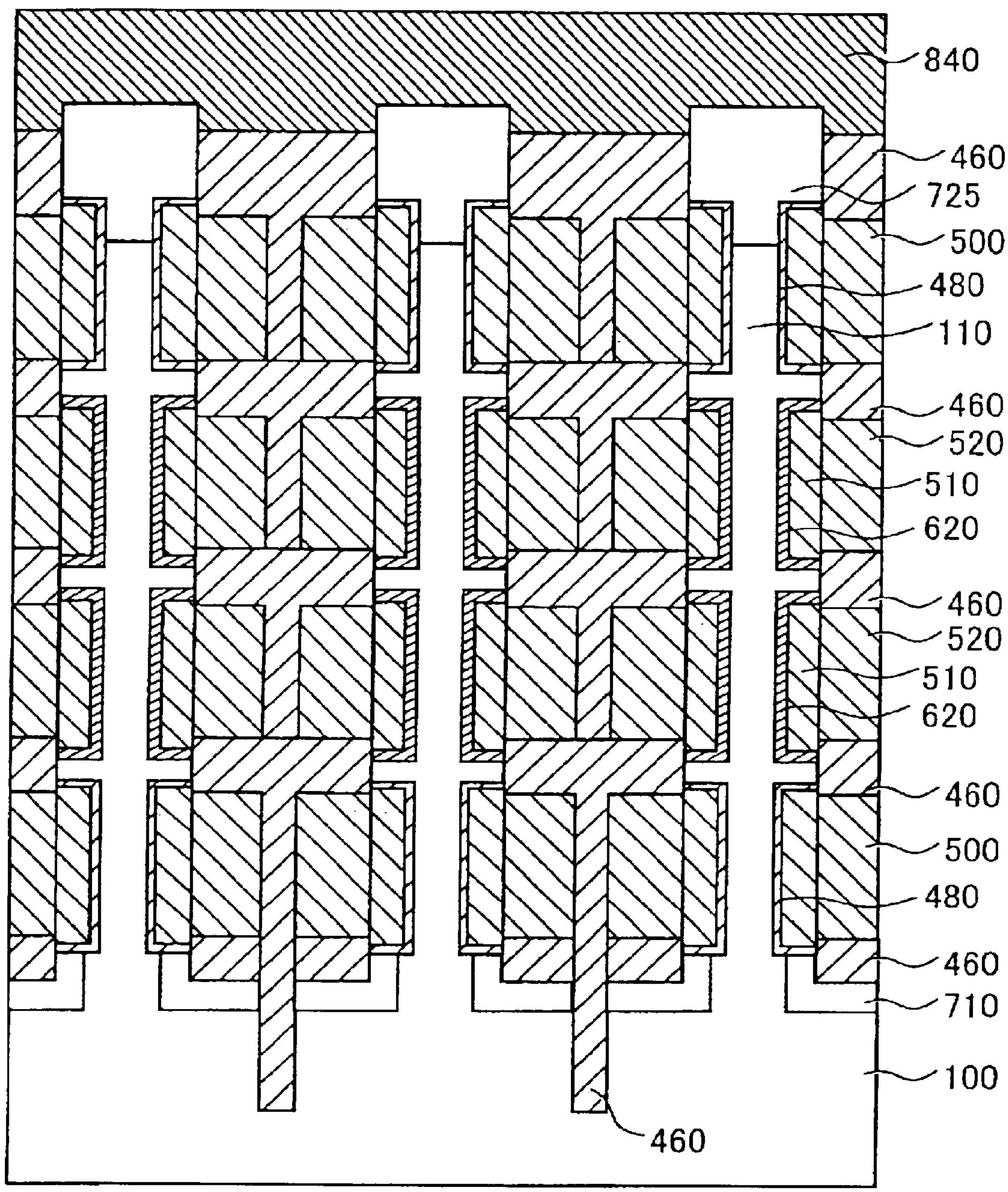
Figure 28:
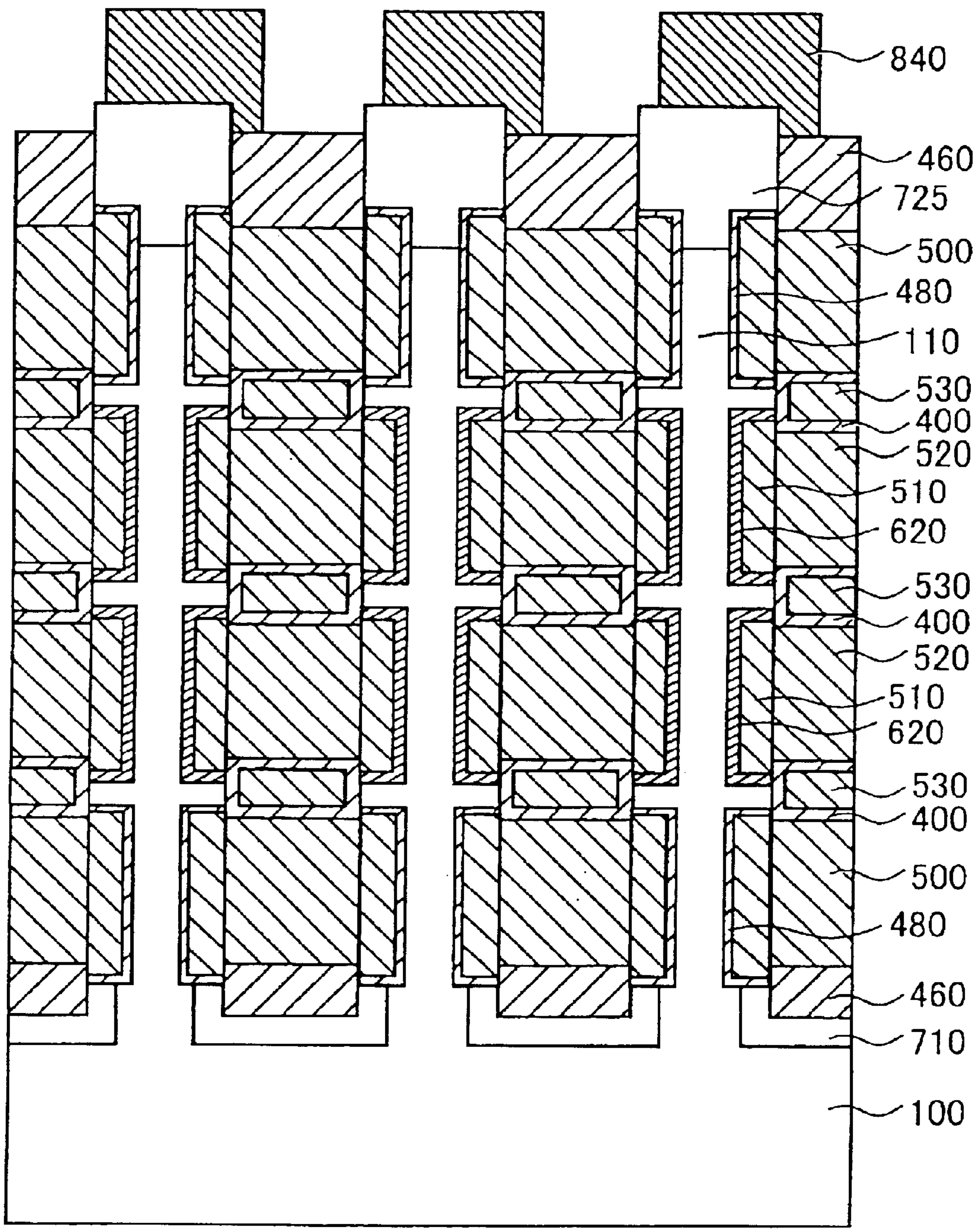
Figure 29:
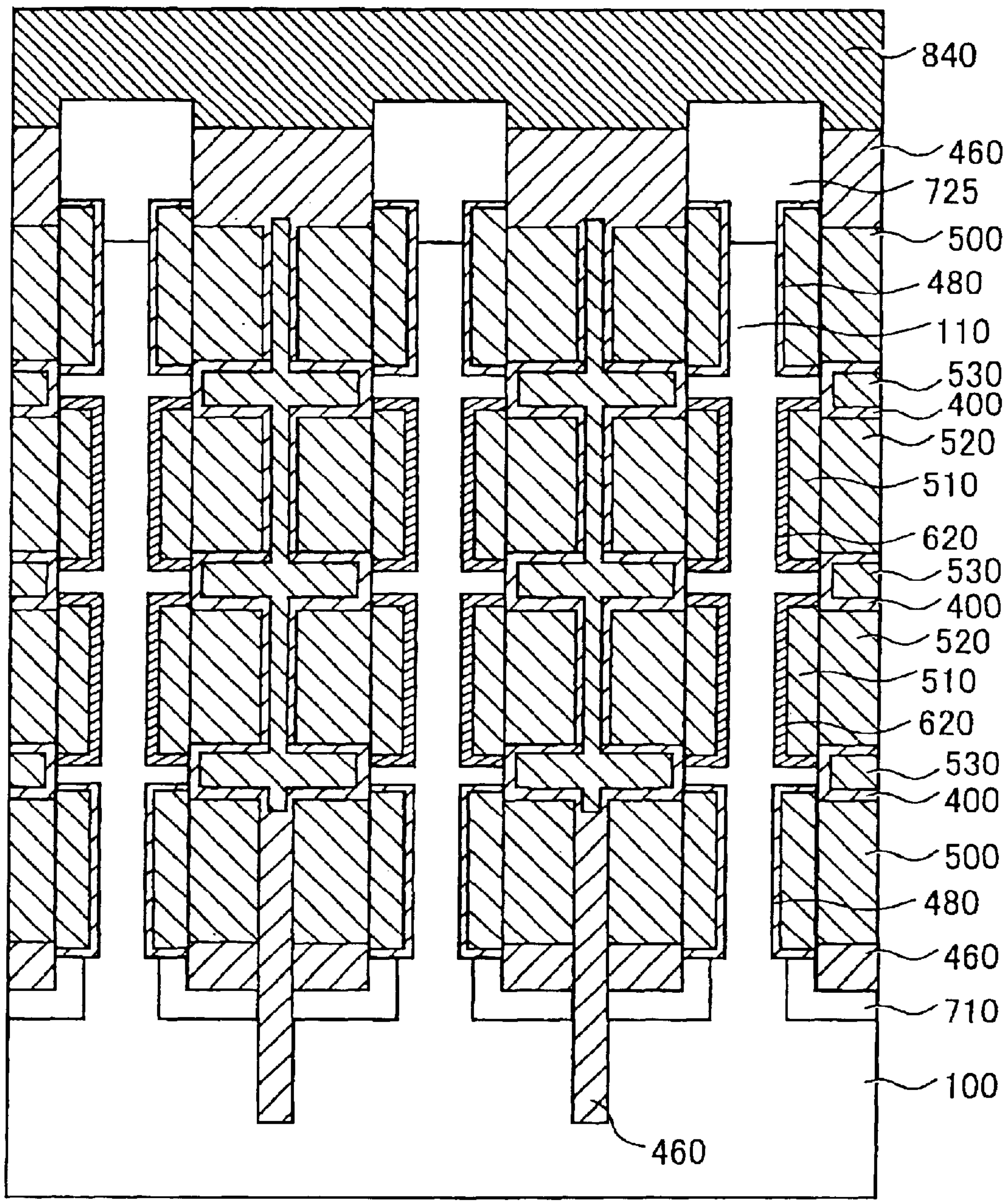

In an example shown in FIG. 22 and FIG. 23, in contrast to FIG. 10 and FIG. 11, the height of the control gate 520 from the surface of the semiconductor substrate is greater than that of the floating gate 510.

FIG. 24 to FIG. 29 show sectional views of a semiconductor memory having layered insulating films as charge storage layers. Among the sectional views shown in FIG. 24 to FIG. 29, odd-numbered figures and even-numbered figures are sectional views taken on line A–A' and line B–B', respectively, in FIG. 9. FIG. 24 to FIG. 29 are the same as FIG. 10 to FIG. 15 except that the floating gates are replaced with the layered insulating films as the charge storage layers.

FIG. 30 to FIG. 43 show sectional views of semiconductor memories having floating gates as charge storage layers. Of FIG. 30 to FIG. 43, even-numbered figures show sectional views taken on line A–A' in FIG. 1 and odd-numbered figures show sectional views taken on line B–B' in FIG. 1.

Figure 30:
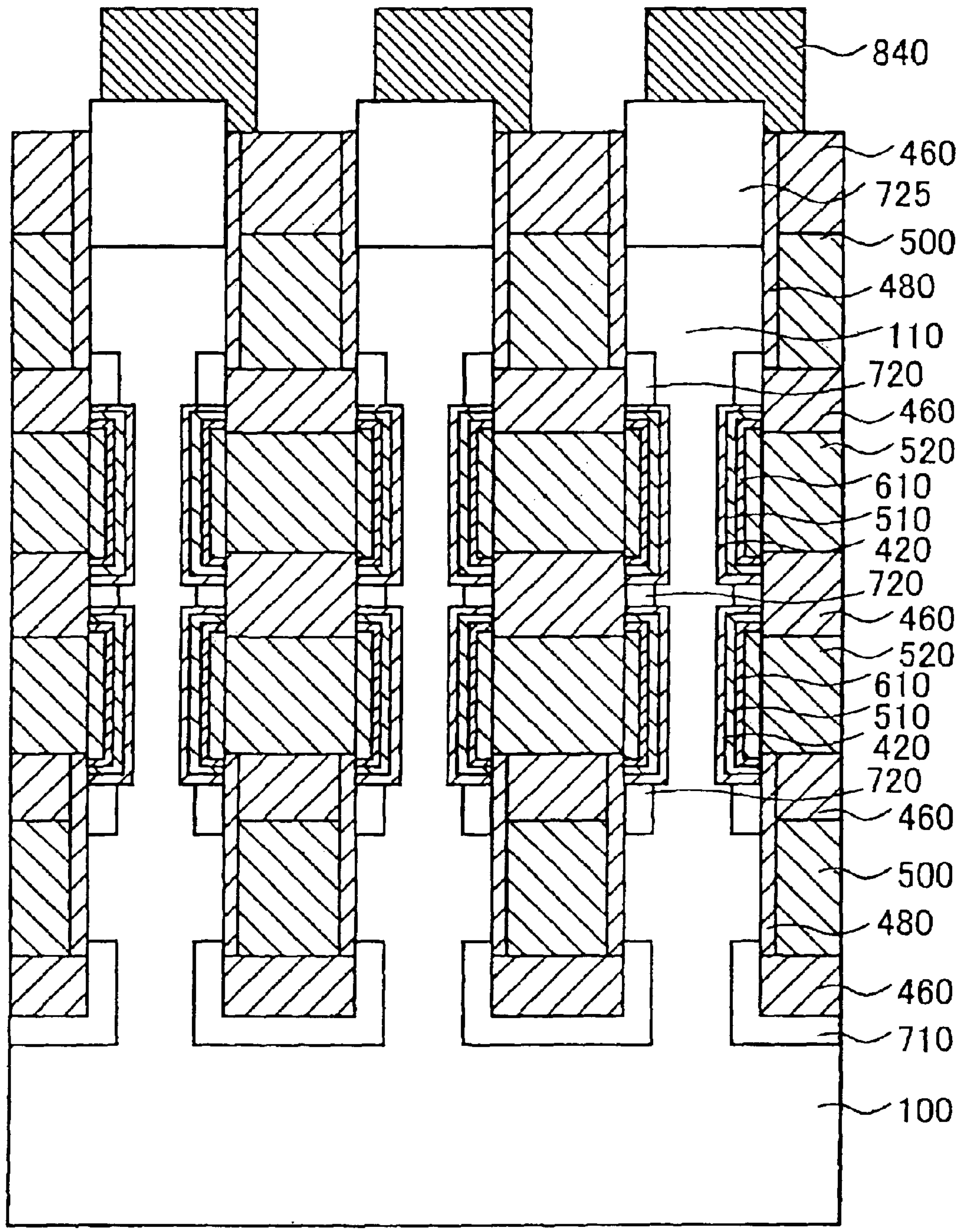
Figure 31:
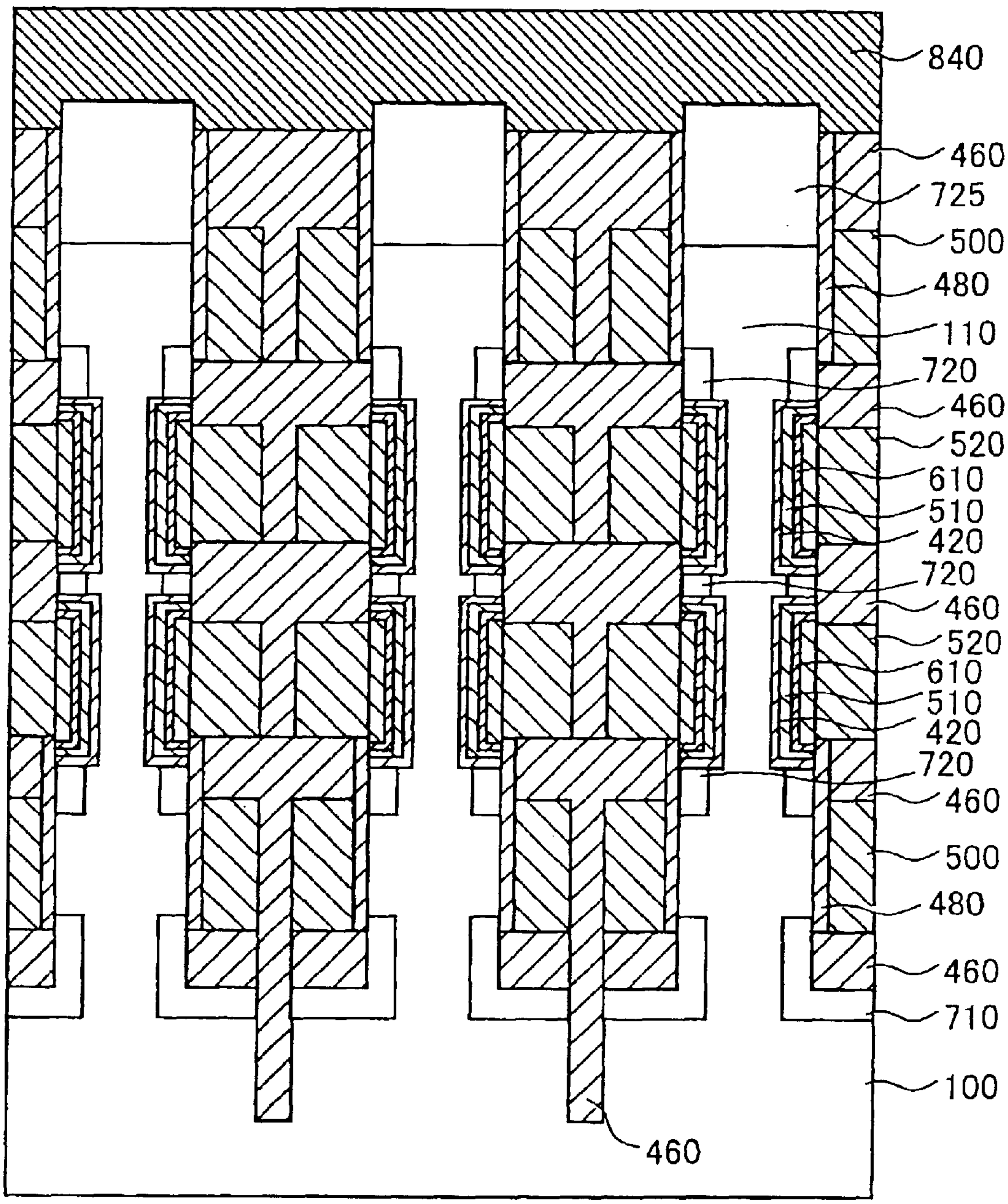

In an example shown in FIG. 30 and FIG. 31, the height of the control gate 520 from the surface of the semiconductor substrate is smaller than that of the floating gate 510.

Figure 32:
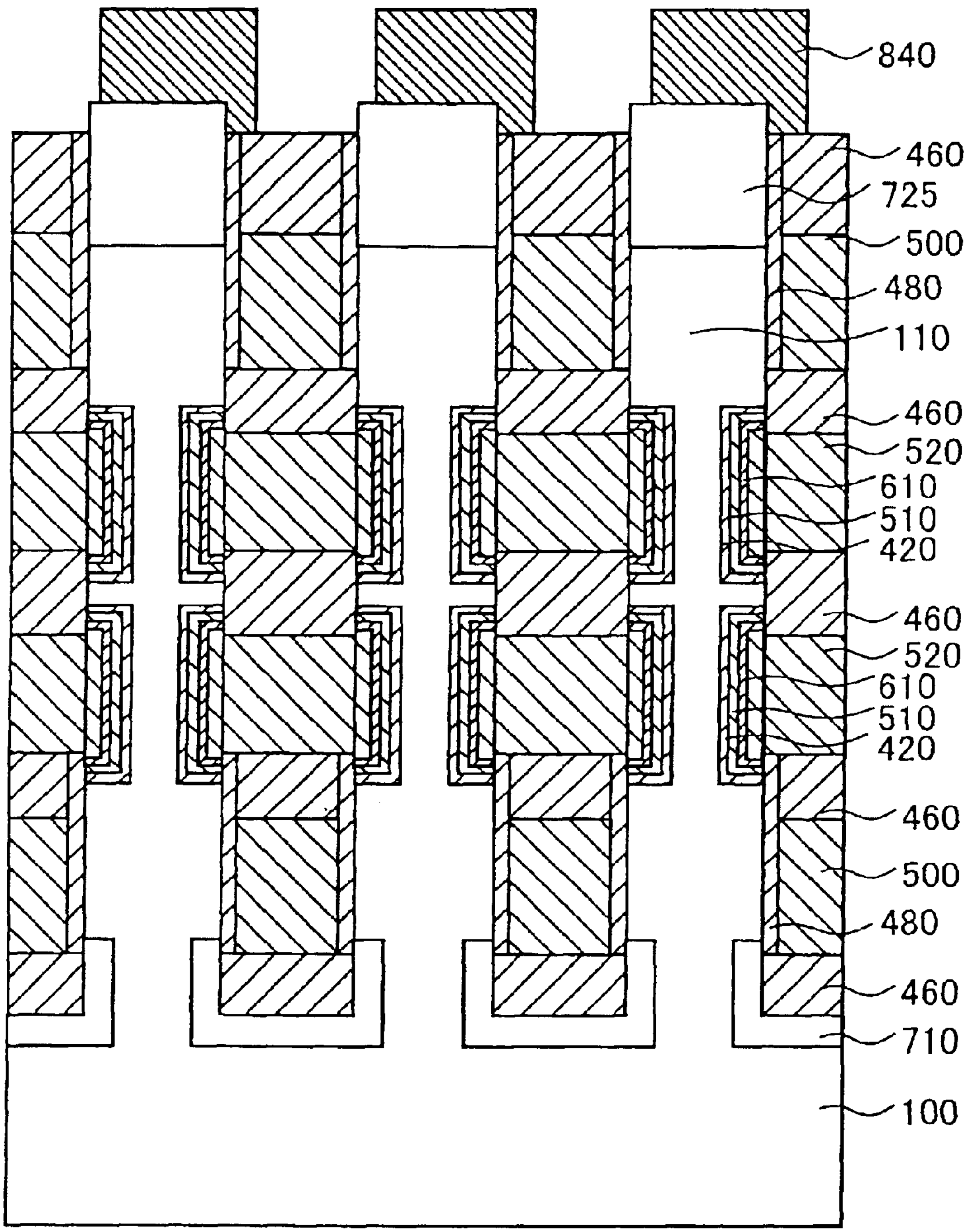
Figure 33:
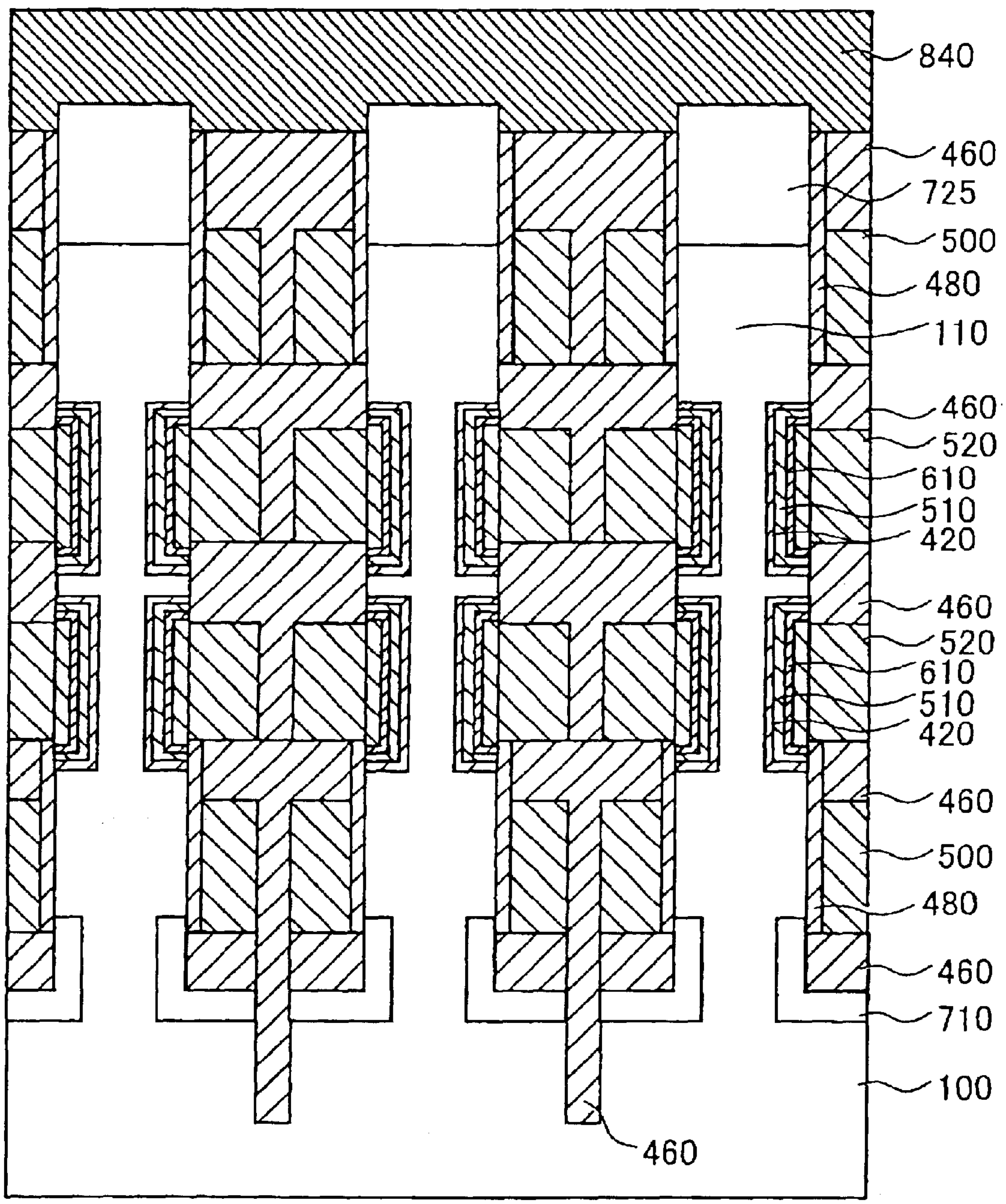

In an example shown in FIG. 32 and FIG. 33, the diffusion layers 720 are not provided between the transistors.

Figure 34:
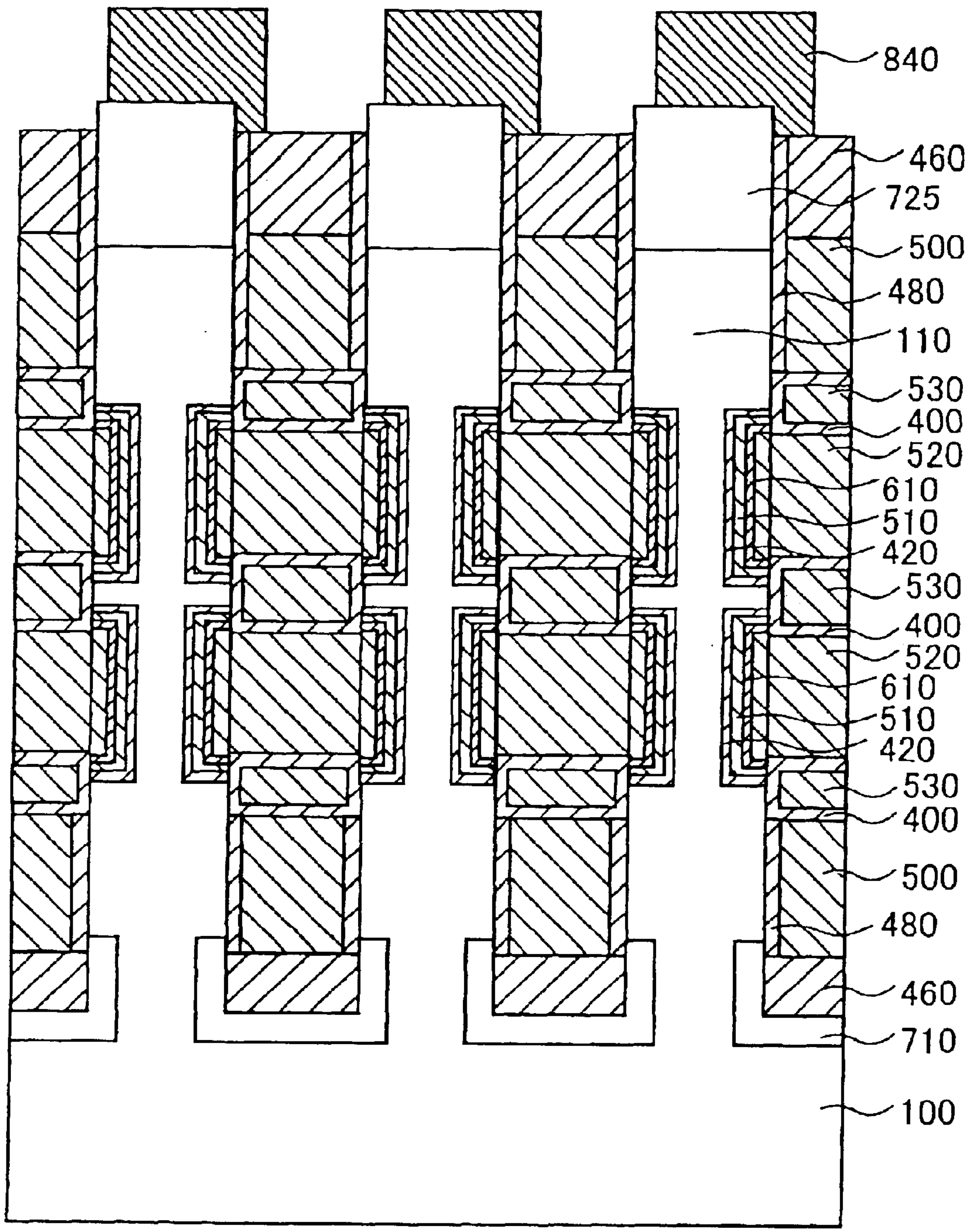
Figure 35:
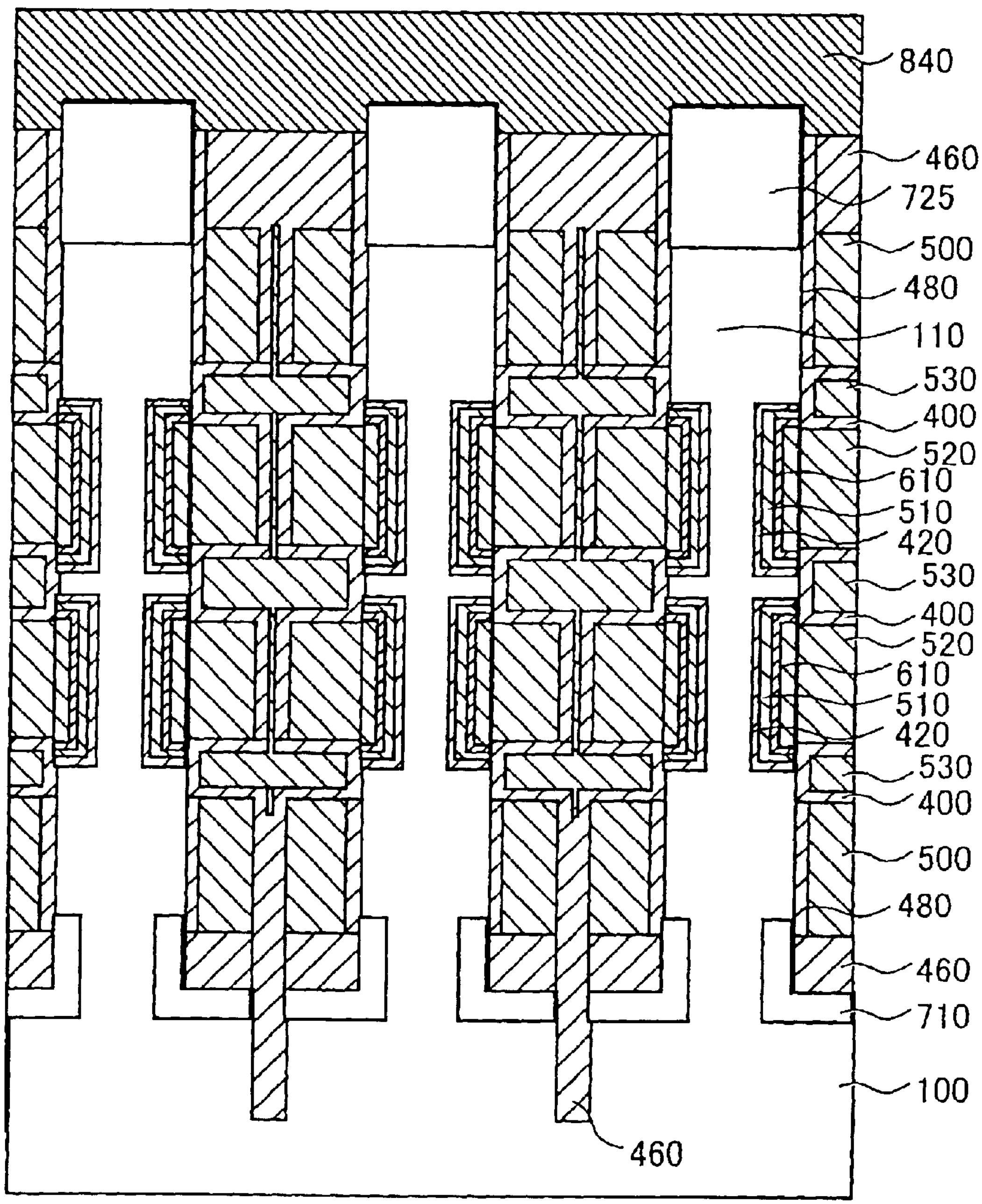

In an example shown in FIG. 34 and FIG. 35, the diffusion layers 720 are not provided and polysilicon films 530 are formed as third electrodes between the gate electrodes 500, 510 and 520 of the memory transistors and the selection gate transistors. In FIG. 1, the polysilicon films 530 as the third electrodes are not shown for avoiding complexity.

Figure 36:
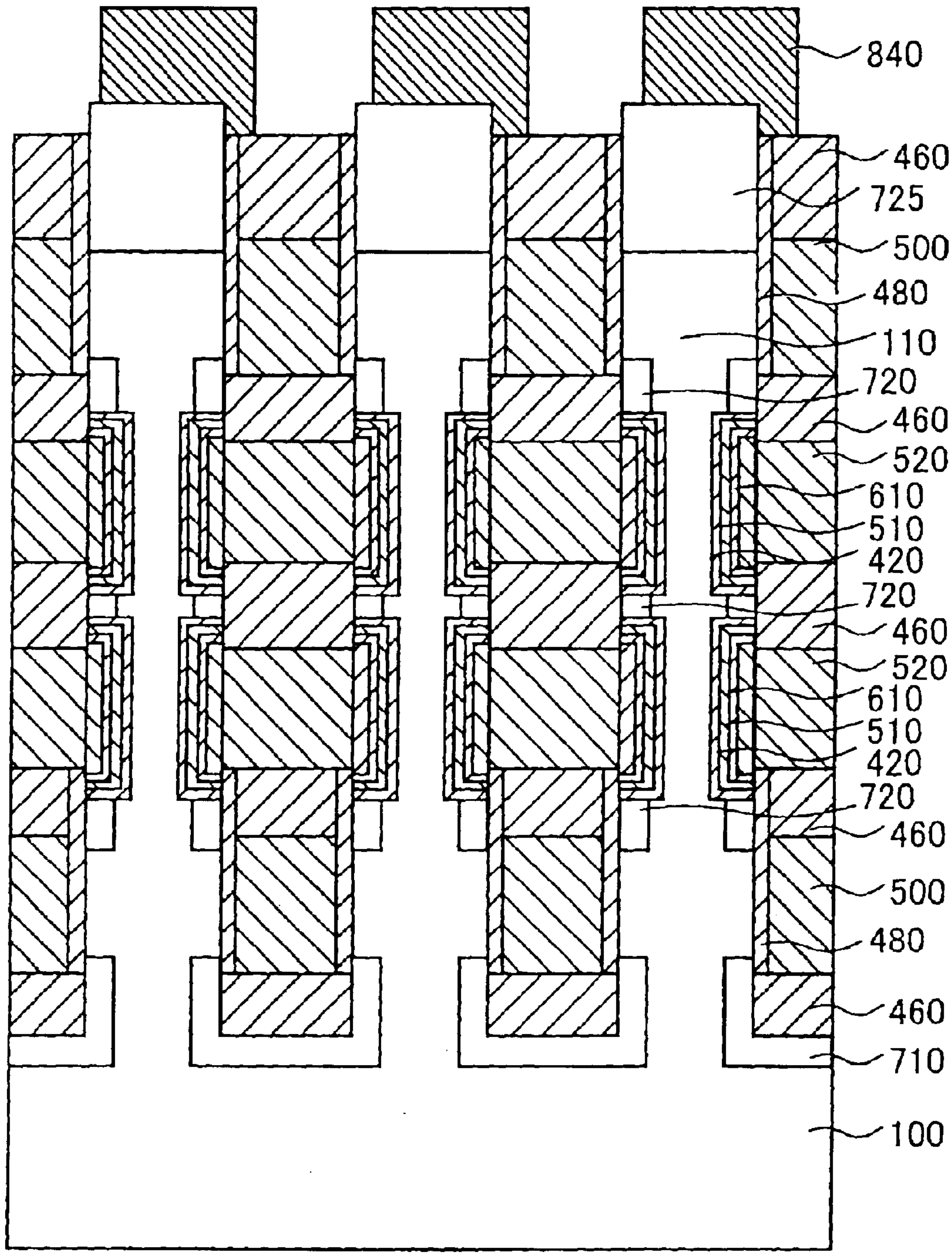
Figure 37:
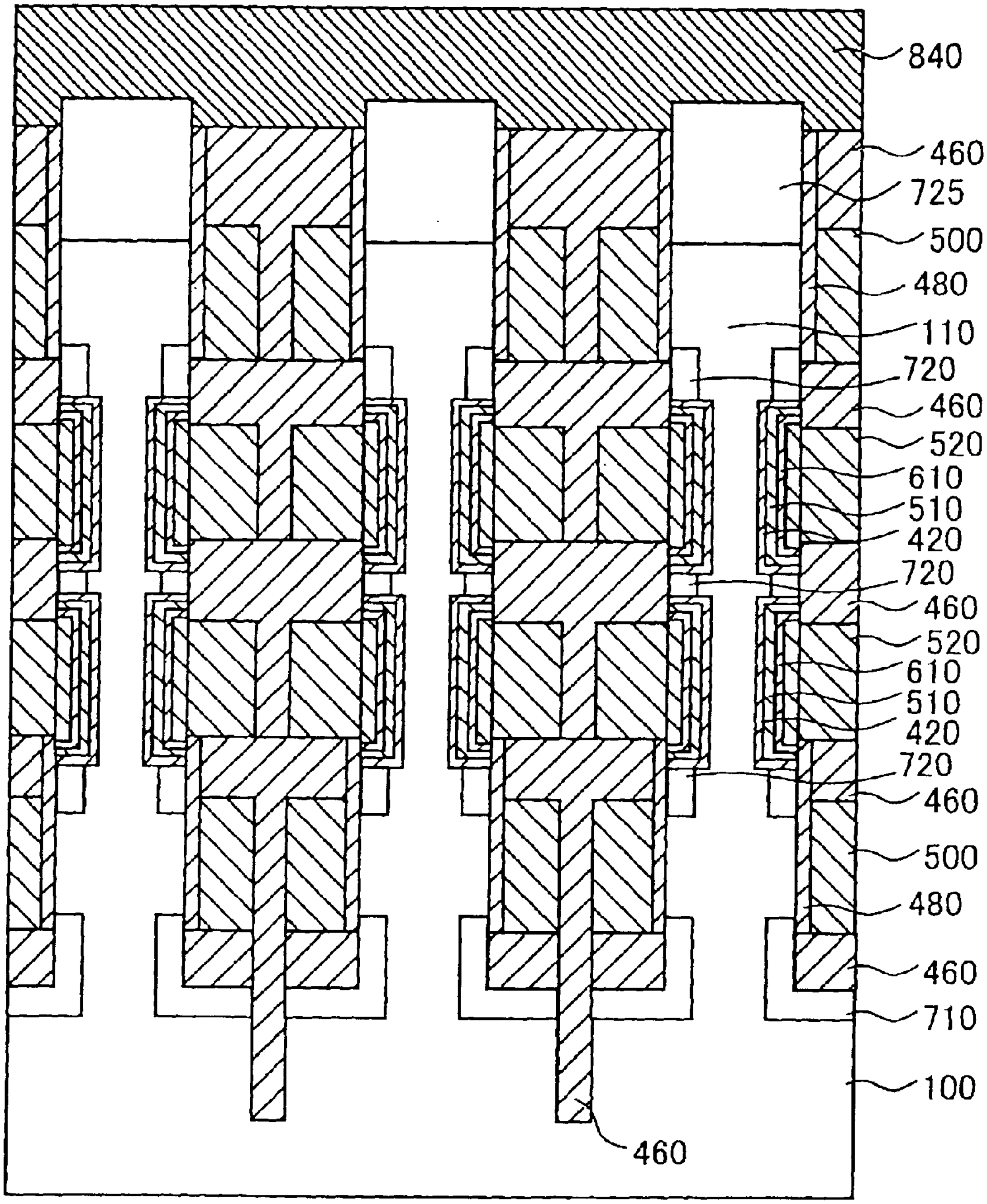

In an example shown in FIG. 36 and FIG. 37, the interlayer insulating film 610 is formed of a single layer film.

Figure 38:
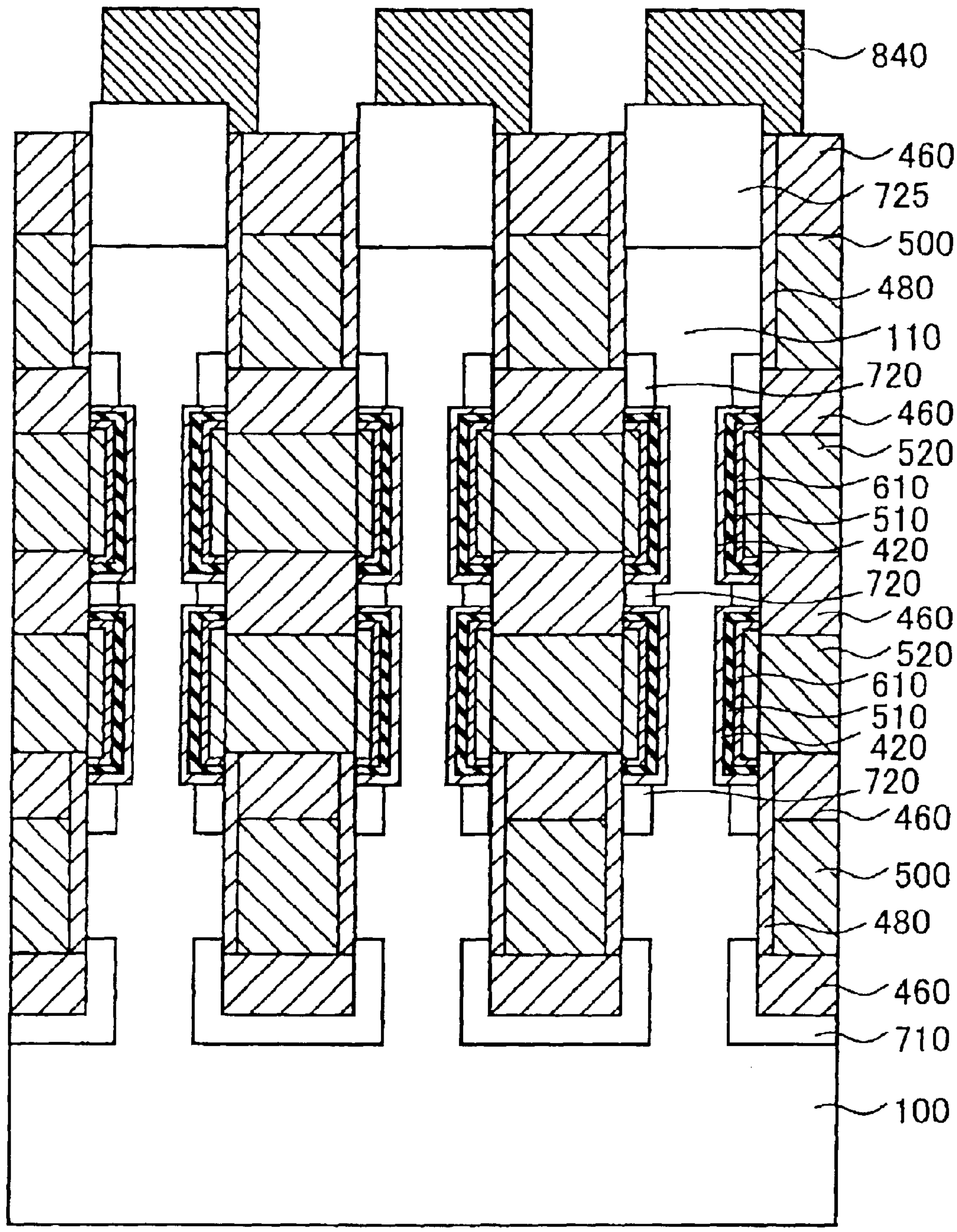
Figure 39:
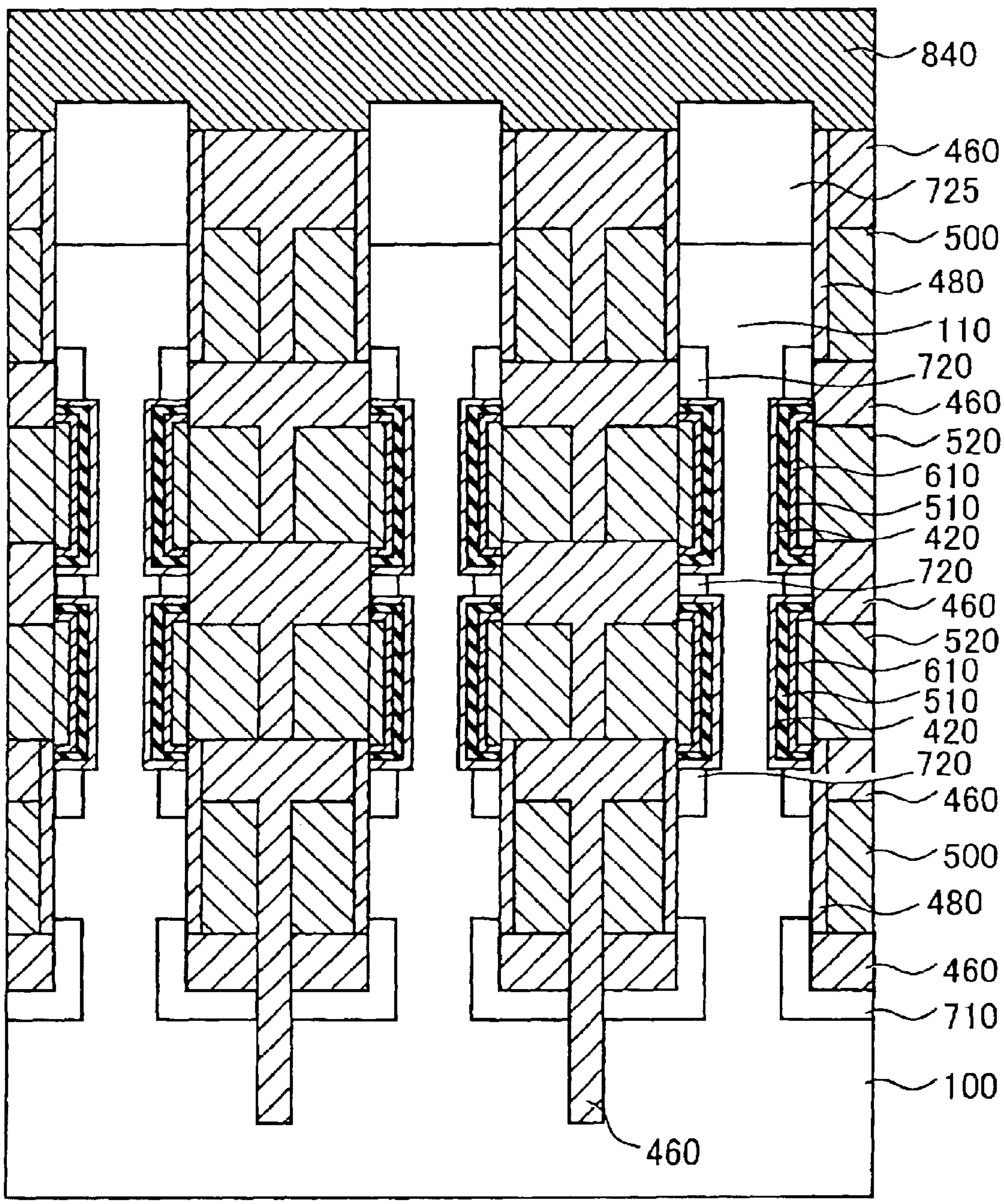

In an example shown in FIG. 38 and FIG. 39, a gate is formed of a material different from that of other gates. More specifically, the control gate 520 and the floating gate 510 of the memory cell are formed of different materials.

Figure 40:
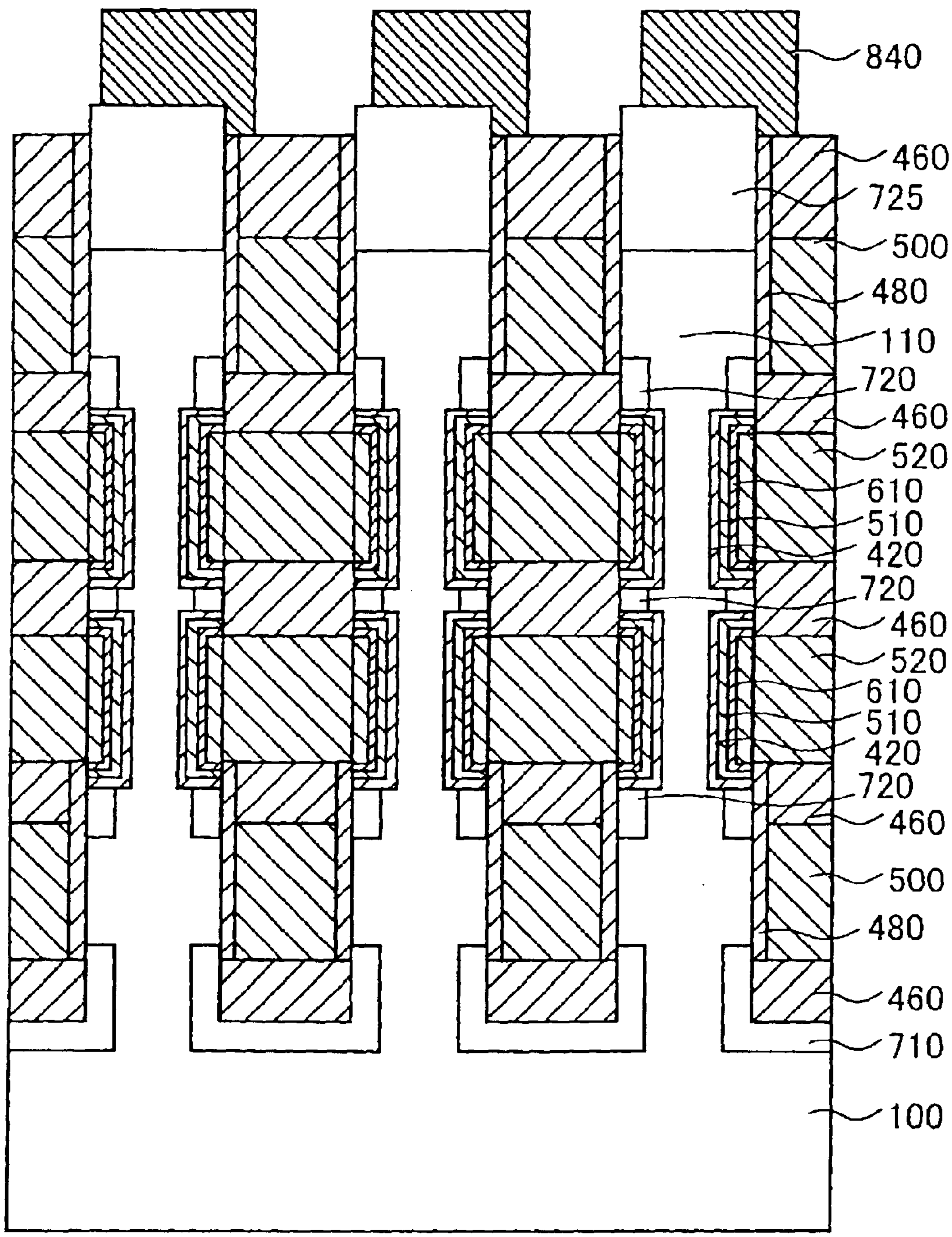
Figure 41:
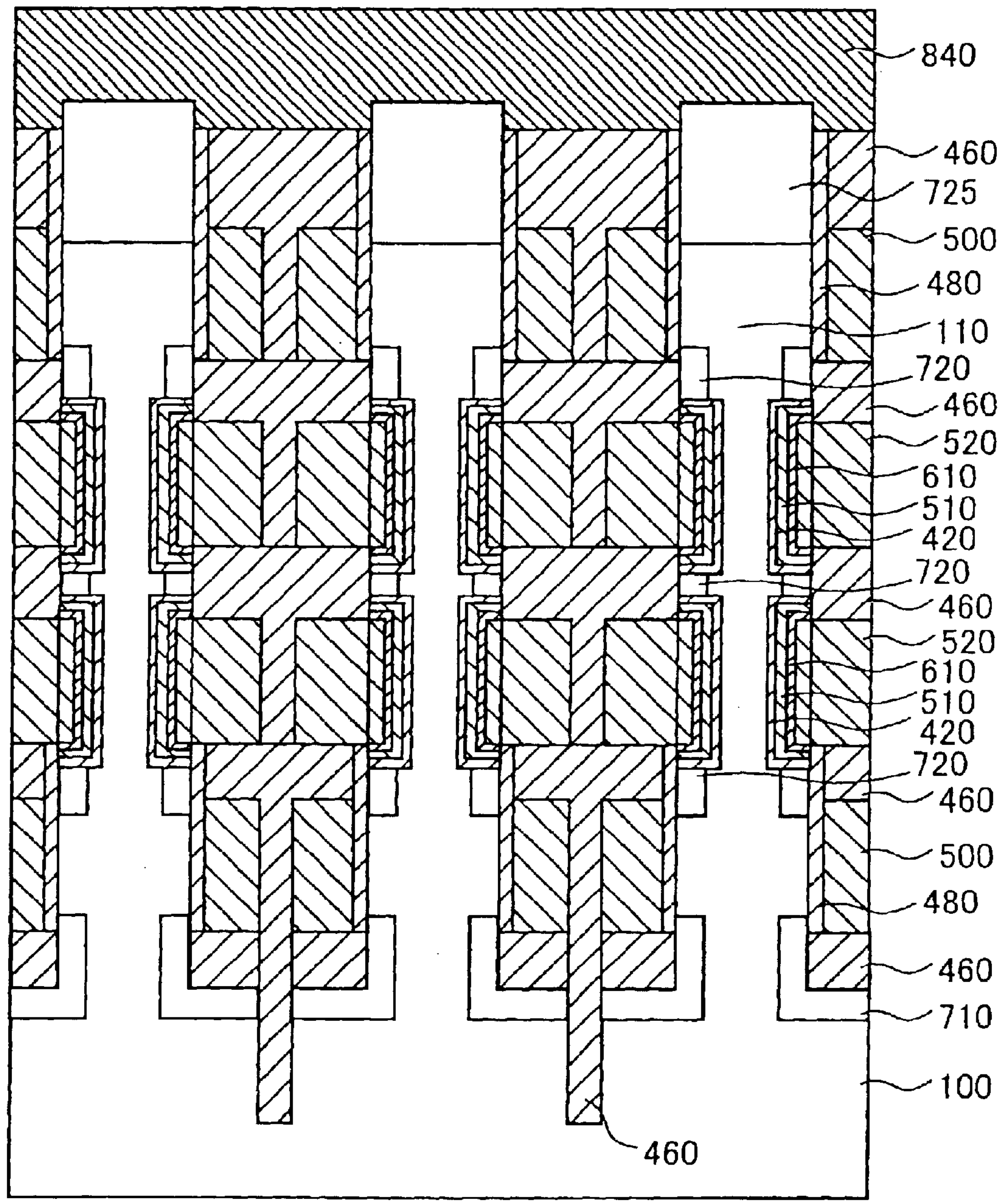

In an example shown in FIG. 40 and FIG. 41, in contrast to FIG. 30 and FIG. 31, the height of the control gate 520 from the surface of the semiconductor substrate is equal to that of the floating gate 510.

Figure 42:
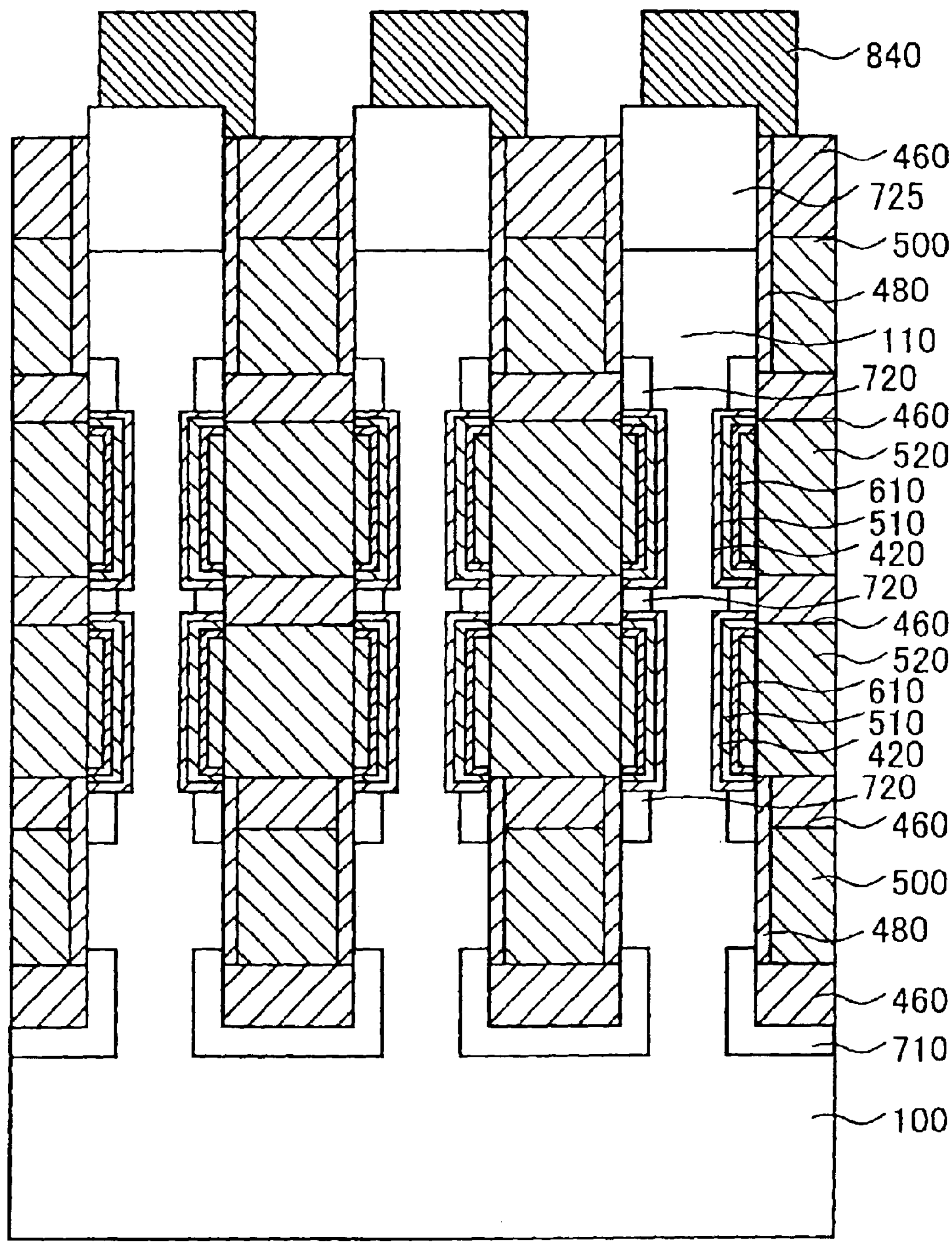
Figure 43:
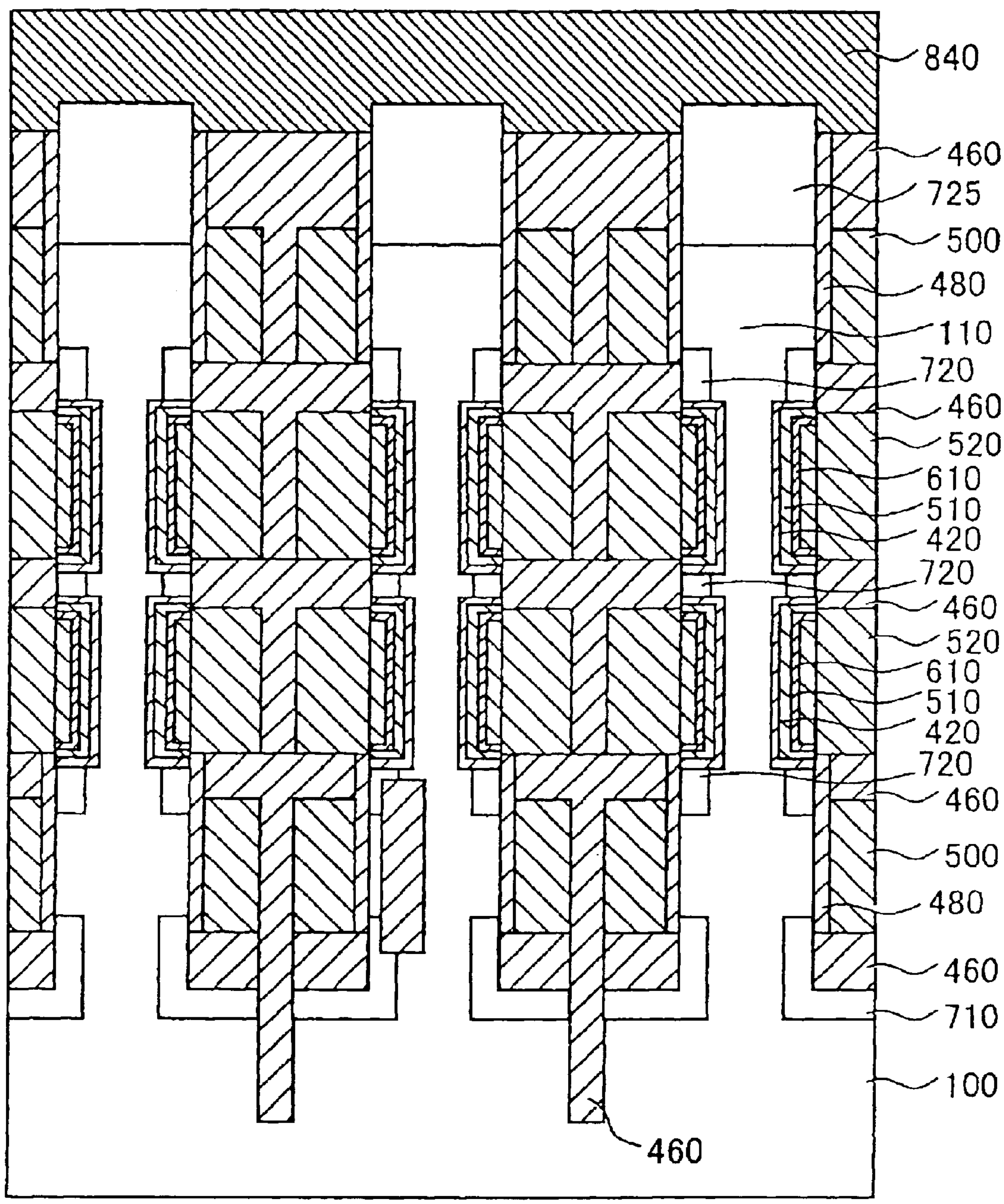
Figure 44:
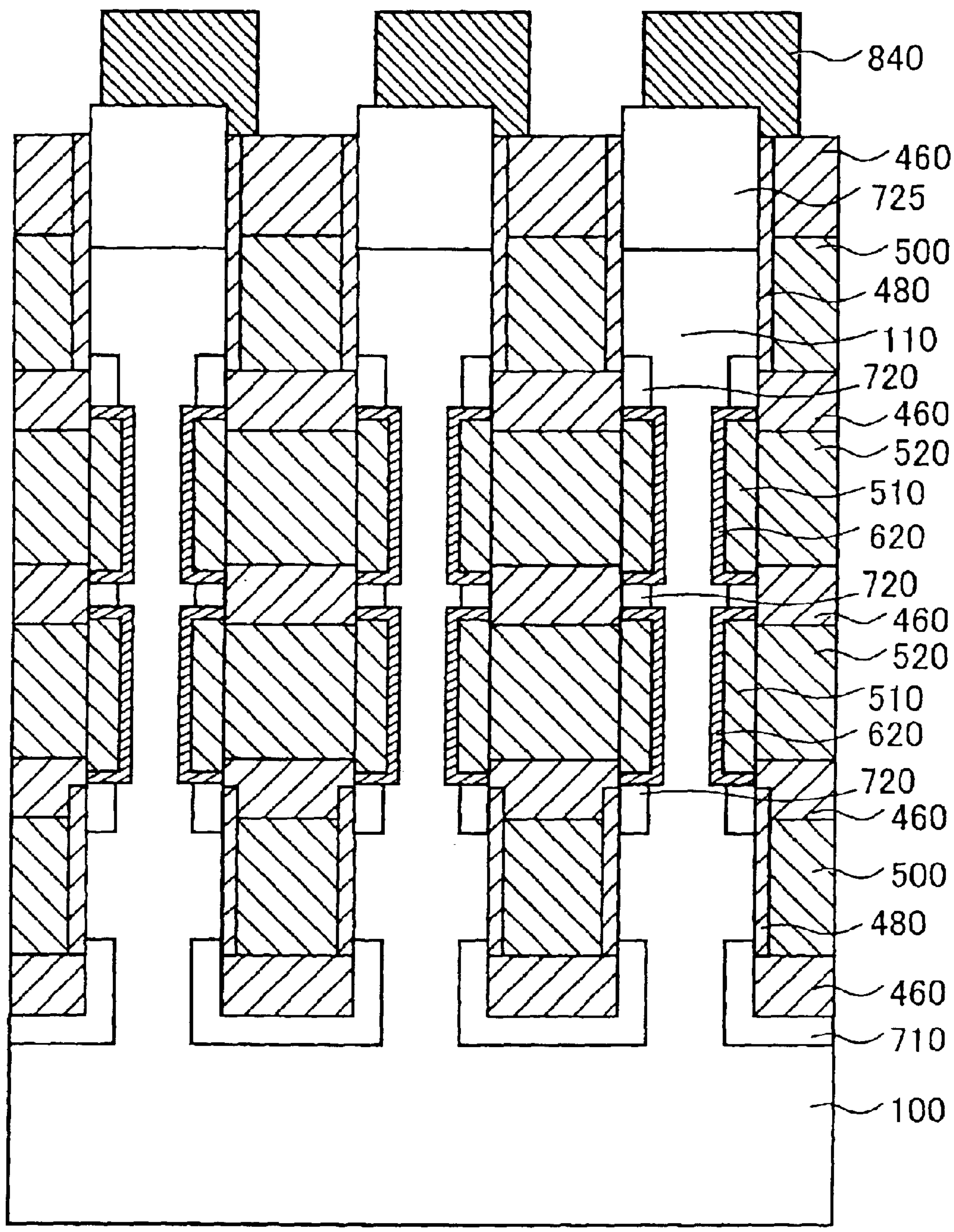
Figure 45:
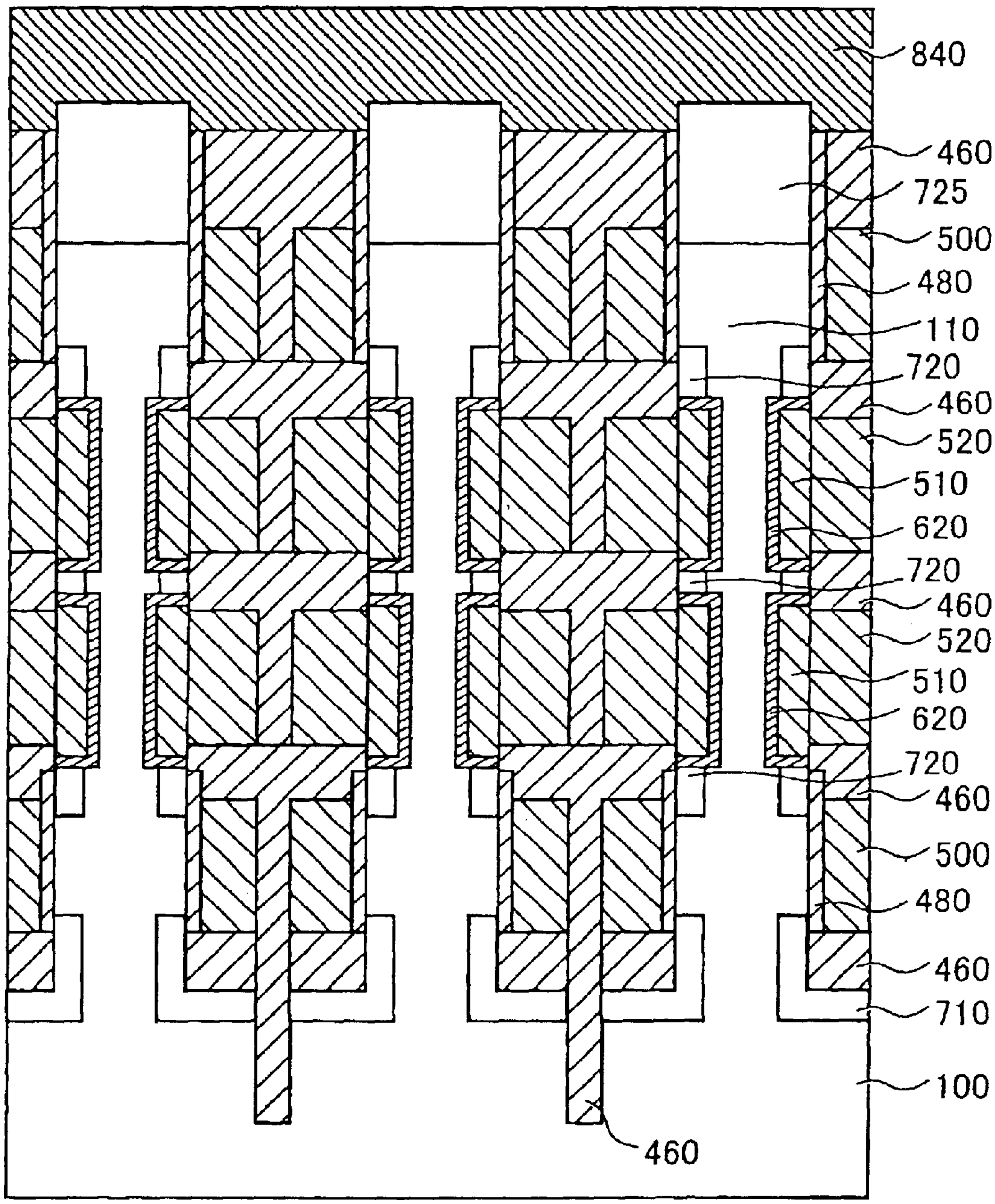
Figure 46:
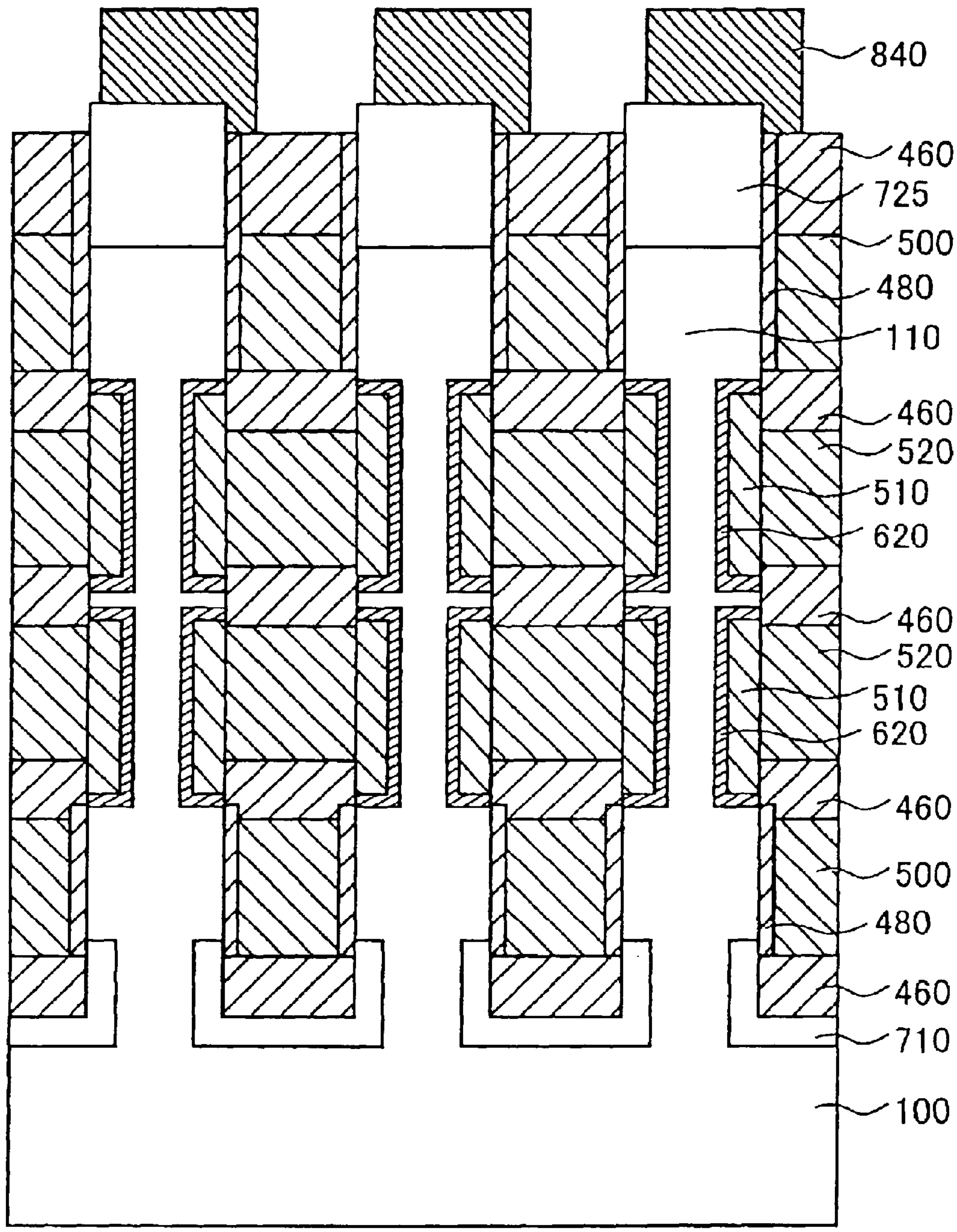
Figure 47:
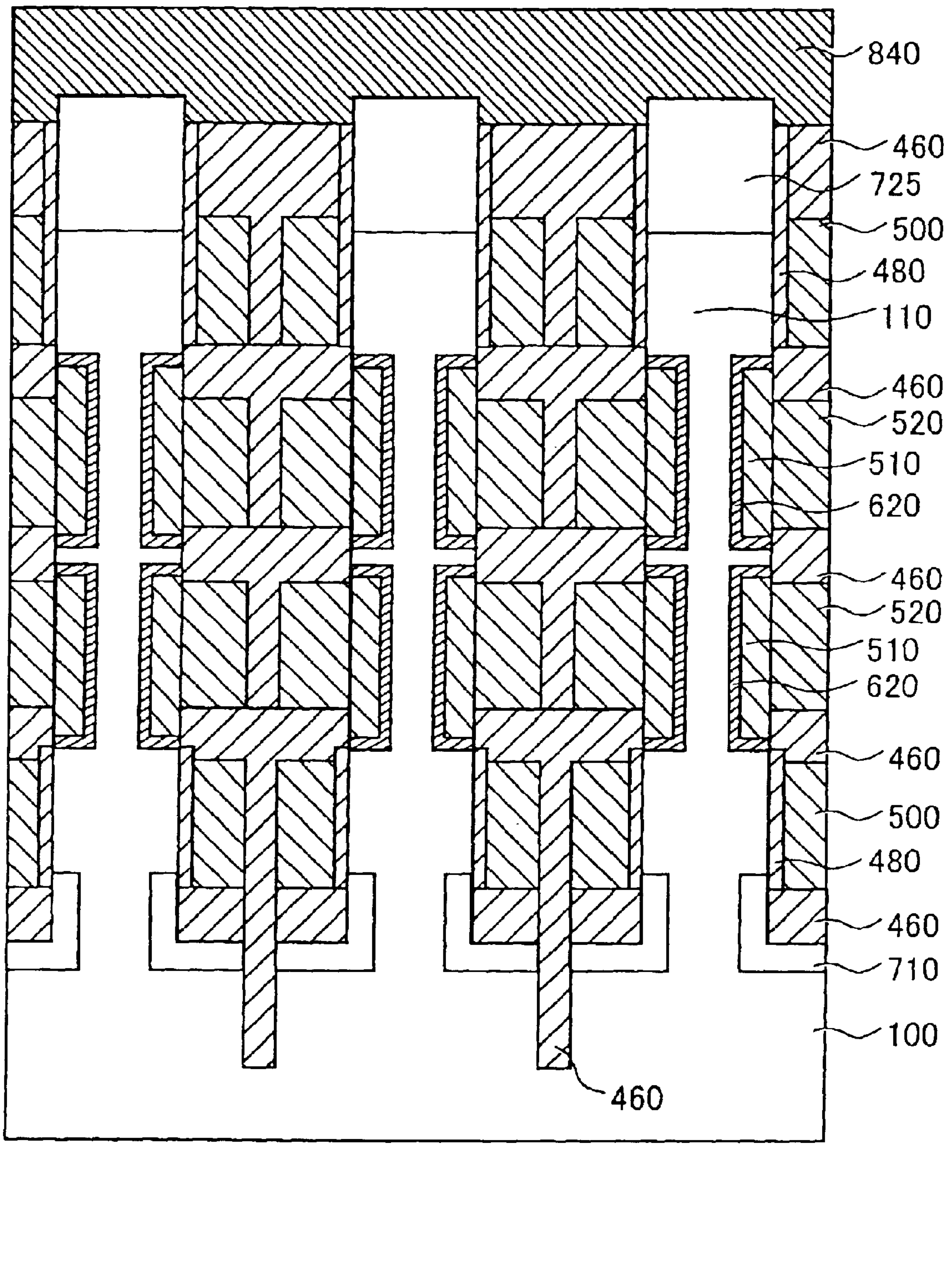
Figure 48:
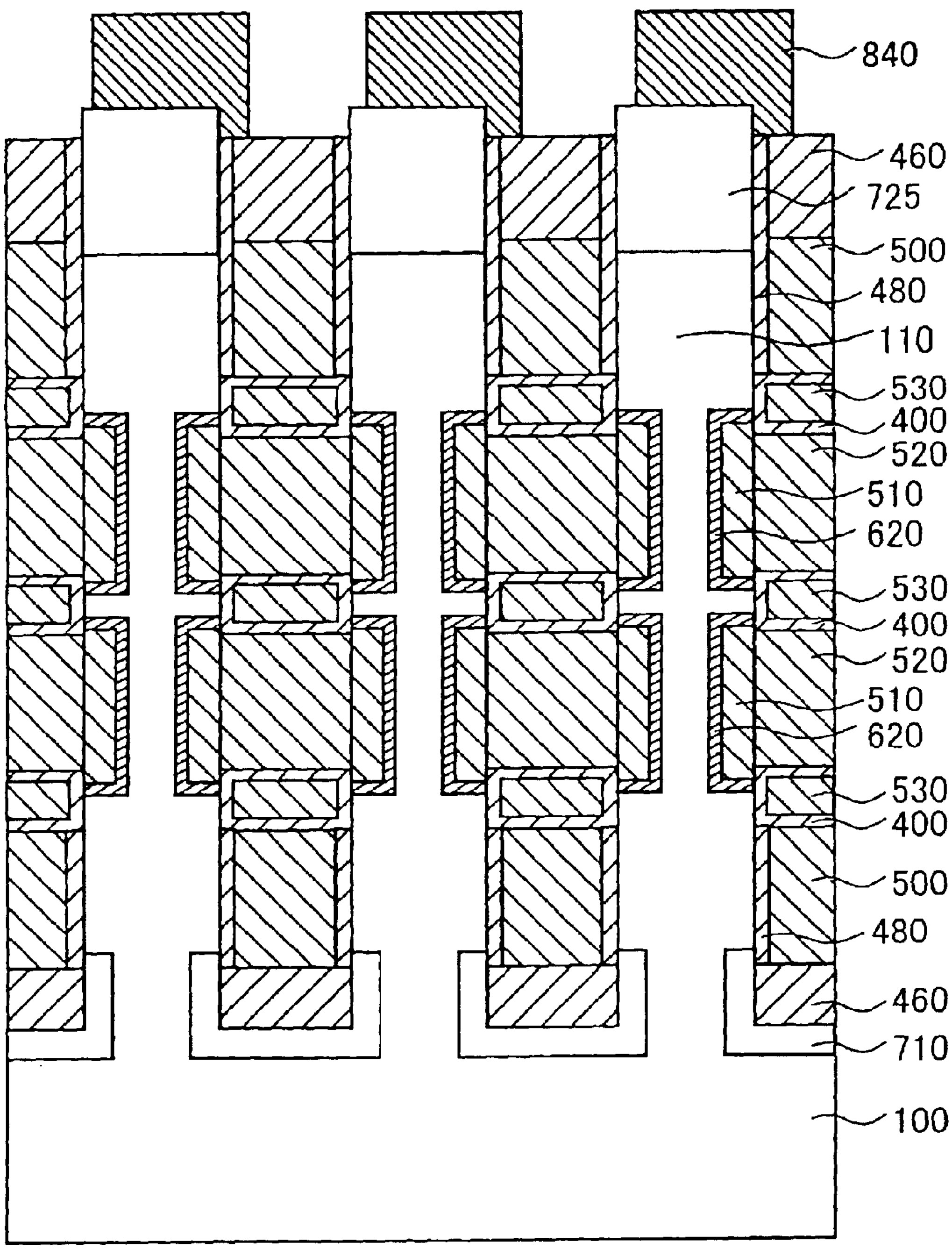
Figure 49:
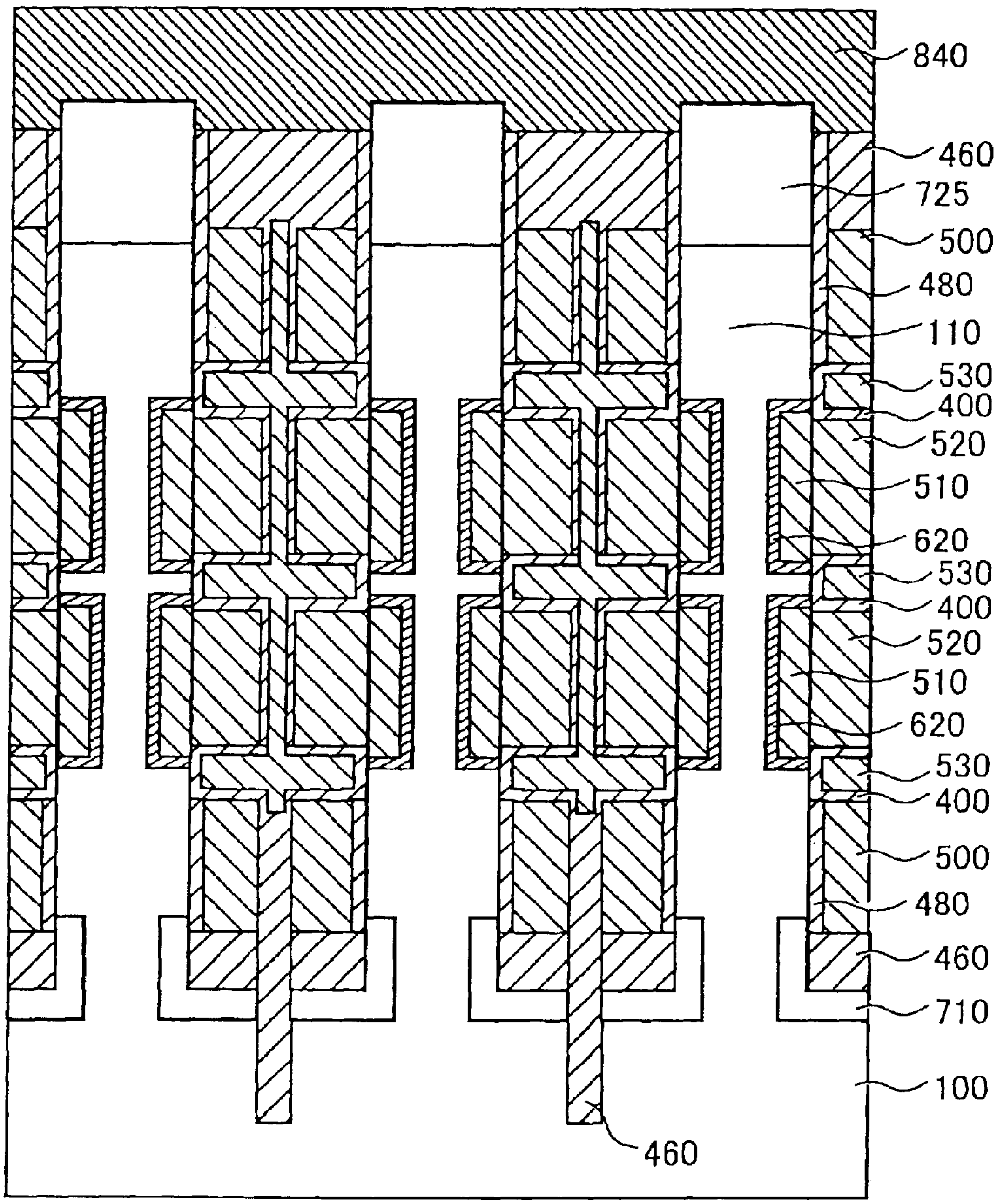

In an example shown in FIG. 42 and FIG. 43, in contrast to FIG. 30 and FIG. 31, the height of the control gate 520 from the surface of the semiconductor substrate is greater than that of the floating gate 510.

FIG. 44 to FIG. 49 show sectional views of a semiconductor memory having layered insulating films as charge storage layers. Among the sectional views shown in FIG. 44 to FIG. 49, even-numbered figures and odd- numbered figures are sectional views taken on line A–A' and line B–B', respectively, in FIG. 9. FIG. 44 to FIG. 49 are the same as FIG. 30 to FIG. 35 except that the floating gates are replaced with the layered insulating films as the charge storage layers.

FIG. 50 to FIG. 63 show sectional views of semiconductor memories having floating gates as charge storage layers. Of FIG. 50 to FIG. 63, even-numbered figures show sectional views taken on line A–A' in FIG. 1 and odd-numbered figures show sectional views taken on line B–B' in FIG. 1.

Figure 50:
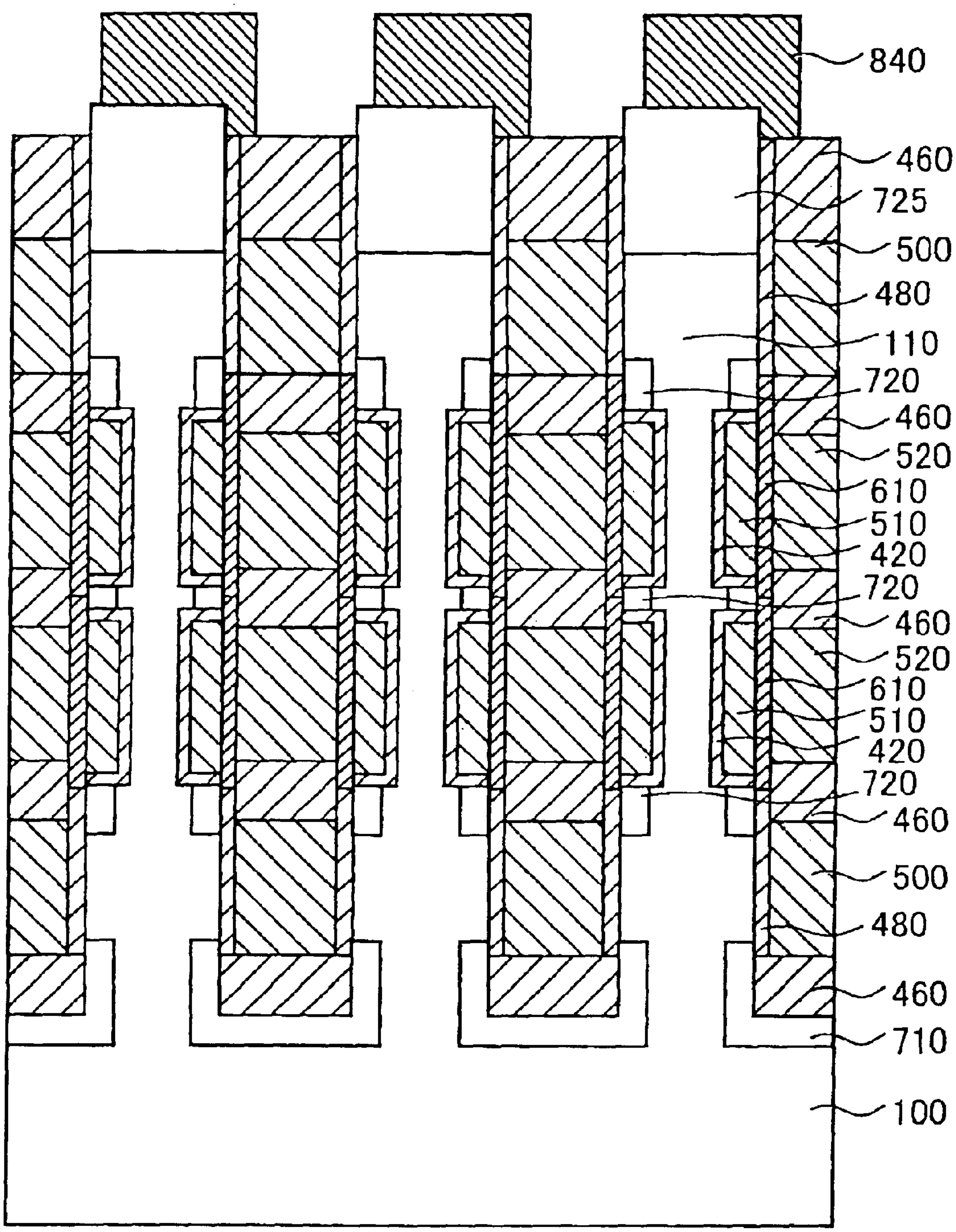
Figure 51:
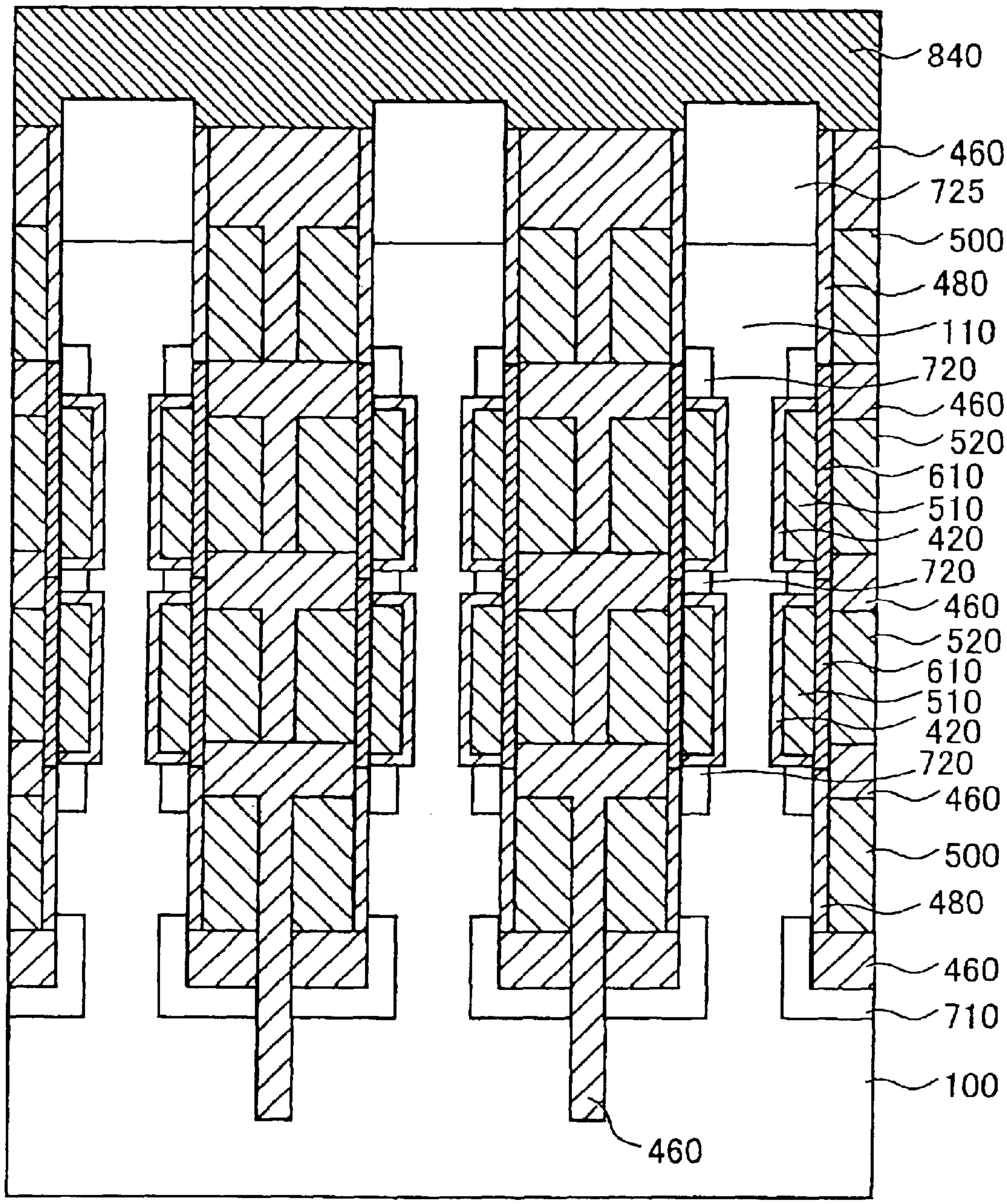

In an example shown in FIG. 50 and FIG. 51, an outer circumference of the floating gate is equal to (flush with) that of the island-like semiconductor layer 110.

Figure 52:
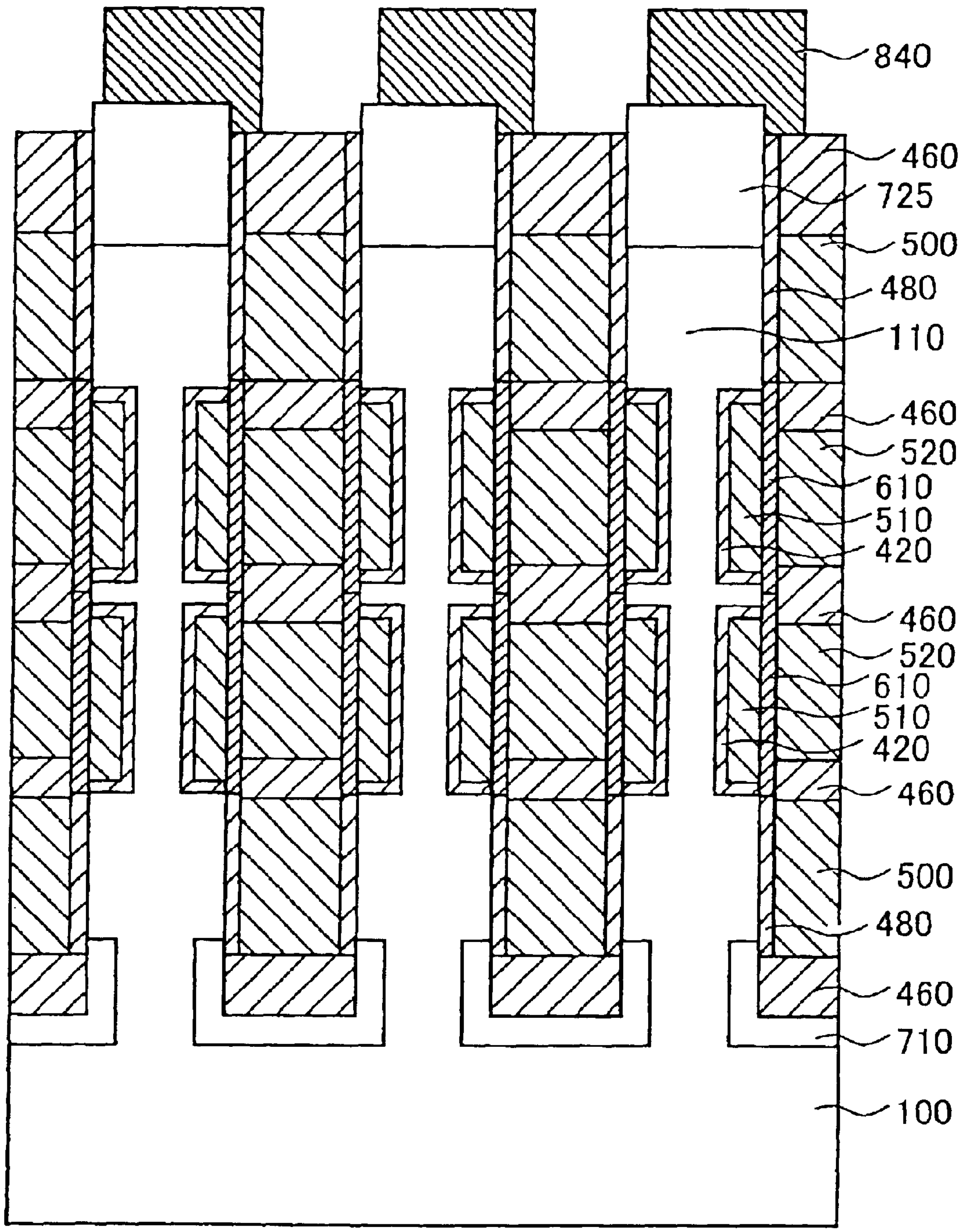
Figure 53:
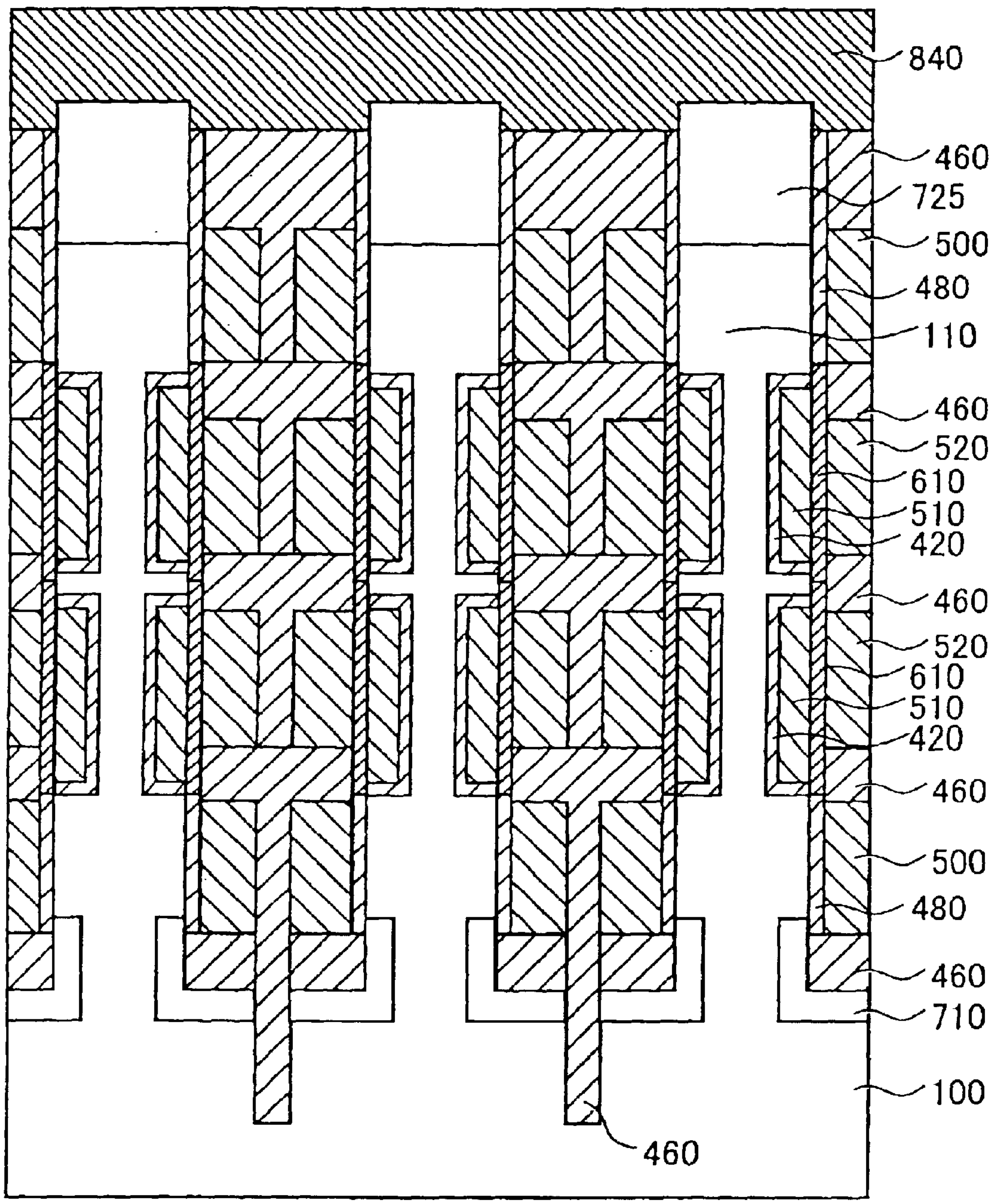

In an example shown in FIG. 52 and FIG. 53, the diffusion layers 720 are not provided between the transistors.

Figure 54:
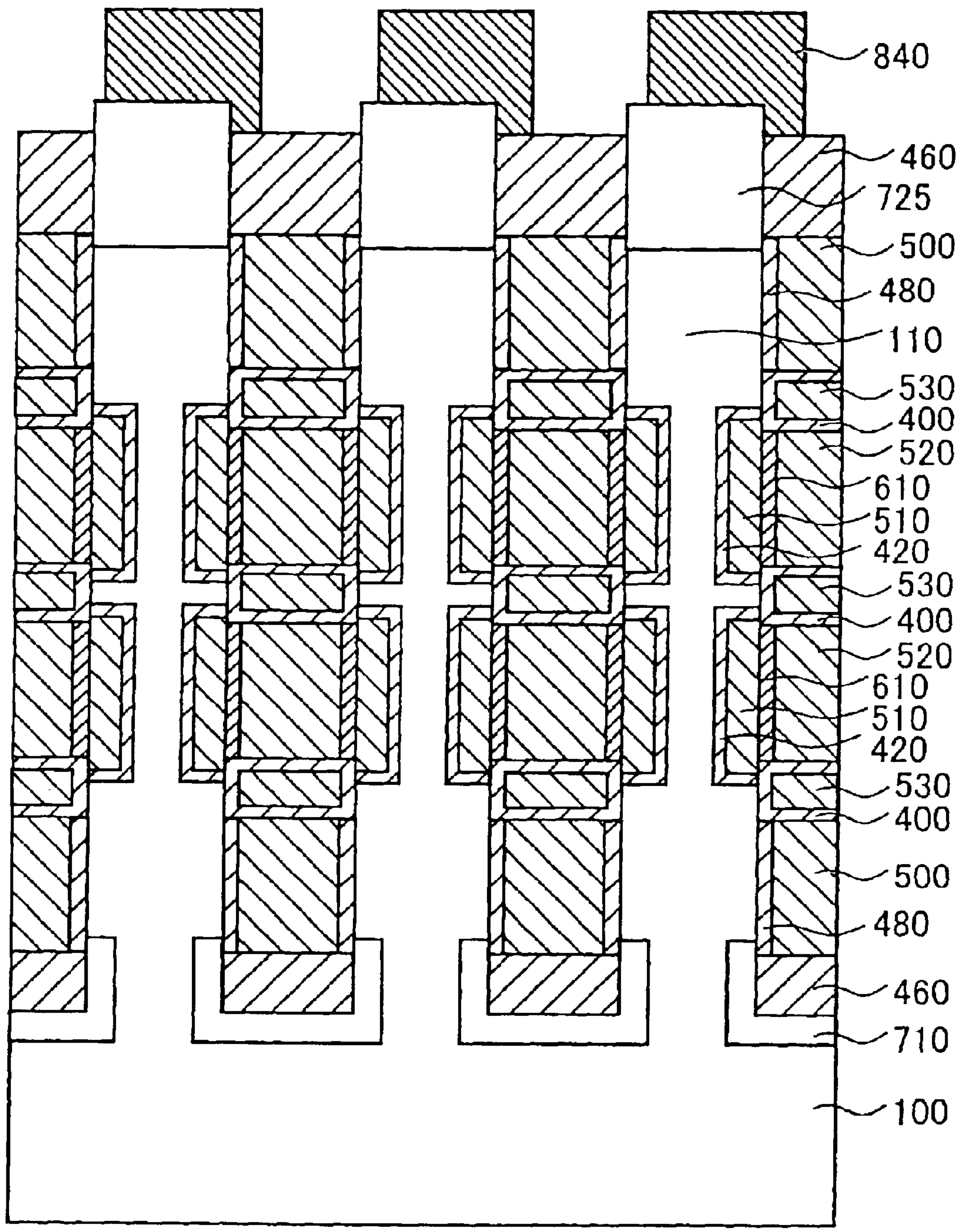
Figure 55:
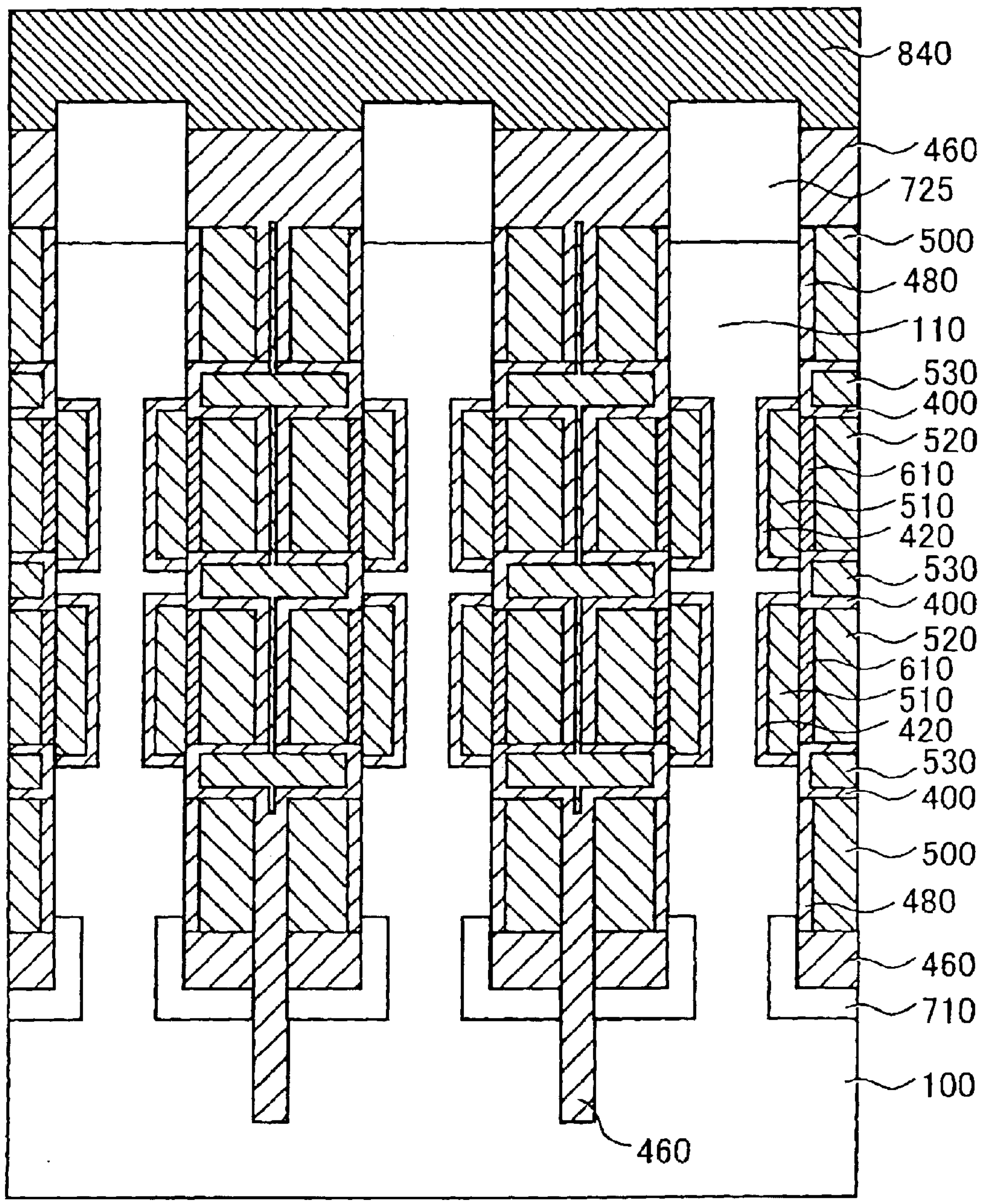

In an example shown in FIG. 54 and FIG. 55, the diffusion layers 720 are not provided and polysilicon films 530 are formed as third electrodes between the gate electrodes 500, 510 and 520 of the memory transistors and the selection gate transistors. In FIG. 1, the polysilicon films 530 as the third electrodes are not shown for avoiding complexity.

Figure 56:
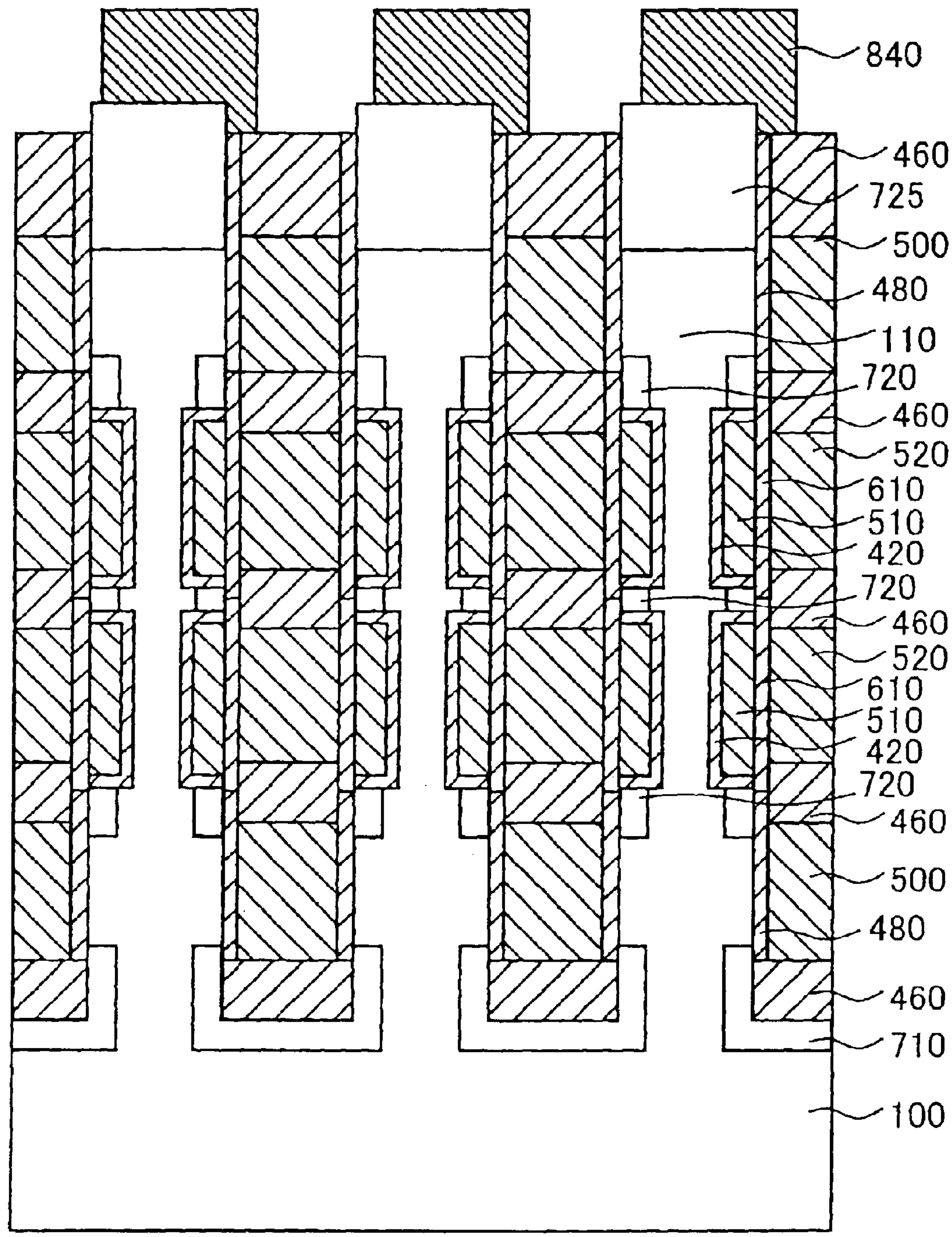
Figure 57:
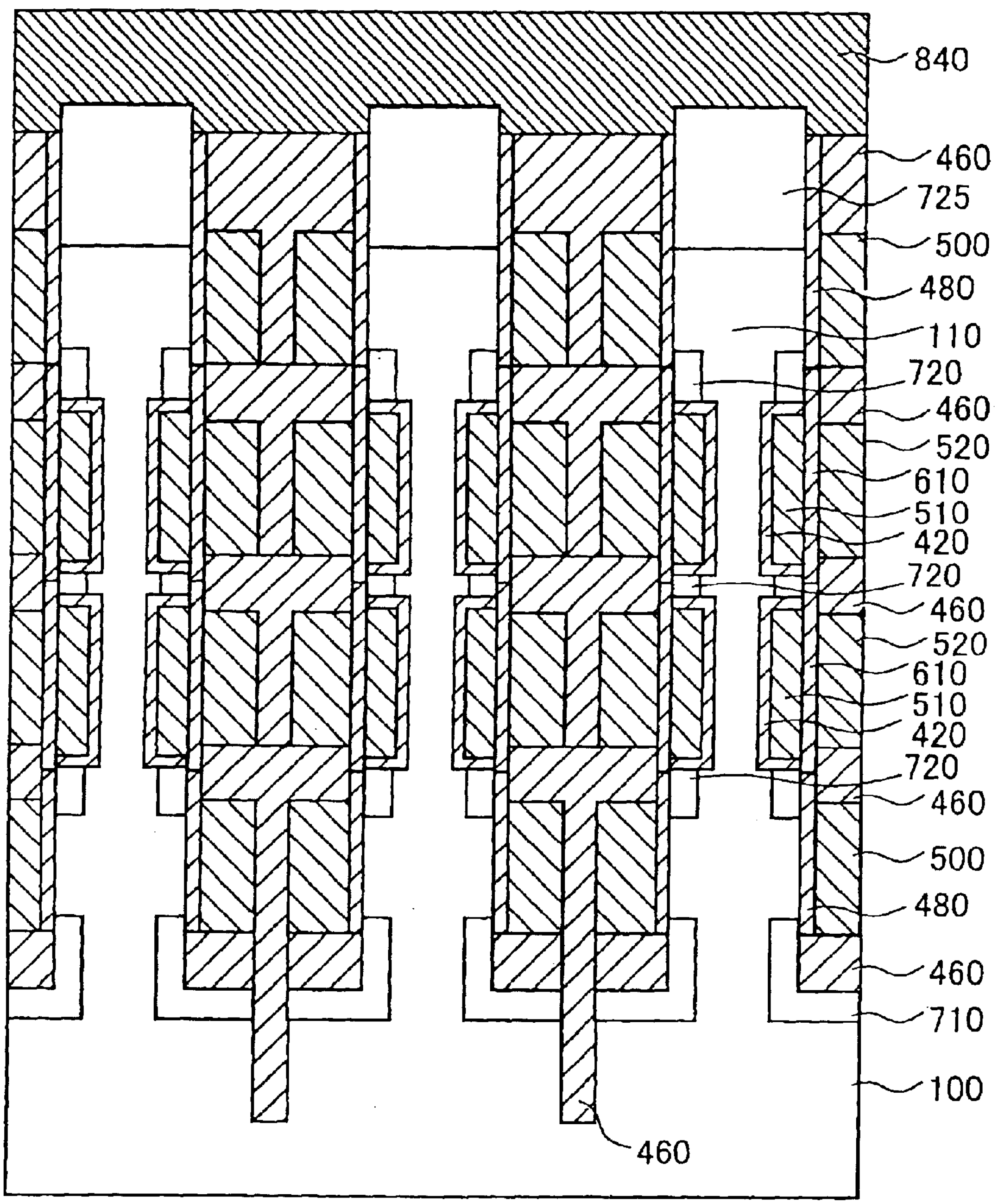

In an example shown in FIG. 56 and FIG. 57, the interlayer insulating film 610 is formed of a single layer film.

Figure 58:
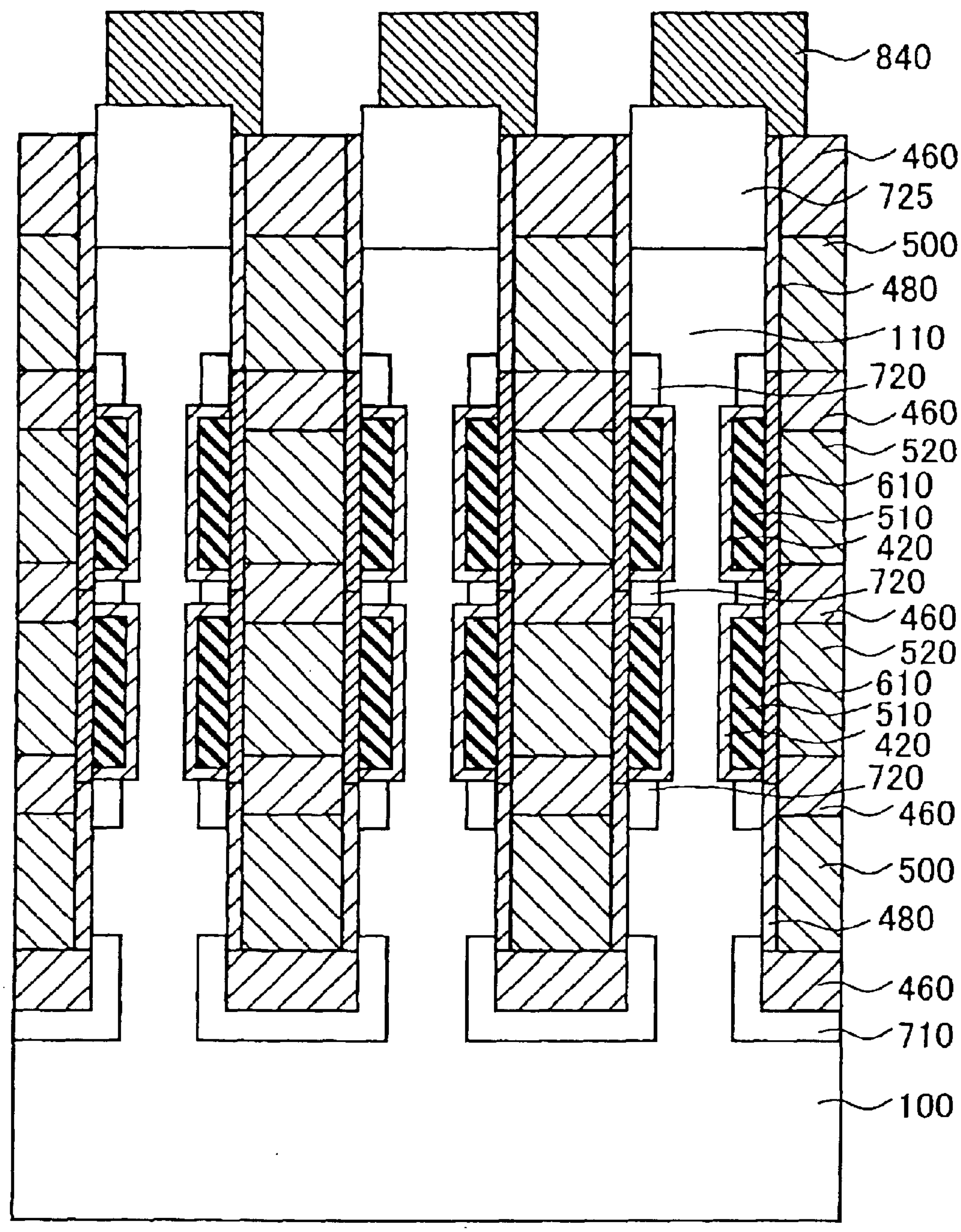
Figure 59:
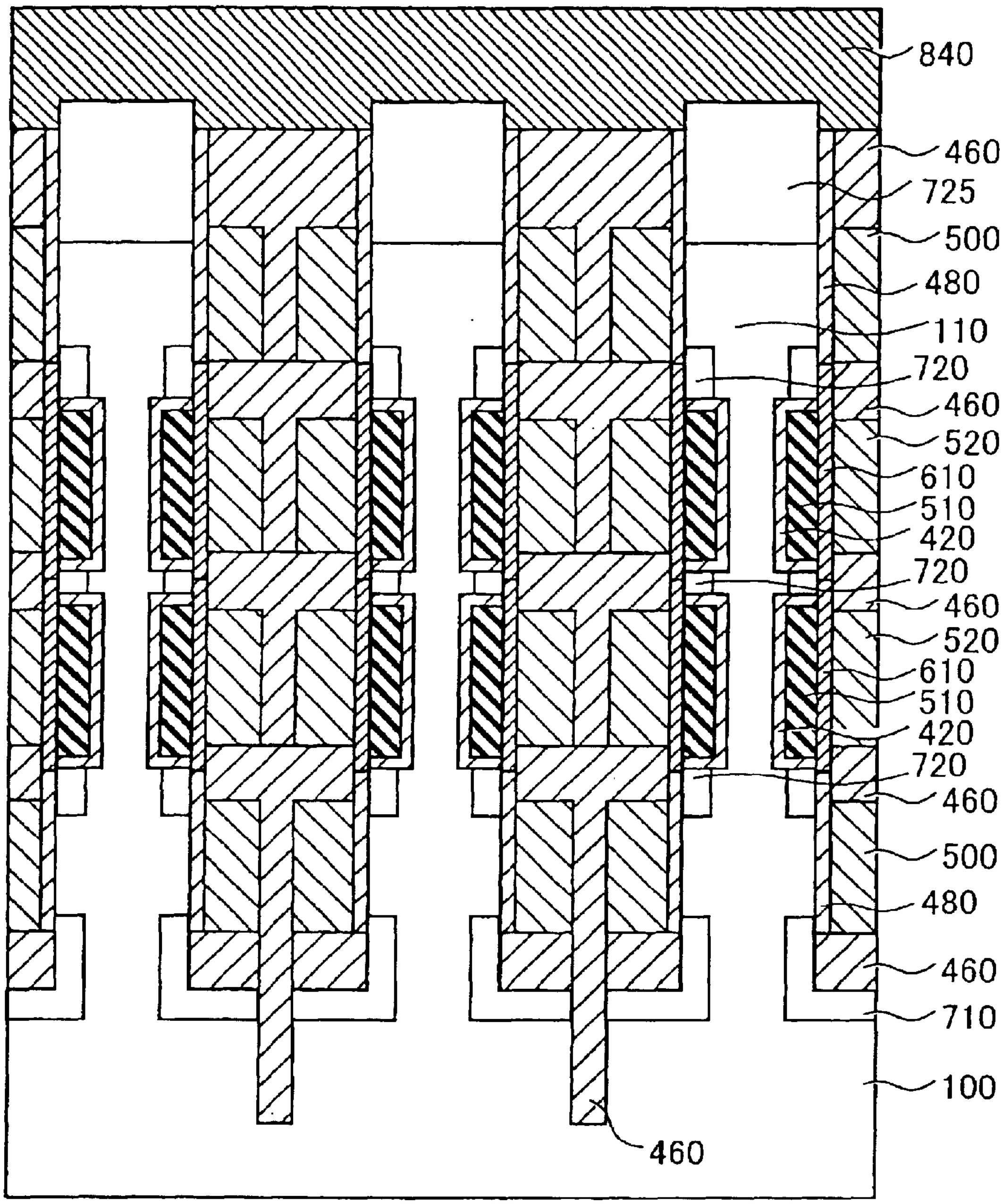

In an example shown in FIG. 58 and FIG. 59, a gate is formed of a material different from that of other gates. More specifically, the control gate 520 and the floating gate 510 of the memory cell are formed of different materials.

Figure 60:
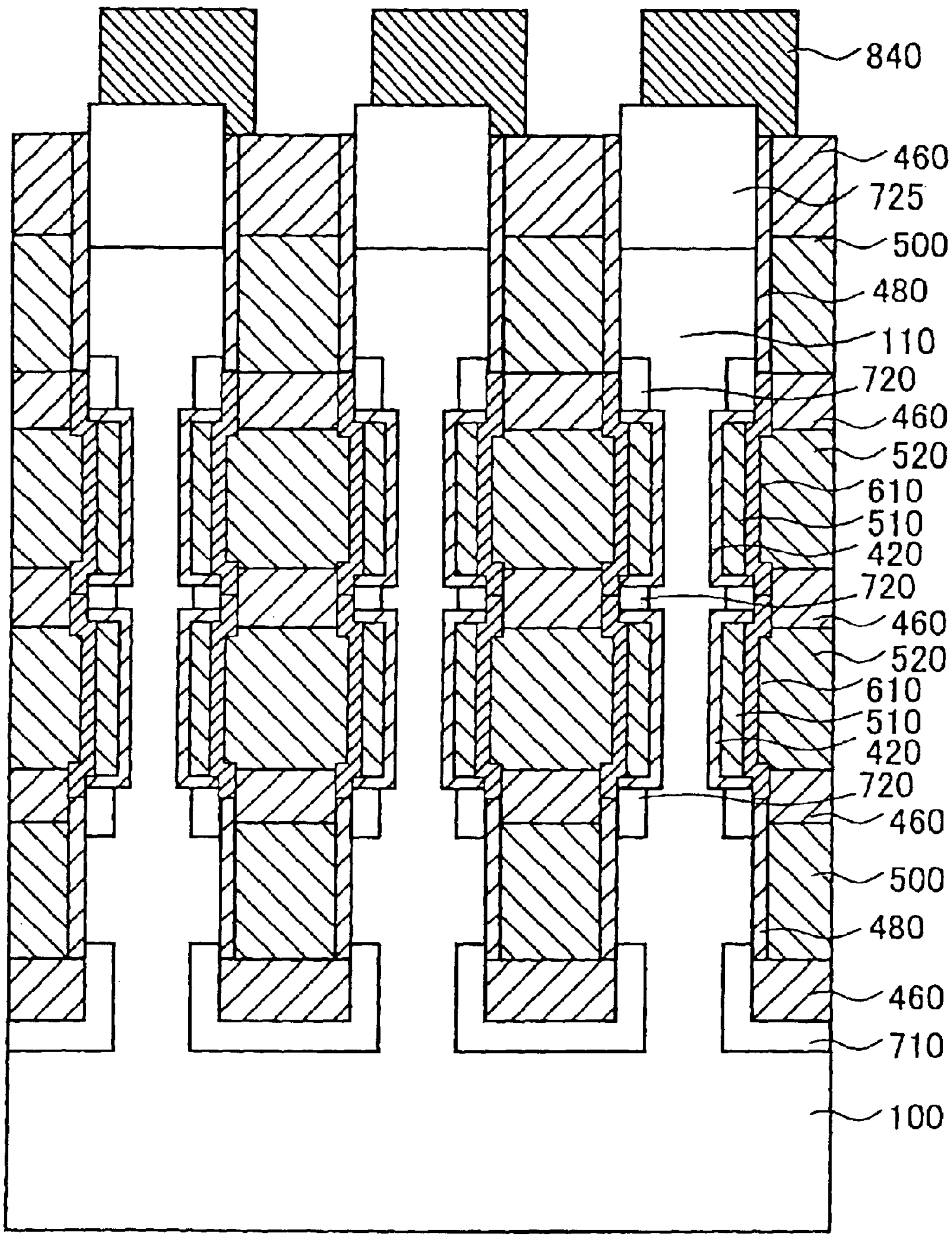
Figure 61:
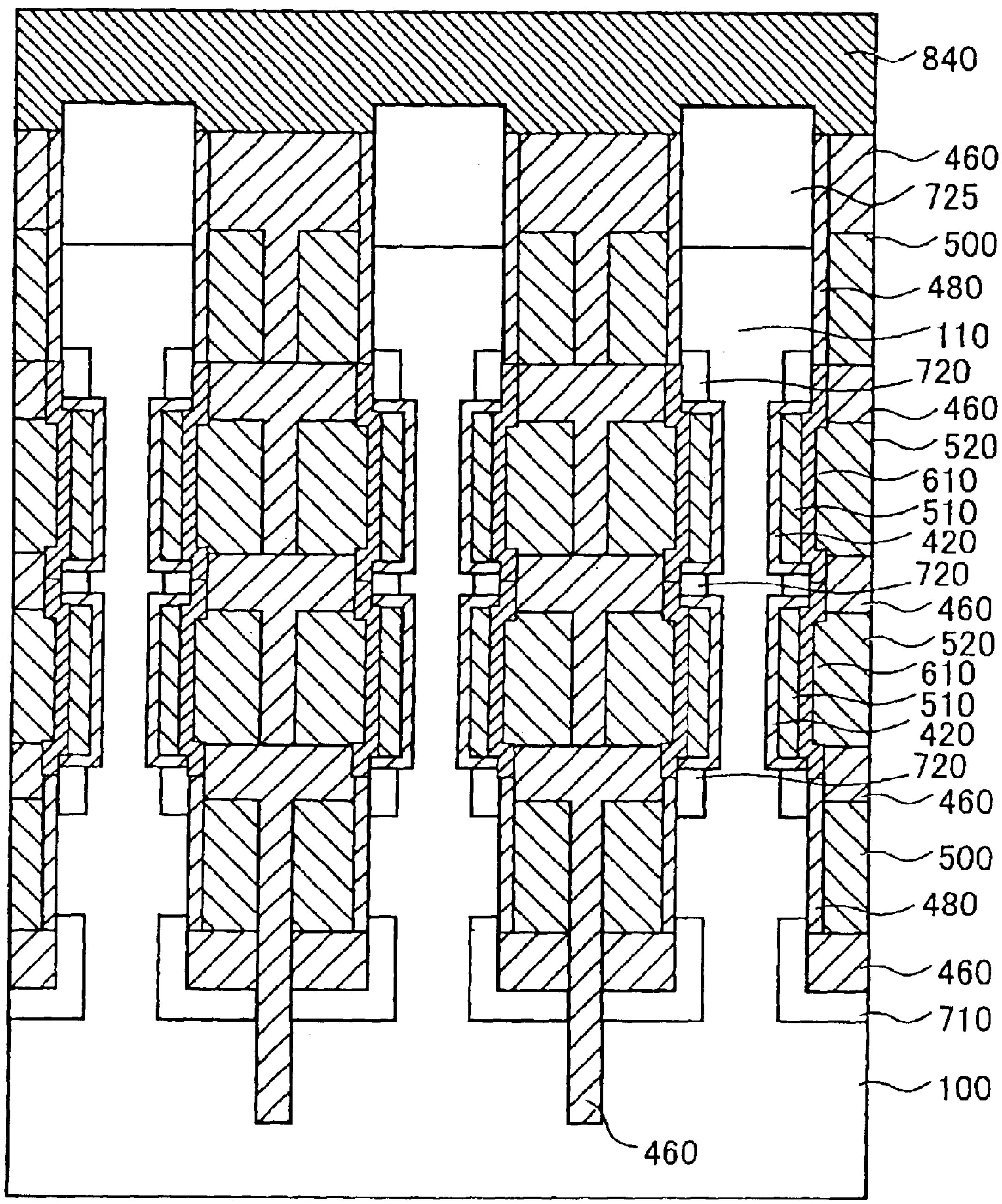

In an example shown in FIG. 60 and FIG. 61, in contrast to FIG. 50 and FIG. 51, the outer circumference of the floating gate is smaller than that of the island-like semiconductor layer 110.

Figure 62:
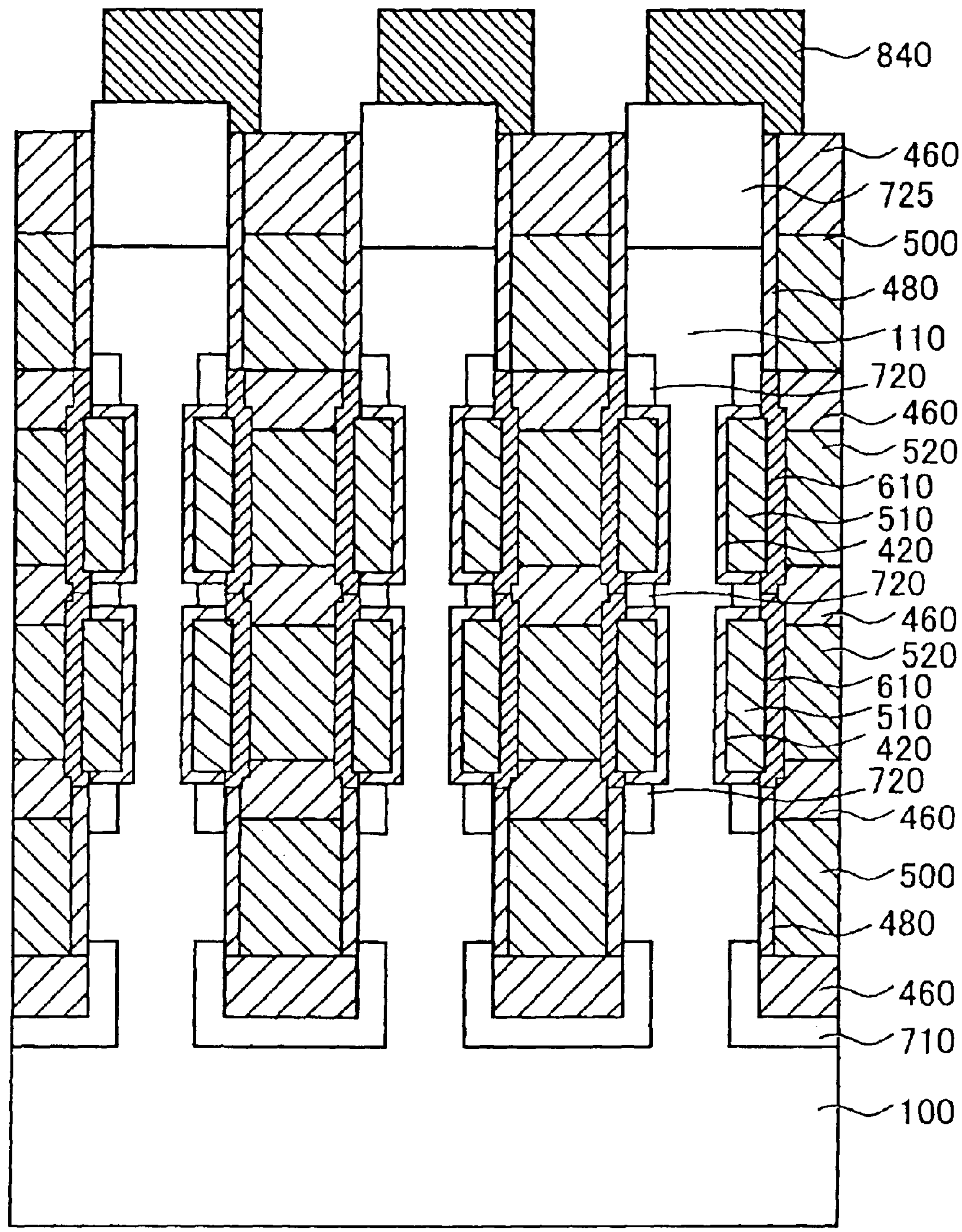
Figure 63:
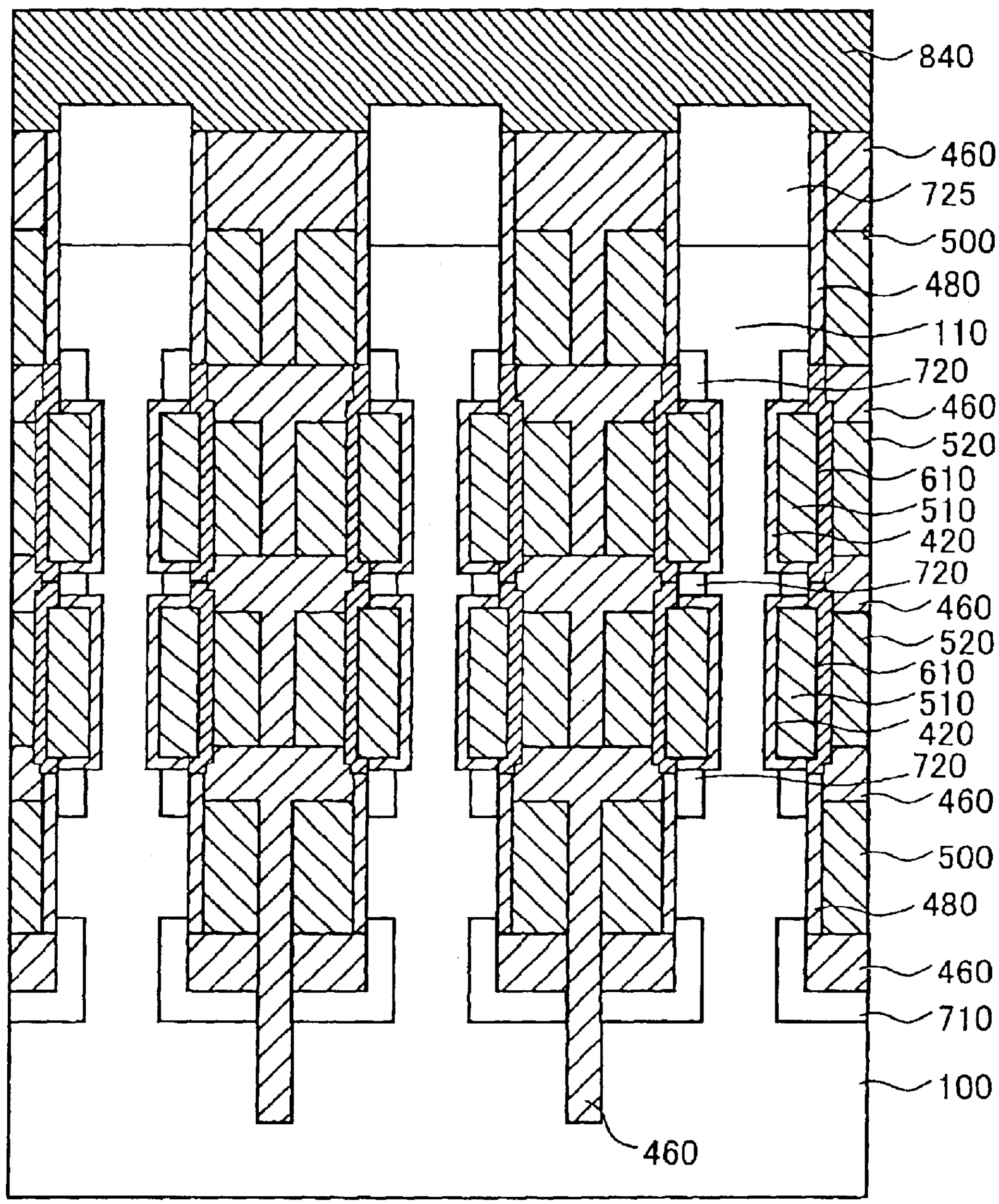

In an example shown in FIG. 62 and FIG. 63, in contrast to FIG. 50 and FIG. 51, the outer circumference of the floating gate is greater than that of the island-like semiconductor layer 110.

Embodiments of Operating Principles of Memory Cell Arrays

The above-described semiconductor memories have the memory function according to the state of a charge stored in the charge storage layer. The operating principles for reading, writing and erasing data will be explained with a memory cell having a floating gate as the charge storage layer, for example.

Reading, writing and erasing processes are now explained with a semiconductor memory according to the present invention which is constructed to include a plurality of (e.g., M×N, wherein M and N are positive integers) island-like semiconductor layers each having, as selection gate transistors, a transistor provided with the second electrode as a gate electrode and a transistor provide with the fifth electrode as a gate electrode and a plurality of (e.g., L, wherein L is a positive integer) memory cells connected in series, the memory cells each provided with the charge storage layer between the selection gate transistors and the third electrode as a control gate electrode. In this memory cell array, a plurality of (e.g., M) fourth wires arranged in parallel with the semiconductor substrate are connected to end portions of the island-like semiconductor layers, and first wires are connected to opposite, end portions of the island-like semiconductor layers. A plurality of (e.g., N×L) third wires are arranged in parallel with the semiconductor substrate and in a direction crossing the fourth wires and are connected to the third electrodes of the memory cells. The first wires are in parallel to the third wires.

Figure 64:
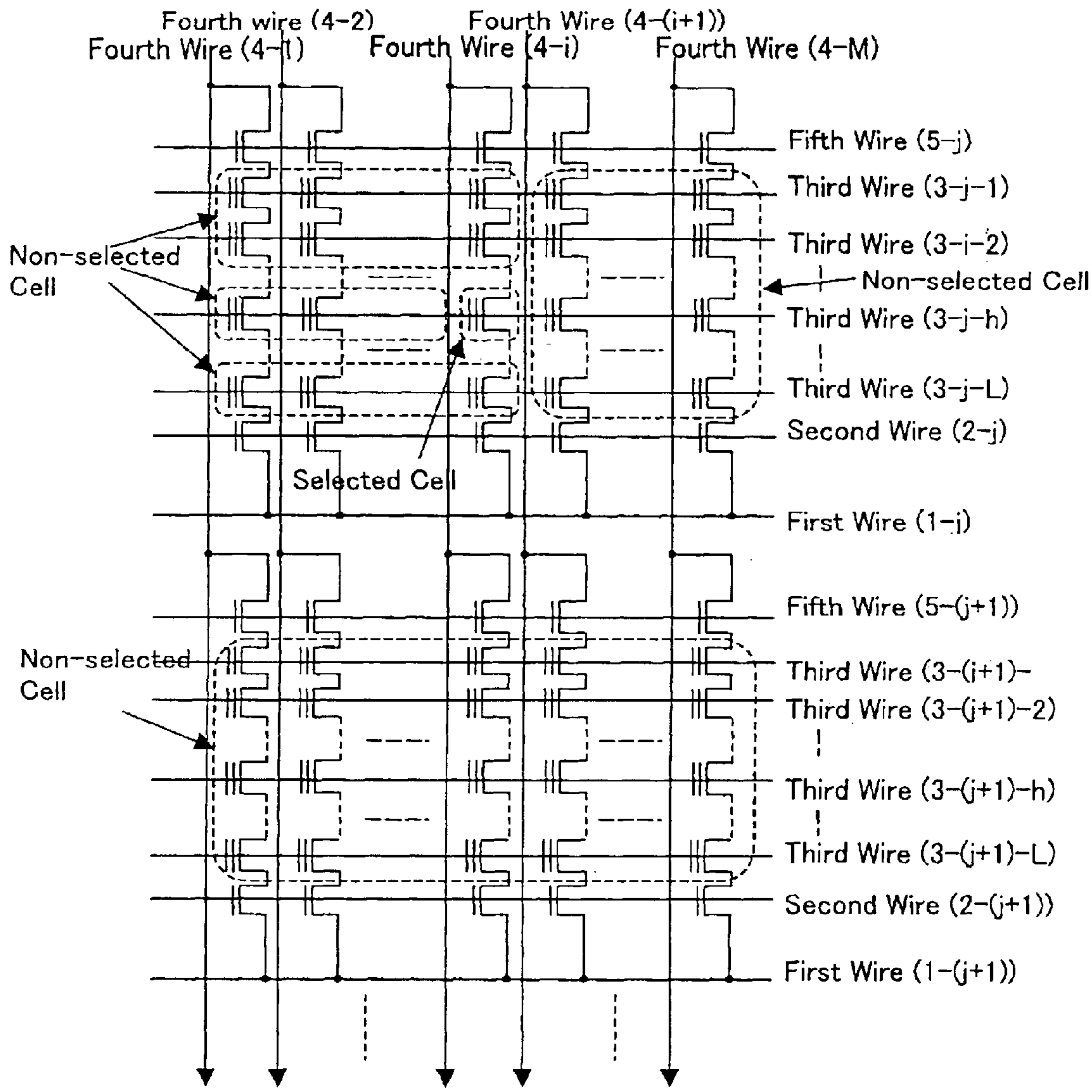
FIGS. 64 to 70 are equivalent circuit diagrams of semiconductor memory devices in accordance with the present invention.

FIG. 64 shows the equivalent circuit diagram of the above-described memory cell array.

In this example, the memory cell has a threshold of 0.5 V or higher when it is in the written state and has a threshold of −0.5 V or lower when it is in the erased state.

Figure 71:
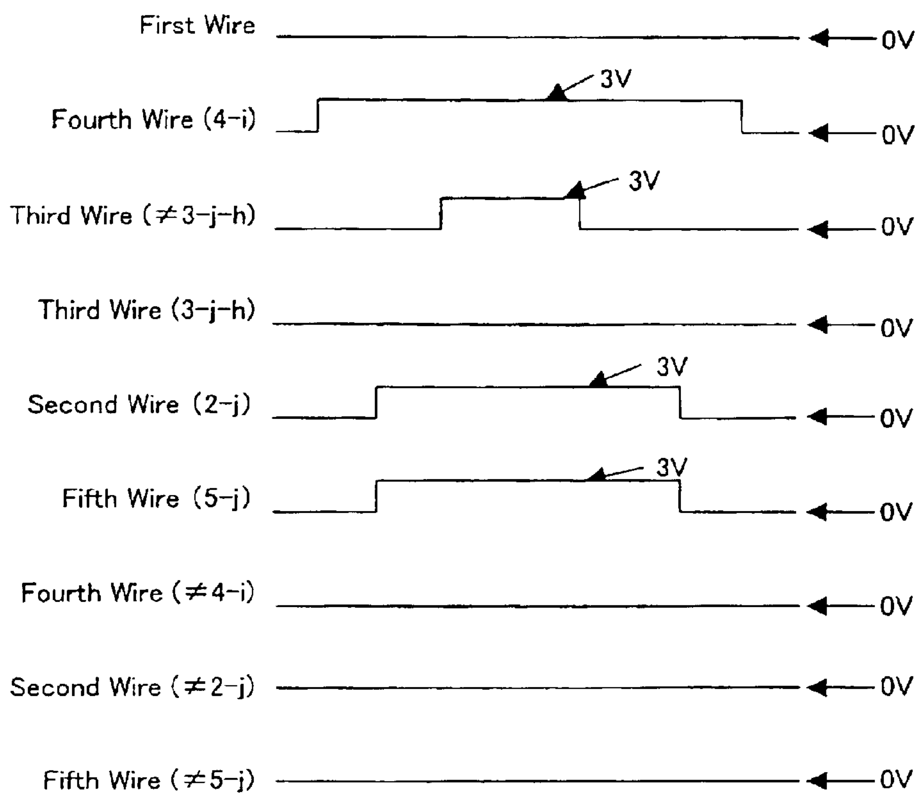
FIGS. 71 to 77 are examples of timing charts at reading, writing or erasing of a semiconductor memory device in accordance with the present invention.

Now an example of the reading process is described. FIG. 71 shows an example of timing of applying a potential to each electrode for reading data.

First, 0 V is applied to the first wires (1-1 to 1-N), the second wires (2-1 to 2-N), the third wires (3-1-1 to 3-N-L), the fourth wires (4-1 to 4-M) and the fifth wires (5-1 to 5-N), respectively. In this state, 3V is applied to the fourth wire (4-*i*), 3V is applied to the second wire (2-*j*), 3V is applied to the fifth wire (5-*j*), and 3V is applied to the third wires (not 3-*j*-*h*) other than the third wire (3-*j*-*h*). Thereby a “0” or “1” is judged from a current flowing through the fourth wire (4-*i*) or the first wire (1-*j*).

The third wires (not 3-*j*-*h*) other than the third wire (3-*j*-*h*) are returned to 0 V, and the second wires (not 2-*j*) and the fifth wires (not 5-*j*) are returned to 0 V. Then the fourth wire (4-*i*) is returned to 0 V. The potentials may be applied to the respective wires in another order or simultaneously.

In the above example, the reading process has been described with the case where the selected cell is a memory cell having the third wire (3-*j*-*h*) as the gate electrode. However, the reading process is the same with the case where the selected cell is a memory cell having a third wire other than the third wire (3-*j*-*h*) as the gate electrode.

The reading may be carried out in sequence from the third wire (3-*j*-L) to the third wire (3-*j*-1), in a reverse order or in a random order. Data may be read out simultaneously from a plurality of or all memory cells connected with the third wire (3-*j*-*h*).

By providing the selection gates in the top and the bottom of a set of memory cells, it is possible to prevent the phenomenon that a cell current flows even through a non-selected cell in the case where a memory cell transistor is over-erased, i.e., a threshold is negative and a reading gate voltage is 0 V.

Figure 72:
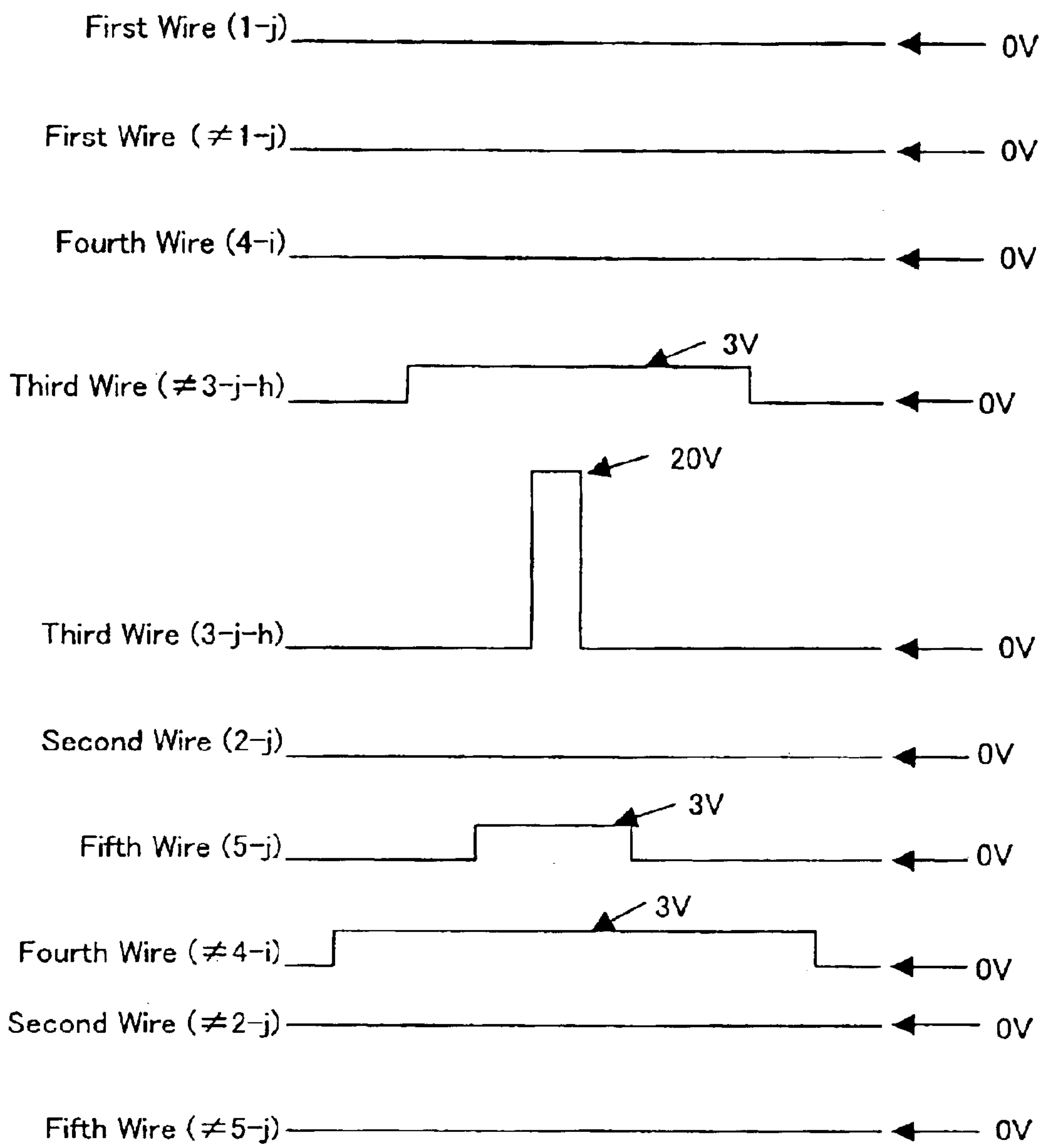

Now an example of the writing process is described. FIG. 72 shows an example of timing of applying a potential to each electrode for writing data.

First, 0 V is applied to the first wires (1-1 to 1-N), the second wires (2-1 to 2-N), the third wires (3-1-1 to 3-N-L), the fourth wires (4-1 to 4-M) and the fifth wires (5-1 to 5-N), respectively. In this state, 3 V is applied to the fourth wires (not 4-*i*) other than the fourth wire (4-*i*), 1 V is applied to the fifth wire (5-*j*), 3 V is applied to the third wires (not 3-*j*-*h*) other than the third wire (3-*j*-*h*), and then 20 V is applied to the third wire (3-*j*-*h*). This state is maintained for a desired period of time to generate a state in which a high potential is applied only to a region between the channel and the control gate of the selected cell. Electrons are injected from the channel to the charge storage layer by F-N tunneling phenomenon.

By applying 3 V to the fourth wires (not 4-*i*) other than the fourth wire (4-*i*), is cut off the selection gate transistor having the fifth electrode in the island-like semiconductor layer which does not include the selected cell, thereby data writing is not performed.

Thereafter, the third wire (3-*j*-*h*) is returned to 0 V, the second wire (2-*i*) and the fifth wire (5-*j*) are returned to 0 V, and then the third wires (not 3-*j*-*h*) other than the third wire (3-*j*-*h*) are returned to 0 V. Then, the fourth wire (4-*i*) is returned to 0 V.

The timing of applying the potentials to the respective electrodes may be in another order or simultaneous. The potentials applied may be any combination of potentials so long as they satisfy conditions for storing negative electric charges of not less than a certain amount in the charge storage layer of a desired cell.

In the above example, the writing process has been described with the case where the selected cell is a memory cell having the third wire (3-*j*-*h*) as the gate electrode. However, the writing process is the same with the case where the selected cell is a memory cell having a third wire other than the third wire (3-*j*-*h*) as the gate electrode.

The writing may be carried out in sequence from the third wire (3-*j*-L) to the third wire (3-*j*-1), in a reverse order or in a random order. Data may be written simultaneously in a plurality of or all memory cells connected with the third wire (3-*j*-*h*).

Figure 77:
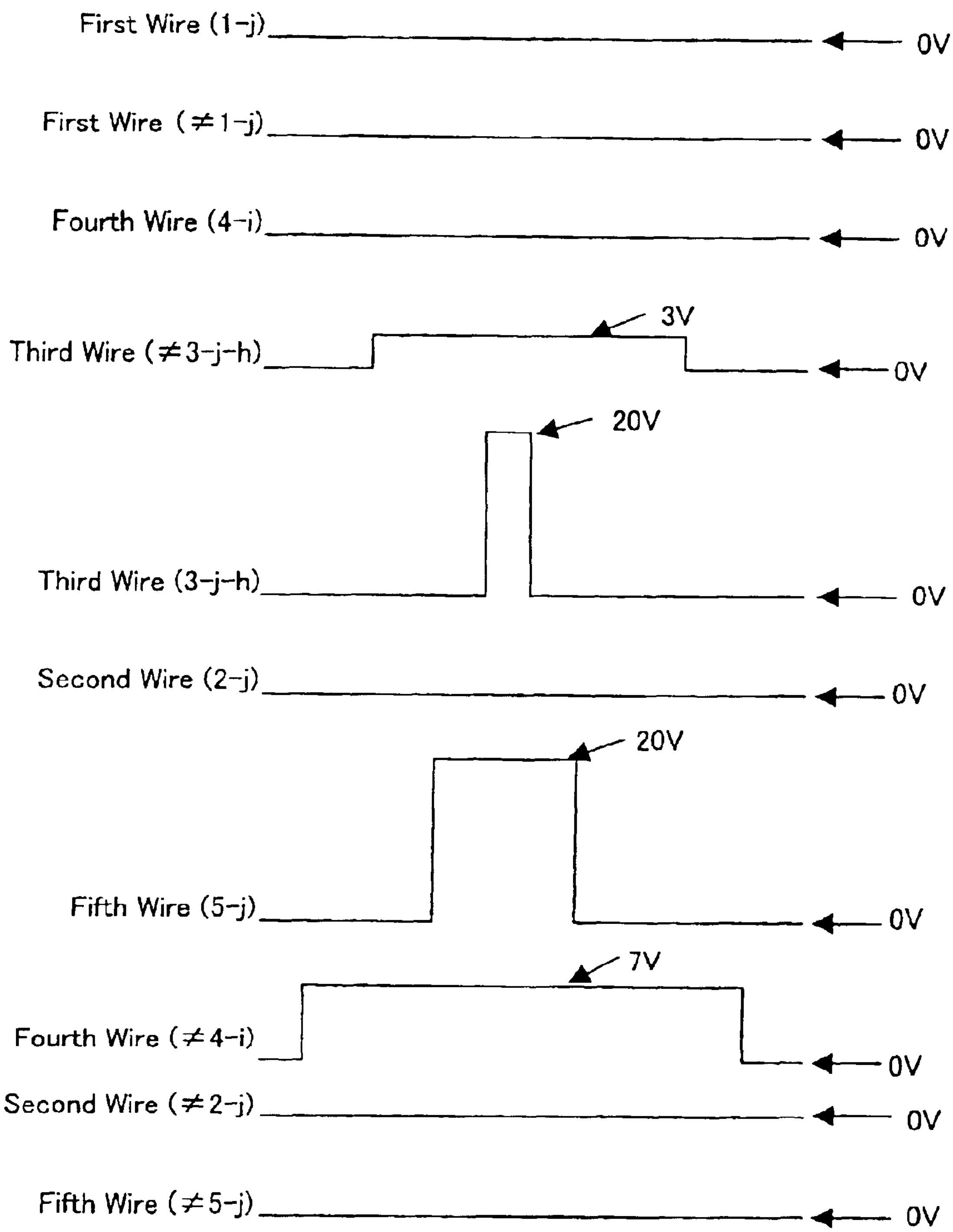

Further, described is an example of data writing wherein the selection gate transistor having the fifth electrode in the island-like semiconductor layer which does not include the selected cell is not cut off. FIG. 77 shows an example of timing of applying a potential to each electrode for writing data.

First, for example, 0 V is applied to the first wires (1-1 to 1-N), the second wires (2-1 to 2-N), the third wires (3-1-1 to 3-N-L), the fourth wires (4-1 to 4-M) and the fifth wires (5-1 to 5-N), respectively. In this state, 7 V is applied to the fourth wires (not 4-*i*) other than the fourth wire (4-*i*), 20 V is applied to the fifth wire (5-*j*), 3 V is applied to the third wires (not 3-*j*-*h*) other than the third wire (3-*j*-*h*), and then 20 V is applied to the third wire (3-*j*-*h*). This state is maintained for a desired period of time to generate potential difference of about 20 V between the channel and the control gate of the selected cell. Electrons are injected from the channel to the charge storage layer by F-N tunneling phenomenon for writing data.

At this time, there is generated a potential difference of about 13 V between the channel and the control gate of a non-selected cell connected to the third wire (3-*j*-*h*). However, in a period for data writing to the selected cell, electrons are not injected to the non-selected cell in an amount enough to vary the threshold of the non-selected cell, thereby data is not written in the non-selected cell.

Thereafter, the third wire (3-*j*-*h*) is returned to 0 V, the fifth wire (5-*j*) is returned to 0 V, and then the third wires (not 3-*j*-*h*) other than the third wire (3-*j*-*h*) are returned to 0 V. Then, the fourth wires (not 4-*i*) are returned to 0 V.

The timing of applying the potentials to the respective electrodes may be in another order or simultaneous. The potentials applied may be any combination of potentials so long as they satisfy conditions for storing negative electric charges of not less than a certain amount in the charge storage layer of a desired cell.

In the above example, the writing process has been described with the case where the selected cell is a memory cell having the third wire (3-*j*-*h*) as the gate electrode. However, the writing process is the same with the case where the selected cell is a memory cell having a third wire other than the third wire (3-*j*-*h*) as the gate electrode.

The writing may be carried out in sequence from the third wire (3-*j*-L) to the third wire (3-*j*-1), in a reverse order or in a random order. Data may be written simultaneously in a plurality of or all memory cells connected with the third wire (3-*j*-*h*).

Figure 66:
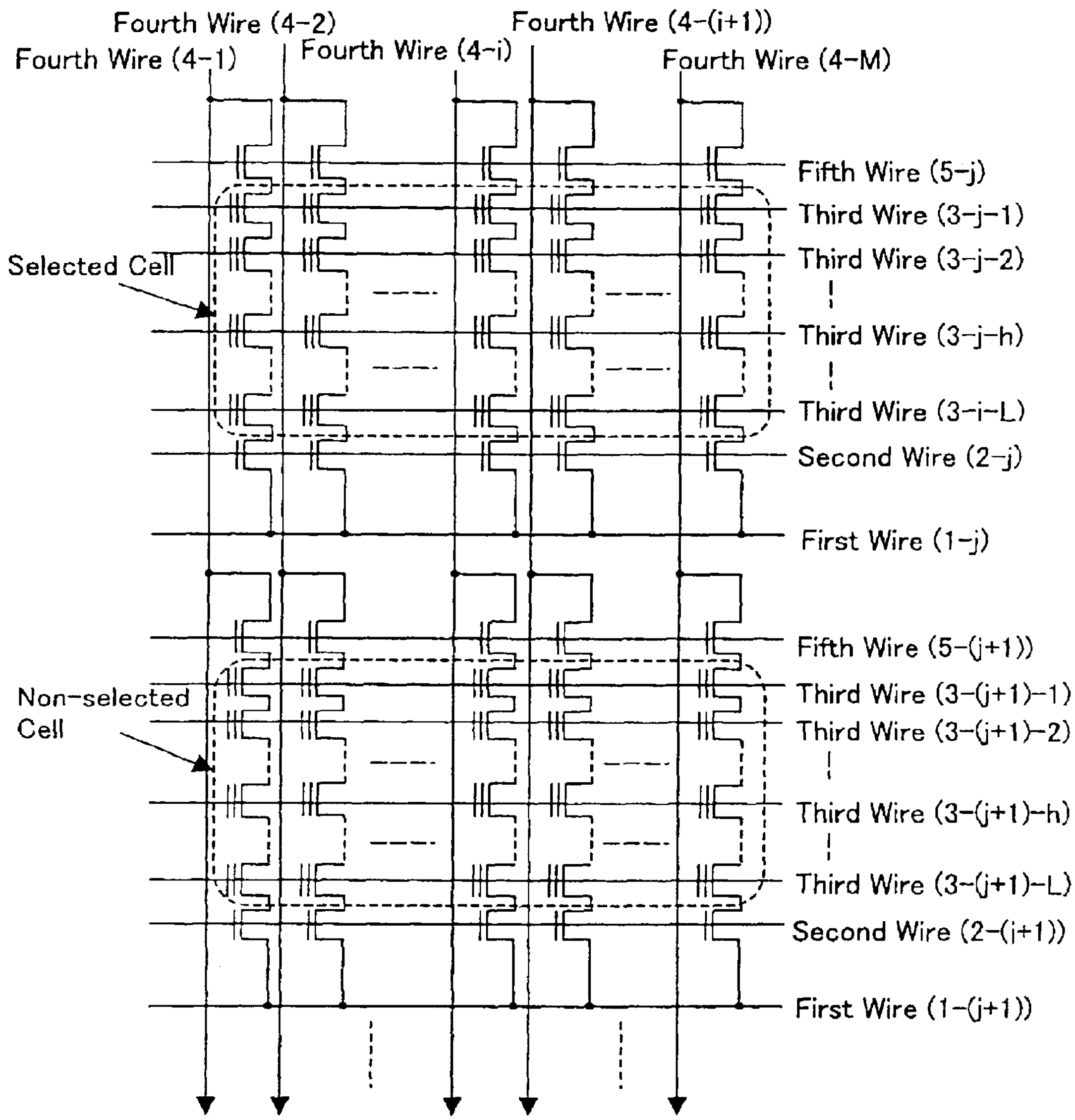
Figure 73:
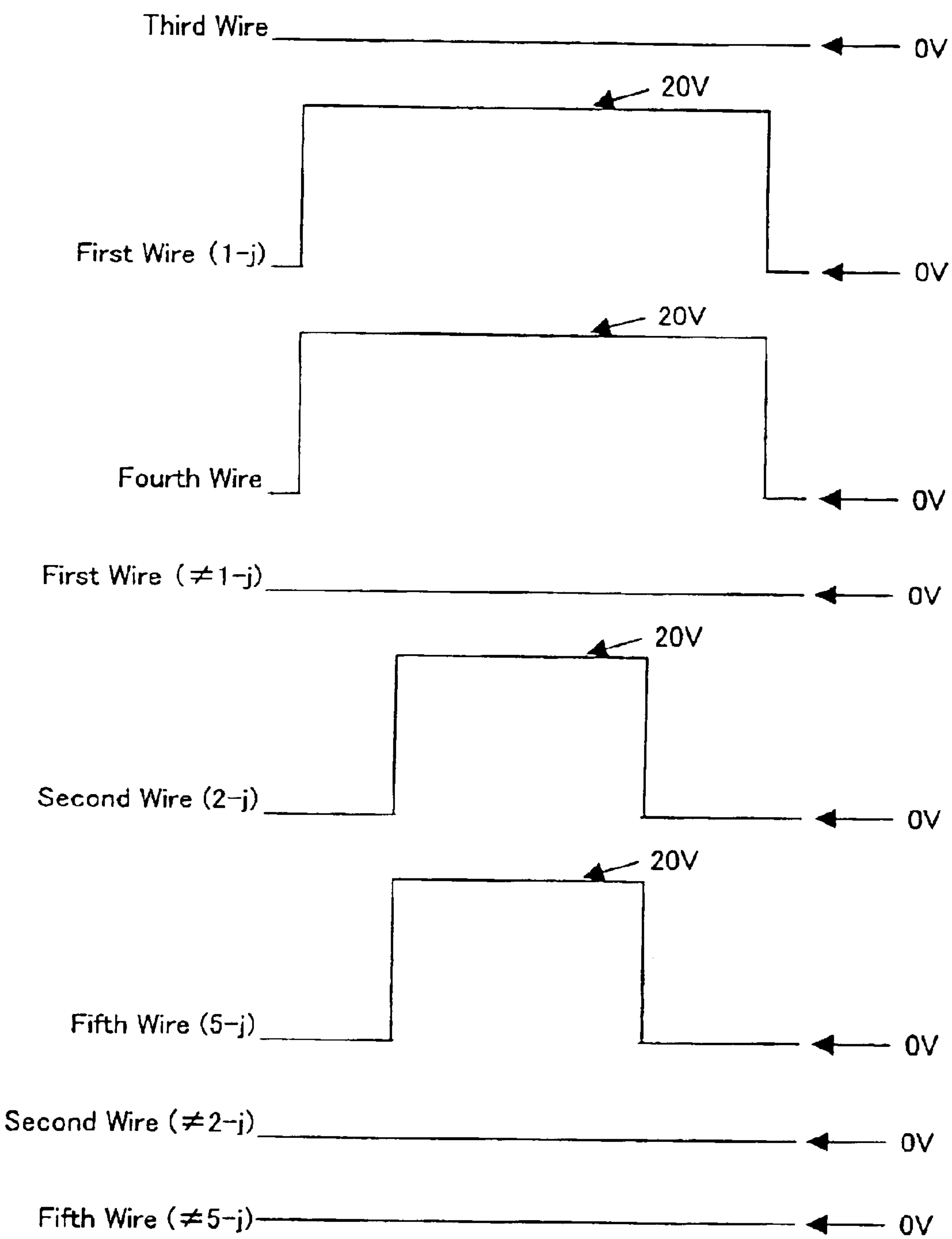

Now an example of the erasing process is described. FIG. 73 shows an example of timing of applying each potential for erasing data. The data erasing is performed for every block or for chips at once as shown in FIG. 66 illustrating a selected area.

First, for example, 0 V is applied to the first wires (1-1 to 1-N), the second wire (2-*j*), the third wires (3-1-1 to 3-N-L), the fourth wires (4-1 to 4-M) and the fifth wire (5-*j*), respectively. In this state, 20 V is applied to the fourth wires (4-1 to 4-M), 20 V is applied to the first wire (1-*j*), 20 V is applied to the second wire (2-*j*), and then 20 V is applied to the fifth wire (5-*j*). This state is maintained for a desired period of time to withdraw the electrons from the charge storage layer of the selected cell by F-N tunneling phenomenon for erasing data.

Thereafter, the second wire (2-*j*) and the fifth wire (5-*j*) are returned to 0 V, and then the fourth wires (4-1 to 4-M) are returned to 0 V. Then, the first wire (1-*i*) is returned to 0 V.

The timing of applying the potentials to the respective electrodes may be in another order or simultaneous. The potentials applied may be any combination of potentials so long as they satisfy conditions for decreasing the threshold of a desired cell.

In the above example, the erasing process has been described with the case where the selected cell is a memory cell having the third wires (3-*j*-1 to 3-*j*-L) as the gate electrodes. However, the erasing process is the same with the case where the selected cell is a memory cell having a third wire other than the third wire (3-*j*-1 to 3-*j*-L) as the gate electrode.

The erasing may be carried out simultaneously with respect to all memory cells connected to the third wires (3-*j*-1 to 3-*j*-L), or with respect to a plurality of or all memory cells connected with the third wires (3-1-1 to 3-N-L).

Reading, writing and erasing processes are now explained with a semiconductor memory according to the present invention which is constructed to include a plurality of (e.g., M×N, wherein M and N are positive integers) island-like semiconductor layers each having, two memory cells connected in series, the memory cells each provided with the charge storage layer and the third electrode as a control gate electrode. In this memory cell array, a plurality of (e.g., M) fourth wires arranged in parallel with the semiconductor substrate are connected to end portions of the island-like semiconductor layers, and first wires are connected to opposite end portions of the island-like semiconductor layers. A plurality of (e.g., N×2) third wires are arranged in parallel with the semiconductor substrate and in a direction crossing the fourth wires and are connected to the third electrodes of the memory cells. The first wires are arranged in parallel with the third wires.

Figure 65:
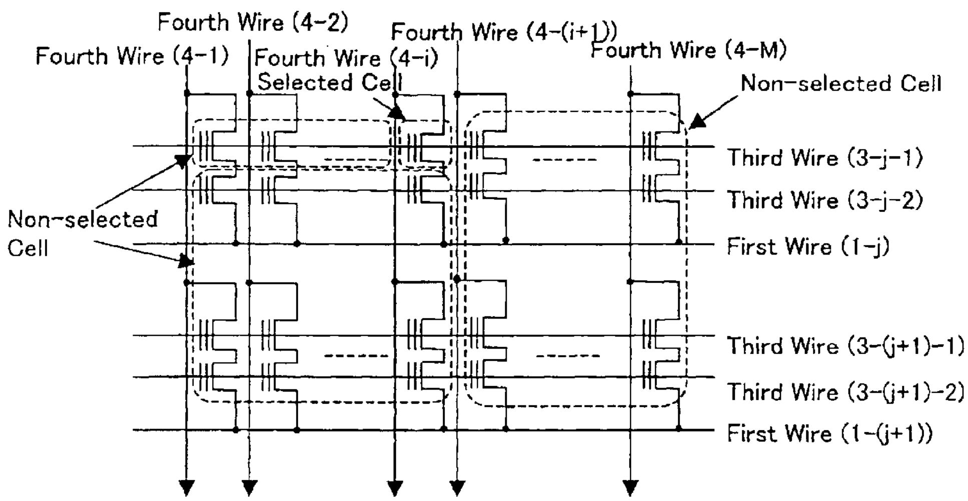

FIG. 65 shows an equivalent circuit diagram of the above-described memory cell array.

In this example, the memory cell has a threshold of 4 V or higher when it is in the written state and has a threshold of 0.5 V and higher to 3 V or lower when it is in the erased state.

Figure 74:
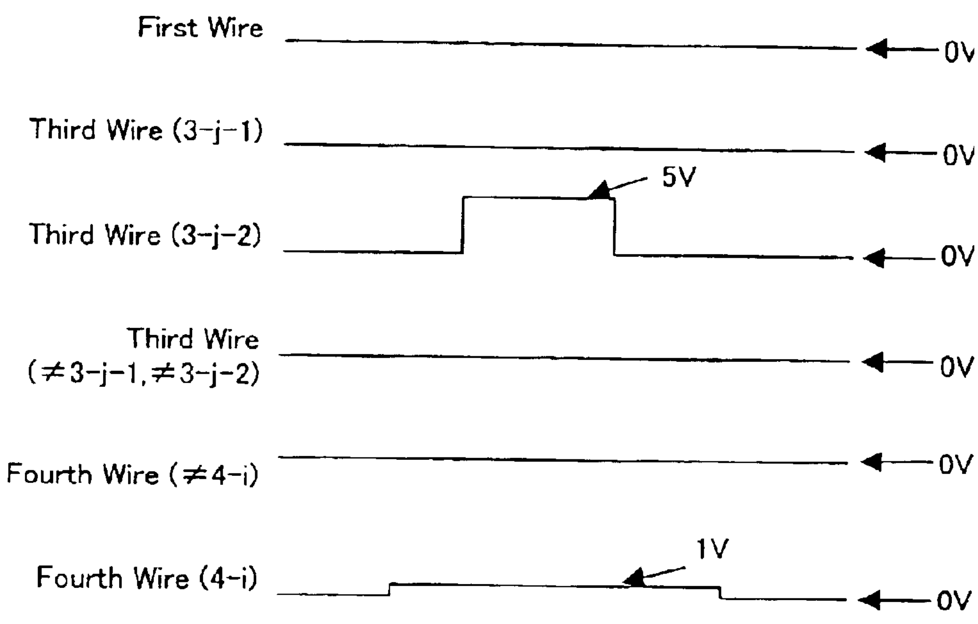

Now an example of the reading process is described. FIG. 74 shows an example of timing of applying a potential to each electrode for reading data.

First, 0 V is applied to the first wires (1-1 to 1-N), the third wires (3-*j*-1 and 3-*j*-2), the third wires (not 3-*j*-1, not 3-*j*-2) and the fourth wires (4-1 to 4-M), respectively. In this state, 1V is applied to the fourth wire (4-*i*), and then 5 V is applied to the third wire (3-*j*-2). Thereby a "0" or "1" is judged from a current flowing through the fourth wire (4-*i*) or the first wire (1-*j*, wherein j is a positive integer, 1≦j≦N). Then, the third wire (3-*j*-2) is returned to 0 V, and then the fourth wire (4-*i*) is returned to 0 V. The potentials may be applied to the respective wires in another order or simultaneously.

In the above example, the reading process has been described with the case where the selected cell is a memory cell having the third wire (3-*j*-1) as the gate electrode. However, the reading process is the same with the case where the selected cell is a memory cell having a third wire other than the third wire (3-*j*-1) as the gate electrode.

The reading may be carried out in sequence from the third wire (3-*j*-2) to the third wire (3-*j*-1), in a reverse order or in a random order. Data may be read out simultaneously from a plurality of or all memory cells connected with the third wire (3-*j*-1).

Figure 75:
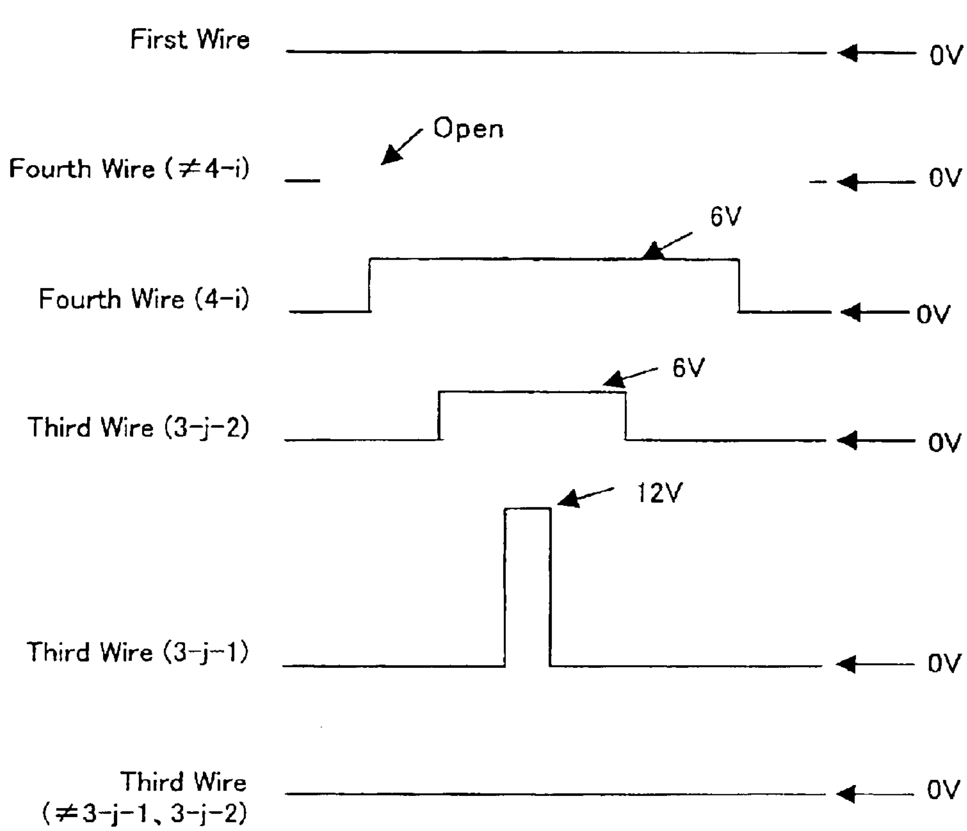

Now an example of the writing process is described. FIG. 75 shows an example of timing of applying a potential to each electrode for writing data.

First, 0 V is applied to the first wires (1-1 to 1-N), the third wires (3-1-1 to 3-N-2) and the fourth wires (4-1 to 4-M), respectively. In this state, the fourth wires (not 4-*i*) other than the fourth wire (4-*i*) are opened. Then, 6 V is applied to the fourth wire (4-*i*), 6 V is applied to the third wire (3-*j*-2), and then 12 V is applied to the third wire (3-*j*-1). This state is maintained for a desired period of time to generate channel hot electrons in the neighborhood of the diffusion layer at a high potential side of the selected cell. The generated electrons are injected to the charge storage layer of the selected cell by use of a high potential applied to the third wire (3-*j*-1) for writing data.

Thereafter, the third wire (3-*j*-1) is returned to 0 V, the third wire (3-*j*-2) is returned to 0 V, the fourth wire (4-*i*) is returned to 0 V, and then the fourth wires (not 4-*i*) are returned to 0 V. The timing of applying the potentials to the respective electrodes may be in another order or simultaneous. The potentials applied may be any combination of potentials so long as they satisfy conditions for storing negative electric charges of not less than a certain amount in the charge storage layer of a desired cell.

In the above example, the writing process has been described with the case where the selected cell is a memory cell having the third wire (3-*j*-1) as the gate electrode. However, the writing process is the same with the case where the selected cell is a memory cell having a third wire other than the third wire (3-*j*-1) as the gate electrode. The writing may be carried out to the third wire (3-*j*-2) and the third wire (3-*j*-1) in this order or in a reverse order. Data may be written simultaneously in a plurality of or all memory cells connected with the third wire (3-*j*-1).

Figure 76:
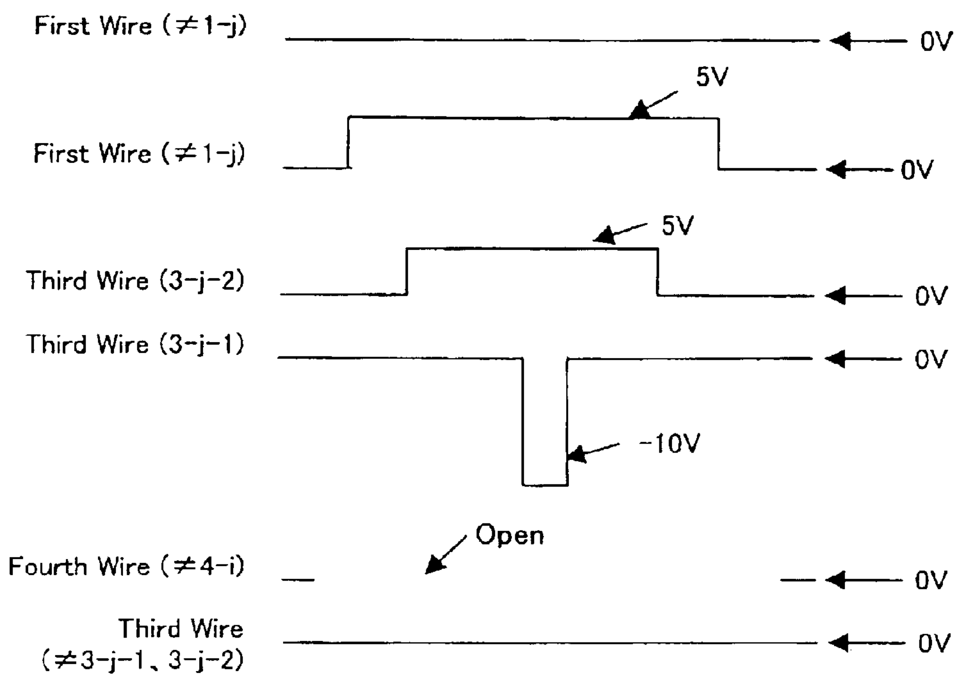

Now an example of the erasing process is described. FIG. 76 shows an example of timing of applying each potential for erasing data. The data erasing is performed block by block, or only in an upper row or a lower row in a word line or a block.

First, for example, 0 V is applied to the first wires (1-1 to 1-N), the third wires (3-1-1 to 3-N-2) and the fourth wires (4-1 to 4-M), respectively. In this state, the fourth wires (4-1 to 4-M) are opened. Then, 5 V is applied to the first wire (1-*j*), 5 V is applied to the third wire (3-*j*-2), and then −10 V is applied to the third wire (3-*j*-1). This state is maintained for a desired period of time to withdraw the electrons from the charge storage layer of the selected cell by F-N tunneling phenomenon for erasing data.

Thereafter, the third wire (3-*j*-1) is returned to 0 V, the third wire (3-*j*-2) is returned to 0 V, the first wire (1-*j*) is returned to 0 V, and then the fourth wires (4-1 to 4-M) are returned to 0 V. The timing of applying the potentials to the respective electrodes may be in another order or simultaneous. The potentials applied may be any combination of potentials so long as they satisfy conditions for decreasing the threshold of a desired cell.

In the above example, the erasing process has been described with the case where the selected cell is a memory cell having the third wire (3-*j*-1) as the gate electrode. However, the erasing process is the same with the case where the selected cell is a memory cell having a third wire other than the third wire (3-*j*-1) as the gate electrode. Data may be erased simultaneously from a plurality of or all memory cells connected with the third wires (3-*j*-1 to 3-*j*-2), or from a plurality of or all memory cells connected with the third wires (3-1-1 to 3-N-2).

The polarity of all the electrodes may be reversed as in the case of island-like semiconductor layers formed of an N-type semiconductor. At this time, the potentials have a relationship in magnitude reverse to that mentioned above. The above examples of reading, writing and erasing operations have been given of the case where the first wires and the third wires are arranged in parallel. However, the operation principles are also true of the case where the first wires and the fourth wires are arranged in parallel and the case where the first wires are formed in common throughout the array, by applying the potentials corresponding to the respective wires. If the first wires and the fourth wires are arranged in parallel, the erasing can be performed on a block basis or a bit line basis.

Now explanation is given of memory cells other than the above-described memory cells having floating gates as the charge storage layers.

Figure 67:
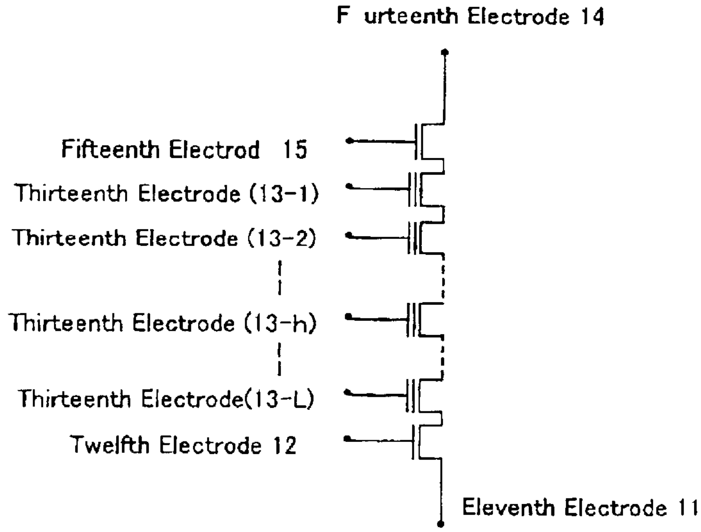
Figure 68:
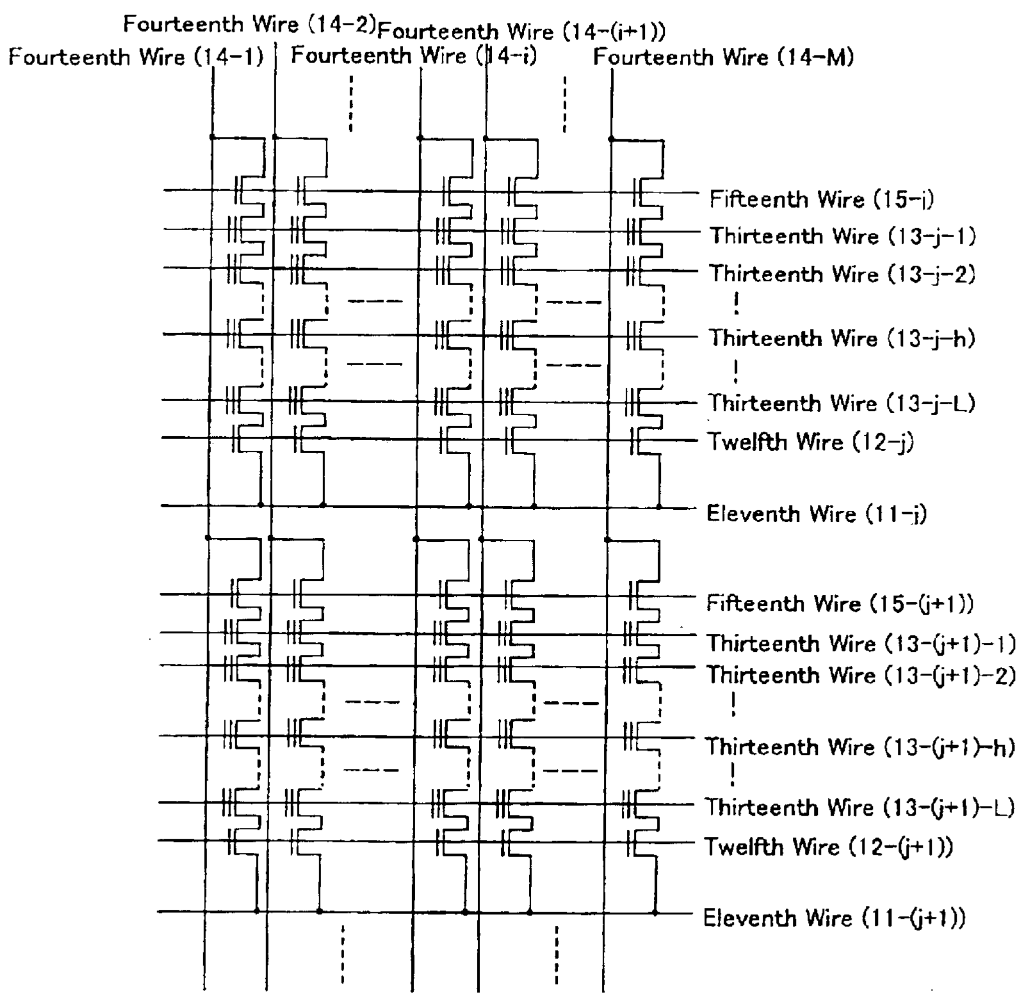

FIG. 67 and FIG. 68 are equivalent circuit diagrams of part of a memory cell array of the MONOS structure shown as an example in FIG. 9 and FIG. 24 to FIG. 29.

FIG. 67 is an equivalent circuit diagram of memory cells of the MONOS structure arranged in one island-like semiconductor layer 110, and FIG. 68 is an equivalent circuit diagram in the case where a plurality of island-like semiconductor layers 110 are arranged.

Now explanation is given of the equivalent circuit diagram of FIG. 67.

The island-like semiconductor layer 110 has, as the selection gate transistors, a transistor provided with a twelfth electrode 12 as the gate electrode and a transistor provided with a fifth electrode 15 as the gate electrode, and a plurality of (e.g., L, L is a positive integer) memory cells arranged in series. The memory cell has a laminated insulating film as the charge storage layer between the selection gate transistors and has a thirteenth electrode (13-*h*, h is a positive integer, $1 \leqq h \leqq L$) as a control gate electrode. A fourteenth electrode 14 is connected to an end of the island-like semiconductor layer 110 and an eleventh electrode 11 is connected to another end thereof.

Next explanation is given of the equivalent circuit diagram of FIG. 68.

Now there is shown a connection relationship between each circuit element arranged in each island-like semiconductor layer 110 shown in FIG. 67 and each wire in a memory cell array where a plurality of island-like semiconductor layers 110 are arranged.

Are provided a plurality of (e.g., M×N, M and N are positive integers; i is a positive integer, $1 \leqq i \leqq M$; j is a positive integer, $1 \leqq j \leqq N$) island-like semiconductor layers 110. In the memory cell array, a plurality of (e.g., M) fourteenth wires arranged in parallel with the semiconductor substrate are connected with the above-mentioned fourteenth electrodes 14 provided in the island-like semiconductor layers 110.

A plurality of (e.g., N×L) thirteenth wires arranged in parallel with the semiconductor substrate and in a direction crossing the fourteenth wires 14 are connected with the above-mentioned thirteenth electrodes (13-*h*, h is a positive integer, 1≦h≦L) of the memory cells. A plurality of (e.g., N) eleventh wires arranged in a direction crossing the fourteenth wires 14 are connected with the above-mentioned eleventh electrodes 11 provided in the island-like semiconductor layers 110.

The eleventh wires are arranged in parallel with the thirteenth wires. A plurality of (e.g., N) twelfth wires arranged in parallel with the semiconductor substrate and in a direction crossing the fourteenth wires 14 are connected with the above-mentioned twelfth electrodes 12 of the memory cells, and a plurality of (e.g., N) fifteenth wires arranged in parallel with the semiconductor substrate and in a direction crossing the fourteenth wires 14 are connected with the above-mentioned fifteenth electrodes 15 of the memory cells.

Figure 69:
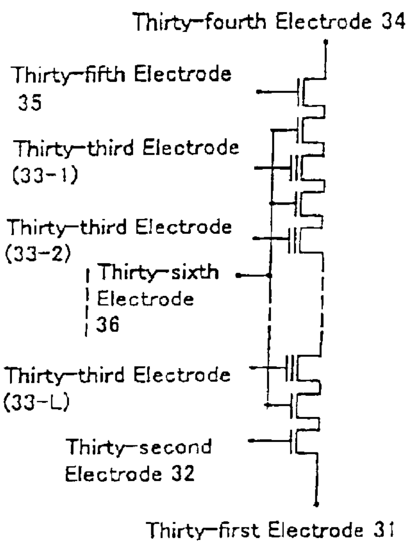
Figure 70:
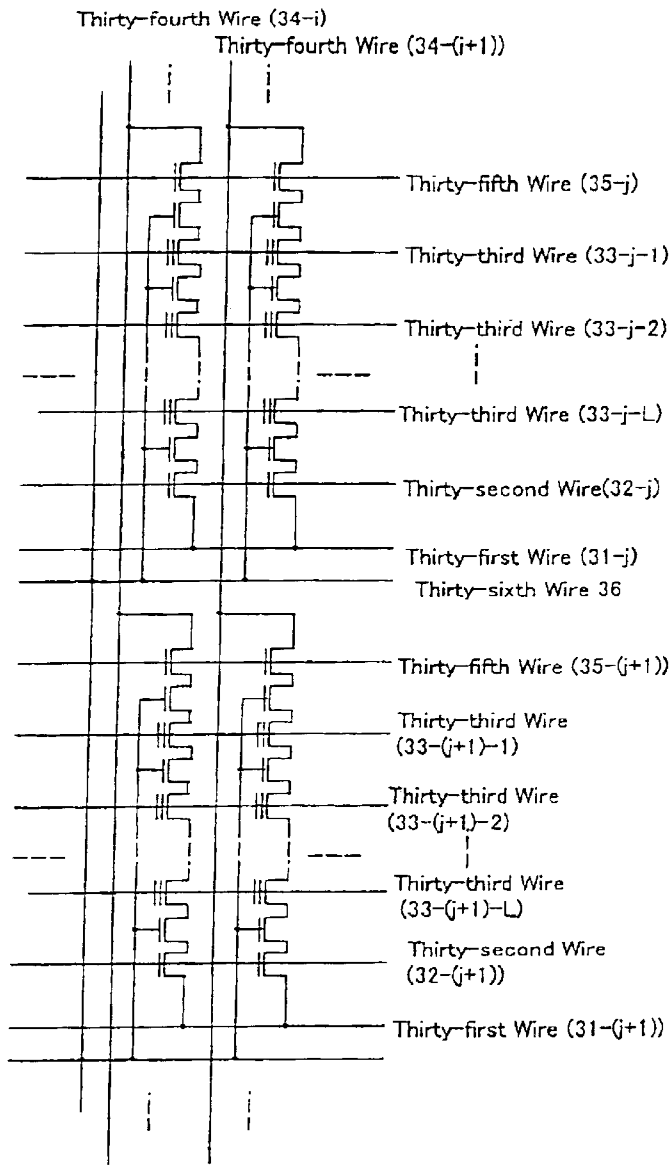

FIG. 69 and FIG. 70 are equivalent circuit diagrams of part of a memory cell array shown as an example in FIG. 14 and FIG. 15 in which diffusion layers 720 are not disposed between the transistors and polysilicon films 530 are formed as third conductive films between the gate electrodes 500, 510 and 520 of the memory transistors and the selection gate transistors.

FIG. 69 shows an equivalent circuit diagram of memory cells arranged in one island-like semiconductor layer 110 in which the polysilicon films 530 are formed as third conductive films between the gate electrodes of the memory transistors and the selection gate transistors, and FIG. 70 shows an equivalent circuit diagram in the case where a plurality of island-like semiconductor layers 110 are arranged.

Now explanation is given of the equivalent circuit diagram of FIG. 69.

The island-like semiconductor layer 110 has, as the selection gate transistors, a transistor provided with a thirty-second electrode 32 as the gate electrode and a transistor provided with a thirty-fifth electrode 35 as the gate electrode and a plurality of (e.g., L, L is a positive integer) memory cells arranged in series. The memory cell has a charge storage layer between the selection gate transistors and has a thirty-third electrode (33-*h*, h is a positive integer, 1≦h≦L) as the control gate electrode. The island-like semiconductor layer 110 also has thirty-sixth electrodes as the gate electrodes between the transistors. A thirty-fourth electrode 34 is connected to an end of the island-like semiconductor layer 110 and a thirty-first electrode 31 is connected to another end thereof. A plurality of thirsty-sixth electrodes are connected as a whole and provided in the island-like semiconductor layers 110.

Next explanation is given of the equivalent circuit diagram of FIG. 70. Now there is shown a connection relationship between each circuit element arranged in each island-like semiconductor layer 1 10 shown in FIG. 69 and each wire in a memory cell array where a plurality of island-like semiconductor layers 110 are arranged.

Are provided a plurality of (e.g., M×N, M and N are positive integers; i is a positive integer, 1≦i≦M; j is a positive integer, 1≦j≦N) island-like semiconductor layers 110. In the memory cell array, a plurality of (e.g., M) thirty-fourth wires arranged in parallel with the semiconductor substrate are connected to the above-mentioned thirty-fourth electrodes 34 provided in the island-like semiconductor layers 110.

A plurality of (e.g., N×L) thirty-third wires arranged in parallel with the semiconductor substrate and in a direction crossing the thirty-fourth wires 34 are connected with the above-mentioned thirty-third electrodes (33-*h*) of the memory cells. A plurality of (e.g., N) thirty-first wires arranged in a direction crossing the thirty-fourth wires are connected to the above-mentioned thirty-first electrodes 31 provided in the island-like semiconductor layers 110. The thirty-first wires are arranged in parallel with the thirty-third wires.

A plurality of (e.g., N) thirty-second wires arranged in parallel with the semiconductor substrate and in a direction crossing the thirty-fourth wires 34 are connected to the above-mentioned thirty-second electrodes 32 of the memory cells. A plurality of (e.g., N) thirty-fifth wires arranged in parallel with the semiconductor substrate and in a direction crossing the thirty-fourth wires 34 are connected to the above-mentioned thirty-fifth electrodes 35 of the memory cells. All the above-mentioned thirty-sixth electrodes 36 provided in the island-like semiconductor layers 110 are connected in unity by thirty-sixth wires.

All the above-mentioned thirty-sixth electrodes 36 provided in the island-like semiconductor layers 2110 need not be connected in unity by thirty-sixth wires, but may be connected in two or more groups by dividing the memory cell array with the thirty-sixth wires. That is, the memory cell array may be so constructed that the thirty-sixth electrodes 36 are connected block by block.

Now is described the operation principle of the case where the selection gate transistor is not connected to a memory cell adjacent to the selection gate transistor via an impurity diffusion layer, and the memory cells are not connected to each other via an impurity diffusion layer, and instead of that, the interval between the selection gate transistor and the memory cell and that between the memory cells are as close as about 30 nm or less as compared with the case where the selection gate transistor and the memory cell as well as the memory cells are connected via an impurity diffusion layer.

Where adjacent elements are sufficiently close to each other, a channel formed by a potential higher than the threshold applied to the gate of a selection gate transistor and the control gate of a memory cell connects to a channel of an adjacent element, and if a potential higher than the threshold is applied to the gates of all elements, the channels of all elements are connected. This state is equivalent to a state in which the selection transistor and the memory cell as well as the memory cells are connected via the impurity diffusion layer. Therefore, the operation principle is the same as that in the case where the selection transistor and the memory cell as well as the memory cells are connected via the impurity diffusion layer.

Now is described the operation principle of the case where the selection gate transistor is not connected to a memory cell adjacent to the selection gate transistor via an impurity diffusion layer, the memory cells are not connected to each other via an impurity diffusion layer, and instead of that, third conductive films between the selection transistor and the memory cell and between the gate electrodes of the memory cells.

The third conductive films are located between elements and are connected to the island-like semiconductor layers with intervention of insulating films, e.g., silicon oxide films. That is, the third conductive film, the insulating film and the island-like semiconductor layer form an MIS capacitor. A channel is formed by applying to the third conductive film a potential such that a reverse layer is formed at an interface between the island-like semiconductor layer and the insulating film. The thus formed channel acts to adjacent elements in the same manner as an impurity diffusion layer connecting the elements. Therefore, if a potential allowing a channel to be formed is applied to the third conductive film, is produced the same action as in the case where the selection gate transistor and the memory cell are connected via the impurity diffusion layer.

Even if the potential allowing a channel to be formed is not applied to the third conductive film, is produced the same action as in the case where the selection gate transistor and the memory cell are connected via the impurity diffusion layer, when electrons are drawn from the charge storage layer if the island-like semiconductor layer is formed of a P-type semiconductor.

Embodiments of Processes of Producing Semiconductor Memories

With reference to the figures, described are a production process of a semiconductor memory according to the present invention and embodiments of the semiconductor memory produced by the production process.

Unlike the conventional memory, embodiments of the semiconductor memory are shown in which a semiconductor substrate or a semiconductor layer patterned in the form of pillars having at least one recess is formed and tunnel oxide films, floating gates and control gates are formed in the recesses.

The steps and embodiments according to the following Production examples may be applied in combination with the steps and embodiments of other Production examples.

PRODUCTION EXAMPLE 1

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. The island-like semiconductor layers have additional recesses at the top and the bottom thereof and selection gate transistors including gate oxide films and selection gates are arranged therein. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Such a semiconductor memory is produced by the following production process.

FIGS. 78 to 105 and FIGS. 106 to 133 are sectional views taken on line A–A' and line B–B', respectively, in FIG. 1 which is a cross-sectional view illustrating a memory cell array of an EEPROM.

Figure 78:
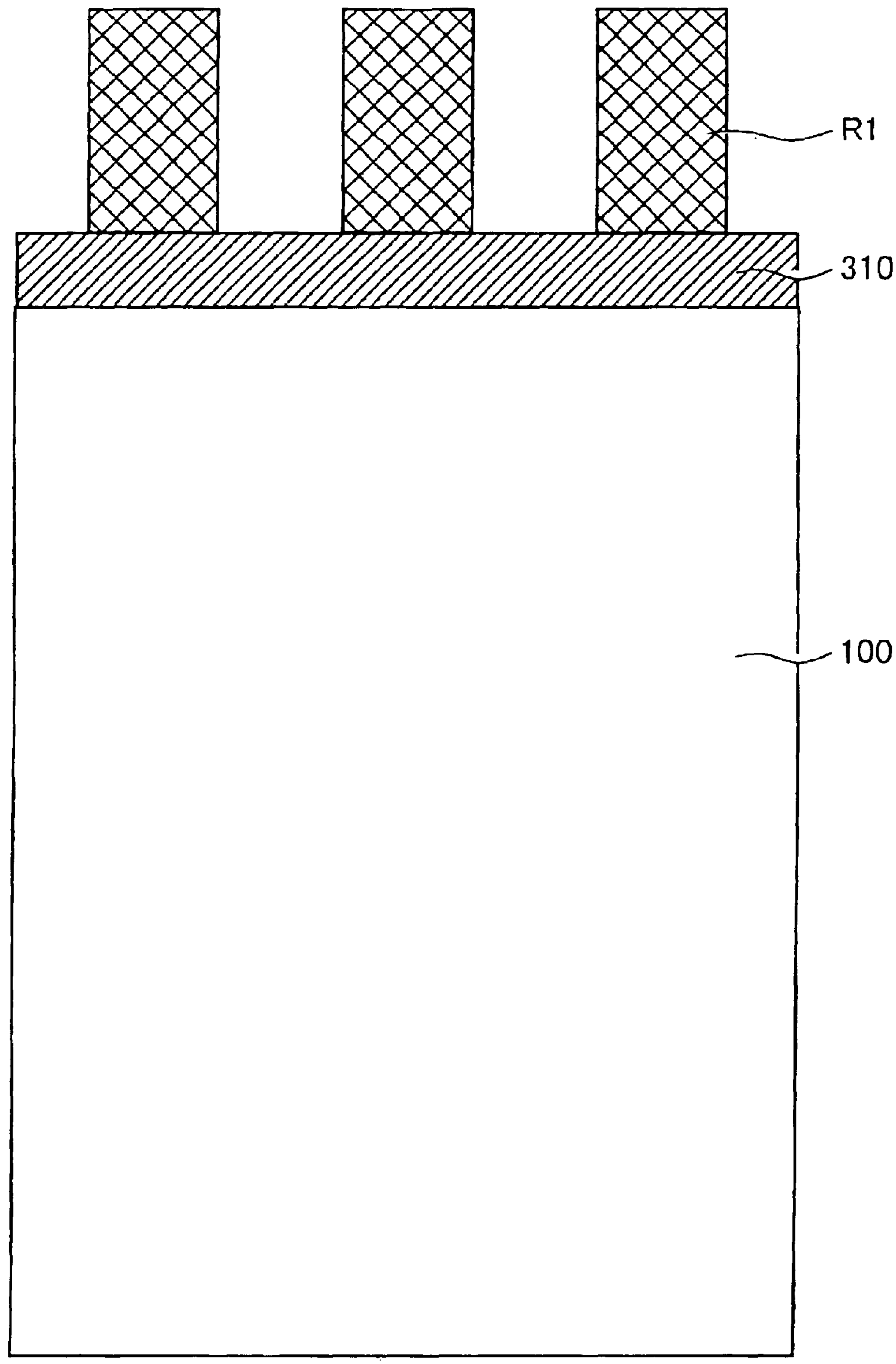
FIGS. 78 to 485 are sectional views (taken on line A–A' and line B–B' in FIG. 1, FIG. 2 or FIG. 9) illustrating production steps for producing a semiconductor memory device in accordance with the present invention.
Figure 79:
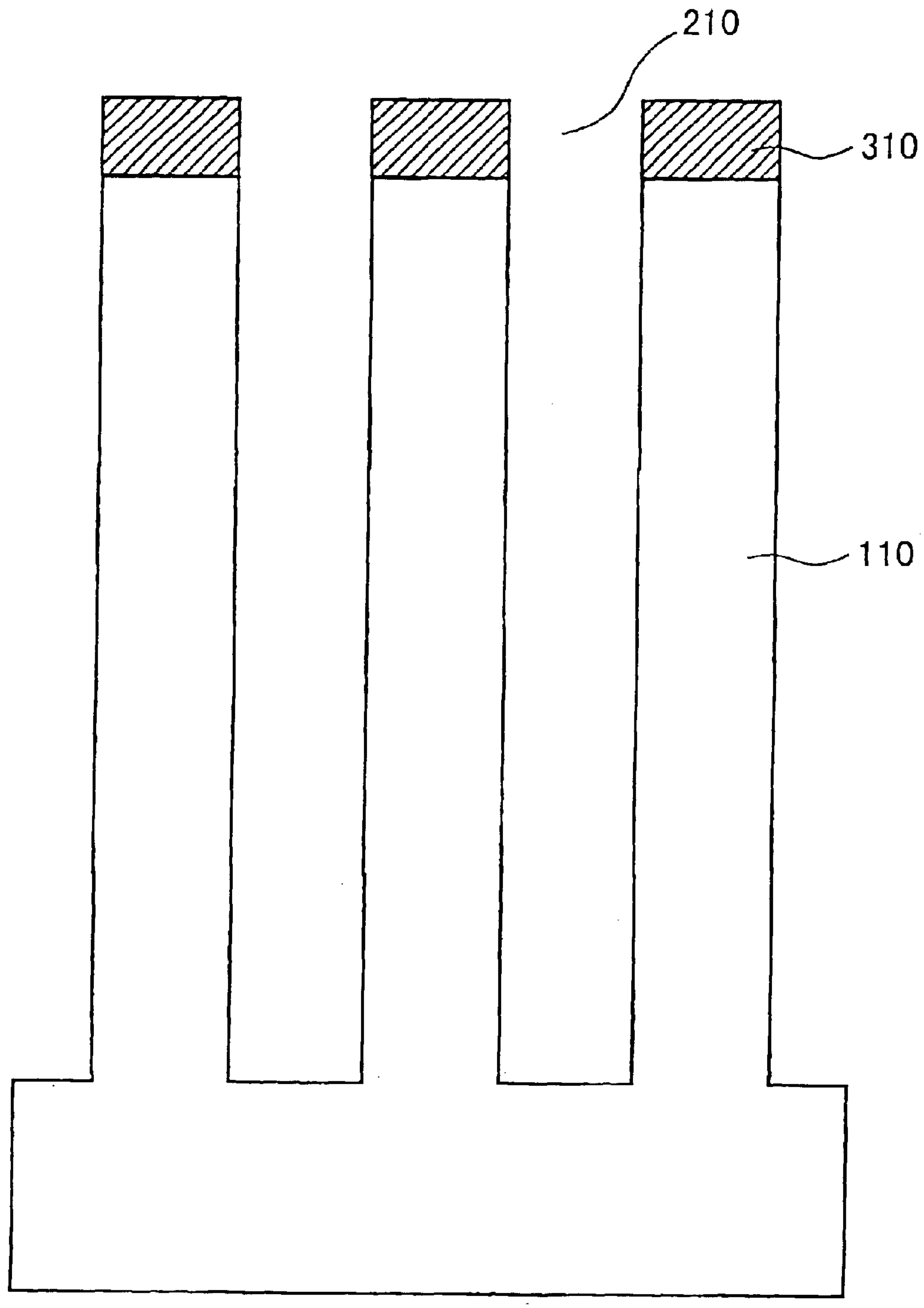
Figure 106:
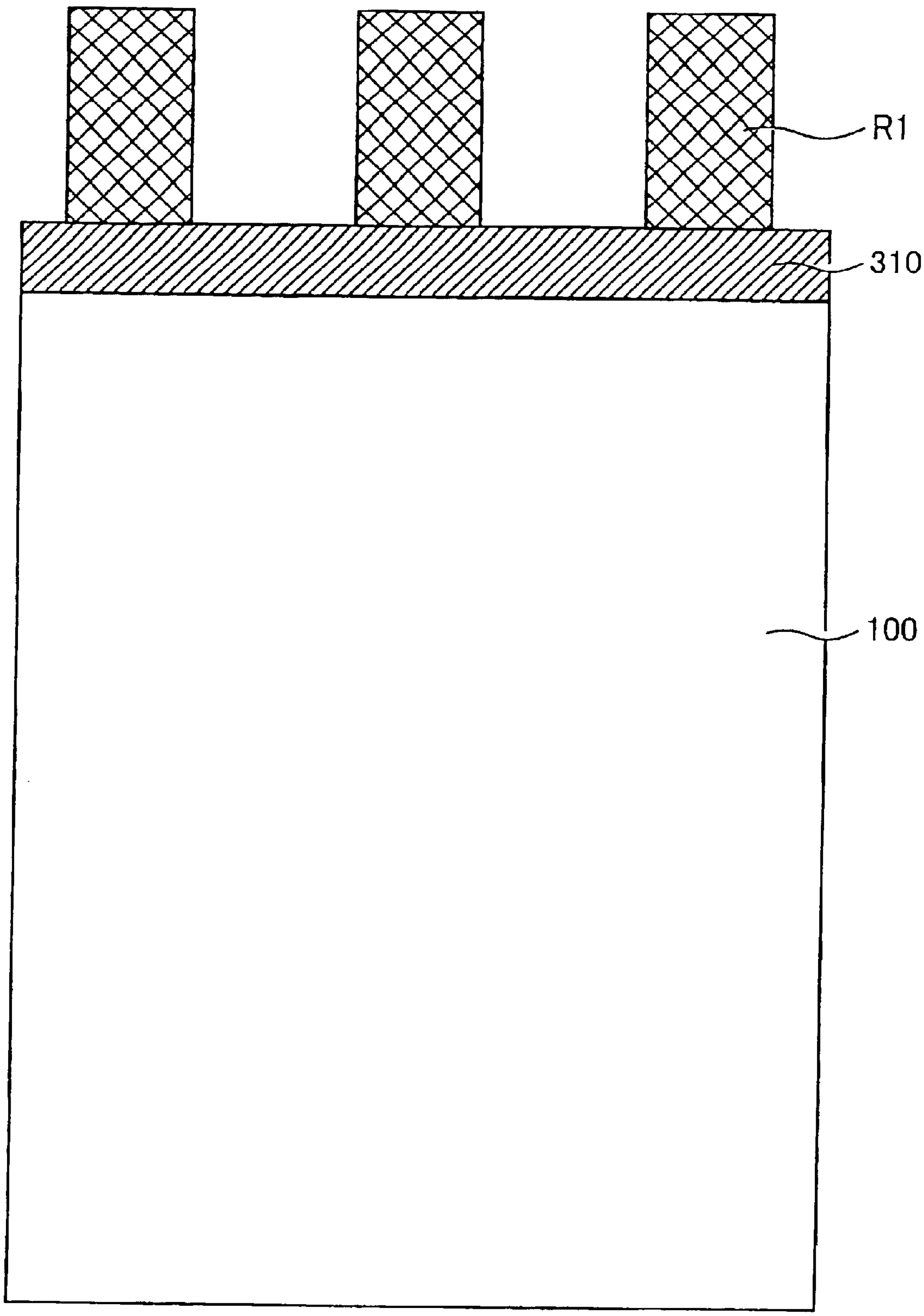
Figure 107:
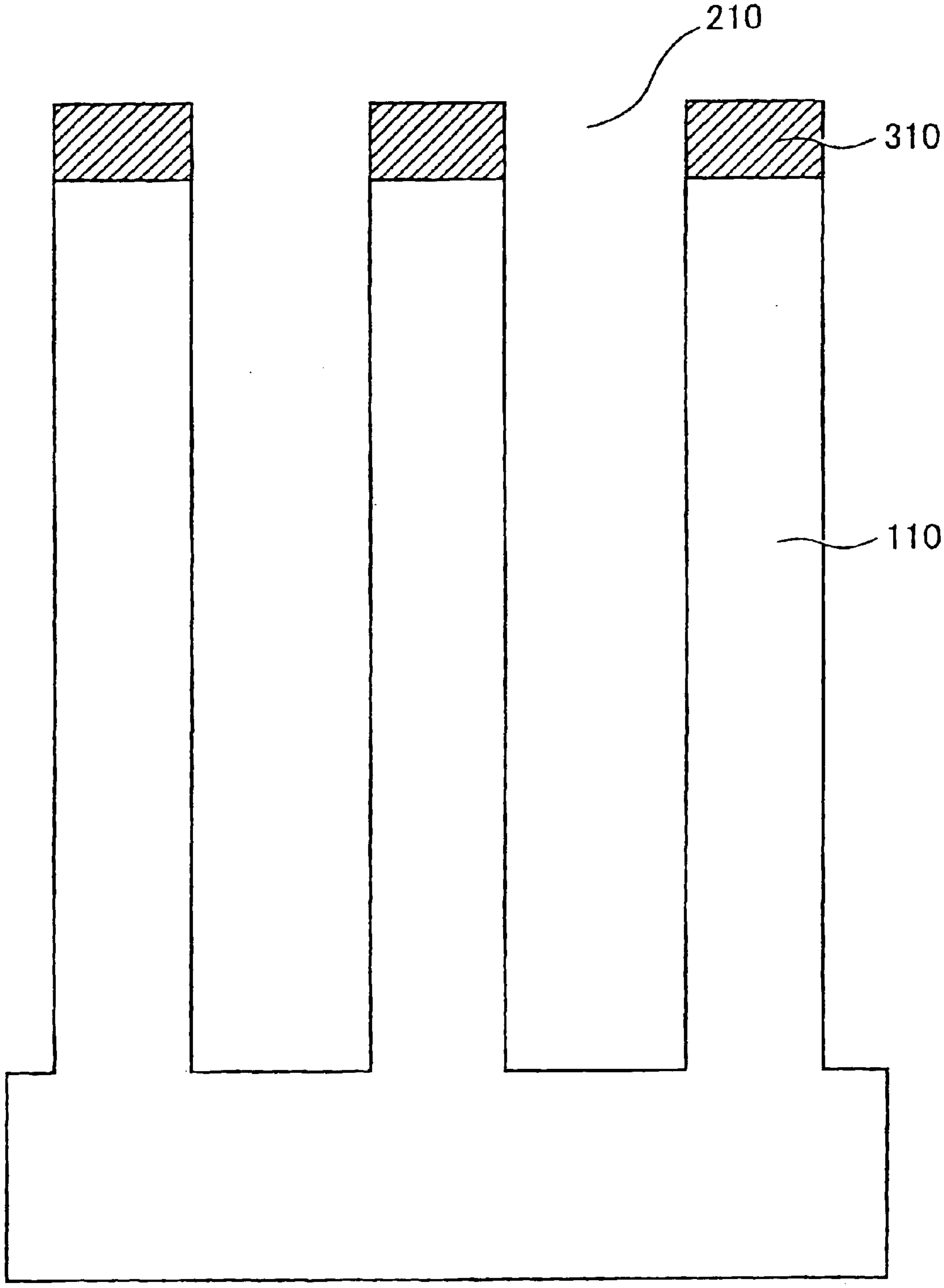

First, a silicon nitride film 310 to be a mask layer is deposited to a thickness of 200 to 2,000 nm as a first insulating film on a surface of a P-type silicon substrate 100 and etched by reactive ion etching using a resist film R1 patterned by a known photolithography technique as a mask (FIG. 78 and FIG. 106). Using the silicon nitride film 310 as a mask, the P-type silicon substrate 100 is etched by 2,000 to 20,000 nm by reactive ion etching to form a first trench 210 in a lattice form (FIG. 79 and FIG. 107). Thereby, the P-type silicon substrate 100 is divided into a plurality of columnar island-like semiconductor layers 110.

Thereafter, as required, the surface of the island-like semiconductor layer 110 is oxidized to form a thermally oxidized film 410 having a thickness of 10 to 100 nm as a second insulating film. At this time, if the island-like semiconductor layer 110 has been formed at the minimum photoetching dimension, the dimension of the island-like semiconductor layer 110 is decreased by the formation of the thermally oxidized film 410, that is, the island-like semiconductor layer 110 is formed to have a dimension smaller than the minimum photoetching dimension.

Next, the thermally oxidized film 410 is etched away from the periphery of each island-like semiconductor layer 110 by isotropic etching. Then, as required, channel ion implantation is carried out into the sidewall of the island semiconductor layer 110 by utilizing slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 110 because a surface impurity concentration becomes more uniform. Alternatively, instead of the channel ion implantation, an oxide film containing boron may be deposited by CVD with a view to utilizing diffusion of boron from the oxide film.

The impurity implantation from the surface of the island-like semiconductor layers 110 may be carried out before the island-like semiconductor layers are covered with the thermally oxidized film 410, or the impurity implantation may be finished before the island-like semiconductor layers 110 are formed. Means for the implantation are not particularly limited so long as an impurity concentration distribution is almost equal over the island-like semiconductor layers 110.

Figure 80:
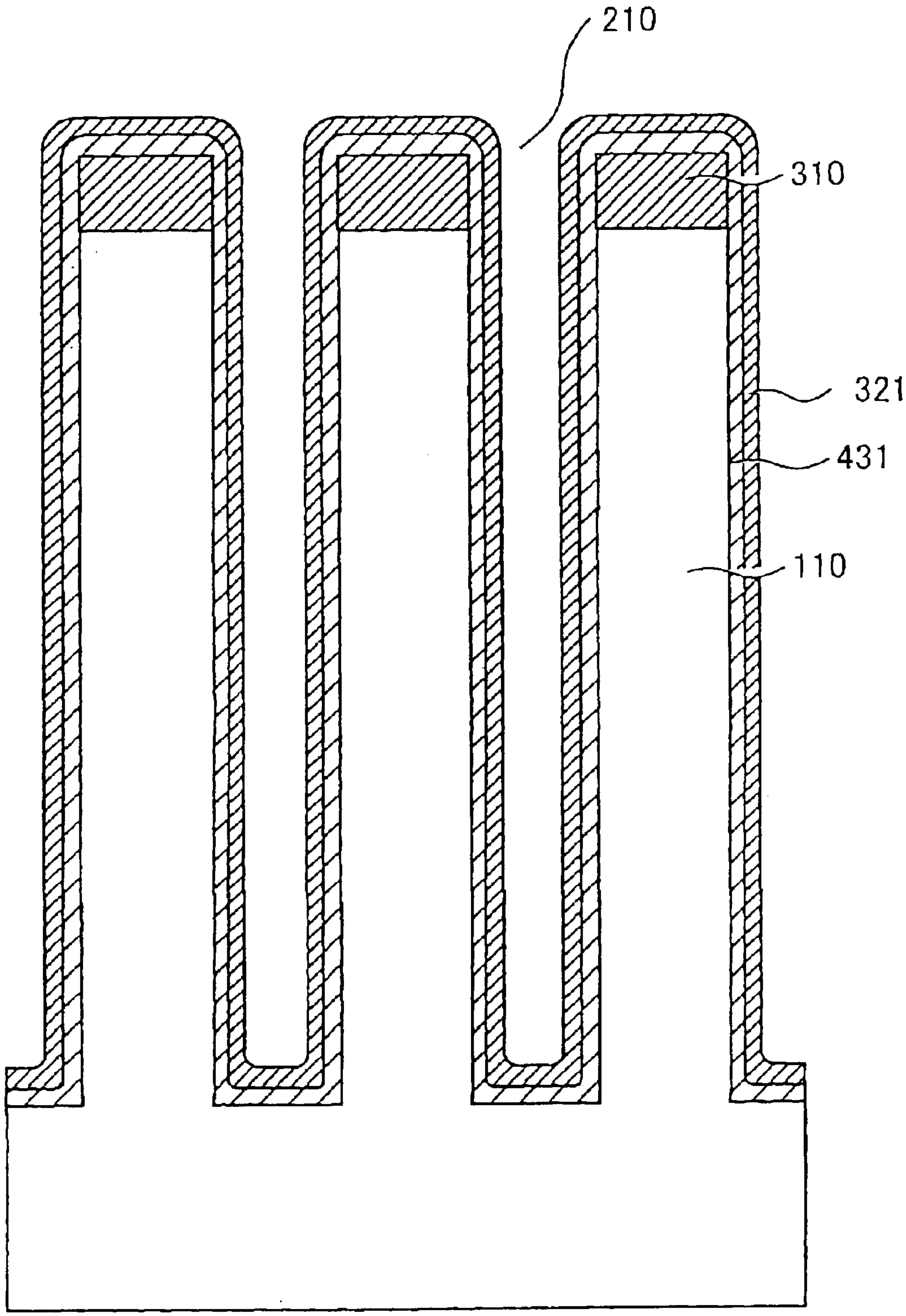
Figure 108:
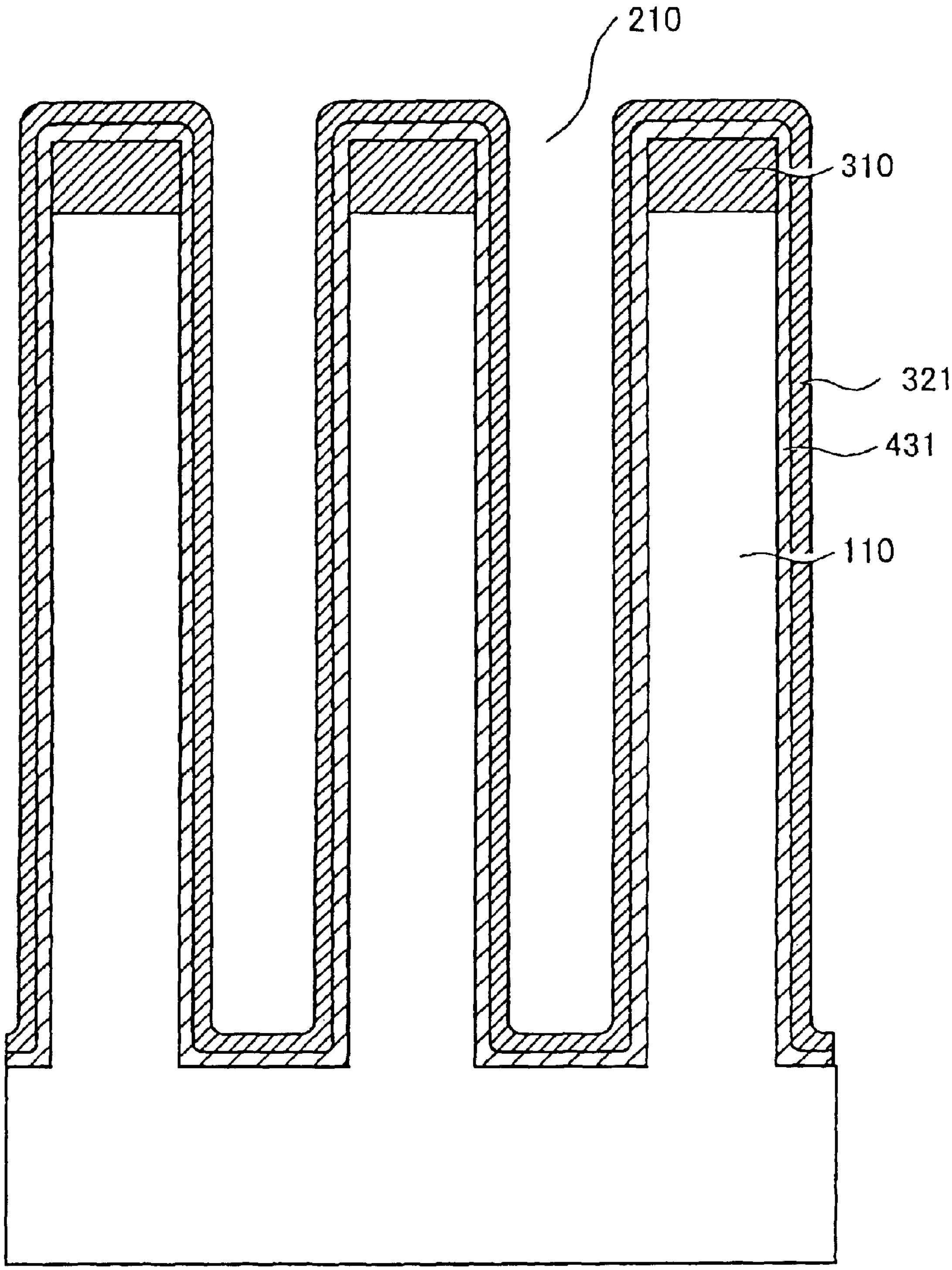

Then, a silicon oxide film 431 is deposited to a thickness of 10 to 100 nm as a fifth insulating film and a silicon nitride film 321 is deposited to a thickness of 10 to 100 nm as a fourth insulating film (FIG. 80 and FIG. 108).

Figure 81:
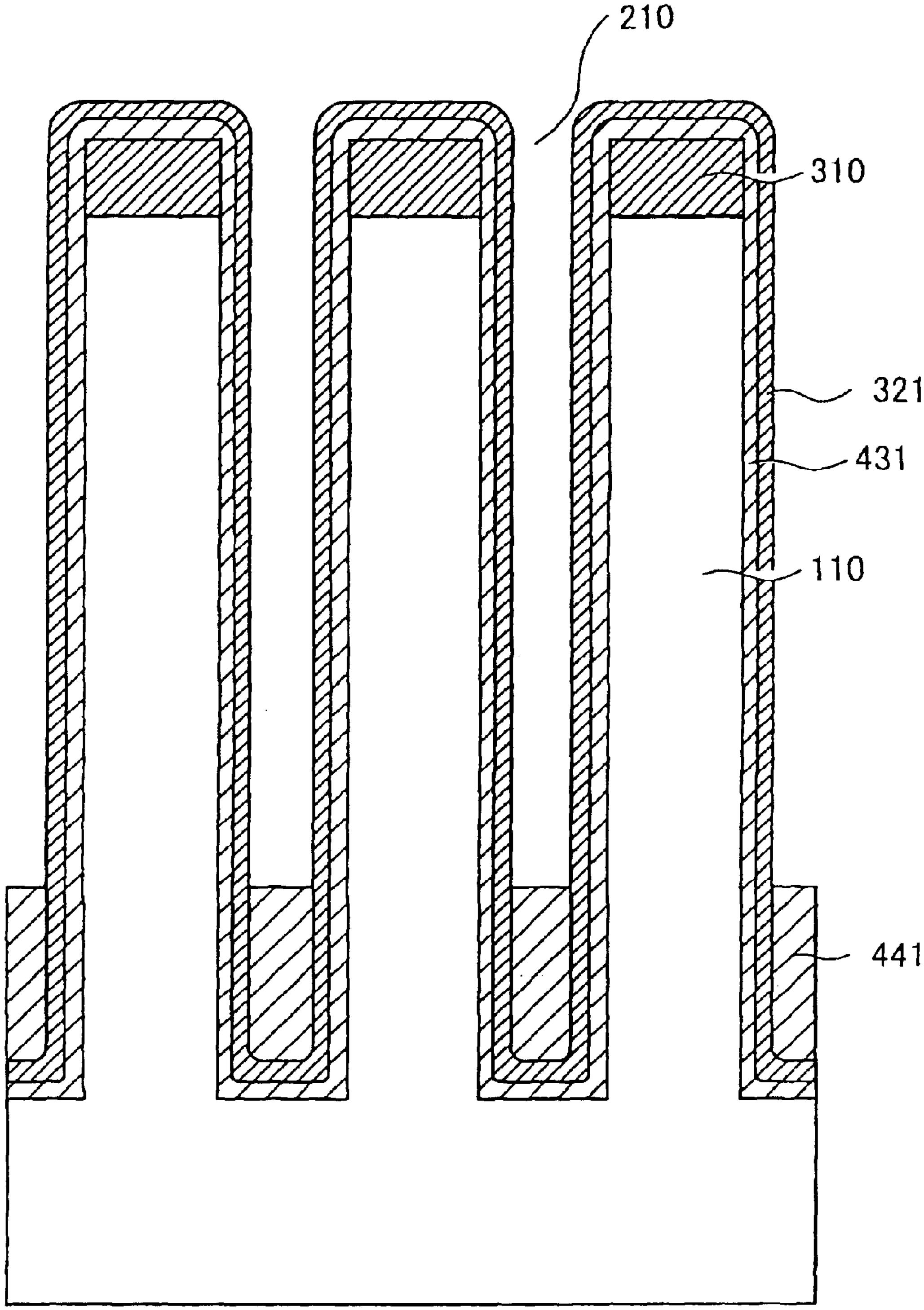
Figure 109:
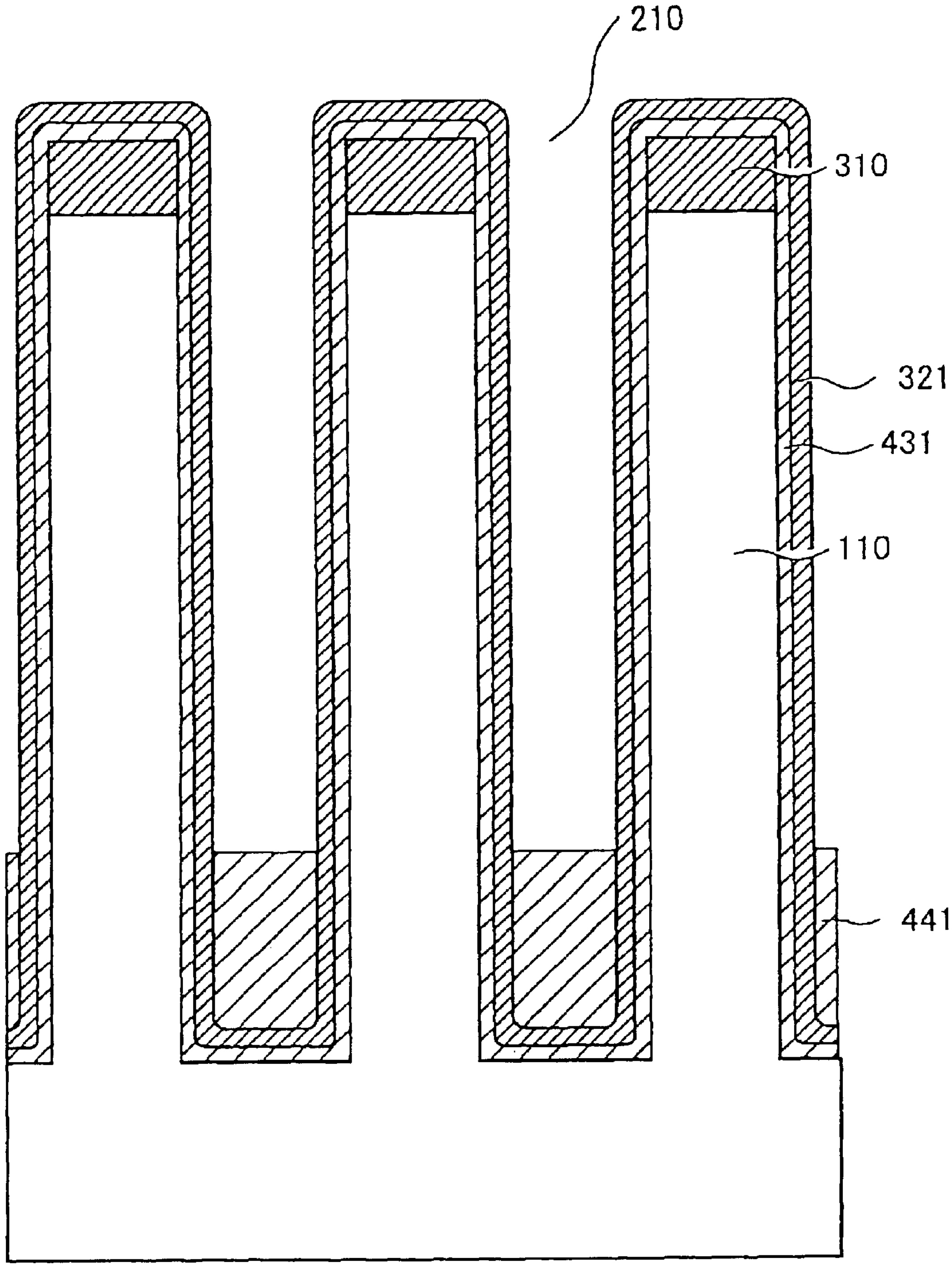

Further, a silicon oxide film 441 is deposited to a thickness of 50 to 500 nm as a sixth insulating film and etched back to a desired height by isotropic etching, for example, such that the silicon oxide film 441 is buried in the first trench 210 (FIG. 81 and FIG. 109).

Figure 82:
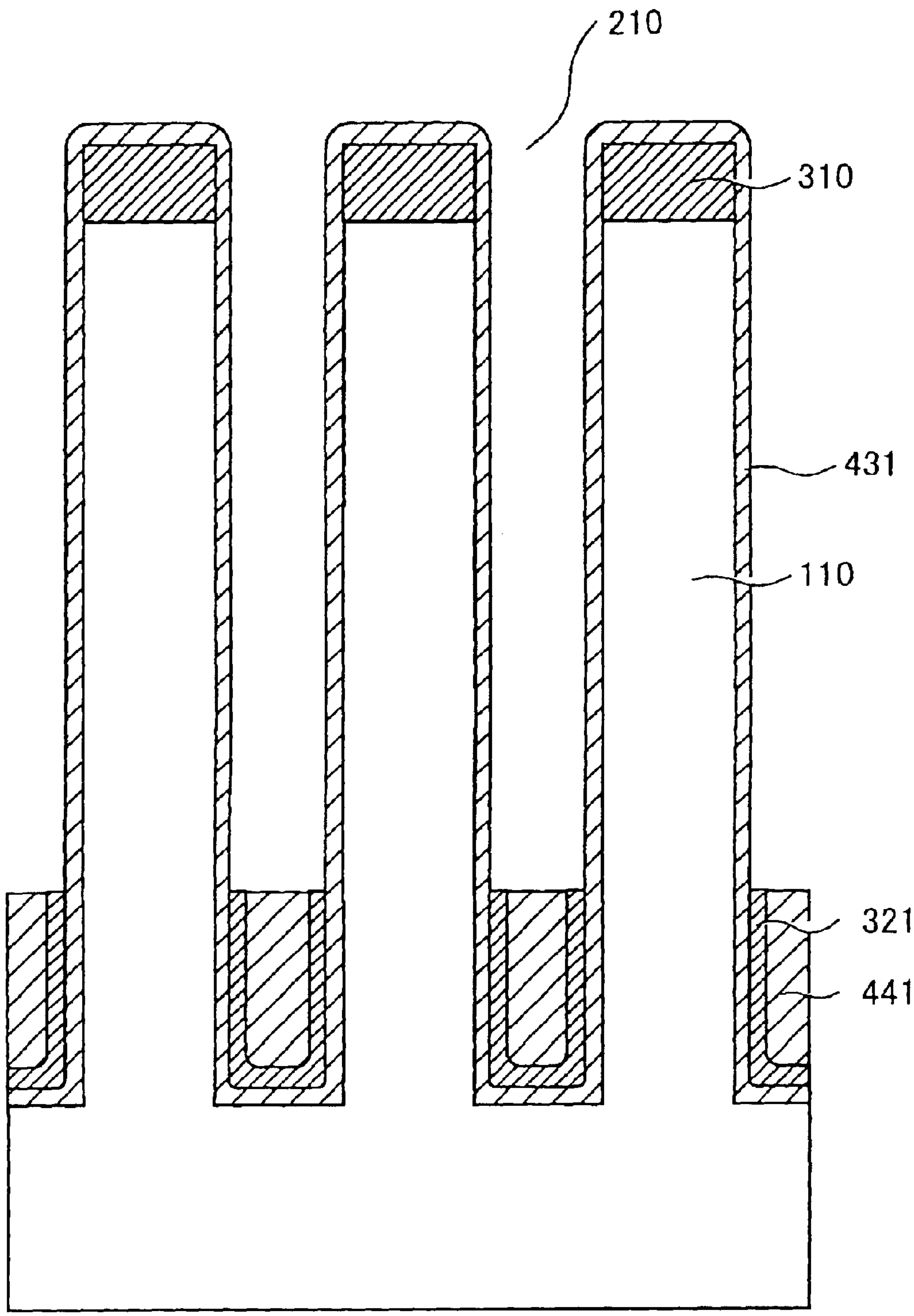
Figure 83:
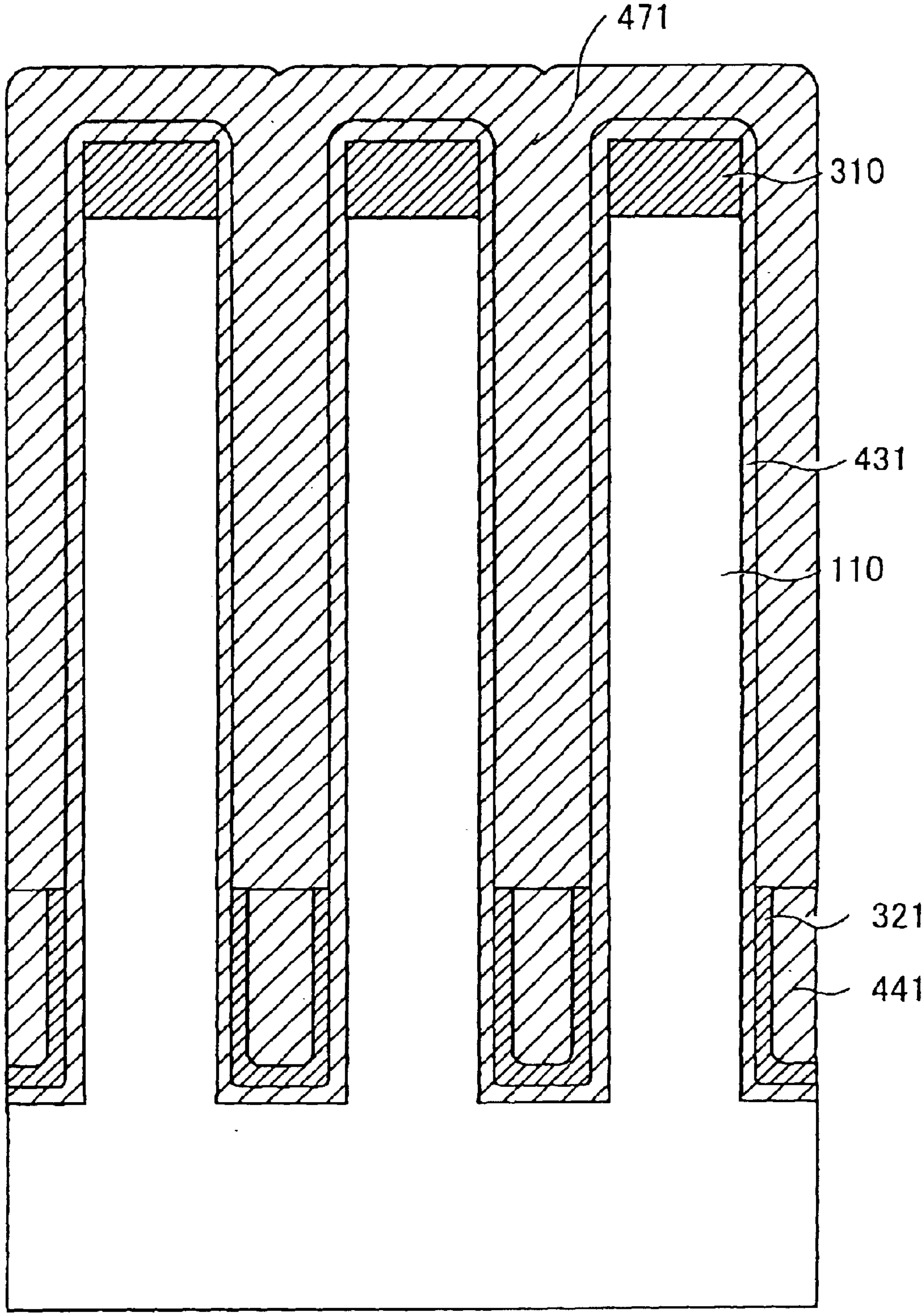
Figure 110:
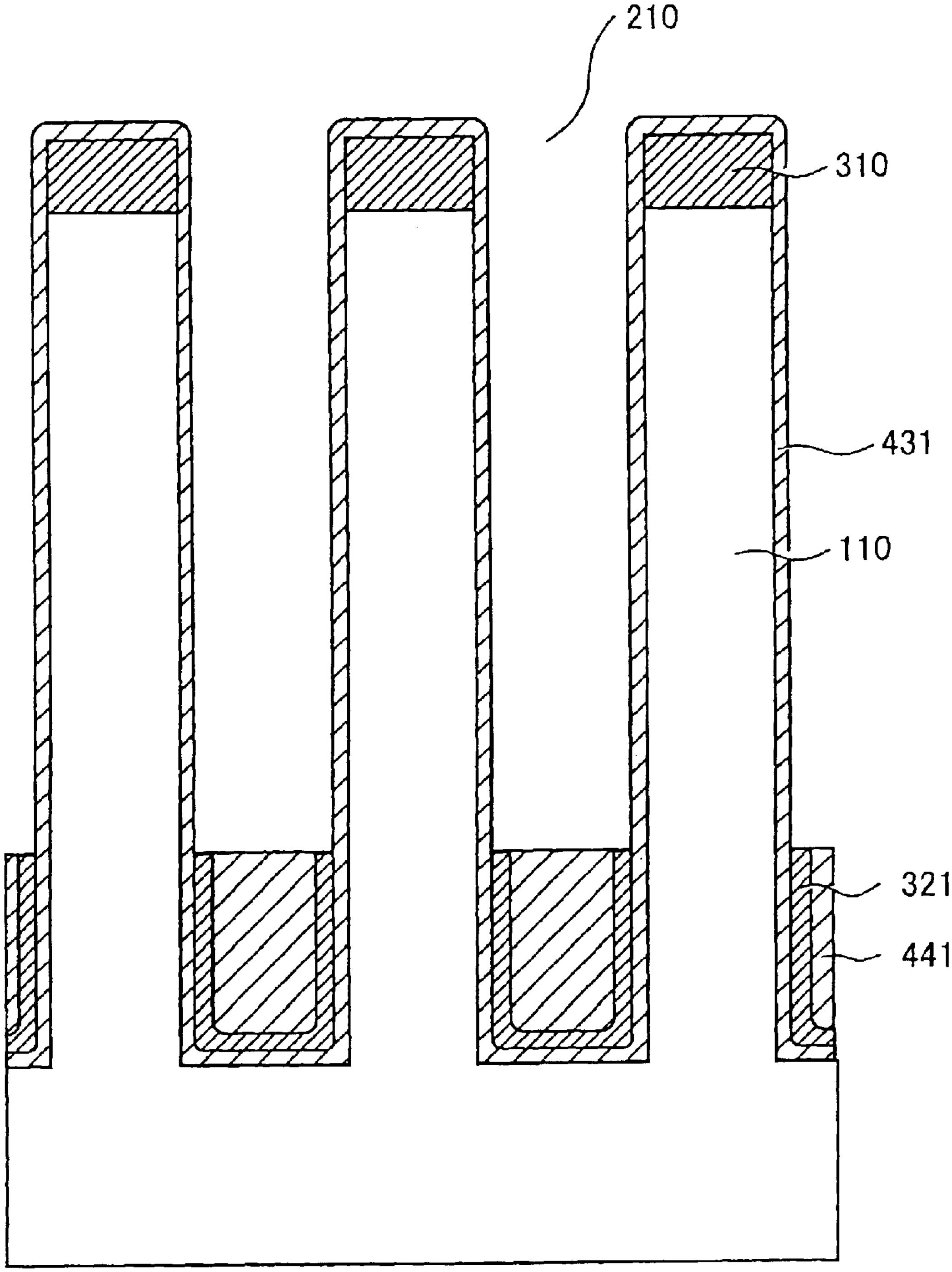
Figure 111:
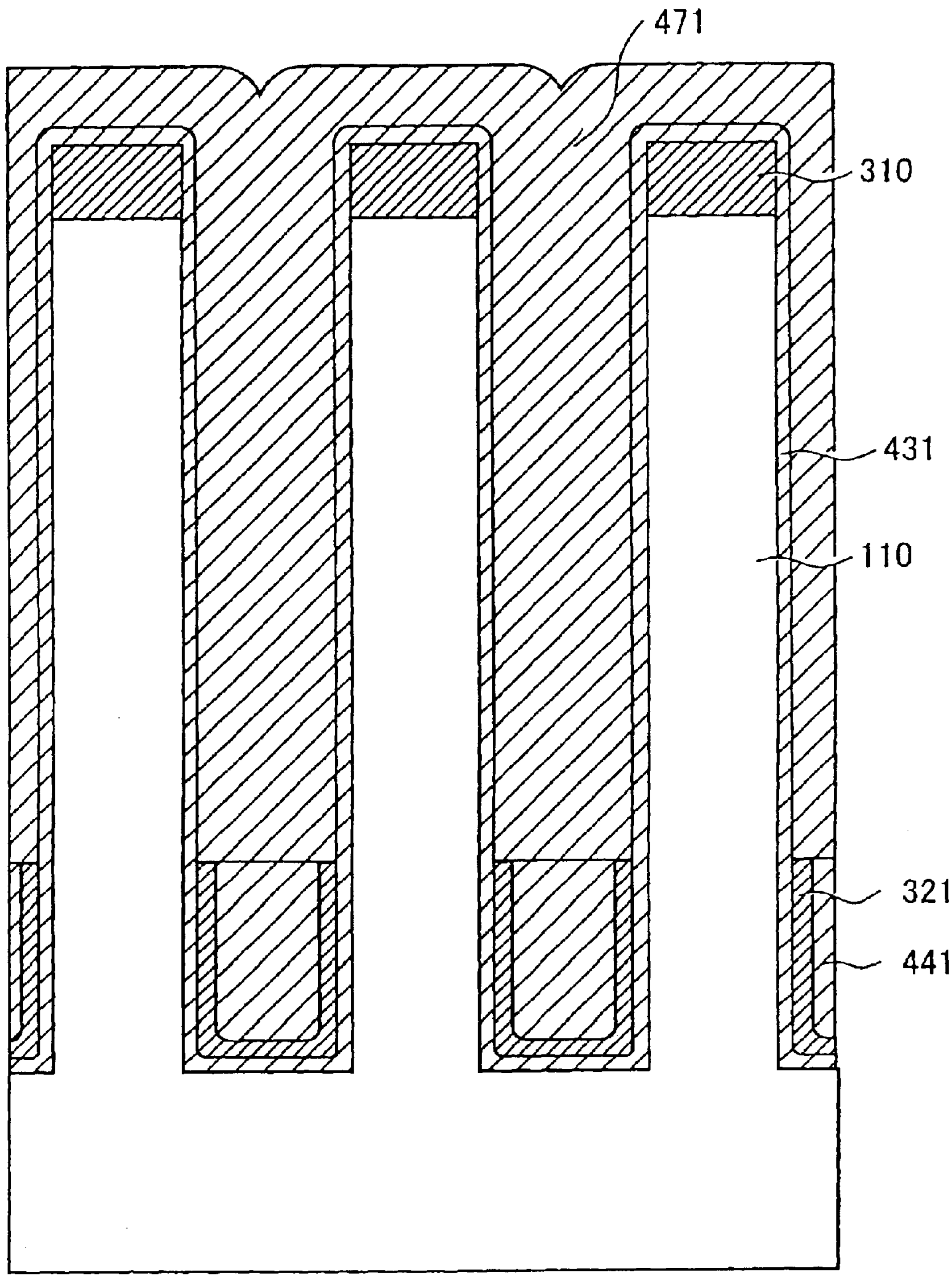

Using the silicon oxide film 441 as a mask, an exposed portion of the silicon nitride film 321 is removed by isotropic etching, for example (FIG. 82 and FIG. 110).

Figure 84:
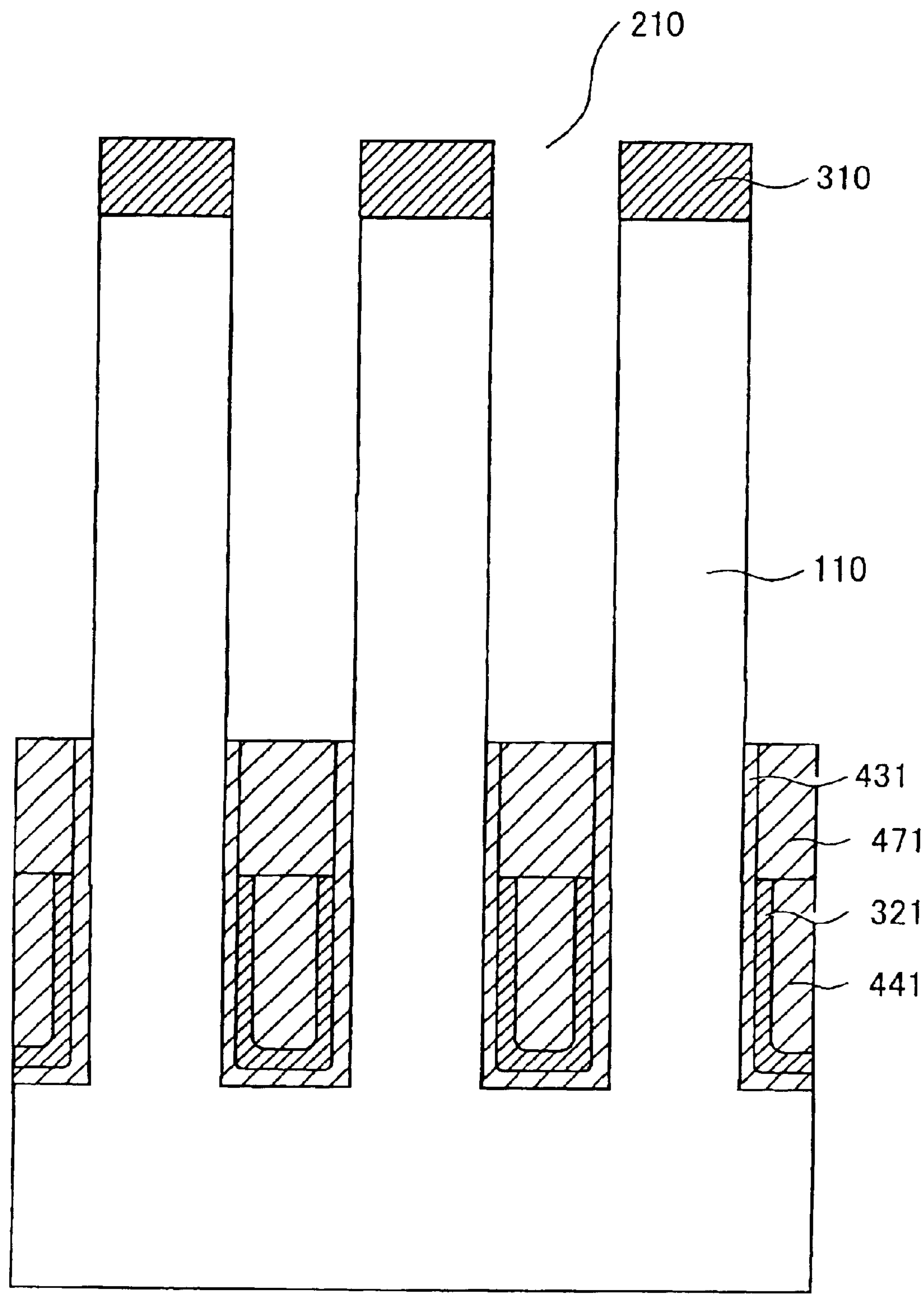
Figure 112:
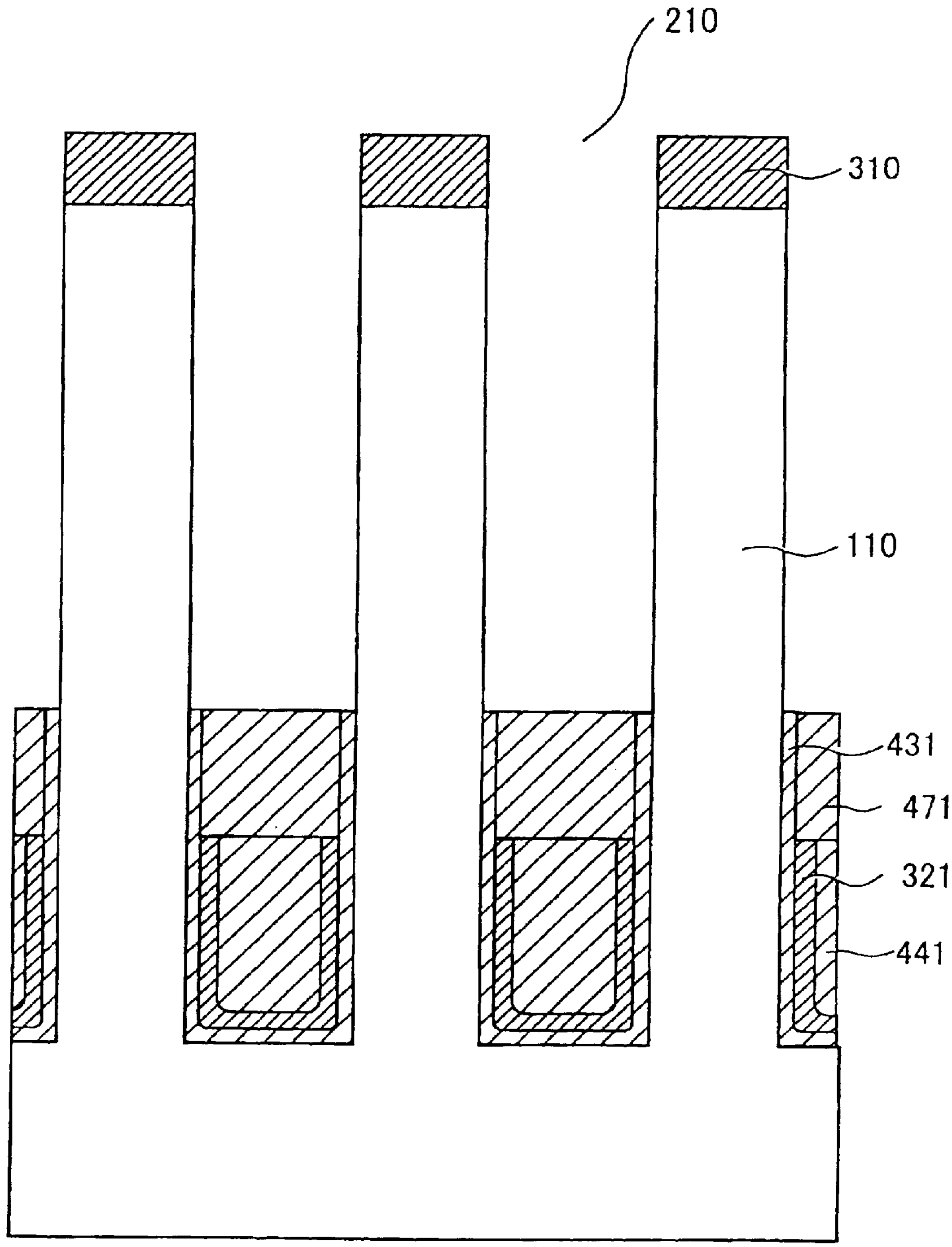

Subsequently, a silicon oxide film 471 is deposited to a thickness of 50 to 500 nm (FIG. 83 and FIG. 111) as a eleventh insulating film and etched back to a desired height by isotropic etching, for example, such that the silicon oxide film 471 is buried in the first trench 210 (FIG. 84 and FIG. 112).

Then, a silicon oxide film 432 is deposited to a thickness of 10 to 100 nm as a fifth insulating film and a silicon nitride film 322 is deposited to a thickness of 10 to 100 nm as a fourth insulating film. The silicon nitride film 322 is etched by anisotropic etching to remain in the form of a sidewall spacer on the sidewall of the island-like semiconductor layer 110 with the intervention of the silicon oxide film 432.

A silicon oxide film 442 is then deposited to a thickness of 50 to 500 nm as a sixth insulating film and etched back to a desired height by isotropic etching, for example, such that the silicon oxide film 442 is buried in the first trench 210.

Using the silicon oxide film 442 as a mask, an exposed portion of the silicon nitride film 322 is removed by isotropic etching.

Figure 85:
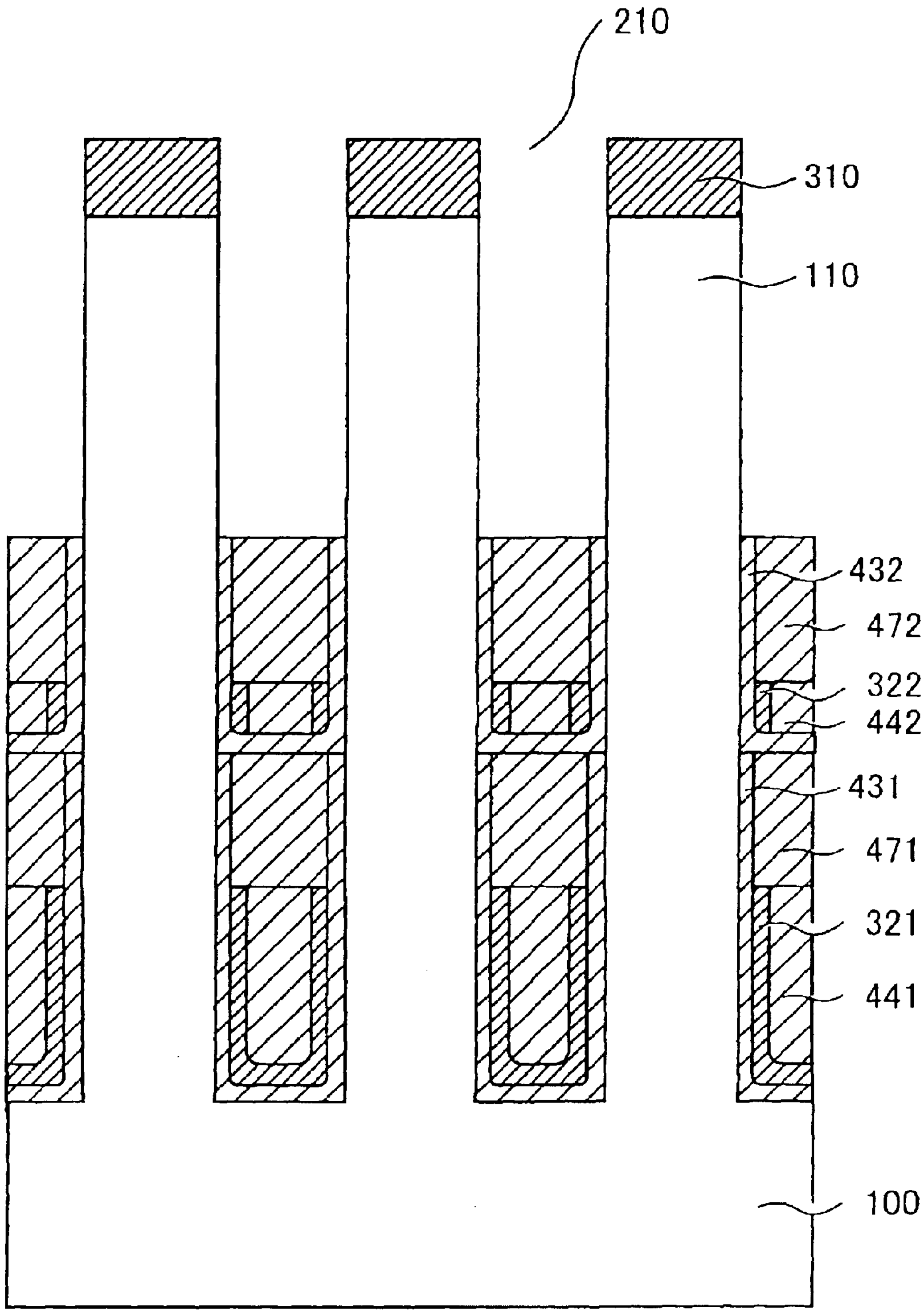
Figure 113:
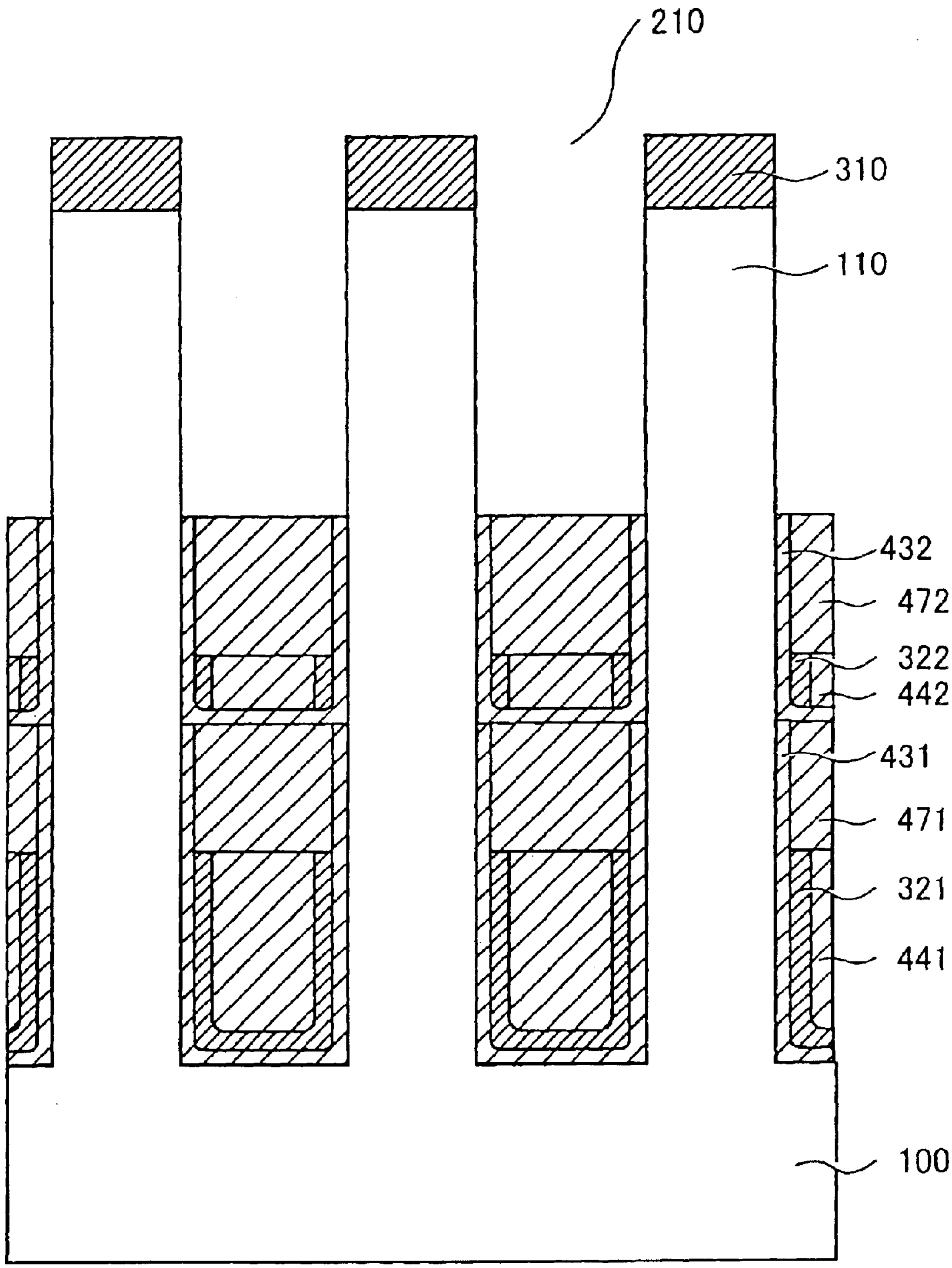

Subsequently, a silicon oxide film 472 is deposited to a thickness of 50 to 500 nm as a eleventh insulating film and etched back to a desired height by isotropic etching, for example, such that the silicon oxide film 472 is buried in the first trench 210 (FIG. 85 and FIG. 113).

Figure 86:
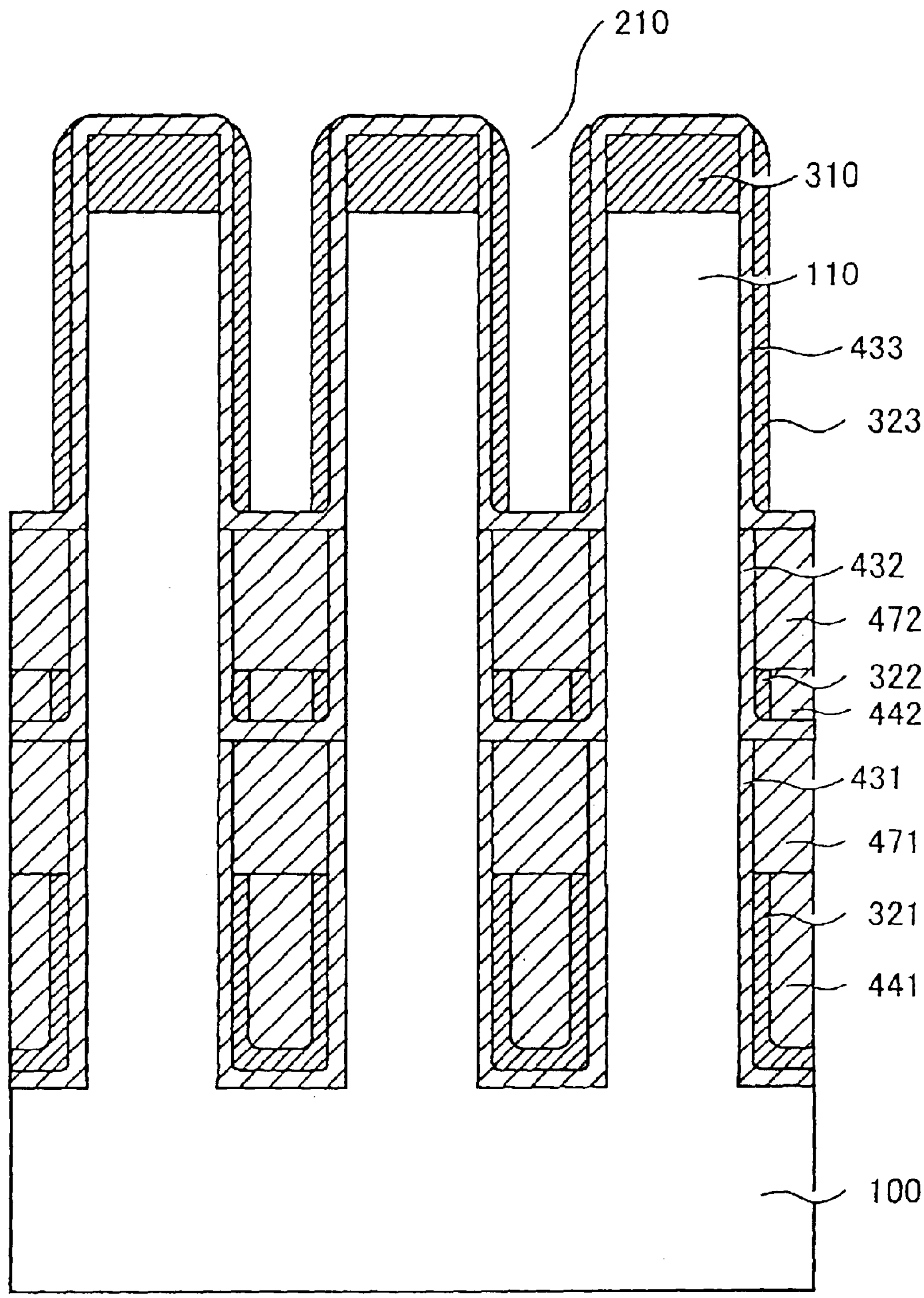
Figure 87:
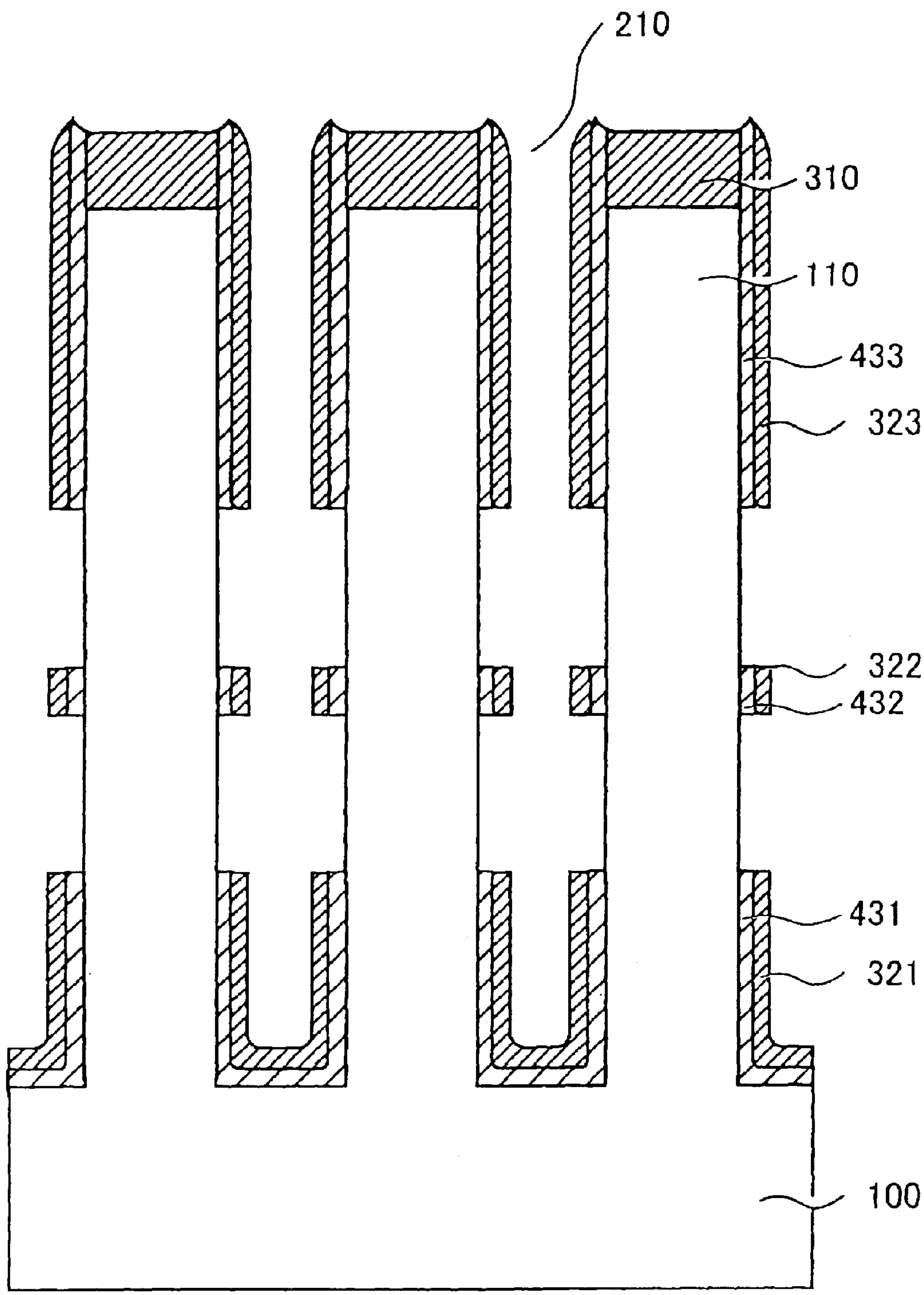
Figure 114:
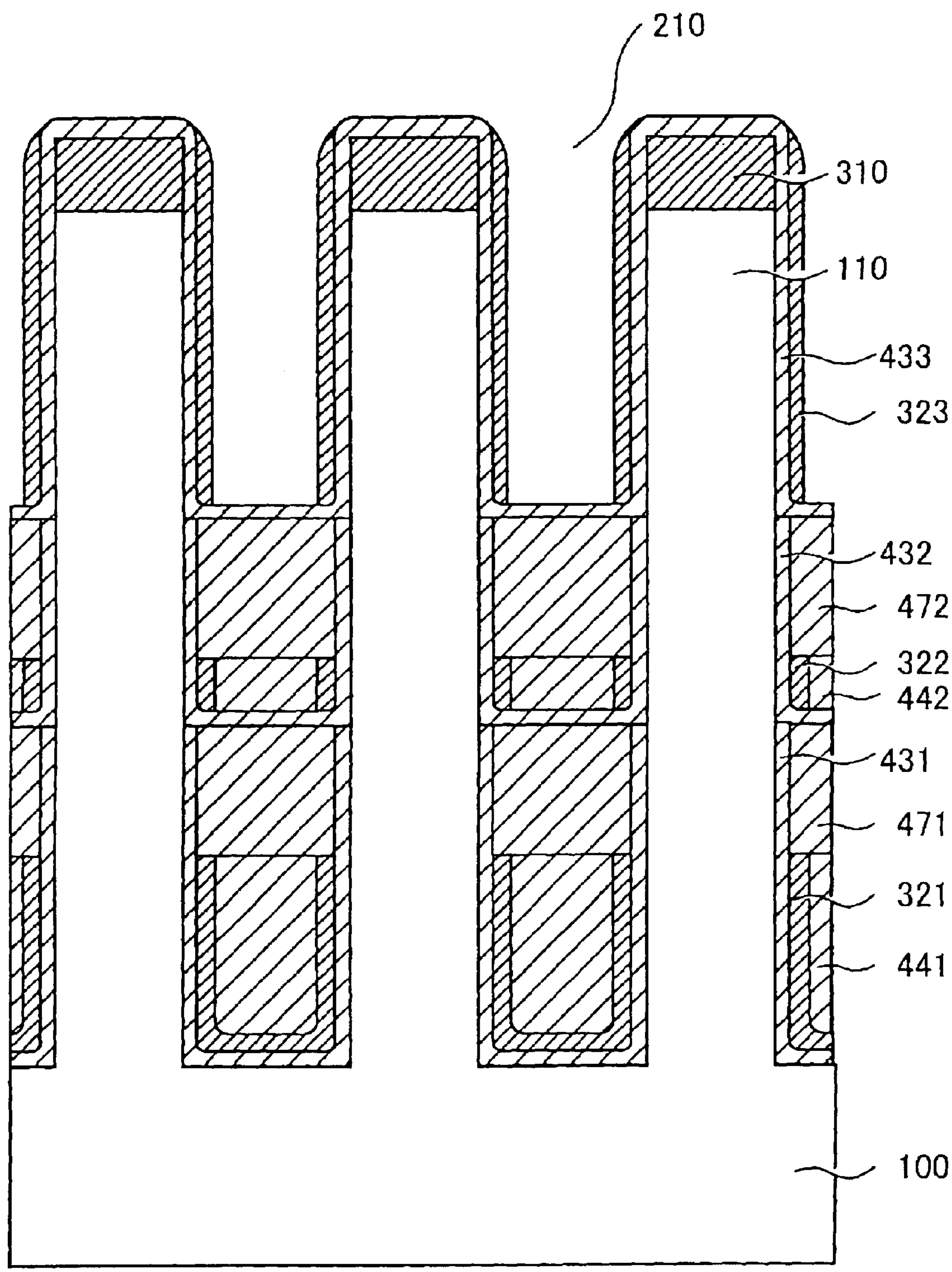
Figure 115:
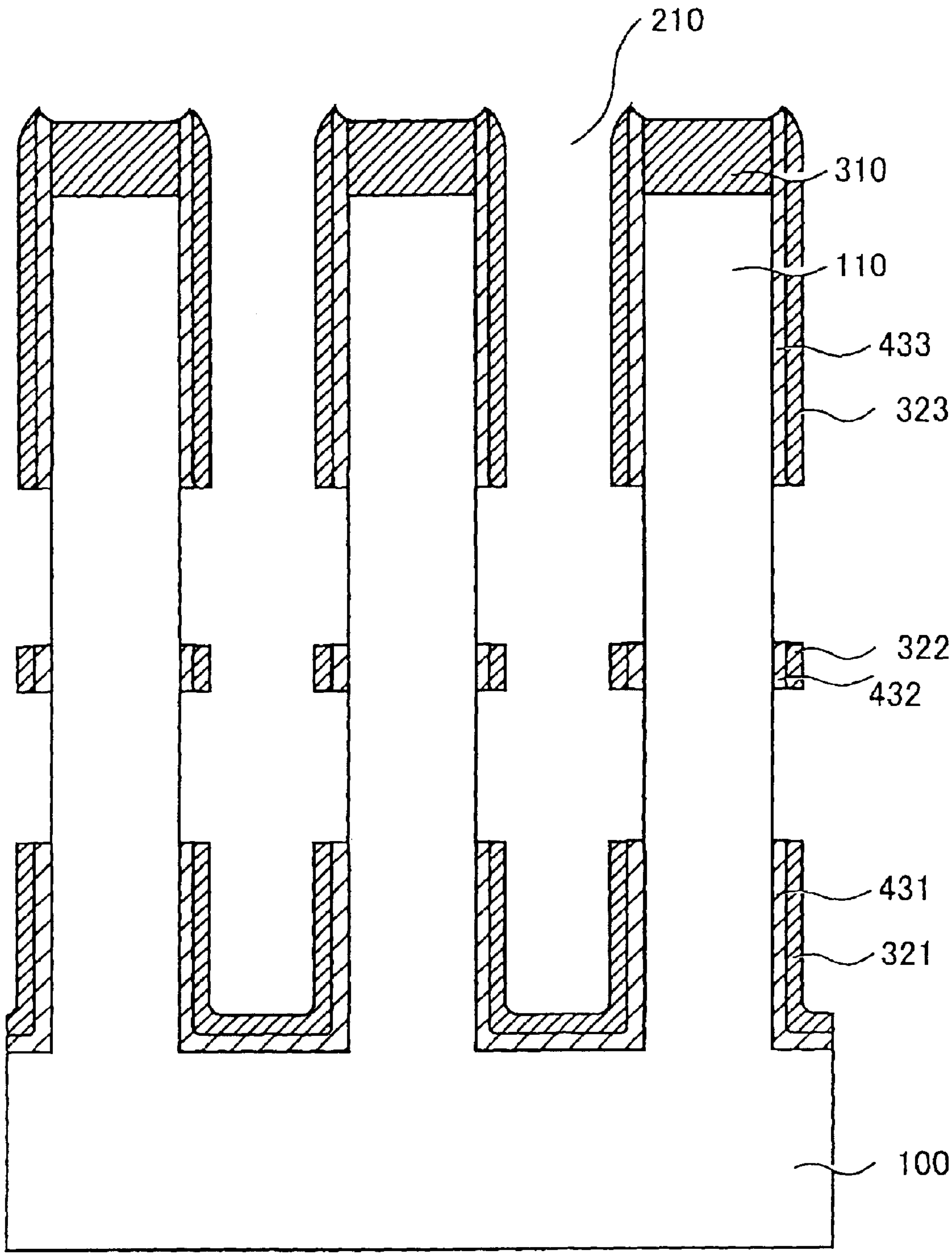

Then, a silicon oxide film 433 is deposited to a thickness of 10 to 100 nm as a fifth insulating film and a silicon nitride film 323 is deposited to a thickness of 10 to 100 nm as a fourth insulating film. The silicon nitride film 323 is etched by anisotropic etching to remain in the form of a sidewall spacer on the sidewall of the island-like semiconductor layer 110 with the intervention of the silicon oxide film 433 (FIG. 86 and FIG. 114).

Figure 88:
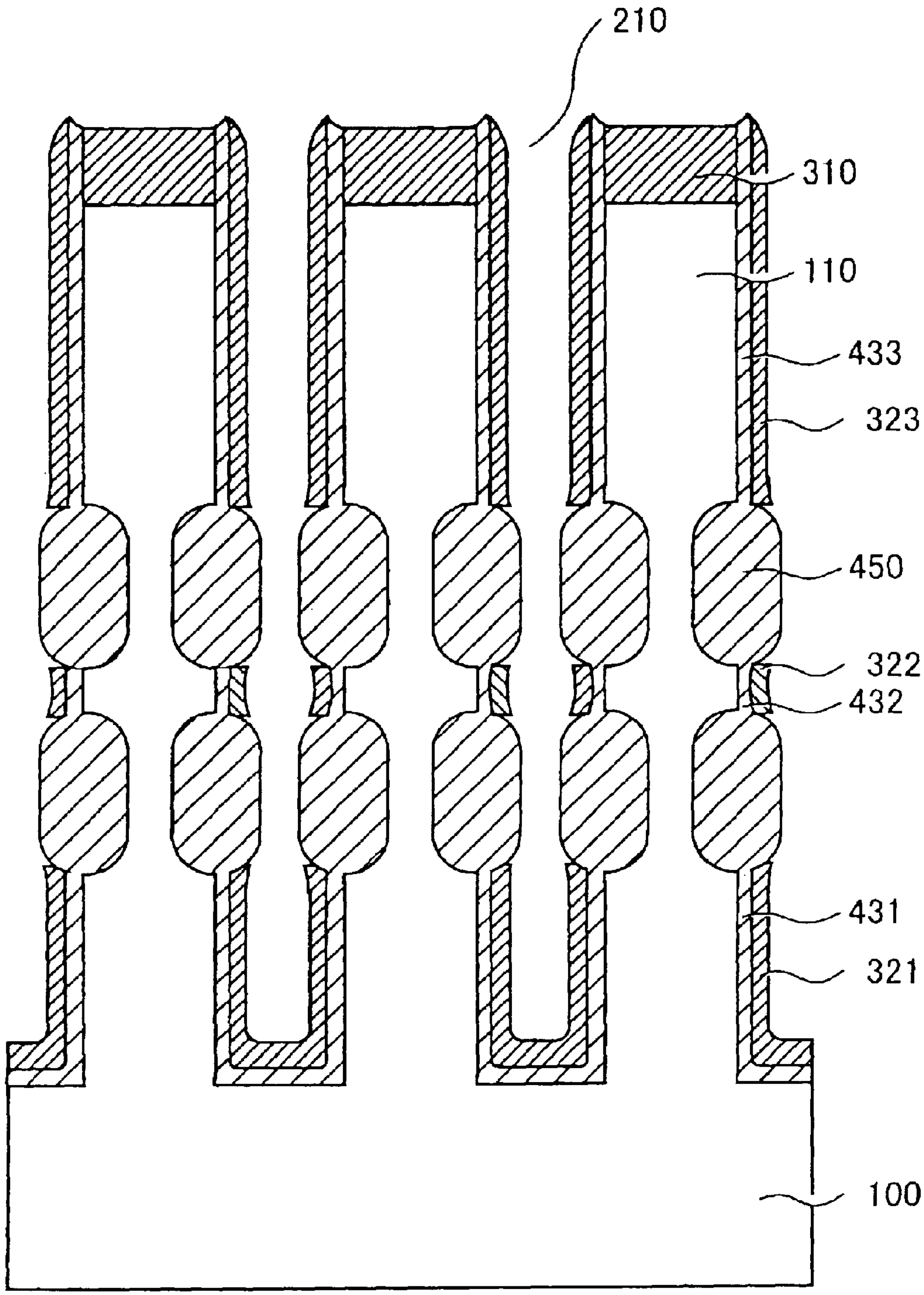
Figure 116:
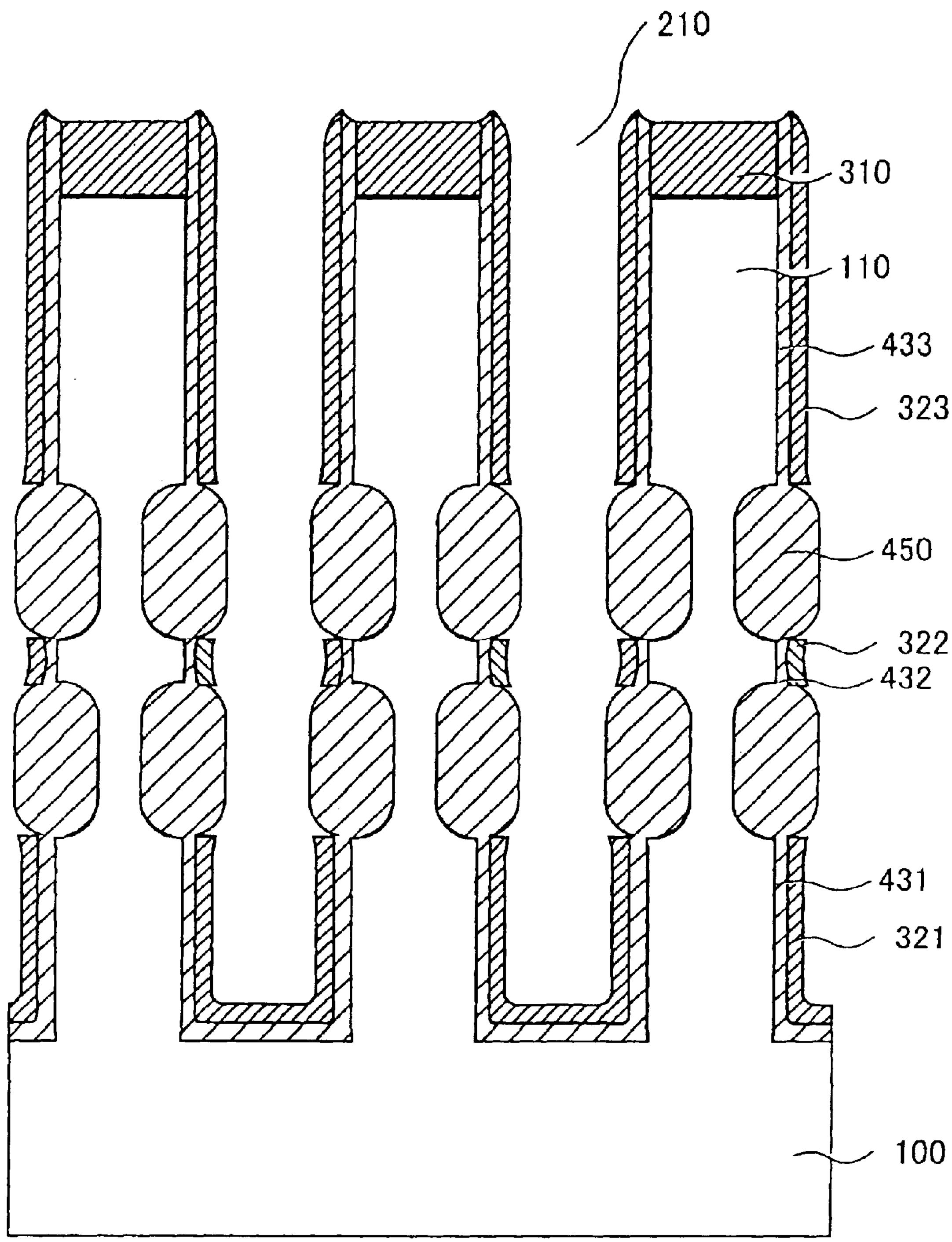

The silicon oxide film is selectively removed by isotropic etching (FIG. 87 and FIG. 115), and a silicon oxide film 450 of about 30 to 300 nm thick is grown on the exposed island-like semiconductor layer 110 as a seventh insulating film, for example, by thermal oxidation (FIG. 88 and FIG. 116).

Figure 89:
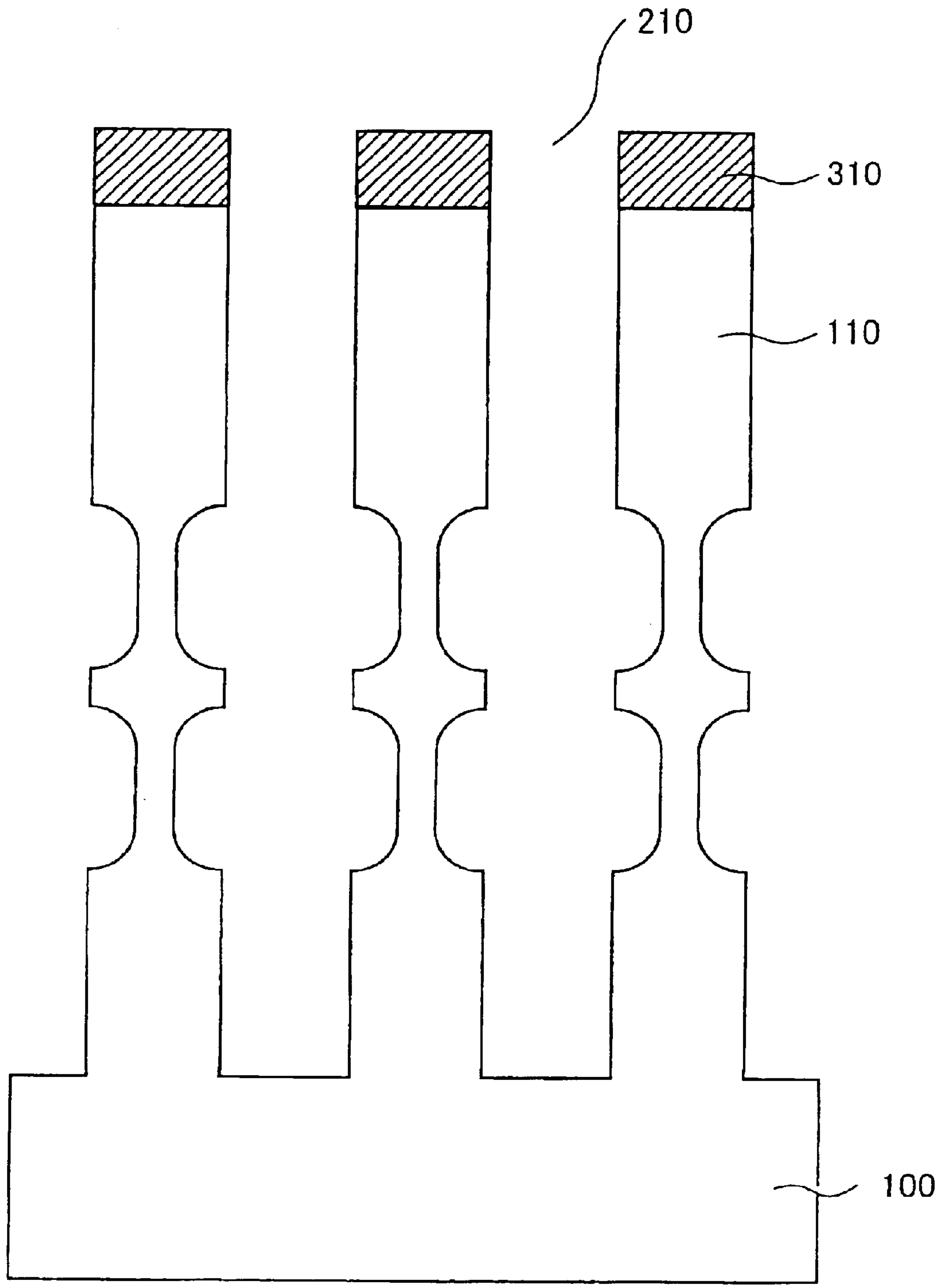
Figure 90:
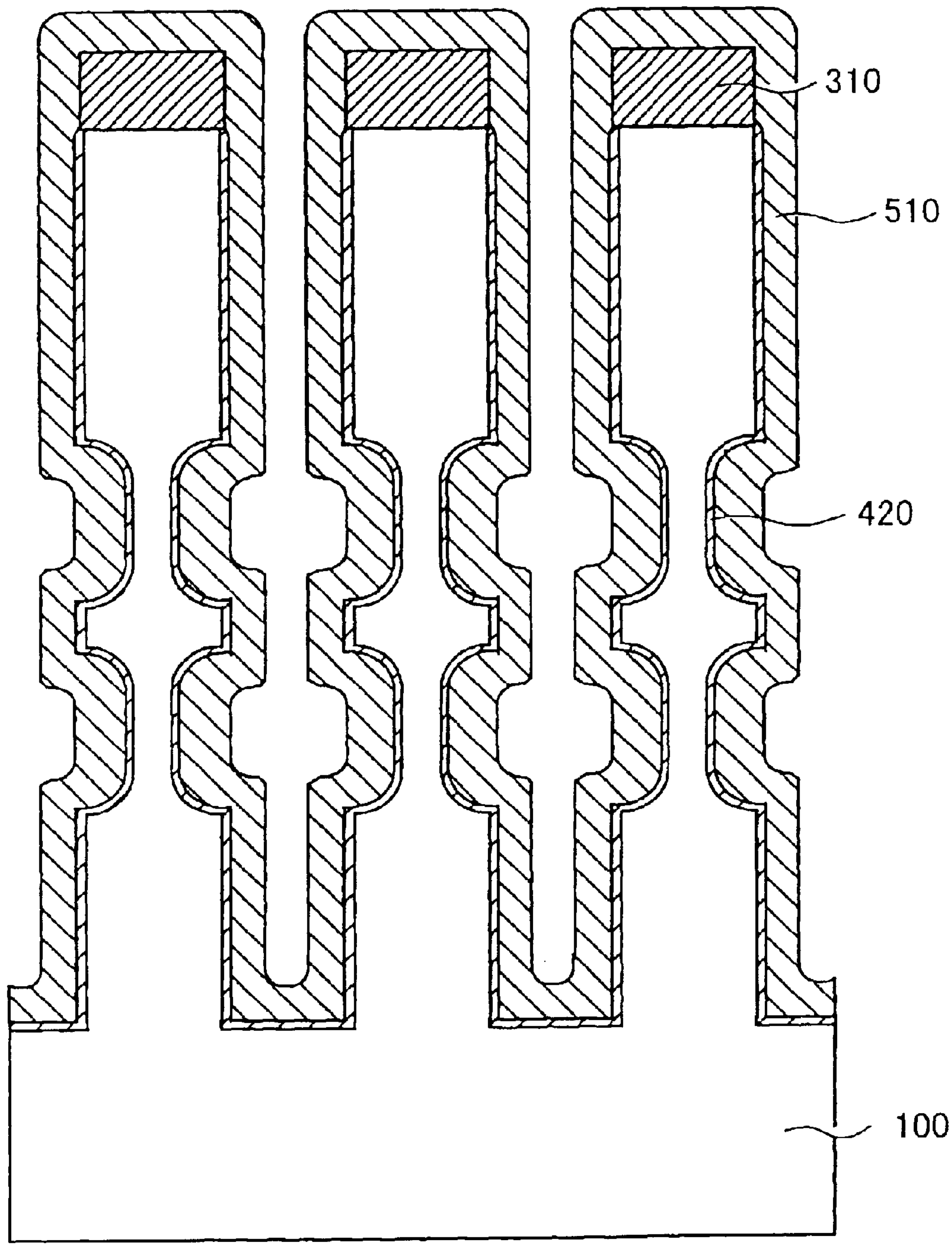
Figure 117:
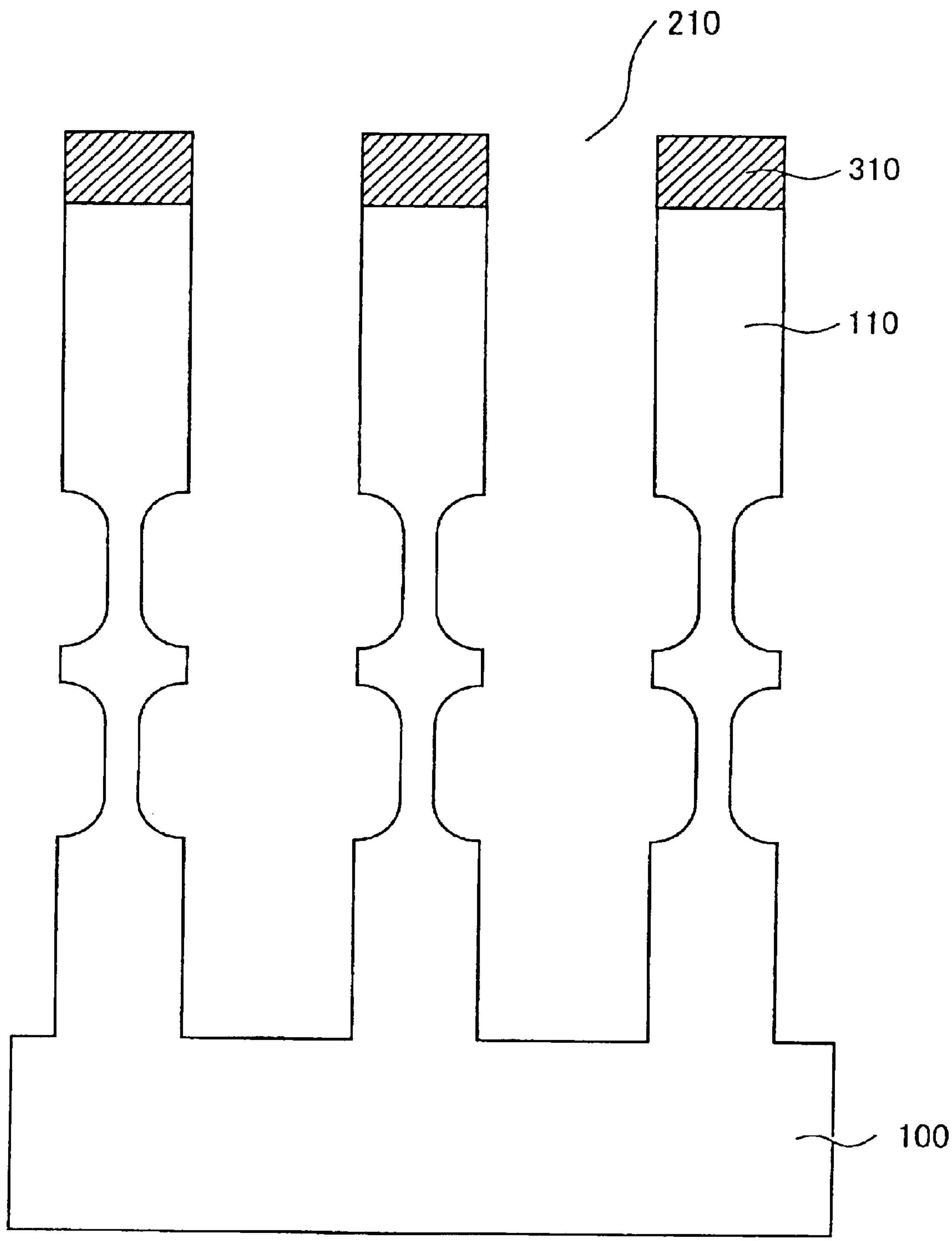
Figure 118:
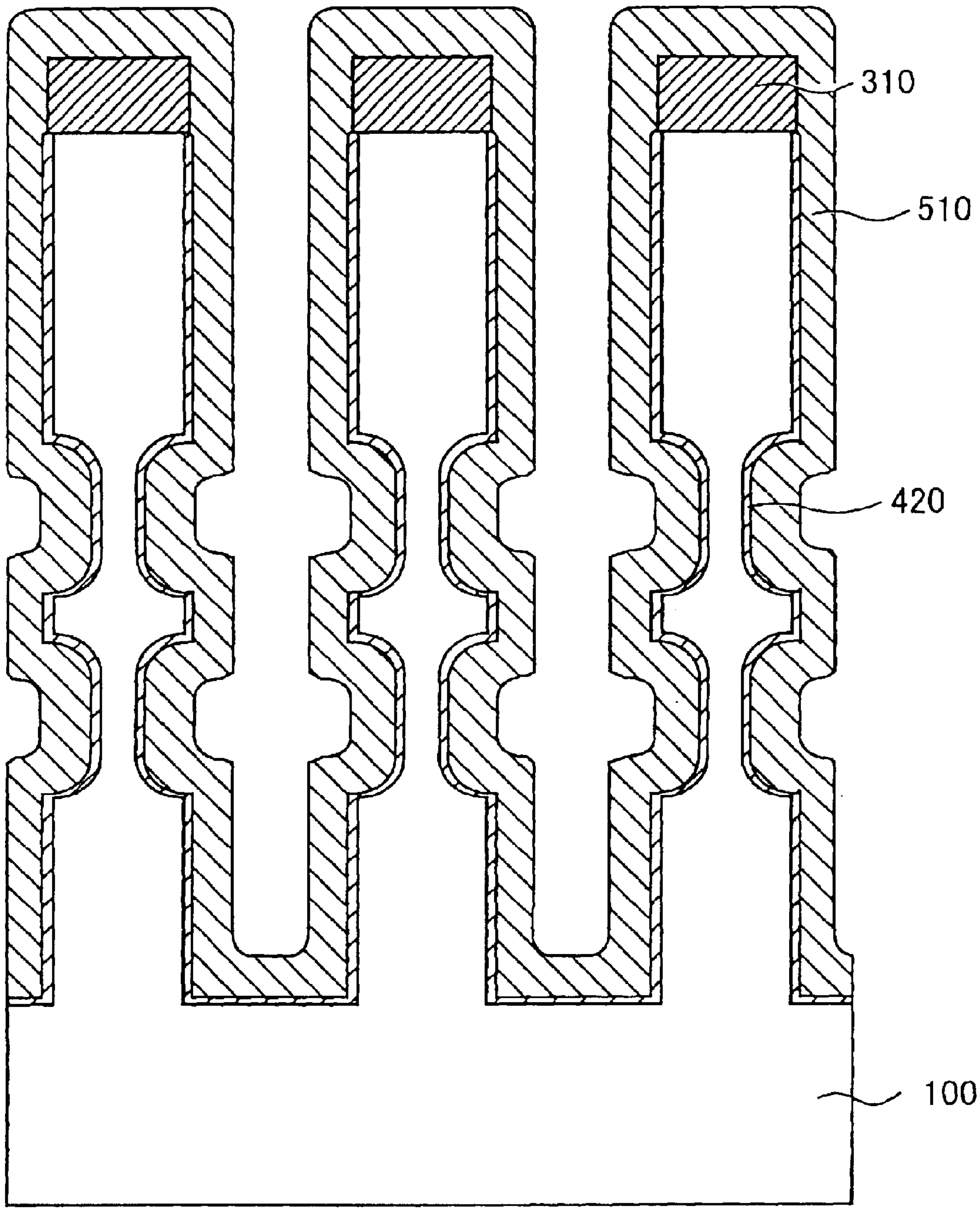

Then, isotropic etching of the silicon oxide film, the silicon nitride film and the silicon oxide film is carried out in this order, thereby removing the silicon oxide films 431 to 433, the silicon nitride films 321 to 323 and the silicon oxide film 450 (FIG. 89 and FIG. 117). To obtain the configuration of the island-like semiconductor layer 110 shown in FIG. 89, recesses having a depth of about 30 to 300 nm may be formed on the sidewall of the island-like semiconductor layer 110 by isotropic etching instead of forming the silicon oxide film 450 by thermal oxidation. Alternatively, the thermal oxidation and the isotropic etching may be carried out in combination. Any means may be used without limitation as long as a desired configuration is obtained.

For example, a silicon oxide film 420 is formed as a third insulating film to be a tunnel oxide film in a thickness of about 10 nm around each island-like semiconductor layer 110 by thermal oxidation.

Figure 91:
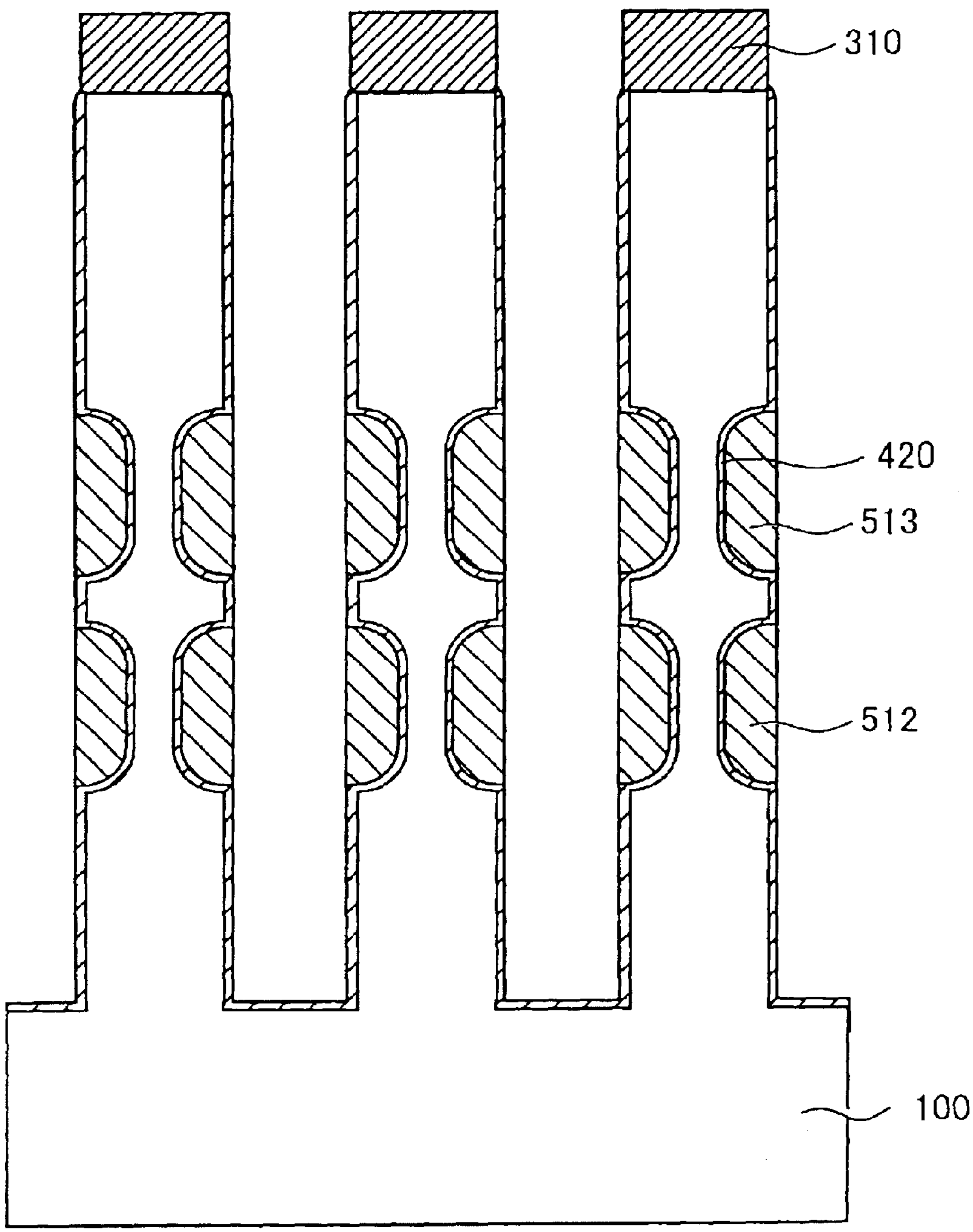
Figure 119:
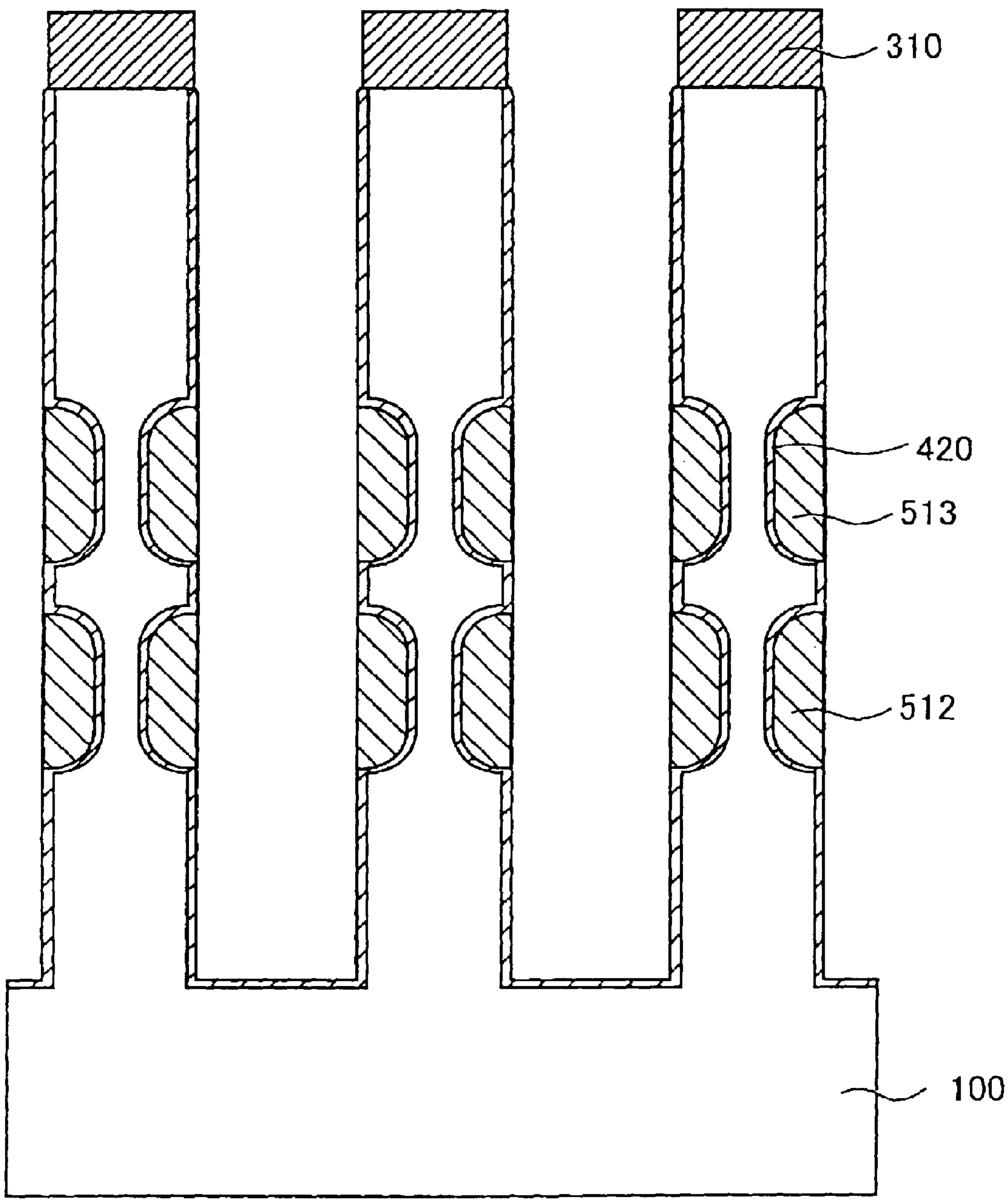

A first conductive film, for example, a polysilicon film 510, is deposited to a thickness of about 50 to 200 nm (FIG. 90 and 118) and anisotropically etched such that the polysilicon film 510 is buried in the recesses formed on the sidewall of the island-like semiconductor layer 110 with the intervention of the silicon oxide film 420, thereby separating the polysilicon film 510 into polysilicon films 512 and 513 (FIG. 91 and FIG. 119). Instead of anisotropic etching, the separation into the polysilicon films 512 and 513 may be carried out by isotropic etch back until reaching to the recesses and then by anisotropic etching after reaching to the recesses, or totally performed by isotropic etching only.

Figure 92:
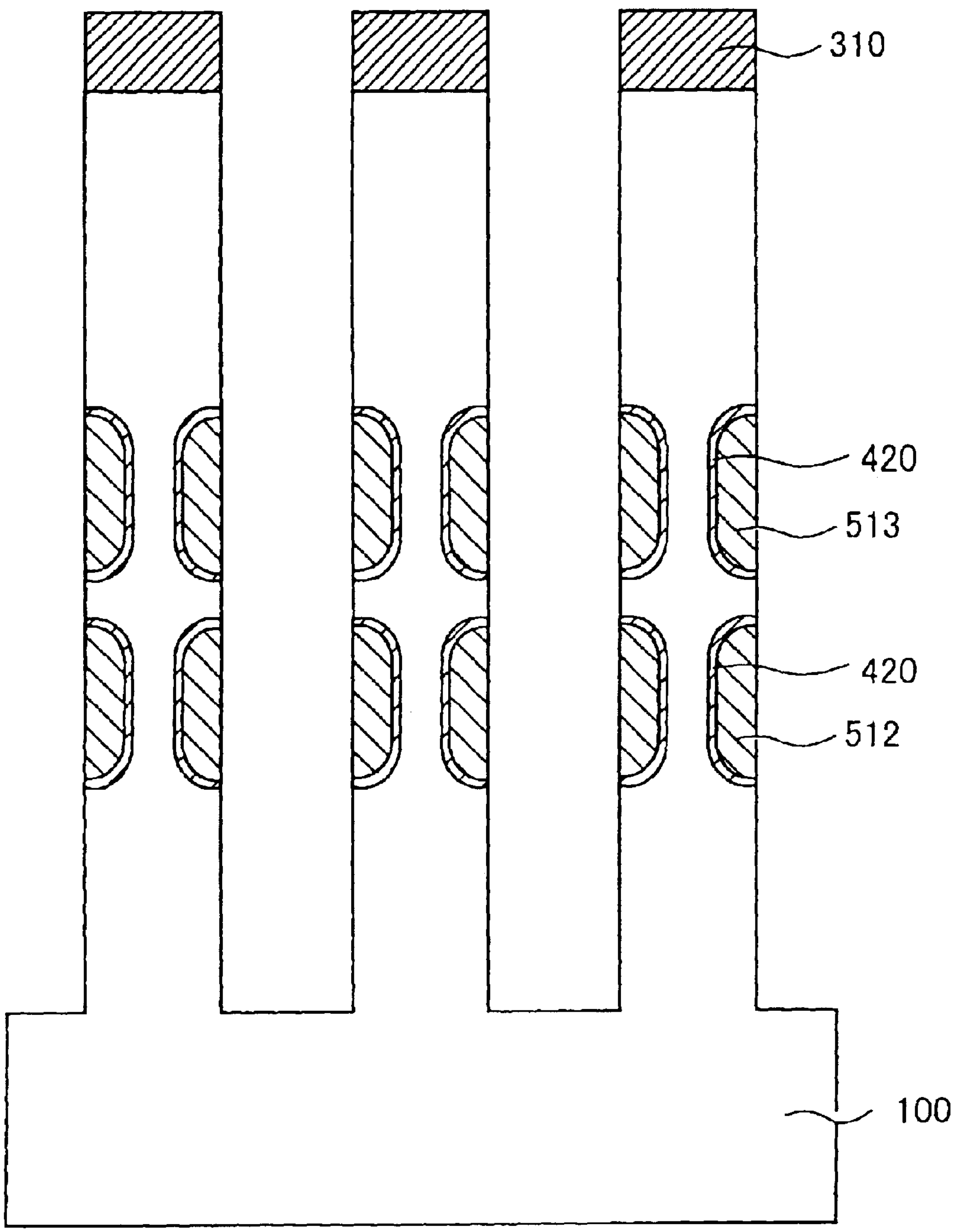
Figure 93:
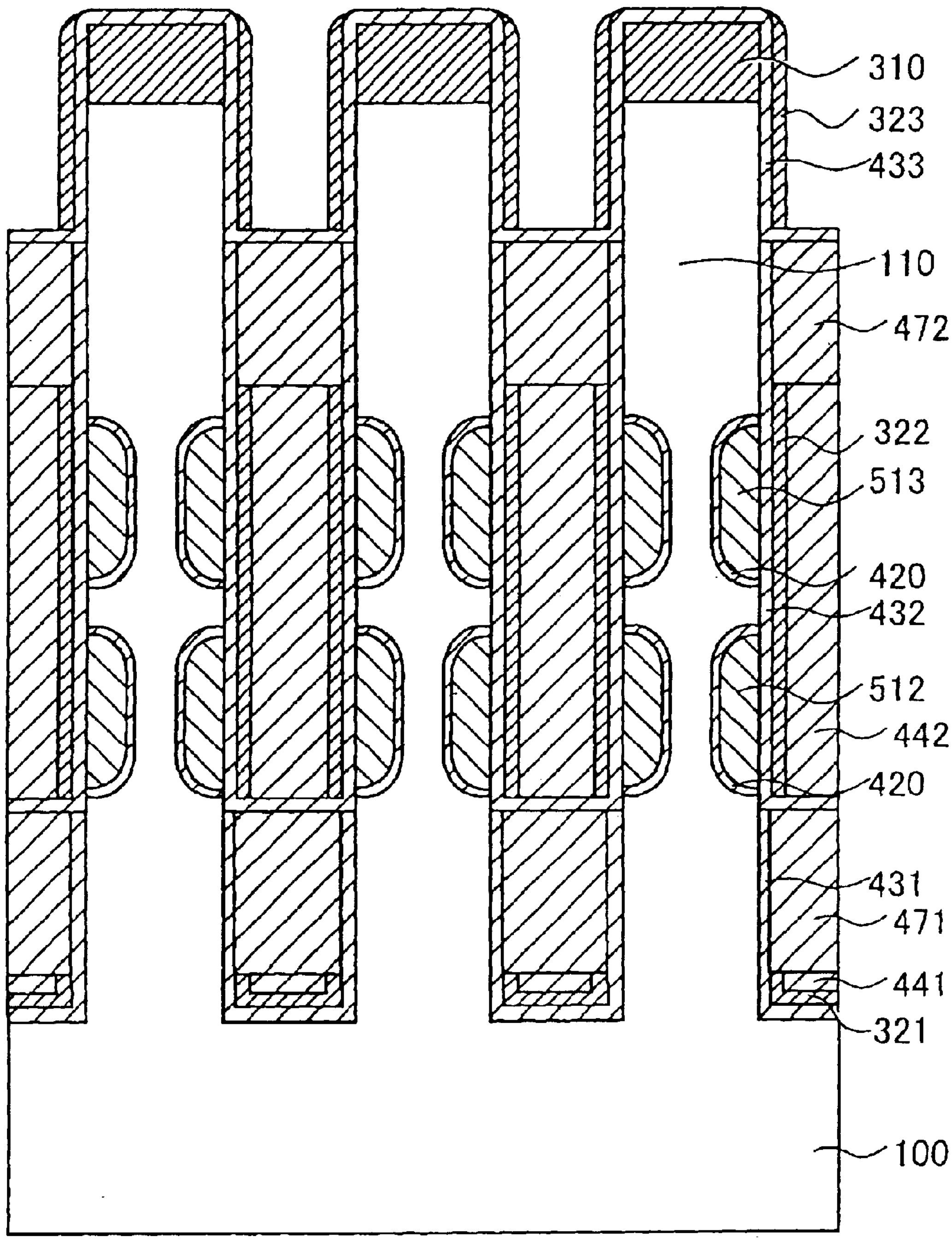
Figure 94:
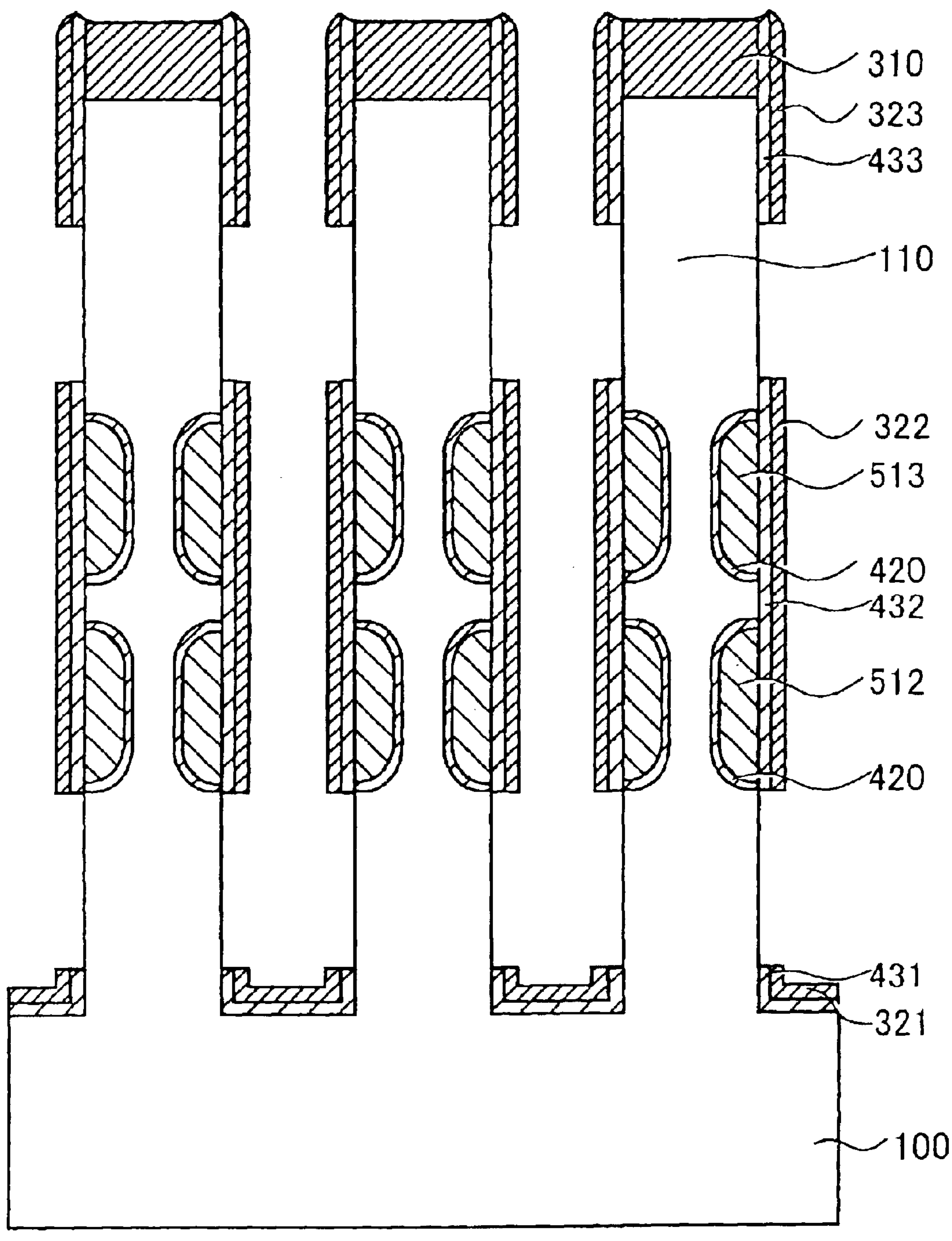
Figure 95:
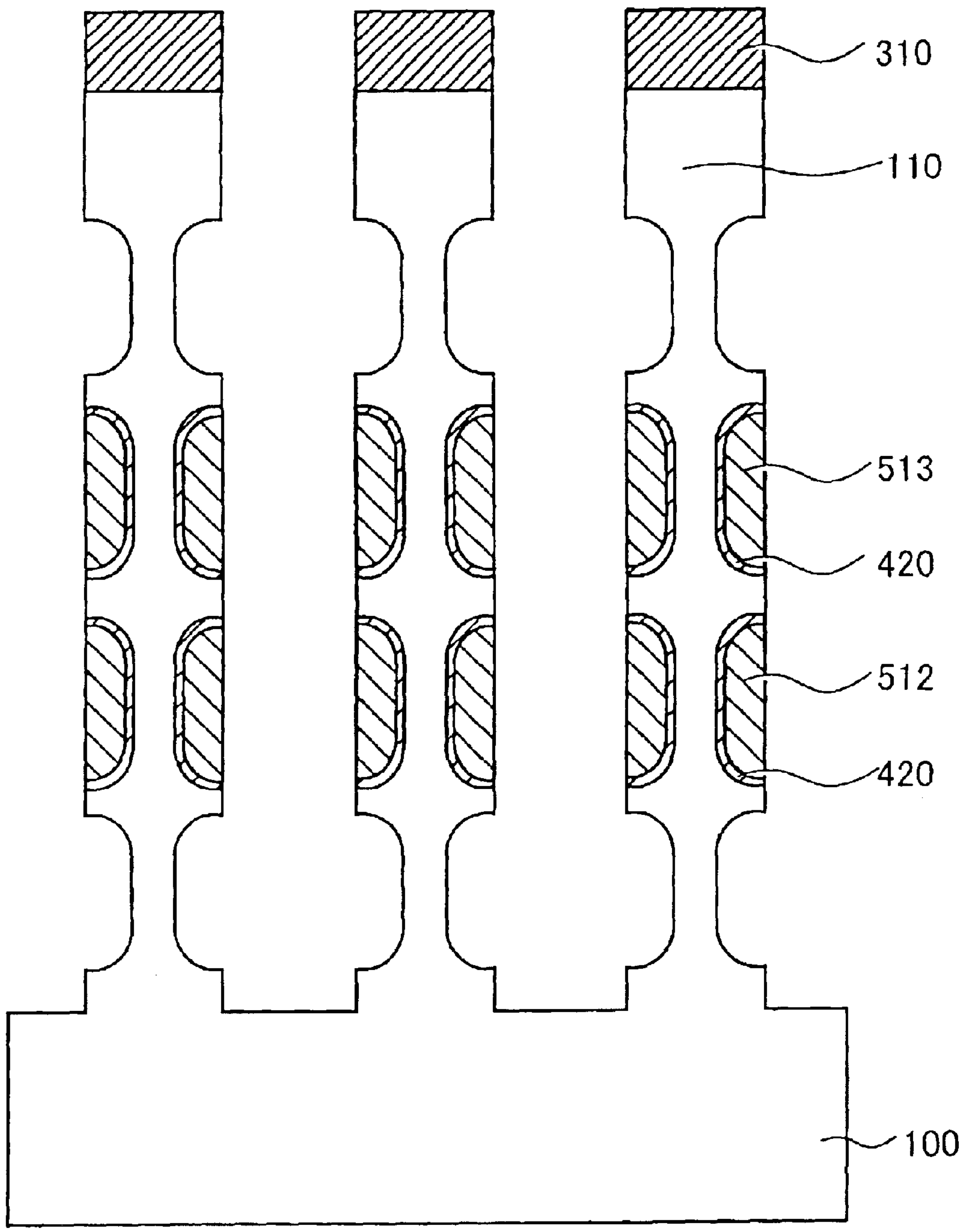
Figure 120:
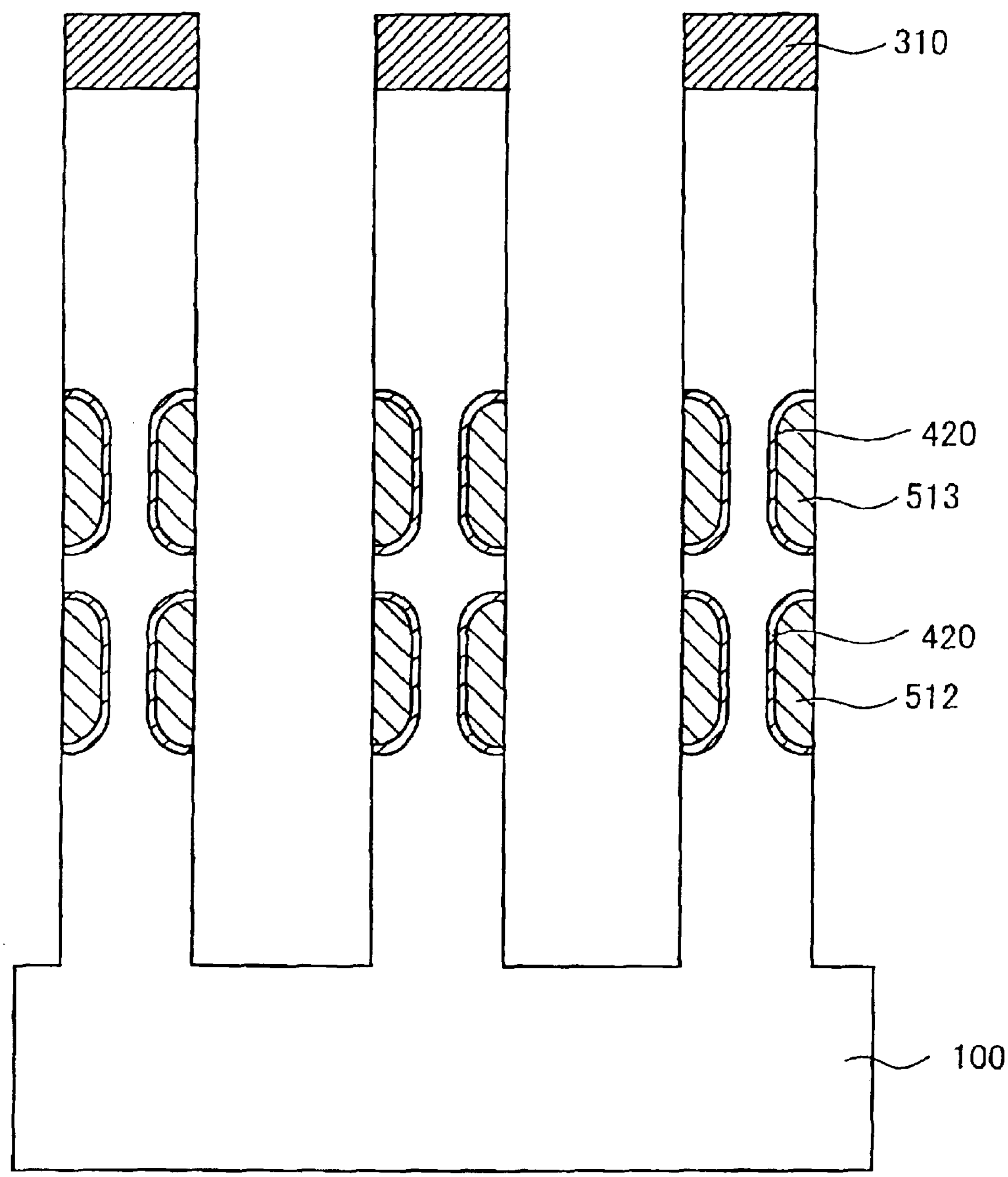
Figure 121:
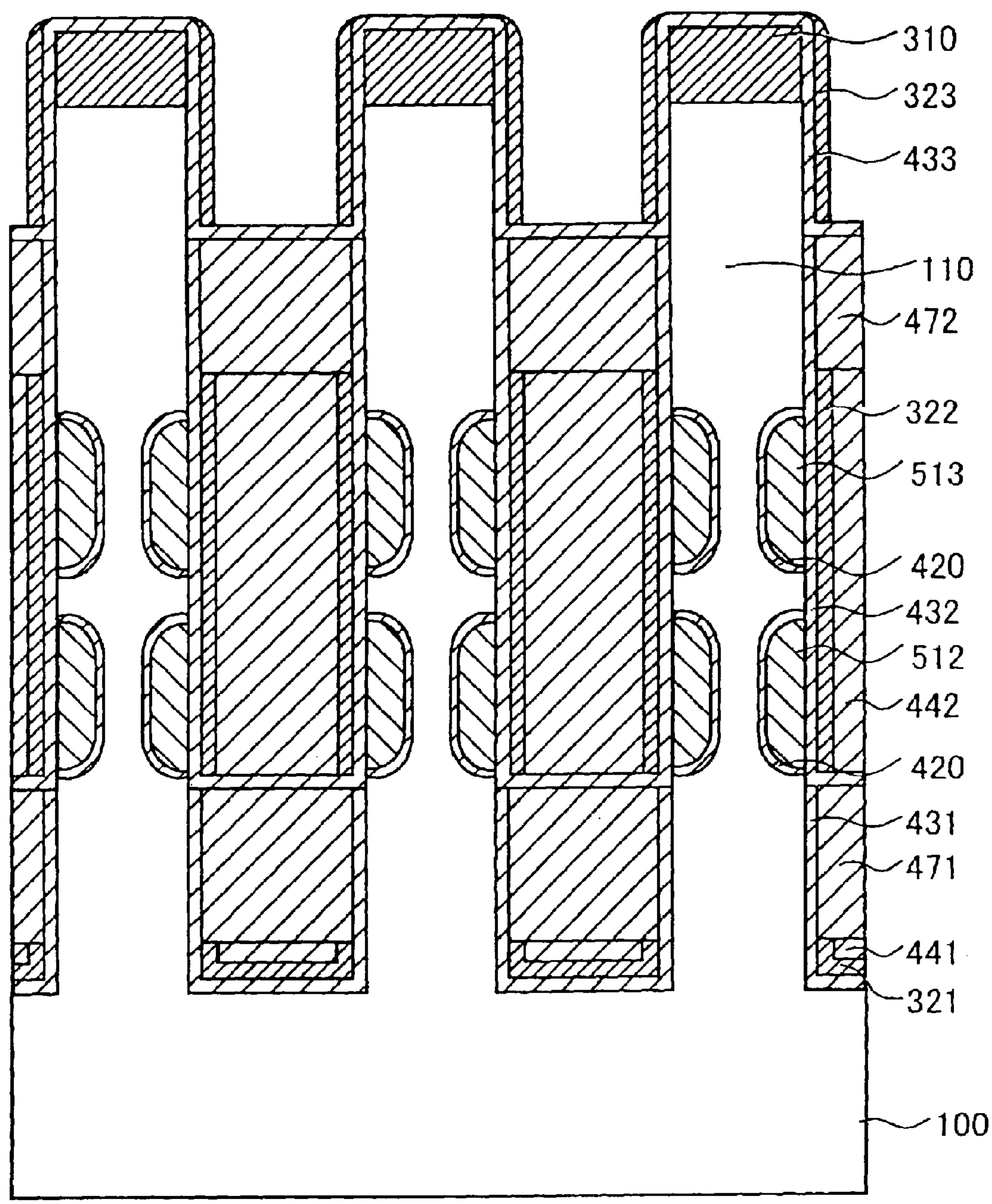
Figure 122:
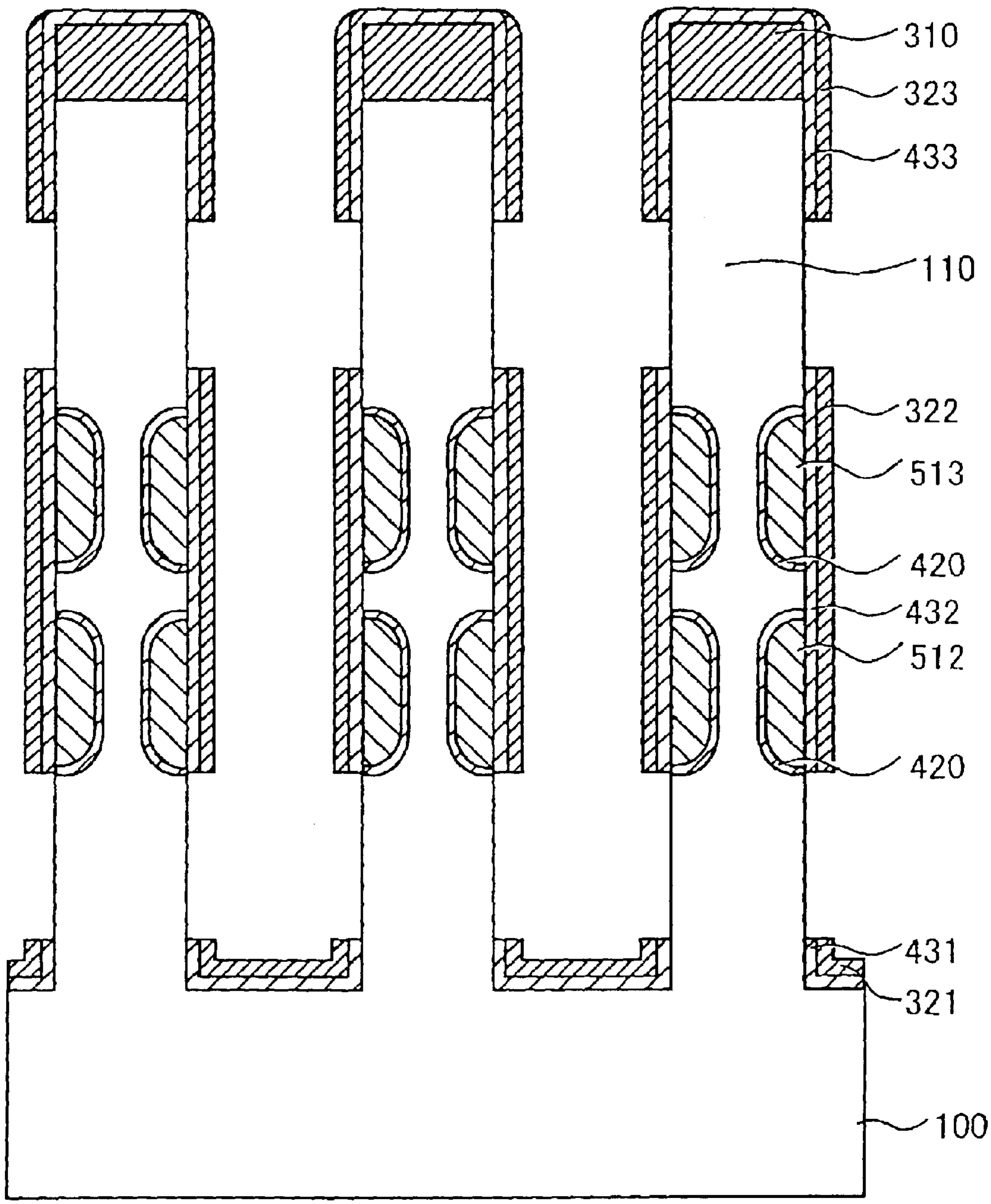
Figure 123:
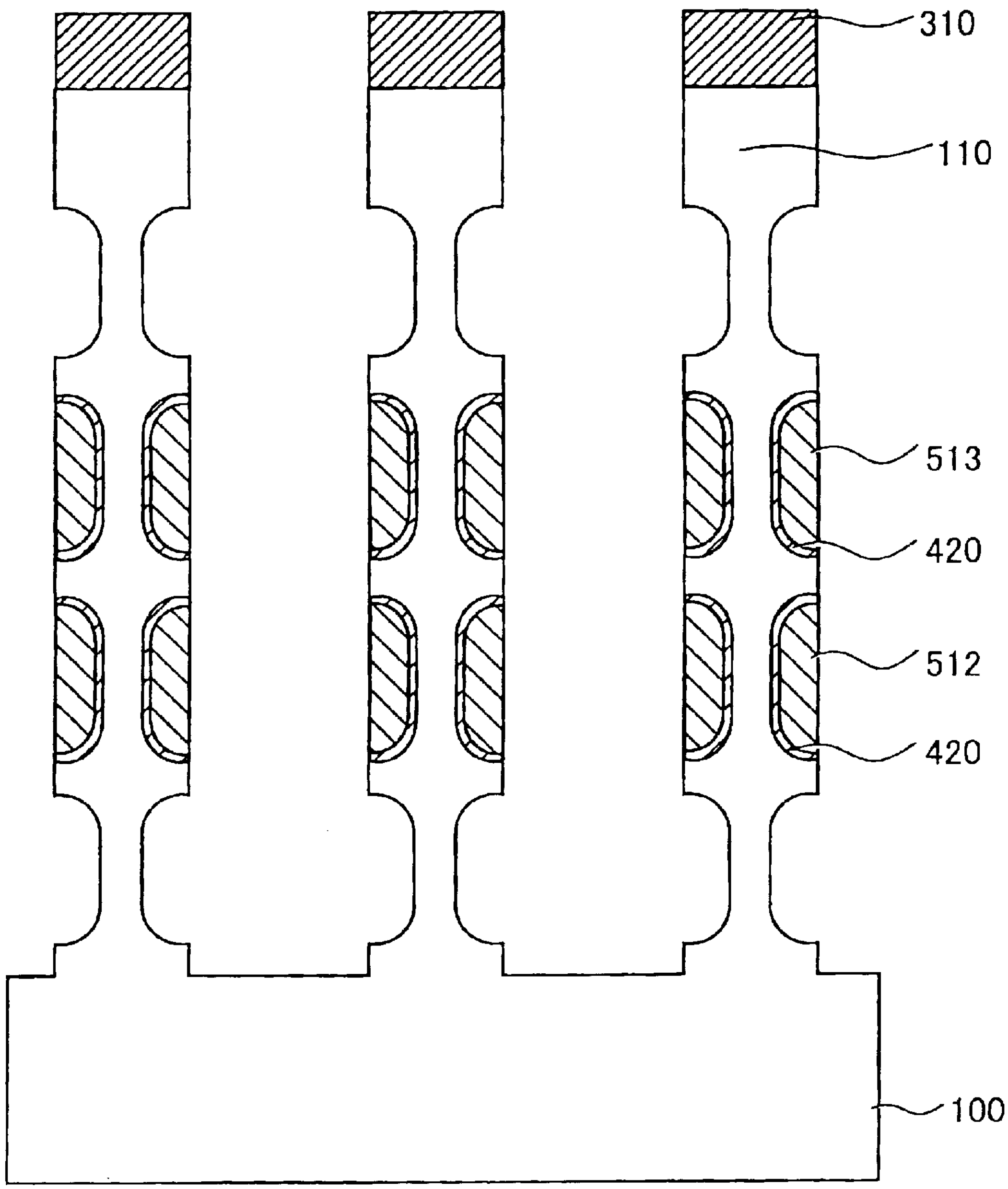

As required, the silicon oxide film 420 formed on the sidewall and the bottom of the island-like semiconductor layer 110 is removed (FIG. 92 and FIG. 120). Then, silicon nitride films 321 to 323 are formed by the aforesaid technique, for example, with the intervention of silicon oxide films 431 to 433 to mask a region where the selection gate transistors are not formed (FIGS. 93 and 121, FIGS. 94 and 122). Then, the recesses are formed on the sidewall of the island-like semiconductor layer 110 (FIG. 95 and FIG. 123).

Then, a silicon oxide film 480 is formed as a thirteenth insulating film to be a gate oxide film to a thickness of about 10 nm on the side portion of the island-like semiconductor layer 110 by thermal oxidation. The gate oxide film, however, may be formed of not only a thermally oxidized film but also a CVD oxide film or a nitrogen oxide film. A relation between the thickness of the gate oxide film and that of the tunnel oxide film is not limited, but it is desired that the thickness of the gate oxide film is larger than that of the tunnel oxide film.

Figure 96:
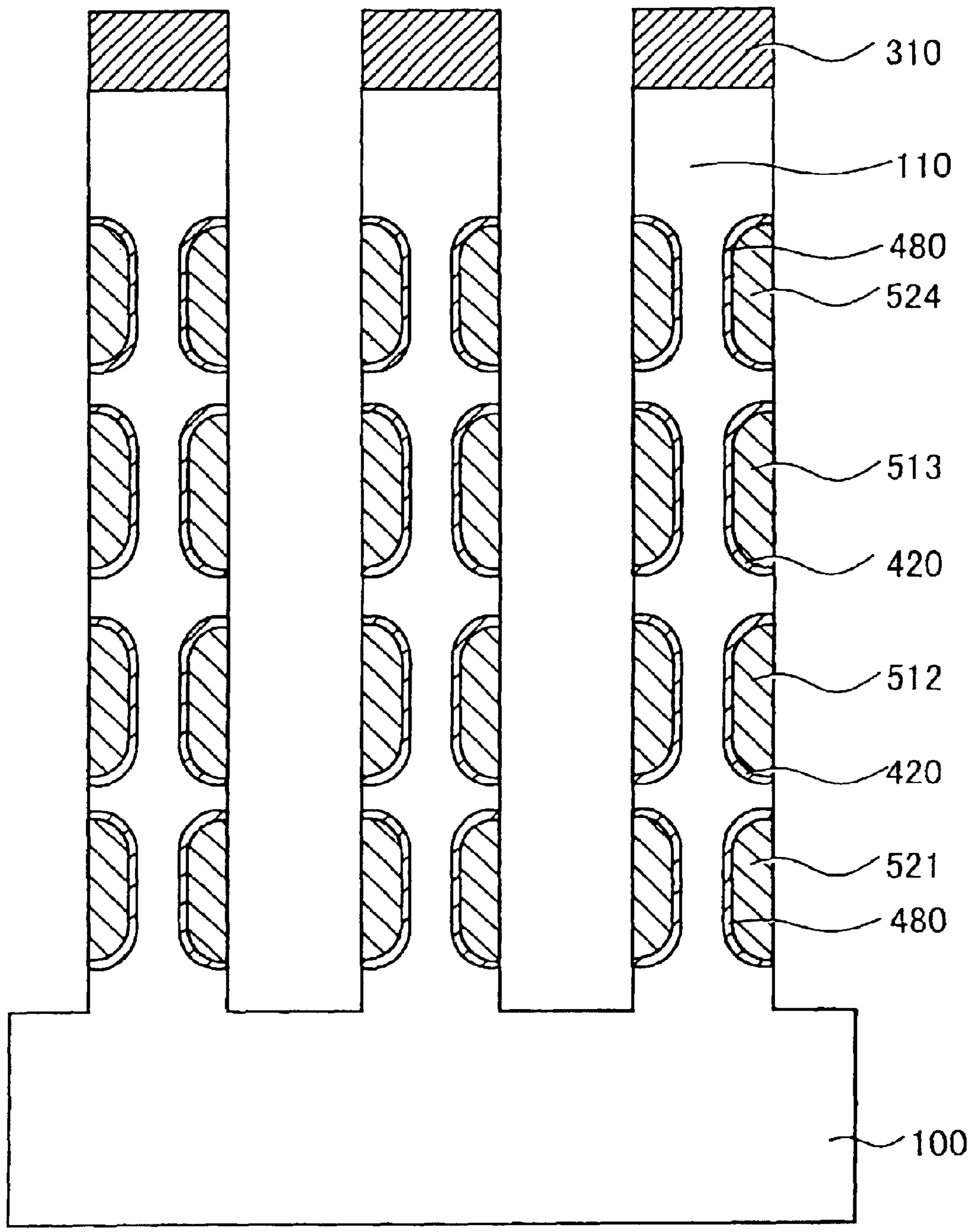
Figure 124:
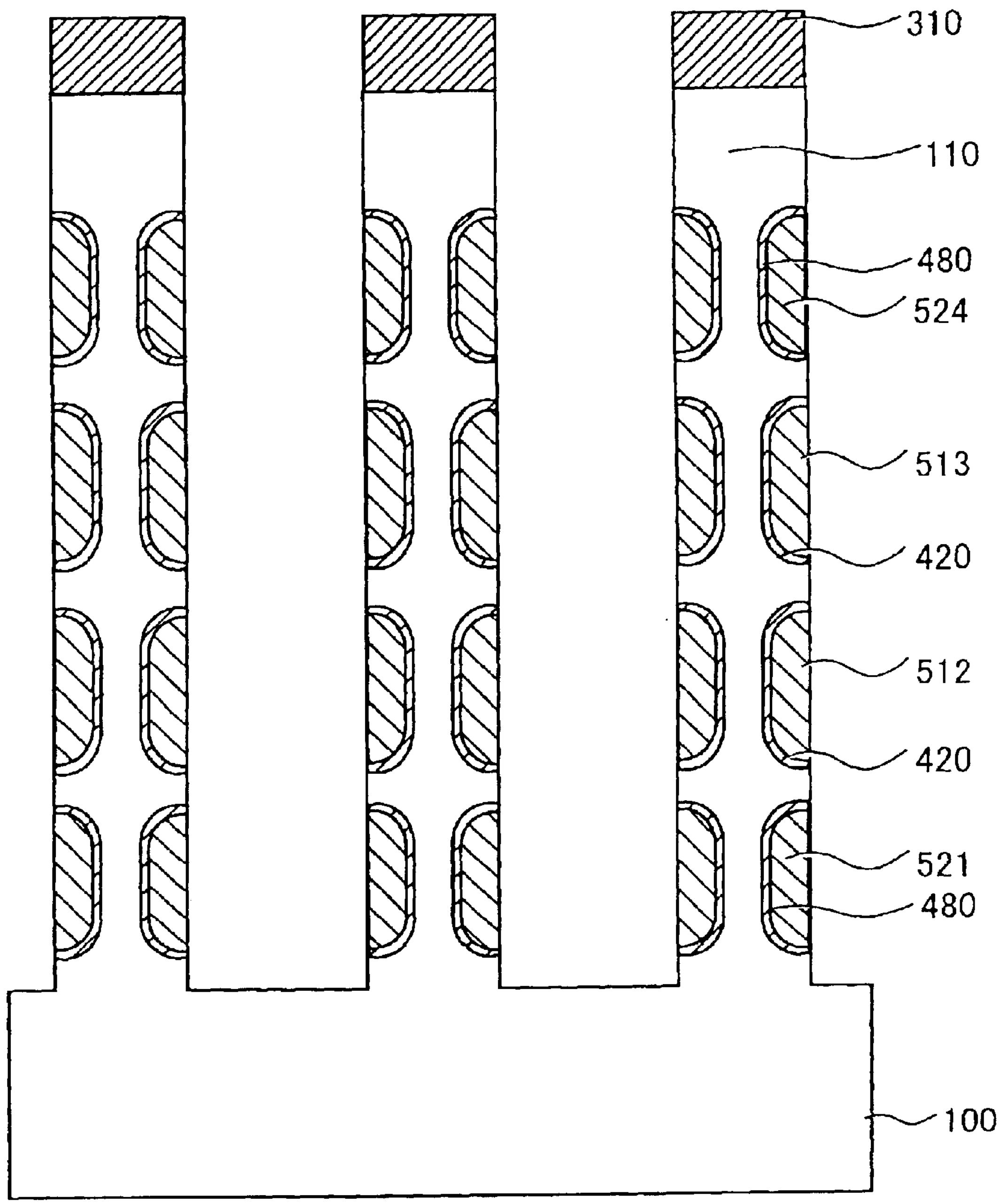

As a second conductive film, a polysilicon film is deposited to a thickness of 15 to 150 nm and etched back in self-alignment with the sidewall of the island-like semiconductor layer 110 such that the polysilicon film is buried in the recesses formed on the sidewall of the island-like semiconductor layer 110 with the intervention of the silicon oxide film 480, thereby dividing the polysilicon film into polysilicon films 521 and 524 (FIG. 96 and FIG. 124).

Figure 97:
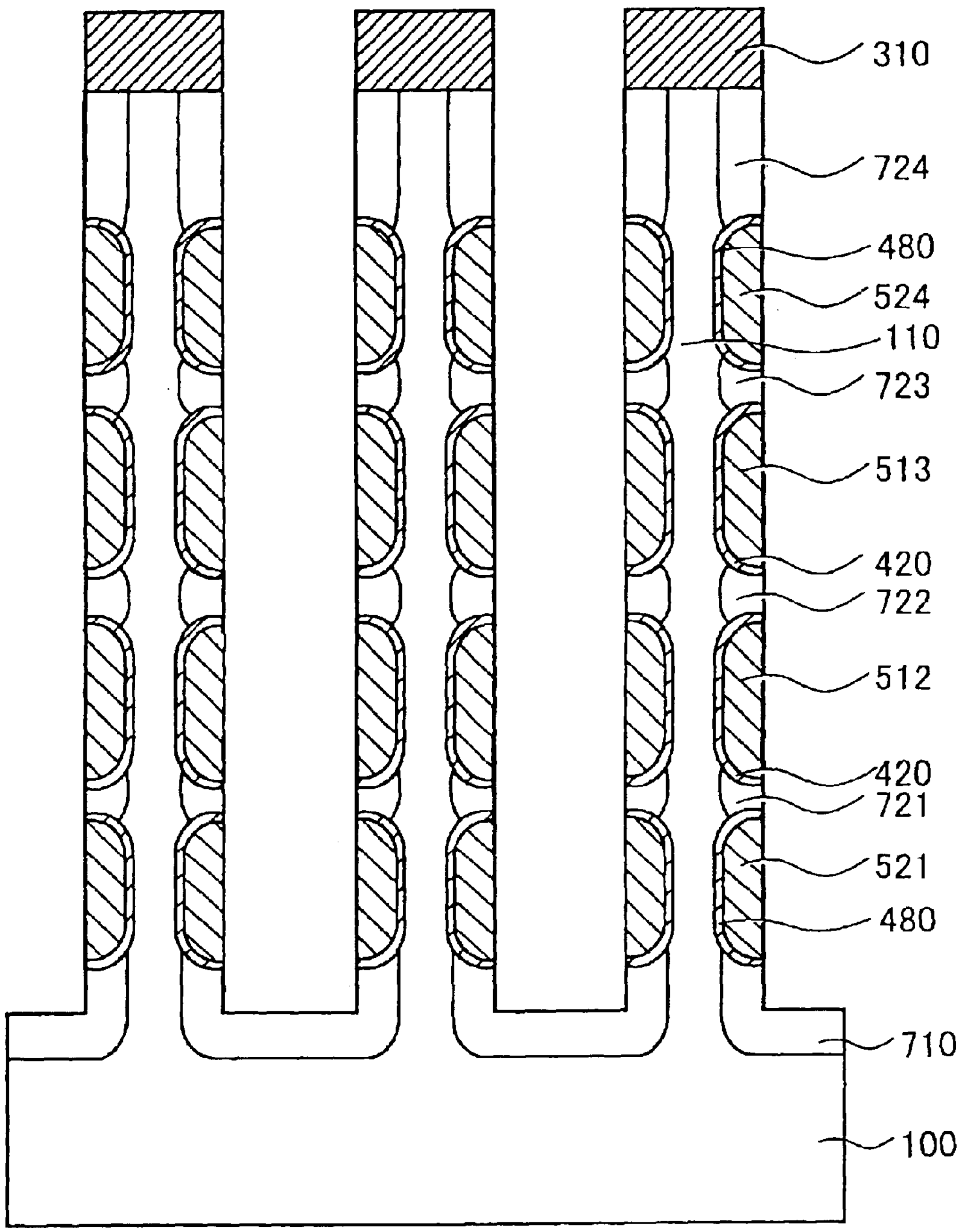
Figure 125:
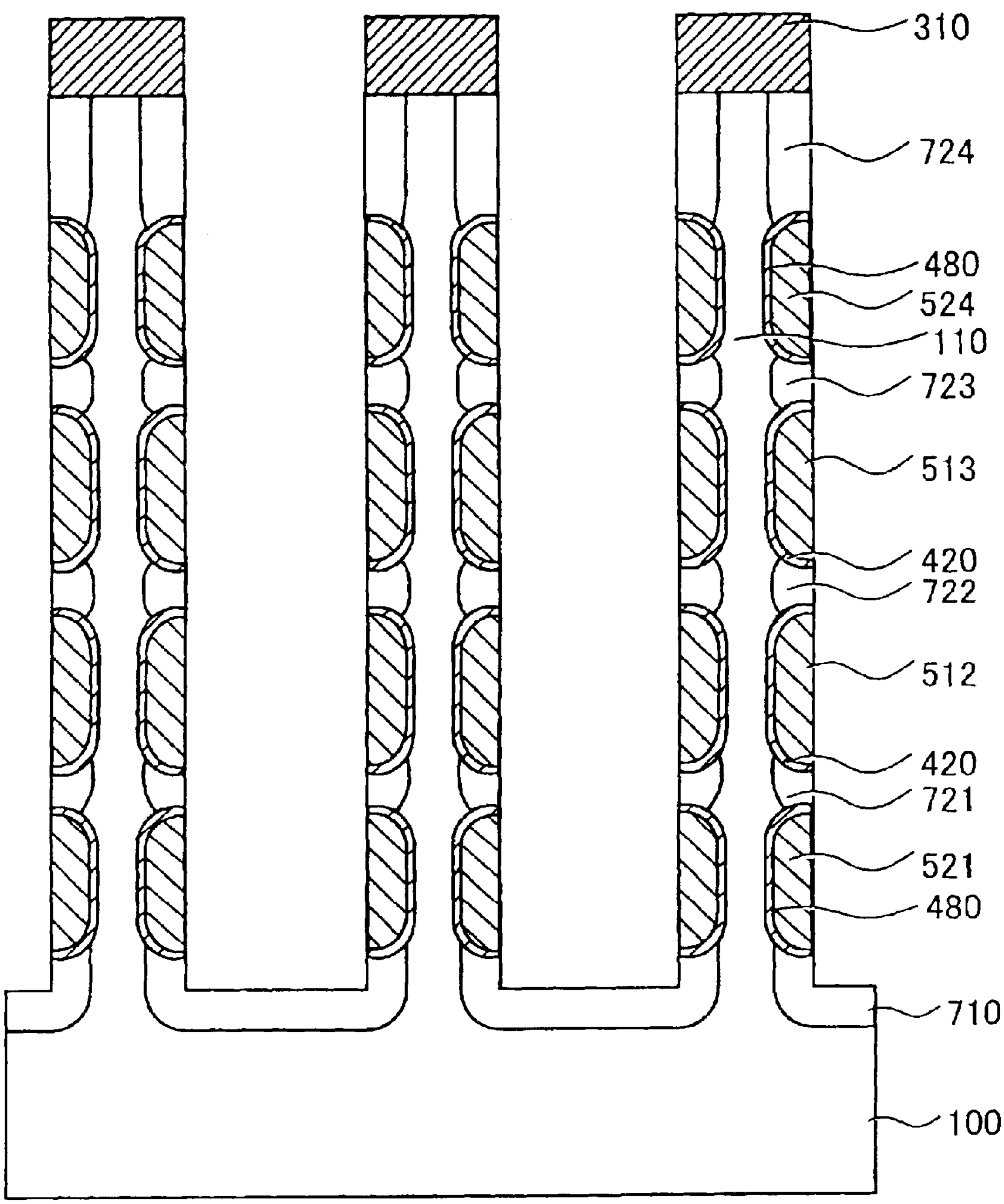

Thereafter, impurity implantation is carried out with respect to the island-like semiconductor layer 110 and the semiconductor substrate 100 to form N-type impurity diffusion layers 710 to 724 in self-alignment with the control gates and the selection gates (FIG. 97 and FIG. 125). For example, the ion implantation may be performed at an implantation energy of 5 to 100 keV at a phosphorus dose of about $1\times10^{13}$ to $1\times10^{15}/cm^2$ in a direction inclined by about 0 to 7°. The ion implantation for formation of the N-type impurity diffusion layers 710 to 724 may be performed to the whole periphery of the island-like semiconductor layer 110, from one direction or various directions to the island-like semiconductor layers. That is, the N-type impurity diffusion layers 710 to 724 may not be formed to entirely encircle the island-like semiconductor layer. The timing of forming the impurity diffusion layer 710 is not necessarily the same as the timing of forming the N-type semiconductor layers 721 to 724.

An eighth insulating film, for example, a silicon oxide film 461, is deposited to a thickness of 50 to 500 nm and etched back to a desired height to be buried. Then, a polysilicon film 521 is deposited to a thickness of 15 to 150 nm as a second conductive film and patterned into the form of a sidewall spacer by anisotropic etching to form a selection gate. At this time, by setting the intervals between the island-like semiconductor layers 110 in a direction of A–A' in FIG. 1 to a predetermined value or smaller, the polysilicon film 521 is formed into a second wiring layer to be a selection gate line continuous in the direction without need to use a masking process.

Figure 98:
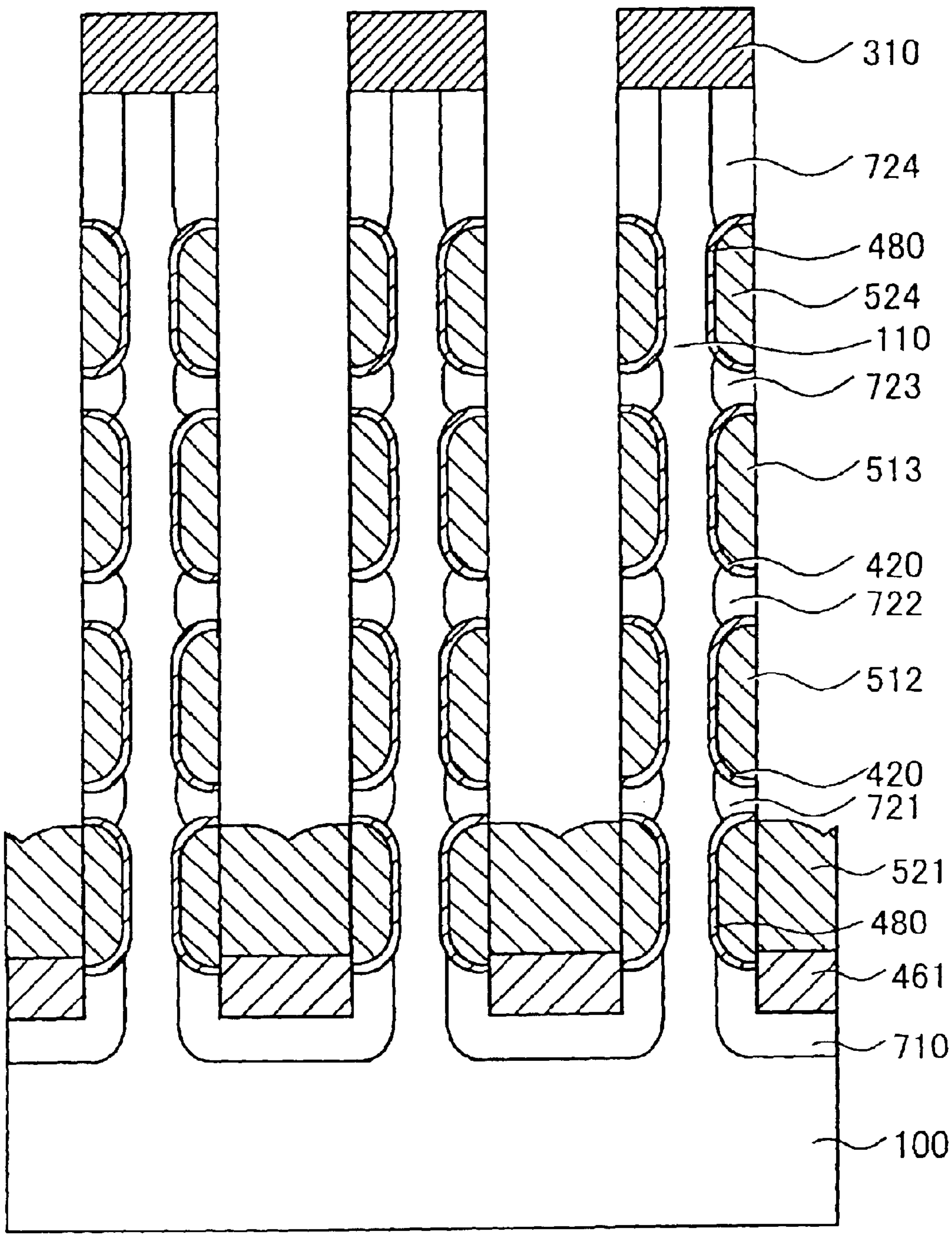
Figure 126:
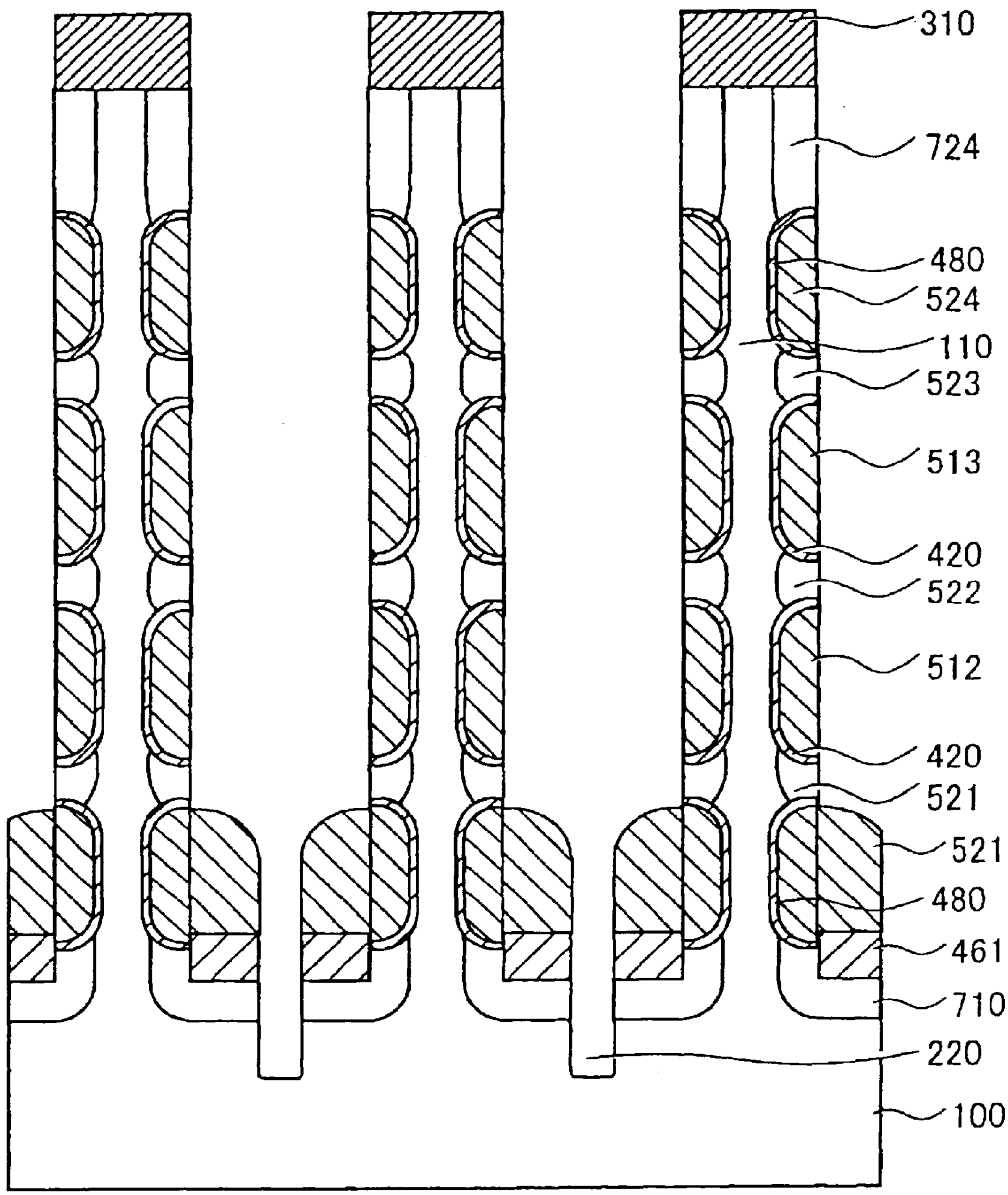

Thereafter, as shown in FIG. 126, a second trench 220 is formed in the P-type silicon substrate 100 in self-alignment with the polysilicon film 521, thereby dividing the impurity diffusion layer 710 (FIG. 98 and FIG. 126). That is, a separation portion of the first wiring layer is formed in self-alignment with a separation portion of the second conductive film.

A silicon oxide film 462 is deposited to a thickness of 50 to 500 nm as eighth insulating film and anisotropically and isotropically etched so that the silicon oxide film 462 is embedded to bury the side and top of the polysilicon film 521.

Figure 99:
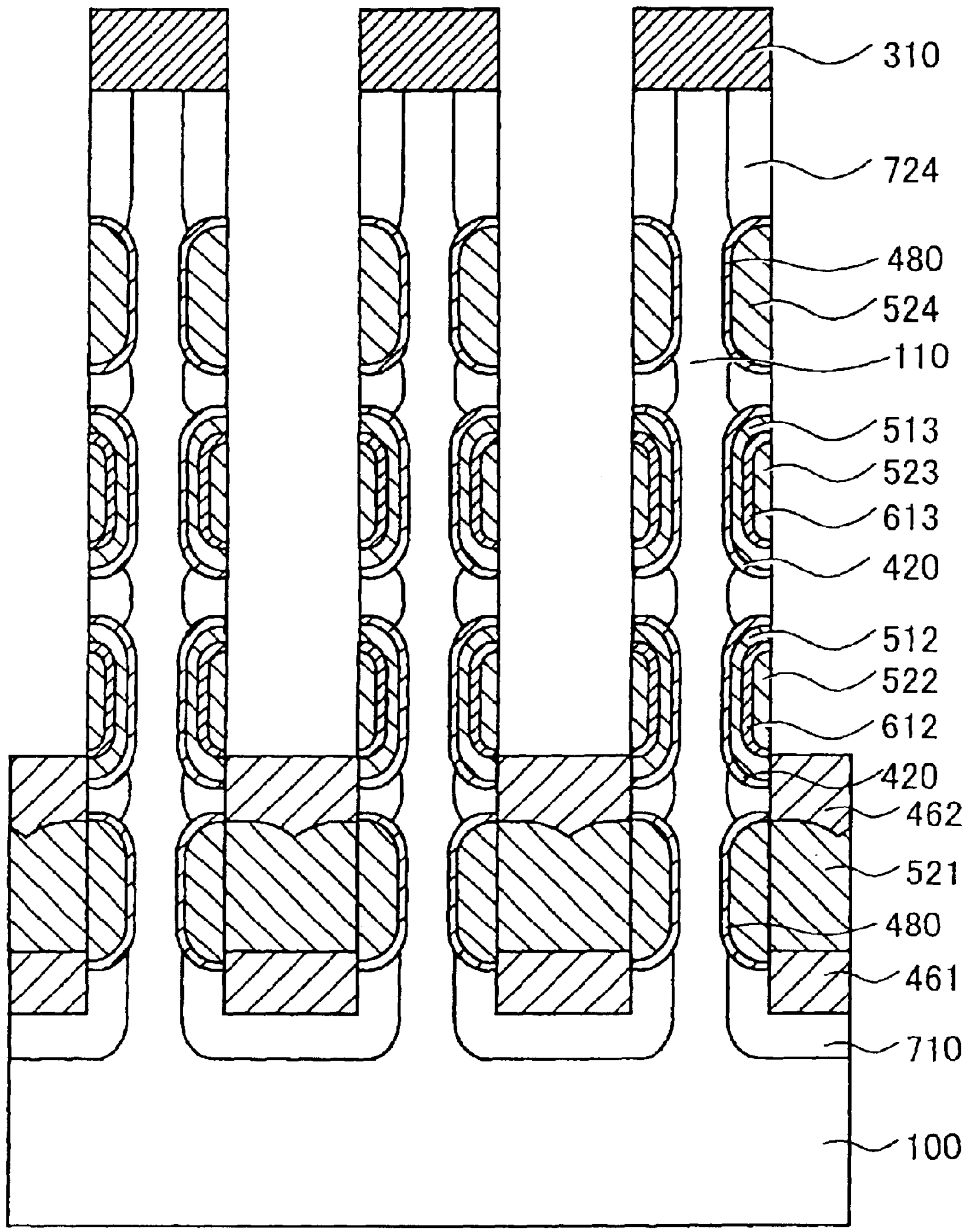
Figure 127:
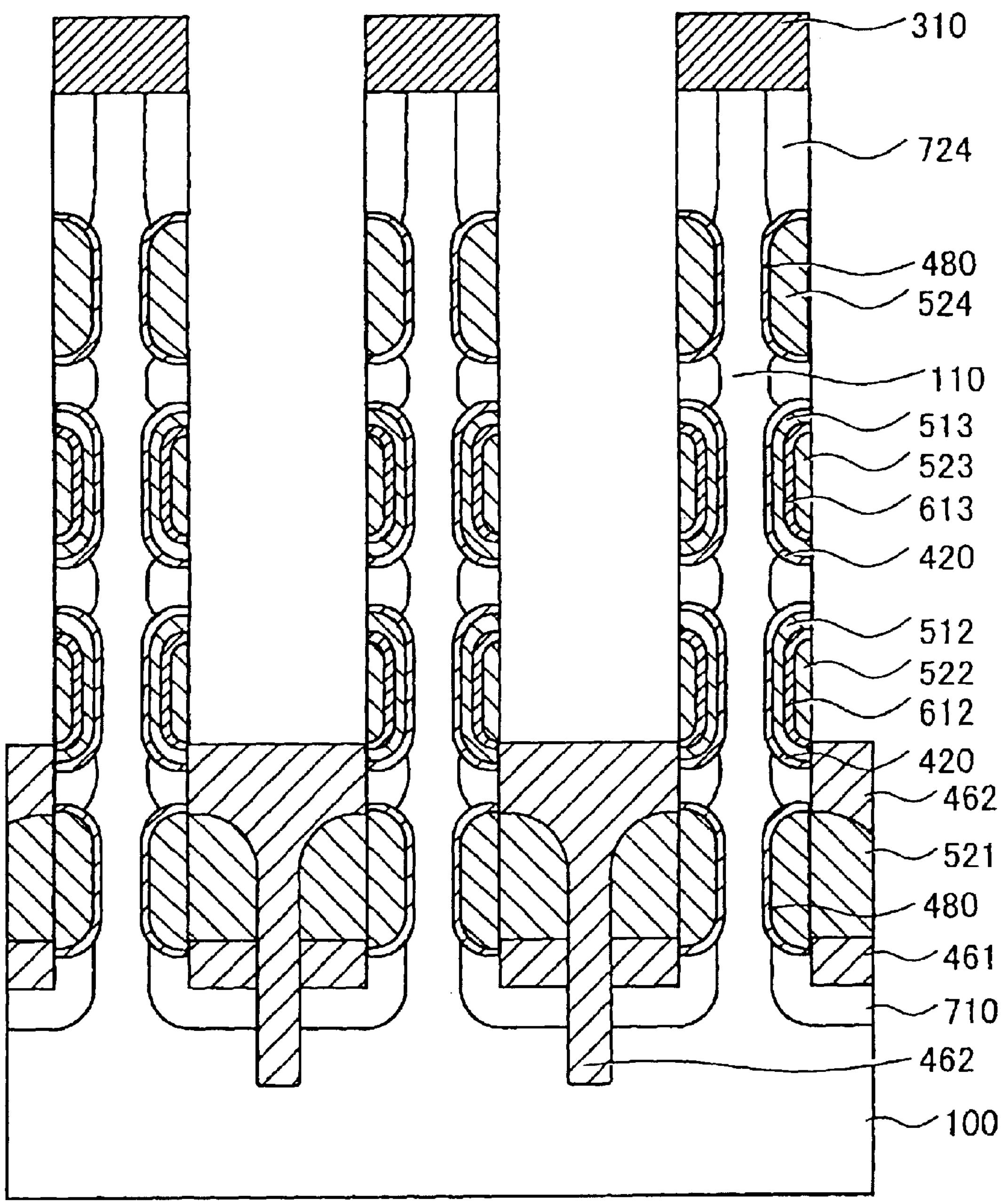

Then, on the sidewalls of the polysilicon films 512 and 513 which are buried in the island-like semiconductor layer 110, recesses are formed, for example, by the above-described technique. In the recesses, polysilicon films 522 and 523 are formed as second conductive films with the intervention of interlayer insulating films 612 and 613 (FIG. 99 and FIG. 127). This interlayer insulating film 612 and 613 may be formed of an ONO film, for example. More particularly, a silicon oxide film of 5 to 10 nm thickness is formed on the surface of the polysilicon film by thermal oxidization, and then, a silicon nitride film of 5 to 10 nm thickness and a silicon oxide film of 5 to 10 nm thickness are formed sequentially by CVD.

Further, a polysilicon film 522 is deposited to a thickness of 15 to 150 nm as a second conductive film and etched back. At this time, by setting the intervals between the island-like semiconductor layers 2110 in a direction of A–A' in FIG. 1 to a predetermined value or smaller, the polysilicon film 2521 is formed into a third wiring layer to be a selection gate line continuous in the direction without need to use a masking process.

Figure 100:
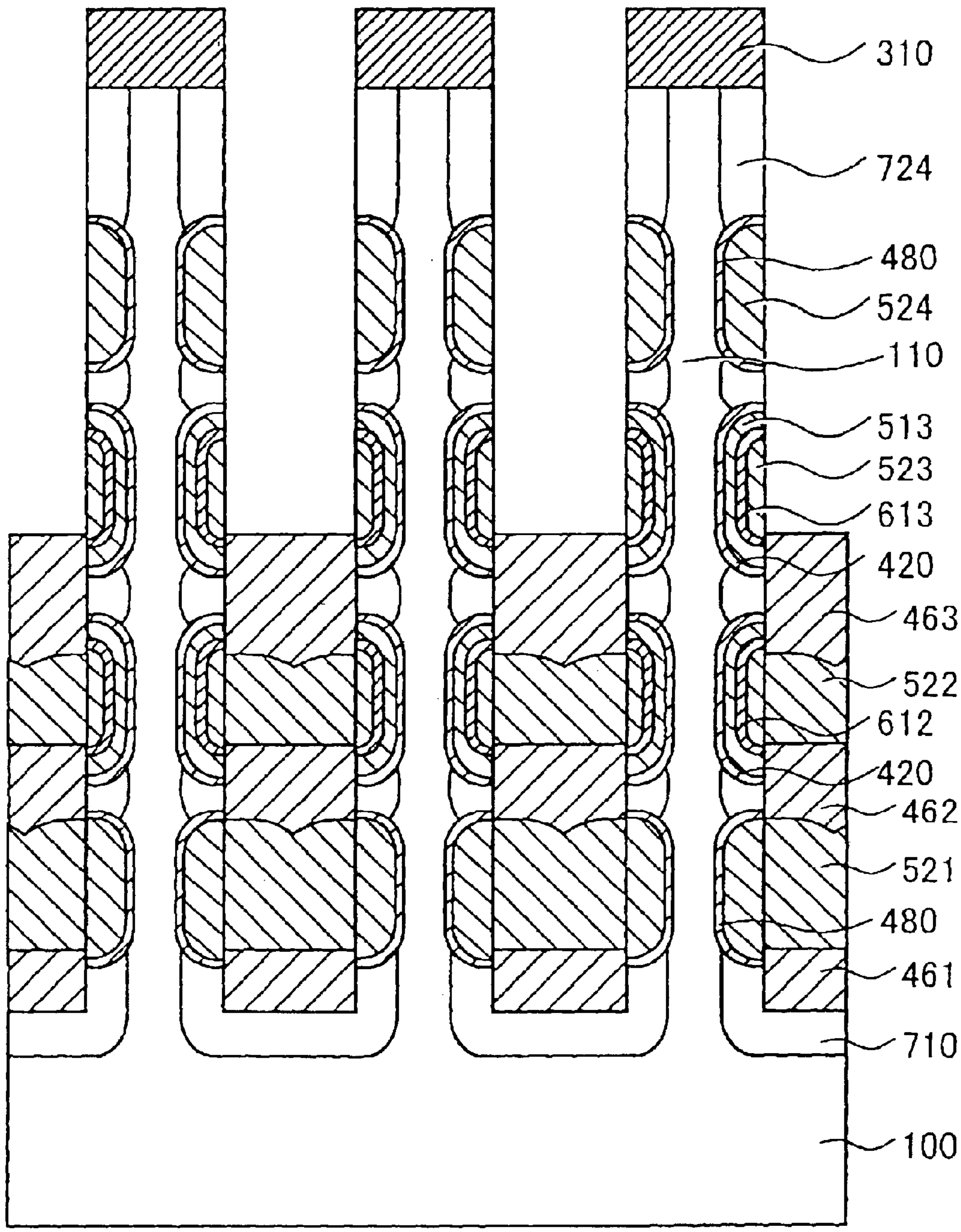
Figure 128:
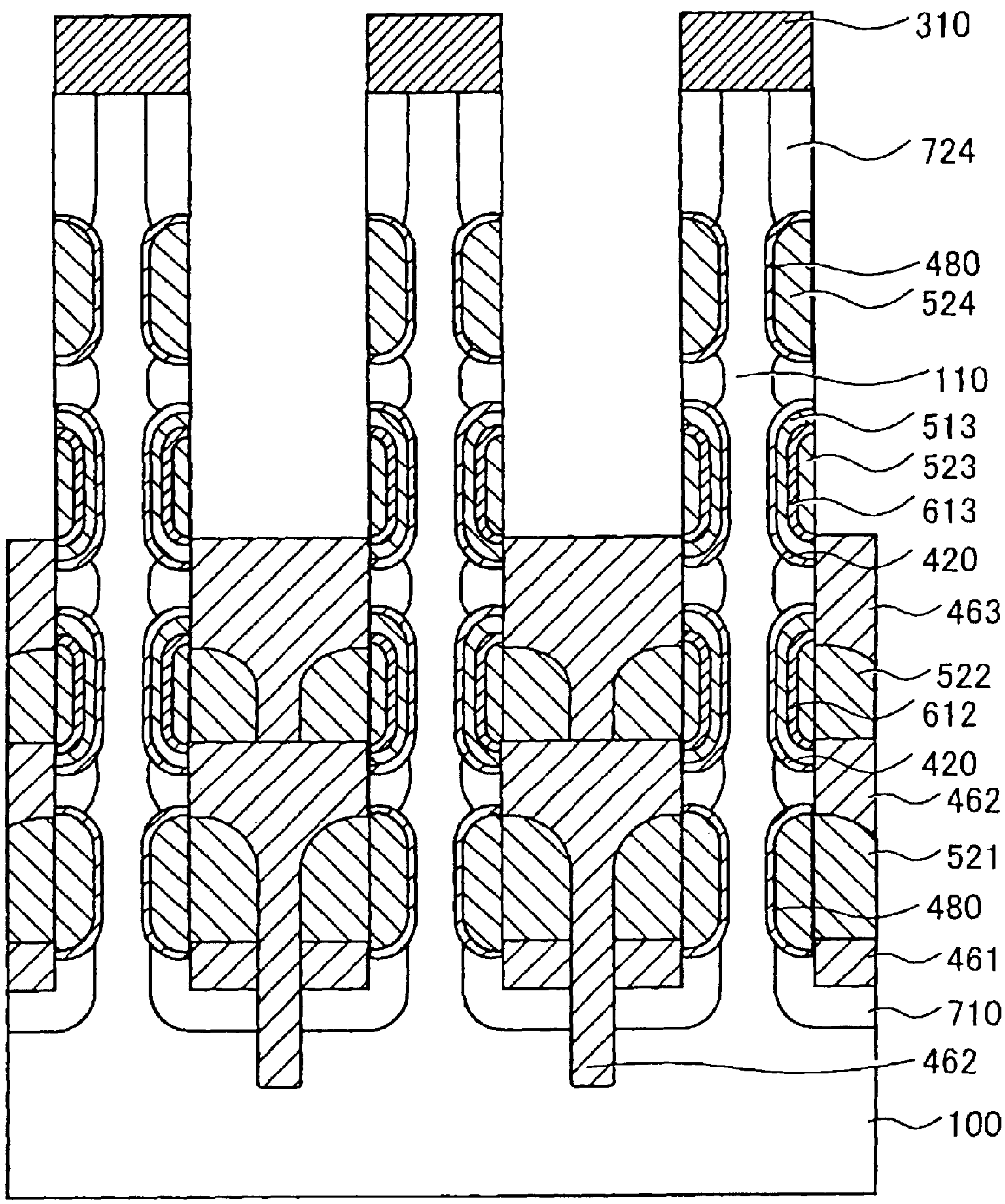

A silicon oxide film 463 is deposited to a thickness of 50 to 500 nm as eighth insulating film and anisotropically and isotropically etched so that the silicon oxide film 463 is embedded to bury the side and top of the polysilicon film 522 (FIG. 100 and FIG. 128).

Figure 101:
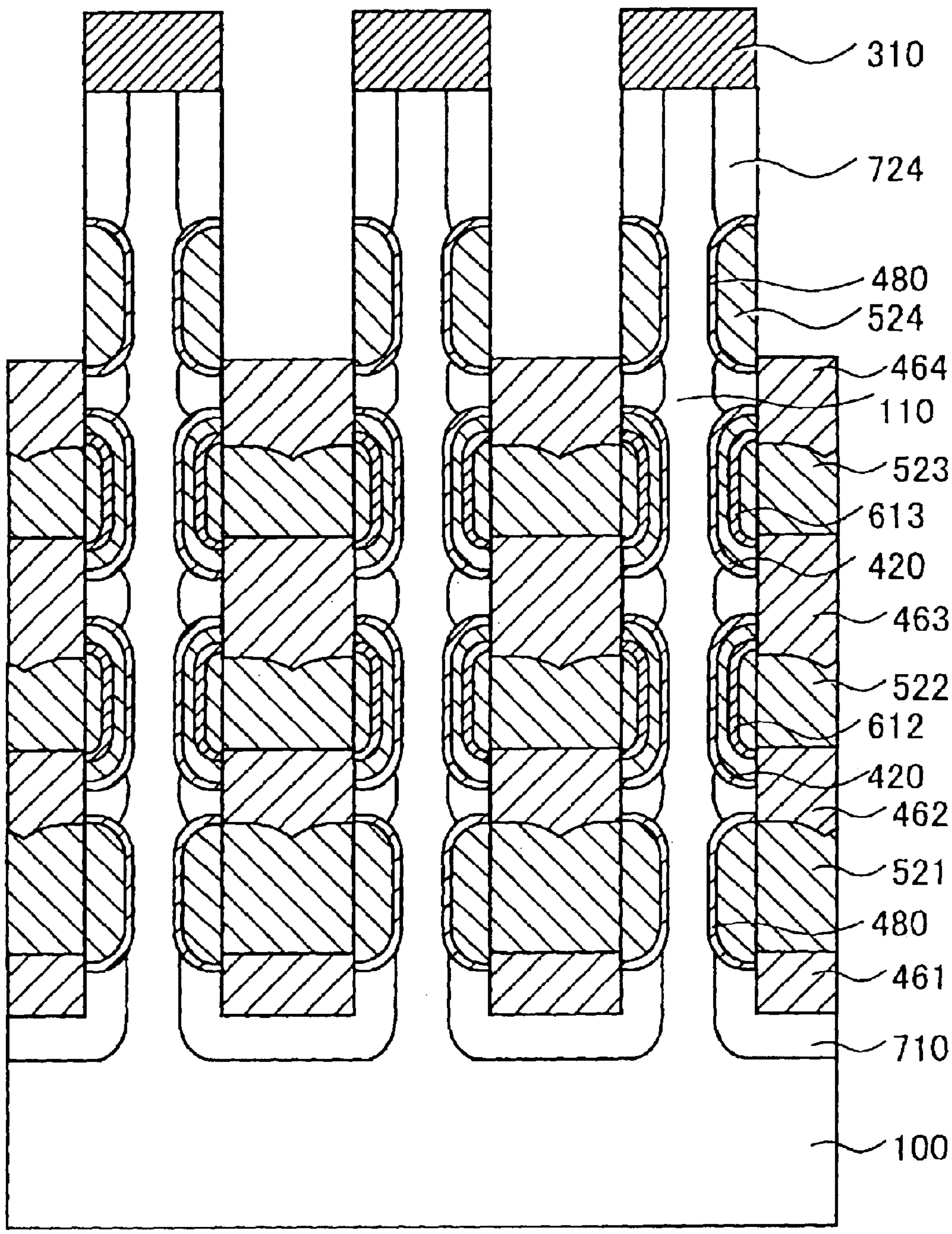
Figure 129:
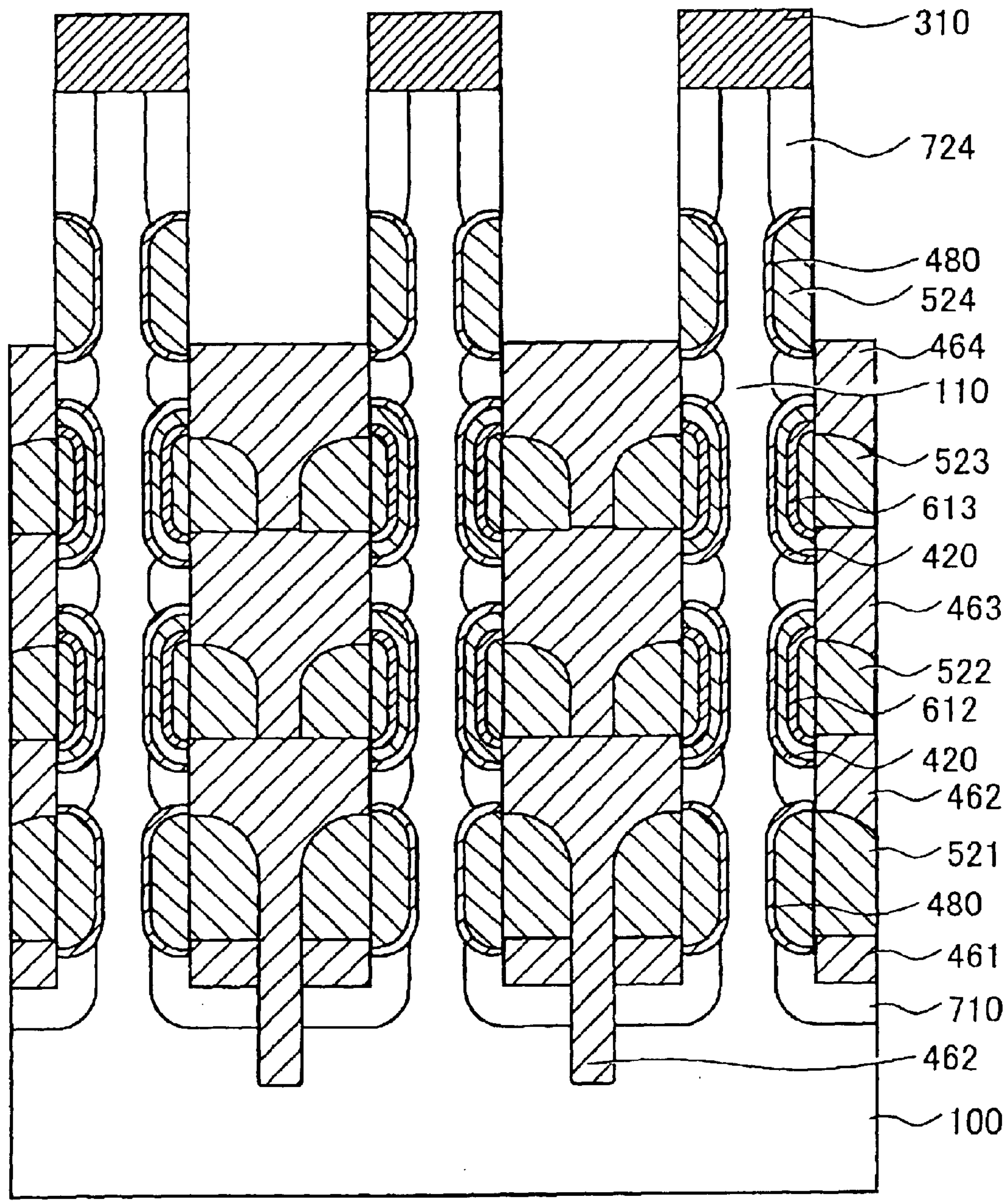

By repeating likewise, a polysilicon film 523 is deposited to a thickness of 15 to 150 nm as a second conductive film and anisotropically etched into the form of a sidewall spacer, and a silicon oxide film 464 as a eighth insulating film is embedded to bury the side and top of the polysilicon film 523 (FIG. 101 and FIG. 129).

Figure 102:
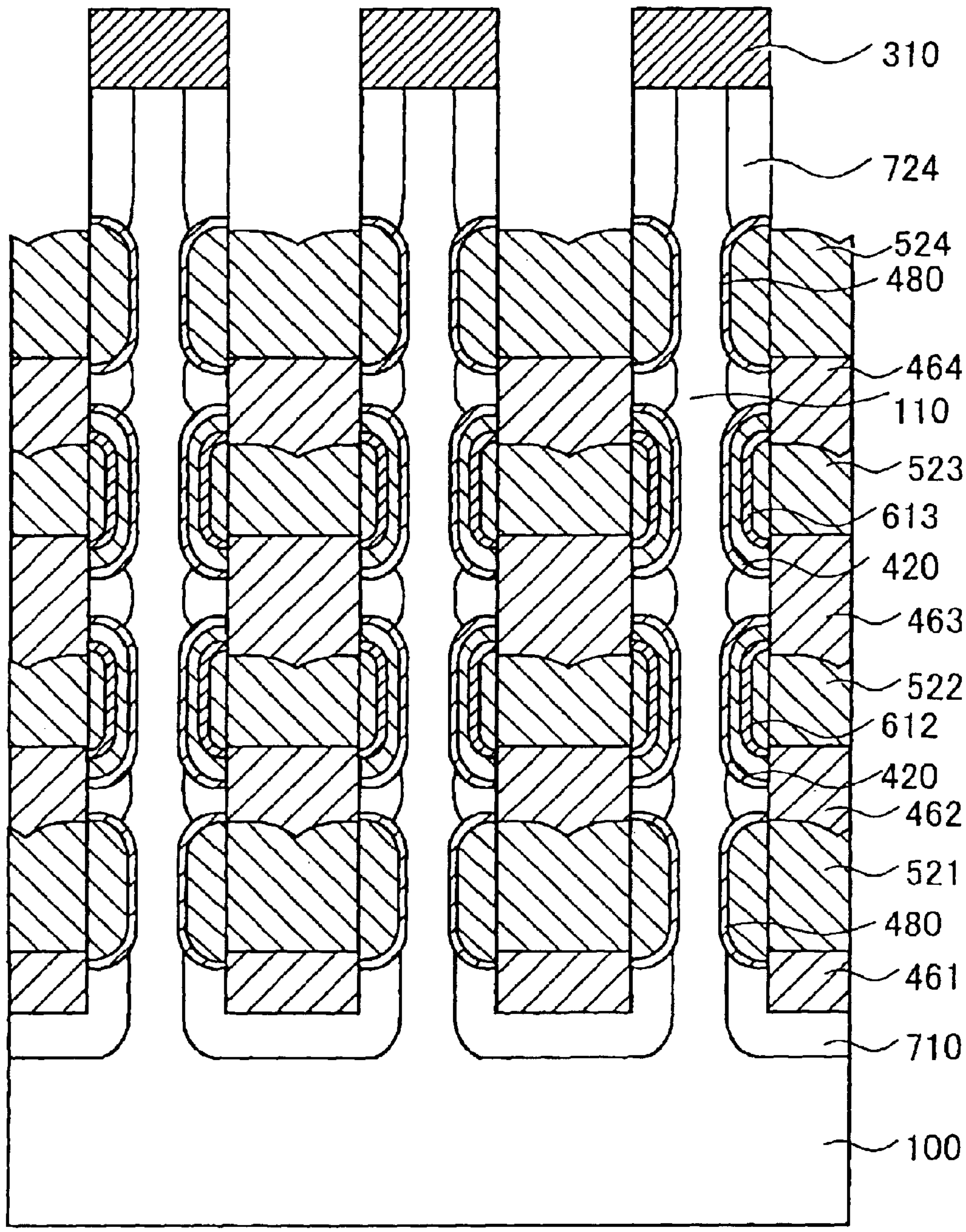
Figure 103:
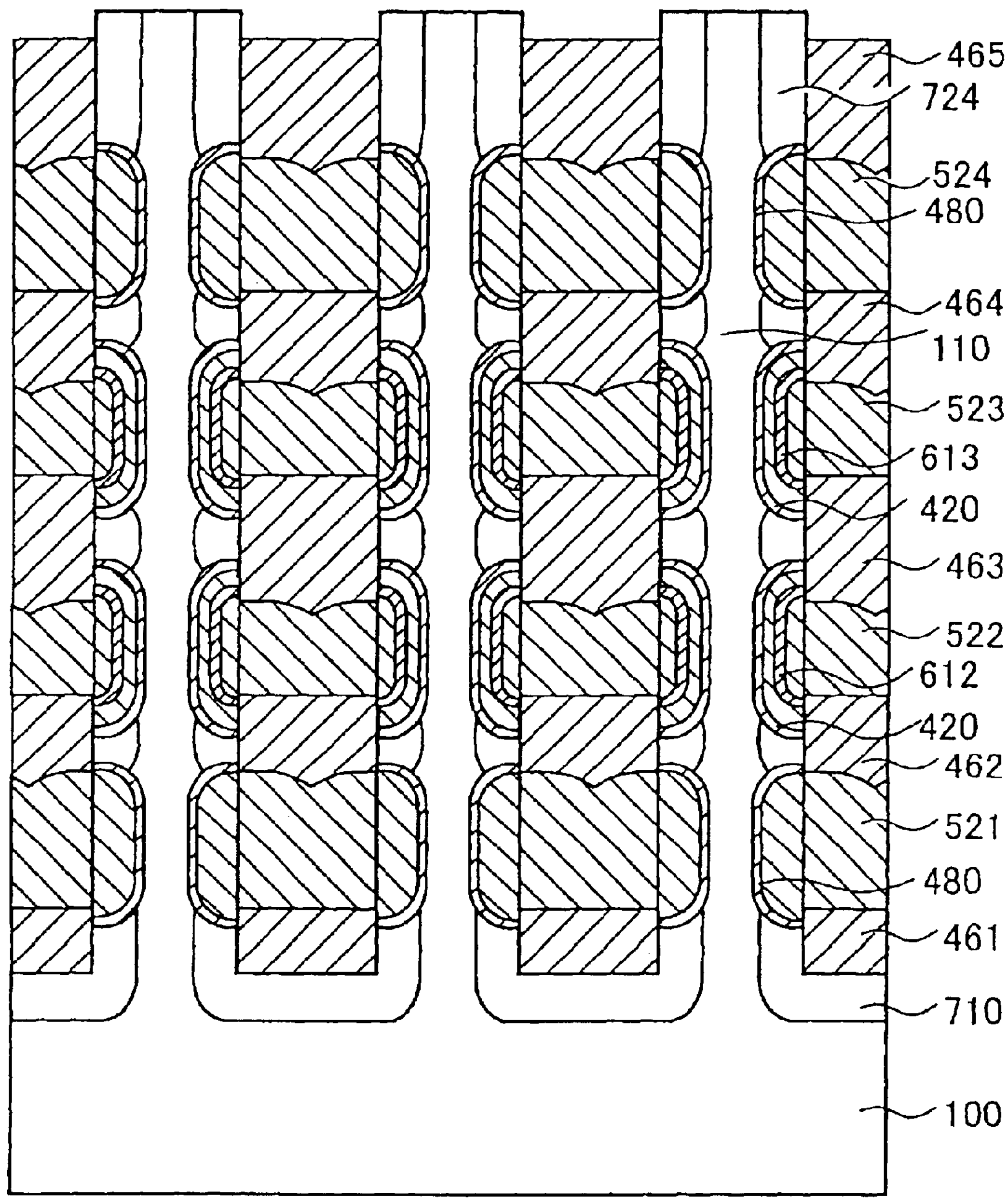
Figure 130:
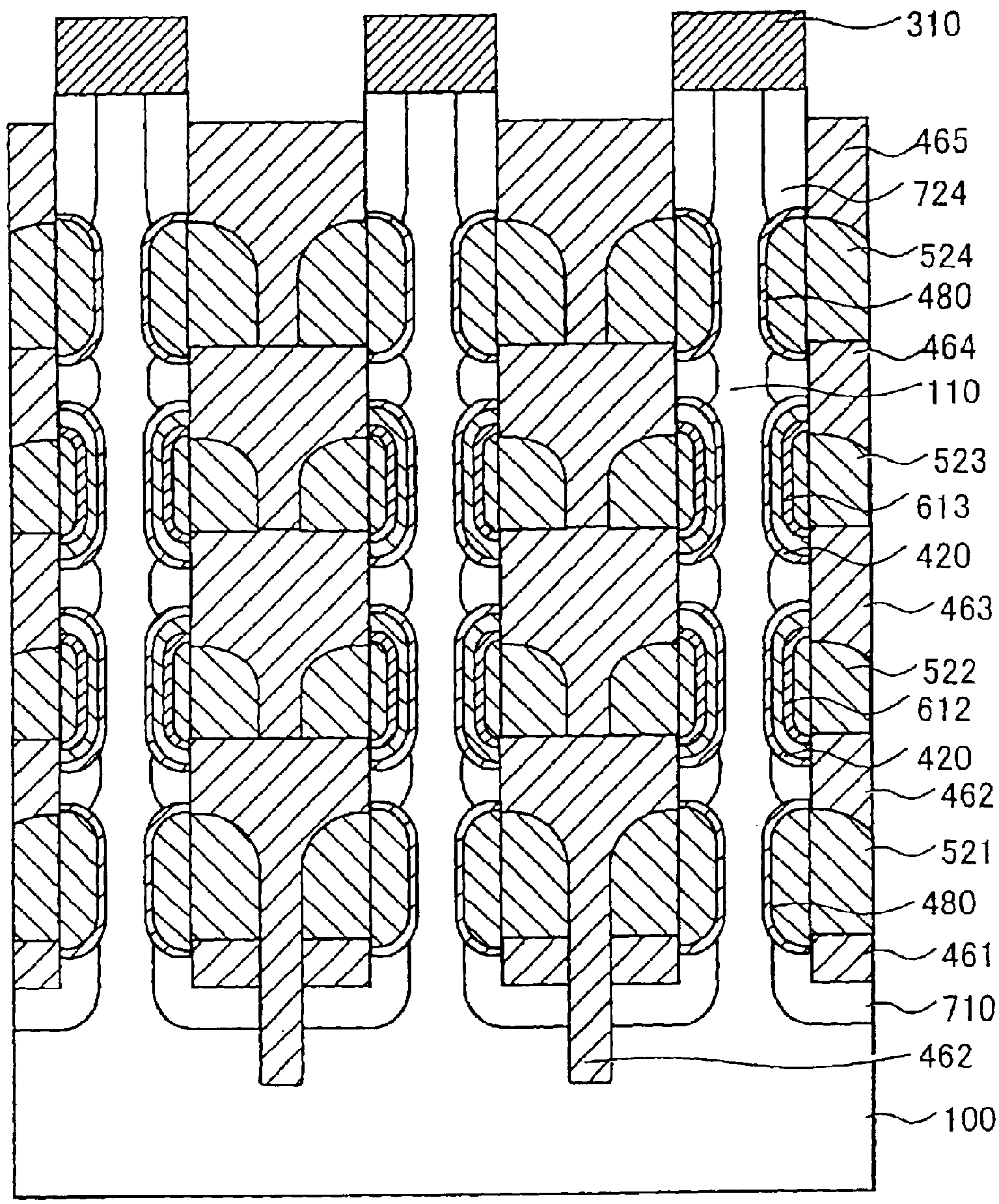
Figure 131:
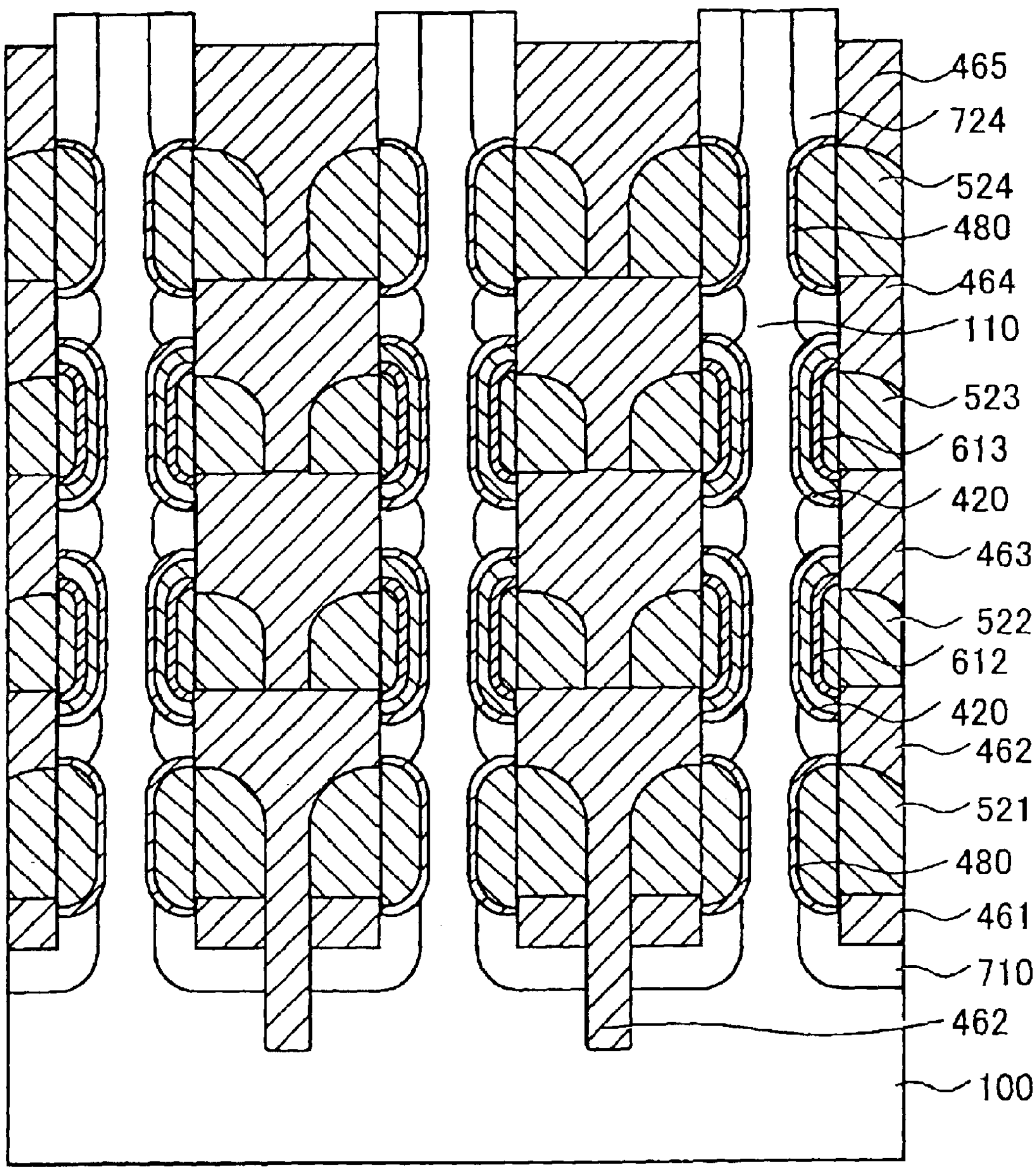

Subsequently, a polysilicon film 524 is deposited to a thickness of 15 to 150 nm as a second conductive film and anisotropically etched into the form of a sidewall spacer (FIG. 102 and FIG. 130).

On the top of the polysilicon film 524, a silicon oxide film 465 is deposited to a thickness of 100 to 500 nm as a tenth insulating film. The top of the island-like semiconductor layer 110 provided with the impurity diffusion layer 724 is exposed by etch-back or CMP (FIG. 103 and FIG. 131), for example, and as required, ion implantation is carried out with respect to the top of the island-like semiconductor layer 110 to adjust the impurity concentration. Then, a fourth wiring layer 840 is connected to the top of the island-like semiconductor layer 110 so that the direction of the fourth wiring layer crosses the direction of the second or the third wiring layer.

Figure 104:
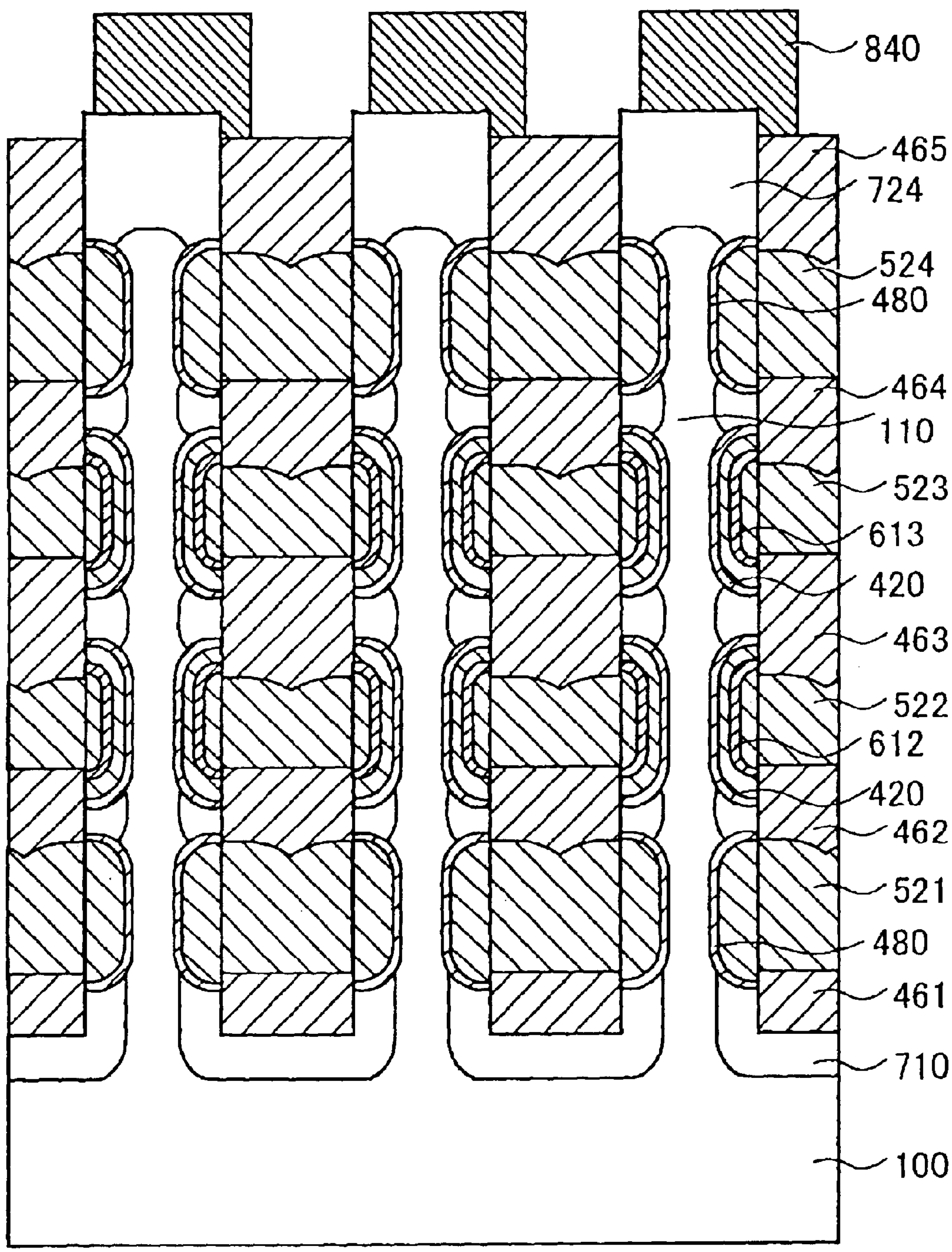
Figure 132:
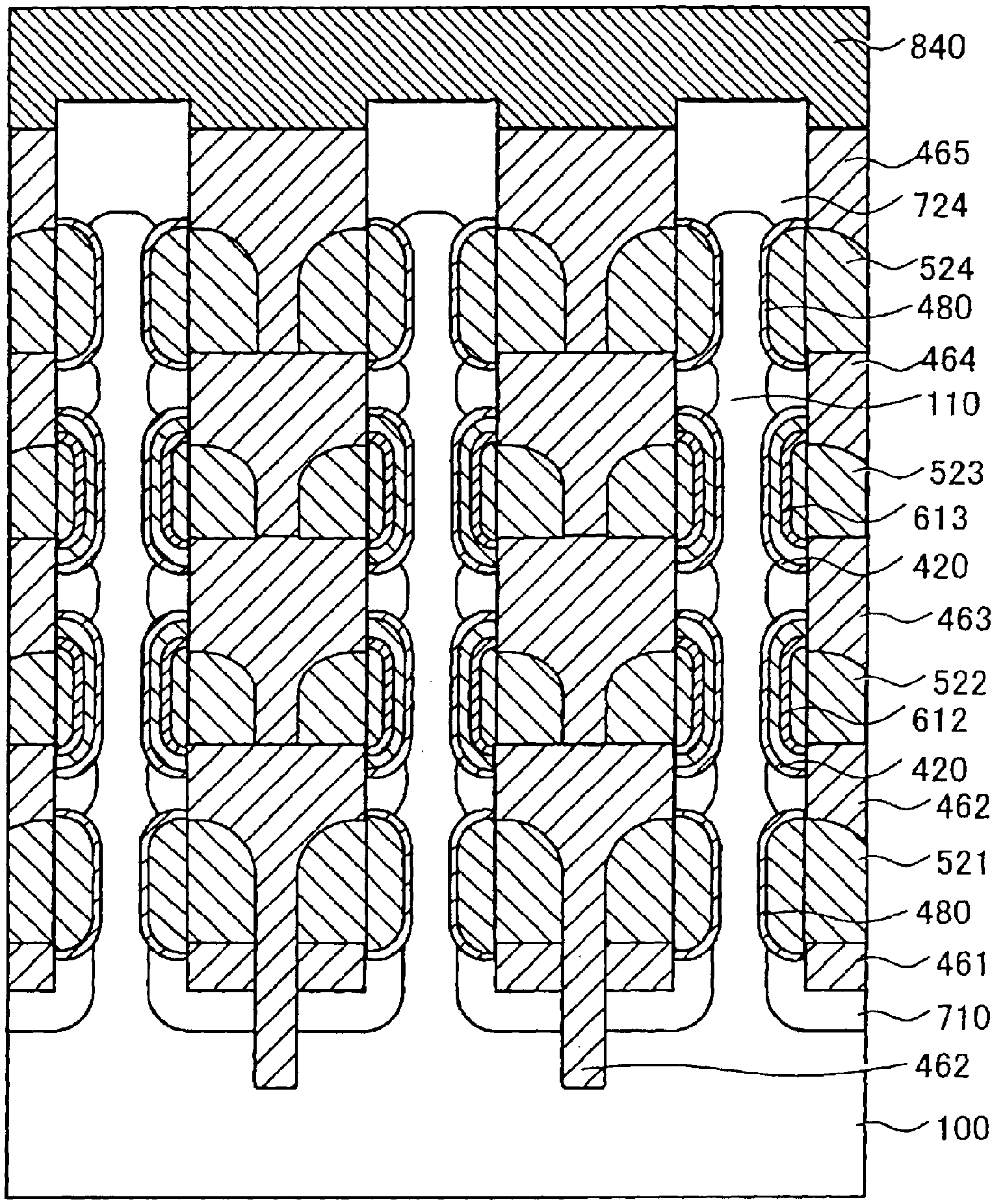

Then, by known techniques, an interlayer insulating film is formed and a contact hole and metal wiring are formed. Thereby, a semiconductor memory is realized which has a memory function according to the state of a charge in the charge storage layer which is the floating gate made of the polysilicon film as the first conductive film (FIG. 104 and FIG. 132).

Thus, since the floating gate is buried in the sidewall of the island-like semiconductor layer 110 and the control gate is buried in the sidewall of the floating gate, the ratio of an area of the interlayer insulating film to an area of the tunnel oxide film in each memory cell, i.e., the coupling ratio, is increased as compared with the case where only the floating gate is buried in the sidewall of the island-like semiconductor layer 110. Therefore, the writing speed is improved.

Further, since the polysilicon films 521 and 524, which are the selection gates, are also buried in the inside of the island-like semiconductor layer 110, sufficient intervals between the island-like semiconductor layers 110 arranged in matrix are established simply by intervals required for placing the wiring layers of the control gates and the selection gates. This includes a possibility of providing a more integrated device.

In the case of forming the island-like semiconductor layers 110 by using a resist R1 patterned at the minimum photoetching dimension, for example, a sidewall spacer may be formed to reduce the intervals between the island-like semiconductor layers 110 so that the diameter of the island-like semiconductor layers 110 increases. Alternatively, the polysilicon films 522 and 523 may partially be arranged in the recesses formed on the sidewalls of the polysilicon films 512 and 513, respectively. There is no particular limitation to the shape of the polysilicon films 522 and 523 which are buried in the floating gates with the intervention of the interlayer insulating films.

In this production example, the first lattice-form trench 210 is formed on the P-type semiconductor substrate, as an example. However, the first lattice-form trench 210 may be formed in a P-type impurity diffusion layer formed in an N-type semiconductor substrate, or in a P-type impurity diffusion layer formed in an N-type impurity diffusion layer formed in a P-type silicon substrate. The conductivity types of the impurity diffusion layers may be reversed.

In this production example, films formed on the surface of the semiconductor substrate or the polysilicon film such as the silicon nitride film 310 may be formed of a layered film of a silicon oxide film/a silicon nitride film from the silicon surface. Means of forming the silicon oxide film to be buried is not limited to CVD, and rotational application may be used, for example.

In this production example, the recesses in which the polysilicon films 512 and 513 (the first conductive films) are buried and those in which the polysilicon films 521 and 524 (the second conductive films) are buried or those in which the polysilicon films 522 and 523 (the second conductive films) are buried, are formed at the same time. However, they may be formed stage by stage. For example, the recesses for burying therein the polysilicon films 512 and 513 and those for burying therein the polysilicon films 521 and 524 may be formed simultaneously. The number of the recesses to be formed simultaneously and the order of the formation are not limited.

In this production example, the control gates of the memory cells are formed continuously in one direction without using a mask. However, that is possible only where the island-like semiconductor layers are not disposed symmetrically to a diagonal. More particularly, by setting smaller the intervals between adjacent island-like semiconductor layers in the direction of the second or the third wiring layers than those in the direction of the fourth wiring layer, it is possible to automatically obtain the wiring layers which are discontinuous in the direction of the fourth wiring layer and are continuous in the direction of the second or the third wiring layers without using a mask. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased, i.e., a reading voltage is 0V and a threshold is negative, thereby the cell current flows even through a non-selected cell.

Figure 105:
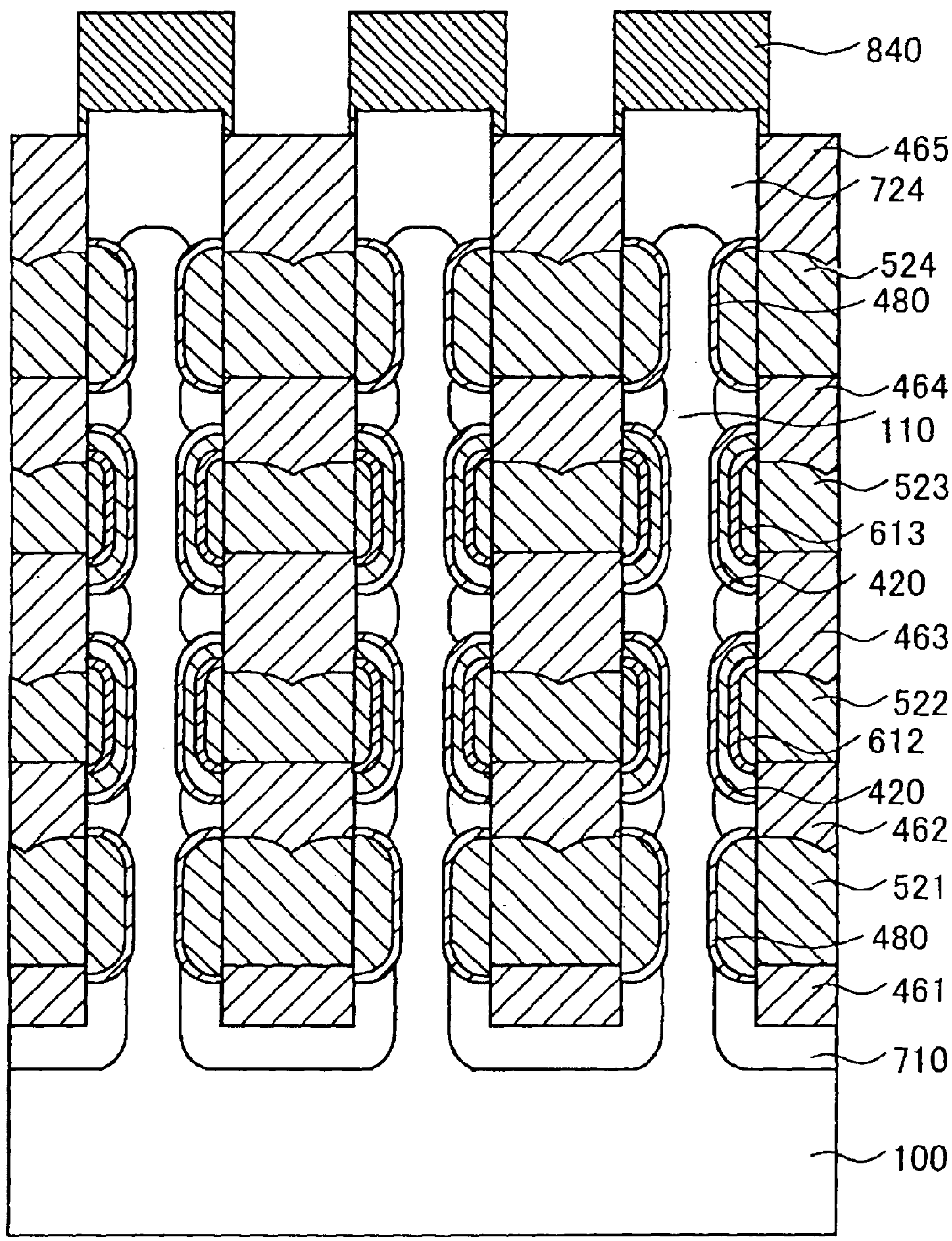
Figure 133:
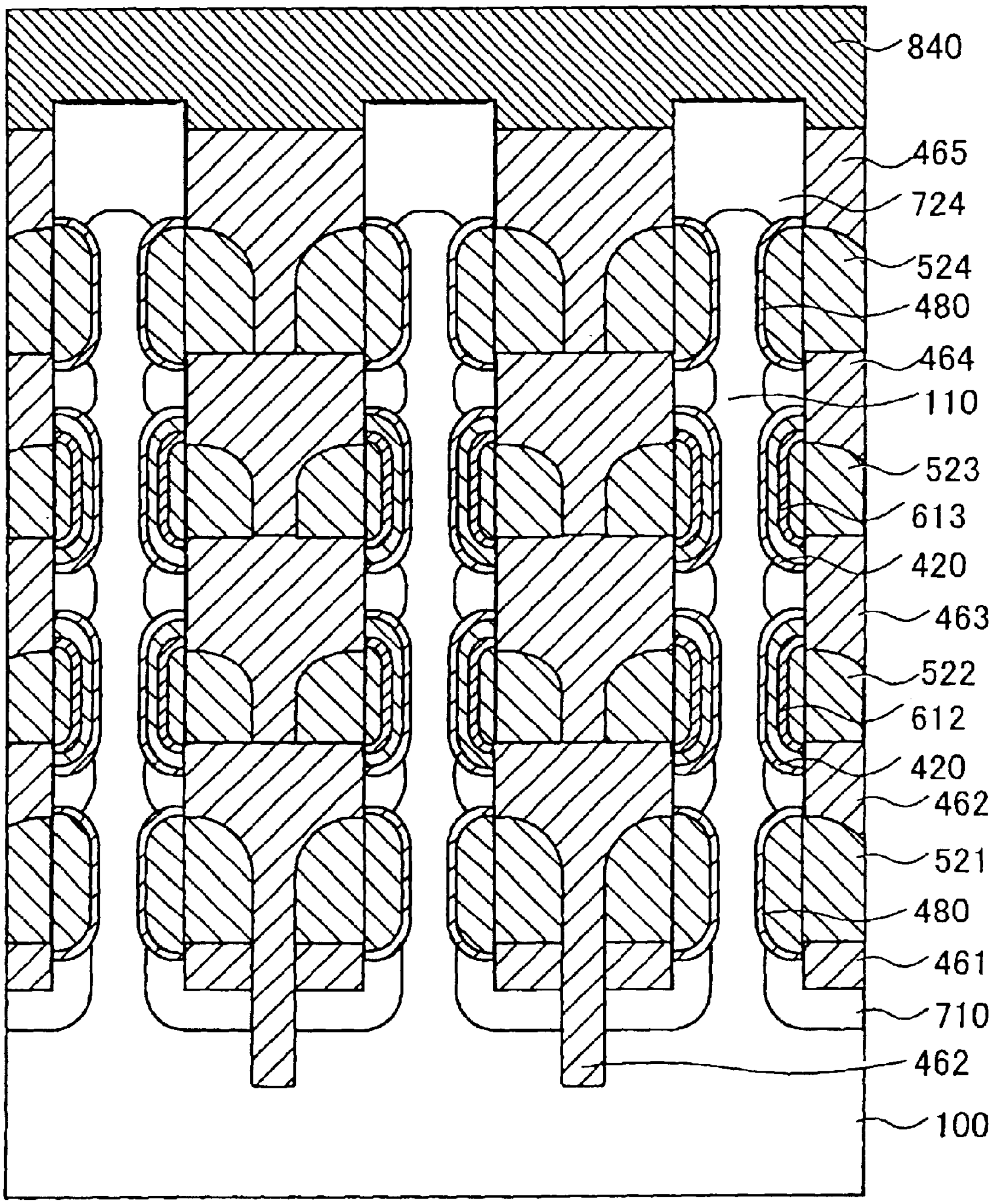

FIG. 104 and FIG. 132 show that the fourth wiring layer 840 is mis-aligned with respect to the island-like semiconductor layer 110. However, it is preferred that the fourth wiring layer 840 is formed without mis-alignment as shown in FIG. 105 and FIG. 133.

PRODUCTION EXAMPLE 2

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. The island-like semiconductor layers have additional recesses at the top and the bottom thereof and selection gate transistors including gate oxide films and selection gates are arranged therein. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

A semiconductor memory is produced by the following production process.

FIGS. 134 and 135 and FIGS. 136 and 137 are sectional views taken on line A–A' and line B–B', respectively, in FIG. 1 which is a cross-sectional view illustrating a memory cell array of an EEPROM.

Figure 134:
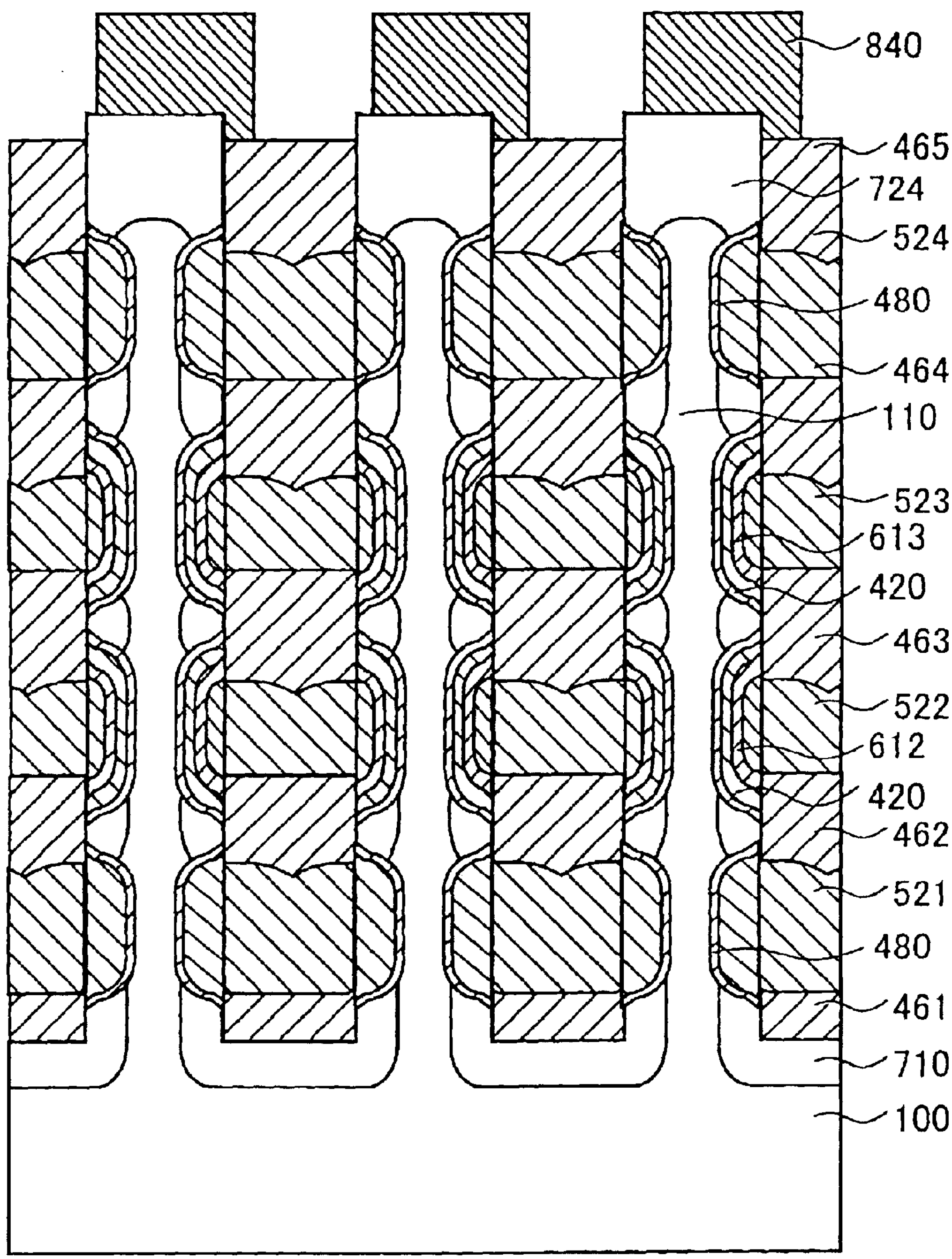
Figure 135:
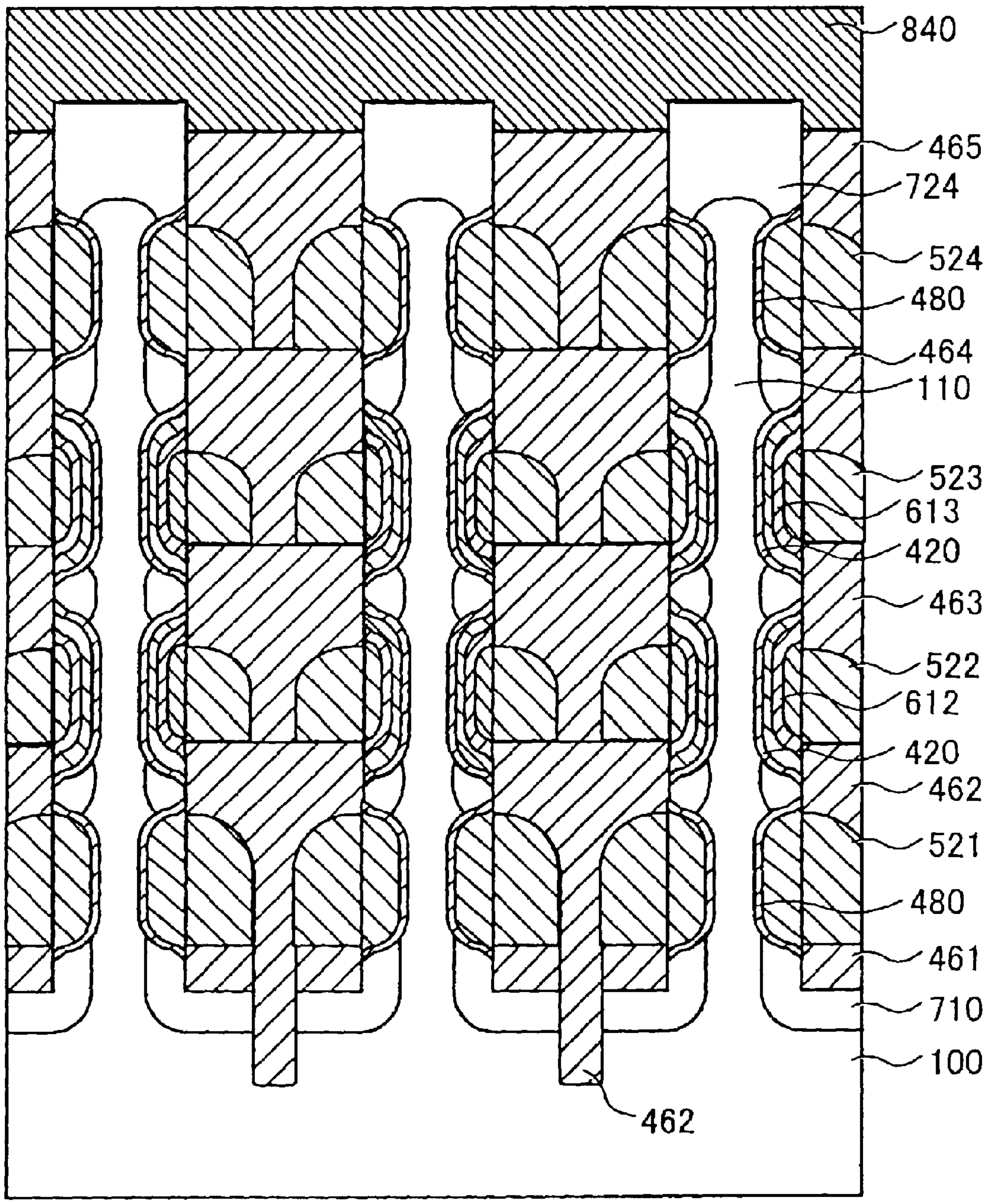

In this production example, described is a semiconductor memory as explained in Production example 1 in which at least one recess to be formed in the island-like semiconductor layer 110 does not have a simple concave shape as shown in FIG. 134 and FIG. 135. More specifically, during the formation of a silicon oxide film 450 (a seventh insulating film) by thermal oxidation, the island-like semiconductor layer 110 located inside a silicon nitride film 322 (a fourth insulating film) is partially oxidized, thereby the recesses of such a shape are formed. However, such recesses are also sufficiently used. The shape of the recesses is not particularly limited as long as the diameter of the island-like semiconductor layer 110 is partially reduced by the recesses.

Figure 136:
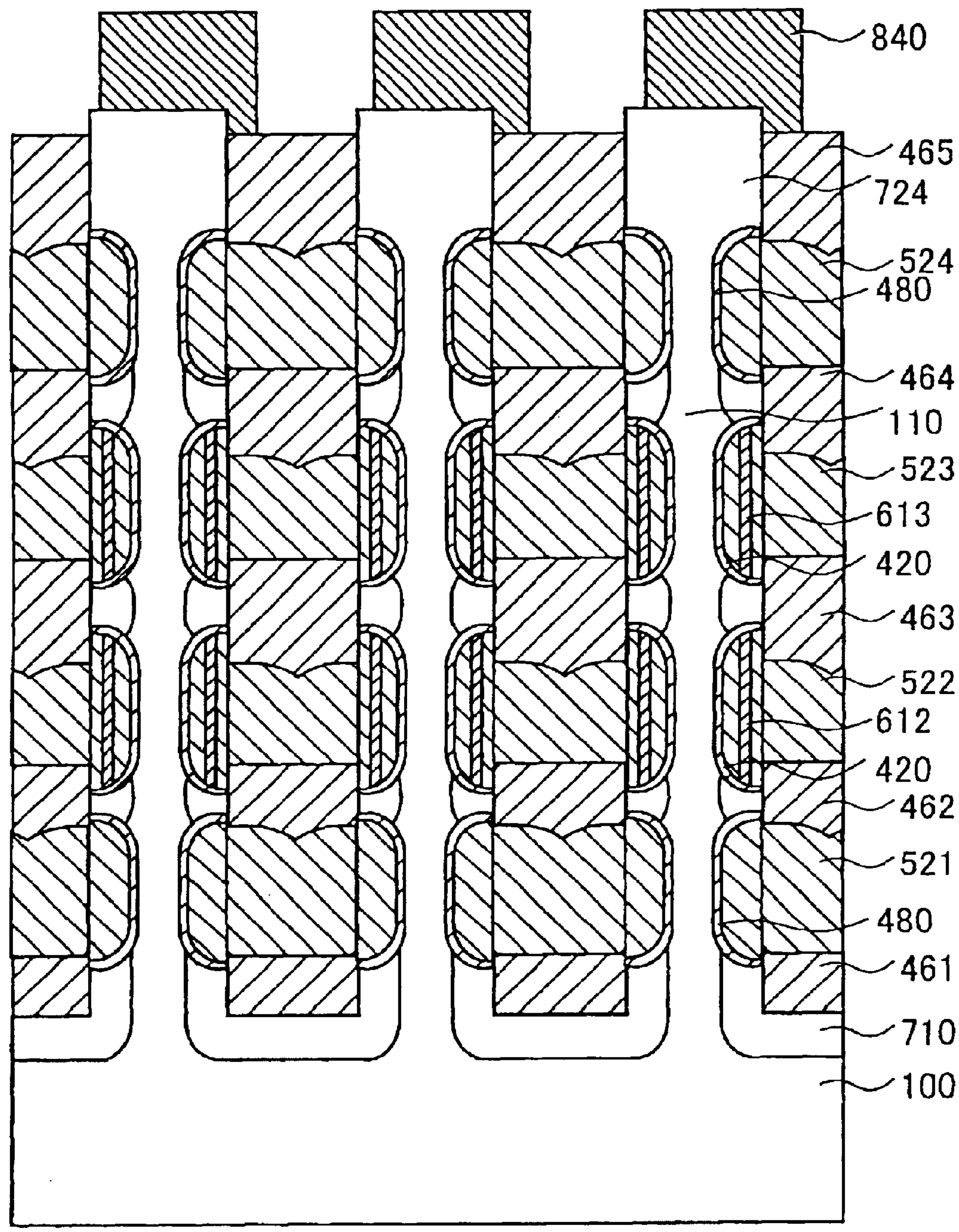
Figure 137:
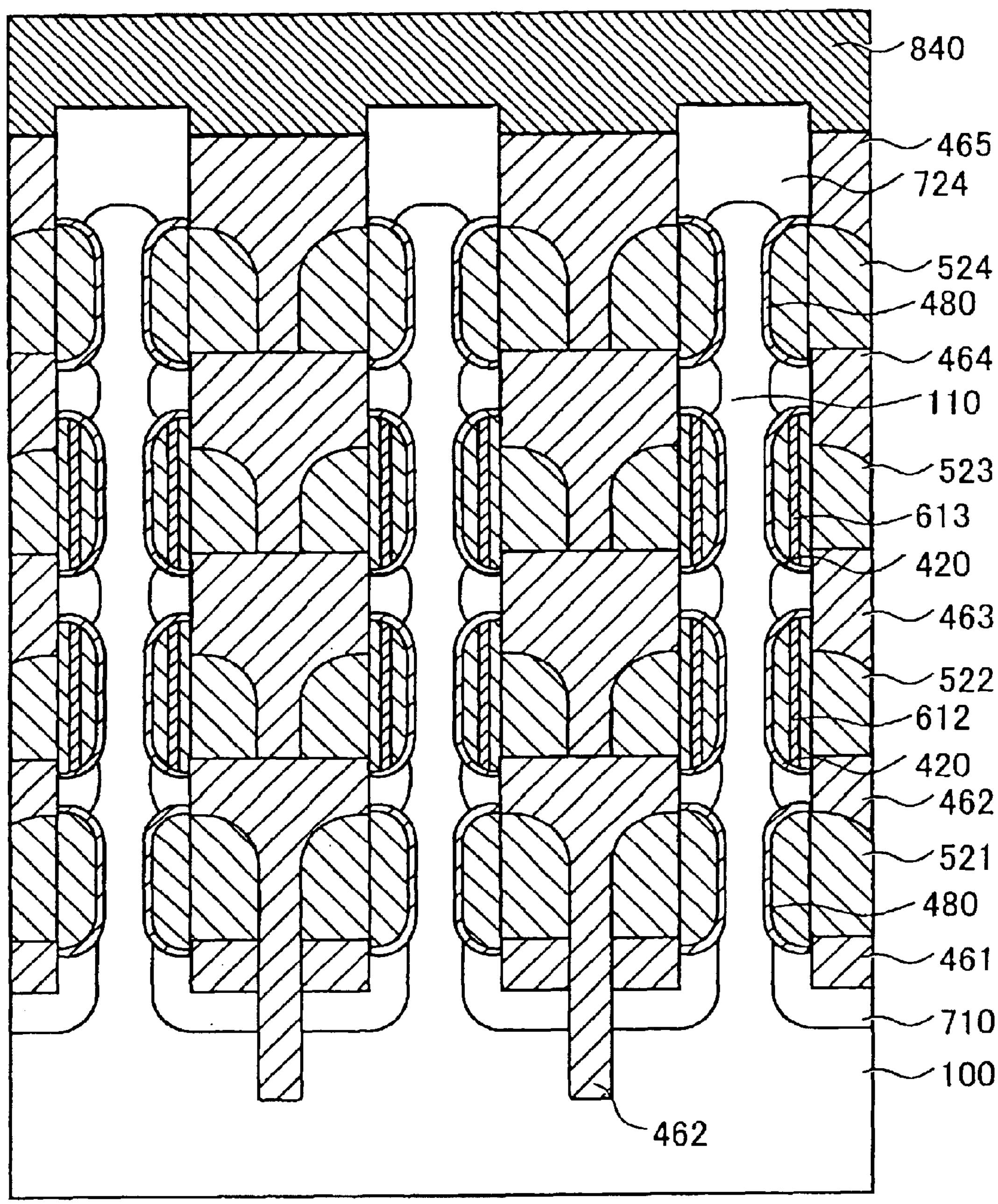

In the case where the floating gate and the control gate are placed in the same recess in the semiconductor memory as explained in Production example 1, the floating gate and the control gate may be arranged as shown in FIG. 136 and FIG. 137, for example. The positional relationship between the floating gate and the control gate in the recess is not limited.

PRODUCTION EXAMPLE 3

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. The island-like semiconductor layers have additional recesses at the top and the bottom thereof and selection gate transistors including gate oxide films and selection gates are arranged therein. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Figure 138:
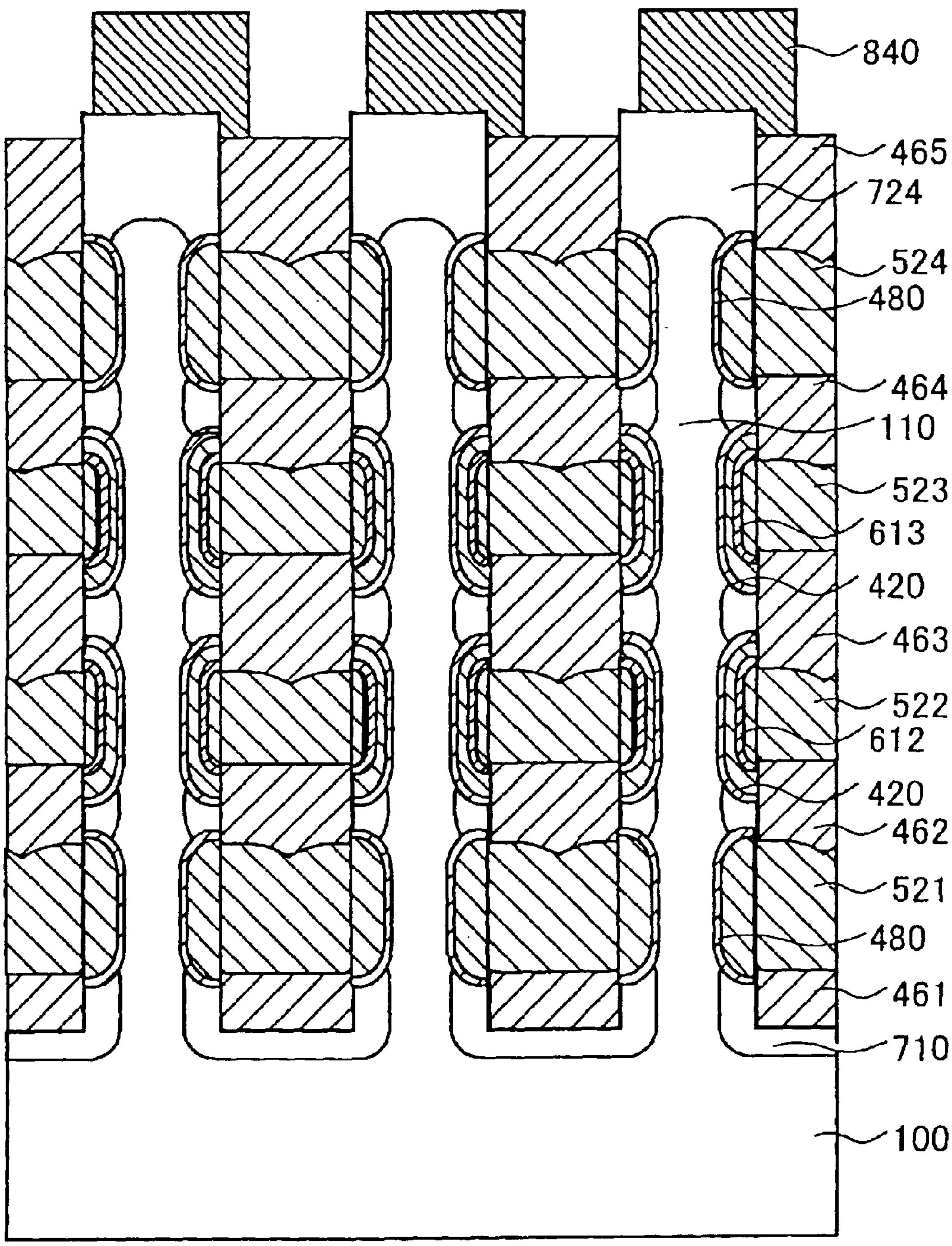
Figure 139:
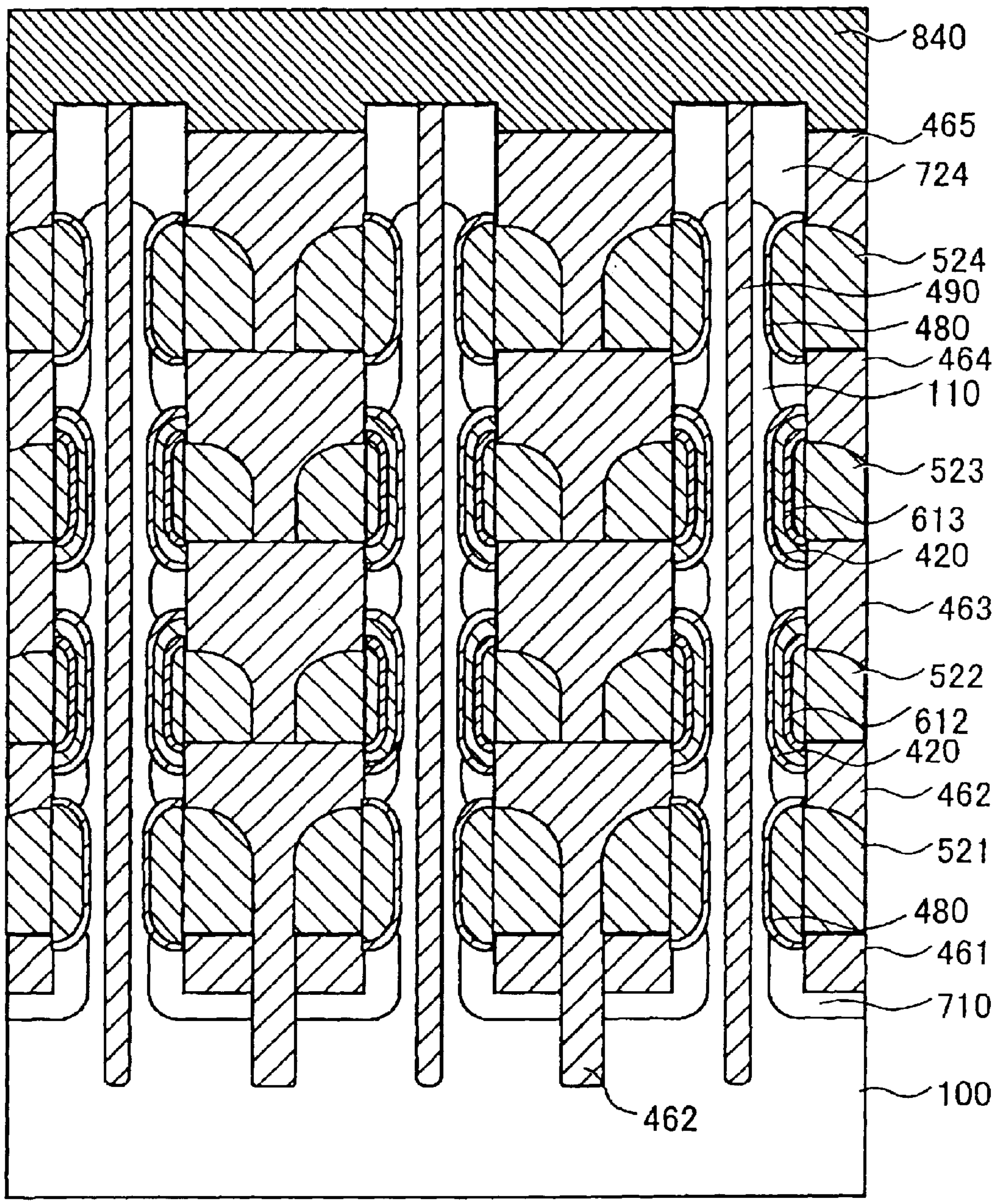

A semiconductor memory is produced by the following production process. FIG. 138 and FIG. 139 are sectional views taken on line A–A' and line B–B', respectively, in FIG. 2 which is a cross-sectional view illustrating a memory cell array of an EEPROM.

In this production example, a semiconductor memory as explained in Production example 1 is formed, in which the island-like semiconductor layers 110 continuously formed in a direction of A–A' are anisotropically etched by using a patterned mask until at least the impurity diffusion layer 710 is separated and a silicon oxide film 490 is buried as a fifteenth insulating film (FIG. 138 and FIG. 139).

Thus, a semiconductor memory having similar function and doubled device capacitance as compared with the semiconductor memory of Production example 1 is obtained, though the deterioration of the device performance is expected.

The fifteenth insulating film is not limited to the silicon oxide film, but a silicon nitride film may be used. Any film may be used as long as it is an insulating film.

PRODUCTION EXAMPLE 4

In a semiconductor memory to be produced in this example, a semiconductor substrate is patterned in the form of pillars to form island-like semiconductor layers having at least one recess. Sides of the island-like semiconductor layers make active regions. Laminated insulating films as charge storage layers and control gates are formed in the recesses. The island-like semiconductor layers have additional recesses at the top and the bottom thereof and selection gate transistors including gate oxide films and selection gates are arranged therein. A plurality of memory transistors, for example, two memory transistors, are placed between the selection gate transistors and are connected in series along the island-like semiconductor layer. The laminated insulating films and the control gates of the memory transistors are formed at the same time.

Such a semiconductor memory is produced by the following production process.

Figure 140:
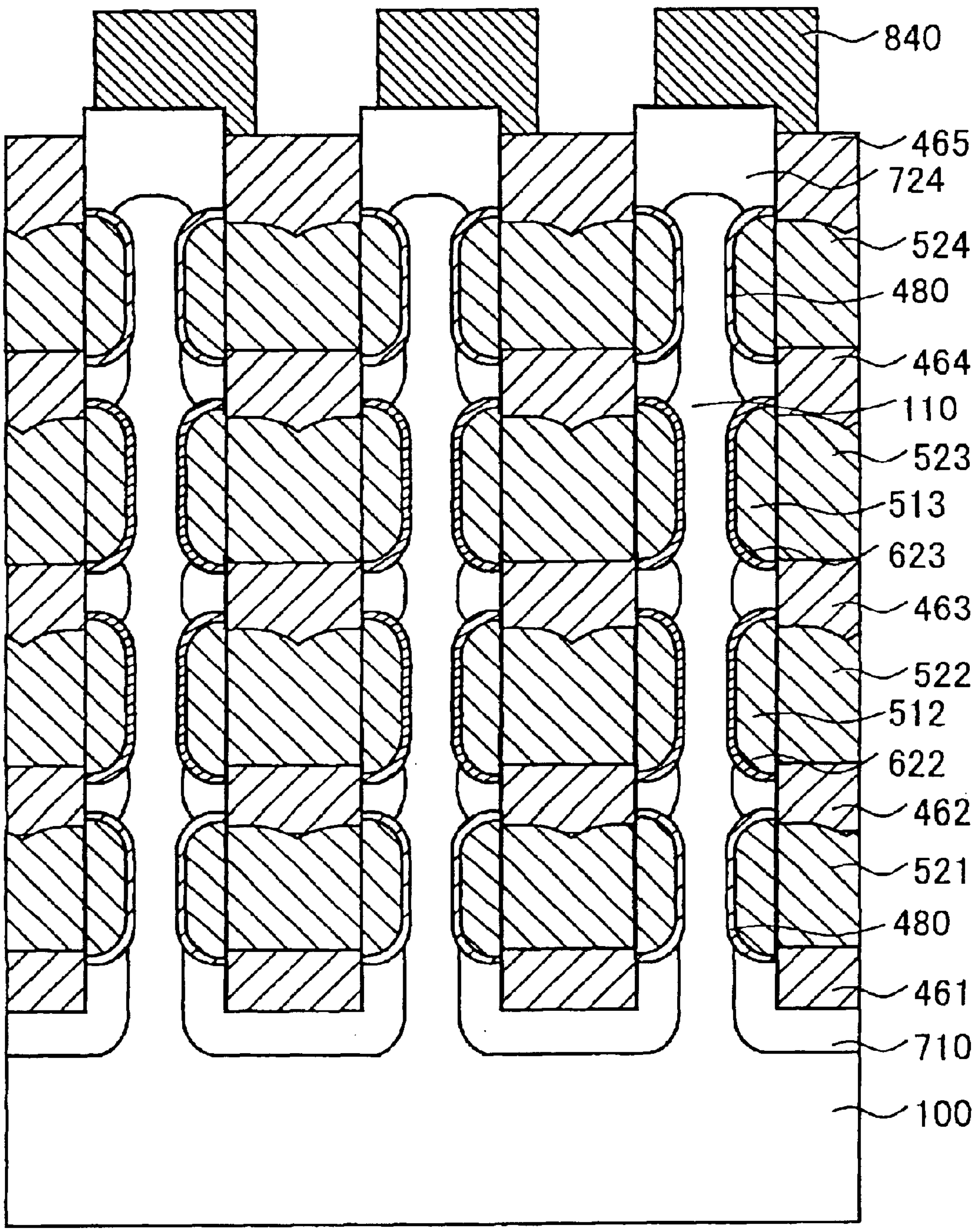
Figure 141:
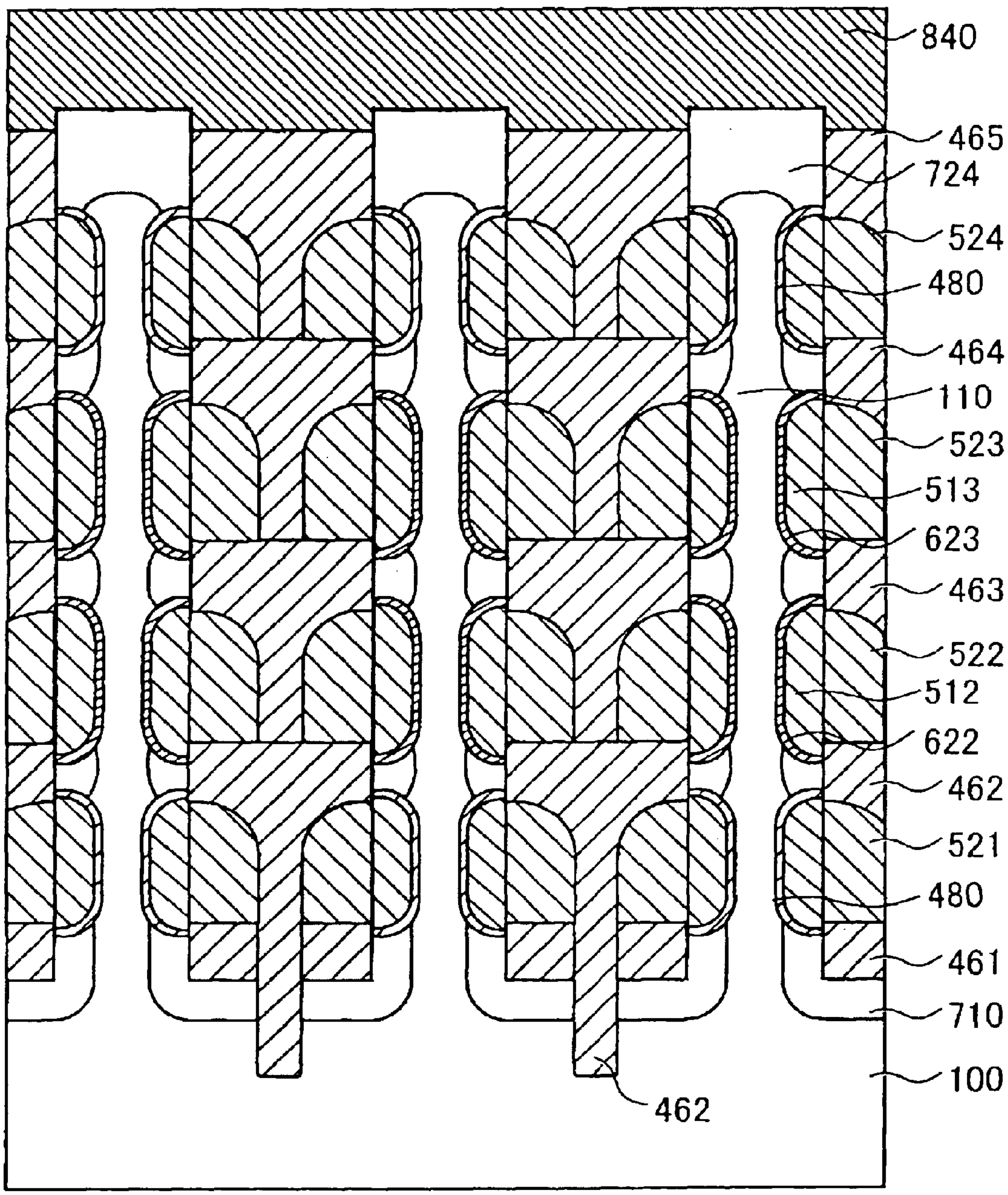

FIG. 140 and FIG. 141 are sectional views taken on line A–A' and line B–B', respectively, in FIG. 9 which is a cross-sectional view illustrating a memory cell array of an EEPROM.

In this production example, instead of forming the silicon oxide film 420 as explained in Production example 1, layered insulating films 622 and 623 are formed and the interlayer insulating films 612 and 613 are not formed as shown in FIG. 140 and FIG. 141. The layered insulating film described herein may have a layered structure of a tunnel oxide film and a silicon nitride film, or a layered structure of a tunnel oxide film, a silicon nitride film and a silicon oxide film. Unlike the memory of Production example 1, the charge storage layer is not realized by electron injection into the floating gate but by electron trapping into the layered insulating film.

Thereby, the same effect as obtained by Production Example 1 is obtained.

PRODUCTION EXAMPLE 5

In a semiconductor memory to be produced in this example, a semiconductor substrate to which an oxide film is inserted, for example, a semiconductor portion on an oxide film of an SOI substrate, is patterned into pillar-form island-like semiconductor layers having at least one recess.

Such a semiconductor memory is produced by the following production process. FIGS. 142 and 143 and FIGS. 144 and 145 are sectional views taken on line A–A' and line B–B', respectively, in FIG. 1 which is a cross-sectional view illustrating a memory cell array of an EEPROM.

According to this example, the same effect as obtained by Production Example 1 can be obtained, and furthermore, the junction capacitance of the impurity diffusion layer 710 which functions as the first wiring layer is suppressed or removed. The use of the SOI substrate can be applied to every embodiment of the present invention.

Figure 142:
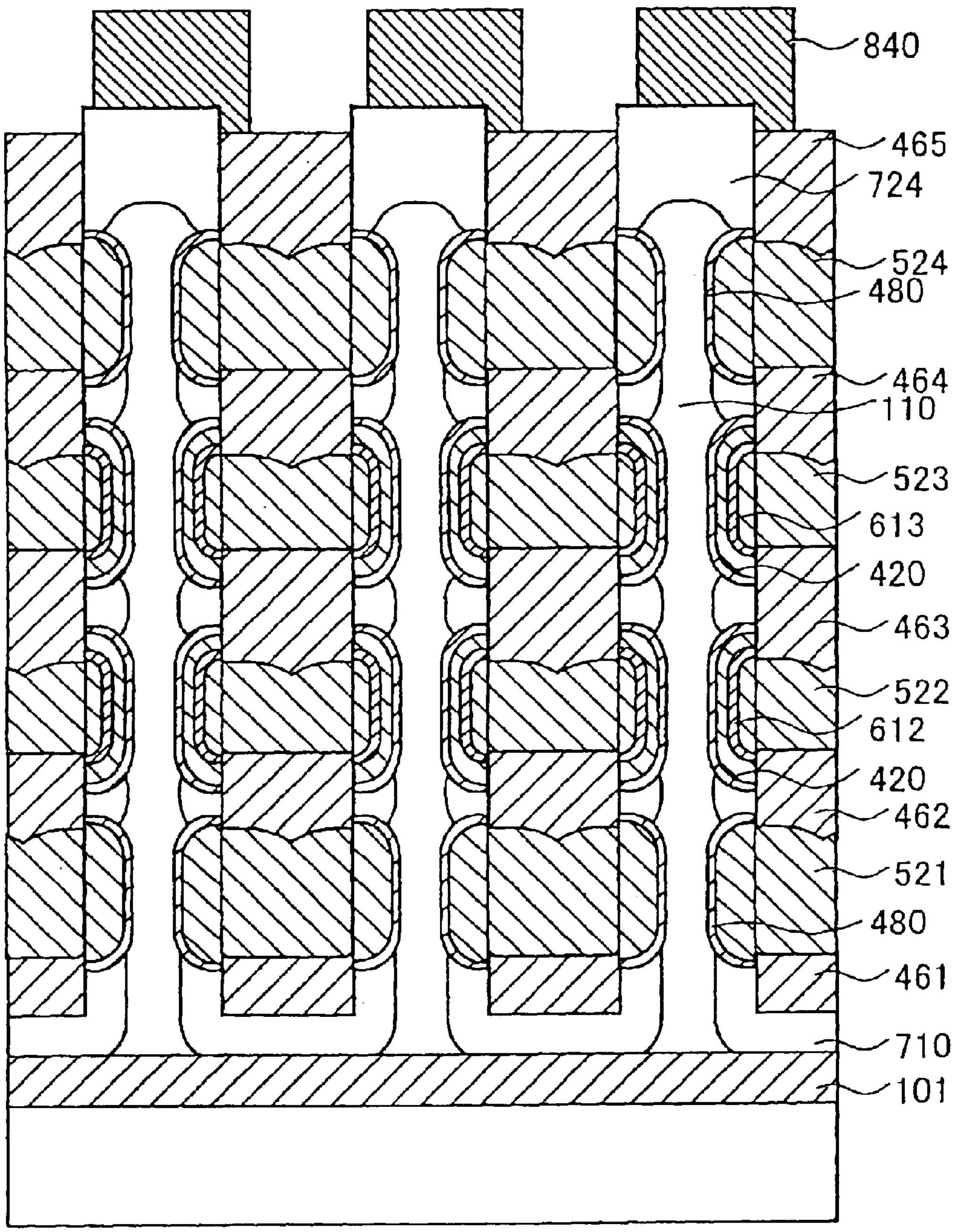
Figure 143:
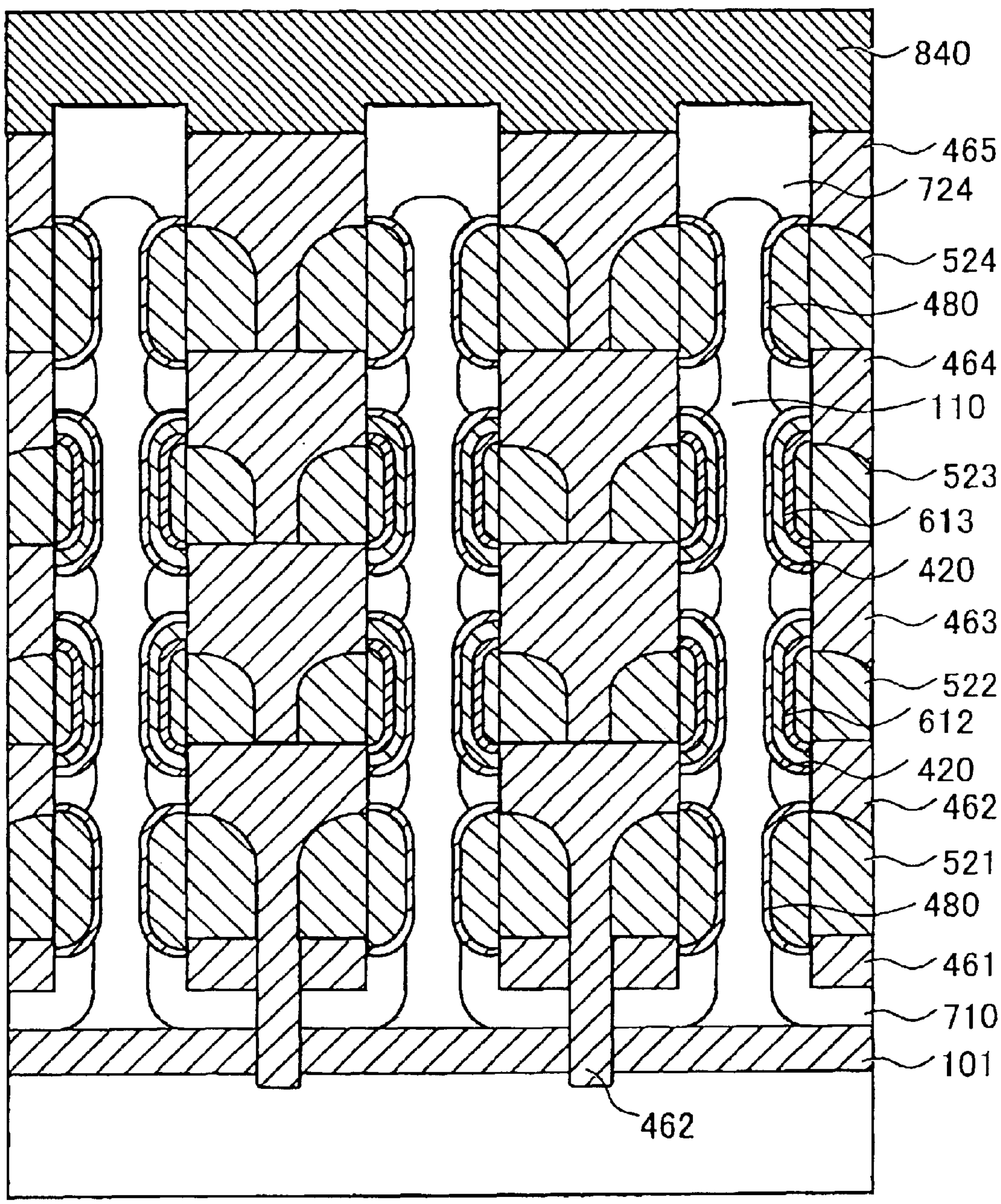
Figure 144:
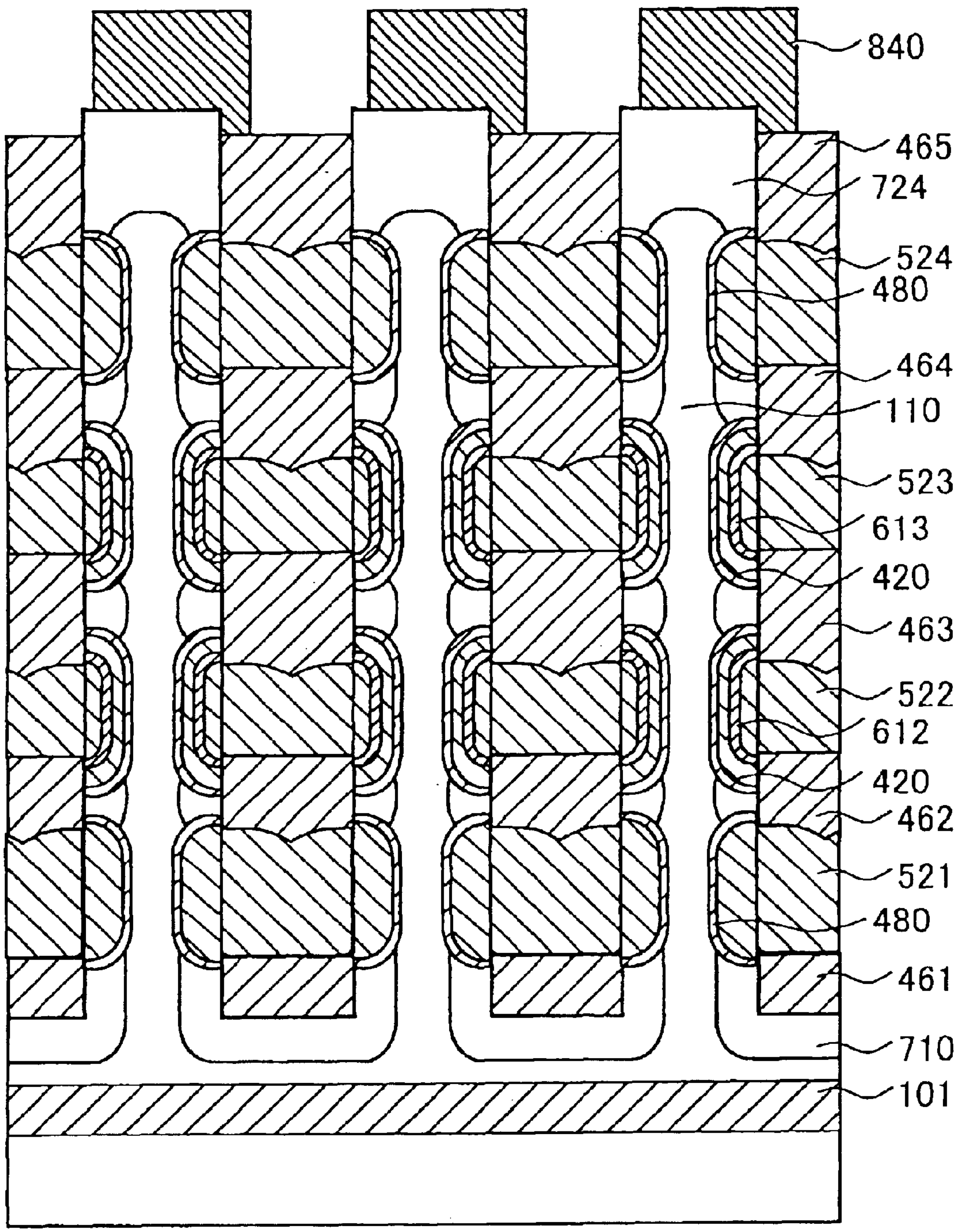
Figure 145:
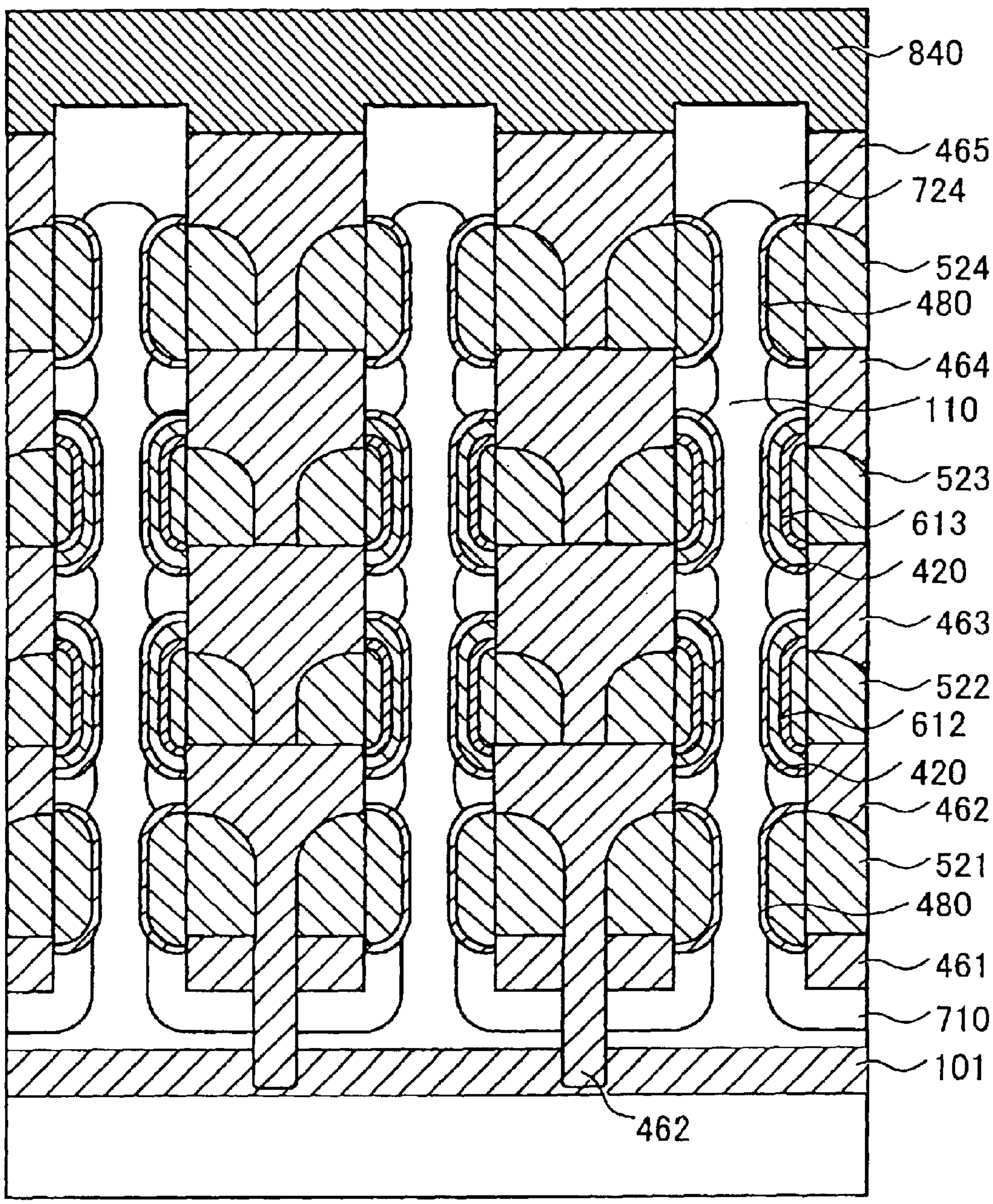

If the SOI substrate is used, the impurity diffusion layer (the first wiring layer) 710 may reach the oxide film of the SOI substrate as shown in FIGS. 142 and 143 and may not reach the oxide film as shown in FIGS. 144 and 145. The trench for separating the first wiring layer may reach the oxide film of the SOI substrate, may not reach the oxide film or may form deeply so as to penetrate the oxide film. The depth of the trench is not limited as long as the impurity diffusion layer is separated.

This example uses the SOI substrate with the oxide film inserted therein as the insulating film, but the insulating film may be a nitride film. The kind of the insulating film is not limited.

PRODUCTION EXAMPLE 6

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. The island-like semiconductor layers have additional recesses at the top and the bottom thereof and selection gate transistors including gate oxide films and selection gates are arranged therein. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Such a semiconductor memory is produced by the following production process.

Figure 146:
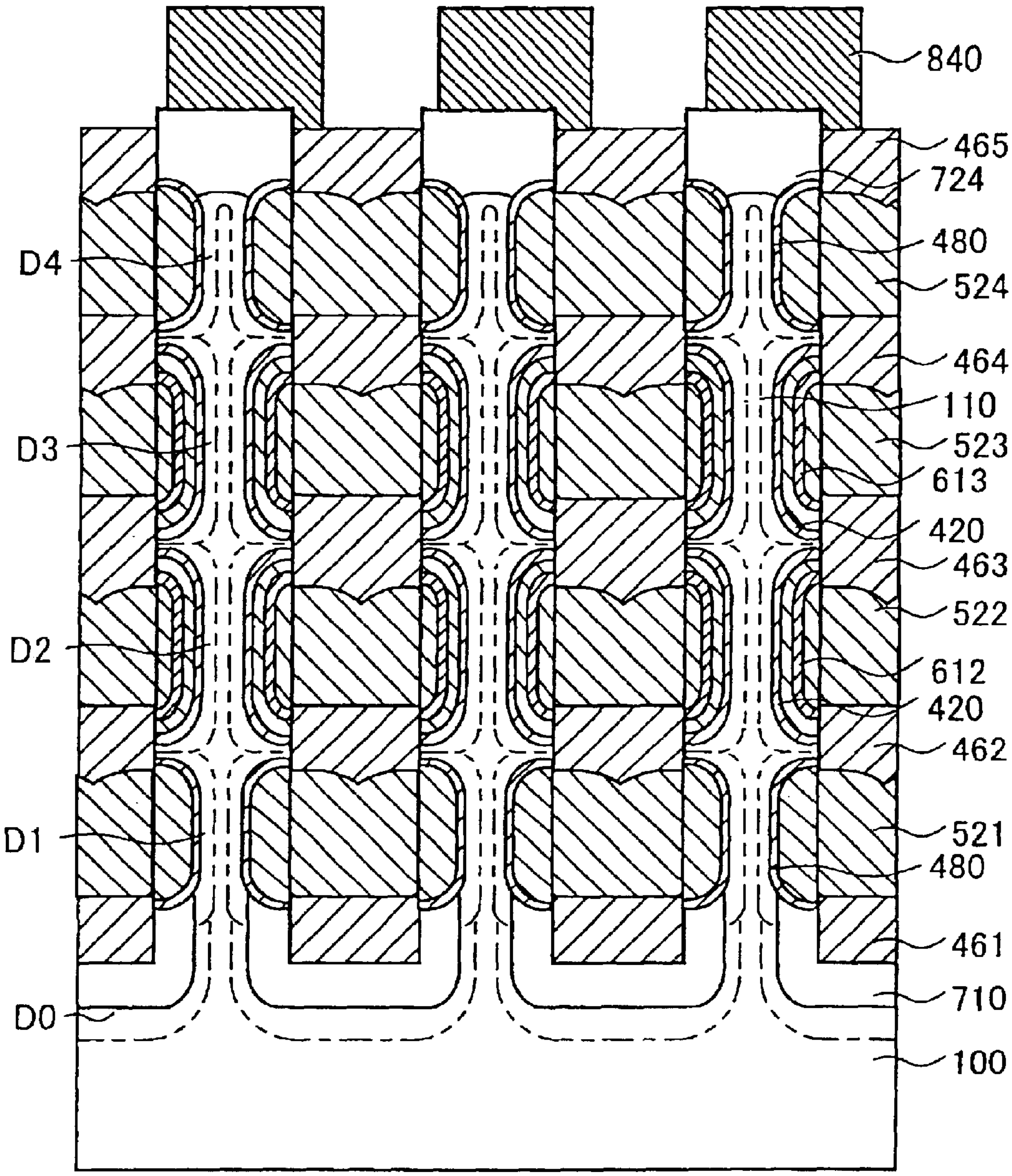
Figure 147:
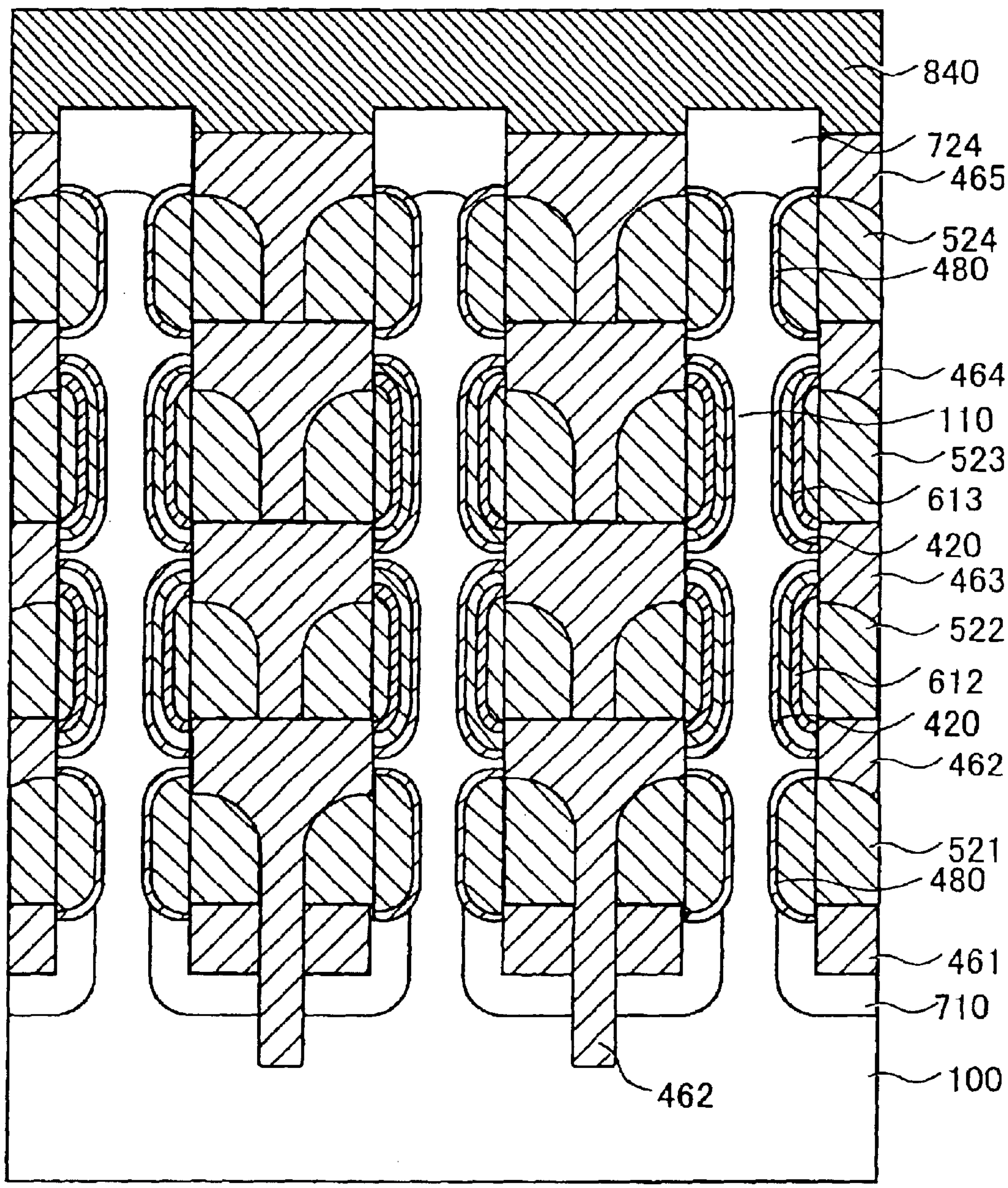

FIGS. 146 and 147 are sectional views taken on line A–A' and line B–B', respectively, in FIG. 1 which is a cross-sectional view illustrating a memory cell array of an EEPROM.

In this production example, a semiconductor memory as explained in Production example 1 is formed, in which intervals between the memory transistors and the selection gate transistors are set about 20 to 40 nm and diffusion layers 721 to 723 are not introduced (FIG. 146 and FIG. 147).

Thus, the same effect as obtained by Production Example 1 can be obtained.

At data reading, as shown in FIG. 146, depletion layers and inversion layers shown in D1 to D4 are electrically connected with gate electrodes 521, 522, 523 ad 524, thereby an electric current path is established between the impurity diffusion layers 710 and 725. In this situation, voltages to be applied to the gates 521, 522, 523 and 524 are so set that whether the inversion layers are formed in D2 and D3 or not is selected depending on the state of the charge storage layers 512 and 513, thereby the data can be read from the memory cell.

Figure 148:
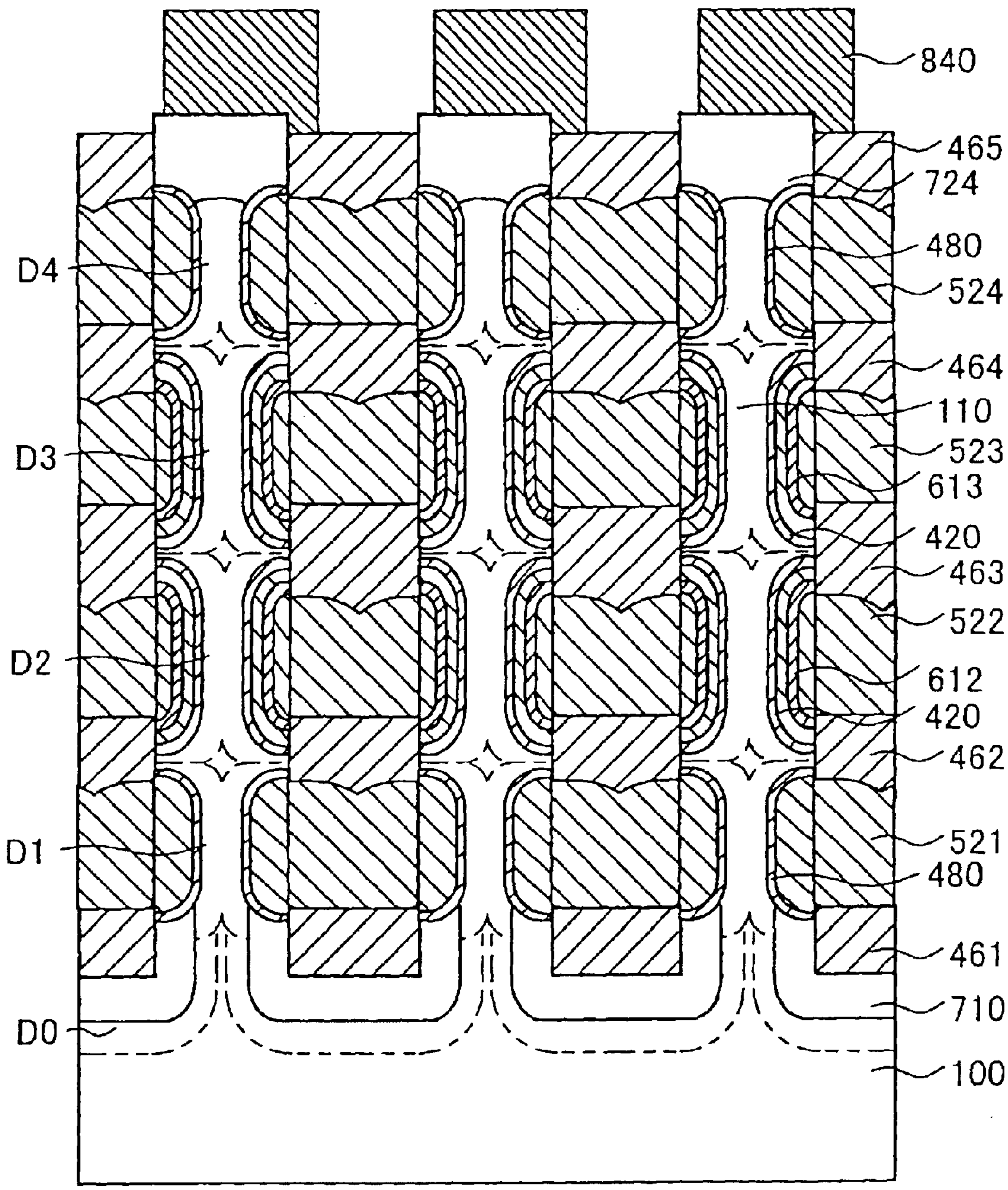

It is desired that the distribution of D1 to D4 is completely depleted as shown in FIG. 148. In this case, it is expected that back-bias effect is suppressed in the memory cells and the selection gate transistors, which is effective in reducing variations in device performance.

Further, by adjusting the amount of impurities to be implanted or controlling the thermal treatment, the expansion of the impurity diffusion layers 710 to 724 is suppressed and a height of the island-like semiconductor layers 110 is reduced, which contributes to the cost reduction and the suppression of variations during the production process.

PRODUCTION EXAMPLE 7

Explanation is given of an example of production process for obtaining a structure in which the direction of the first wiring layer is parallel to the direction of the fourth wiring layer.

Figure 149:
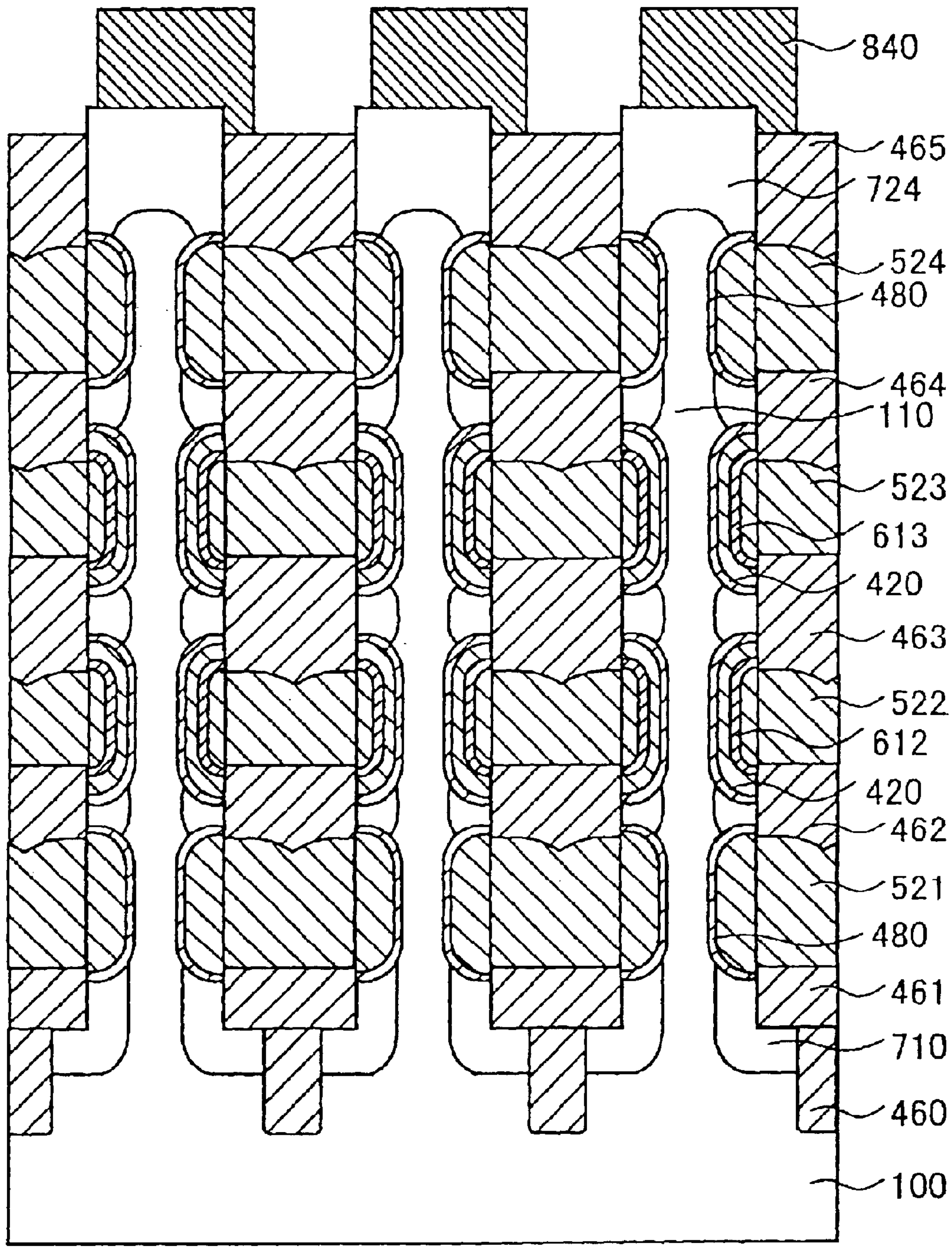
Figure 150:
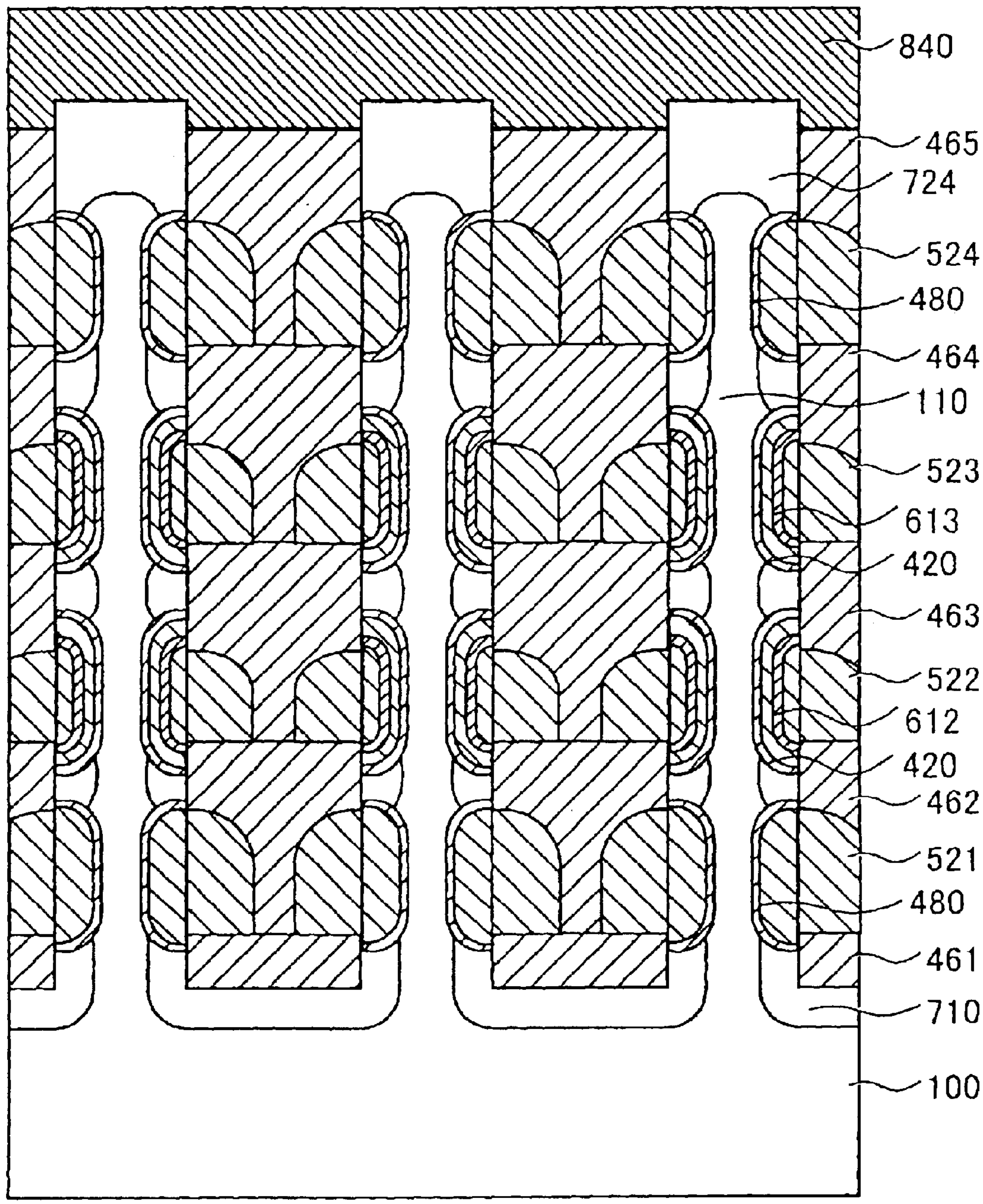

Such a semiconductor memory is produced by the following production process. FIG. 149 and FIG. 150 are sectional views taken on line A–A' and line B–B', respectively, in FIG. 1 which is a cross-sectional view illustrating a memory cell array of an EEPROM.

In this production example, the first wiring layers continuously formed in the direction of A–A', which are explained in Production example 1, are anisotropically etched by using a patterned resist and separated by burying a silicon oxide film 460 as an eighth insulating film. Further, the step of separating the impurity diffusion layer 710 in the self-alignment manner, which is performed after the formation of the polysilicon film 521 (the second conductive film) in the form of a sidewall spacer, is omitted so that the first wiring layers continuously formed in the direction of B–B' are not separated.

Thereby, a semiconductor memory is realized in which the first wiring layer is parallel to the fourth wiring layer and which has a memory function according to the state of a charge in the charge storage layer which is the floating gate made of the polysilicon film (FIG. 149 and FIG. 150).

PRODUCTION EXAMPLE 8

Figure 151:
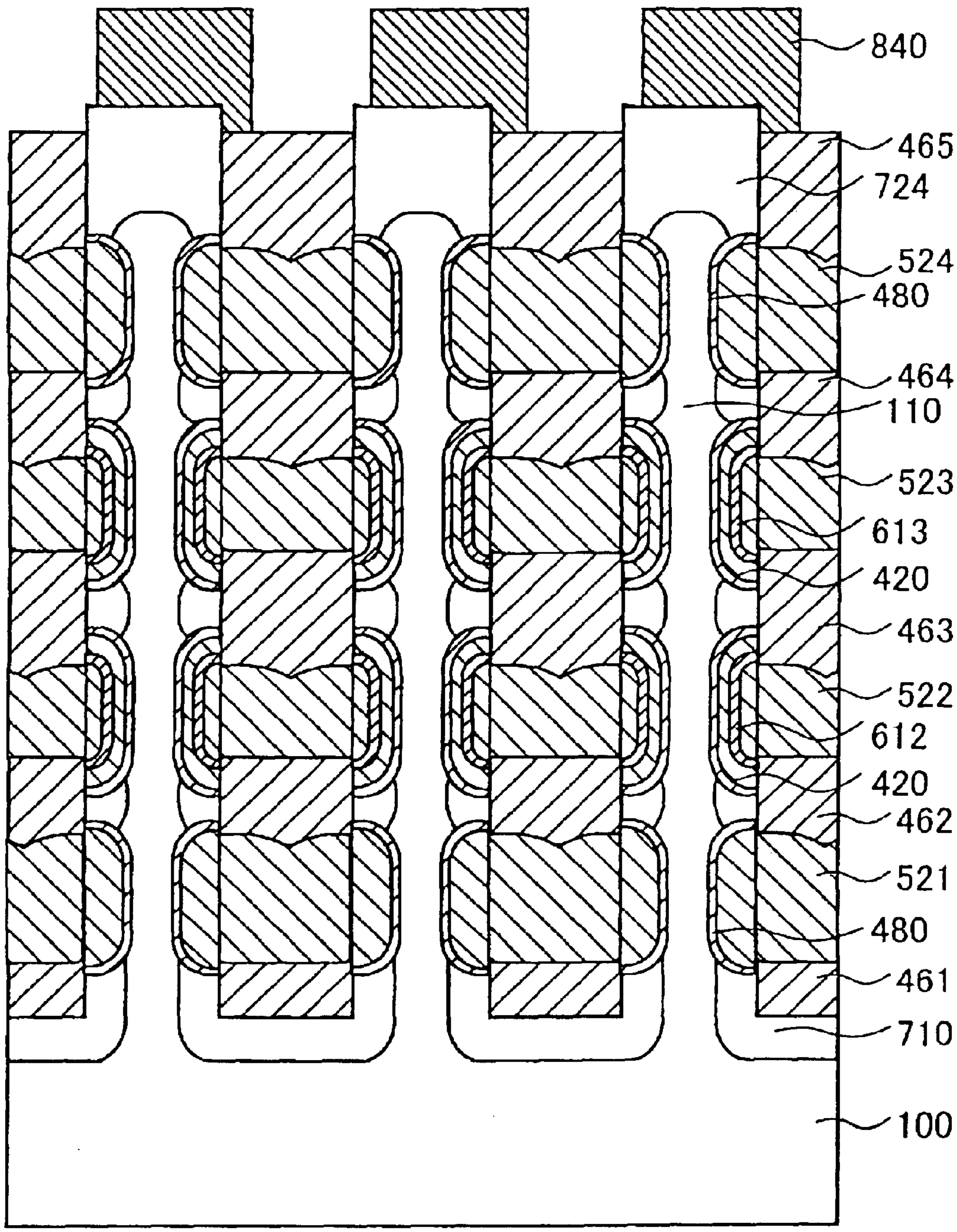
Figure 152:
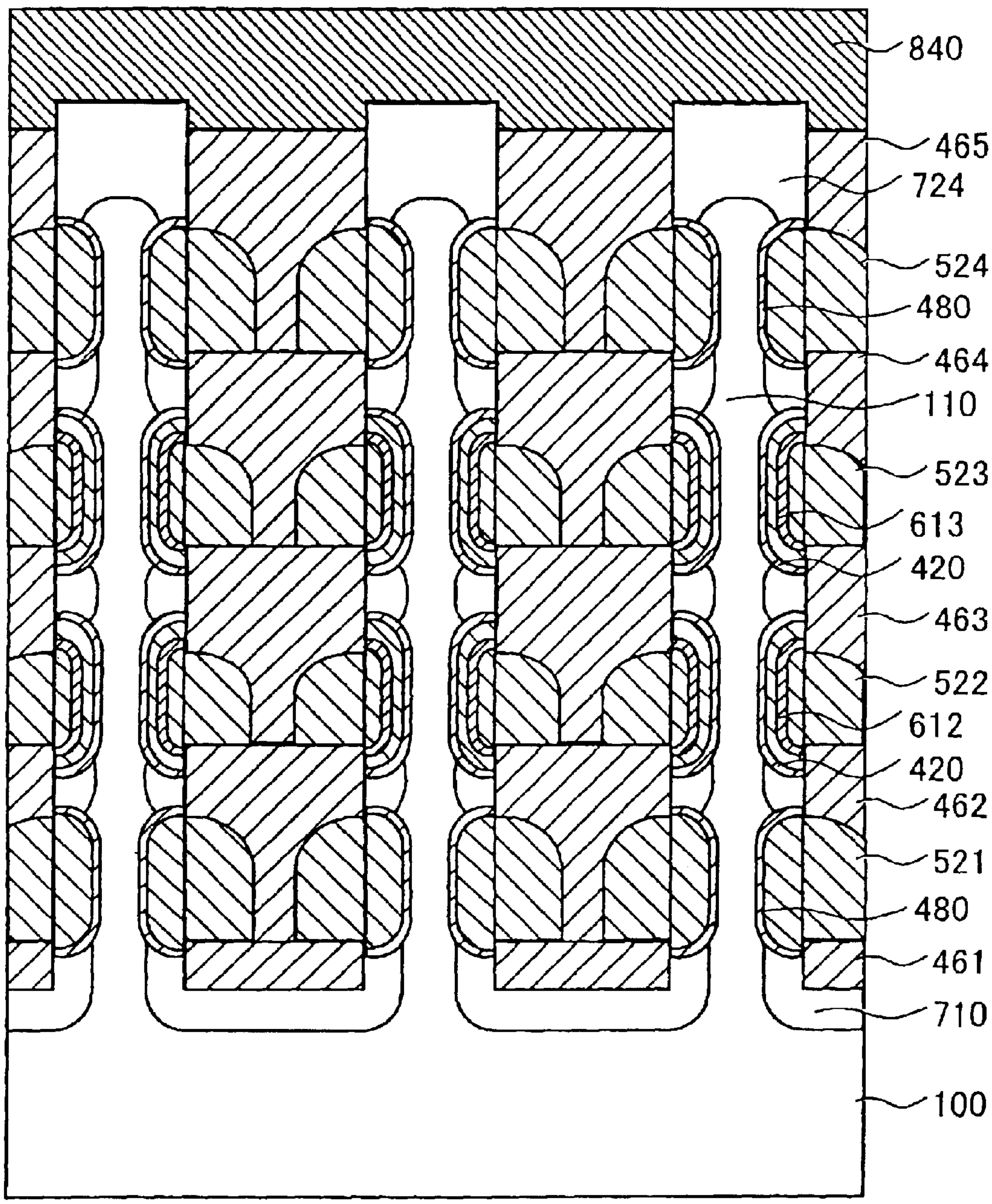

Explanation is given of an example of production process for obtaining a structure in which the first wiring layer is electrically common to the memory cell array. FIG. 151 and FIG. 152 are sectional views taken on line A–A' and line B–B', respectively, in FIG. 1 which is a cross-sectional view illustrating a memory cell array of an EEPROM.

In this production example, the second trench 220 as explained in Production example 1 is not formed in the semiconductor substrate 100. By omitting the steps regarding the formation of the second trench 220 from Production example 1, a semiconductor memory is realized in which at least the first wiring layer in the array is not divided but is common and which has a memory function according to the state of a charge in the charge storage layer which is the floating gate made of the polysilicon film as the first conductive film (FIG. 151 and FIG. 152).

PRODUCTION EXAMPLE 9

Explanation is given of an example of production process for producing a semiconductor memory in which the memory transistors and the selection gate transistors have different gate lengths in a vertical direction. FIGS. 153 and 154 and FIGS. 155 and 156 are sectional views taken on line A–A' and line B–B', respectively, in FIG. 1 which is a cross-sectional view illustrating a memory cell array of an EEPROM.

Figure 153:
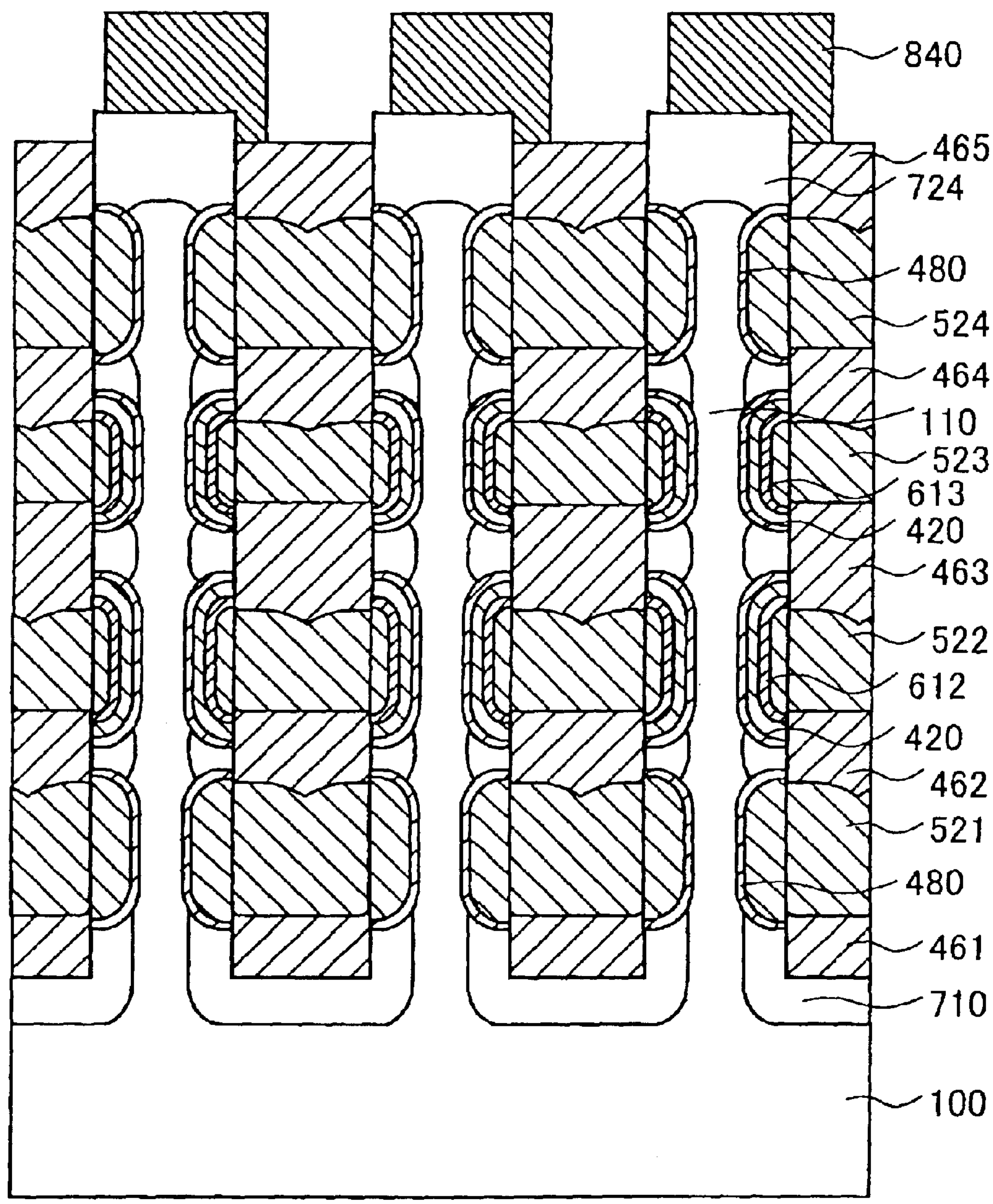
Figure 154:
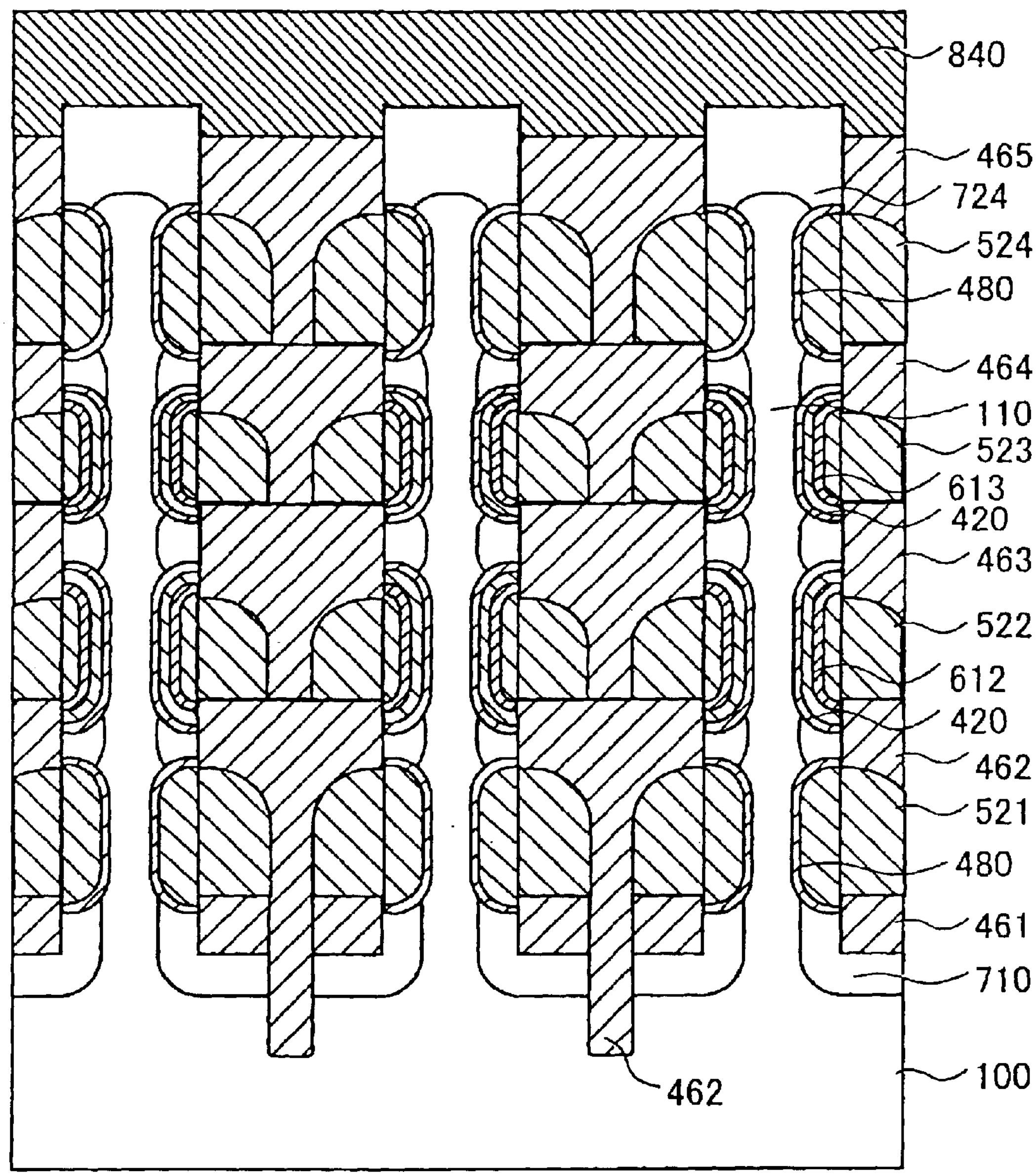

As regards the lengths of the polysilicon films 511 to 514 (the first conductive film) to be the memory cell gates or the selection gates in the direction vertical to the semiconductor substrate 100, the polysilicon films 512 and 513 to be the memory cell gates may have different lengths as shown in FIG. 153 and FIG. 154.

Figure 155:
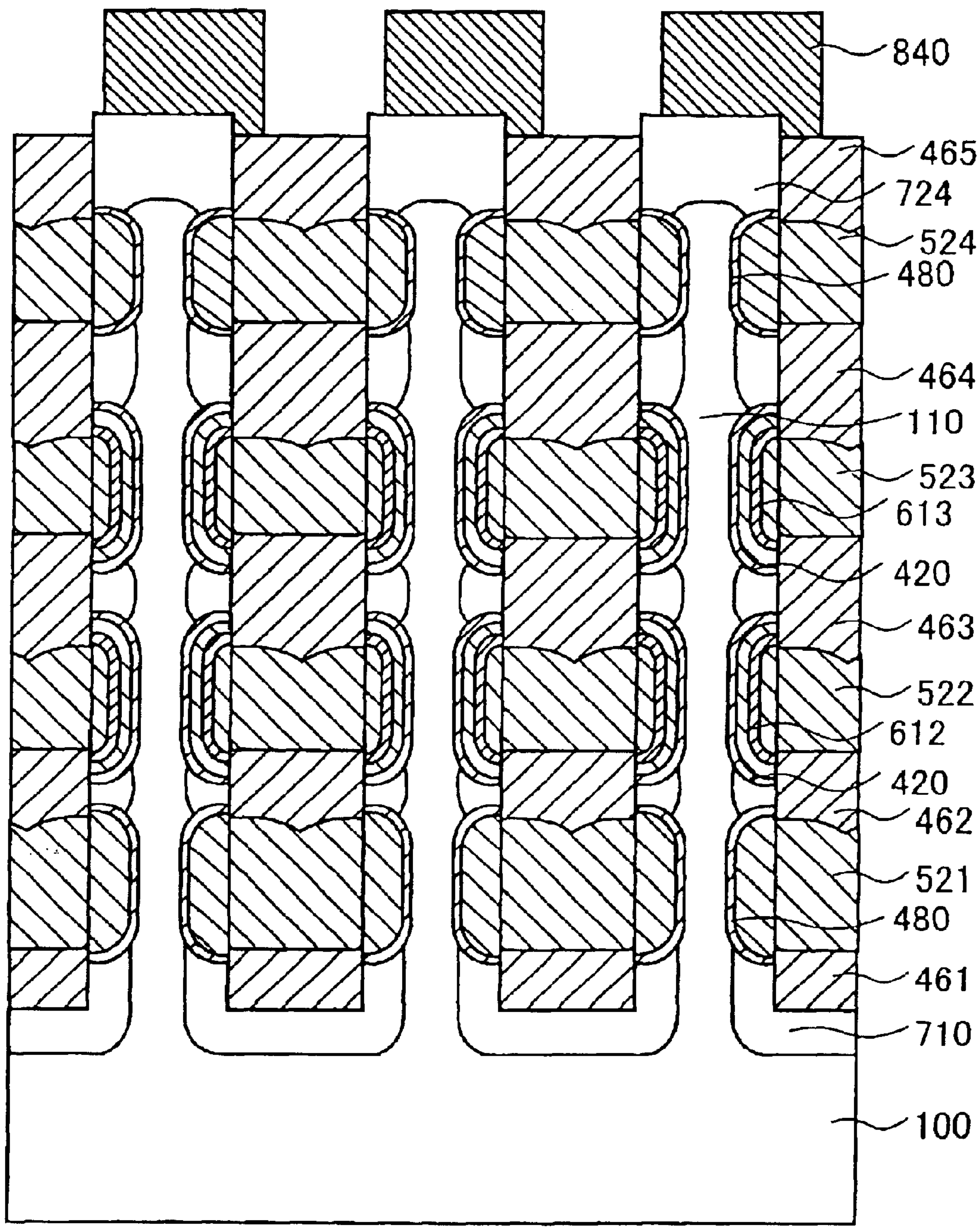
Figure 156:
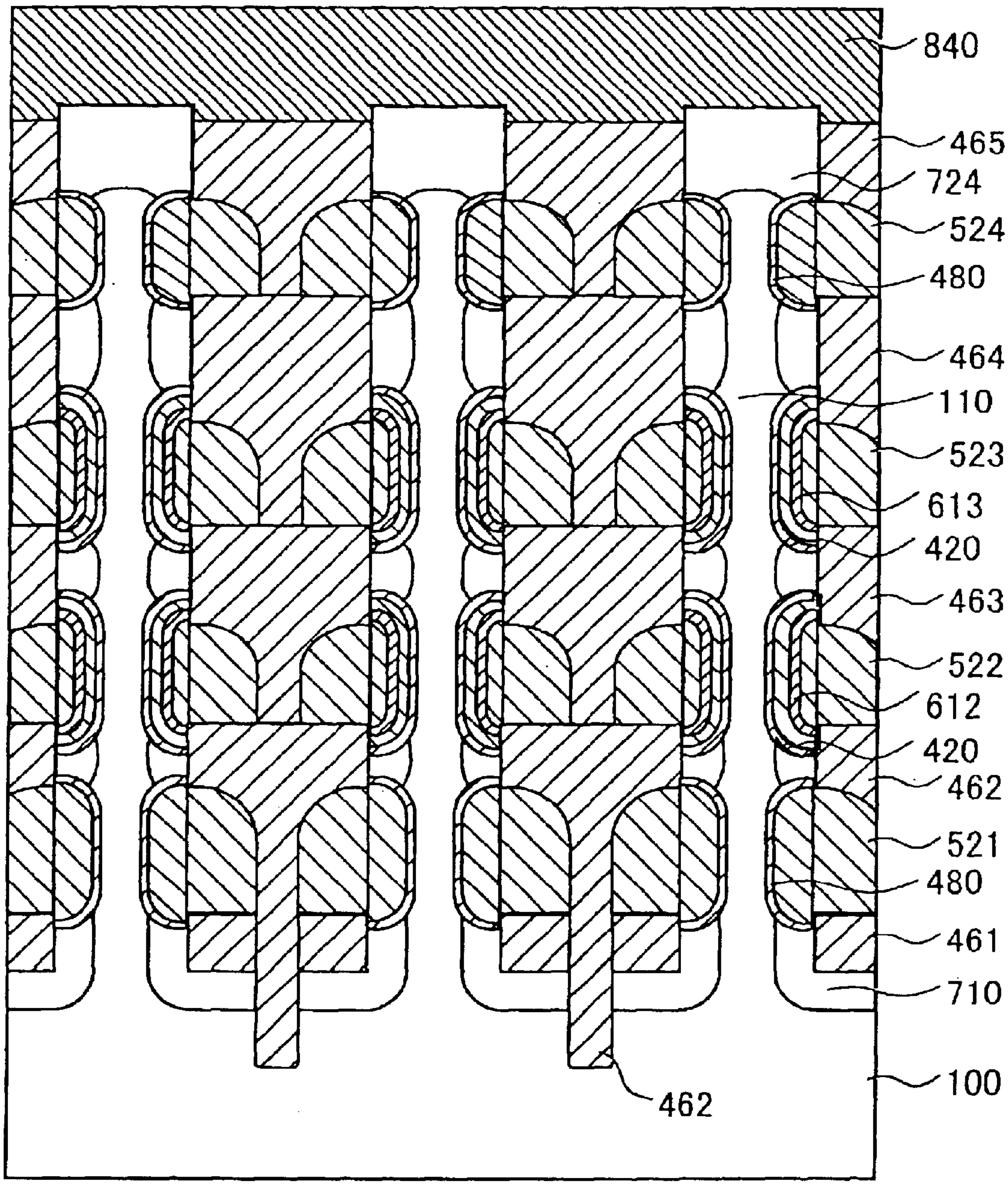

Further, as shown in FIG. 155 and FIG. 156, the polysilicon films 521 and 524 (the second conductive film) to be the selection gates may have different lengths. The polysilicon films 521 to 524 need not have the same vertical lengths.

It is rather desirable to change the gate lengths of the transistors in consideration that a threshold is reduced due to the back-bias effect from the substrate at data reading from the memory cells connected in series in the island-like semiconductor layers 110. At this time, since the height of the first and second conductive films, i.e., the gate lengths, can be controlled stage by stage, the memory cells are controlled easily.

PRODUCTION EXAMPLE 10

Explanation is given of an example of production process for producing a semiconductor memory in which the island-like semiconductor layer 110 is in an electrically floating state due to the impurity diffusion layer 710. FIGS. 157 and 158 and FIGS. 159 and 160 are sectional views taken on line A–A' and line B–B', respectively, in FIG. 1 which is a cross-sectional view illustrating a memory cell array of an EEPROM.

In this production example, a semiconductor memory is realized by changing the arrangement of the impurity diffusion layers 710 and 721 to 723 from that in the semiconductor memory explained in Production example 1.

Figure 157:
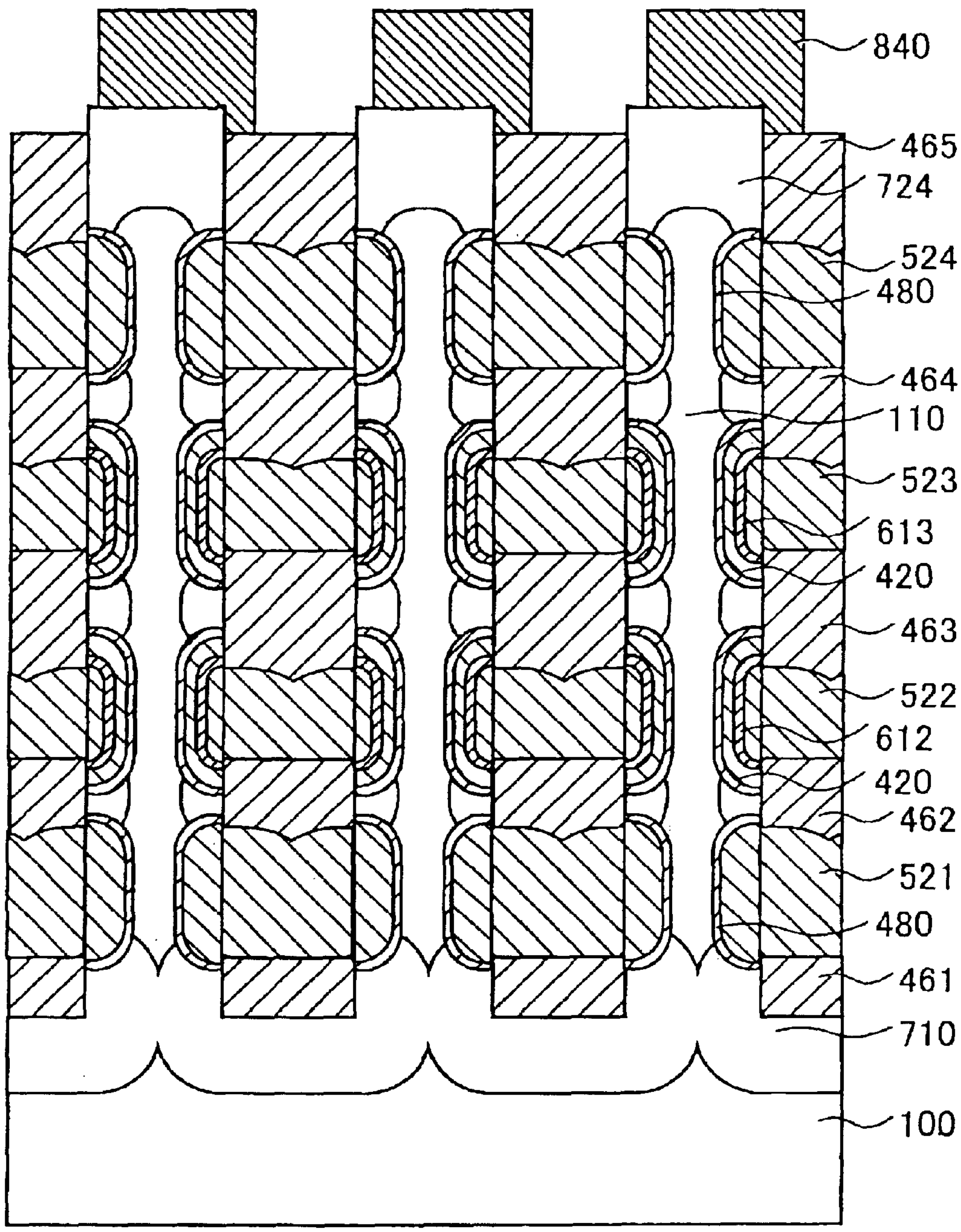
Figure 158:
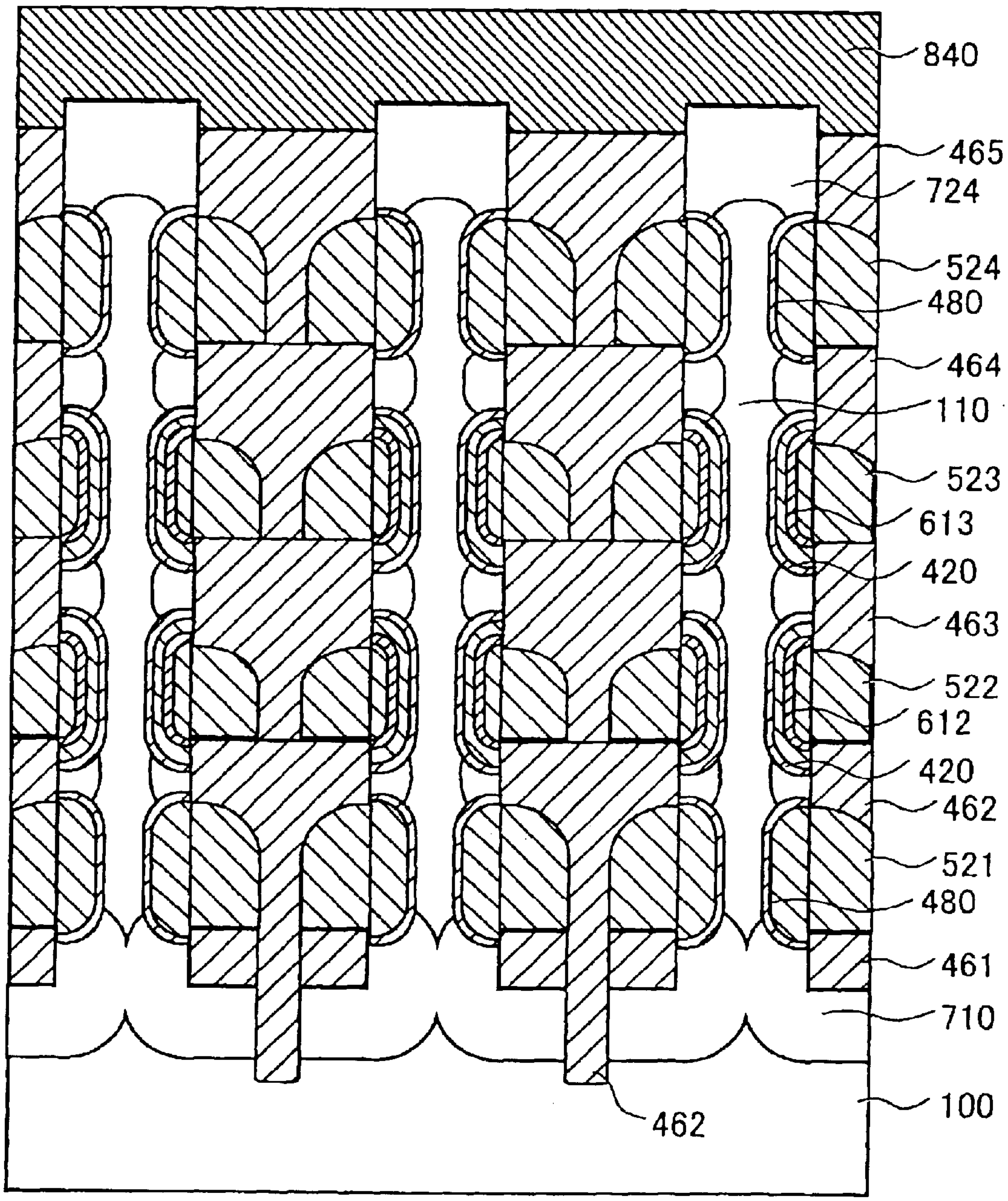

As shown in FIGS. 157 and 158, the impurity diffusion layer 710 may be disposed such that the semiconductor substrate 100 is not electrically connected with the island-like semiconductor layer 110.

Figure 159:
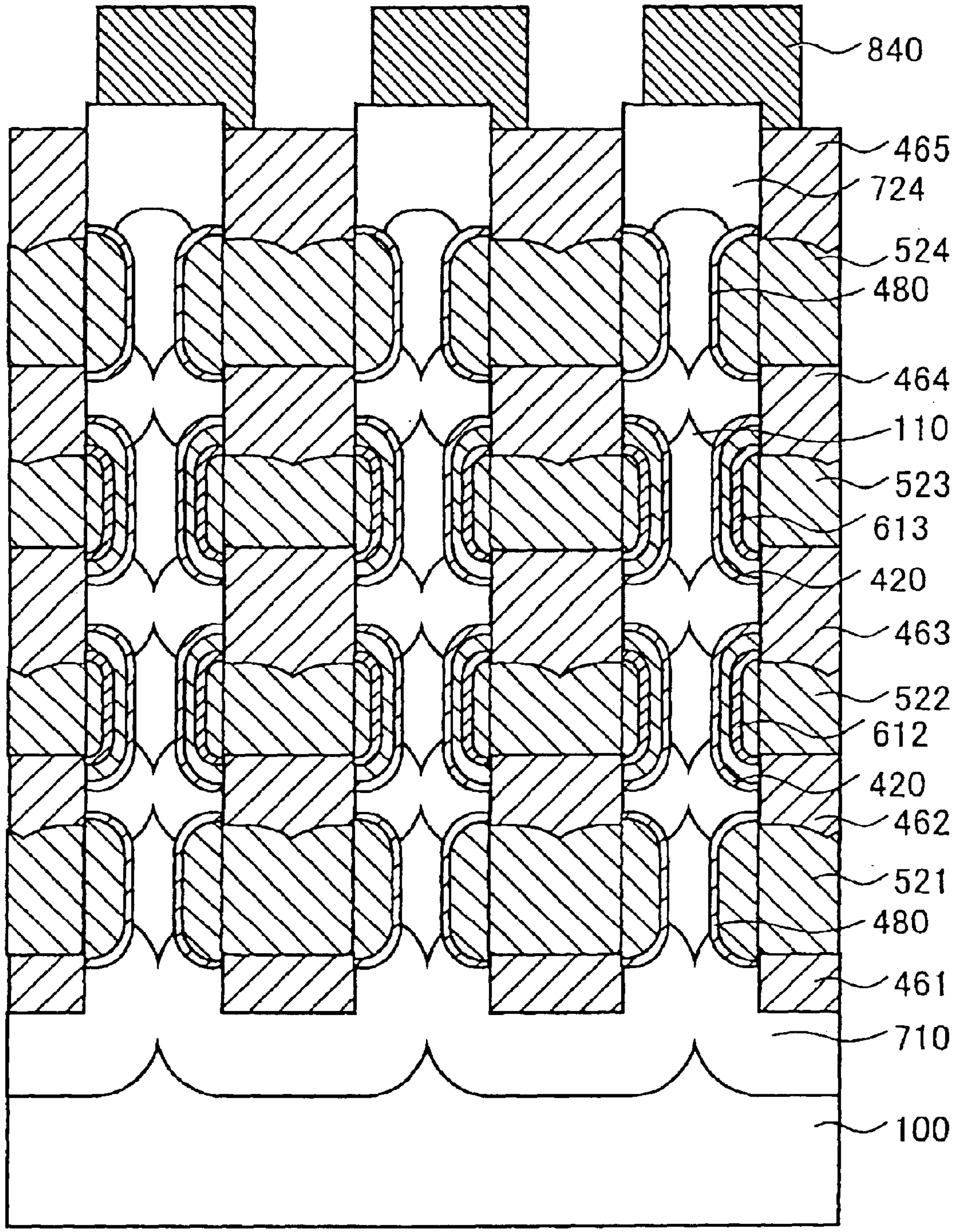
Figure 160:
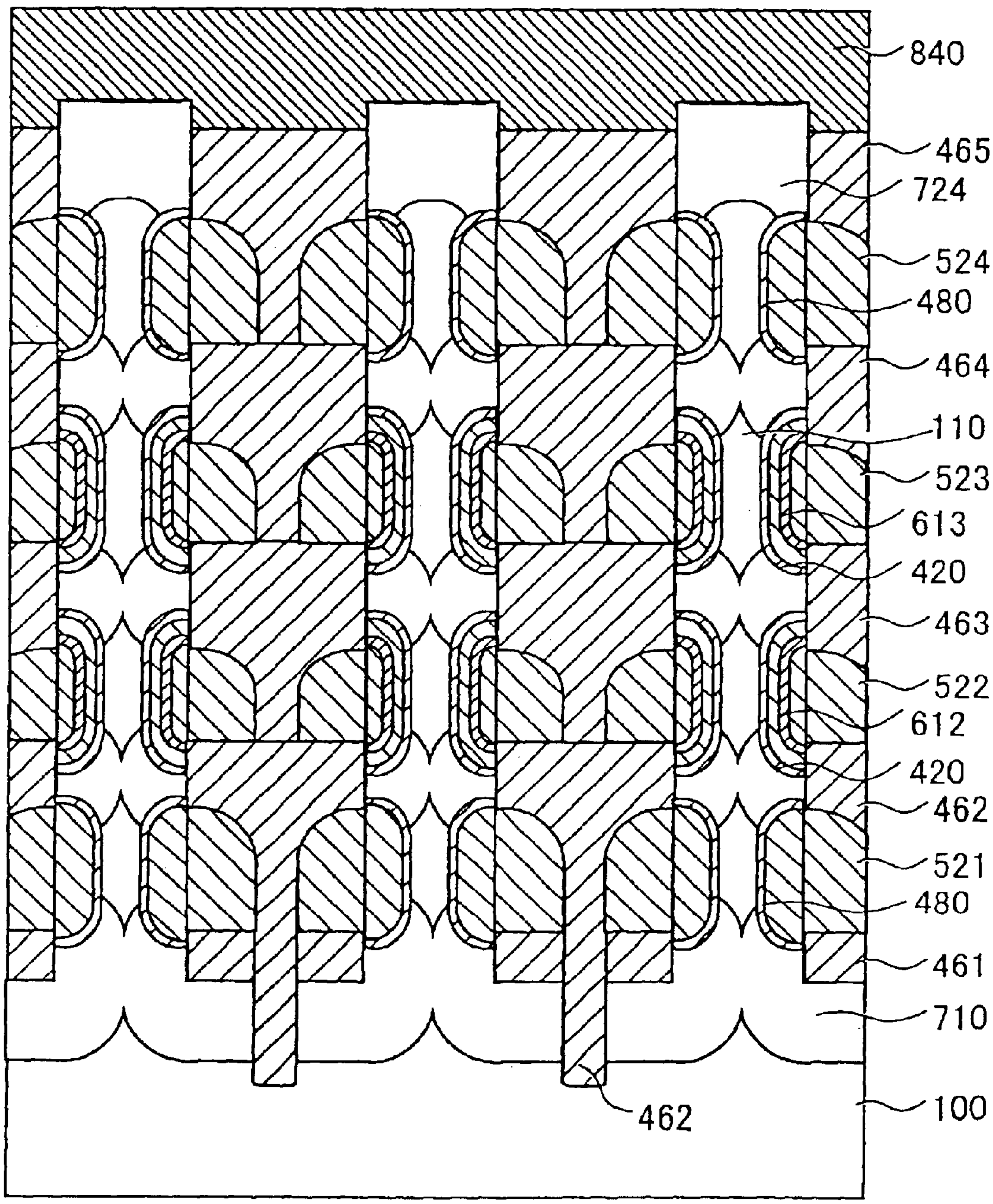

Further, as shown in FIGS. 159 and 160, the impurity diffusion layers 721 to 723 may be disposed such that active regions of the memory cells and the selection gate transistors arranged in the island-like semiconductor layers 110 are electrically insulated. Alternatively, the impurity diffusion layers 710 and 721 to 723 may be disposed such that the same effect can be obtained by the depletion layer which is expanded due to a potential applied at reading, erasing or writing.

Thus, the same effect as obtained by Production Example 1 is obtained. Further, since the impurity diffusion layers are disposed such that the active regions of the memory cells are in an electrically floating state with respect to the substrate, the back-bias effect from the substrate is prevented. Thereby, the occurrence of variations is prevented with regard to the characteristics of the memory cells owing to decrease of the threshold of the memory cells at reading data. It is desired that the memory cells and the selection gate transistors are completely depleted.

PRODUCTION EXAMPLE 11

Explanation is given of an example of production process for producing a semiconductor memory in which the bottom of the island-like semiconductor layer 110 does not have a simple columnar shape. FIGS. 161 and 162 and FIGS. 163 and 164 are sectional views taken on line A–A' and line B–B', respectively, in FIG. 1 which is a cross-sectional view illustrating a memory cell array of an EEPROM.

Figure 161:
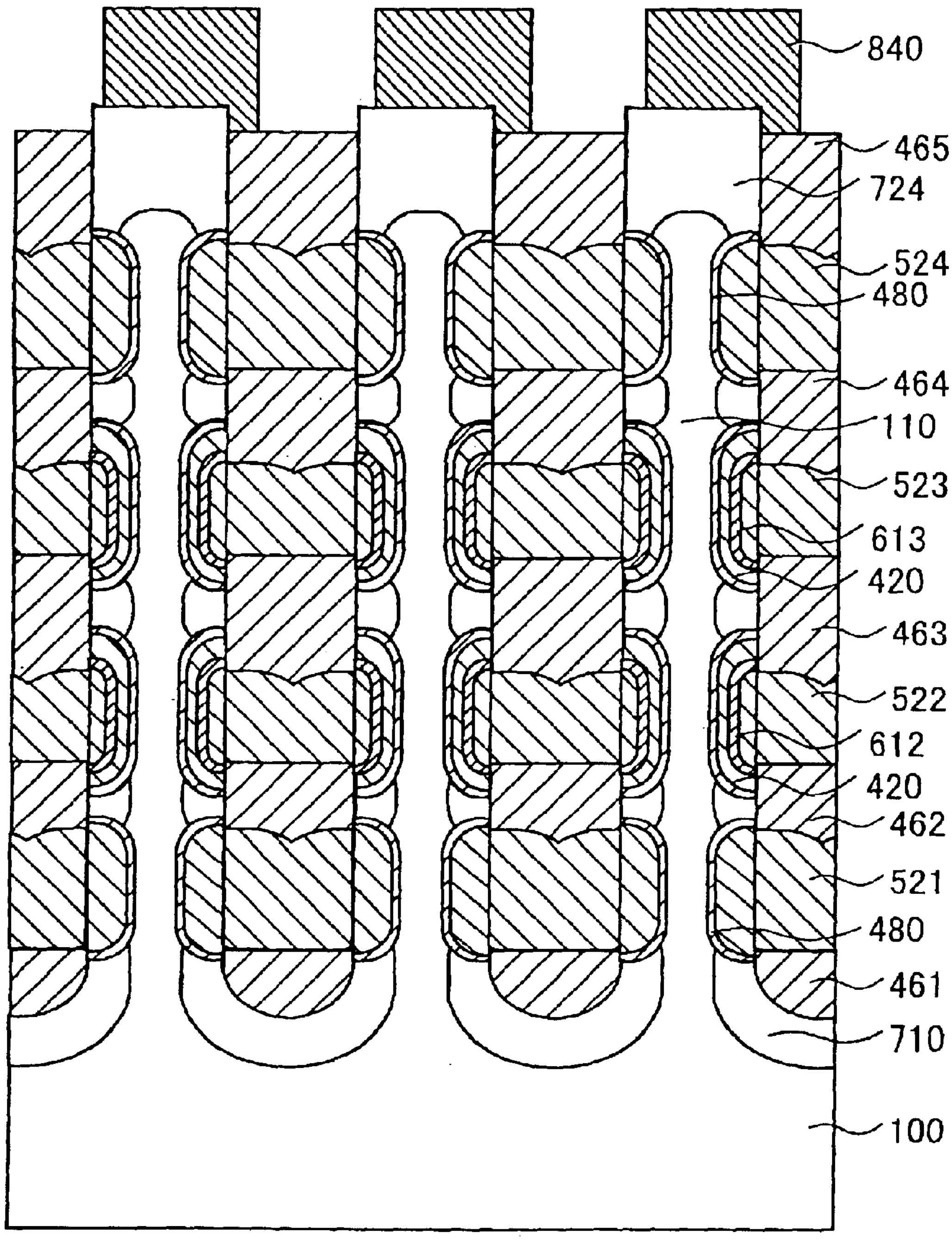
Figure 162:
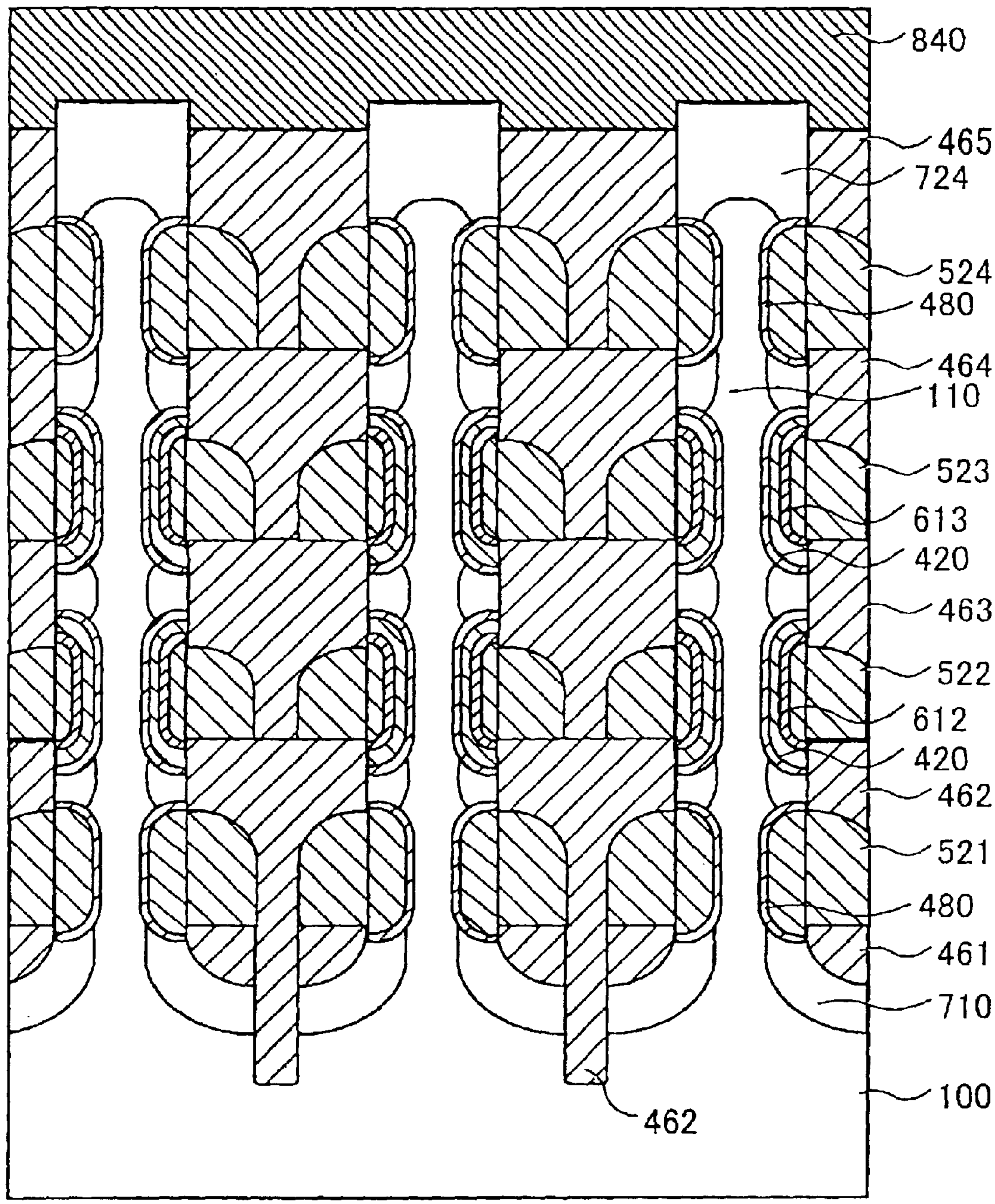

As shown in FIGS. 161 and 162, the first lattice-form trench 210 may have a partially or entirely rounded slant shape at its bottom. The bottom of the polysilicon film 521 to be a second conductive film may or may not reach the slant bottom of the first trench 210.

Figure 163:
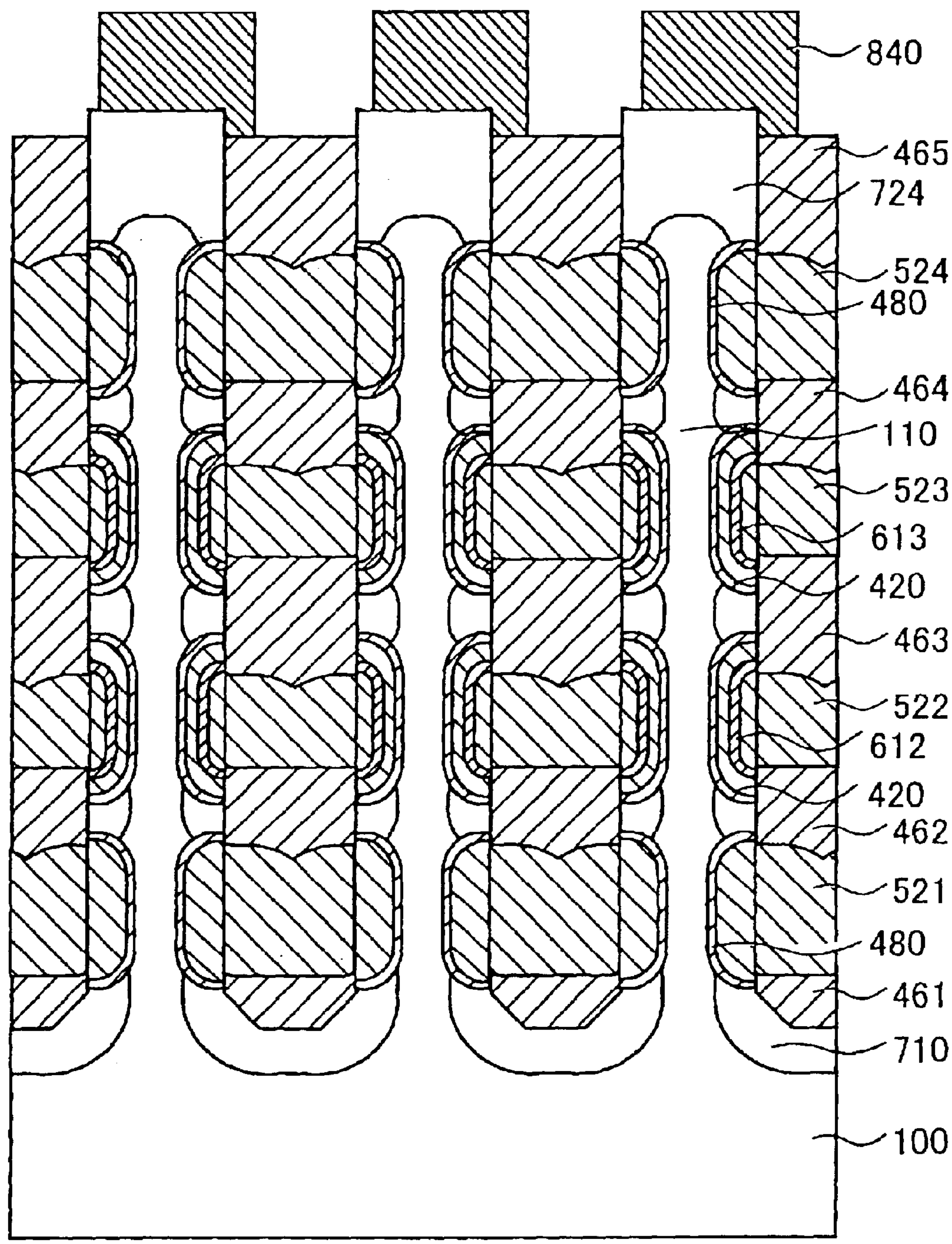
Figure 164:
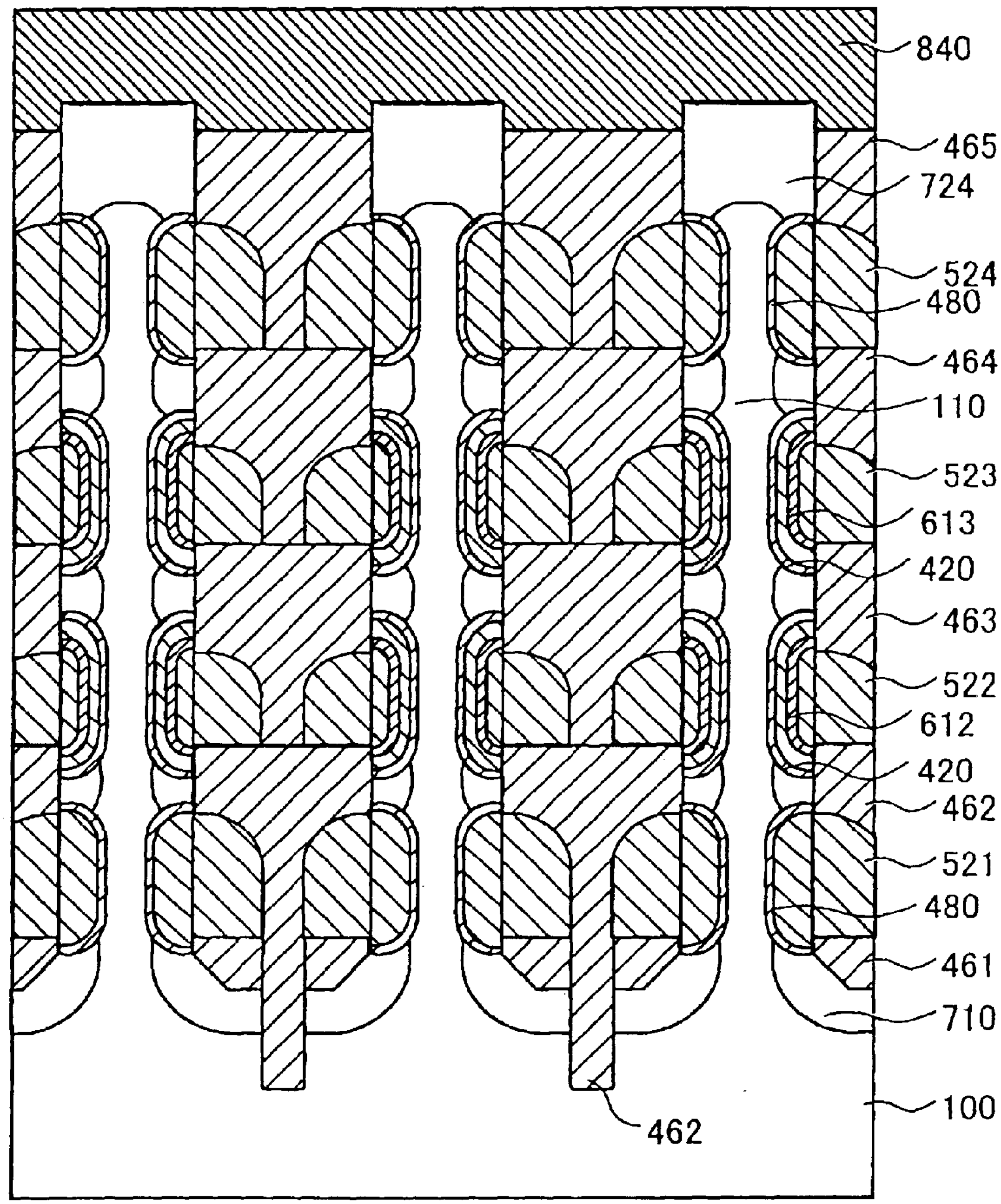

Alternatively, the first lattice-form trench 210 may have a slant shape at its bottom as shown in FIGS. 163 and 164. The bottom of the polysilicon film 521 may or may not reach the slant bottom of the first trench 210.

PRODUCTION EXAMPLE 12

Explanation is given of an example of production process for producing a semiconductor memory in which the bottom of the island-like semiconductor layer 110 does not have a simple columnar shape. FIGS. 165 and 166 and FIGS. 167 and 168 are sectional views taken on line A–A' and line B–B', respectively, in FIG. 1 which is a cross-sectional view illustrating a memory cell array of an EEPROM.

Figure 165:
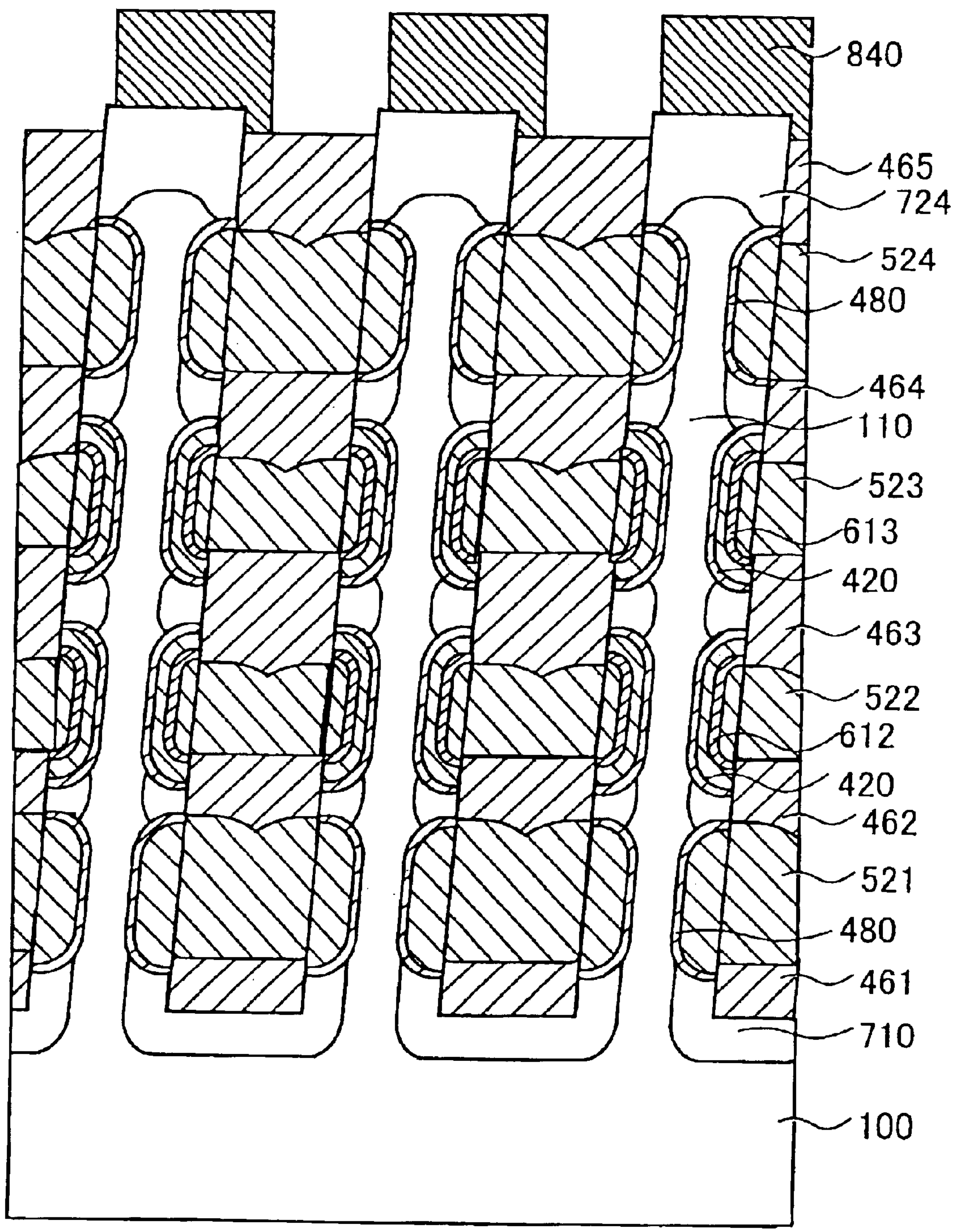
Figure 166:
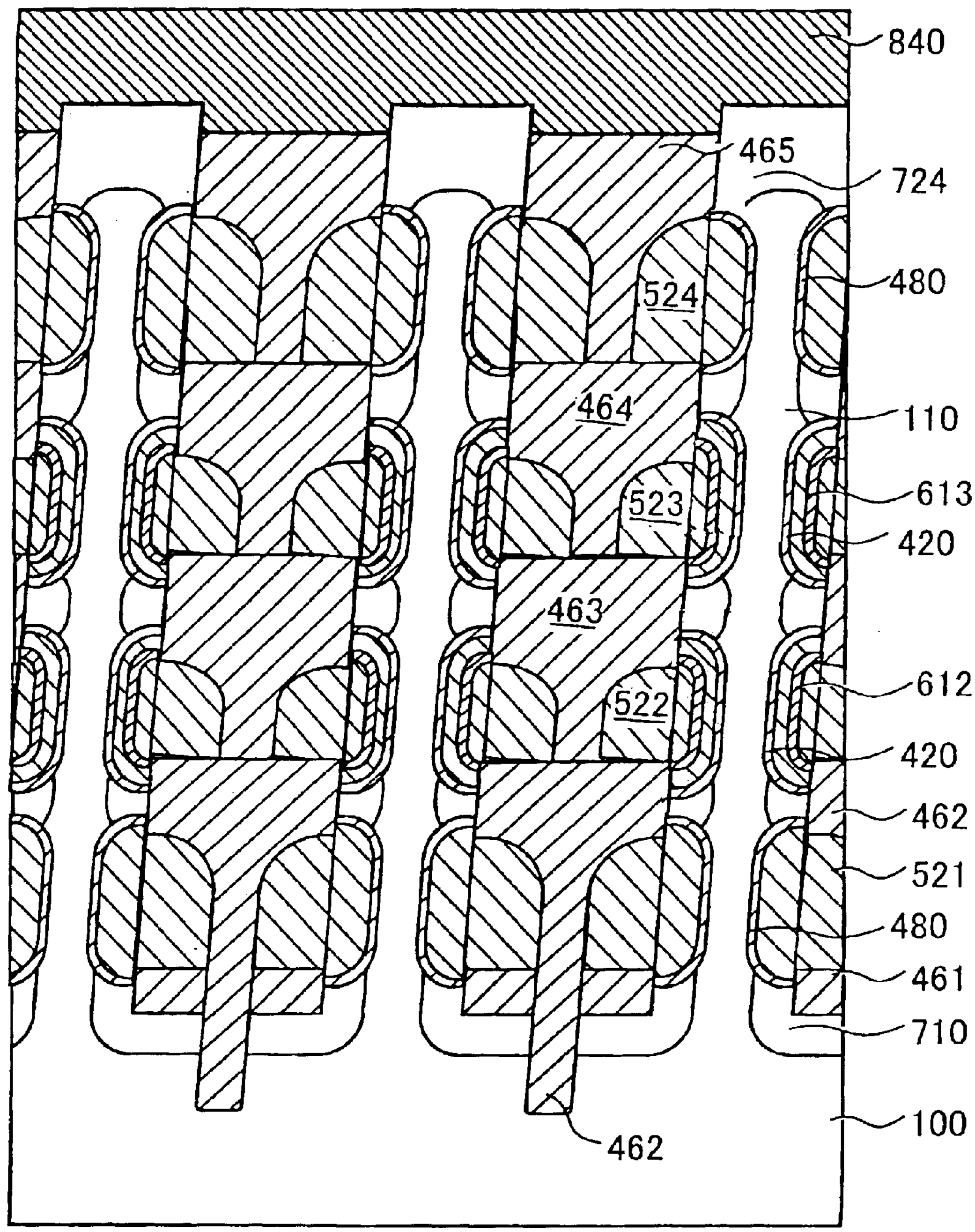

The first trench 210 may be formed by reactive ion etching such that the top and the bottom of the island-like semiconductor layer 110 may be shifted in a horizontal direction as shown in FIG. 165 and FIG. 166.

Figure 167:
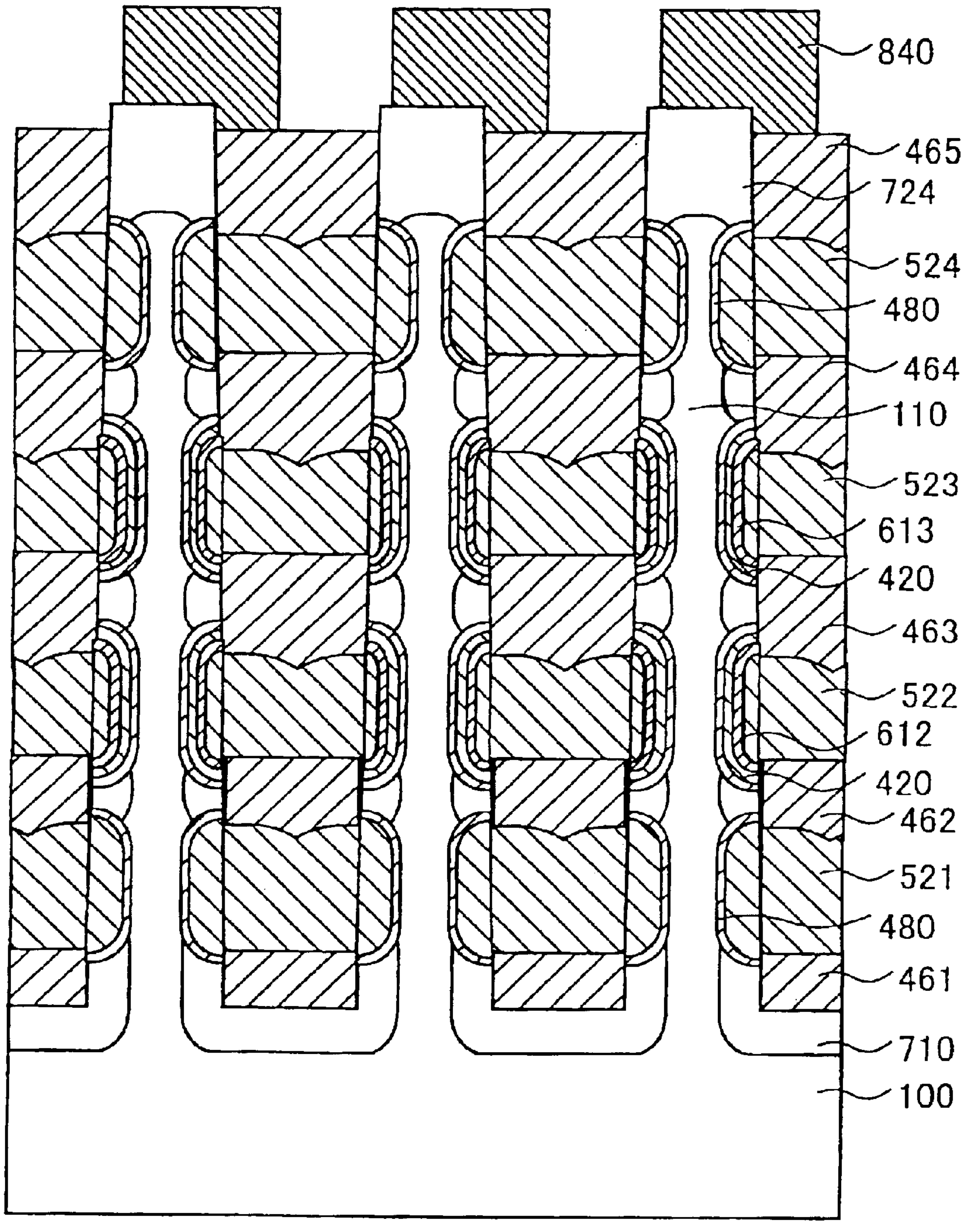
Figure 168:
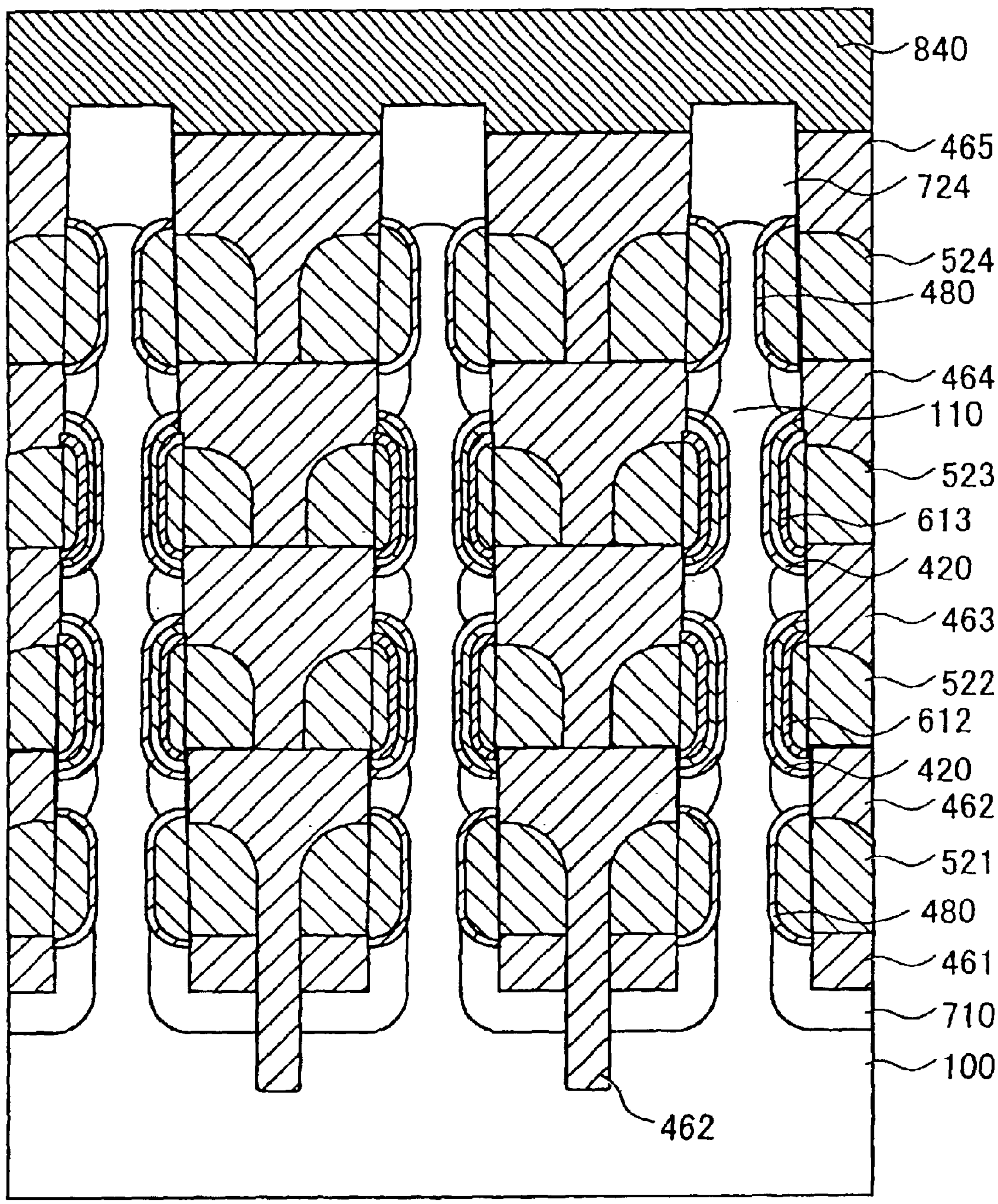
Figure 169:
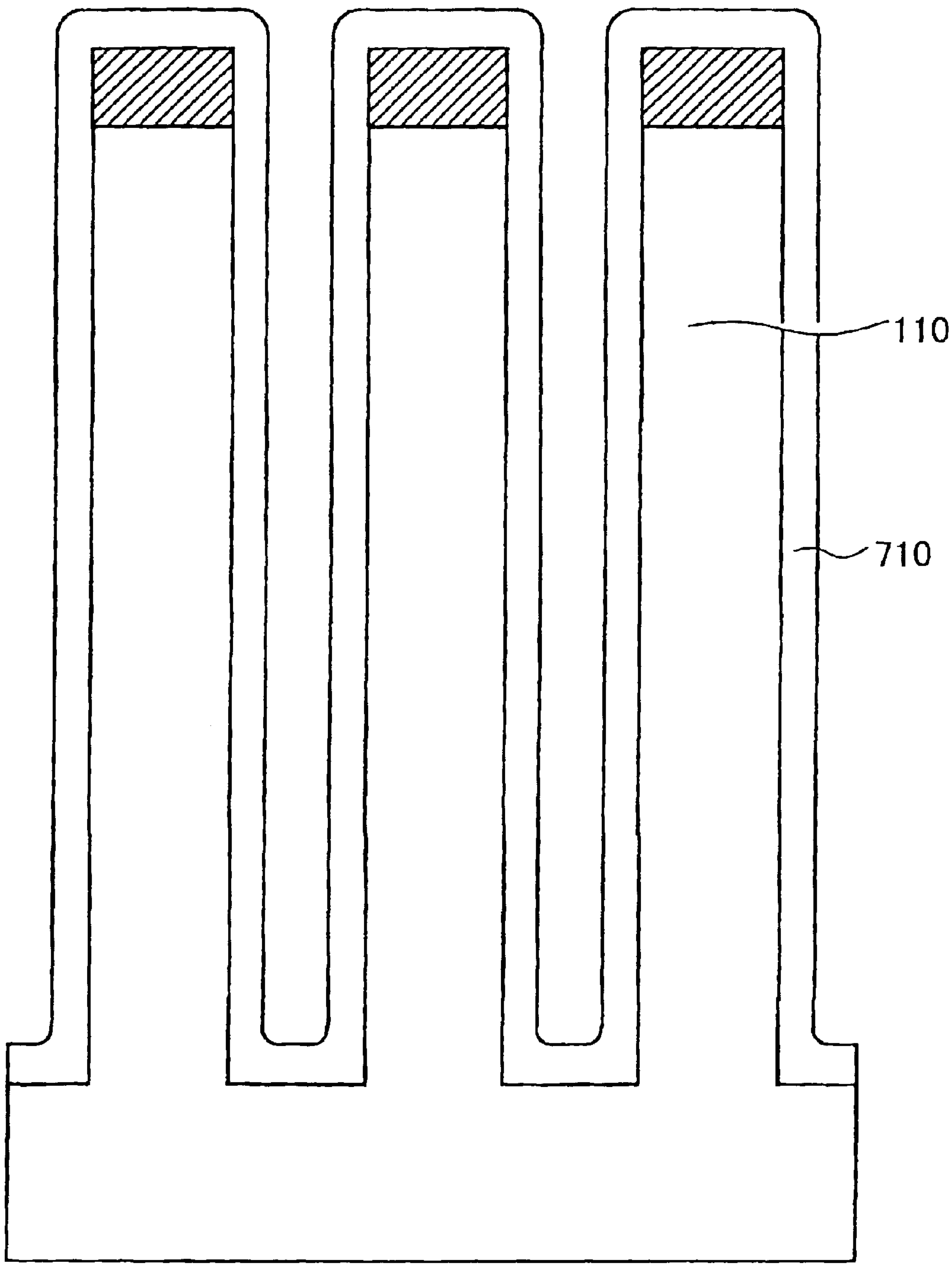

Also, the top and the bottom of the island-like semiconductor layer 110 may have different outward shapes as shown in FIG. 167 and 168.

For example, in the case where the island-like semiconductor layer 110 is circular in cross-sectional view as shown in FIG. 1, the island-like semiconductor layer 110 is an inclined column in FIGS. 165 and 166 and is a truncated cone in FIGS. 167 and 168.

The shape of the island-like semiconductor layer 110 is not particularly limited so long as the memory cells can be disposed in series in the direction vertical to the semiconductor substrate 100.

PRODUCTION EXAMPLE 13

Explanation is given of an example of production process for producing a semiconductor memory in which the diffusion layer is not formed by ion implantation but an N-type semiconductor layer is formed by epitaxial growth. FIGS. 169 and 170 and FIGS. 171 and 172 are sectional views taken on line A–A' and line B–B', respectively, in FIG. 1 which is a cross-sectional view illustrating a memory cell array of an EEPROM.

Figure 170:
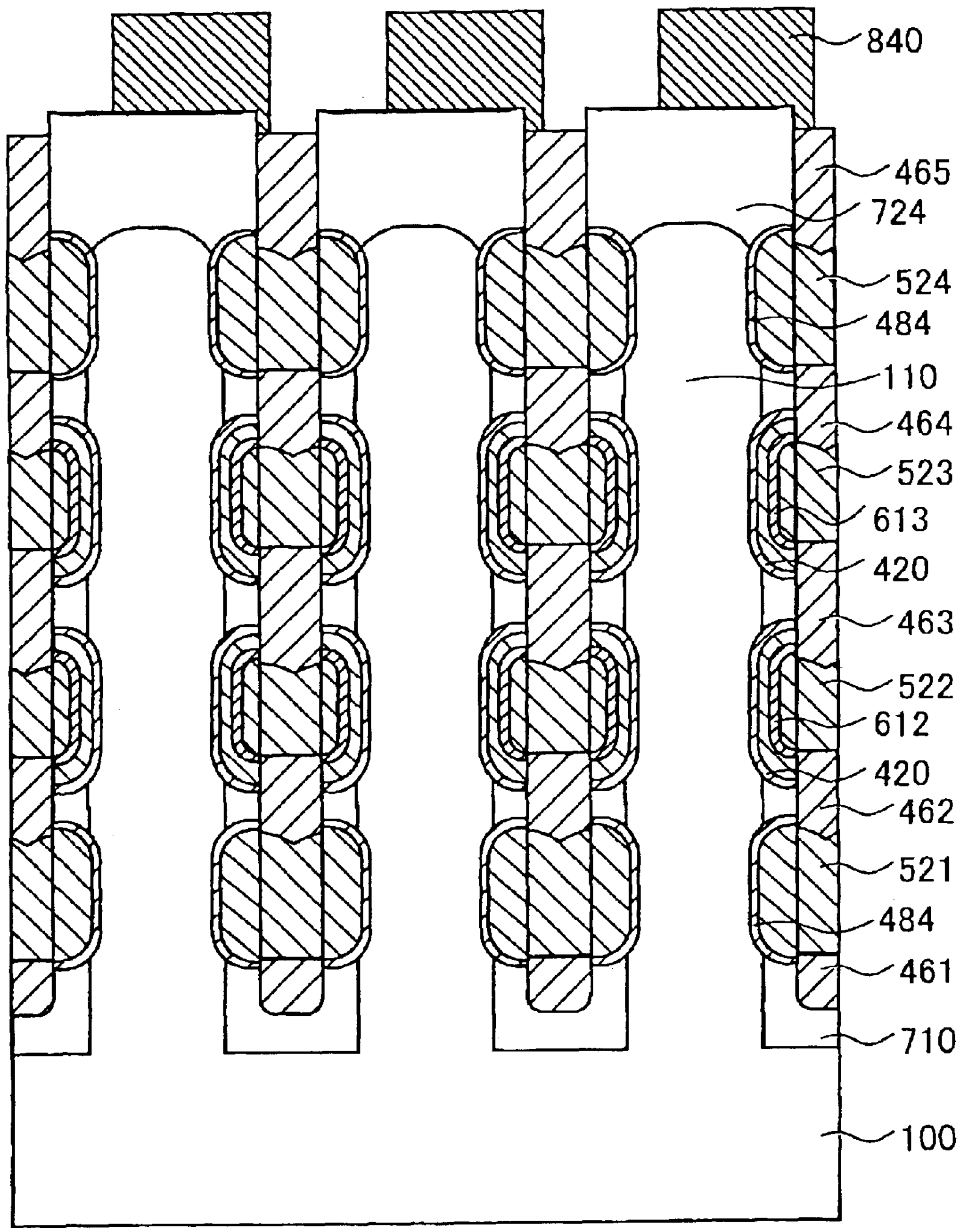
Figure 171:
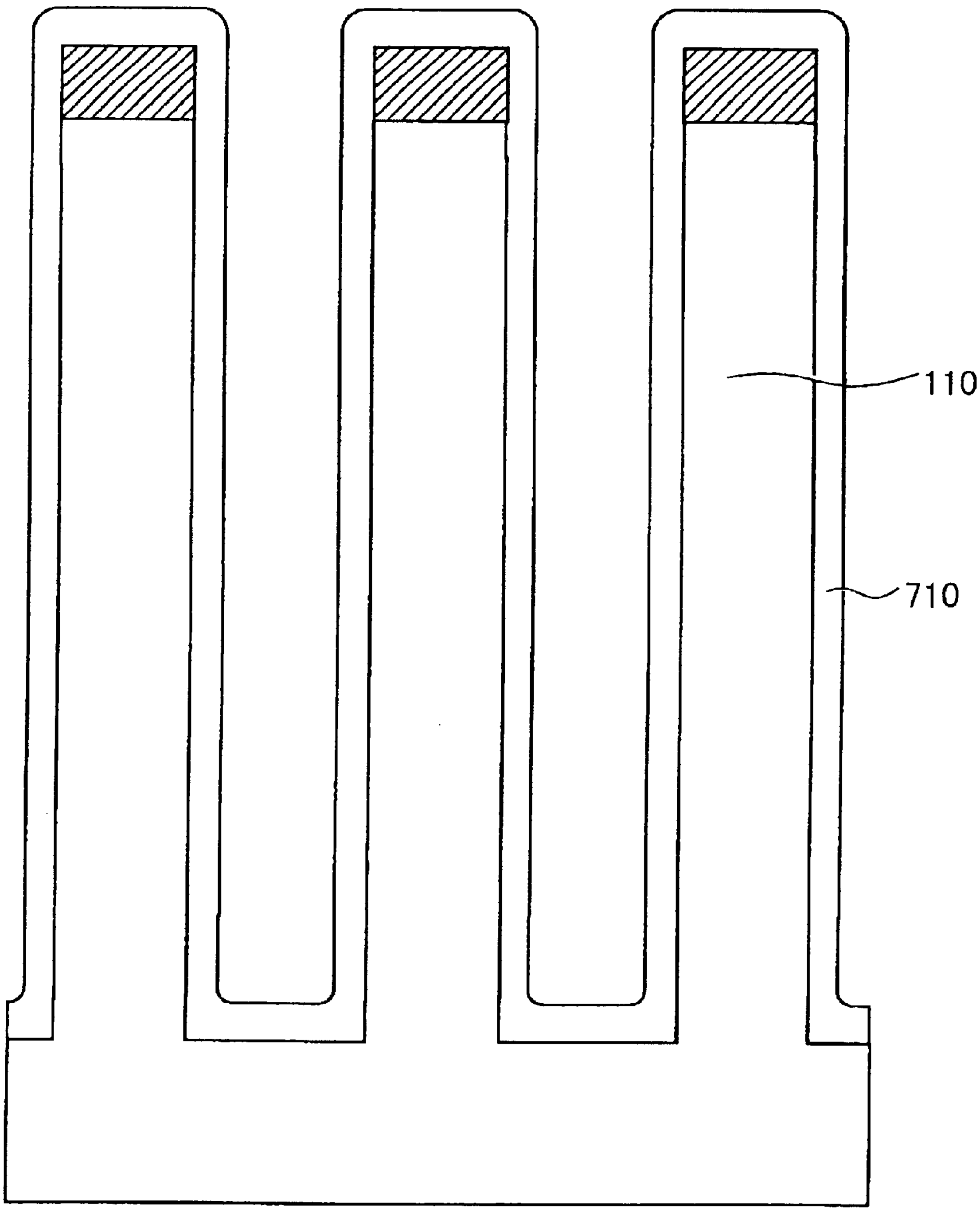
Figure 172:
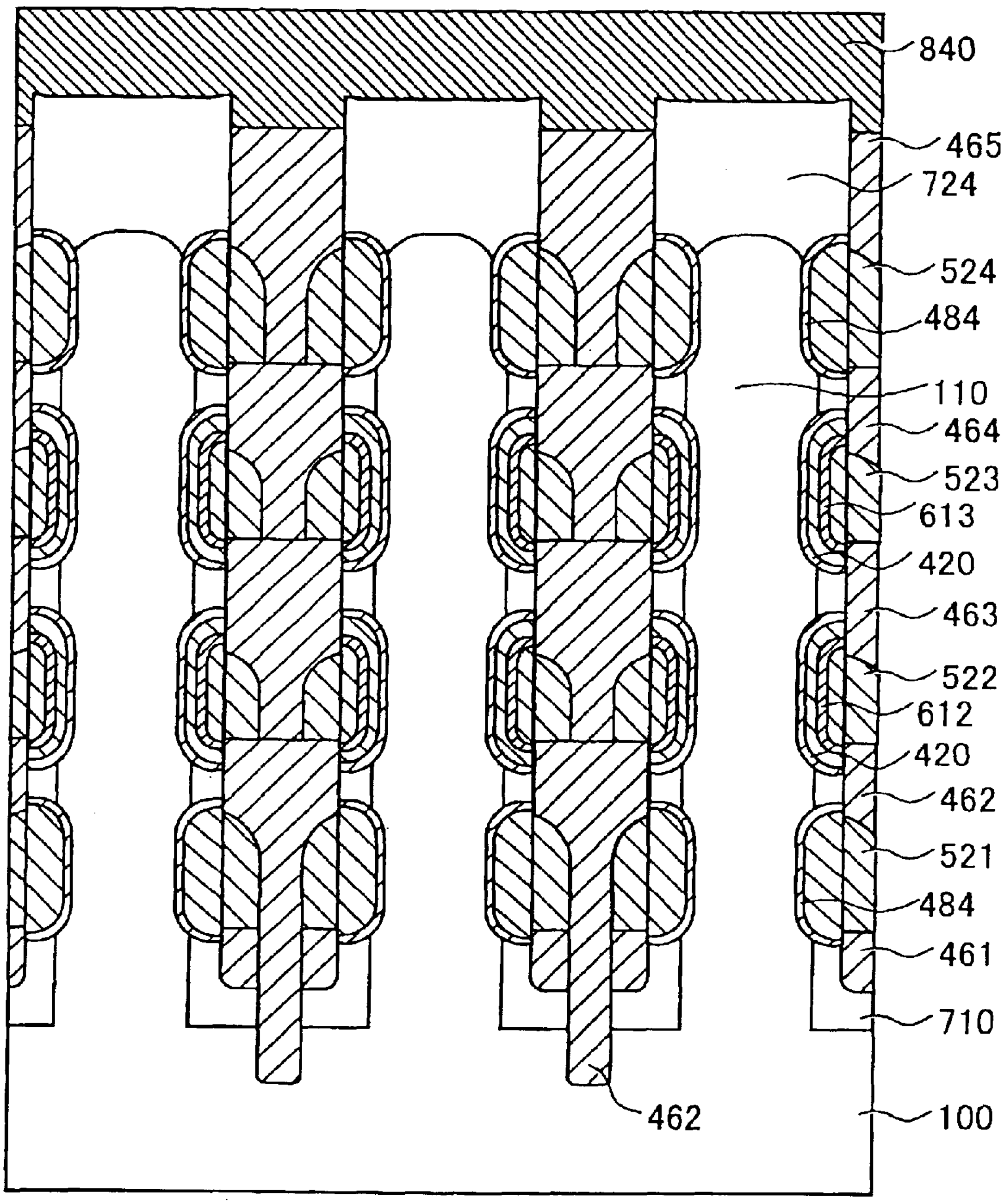
Figure 173:
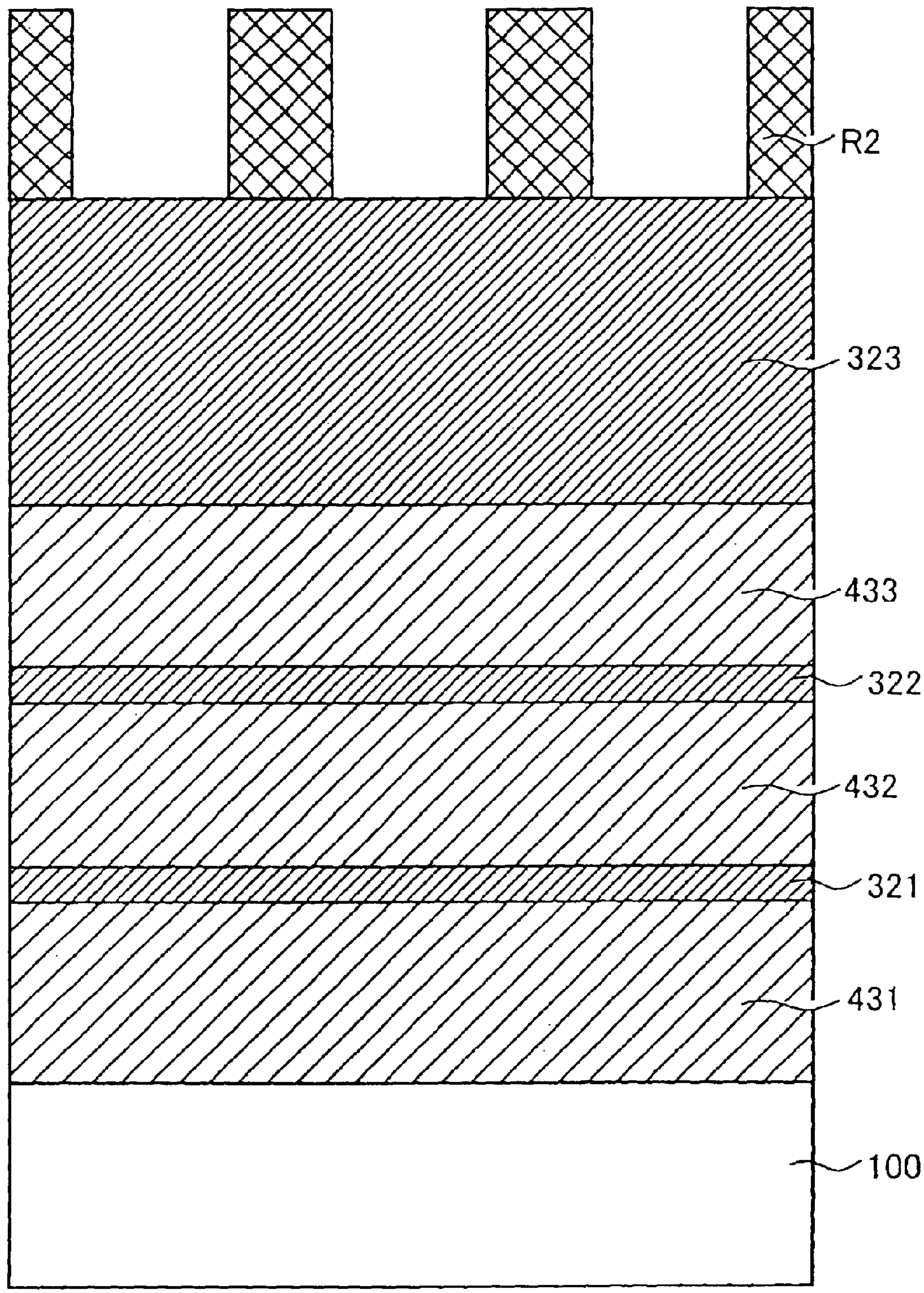

In this production example, a semiconductor memory is formed in the same manner as in Production example 1 except that an N-type semiconductor layer 710 is epitaxially grown to a thickness of 10 to 100 nm after the first trench 210 is formed (FIG. 169 and FIG. 171) and the ion implantation for forming the diffusion layer is omitted (FIG. 170 and FIG. 172).

Thus, the diffusion layer is separated simultaneously with the formation of the silicon oxide film 450 (the seventh insulating film) by thermal oxidation. Since the ion implantation is not utilized, occurrence of variations is prevented with regard to the device performance due to difficulty in controlling the ion implantation performed at a small angle. Further, in a structure in which the floating gates, the control gate and the selection gate are formed in the island-like semiconductor layer 110 as in the semiconductor memory explained in Production example 1, sufficient intervals between the island-like semiconductor layers 110 arranged in matrix are established simply by intervals required for placing the wiring layers of the control gates and the selection gates. Therefore, for example, in view of the case where the island-like semiconductor layer 110 is formed by using a resist R1 patterned at the minimum photoetching dimension and a sidewall spacer is formed to decrease the intervals between the island-like semiconductor layers 110 so that the diameter of the island-like semiconductor layers 110 increases, the process of this production example easily realizes the structure without using the sidewall spacer.

Further, as required, ion implantation may be carried out with respect to the top or the bottom of the island-like semiconductor layer 110 to adjust the impurity concentration.

In this production example, the diffusion layer may desirably be an N-type semiconductor layer formed by epitaxial growth. However, any kind of diffusion layer may be used as long as it serves as a conductive film, for example, a polysilicon film may be used.

PRODUCTION EXAMPLE 14

In a semiconductor memory to be produced in this production example, a region for forming at least one recess on the sidewall of the pillar-form island-like semiconductor layer is determined in advance by a layered film made of plural films, and thereafter, the island-like semiconductor layer in the pillar form is formed by selective epitaxial growth in a hole-form trench opened by using a photoresist mask. Sides of the island-like semiconductor layers make active regions. Tunnel oxide films and floating gates as the charge storage film are formed in the recesses. The island-like semiconductor layers have additional recesses at the top and the bottom thereof and selection gate transistors including gate oxide films and selection gates are arranged therein. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Such a semiconductor memory is produced by the following production process. FIGS. 173 to 181 and FIGS. 182 to 190 are sectional views taken on line A–A' and line B–B', respectively, in FIG. 1 which is a cross-sectional view illustrating a memory cell array of an EEPROM.

First, a silicon oxide film 431 is deposited on a surface of a P-type silicon substrate 100 as a fifth insulating film to a thickness of 50 to 500 nm by CVD. Then, a silicon nitride film 321 is deposited to a thickness of 10 to 100 nm as a fourth insulating film, a silicon oxide film 432 is deposited to a thickness of 50 to 500 nm as a fifth insulating film, a silicon nitride film 322 is deposited to a thickness of 10 to 100 nm as a fourth insulating film, a silicon oxide film 433 is deposited to a thickness of 50 to 500 nm as a fifth insulating film, and a silicon nitride film 323 is deposited to a thickness of 100 to 5,000 nm as a fourth insulating film. The thicknesses of the silicon oxide films 432 and 433 are adjusted to a height of the floating gate of the memory cell.

Figure 174:
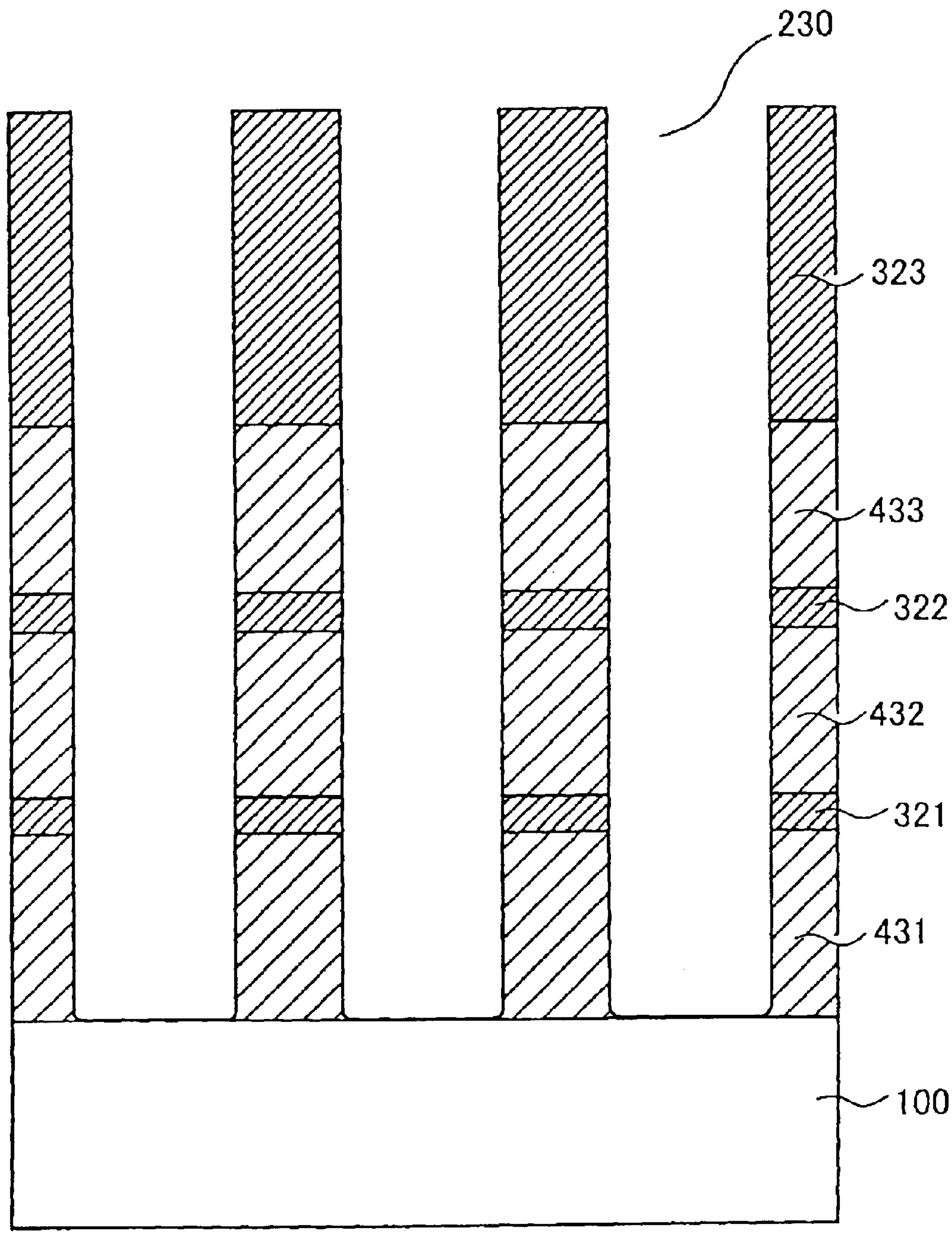
Figure 183:
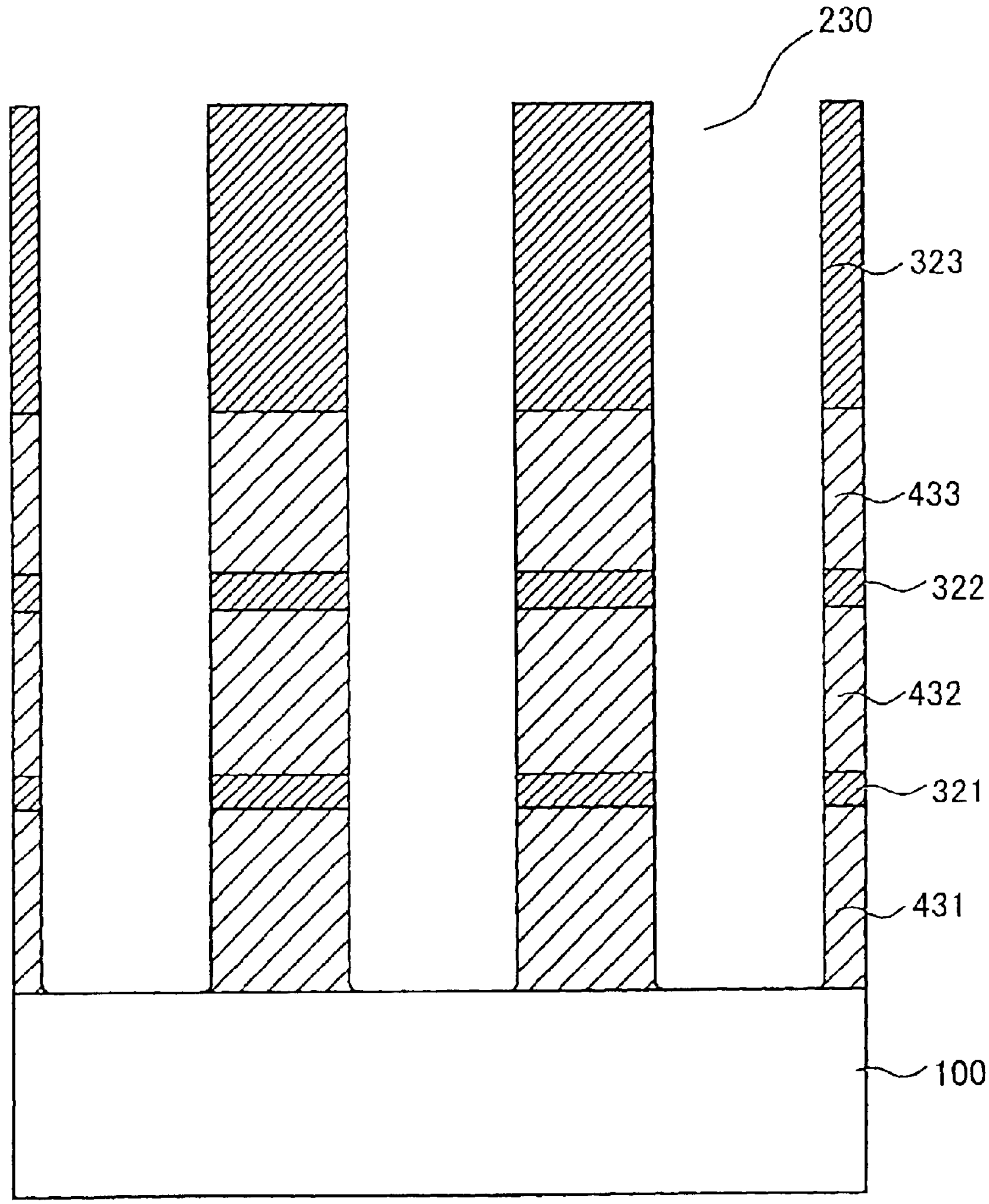

Subsequently, using a resist R2 patterned by a known photolithography technique as a mask (FIG. 173 and FIG. 182), the silicon nitride film 323, the silicon oxide film 433, the silicon nitride film 322, the silicon oxide film 432, the silicon nitride film 321 and the silicon oxide film 431 are etched successively by reactive ion etching to form a third trench 230. Then, the resist R2 is removed (FIG. 174 and FIG. 183).

Figure 175:
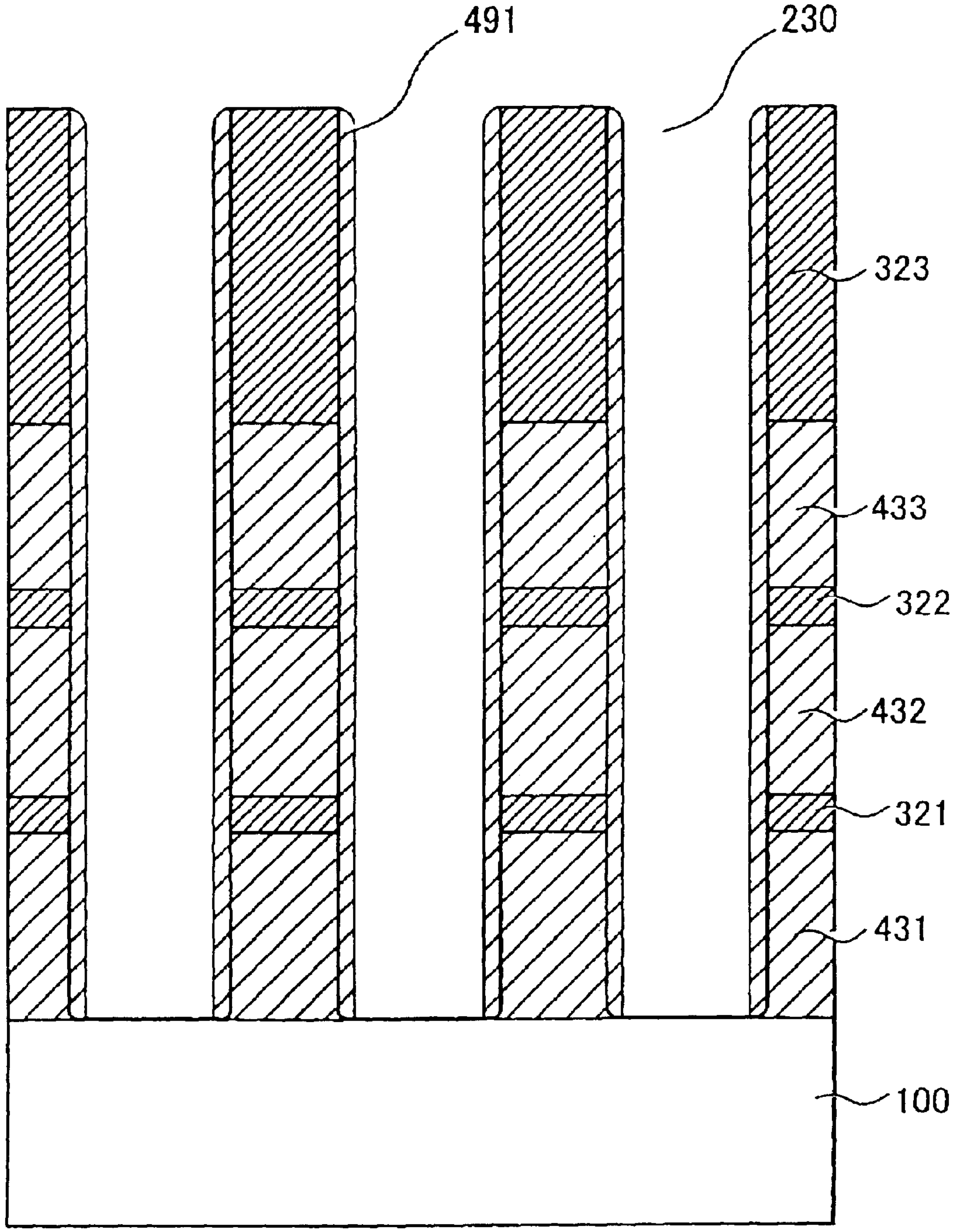
Figure 184:
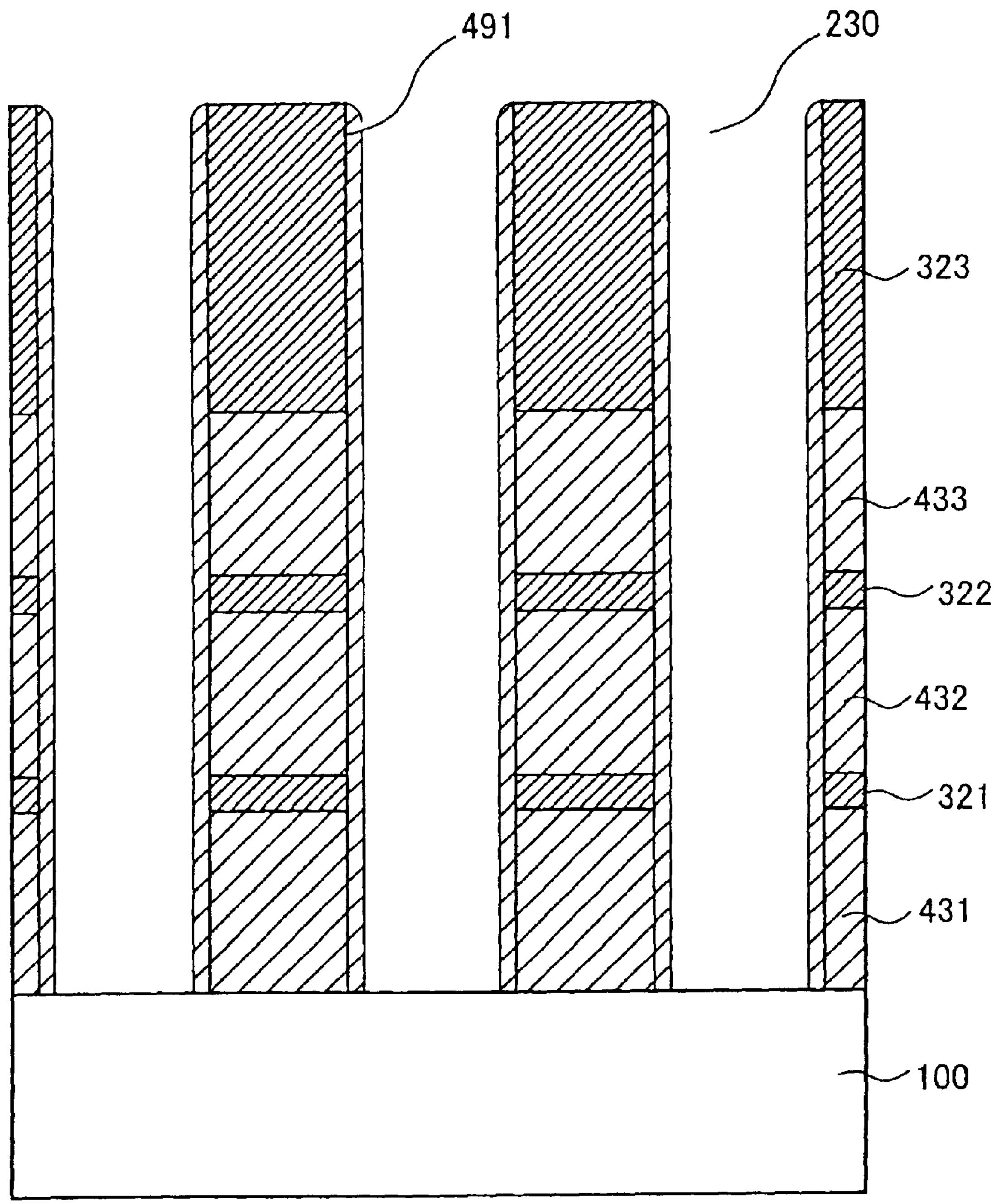

A fifteenth insulating film, for example, a silicon oxide film 491, is deposited to a thickness of 20 to 200 nm and anisotropically etched by about a deposit thickness such that the silicon oxide film 491 is arranged in the form of a sidewall spacer on the inner wall of the third trench 230 (FIG. 175 and FIG. 184).

Figure 176:
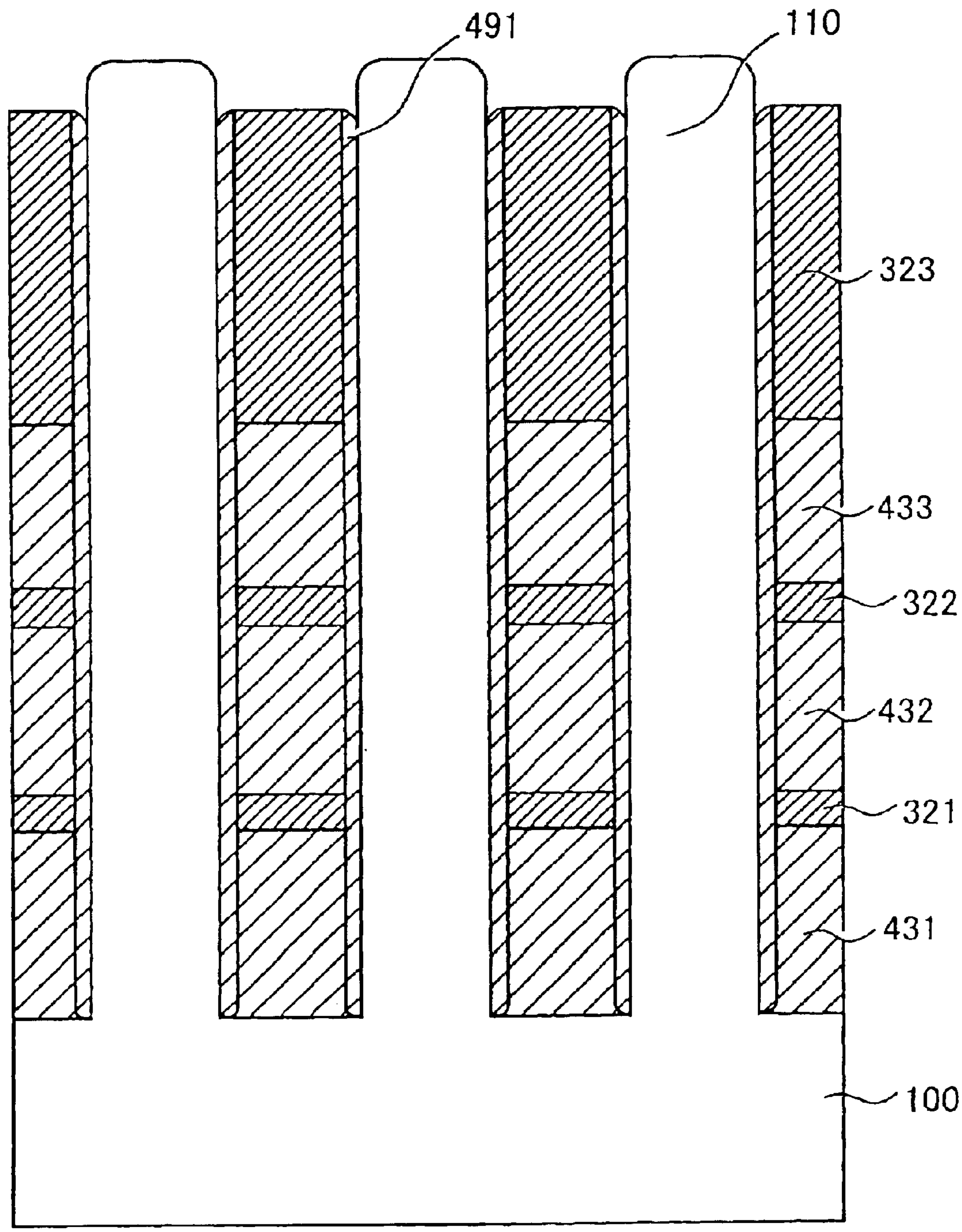
Figure 177:
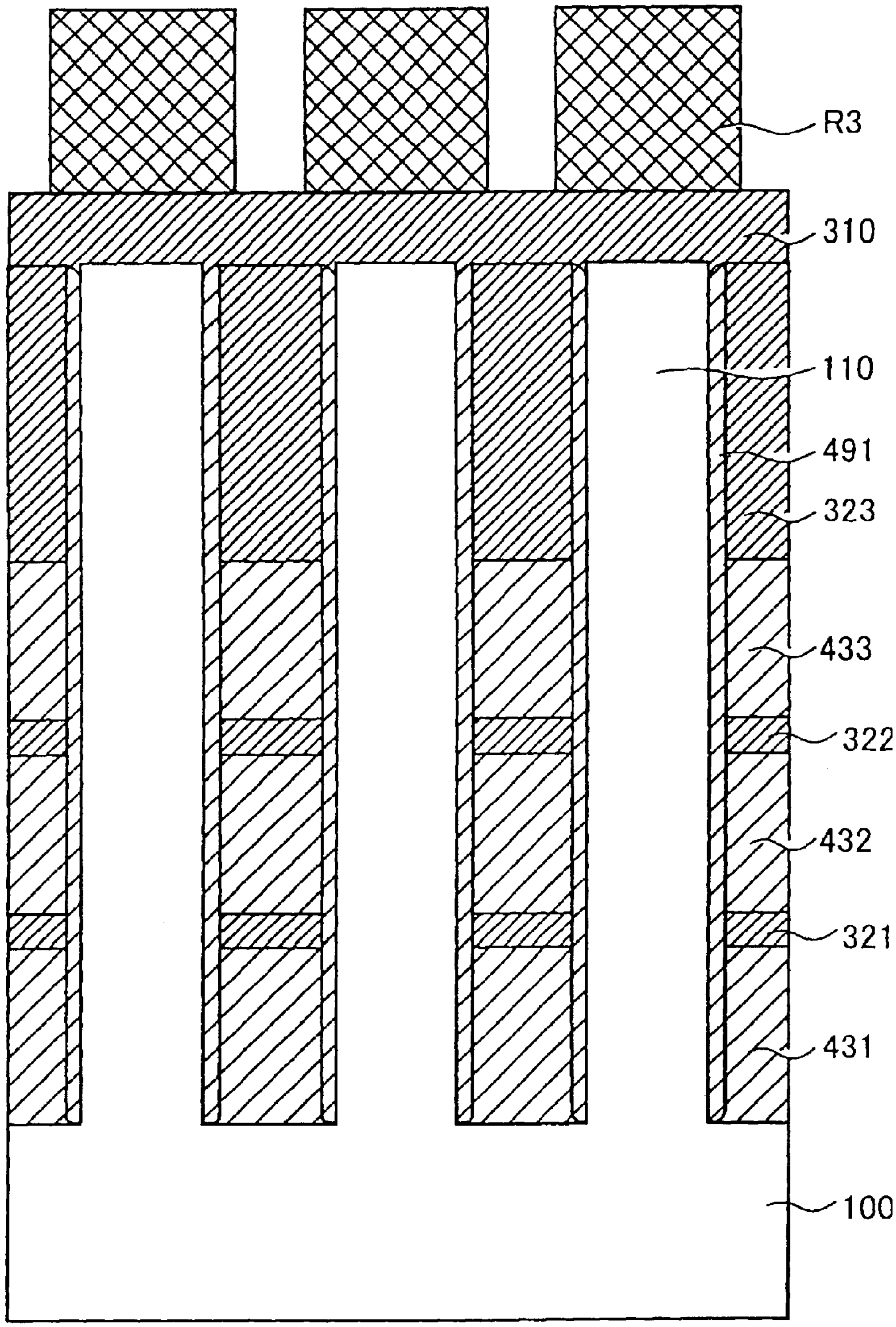
Figure 178:
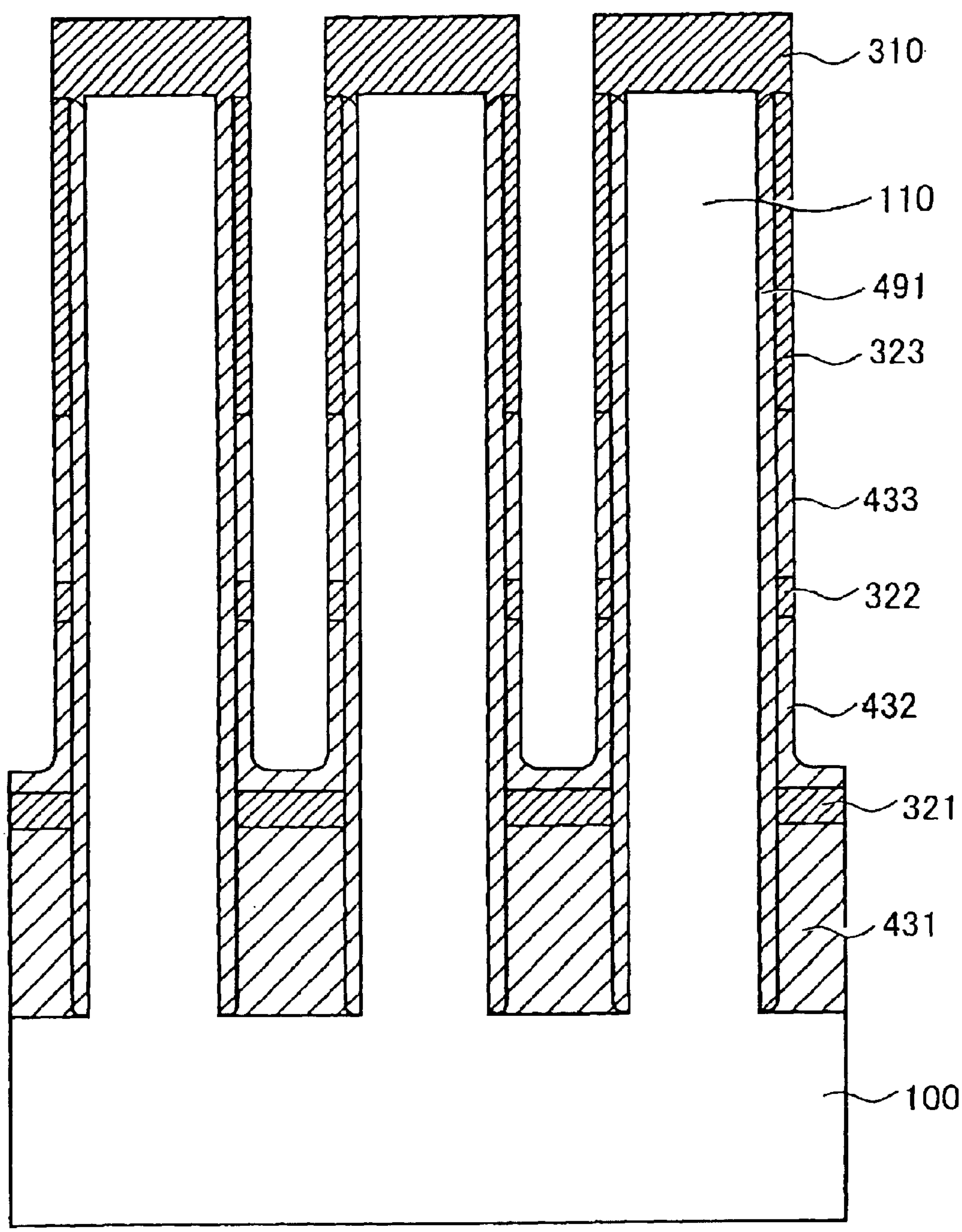
Figure 179:
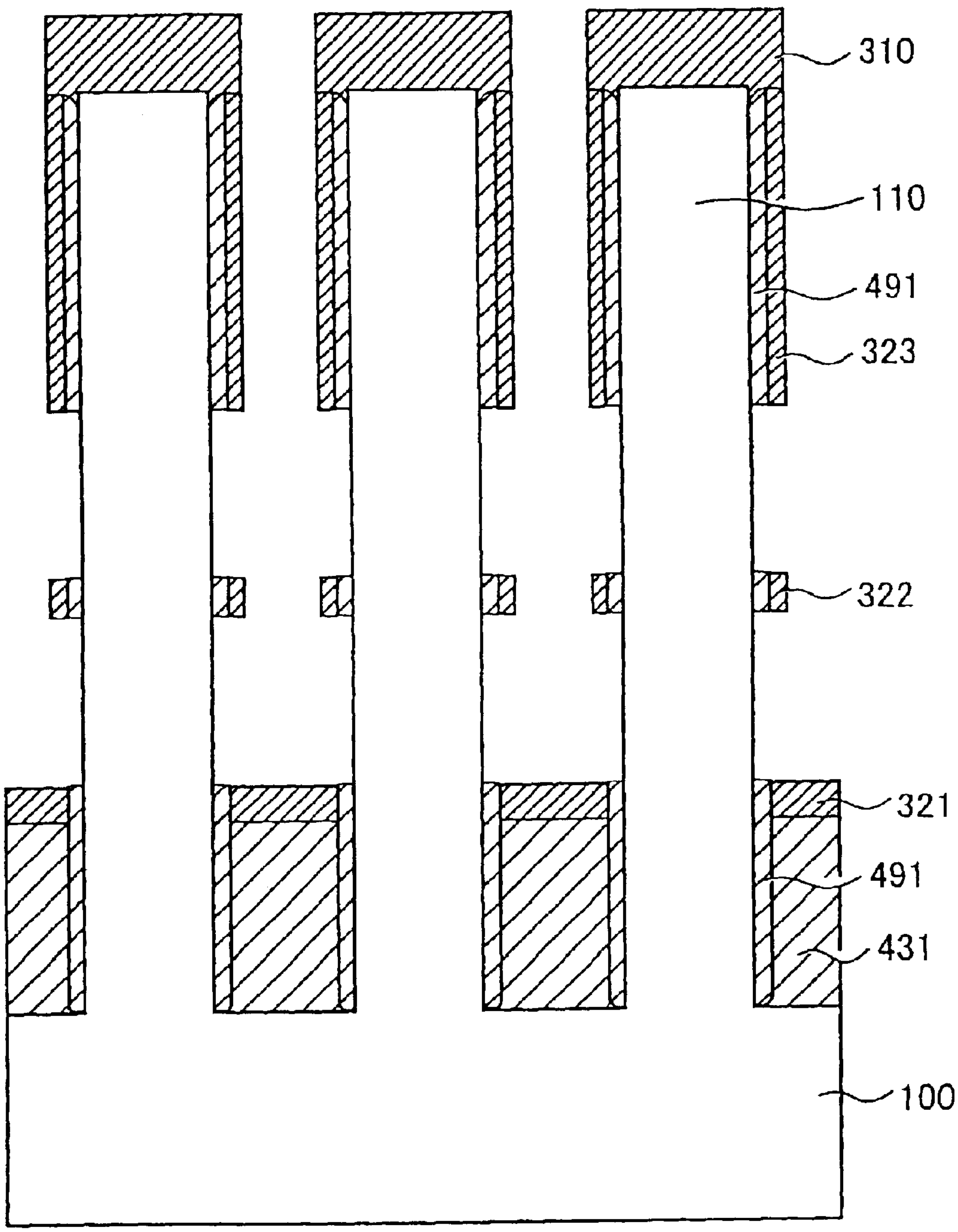
Figure 185:
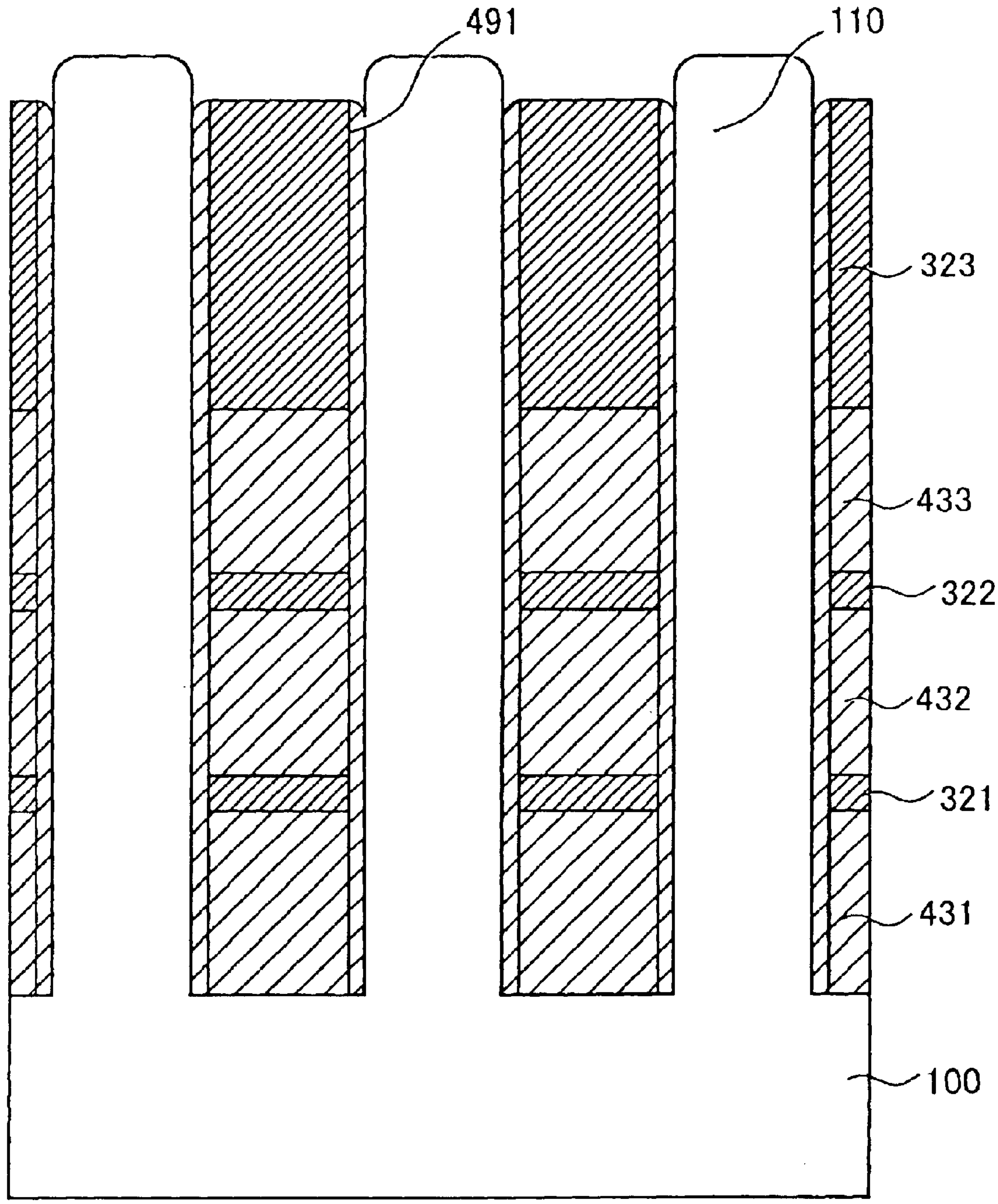
Figure 186:
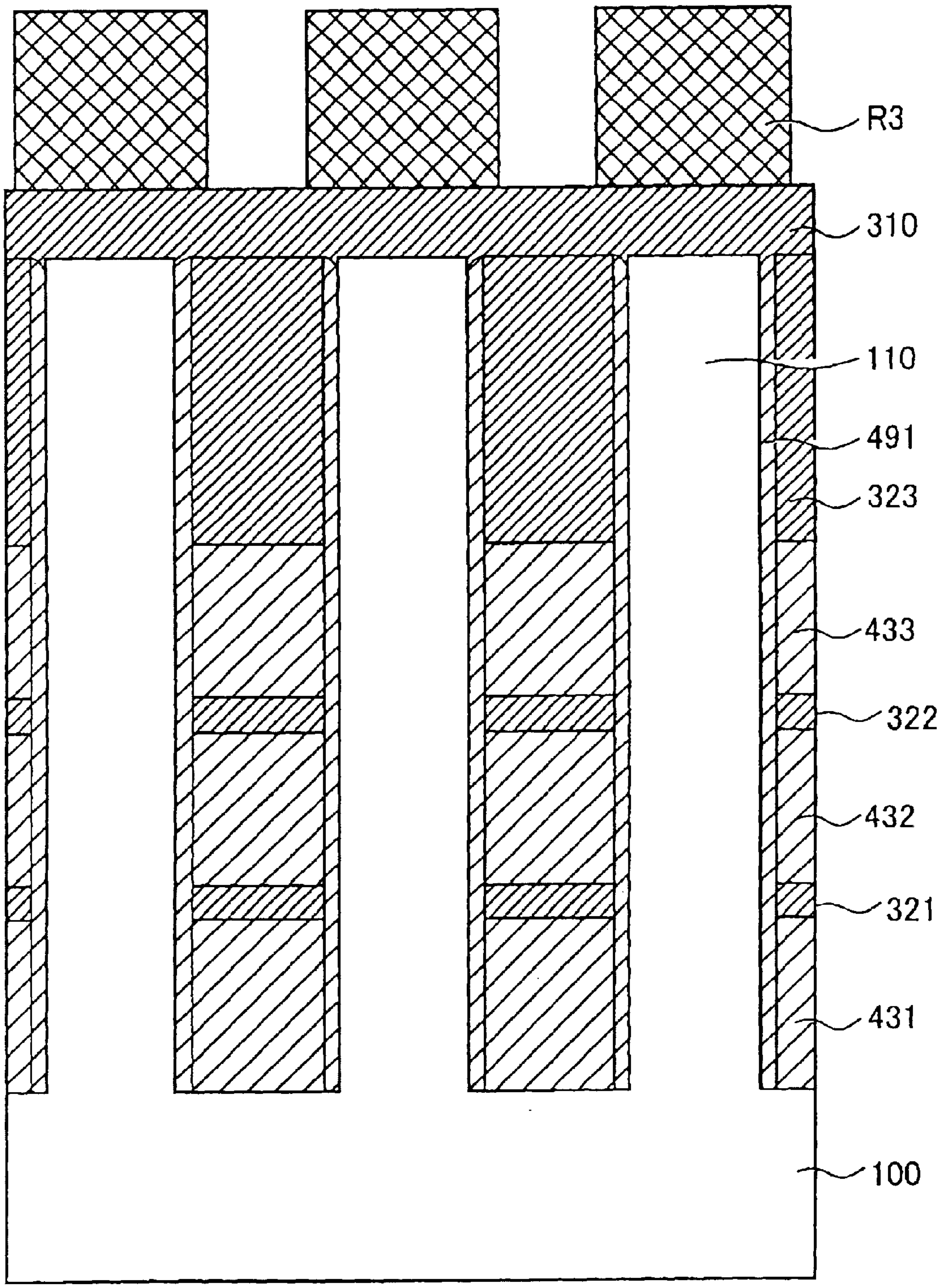
Figure 187:
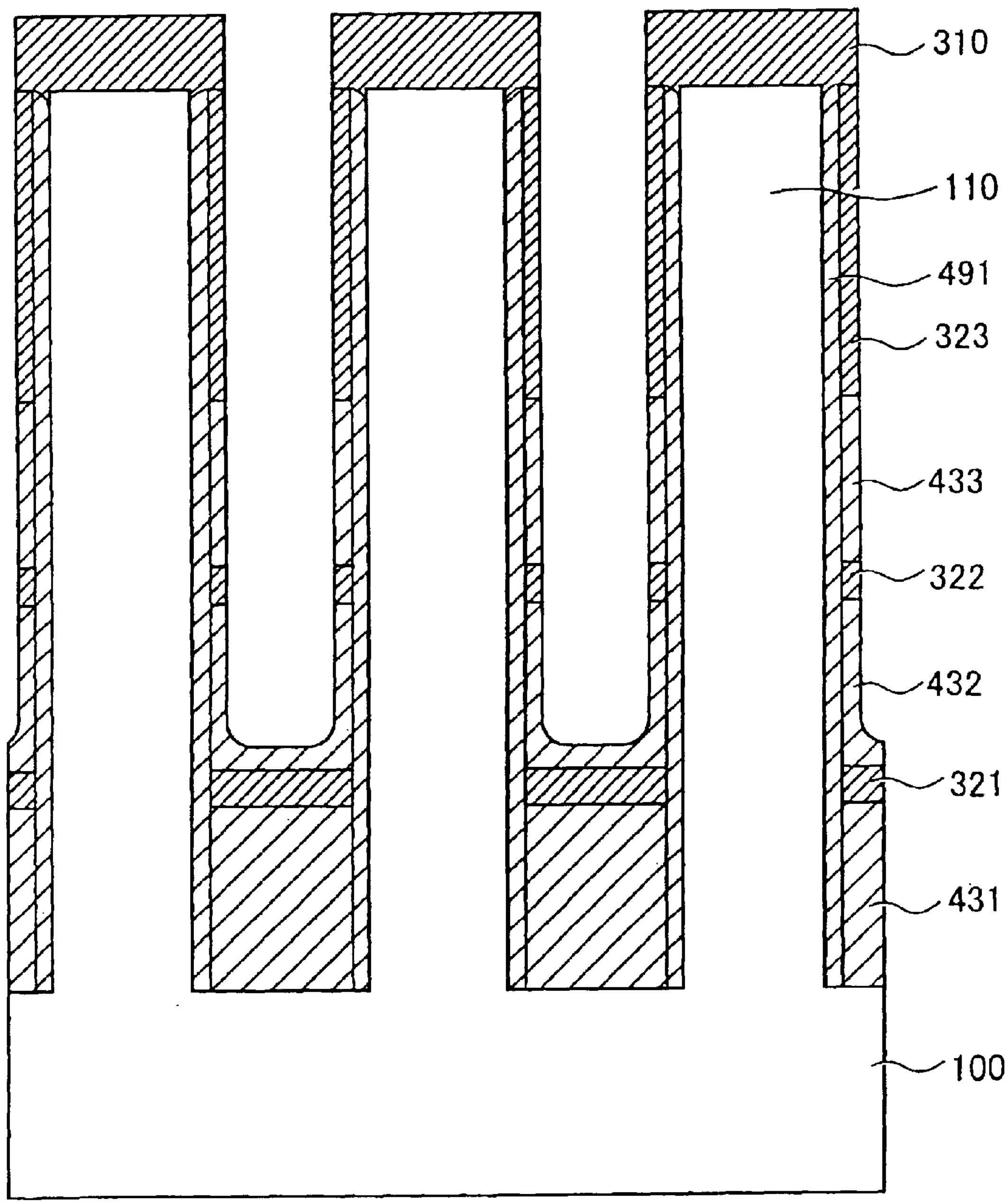
Figure 188:
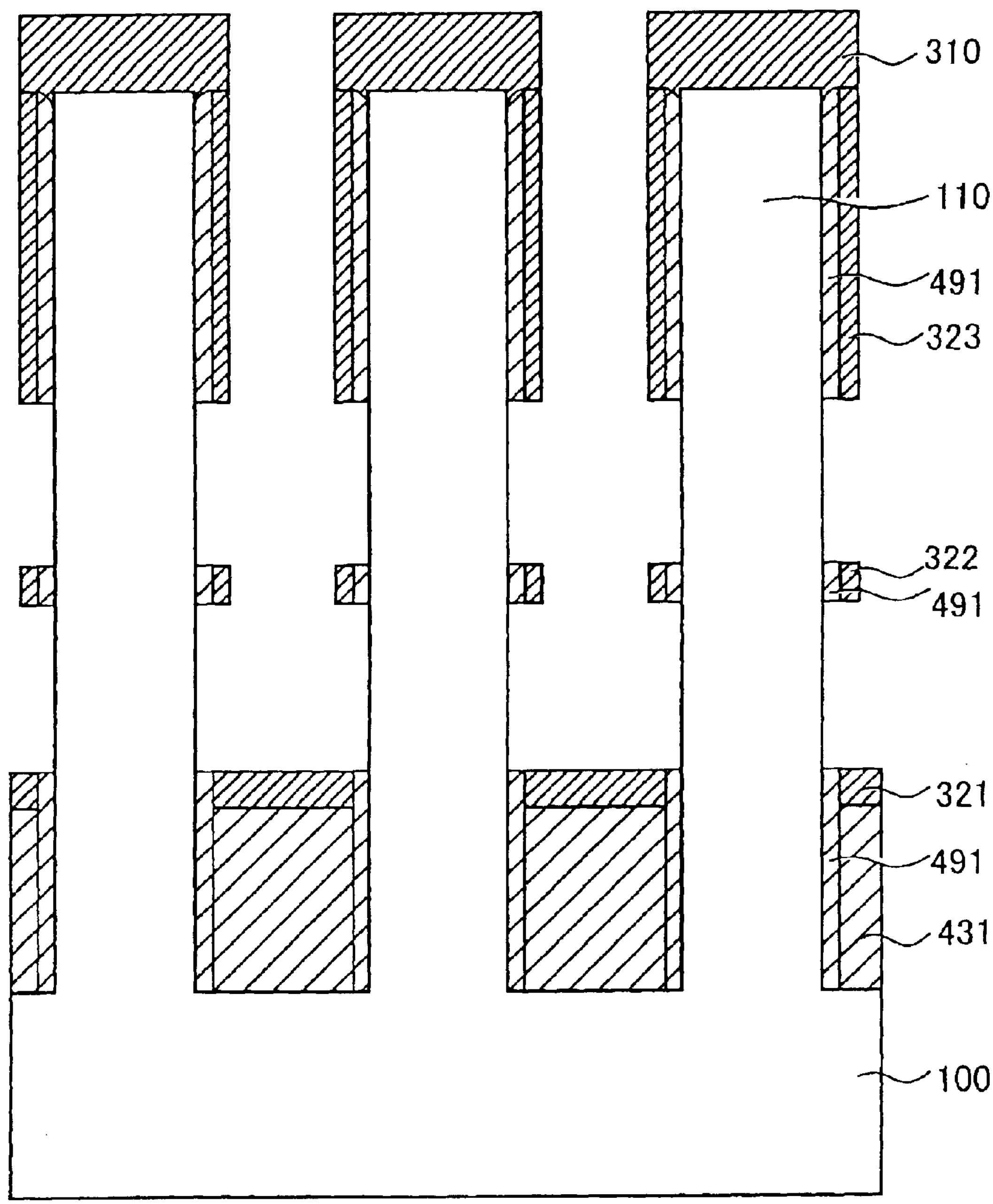

Then, an island-like semiconductor layer 110 is buried in the third trench 230 with the intervention of the silicon oxide film 491. For example, the semiconductor layer is selectively epitaxially grown from the P-type silicon substrate 100 located at the bottom of the third trench 230 (FIG. 176 and FIG. 185).

The island-like semiconductor layer 110 is planarized to be flush with the silicon nitride film 323. At this time, the planarization may be carried out by isotropic etch back, anisotropic etch back, CMP, or these may be combined in various ways. Any means may be used for the planarization.

A silicon nitride film 310 is deposited to a thickness of about 100 to 1,000 nm as a first insulating film. Using a resist R3 patterned by a known photolithography technique as a mask (FIG. 177 and FIG. 186), reactive ion etching is performed to successively etch the silicon nitride film 310, the silicon nitride film 323, the silicon oxide film 433, the silicon nitride film 322 and the silicon oxide film 432, thereby exposing the silicon oxide film 432. At this time, the silicon oxide film 432 may be etched until the silicon nitride film 321 is exposed.

Figure 180:
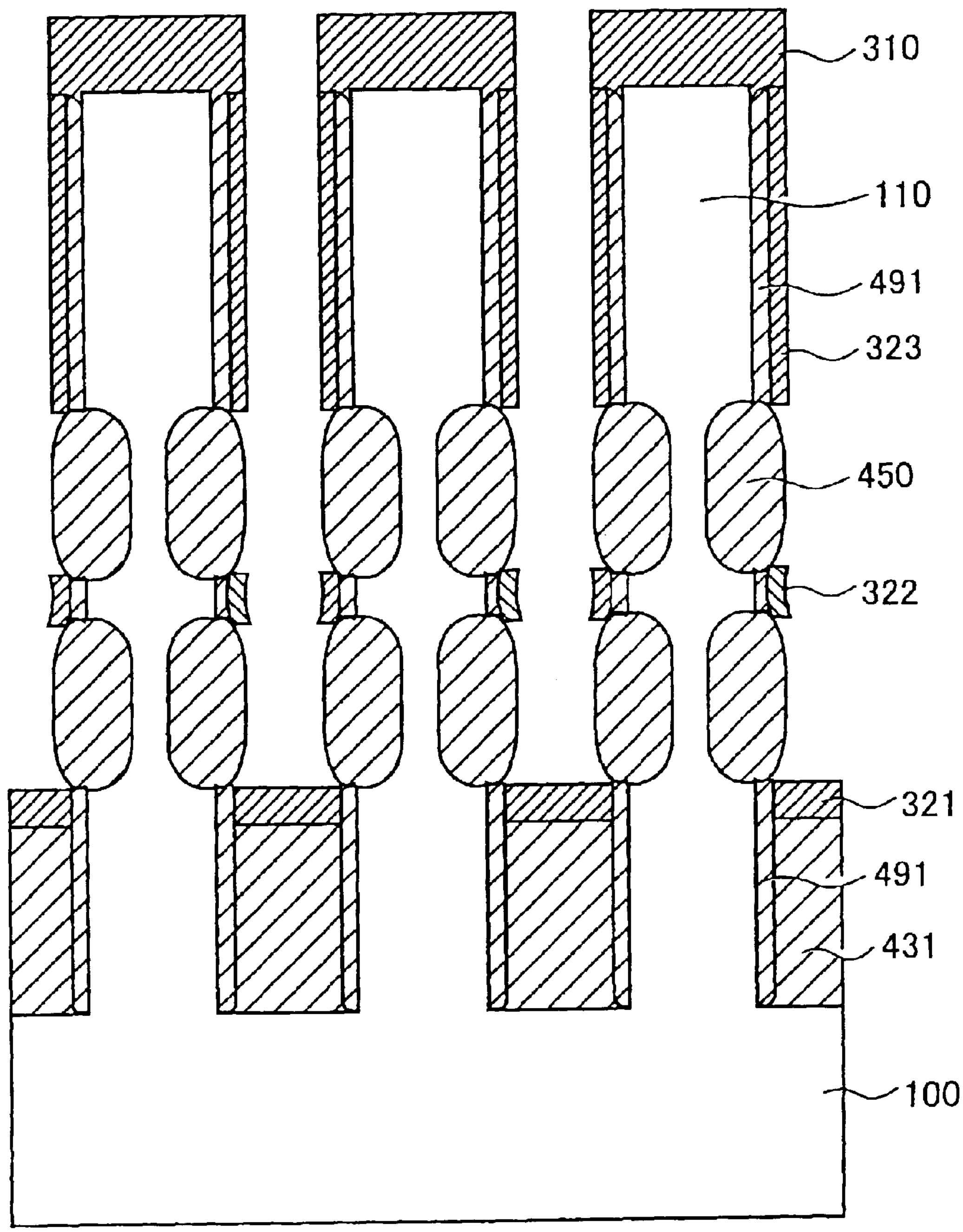
Figure 189:
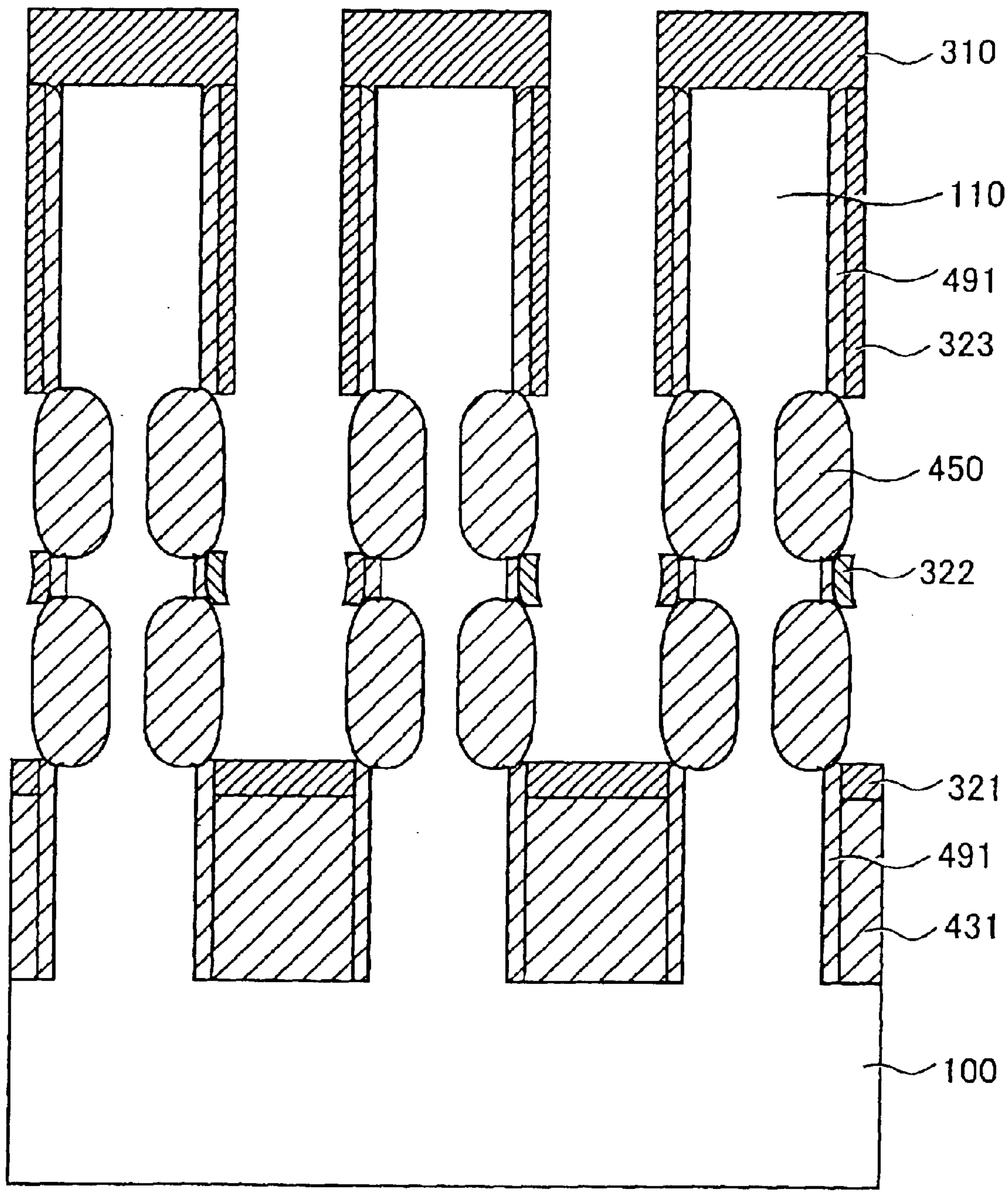

After the resist R3 is removed (FIG. 178 and FIG. 187), the silicon oxide film is entirely removed by isotropic etching (FIG. 179 and FIG. 188) and the exposed island-like semiconductor layer 110 is thermally oxidized to form a silicon oxide film 450 as a seventh insulating film (FIG. 180 and FIG. 189).

Figure 181:
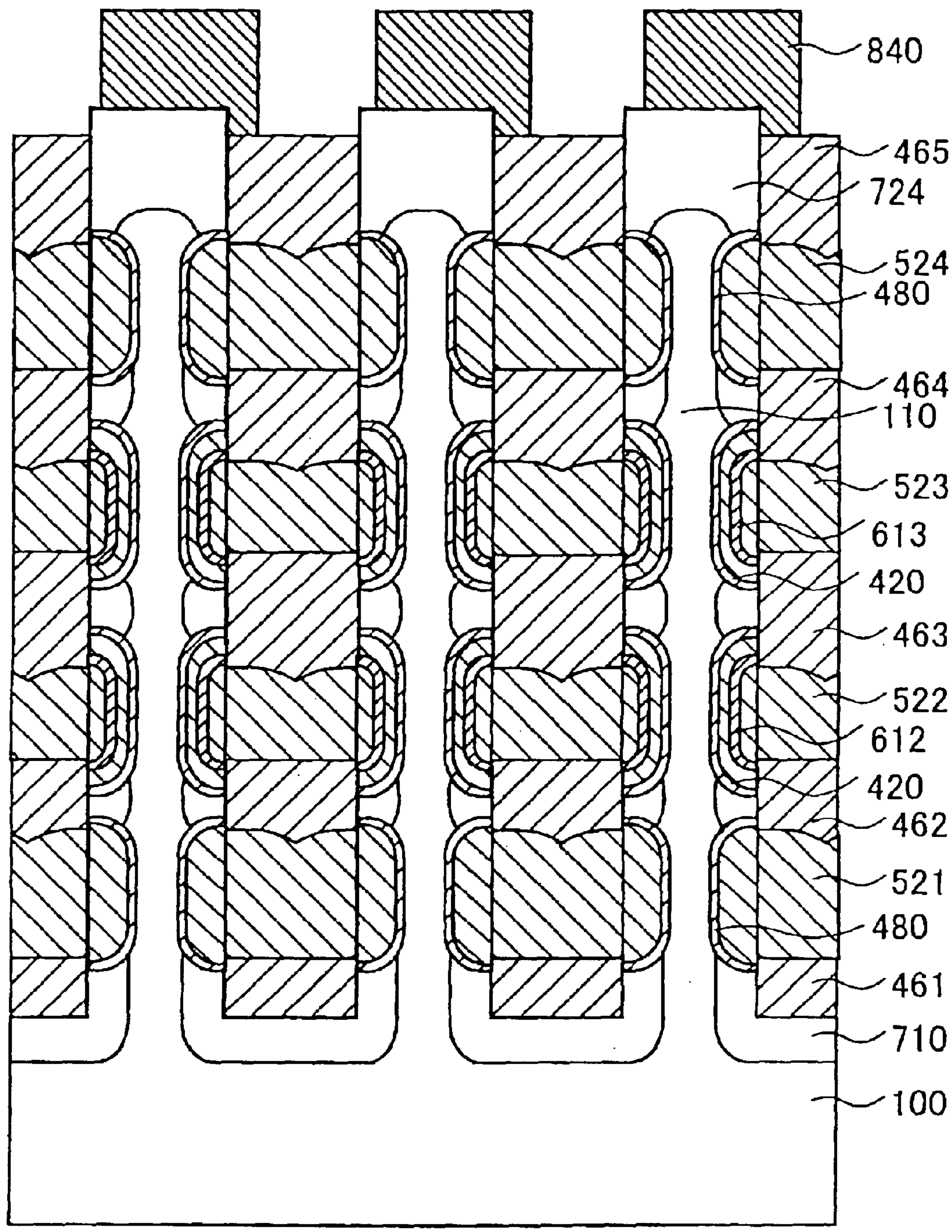
Figure 182:
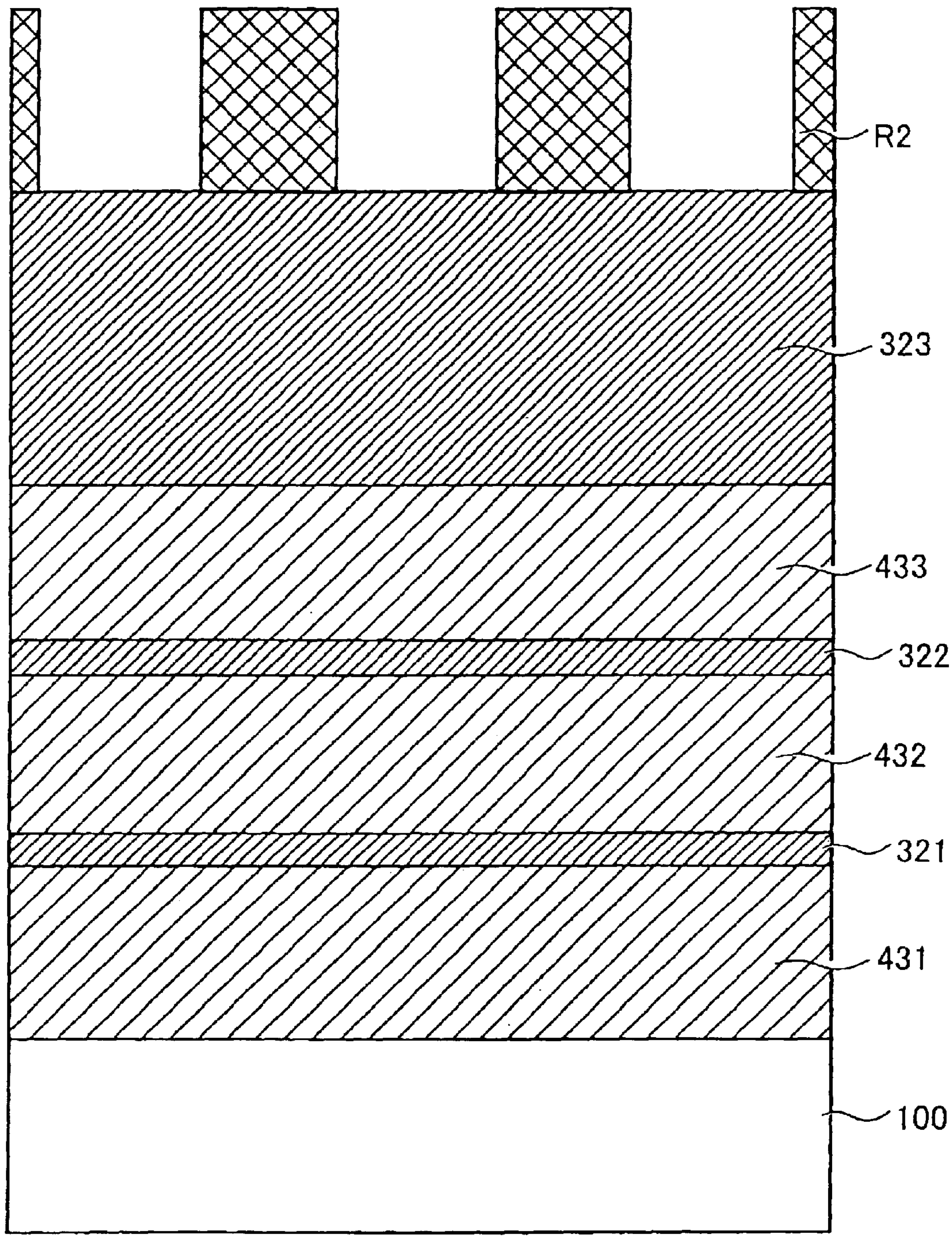
Figure 190:
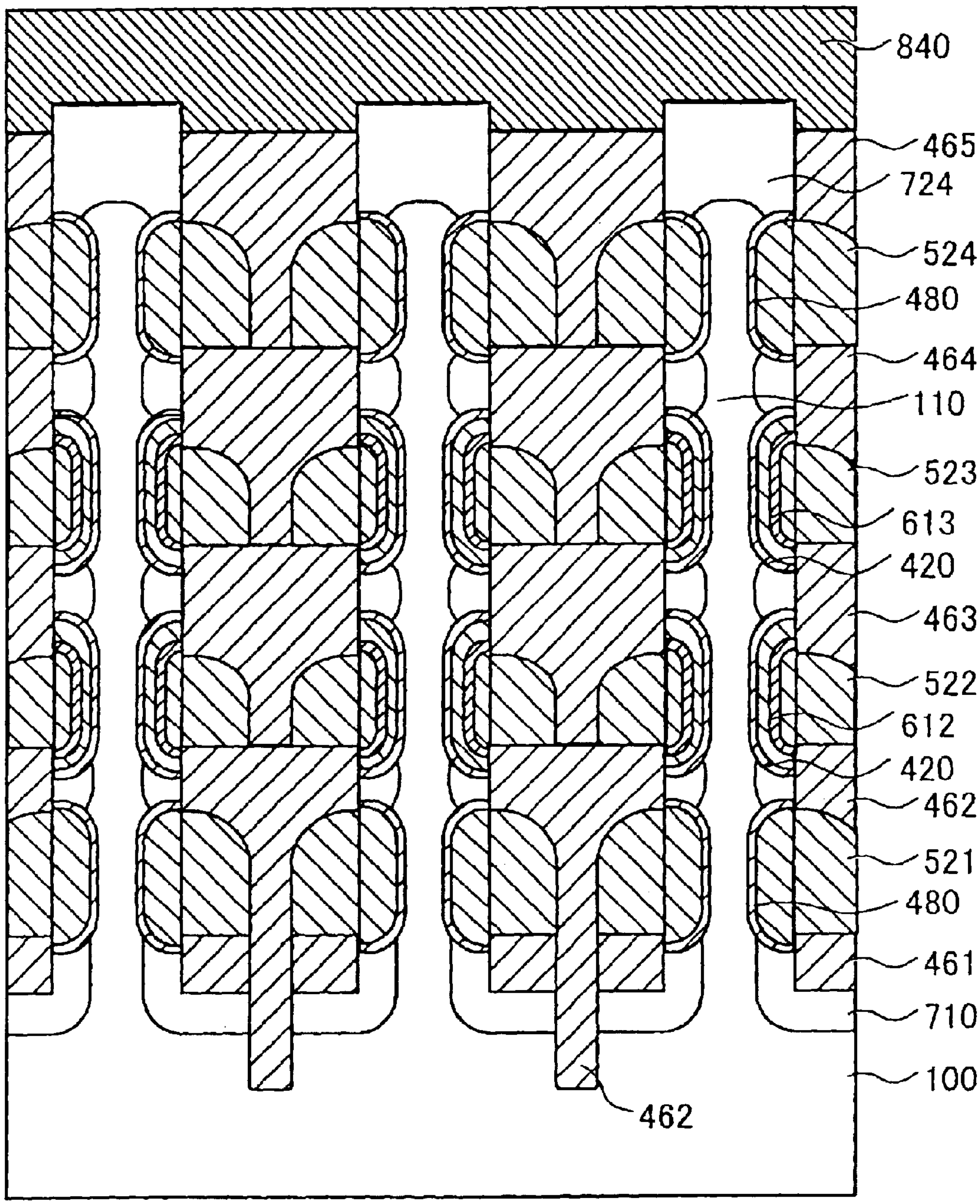

Production steps thereafter follow Production Example 1. Thereby, a semiconductor memory is realized which has a memory function according to the state of a charge in the charge storage layer which is the floating gate made of the polysilicon film to be the first conductive film (FIG. 181 and FIG. 190).

Thus, the same effect as obtained by Production Example 1 is obtained. Further, since the region for forming at least one recess on the sidewall of the pillar-form island-like semiconductor layer is determined precisely by the layered film made of plural films, variations in device performance can advantageously be reduced.

PRODUCTION EXAMPLE 15

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. The island-like semiconductor layers have additional recesses at the top and the bottom thereof and selection gate transistors including gate oxide films and selection gates are arranged therein. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time. Transmission gates are disposed between the transistors for transmitting potentials to the active regions of the memory cell transistors.

Figure 191:
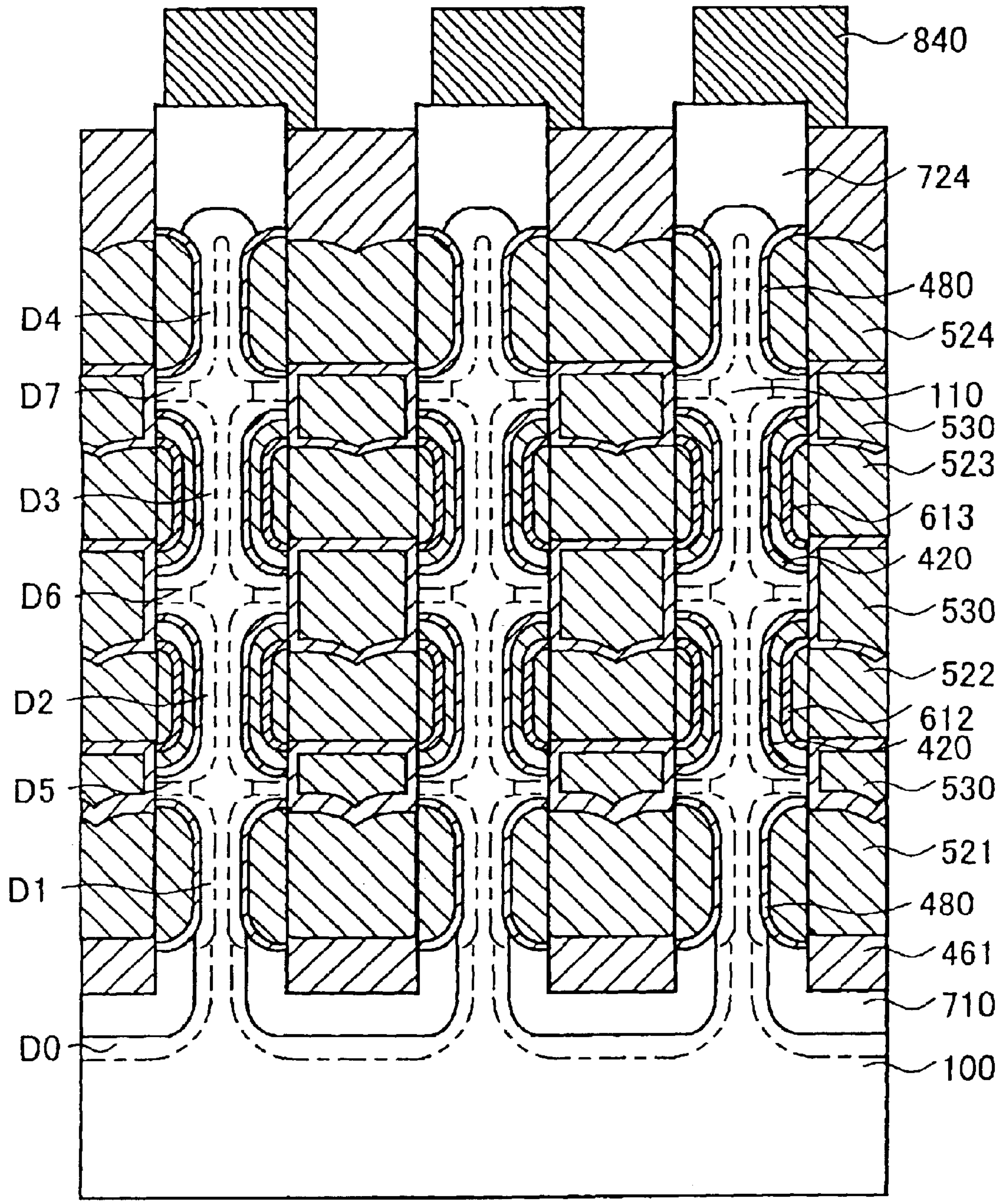
Figure 192:
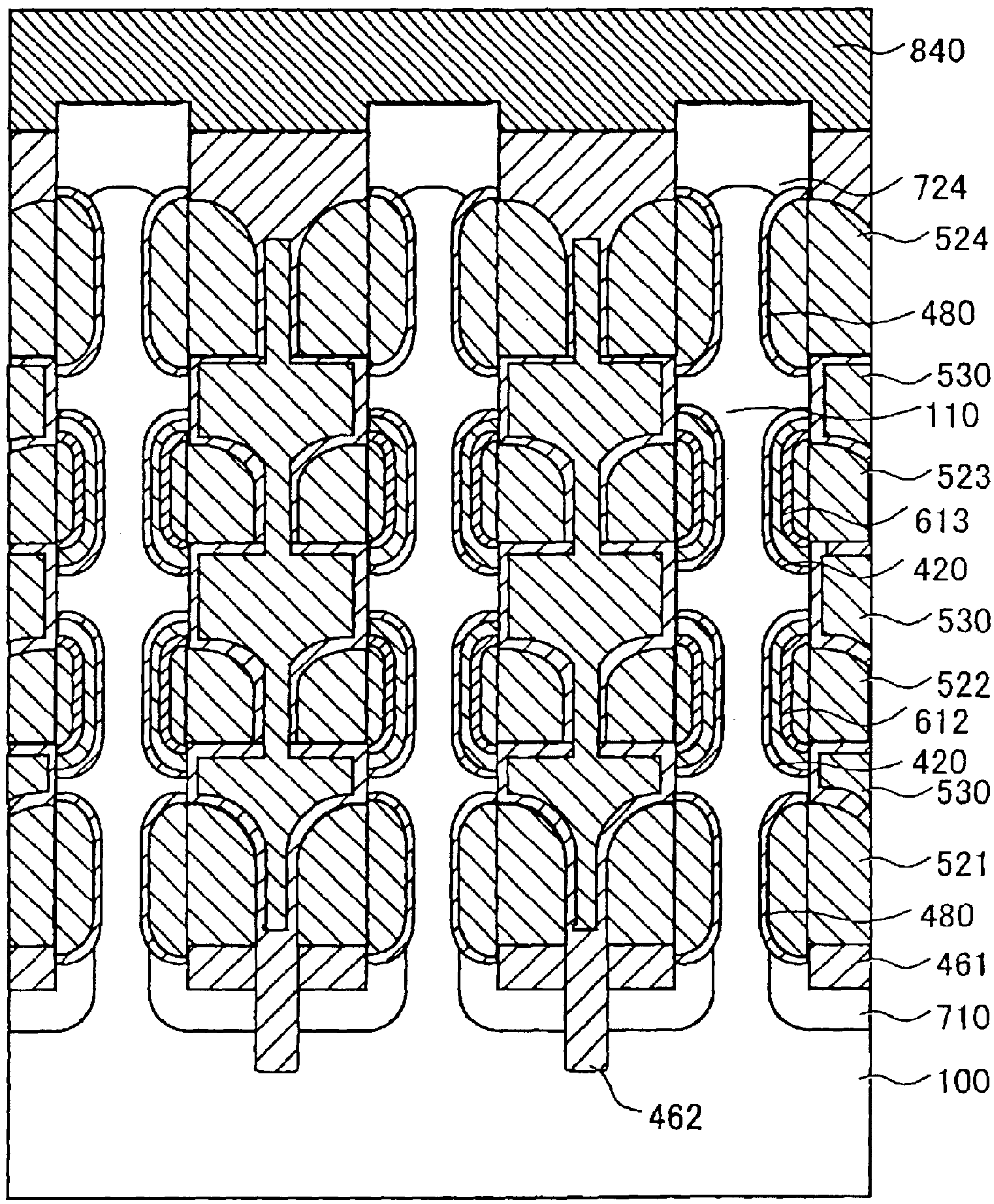

Such a semiconductor memory is produced by the following production process. FIG. 191 and FIG. 192 are sectional views taken on line A–A' and line B–B', respectively, in FIG. 1 which is a cross-sectional view illustrating a memory cell array of an EEPROM.

In this production example, a semiconductor memory is realized in the same manner as in Production example 1 except that the impurity diffusion layers 721 to 723 are not introduced and the step of forming a polysilicon film 530 as a third conductive film to be a gate electrode is added after the formation of the polysilicon films 521, 522, 523 and 524 as second conductive films (FIG. 191 and FIG. 192).

At data reading, as shown in FIG. 191, depletion layers and inversion layers shown in D1 to D7 are electrically connected with the gate electrodes 521, 522, 523, 524 and 530, thereby an electric current path is established between the impurity diffusion layers 710 and 725. In this situation, voltages to be applied to the gates 521, 522, 523, 524 and 530 are so set that whether the inversion layers are formed in D2 and D3 or not is selected depending on the state of the charge storage layers 512 and 513, thereby the data can be read from the memory cell.

Figure 193:
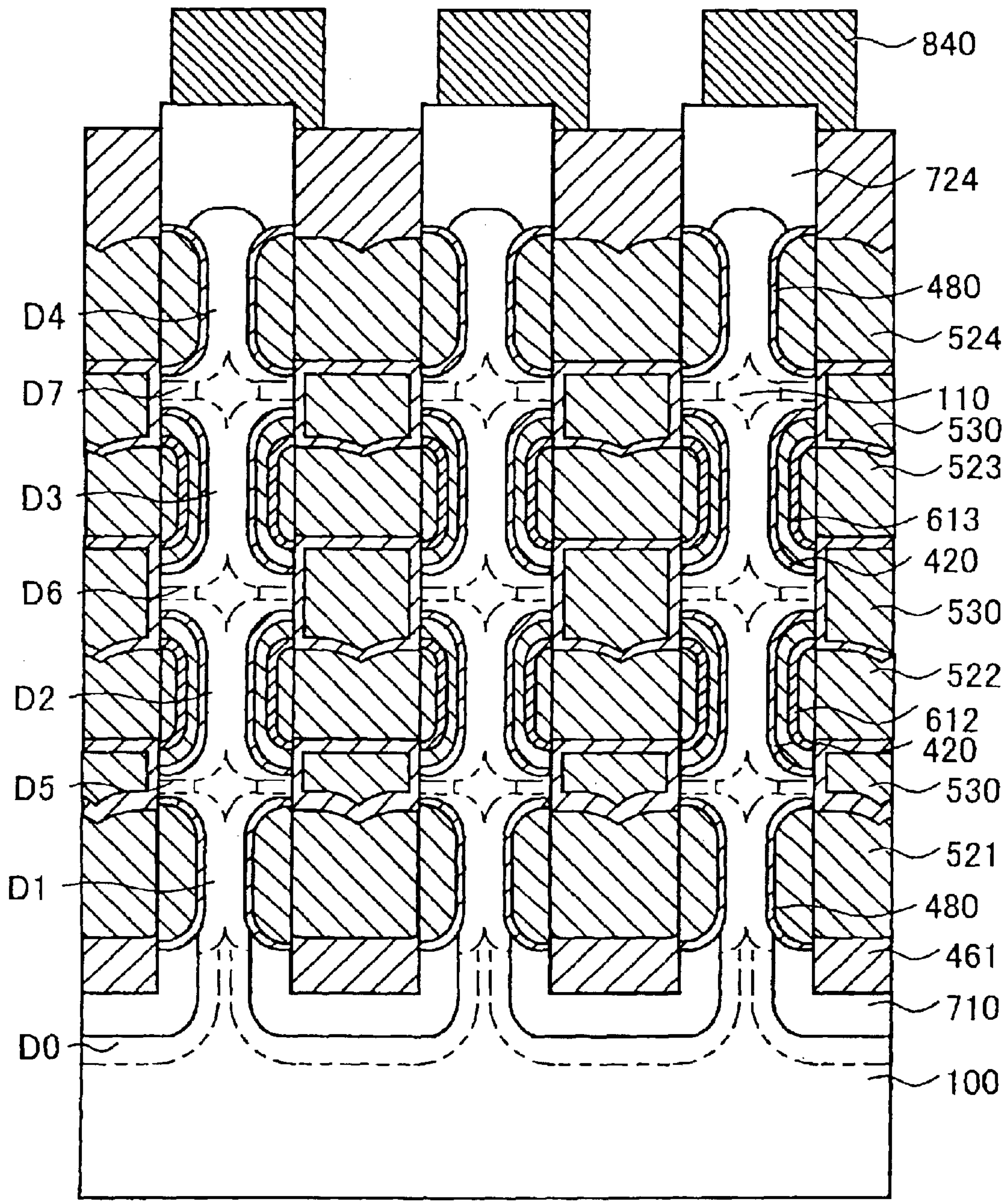

It is desired that the distribution of D1 to D4 is completely depleted as shown in FIG. 193. In this case, it is expected that the back-bias effect is suppressed in the memory cells and the selection gate transistors, which is effective in reducing variations in device performance.

According to this production example, the same effect as obtained by Production example 1 is obtained. Since the production steps are reduced and the required height of the island-like semiconductor layer 110 is reduced, variations during the production process are suppressed.

The top and the bottom of the polysilicon film 530 may be positioned as shown in FIG. 192, in which at least the top is positioned higher than the bottom of the polysilicon film 524 and the bottom is positioned lower than the top of the polysilicon film 521.

PRODUCTION EXAMPLE 16

Explanation is given of an example of production process for producing a semiconductor memory in which the silicon oxide films 461 to 465 (the eighth insulating film) are not buried completely. FIGS. 194 and 195 and FIGS. 196 and 197 are sectional views taken on line A–A' and line B–B', respectively, in FIG. 1 which is a cross-sectional view illustrating a memory cell array of an EEPROM.

In the semiconductor memory of Production example 1, the second trench 220 is formed in the self-alignment manner by reactive ion etching using the polysilicon film 521 (the second conductive film) as a mask. However, the polysilicon film 522, 523 or 524 (the second conductive film) may be used as the mask. Alternatively, a resist patterned by a known photolithography technique may be used for the separation.

Figure 194:
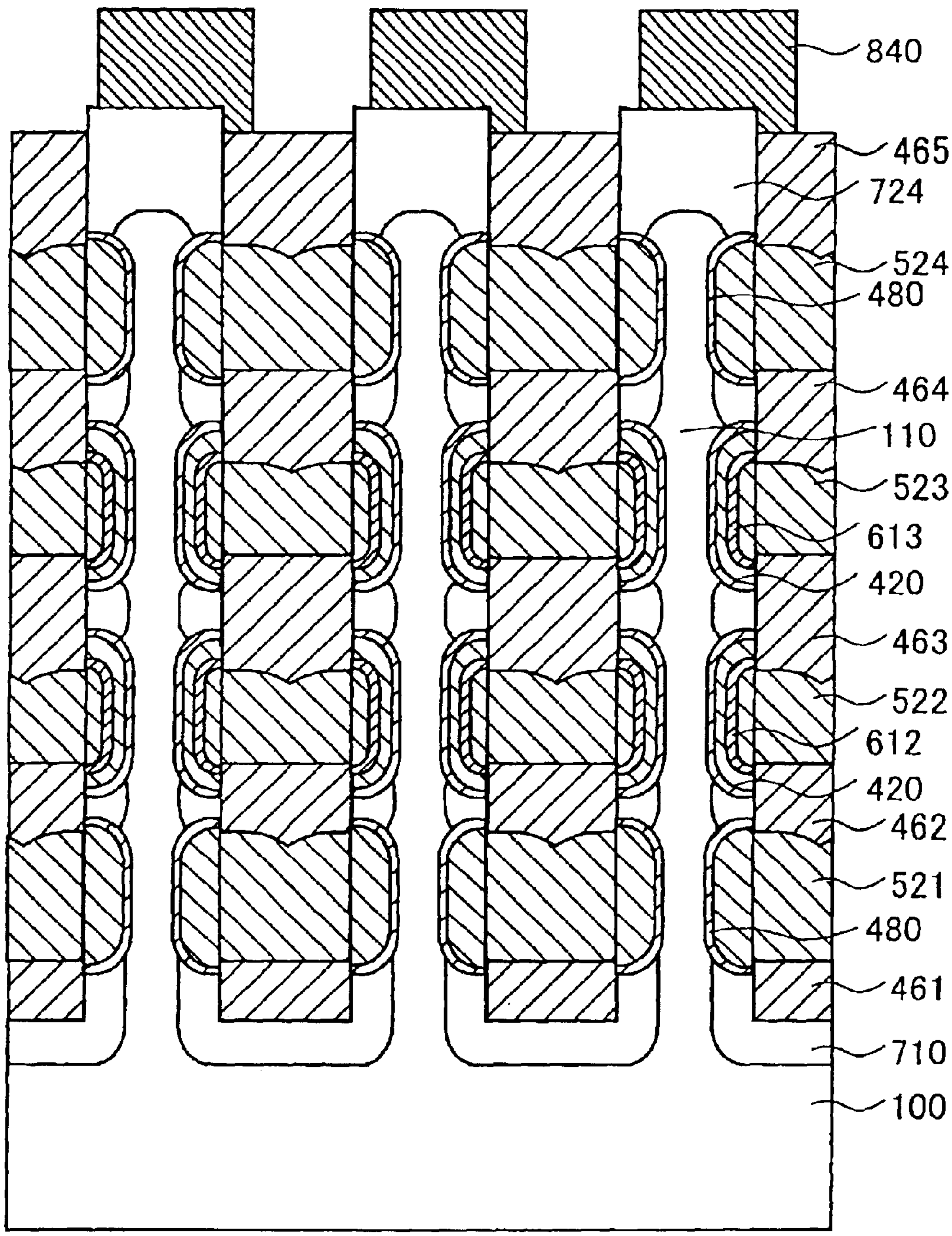
Figure 195:
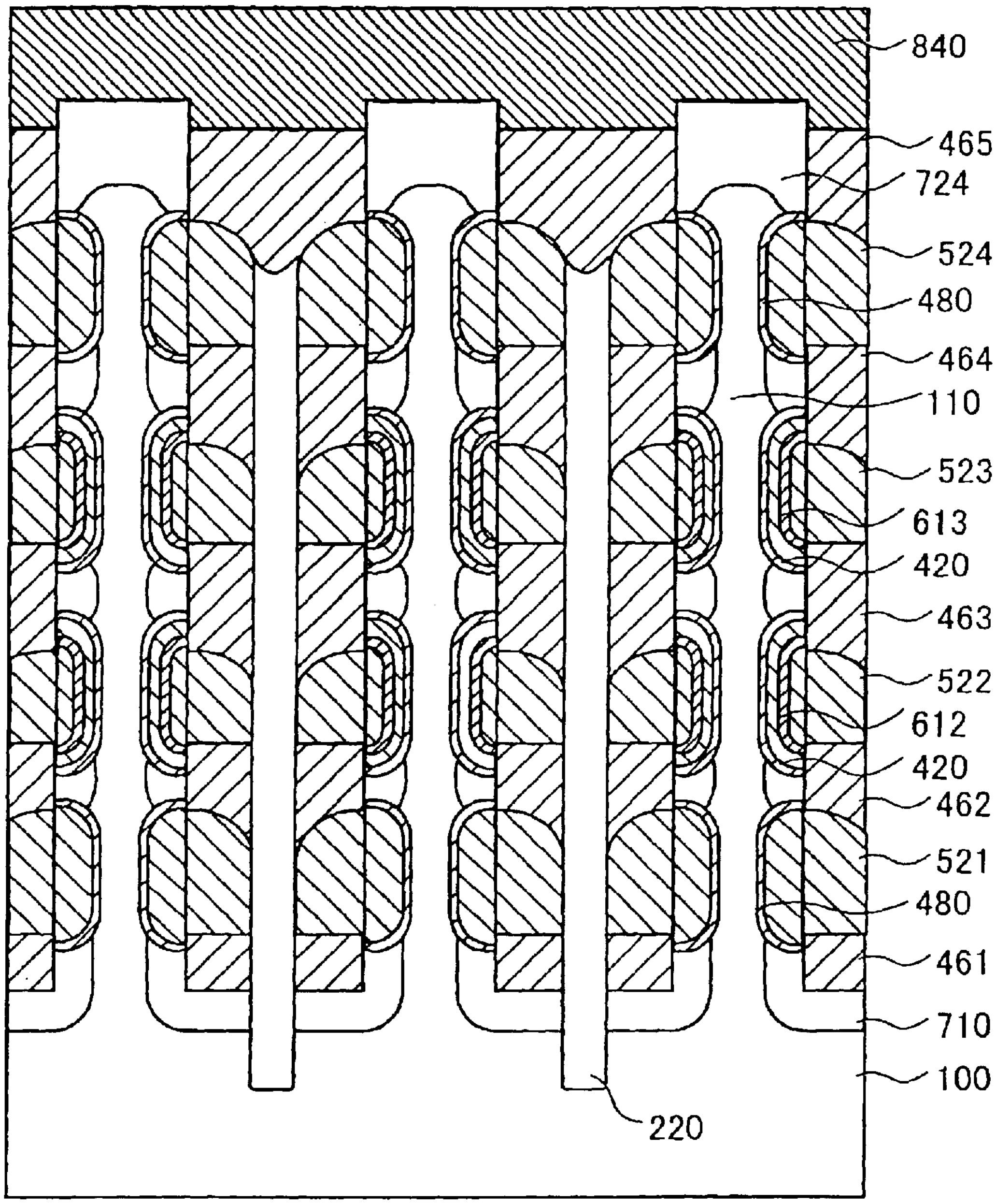

For example, in the case where the second trench 220 is formed in the self-alignment manner by using the polysilicon film 524 as a mask, the silicon oxide film 465 cannot be buried completely in the thus formed second trench 220 and a hollow is made in the trench as shown in FIG. 194 and FIG. 195. However, this is permissible as long as the hollow serves as an air gap and establishes the insulation between the control gate lines and the selection gate lines.

Figure 196:
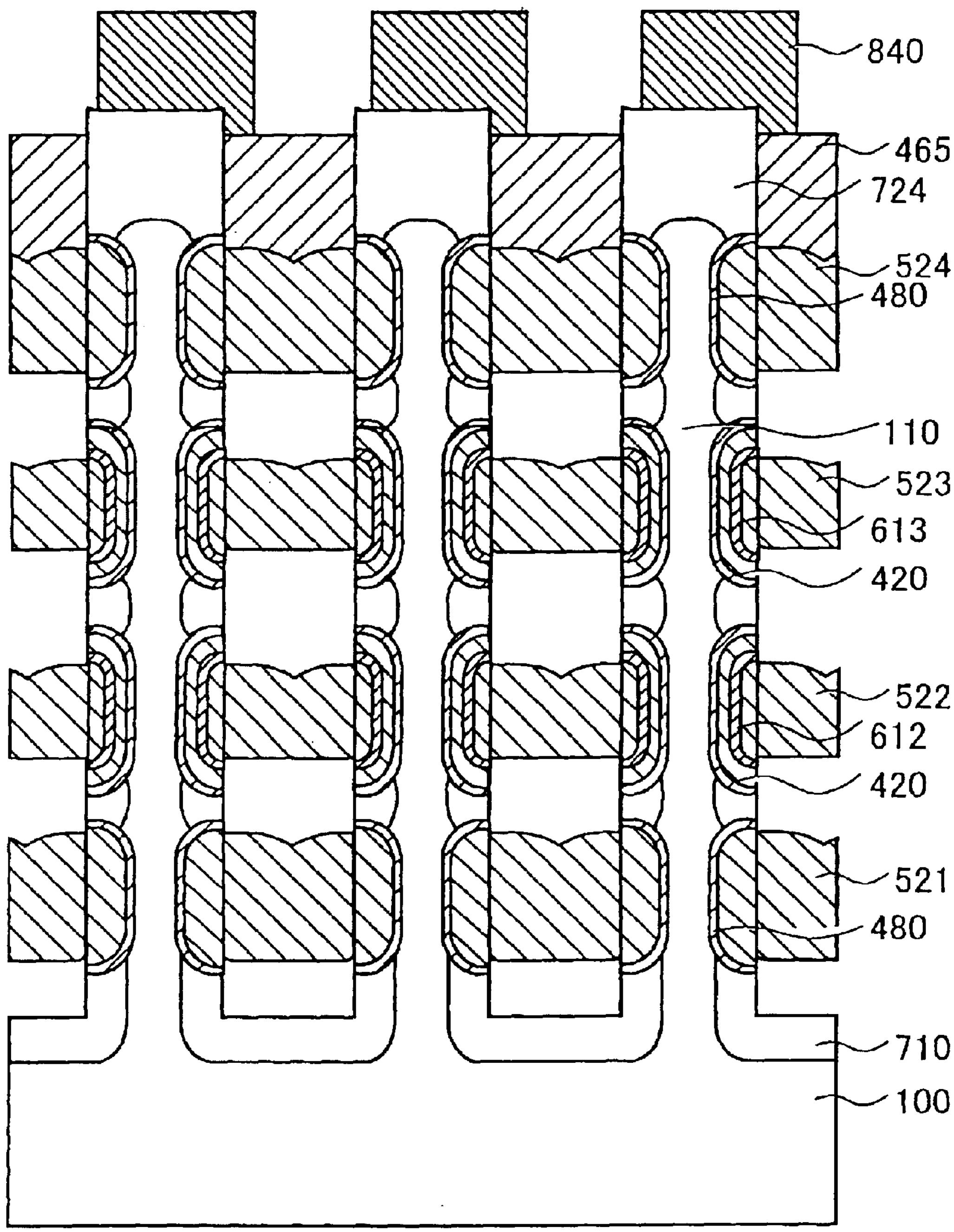
Figure 197:
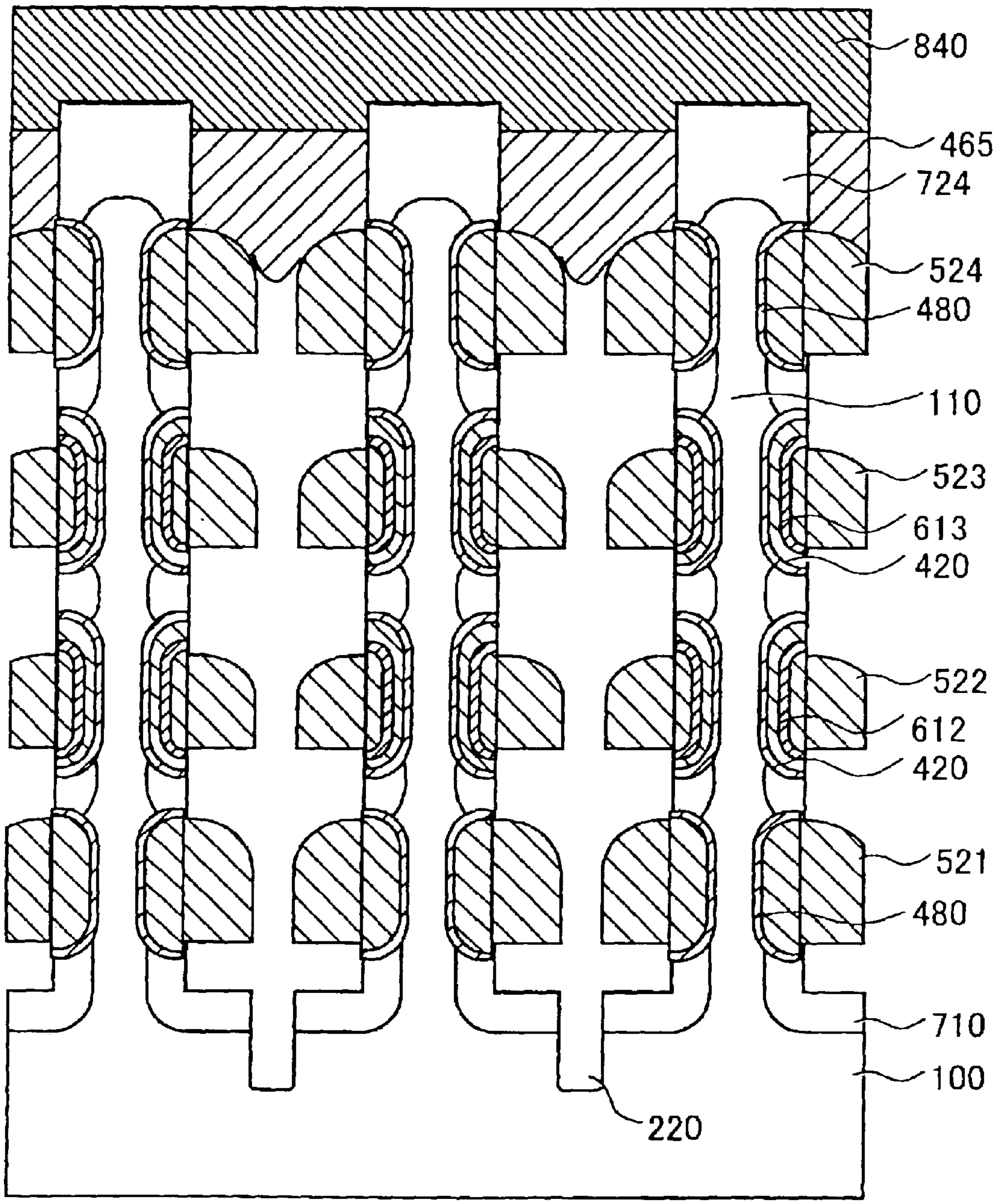

Further, as shown in FIG. 196 and 197, the silicon oxide film may selectively be removed before the silicon oxide film 465 is buried in the second trench 220.

As described above, the presence of the hollow realizes a low dielectric constant. Accordingly, the obtained semiconductor memory is expected to show suppressed parasitic capacitance and high speed characteristics.

PRODUCTION EXAMPLE 17

Explanation is given of an example of production process for producing a semiconductor memory in which the floating gate and the island-like semiconductor layer 110 have different outer circumferences. FIGS. 198 and 199 and FIGS. 200 and 201 are sectional views taken on line A–A' and line B–B', respectively, in FIG. 1 which is a cross-sectional view illustrating a memory cell array of an EEPROM.

In the semiconductor memory explained in Production example 1, the floating gate and the island-like semiconductor layer 110 have equal outer circumference. However, the outer circumference of the floating gate may be different from that of the island-like semiconductor layer 110. The outer circumference of the control gate may also be different from that of the floating gate or the island-like semiconductor layer 110.

Figure 198:
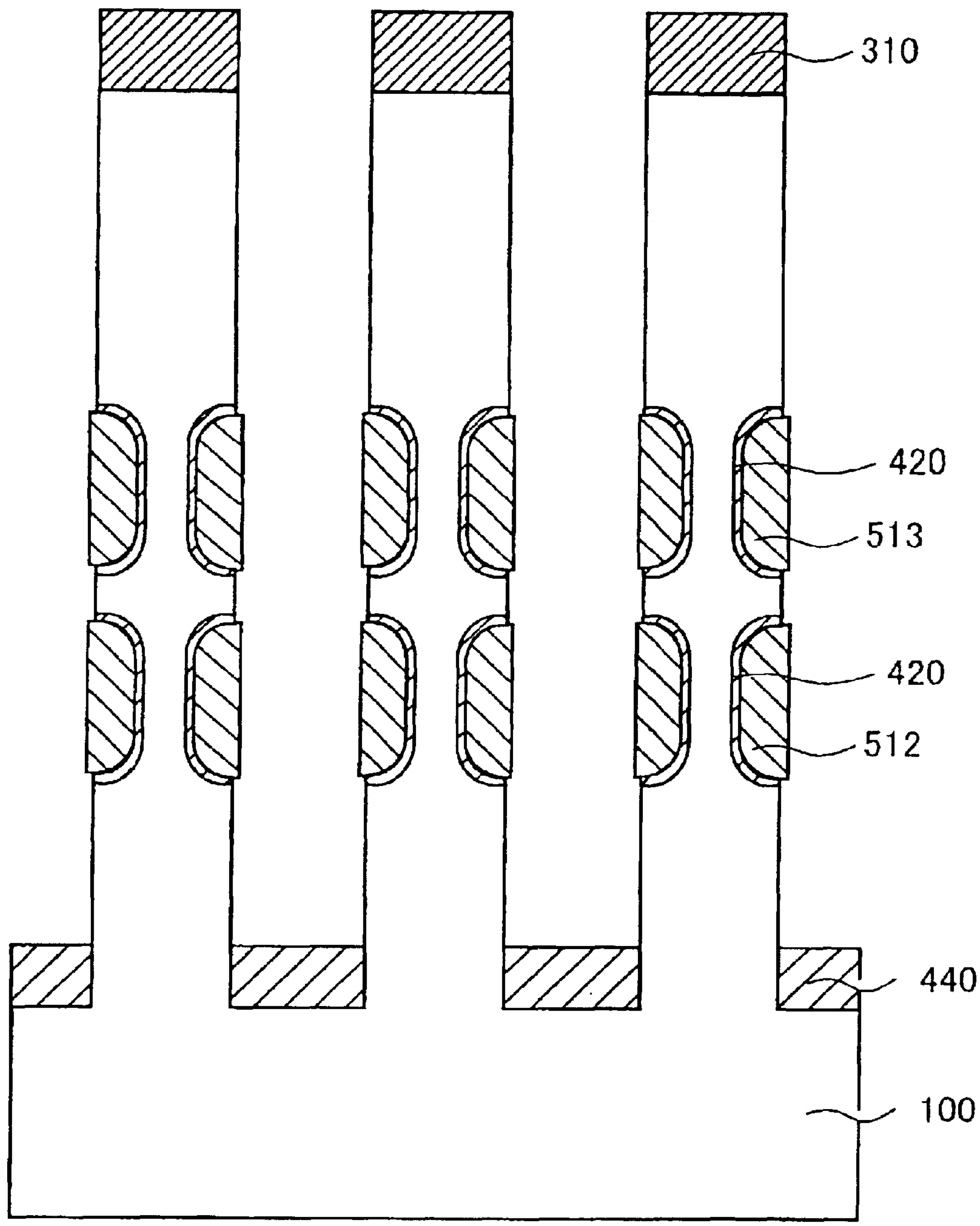
Figure 200:
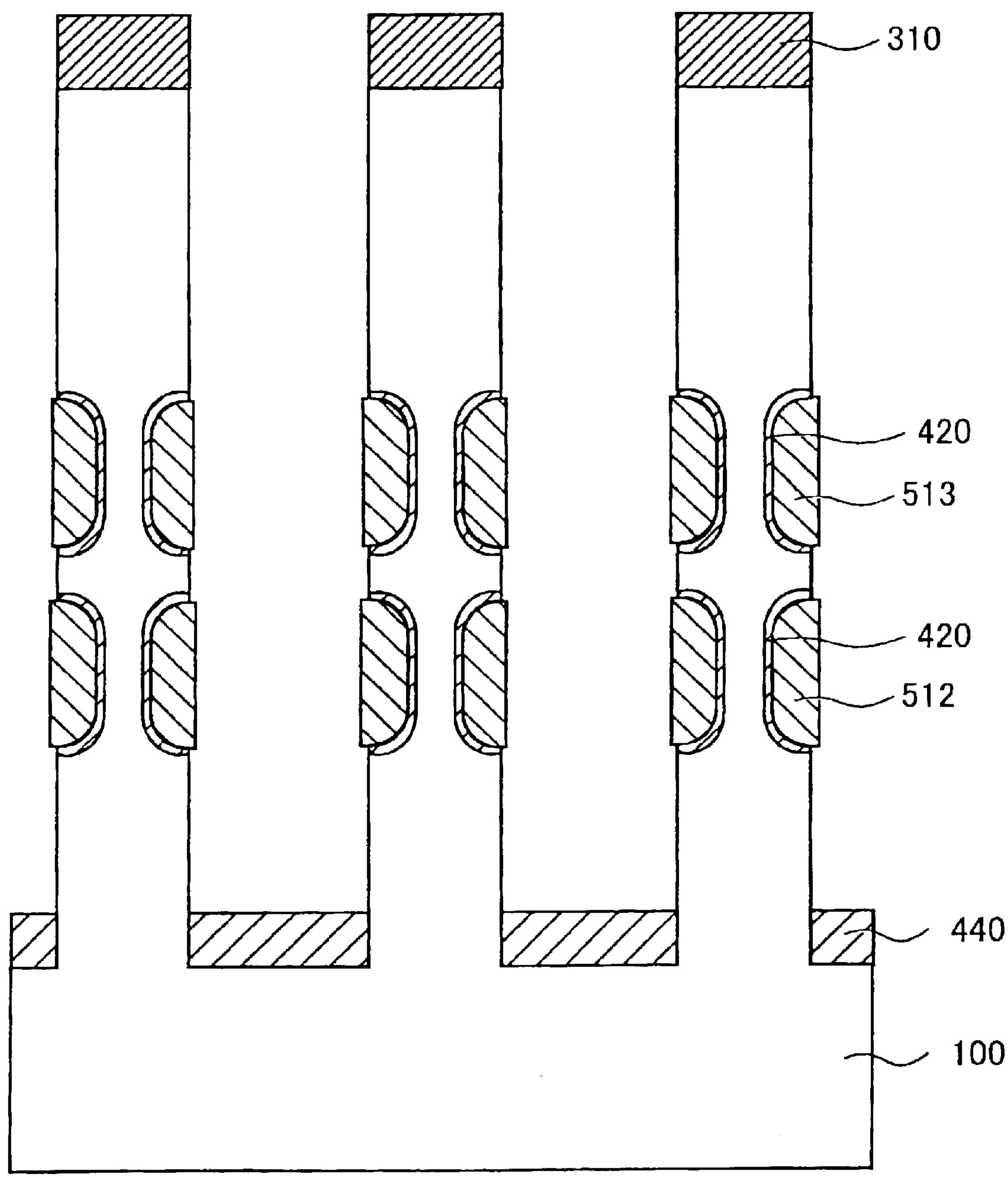

More specifically, after the polysilicon films 512 and 513 (the first conductive film) are buried as the first conductive films in the recesses formed on the sidewall of the island-like semiconductor layer 110 as explained in Production example 1, a silicon oxide film 440 (the sixth insulating film) is buried. At this time, a portion of the silicon oxide film 420 (the third insulating film) which is not buried in the recesses is removed. Therefore, as shown in FIG. 198 and FIG. 200, the outer circumferences of the polysilicon films 512 and 513 become larger than the outer circumference of the island-like semiconductor layer 110 by the thickness of the silicon oxide film 420. However, the outer circumference of the floating gate may be larger or smaller than that of the island-like semiconductor layer 110. A relationship between the outer circumferences is not important.

Figure 199:
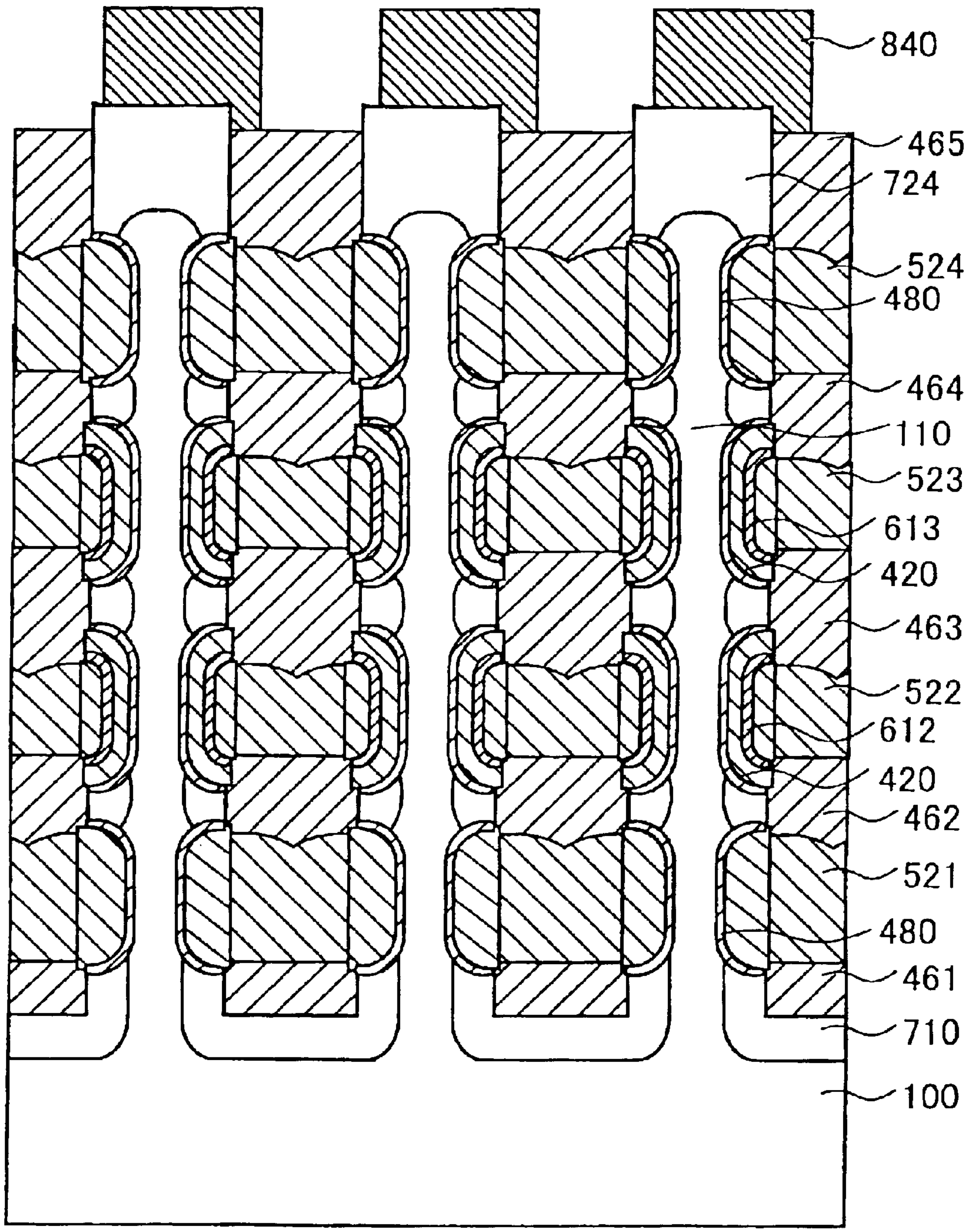
Figure 201:
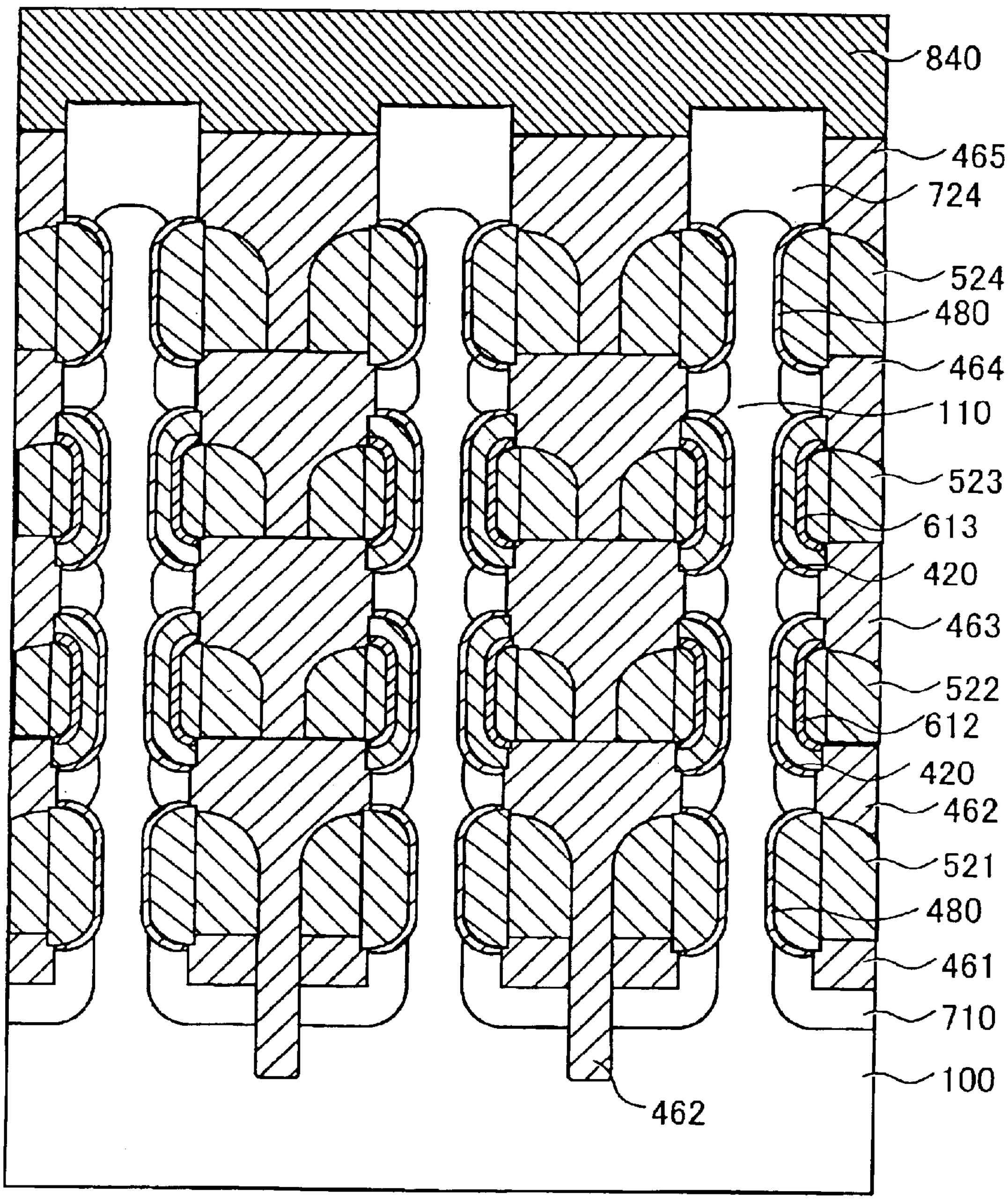
Figure 202:
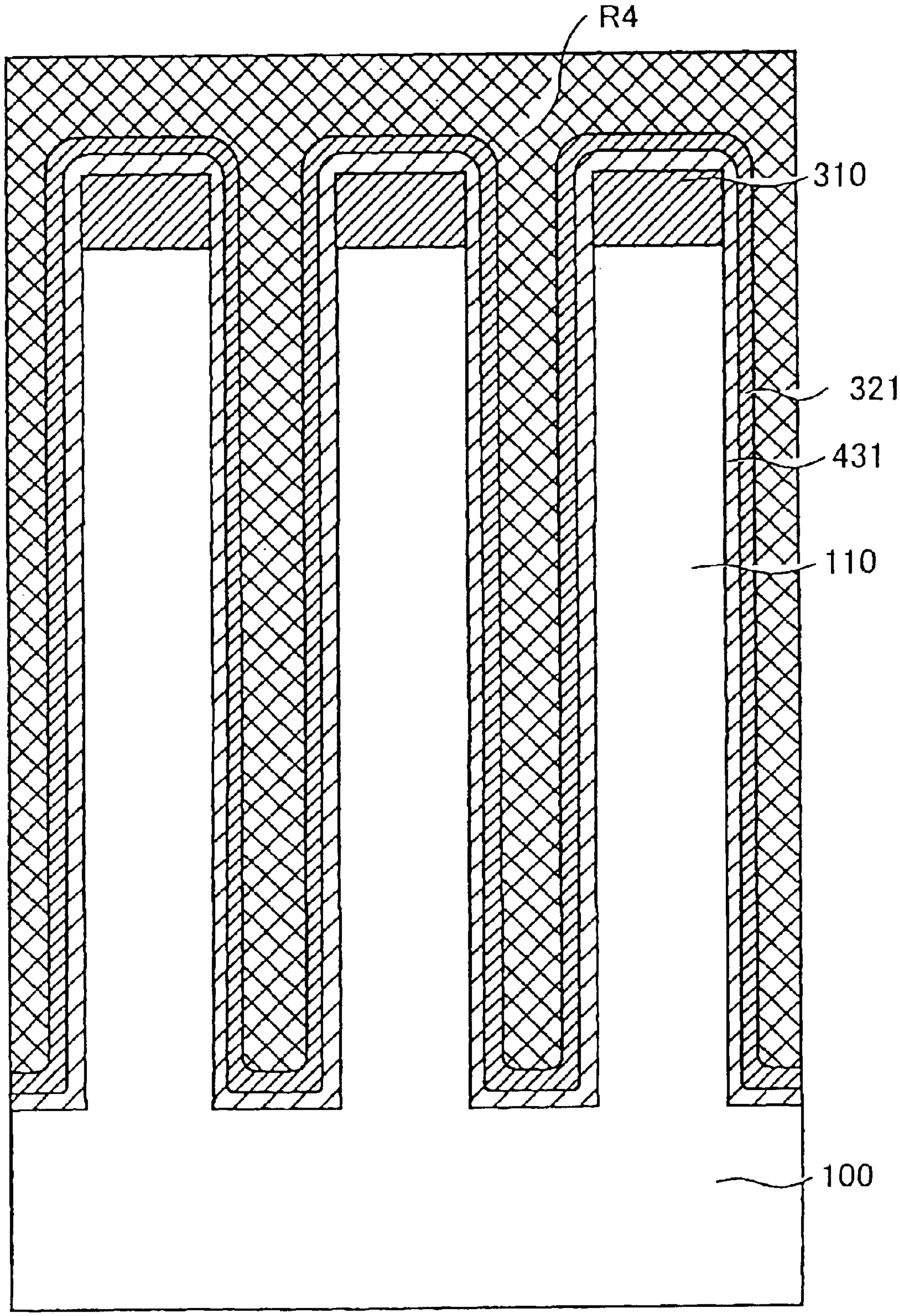

FIG. 199 and FIG. 201 show a completed semiconductor memory in which the outer circumference of the floating gate is larger than that of the island-like semiconductor layer 110 and the outer circumference of the selection gate is larger than that of the floating gate.

As regards the outer circumference of the selection gate, it may also be larger or smaller than that of the other gates and that of the island-like semiconductor layer 110. A relationship among them is not important.

PRODUCTION EXAMPLE 18

Explanation is given of an example of production process for producing a semiconductor memory in which a resist is used instead of the silicon oxide films 441 and 442 (the sixth insulating film). FIGS. 202 to 206 and FIGS. 207 to 211 are sectional views taken on line A–A' and line B–B', respectively, in FIG. 1 which is a cross-sectional view illustrating a memory cell array of an EEPROM.

In the semiconductor memory of Production example 1, the silicon oxide films 441 and 442 (the sixth insulating film) are buried and used as a mask for forming the silicon nitride films 321 to 323 (the fourth insulating film) on the sidewall of the island-like semiconductor layer 110. However, the silicon oxide films 441 and 442 may be replaced with a resist.

Figure 203:
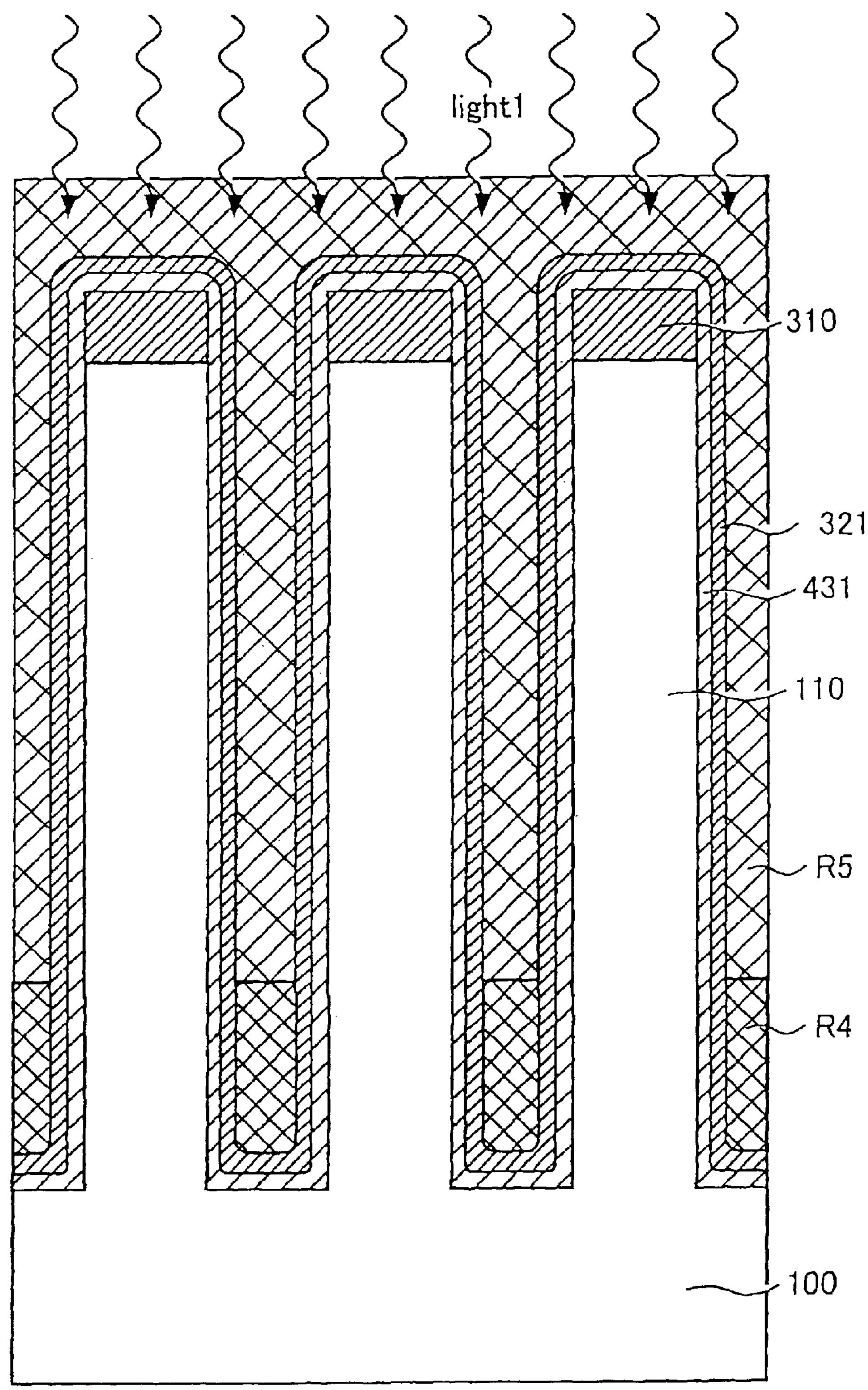
Figure 208:
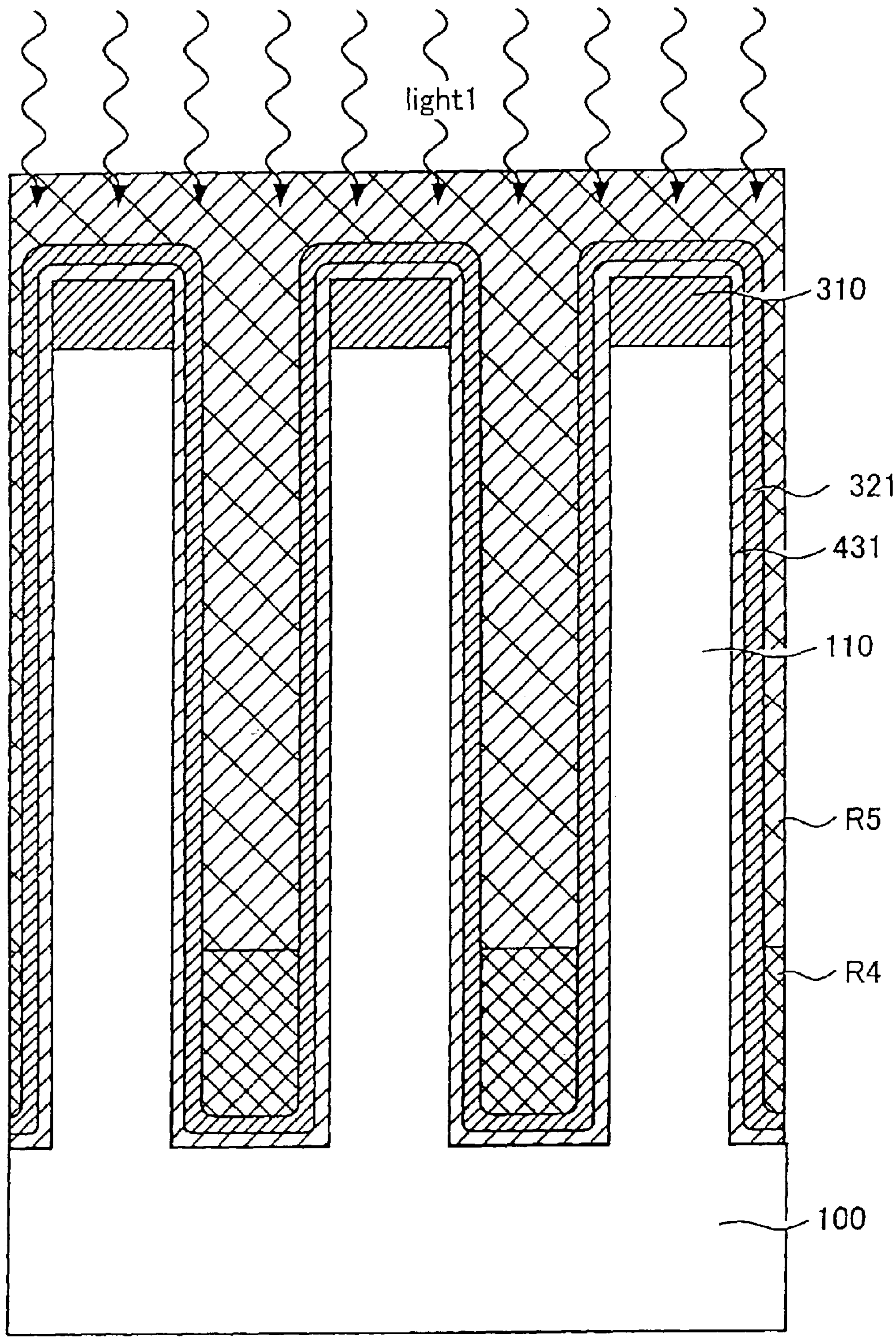

According to Production example 1, the silicon oxide film 321 (the fifth insulating film) is deposited and the silicon oxide film 441 is deposited. Thereafter, a resist R4 is applied to a thickness of about 500 to 25,000 nm (FIG. 202 and FIG. 207) and irradiated with light 1 to be exposed to a desired depth (FIG. 203 and FIG. 208). The light exposure to the desired depth may be controlled by exposure time, an amount of light, or both of them. Means of controlling the light exposure including the following development step is not limited.

Figure 204:
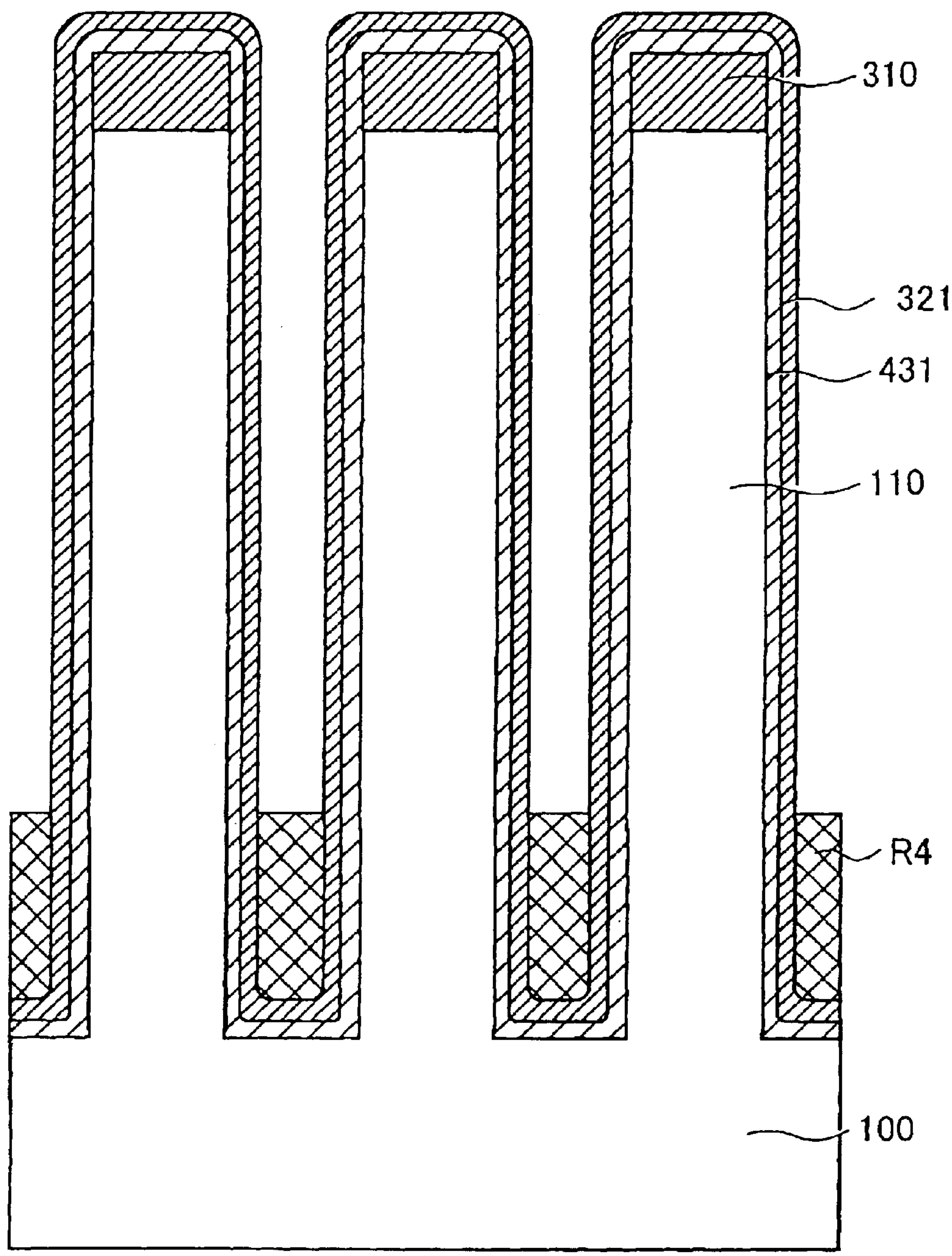
Figure 209:
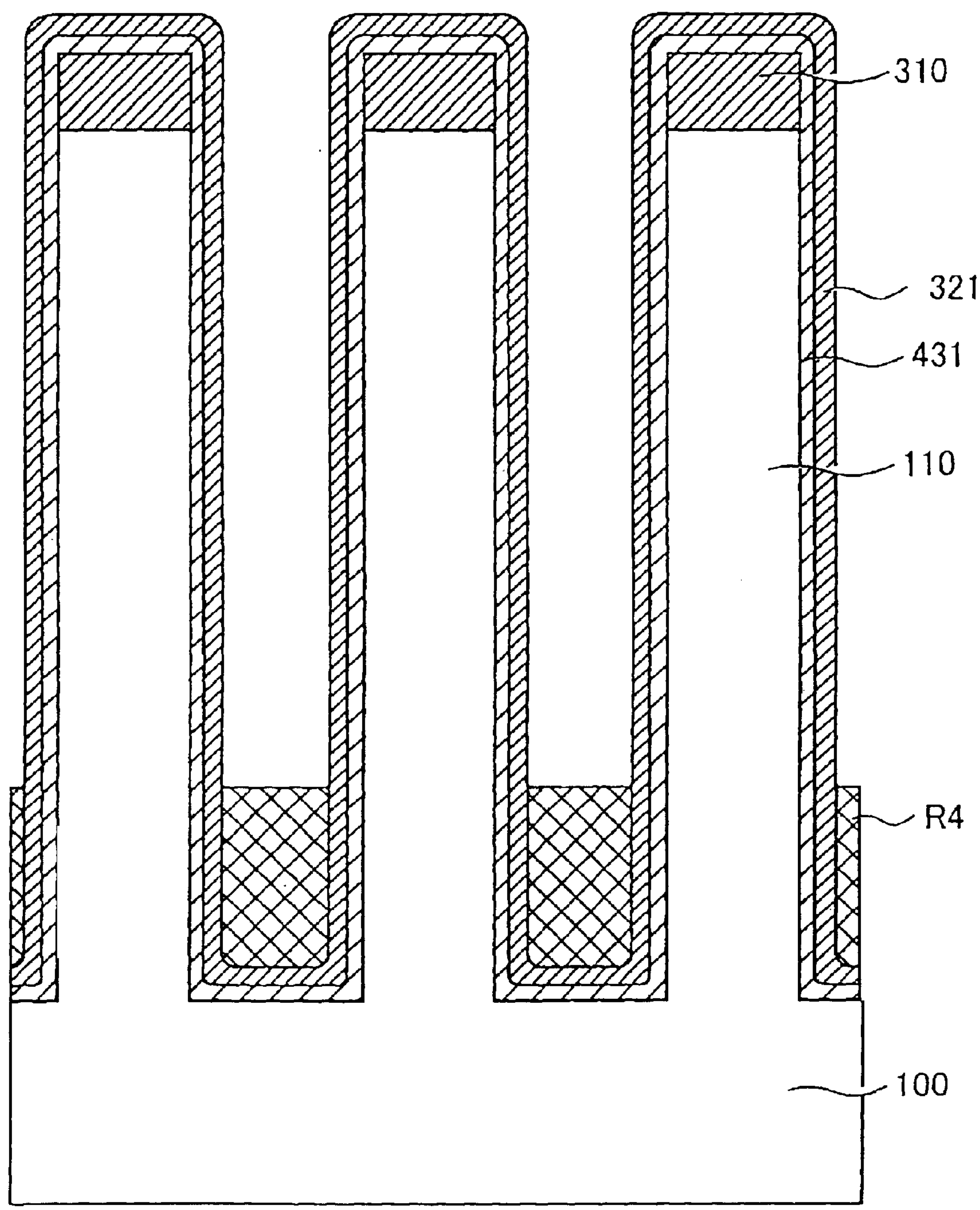

Subsequently, development is carried out by a known technique, and a resist R5, which is an exposed portion of the resist R4, is selectively removed and the resist R4 is buried (FIG. 204 and FIG. 209). According to the thus performed light exposure, the resist can be etched back with good controllability and variations in device performance are expected to be suppressed. However, the resist R4 may be etched back by ashing, instead of the light exposure. Alternatively, the resist may be applied such that it is buried to a desired depth at the application thereof, without performing the etch back. At this time, it is desirable to use a low-viscosity resist. These techniques may be combined in various ways. It is desired that the surface on which the resist R4 is applied is hydrophilic, for example, the resist R4 is desirably applied on the silicon oxide film.

Figure 205:
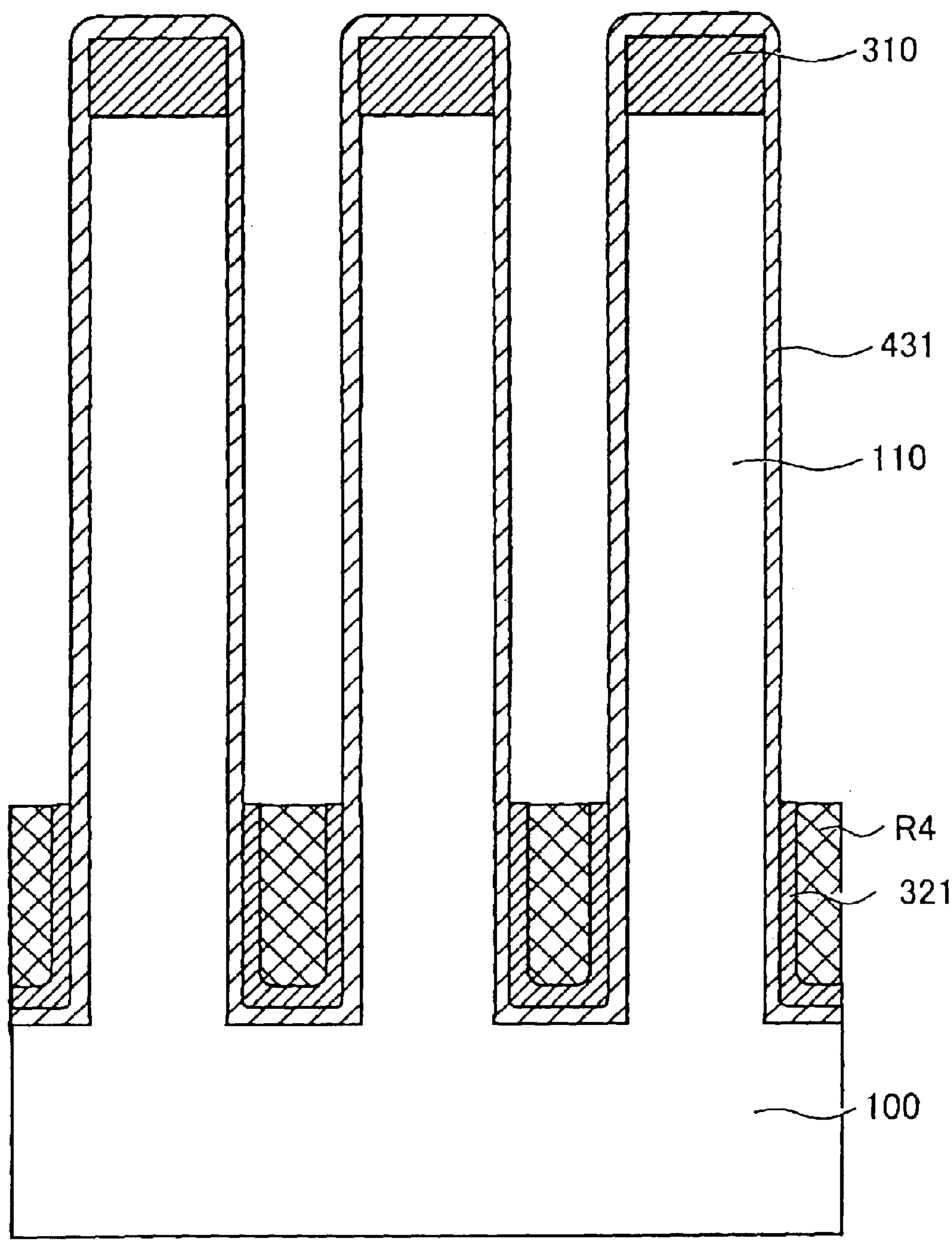
Figure 210:
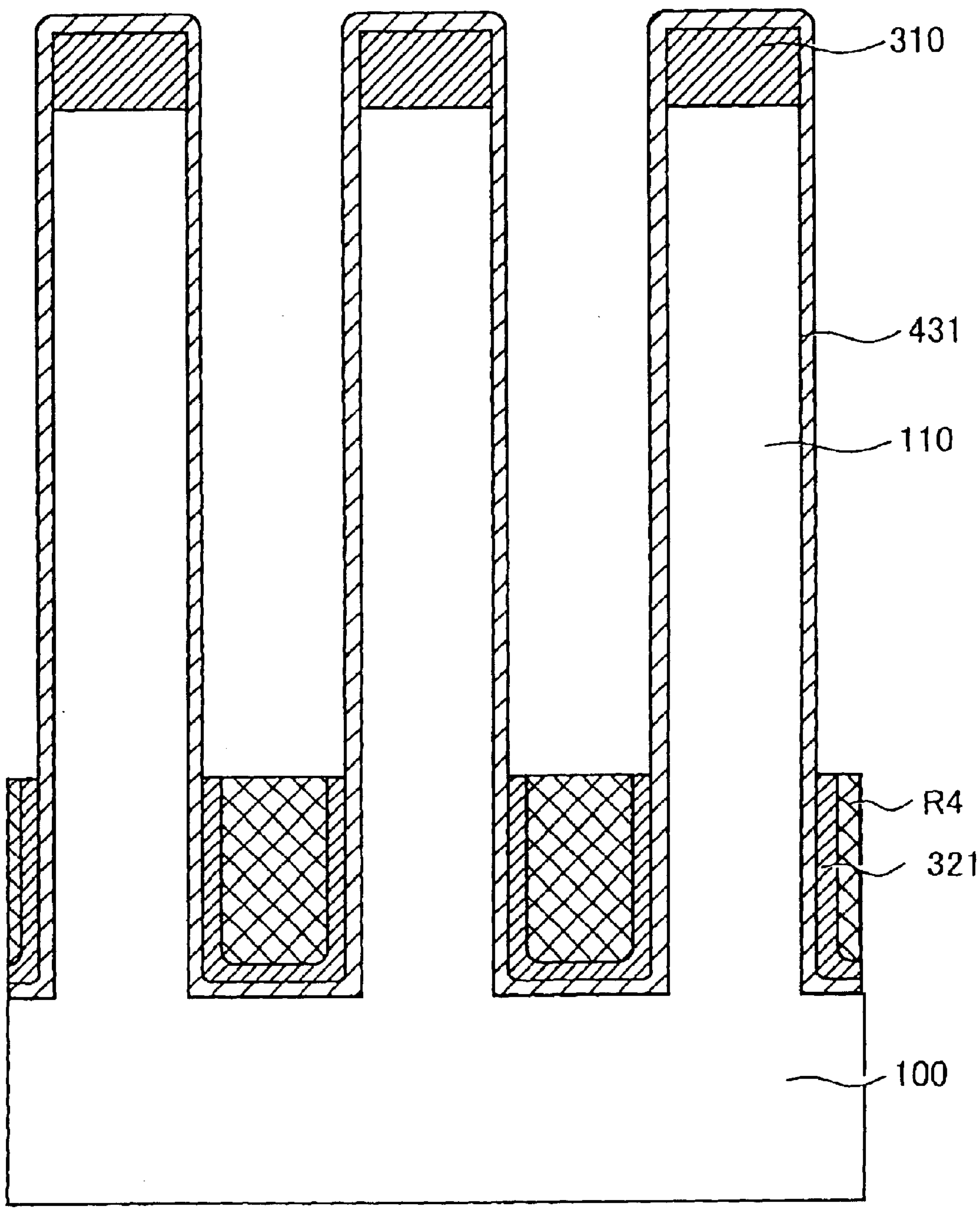

Thereafter, using the resist R4 as a mask, an exposed portion of the silicon nitride film 321 (the fourth insulating film) is removed by isotropic etching, for example (FIG. 205 and FIG. 210).

Figure 206:
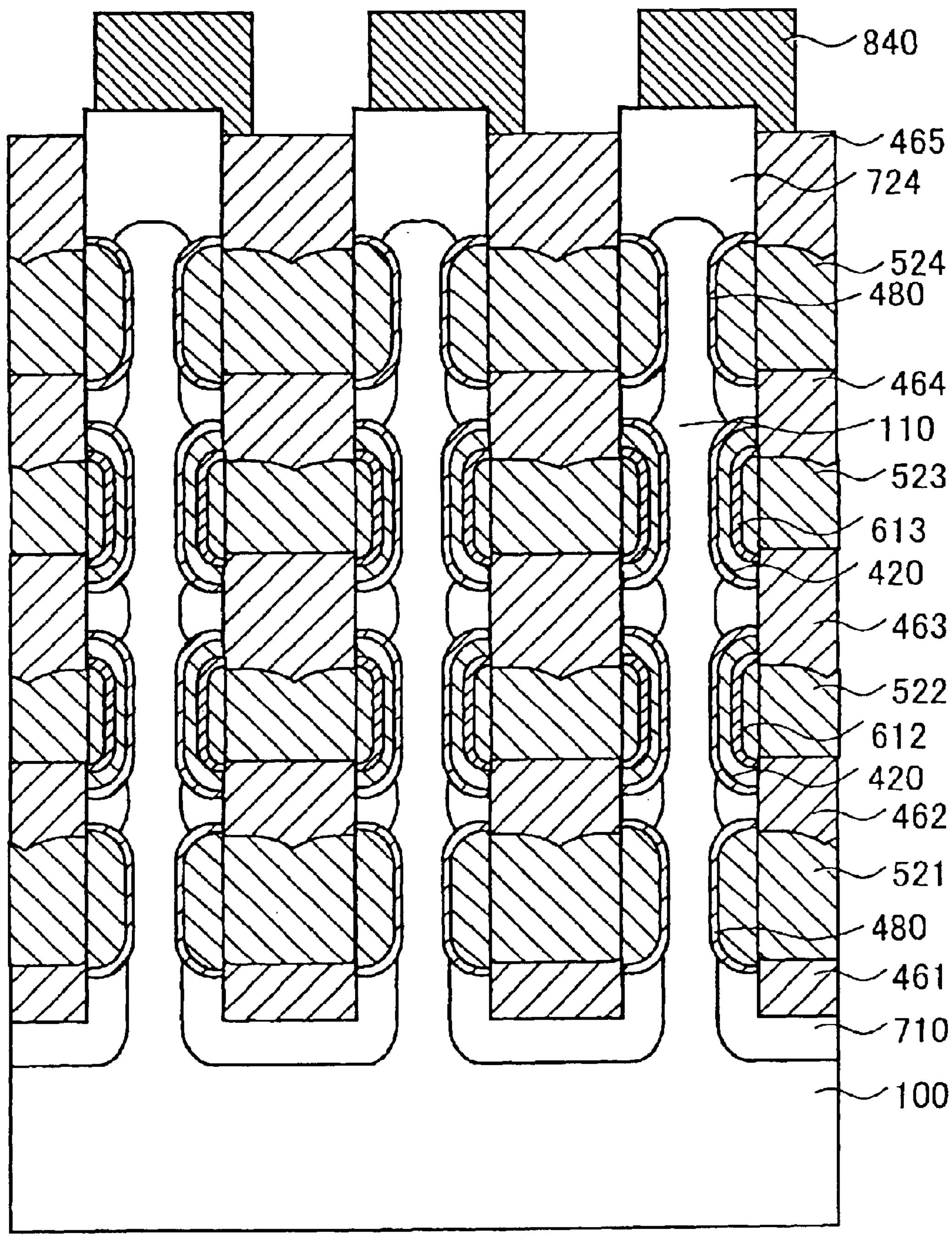
Figure 207:
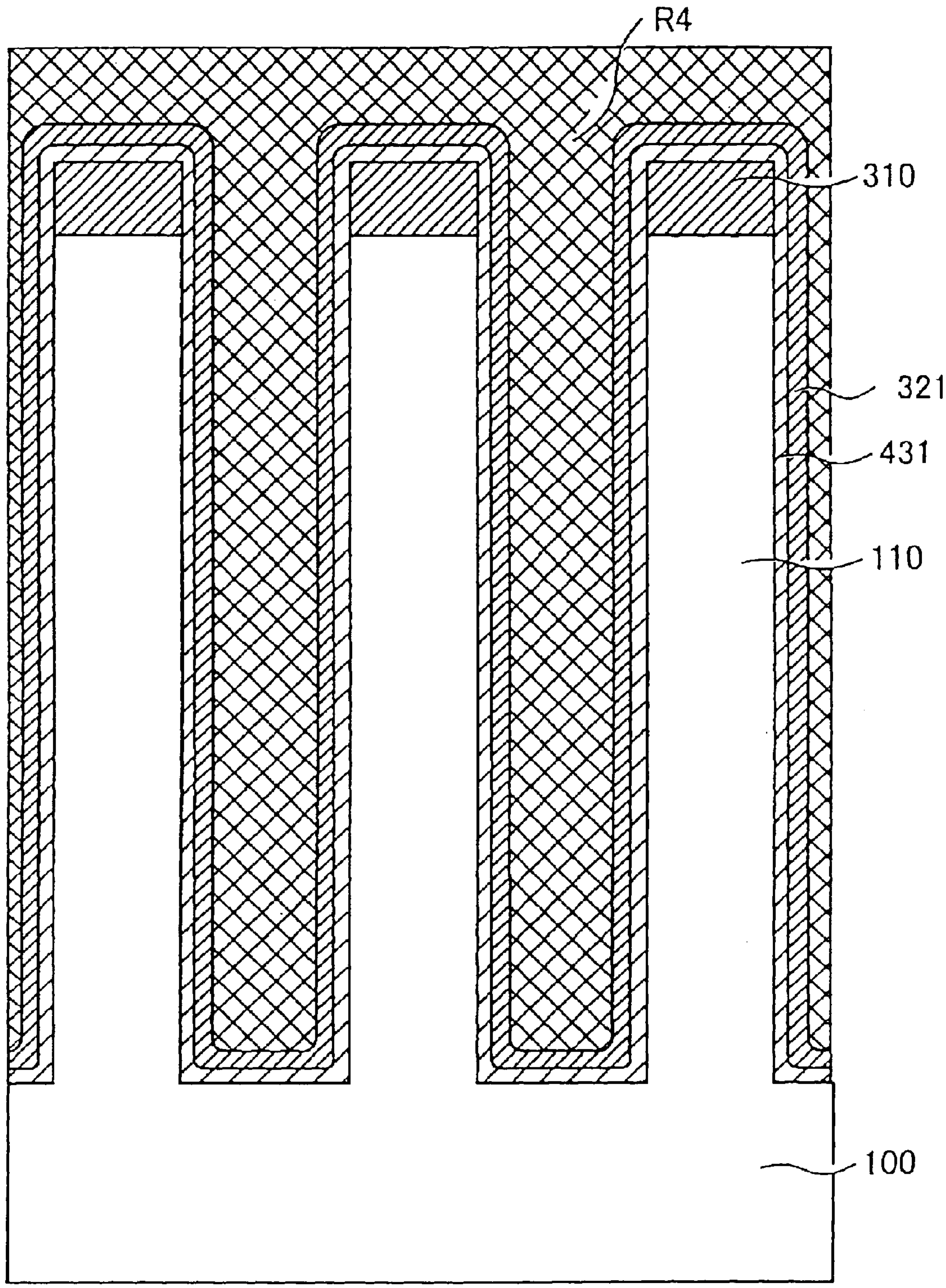
Figure 211:
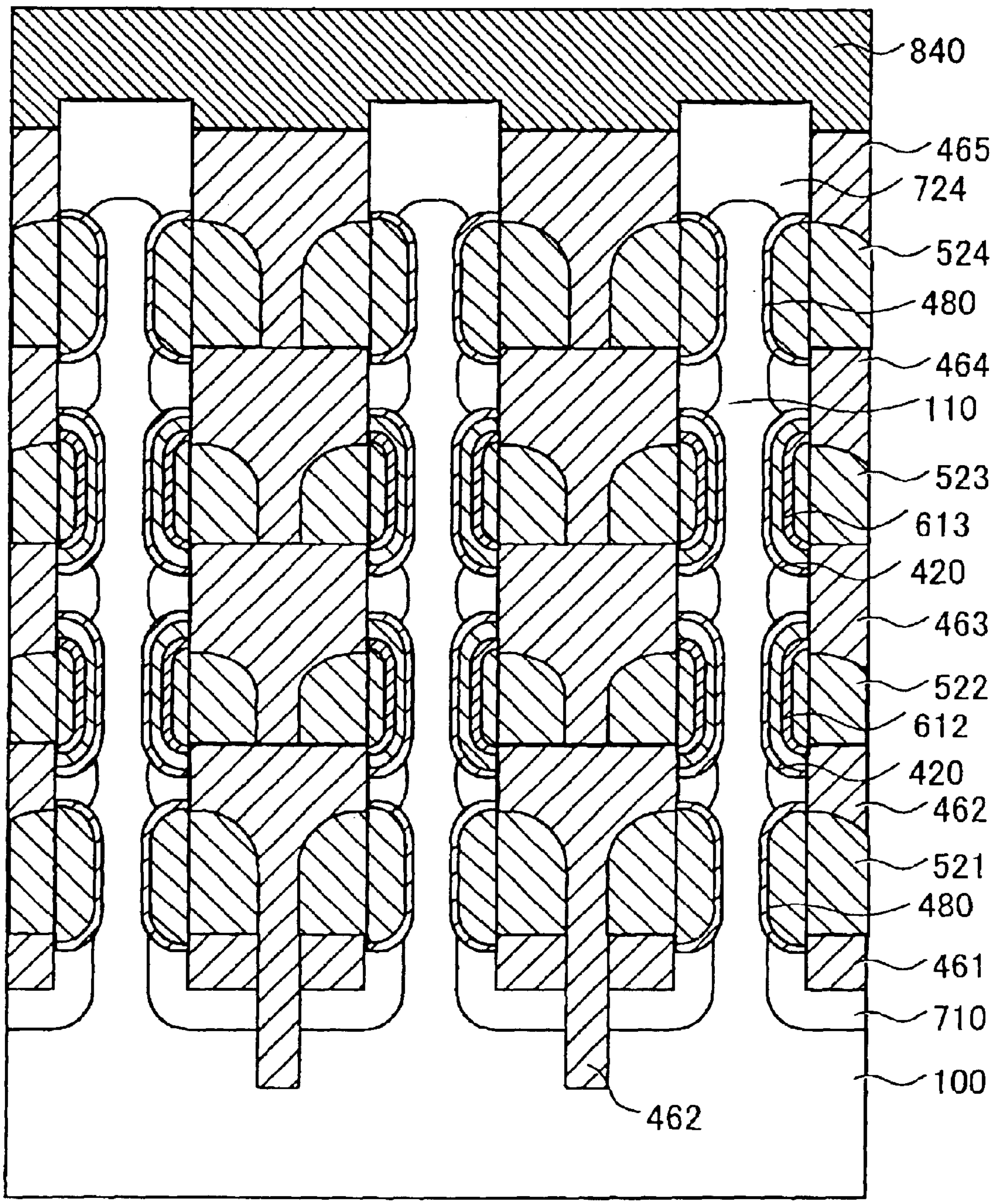

After the resist R4 is removed, production steps follow Production example 1. Thereby, a semiconductor memory as explained in Production example 1 is realized (FIG. 206 and FIG. 211).

By making use of the resist instead of the silicon oxide films 441 and 442 (the sixth insulating film), thermal history to the tunnel oxide film and the like is reduced and a rework can be done easily.

PRODUCTION EXAMPLE 19

In the semiconductor memory explained in Production example 1, the P-type silicon substrate 100 is patterned to form the island-like semiconductor layers 110 by using the resist R1 patterned by a known photolithography technique. In connection to this, explanation is given of an example of producing a semiconductor memory, in which the diameter of the island-like semiconductor layer 110, which is determined at the patterning of the resist R1, is increased.

FIGS. 212 to 214 and FIGS. 215 to 217 are sectional views taken on line A–A' and line B–B', respectively, in FIG. 1 which is a cross-sectional view illustrating a memory cell array of an EEPROM.

In the semiconductor memory of Production example 1, the memory cells and the selection gate transistors are formed within the island-like semiconductor layers 110, so that intervals between the island-like semiconductor layers 110 in the memory cell array have a margin. Therefore, the diameter of the island-like semiconductor layers 110 may be increased without changing the intervals therebetween. However, in the case where the island-like semiconductor layers 110 are formed at the minimum photoetching dimension to have the minimum diameter and the minimum intervals, it is impossible to decrease the intervals provided at the minimum photoetching dimension. Therefore, when the diameter of the island-like semiconductor layers 110 increases, the intervals between the island-like semiconductor layers 110 also increase. This is disadvantageous because the device capacitance decreases. Hereinafter, explanation is given of an example of production process in which the diameter of the island-like semiconductor layers 110 is increased without increasing the intervals between the island-like semiconductor layers 110.

Figure 212:
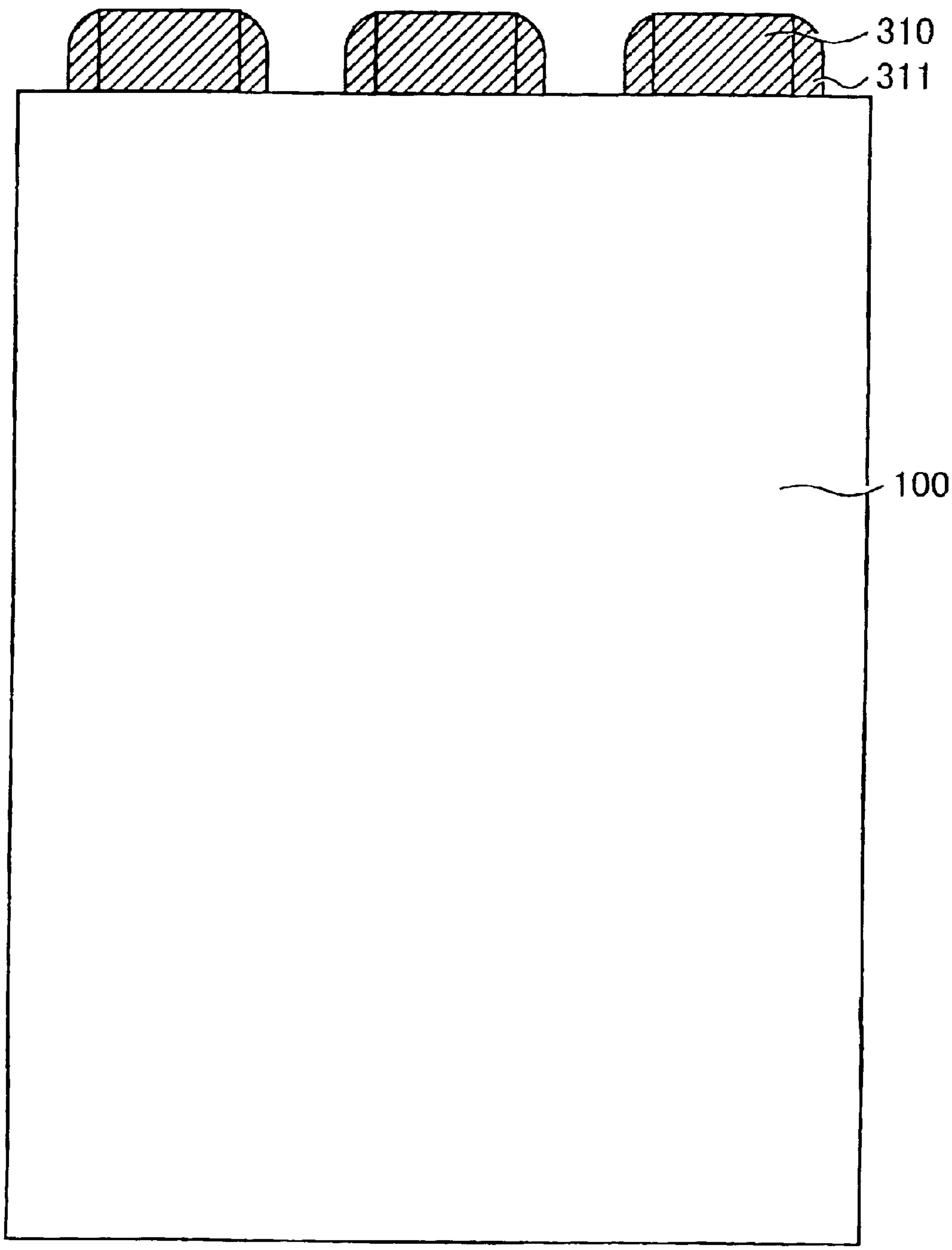
Figure 215:
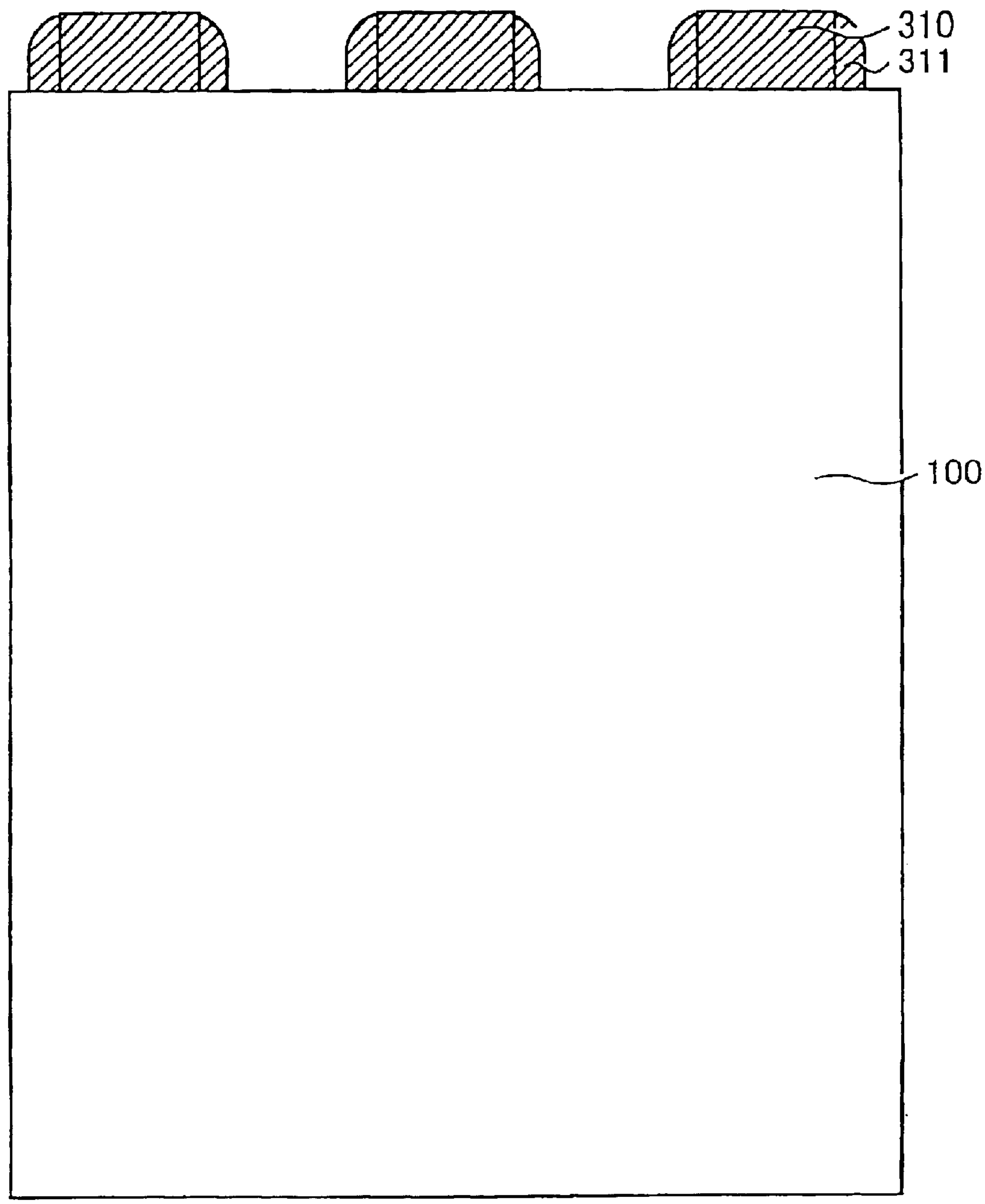

First, as described in Production example 1, a silicon nitride film 310 is deposited to a thickness of 200 to 2,000 nm as a first insulating film to be a mask layer on a surface of a P-type silicon substrate 100 and then etched by reactive ion etching using a resist R1 patterned by a known photolithography technique as a mask. Then, a silicon nitride film 311 is deposited to a thickness of 50 to 500 nm as a first insulating film and anisotropically etched by about a deposit thickness so that the silicon nitride film 311 remains in the form of a sidewall spacer on the sidewall of the silicon nitride film 310 (FIG. 212 and FIG. 215).

Figure 213:
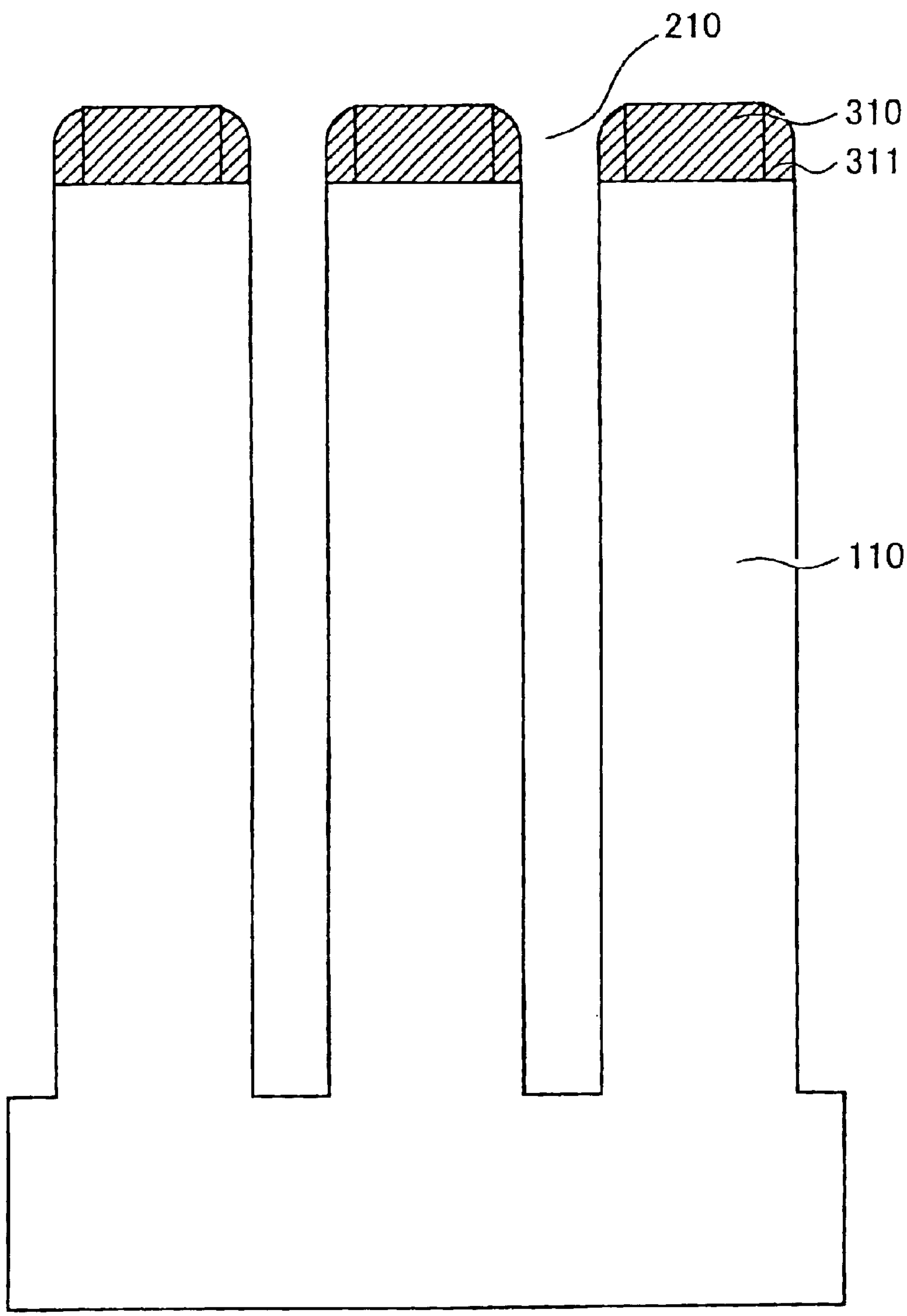
Figure 216:
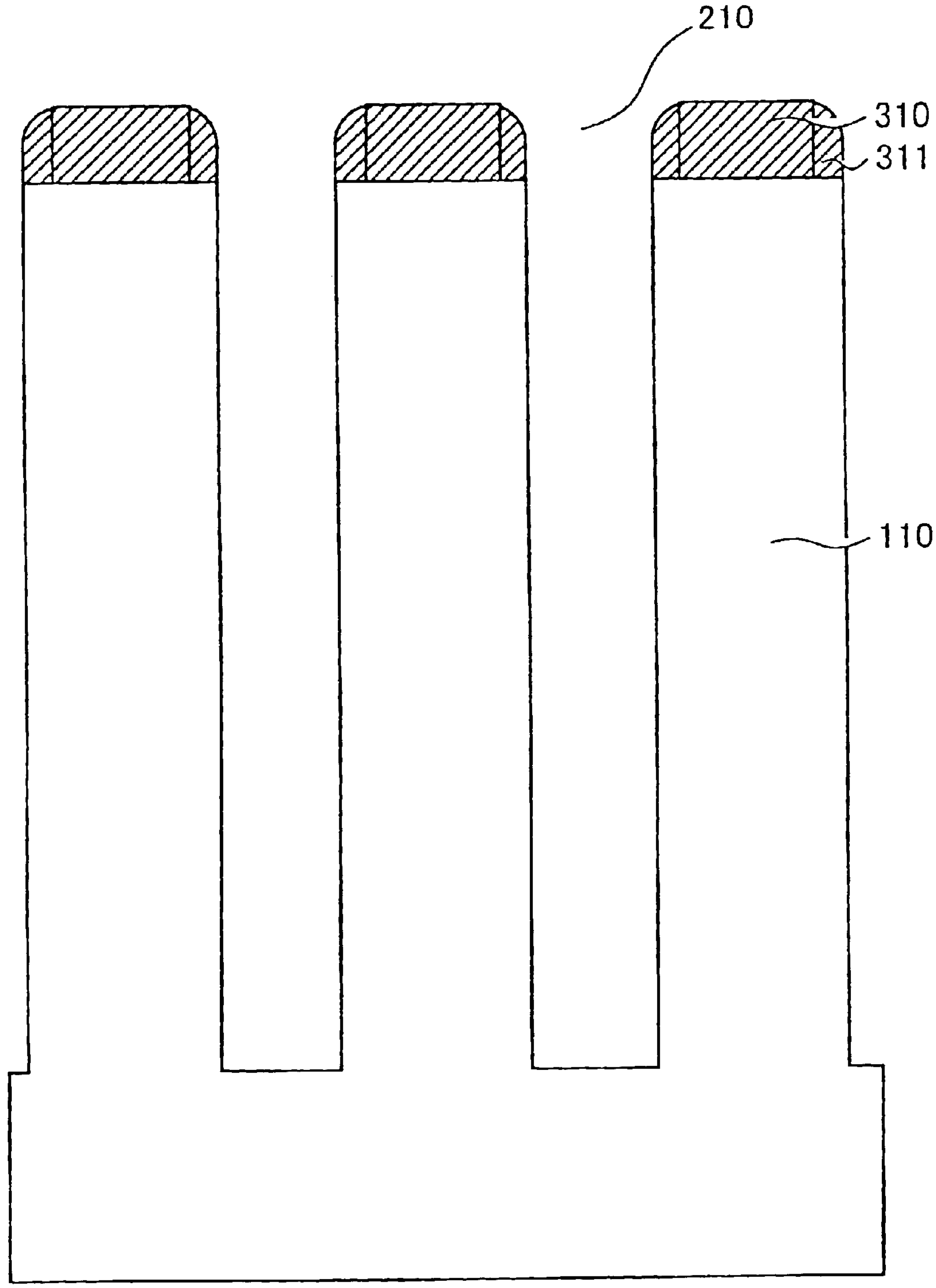

Using the silicon nitride films 310 and 311 as a mask, the P-type silicon substrate 100 is etched by 2,000 to 20,000 nm by reactive ion etching to form a first lattice-form trench 210. Thereby, the island-like semiconductor layers 110 are formed to have an increased diameter, which is determined at the patterning of the resist RI (FIG. 213 and FIG. 216).

Figure 214:
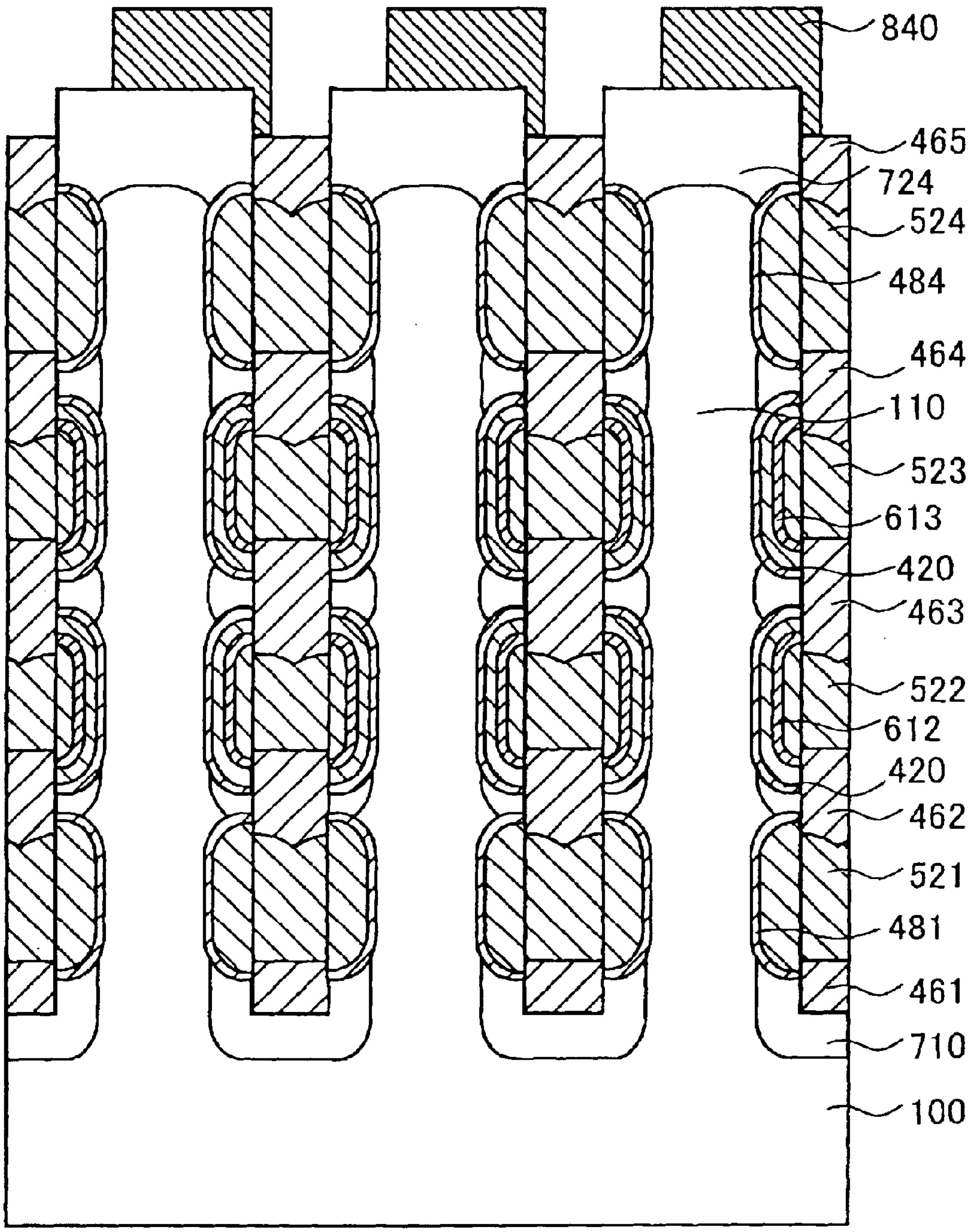
Figure 217:
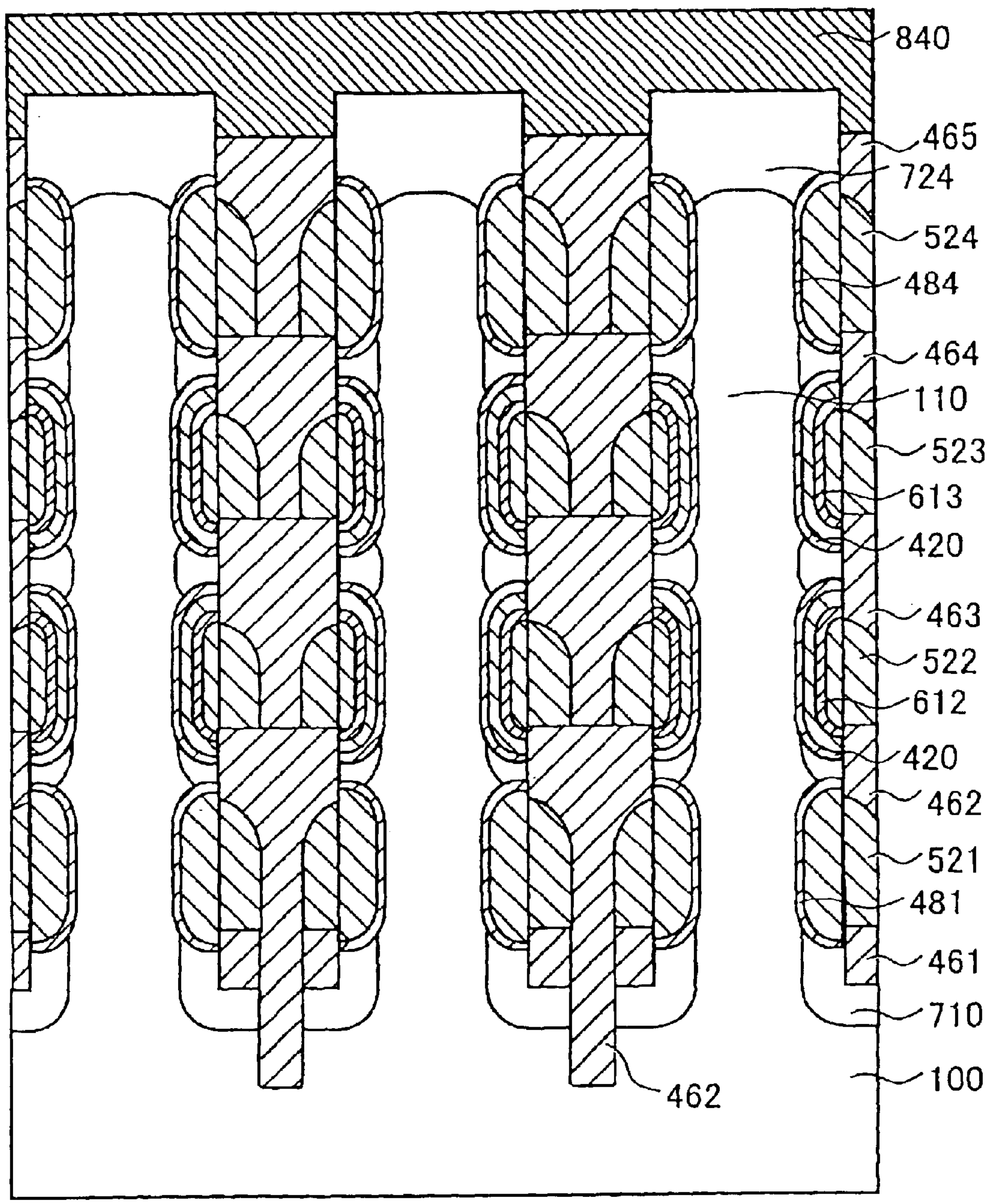

Production steps thereafter follow Production Example 1. Thereby, a semiconductor memory is realized which has a memory function according to the state of a charge in the charge storage layer which is the floating gate made of the polysilicon film (FIG. 214 and FIG. 217).

Thus, the same effect as obtained by Production Example 1 is obtained. Owing to the increase of the diameter of the island-like semiconductor layers 110, resistance at the top and the bottom of the island-like semiconductor layer 110, i.e., resistance at a source and a drain, is reduced, driving current increases and cell characteristics improve. Further, the back-bias effect is expected to decrease due to the reduction of the source resistance. Moreover, since the open area ratio is reduced in the formation of the island-like semiconductor layers 110, the trench is easily formed by etching and the amount of reaction gas used for the etching is reduced, which allows the reduction of process costs.

PRODUCTION EXAMPLE 20

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Such a semiconductor memory is produced by the following production process.

FIGS. 218 to 243 and FIGS. 244 to 269 are sectional views taken on line A–A' and line B–B', respectively, in FIG. 1 which is a cross-sectional view illustrating a memory cell array of an EEPROM.

Figure 218:
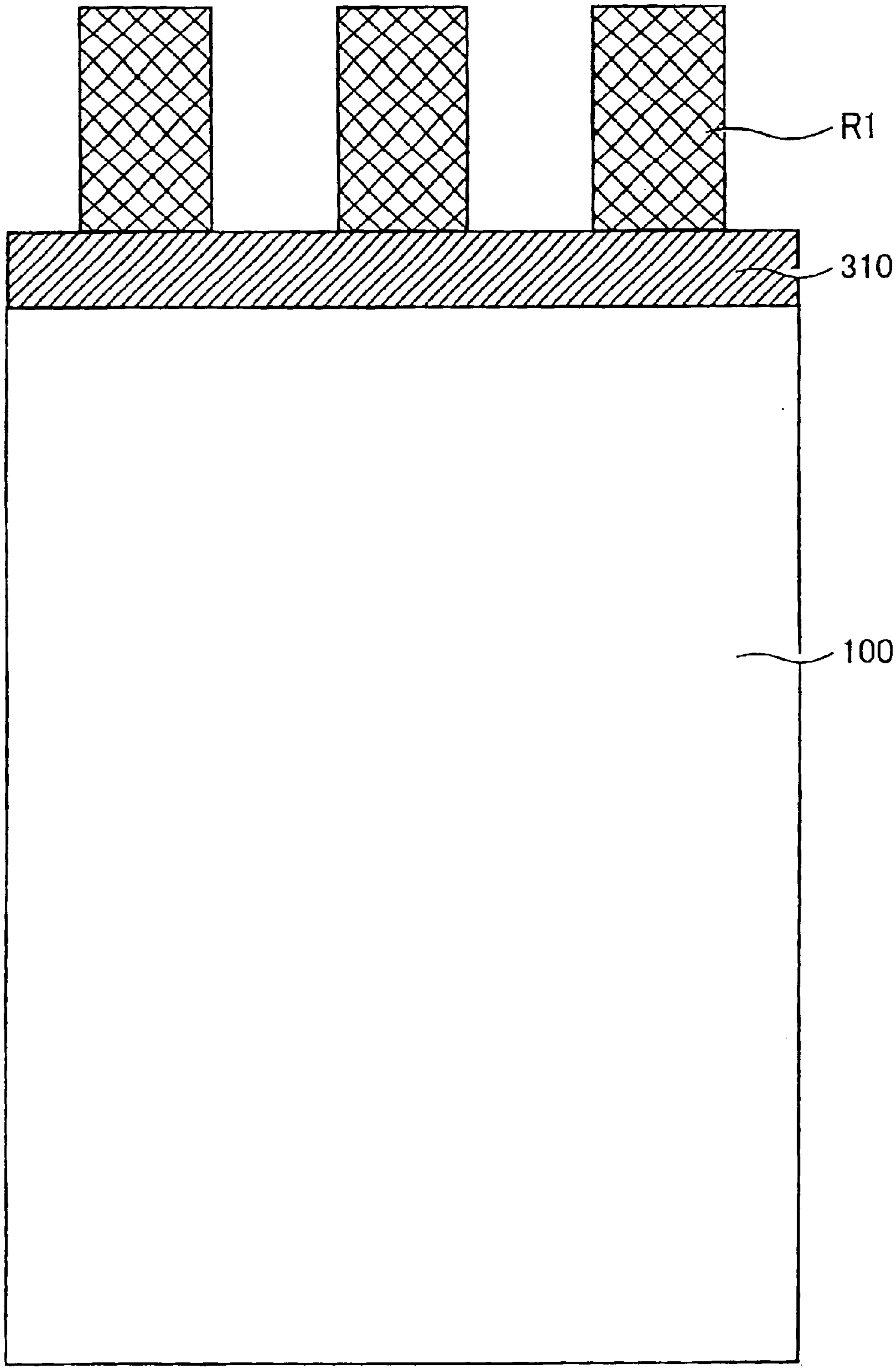
Figure 244:
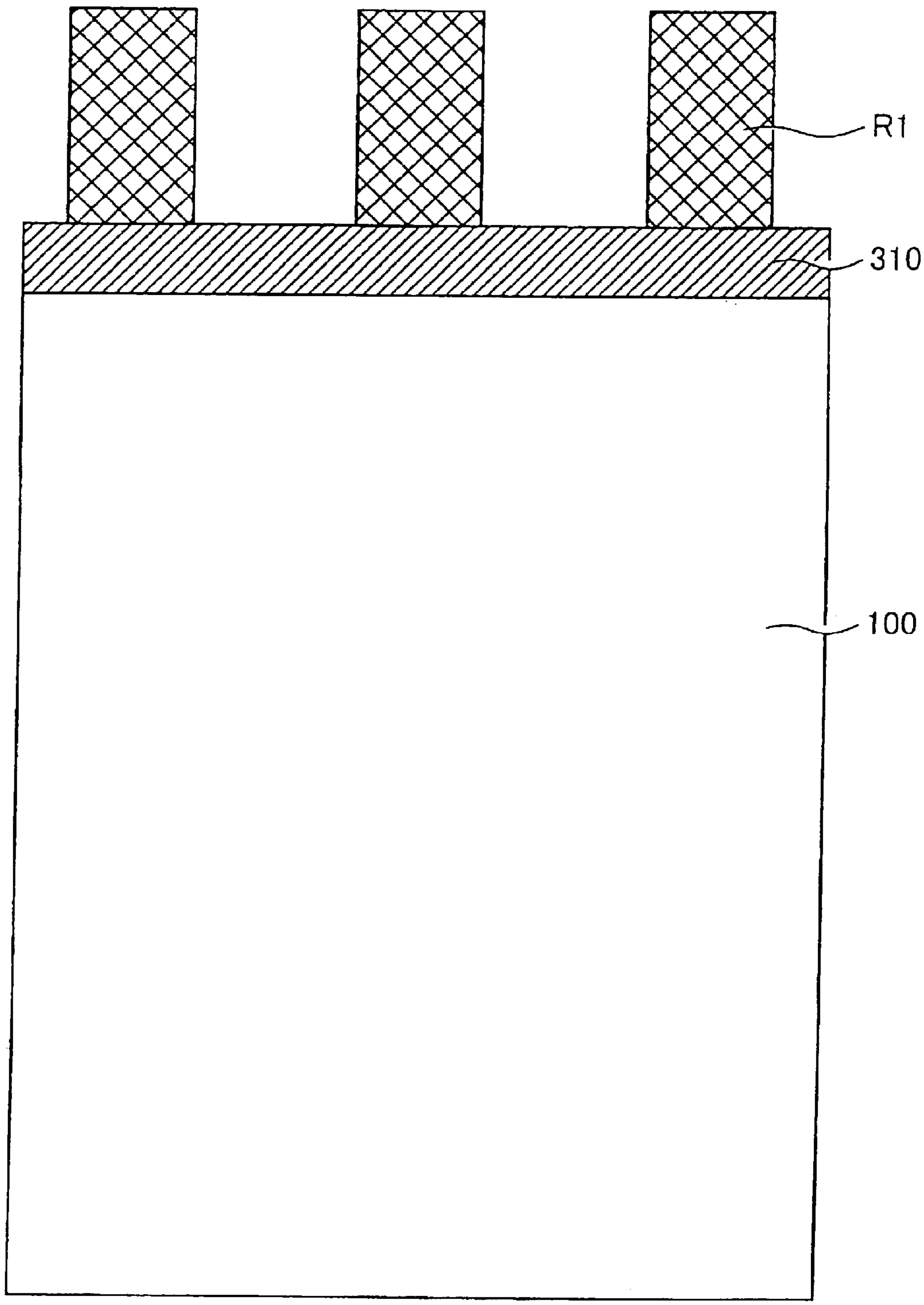

In this production example, a silicon nitride film 310 is deposited to a thickness of 200 to 2,000 nm as a first insulating film to be a mask layer on a surface of a P-type silicon substrate 100, and a resist R1 patterned by a known photolithography technique is used as a mask (FIG. 218 and FIG. 244).

Figure 219:
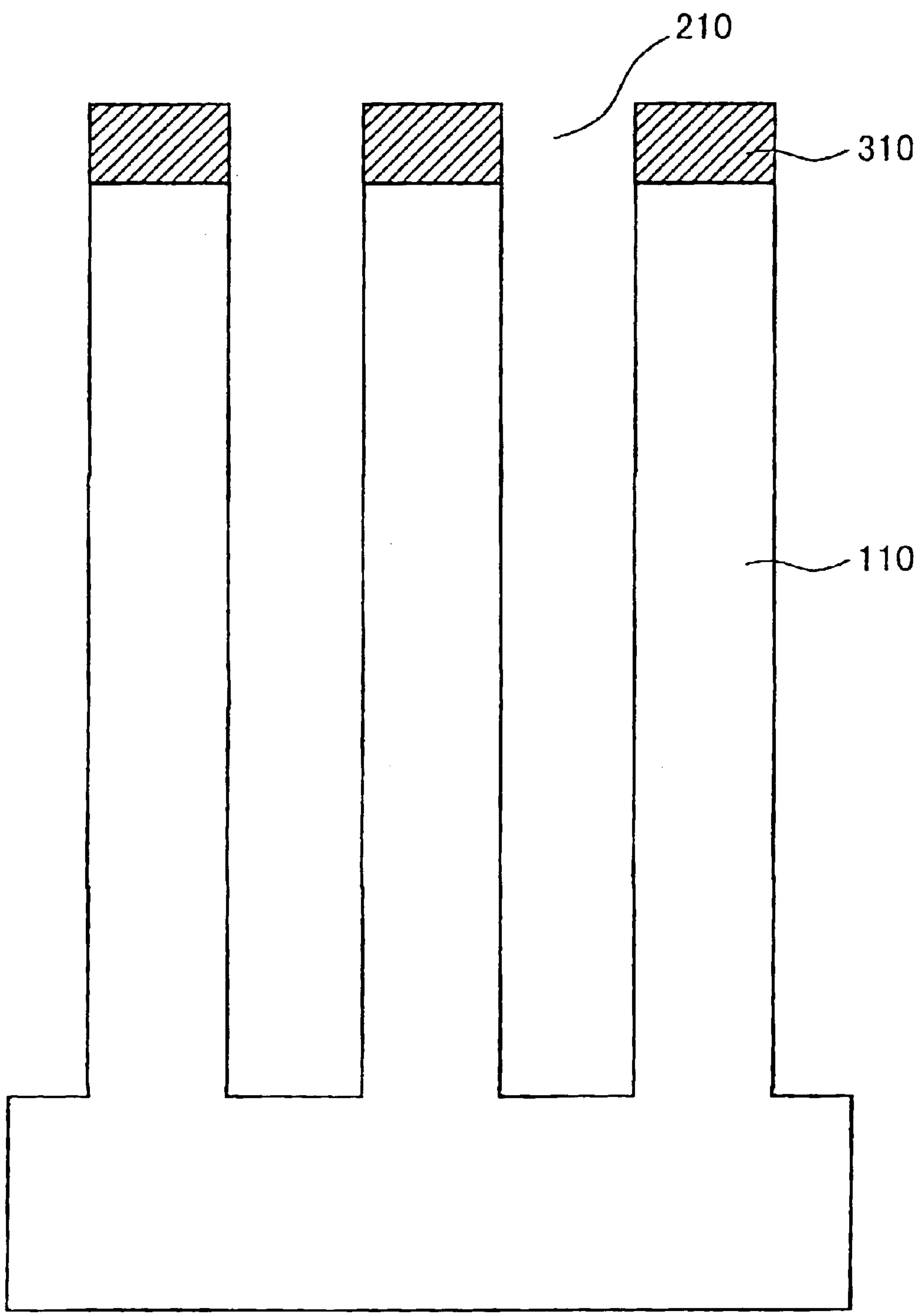
Figure 245:
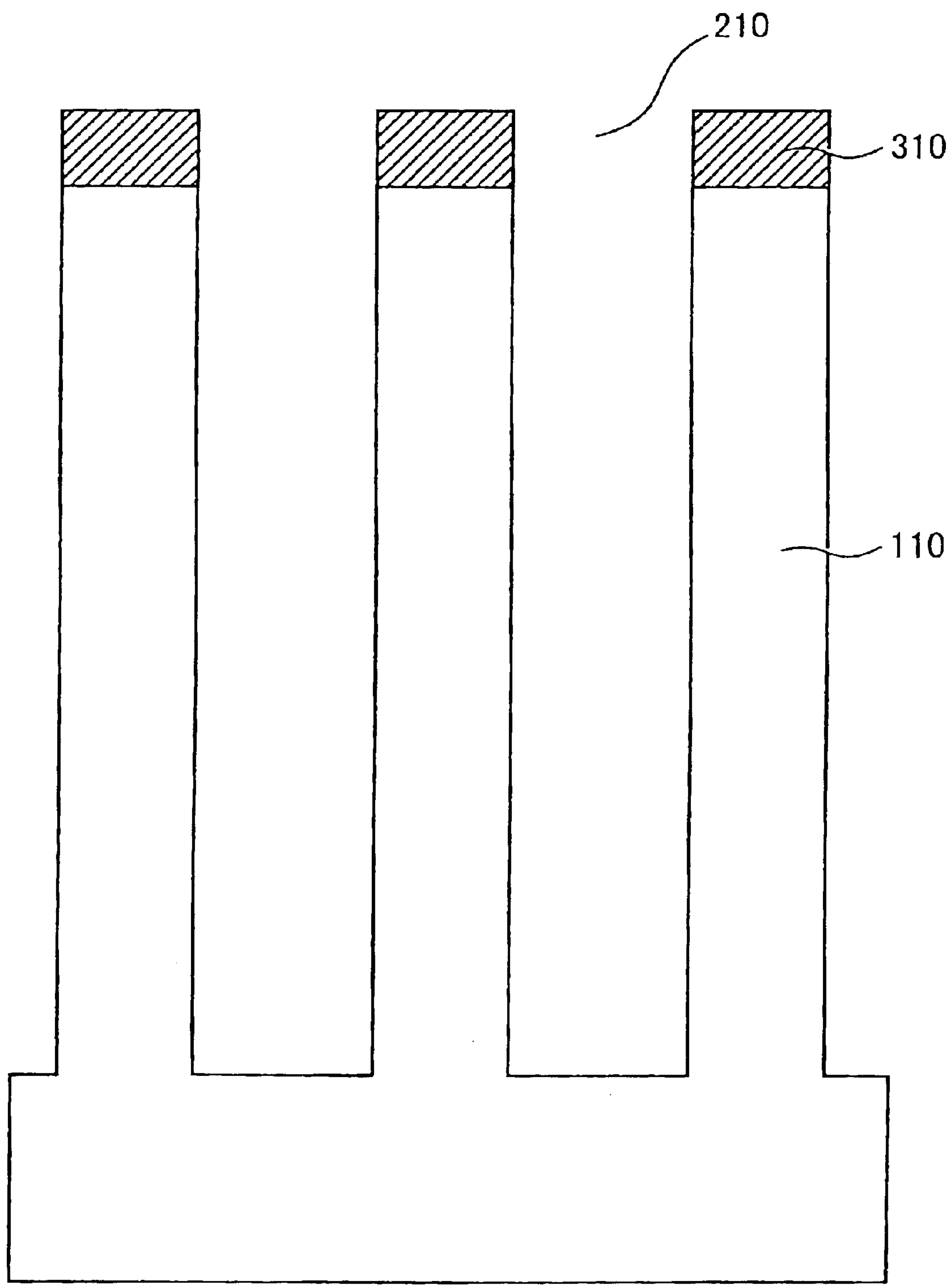

The silicon nitride film 310 is etched by reactive ion etching. Using the silicon nitride film 310 as a mask, the P-type silicon substrate 100 is etched by 2,000 to 20,000 nm by reactive ion etching to form a first trench 210 in a lattice form (FIG. 219 and FIG. 245). Thereby, the P-type silicon substrate 100 is divided into a plurality of columnar island-like semiconductor layers 110.

Thereafter, as required, the surface of the island-like semiconductor layer 110 is oxidized to form a thermally oxidized film 410 having a thickness of 10 to 100 nm as a second insulating film. At this time, if the island-like semiconductor layer 110 has been formed at the minimum photoetching dimension, the dimension of the island-like semiconductor layer 110 is decreased by the formation of the thermally oxidized film 410, that is, the island-like semiconductor layer 110 is formed to have a dimension smaller than the minimum photoetching dimension.

Next, the thermally oxidized film 410 is etched away from the periphery of each island-like semiconductor layer 110 by isotropic etching. Then, as required, channel ion implantation is carried out into the sidewall of the island-like semiconductor layer 110 by utilizing slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 110 because a surface impurity concentration becomes more uniform. Alternatively, instead of the channel ion implantation, an oxide film containing boron may be deposited by CVD with a view to utilizing diffusion of boron from the oxide film.

The impurity implantation from the surface of the island-like semiconductor layers 110 may be carried out before the island-like semiconductor layers are covered with the thermally oxidized film 410, or the impurity implantation may be finished before the island-like semiconductor layers 110 are formed. Means for the implantation are not particularly limited so long as an impurity concentration distribution is almost equal over the island-like semiconductor layers 110.

Figure 220:
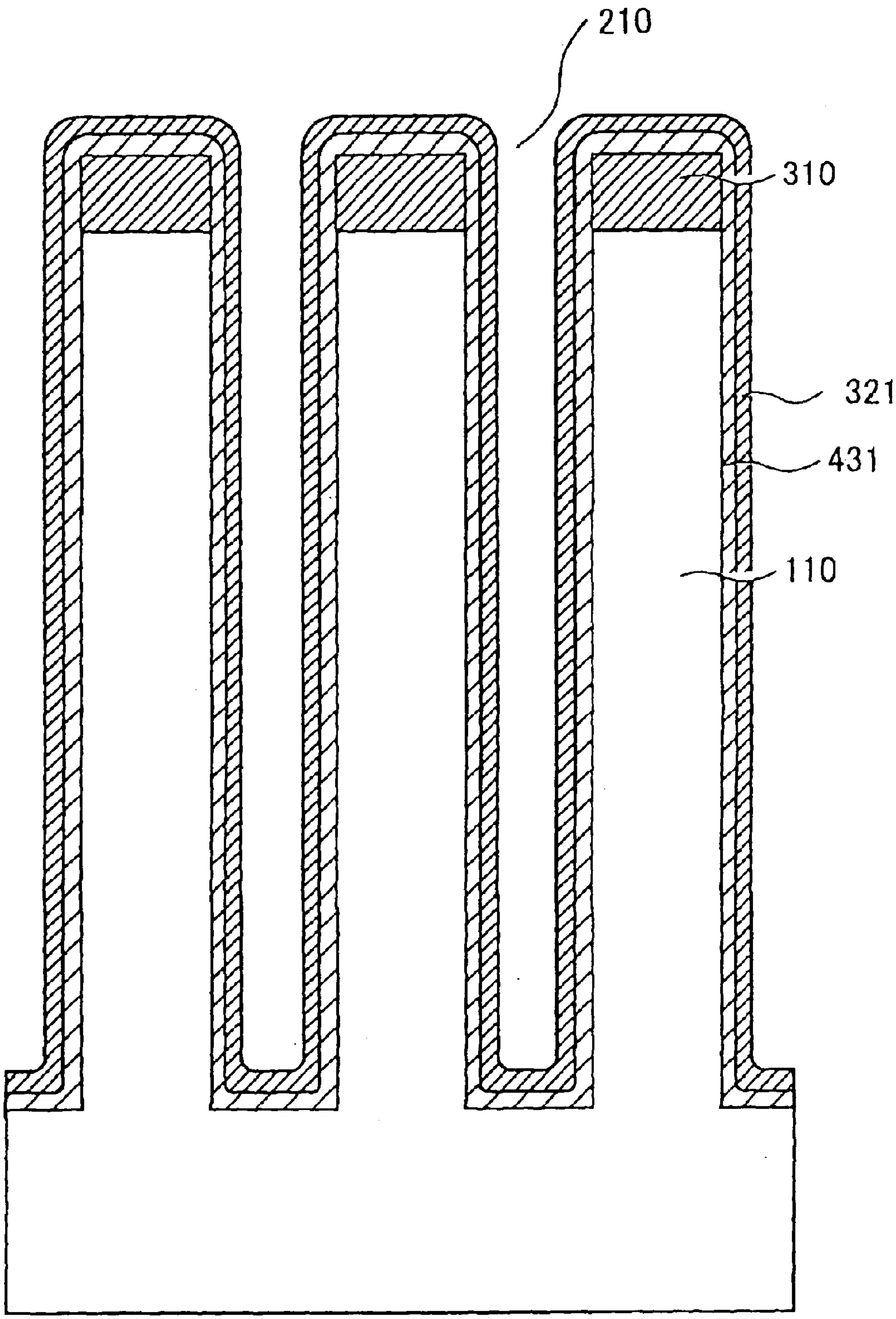
Figure 246:
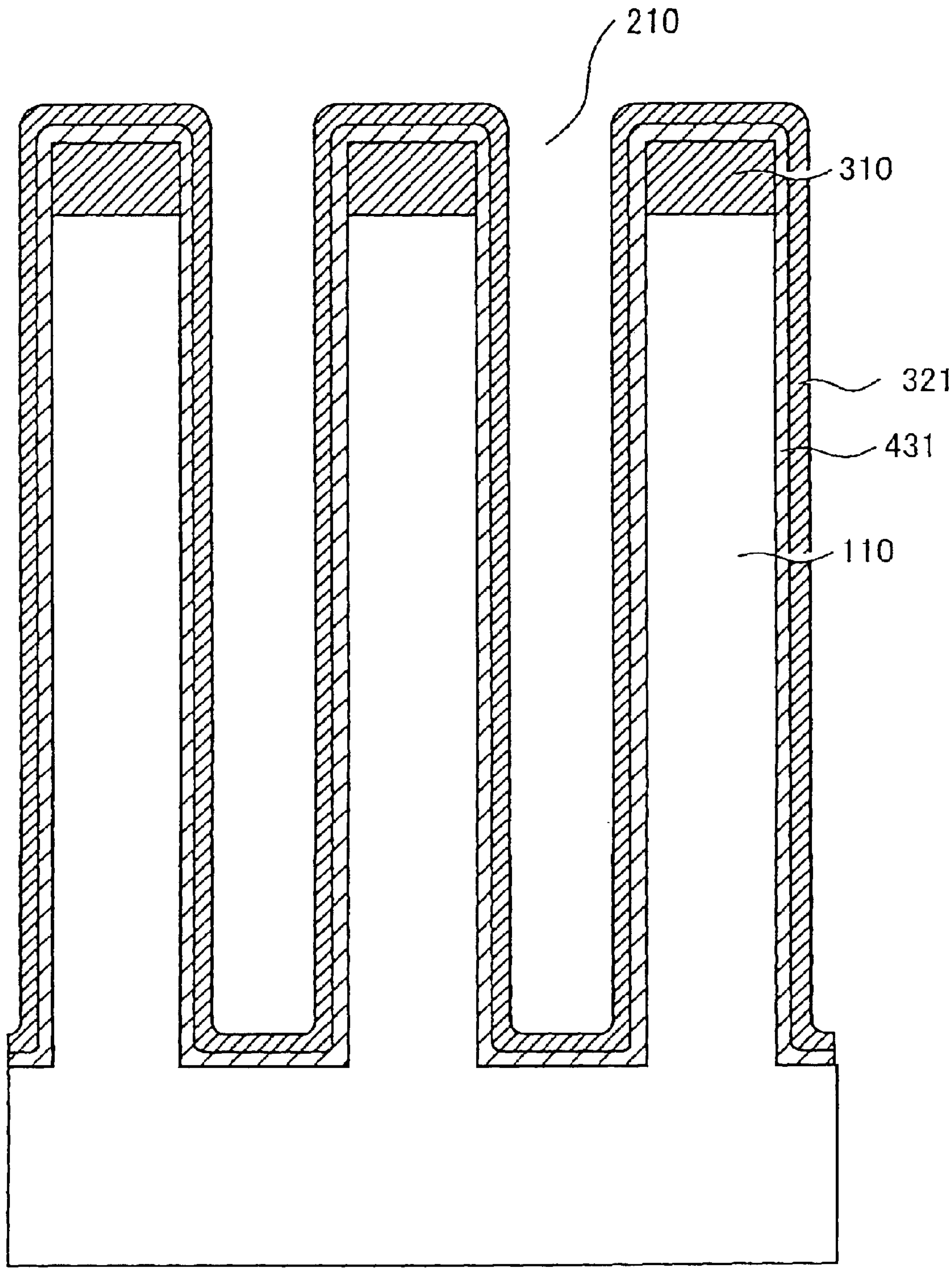

Then, a silicon oxide film 431 is deposited to a thickness of 10 to 100 nm as a fifth insulating film and a silicon nitride film 321 is deposited to a thickness of 10 to 100 nm as a fourth insulating film (FIG. 220 and FIG. 246).

Figure 221:
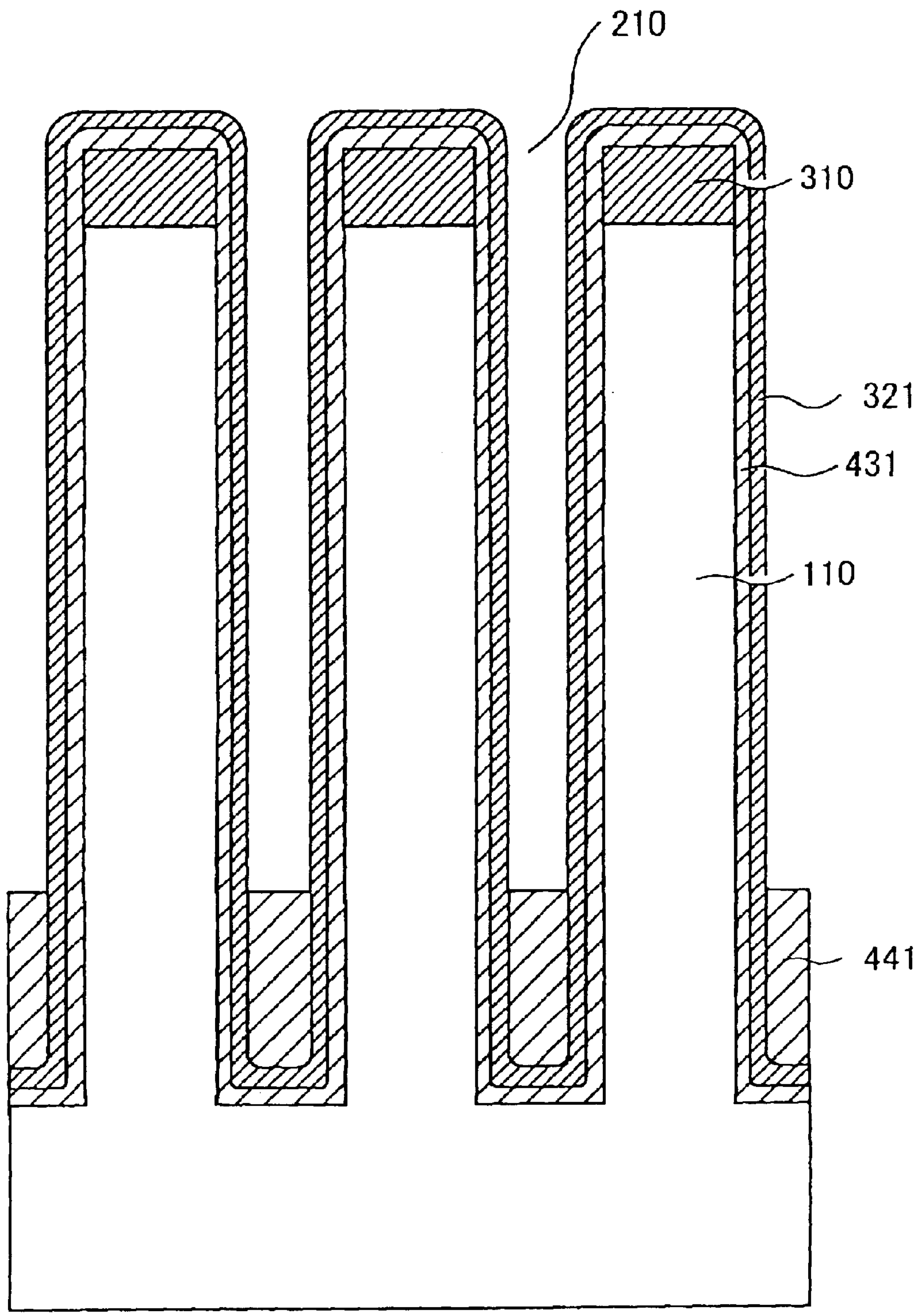
Figure 247:
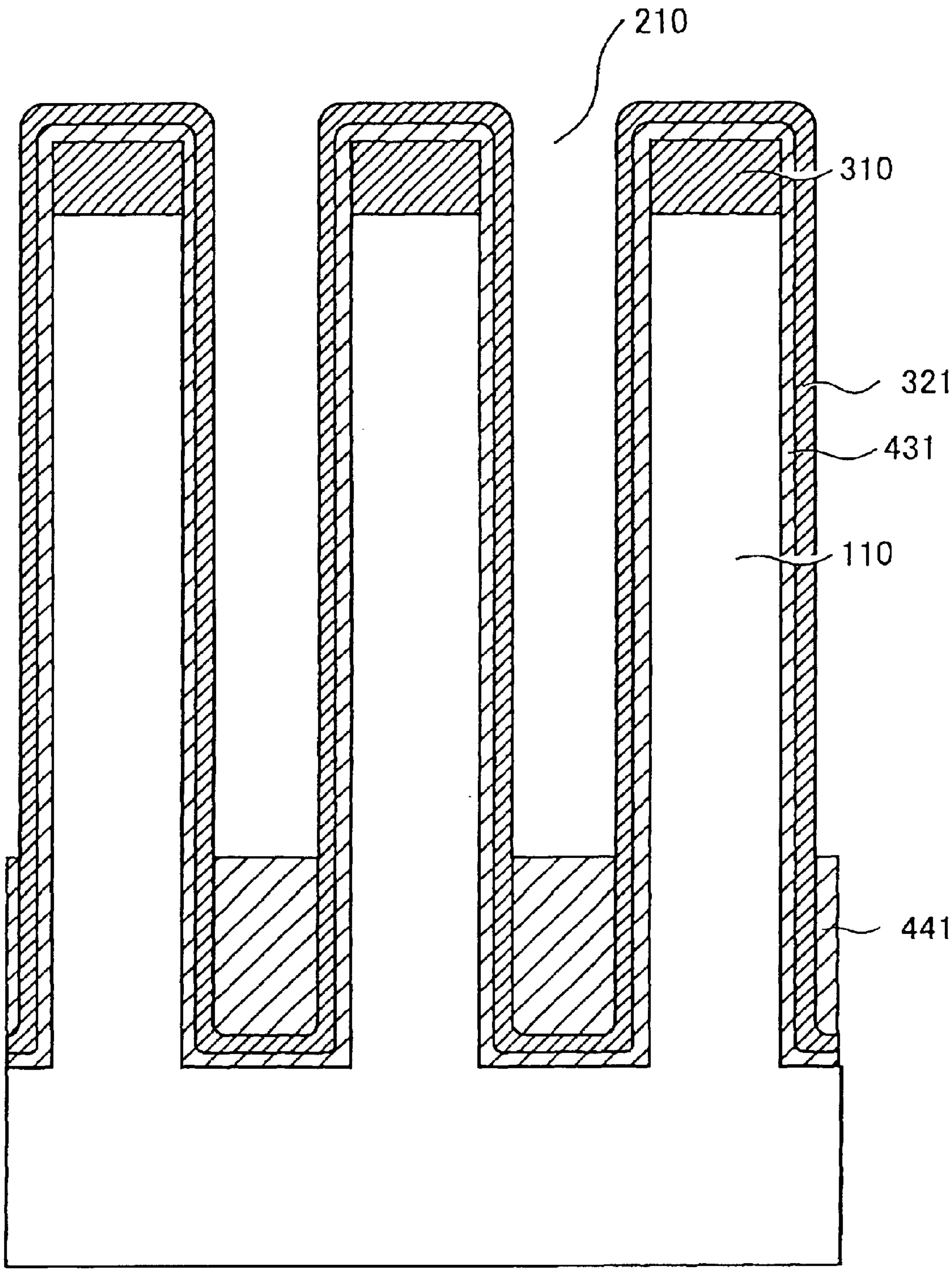

Further, a silicon oxide film 441 is deposited to a thickness of 50 to 500 nm as a sixth insulating film and etched back to a desired height by isotropic etching, for example, such that the silicon oxide film 441 is buried in the first trench 210 (FIG. 221 and FIG. 247).

Figure 222:
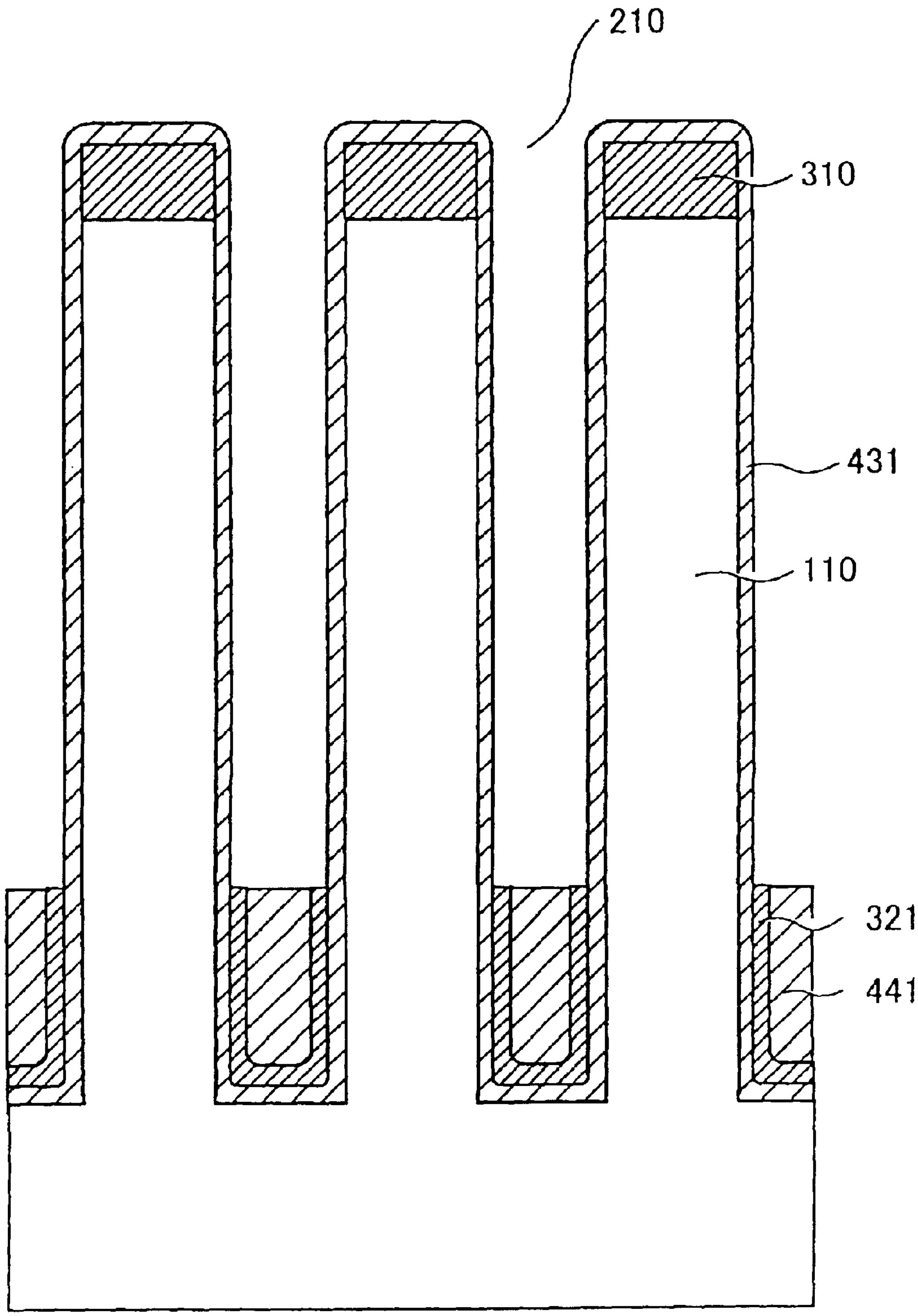
Figure 223:
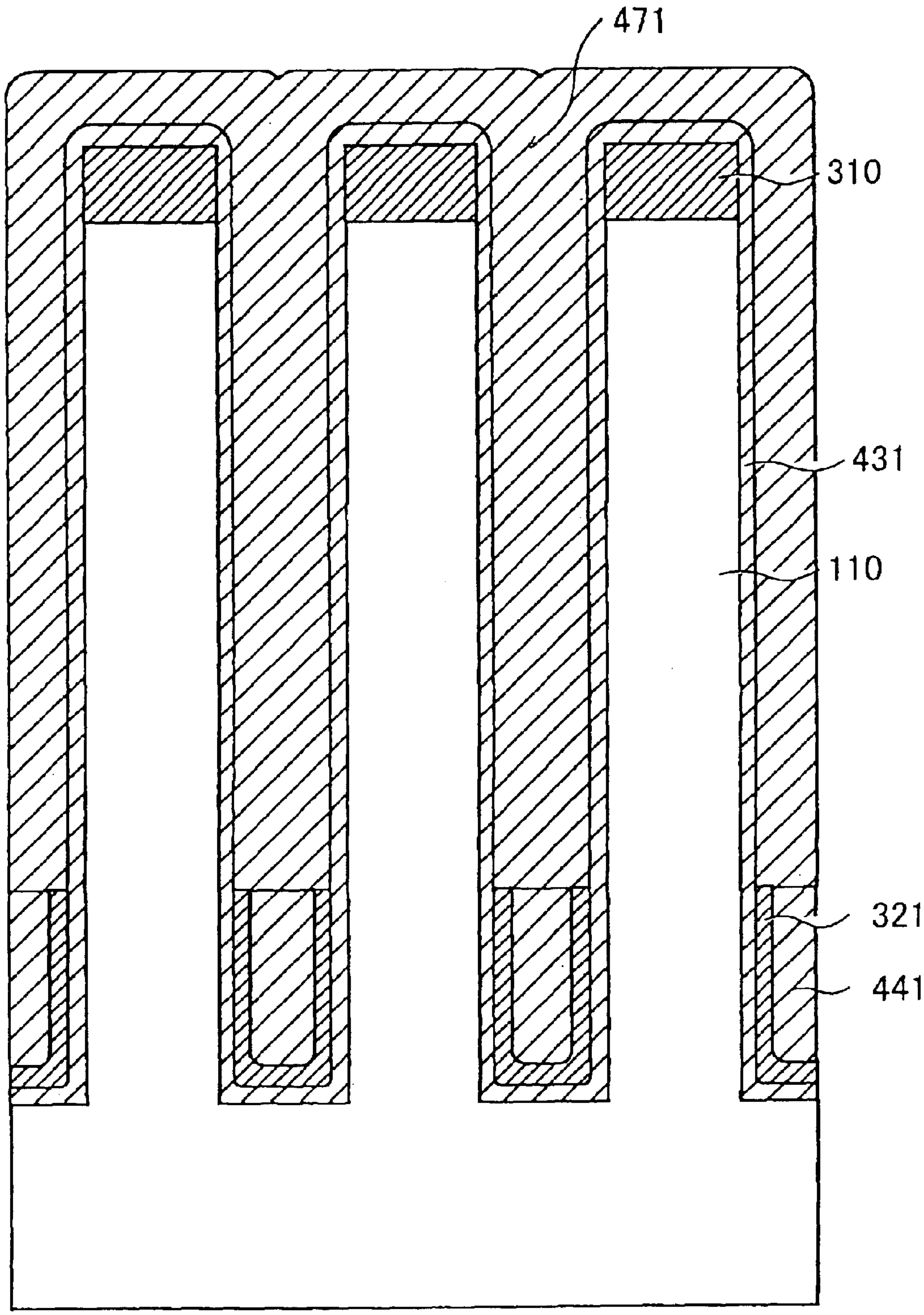
Figure 248:
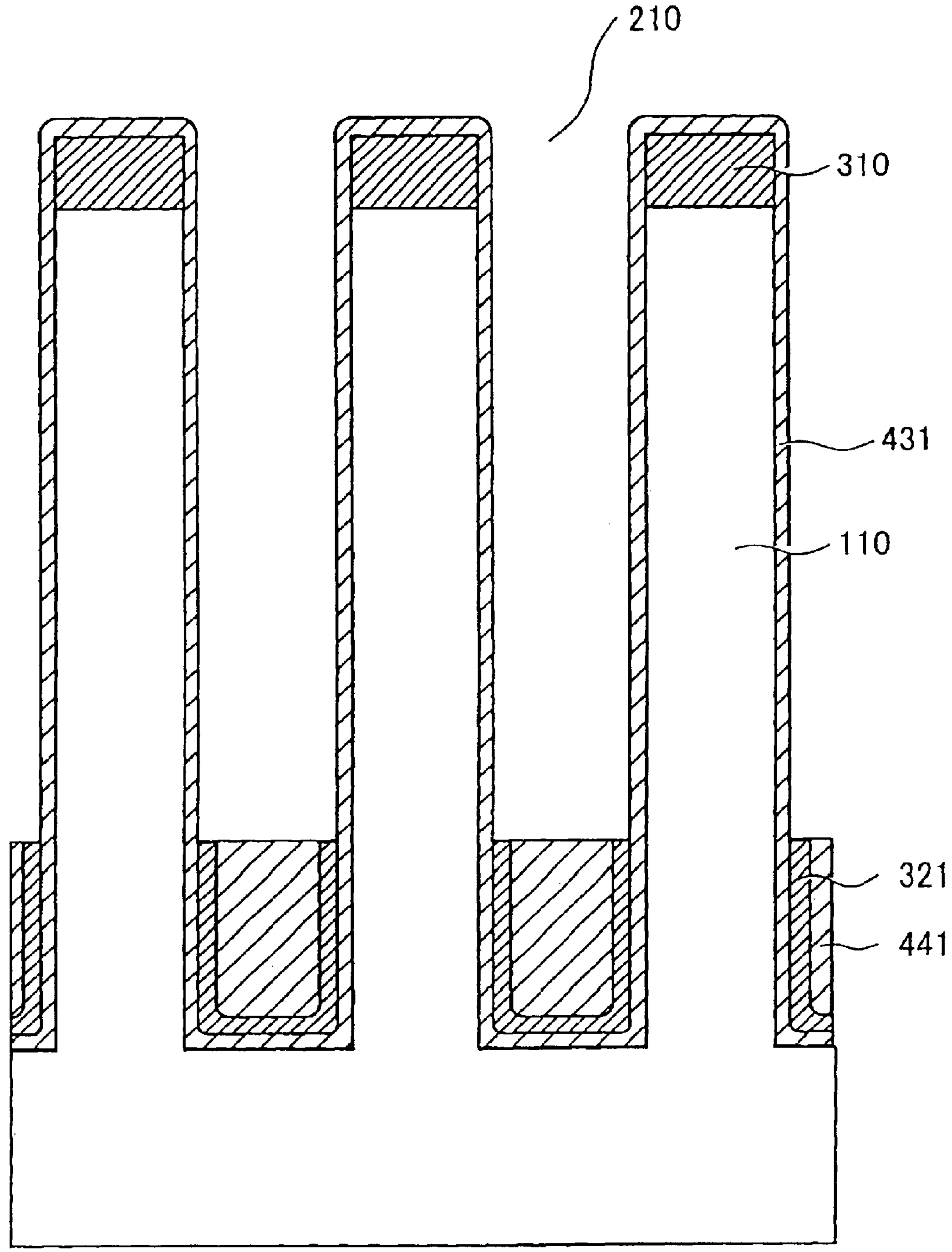
Figure 249:
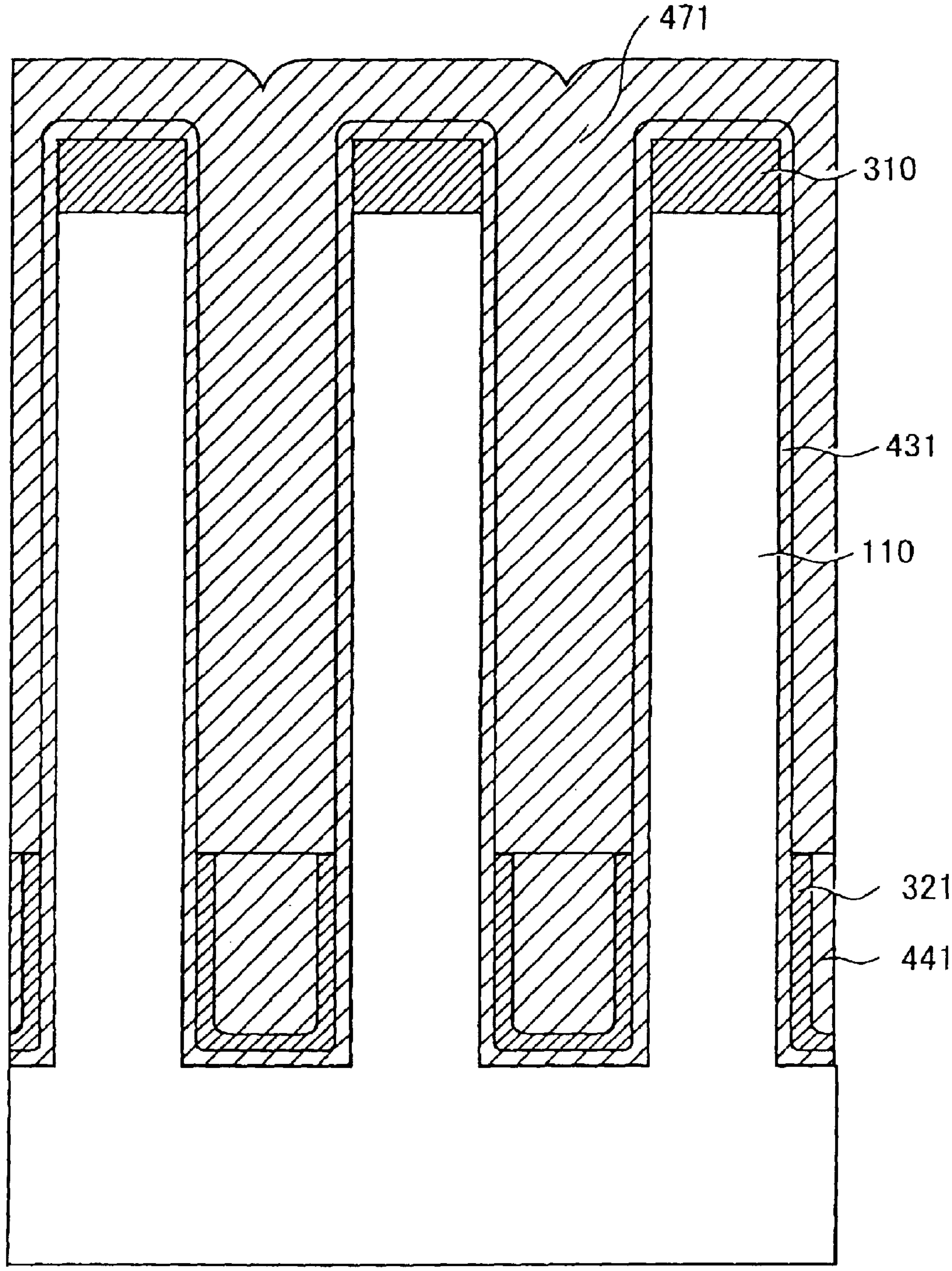

Using the silicon oxide film 441 as a mask, an exposed portion of the silicon nitride film 321 is removed by isotropic etching, for example (FIG. 222 and FIG. 248).

Figure 224:
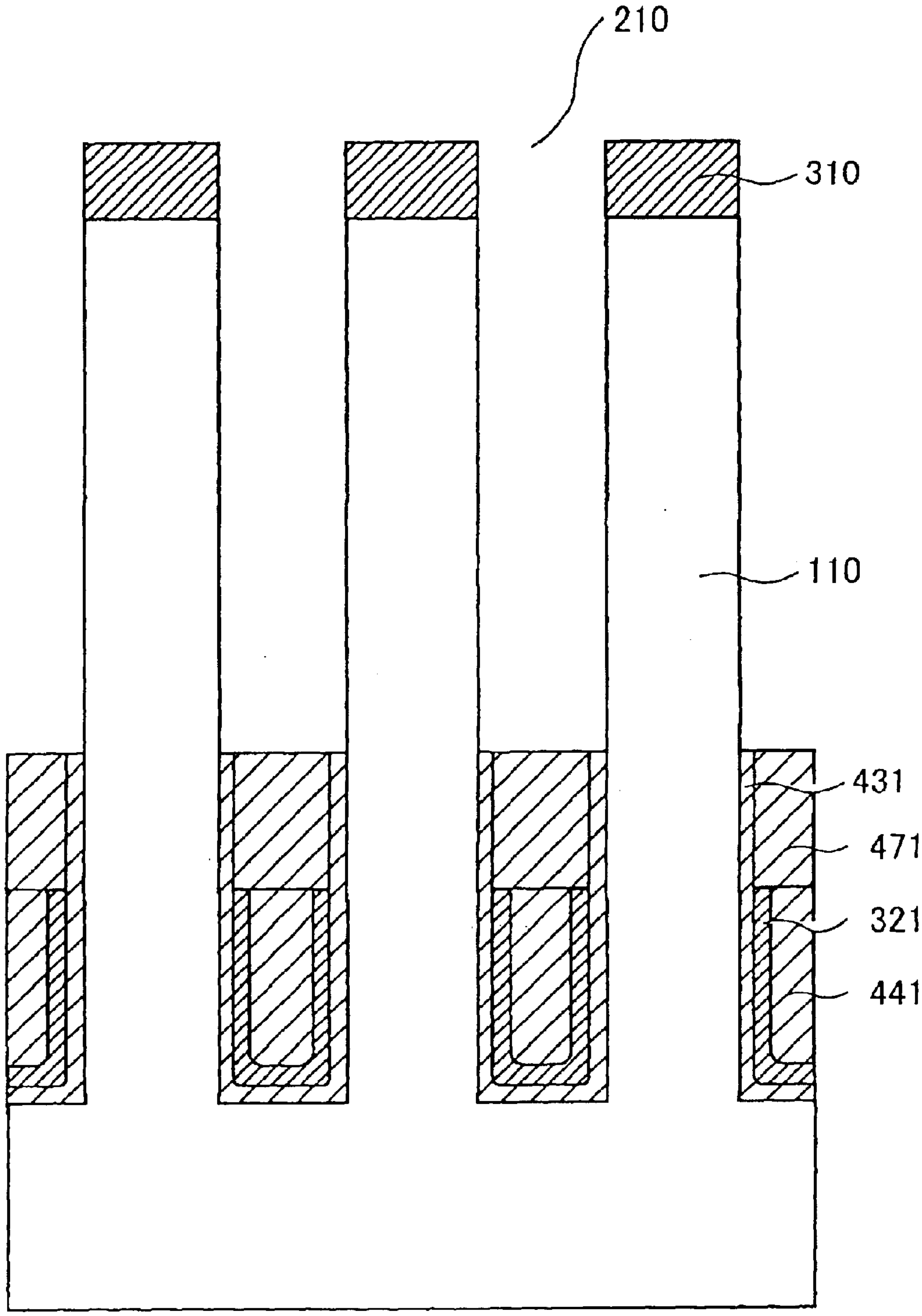
Figure 250:
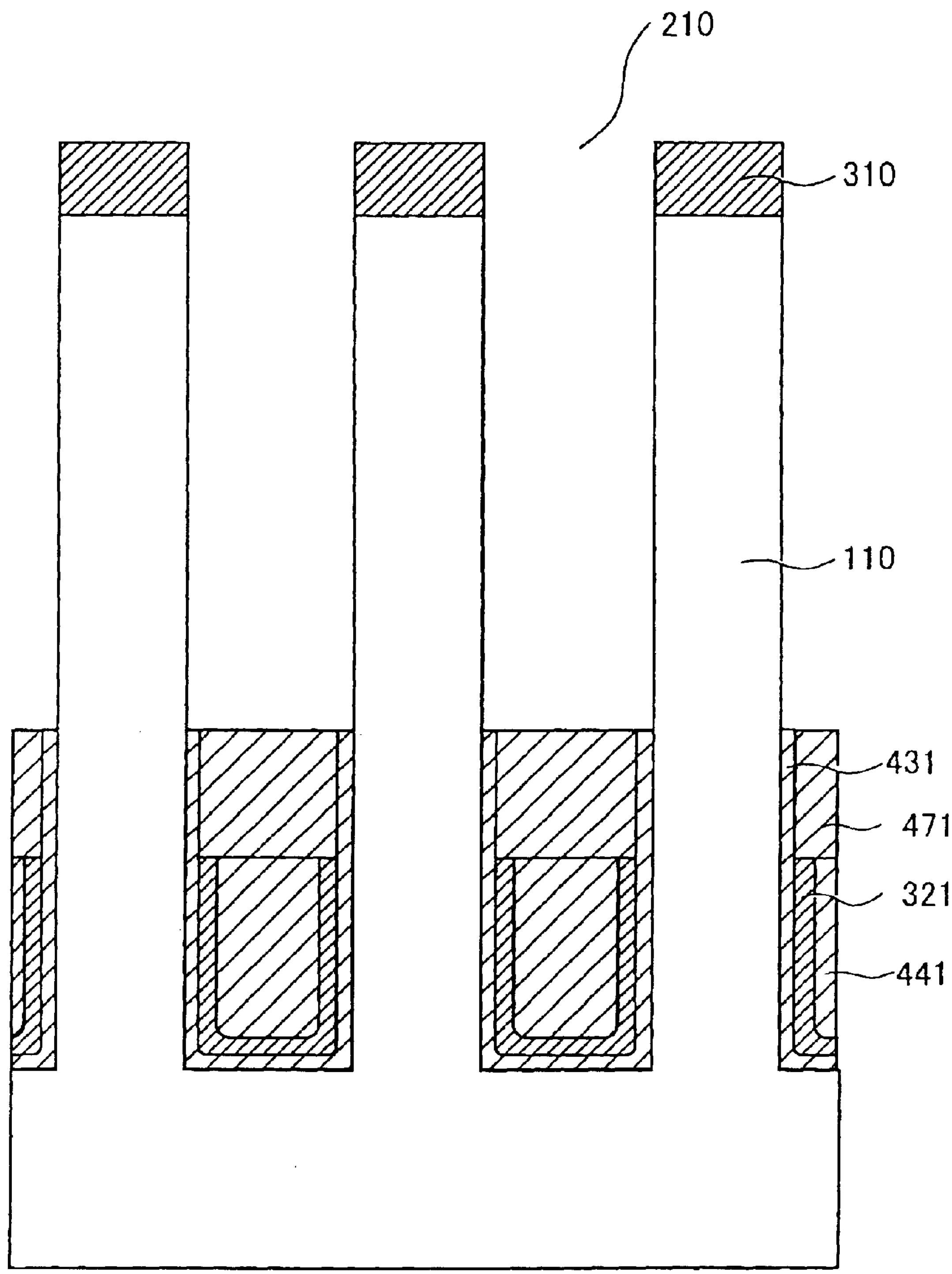

Subsequently, a silicon oxide film 471 is deposited to a thickness of 50 to 500 nm (FIG. 223 and FIG. 249) and etched back to a desired height by isotropic etching, for example, such that the silicon oxide film 471 is buried in the first trench 210 (FIG. 224 and FIG. 250).

Then, a silicon oxide film 432 is deposited to a thickness of 10 to 100 nm as a fifth insulating film and a silicon nitride film 322 is deposited to a thickness of 10 to 100 nm as a fourth insulating film. The silicon nitride film 322 is etched by anisotropic etching to remain in the form of a sidewall spacer on the sidewall of the island-like semiconductor layer 110 with the intervention of the silicon oxide film 432.

A silicon oxide film 442 is then deposited to a thickness of 50 to 500 nm as a sixth insulating film and etched back to a desired height by isotropic etching, for example, such that the silicon oxide film 442 is buried in the first trench 210.

Figure 225:
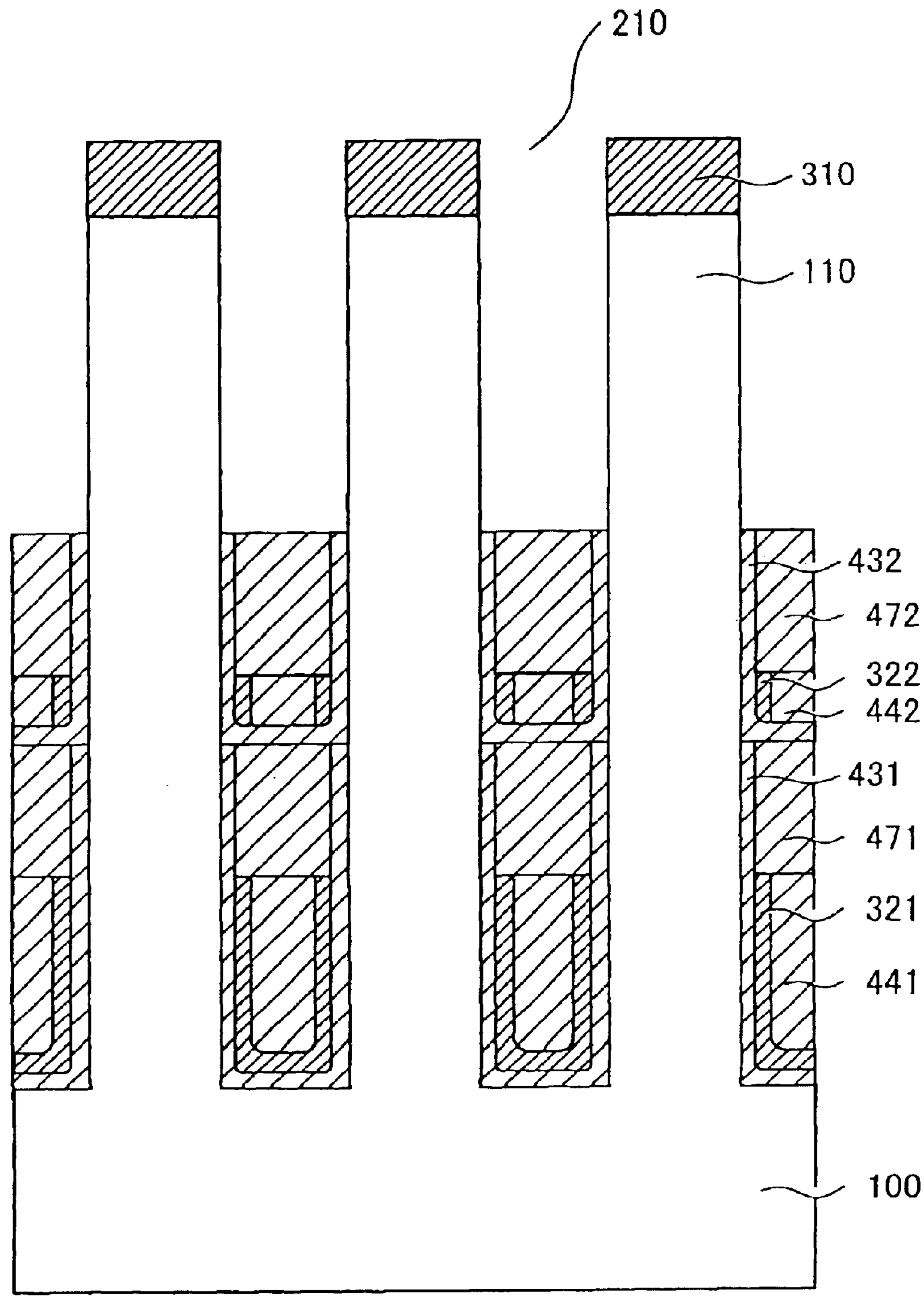
Figure 251:
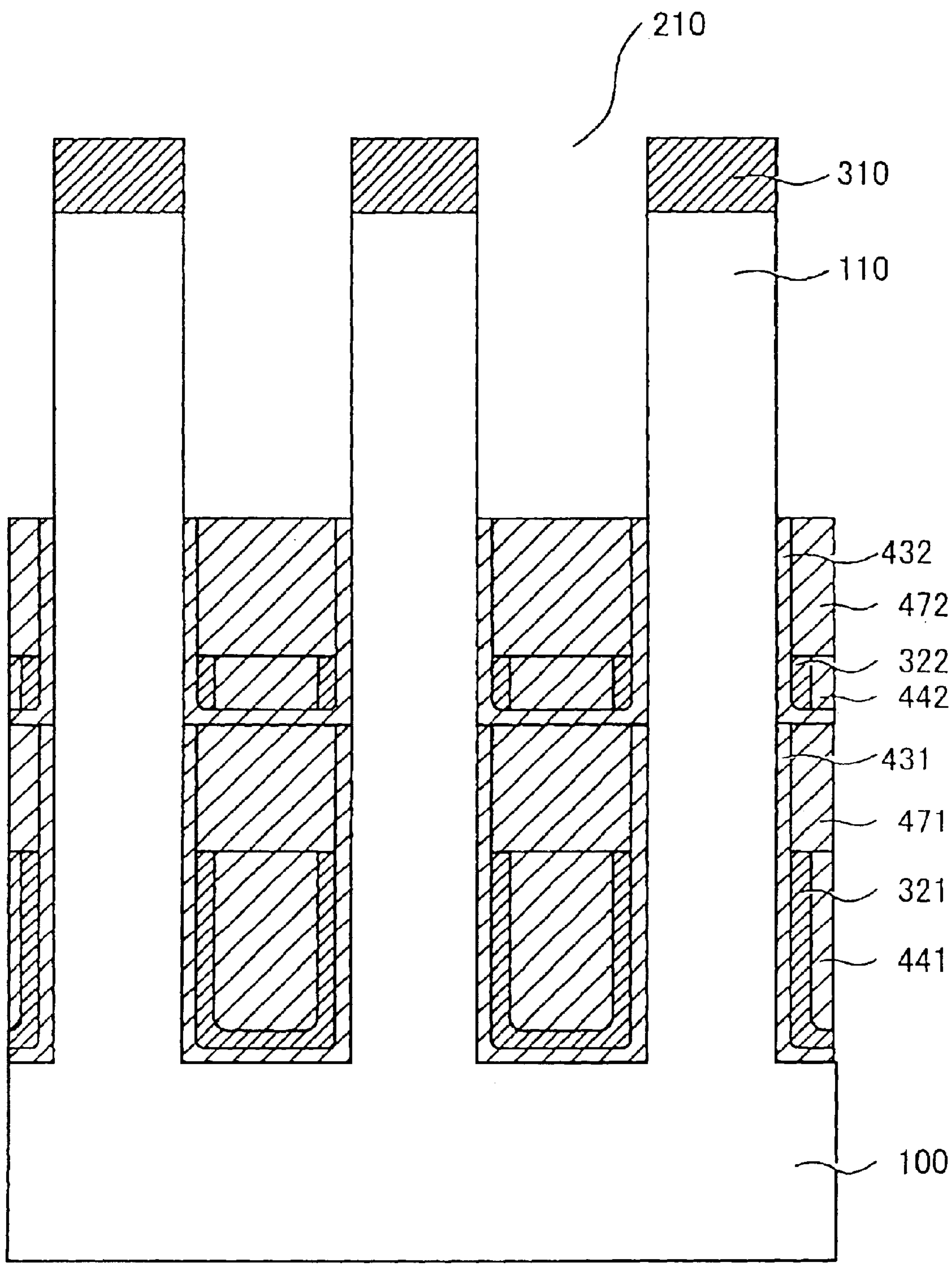

Using the silicon oxide film 442 as a mask, an exposed portion of the silicon nitride film 322 is removed by isotropic etching. Subsequently, a silicon oxide film 472 is deposited to a thickness of 50 to 500 nm as a eleventh insulating film and etched back to a desired height by isotropic etching, for example, such that the silicon oxide film 472 is buried in the first trench 210 (FIG. 225 and FIG. 251).

Figure 226:
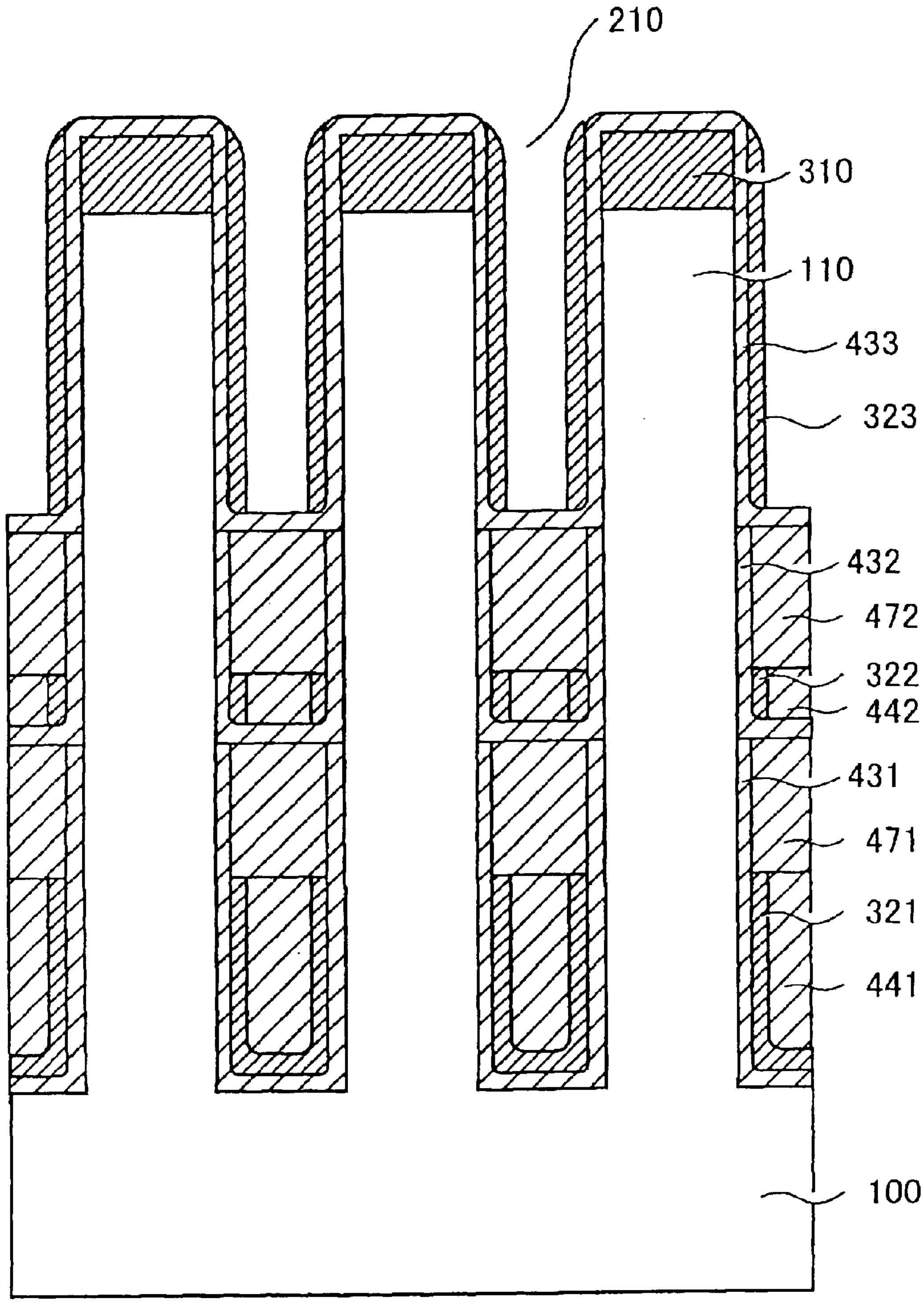
Figure 227:
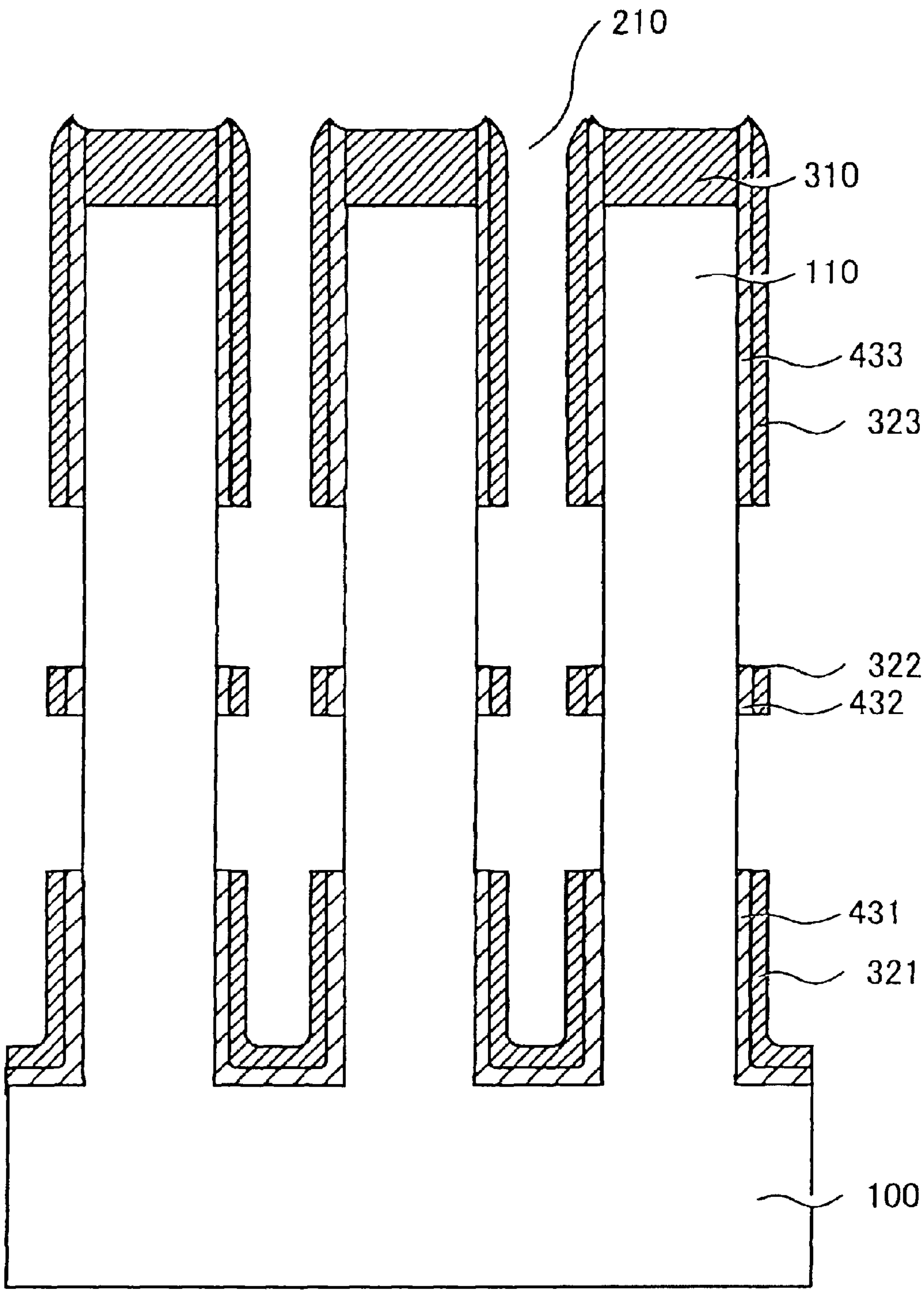
Figure 252:
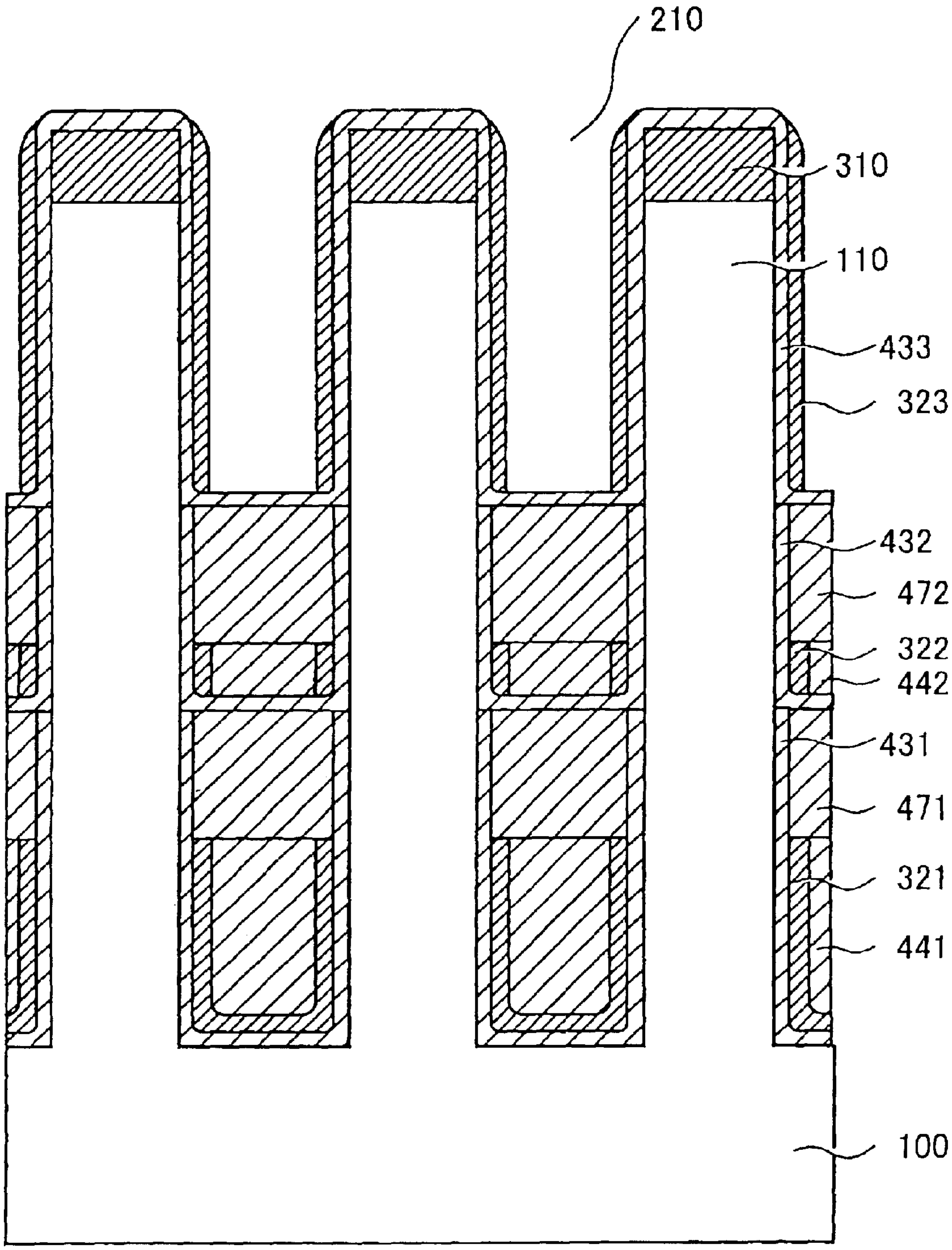
Figure 253:
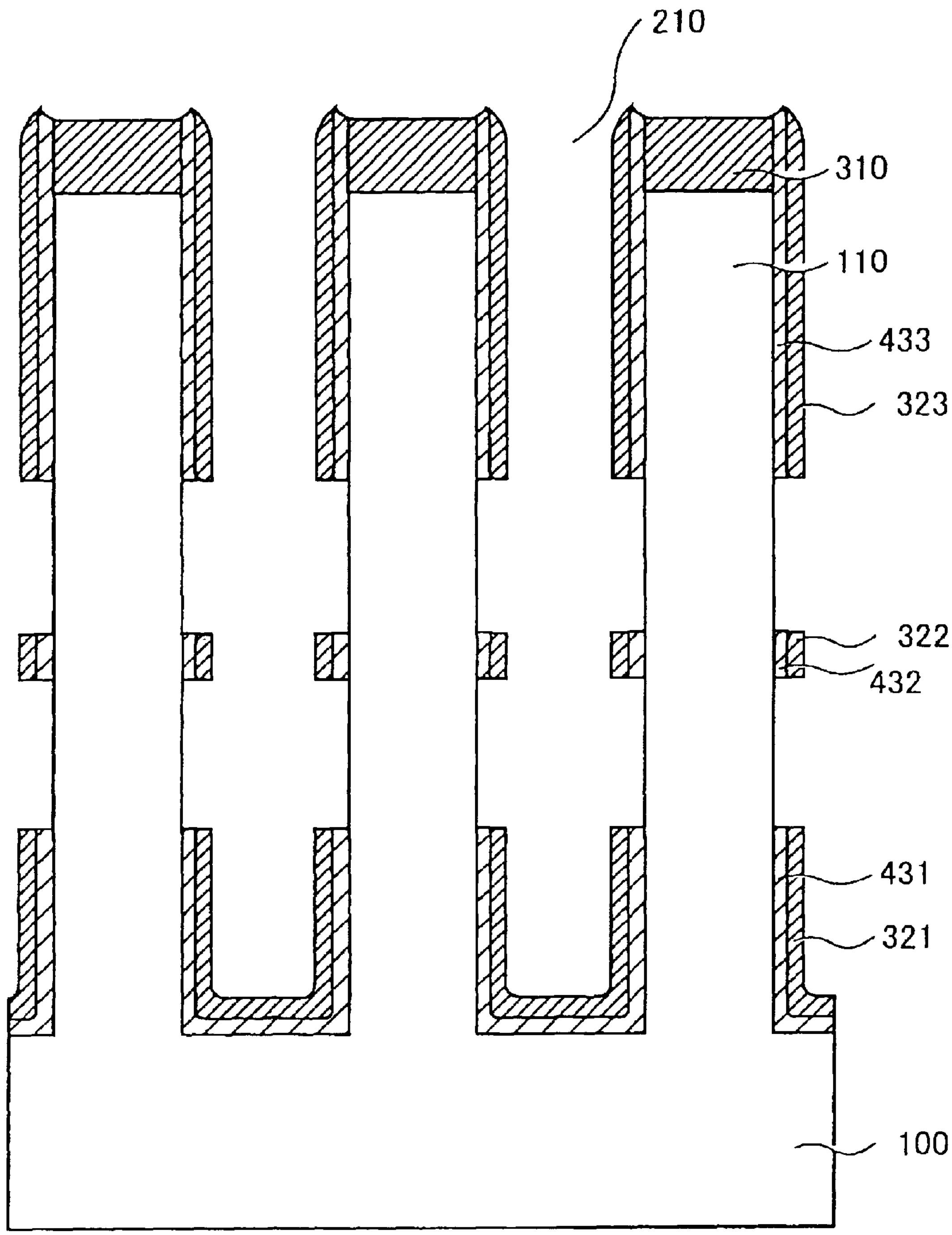

Then, a silicon oxide film 433 is deposited to a thickness of 10 to 100 nm as a fifth insulating film and a silicon nitride film 323 is deposited to a thickness of 10 to 100 nm as a fourth insulating film. The silicon nitride film 323 is etched by anisotropic etching to remain in the form of a sidewall spacer on the sidewall of the island-like semiconductor layer 110 with the intervention of the silicon oxide film 433 (FIG. 226 and FIG. 252).

Figure 228:
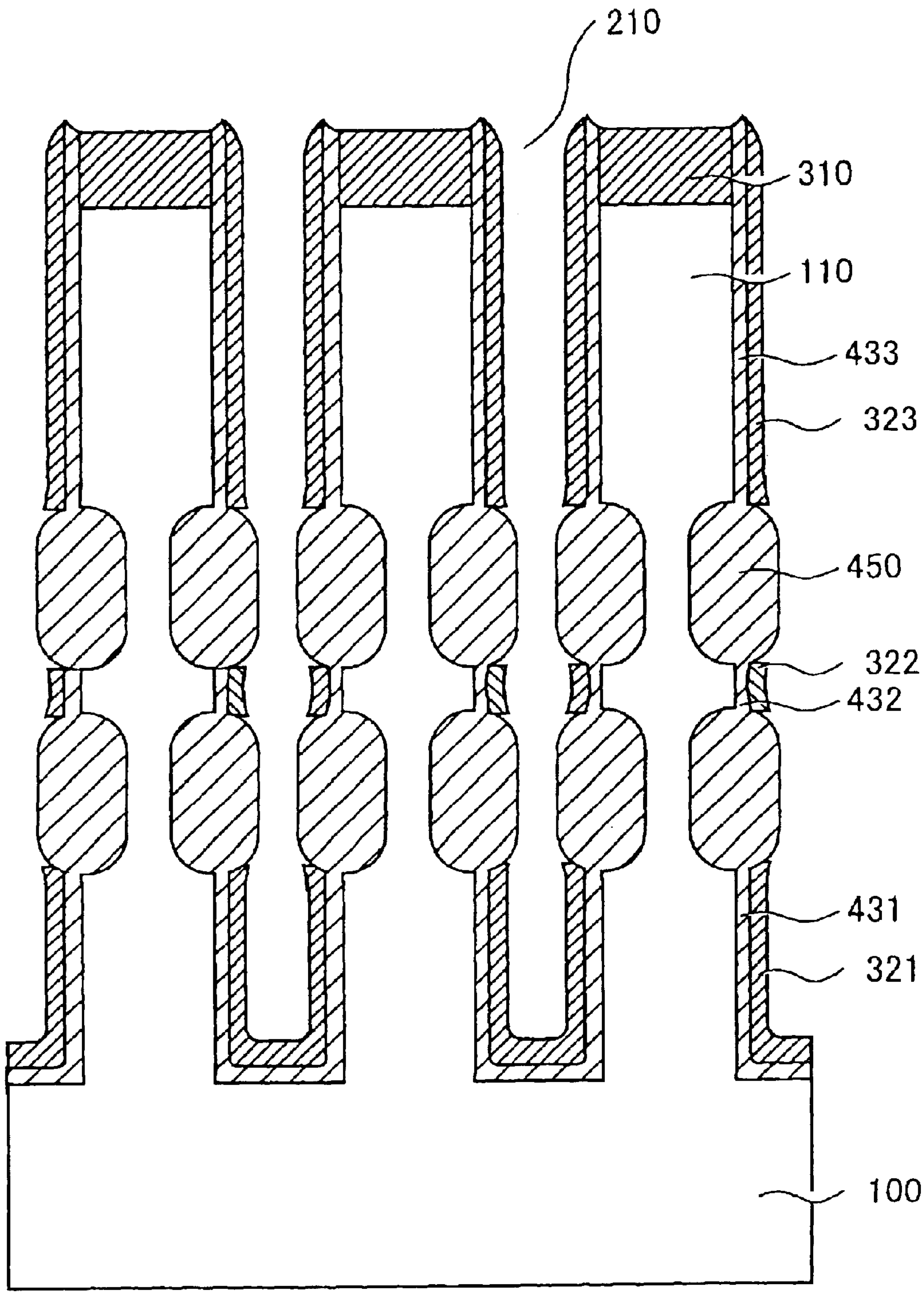
Figure 254:
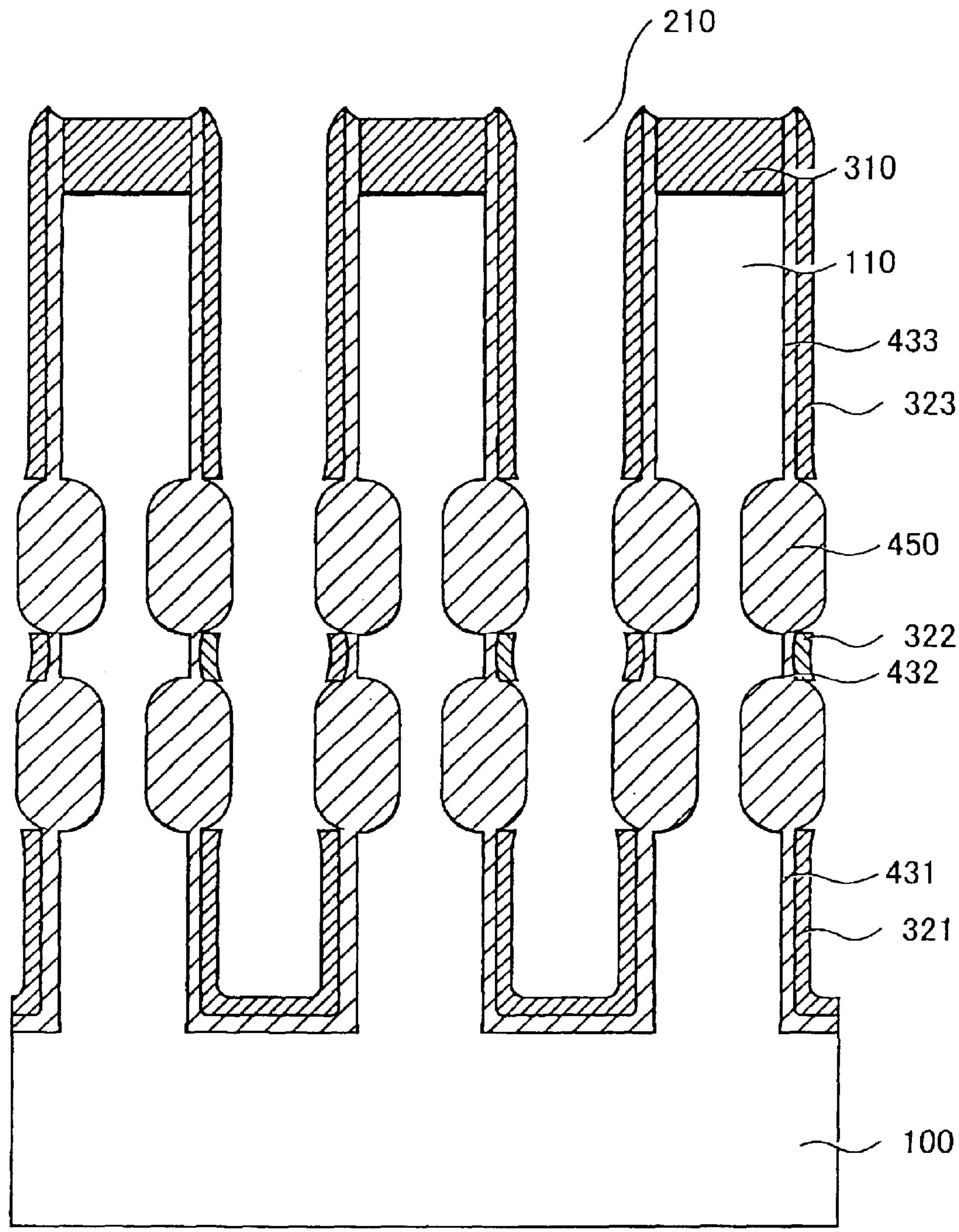

The silicon oxide film is selectively removed by isotropic etching (FIG. 227 and FIG. 253) and the exposed island-like semiconductor layer 110 is thermally oxidized to form a silicon oxide film 450 of about 30 to 300 nm thick as a seventh insulating film (FIG. 228 and FIG. 254).

Figure 229:
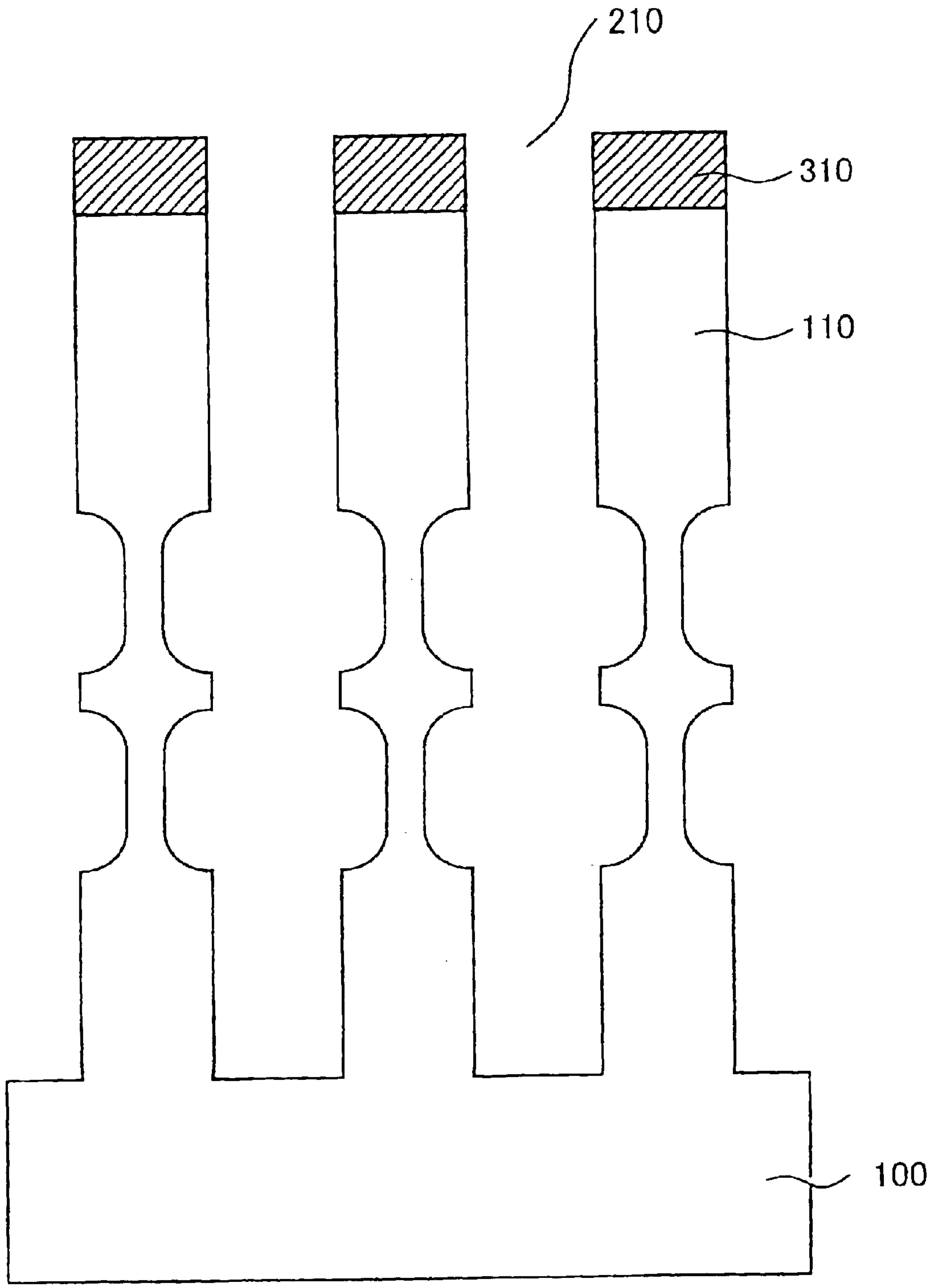
Figure 230:
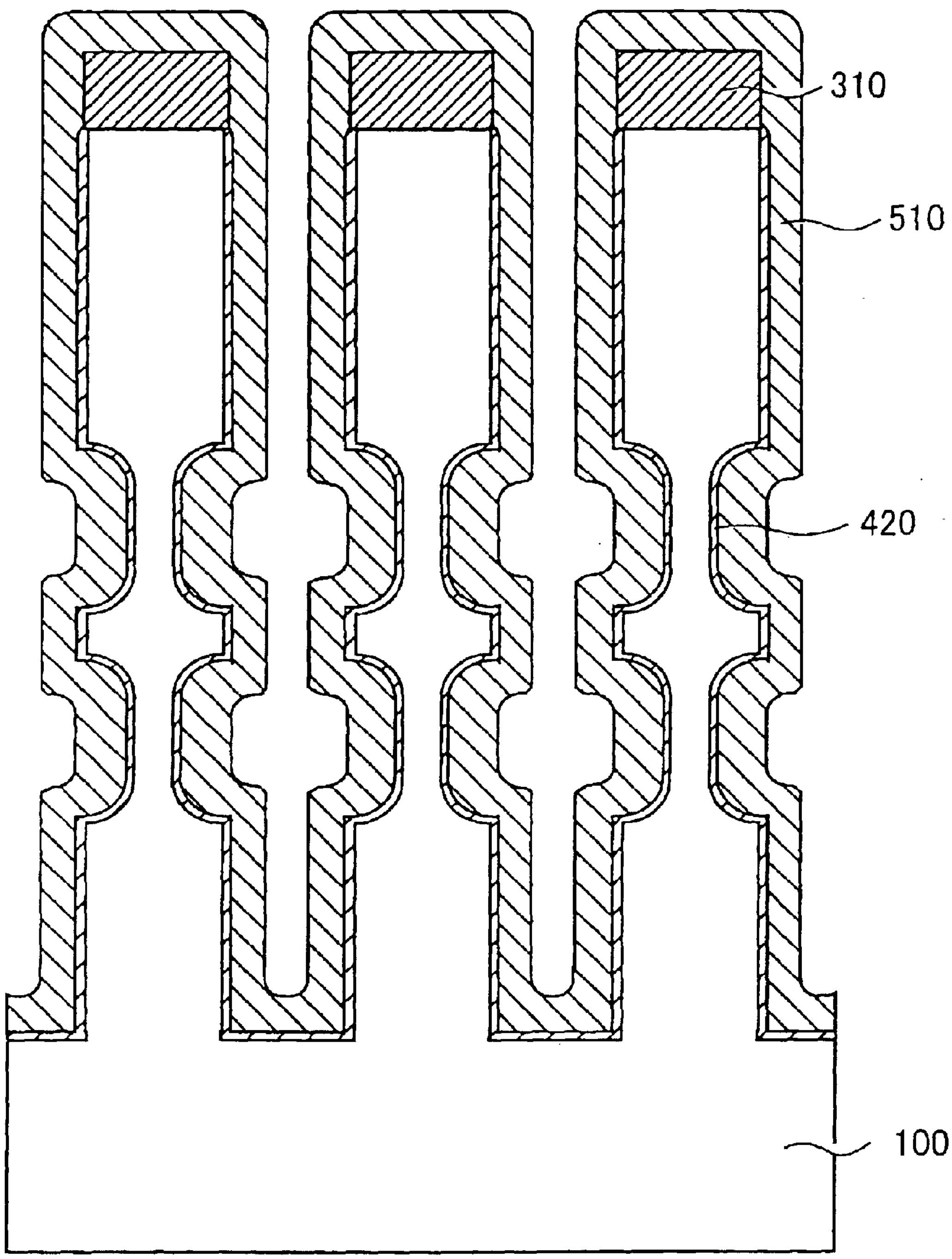
Figure 255:
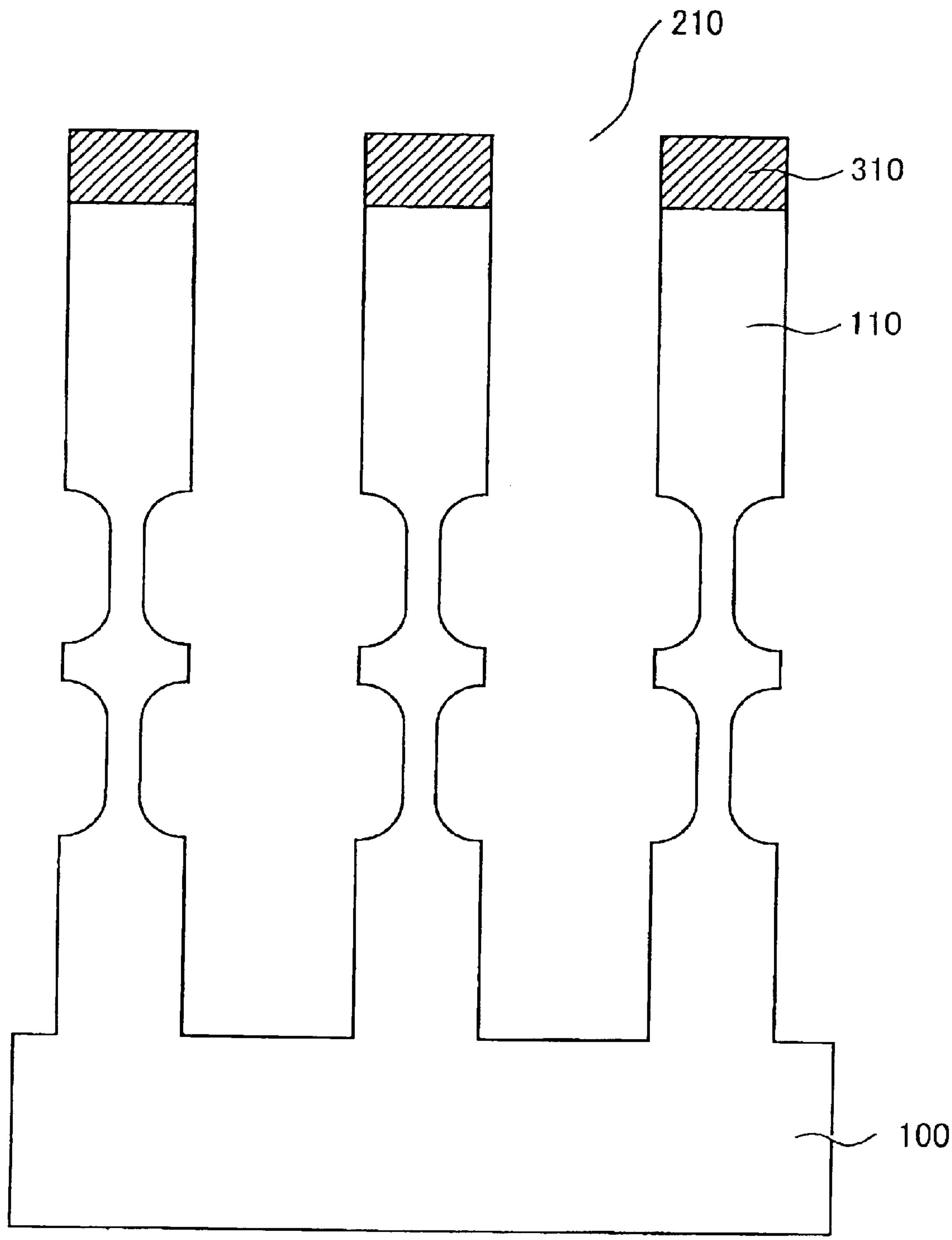
Figure 256:
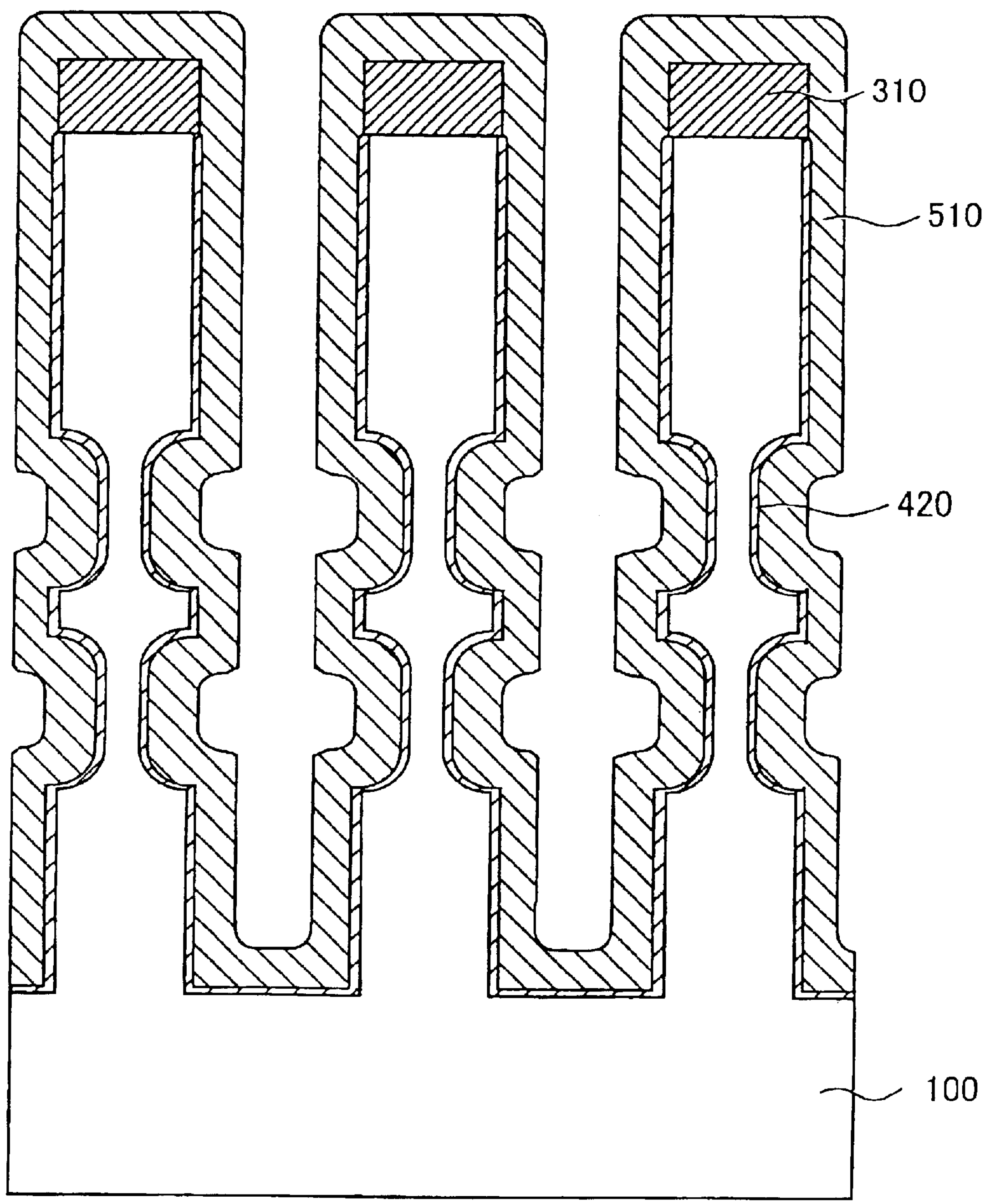

Then, isotropic etching of the silicon oxide film, the silicon nitride film and the silicon oxide film is carried out in this order, thereby removing the silicon oxide films 431 to 433, the silicon nitride films 321 to 323 and the silicon oxide film 450 (FIG. 229 and FIG. 255).

To obtain the configuration of the island-like semiconductor layer 110 shown in FIG. 228, recesses having a depth of about 30 to 300 nm may be formed on the sidewall of the island-like semiconductor layer 110 by isotropic etching instead of forming the silicon oxide film 450 by thermal oxidation. Alternatively, the thermal oxidation and the isotropic etching may be carried out in combination. Any means may be used without limitation as long as a desired configuration is obtained.

Then, for example, a silicon oxide film 420 is formed as a third insulating film to be a tunnel oxide film to have a thickness of about 10 nm around each island-like semiconductor layer 110 by thermal oxidation. The tunnel oxide film, however, may be formed of not only a thermally oxidized film but also a CVD oxide film or a nitrogen oxide film.

Figure 231:
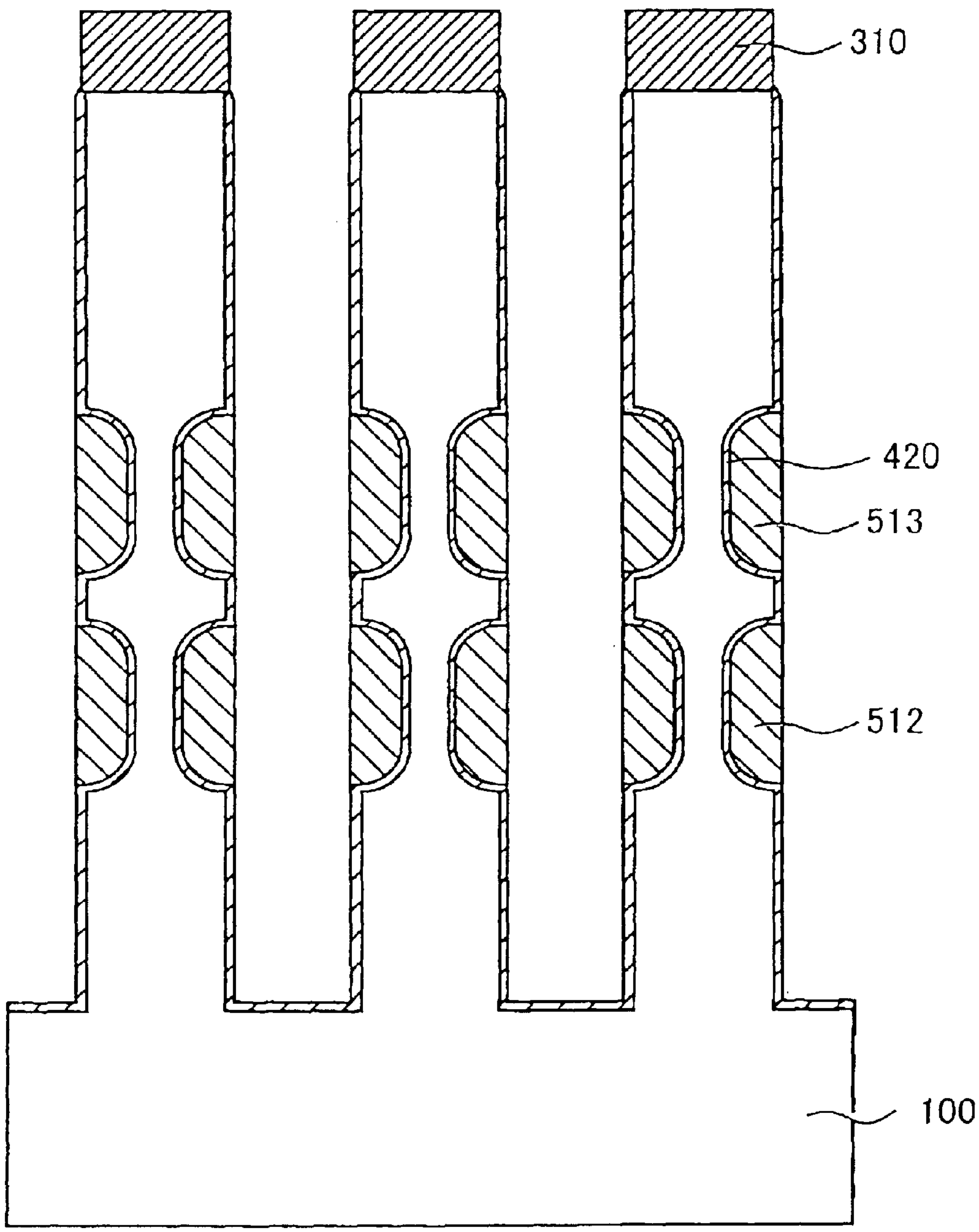
Figure 257:
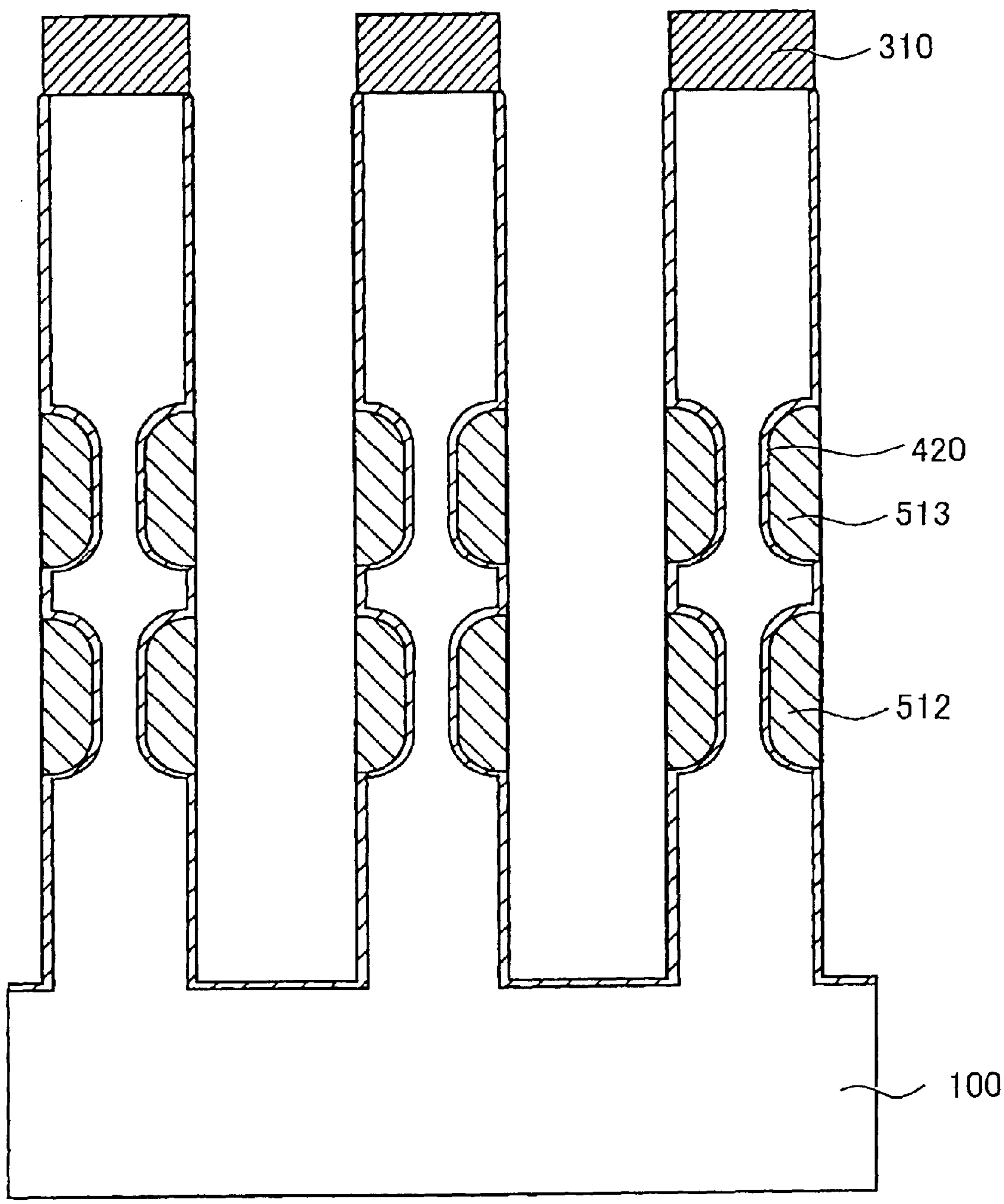

A first conductive film, for example, a polysilicon film 510, is deposited to a thickness of about 50 to 200 nm (FIG. 230 and 256) and anisotropically etched such that the polysilicon film 510 is buried in the recesses formed on the sidewall of the island-like semiconductor layer 110 with the intervention of the silicon oxide film 420, thereby separating the polysilicon film 510 into polysilicon films 512 and 513 (FIG. 231 and FIG. 257). Instead of anisotropic etching, the separation into the polysilicon films 512 and 513 may be carried out by isotropic etch back until reaching to the recesses and then by anisotropic etching after reaching to the recesses, or totally performed by isotropic etching only.

Figure 232:
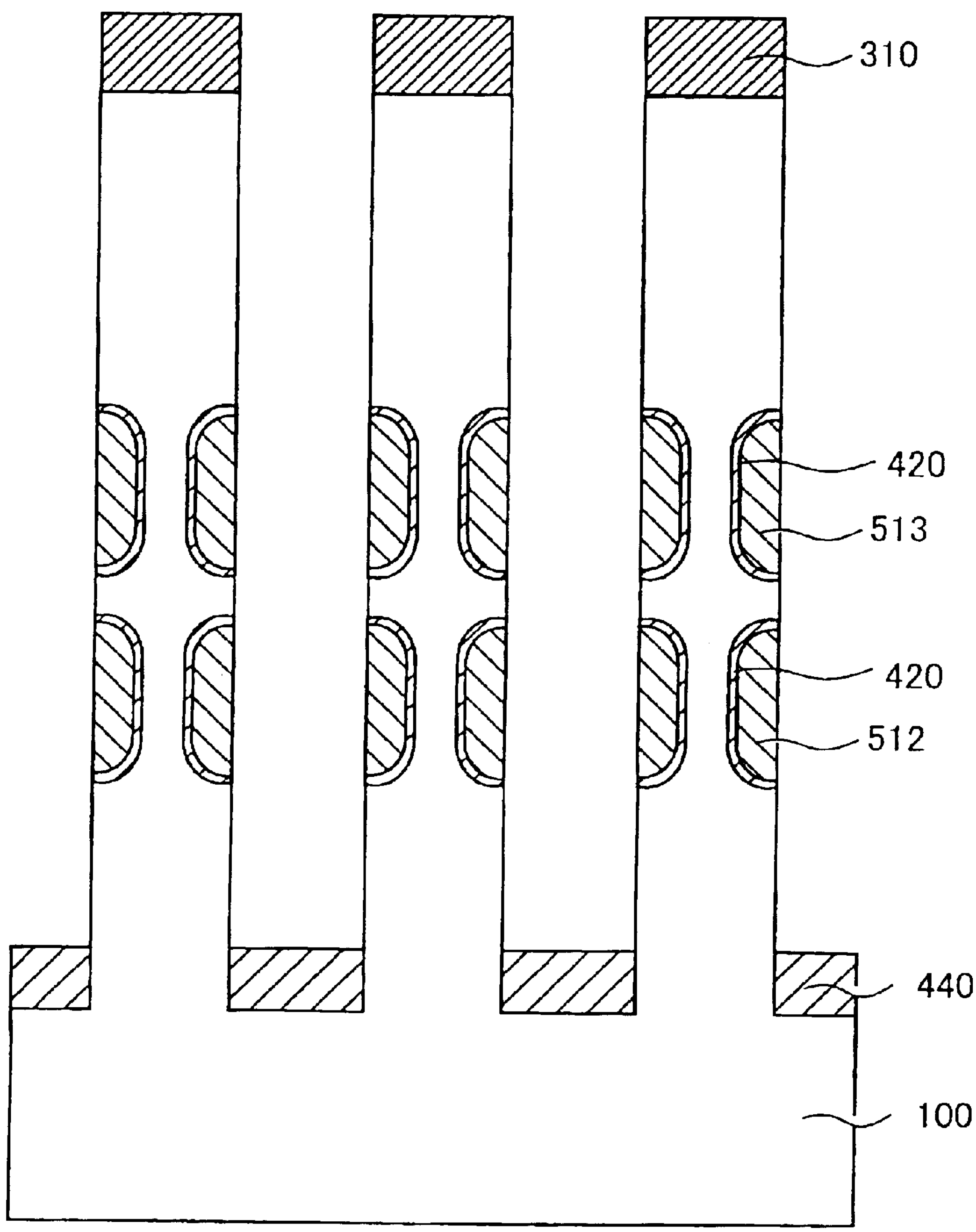
Figure 258:
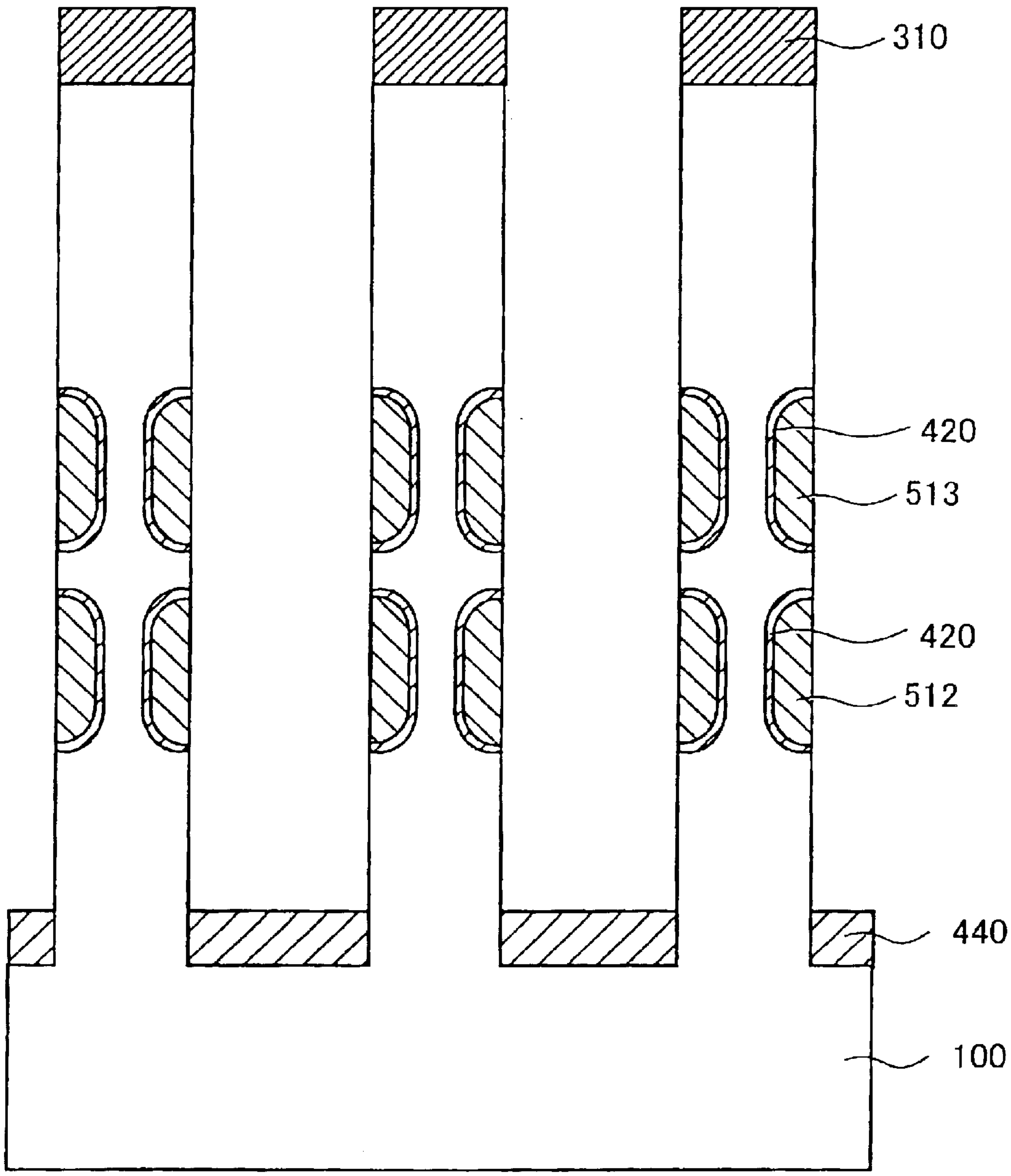

Then, a silicon oxide film 440 is deposited to a thickness of 50 to 500 nm as a sixth insulating film and etched back to a desired height to be buried (FIG. 232 and FIG. 258). Thereafter, a silicon oxide film 431 is deposited to a thickness of 10 to 100 nm as a fifth insulating film and a silicon nitride film 321 is deposited to a thickness of 10 to 100 nm as a fourth insulating film.

Figure 233:
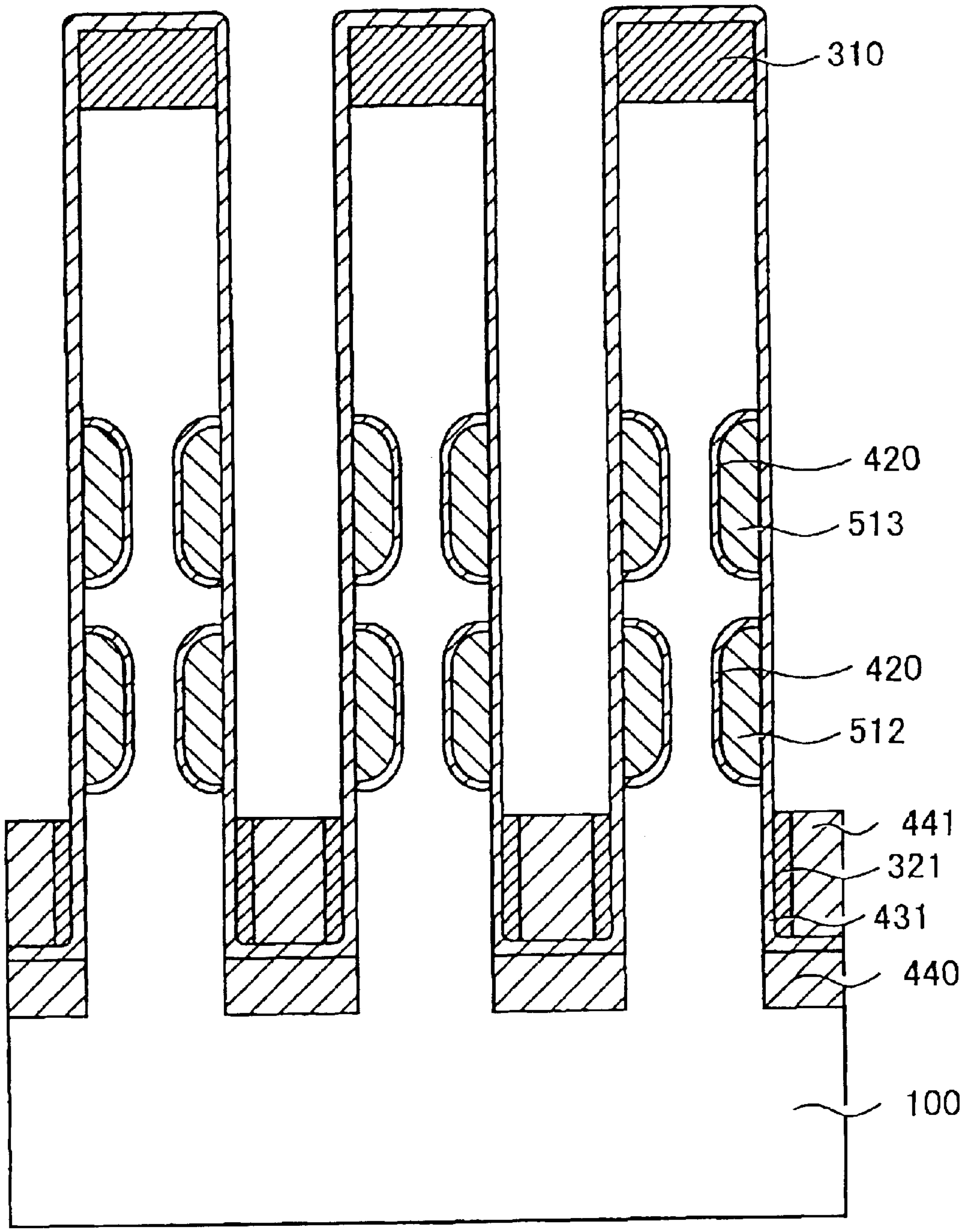
Figure 259:
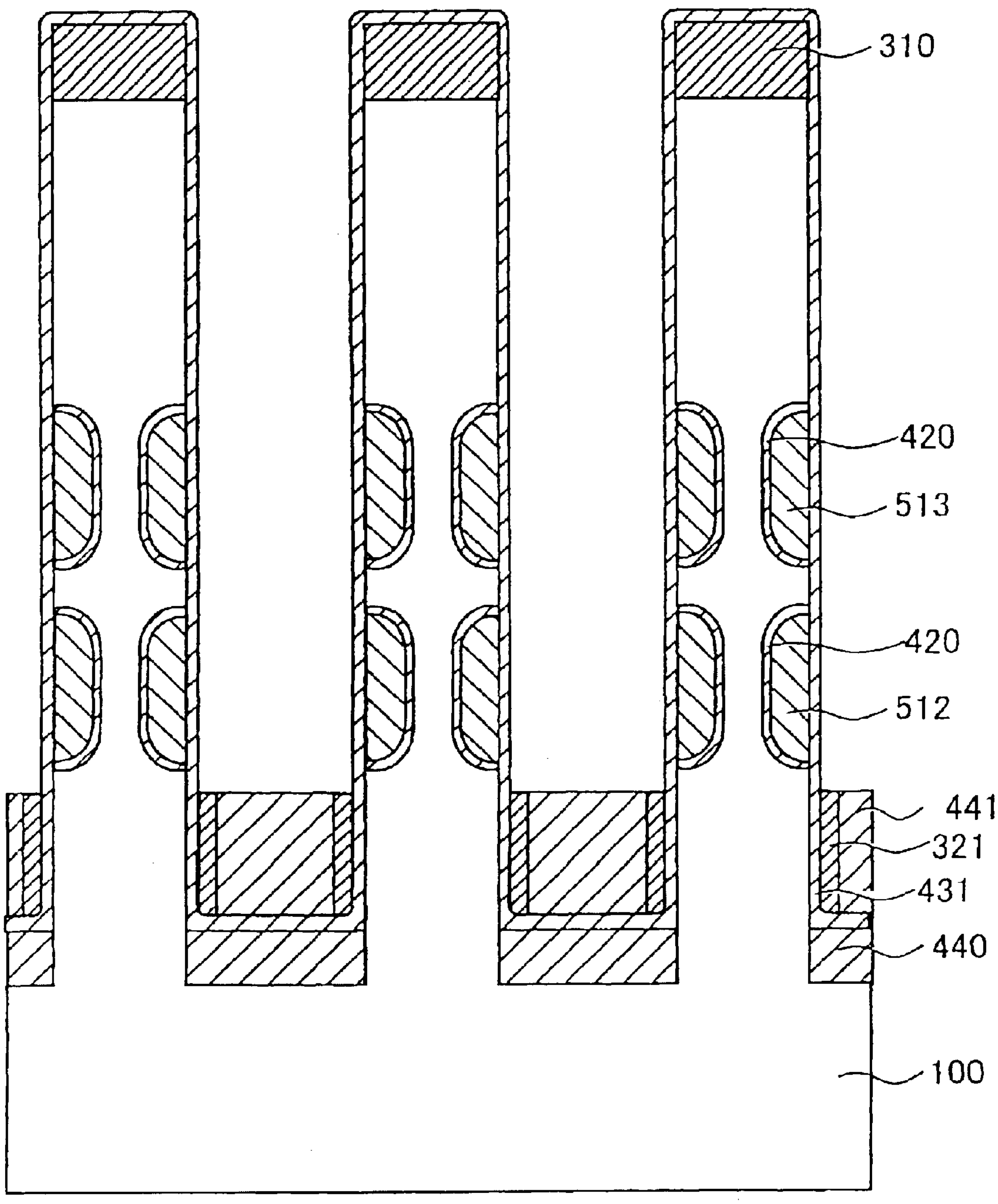

Further, a silicon oxide film 441 is deposited to a thickness of 50 to 500 nm as a sixth insulating film and etched back to a desired height by isotropic etching such that the silicon oxide film 441 is buried in the first trench 210. Then, using the silicon oxide film 441 as a mask, an exposed portion of the silicon nitride film 321 is removed by isotropic etching, for example (FIG. 233 and FIG. 259).

Figure 234:
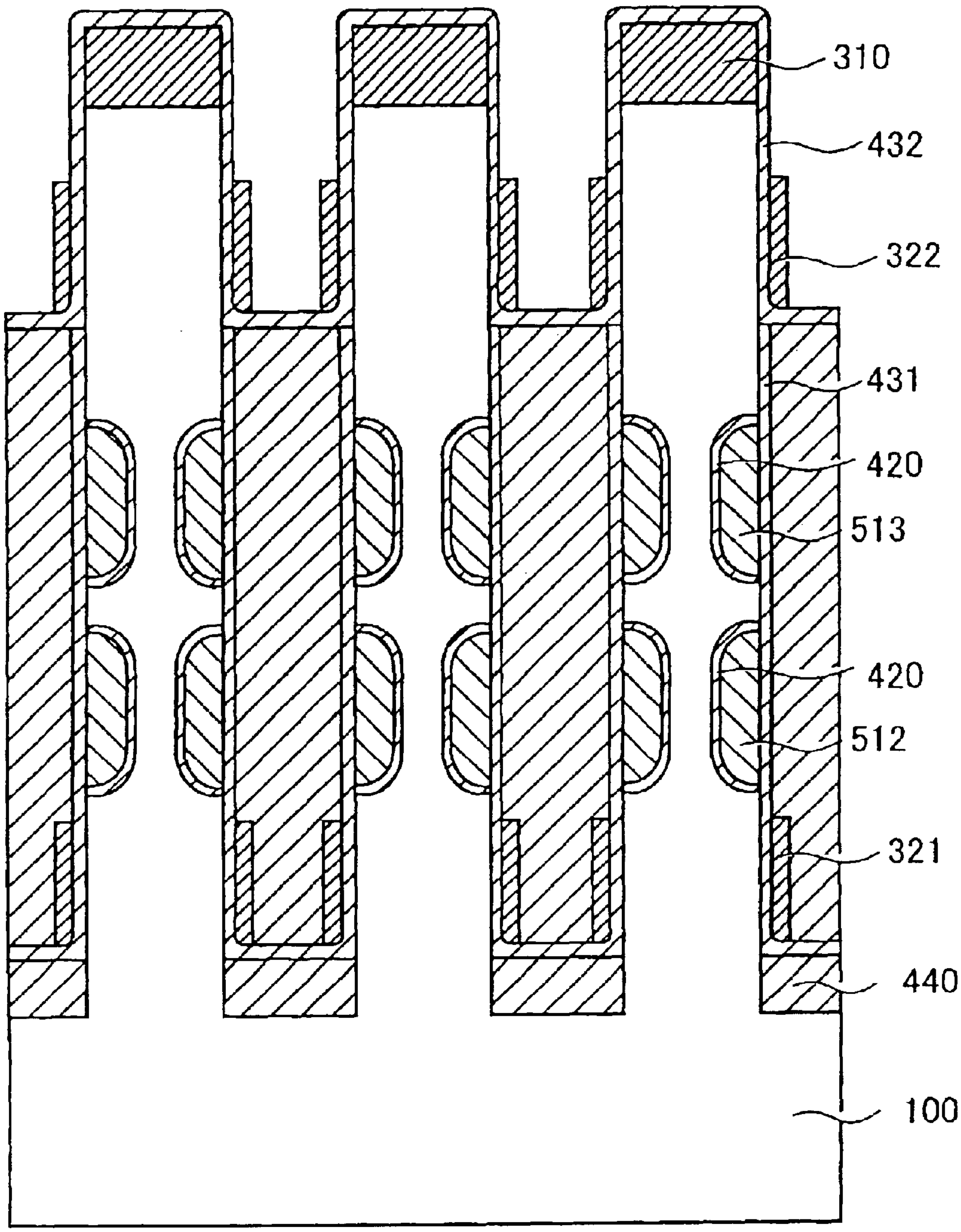
Figure 235:
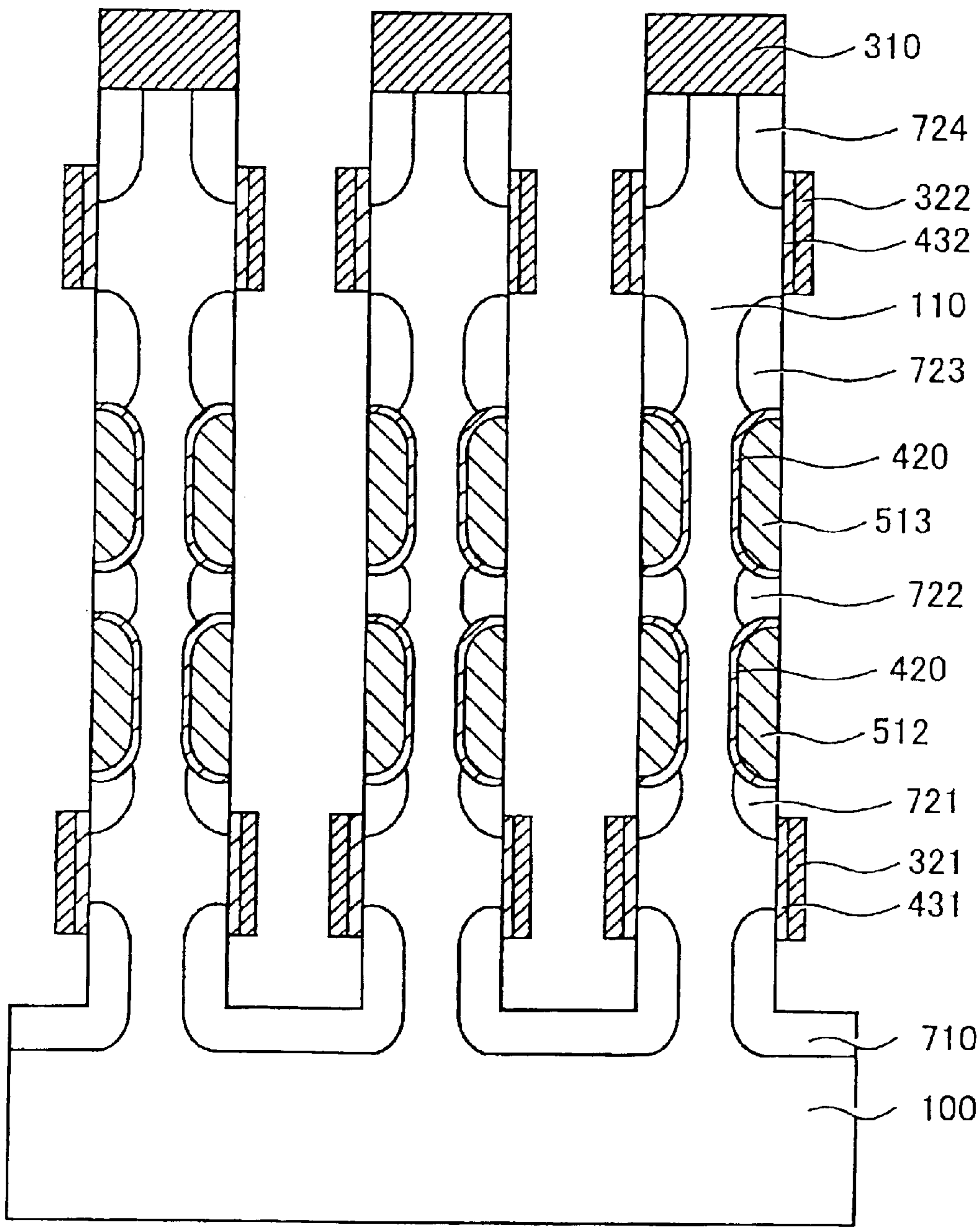
Figure 260:
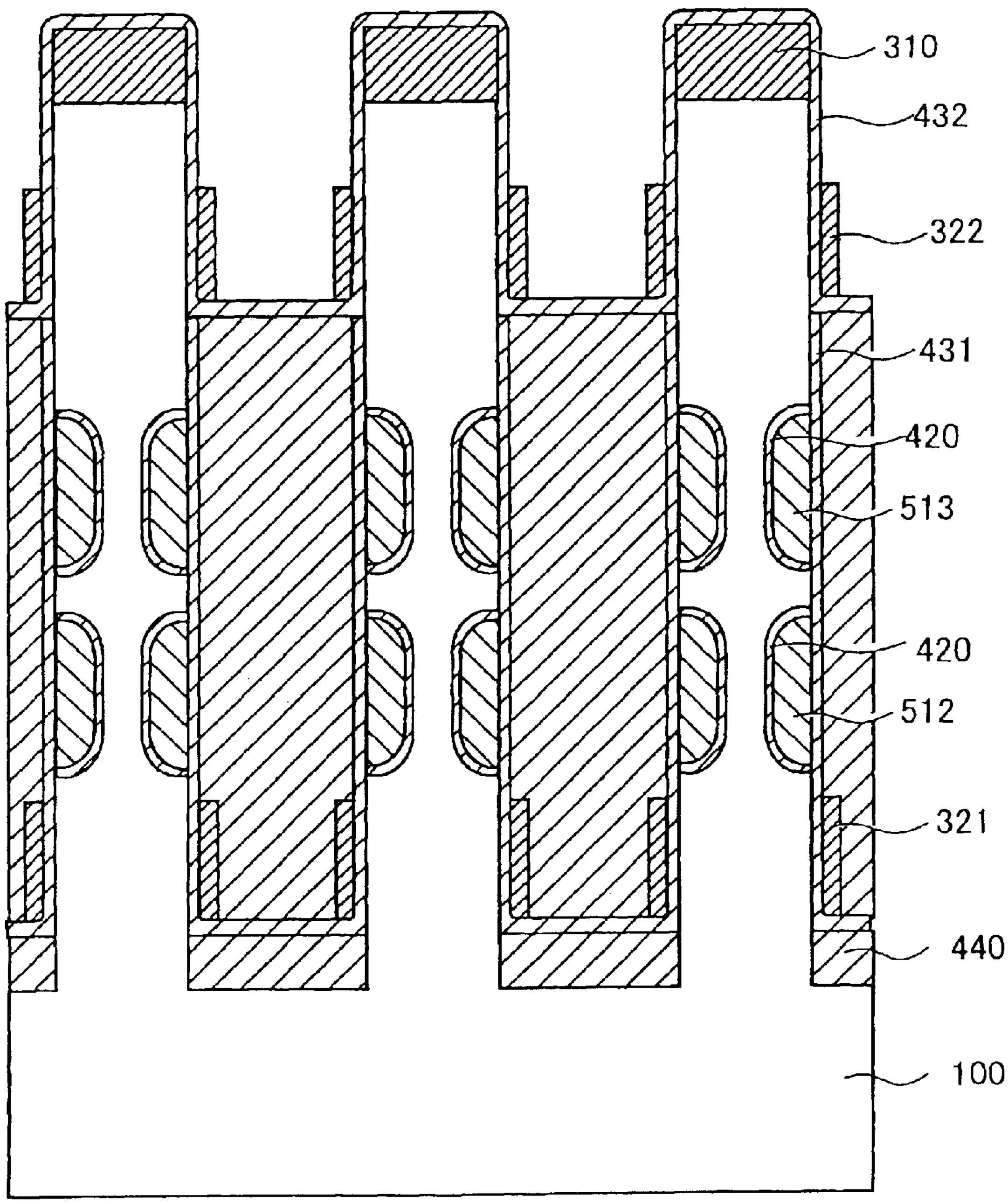
Figure 261:
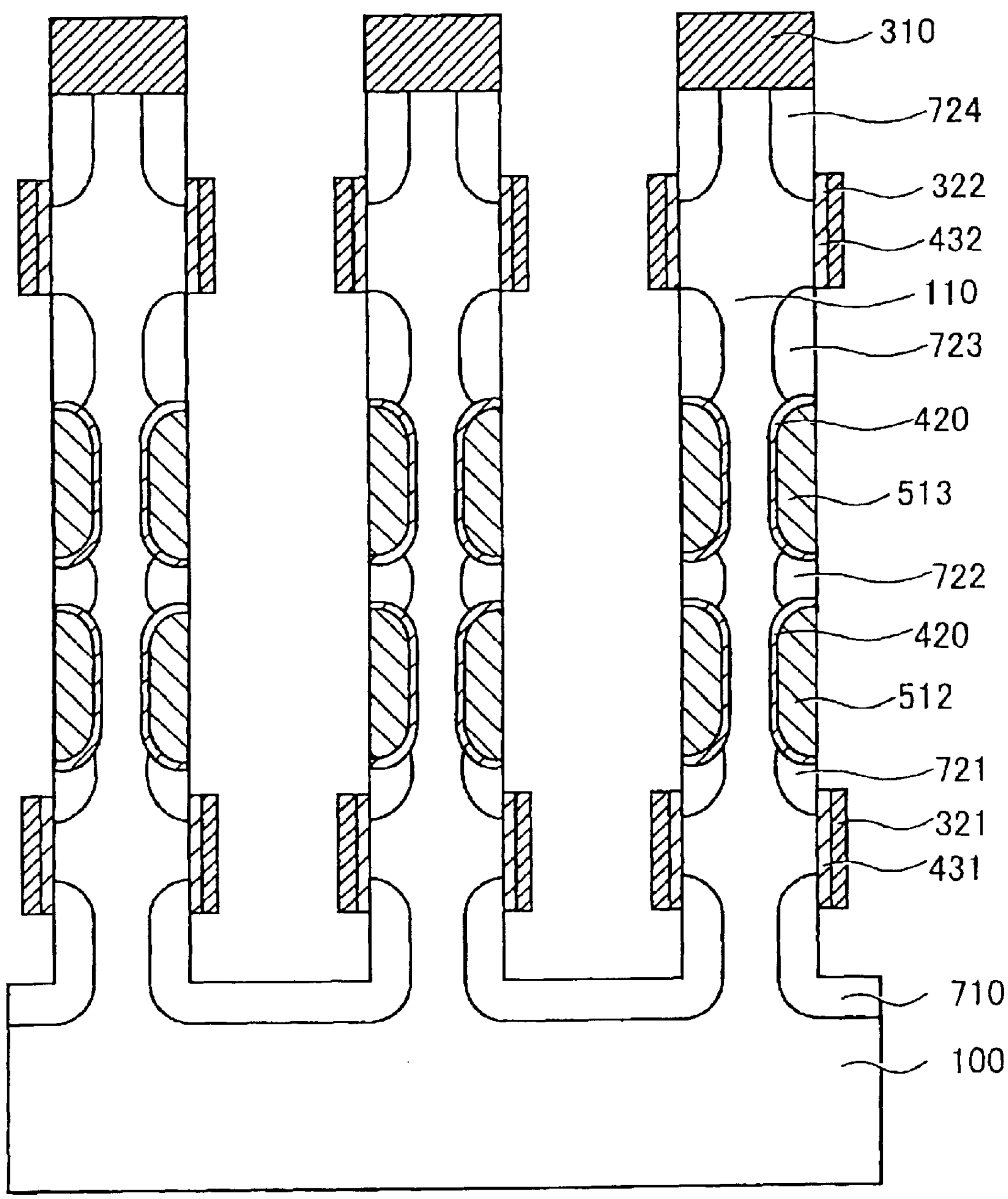

By repeating the above-described steps, the silicon nitride films 321 and 322 are disposed on the sidewall of the island-like semiconductor layer 110 with the intervention of the silicon oxide films 431 and 432, respectively (FIG. 234 and FIG. 260). After the silicon oxide films are selectively removed by isotropic etching, impurities are introduced into the island-like semiconductor layer 110 and the semiconductor substrate 100 to form N-type impurity diffusion layers 710 to 724 (FIG. 235 and FIG. 261). For example, the ion implantation may be performed at an implantation energy of 5 to 100 keV at a arsenic or phosphorus dose of about $1\times10^{13}$ to $1\times10^{15}/cm^2$ in a direction inclined by about 0 to 7°. The ion implantation for formation of the N-type impurity diffusion layers 710 to 724 may be performed to the whole periphery of the island-like semiconductor layer 110, from one direction or various directions to the island-like semiconductor layers. That is, the N-type impurity diffusion layers 710 to 724 may not be formed to entirely encircle the island-like semiconductor layer. The timing of forming the impurity diffusion layer 710 is not necessarily the same as the timing of forming the N-type semiconductor layers 721 to 724.

Then, the silicon oxide films 431 and 432 and the silicon nitride films 321 and 322 are removed. As an eighth insulating film, for example, a silicon oxide film 461, is deposited to a thickness of 50 to 500 nm as a eighth insulating film and etched back to a desired height to be buried. Thereafter, a silicon oxide film 481 having a thickness of about 10 nm is formed as a thirteenth insulating film to be a gate oxide film on the periphery of the island-like semiconductor layer 110 by thermal oxidation. The gate oxide film, however, may be formed of not only a thermally oxidized film but also a CVD oxide film or a nitrogen oxide film. A relation between the thickness of the gate oxide film and that of the tunnel oxide film is not limited, but it is desired that the thickness of the gate oxide film is larger than that of the tunnel oxide film.

Subsequently, a polysilicon film 521 is deposited to a thickness of 15 to 150 nm as-a second conductive film and anisotropically etched into the form of a sidewall spacer to form a selection gate. At this time, by setting the intervals between the island-like semiconductor layers 110 in a direction of A–A' in FIG. 1 to a predetermined value or smaller, the polysilicon film 521 is formed into a second wiring layer to be a selection gate line continuous in the direction without need to use a masking process.

Figure 236:
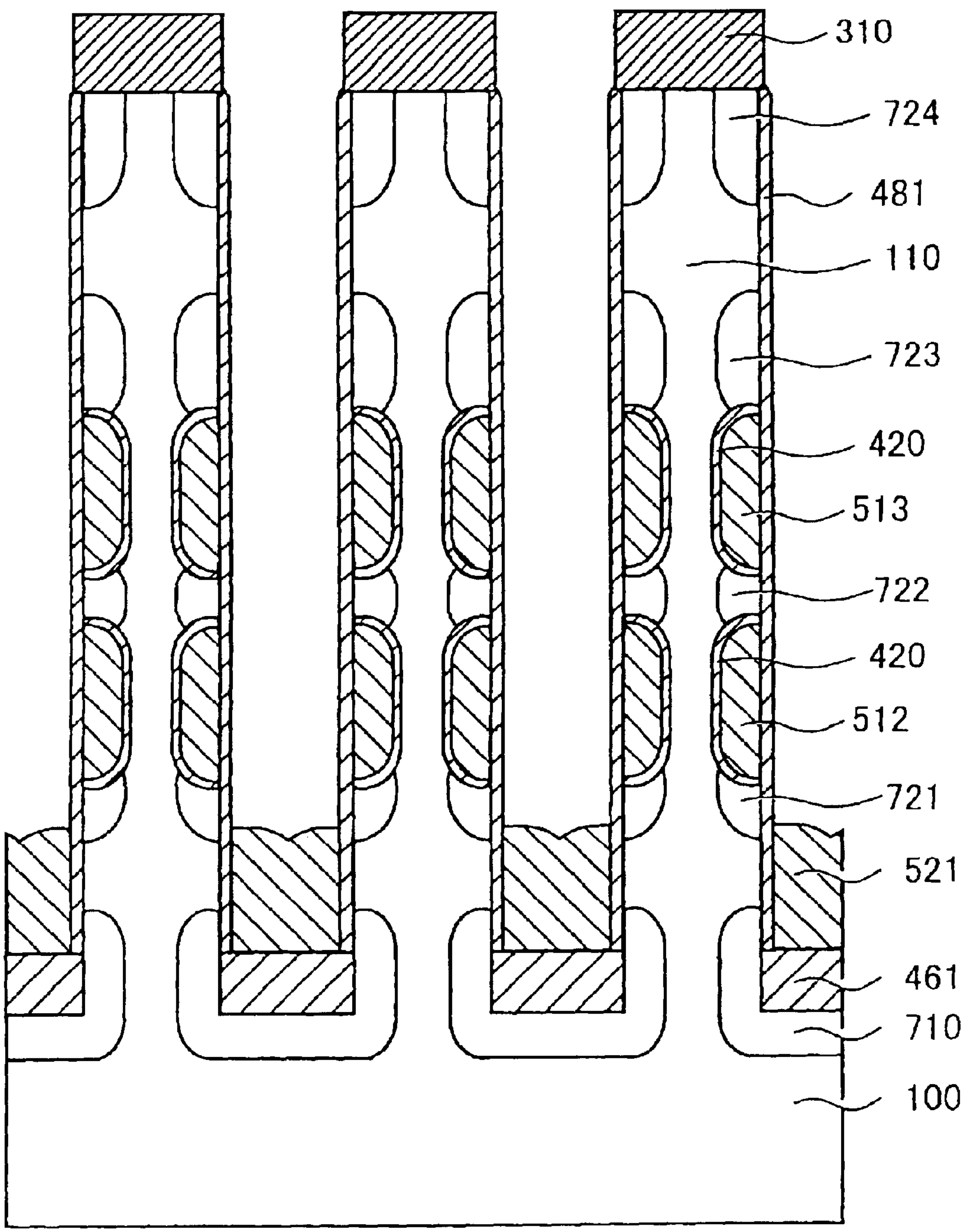
Figure 262:
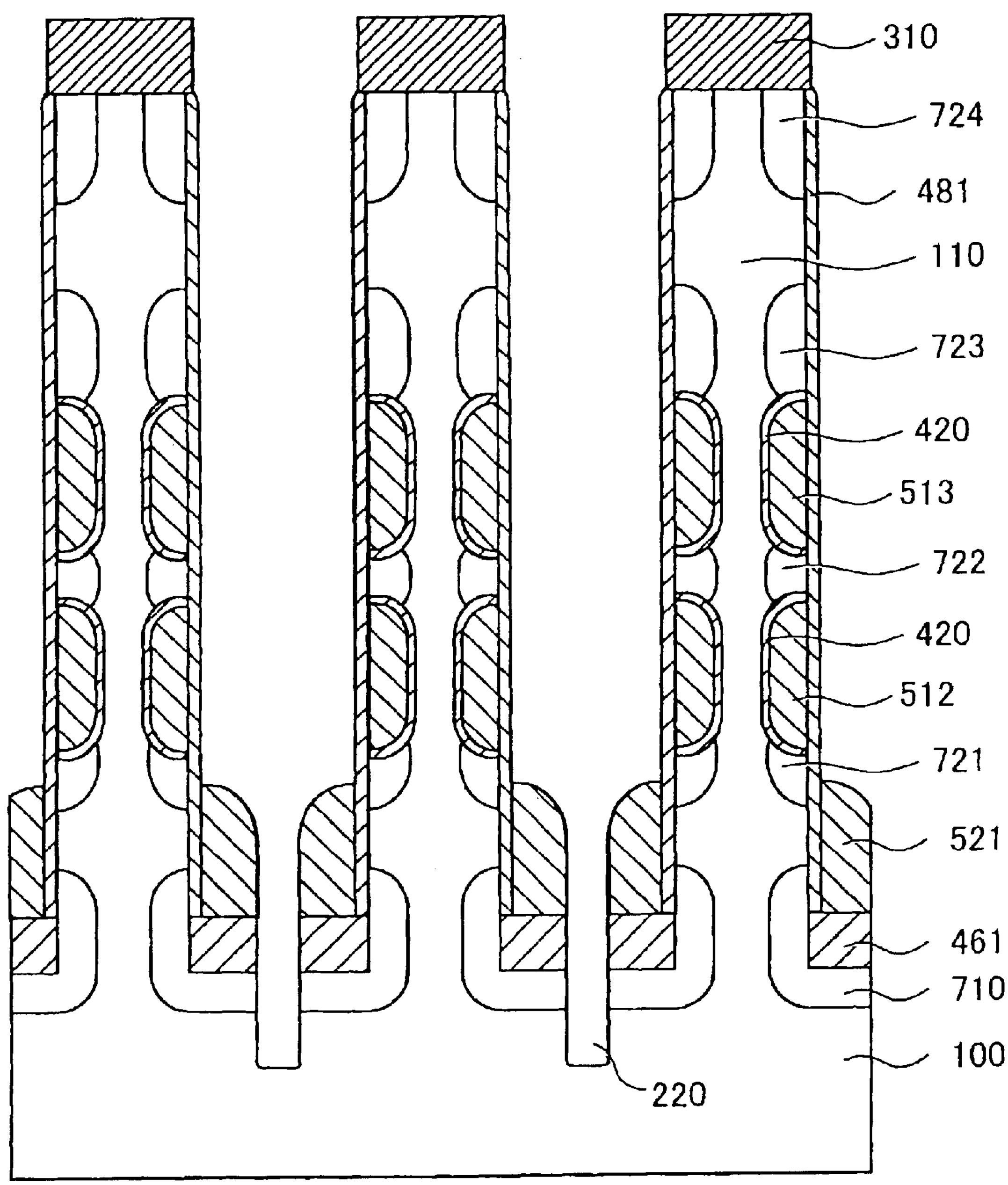

Then, as shown in FIG. 262, a second trench 220 is formed on the P-type silicon substrate 100 in self-alignment with the polysilicon film 521, thereby separating the impurity diffusion layer 710 (FIG. 236 and FIG. 262). That is, a separation portion of the first wiring layer is formed in self-alignment with a separation portion of the second conductive film.

A silicon oxide film 462 is deposited to a thickness of 50 to 500 nm as an eighth insulating film and anisotropically and isotropically etched so that the silicon oxide film 462 is embedded to bury the side and top of the polysilicon film 521.

Figure 237:
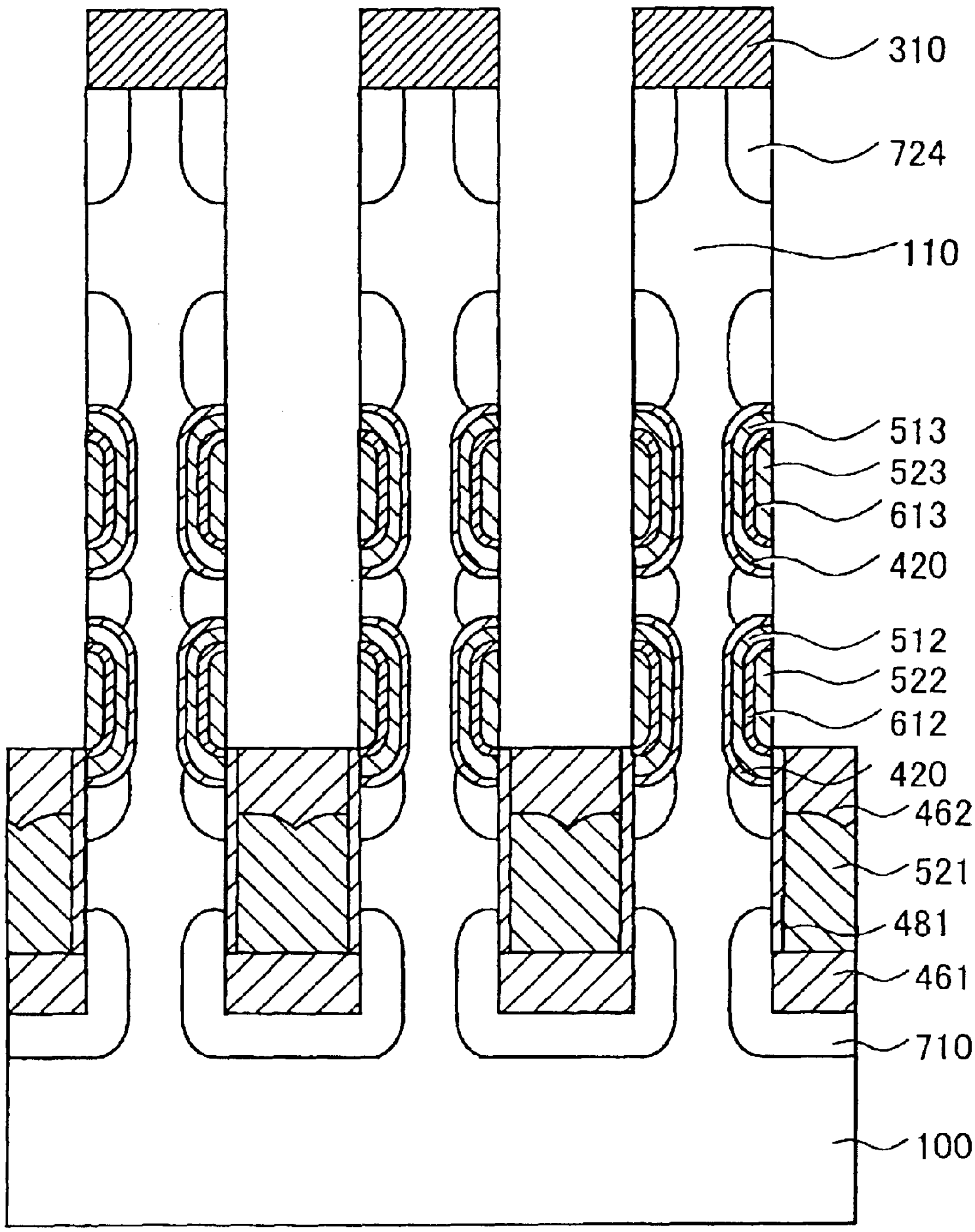
Figure 263:
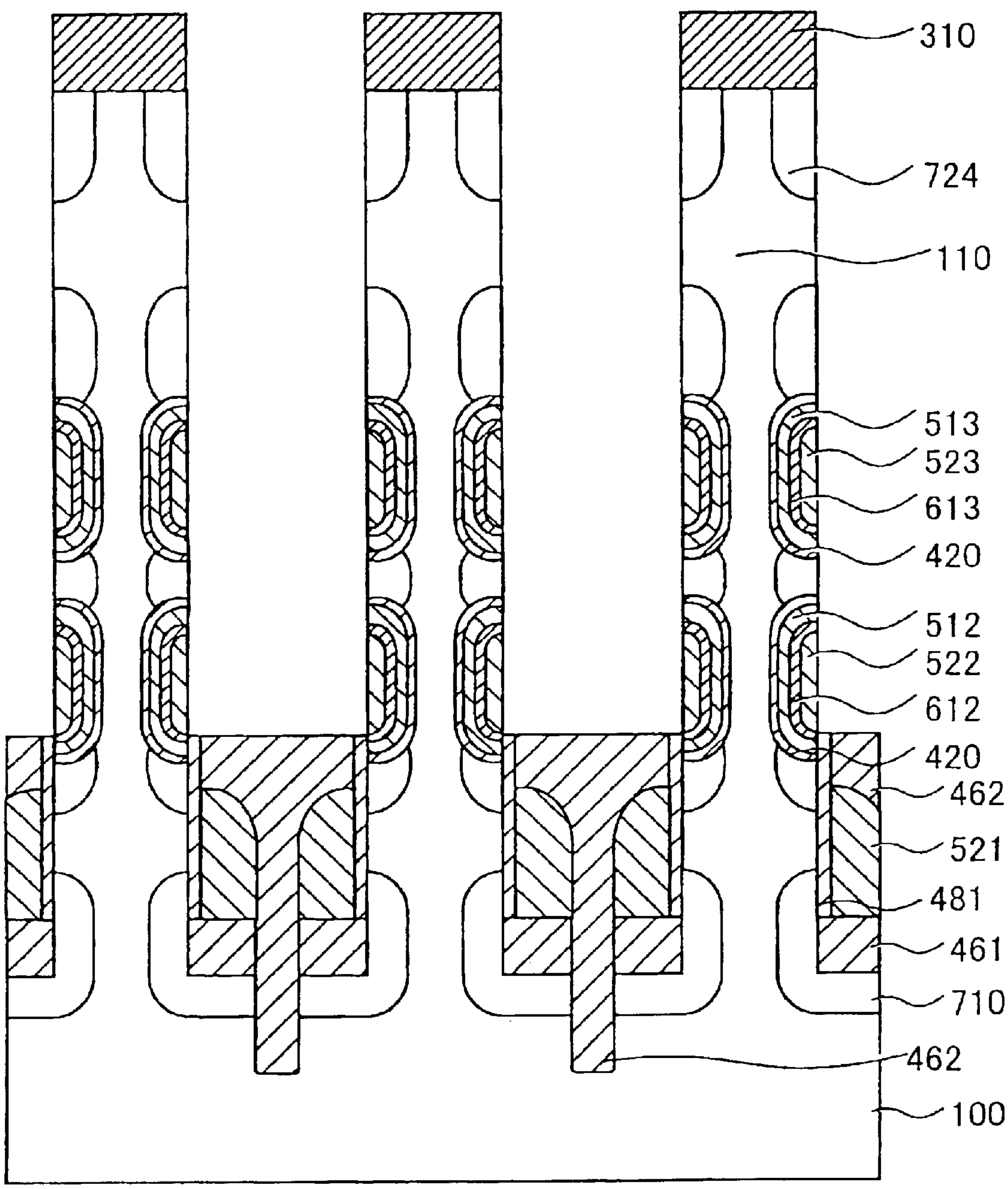

Then, on the sidewalls of the polysilicon films 512 and 513 which are buried in the island-like semiconductor layer 110, recesses are formed, for example, by the above-described technique. In the recesses, polysilicon films 522 and 523 are formed as second conductive films with the intervention of interlayer insulating films 612 and 613 (FIG. 237 and FIG. 263). This interlayer insulating film 612 and 613 may be formed of an ONO film, for example. More particularly, a silicon oxide film of 5 to 10 nm thickness is formed on the surface of the polysilicon film by thermal oxidization, and then, a silicon nitride film of 5 to 10 nm thickness and a silicon oxide film of 5 to 10 nm thickness are formed sequentially by CVD.

Further, a polysilicon film 522 is deposited to a thickness of 15 to 150 nm as a second conductive film and etched back. At this time, by setting the intervals between the island-like semiconductor layers 110 in a direction of A–A' in FIG. 1 to a predetermined value or smaller, the polysilicon film 522 is formed into a third wiring layer to be a control gate line continuous in the direction without need to use a masking process.

Figure 238:
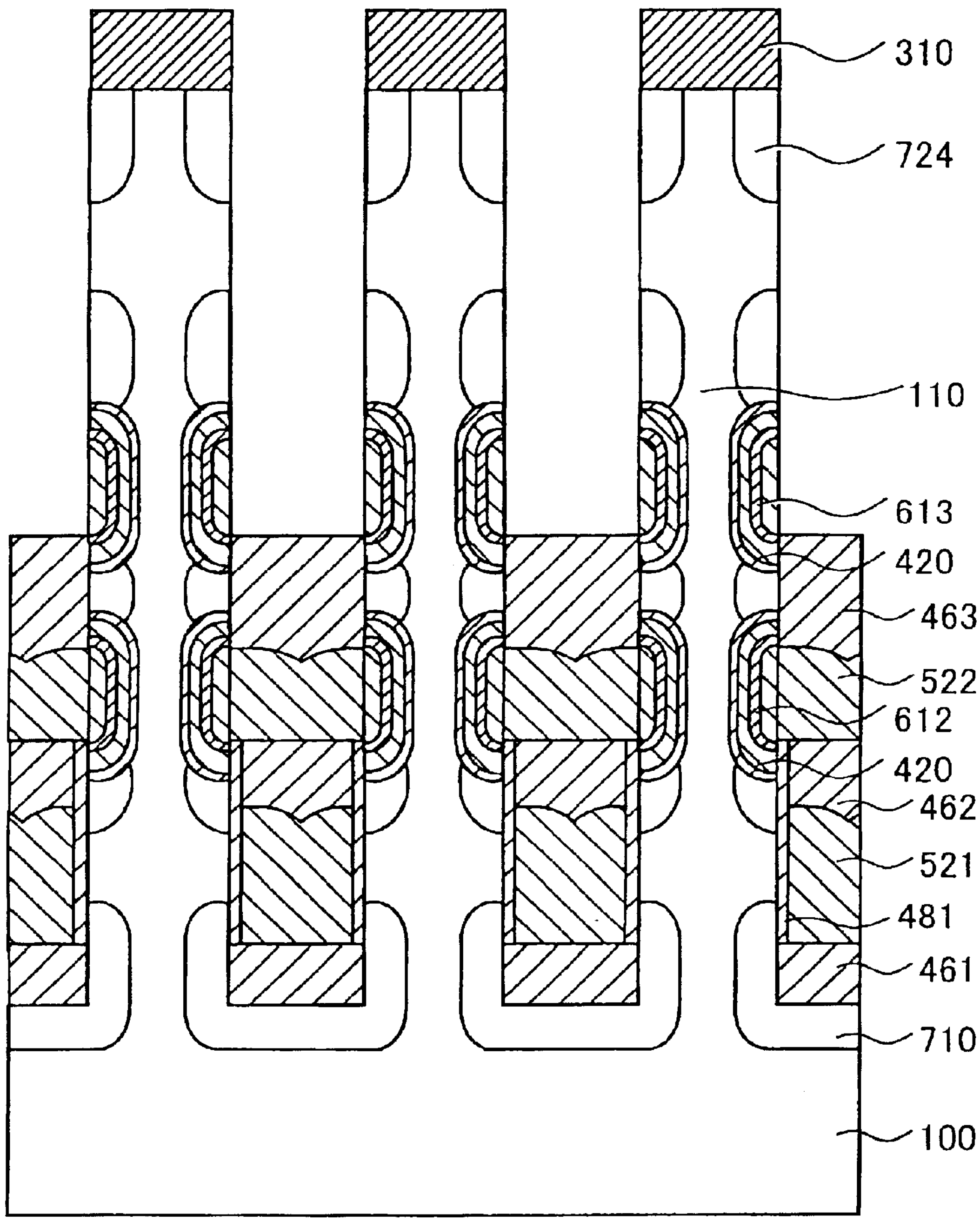
Figure 264:
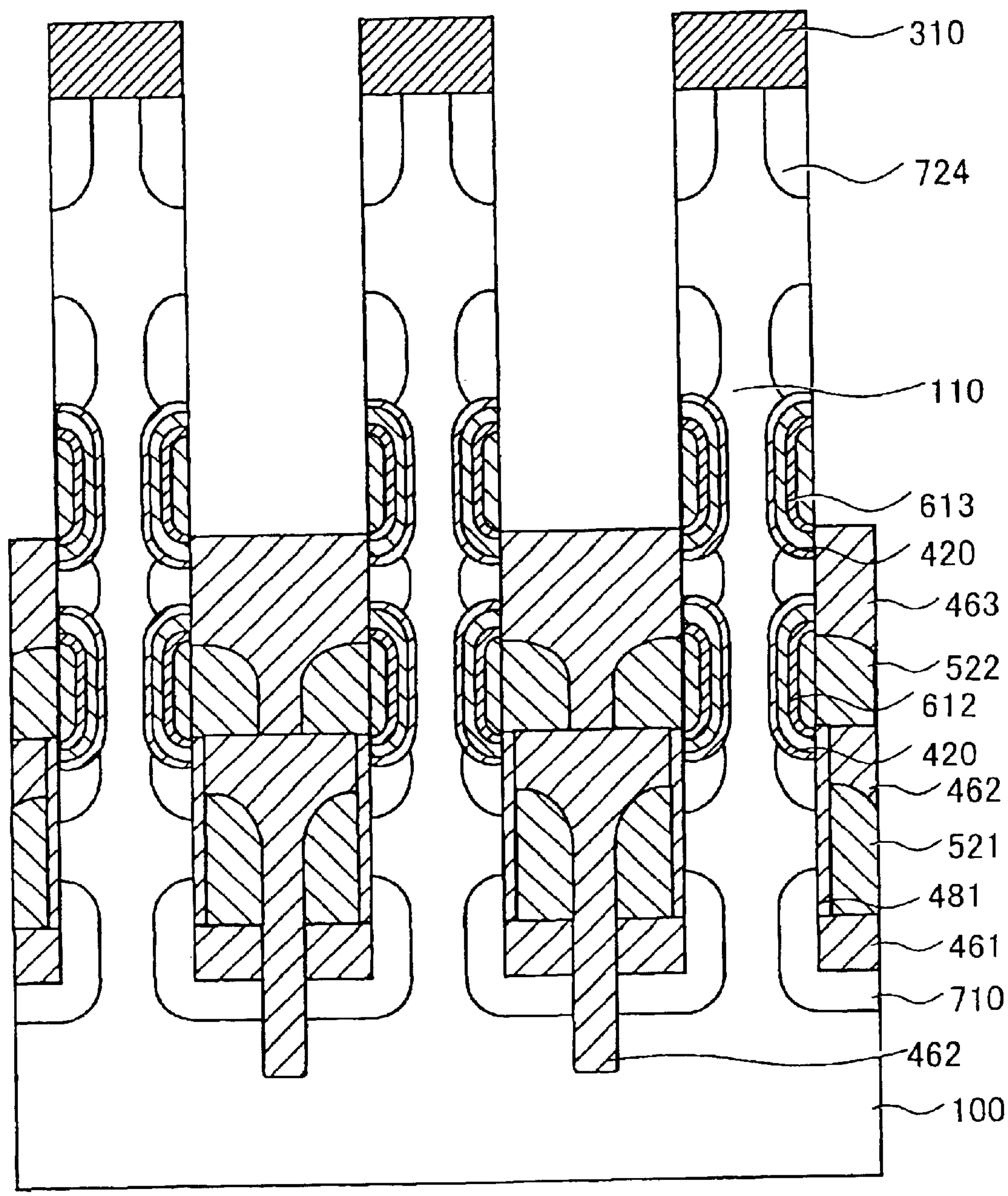

Then, a silicon oxide film 463 is deposited to a thickness of 50 to 500 nm as a eighth insulating film and anisotropically and isotropically etched so that the silicon oxide film 463 is embedded to bury the side and top of the polysilicon film 522 (FIG. 238 and FIG. 264).

Figure 239:
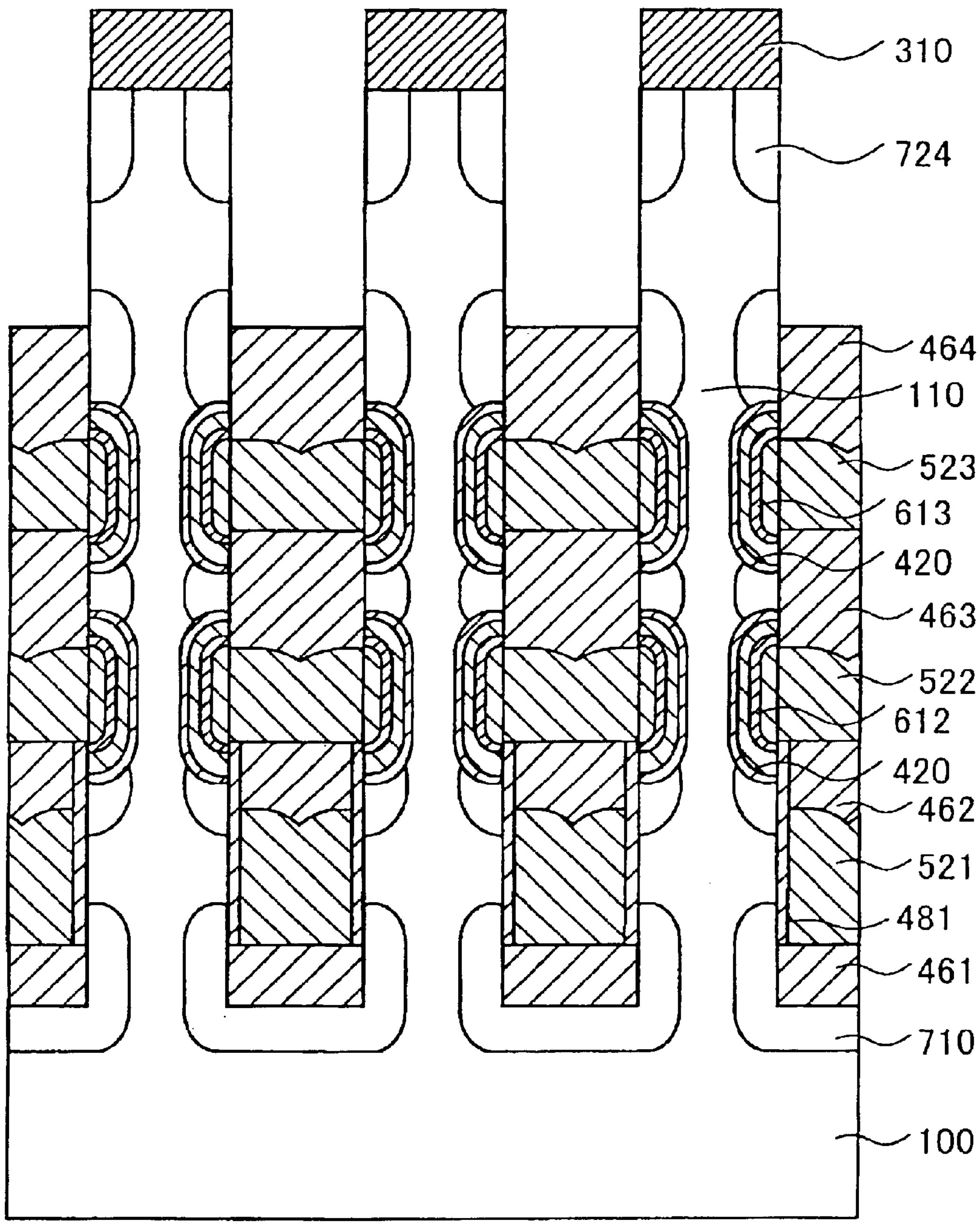
Figure 265:
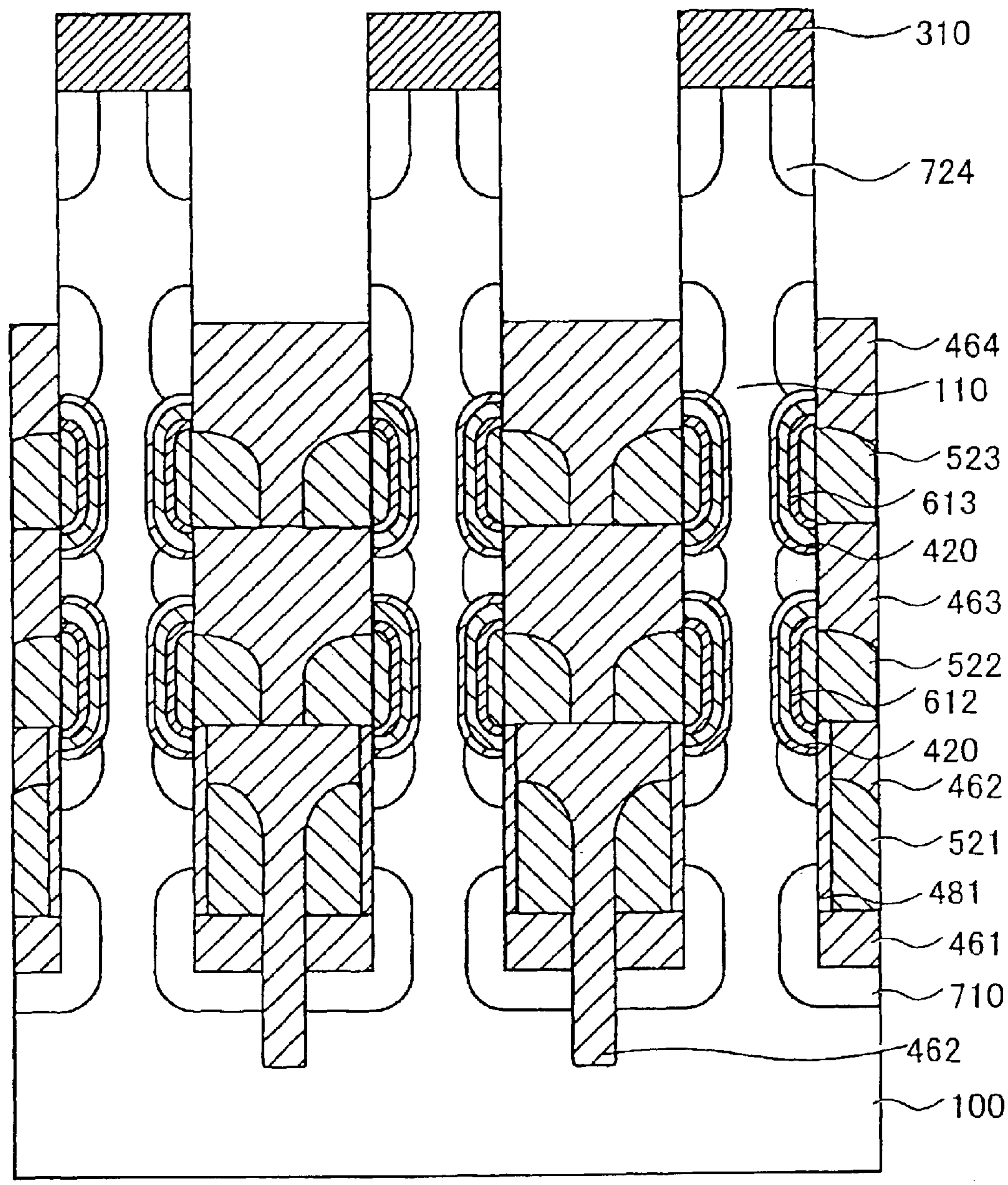

By repeating likewise, a polysilicon film 523 is deposited to a thickness of 15 to 150 nm as a second conductive film and anisotropically etched into the form of a sidewall spacer, and a silicon oxide film 464 is embedded to bury the side and top of the polysilicon film 523 (FIG. 239 and FIG. 265).

Figure 240:
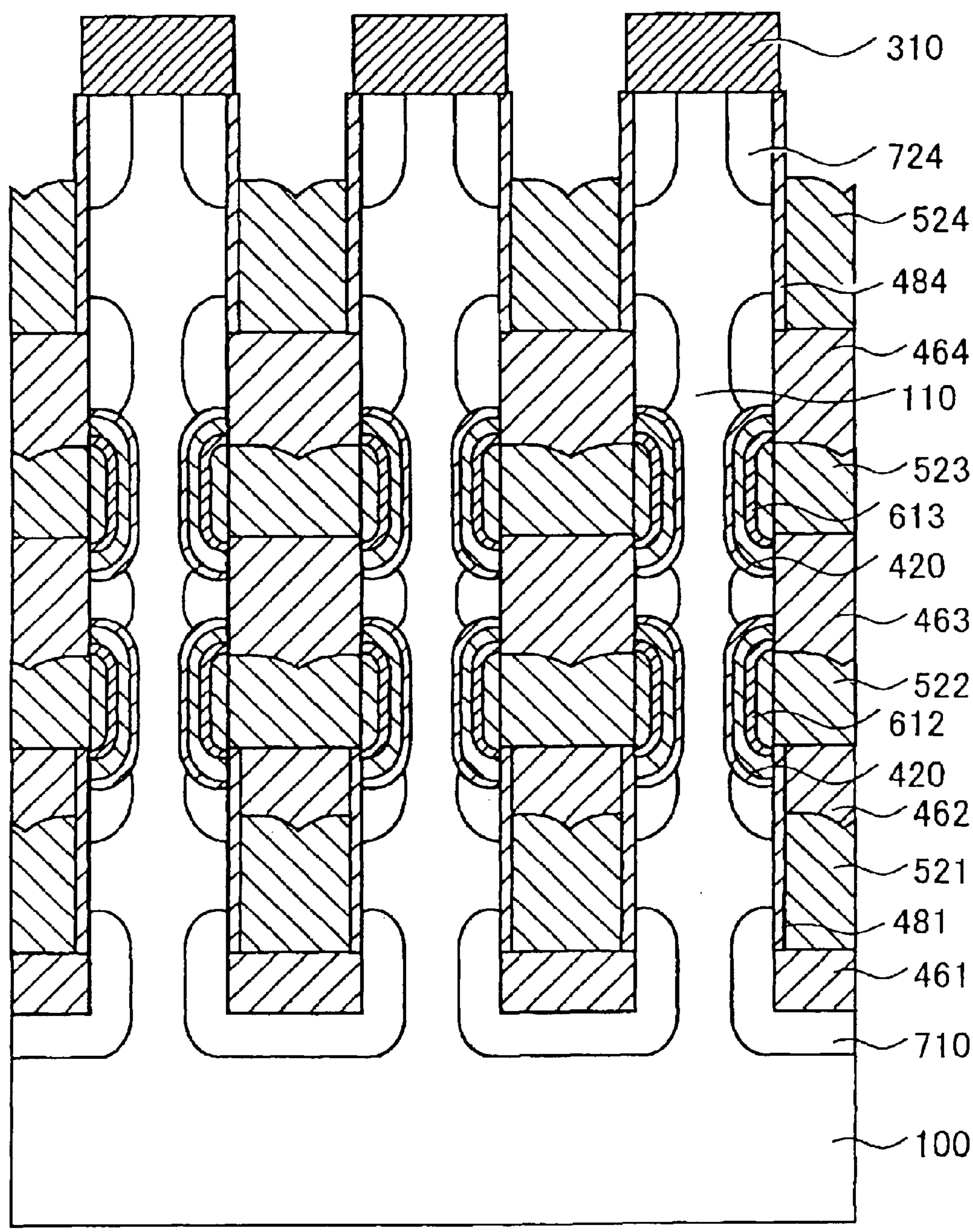
Figure 241:
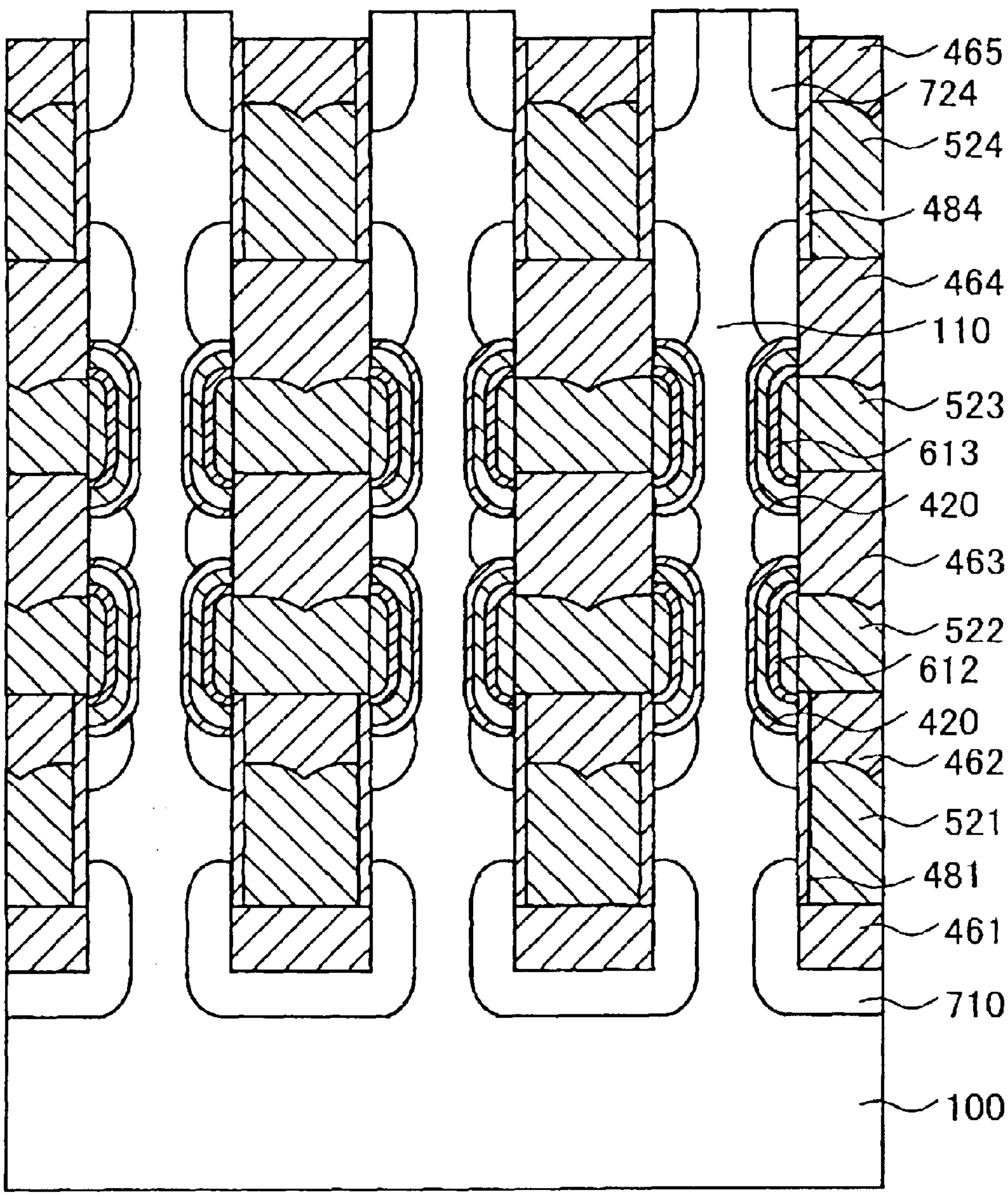
Figure 266:
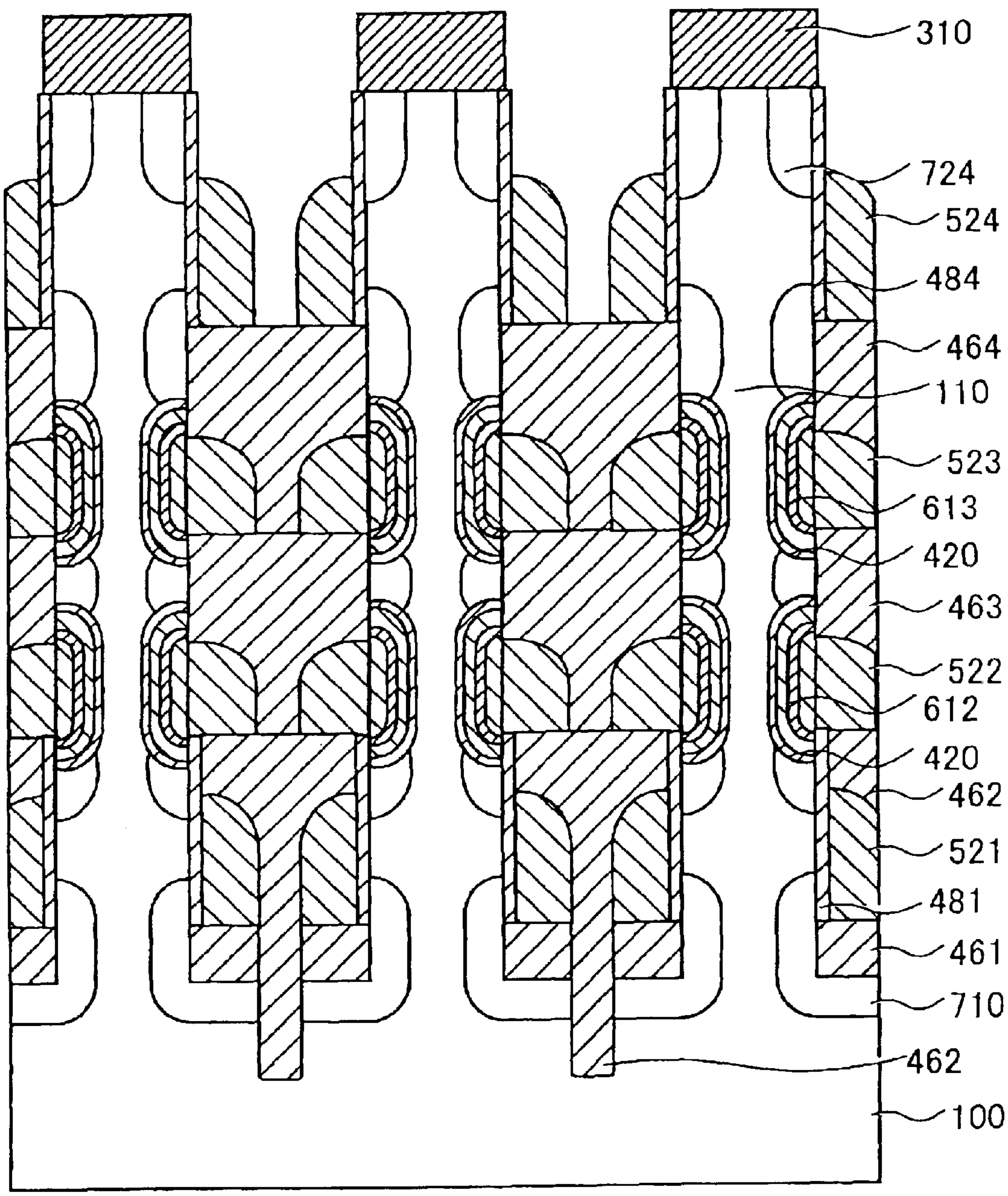
Figure 267:
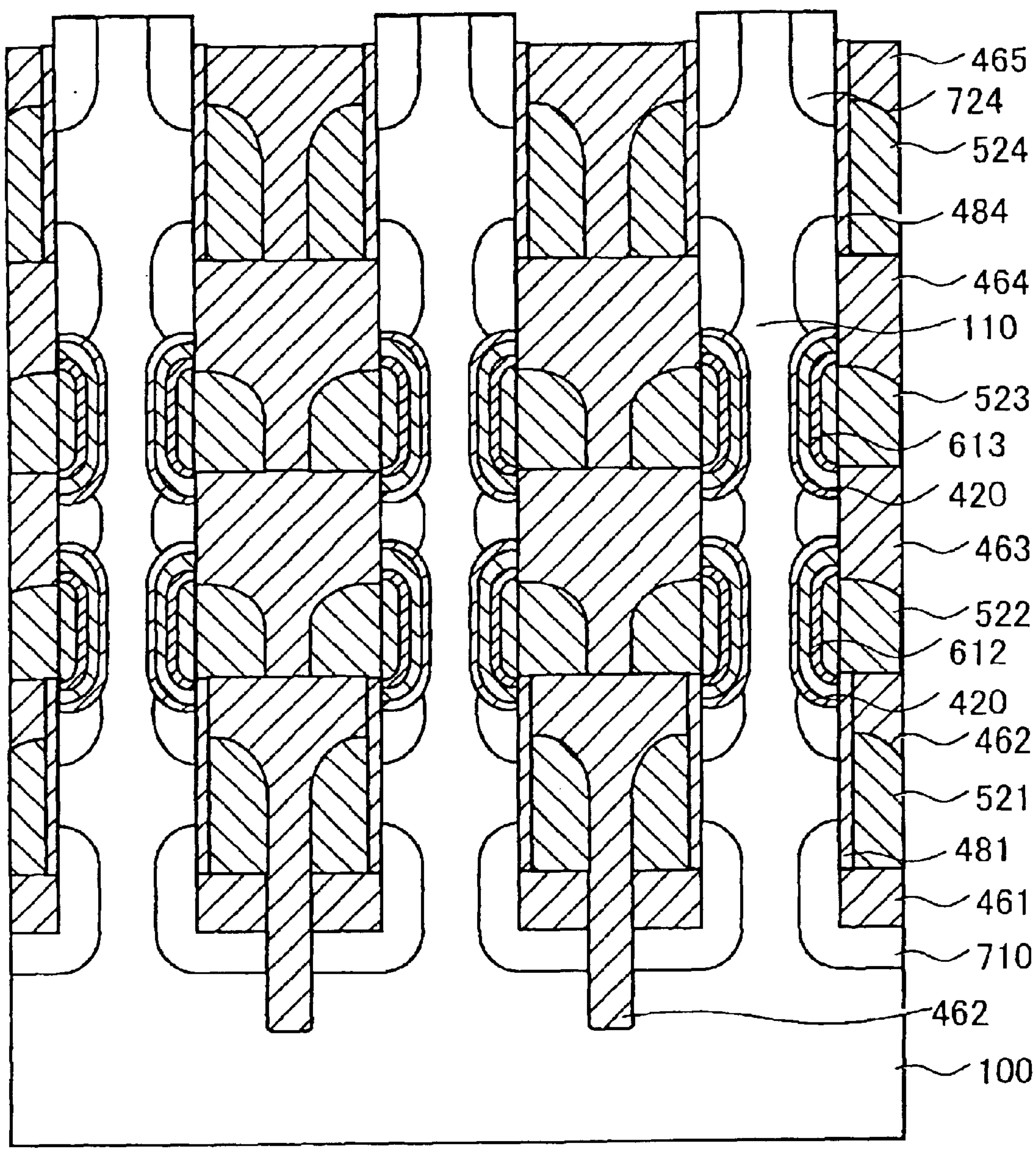

Subsequently, a polysilicon film 524 is deposited to a thickness of 15 to 150 nm as a second conductive film and anisotropically etched into the form of a sidewall spacer (FIG. 240 and FIG. 266).

On the top of the polysilicon film 524, a silicon oxide film 465 is deposited to a thickness of 100 to 500 nm as a tenth insulating film. The top of the island-like semiconductor layer 110 provided with the impurity diffusion layer 724 is exposed by etch-back or CMP (FIG. 241 and FIG. 267), and as required, ion implantation is carried out with respect to the top of the island-like semiconductor layer 110 to adjust the impurity concentration. Then, a fourth wiring layer 840 is connected to the top of the island-like semiconductor layer 110 so that the direction of the fourth wiring layer crosses the direction of the second or the third wiring layer.

Figure 242:
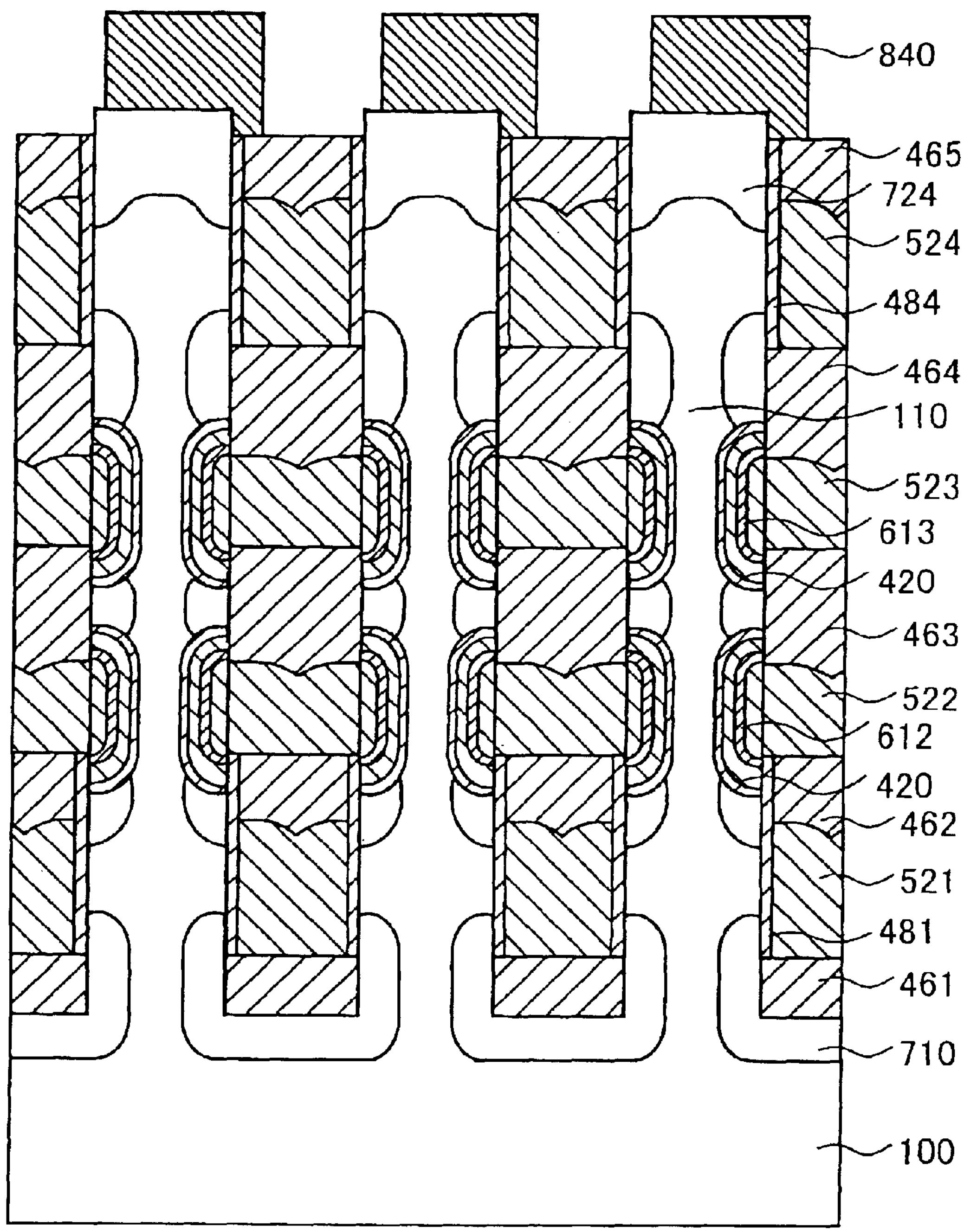
Figure 268:
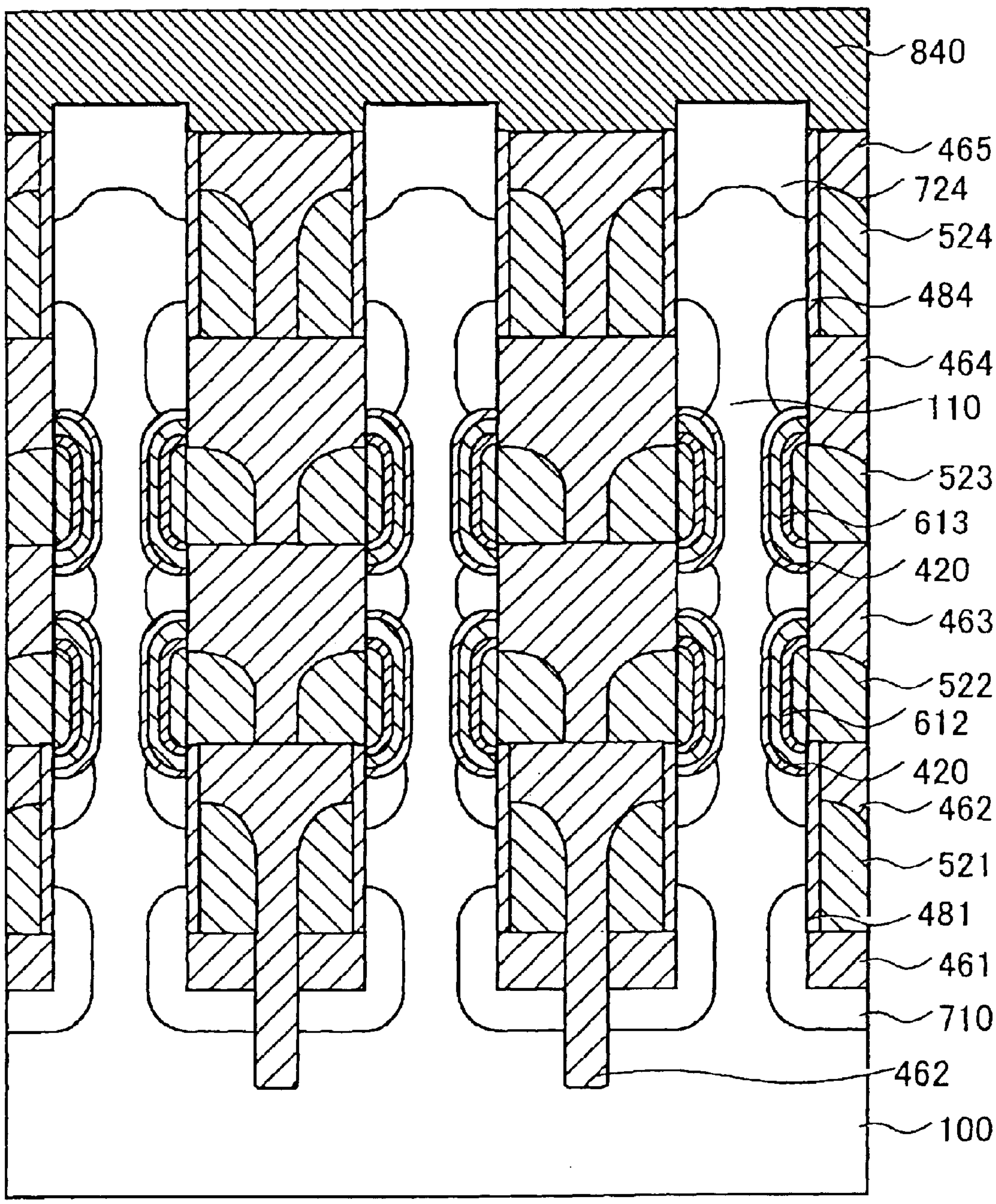

Then, by known techniques, an interlayer insulating film is formed and a contact hole and metal wiring are formed. Thereby, a semiconductor memory is realized which has a memory function according to the state of a charge in the charge storage layer which is the floating gate made of the polysilicon film to be the first conductive film (FIG. 242 and FIG. 268).

Thus, since the floating gate is buried in the sidewall of the island-like semiconductor layer 110 and the control gate is buried in the sidewall of the floating gate, the coupling ratio decreases. However, since the channel region has a curvature, field intensity increases and as a result, writing speed improves.

The polysilicon films 522 and 523 to be the first conductive films may partially be disposed in the recesses formed on the sidewalls of the polysilicon films 512 and 513, respectively. There is no particular limitation to the shape of the polysilicon films 522 and 523 to be the second conductive films buried in the floating gates with the intervention of the interlayer insulating films.

In this production example, the first lattice-form trench 210 is formed on the P-type semiconductor substrate, as an example. However, the first lattice-form trench 210 may be formed in a P-type impurity diffusion layer formed in an N-type semiconductor substrate, or in a P-type impurity diffusion layer formed in an N-type impurity diffusion layer formed in a P-type silicon substrate. The conductivity types of the impurity diffusion layers may be reversed.

This production example can be applied to the following production examples.

In this production example, films formed on the surface of the semiconductor substrate or the polysilicon film such as the silicon nitride film 310 may be formed of a layered film of a silicon oxide film/a silicon nitride film from the silicon surface. Means of forming the silicon oxide film to be buried is not limited to CVD, and rotational application may be used, for example.

In this production example, the recesses in which the polysilicon films 512 and 513 (the first conductive films) are buried and in which the polysilicon films 522 and 523 (the second conductive films) are buried, are formed at the same time. However, they may be formed stage by stage.

In this production example, the control gates of the memory cells are formed continuously in one direction without using a mask. However, that is possible only where the island-like semiconductor layers are not disposed symmetrically to a diagonal. More particularly, by setting smaller the intervals between adjacent island-like semiconductor layers in the direction of the second or the third wiring layers than those in the direction of the fourth wiring layer, it is possible to automatically obtain the wiring layers which are discontinuous in the direction of the fourth wiring layer and are continuous in the direction of the second or the third wiring layers without using a mask. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased, i.e., a reading voltage is 0V and a threshold is negative, thereby the cell current flows even through a non-selected cell.

Figure 243:
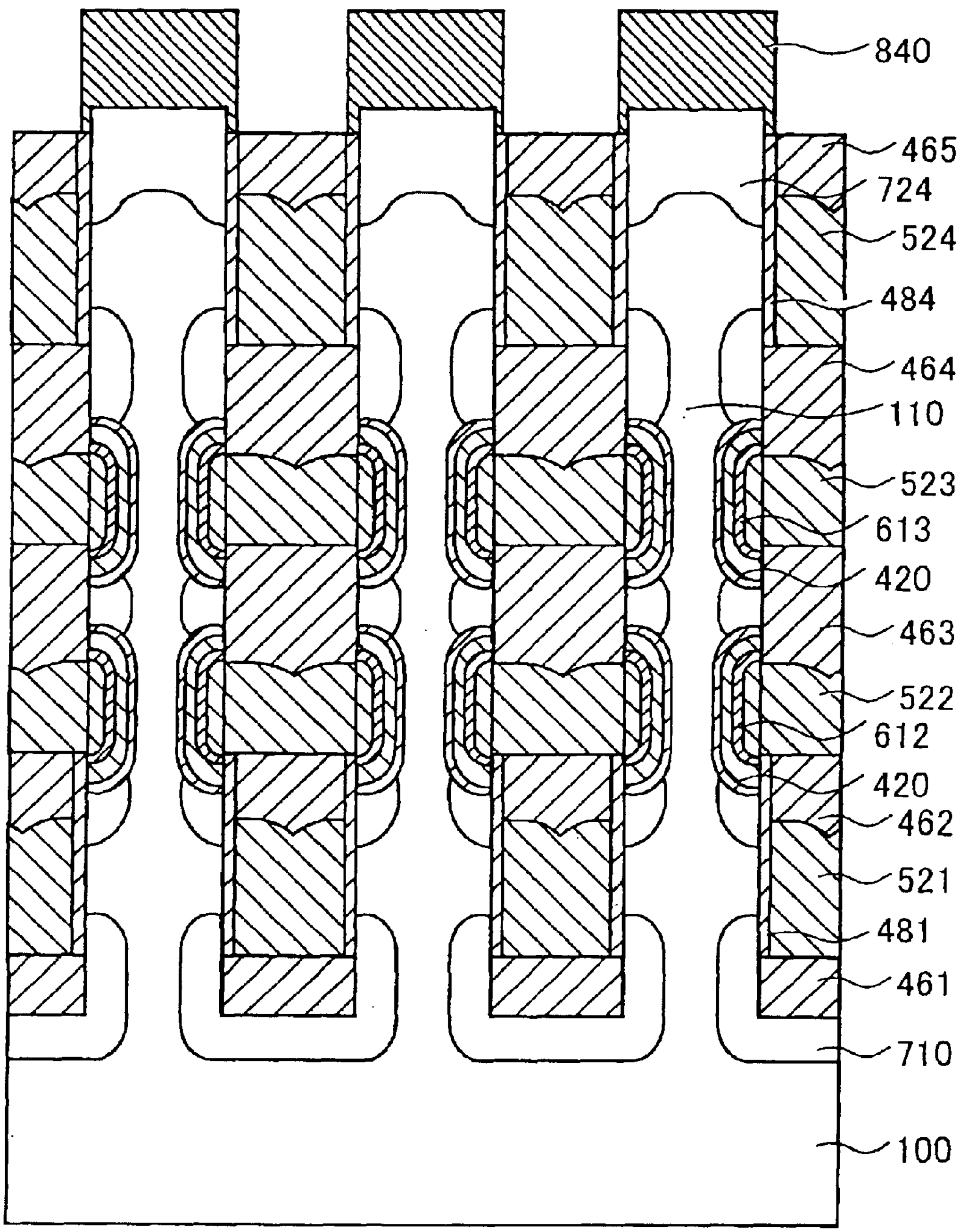
Figure 269:
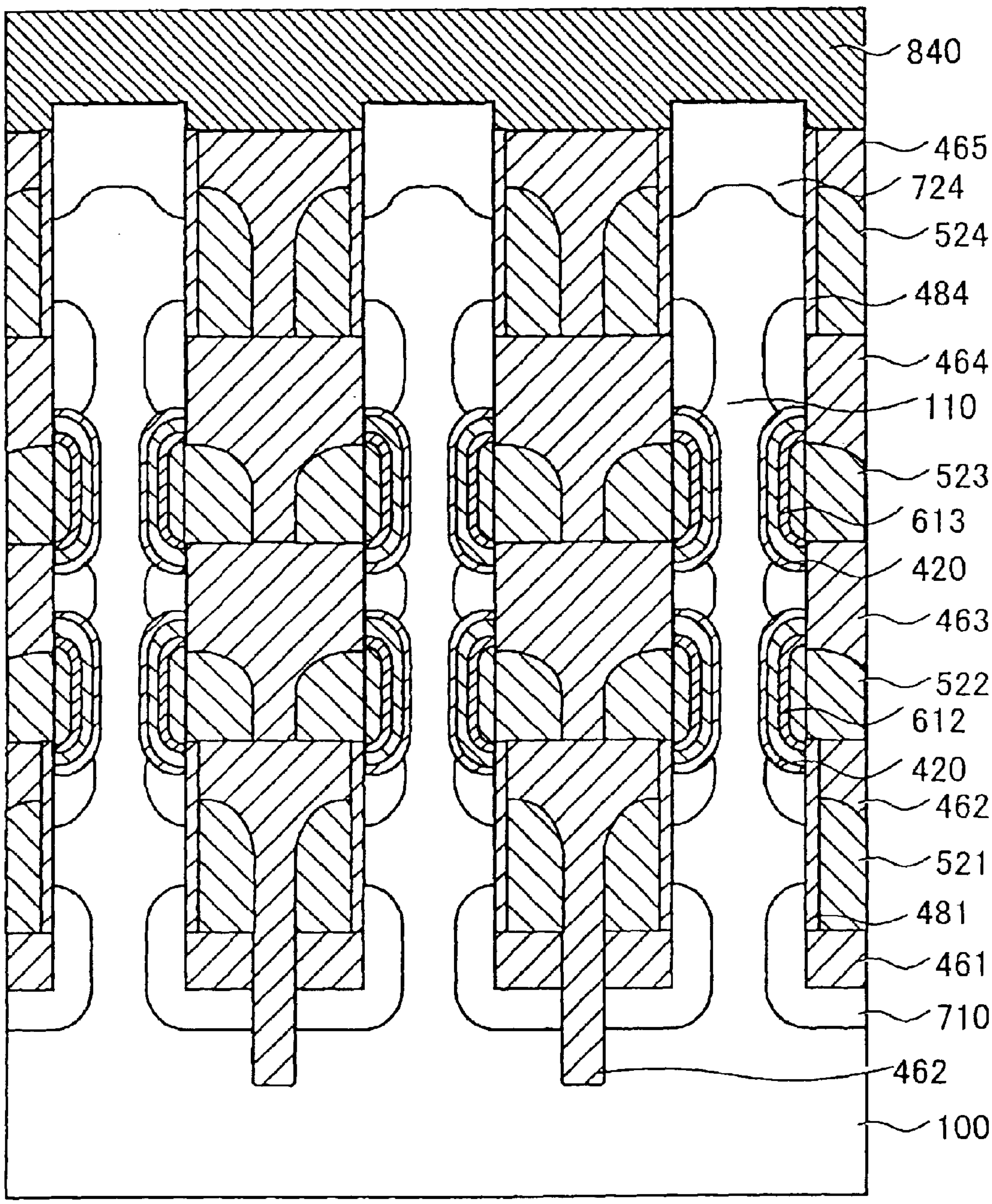

FIG. 242 and FIG. 268 show that the fourth wiring layer 840 is mis-aligned with respect to the island-like semiconductor layer 110. However, it is preferred that the fourth wiring layer 840 is formed without mis-alignment as shown in FIG. 243 and FIG. 269.

PRODUCTION EXAMPLE 21

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

A semiconductor memory is produced by the following production process.

FIGS. 270 and 271 and FIGS. 272 and 273 are sectional views taken on line A–A' and line B–B', respectively, in FIG. 1 which is a cross-sectional view illustrating a memory cell array of an EEPROM.

Figure 270:
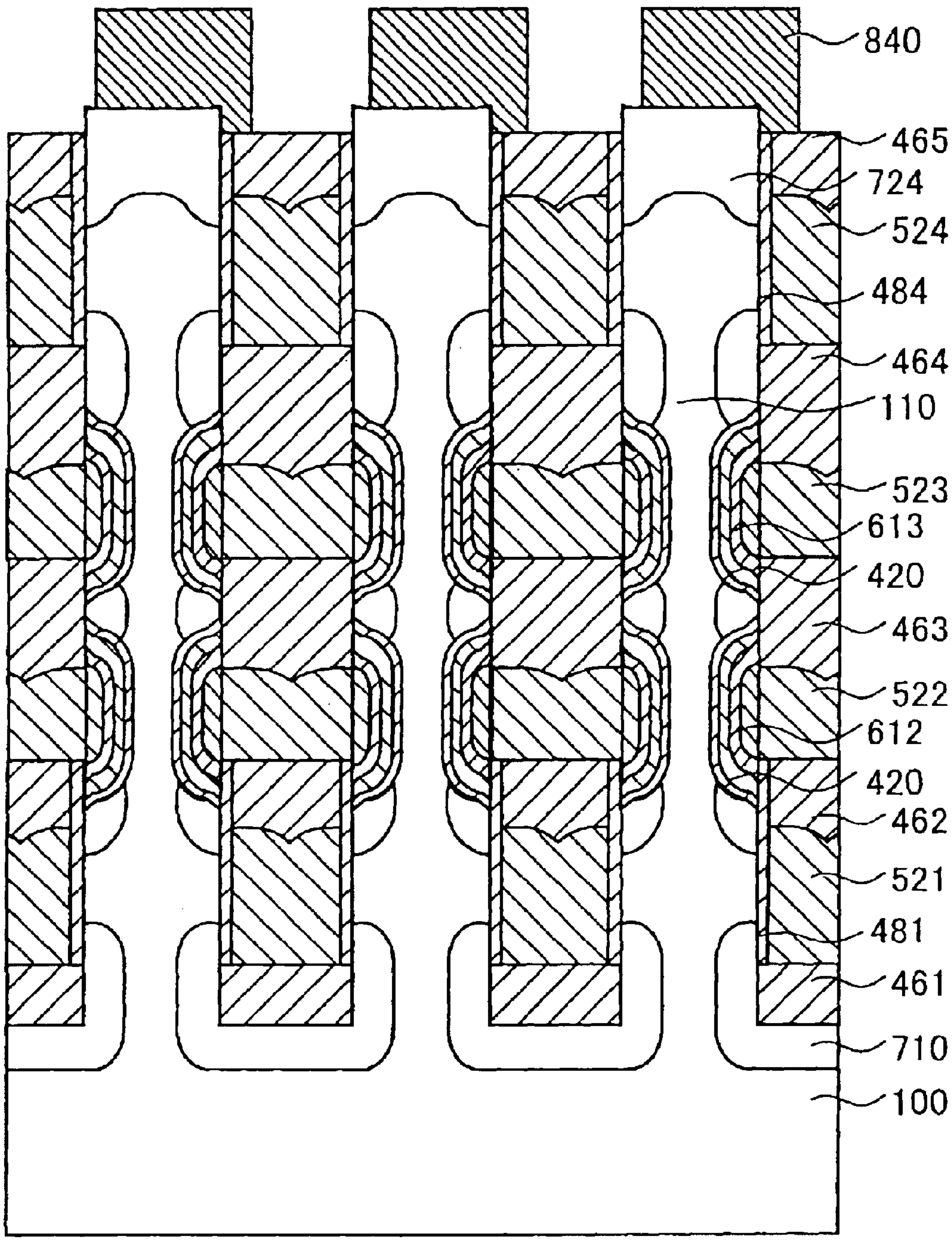
Figure 271:
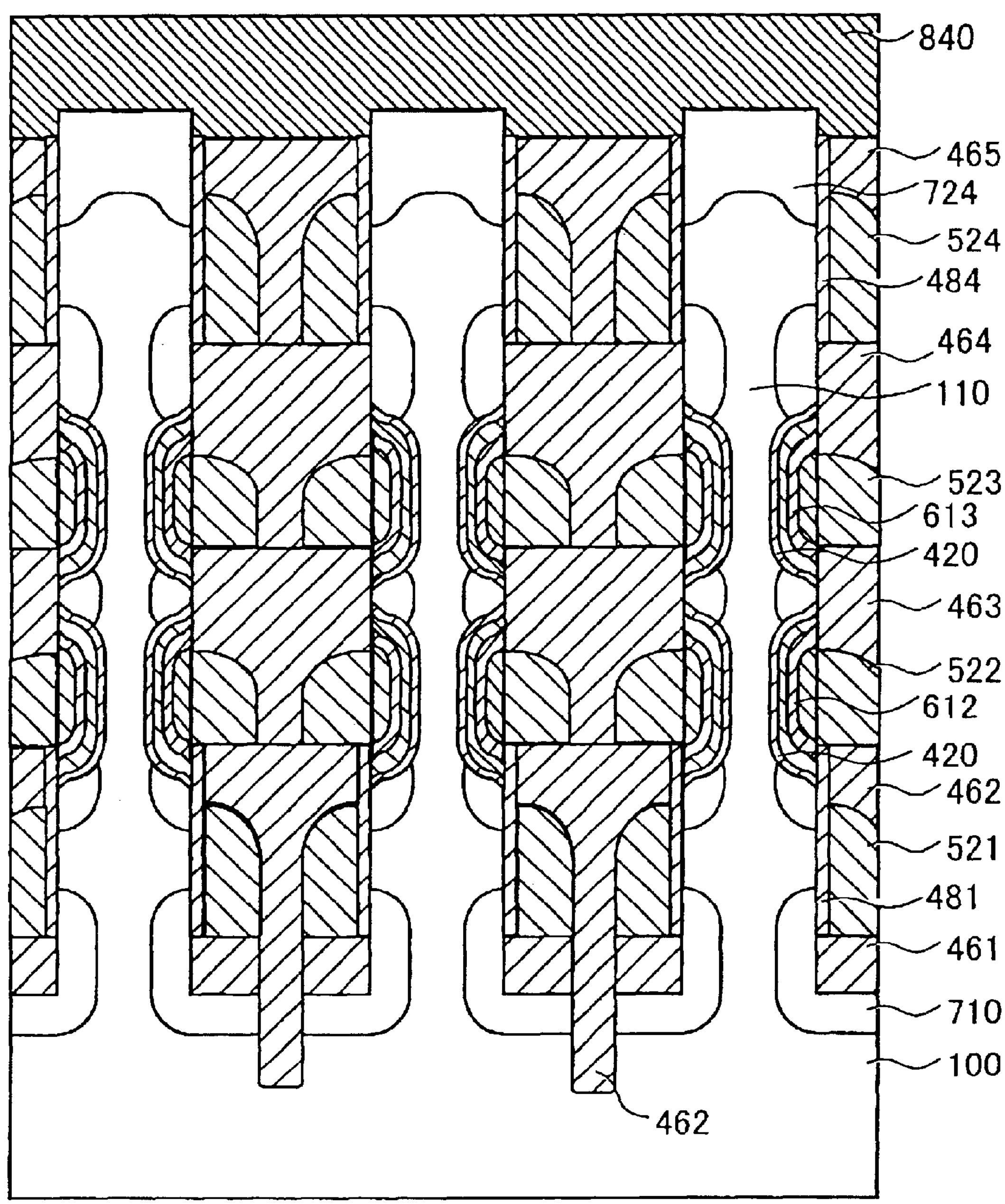

In this production example, at least one recess to be formed in the island-like semiconductor layer 110 does not have a simple concave shape as shown in FIG. 270 and FIG. 271. More specifically, during the formation of a silicon oxide film 450 (a seventh insulating film) by thermal oxidation, the island-like semiconductor layer 110 located inside a silicon nitride film 322 (a fourth insulating film) is partially oxidized, thereby the recesses of such a shape are formed. However, such recesses are also sufficiently used. The shape of the recesses is not particularly limited as long as the diameter of the island-like semiconductor layer 110 is partially reduced by the recesses.

Figure 272:
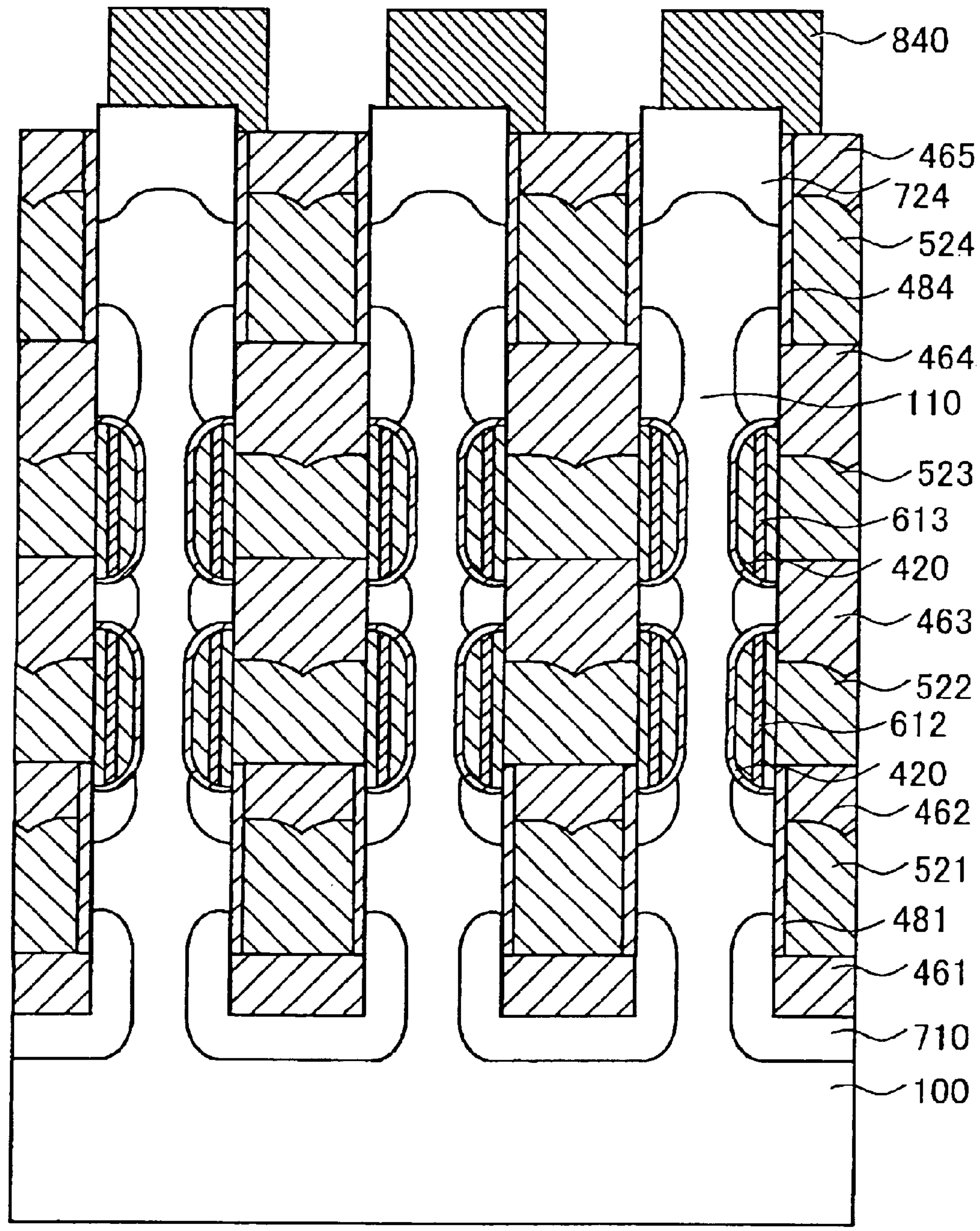
Figure 273:
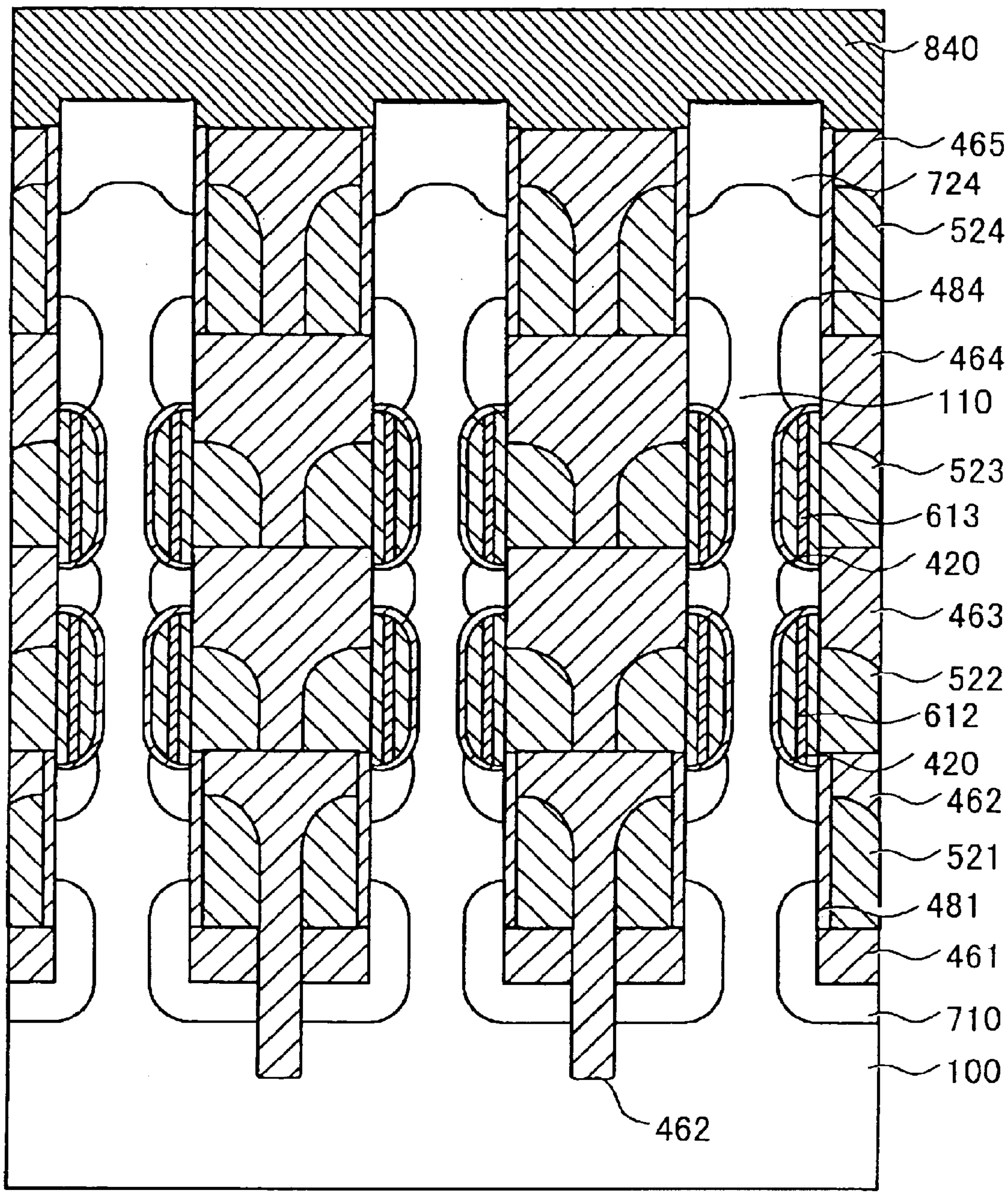

In the case where the floating gate and the control gate are placed in the same recess in the semiconductor memory as explained in Production example 20, the floating gate and the control gate may be arranged as shown in FIG. 272 and FIG. 273, for example. The positional relationship between the floating gate and the control gate in the recess is not limited.

PRODUCTION EXAMPLE 22

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Figure 274:
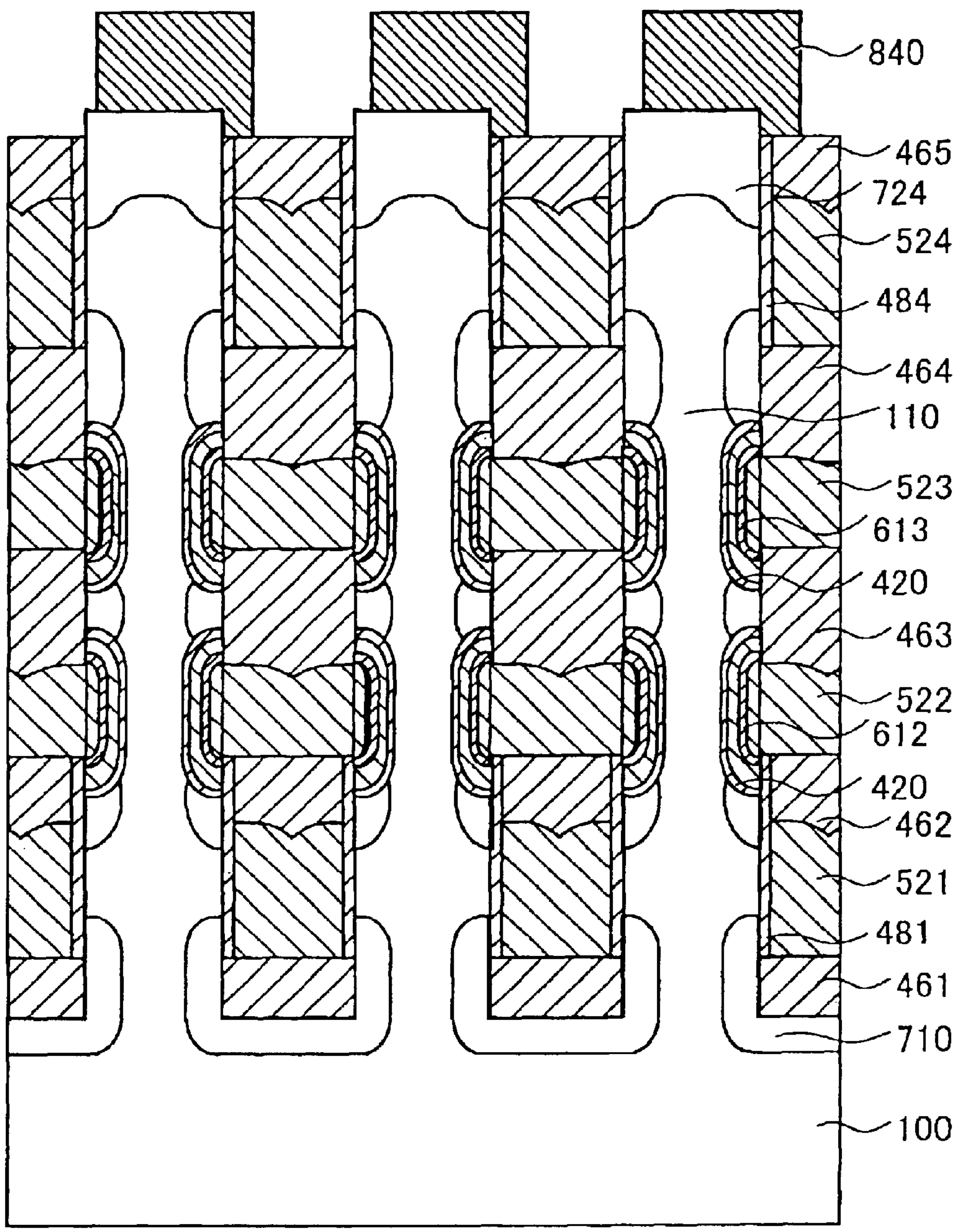
Figure 275:
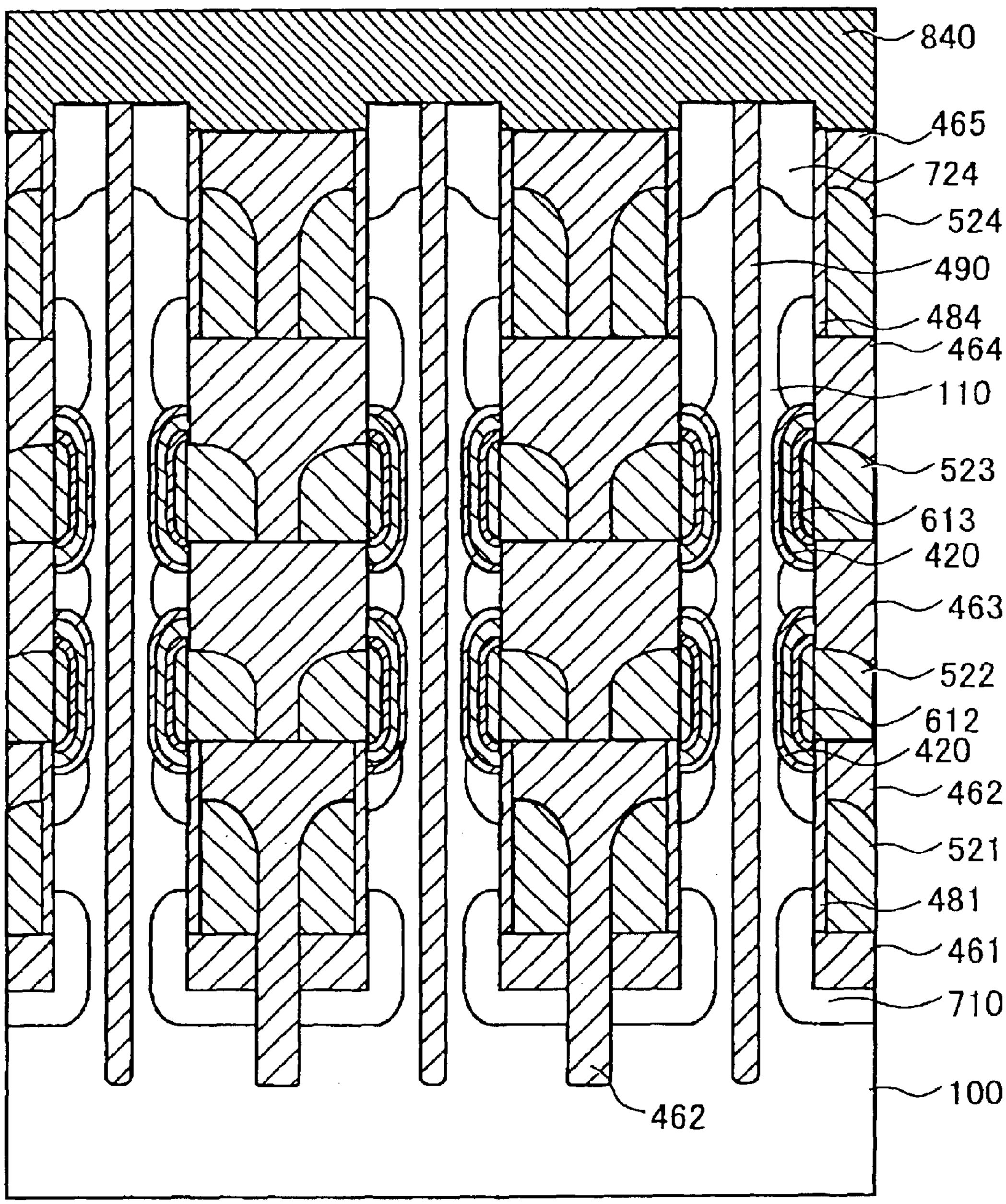

Such a semiconductor memory is produced by the following production process. FIG. 274 and FIG. 275 are sectional views taken on line A–A' and line B–B', respectively, in FIG. 1 which is a cross-sectional view illustrating a memory cell array of an EEPROM.

In this production example, the island-like semiconductor layers 110 continuously formed in a direction of A–A', which are explained in Production example 20, are anisotropically etched by using a patterned mask until at least the impurity diffusion layer 710 is separated and a silicon oxide film 490 is buried as a fifteenth insulating film (FIG. 274 and FIG. 275).

Thus, a semiconductor memory having similar function and doubled device capacitance as compared with the semiconductor memory of Production example 20 is obtained, though the deterioration of the device performance is expected.

The fifteenth insulating film is not limited to the silicon oxide film, but a silicon nitride film may be used. Any film may be used as long as it is an insulating film.

PRODUCTION EXAMPLE 23

In a semiconductor memory to be produced in this example, a semiconductor substrate is patterned in the form of pillars to form island-like semiconductor layers having at least one recess. Sides of the island-like semiconductor layers make active regions. Laminated insulating film as charge storage layers and control gates are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The laminated insulating films and the control gates of the memory transistors are formed at the same time.

Figure 276:
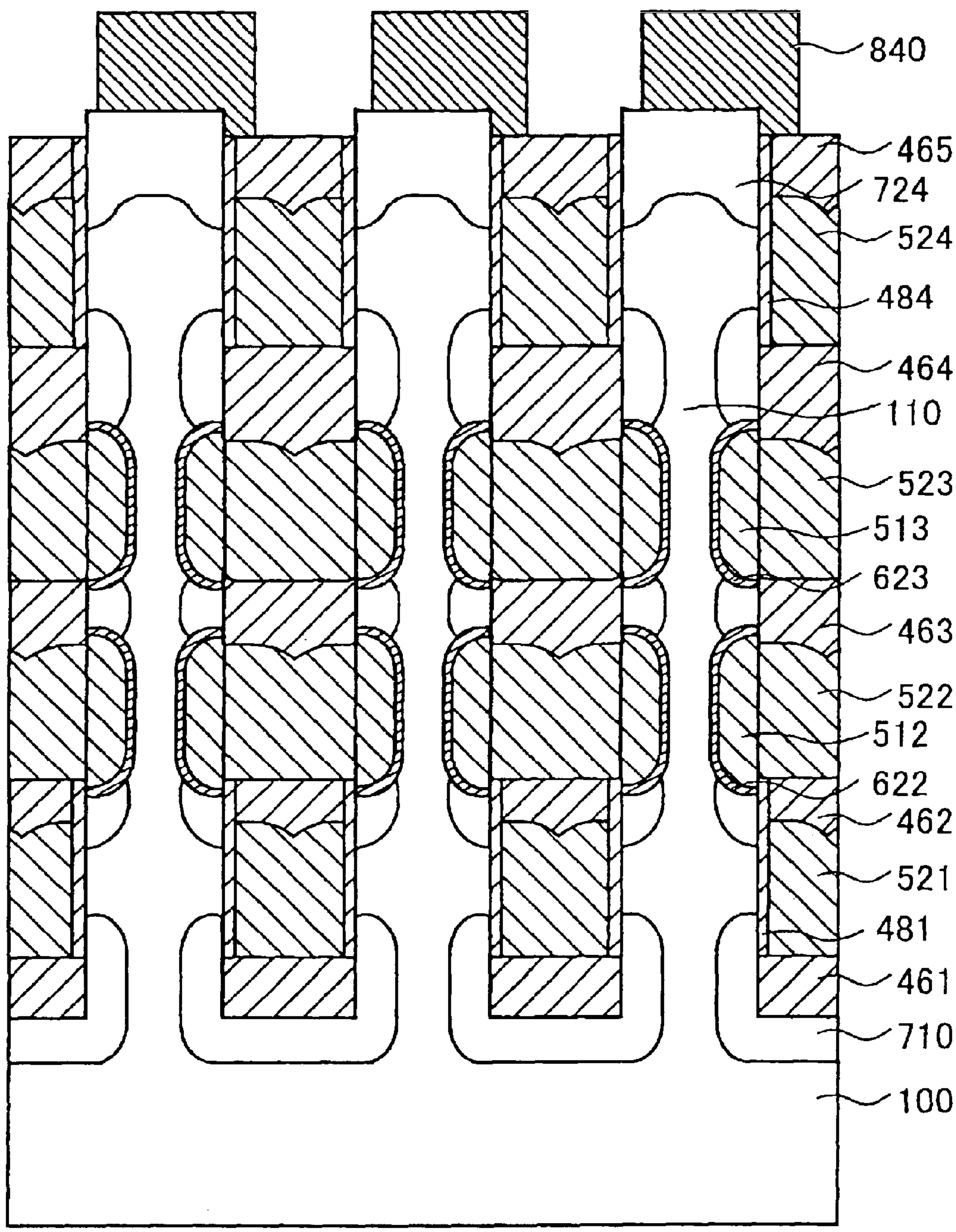
Figure 277:
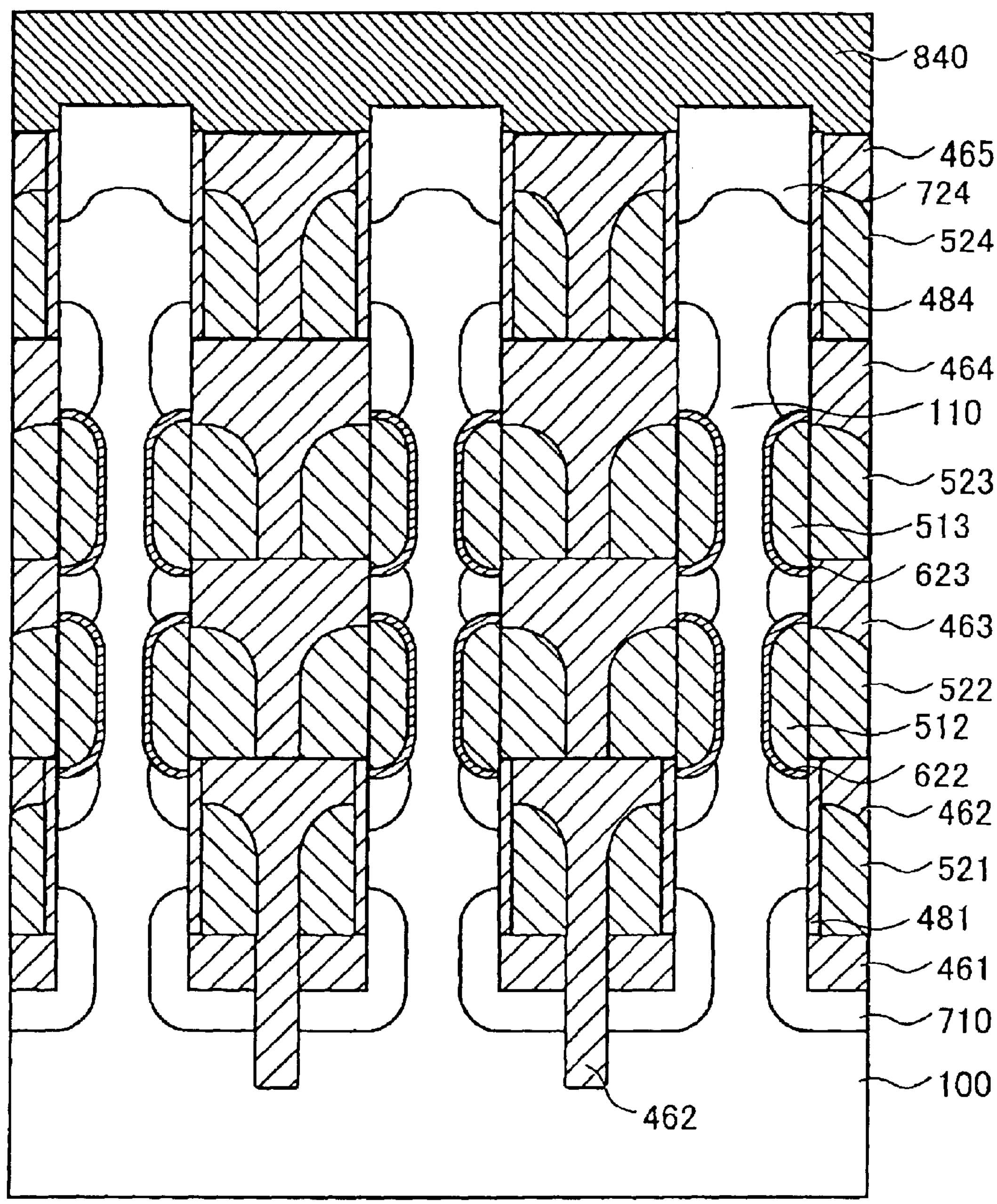

Such a semiconductor memory is produced by the following production process. FIG. 276 and FIG. 277 are sectional views taken on line A–A' and line B–B', respectively, in FIG. 9 which is a cross-sectional view illustrating a memory cell array of an MNOS or MONOS.

In this production example, instead of forming the silicon oxide film 420 as explained in Production example 20, layered insulating films 622 and 623 are formed and the interlayer insulating films 612 and 613 are not formed as shown in FIG. 276 and FIG. 277.

The layered insulating film described herein may have a layered structure of a tunnel oxide film and a silicon nitride film, or a layered structure of a tunnel oxide film, a silicon nitride film and a silicon oxide film. Unlike the memory of Production example 20, the charge storage layer is not realized by electron injection into the floating gate but by electron trapping into the layered insulating film.

Thereby, the same effect as obtained by Production Example 20 is obtained.

PRODUCTION EXAMPLE 24

In a semiconductor memory to be produced in this example, a semiconductor substrate to which an oxide film is inserted, for example, a semiconductor portion on an oxide film of an SOI substrate, is patterned into pillar-form island-like semiconductor layers having at least one recess. Sides of the island-like semiconductor layers make active regions. Tunnel oxide films, floating gates and control gates are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Such a semiconductor memory is produced by the following production process. FIGS. 278 to 279 and FIGS. 280 to 281 are sectional views taken on line A–A' and line B–B', respectively, in FIG. 1 which is a cross-sectional view illustrating a memory cell array of an EEPROM.

According to this example, the same effect as obtained by Production Example 20 can be obtained, and furthermore, the junction capacitance of the impurity diffusion layer 710 which functions as the first wiring layer is suppressed or removed.

The use of the SOI substrate can be applied to every embodiment of the present invention.

Figure 278:
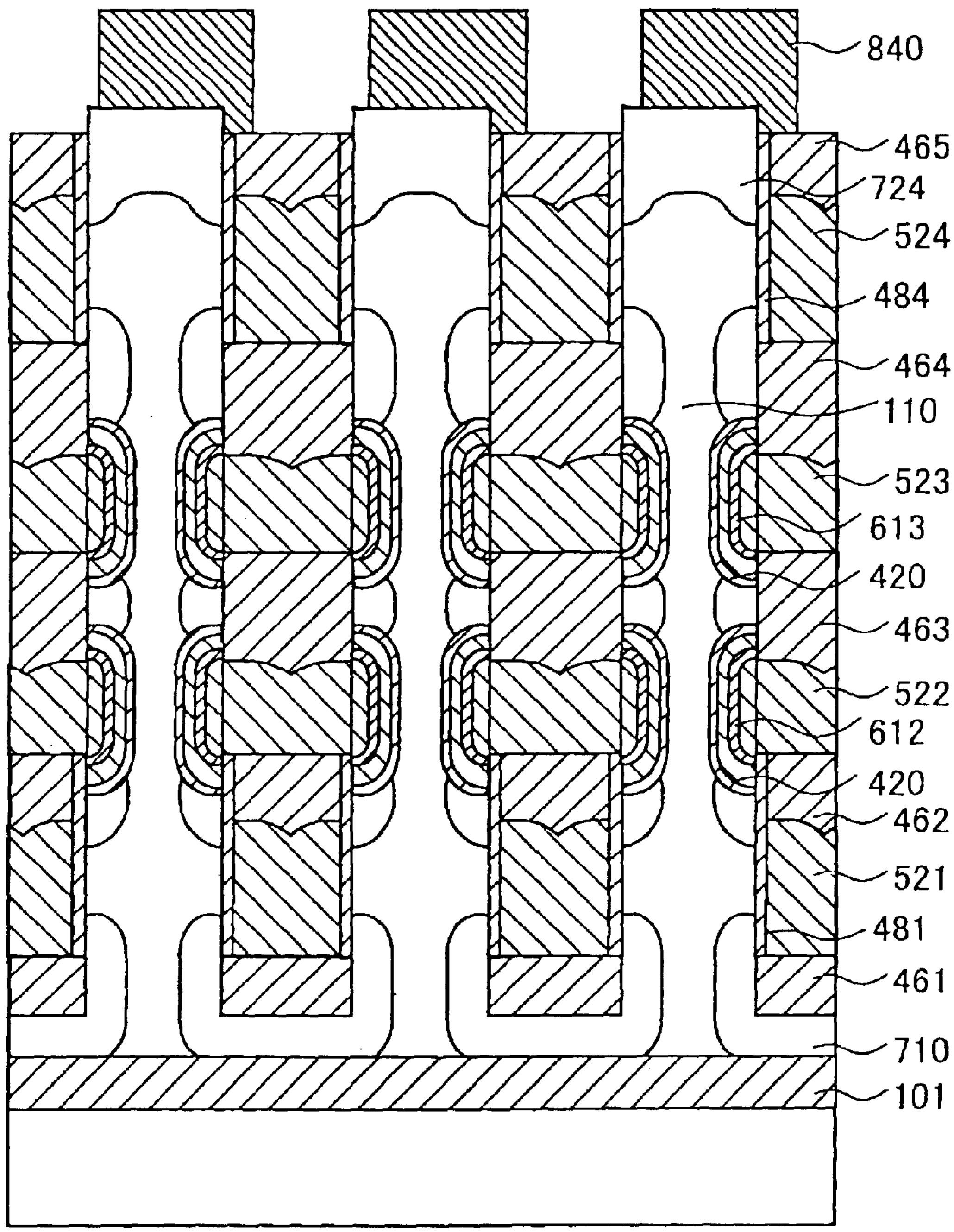
Figure 279:
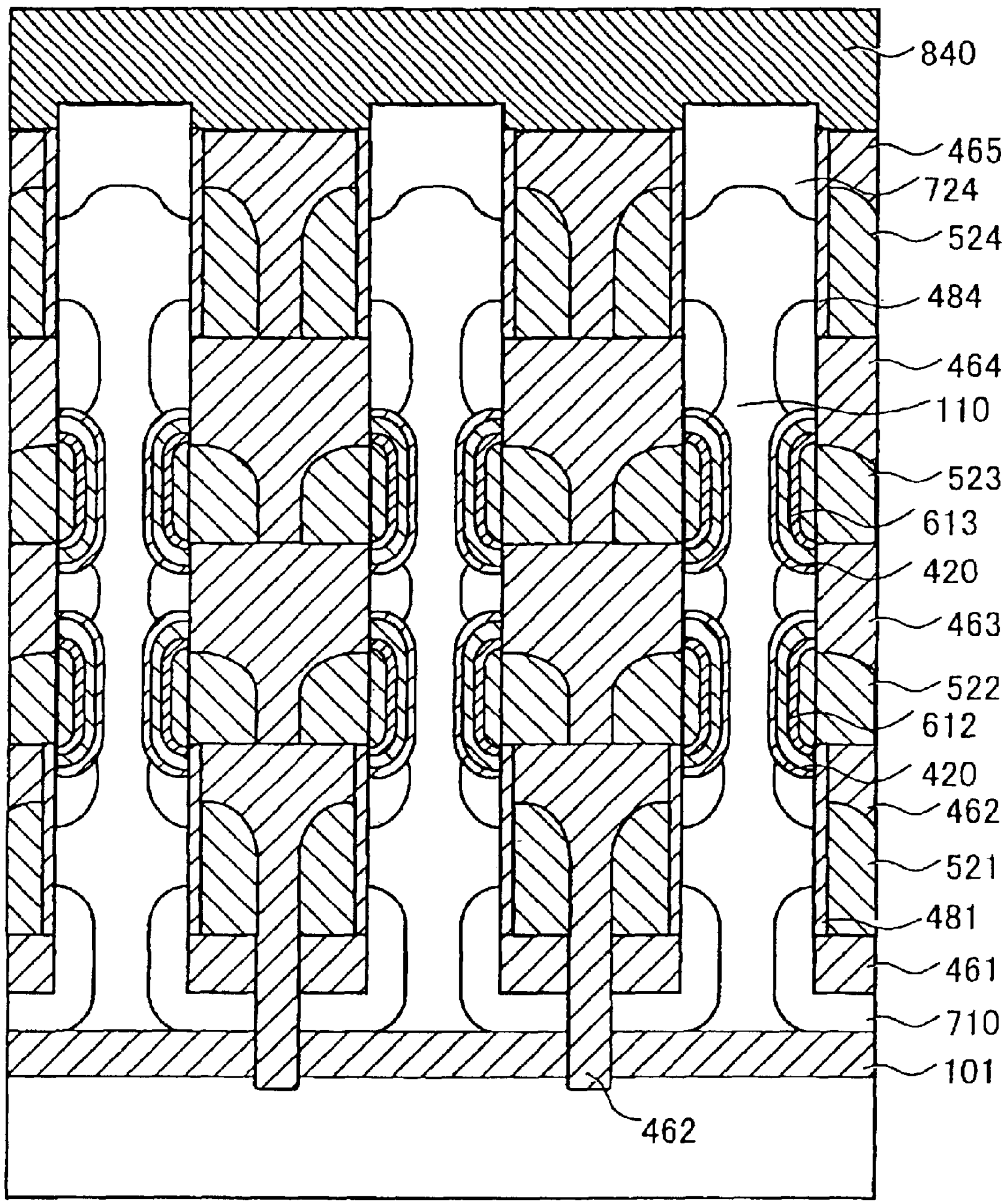
Figure 280:
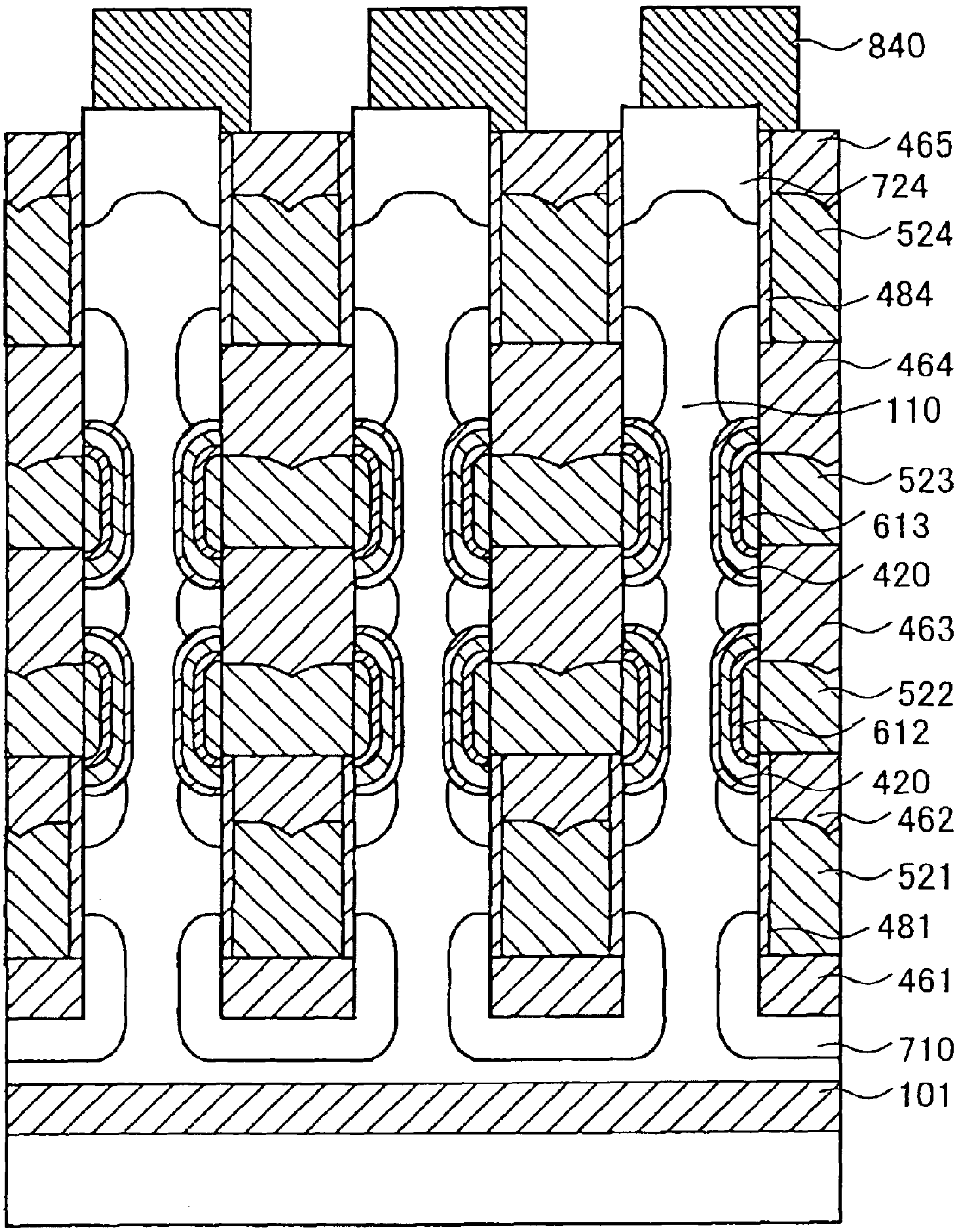
Figure 281:
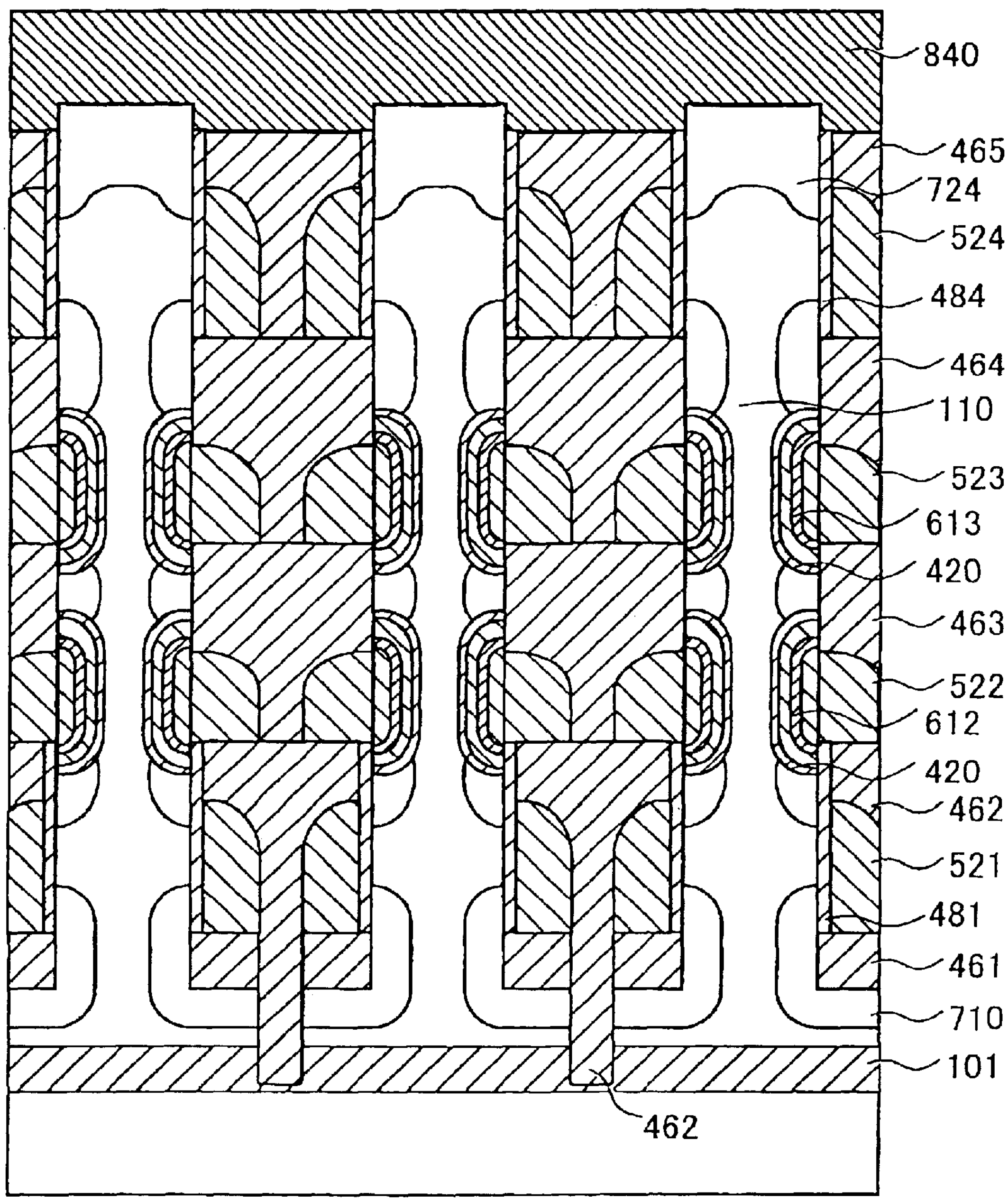

If the SOI substrate is used, the impurity diffusion layer (the first wiring layer) 710 may reach the oxide film of the SOI substrate as shown in FIGS. 278 and 279 and may not reach the oxide film as shown in FIGS. 280 and 281. The trench for separating the first wiring layer may reach the oxide film of the SOI substrate, may not reach the oxide film or may form deeply so as to penetrate the oxide film. The depth of the trench is not limited as long as the impurity diffusion layer is separated.

This example uses the SOI substrate with the oxide film inserted therein as the insulating film, but the insulating film may be a nitride film. The kind of the insulating film is not limited.

PRODUCTION EXAMPLE 25

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. A plurality of memory transistors, for example, two memory transistors, are placed and are connected in series along the island-like semiconductor layer. The tunnel oxide films and the floating gates of the memory transistors are formed at the same time.

Figure 282:
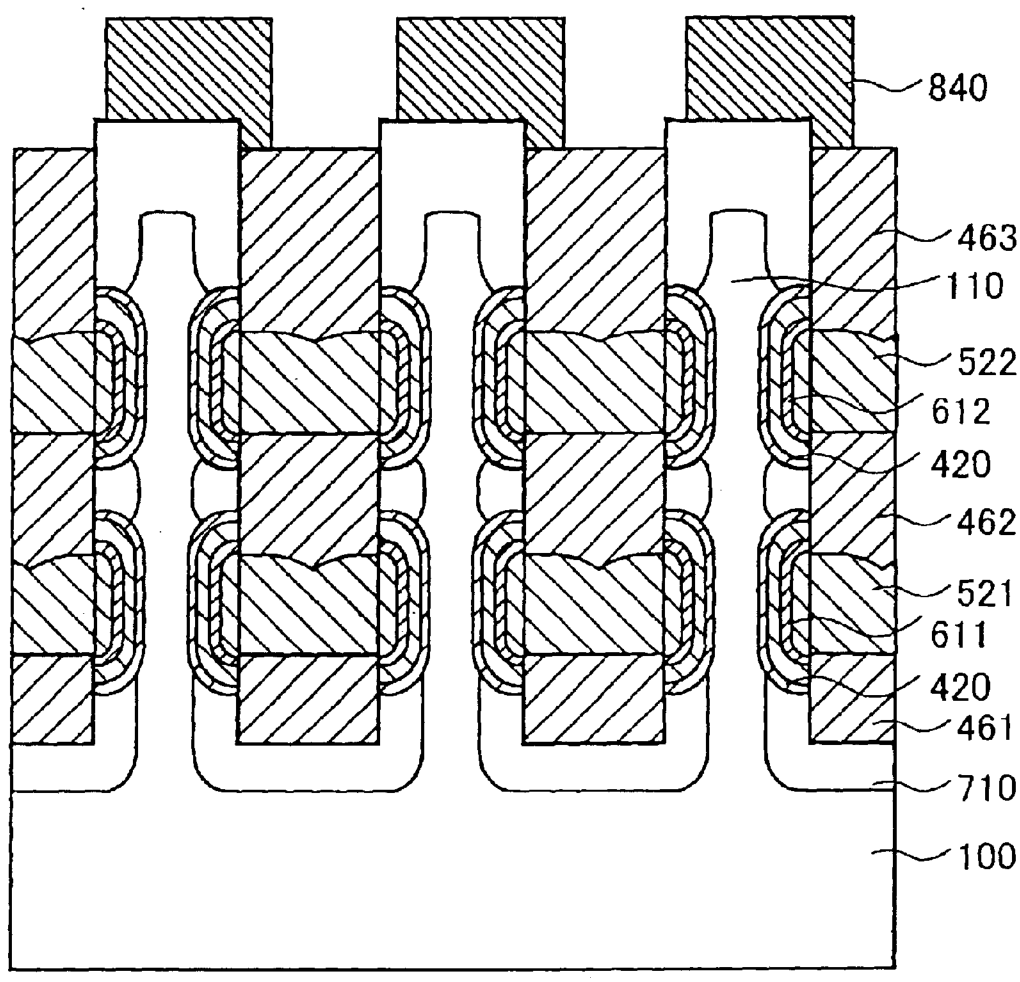
Figure 283:
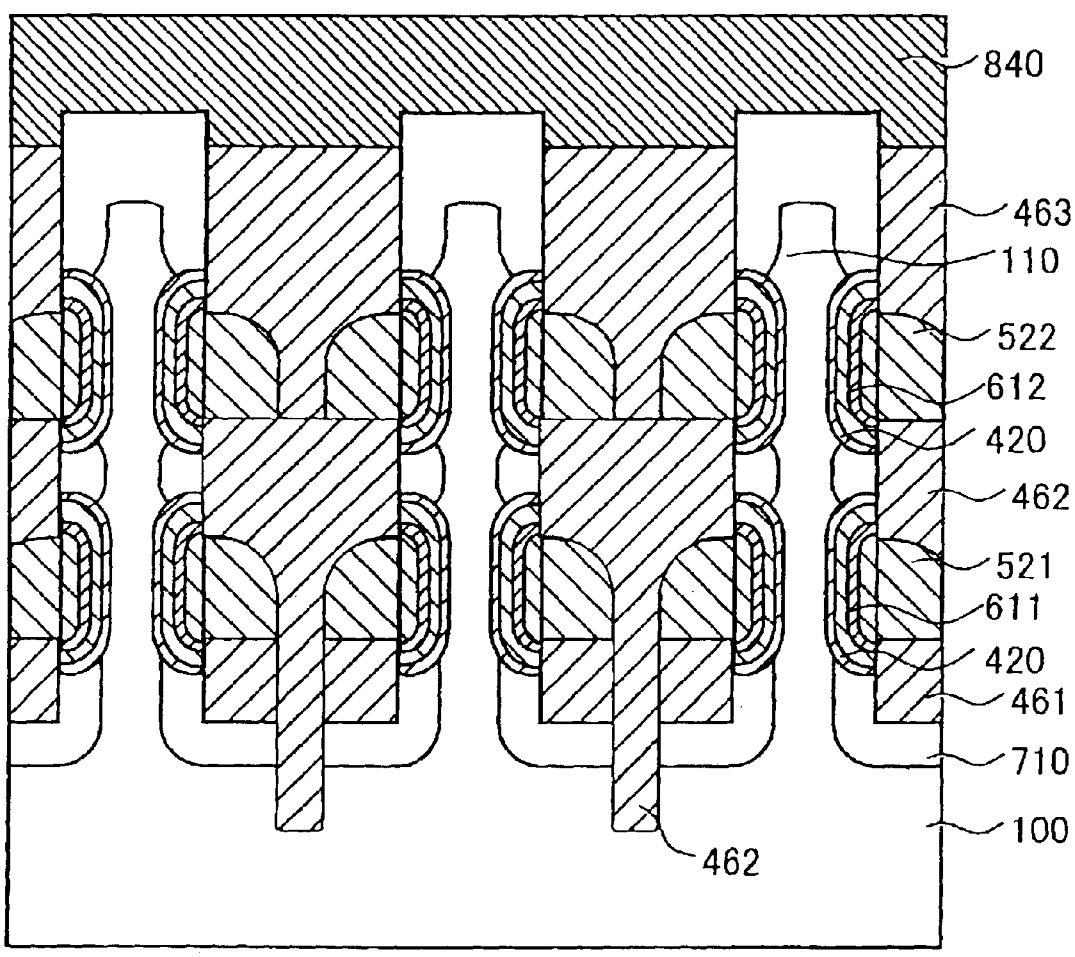

Such a semiconductor memory is produced by the following production process. FIG. 282 and FIG. 283 are sectional views taken on line A–A' and line B–B', respectively, in FIG. 1 which is a cross-sectional view illustrating a memory cell array of an EEPROM.

In this production example, a semiconductor memory is realized in the same manner as in Production example 20 until the polysilicon film 510 is buried in the recesses formed on the sidewall of the island-like semiconductor layer 110 with the intervention of the silicon oxide film 420, thereby separating the polysilicon film 510 into polysilicon films 512 and 513 (FIG. 231 and FIG. 257). Thereafter, unlike the process of Production example 20, impurity introduction is introduced into the island-like semiconductor layer 110 and the semiconductor substrate 100 to form an N-type semiconductor layer and the step of forming the selection gate transistor is omitted (FIG. 282 and FIG. 283).

In this production example, the floating gate is used as the charge storage layer. However, other charge storage layer may be used.

PRODUCTION EXAMPLE 26

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Figure 284:
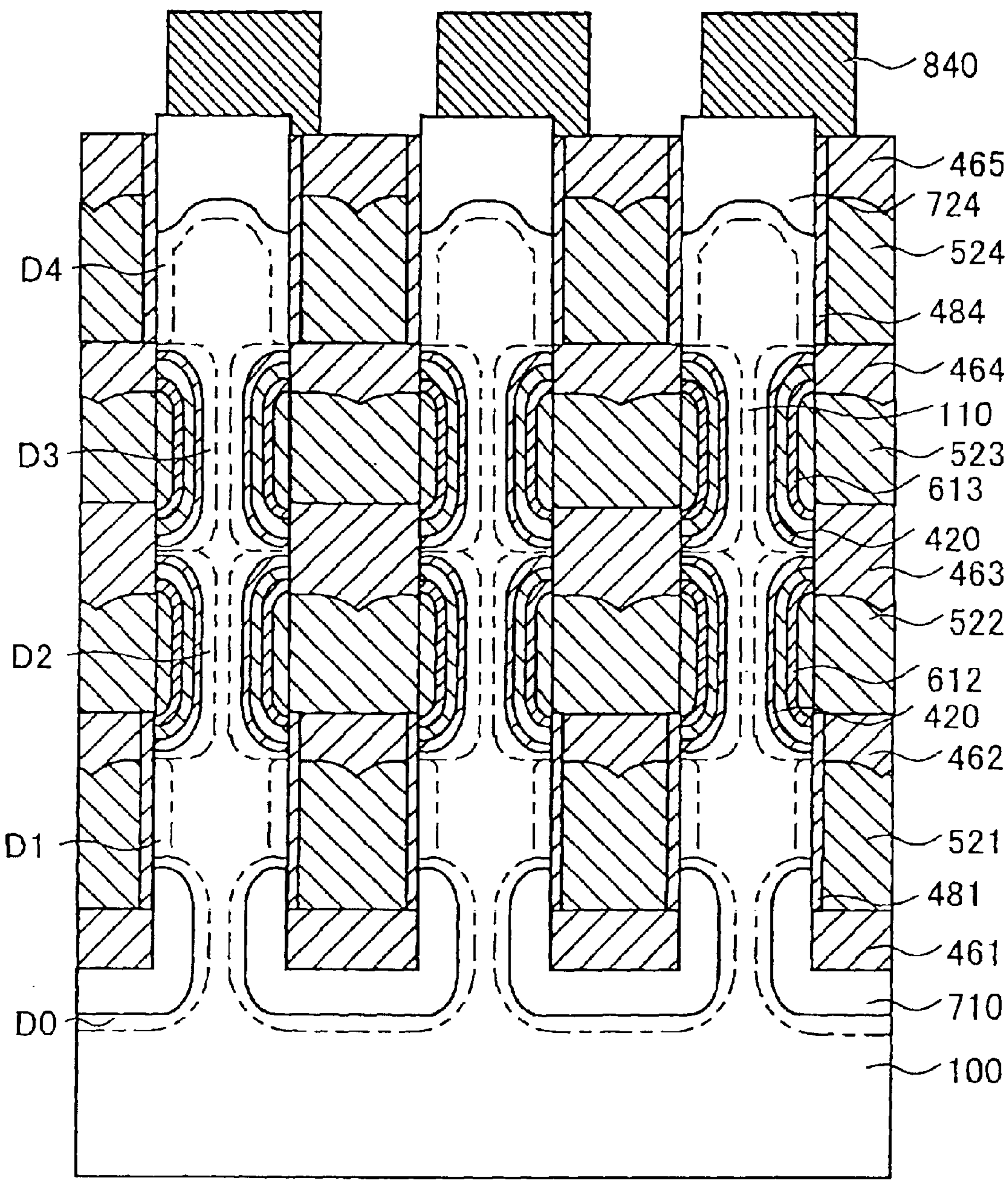
Figure 285:
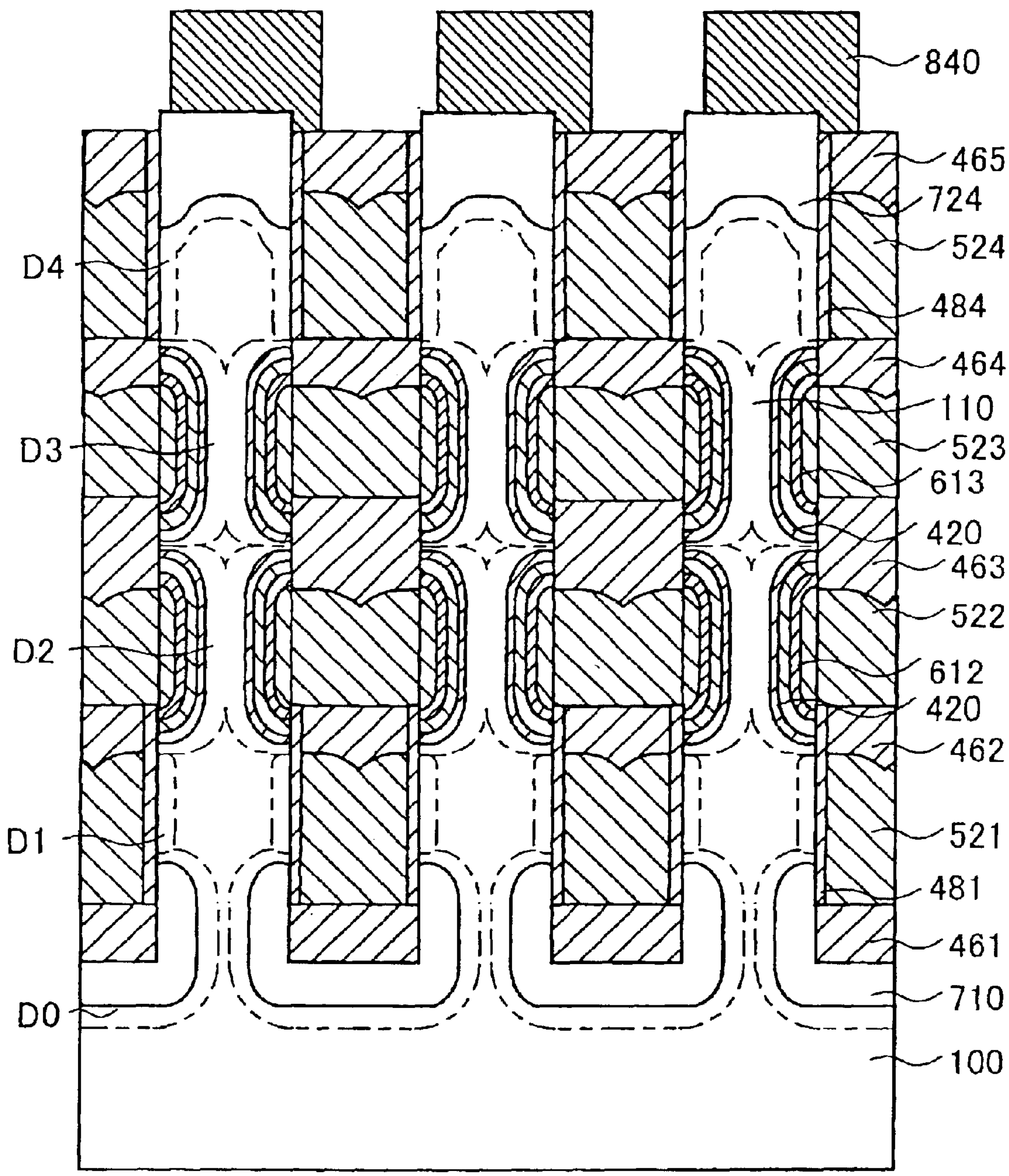

Such a semiconductor memory is produced by the following production process. FIGS. 284 and 285 are sectional views taken on line A–A' and line B–B', respectively, in FIG. 1 which is a cross-sectional view illustrating a memory cell array of an EEPROM.

In this production example, a semiconductor memory as explained in Production example 20 is formed, in which intervals between the memory transistors and the selection gate transistors are set about 20 to 40 nm and diffusion layers 721 to 723 are not introduced (FIG. 284 and FIG. 285).

According to this example, the same effect as obtained by Production example 20 is obtained.

At data reading, as shown in FIG. 284, depletion layers and inversion layers shown in D1 to D4 are electrically connected with gate electrodes 521, 522, 523 ad 524, thereby an electric current path is established between the impurity diffusion layers 710 and 725. In this situation, voltages to be applied to the gates 521, 522, 523 and 524 are so set that whether the inversion layers are formed in D2 and D3 or not is selected depending on the condition of the charge storage layers 512 and 513, thereby the data can be read from the memory cell.

Figure 286:
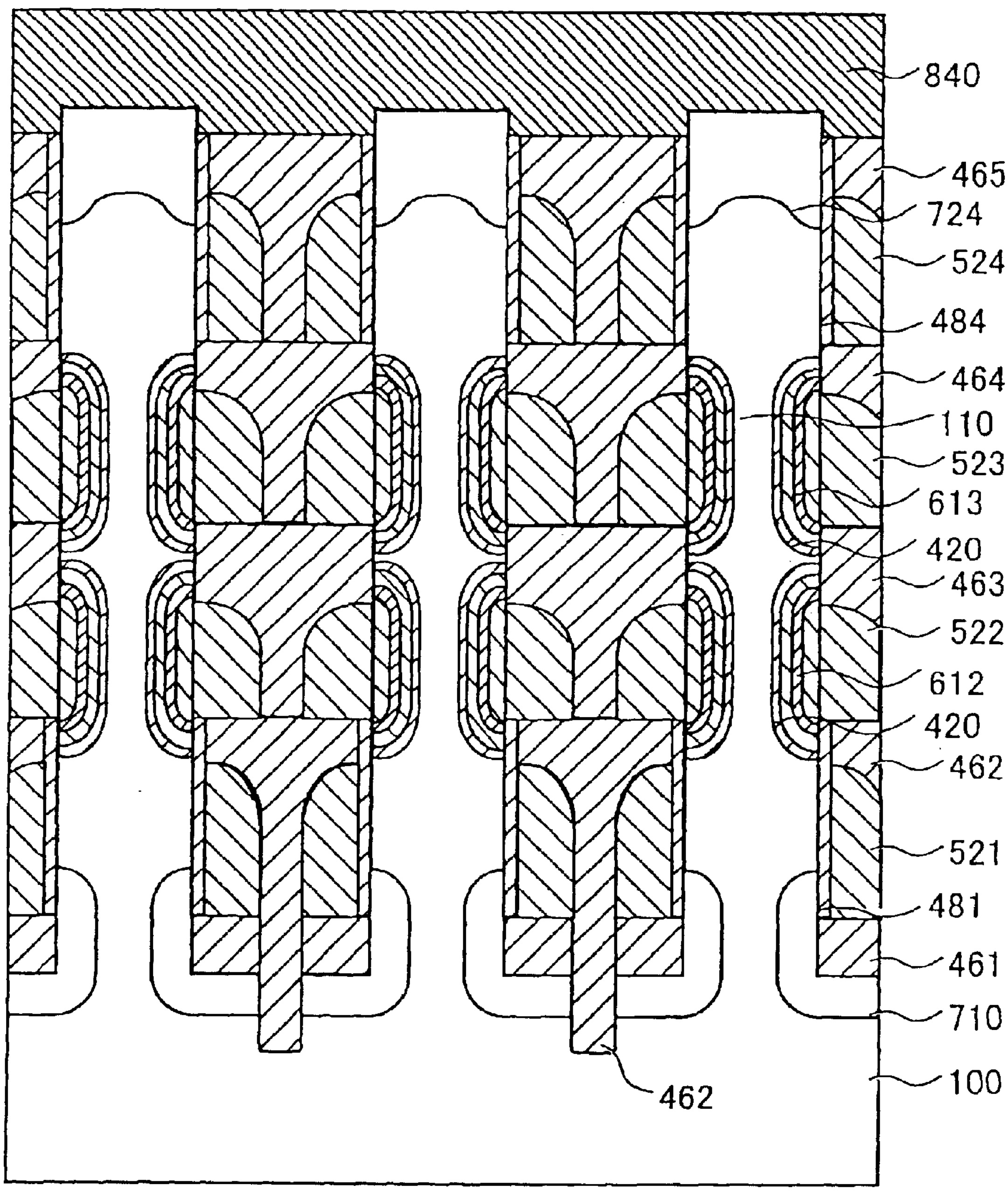

It is desired that the distribution of D2 and D3 is completely depleted as shown in FIG. 286. In this case, it is expected that the back-bias effect is suppressed in the memory cells, which is effective in reducing variations in device performance.

Further, by adjusting the amount of impurities to be implanted or controlling the thermal treatment, the expansion of the impurity diffusion layers 710 to 724 is suppressed and a height of the island-like semiconductor layers 110 is reduced, which contributes to the cost reduction and the suppression of variations during the production process.

PRODUCTION EXAMPLE 27

Figure 287:
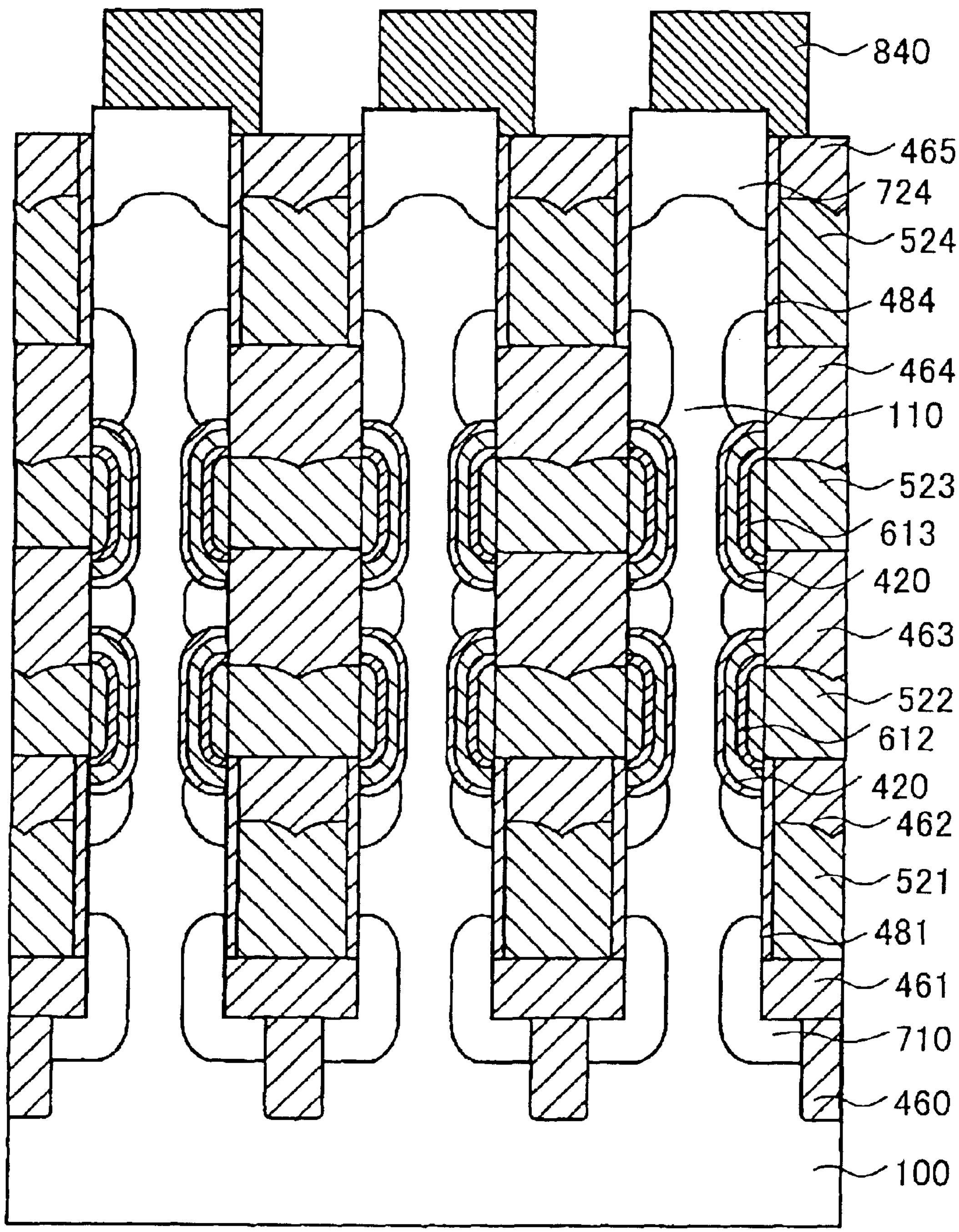
Figure 288:
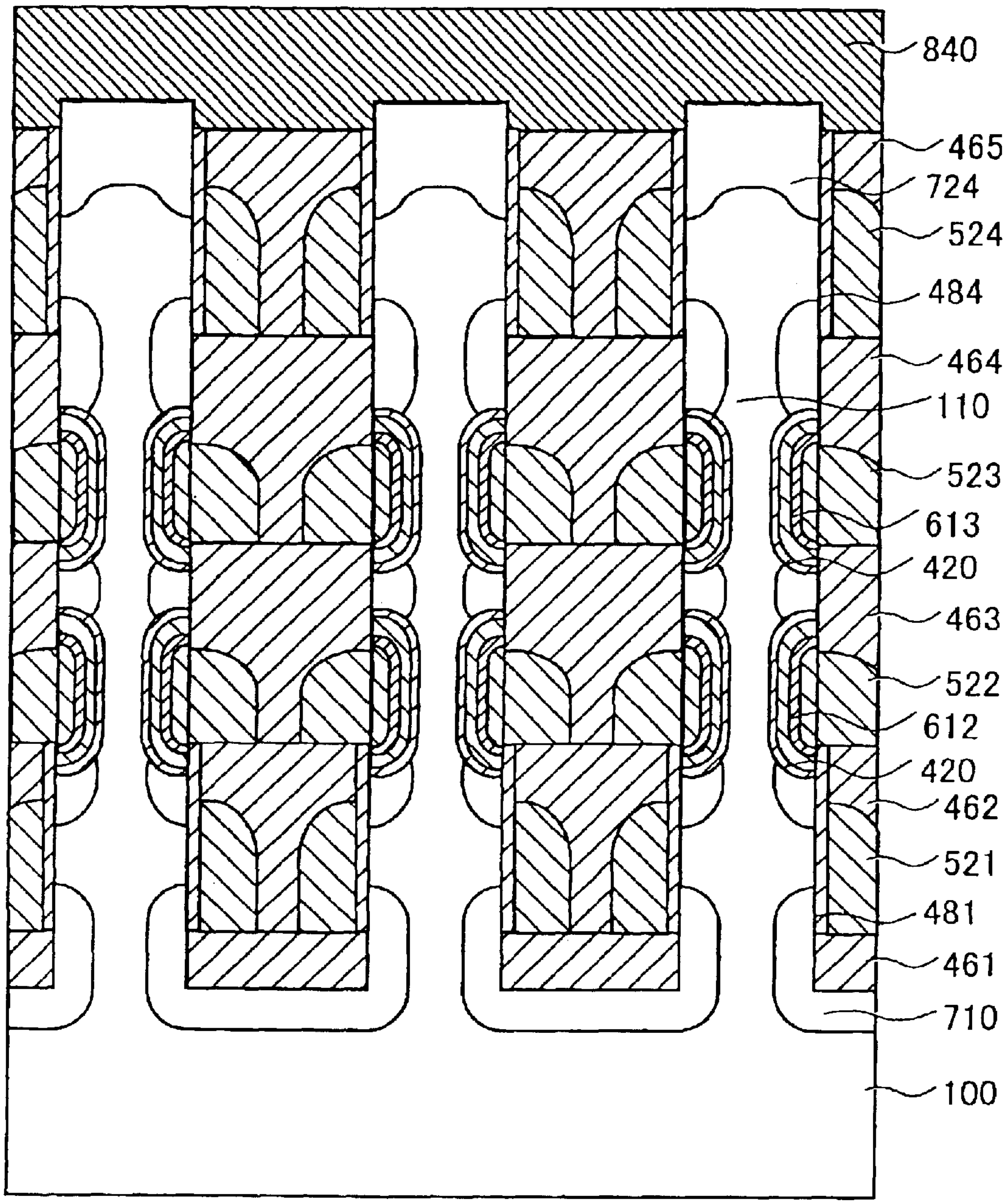

Explanation is given of an example of production process for producing a semiconductor memory in which the direction of the first wiring layer is parallel to the direction of the fourth wiring layer. FIGS. 287 and 288 are sectional views taken on line A–A' and line B–B', respectively, in FIG. 1 which is a cross-sectional view illustrating a memory cell array of an EEPROM.

In this production example, the first wiring layers continuously formed in the direction of A–A', which are explained in Production example 20, are anisotropically etched by using a patterned resist and separated by burying a silicon oxide film 460 as an eighth insulating film. Further, the step of separating the impurity diffusion layer 710 in the self-alignment manner, which is performed after the formation of the polysilicon film 521 in the form of a sidewall spacer, is omitted so that the first wiring layers continuously formed in the direction of B–B' are not separated.

Thereby, a semiconductor memory is realized in which the first wiring layer is parallel to the fourth wiring layer and which has a memory function according to the state of a charge in the charge storage layer which is the floating gate made of the polysilicon film as the first conductive film (FIG. 287 FIG. 288).

PRODUCTION EXAMPLE 28

Figure 289:
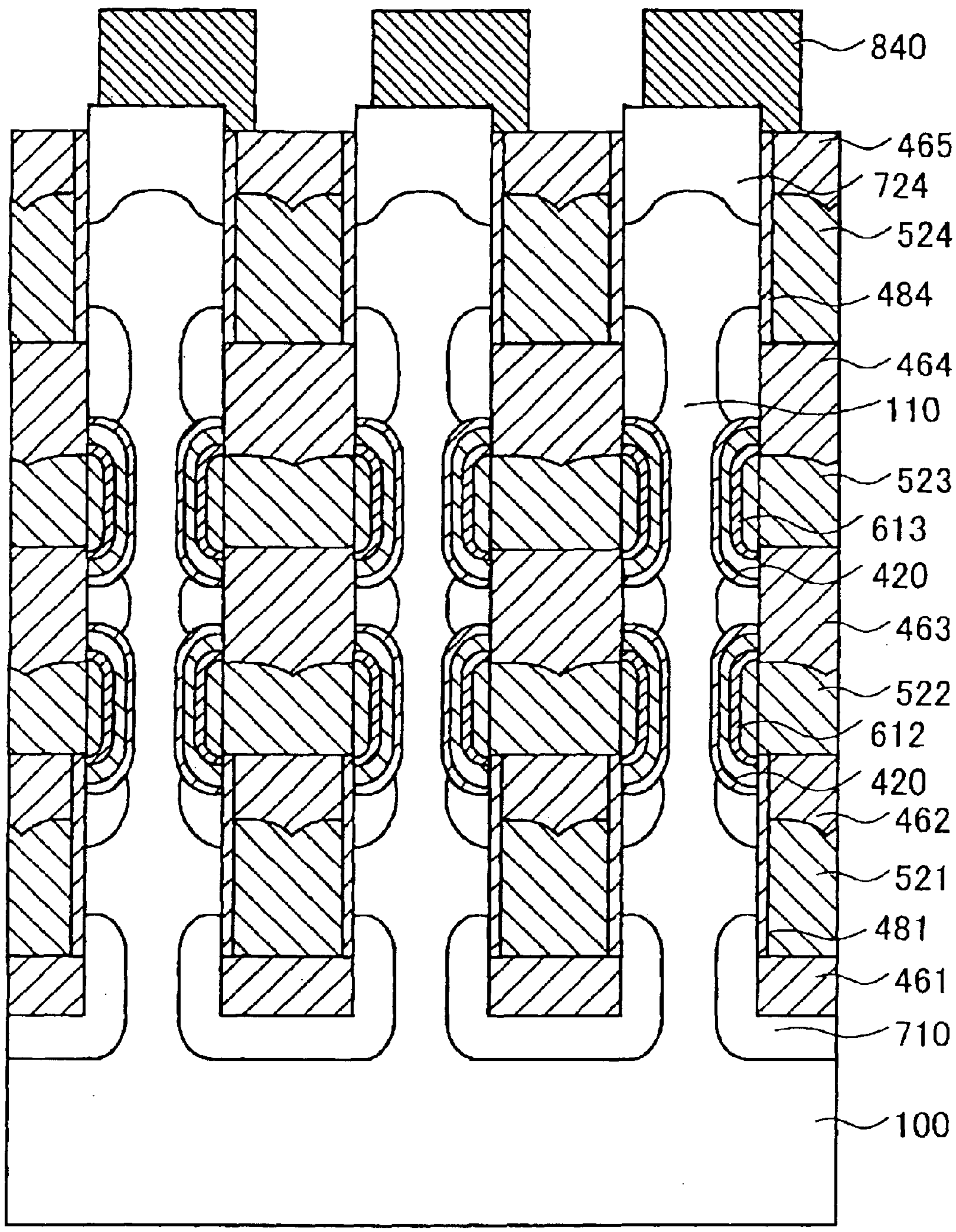
Figure 290:
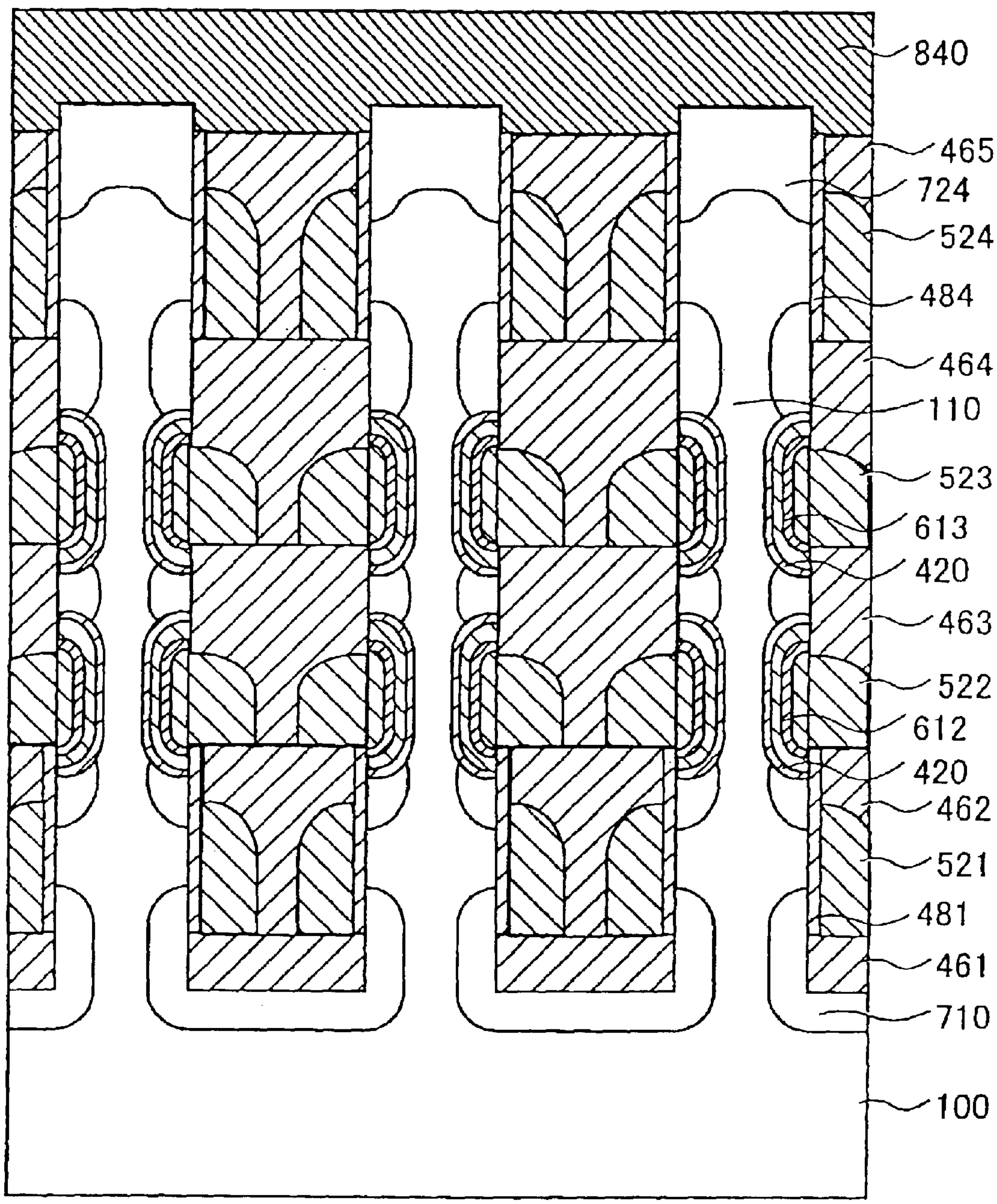

Explanation is given of an example of production process for obtaining a structure in which the first wiring layer is electrically common to the memory cell array. FIG. 289 and FIG. 290 are sectional views taken on line A–A' and line B–B', respectively, in FIG. 1 which is a cross-sectional view illustrating a memory cell array of an EEPROM.

In this production example, the second trench 220 as explained in Production example 20 is not formed in the semiconductor substrate 100. By omitting the steps regarding the formation of the second trench 220 from Production example 20, a semiconductor memory is realized in which at least the first wiring layer in the array is not divided but is common and which has a memory function according to the state of a charge in the charge storage layer which is the floating gate made of the polysilicon film as the first conductive film (FIG. 289 and FIG. 290).

PRODUCTION EXAMPLE 29

This example shows an example of production process for producing a semiconductor memory in which the memory transistors and the selection gate transistors have different gate lengths in a vertical direction. FIGS. 291 and 292 and FIGS. 293 and 294 are sectional views taken on line A–A' and line B–B', respectively, in FIG. 1 which is a cross-sectional view illustrating a memory cell array of an EEPROM.

Figure 291:
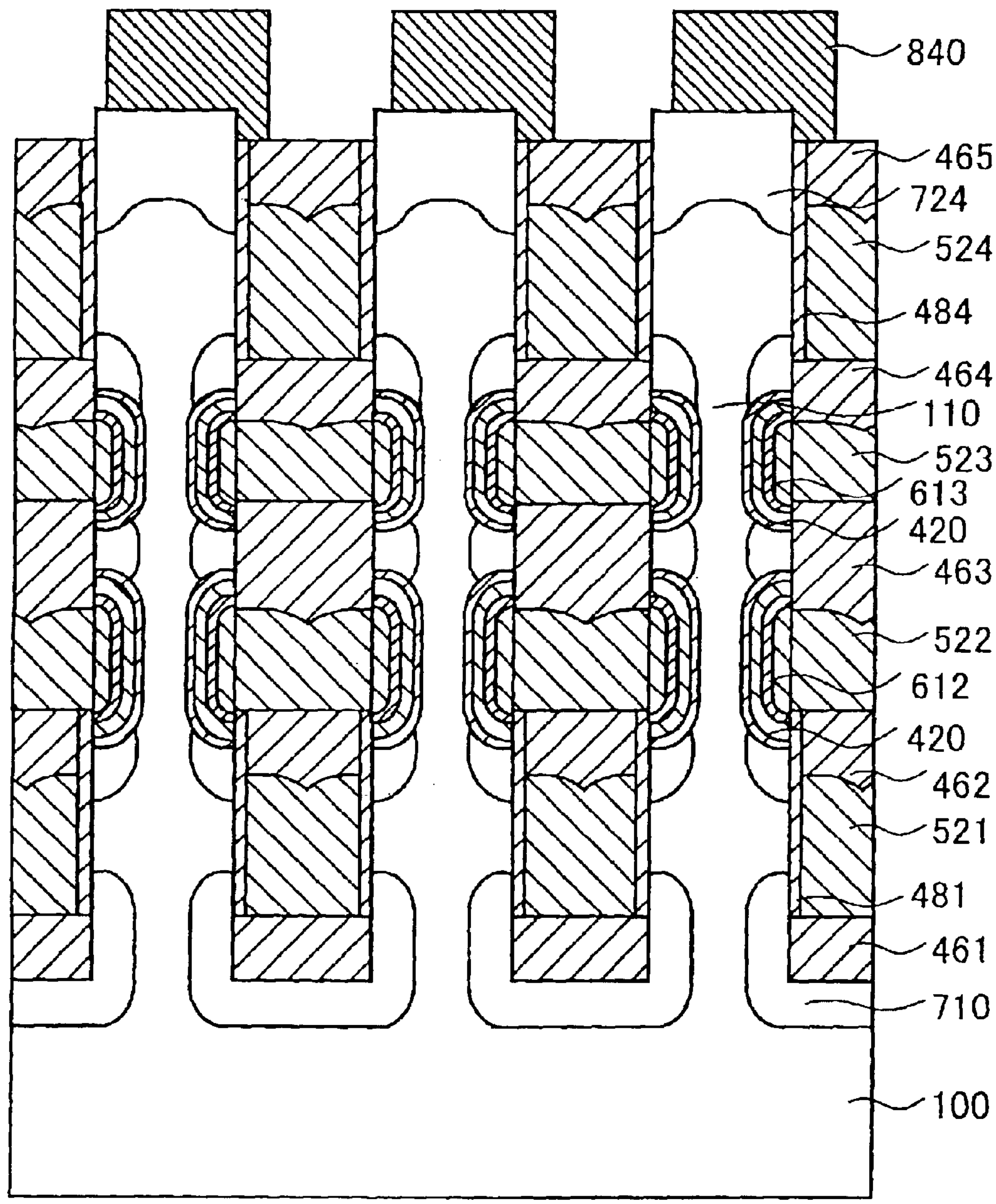
Figure 292:
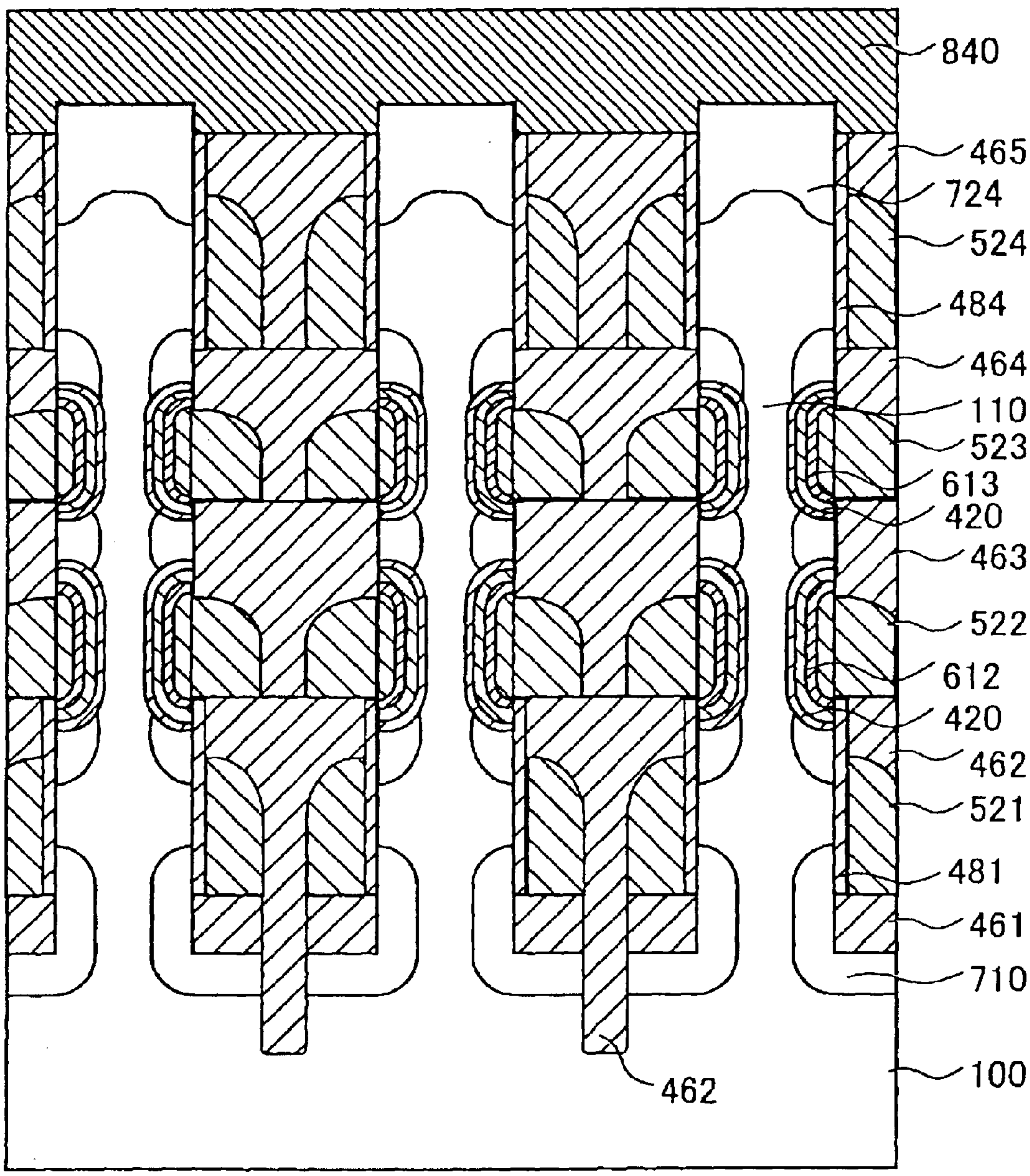
Figure 293:
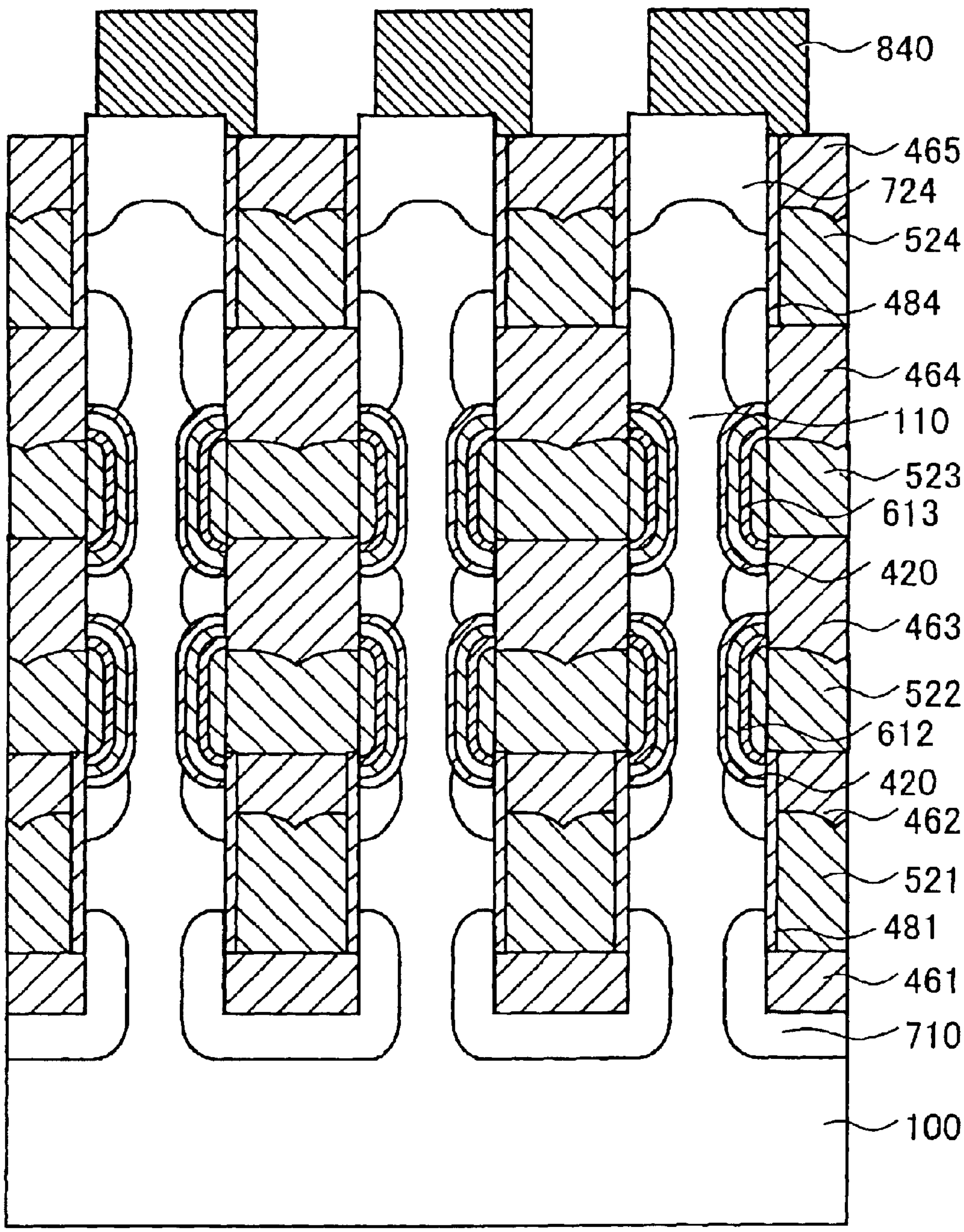
Figure 294:
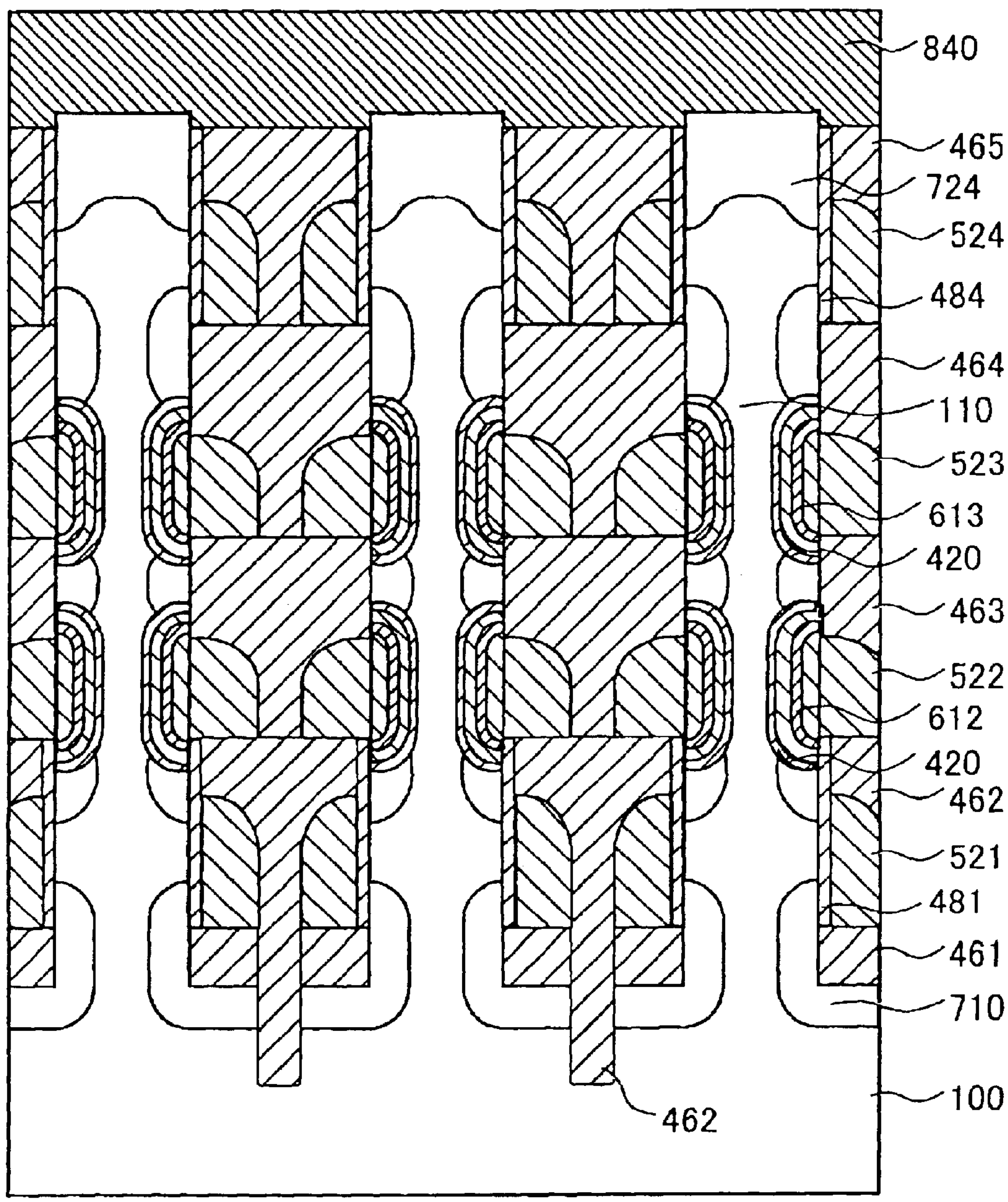

As regards the lengths of the polysilicon films 511 to 514 (the first conductive films) to be the memory cell gates or the selection gates in the direction vertical to the semiconductor substrate 100, the polysilicon films 512 and 513 to be the memory cell gates may have different lengths as shown in FIG. 291 and FIG. 292. Further, as shown in FIG. 293 and FIG. 294, the polysilicon films 521 and 524 to be the selection gates may have different lengths. The polysilicon films 521 to 524 need not have the same vertical lengths. It is rather desirable to change the gate lengths of the transistors in consideration that a threshold is reduced due to the back-bias effect from the substrate at data reading from the memory cells connected in series in the island-like semiconductor layers 110. At this time, since the height of the first and second conductive films, i.e., the gate lengths, can be controlled stage by stage, the memory cells are controlled easily.

PRODUCTION EXAMPLE 30

Explanation is given of an example of production process for producing a semiconductor memory in which the island-like semiconductor layer 110 is in an electrically floating state due to the impurity diffusion layer 710. FIGS. 295 and 296 and FIGS. 297 and 298 are sectional views taken on line A–A' and line B–B', respectively, in FIG. 1 which is a cross-sectional view illustrating a memory cell array of an EEPROM.

Figure 295:
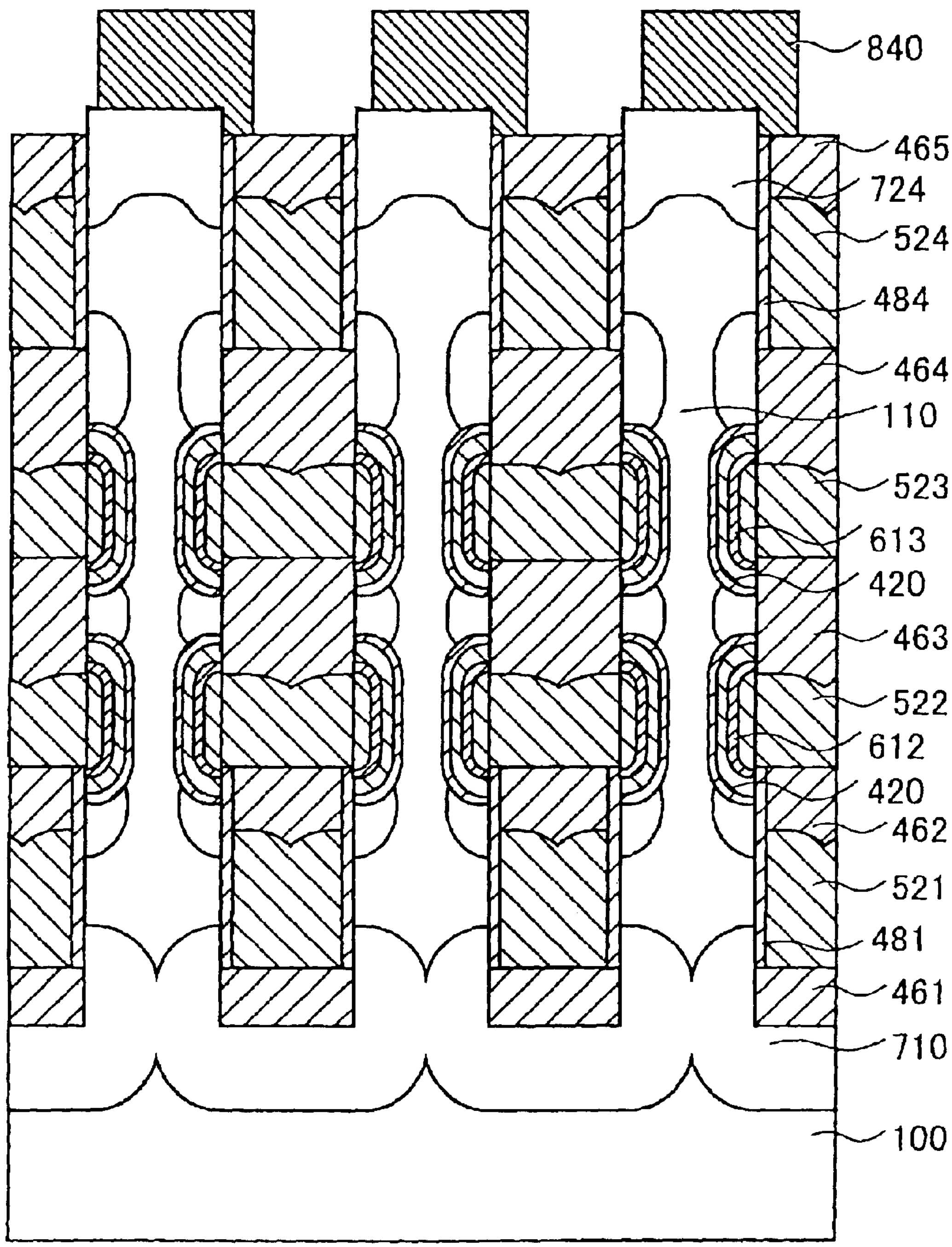
Figure 296:
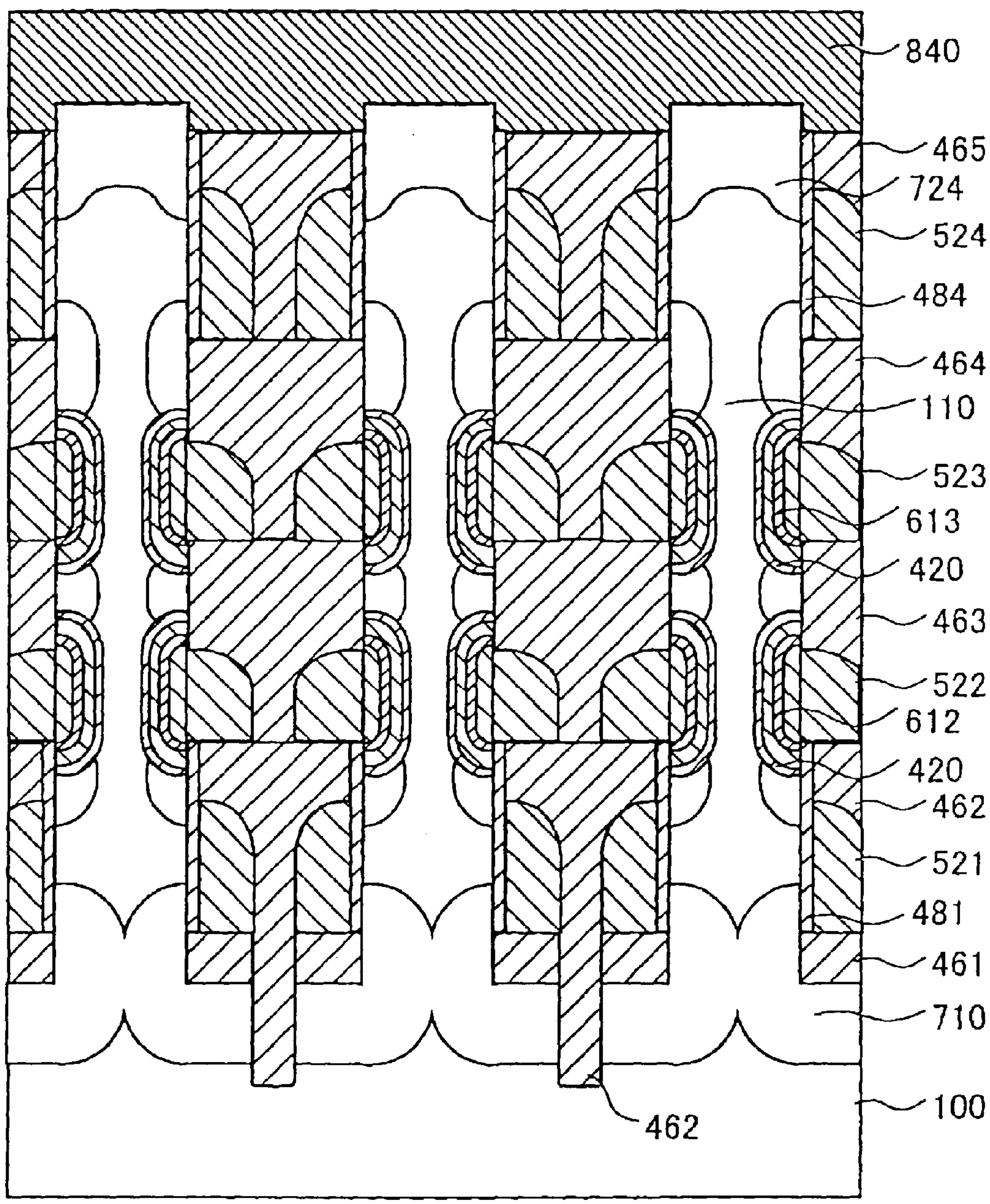
Figure 297:
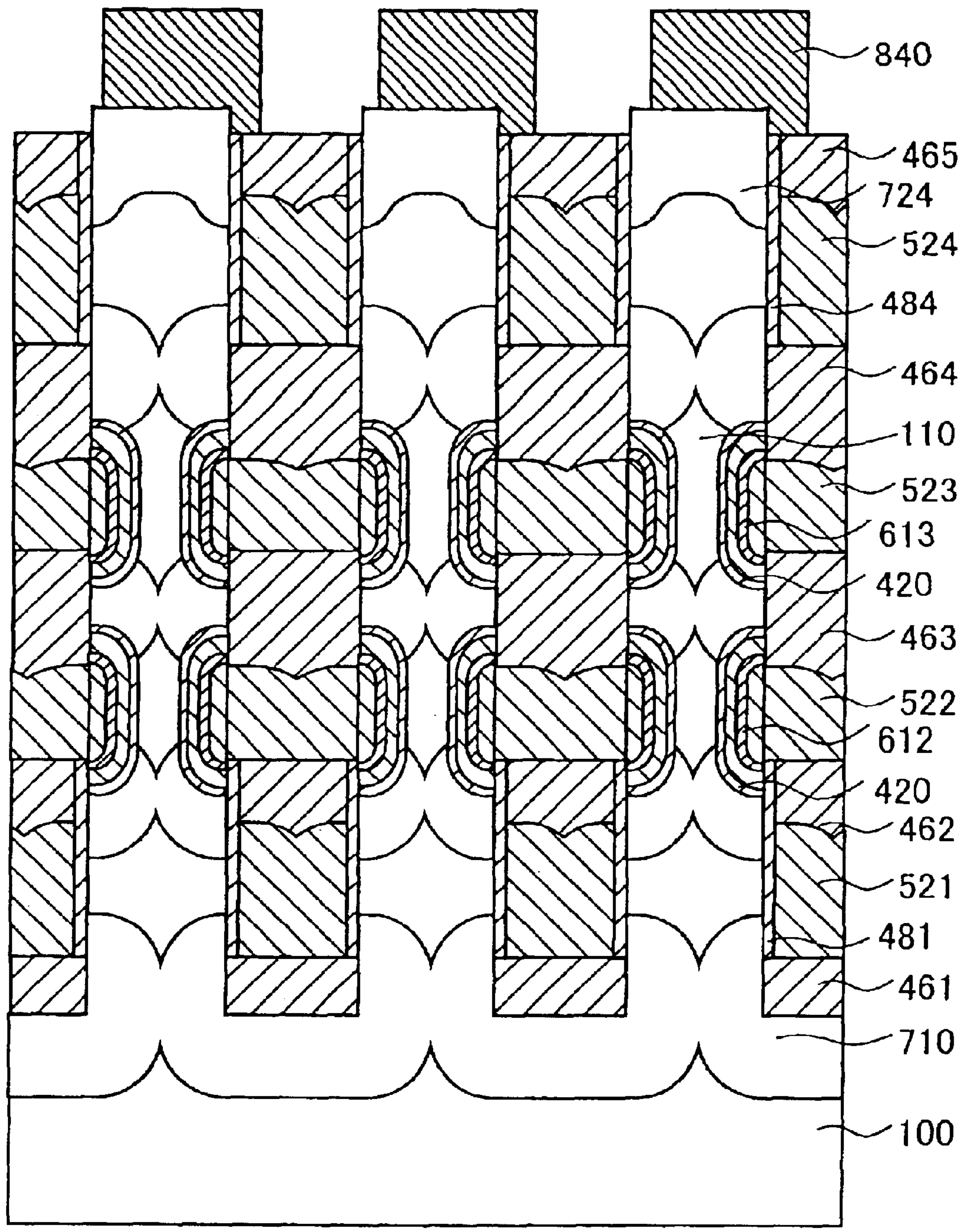
Figure 298:
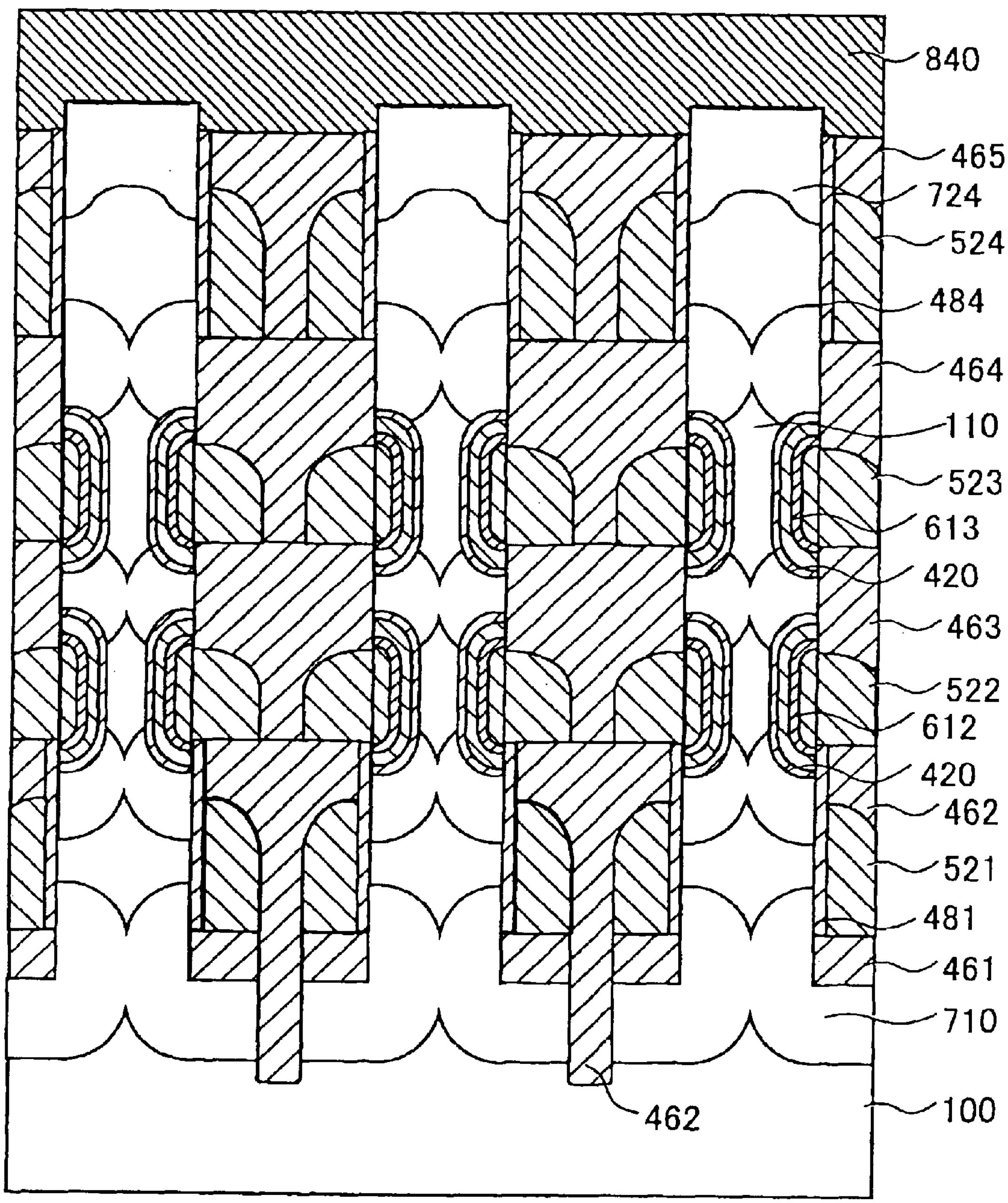

In this production example, a semiconductor memory is realized by changing the arrangement of the impurity diffusion layers 710 and 721 to 723 from that in the semiconductor memory of Production example 20. More specifically, as shown in FIGS. 295 and 296, the impurity diffusion layer 710 may be disposed such that the semiconductor substrate 100 is not electrically connected with the island-like semiconductor layer 110. Further, as shown in FIGS. 297 and 298, the impurity diffusion layers 721 to 723 may be disposed such that active regions of the memory cells and the selection gate transistors arranged in the island-like semiconductor layers 110 are electrically insulated. Alternatively, the impurity diffusion layers 710 and 721 to 723 may be disposed such that the same effect can be obtained by the depletion layer which is expanded due to a potential applied at reading, erasing or writing.

According to this example, the same effect as obtained by Production Example 20 is obtained. Further, since the impurity diffusion layers are disposed such that the active regions of the memory cells are in an electrically floating state with respect to the substrate, the back-bias effect from the substrate is prevented. Thereby, the occurrence of variations is prevented with regard to the characteristics of the memory cells owing to decrease of the threshold of the memory cells at reading data. It is desired that the memory cells and the selection gate transistors are completely depleted.

PRODUCTION EXAMPLE 31

Explanation is given of an example of production process for producing a semiconductor memory in which the bottom of the island-like semiconductor layer 110 does not have a simple columnar shape. FIGS. 299 and 300 and FIGS. 301 and 302 are sectional views taken on line A–A' and line B–B', respectively, in FIG. 1 which is a cross-sectional view illustrating a memory cell array of an EEPROM.

Figure 299:
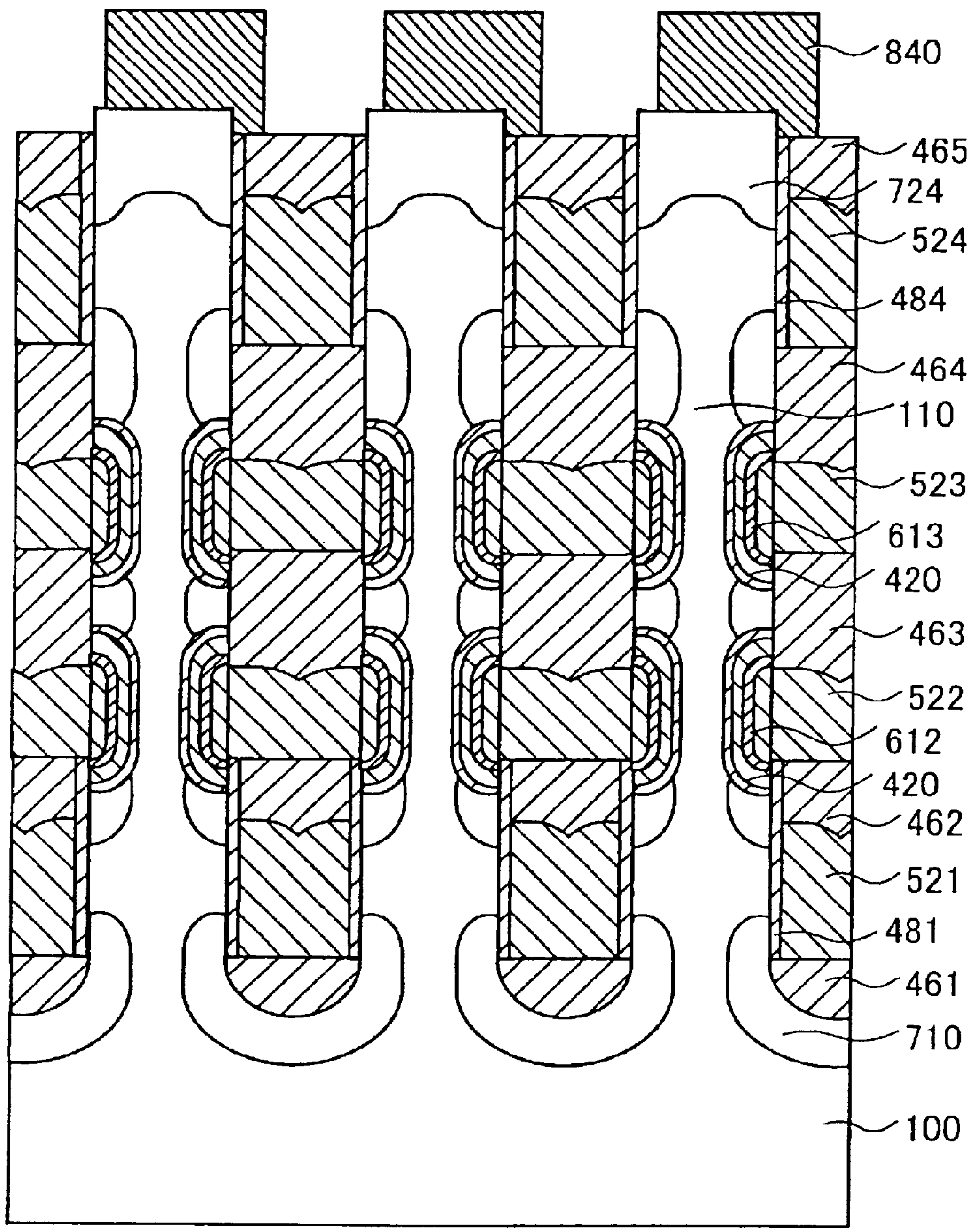
Figure 300:
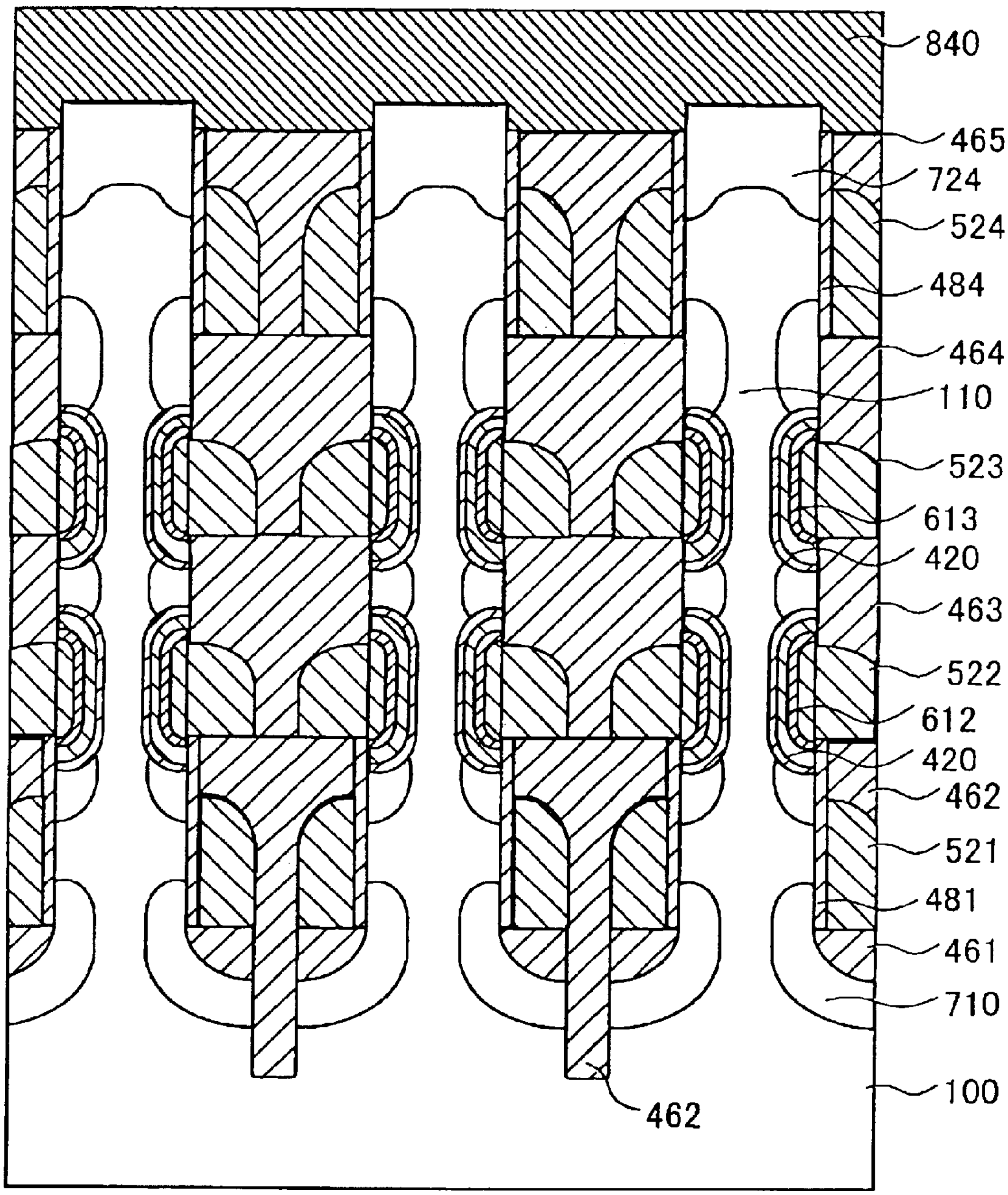

As shown in FIGS. 299 and 300, the first lattice-form trench 210 may have a partially or entirely rounded slant shape at its bottom.

The bottom of the polysilicon film 521 to be a second conductive film may or may not reach the slant bottom of the first trench 210.

Figure 301:
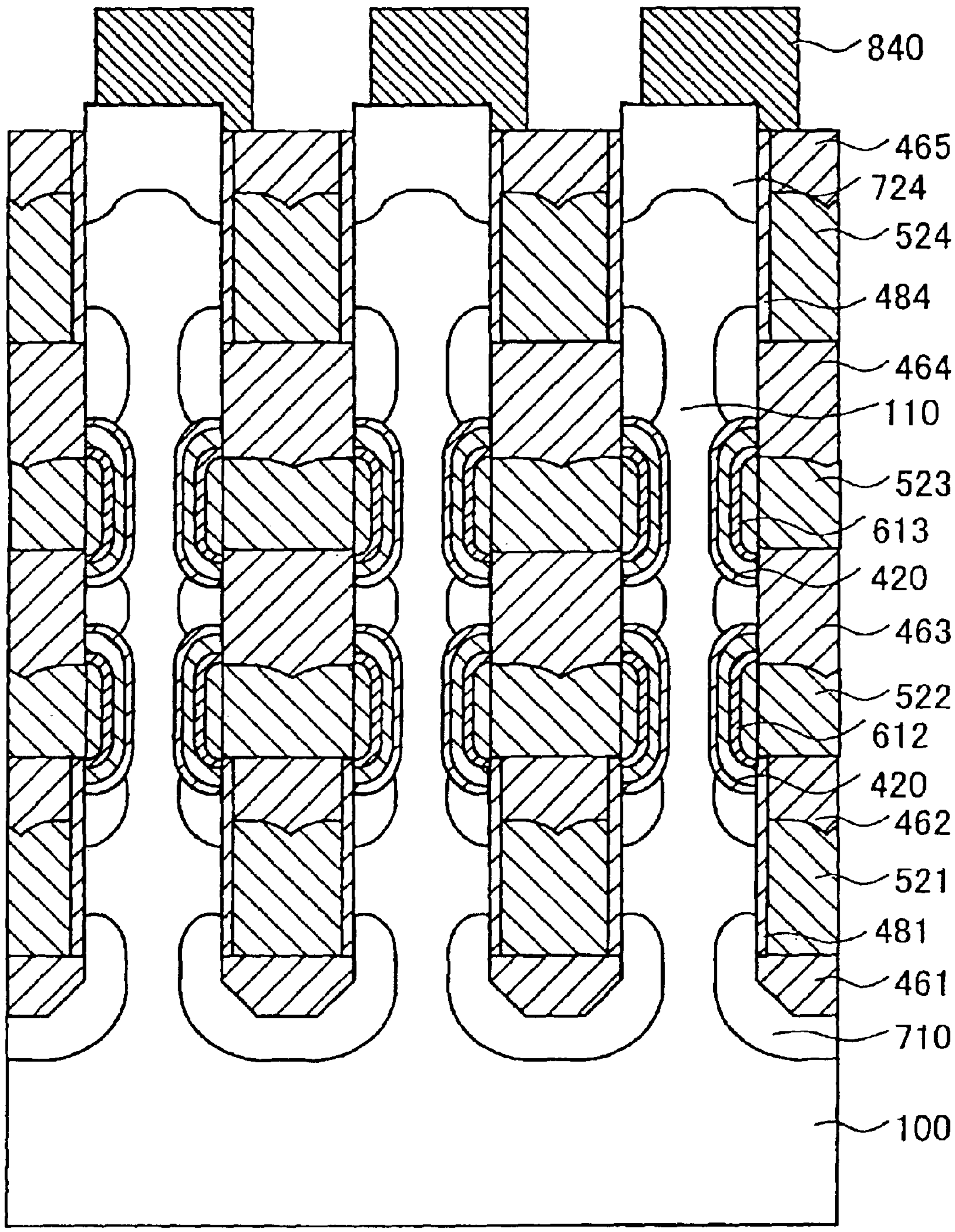
Figure 302:
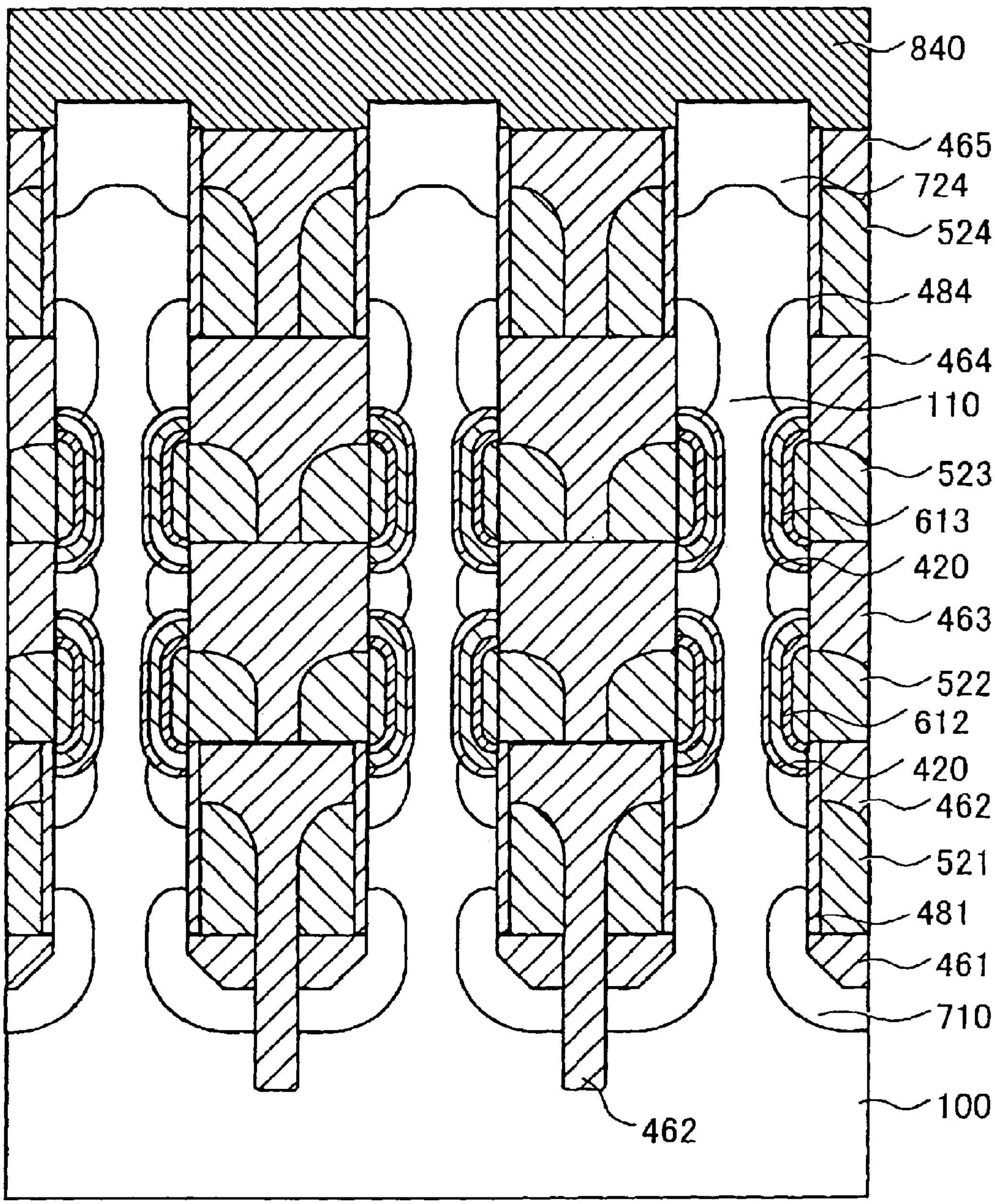

Alternatively, the first lattice-form trench 210 may have a slant shape at its bottom as shown in FIGS. 301 and 302. The bottom of the polysilicon film 521 may or may not reach the slant bottom of the first trench 210.

PRODUCTION EXAMPLE 32

Explanation is given of an example of production process for producing a semiconductor memory in which the bottom of the island-like semiconductor layer 110 does not have a simple columnar shape. FIGS. 303 and 304 and FIGS. 305 and 306 are sectional views taken on line A–A' and line B–B', respectively, in FIG. 1 which is a cross-sectional view illustrating a memory cell array of an EEPROM.

Figure 303:
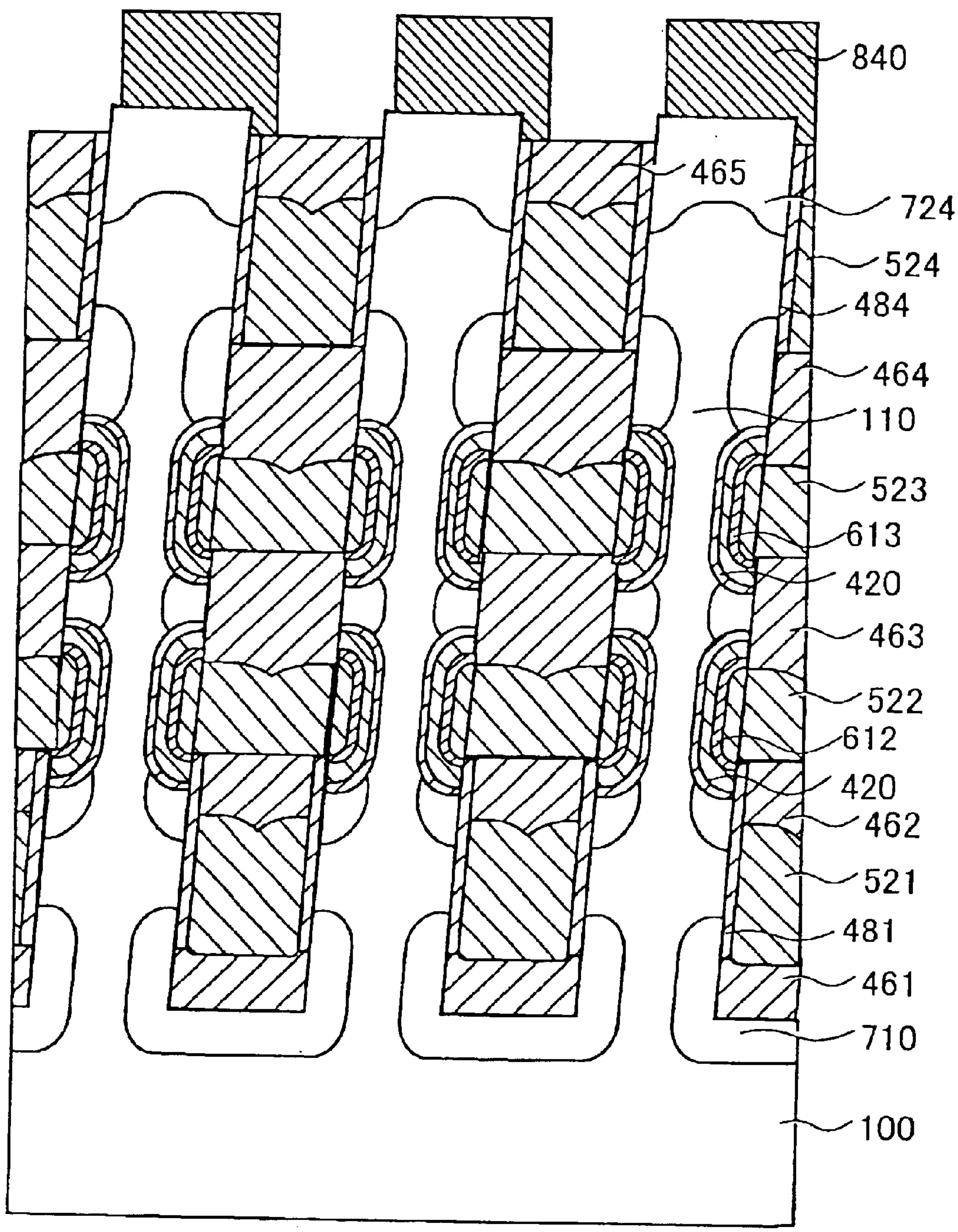
Figure 304:
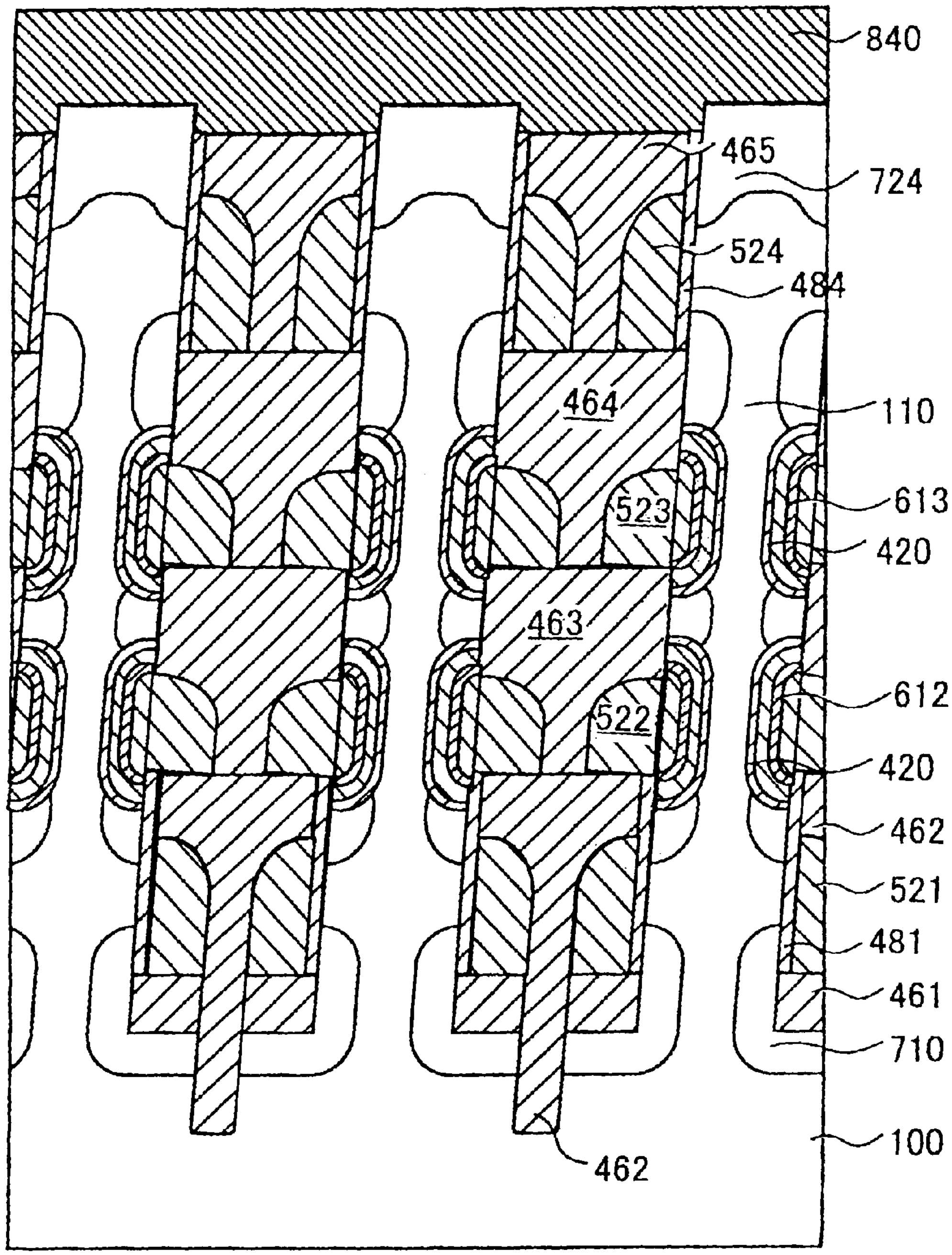
Figure 305:
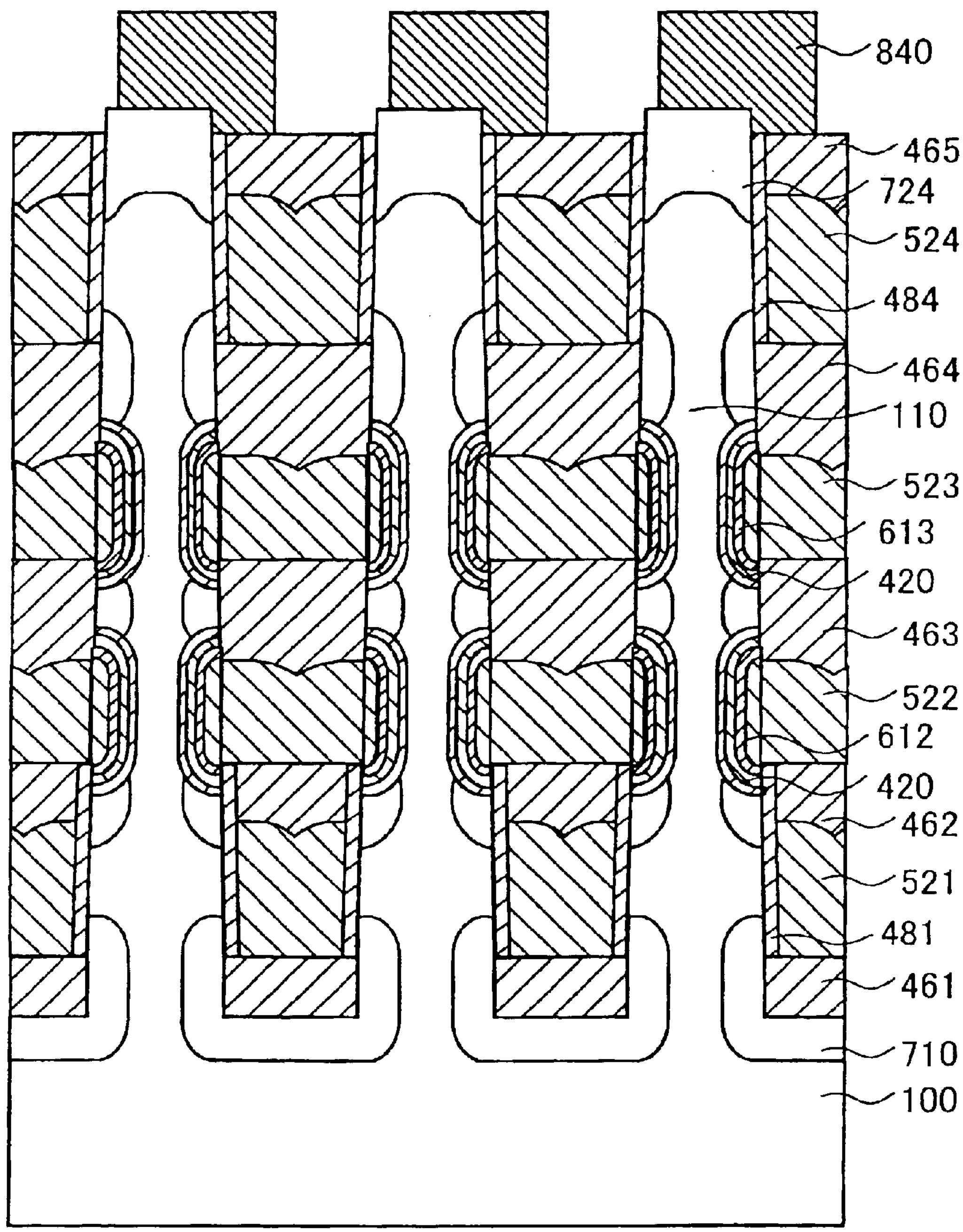
Figure 306:
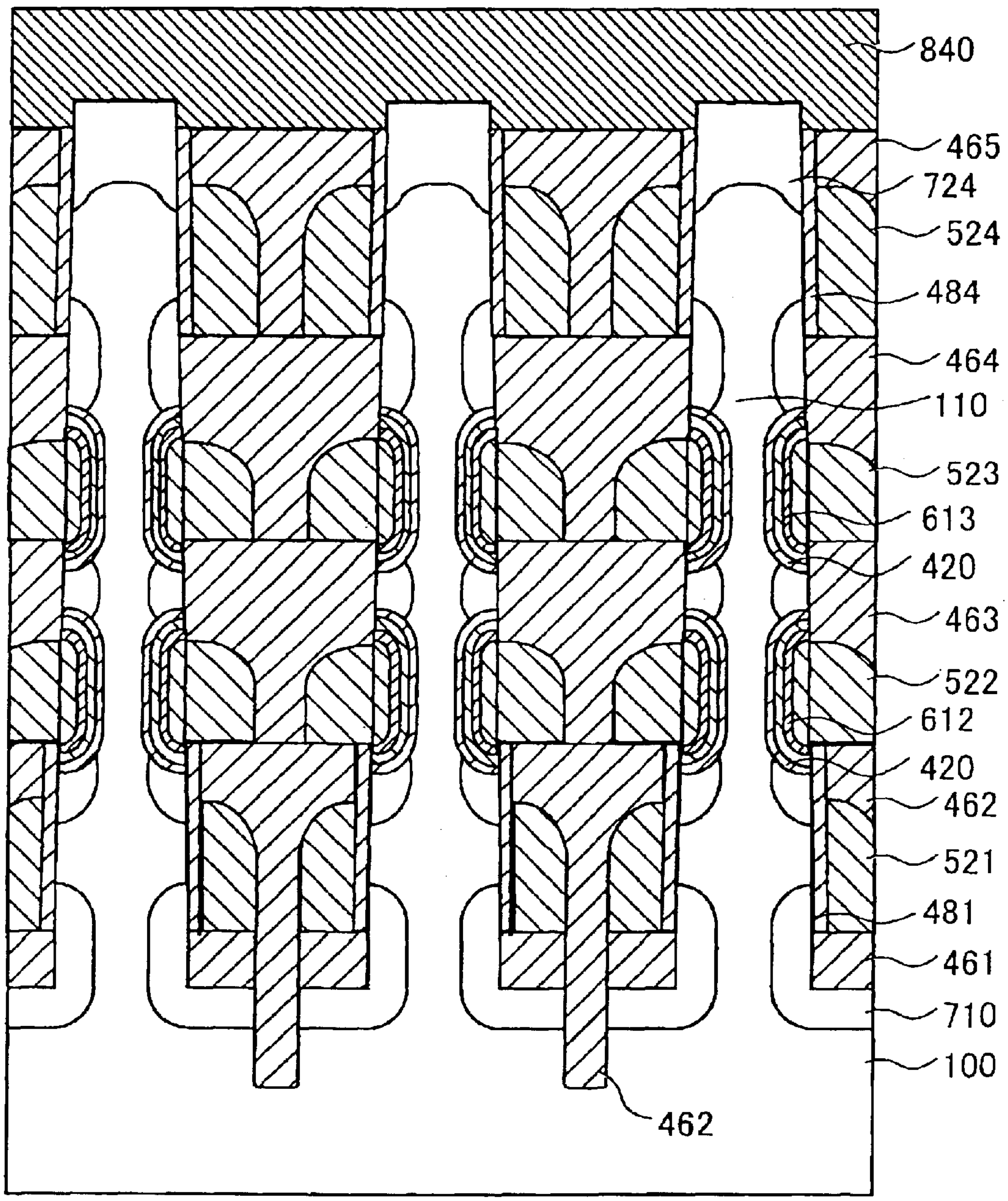
Figure 307:
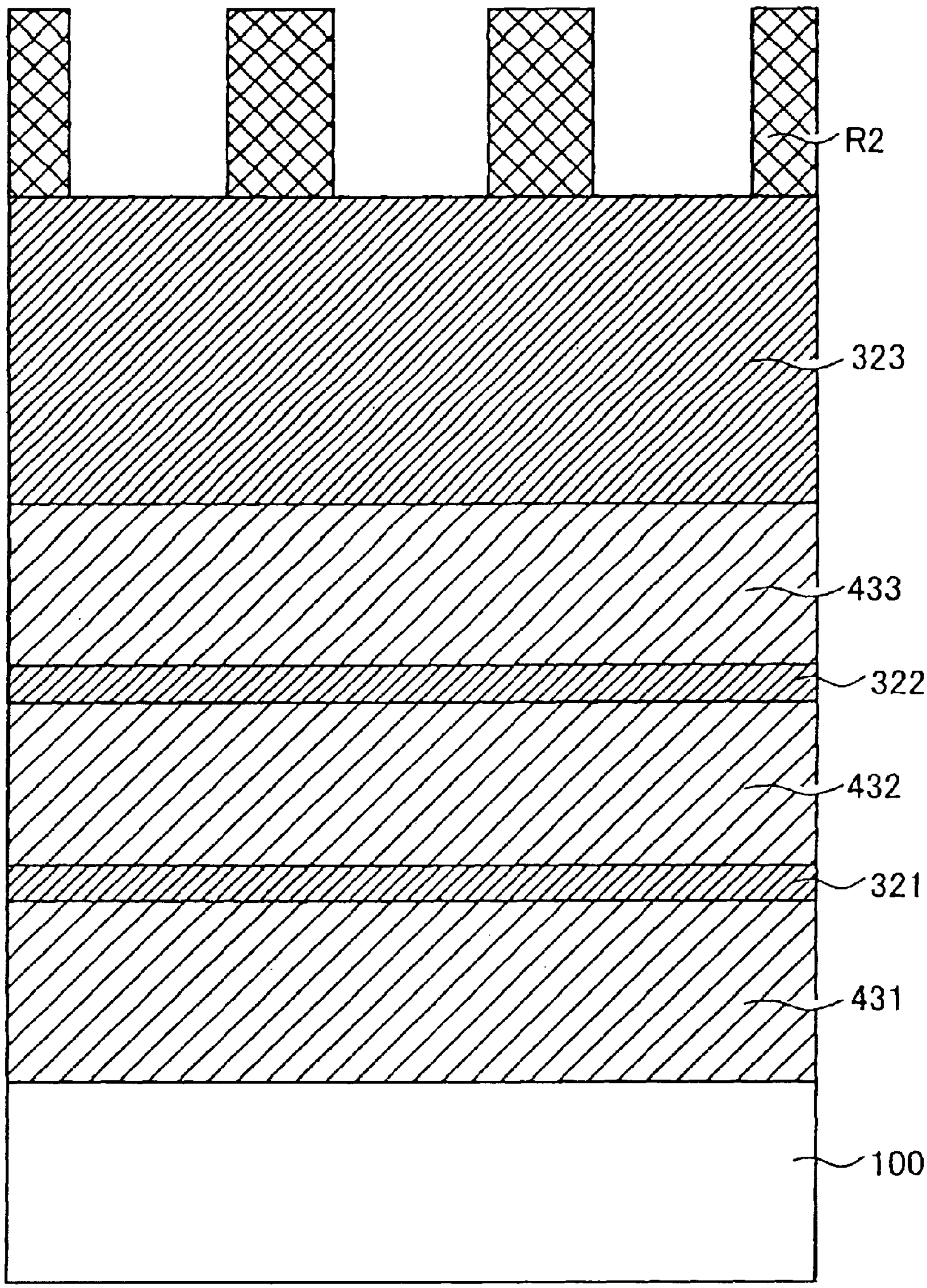

The first trench 210 may be formed by reactive ion etching such that the top and the bottom of the island-like semiconductor layer 110 may be shifted in a horizontal direction as shown in FIG. 303 and FIG. 304. Also, the top and the bottom of the island-like semiconductor layer 110 may have different outward shapes as shown in FIG. 305 and 306. For example, in the case where the island-like semiconductor layer 110 is circular in cross-sectional view as shown in FIG. 1, the island-like semiconductor layer 110 is an inclined column in FIGS. 303 and 304 and is a truncated cone in FIGS. 305 and 306.

The shape of the island-like semiconductor layer 110 is not particularly limited so long as the memory cells can be disposed in series in the direction vertical to the semiconductor substrate 100.

PRODUCTION EXAMPLE 33

In a semiconductor memory to be produced in this production example, a region for forming at least one recess on the sidewall of the pillar-form island-like semiconductor layer is determined in advance by a layered film made of plural films, and thereafter, the island-like semiconductor layer in the pillar form is formed by selective epitaxial growth in a hole-form trench opened by using a photoresist mask. Sides of the island-like semiconductor layers make active regions. Tunnel oxide films, floating gates and control gates are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Such a semiconductor memory is produced by the following production process. FIGS. 307 to 315 and FIGS. 316 to 324 are sectional views taken on line A–A' and line B–B', respectively, in FIG. 1 which is a cross-sectional view illustrating a memory cell array of an EEPROM.

First, a silicon oxide film 431 is deposited on a surface of a P-type silicon substrate 100 as a fifth insulating film to a thickness of 50 to 500 nm by CVD. Then, a silicon nitride film 321 is deposited to a thickness of 10 to 100 nm as a fourth insulating film, a silicon oxide film 432 is deposited to a thickness of 50 to 500 nm as a fifth insulating film, a silicon nitride film 322 is deposited to a thickness of 10 to 100 nm as a fourth insulating film, a silicon oxide film 433 is deposited to a thickness of 50 to 500 nm as a fifth insulating film, and a silicon nitride film 323 is deposited to a thickness of 100 to 5,000 nm as a fourth insulating film.

The thicknesses of the silicon oxide films 432 and 433 are adjusted to a height of the floating gate of the memory cell.

Figure 308:
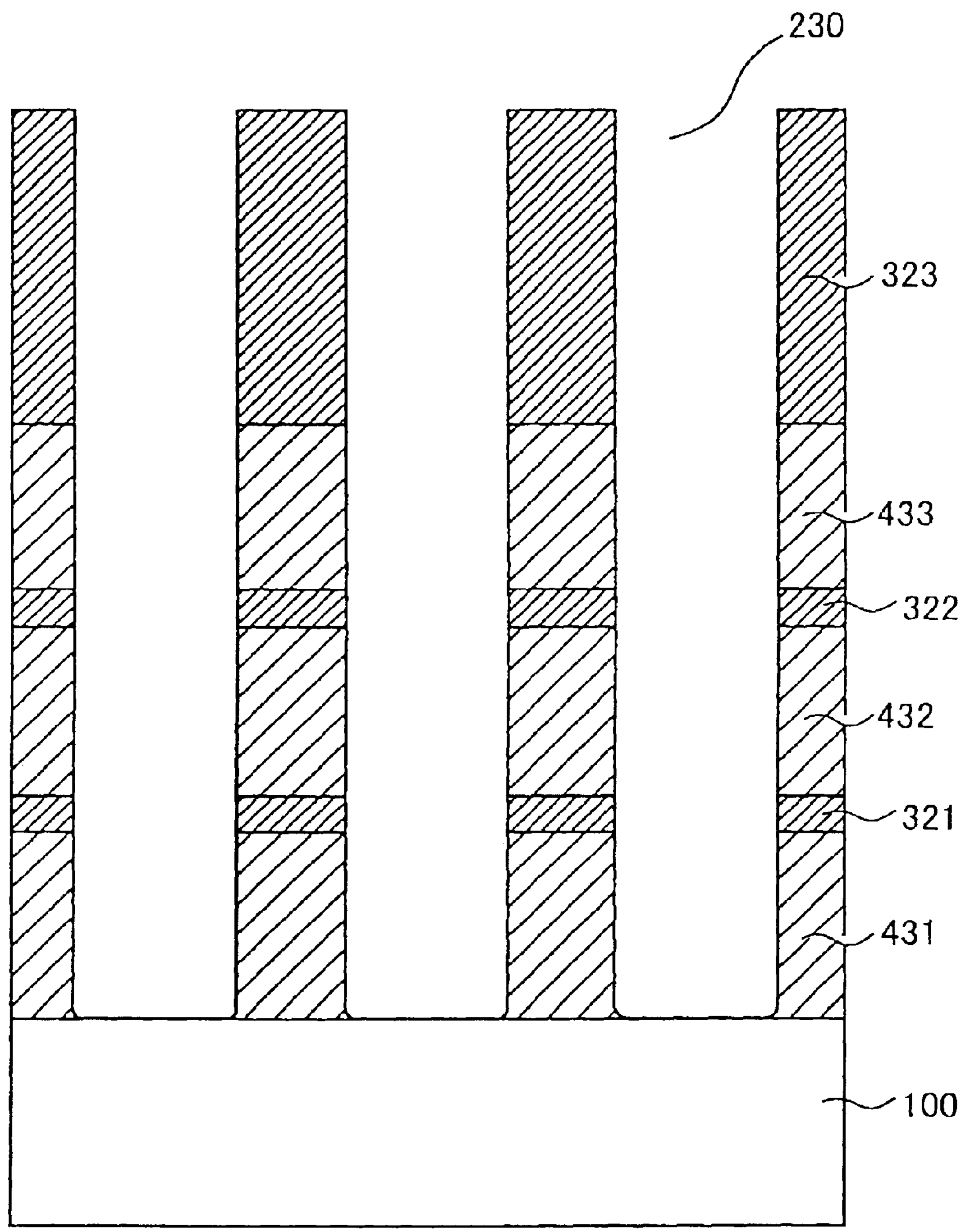
Figure 317:
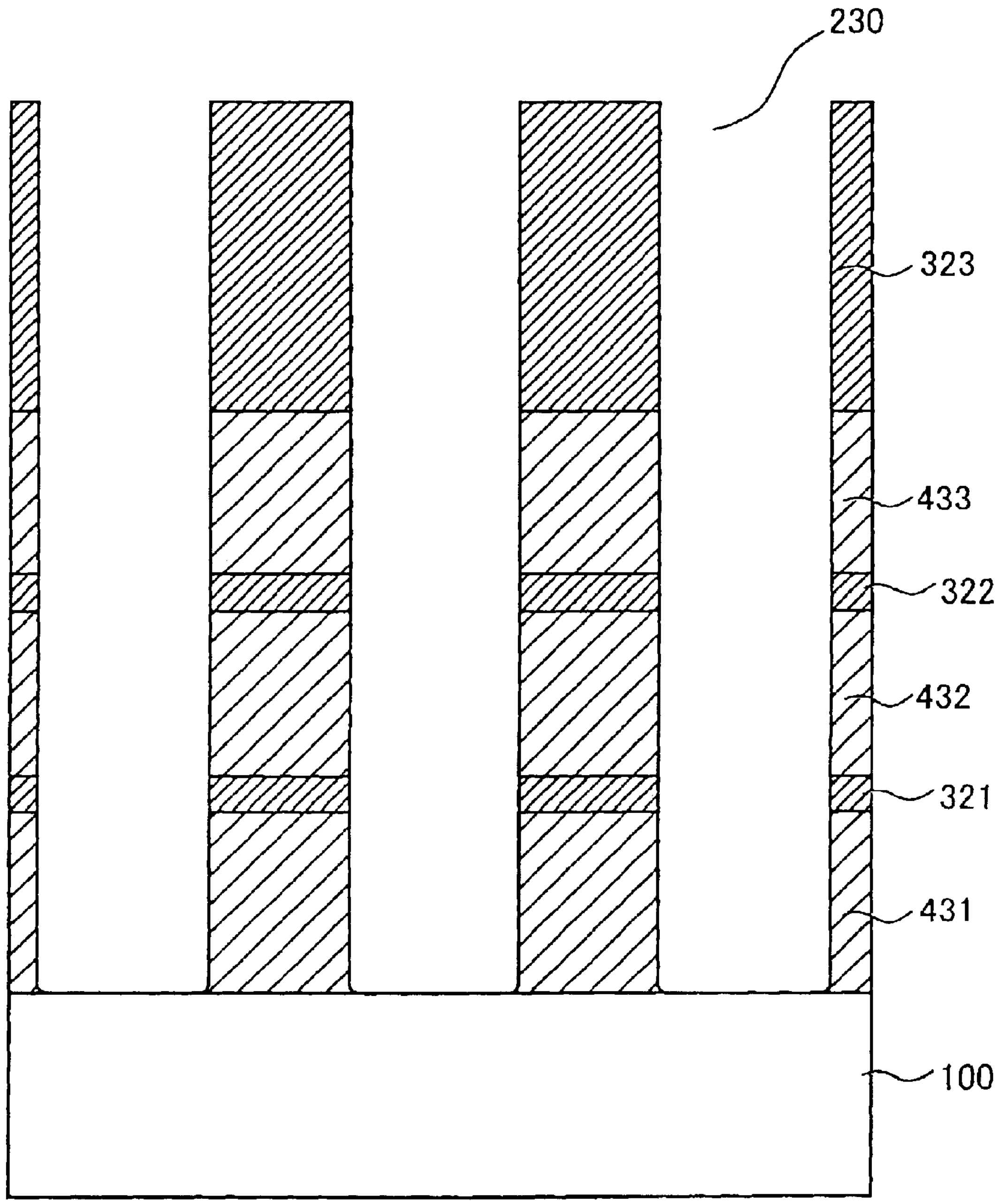

Subsequently, using a resist R2 patterned by a known photolithography technique as a mask (FIG. 307 and FIG. 316), the silicon nitride film 323, the silicon oxide film 433, the silicon nitride film 322, the silicon oxide film 432, the silicon nitride film 321 and the silicon oxide film 431 are etched successively by reactive ion etching to form a third trench 230. Then, the resist R2 is removed (FIG. 308 and FIG. 317).

Figure 309:
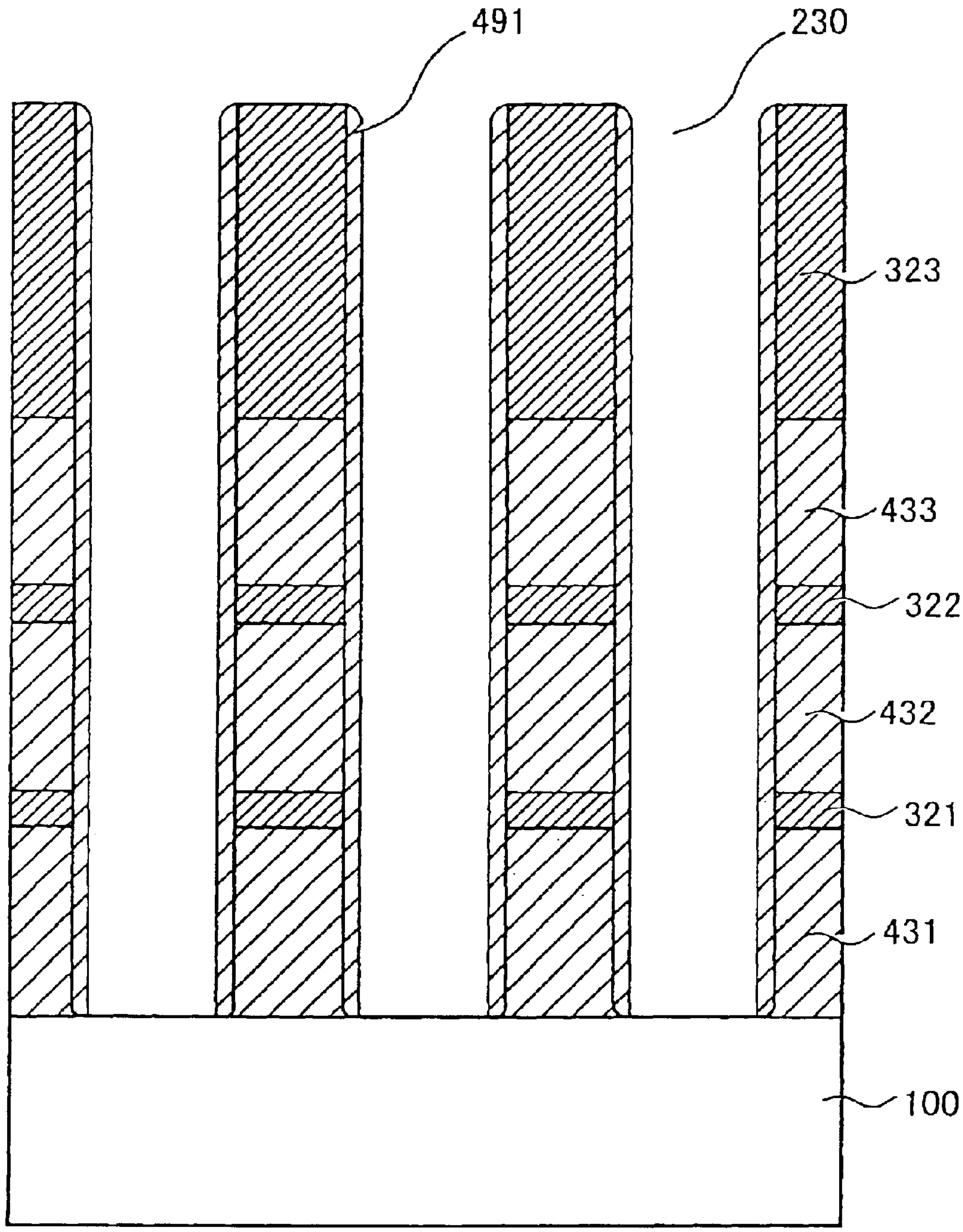
Figure 318:
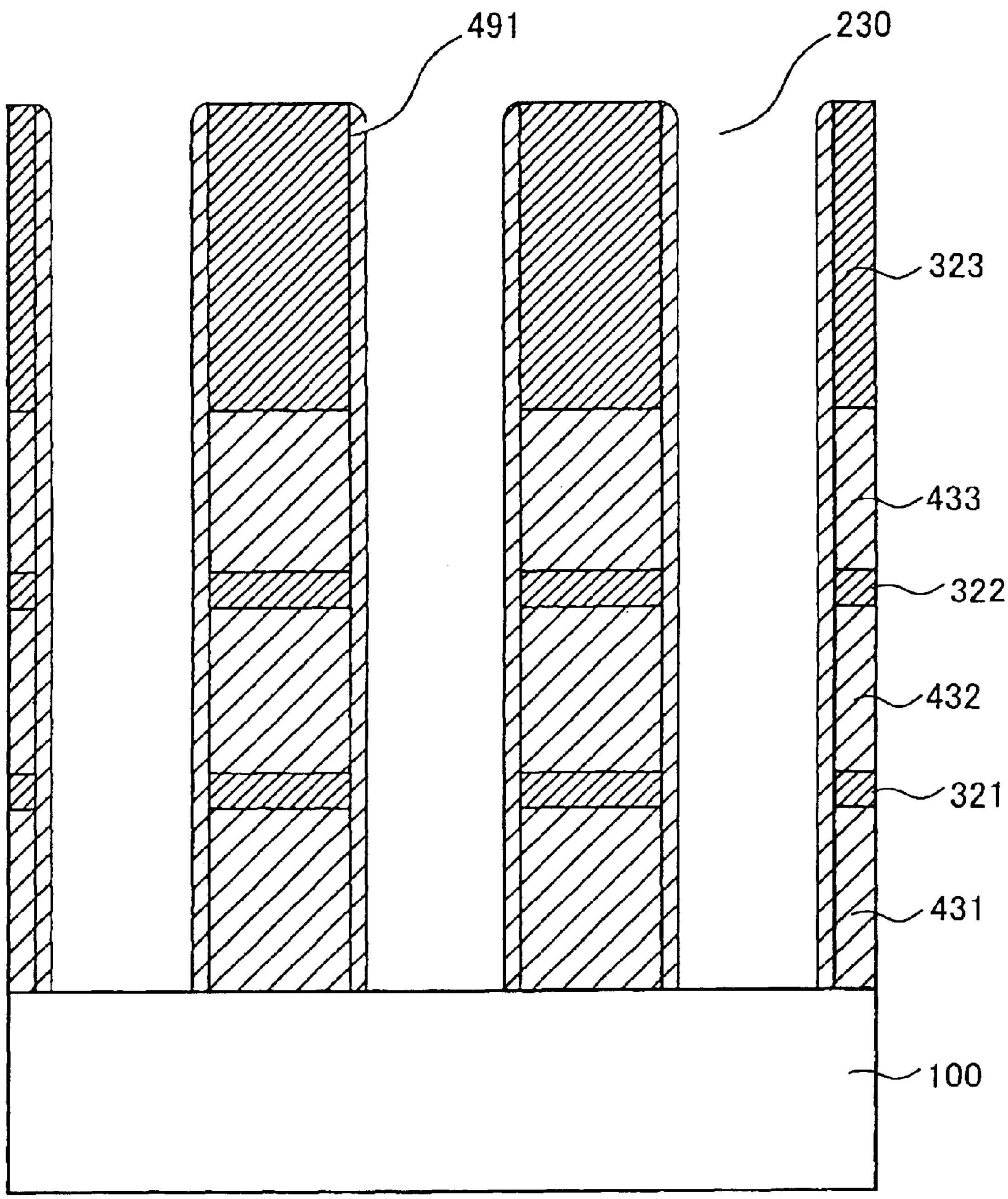

A fifteenth insulating film, for example, a silicon oxide film 491, is deposited to a thickness of 20 to 200 nm and anisotropically etched by about a deposit thickness such that the silicon oxide film 491 remains in the form of a sidewall spacer on the inner wall of the third trench 230 (FIG. 309 and FIG. 318).

Figure 310:
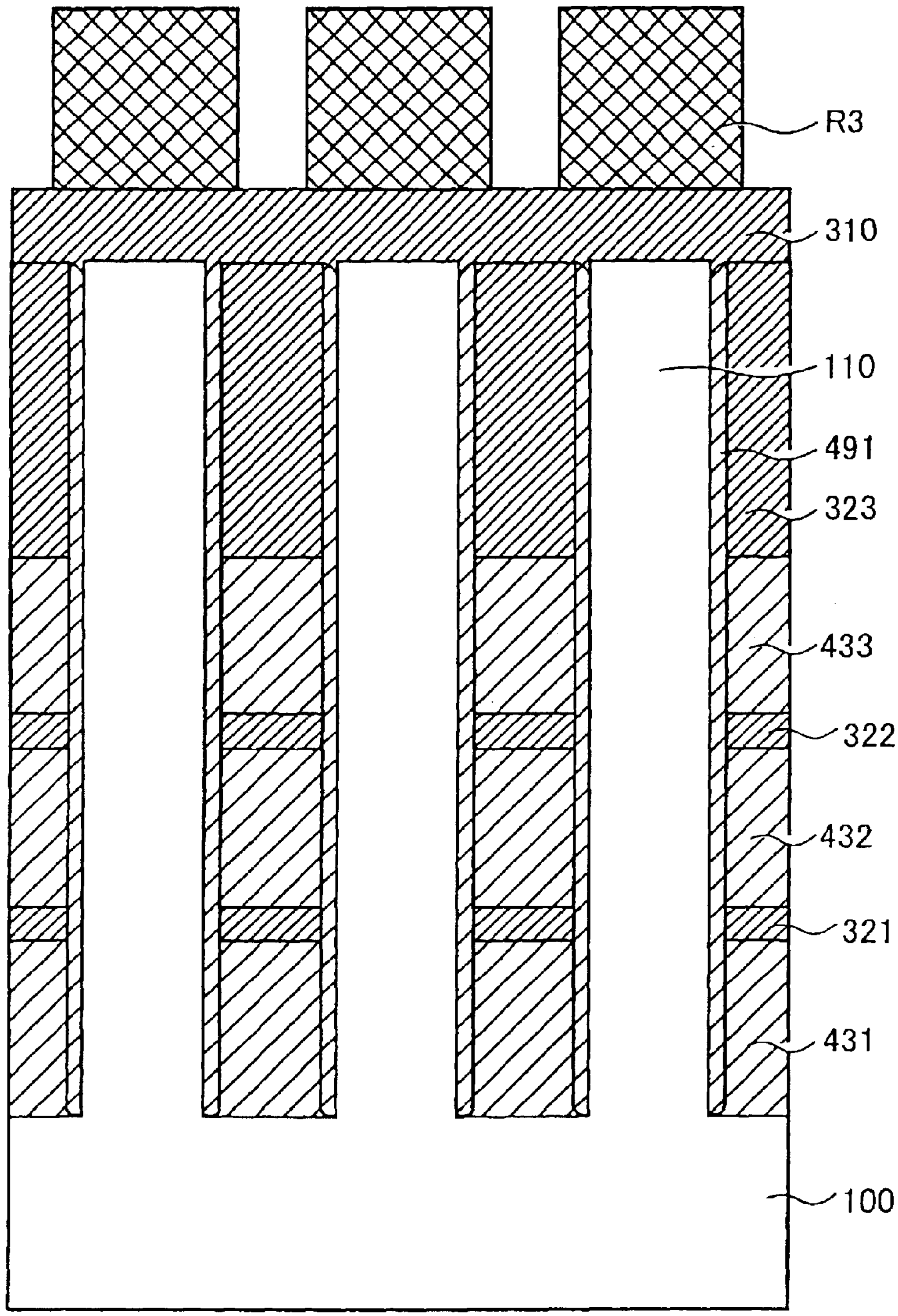
Figure 311:
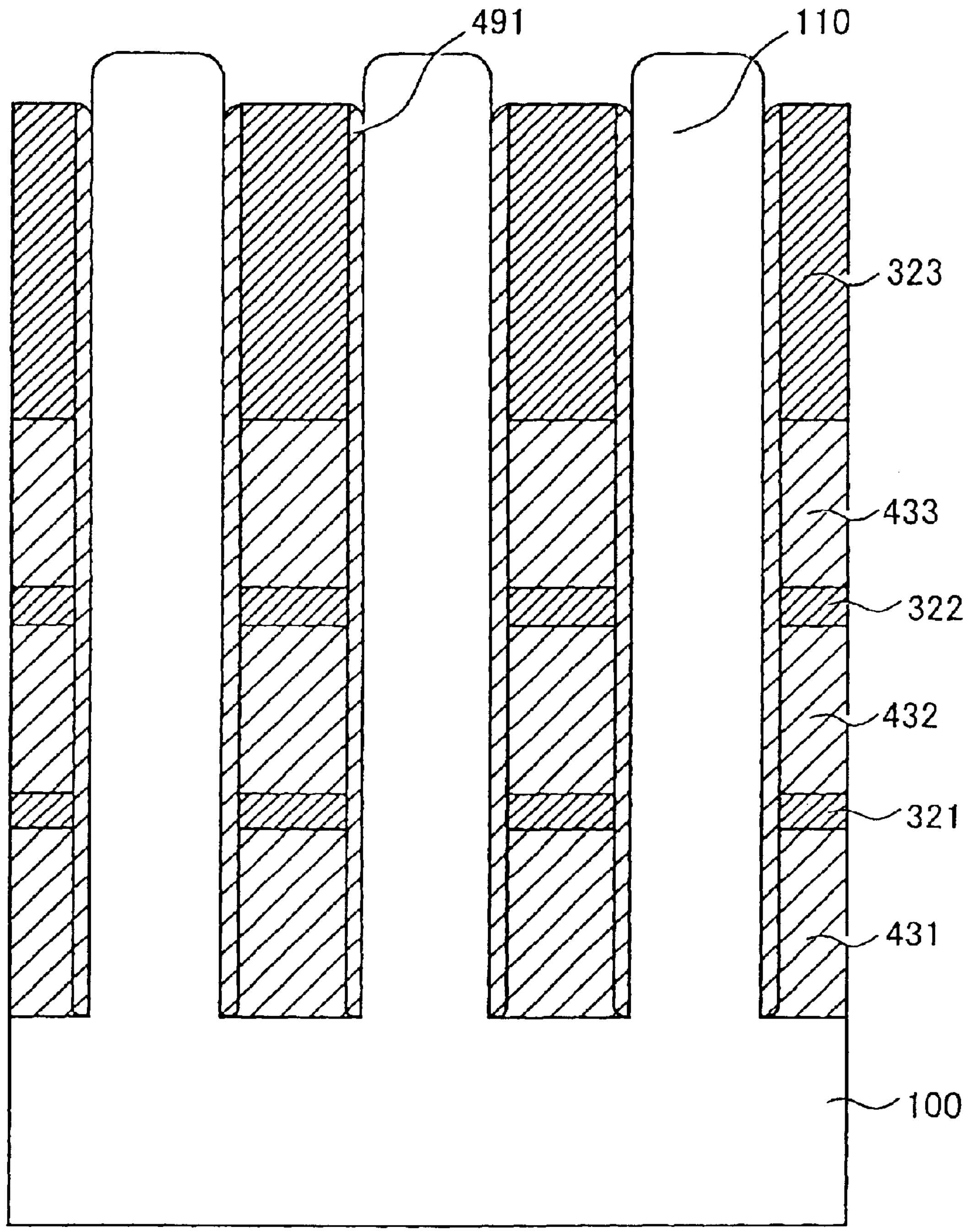
Figure 312:
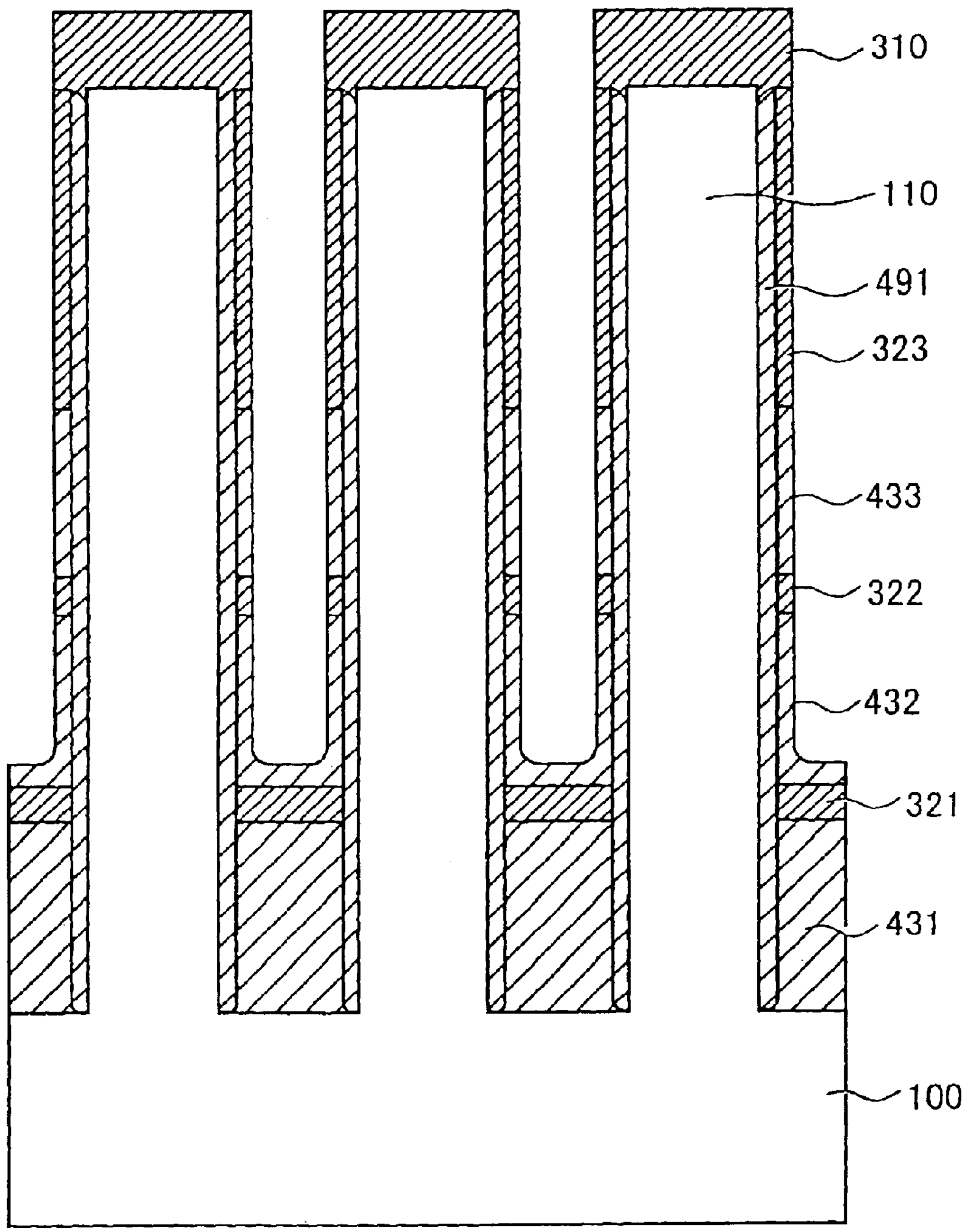
Figure 313:
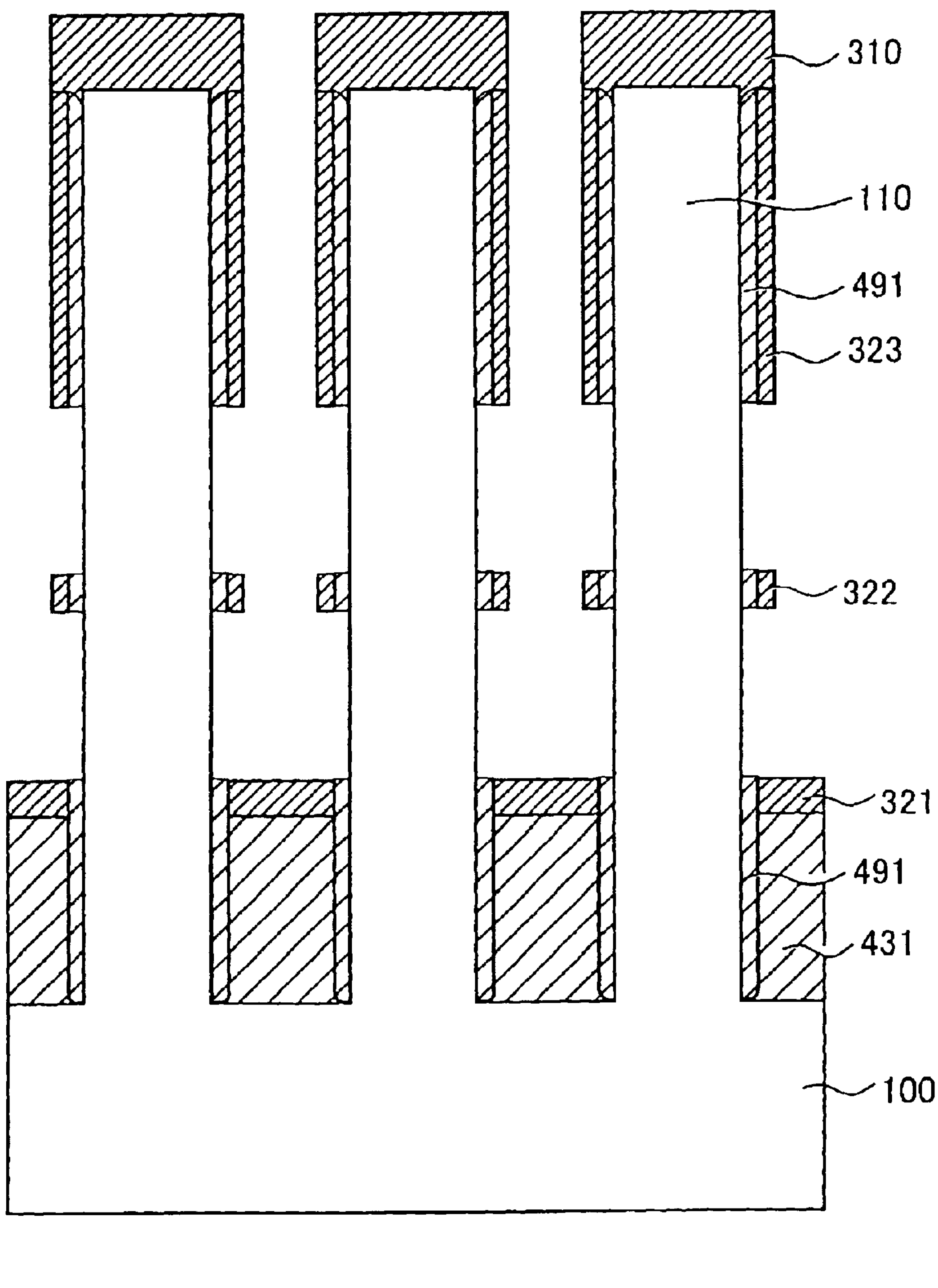
Figure 319:
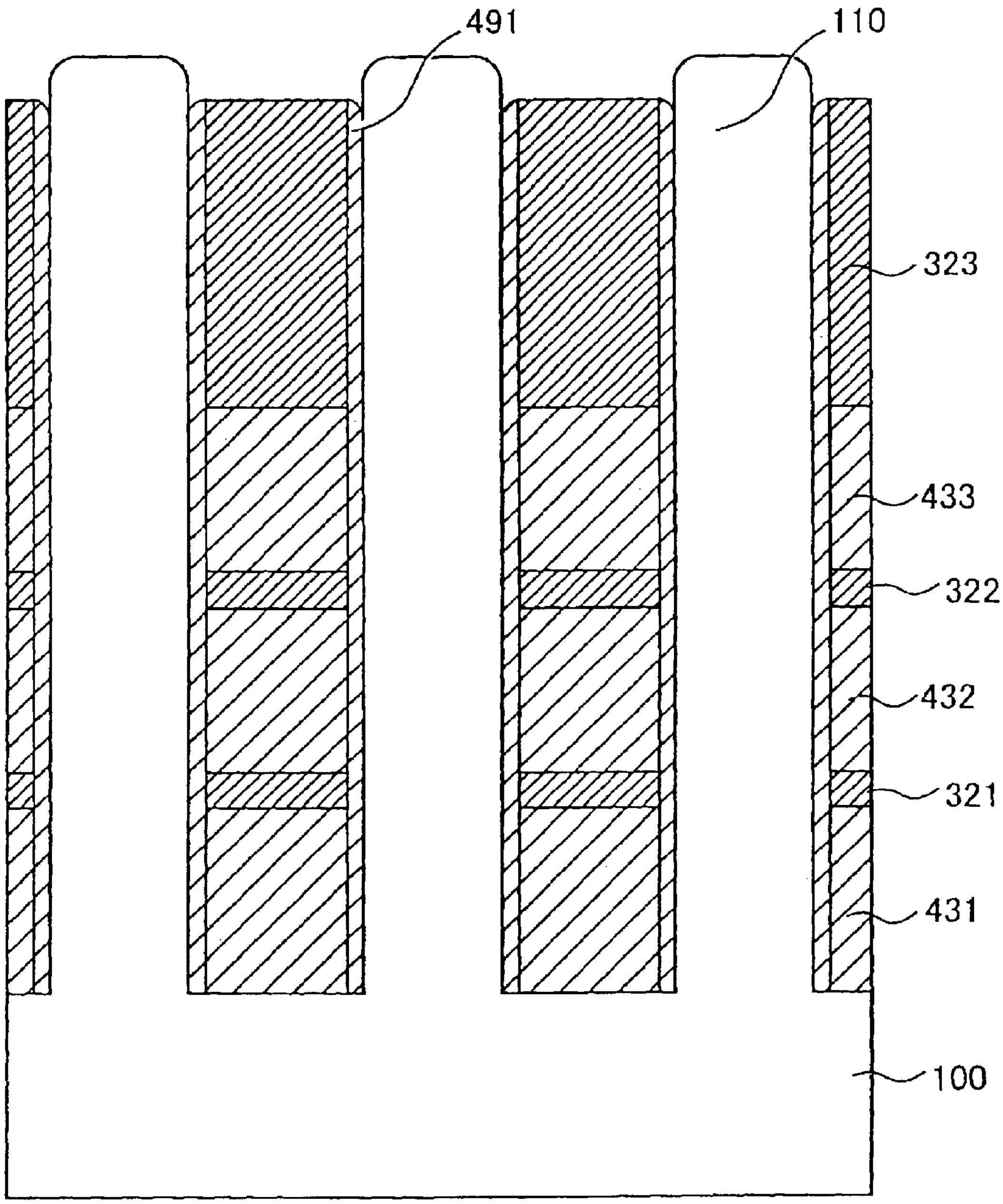
Figure 320:
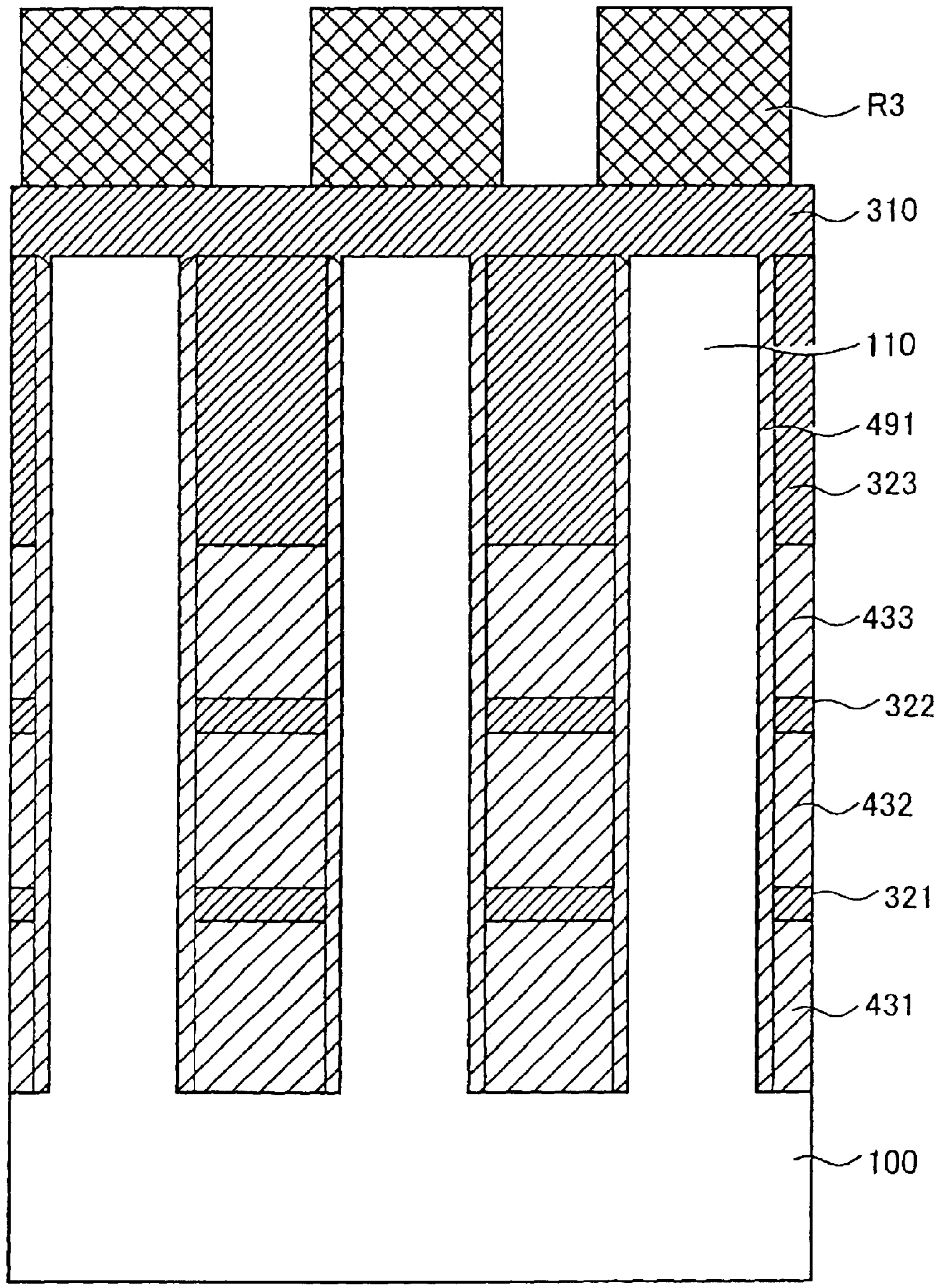
Figure 321:
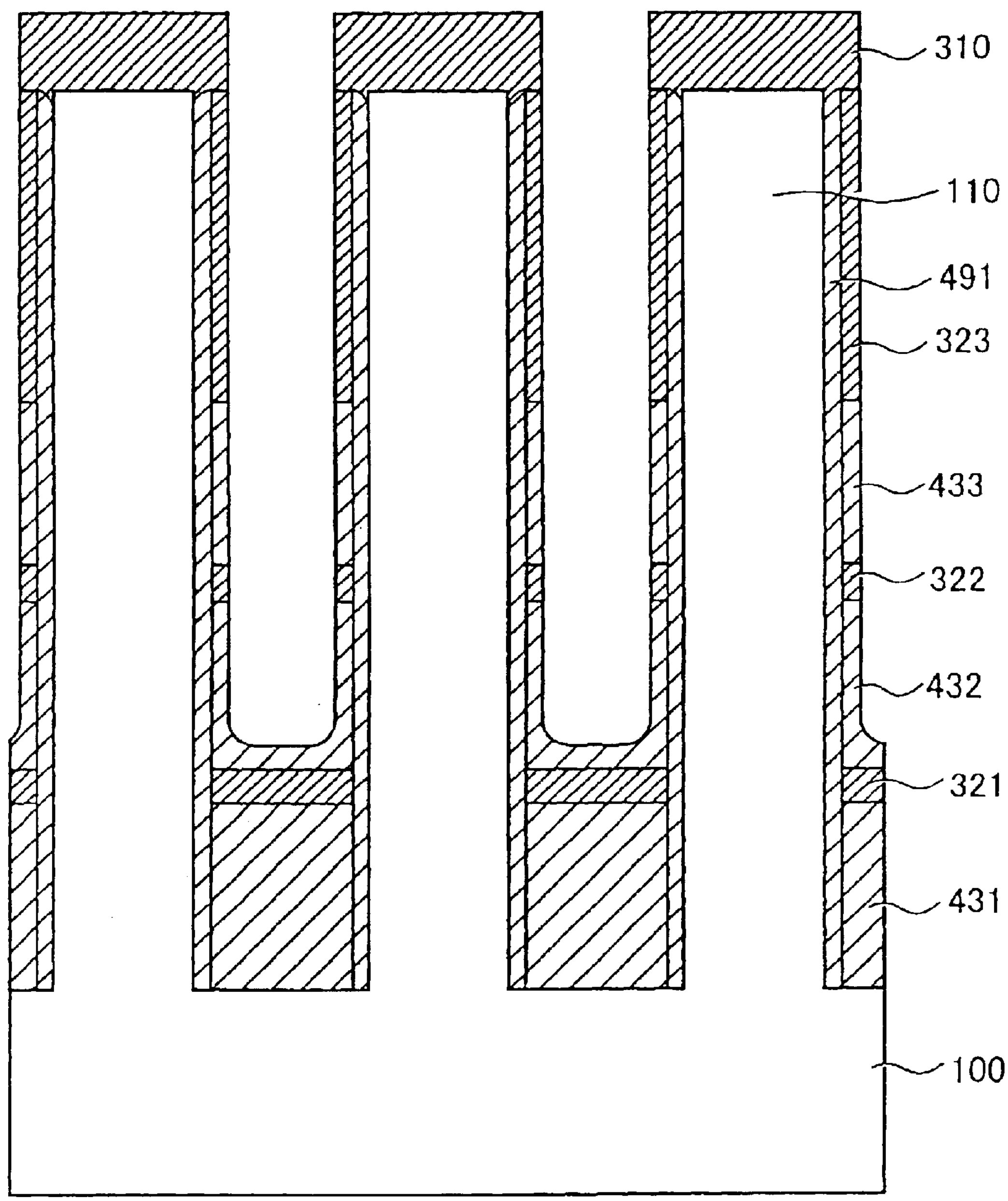
Figure 322:
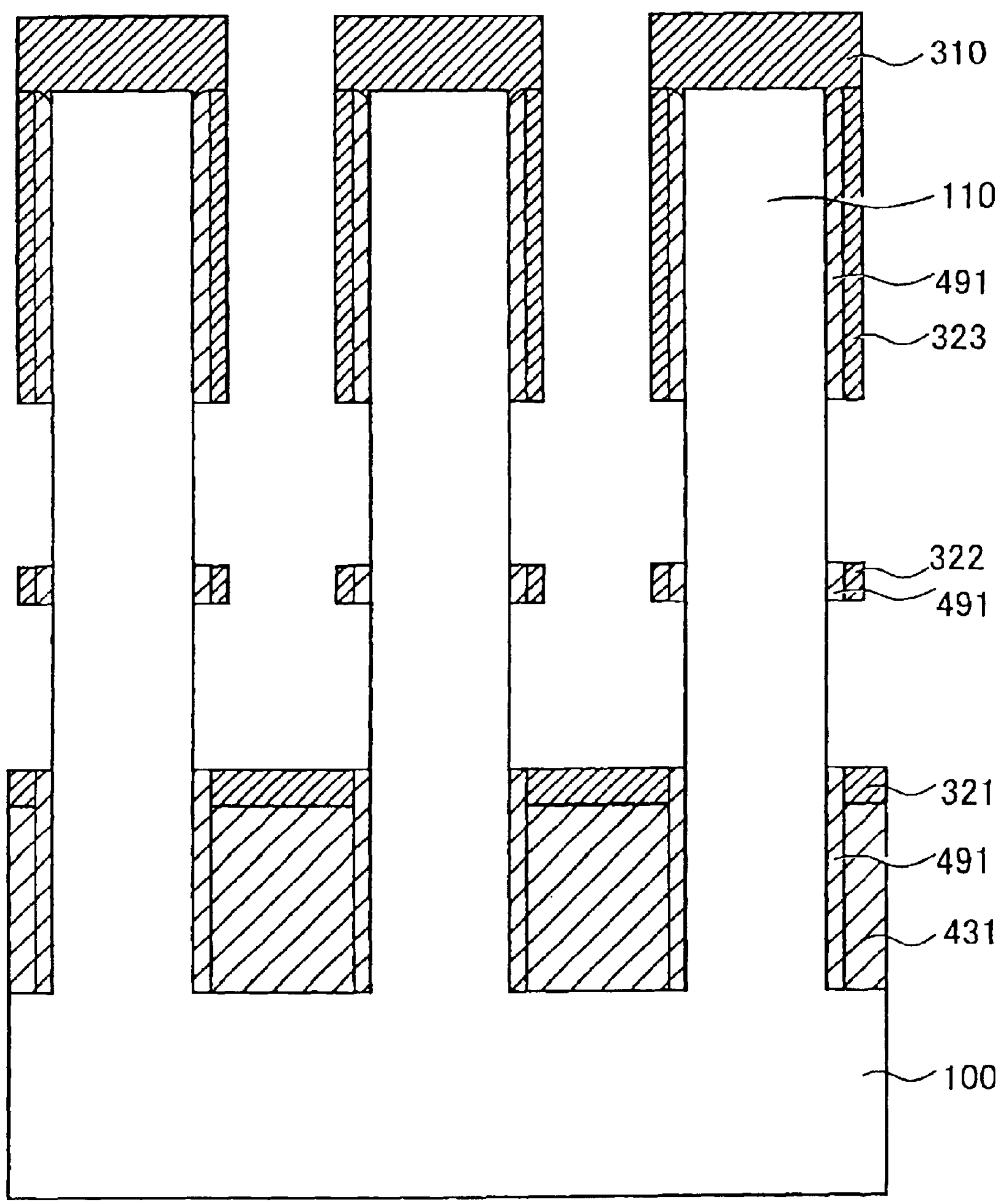

Then, an island-like semiconductor layer 110 is buried in the third trench 230 with the intervention of the silicon oxide film 491. For example, the semiconductor layer is selectively epitaxially grown from the P-type silicon substrate 100 located at the bottom of the third trench 230 (FIG. 310 and FIG. 319). The island-like semiconductor layer 110 is planarized to be flush with the silicon nitride film 323. At this time, the planarization may be carried out by isotropic etch back, anisotropic etch back, CMP, or these may be combined in various ways. Any means may be used for the planarization.

A silicon nitride film 310 is deposited to a thickness of 100 to 1,000 nm as a first insulating film. Using a resist R3 patterned by a known photolithography technique as a mask (FIG. 311 and FIG. 320), reactive ion etching is performed to successively etch the silicon nitride film 310, the silicon nitride film 323, the silicon oxide film 433, the silicon nitride film 322 and the silicon oxide film 432, thereby exposing the silicon oxide film 432. At this time, the silicon oxide film 432 may be etched until the silicon nitride film 321 is exposed.

Figure 314:
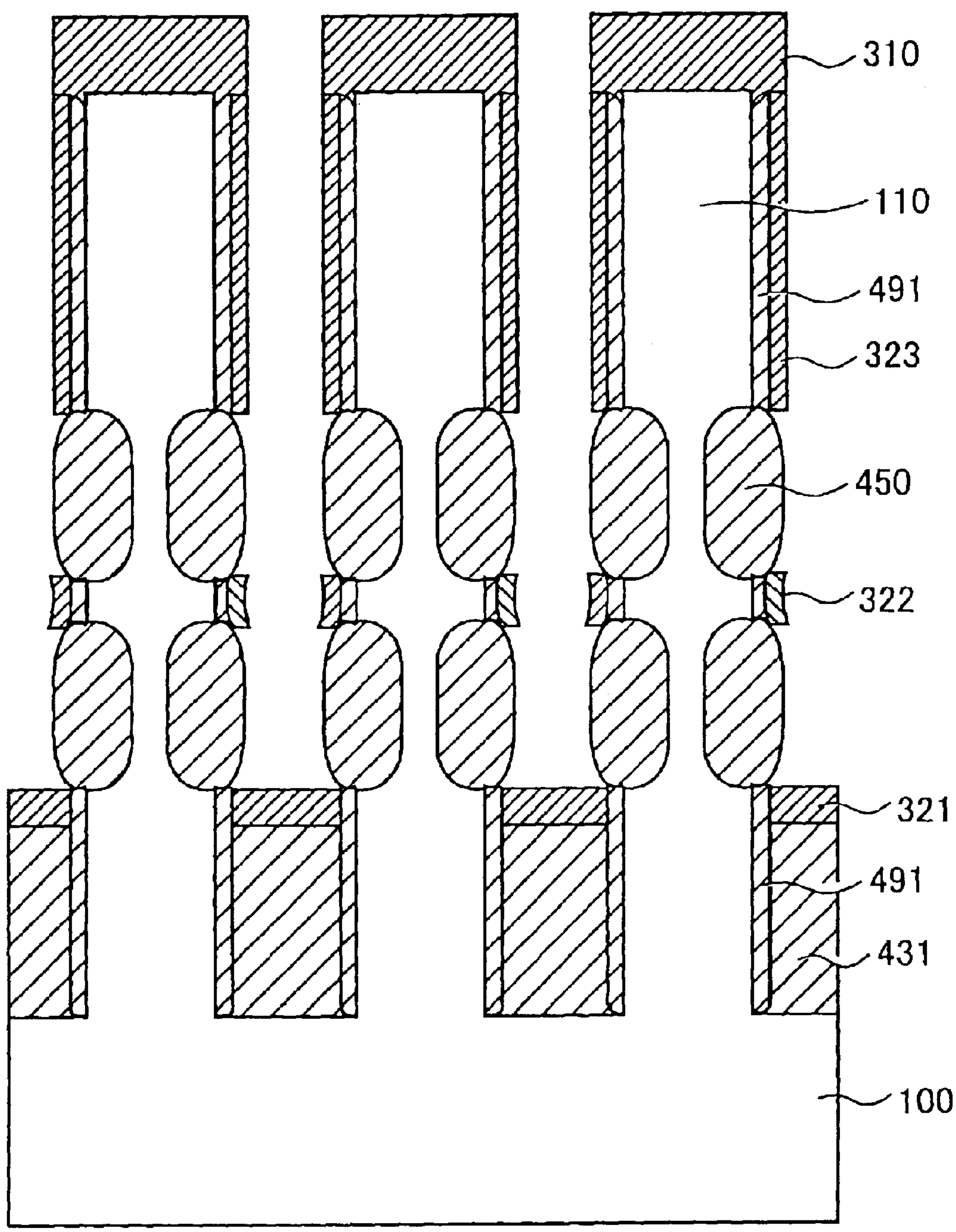
Figure 323:
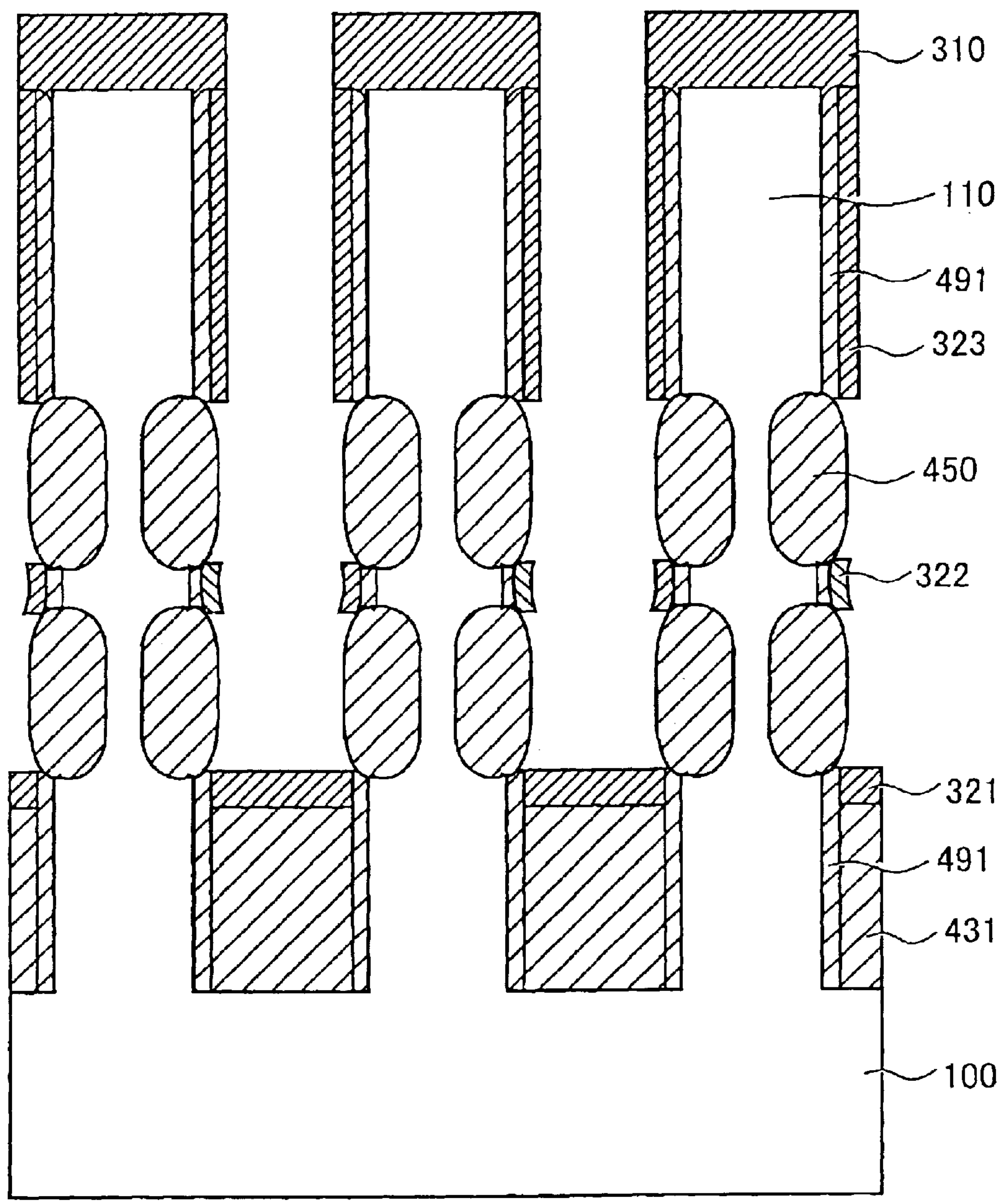

After the resist R3 is removed (FIG. 312 and FIG. 321), the silicon oxide film is entirely removed by isotropic etching (FIG. 313 and FIG. 322) and the exposed island-like semiconductor layer 110 is thermally oxidized to form a silicon oxide film 450 as a seventh insulating film (FIG. 314 and FIG. 323).

Figure 315:
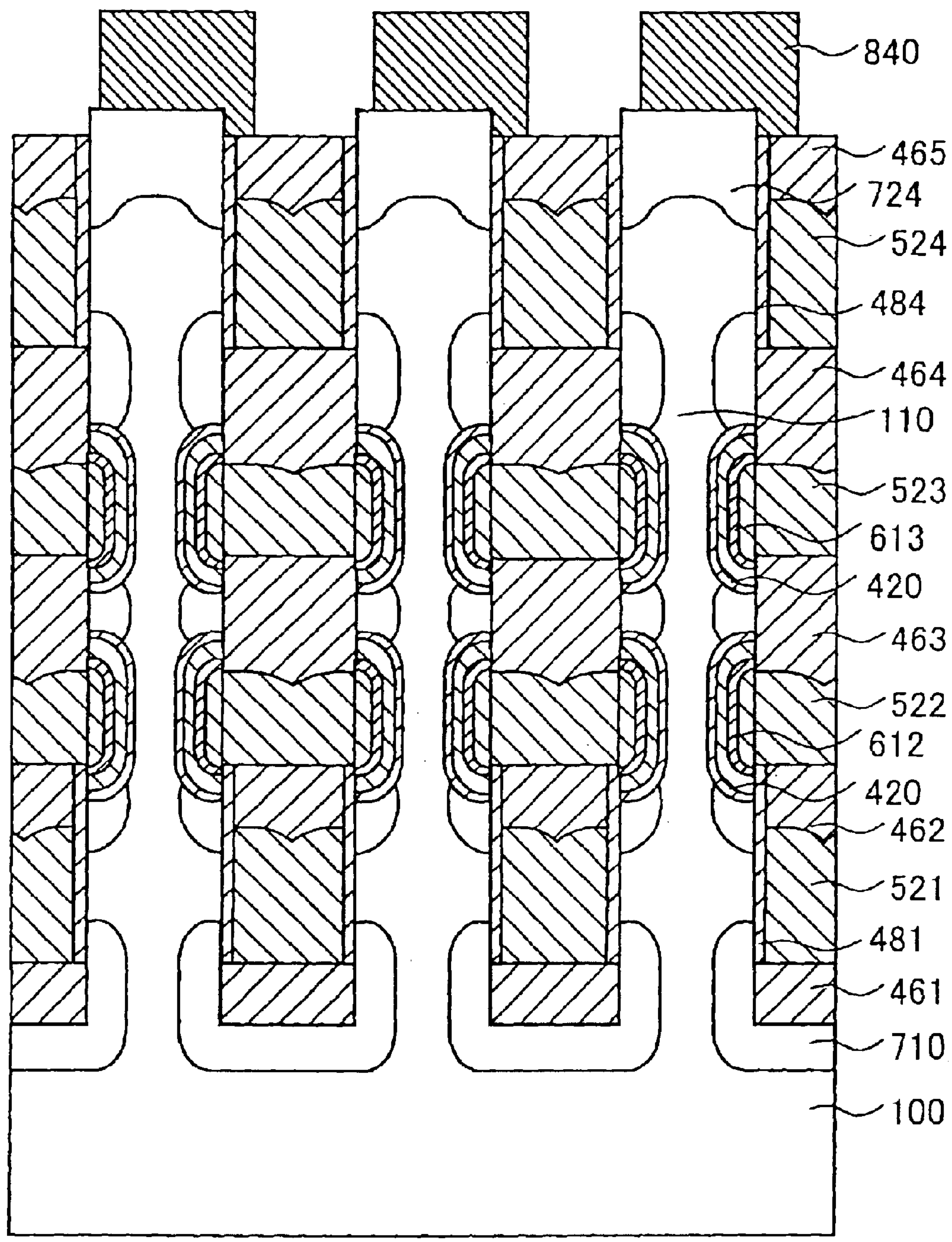
Figure 316:
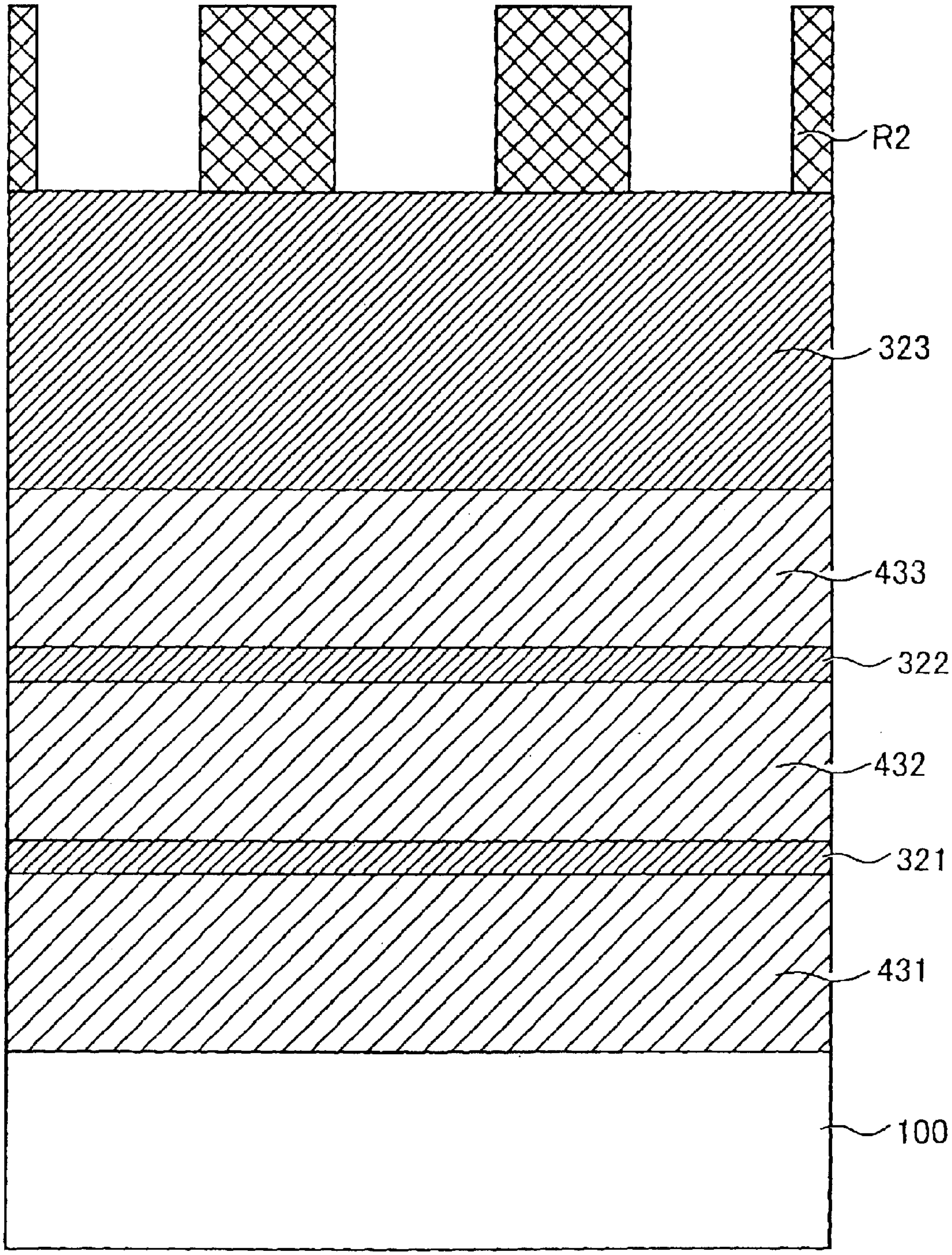
Figure 324:
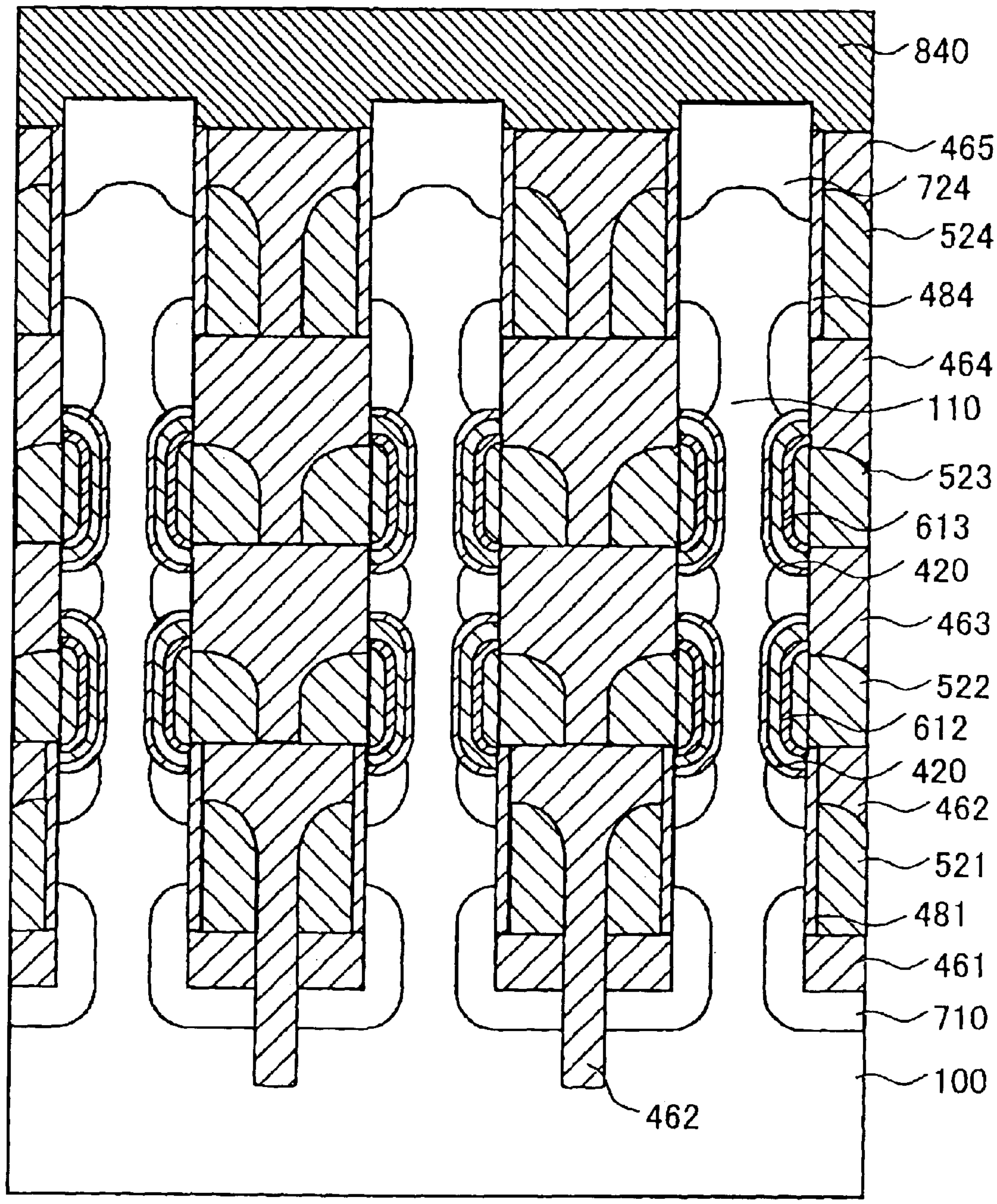

Production steps thereafter follow Production Example 20. Thereby, a semiconductor memory is realized which has a memory function according to the state of a charge in the charge storage layer which is the floating gate made of the polysilicon film as the first conductive film (FIG. 315 and FIG. 324).

Thus, the same effect as obtained by Production Example 20 is obtained. Further, since the region for forming at least one recess on the sidewall of the pillar-form island-like semiconductor layer is determined precisely by the layered film made of plural films, variations in device performance can be reduced.

PRODUCTION EXAMPLE 34

In a semiconductor memory to be produced in this example, a semiconductor substrate is patterned in the form of pillars to form island-like semiconductor layers having at least one recess. Sides of the island-like semiconductor layers make active regions. Tunnel oxide films, floating gates and control gates are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time. Transmission gates are disposed between the transistors for transmitting potentials to the active regions of the memory cell transistors.

Figure 325:
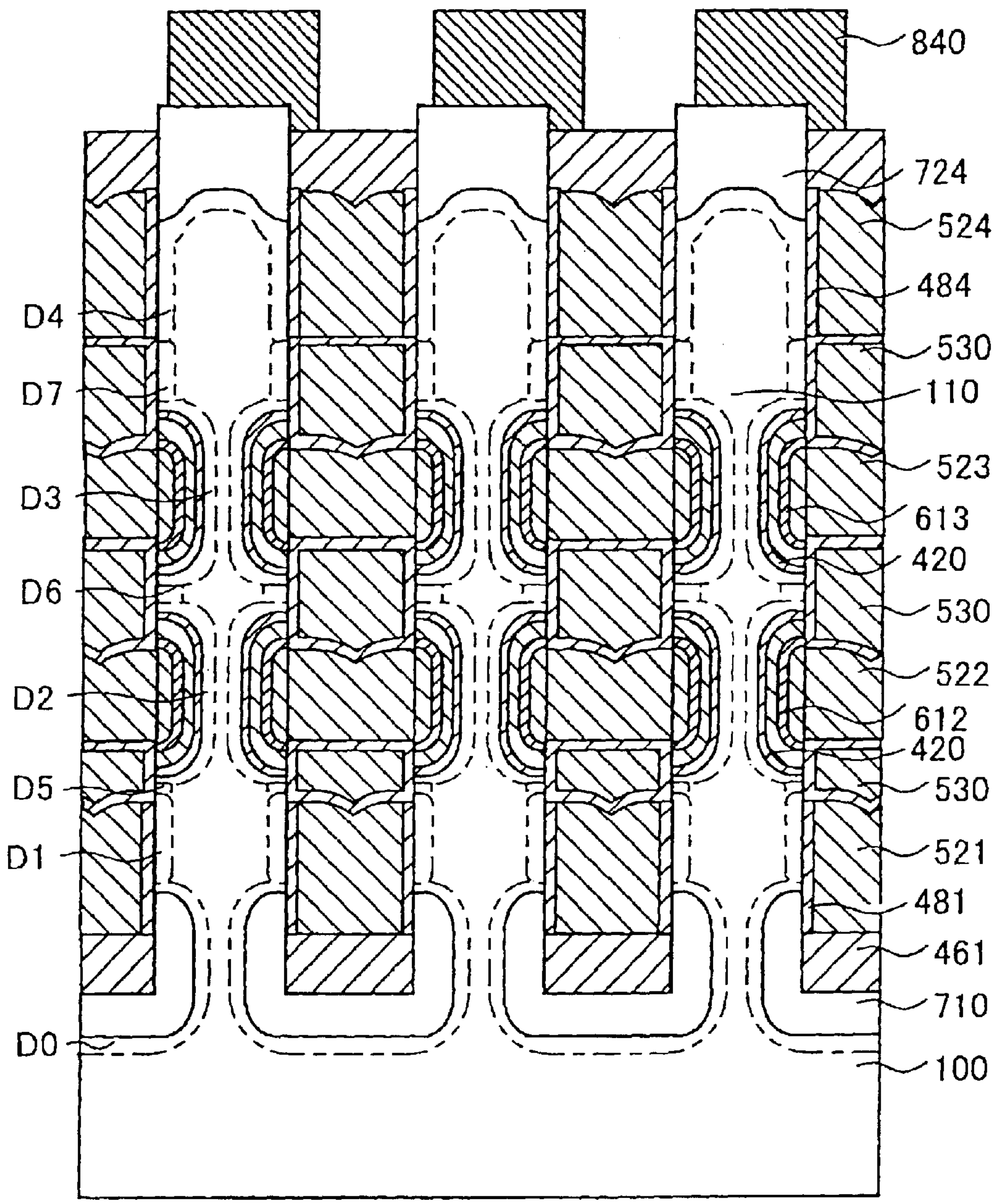
Figure 326:
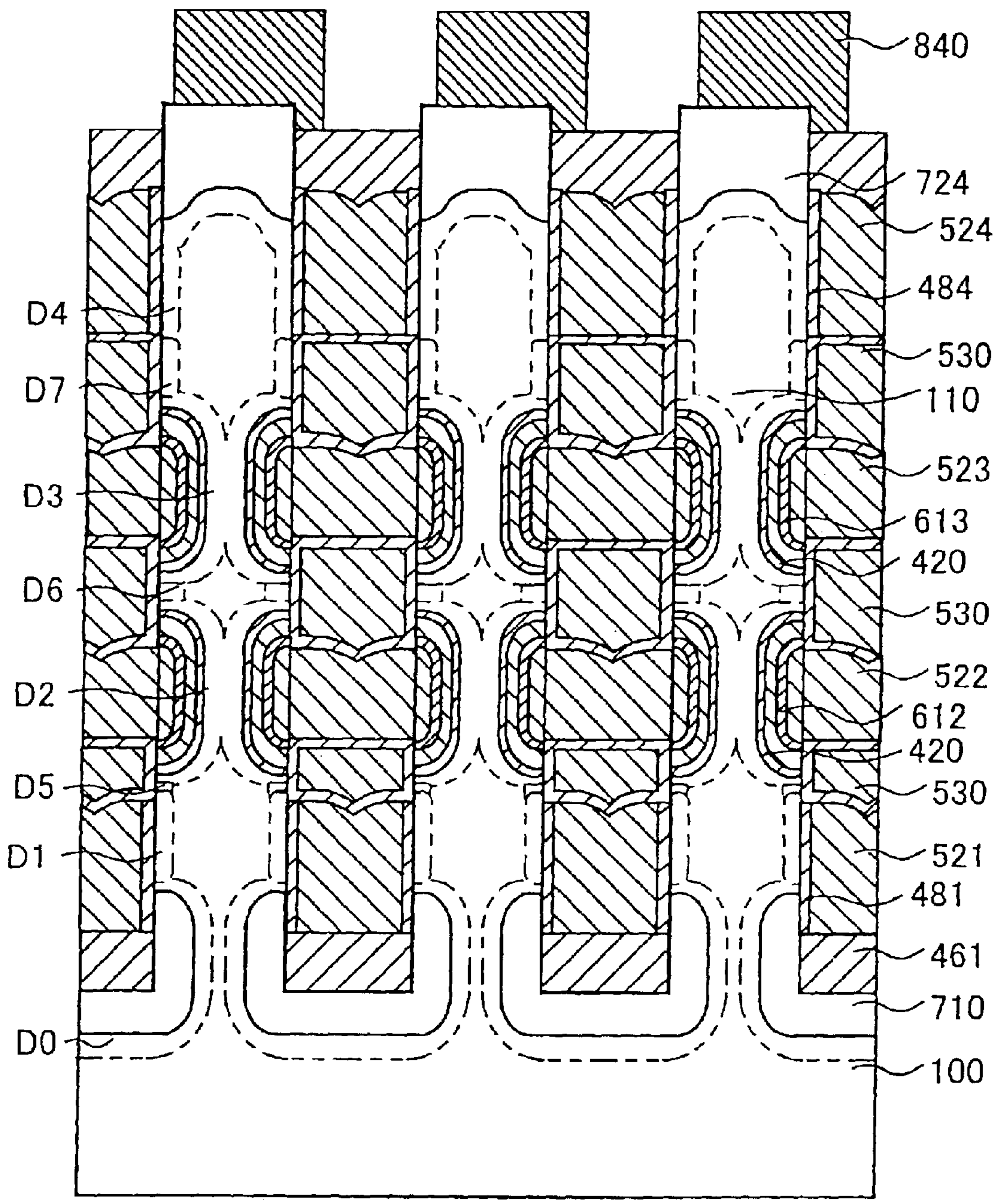

Such a semiconductor memory is produced by the following production process. FIG. 325 and FIG. 326 are sectional views taken on line A–A' and line B–B', respectively, in FIG. 1 which is a cross-sectional view illustrating a memory cell array of an EEPROM.

In this production example, a semiconductor memory is realized in the same manner as in Production example 20 except that the impurity diffusion layers 721 to 723 are not introduced and the step of forming a polysilicon film 530 as a third conductive film to be a gate electrode is added after the formation of the polysilicon films 521, 522, 523 and 524 as second conductive films (FIG. 325 and FIG. 326).

At data reading, as shown in FIG. 325, depletion layers and inversion layers shown in D1 to D7 are electrically connected with the gate electrodes 521, 522, 523, 524 and 530, thereby an electric current path is established between the impurity diffusion layers 710 and 725. In this situation, voltages to be applied to the gates 521, 522, 523, 524 and 530 are so set that whether the inversion layers are formed in D2 and D3 or not is selected depending on the condition of the charge storage layers 512 and 513, thereby the data can be read from the memory cell.

Figure 327:
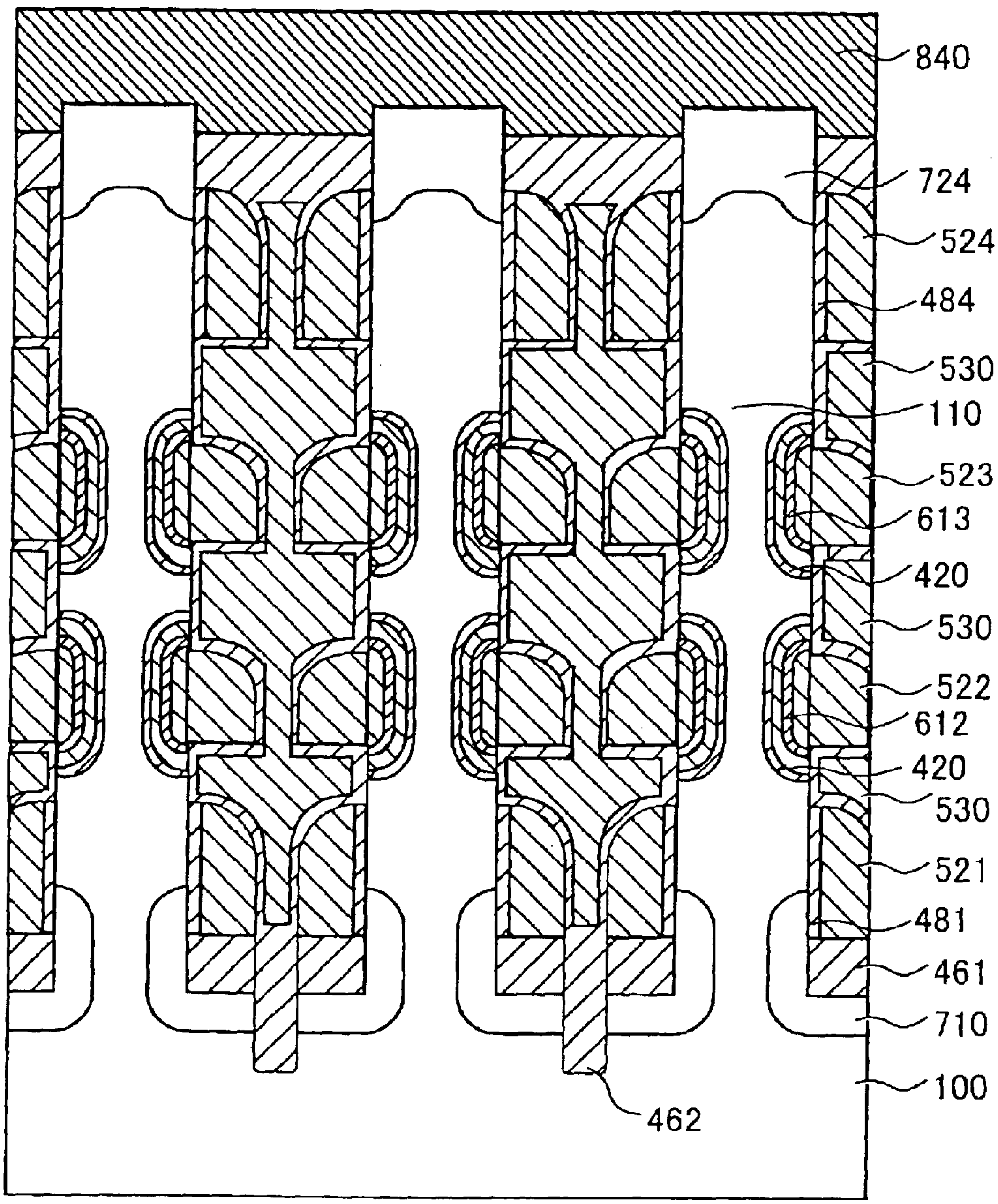

It is desired that the distribution of D2 and D3 is completely depleted as shown in FIG. 327. In this case, it is expected that the back-bias effect is suppressed in the memory cells, which is effective in reducing variations in device performance.

According to this example, the same effect as obtained by Production example 20 is obtained. Since the production steps are reduced and the required height of the island-like semiconductor layer 110 is reduced, variations during the production process are suppressed.

The top and the bottom of the polysilicon film 530 may be positioned as shown in FIG. 326, in which at least the top is positioned higher than the bottom of the polysilicon film 524 and the bottom is positioned lower than the top of the polysilicon film 521.

PRODUCTION EXAMPLE 35

Explanation is given of an example of production process for producing a semiconductor memory in which the silicon oxide films 461 to 465 are not buried completely. FIGS. 328 and 329 and FIGS. 330 and 331 are sectional views taken on line A–A' and line B–B', respectively, in FIG. 1 which is a cross-sectional view illustrating a memory cell array of an EEPROM.

In the semiconductor memory of Production example 20, the second trench 220 is formed in the self-alignment manner by reactive ion etching using the polysilicon film 521 (the second conductive film) as a mask. However, the polysilicon film 522, 523 or 524 (the second conductive films) may be used as the mask. Alternatively, a resist patterned by a known photolithography technique may be used for the separation.

Figure 328:
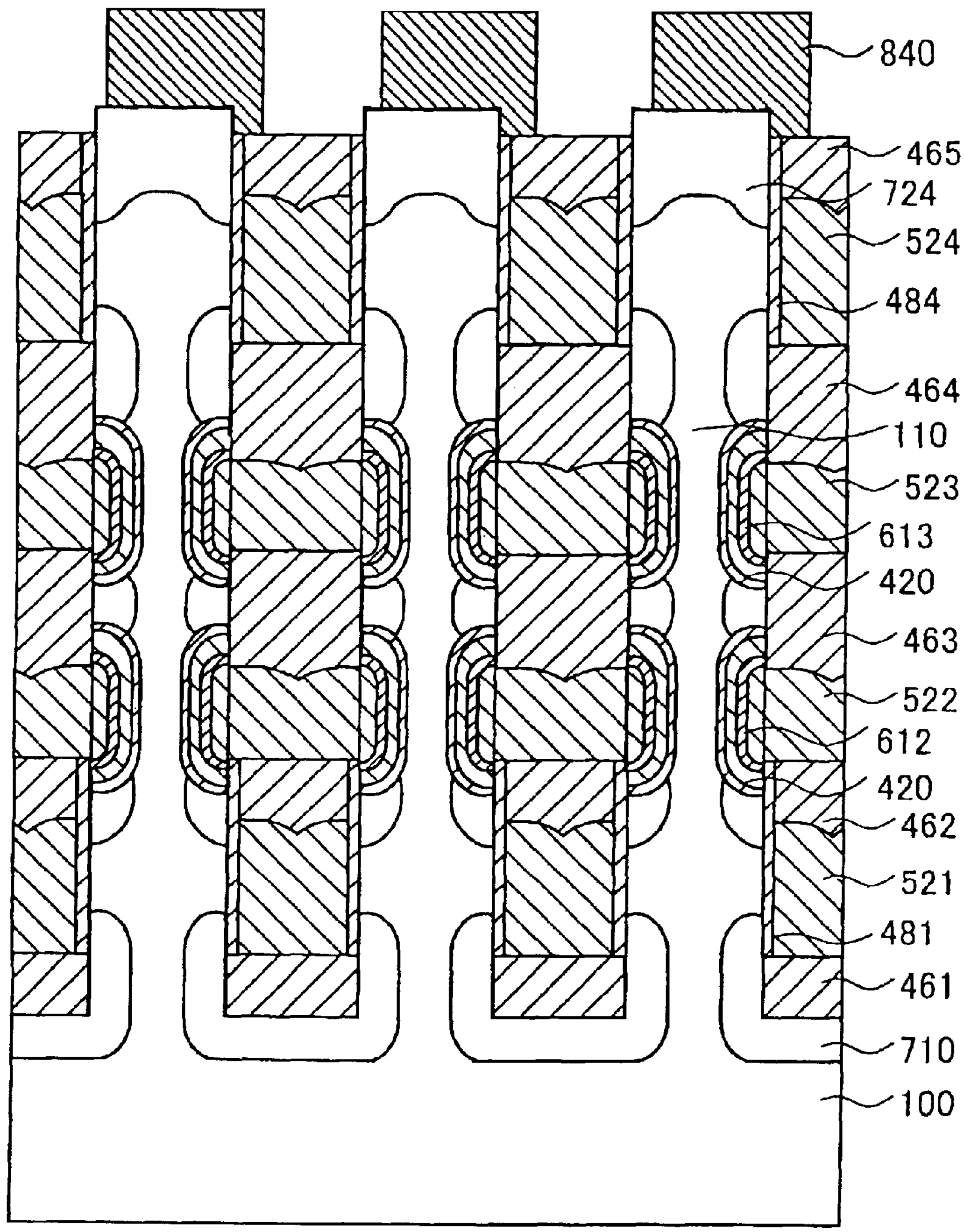
Figure 329:
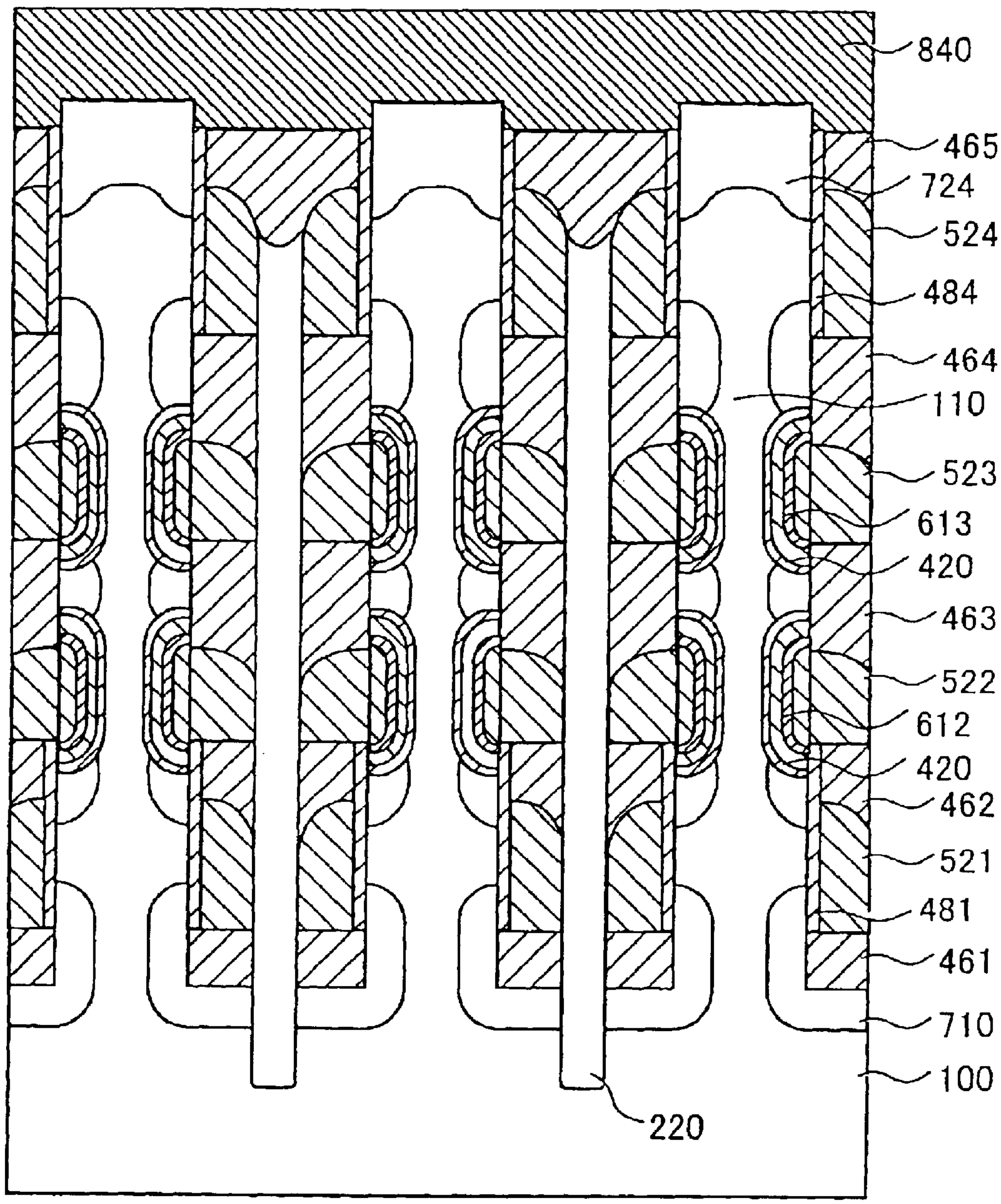

For example, in the case where the second trench 220 is formed in the self-alignment manner by using the polysilicon film 524 as a mask, the silicon oxide film 465 (the eighth insulating film) cannot be buried completely in the thus formed second trench 220 and a hollow is made in the trench as shown in FIG. 328 and FIG. 329. However, this is permissible as long as the hollow serves as an air gap and establishes the insulation between the control gate lines and the selection gate lines.

Figure 330:
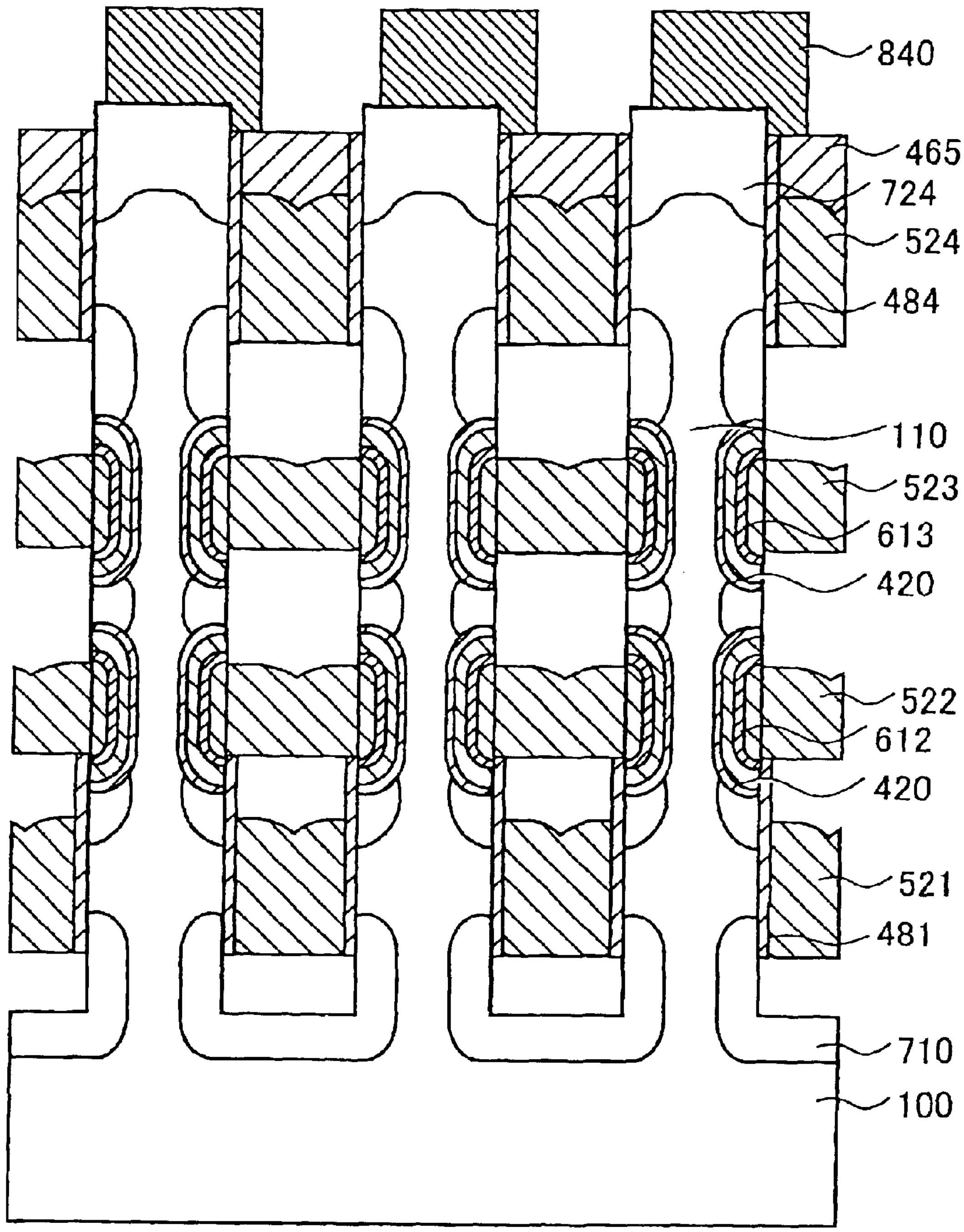
Figure 331:
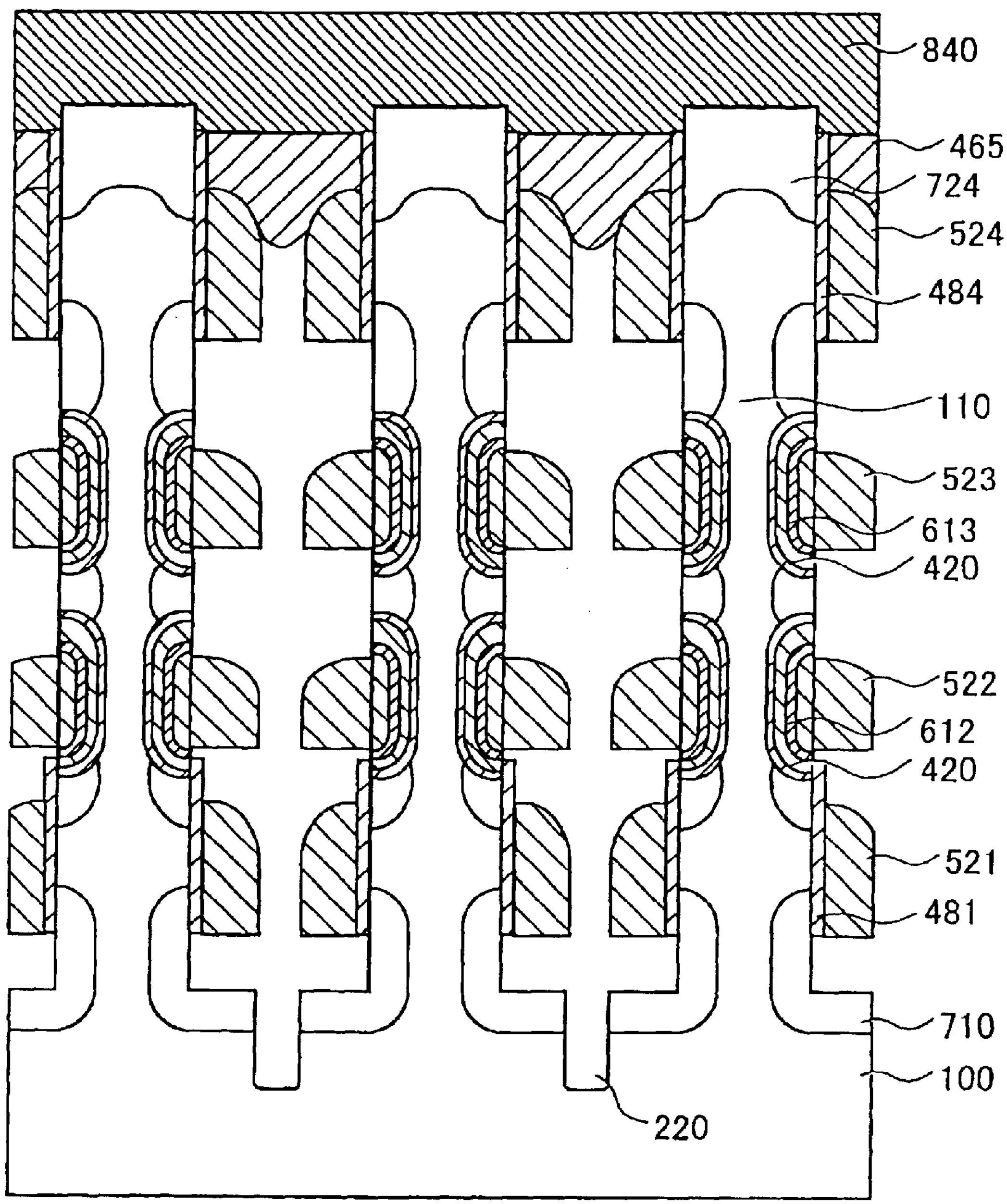

Further, as shown in FIG. 330 and 331, the silicon oxide film may selectively be removed before the silicon oxide film 465 is buried in the second trench 220.

As described above, the presence of the hollow realizes a low dielectric constant. Accordingly, the obtained semiconductor memory is expected to show suppressed parasitic capacitance and high speed characteristics.

PRODUCTION EXAMPLE 36

Explanation is given of an example of production process for producing a semiconductor memory in which the floating gate and the island-like semiconductor layer 110 have different outer circumferences. FIGS. 332 and 333 and FIGS. 334 and 335 are sectional views taken on line A–A' and line B–B', respectively, in FIG. 1 which is a cross-sectional view illustrating a memory cell array of an EEPROM.

Figure 332:
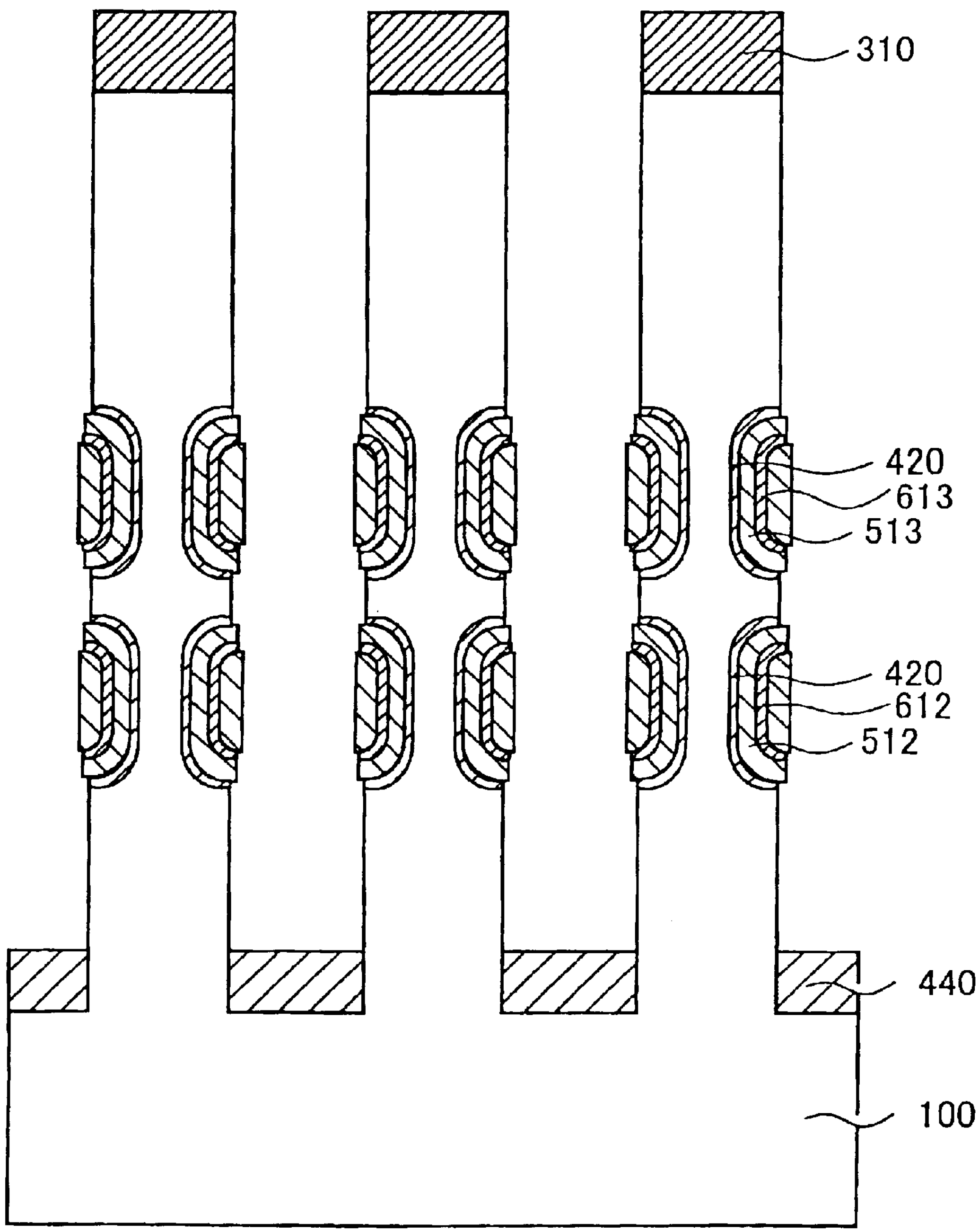
Figure 333:
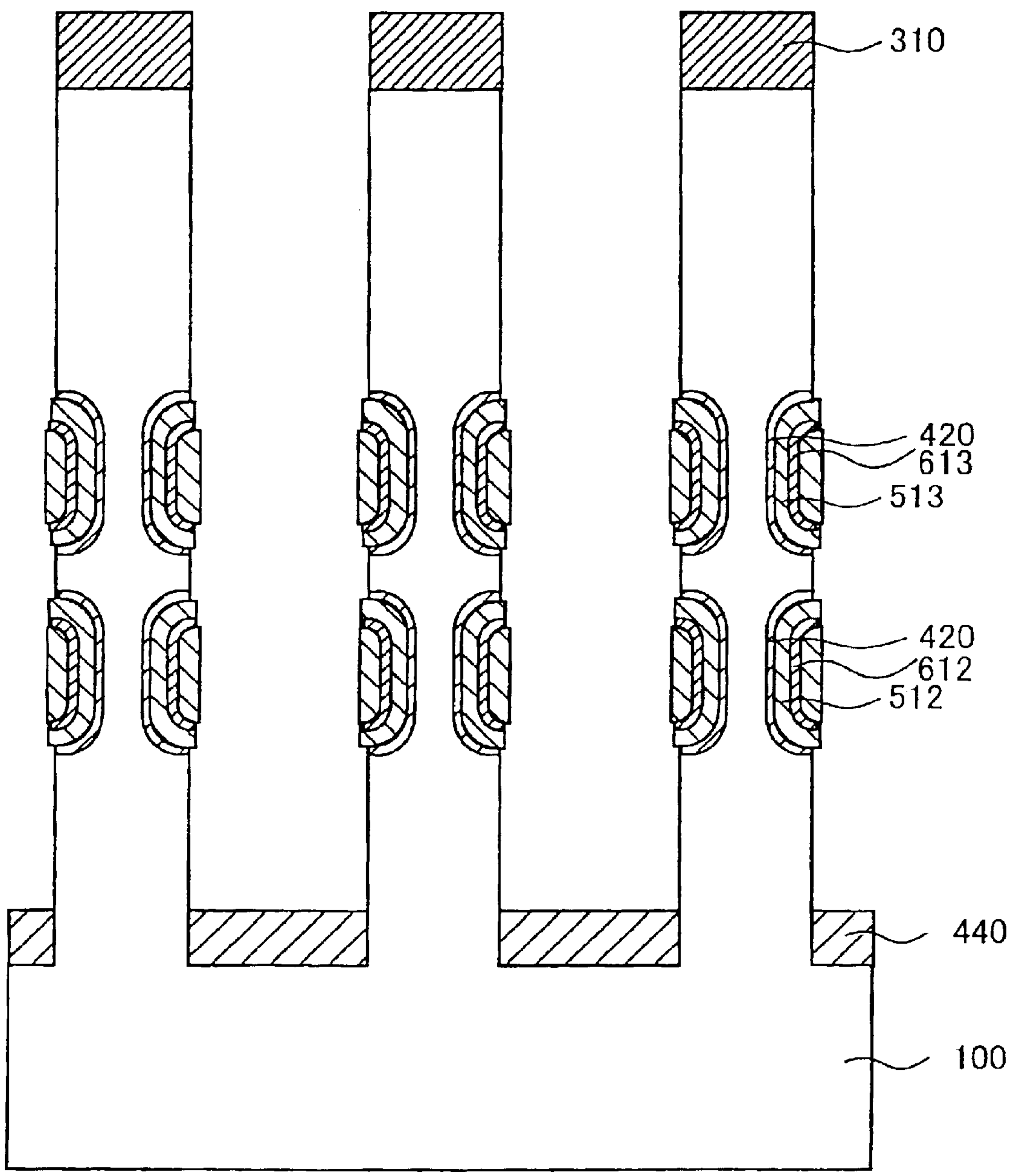

In the semiconductor memory explained in Production example 20, the floating gate and the island-like semiconductor layer 110 have equal outer circumference. However, the outer circumference of the floating gate may be different from that of the island-like semiconductor layer 110. The outer circumference of the control gate may also be different from that of the floating gate or the island-like semiconductor layer 110. More specifically, after the polysilicon films 512 and 513 to be the first conductive films are buried in the recesses formed on the sidewall of the island-like semiconductor layer 110 as explained in Production example 20, a silicon oxide film 440 is buried. At this time, a portion of the silicon oxide film 420 which is not buried in the recesses is removed. Therefore, as shown in FIG. 332 and FIG. 333, the outer circumferences of the polysilicon films 512 and 513 become larger than the outer circumference of the island-like semiconductor layer 110 by the thickness of the silicon oxide film 420. However, the outer circumference of the floating gate may be larger or smaller than that of the island-like semiconductor layer 110. A relationship between the outer circumferences is not important.

Further, the outer circumference of the control gate may also be larger or smaller than that of the floating gate or the island-like semiconductor layer 110. A relationship among them is not important.

Figure 334:
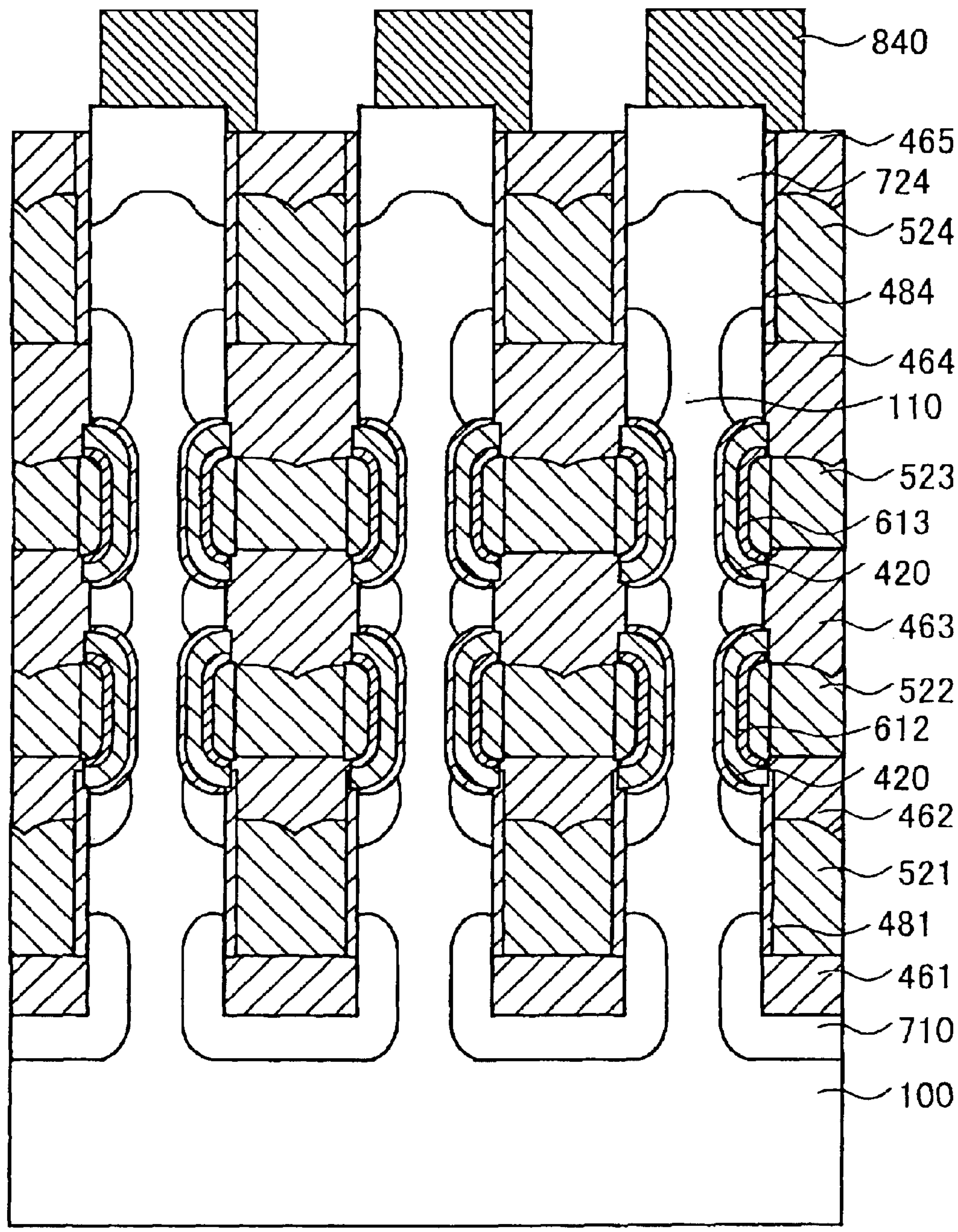
Figure 335:
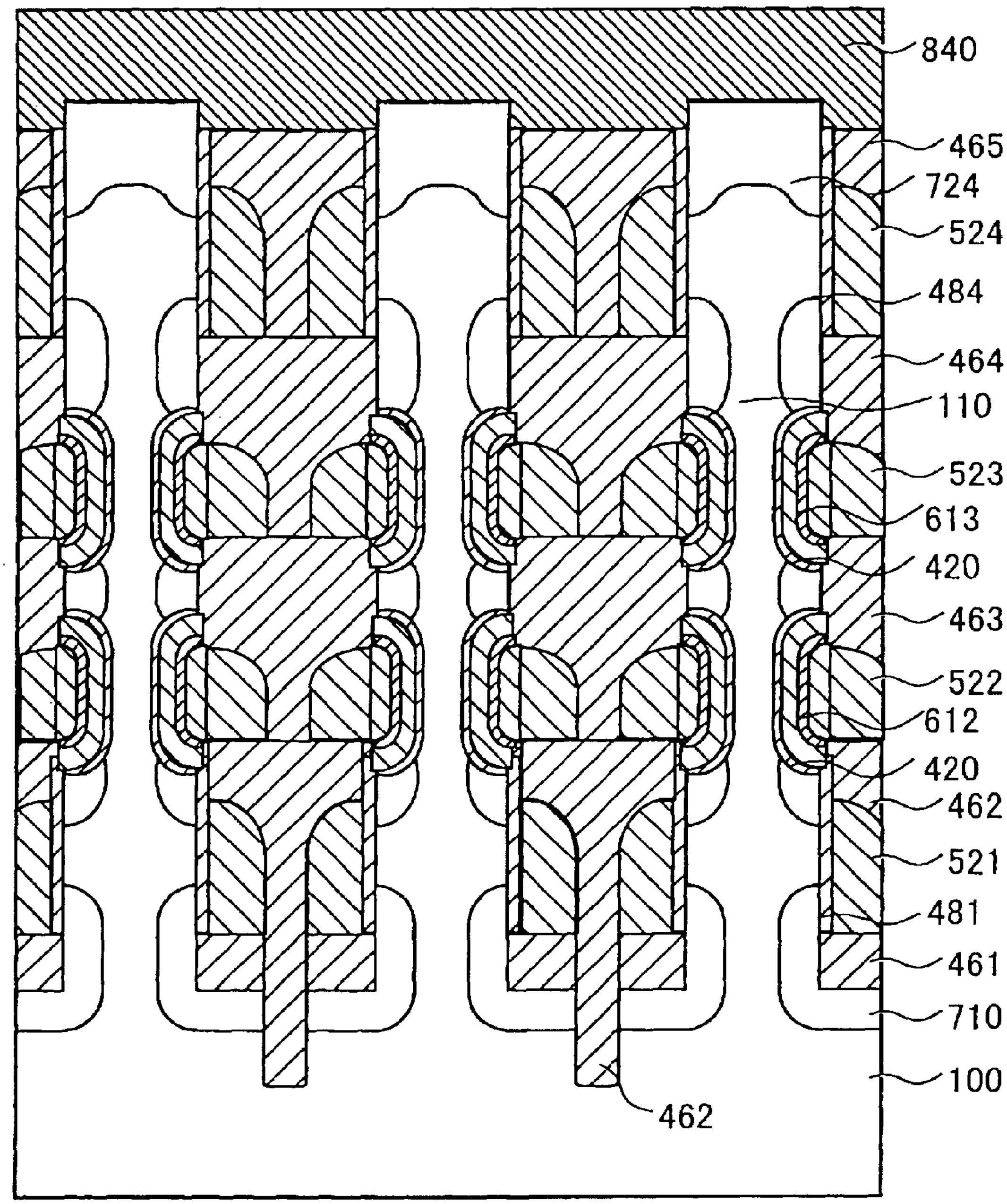
Figure 336:
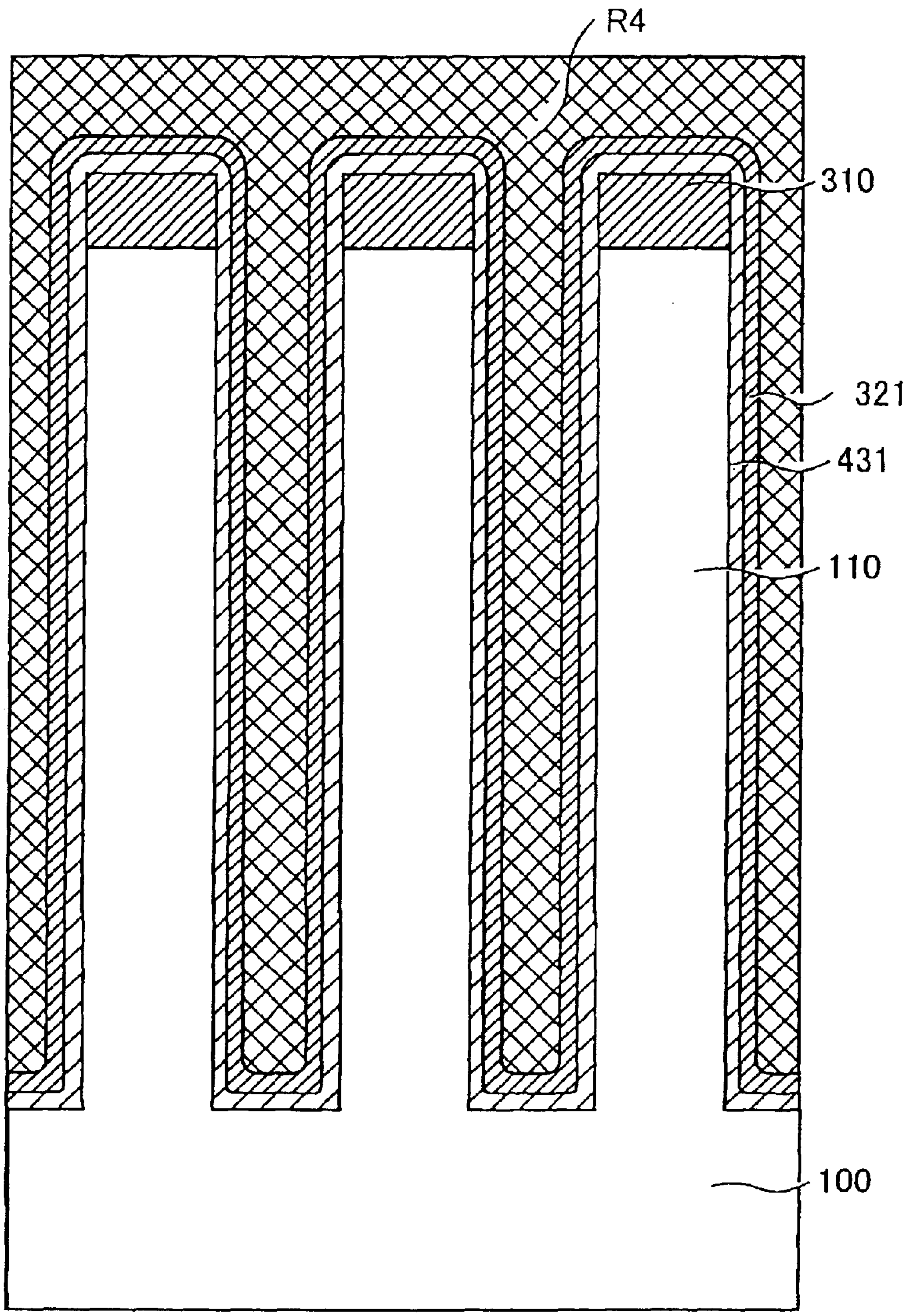

FIG. 334 and FIG. 335 show a completed semiconductor memory in which the outer circumference of the floating gate is larger than that of the island-like semiconductor layer 110 and the outer circumference of the control gate is larger than that of the floating gate.

PRODUCTION EXAMPLE 37

Explanation is given of an example of production process for producing a semiconductor memory in which a resist is used instead of the silicon oxide films 441 and 442 of Production example 20. FIGS. 336 to 340 and FIGS. 341 to 345 are sectional views taken on line A–A' and line B–B', respectively, in FIG. 1 which is a cross-sectional view illustrating a memory cell array of an EEPROM.

In the semiconductor memory of Production example 20, the silicon oxide films 441 and 442 (the sixth insulating films) are buried and used as a mask for forming the silicon nitride films 321 to 323 (the fourth insulating films) on the sidewall of the island-like semiconductor layer 110. However, the silicon oxide films 441 and 442 may be replaced with a resist.

Hereinafter, an example is given in further detail.

Figure 337:
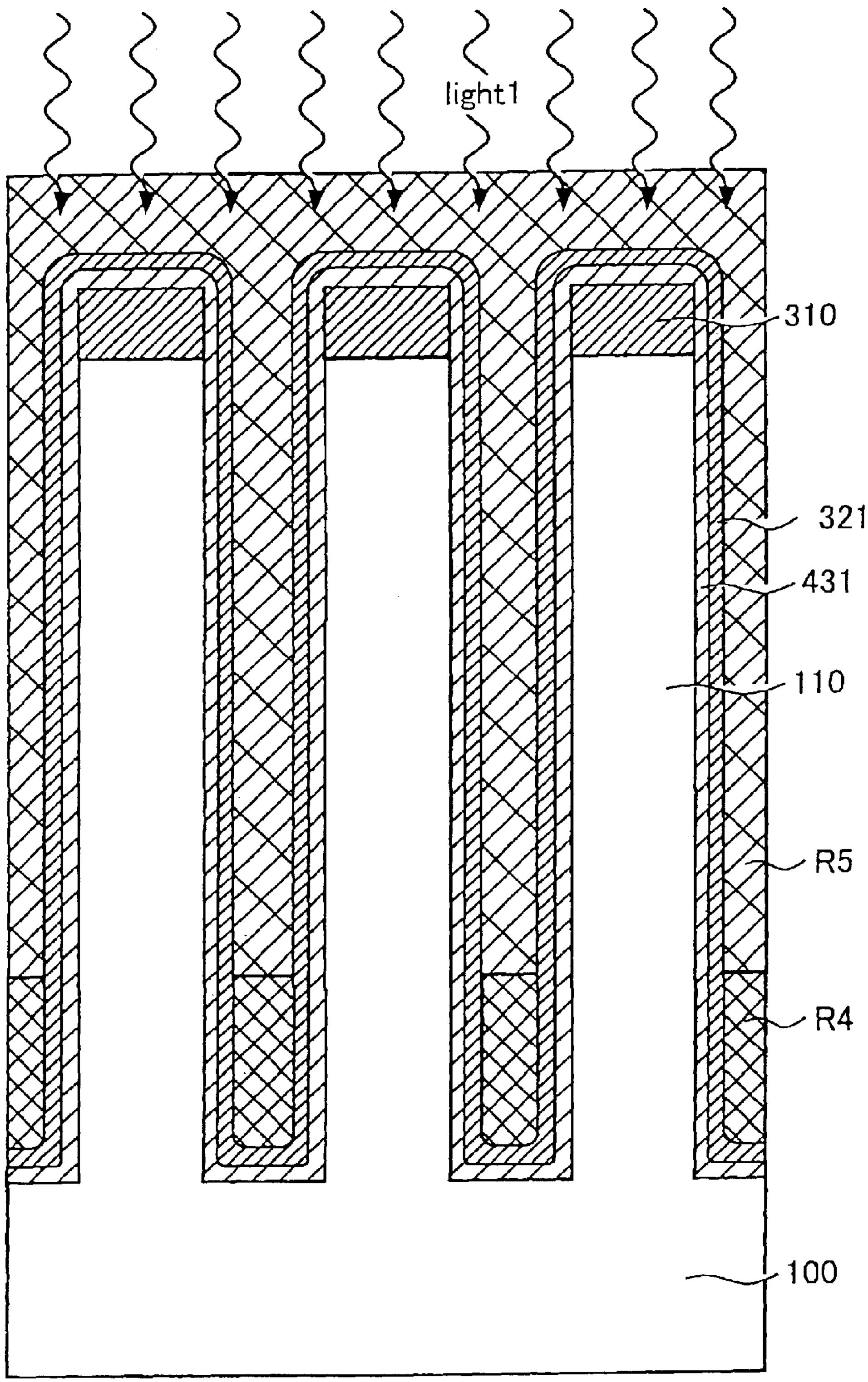
Figure 342:
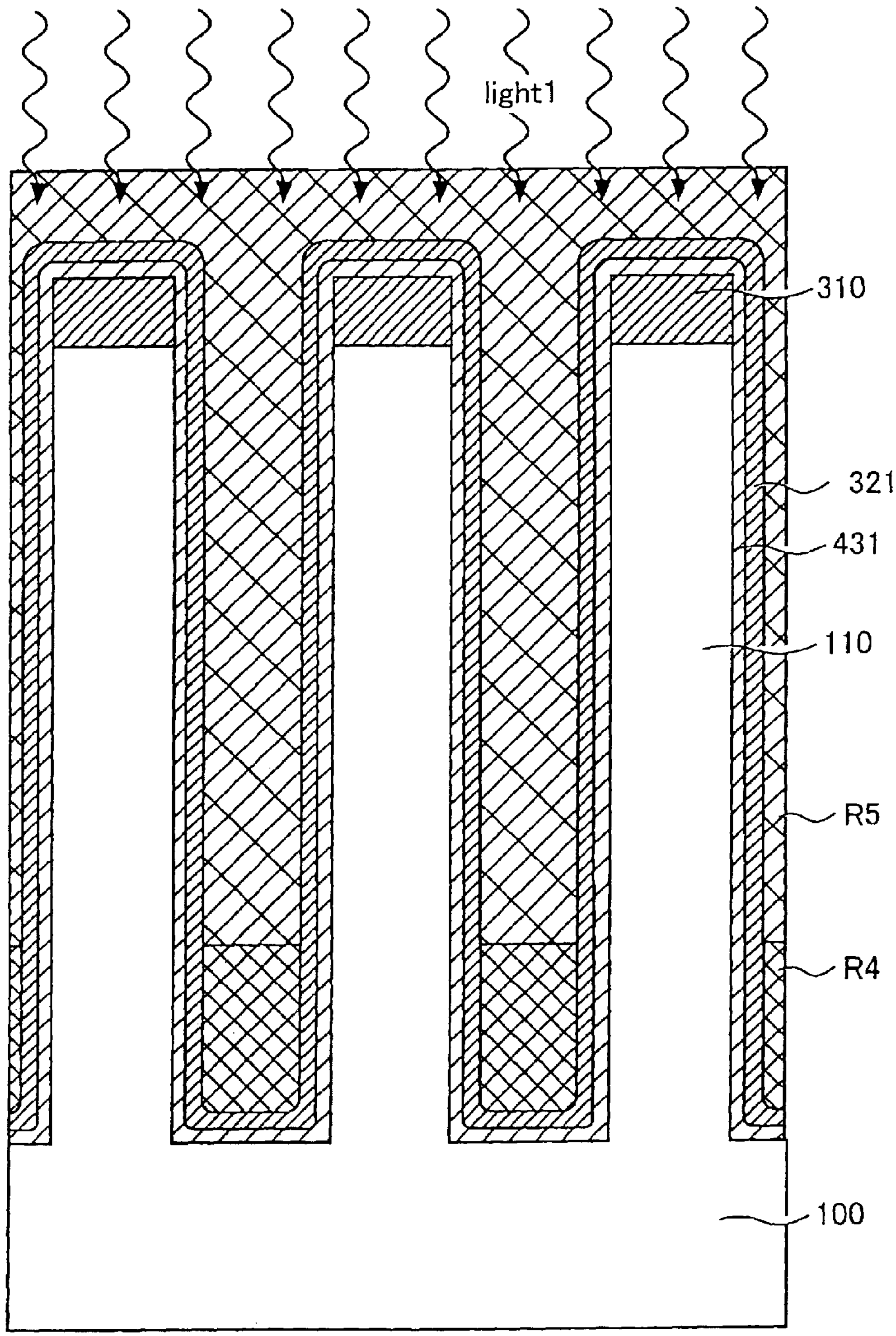

According to Production example 20, the silicon oxide film 321 is deposited as a fifth insulating film and the silicon oxide film 441 is deposited as a fourth insulating film. Further, a resist R4 is applied to a thickness of about 500 to 25,000 nm (FIG. 336 and FIG. 341) and irradiated with light 1 to be exposed to a desired depth (FIG. 337 and FIG. 342). The light exposure to the desired depth may be controlled by exposure time, an amount of light, or both of them. Means of controlling the light exposure including the following development step is not limited.

Figure 338:
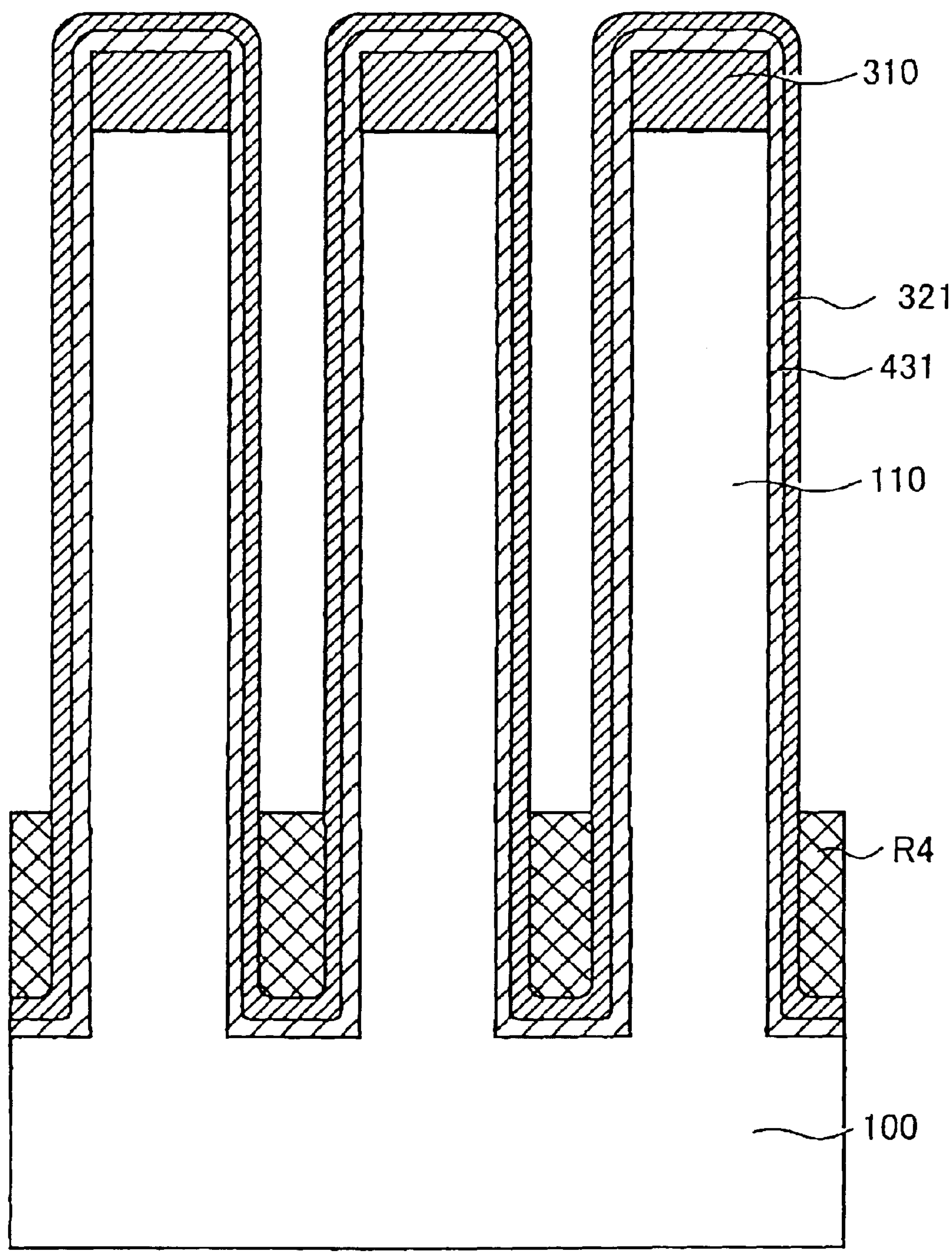
Figure 343:
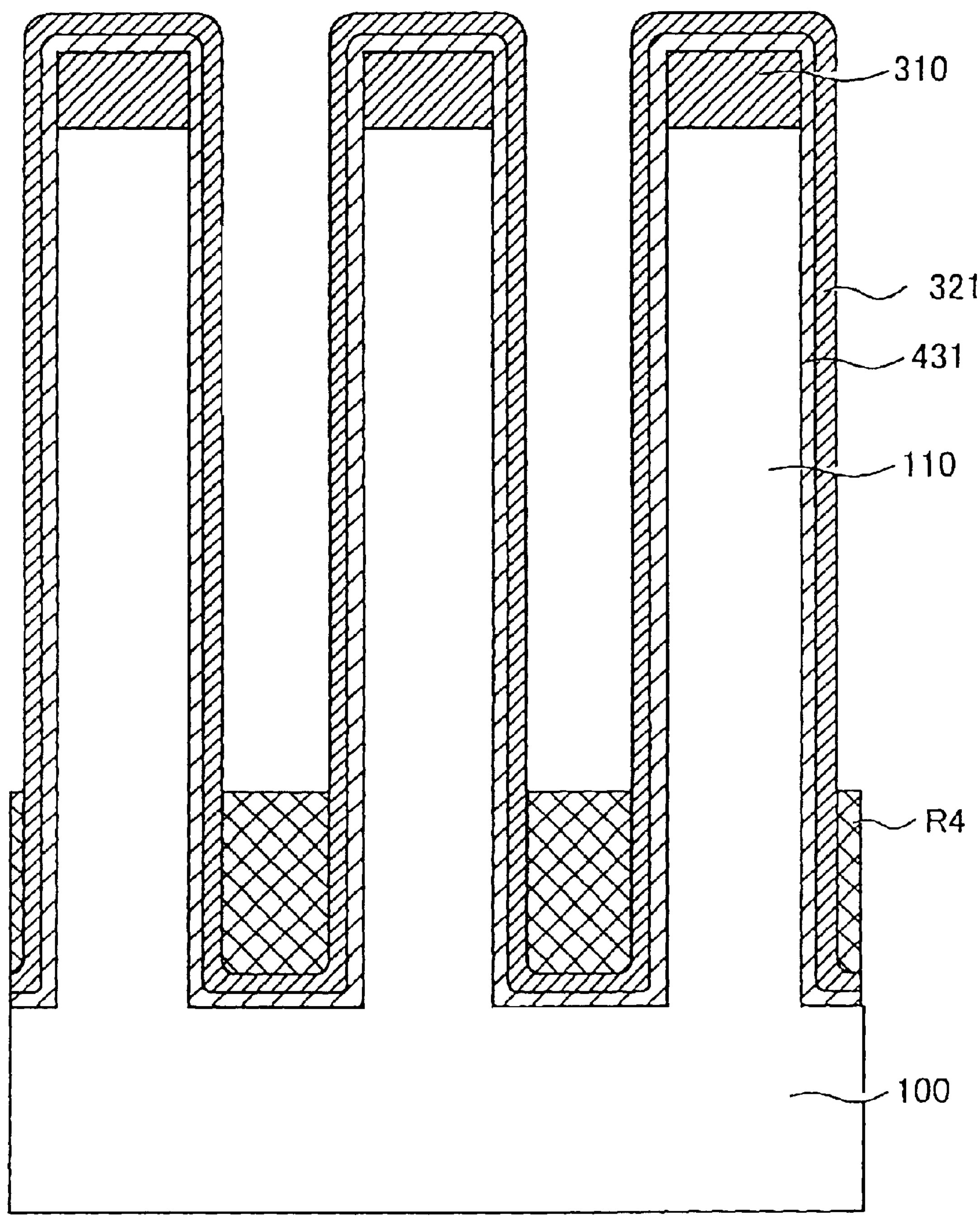

Subsequently, development is carried out by a known technique, and a resist R5, which is an exposed portion of the resist R4, is selectively removed and the resist R4 is buried (FIG. 338 and FIG. 343).

According to the thus performed light exposure, the resist can be etched back with good controllability and variations in device performance are expected to be suppressed. However, the resist R4 may be etched back by ashing, instead of the light exposure. Alternatively, the resist may be applied such that it is buried to a desired depth at the application thereof, without performing the etch back. At this time, it is desirable to use a low-viscosity resist. These techniques may be combined in various ways.

It is desired that the surface on which the resist R4 is applied is hydrophilic, for example, the resist R4 is desirably applied on the silicon oxide film.

Figure 339:
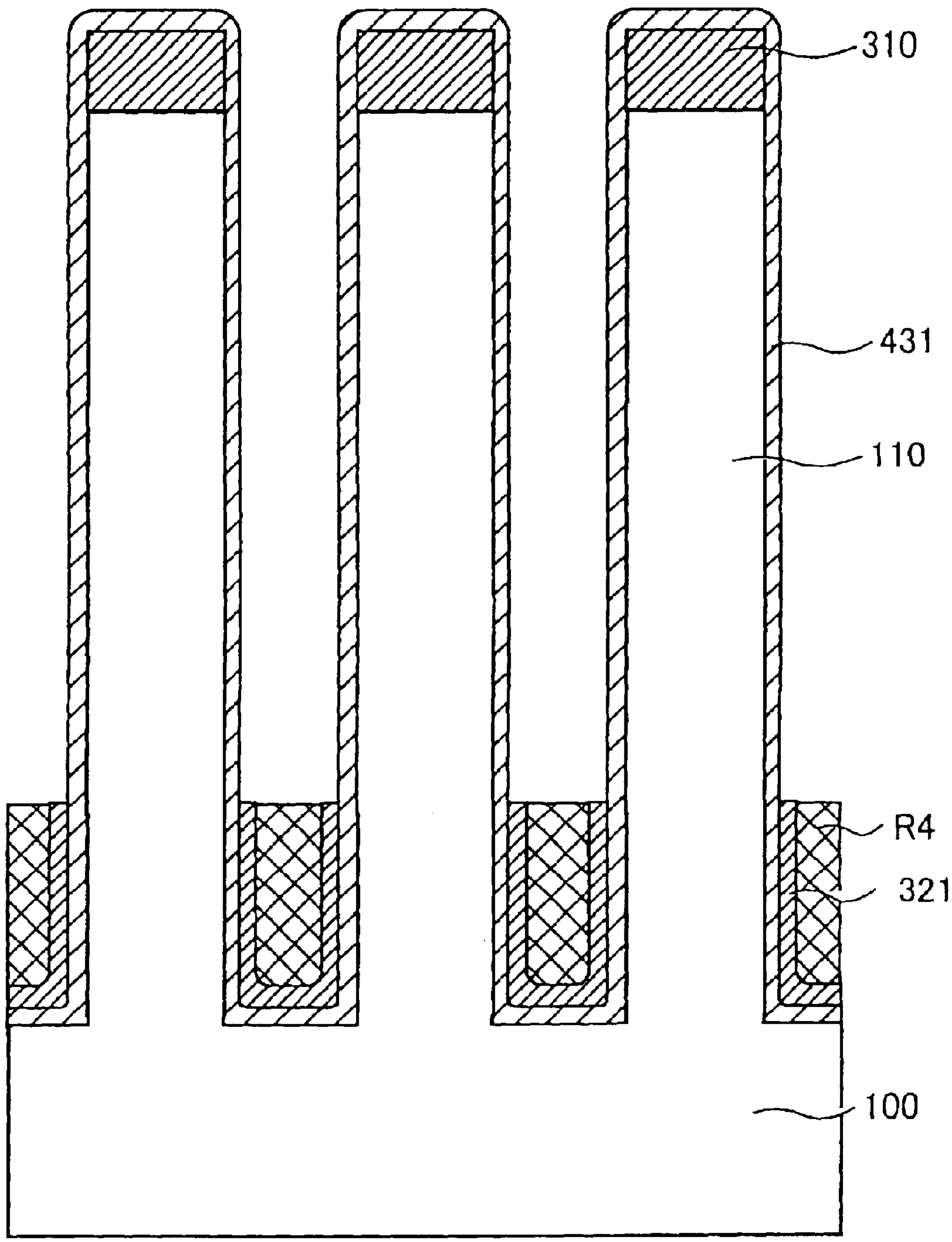
Figure 344:
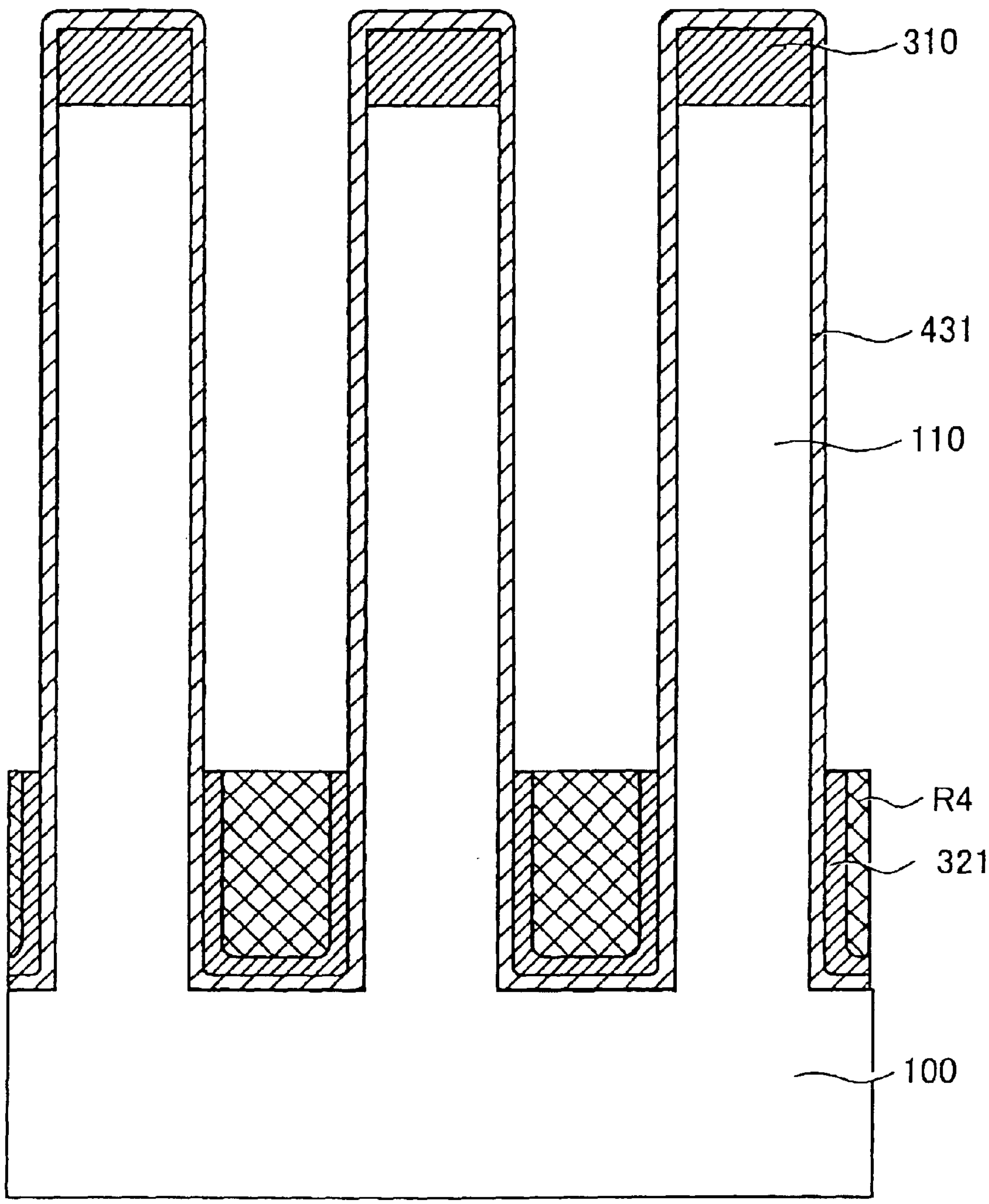

Thereafter, using the resist R4 as a mask, an exposed portion of the silicon nitride film 321 is removed by isotropic etching, for example (FIG. 339 and FIG. 344).

Figure 340:
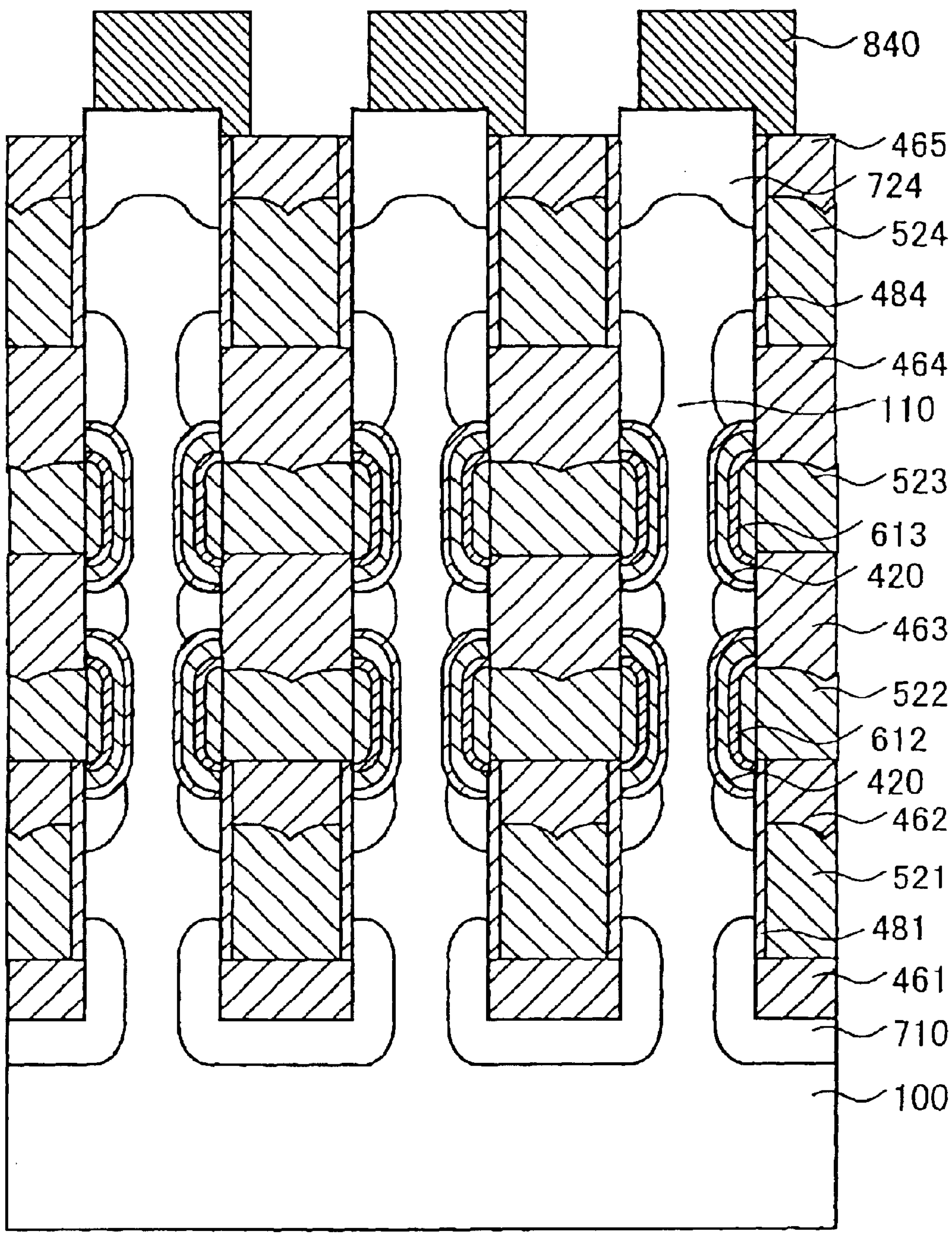
Figure 341:
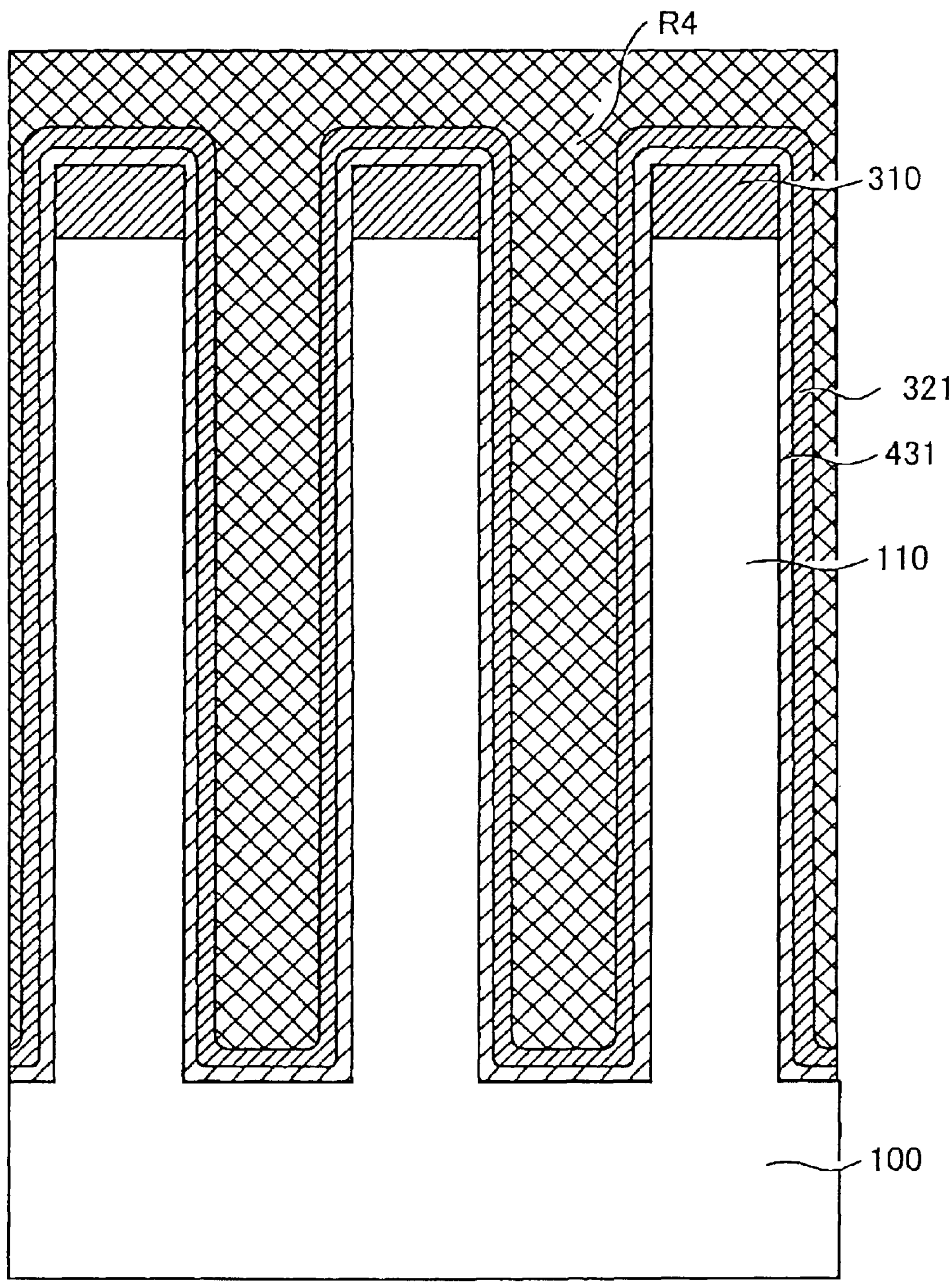
Figure 345:
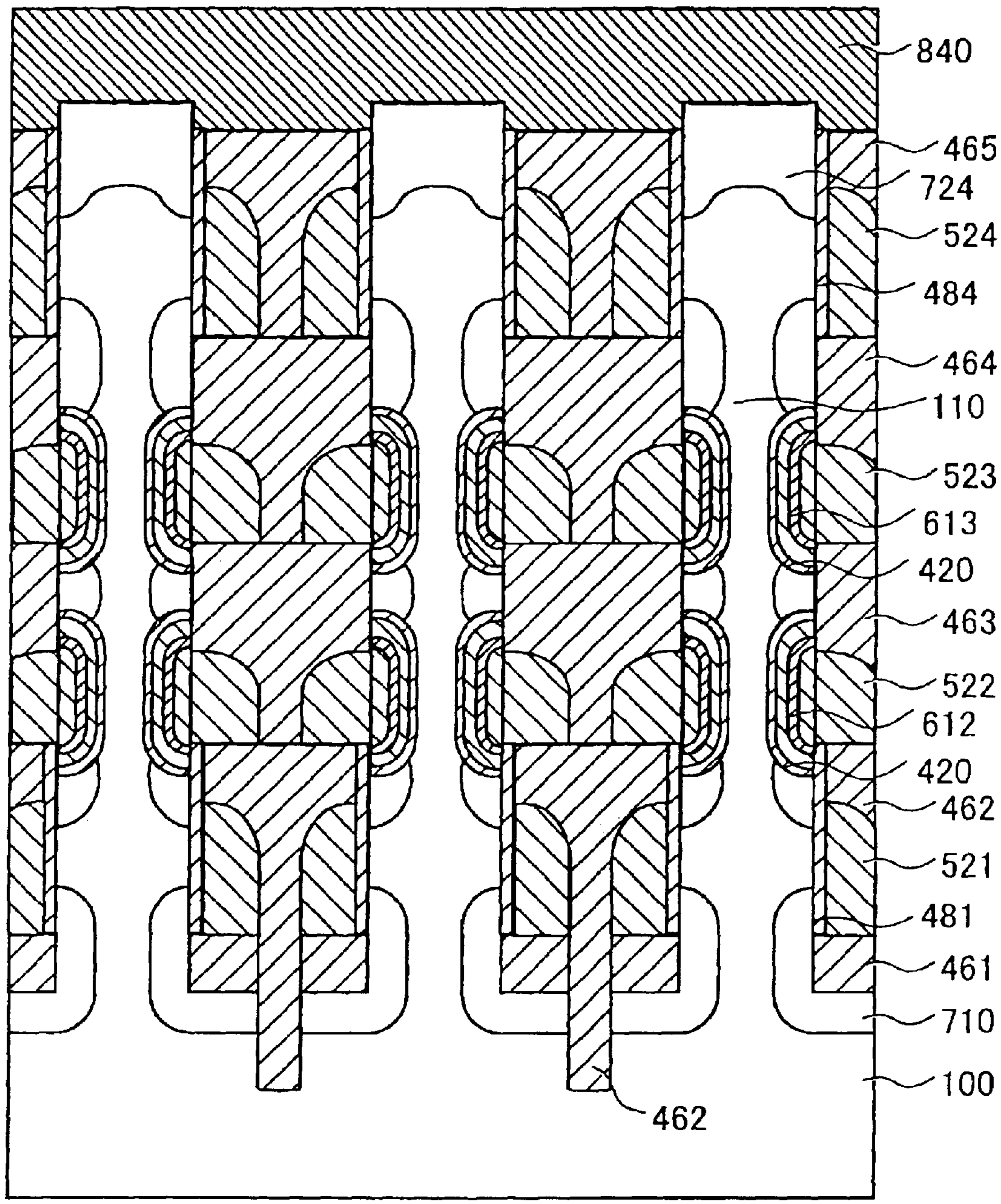

After the resist R4 is removed, production steps follow Production example 20. Thereby, a semiconductor memory is realized (FIG. 340 and FIG. 345).

By making use of the resist instead of the silicon oxide films 441 and 442, thermal history to the tunnel oxide film and the like is reduced and a rework can be done easily.

PRODUCTION EXAMPLE 38

In the semiconductor memory explained in Production example 20, the P-type silicon substrate 100 is patterned to form the island-like semiconductor layers 110 by using the resist R1 patterned by a known photolithography technique. In connection to this, explanation is given of an example of producing a semiconductor memory, in which the diameter of the island-like semiconductor layer 110, which is determined at the patterning of the resist R1, is increased. FIGS. 346 to 348 and FIGS. 349 to 351 are sectional views taken on line A–A' and line B–B', respectively, in FIG. 1 which is a cross-sectional view illustrating a memory cell array of an EEPROM.

In the semiconductor memory of Production example 20, the memory cells and the selection gate transistors are formed within the island-like semiconductor layers 110, so that intervals between the island-like semiconductor layers 110 in the memory cell array have a margin. Therefore, the diameter of the island-like semiconductor layers 110 may be increased without changing the intervals therebetween.

However, in the case where the island-like semiconductor layers 110 are formed at the minimum photoetching dimension to have the minimum diameter and the minimum intervals, it is impossible to decrease the intervals provided at the minimum photoetching dimension. Therefore, when the diameter of the island-like semiconductor layers 110 increases, the intervals between the island-like semiconductor layers 110 also increase. This is disadvantageous because the device capacitance decreases.

Hereinafter, explanation is given of an example of production process in which the diameter of the island-like semiconductor layers 110 is increased without increasing the intervals between the island-like semiconductor layers 110.

Figure 346:
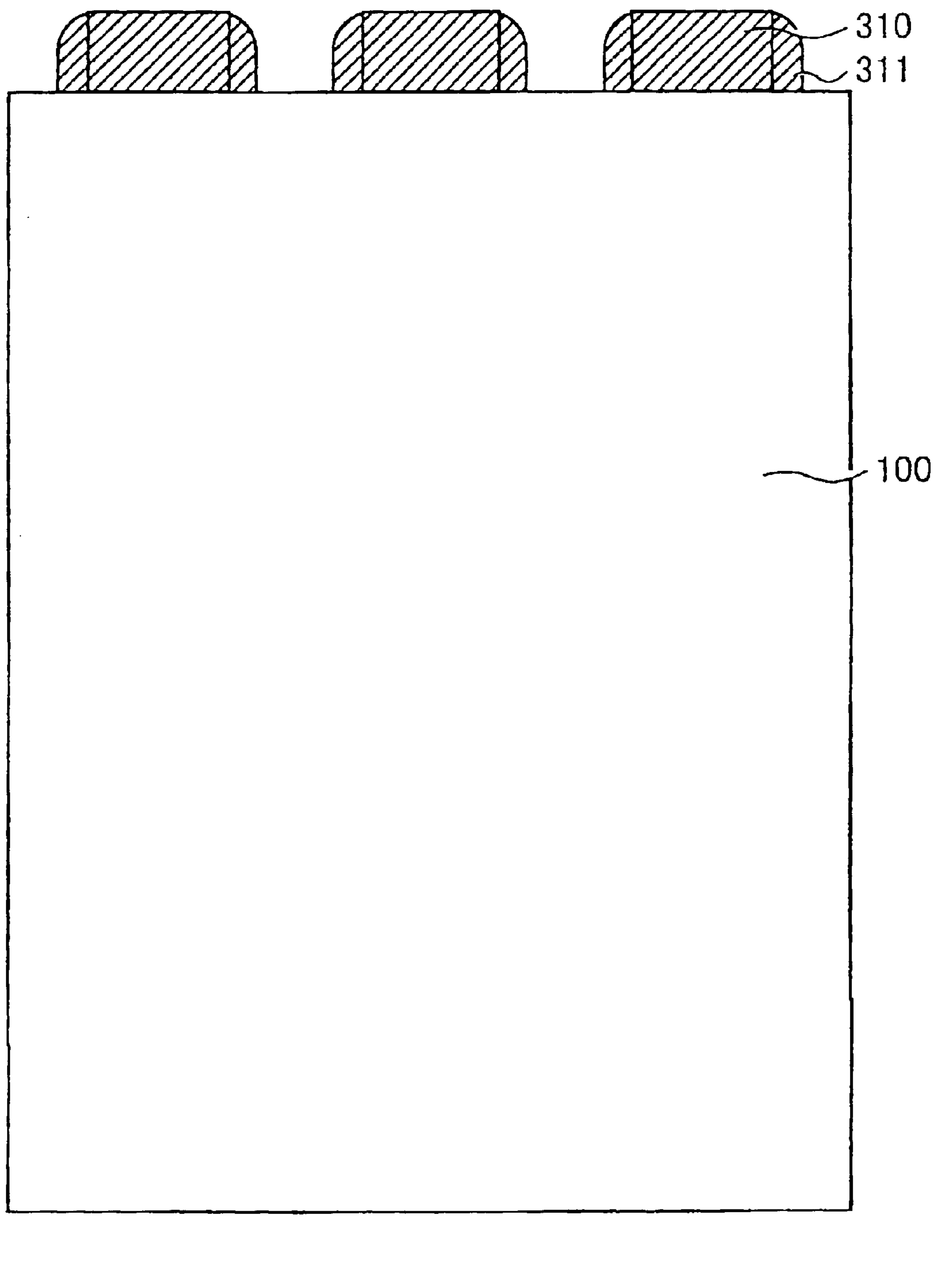
Figure 349:
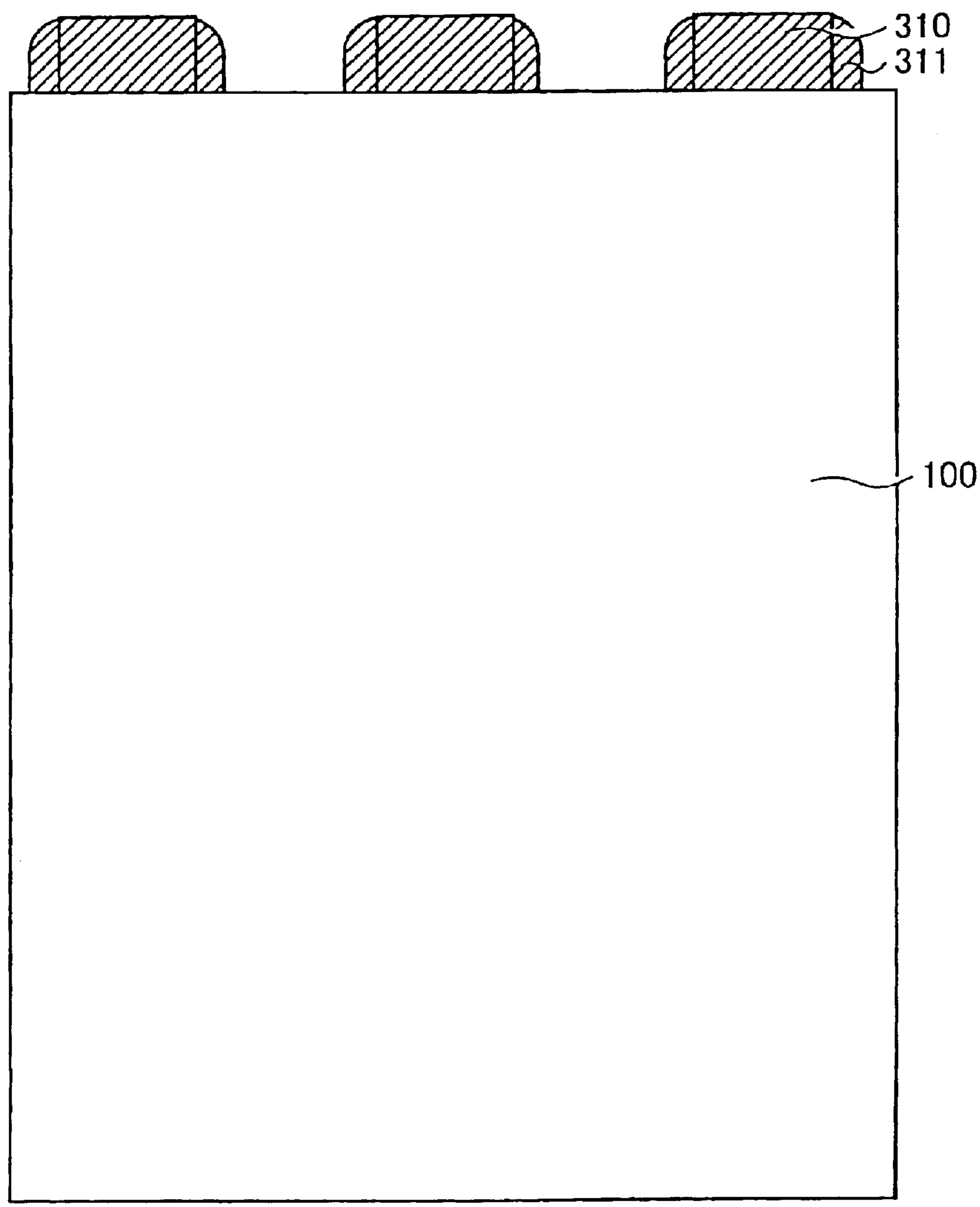

First, a silicon nitride film 310 is deposited to a thickness of 200 to 2,000 nm as a first insulating film to be a mask layer on a surface of a P-type silicon substrate 100 and then etched by reactive ion etching using a resist R1 patterned by a known photolithography technique as a mask as explained in Production example 20. Then, a silicon nitride film 311 is deposited to a thickness of 50 to 500 nm as a first insulating film and anisotropically etched by about a deposit thickness such that the silicon nitride film 311 remains in the form of a sidewall spacer on the sidewall of the silicon nitride film 310 (FIG. 346 and FIG. 349).

Figure 347:
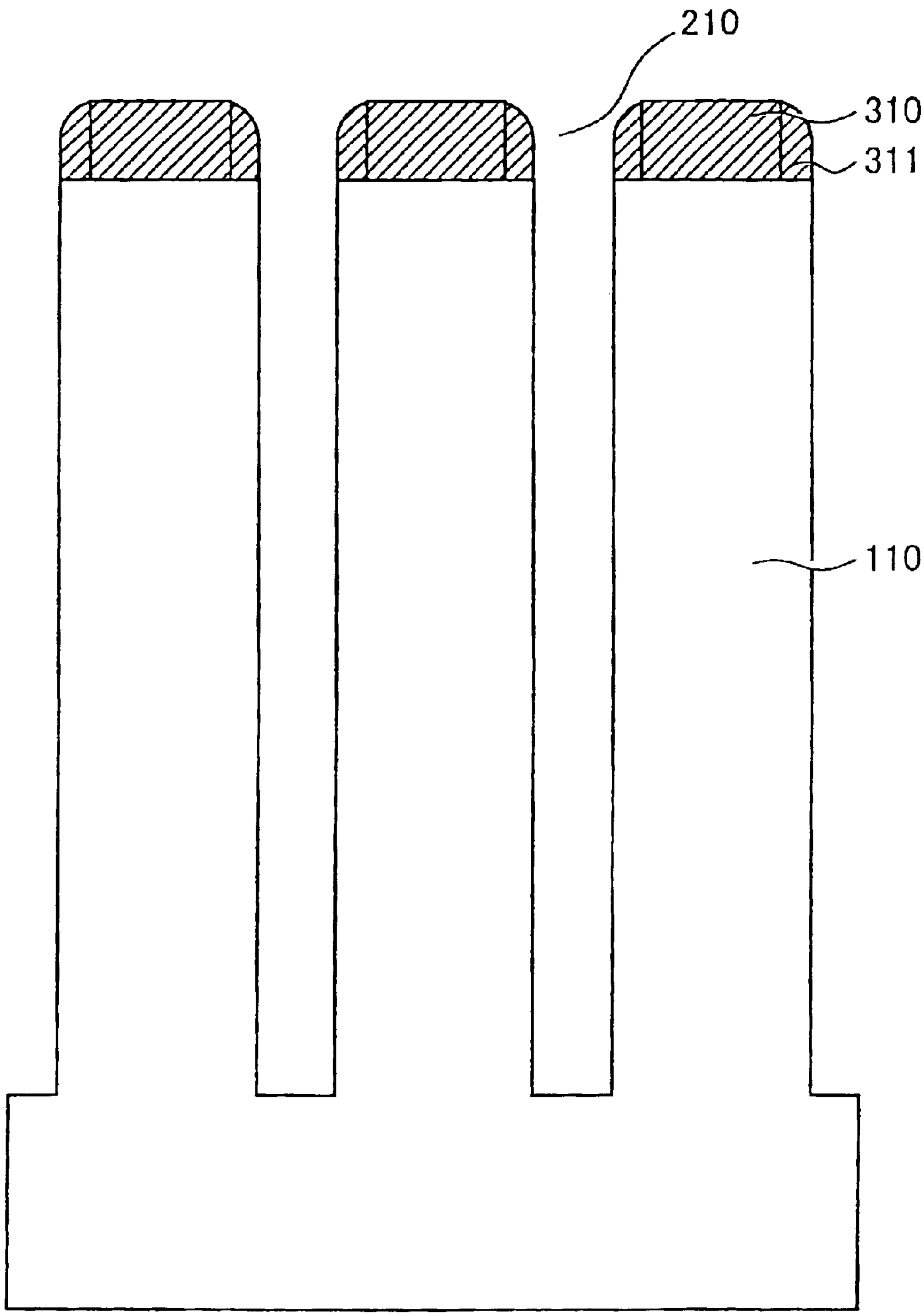
Figure 350:
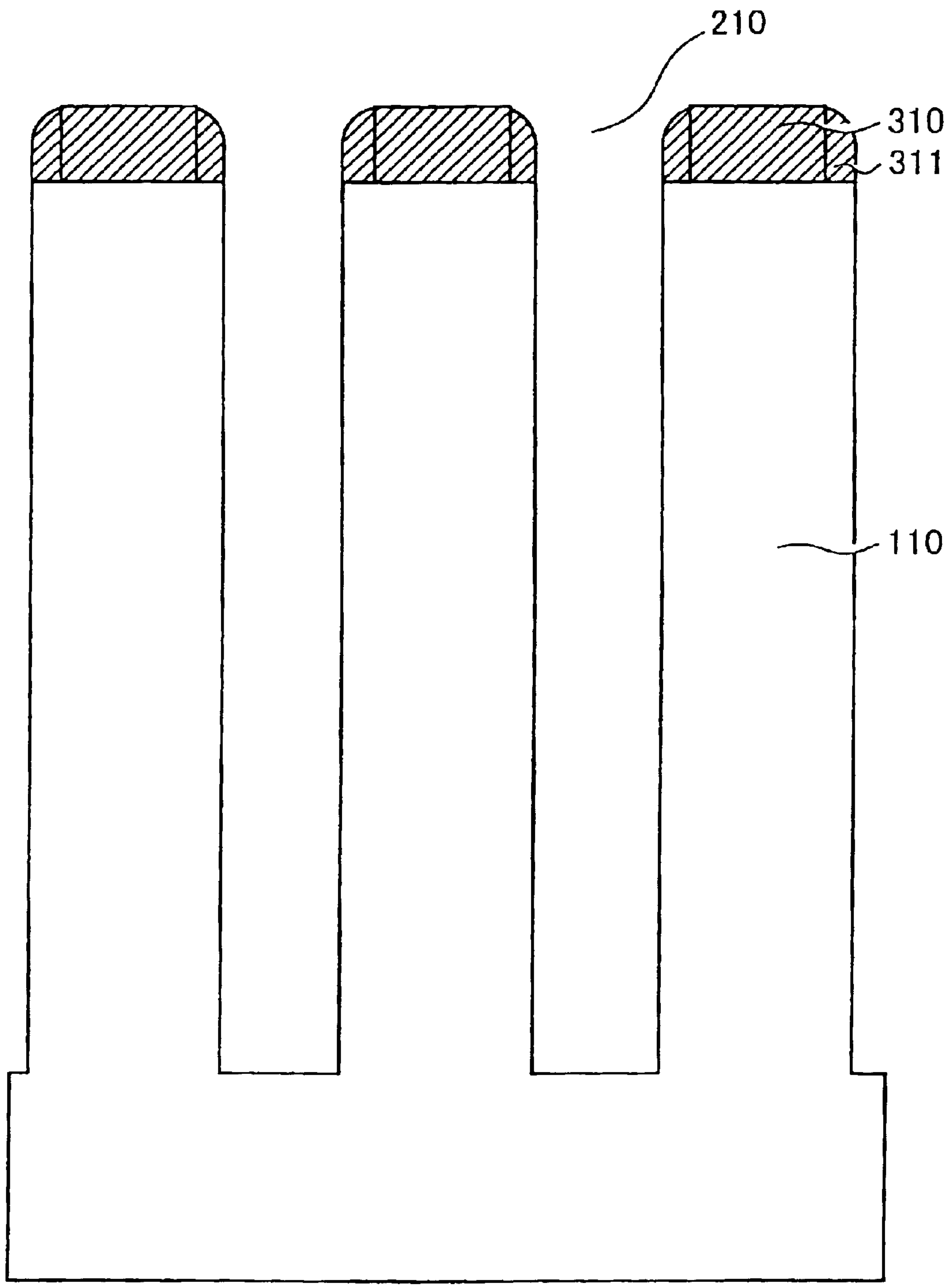

Using the silicon nitride films 310 and 311 as a mask, the P-type silicon substrate 100 is etched by 2,000 to 20,000 nm by reactive ion etching to form a first lattice-form trench 210. Thereby, the island-like semiconductor layers 110 are formed to have an increased diameter, which is determined at the patterning of the resist R1 (FIG. 347 and FIG. 350).

Figure 348:
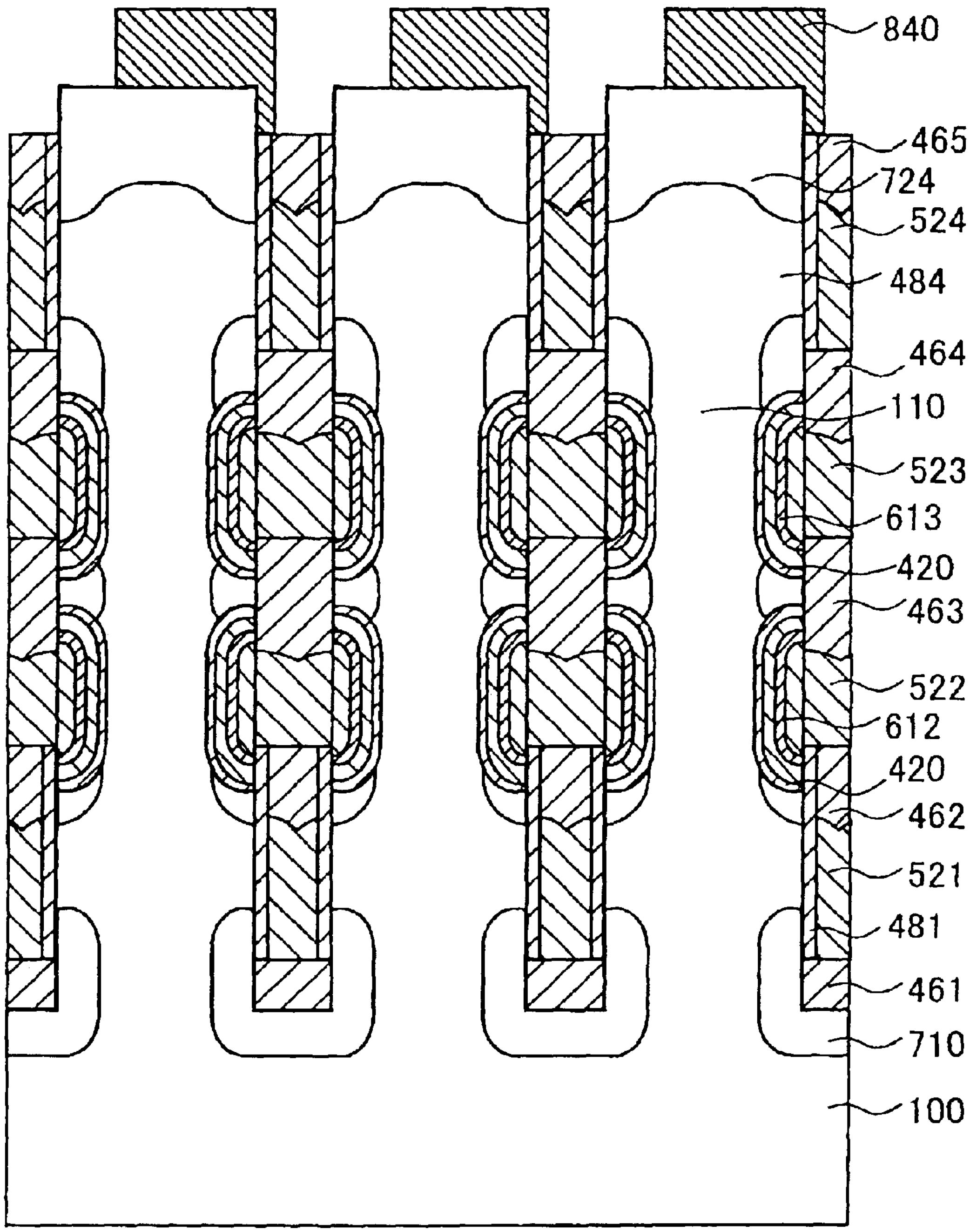
Figure 351:
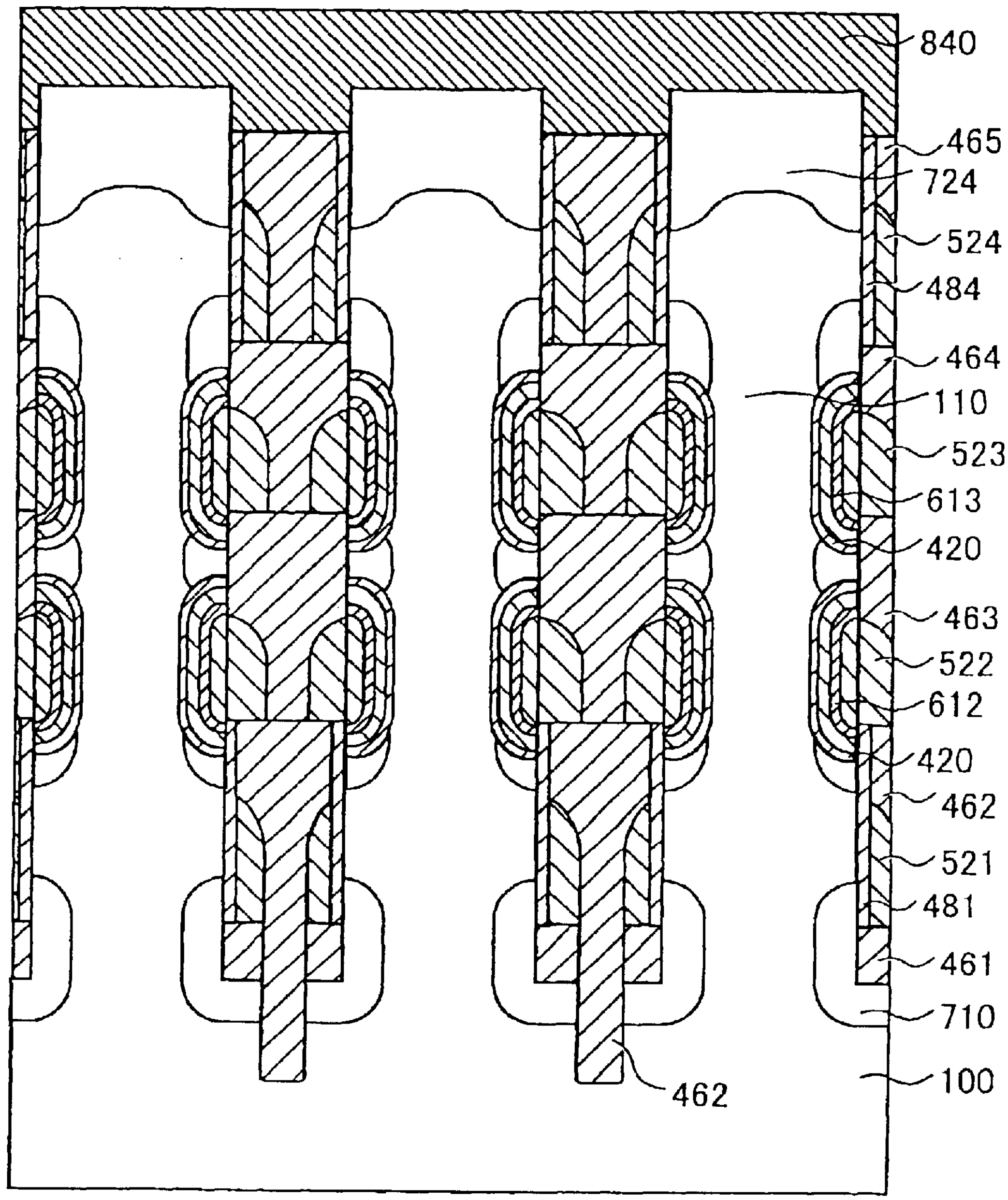

Production steps thereafter follow Production Example 20. Thereby, a semiconductor memory is realized which has a memory function according to the state of a charge in the charge storage layer which is the floating gate made of the polysilicon film as the first conductive film (FIG. 348 and FIG. 351).

Thus, the same effect as obtained by Production Example 20 is obtained. Owing to the increase of the diameter of the island-like semiconductor layers 110, resistance at the top and the bottom of the island-like semiconductor layer 110, i.e., resistance at a source and a drain, is reduced, driving current increases and cell characteristics improve. Further, the back-bias effect is expected to decrease due to the reduction of the source resistance. Moreover, since the open area ratio is reduced in the formation of the island-like semiconductor layers 110, the trench is easily formed by etching and the amount of reaction gas used for the etching is reduced, which allows the reduction of process costs.

PRODUCTION EXAMPLE 39

In a semiconductor memory to be produced in this example, a semiconductor substrate is patterned in the form of pillars to form island-like semiconductor layers having at least one recess. Sides of the island-like semiconductor layers make active regions. Tunnel oxide films and floating gates as charge storage layers are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Such a semiconductor memory is produced by the following production process. FIGS. 352 to 377 and FIGS. 378 to 403 are sectional views taken on line A–A' and line B–B', respectively, in FIG. 1 which is a cross-sectional view illustrating a memory cell array of an EEPROM.

Figure 352:
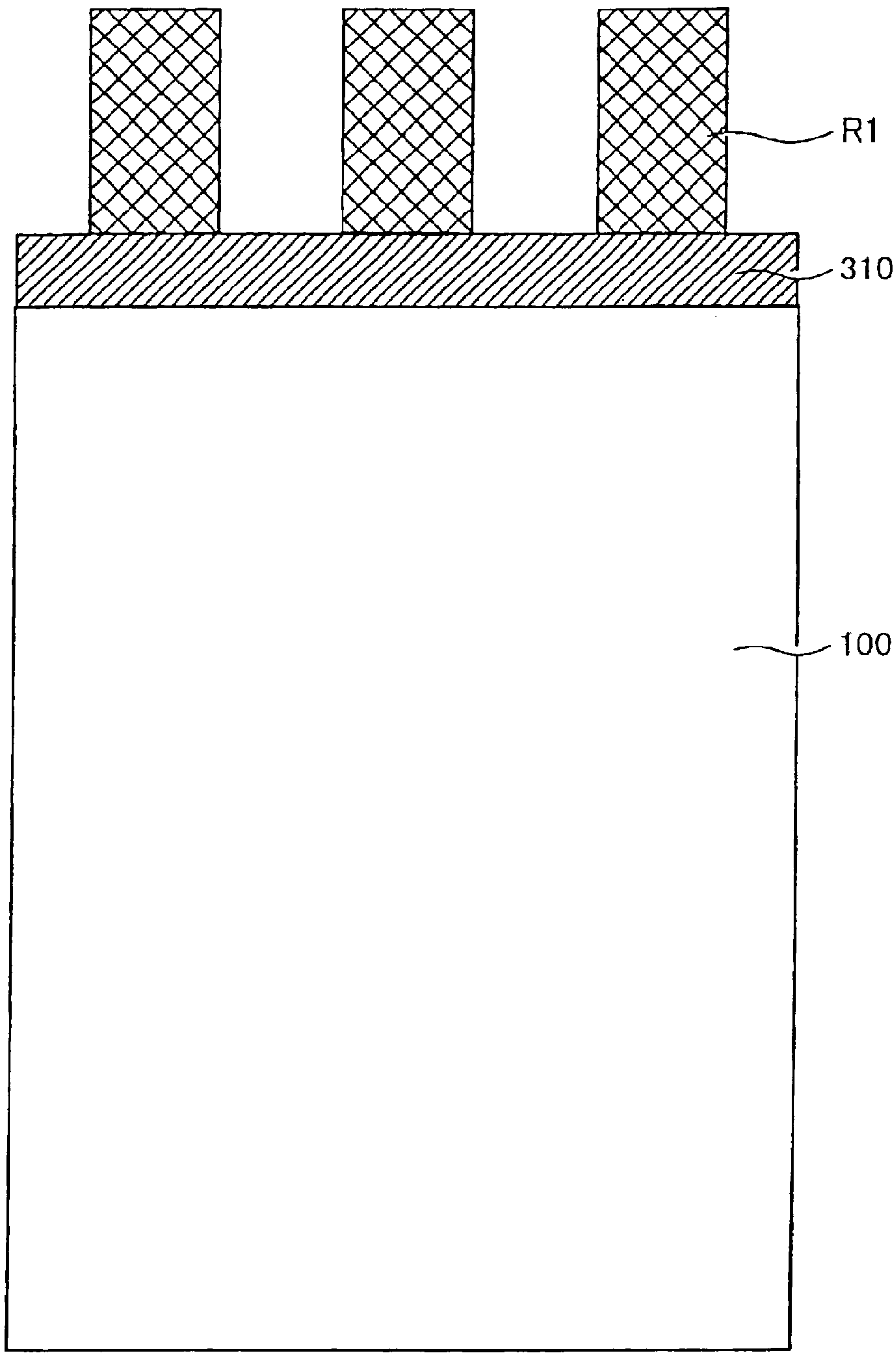
Figure 378:
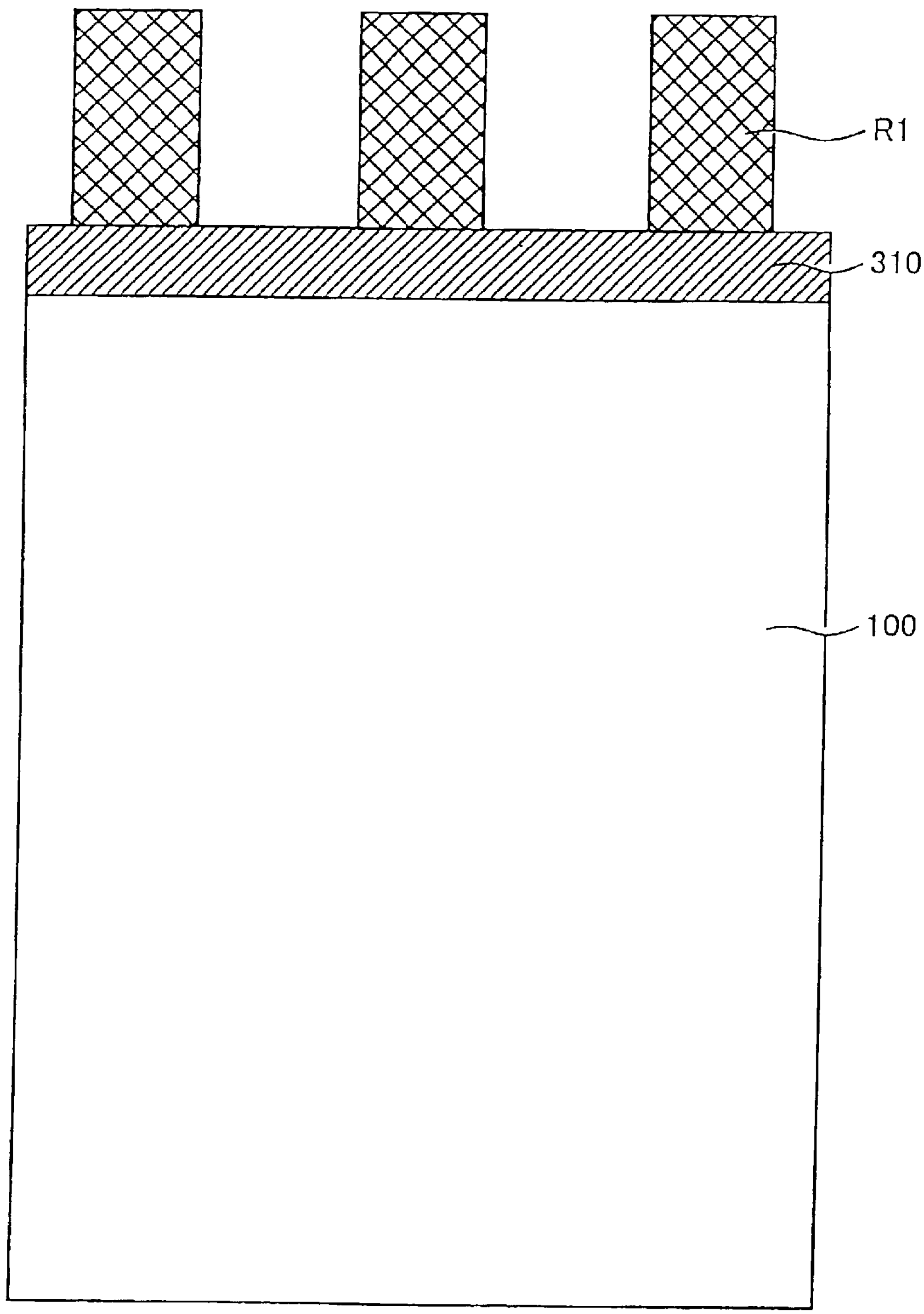

In this production example, a silicon nitride film 310 is deposited to a thickness of 200 to 2,000 nm as a first insulating film to be a mask layer on a surface of a P-type silicon substrate 100, and a resist R1 patterned by a known photolithography technique is used as a mask (FIG. 352 and FIG. 378).

Figure 353:
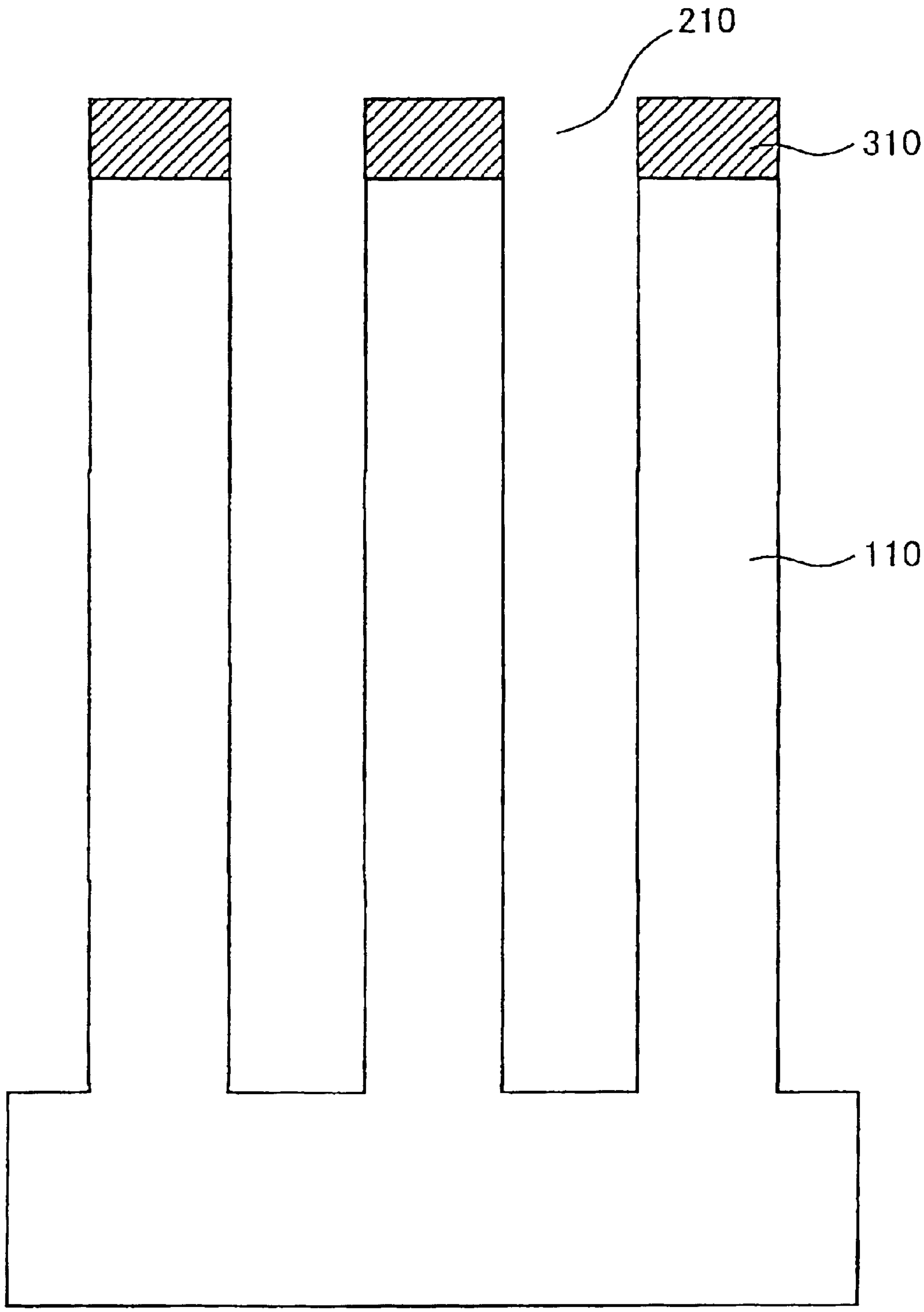
Figure 379:
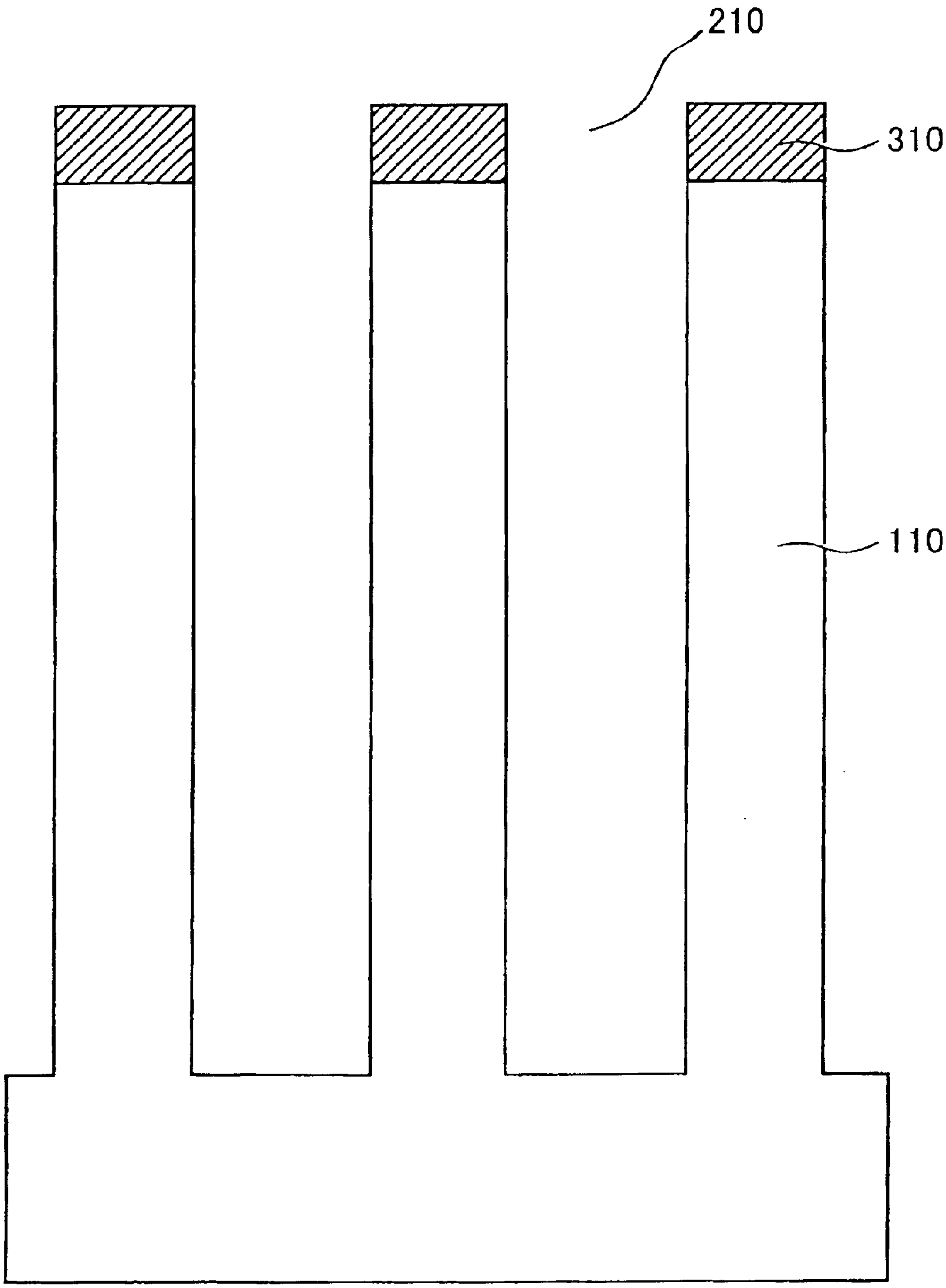

The silicon nitride film 310 is etched by reactive ion etching. Using the silicon nitride film 310 as a mask, the P-type silicon substrate 100 is etched by 2,000 to 20,000 nm by reactive ion etching to form a first trench 210 in a lattice form (FIG. 353 and FIG. 379). Thereby, the P-type silicon substrate 100 is divided into a plurality of columnar island-like semiconductor layers 110.

Thereafter, as required, the surface of the island-like semiconductor layer 110 is oxidized to form a thermally oxidized film 410 having a thickness of 10 to 100 nm as a second insulating film. At this time, if the island-like semiconductor layer 110 has been formed at the minimum photoetching dimension, the dimension of the island-like semiconductor layer 110 is decreased by the formation of the thermally oxidized film 410, that is, the island-like semiconductor layer 110 is formed to have a dimension smaller than the minimum photoetching dimension.

Next, the thermally oxidized film 410 is etched away from the periphery of each island-like semiconductor layer 110 by isotropic etching. Then, as required, channel ion implantation is carried out into the sidewall of the island-like semiconductor layer 110 by utilizing slant ion implantation. For example, the ion implantation may be performed at an implantation energy of 5 to 100 keV at a boron dose of about $1\times10^{11}$ to $1\times10^{13}/cm^2$ at an angle of 5 to 45° with respect to the normal line of the surface of the substrate. Preferably the channel ion implantation is performed from various directions to the island-like semiconductor layers 110 because a surface impurity concentration becomes more uniform. Alternatively, instead of the channel ion implantation, an oxide film containing boron may be deposited by CVD with a view to utilizing diffusion of boron from the oxide film.

The impurity implantation from the surface of the island-like semiconductor layers 110 may be carried out before the island-like semiconductor layers are covered with the thermally oxidized film 410, or the impurity implantation may be finished before the island-like semiconductor layers 110 are formed. Means for the implantation are not particularly limited so long as an impurity concentration distribution is almost equal over the island-like semiconductor layers 110.

Figure 354:
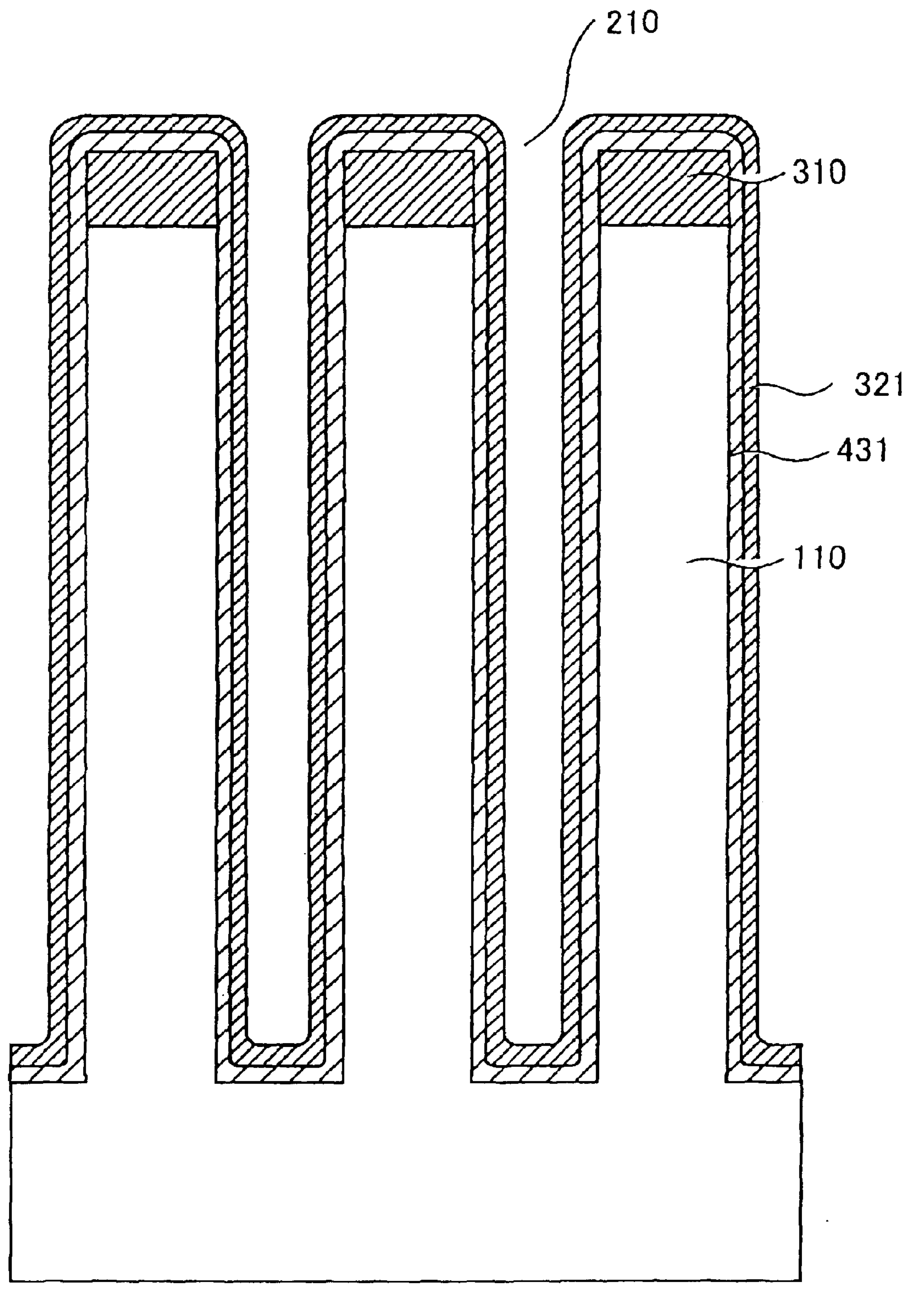
Figure 380:
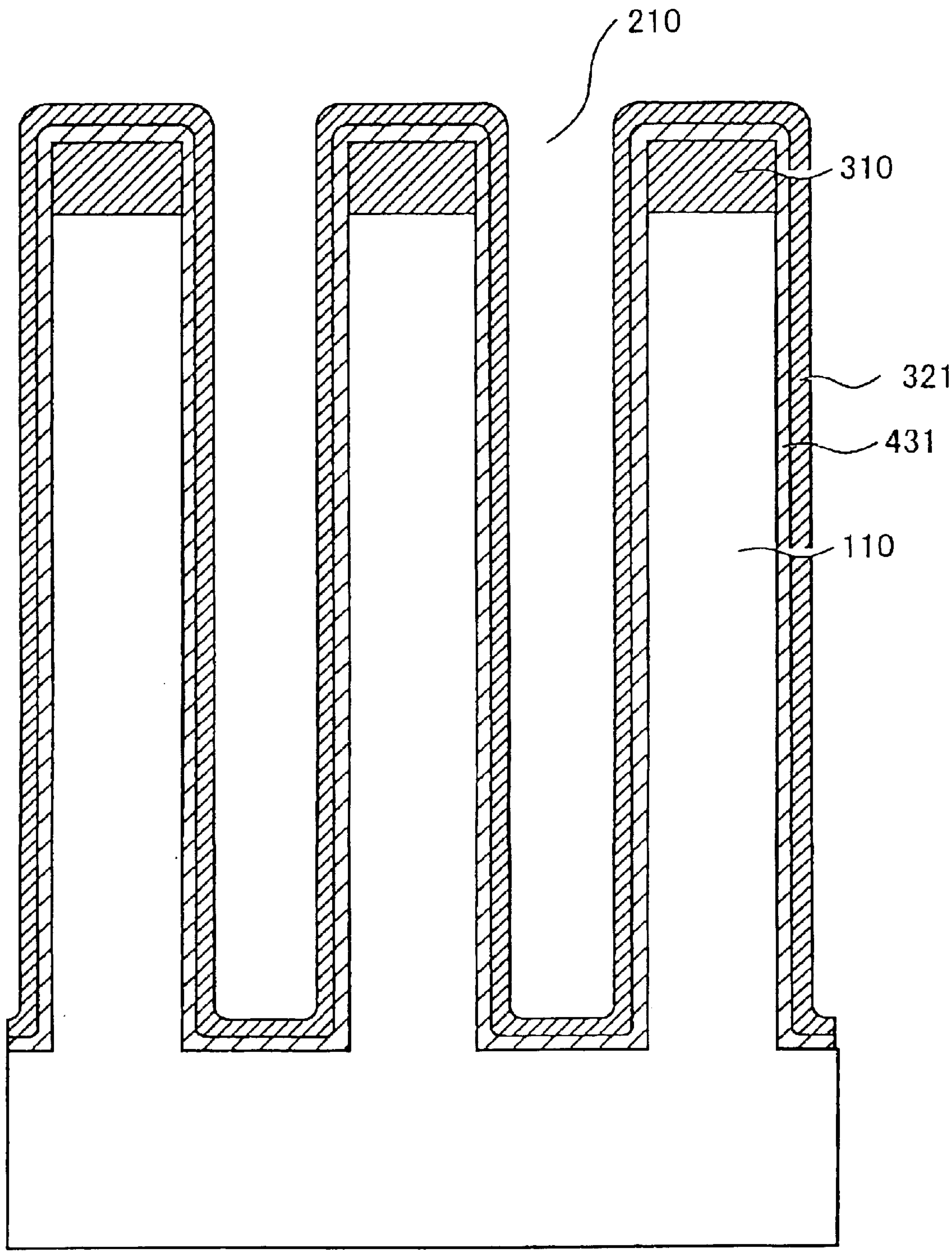

Then, a silicon oxide film 431 is deposited to a thickness of 10 to 100 nm as a fifth insulating film and a silicon nitride film 321 is deposited to a thickness of 10 to 100 nm as a fourth insulating film (FIG. 354 and FIG. 380).

Figure 355:
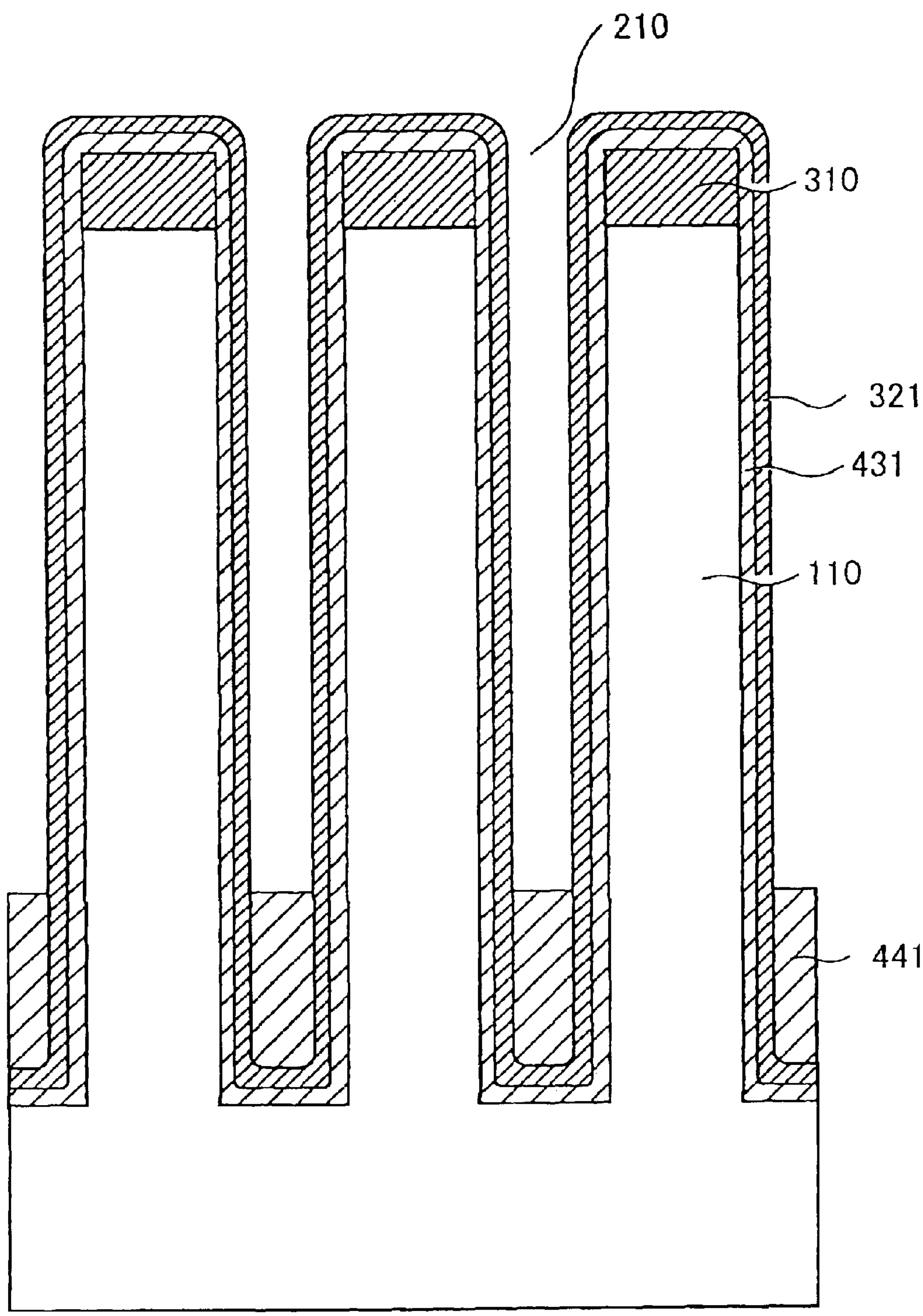
Figure 381:
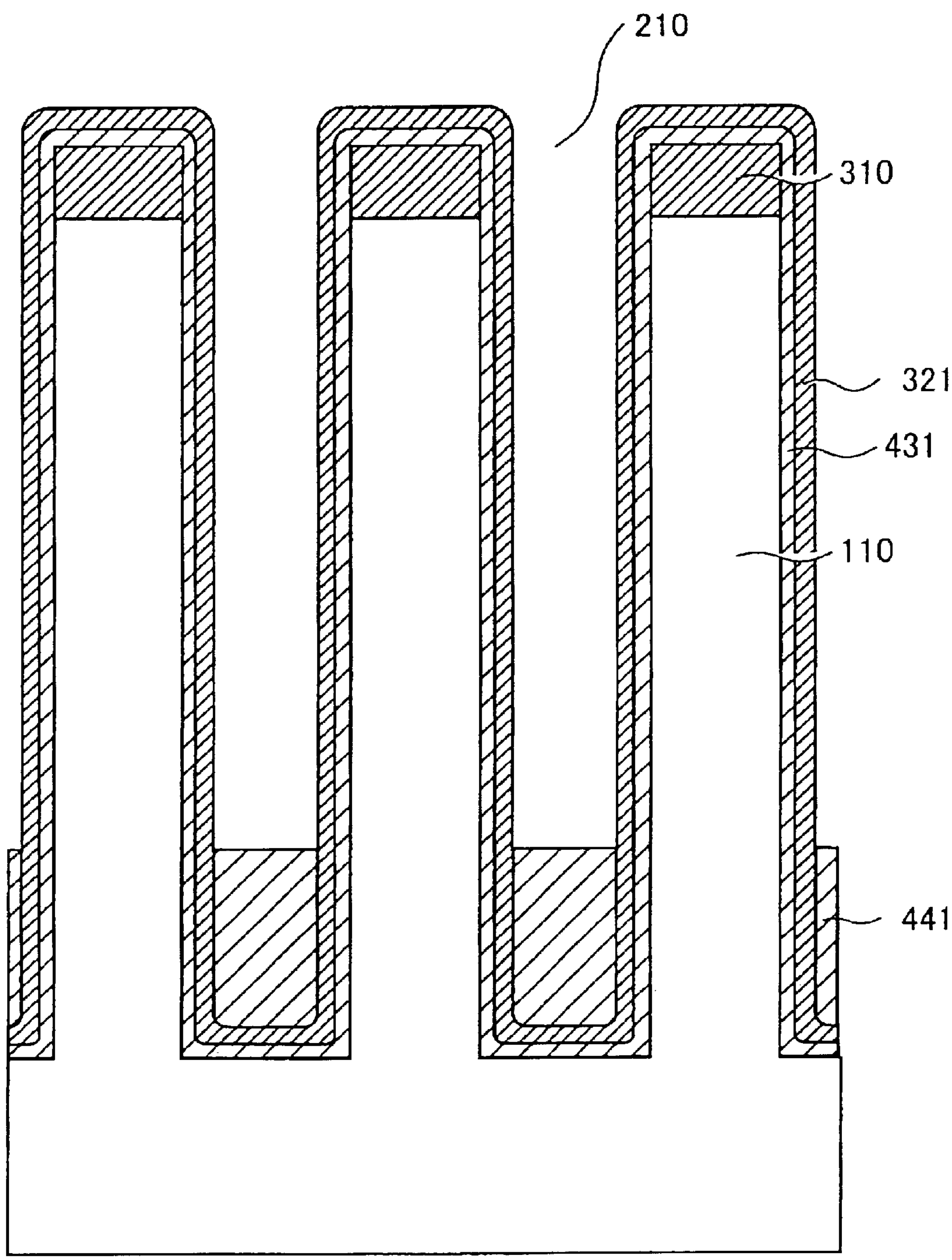

Further, a silicon oxide film 441 is deposited to a thickness of 50 to 500 nm as a sixth insulating film and etched back to a desired height by isotropic etching, for example, such that the silicon oxide film 441 is buried in the first trench 210 (FIG. 355 and FIG. 381).

Figure 356:
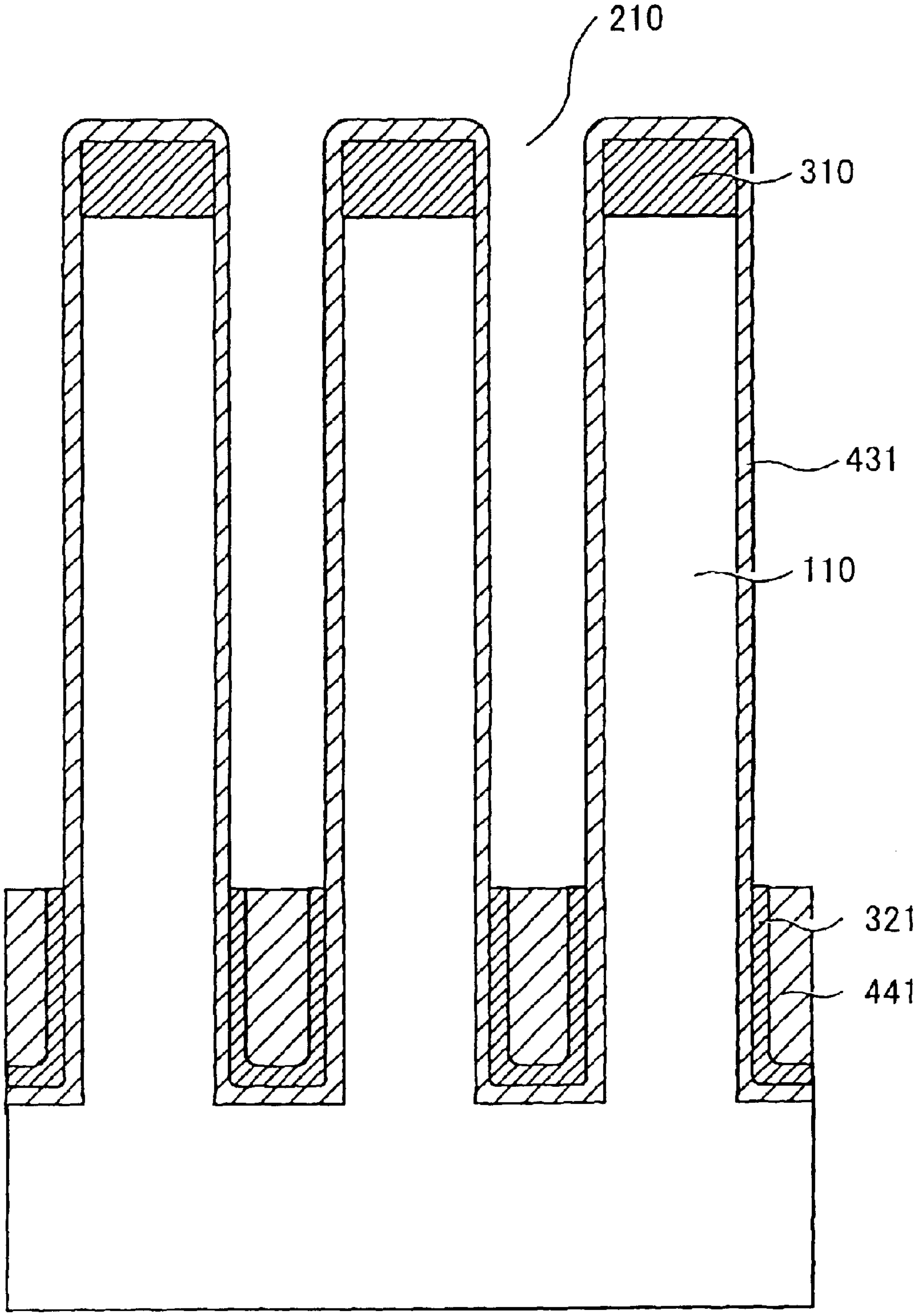
Figure 357:
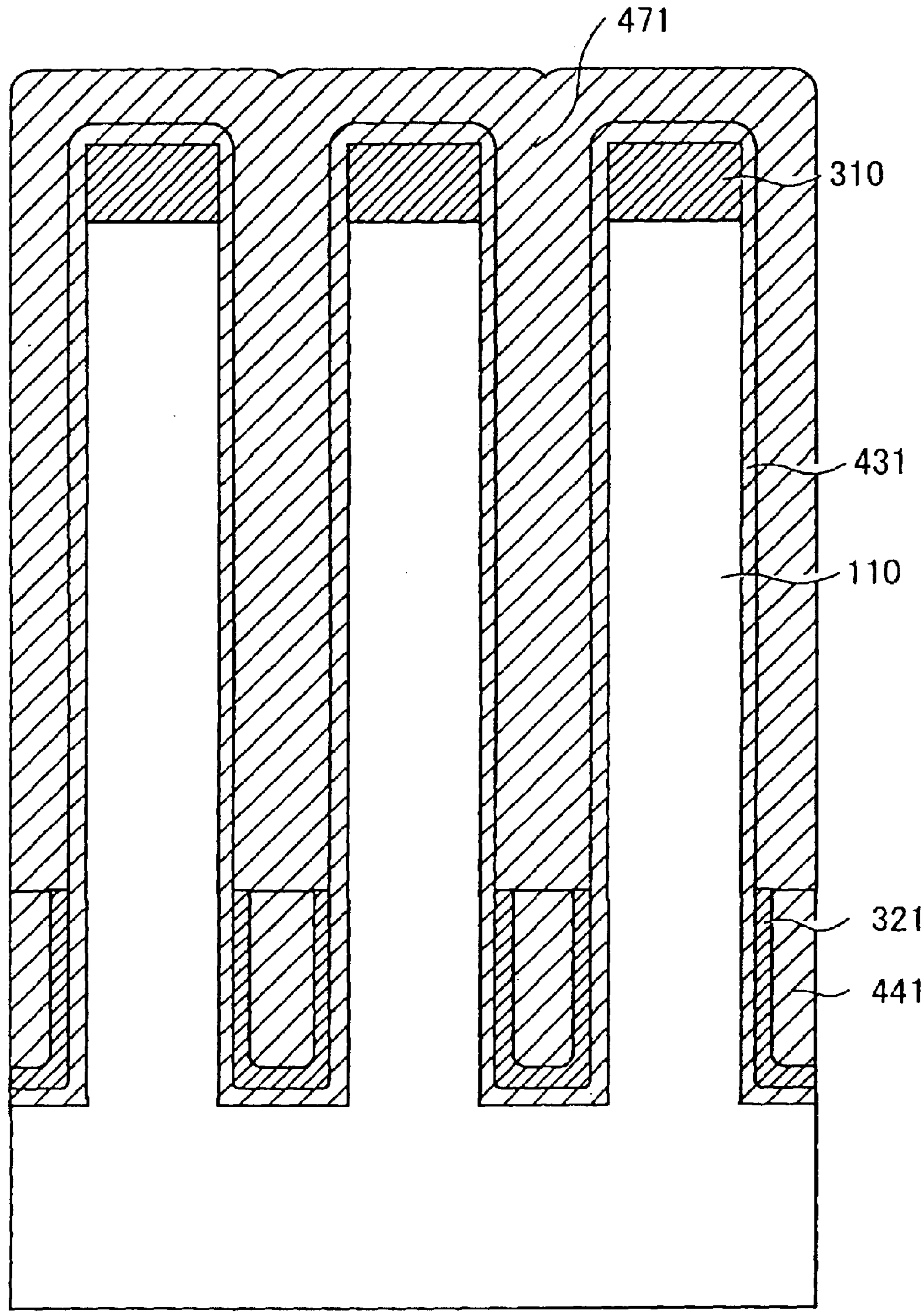
Figure 382:
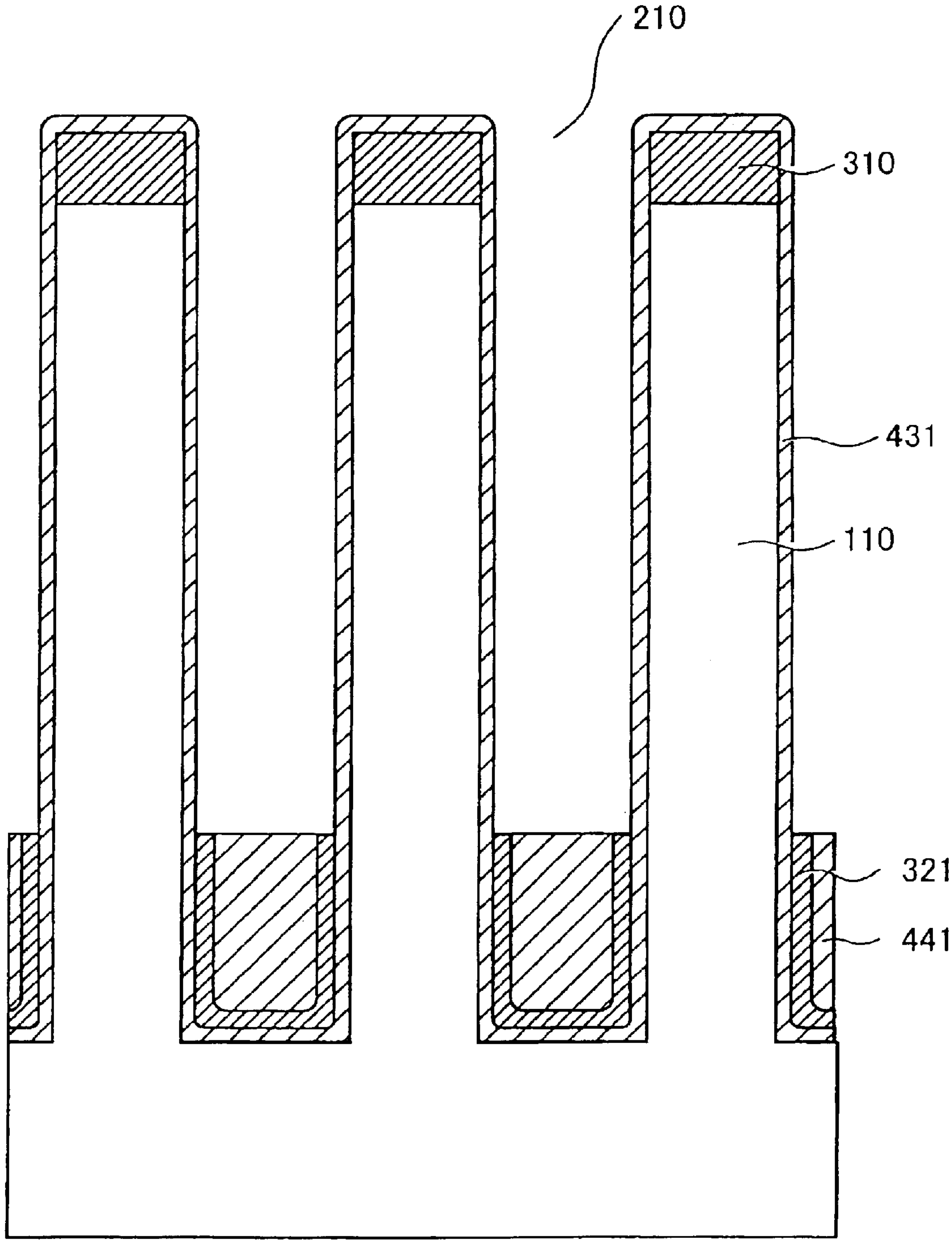
Figure 383:
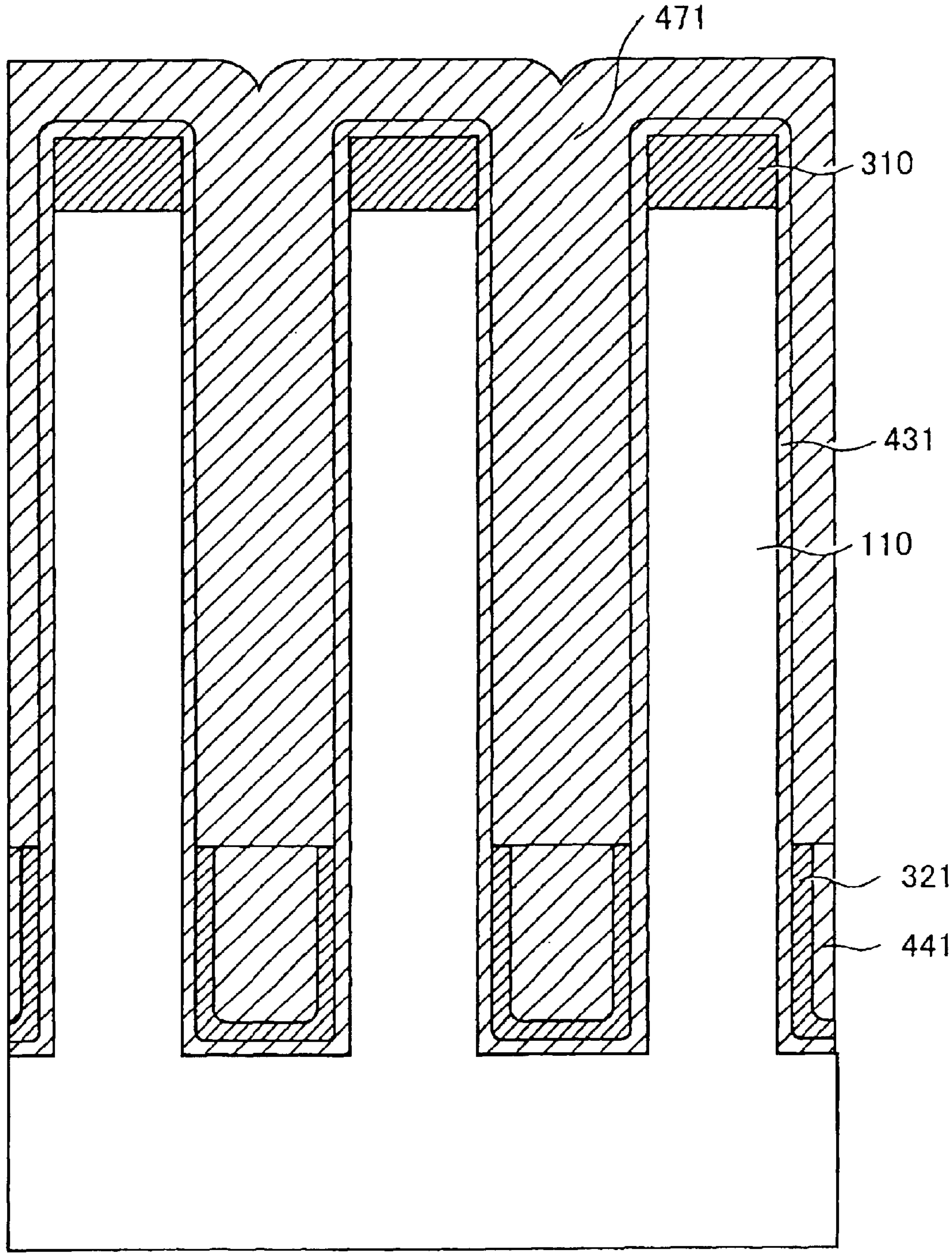

Using the silicon oxide film 441 as a mask, an exposed portion of the silicon nitride film 321 is removed by isotropic etching, for example (FIG. 356 and FIG. 382).

Figure 358:
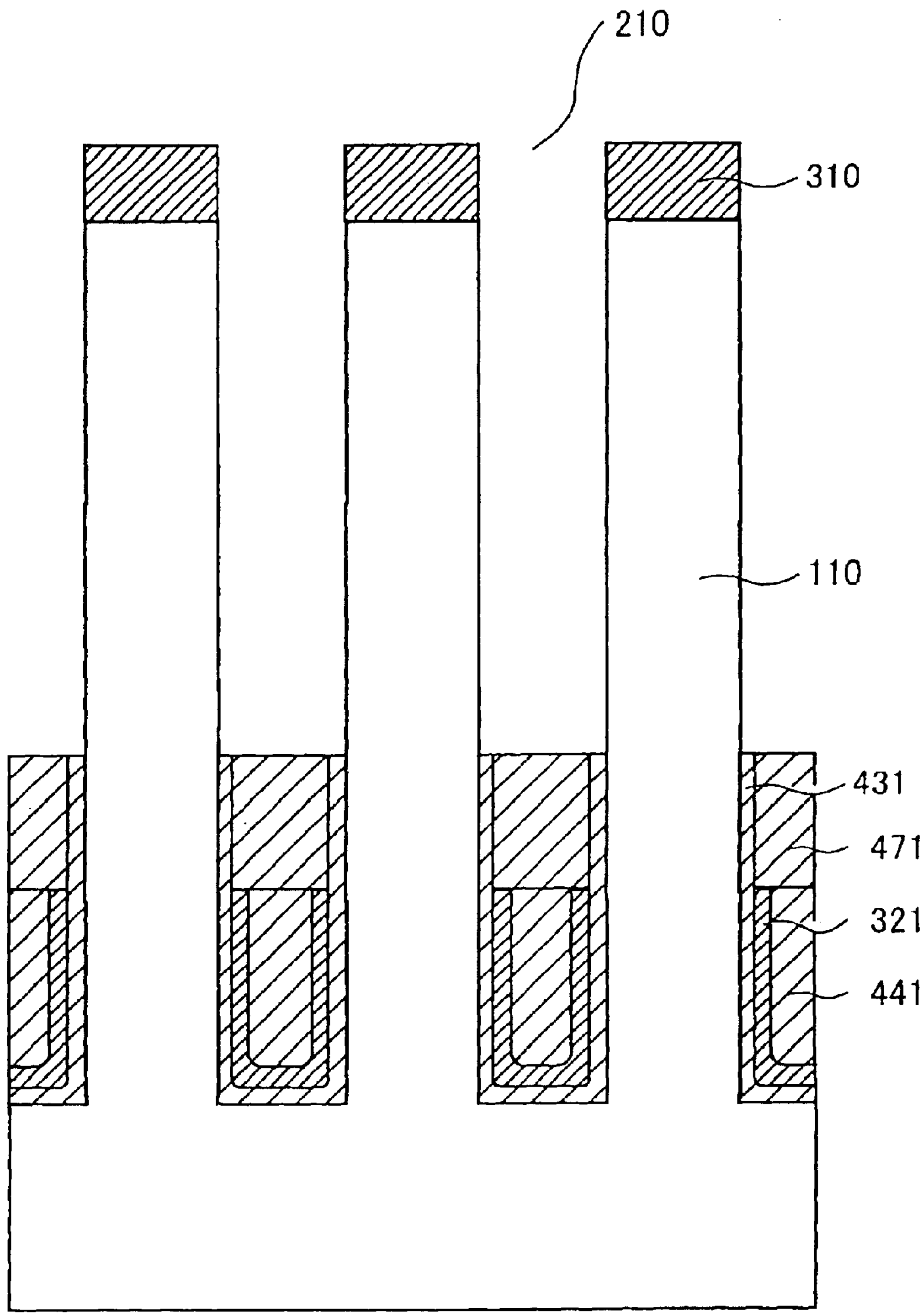
Figure 384:
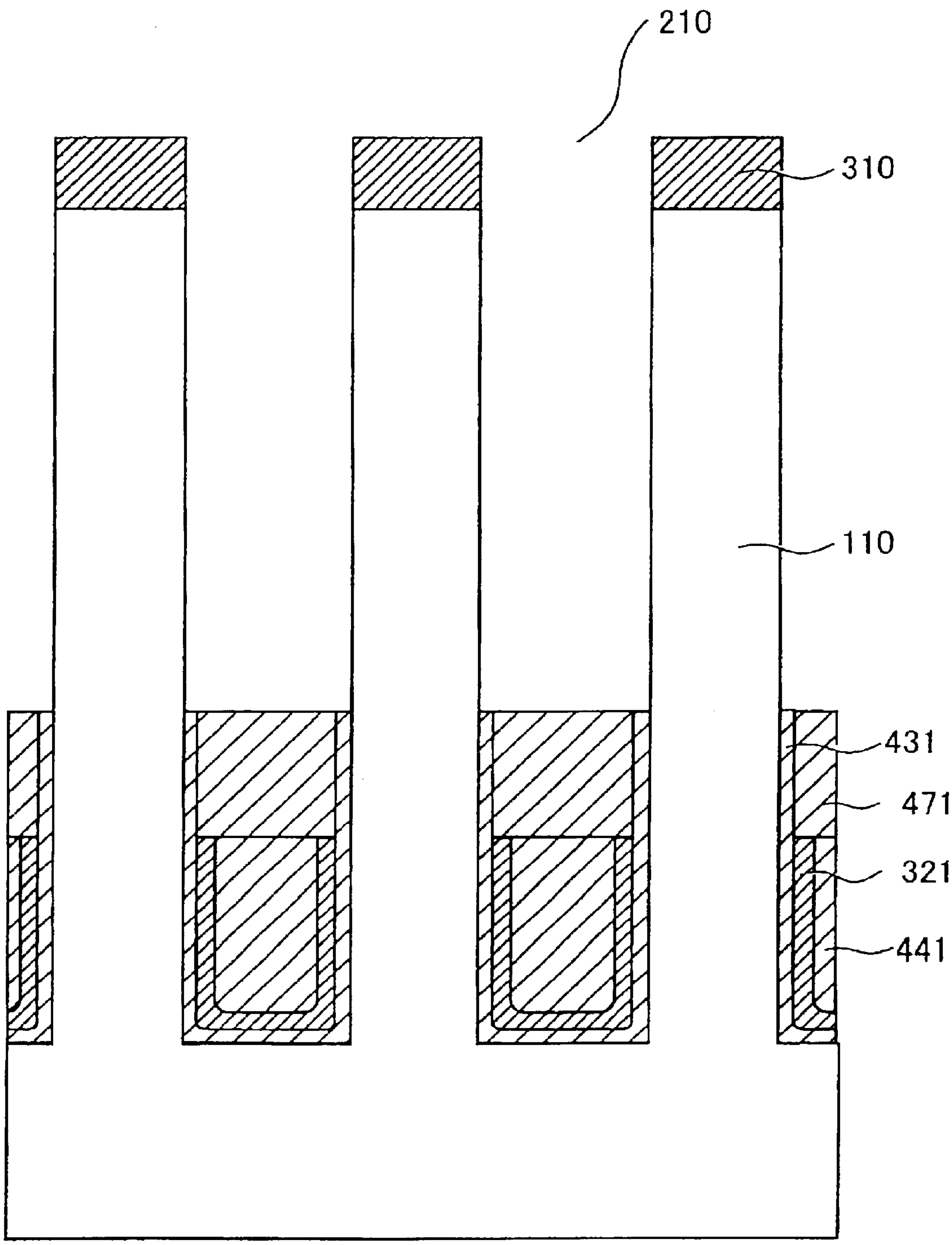

Subsequently, a silicon oxide film 471 is deposited to a thickness of 50 to 500 nm (FIG. 357 and FIG. 383) and etched back to a desired height by isotropic etching, for example, such that the silicon oxide film 471 is buried in the first trench 210 (FIG. 358 and FIG. 384).

Then, a silicon oxide film 432 is deposited to a thickness of 10 to 100 nm as a fifth insulating film and a silicon nitride film 322 is deposited to a thickness of 10 to 100 nm as a fourth insulating film. The silicon nitride film 322 is etched by anisotropic etching to remain in the form of a sidewall spacer on the sidewall of the island-like semiconductor layer 110 with the intervention of the silicon oxide film 432.

A silicon oxide film 442 is then deposited to a thickness of 50 to 500 nm as a sixth insulating film and etched back to a desired height by isotropic etching, for example, such that the silicon oxide film 442 is buried in the first trench 210.

Using the silicon oxide film 442 as a mask, an exposed portion of the silicon nitride film 322 is removed by isotropic etching.

Figure 359:
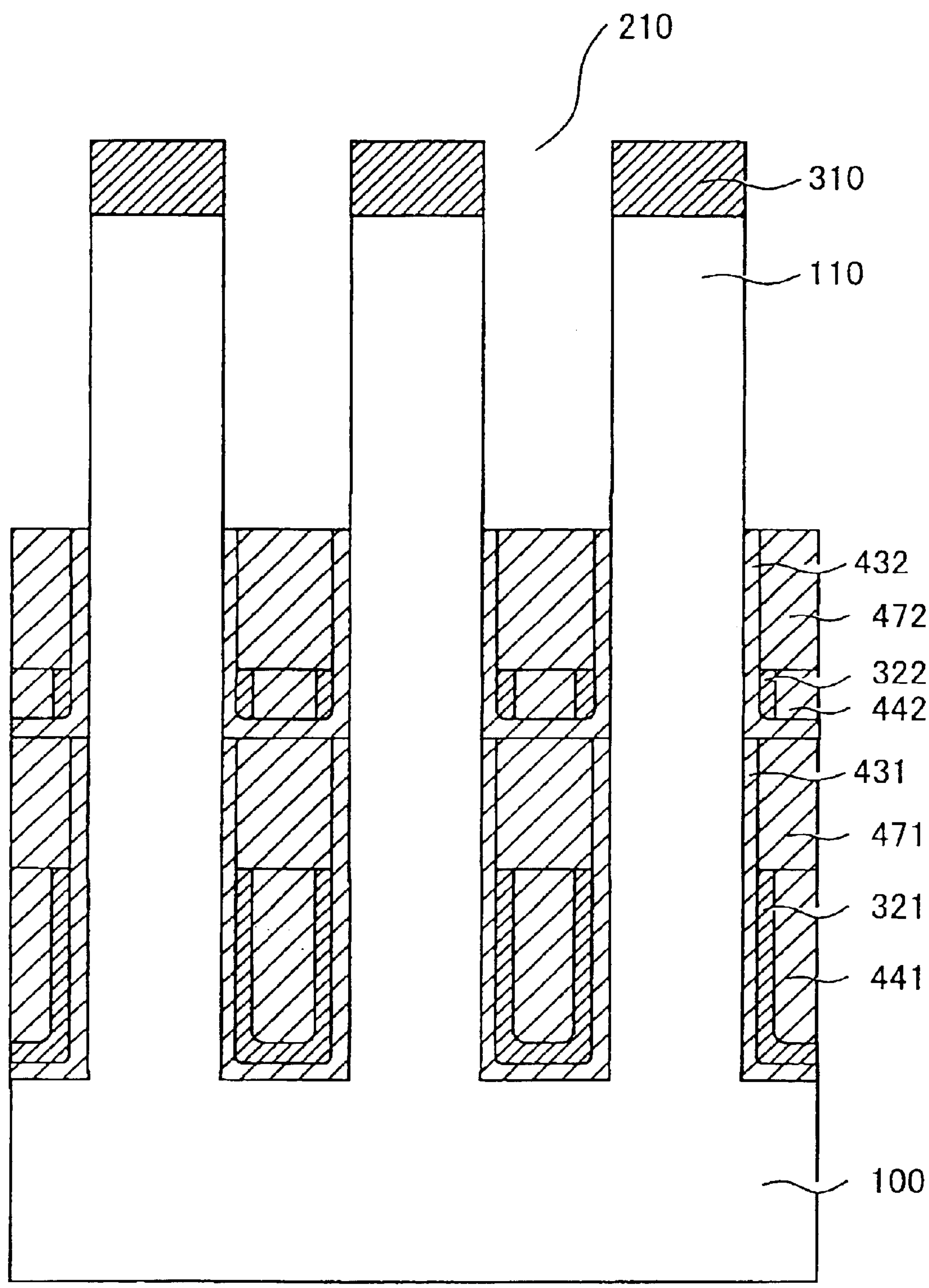
Figure 385:
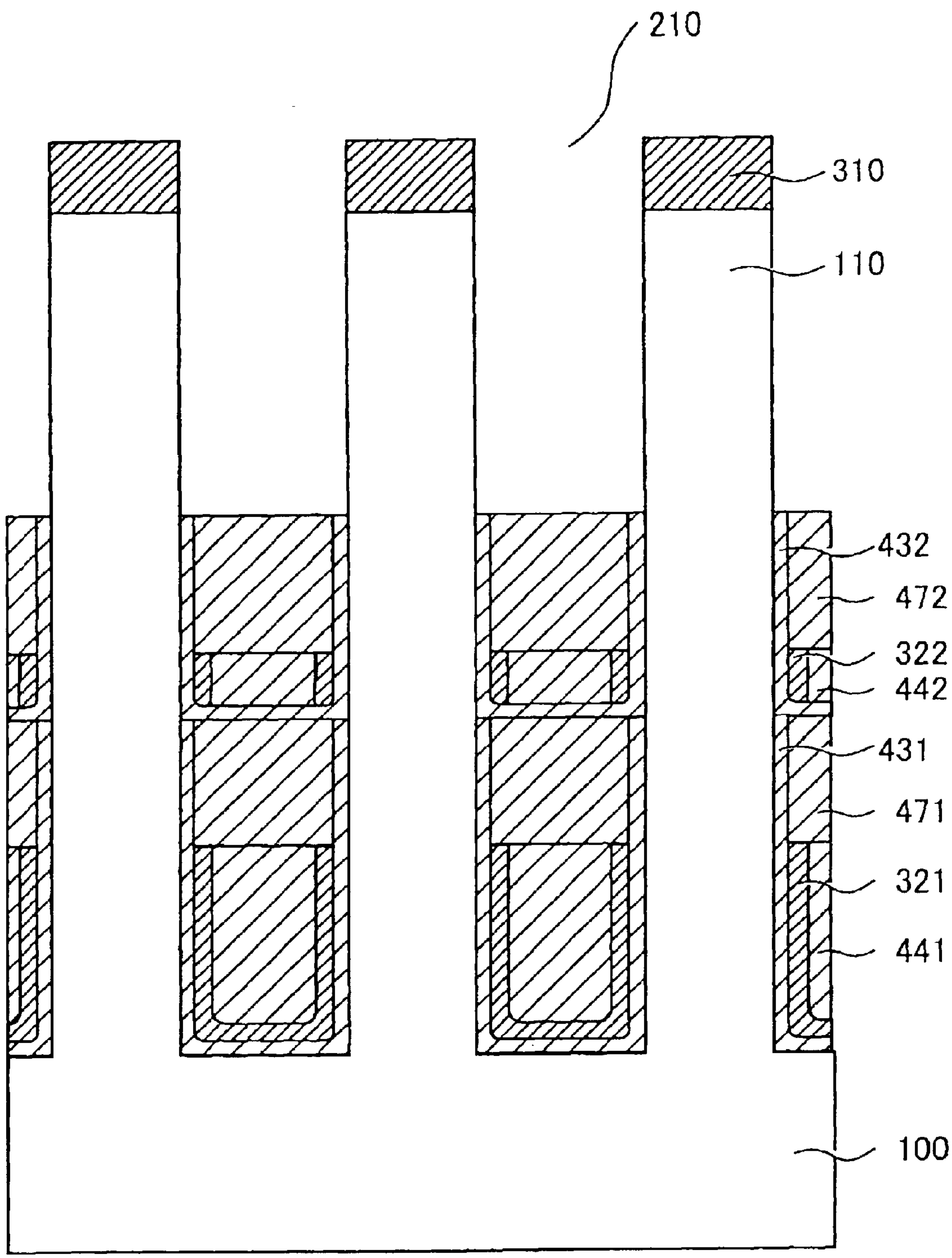

Subsequently, a silicon oxide film 472 is deposited to a thickness of 50 to 500 nm as a eleventh insulating film and etched back to a desired height by isotropic etching, for example, such that the silicon oxide film 472 is buried in the first trench 210 (FIG. 359 and FIG. 385).

Figure 360:
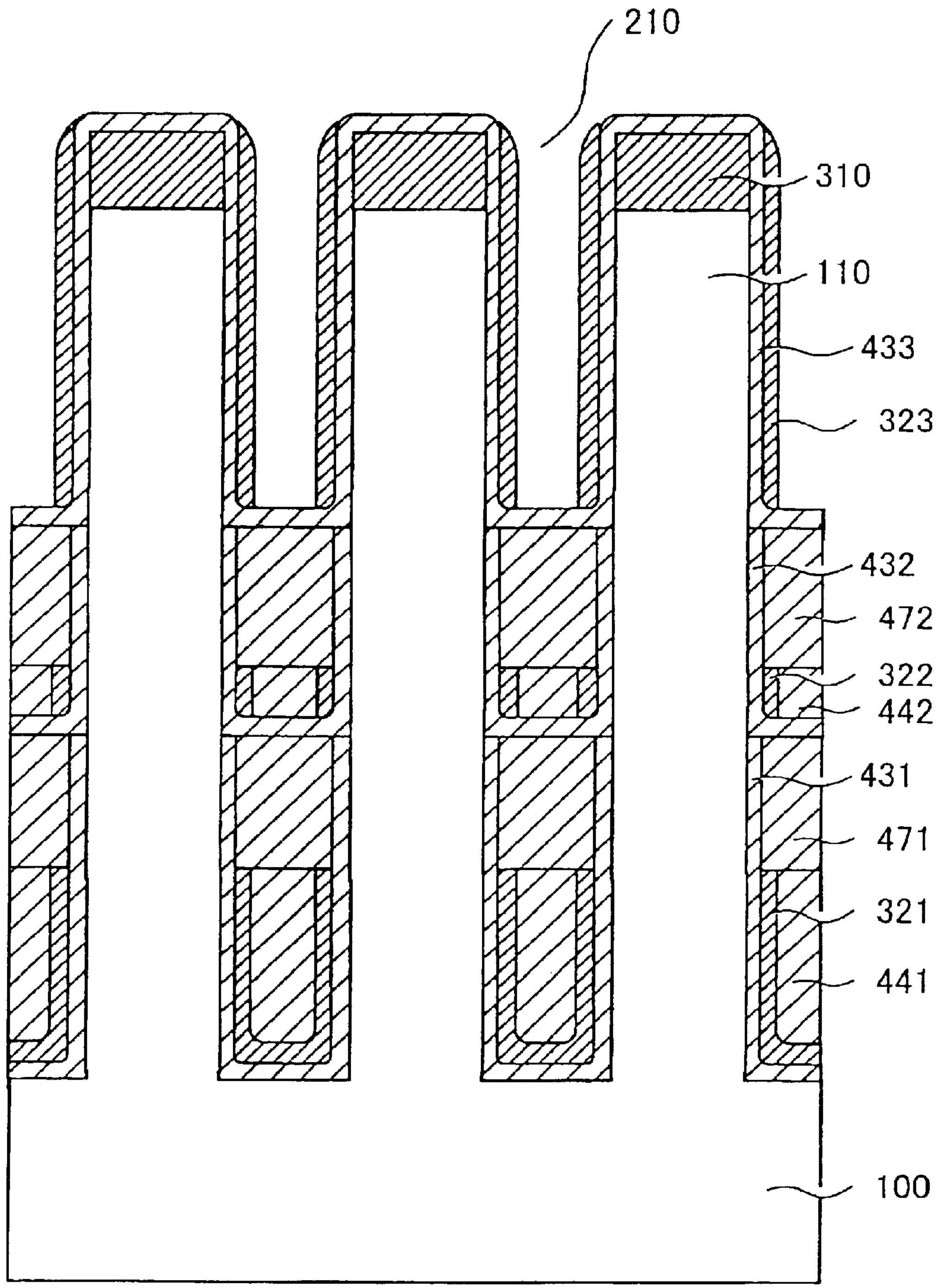
Figure 361:
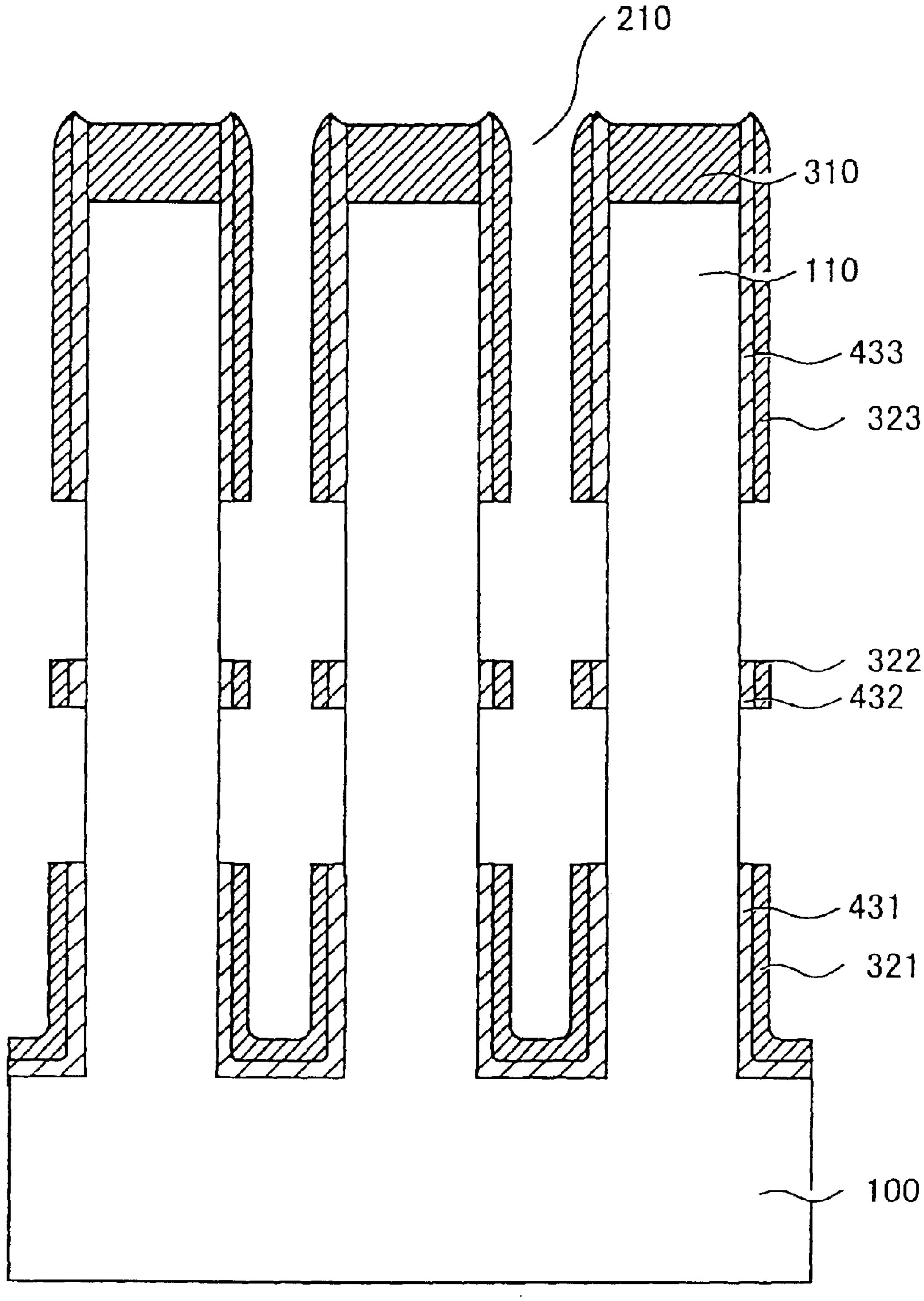
Figure 386:
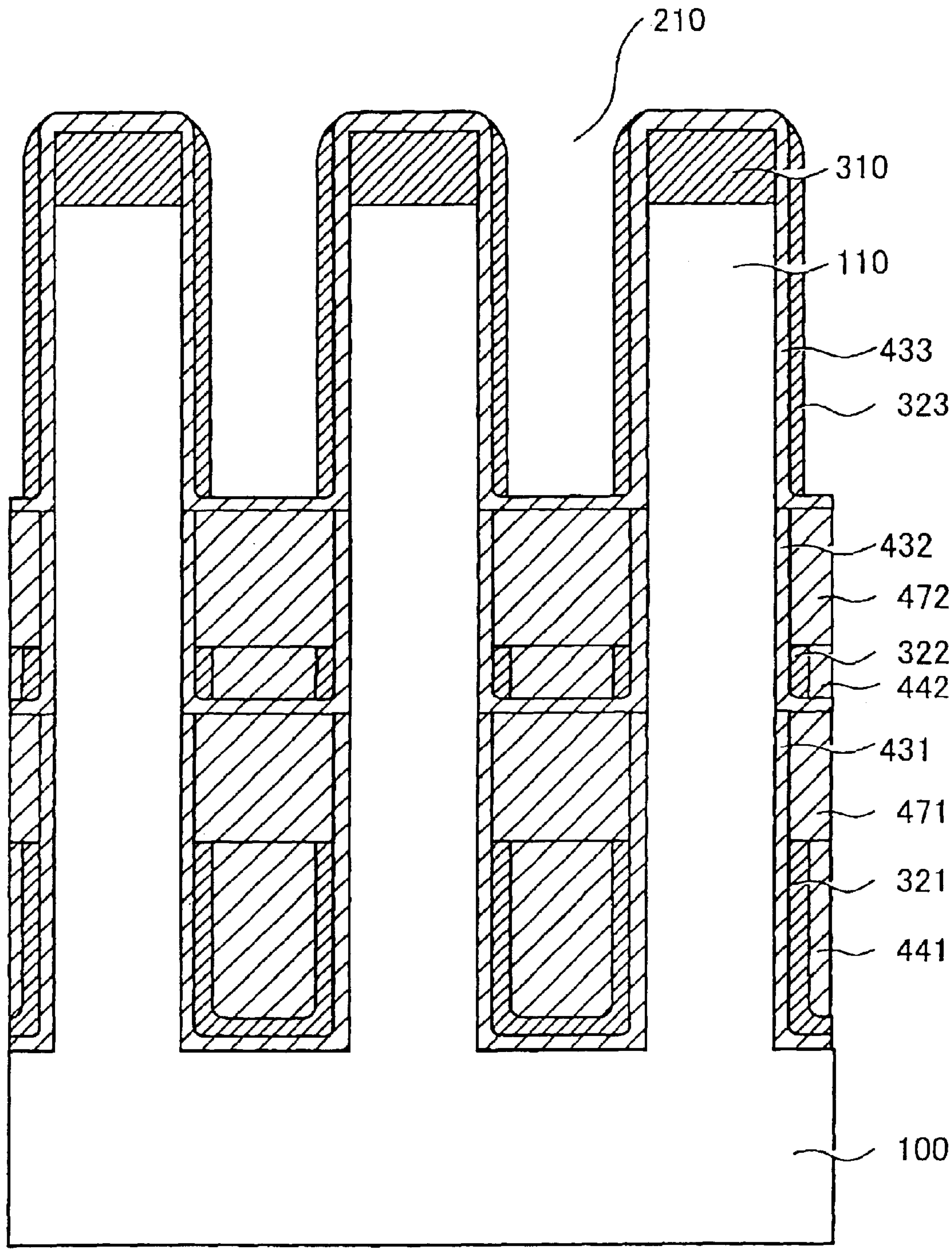
Figure 387:
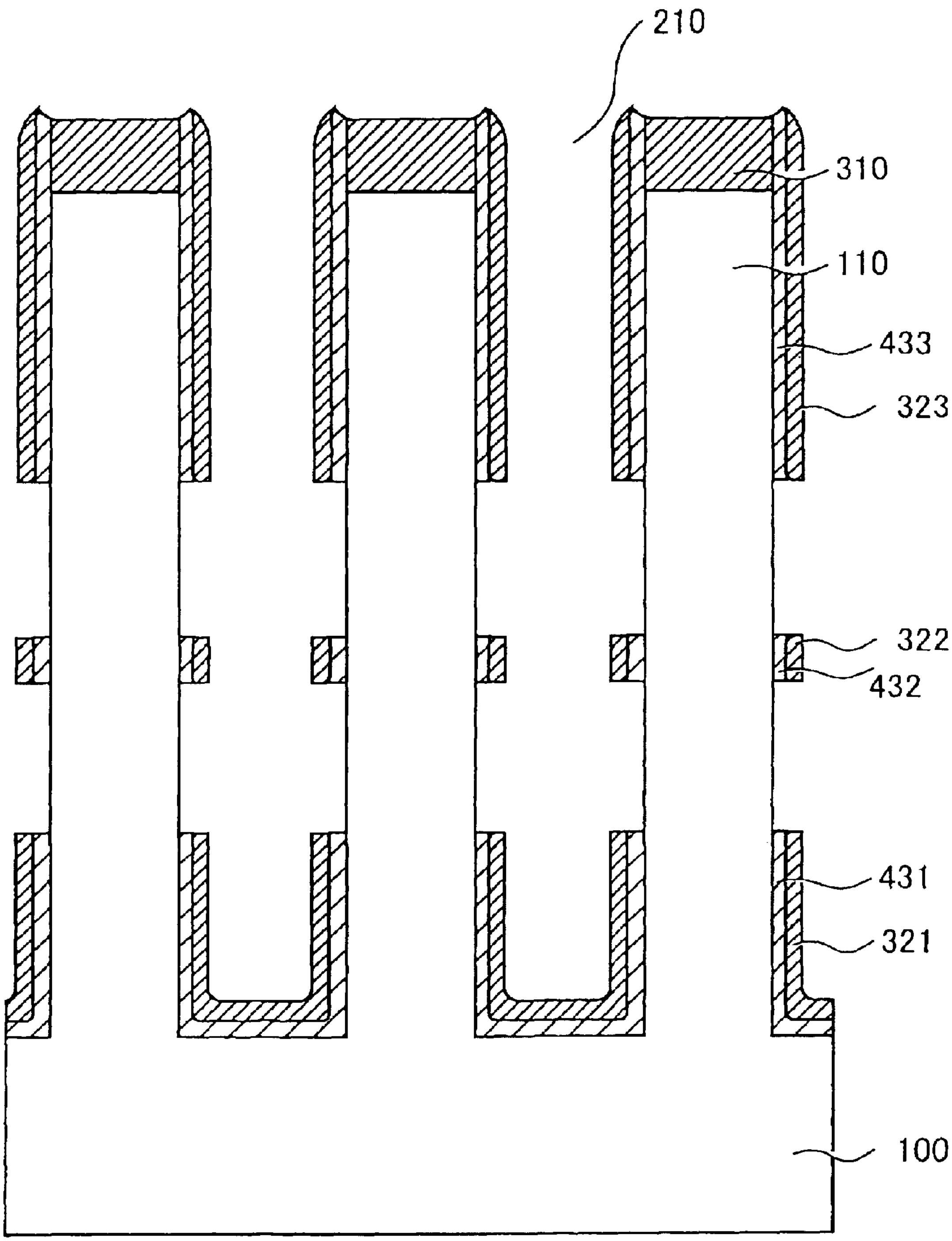

Then, a silicon oxide film 433 is deposited to a thickness of 10 to 100 nm as a fifth insulating film and a silicon nitride film 323 is deposited to a thickness of 10 to 100 nm as a fourth insulating film. The silicon nitride film 323 is etched by anisotropic etching to remain in the form of a sidewall spacer on the sidewall of the island-like semiconductor layer 110 with the intervention of the silicon oxide film 433 (FIG. 360 and FIG. 386).

Figure 362:
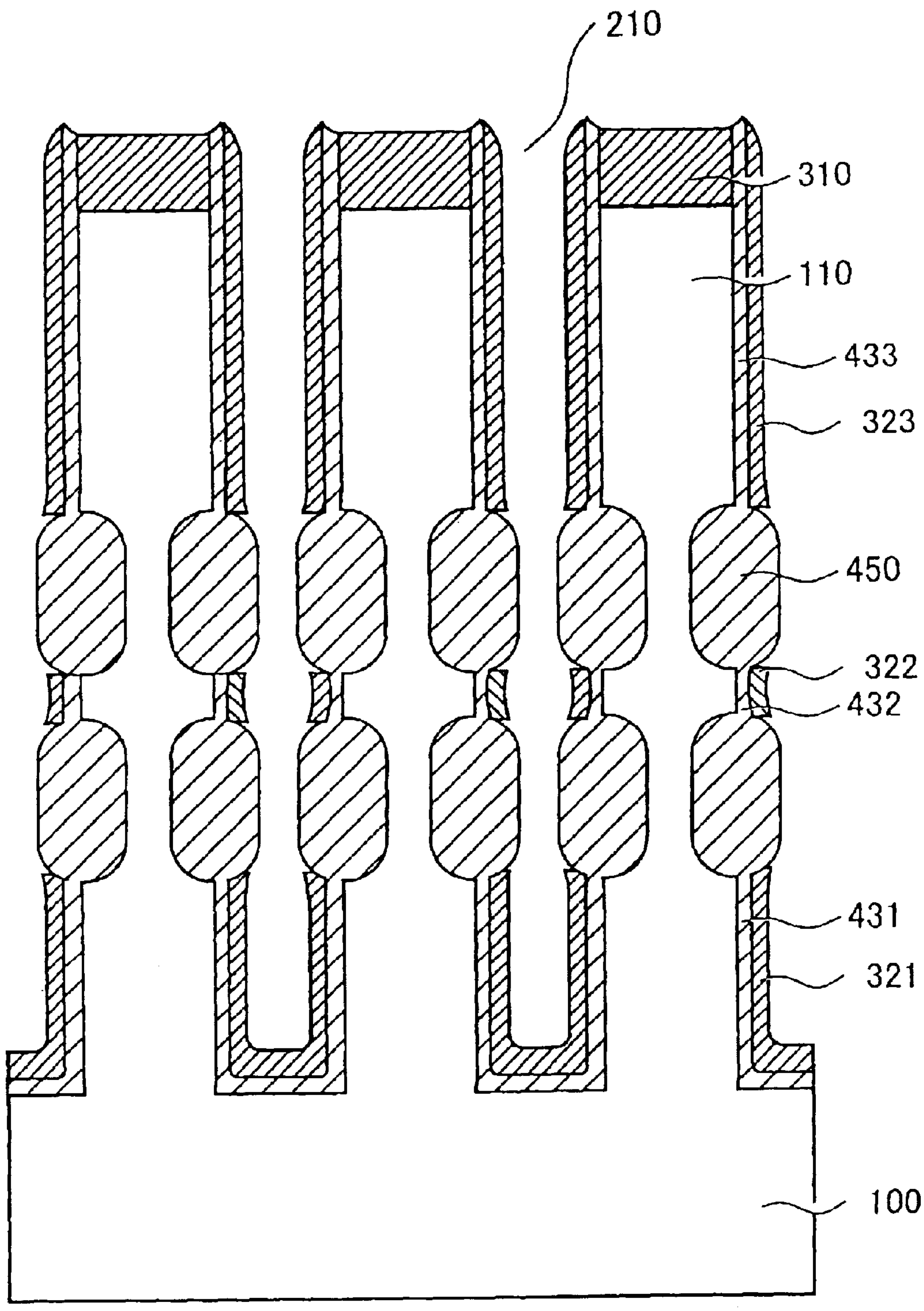
Figure 388:
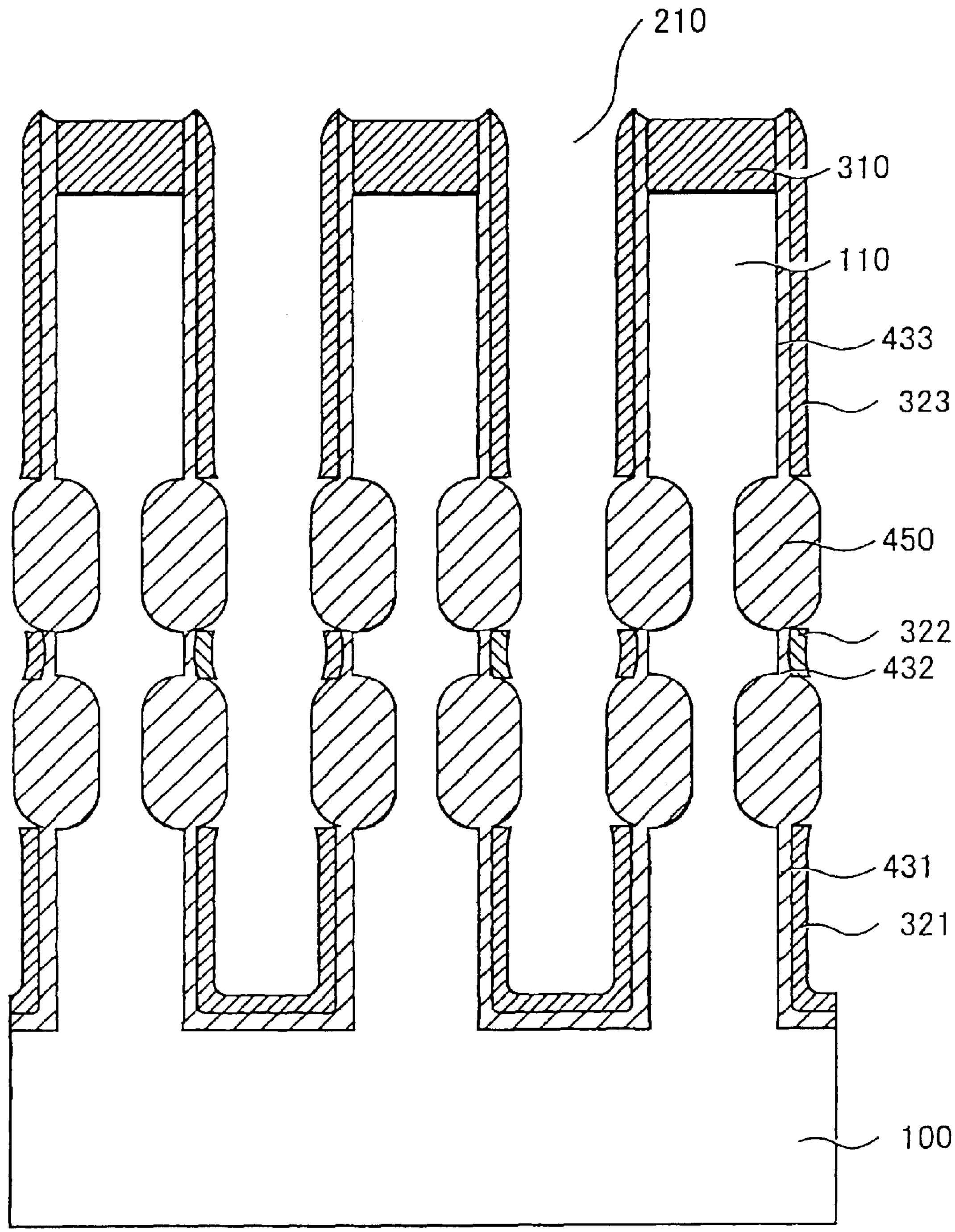

The silicon oxide film is selectively removed by isotropic etching (FIG. 361 and FIG. 387) and the exposed island-like semiconductor layer 110 is thermally oxidized to form a silicon oxide film 450 of about 30 to 300 nm thick as a seventh insulating film (FIG. 362 and FIG. 388).

Figure 363:
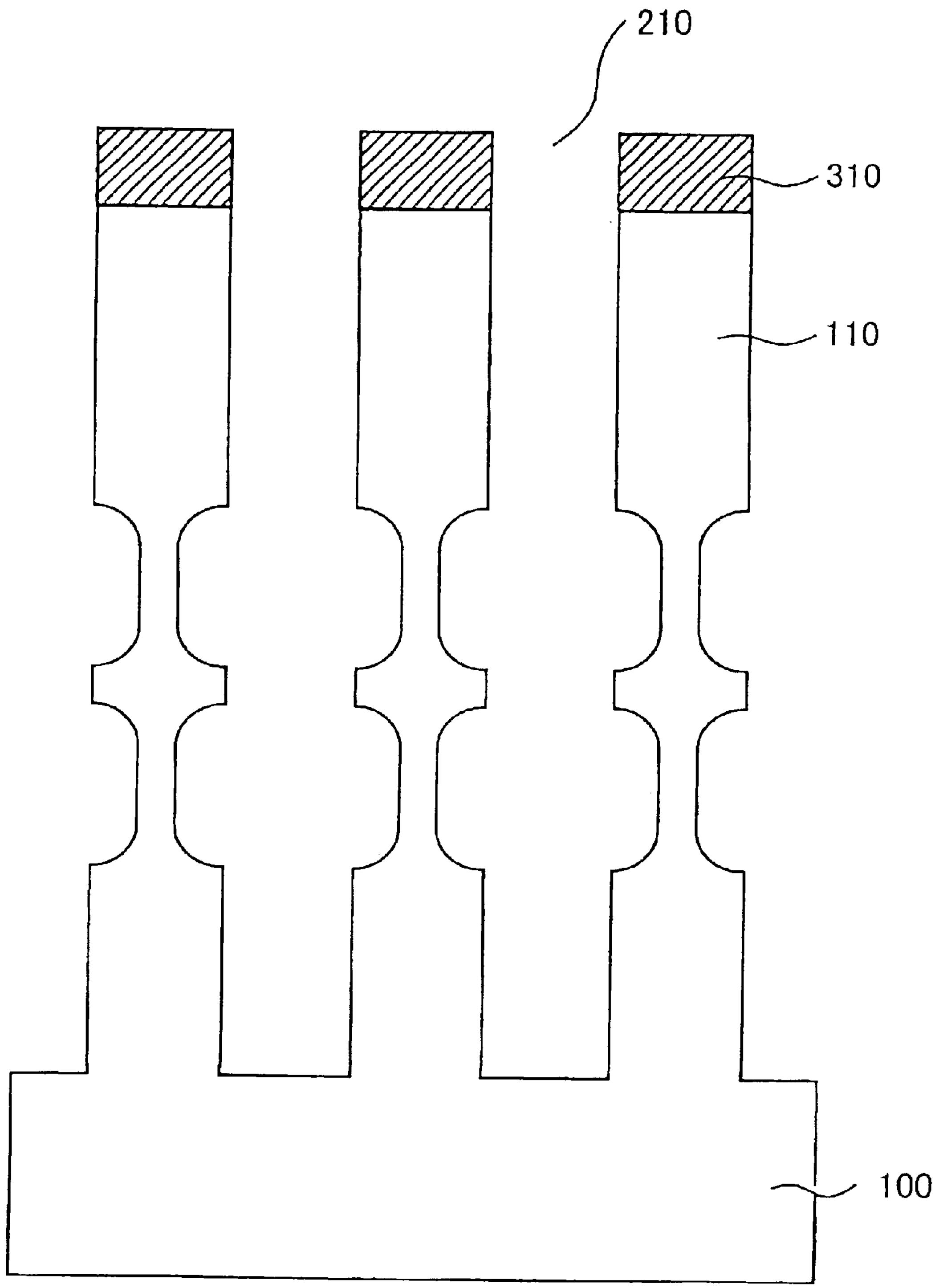
Figure 364:
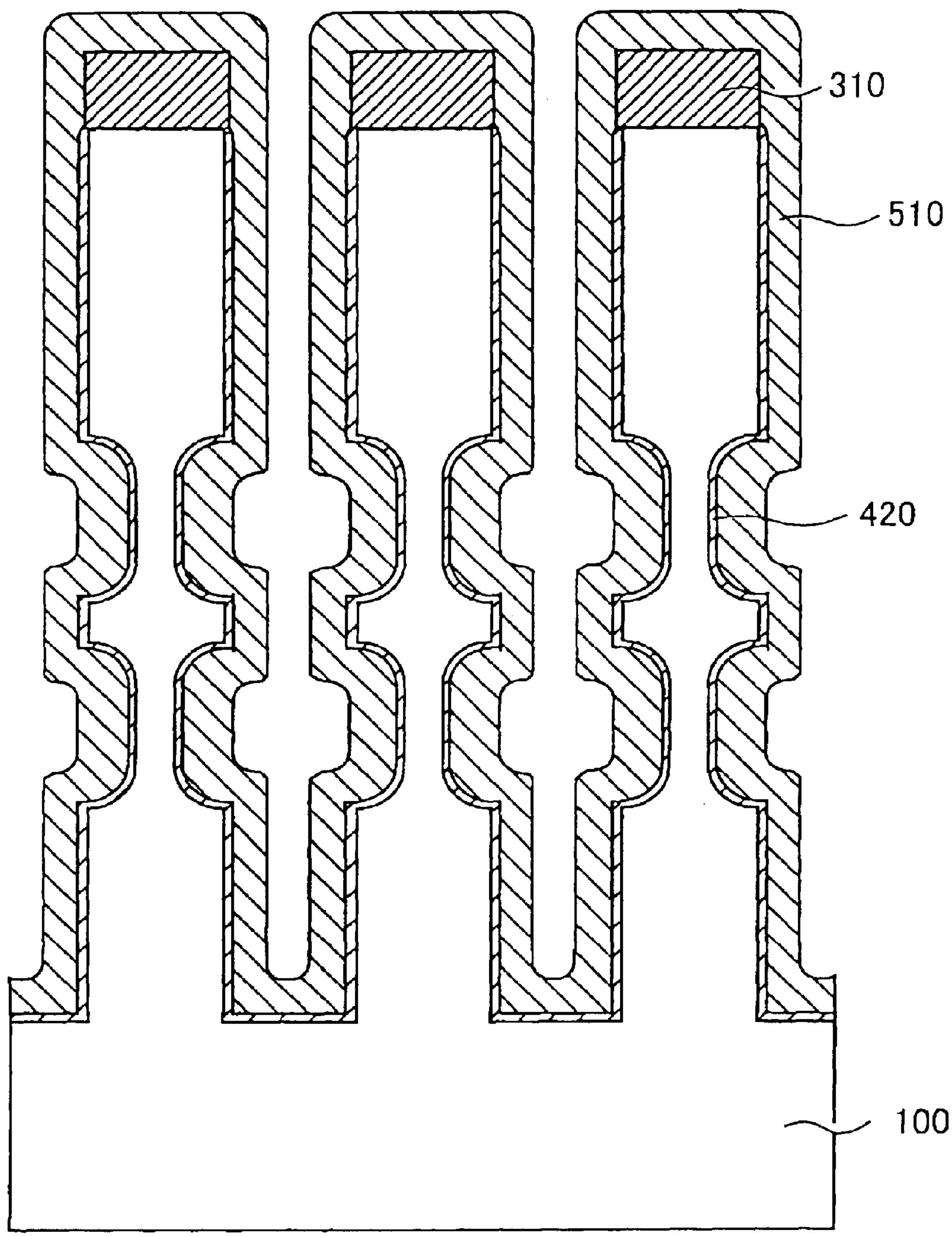
Figure 389:
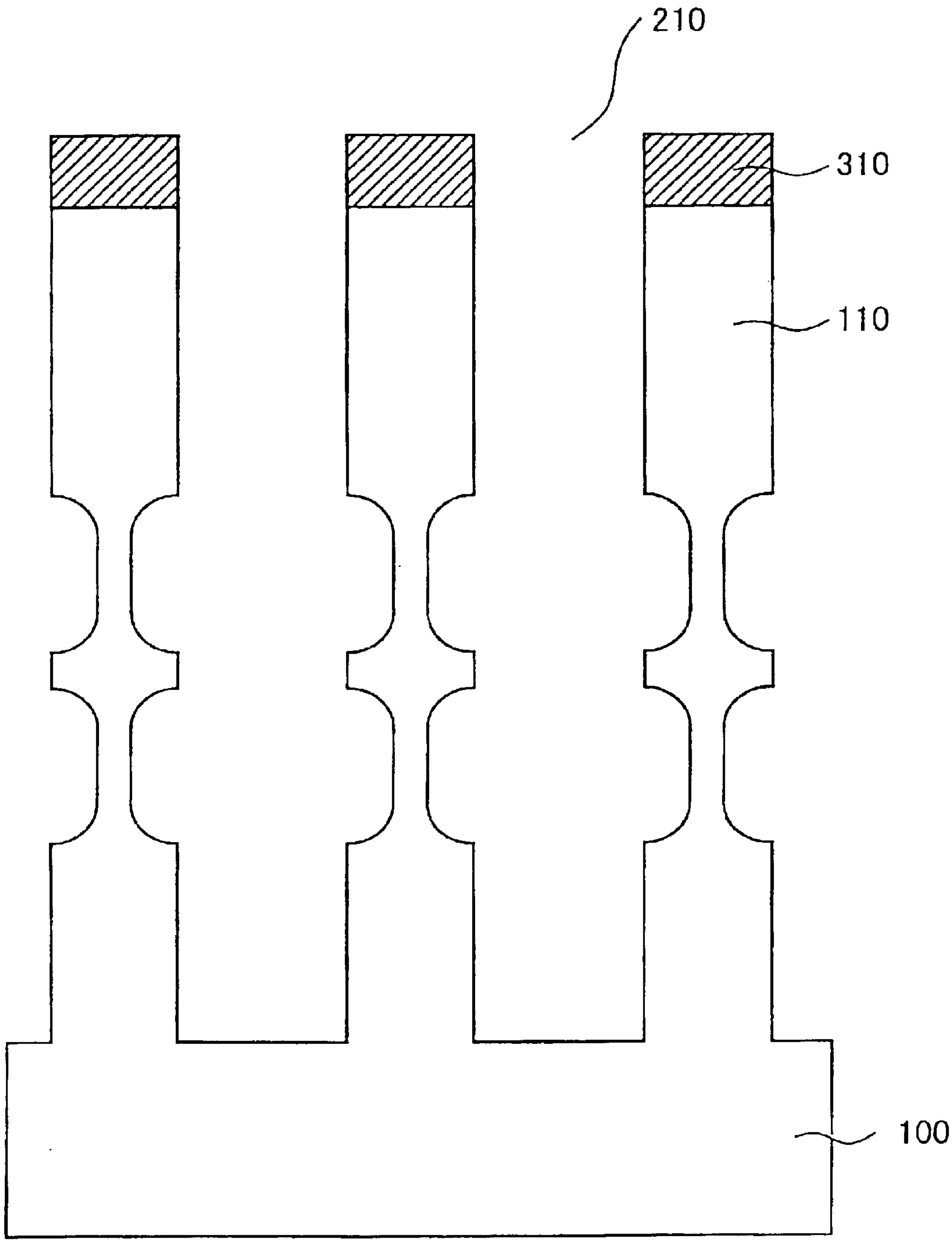
Figure 390:
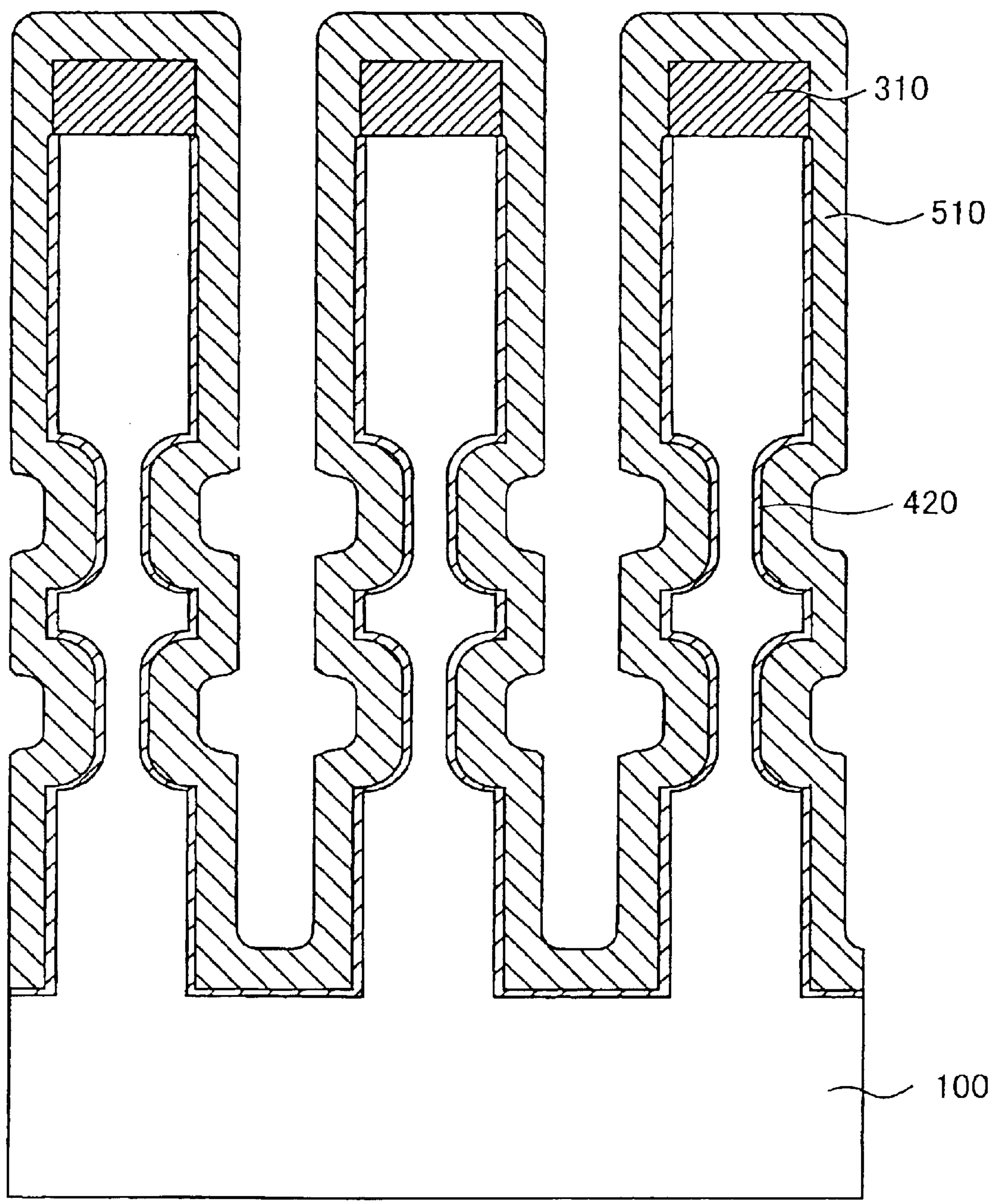

Then, isotropic etching of the silicon oxide film, the silicon nitride film and the silicon oxide film is carried out in this order, thereby removing the silicon oxide films 431 to 433, the silicon nitride films 321 to 323 and the silicon oxide film 450 (FIG. 363 and FIG. 389).

To obtain the configuration of the island-like semiconductor layer 110 shown in FIG. 363 and FIG. 389, recesses having a depth of about 30 to 300 nm may be formed on the sidewall of the island-like semiconductor layer 110 by isotropic etching instead of forming the silicon oxide film 450 by thermal oxidation. Alternatively, the thermal oxidation and the isotropic etching may be carried out in combination. Any means may be used without limitation as long as a desired configuration is obtained.

Then, for example, a silicon oxide film 420 is formed as a third insulating film to be a tunnel oxide film to have a thickness of about 10 nm around each island-like semiconductor layer 110 by thermal oxidation. The tunnel oxide film, however, may be formed of not only a thermally oxidized film but also a CVD oxide film or a nitrogen oxide film.

Figure 365:
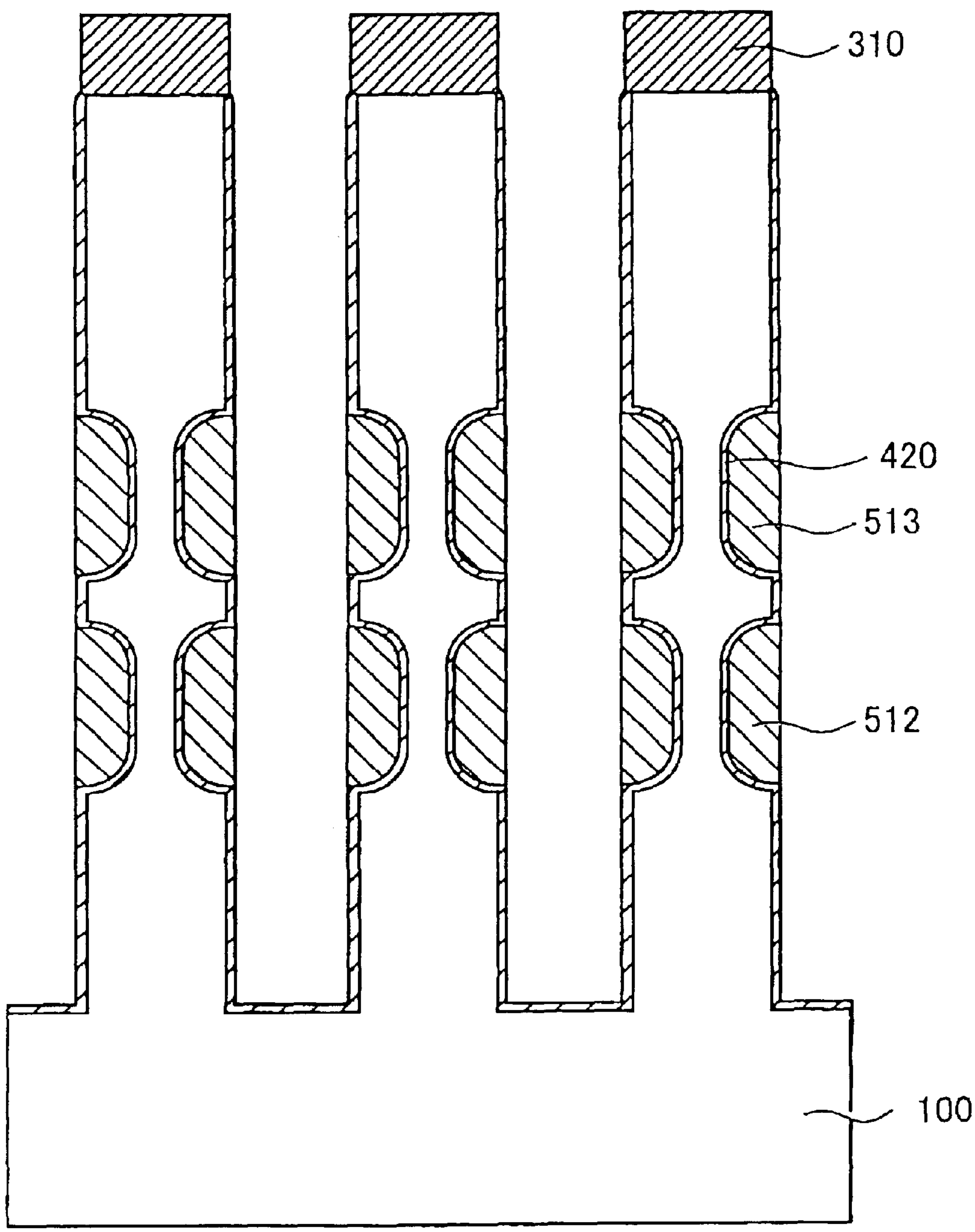
Figure 391:
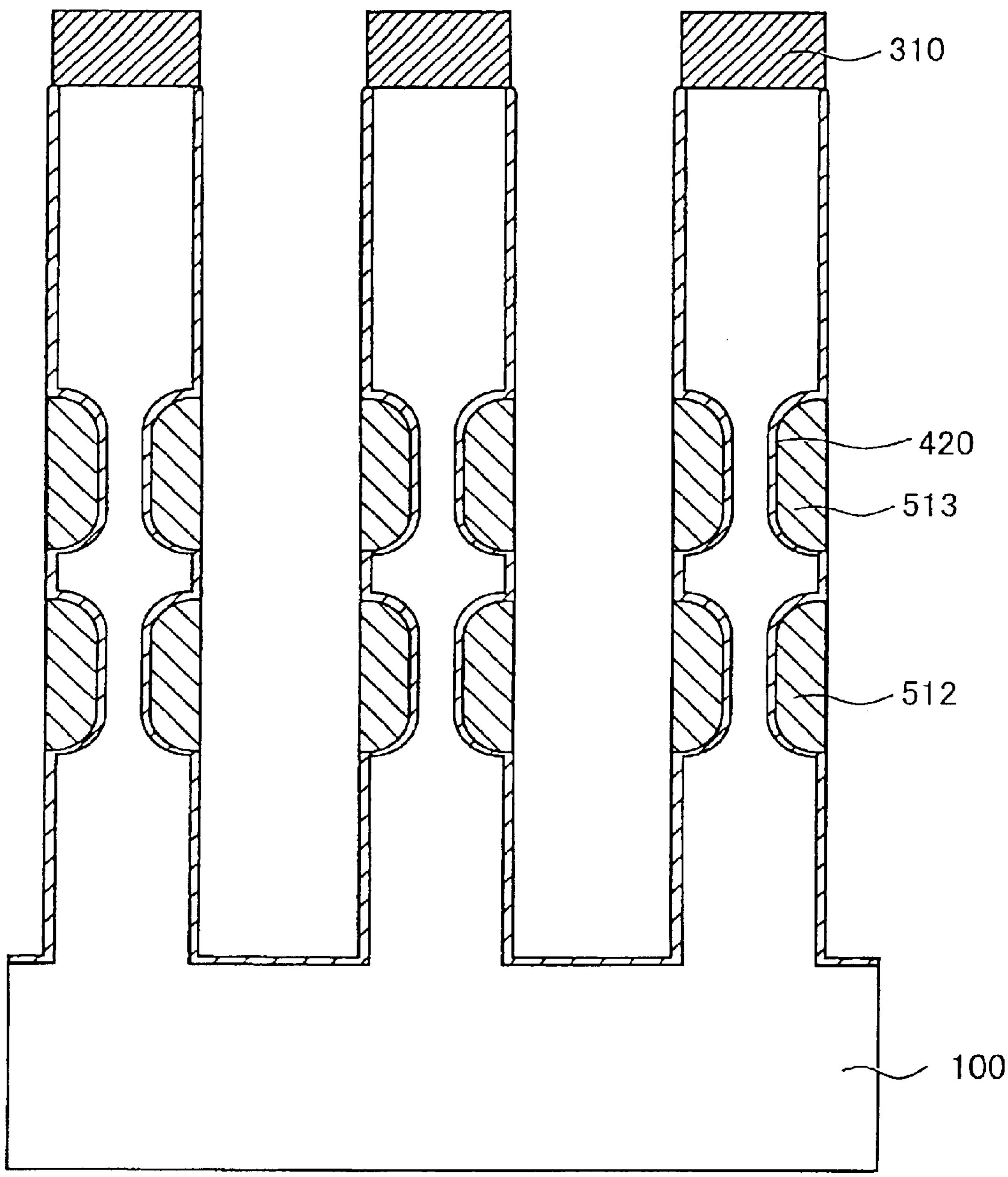

A first conductive film, for example, a polysilicon film 510, is deposited to a thickness of about 50 to 200 nm (FIG. 364 and 390) and anisotropically etched such that the polysilicon film 510 is buried in the recesses formed on the sidewall of the island-like semiconductor layer 110 with the intervention of the silicon oxide film 420, thereby separating the polysilicon film 510 into polysilicon films 512 and 513 (FIG. 365 and FIG. 391). Instead of anisotropic etching, the separation into the polysilicon films 512 and 513 may be carried out by isotropic etch back until reaching to the recesses and then by anisotropic etching after reaching to the recesses, or totally performed by isotropic etching only.

Figure 366:
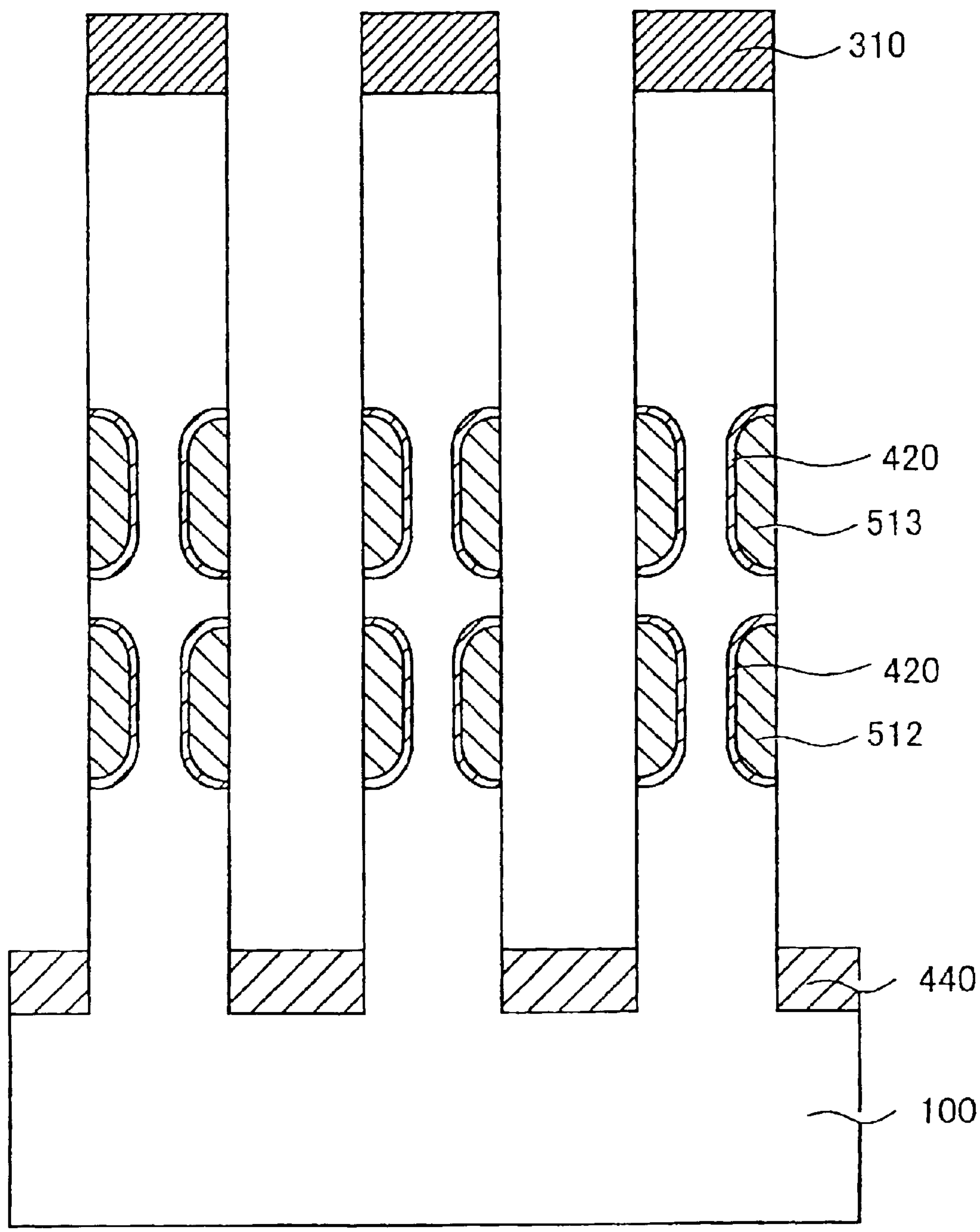
Figure 392:
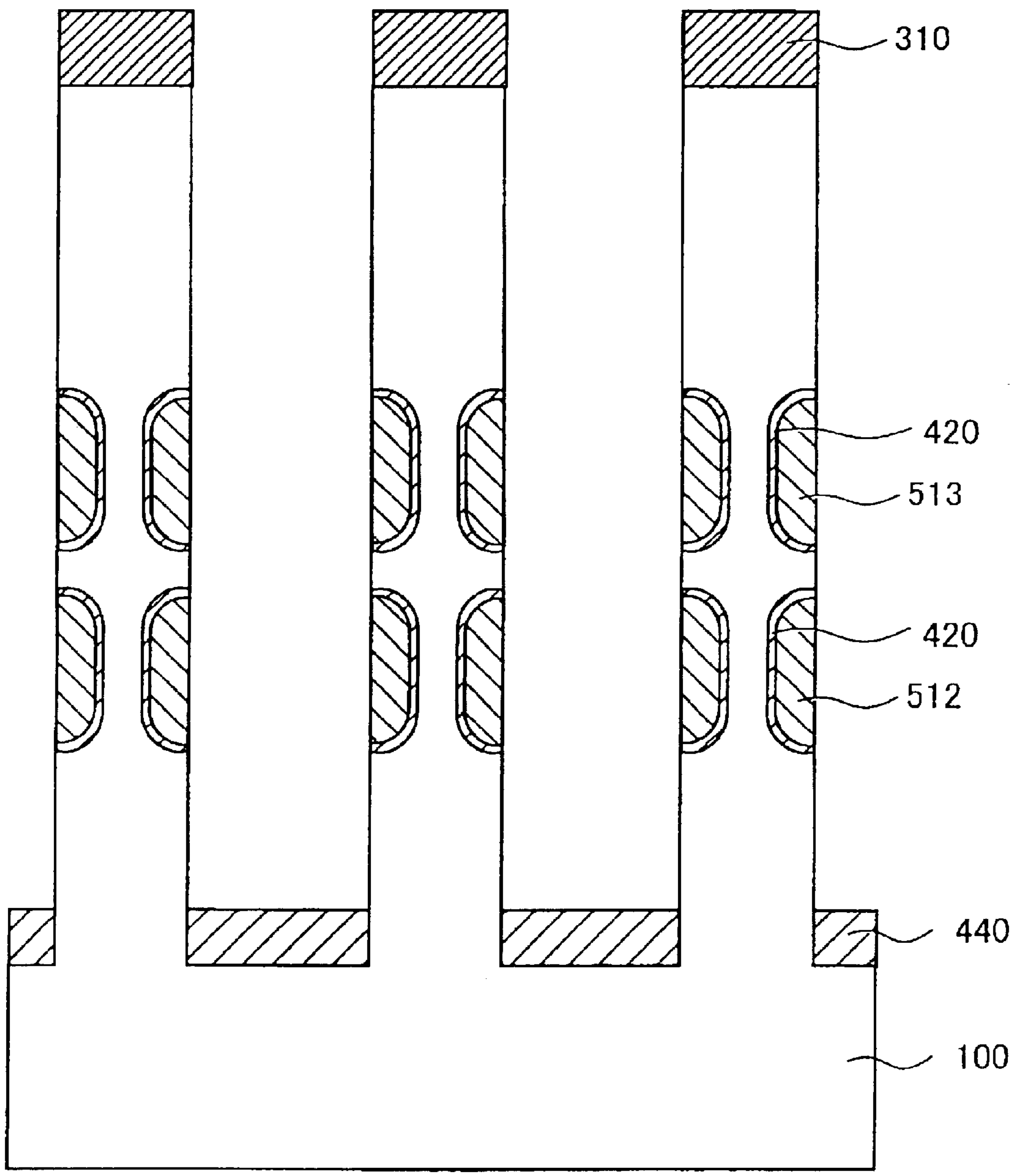

Then, a silicon oxide film 440 is deposited to a thickness of 50 to 500 nm as a sixth insulating film and etched back to a desired height to be buried (FIG. 366 and FIG. 392).

Thereafter, a silicon oxide film 431 is deposited to a thickness of 10 to 100 nm as a fifth insulating film and a silicon nitride film 321 is deposited to a thickness of 10 to 100 nm as a fourth insulating film.

Figure 367:
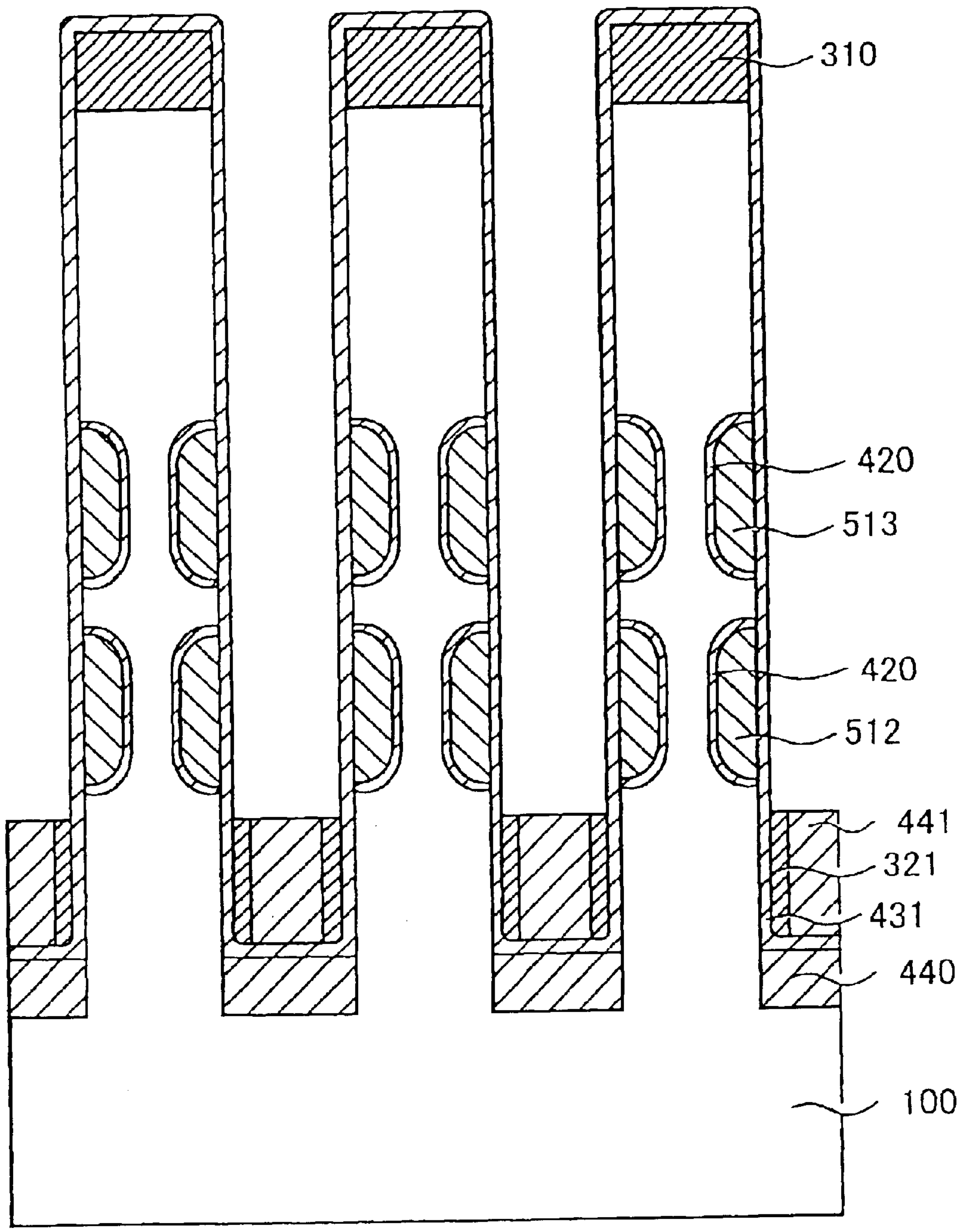
Figure 393:
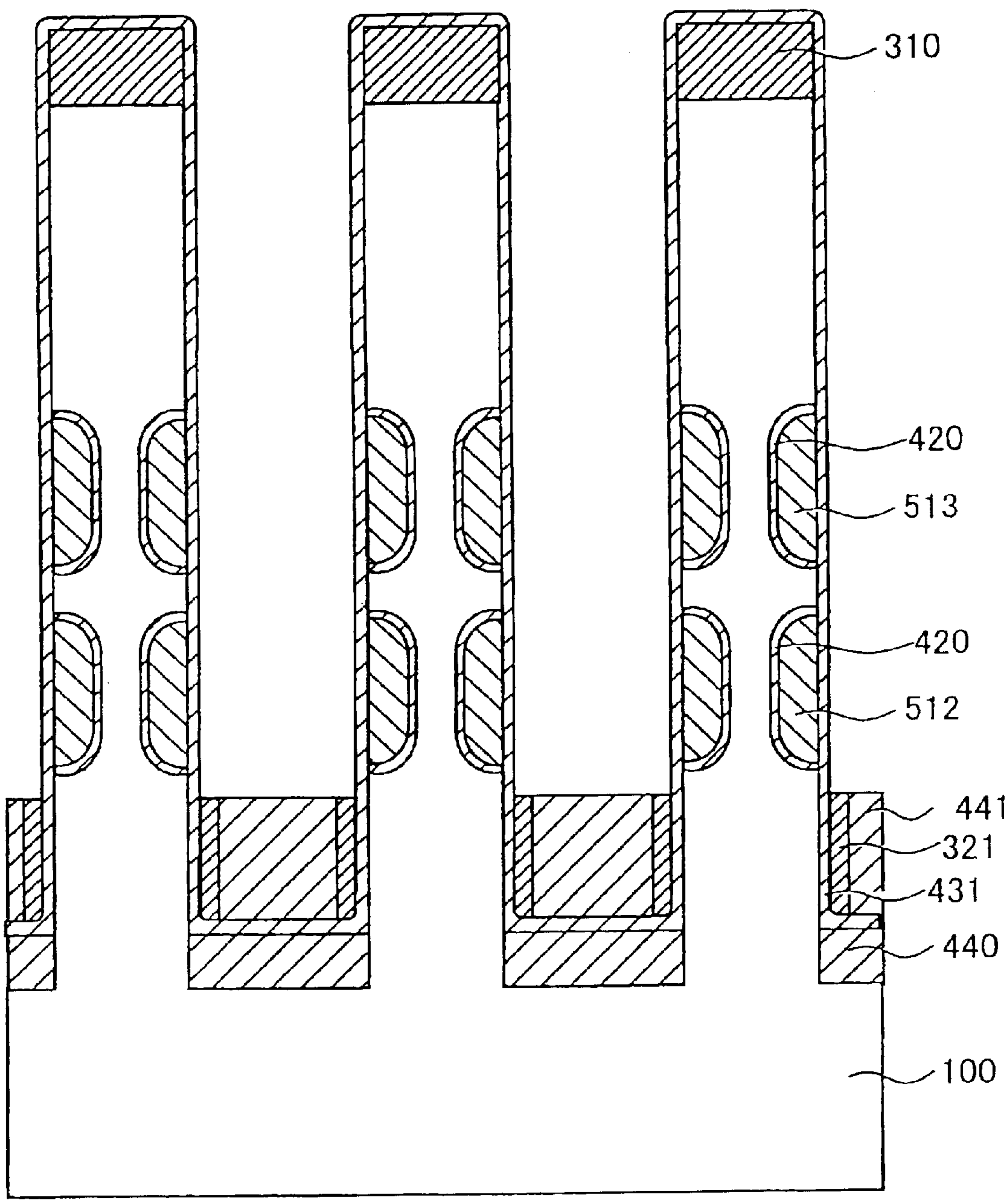

Further, a silicon oxide film 441 is deposited to a thickness of 50 to 500 nm as a sixth insulating film and etched back to a desired height by isotropic etching such that the silicon oxide film 441 is buried in the first trench 210. Then, using the silicon oxide film 441 as a mask, an exposed portion of the silicon nitride film 321 is removed by isotropic etching, for example (FIG. 367 and FIG. 393).

Figure 368:
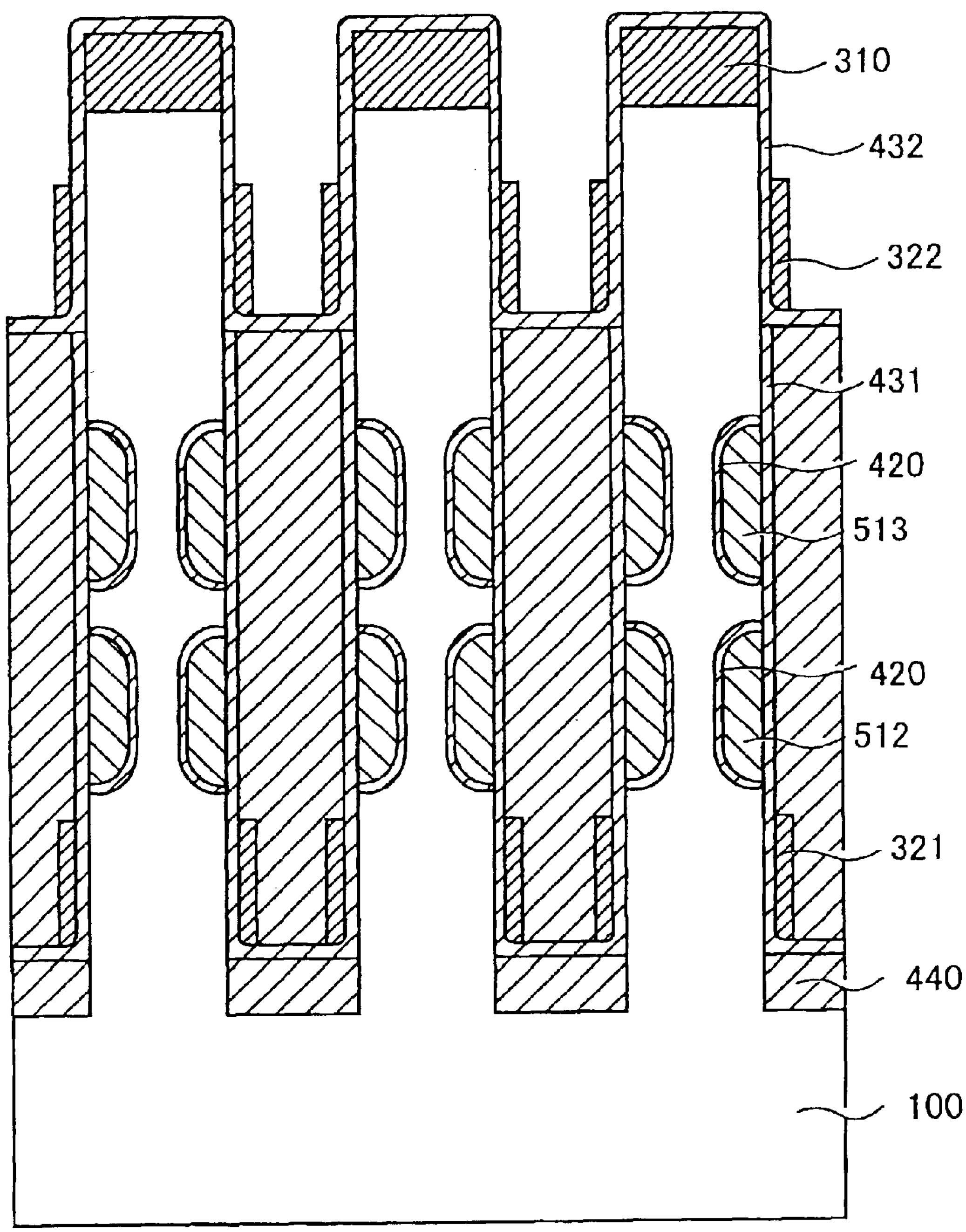
Figure 394:
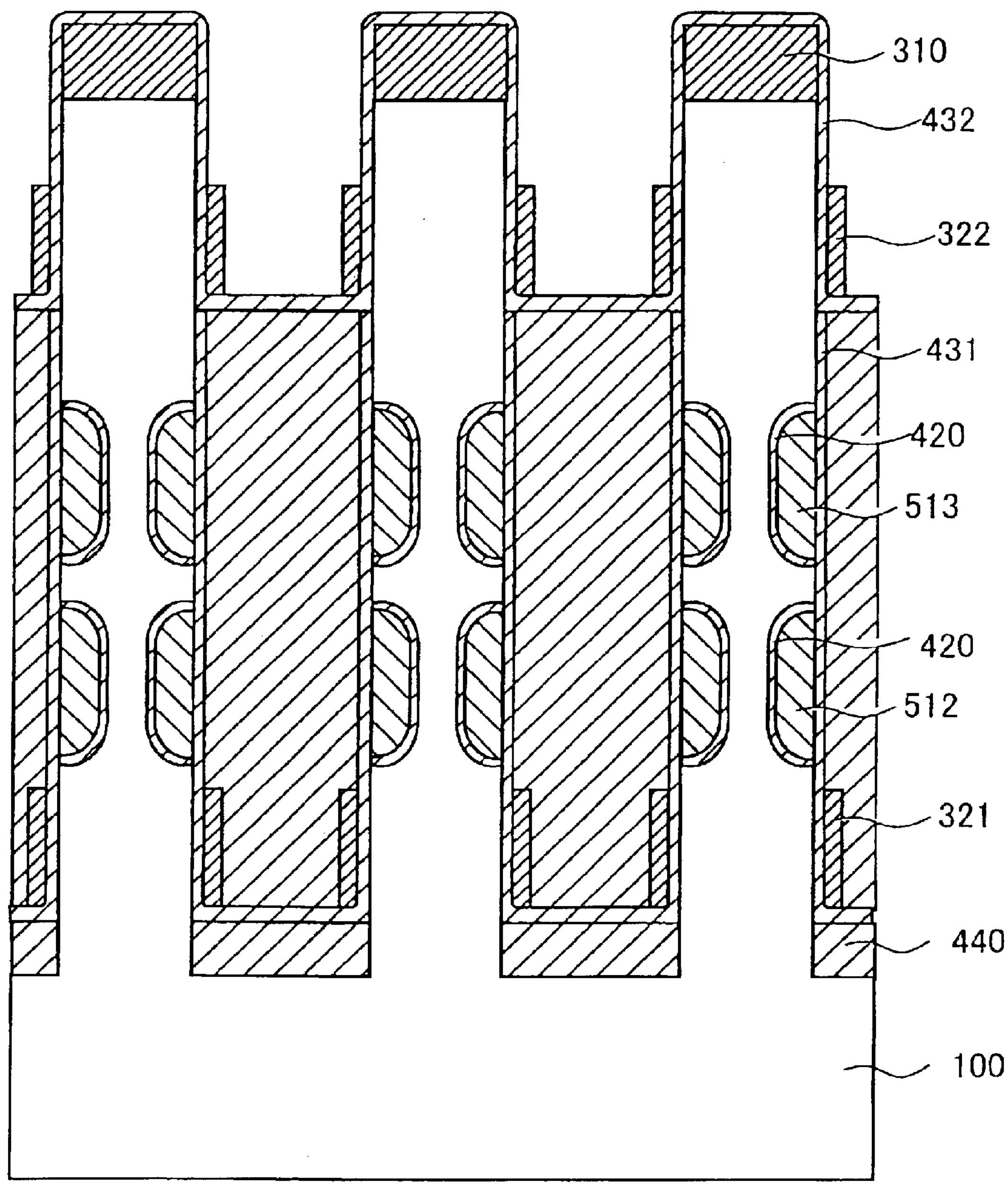

By repeating the above-described steps, the silicon nitride films 321 and 322 are disposed on the sidewall of the island-like semiconductor layer 110 with the intervention of the silicon oxide films 431 and 432, respectively (FIG. 368 and FIG. 394). After the silicon oxide films are selectively removed by isotropic etching.

Figure 369:
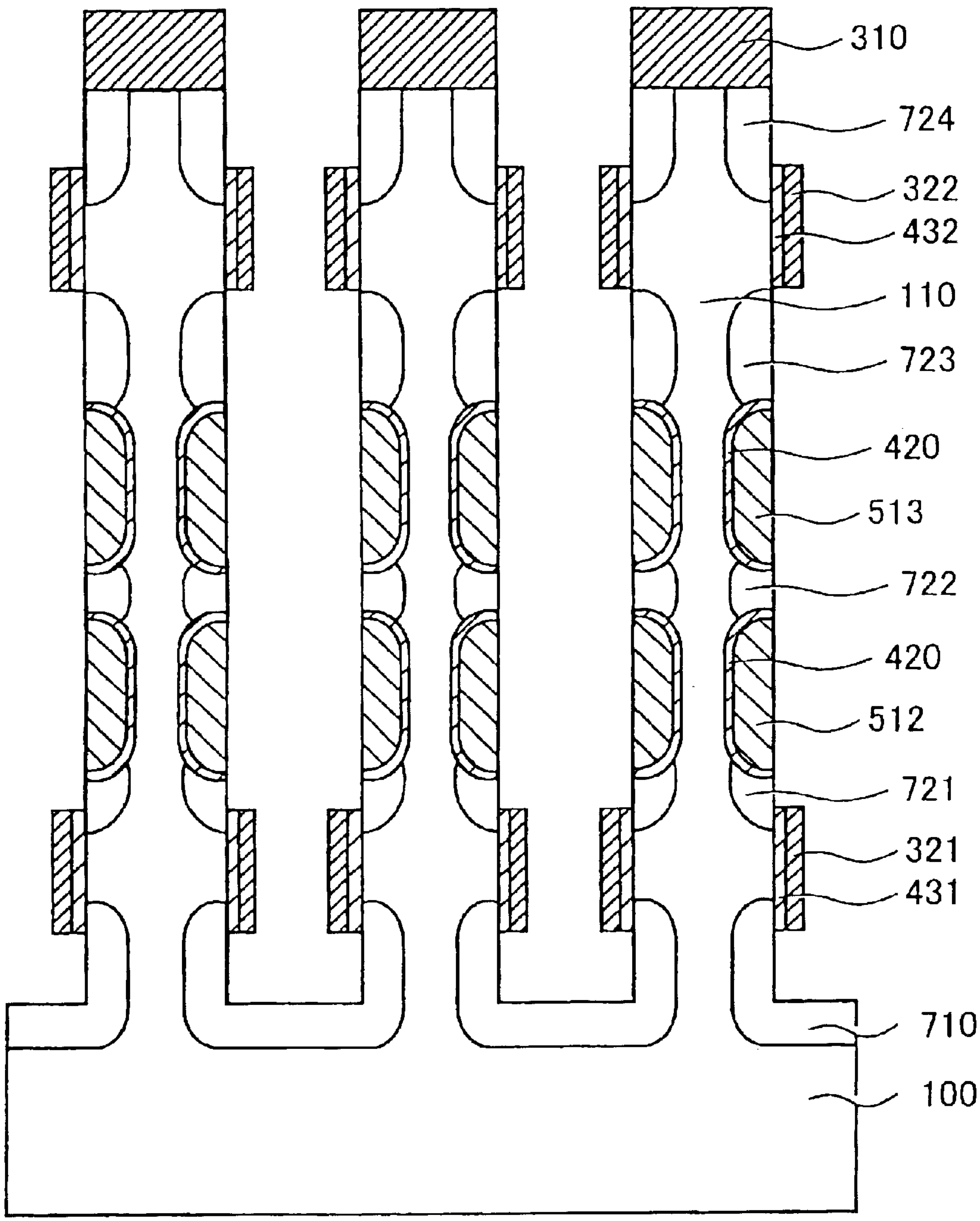
Figure 395:
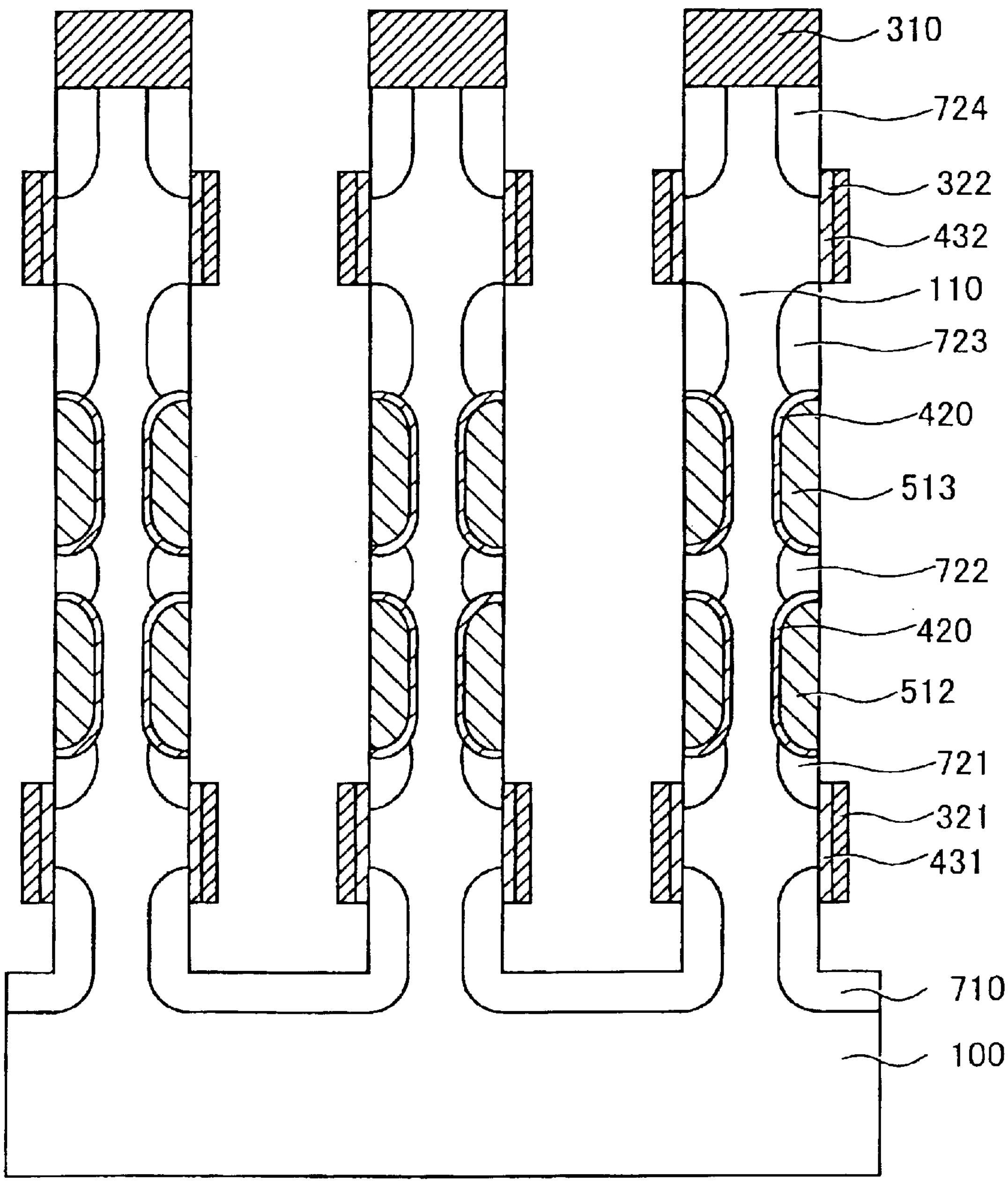

Then, impurities are introduced into the island-like semiconductor layer 110 and the semiconductor substrate 100 to form N-type impurity diffusion layers 710 to 724 (FIG. 369 and FIG. 395). For example, the ion implantation may be performed at an implantation energy of 5 to 100 keV at a arsenic or phosphorus dose of about $1\times10^{13}$ to $1\times10^{15}/cm^2$ in a direction inclined by about 0 to 7°. The ion implantation for formation of the N-type impurity diffusion layers 710 to 724 may be performed to the whole periphery of the island-like semiconductor layer 110, from one direction or various directions to the island-like semiconductor layers. That is, the N-type impurity diffusion layers 710 to 724 may not be formed to entirely encircle the island-like semiconductor layer. The timing of forming the impurity diffusion layer 710 is not necessarily the same as the timing of forming the N-type semiconductor layers 721 to 724.

Then, the silicon oxide films 431 and 432 and the silicon nitride films 321 and 322 are removed. As an eighth insulating film, for example, a silicon oxide film 461, is deposited to a thickness of 50 to 500 nm as a eighth insulating film and etched back to a desired height to be buried. Thereafter, a silicon oxide film 481 having a thickness of about 10 nm is formed as a thirteenth insulating film to be a gate oxide film on the periphery of the island-like semiconductor layer 110 by thermal oxidation. The gate oxide film, however, may be formed of not only a thermally oxidized film but also a CVD oxide film or a nitrogen oxide film. A relation between the thickness of the gate oxide film and that of the tunnel oxide film is not limited, but it is desired that the thickness of the gate oxide film is larger than that of the tunnel oxide film.

Subsequently, a polysilicon film 521 is deposited to a thickness of 15 to 150 nm as a second conductive film and anisotropically etched into the form of a sidewall spacer to form a selection gate. At this time, by setting the intervals between the island-like semiconductor layers 110 in a direction of A–A' in FIG. 1 to a predetermined value or smaller, the polysilicon film 521 is formed into a second wiring layer to be a selection gate line continuous in the direction without need to use a masking process.

Figure 370:
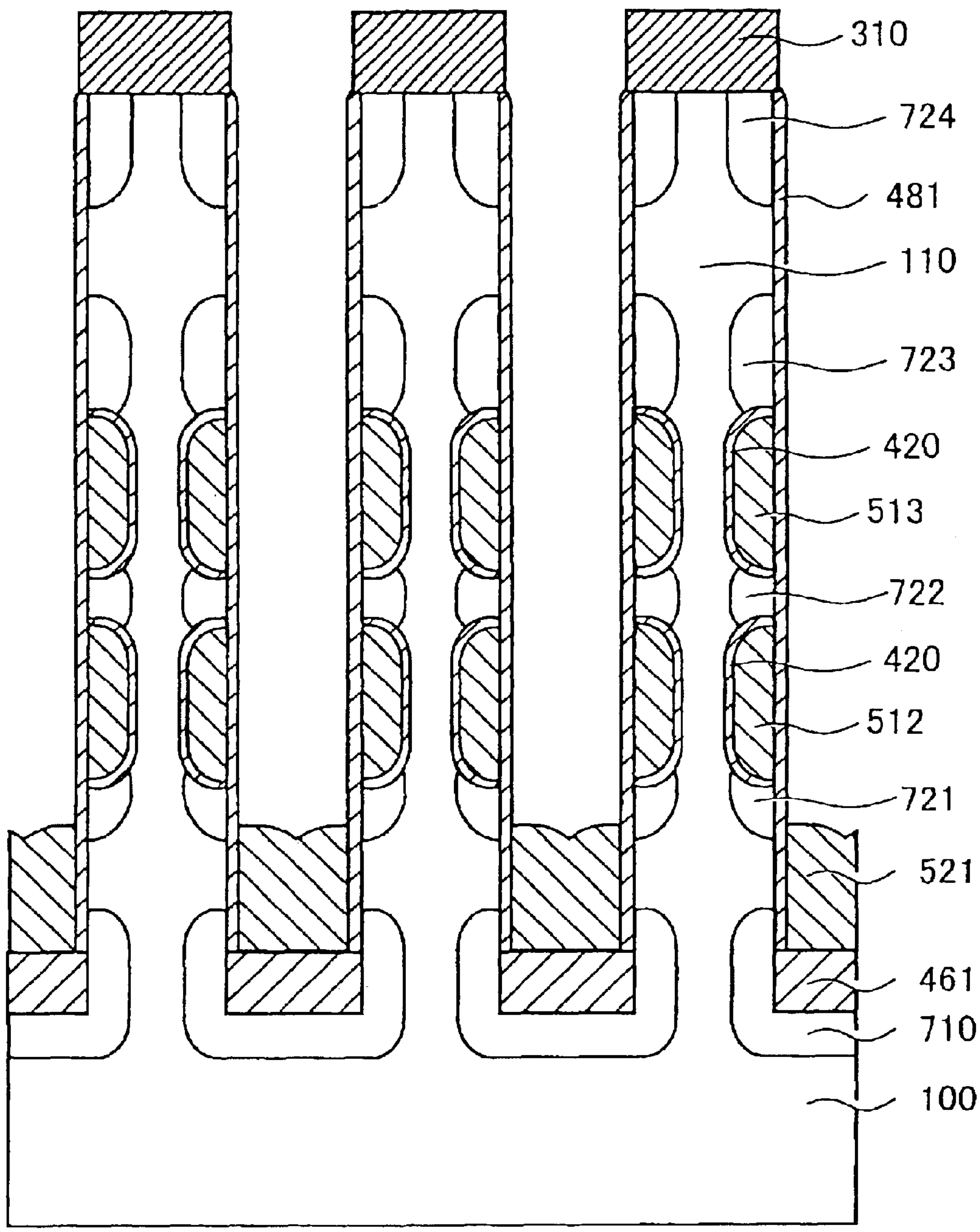
Figure 396:
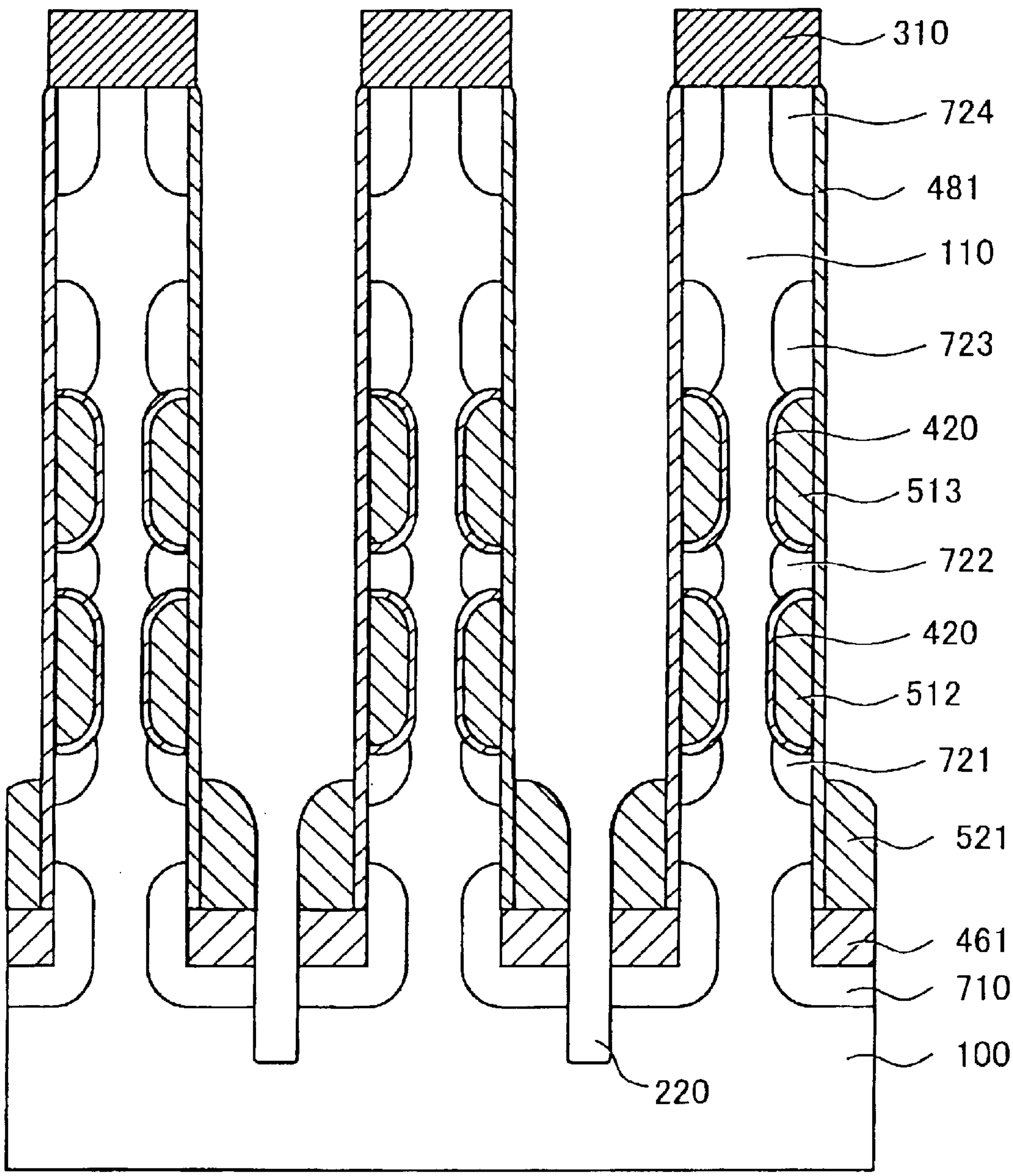

Then, as shown in FIG. 396, a second trench 220 is formed on the P-type silicon substrate 100 in self-alignment with the polysilicon film 521, thereby separating the impurity diffusion layer 710 (FIG. 370 and FIG. 396). That is, a separation portion of the first wiring layer is formed in self-alignment with a separation portion of the second conductive film.

Figure 371:
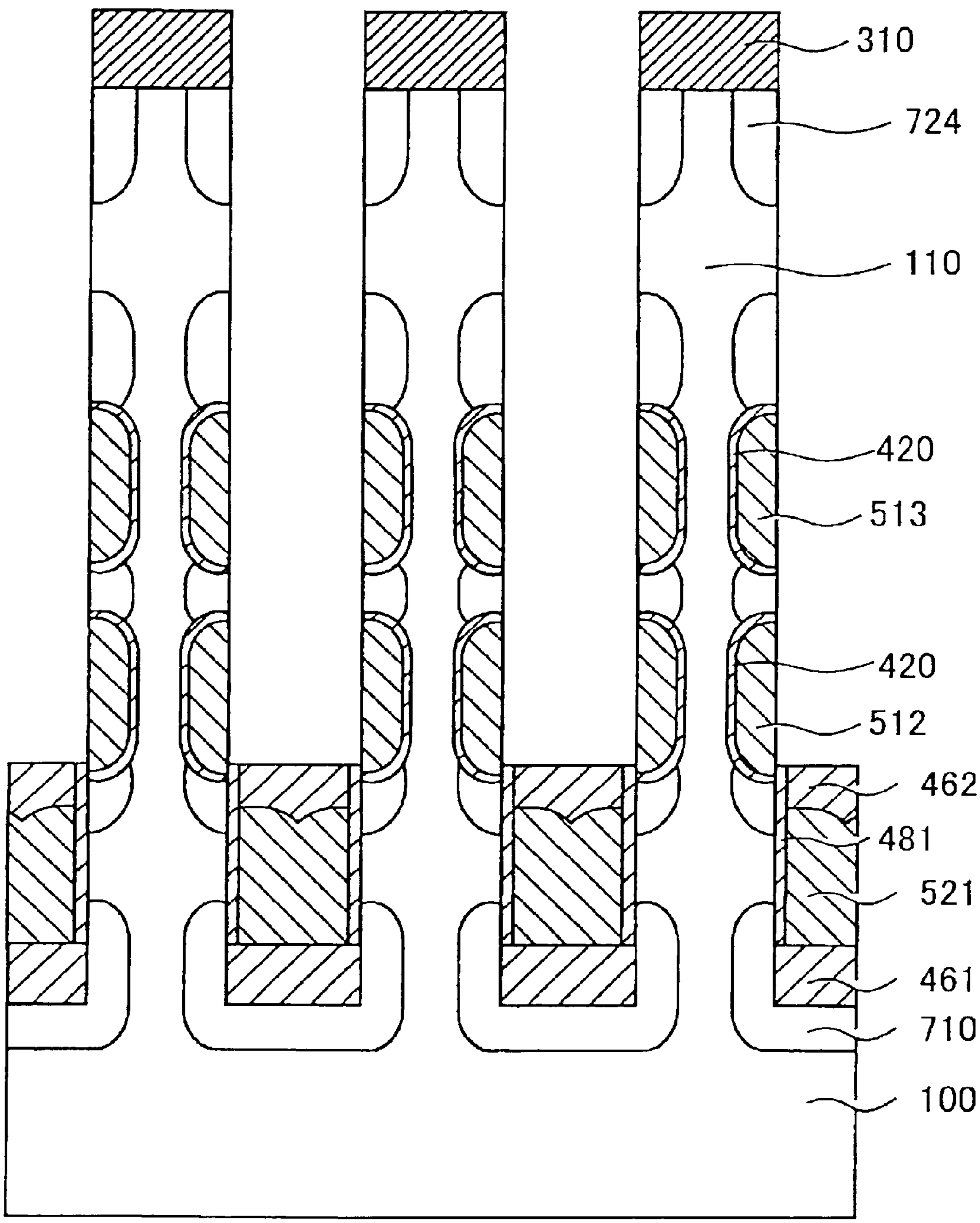
Figure 397:
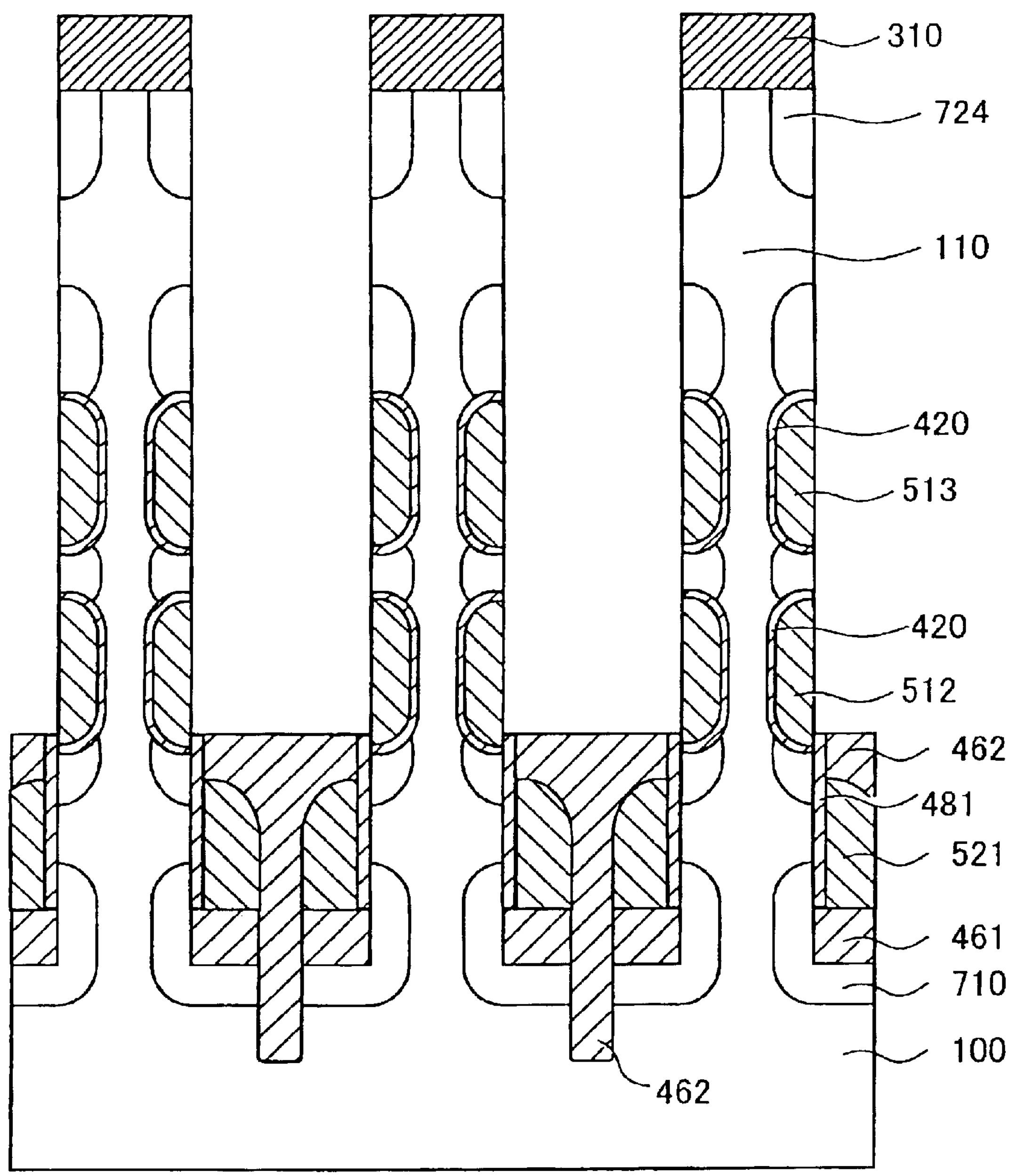
Figure 398:
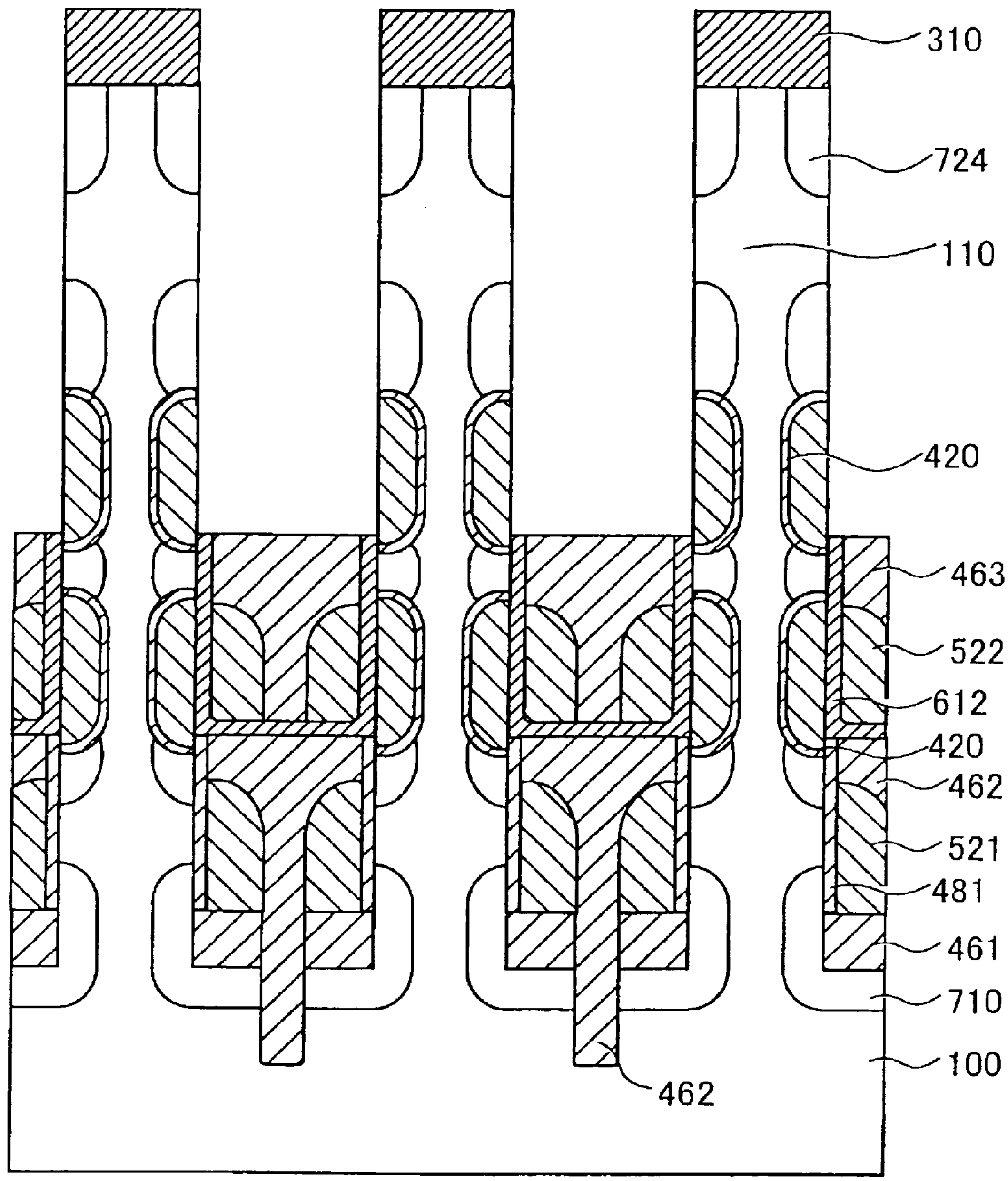

A silicon oxide film 462 is deposited to a thickness of 50 to 500 nm as an eighth insulating film and anisotropically and isotropically etched so that the silicon oxide film 462 is embedded to bury the side and top of the polysilicon film 521 (FIG. 371 and FIG. 397).

Then, an interlayer insulating film 612 is formed on the exposed surfaces of the polysilicon films 512 and 513. This interlayer insulating film 612 may be formed of an ONO film, for example. More particularly, a silicon oxide film of 5 to 10 nm thickness is formed on the surface of the polysilicon film by thermal oxidization, and then, a silicon nitride film of 5 to 10 nm thickness and a silicon oxide film of 5 to 10 nm thickness are formed sequentially by CVD.

Subsequently, a polysilicon film 522 is deposited to a thickness of 15 to 150 nm as a second conductive film and etched back such that the polysilicon film 522 remains on the side of the polysilicon film 512 with the intervention of the interlayer insulating film 612. At this time, by setting the intervals between the island-like semiconductor layers 2110 in a direction of A–A' in FIG. 1 to a predetermined value or smaller, the polysilicon film 522 is formed into a third wiring layer to be a control gate line continuous in the direction without need to use a masking process.

Figure 372:
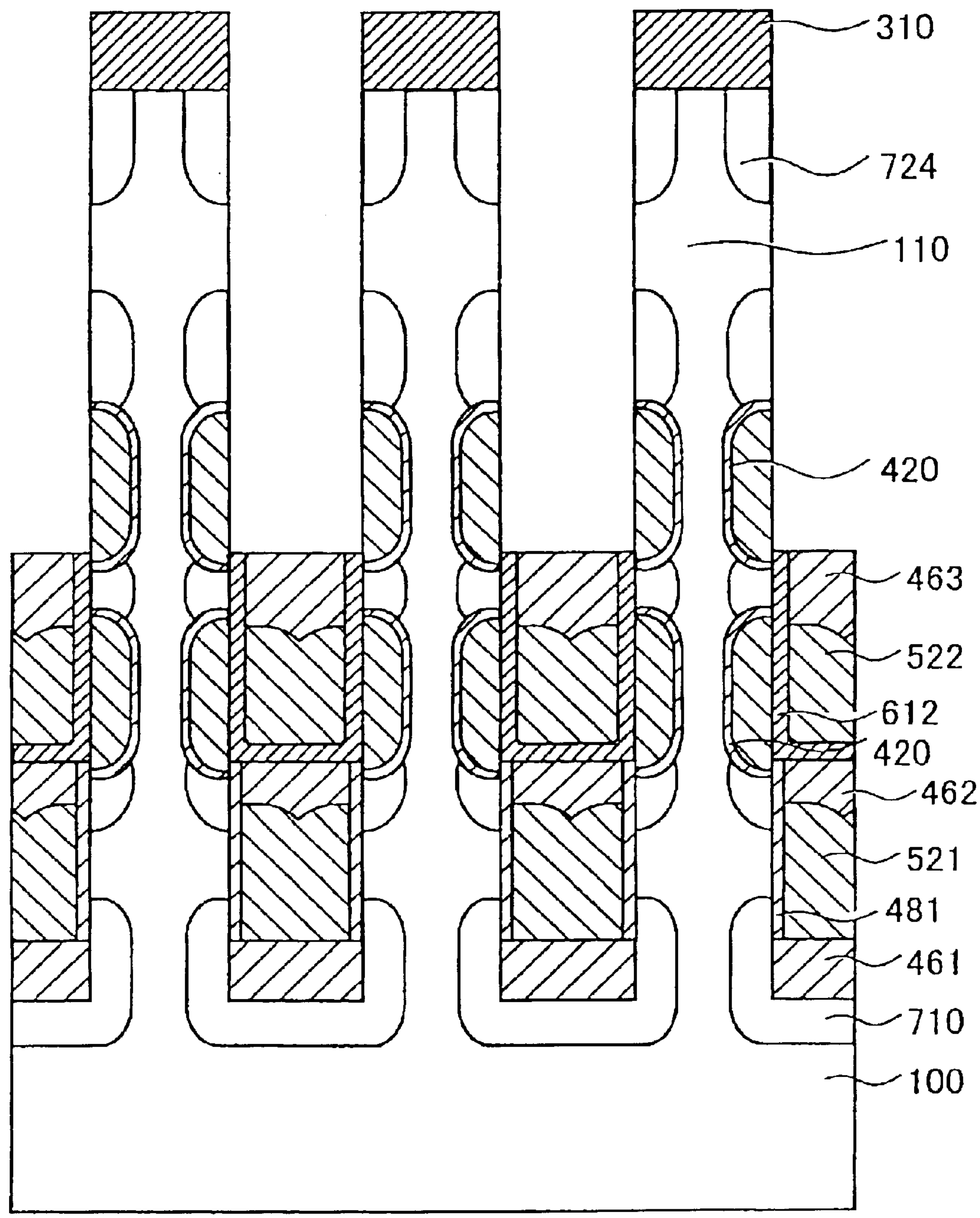

Then, a silicon oxide film 463 is deposited to a thickness of 50 to 500 nm as a eighth insulating film and anisotropically and isotropically etched so that the silicon oxide film 463 is embedded to bury the side and top of the polysilicon film 522 (FIG. 372 and FIG. 298).

Figure 373:
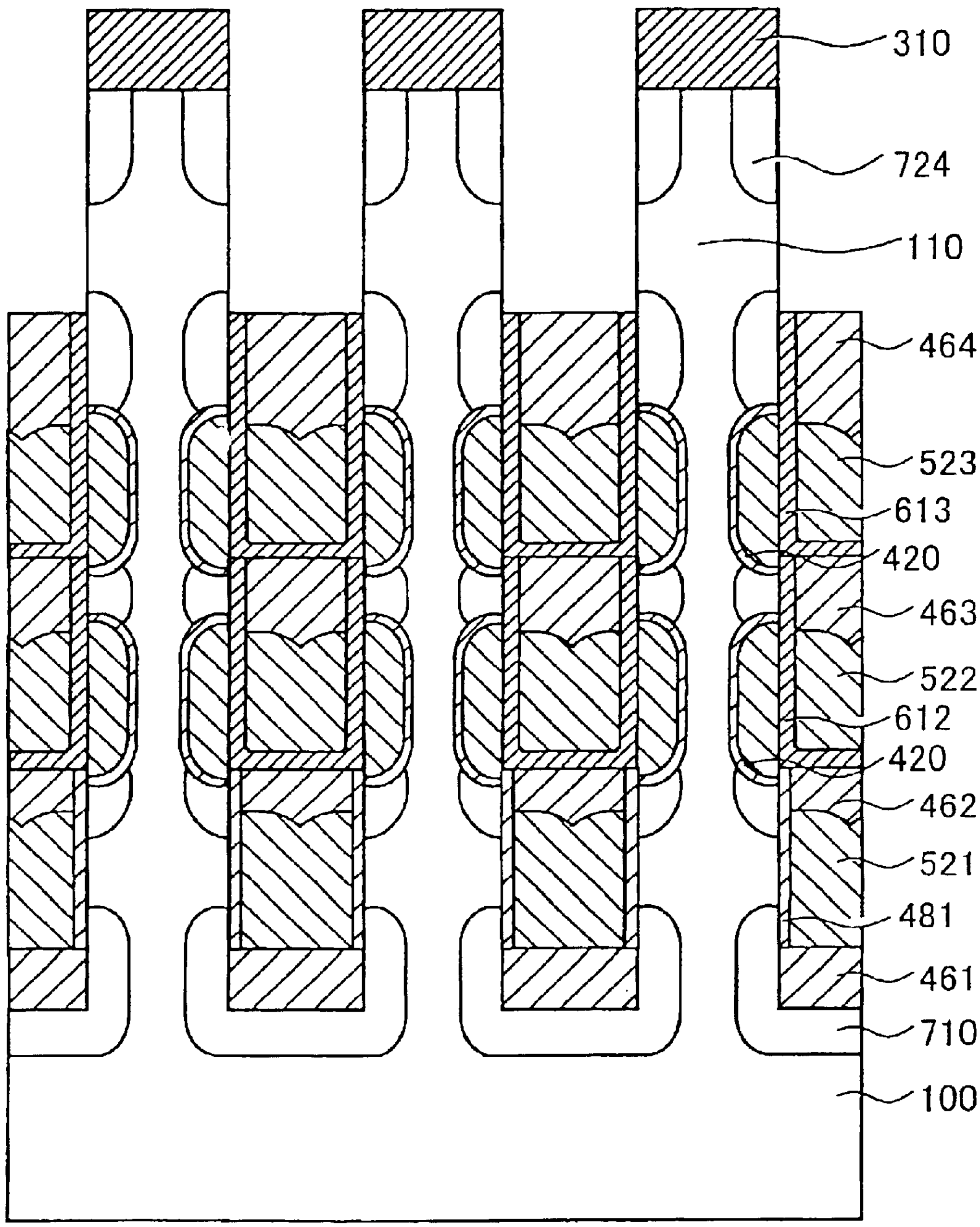
Figure 399:
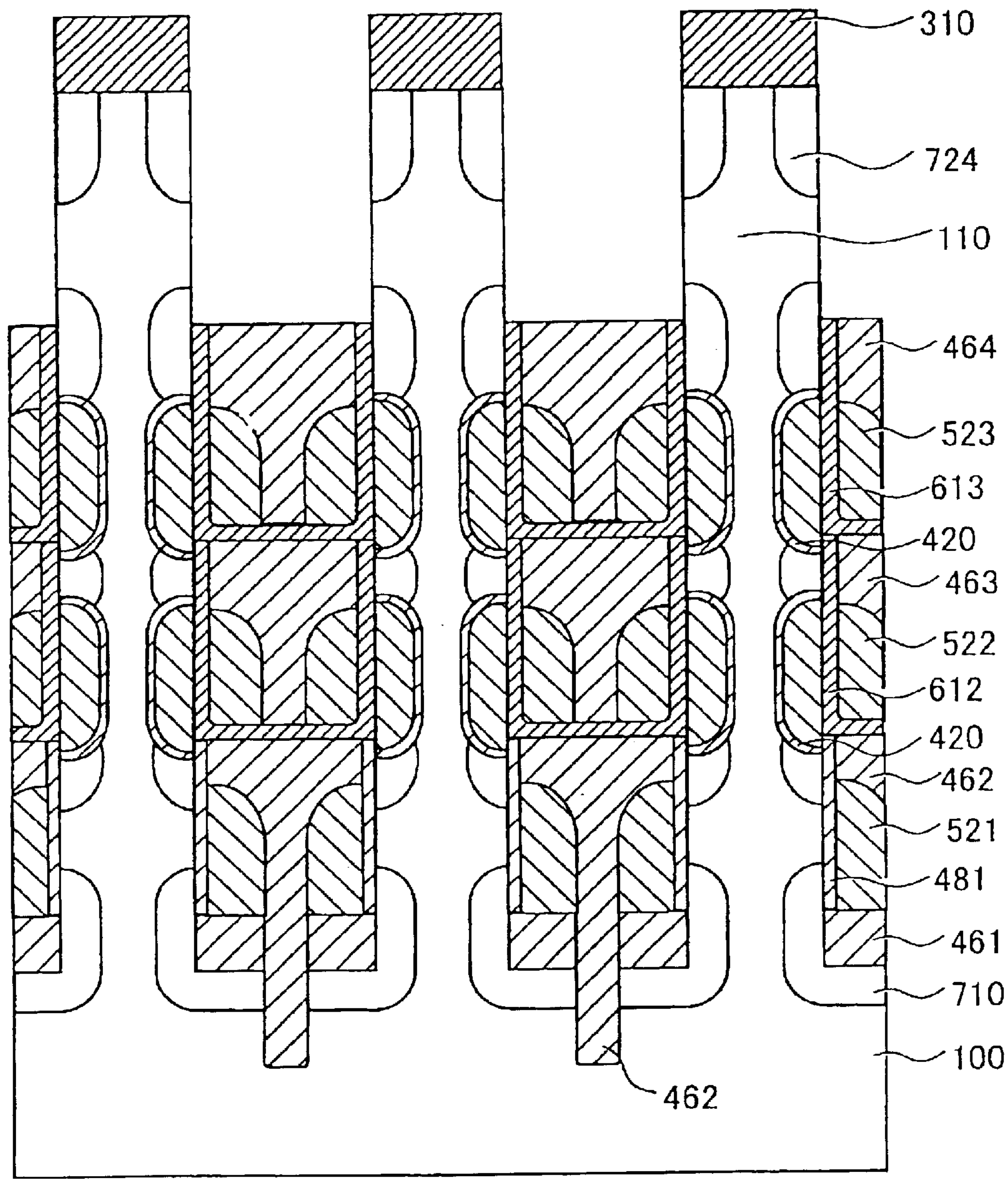

By repeating likewise, a polysilicon film 523 is disposed on the side of the polysilicon film 513 with the intervention of an interlayer insulating film 613 and a silicon oxide film 464 is embedded to bury the side and top of the polysilicon film 523 (FIG. 373 and FIG. 399).

Figure 374:
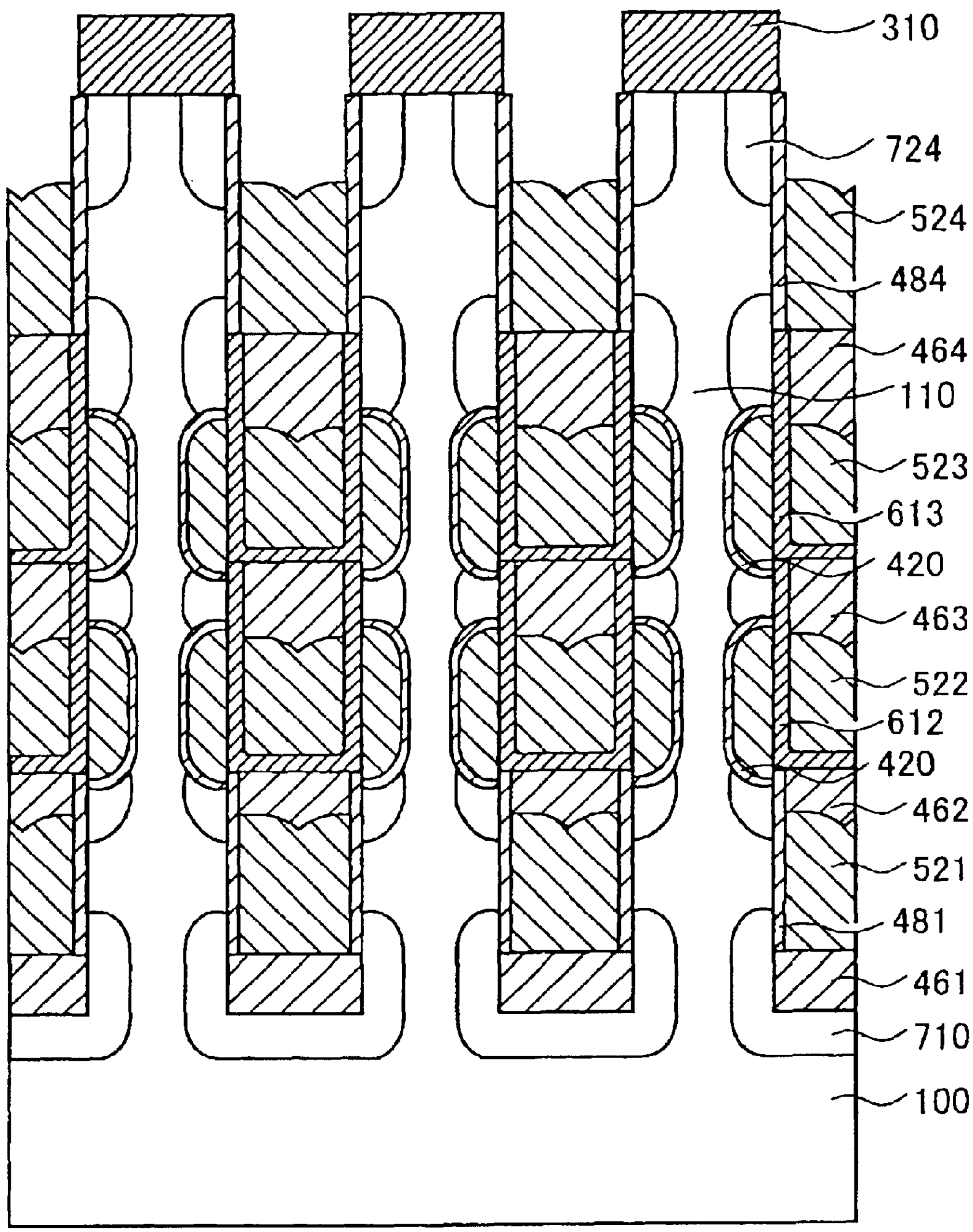
Figure 400:
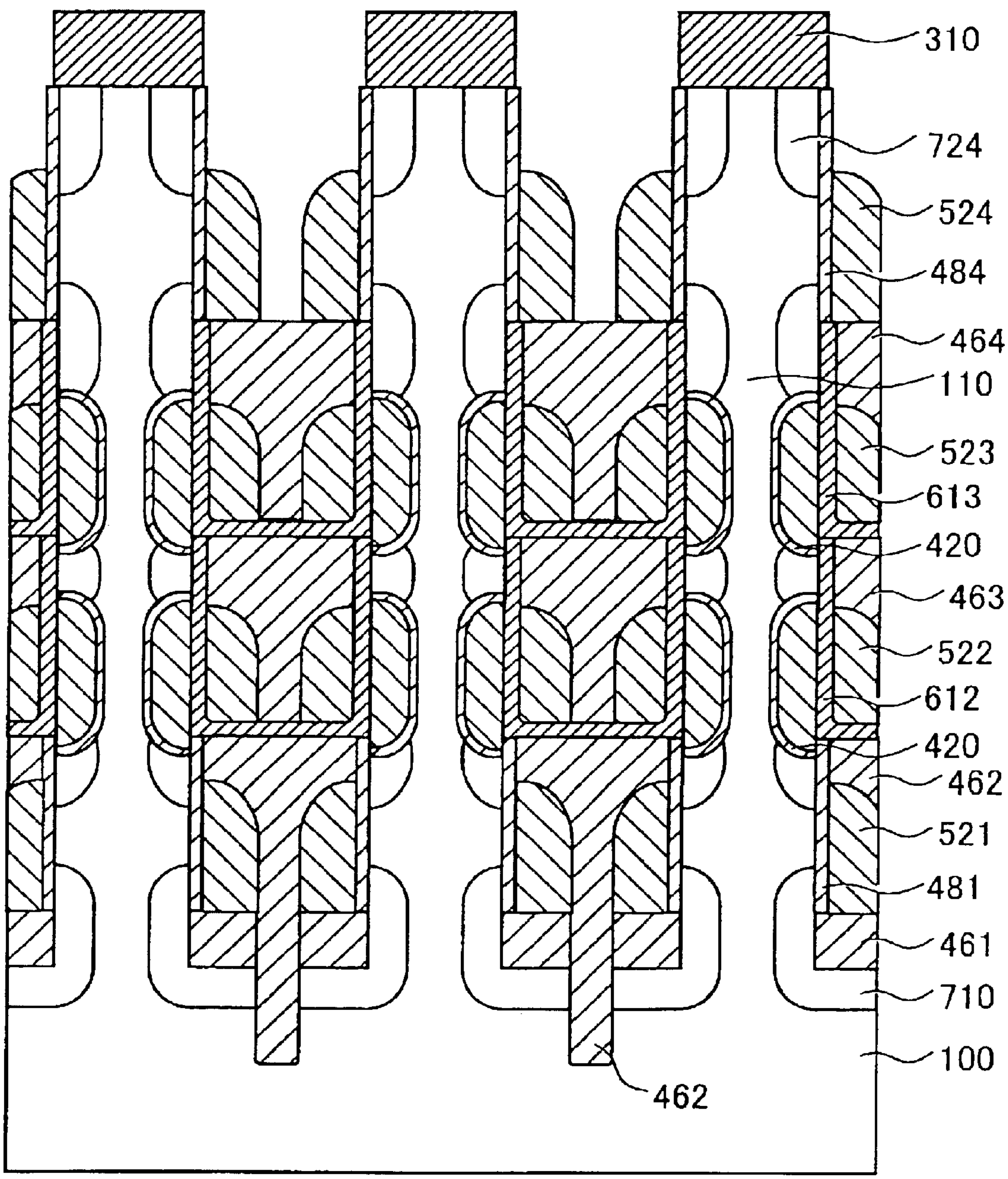

Subsequently, a polysilicon film 524 is deposited to a thickness of 15 to 150 nm and anisotropically etched into the form of a sidewall spacer (FIG. 374 and FIG. 400).

Figure 375:
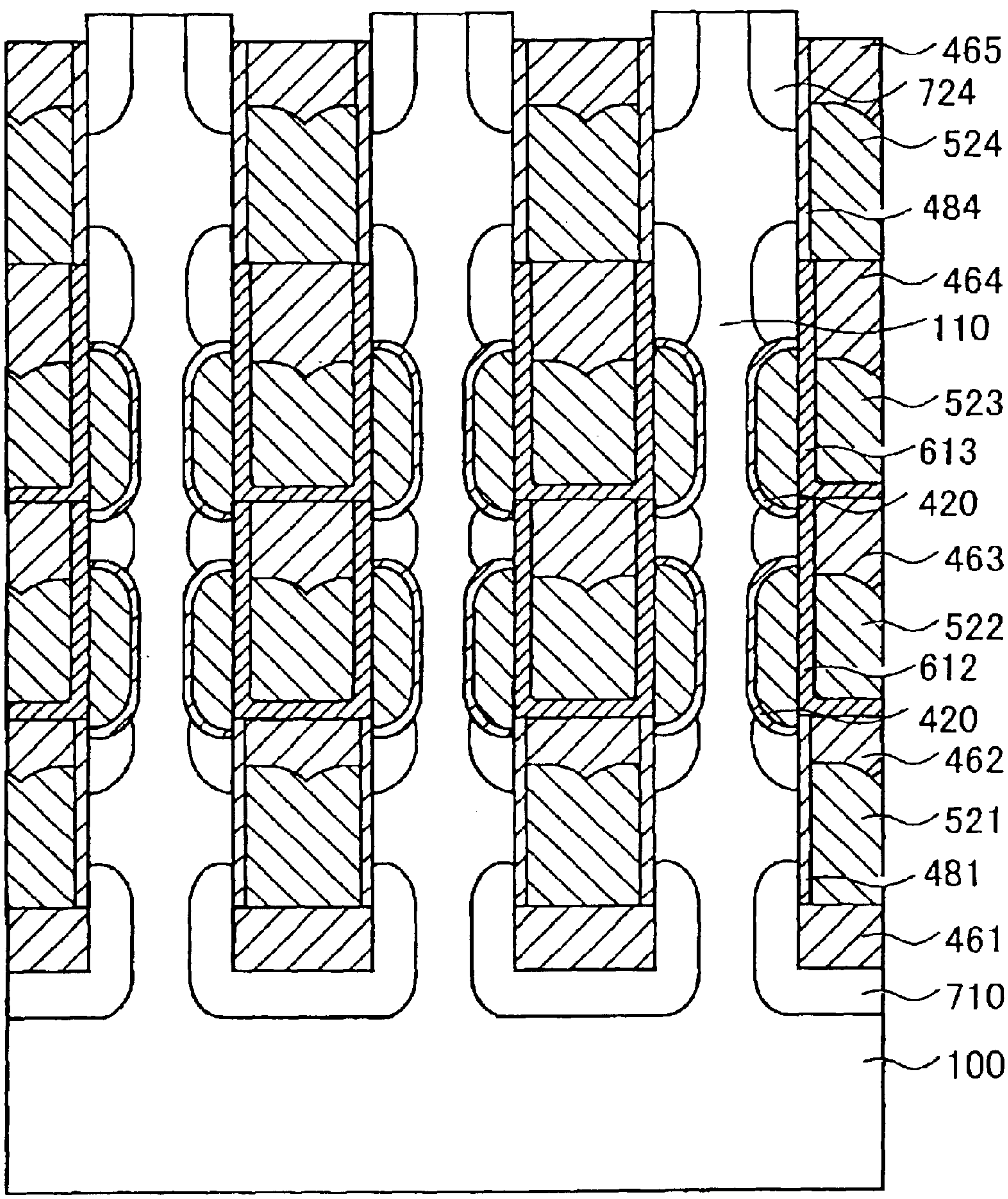
Figure 401:
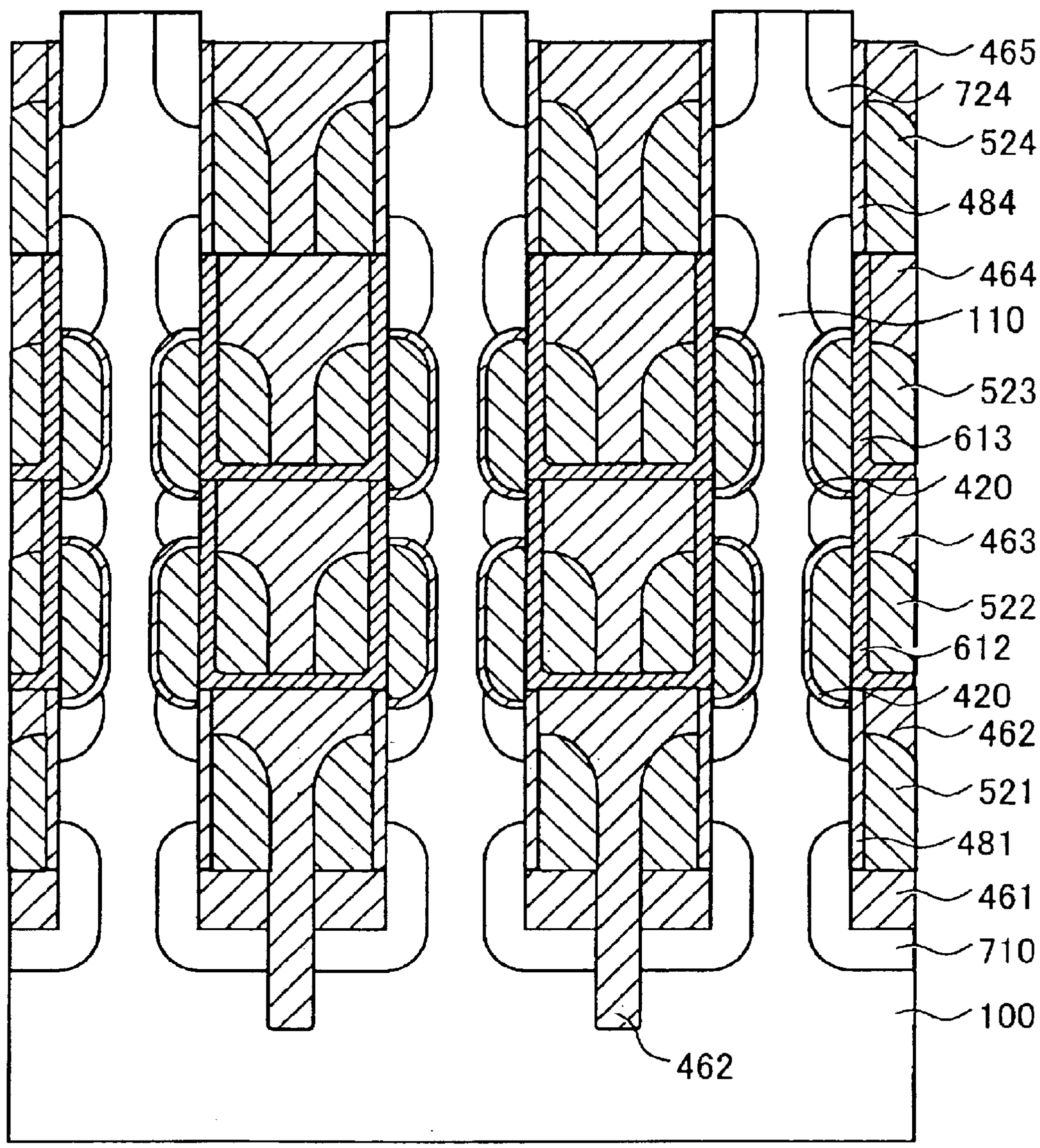

On the top of the polysilicon film 524, a silicon oxide film 465 is deposited to a thickness of 100 to 500 nm as a tenth insulating film. The top of the island-like semiconductor layer 110 provided with the impurity diffusion layer 724 is exposed by etch-back or CMP (FIG. 375 and FIG. 401).

As required, ion implantation is carried out with respect to the top of the island-like semiconductor layer 110 to adjust the impurity concentration. Then, a fourth wiring layer 840 is connected to the top of the island-like semiconductor layer 110 so that the direction of the fourth wiring layer crosses the direction of the second or the third wiring layer.

Then, by known techniques, an interlayer insulating film is formed and a contact hole and metal wiring are formed. Thereby, a semiconductor memory is realized which has a memory function according to the state of a charge in the charge storage layer which is the floating gate made of the polysilicon film as the first conductive film (FIG. 376 and FIG. 402).

Figure 376:
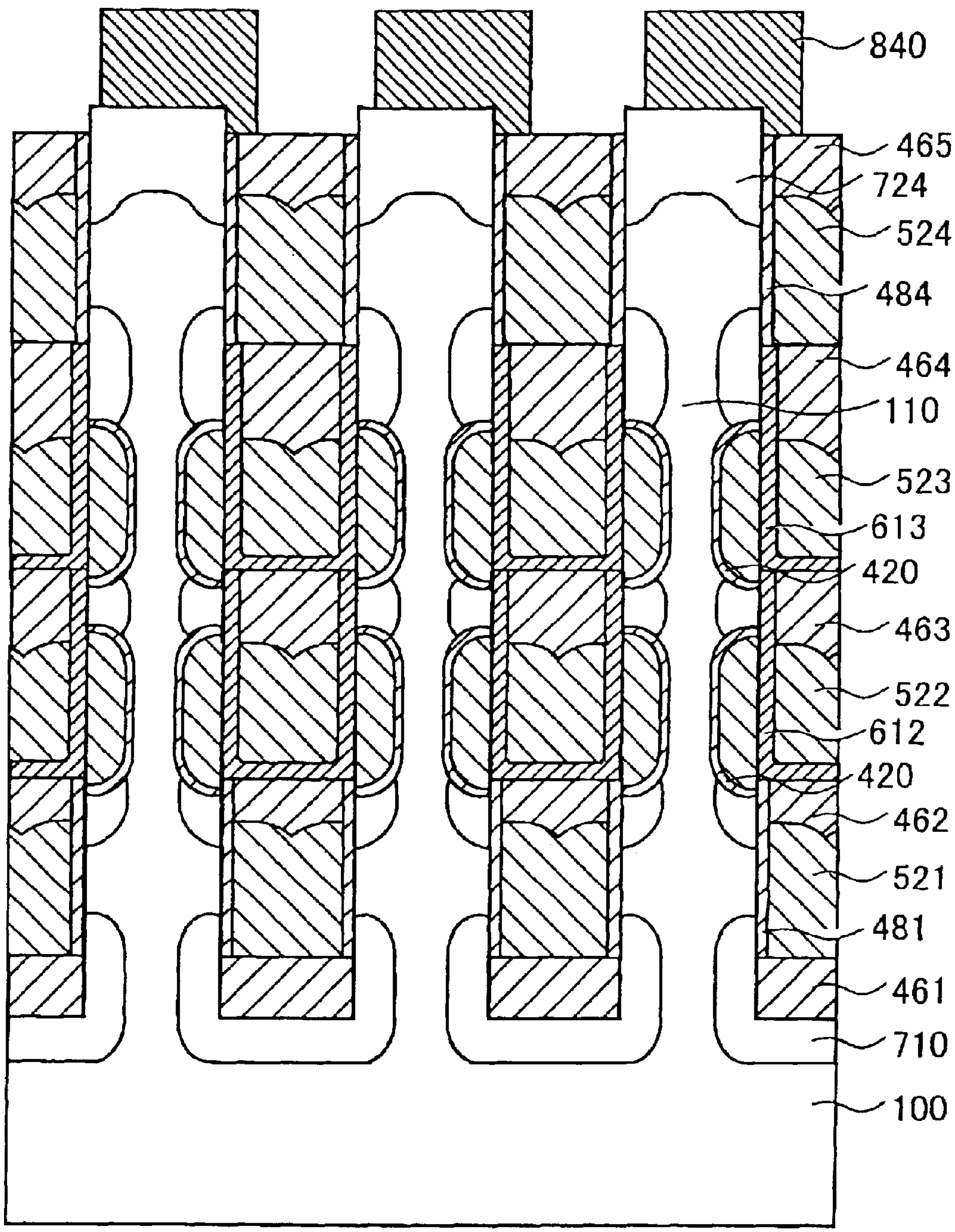
Figure 377:
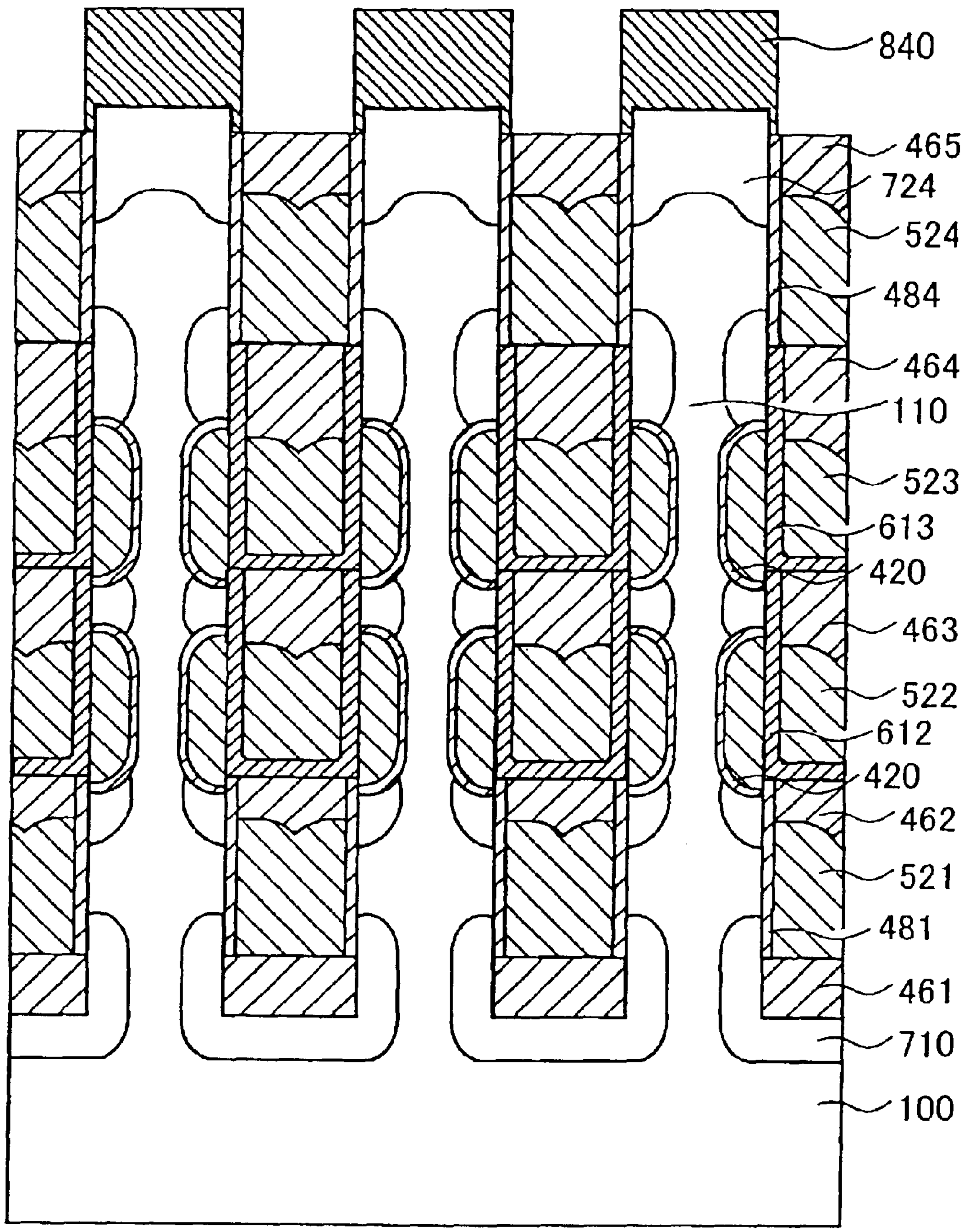
Figure 402:
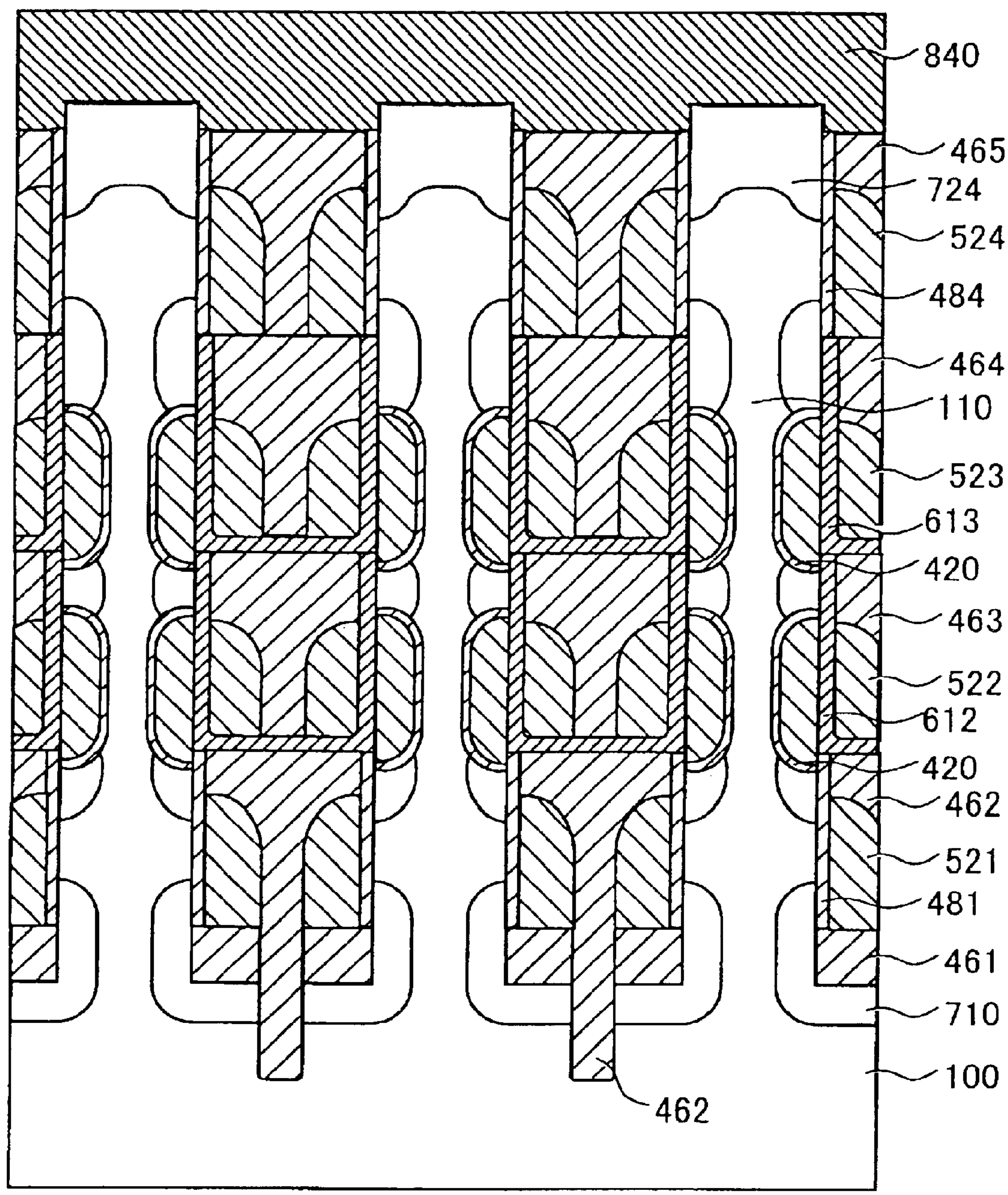
Figure 403:
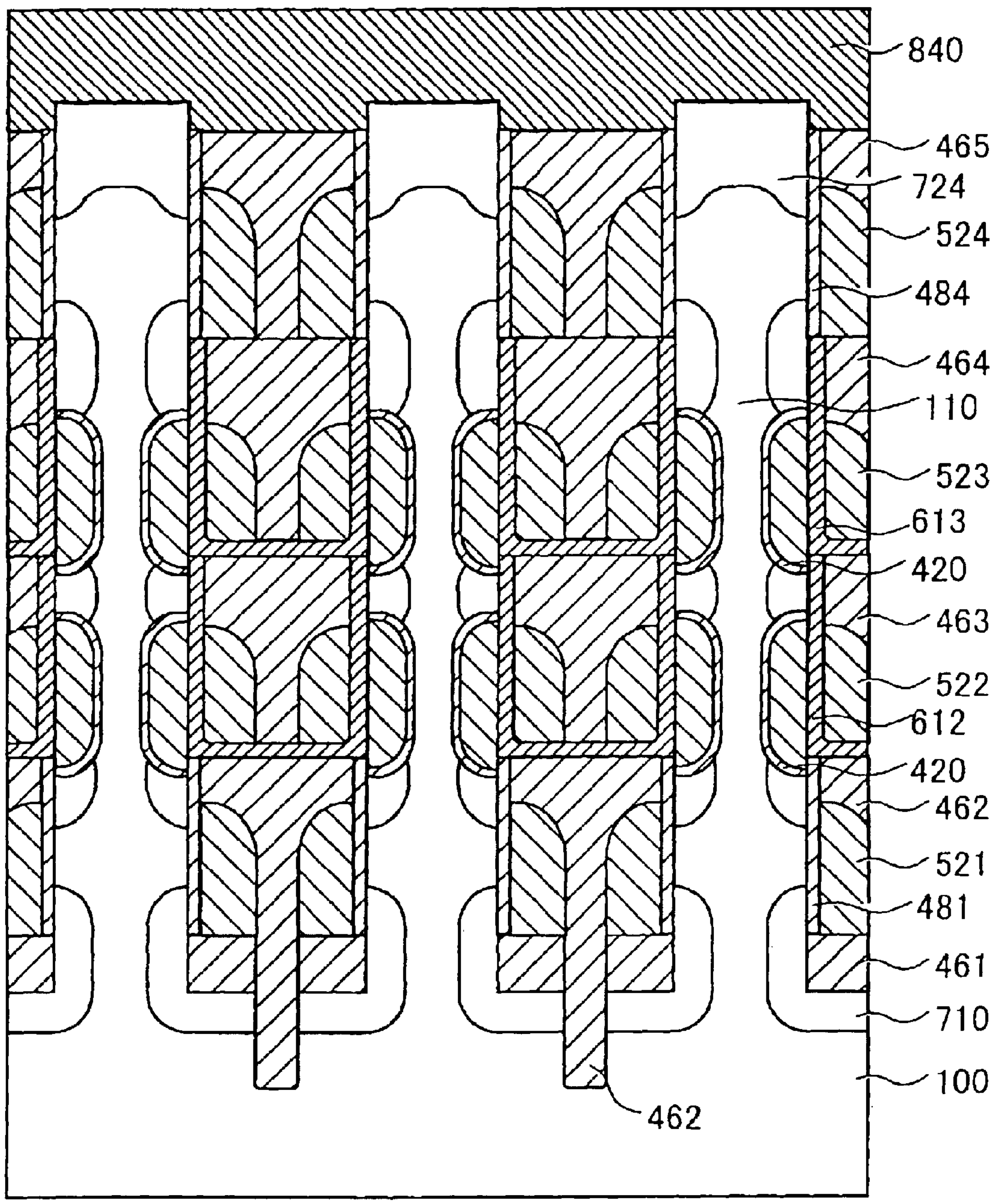

FIG. 376 and FIG. 402 show that the fourth wiring layer 840 is mis-aligned with respect to the island-like semiconductor layer 110. However, it is preferred that the fourth wiring layer 840 is formed without mis-alignment as shown in FIG. 377 and FIG. 403.

In this production example, the first lattice-form trench 210 is formed on the P-type semiconductor substrate, as an example. However, the first lattice-form trench 210 may be formed in a P-type impurity diffusion layer formed in an N-type semiconductor substrate, or in a P-type impurity diffusion layer formed in an N-type impurity diffusion layer formed in a P-type silicon substrate. The conductivity types of the impurity diffusion layers may be reversed.

In this production example, films formed on the surface of the semiconductor substrate or the polysilicon film such as the silicon nitride film 310 may be formed of a layered film of a silicon oxide film/a silicon nitride film from the silicon surface. Means of forming the silicon oxide film to be buried is not limited to CVD, and rotational application may be used, for example.

In this production example, the control gates of the memory cells are formed continuously in one direction without using a mask. However, that is possible only where the island-like semiconductor layers are not disposed symmetrically to a diagonal. More particularly, by setting smaller the intervals between adjacent island-like semiconductor layers in the direction of the second or the third wiring layers than those in the direction of the fourth wiring layer, it is possible to automatically obtain the wiring layers which are discontinuous in the direction of the fourth wiring layer and are continuous in the direction of the second or the third wiring layers without using a mask. In contrast, if the island-like semiconductor layers are disposed symmetrically to a diagonal, for example, the wiring layers may be separated through patterning with use of resist films by photolithography.

By providing the selection gates in the top and the bottom of a set of memory cells, it is possible to prevent the phenomenon that a memory cell transistor is over-erased, i.e., a reading voltage is 0V and a threshold is negative, thereby the cell current flows even through a non-selected cell.

PRODUCTION EXAMPLE 40

In a semiconductor memory to be produced in this example, a semiconductor substrate is patterned in the form of pillars to form island-like semiconductor layers having at least one recess. Sides of the island-like semiconductor layers make active regions. Tunnel oxide films and floating gates as charge storage layers are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Figure 404:
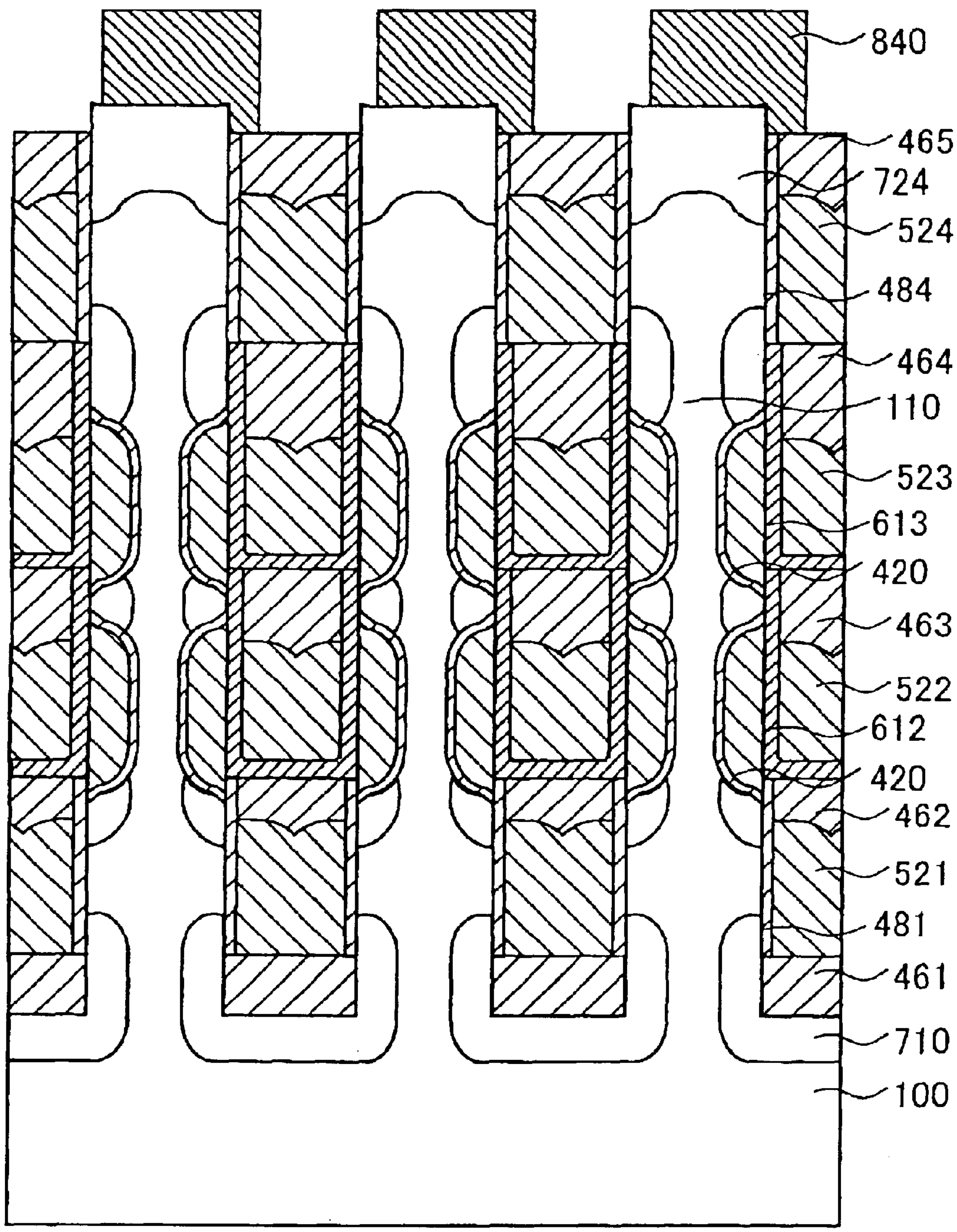
Figure 405:
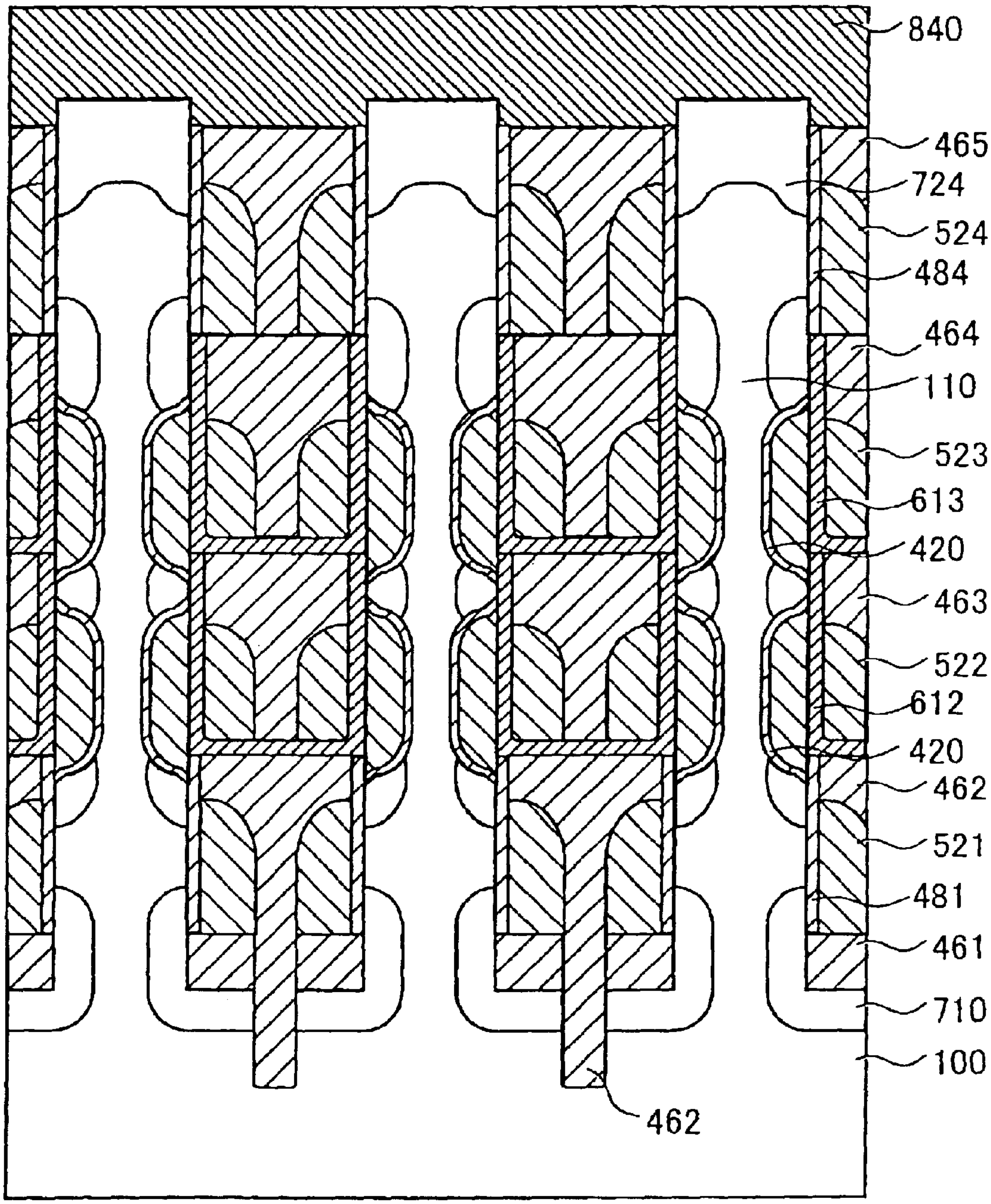

In this production example, at least one recess to be formed in the island-like semiconductor layer 110 does not have a simple concave shape as shown in FIG. 404 and FIG. 405. More specifically, during the formation of a silicon oxide film 450 (a seventh insulating film) by thermal oxidation, the island-like semiconductor layer 110 located inside a silicon nitride film 322 (a fourth insulating film) is partially oxidized, thereby the recesses of such a shape are formed. However, such recesses are also sufficiently used. The shape of the recesses is not particularly limited as long as the diameter of the island-like semiconductor layer 110 is partially reduced by the recesses.

Figure 406:
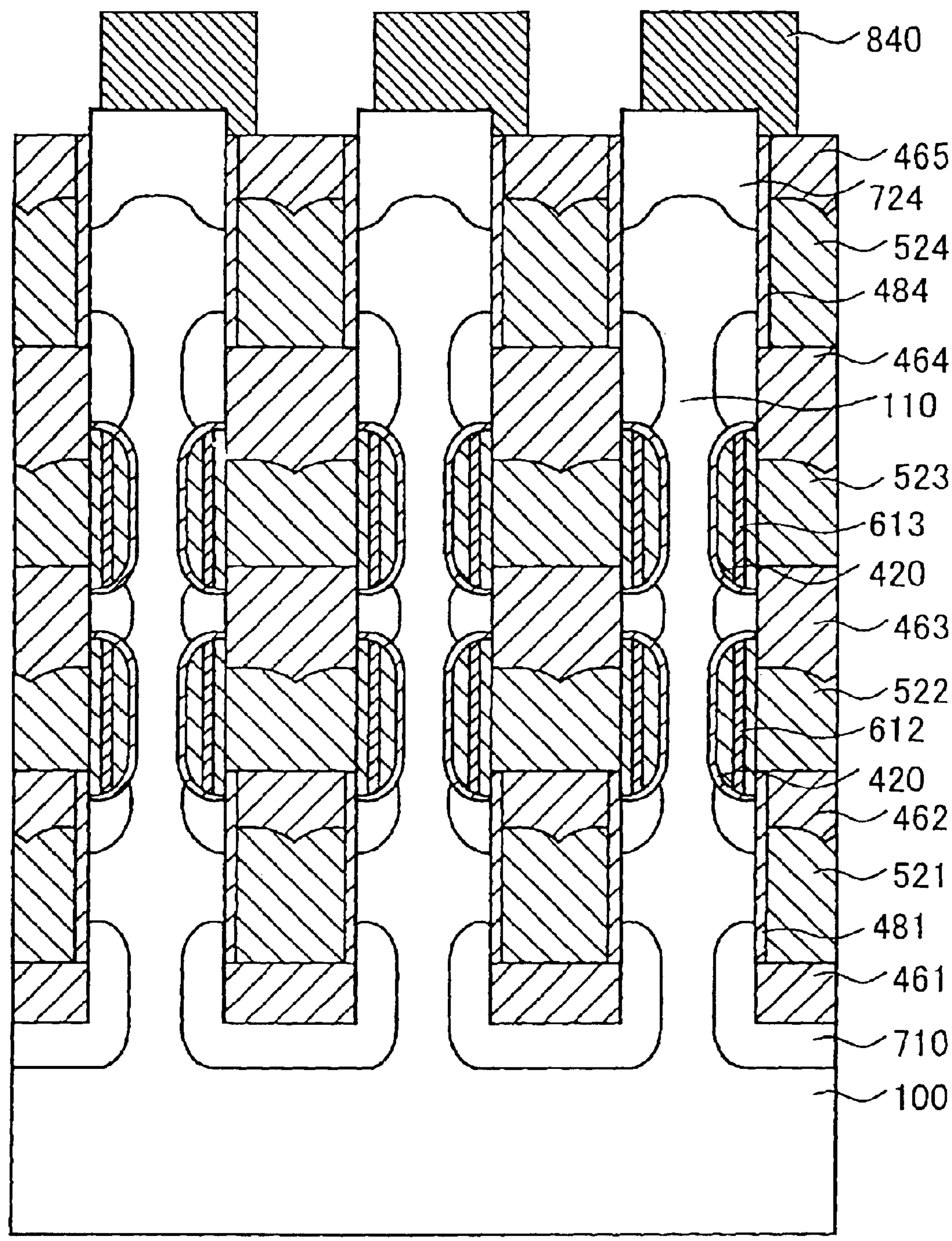
Figure 407:
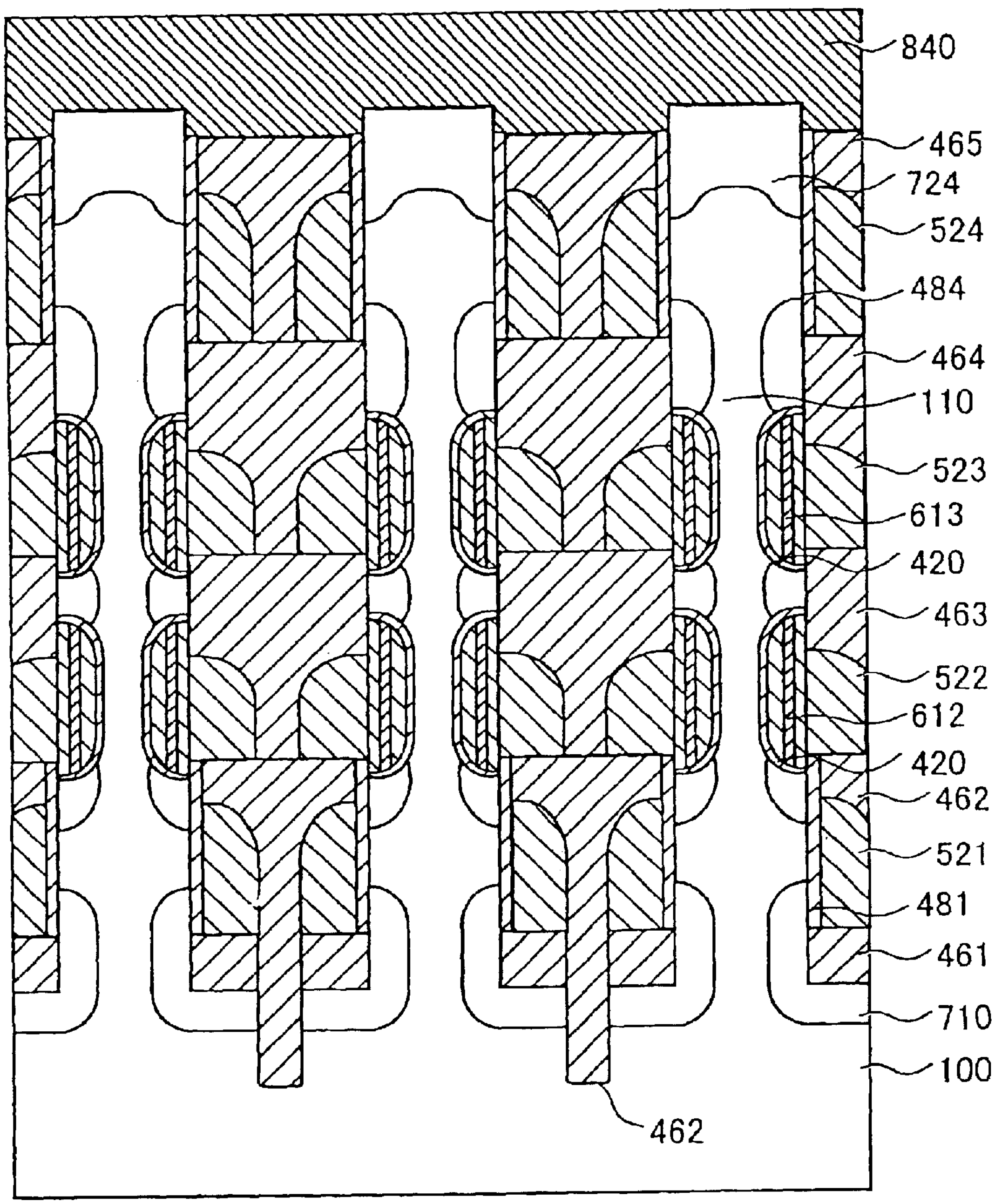

In the case where the floating gate and the control gate are placed in the same recess in the island-like semiconductor layer as shown in FIG. 406 and FIG. 407. The positional relationship between the floating gate and the control gate in the recess is not limited.

PRODUCTION EXAMPLE 41

In a semiconductor memory to be produced in this example, a semiconductor substrate is patterned in the form of pillars to form island-like semiconductor layers having at least one recess. Sides of the island-like semiconductor layers make active regions. Tunnel oxide films and floating gates as charge storage layers are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Figure 408:
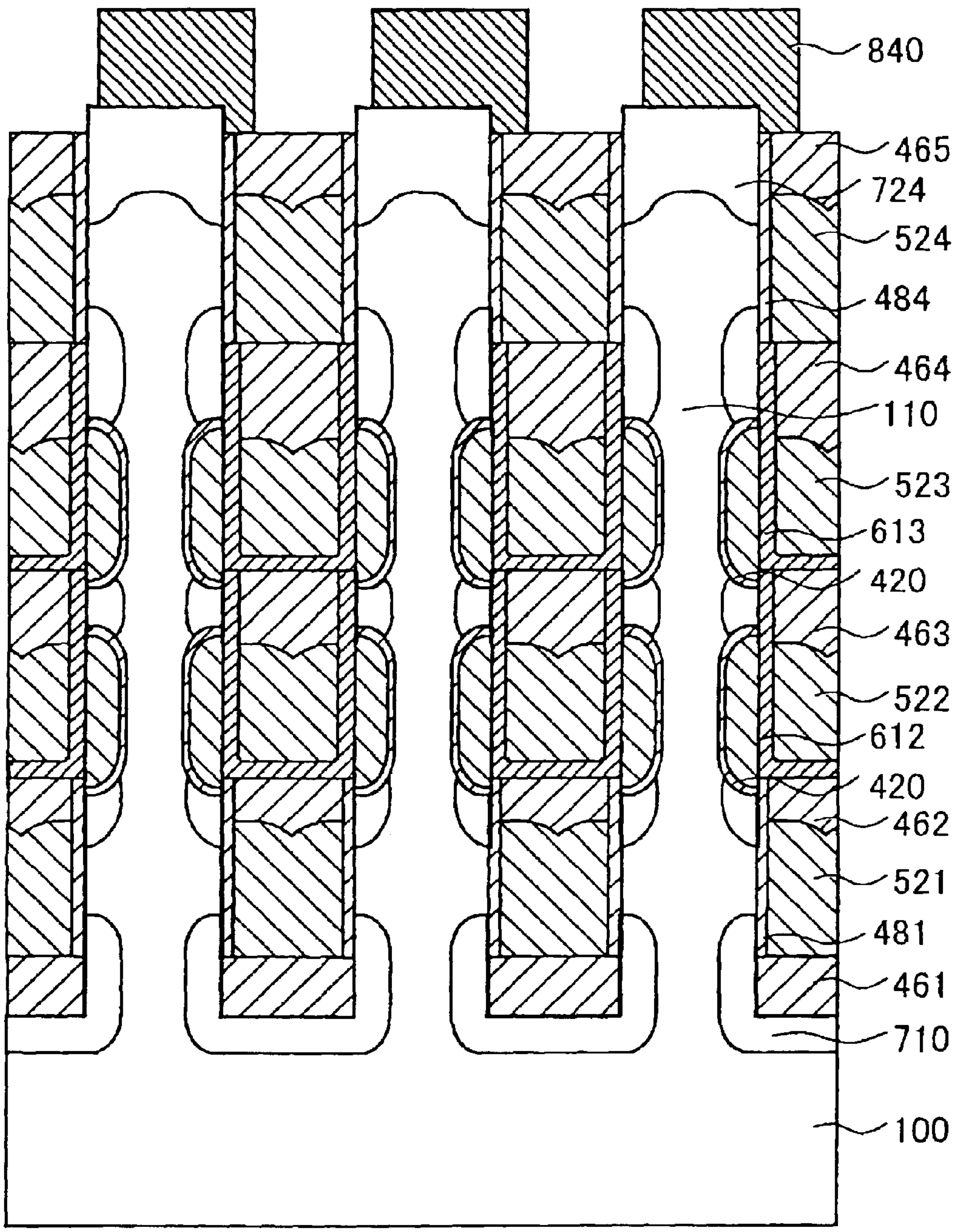
Figure 409:
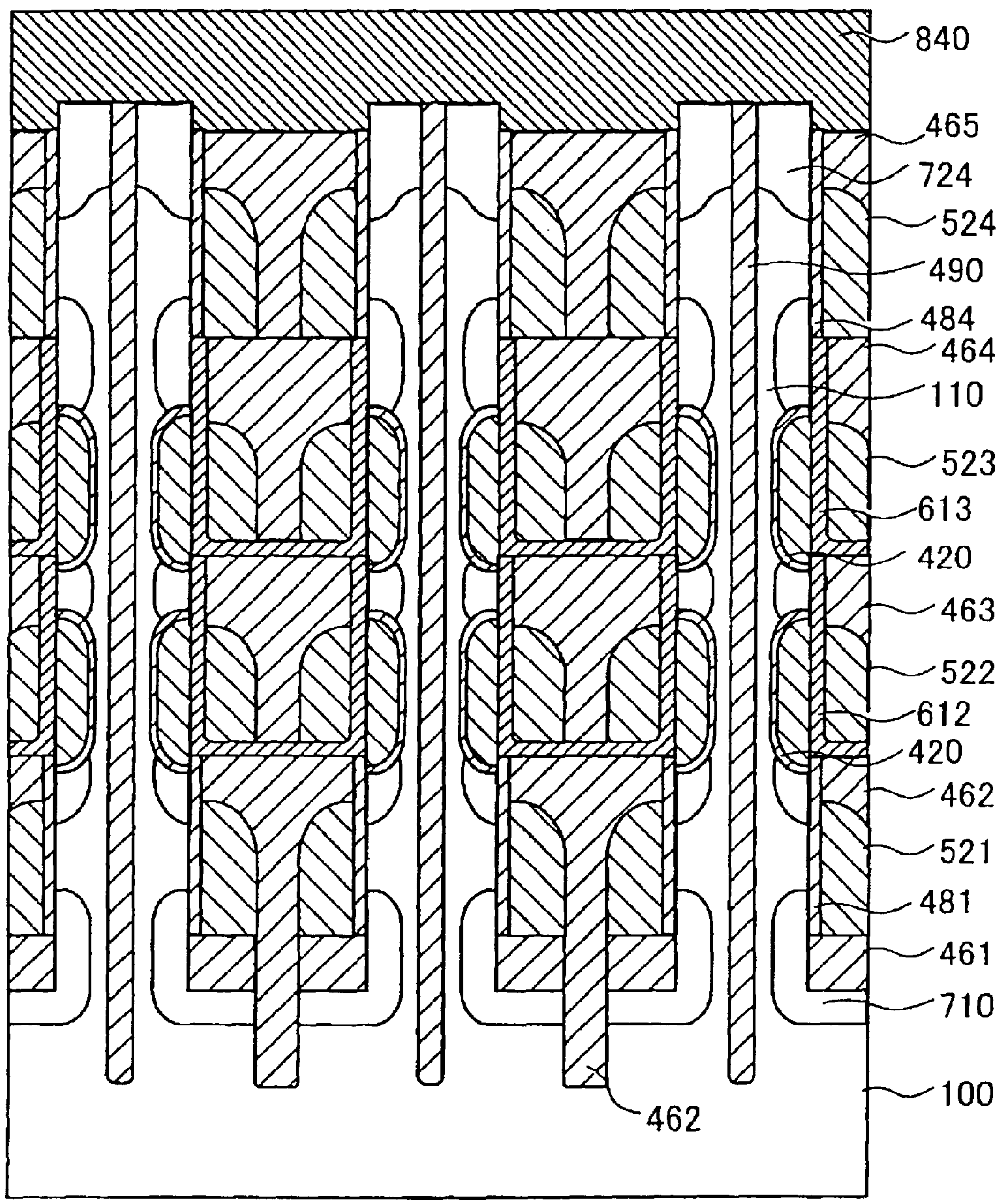

FIG. 408 and FIG. 409 are sectional views taken on line A–A' and line B–B', respectively, in FIG. 1 which is a cross-sectional view illustrating a memory cell array of an EEPROM.

In this production example, the island-like semiconductor layers 110 continuously formed in a direction of A–A' are anisotropically etched by using a patterned mask until at least the impurity diffusion layer 710 is separated and a silicon oxide film 490 is buried as a fifteenth insulating film.

Thus, a semiconductor memory having similar function and doubled device capacitance as compared with the semiconductor memory of Production example 39 is obtained, though the deterioration of the device performance is expected.

The fifteenth insulating film is not limited to the silicon oxide film, but a silicon nitride film may be used. Any film may be used as long as it is an insulating film.

PRODUCTION EXAMPLE 42

In a semiconductor memory to be produced in this example, a semiconductor substrate to which an oxide film is inserted, for example, a semiconductor portion on an oxide film of an SOI substrate, is patterned into pillar-form island-like semiconductor layers having at least one recess. Sides of the island-like semiconductor layers make active regions. Tunnel oxide films and floating gates as charge storage layers are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

FIGS. 410 to 411 and FIGS. 412 to 413 are sectional views taken on line A–A' and line B–B', respectively, in FIG. 1 which is a cross-sectional view illustrating a memory cell array of an EEPROM.

According to this example, the same effect as obtained by Production Example 39 can be obtained, and furthermore, the junction capacitance of the impurity diffusion layer 710 which functions as the first wiring layer is suppressed or removed.

Figure 410:
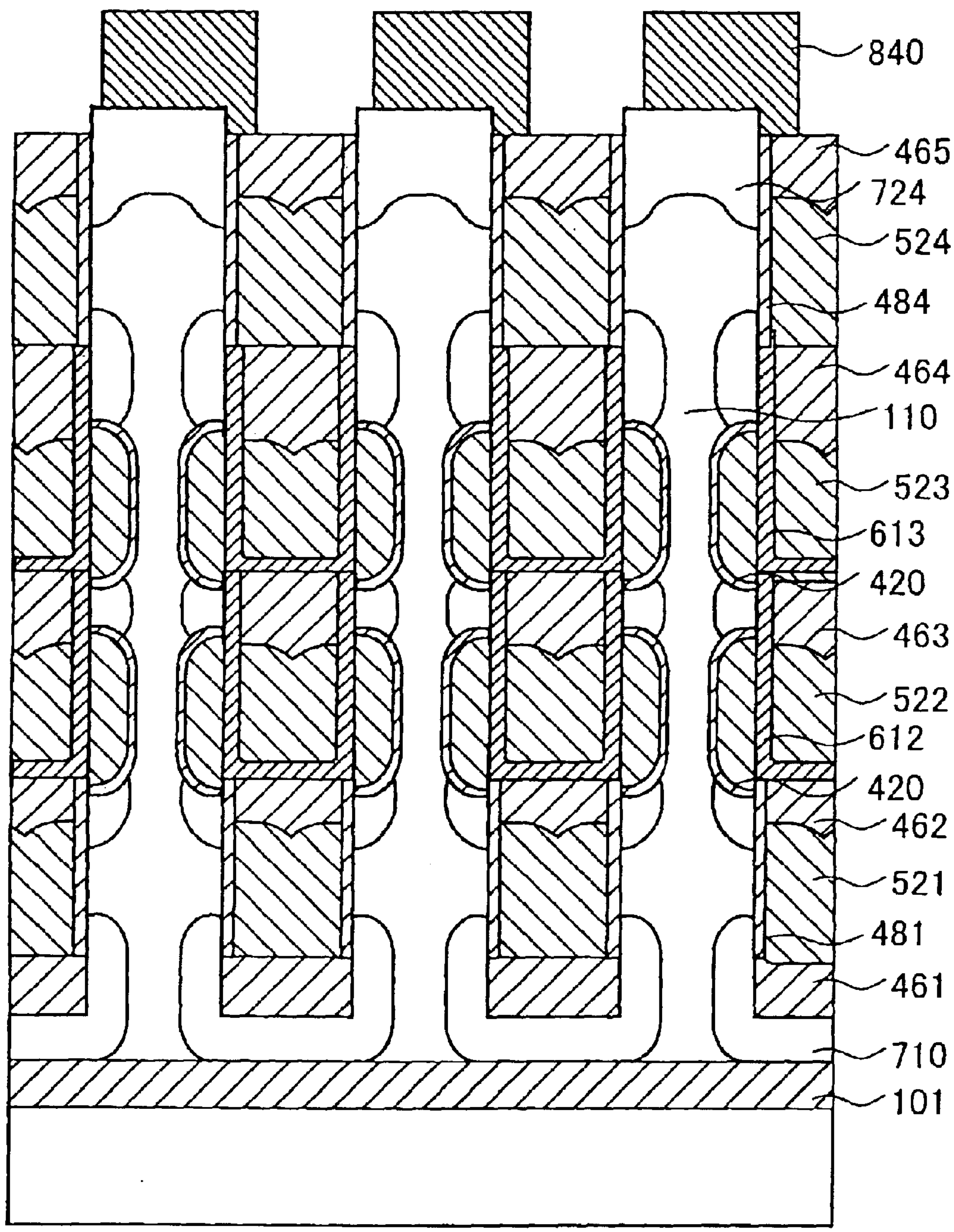
Figure 411:
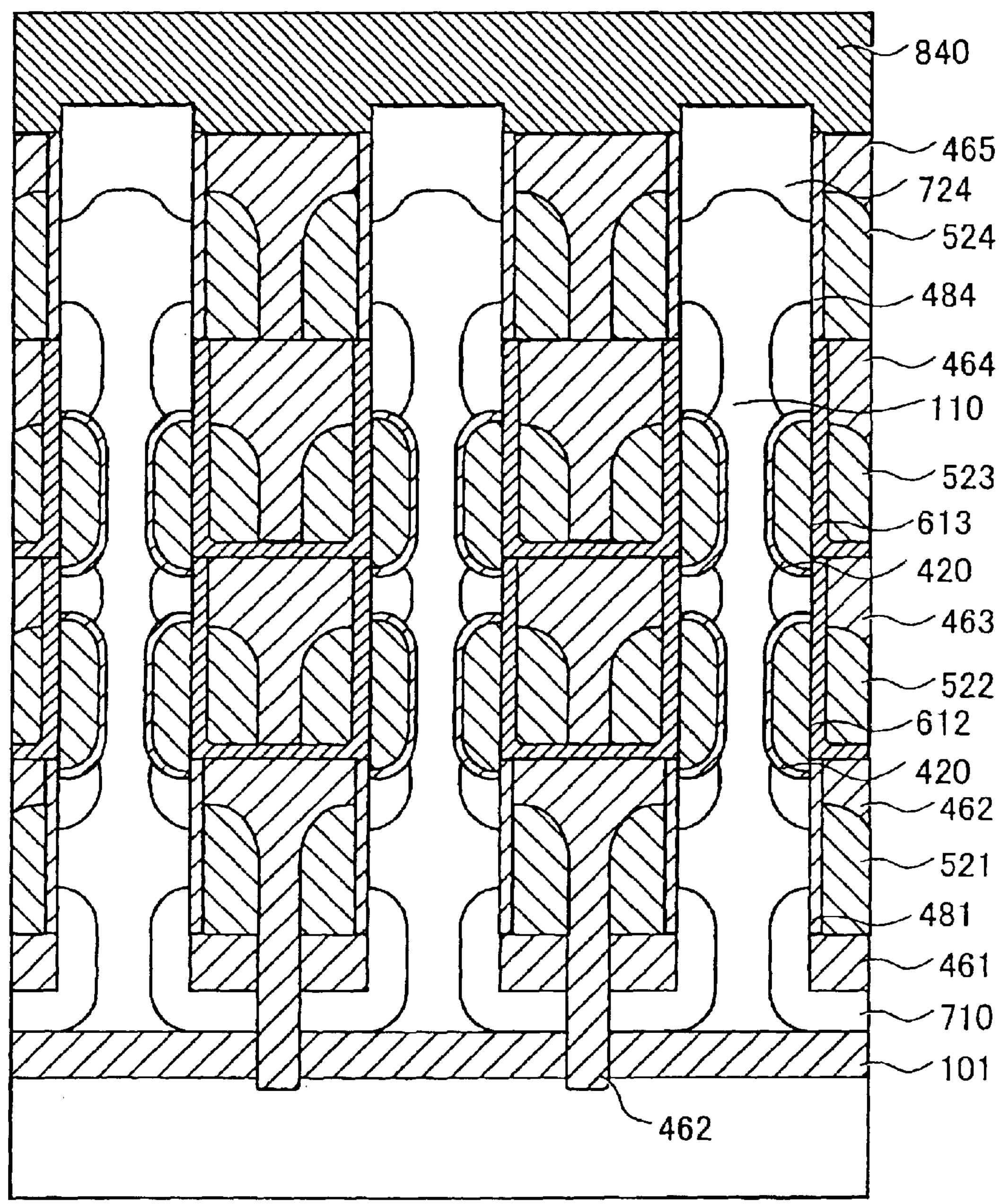
Figure 412:
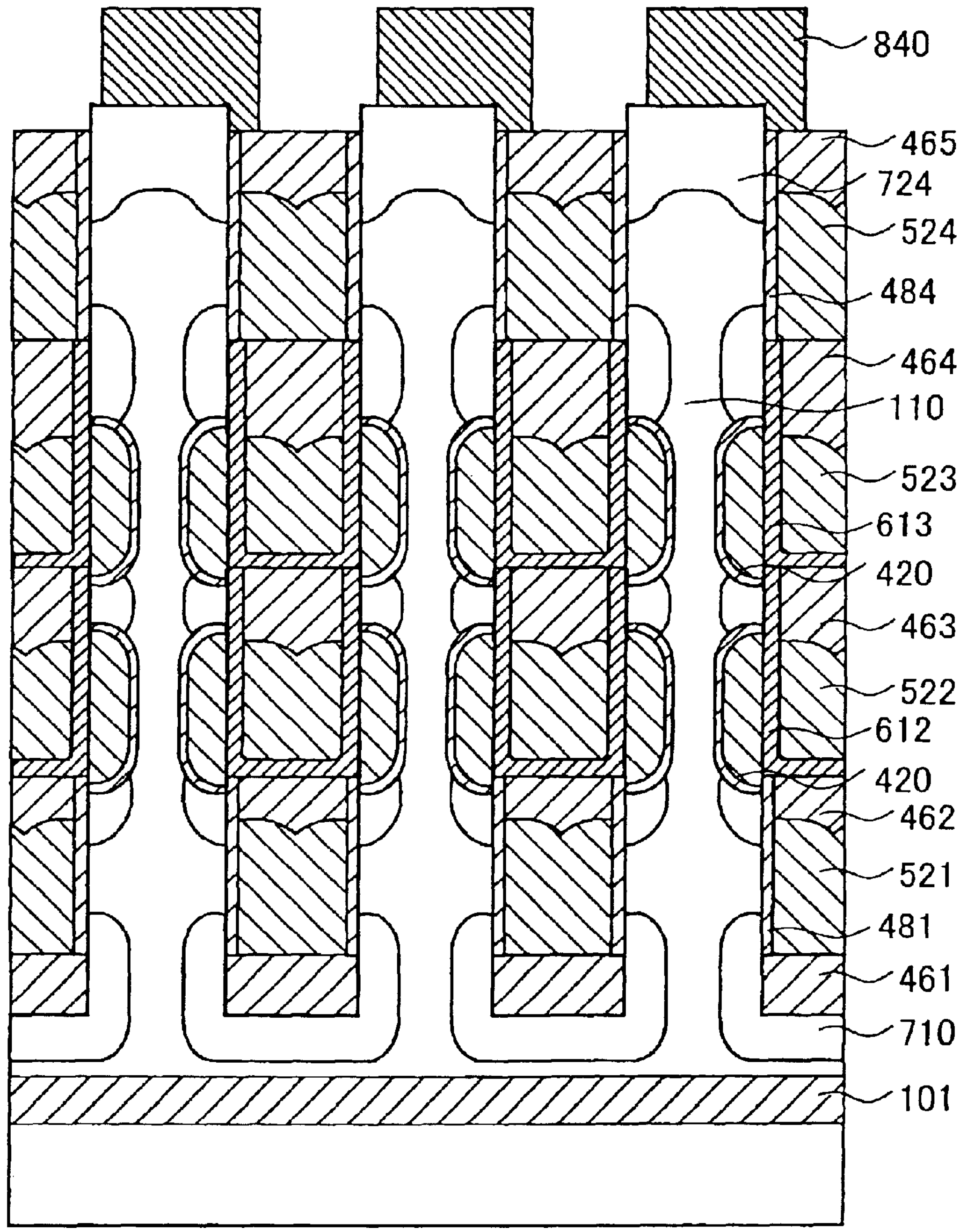
Figure 413:
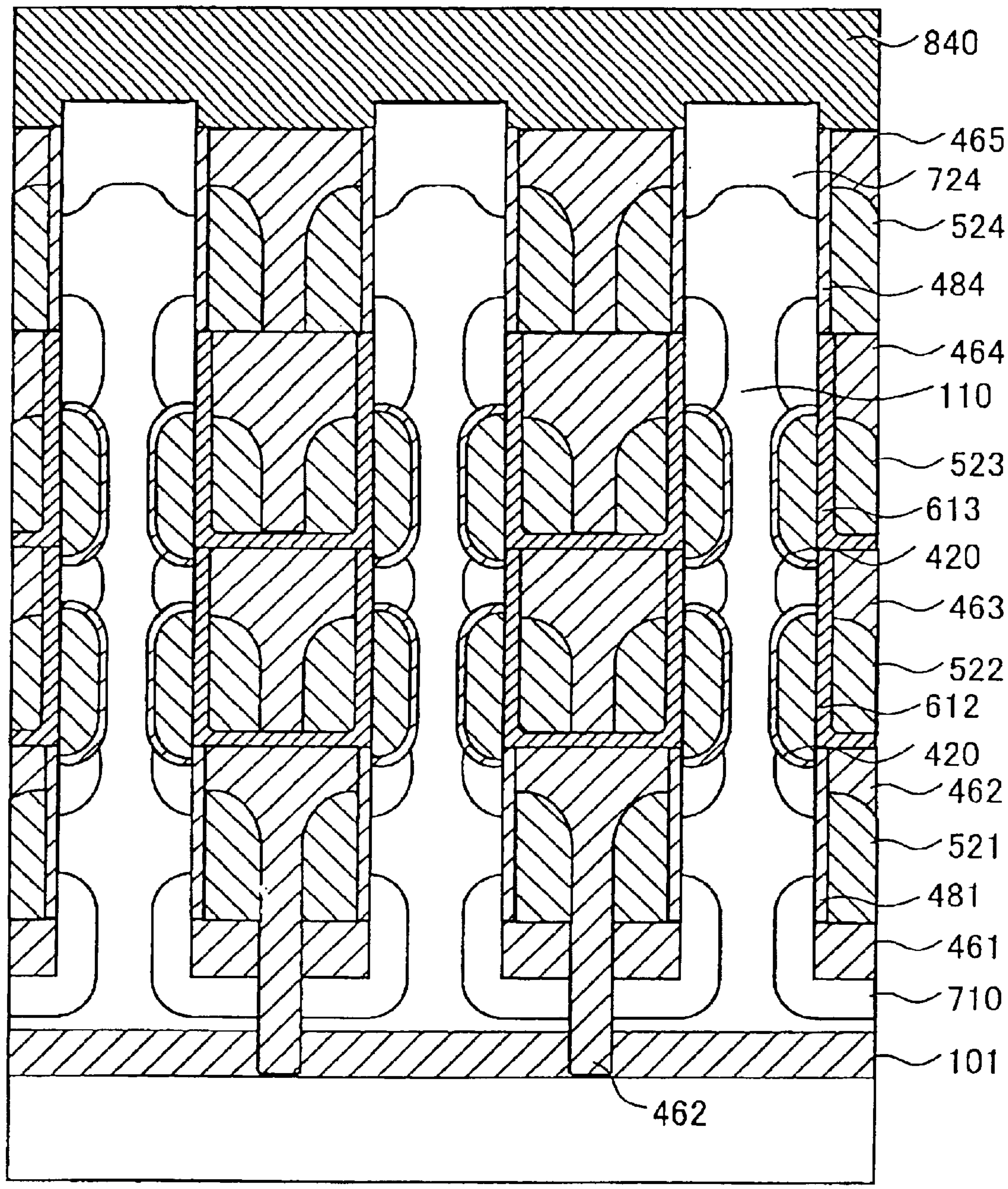

If the SOI substrate is used, the impurity diffusion layer (the first wiring layer) 710 may reach the oxide film of the SOI substrate as shown in FIGS. 410 and 411 and may not reach the oxide film as shown in FIGS. 412 and 413.

The trench for separating the first wiring layer may reach the oxide film of the SOI substrate, may not reach the oxide film or may form deeply so as to penetrate the oxide film. The depth of the trench is not limited as long as the impurity diffusion layer is separated.

This example uses the SOI substrate with the oxide film inserted therein as the insulating film, but the insulating film may be a nitride film. The kind of the insulating film is not limited.

PRODUCTION EXAMPLE 43

In a semiconductor memory to be produced in this example, a semiconductor substrate is patterned in the form of pillars to form island-like semiconductor layers having at least one recess. Sides of the island-like semiconductor layers make active regions. Tunnel oxide films and floating gates as charge storage layers are formed in the recesses. A plurality of memory transistors, for example, two memory transistors, are placed and are connected in series along the island-like semiconductor layer. The tunnel oxide films and the floating gates of the memory transistors are formed at the same time.

Figure 414:
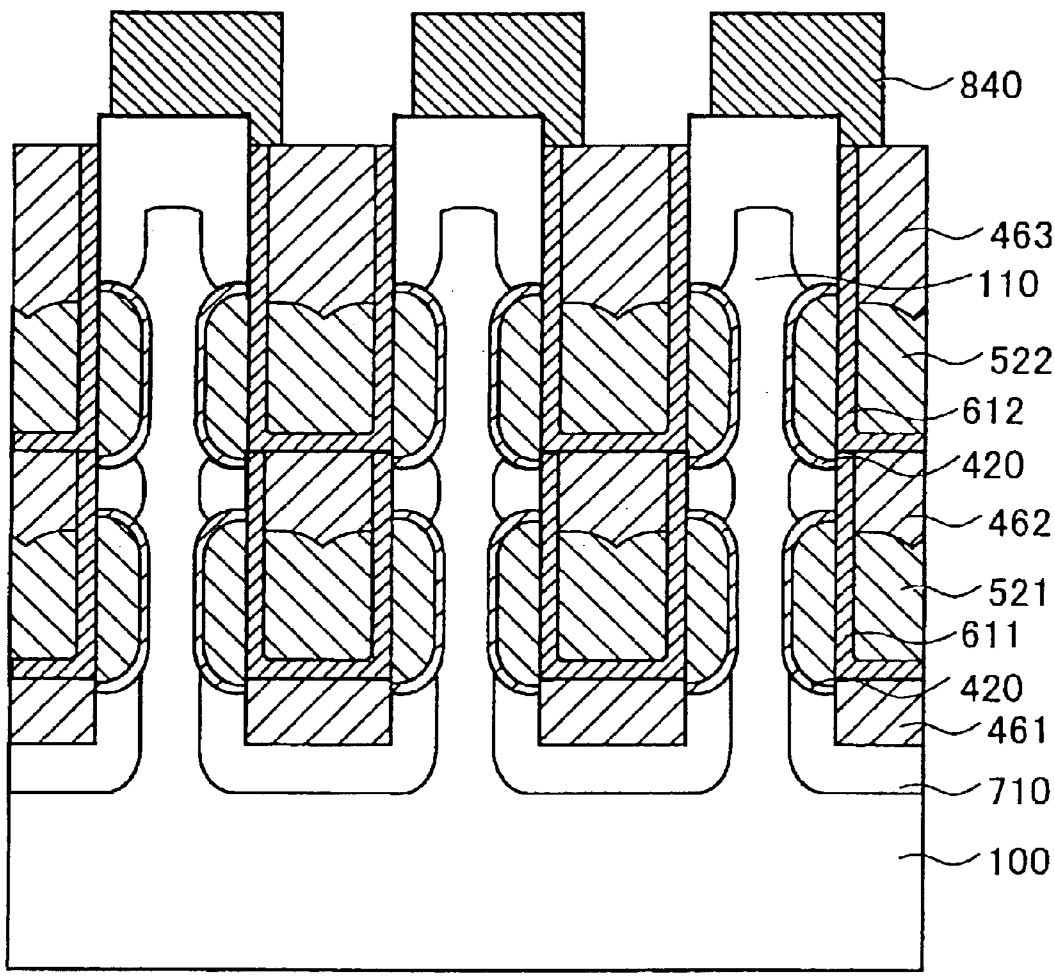
Figure 415:
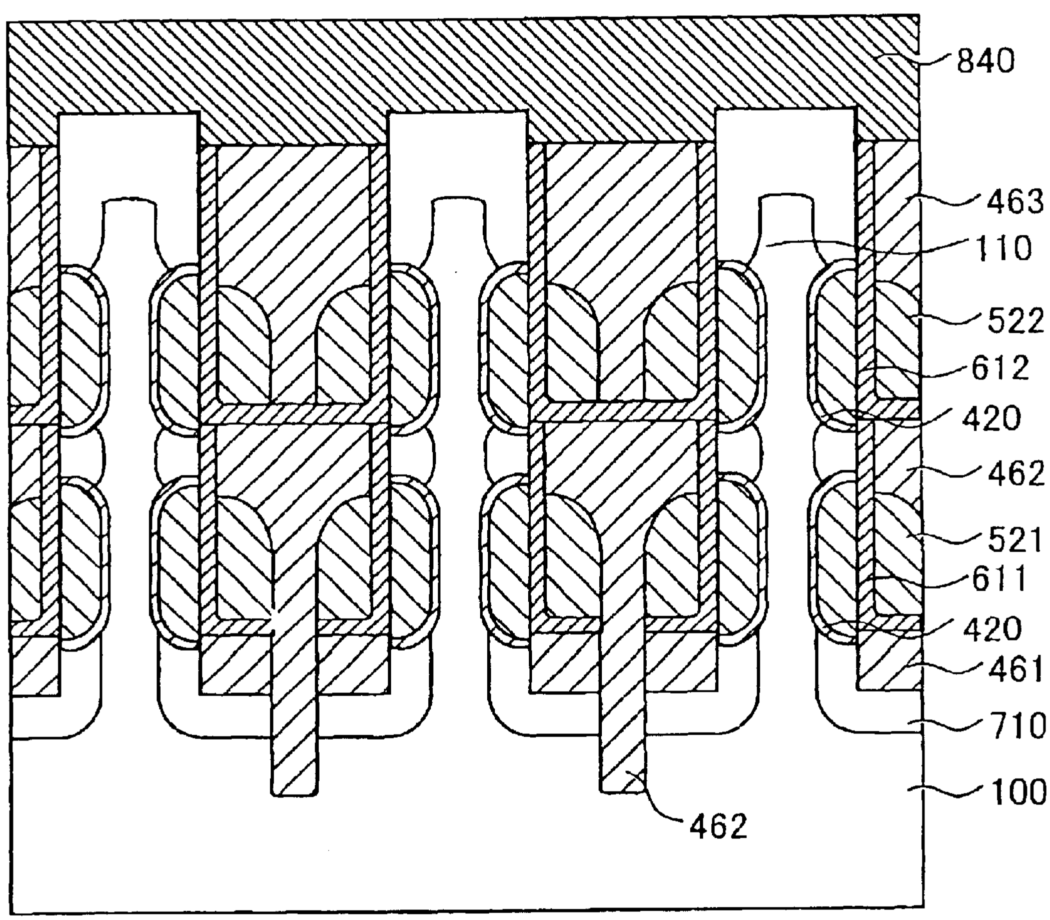

FIG. 414 and FIG. 415 are sectional views taken on line A–A' and line B–B', respectively, in FIG. 1 which is a cross-sectional view illustrating a memory cell array of an EEPROM.

In this production example, a semiconductor memory is realized in the same manner as in Production example 39 until the polysilicon film 510 is buried in the recesses formed on the sidewall of the island-like semiconductor layer 110 with the intervention of the silicon oxide film 420, thereby separating the polysilicon film 510 into polysilicon films 512 and 513 (FIG. 365 and FIG. 391). Thereafter, unlike the process of Production example 39, impurity introduction is introduced into the island-like semiconductor layer 110 and the semiconductor substrate 100 to form an N-type semiconductor layer and the step of forming the selection gate transistor is omitted (FIG. 414 and FIG. 415).

In this production example, the floating gate is used as the charge storage layer. However, other charge storage layer may be used.

PRODUCTION EXAMPLE 44

In a semiconductor memory to be produced in this example, a semiconductor substrate is patterned in the form of pillars to form island-like semiconductor layers having at least one recess. Sides of the island-like semiconductor layers make active regions. Tunnel oxide films and floating gates as charge storage layers are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

Figure 416:
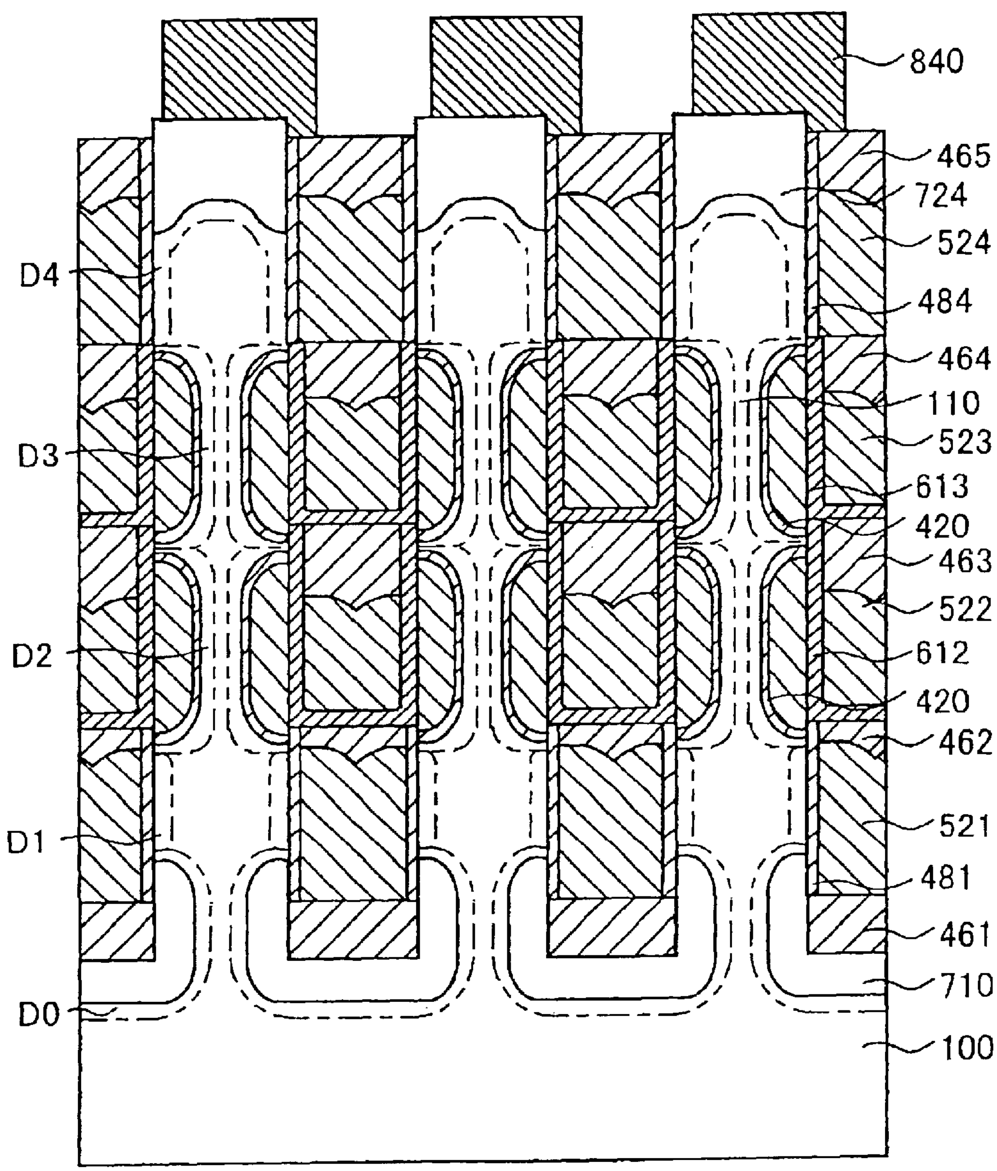
Figure 417:
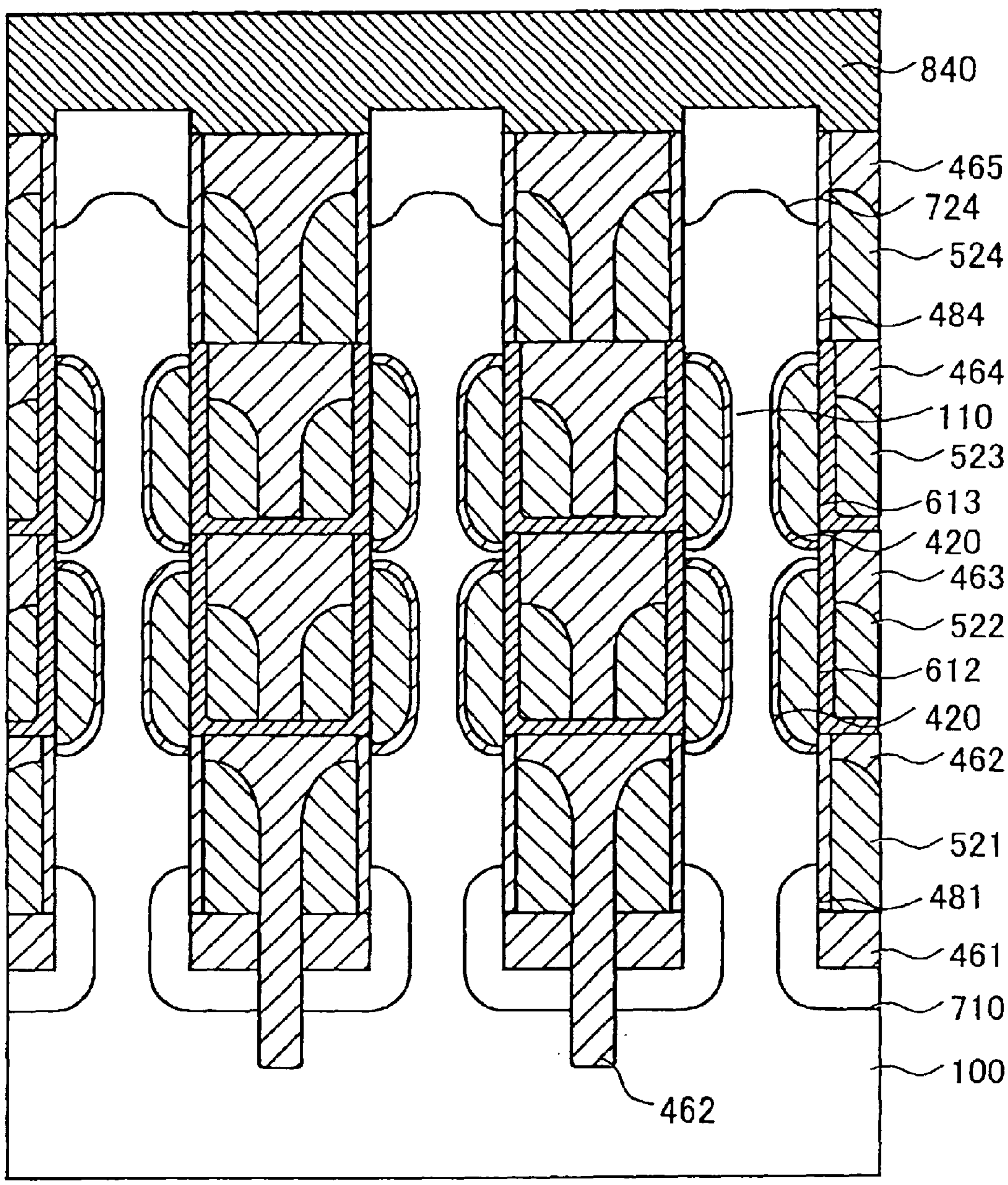

FIGS. 416 and 417 are sectional views taken on line A–A' and line B–B', respectively, in FIG. 1 which is a cross-sectional view illustrating a memory cell array of an EEPROM.

In this production example, a semiconductor memory as explained in Production example 39 is formed, in which intervals between the memory transistors and the selection gate transistors are set about 20 to 40 nm and diffusion layers 721 to 723 are not introduced (FIGS. 416 and FIG. 417).

According to this example, the same effect as obtained by Production example 39 (FIG. 352 to FIG. 370 and FIG. 378 to FIG. 396) is obtained.

At data reading, as shown in FIG. 416, depletion layers and inversion layers shown in D1 to D4 are electrically connected with gate electrodes 521, 522, 523 ad 524, thereby an electric current path is established between the impurity diffusion layers 710 and 725. In this situation, voltages to be applied to the gates 521, 522, 523 and 524 are so set that whether the inversion layers are formed in D2 and D3 or not is selected depending on the condition of the charge storage layers 512 and 513, thereby the data can be read from the memory cell.

Figure 418:
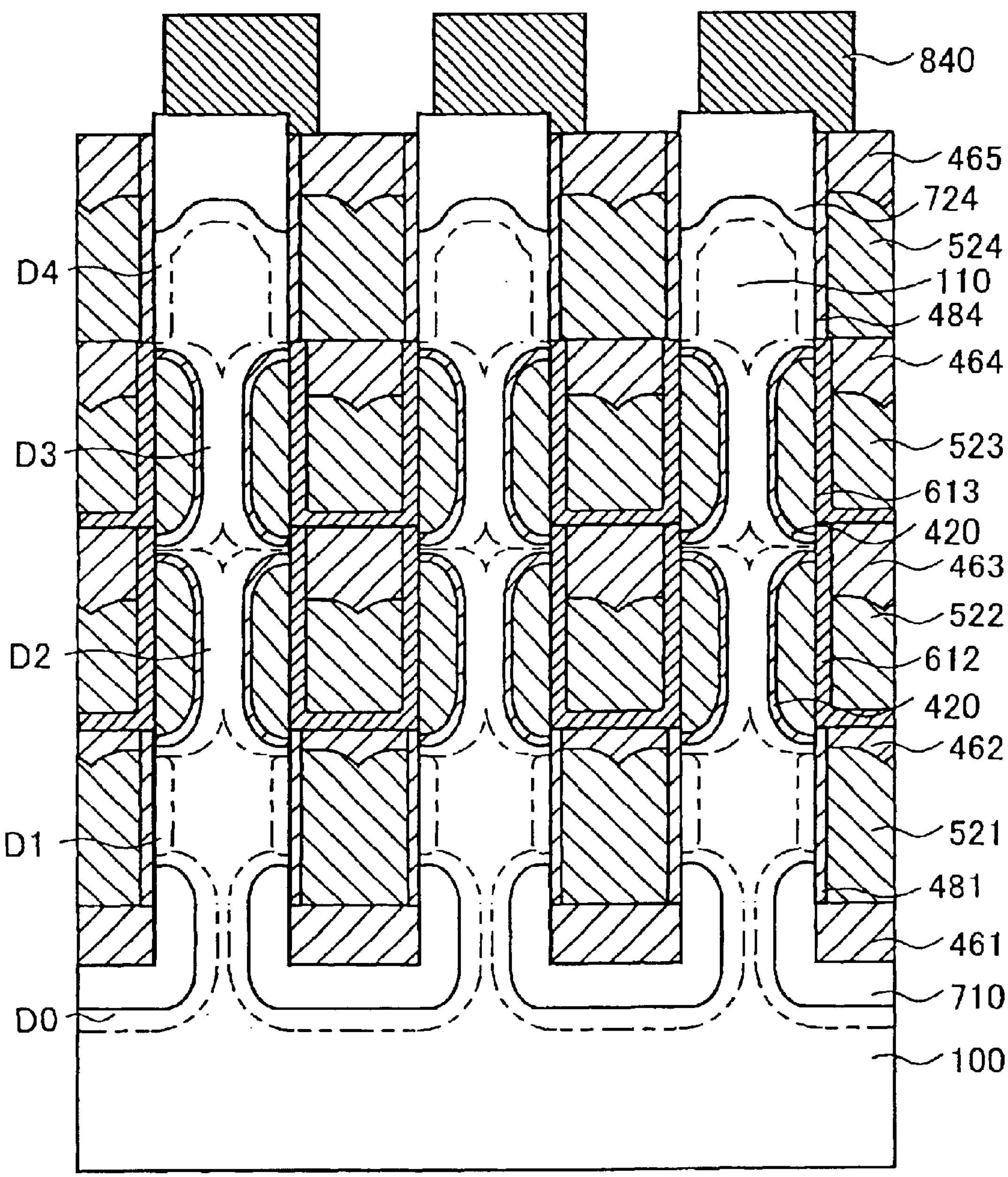

It is desired that the distribution of D2 and D3 is completely depleted as shown in FIG. 418. In this case, it is expected that the back-bias effect is suppressed in the memory cells, which is effective in reducing variations in device performance.

Further, by adjusting the amount of impurities to be implanted or controlling the thermal treatment, the expansion of the impurity diffusion layers 710 to 724 is suppressed and a height of the island-like semiconductor layers 110 is reduced, which contributes to the cost reduction and the suppression of variations during the production process.

PRODUCTION EXAMPLE 45

Explanation is given of an example of production process for producing a semiconductor memory in which the direction of the first wiring layer is parallel to the direction of the fourth wiring layer.

Figure 419:
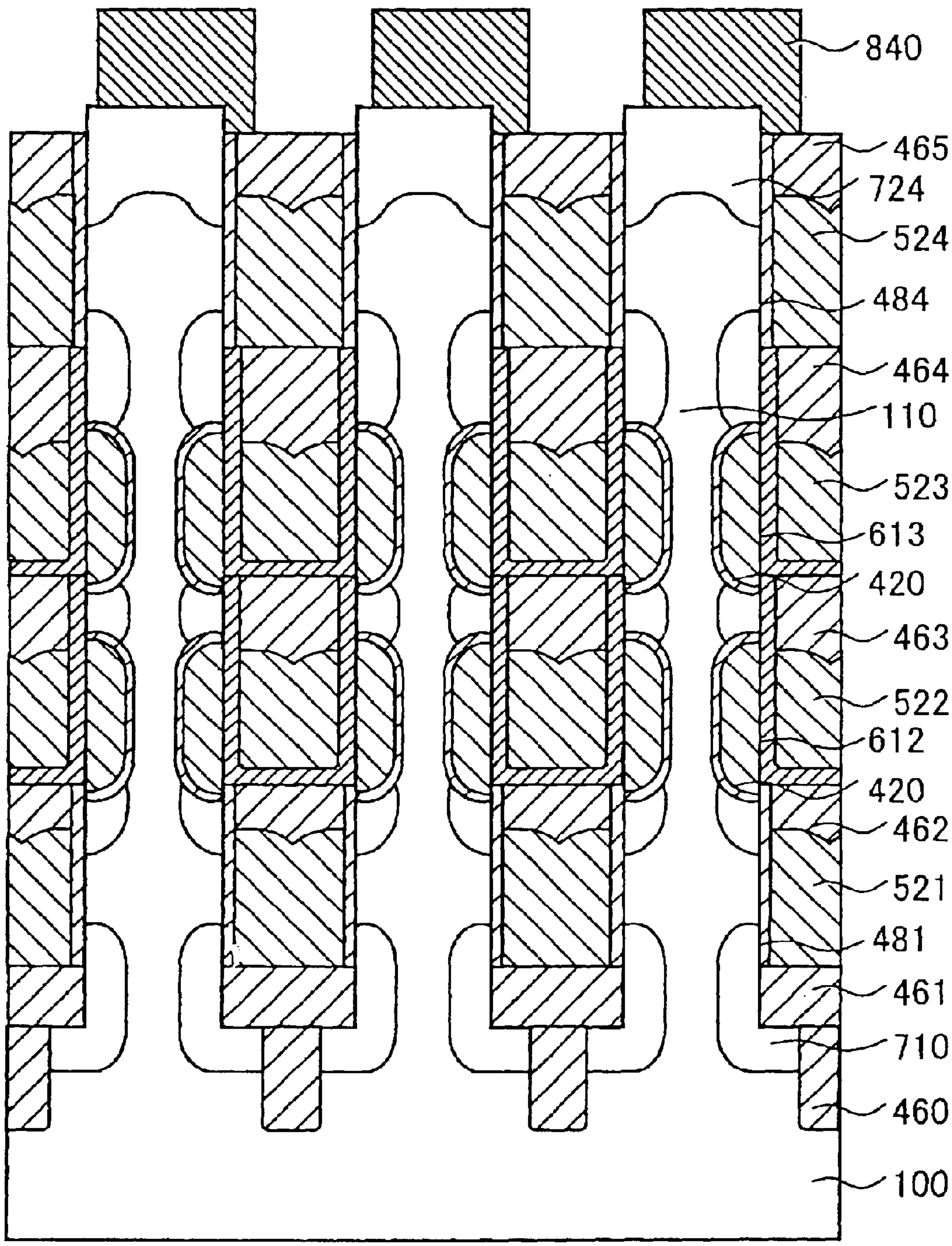
Figure 420:
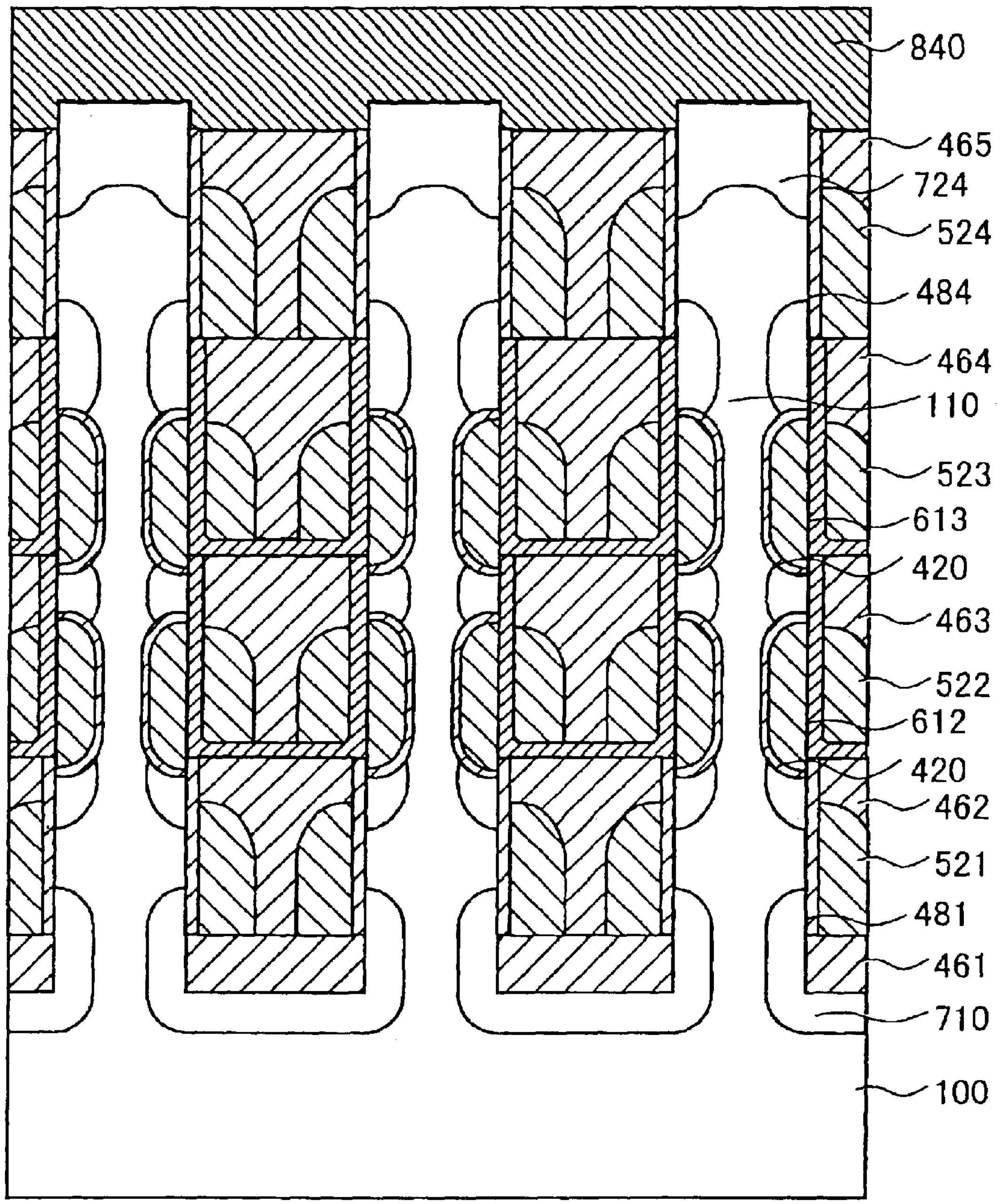

FIGS. 419 and 420 are sectional views taken on line A–A' and line B–B', respectively, in FIG. 1 which is a cross-sectional view illustrating a memory cell array of an EEPROM.

In this production example, the first wiring layers continuously formed in the direction of A–A', which are explained in Production example 39, are anisotropically etched by using a patterned resist and separated by burying a silicon oxide film 460 as an eighth insulating film. Further, the step of separating the impurity diffusion layer 710 in the self-alignment manner, which is performed after the formation of the polysilicon film 521 in the form of a sidewall spacer, is omitted so that the first wiring layers continuously formed in the direction of B–B' are not separated.

Thereby, a semiconductor memory is realized in which the first wiring layer is parallel to the fourth wiring layer and which has a memory function according to the state of a charge in the charge storage layer which is the floating gate made of the polysilicon film as the first conductive film (FIG. 419 FIG. 420).

PRODUCTION EXAMPLE 46

Explanation is given of an example of production process for obtaining a structure in which the first wiring layer is electrically common to the memory cell array.

Figure 421:
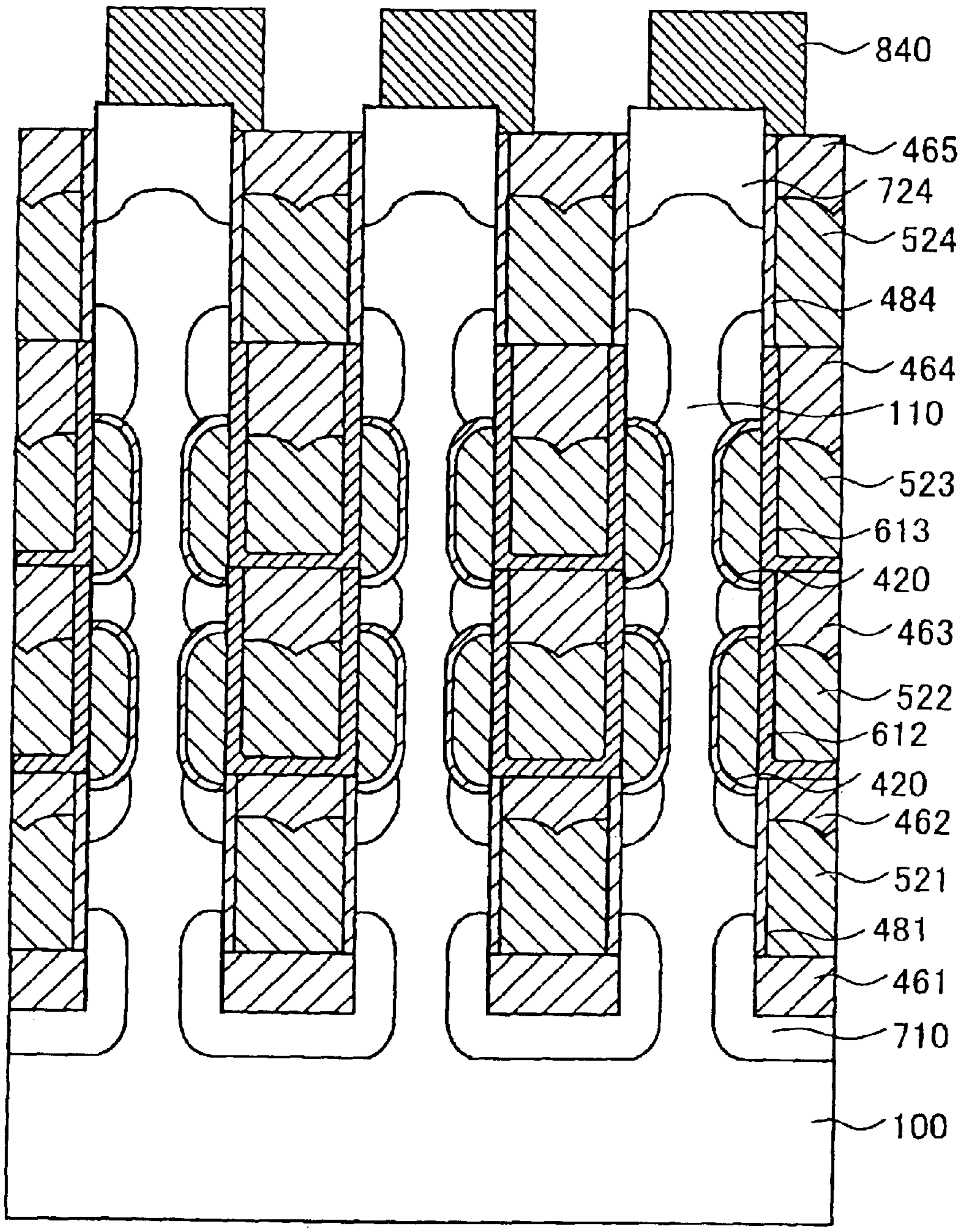
Figure 422:
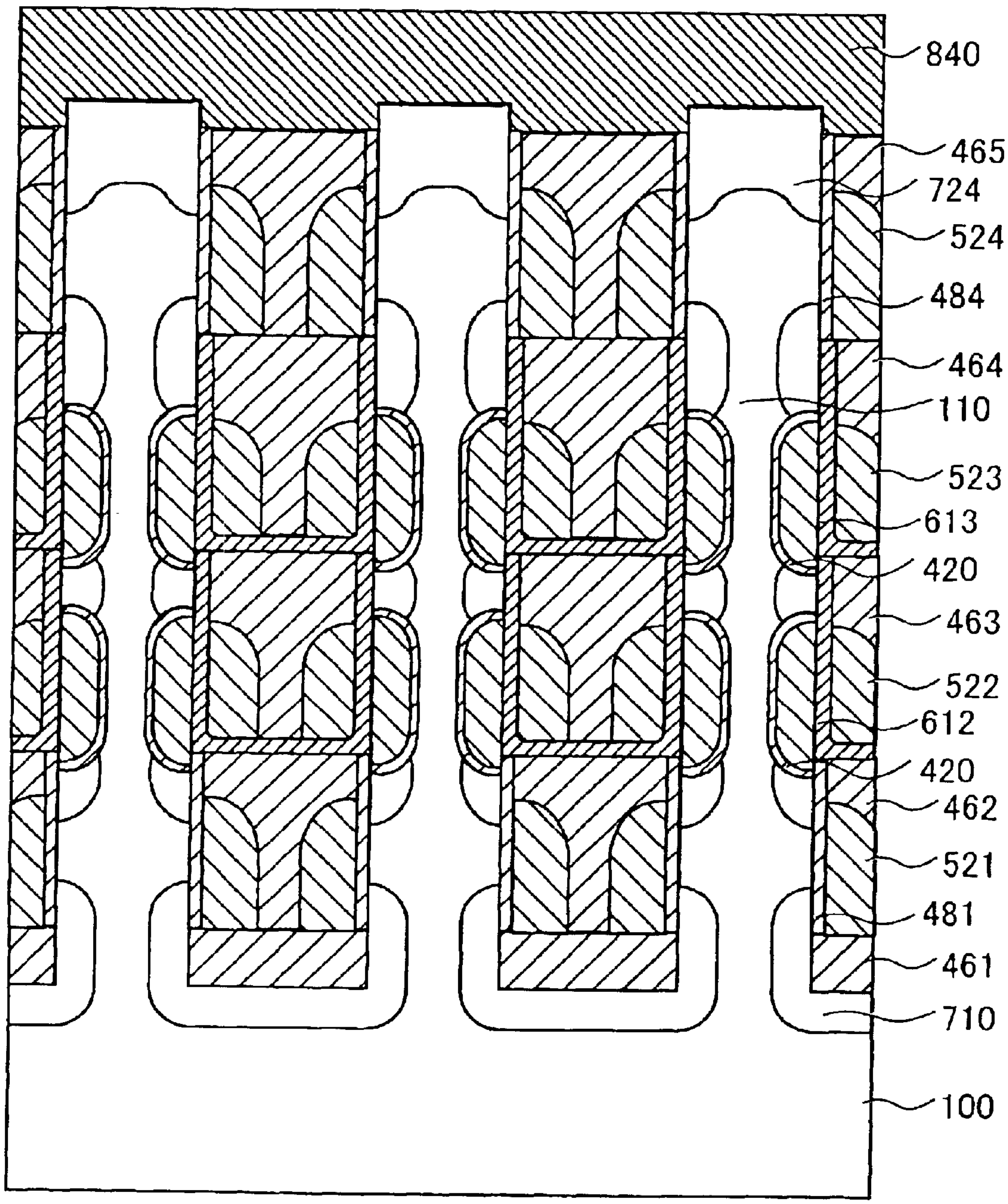

FIG. 421 and FIG. 422 are sectional views taken on line A–A' and line B–B', respectively, in FIG. 1 which is a cross-sectional view illustrating a memory cell array of an EEPROM.

In this production example, the second trench 220 as explained in Production example 39 is not formed in the semiconductor substrate 100. By omitting the steps regarding the formation of the second trench 220 (FIG. 352 to FIG. 376 and FIG. 378 to FIG. 402) from Production example 39, a semiconductor memory is realized in which at least the first wiring layer in the array is not divided but is common and which has a memory function according to the state of a charge in the charge storage layer which is the floating gate made of the polysilicon film as the first conductive film (FIG. 421 and FIG. 422).

PRODUCTION EXAMPLE 47

This example shows an example of production process for producing a semiconductor memory in which the memory transistors and the selection gate transistors have different gate lengths in a vertical direction.

FIGS. 423 and 424 and FIGS. 425 and 426 are sectional views taken on line A–A' and line B–B', respectively, in FIG. 1 which is a cross-sectional view illustrating a memory cell array of an EEPROM.

Figure 423:
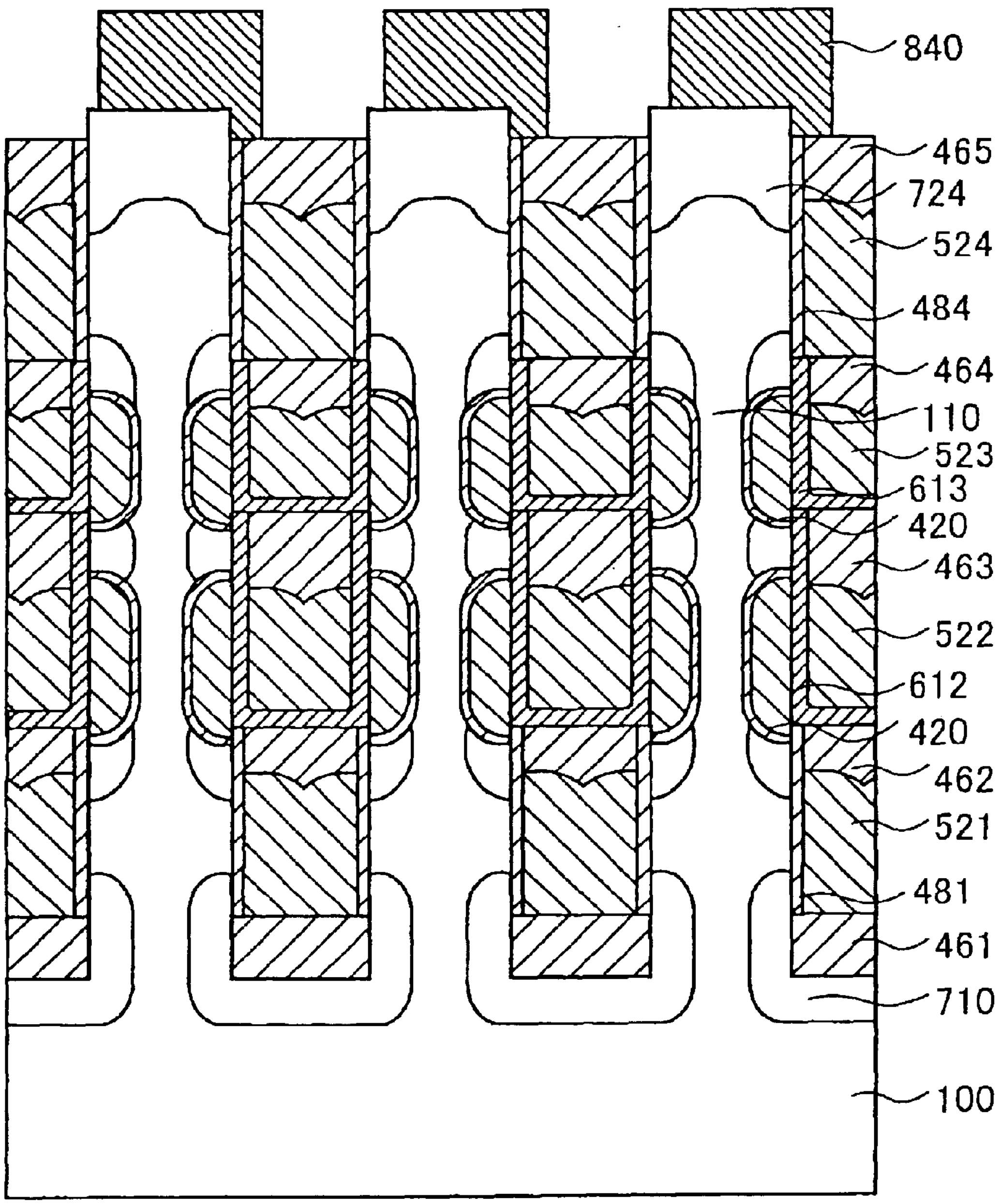
Figure 424:
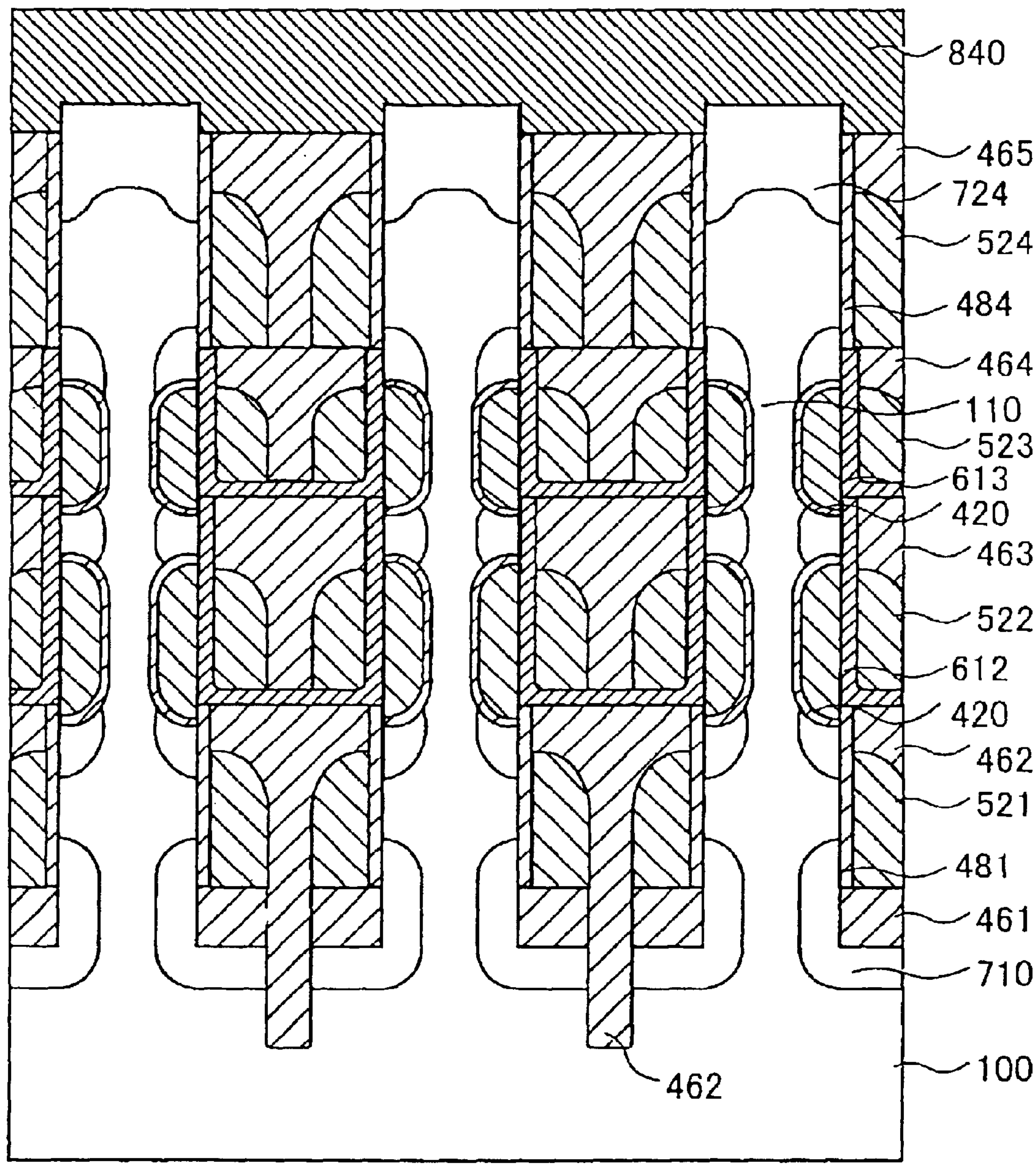
Figure 425:
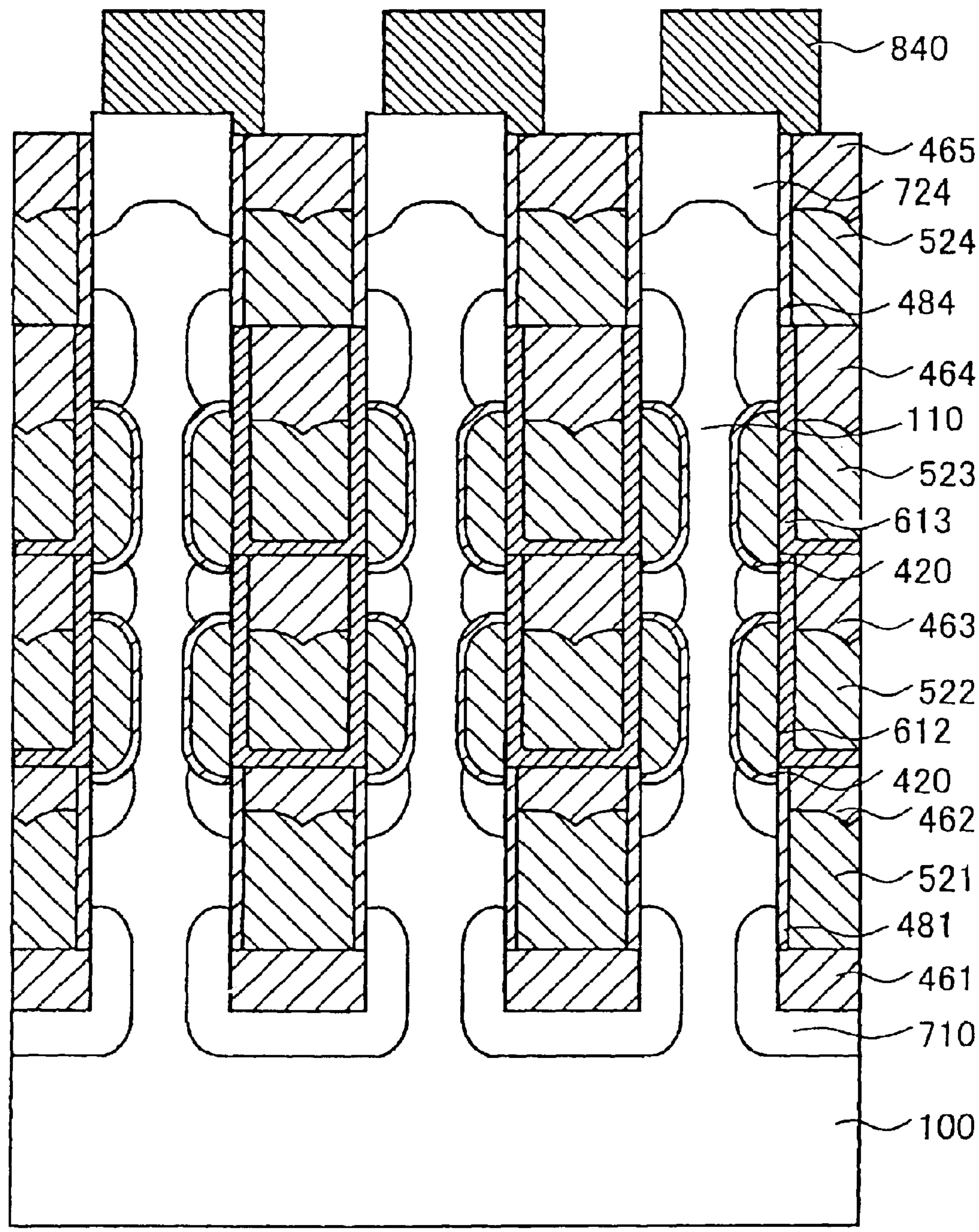
Figure 426:
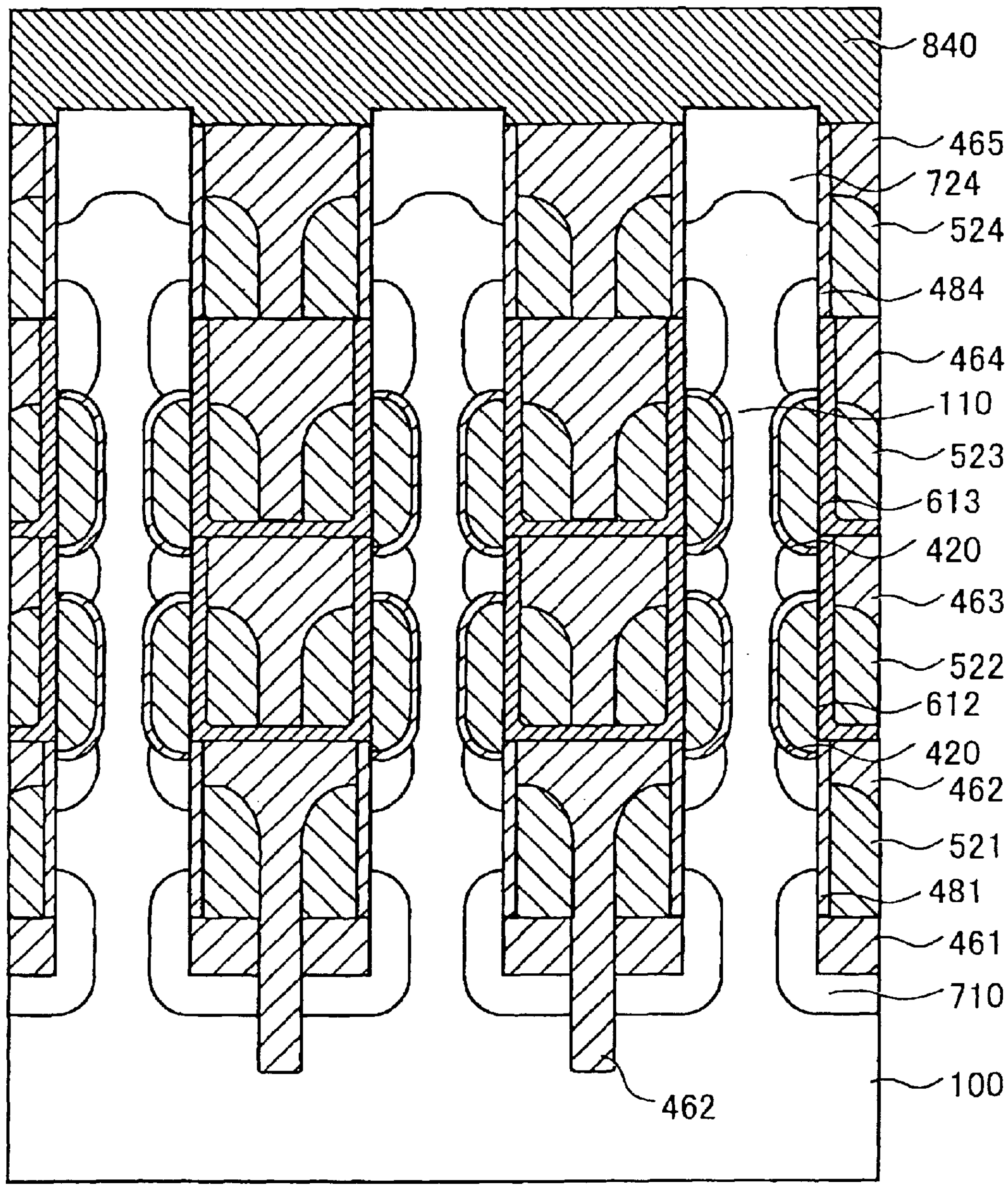

As regards the lengths of the polysilicon films 511 to 514 (the first conductive films) to be the memory cell gates or the selection gates in the direction vertical to the semiconductor substrate 100, the polysilicon films 512 and 513 to be the memory cell gates may have different lengths as shown in FIG. 423 and FIG. 424. Further, as shown in FIG. 425 and FIG. 426, the polysilicon films 521 and 524 to be the selection gates may have different lengths. The polysilicon films 521 to 524 need not have the same vertical lengths. It is rather desirable to change the gate lengths of the transistors in consideration that a threshold is reduced due to the back-bias effect from the substrate at data reading from the memory cells connected in series in the island-like semiconductor layers 110. At this time, since the height of the first and second conductive films, i.e., the gate lengths, can be controlled stage by stage, the memory cells are controlled easily.

PRODUCTION EXAMPLE 48

Explanation is given of an example of production process for producing a semiconductor memory in which the island-like semiconductor layer 110 is in an electrically floating state due to the impurity diffusion layer 710.

FIGS. 427 and 428 and FIGS. 429 and 430 are sectional views taken on line A–A' and line B–B', respectively, in FIG. 1 which is a cross-sectional view illustrating a memory cell array of an EEPROM.

In this production example, a semiconductor memory is realized by changing the arrangement of the impurity diffusion layers 710 and 721 to 723 from that in the semiconductor memory of Production example 39.

Figure 427:
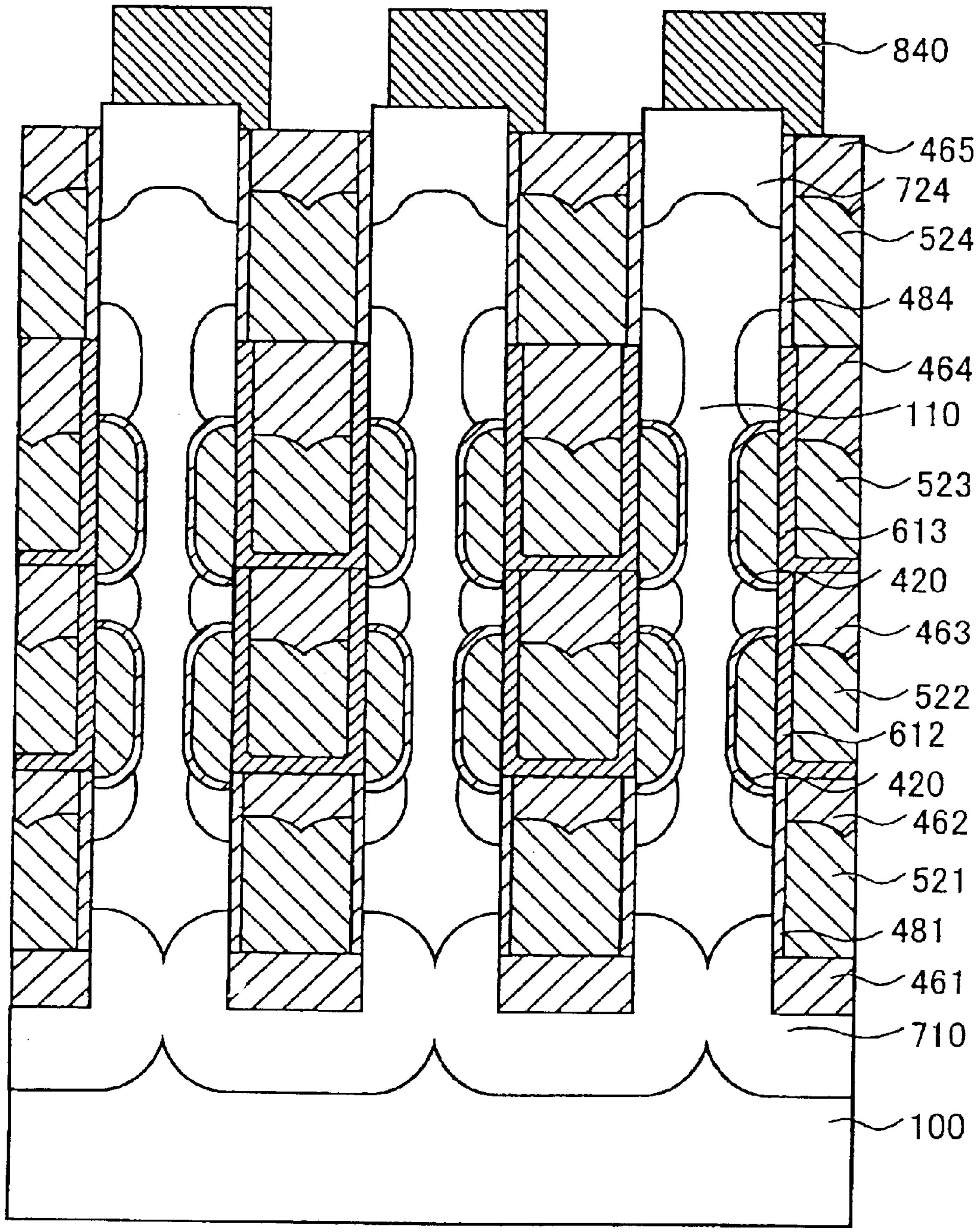
Figure 428:
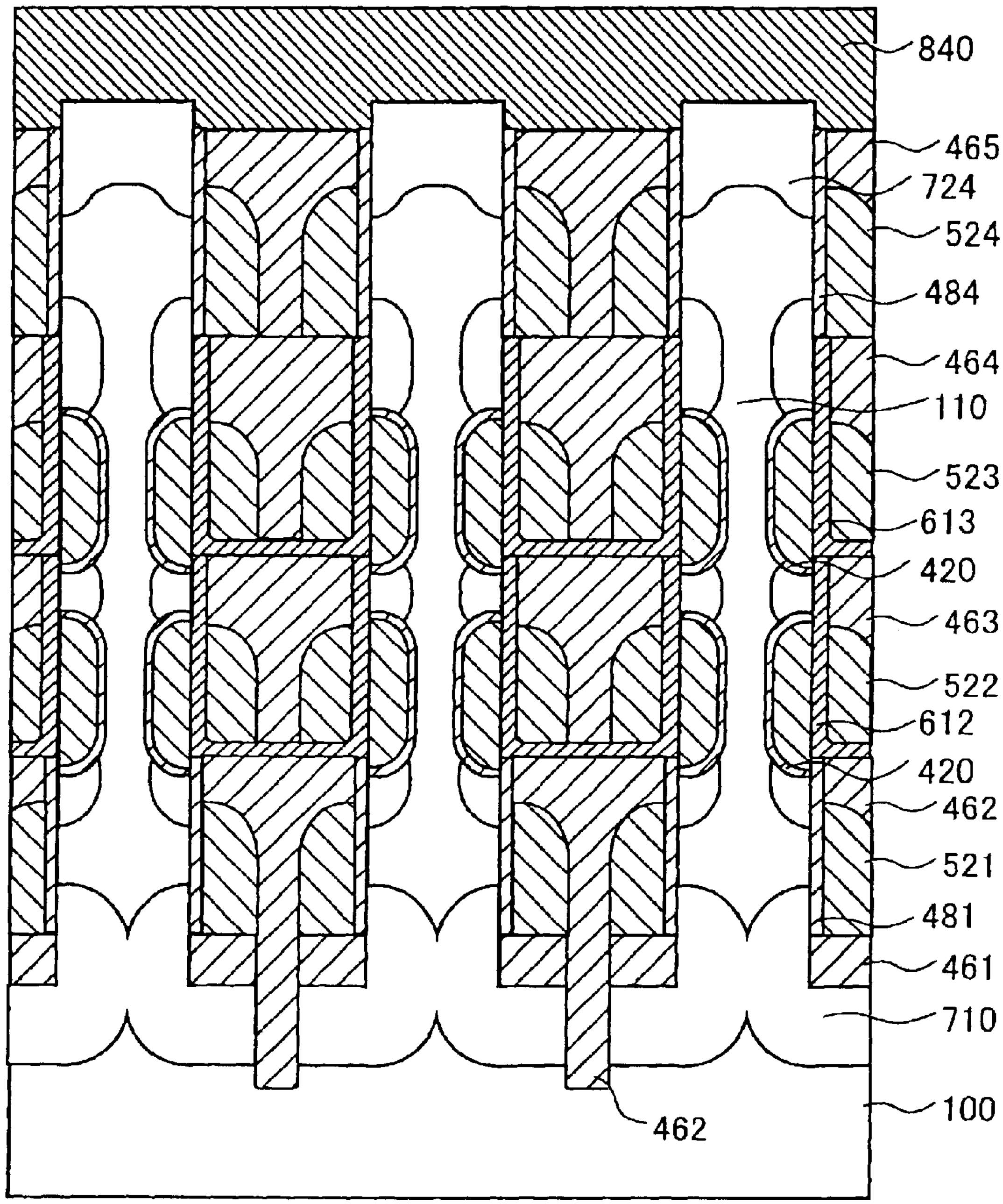
Figure 429:
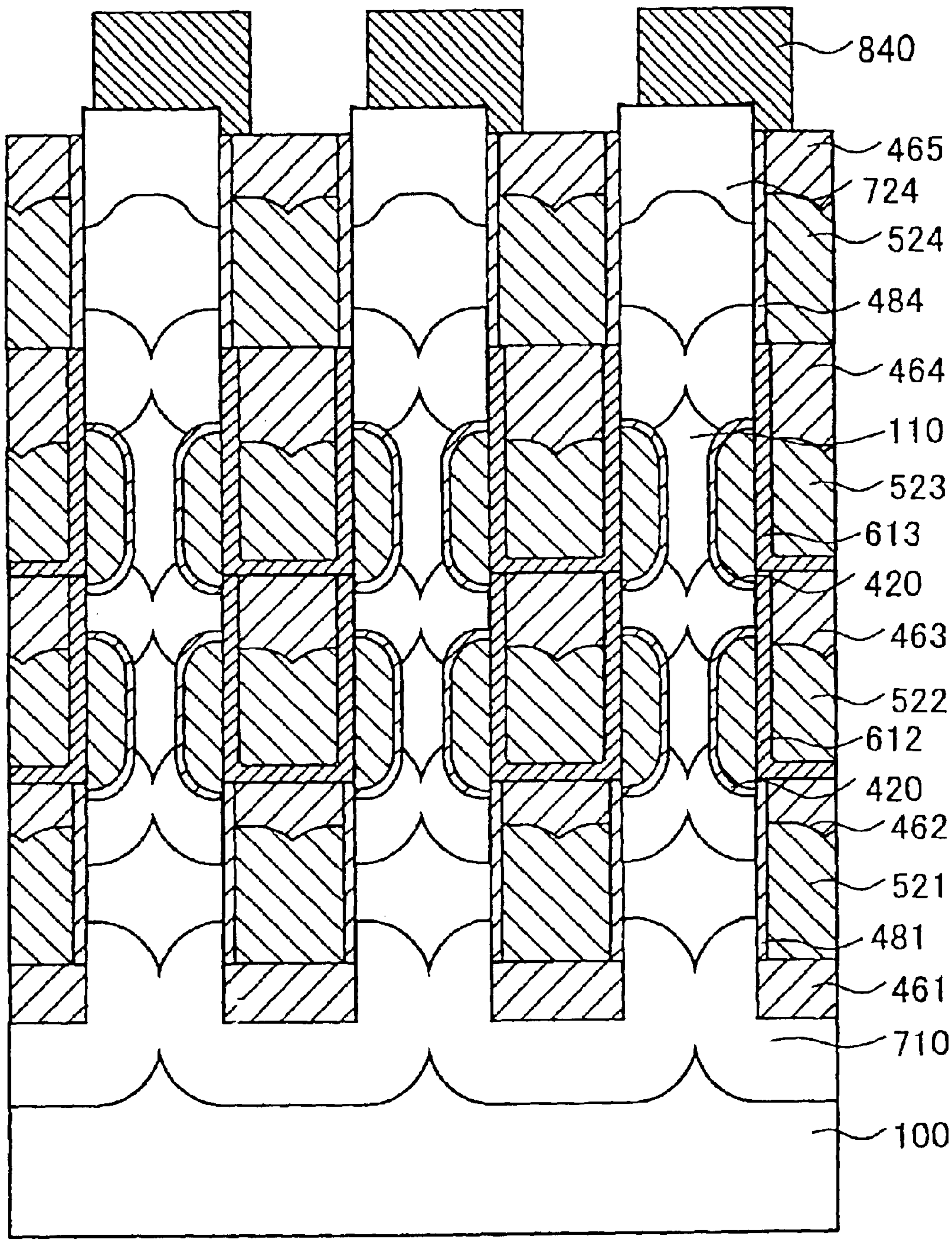
Figure 430:
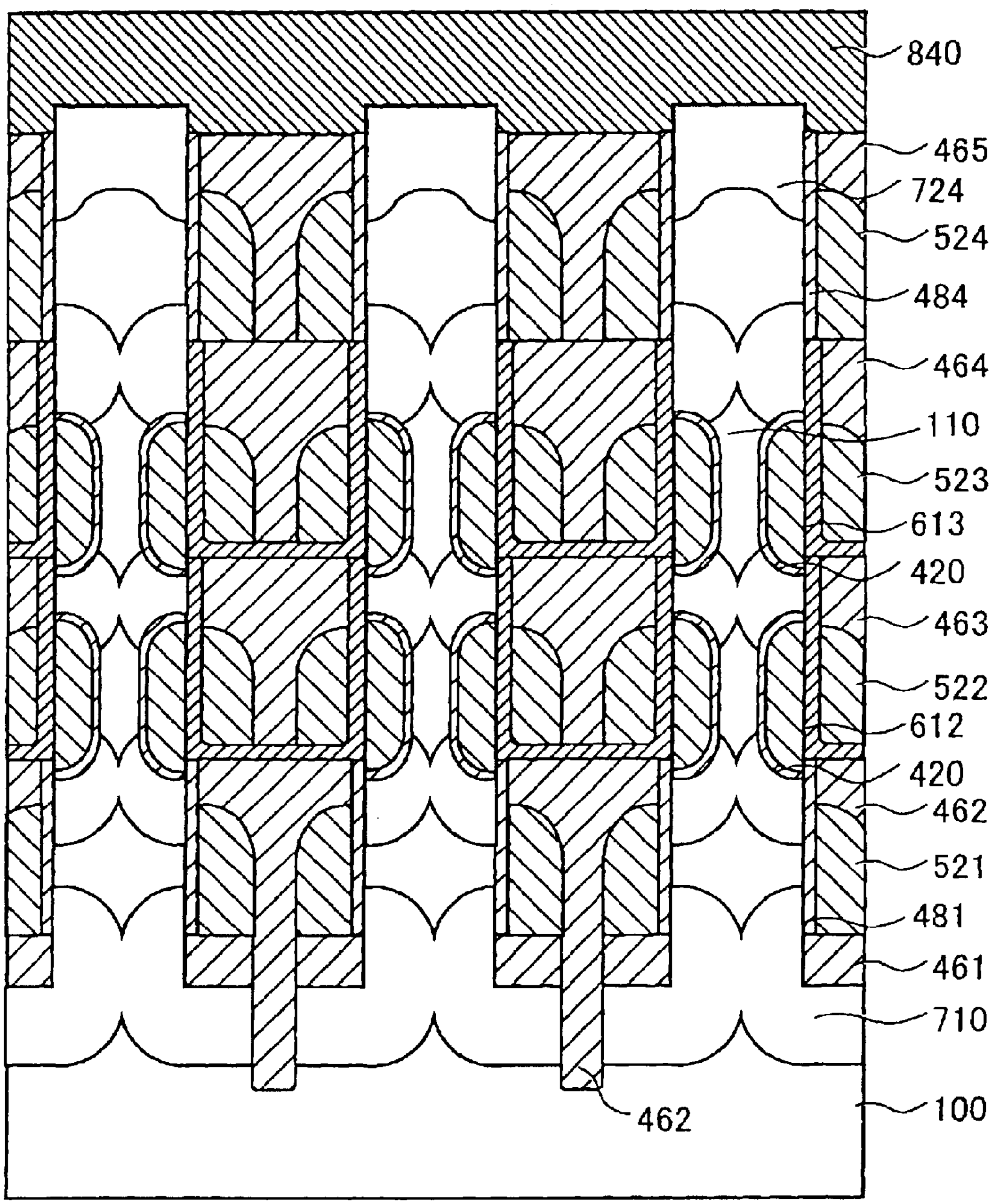

More specifically, as shown in FIGS. 427 and 428, the impurity diffusion layer 710 may be disposed such that the semiconductor substrate 100 is not electrically connected with the island-like semiconductor layer 110. Further, as shown in FIGS. 429 and 430, the impurity diffusion layers 721 to 723 may be disposed such that active regions of the memory cells and the selection gate transistors arranged in the island-like semiconductor layers 110 are electrically insulated. Alternatively, the impurity diffusion layers 710 and 721 to 723 may be disposed such that the same effect can be obtained by the depletion layer which is expanded due to a potential applied at reading, erasing or writing.

According to this example, the same effect as obtained by Production Example 39 is obtained. Further, since the impurity diffusion layers are disposed such that the active regions of the memory cells are in an electrically floating state with respect to the substrate, the back-bias effect from the substrate is prevented. Thereby, the occurrence of variations is prevented with regard to the characteristics of the memory cells owing to decrease of the threshold of the memory cells at reading data. It is desired that the memory cells and the selection gate transistors are completely depleted.

PRODUCTION EXAMPLE 49

Explanation is given of an example of production process for producing a semiconductor memory in which the bottom of the island-like semiconductor layer 110 does not have a simple columnar shape.

FIGS. 431 and 432 and FIGS. 433 and 434 are sectional views taken on line A–A' and line B–B', respectively, in FIG. 1 which is a cross-sectional view illustrating a memory cell array of an EEPROM.

Figure 431:
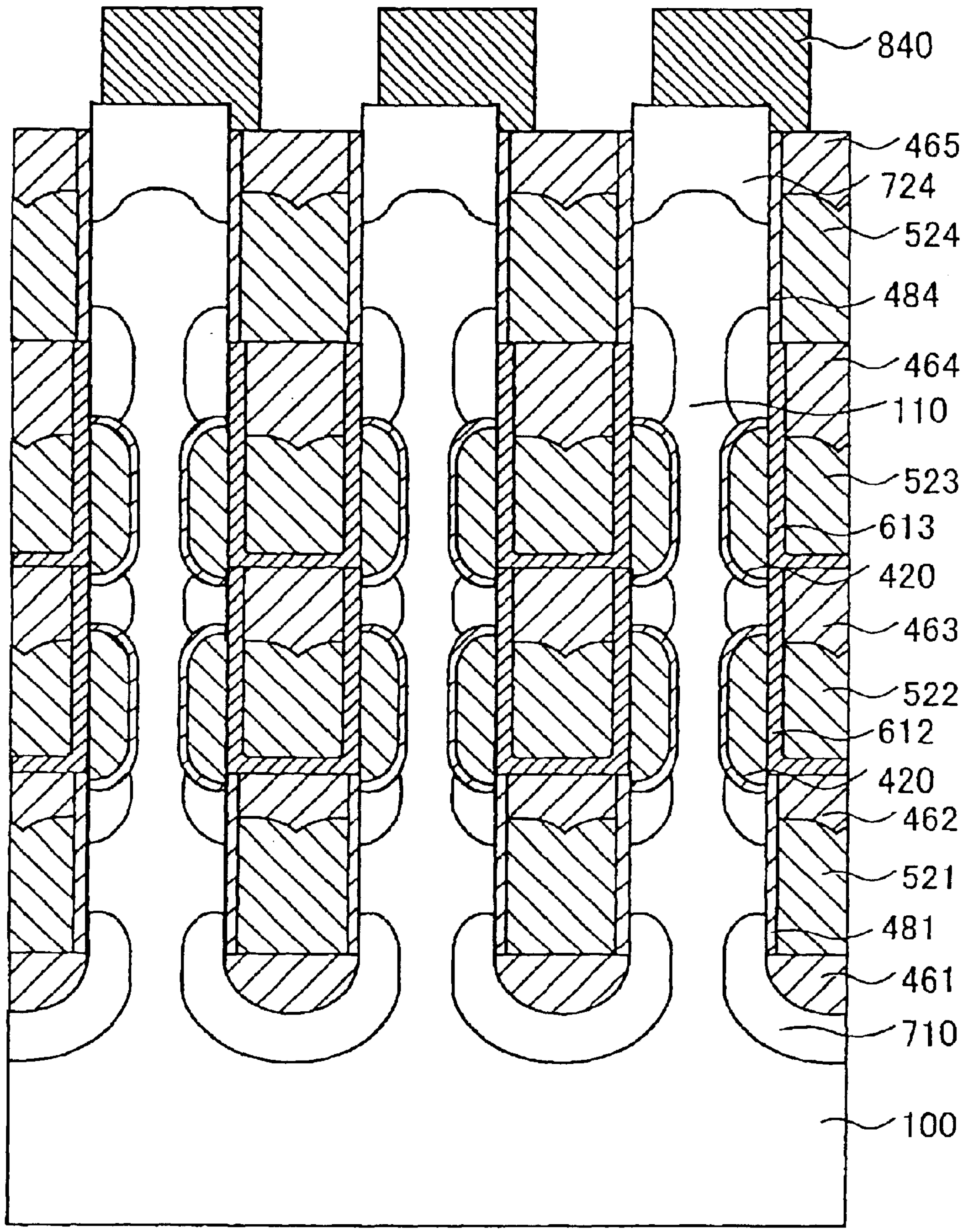
Figure 432:
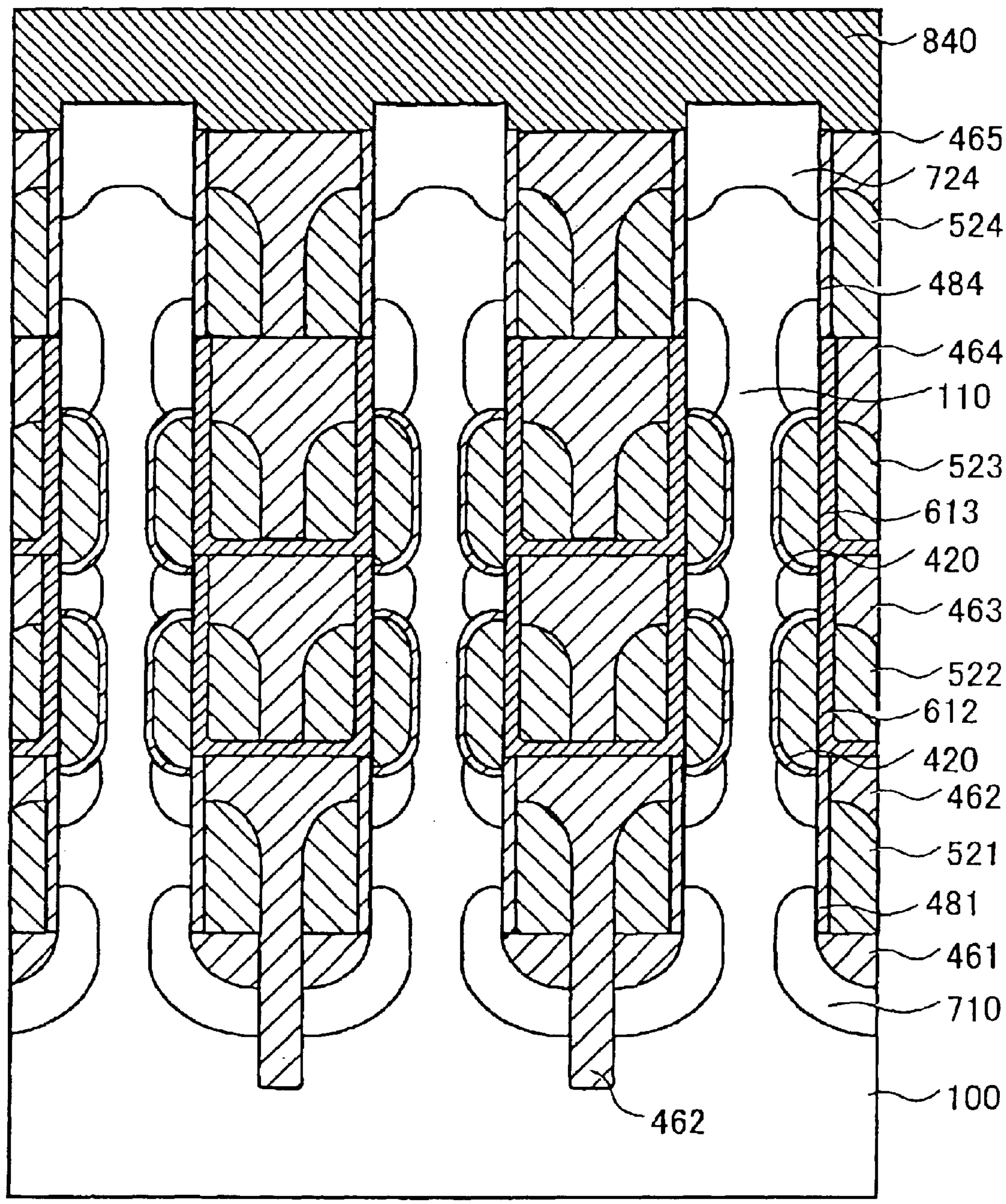

As shown in FIGS. 431 and 432, the first lattice-form trench 210 may have a partially or entirely rounded slant shape at its bottom. The bottom of the polysilicon film 521 to be a second conductive film may or may not reach the slant bottom of the first trench 210.

Figure 433:
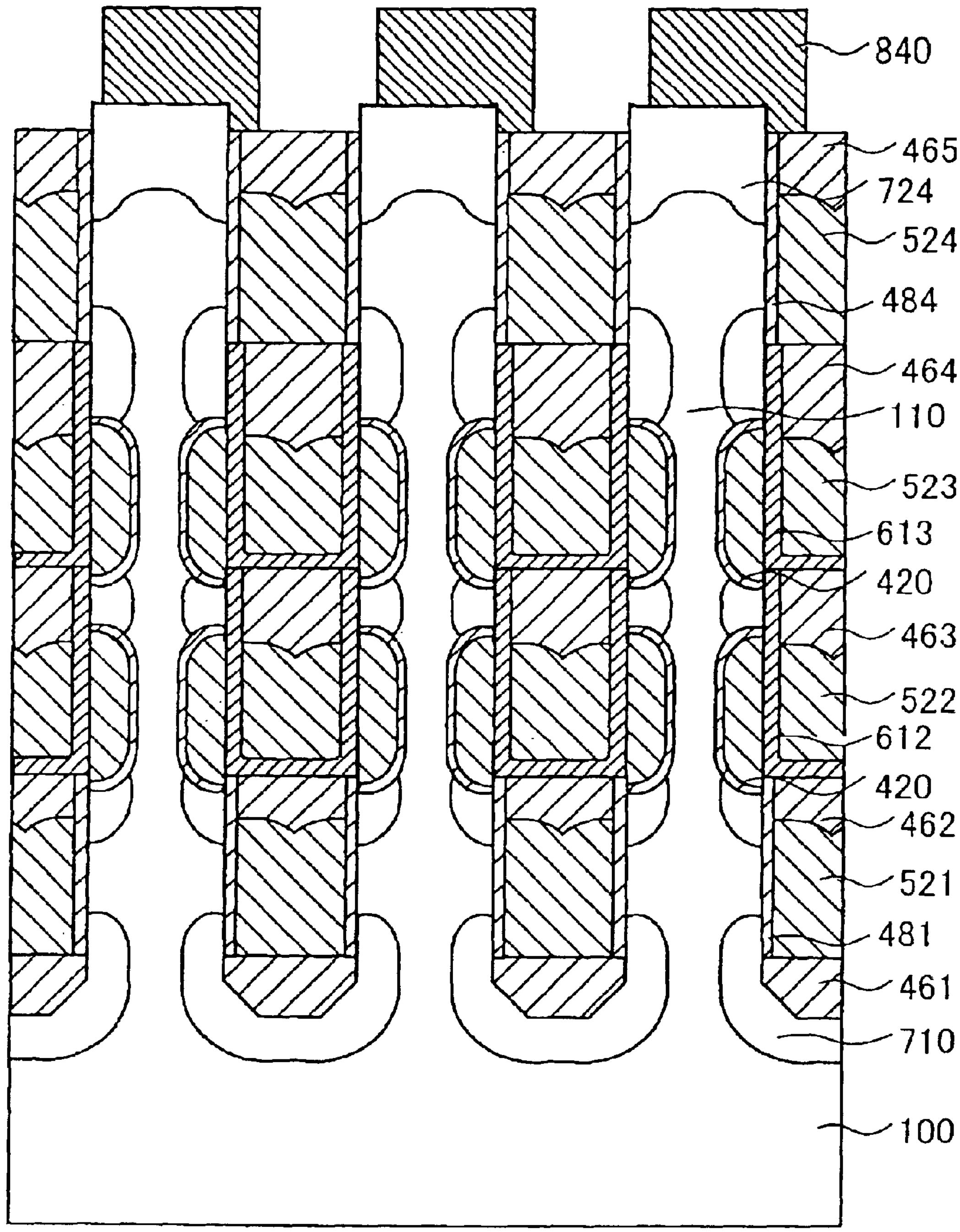
Figure 434:
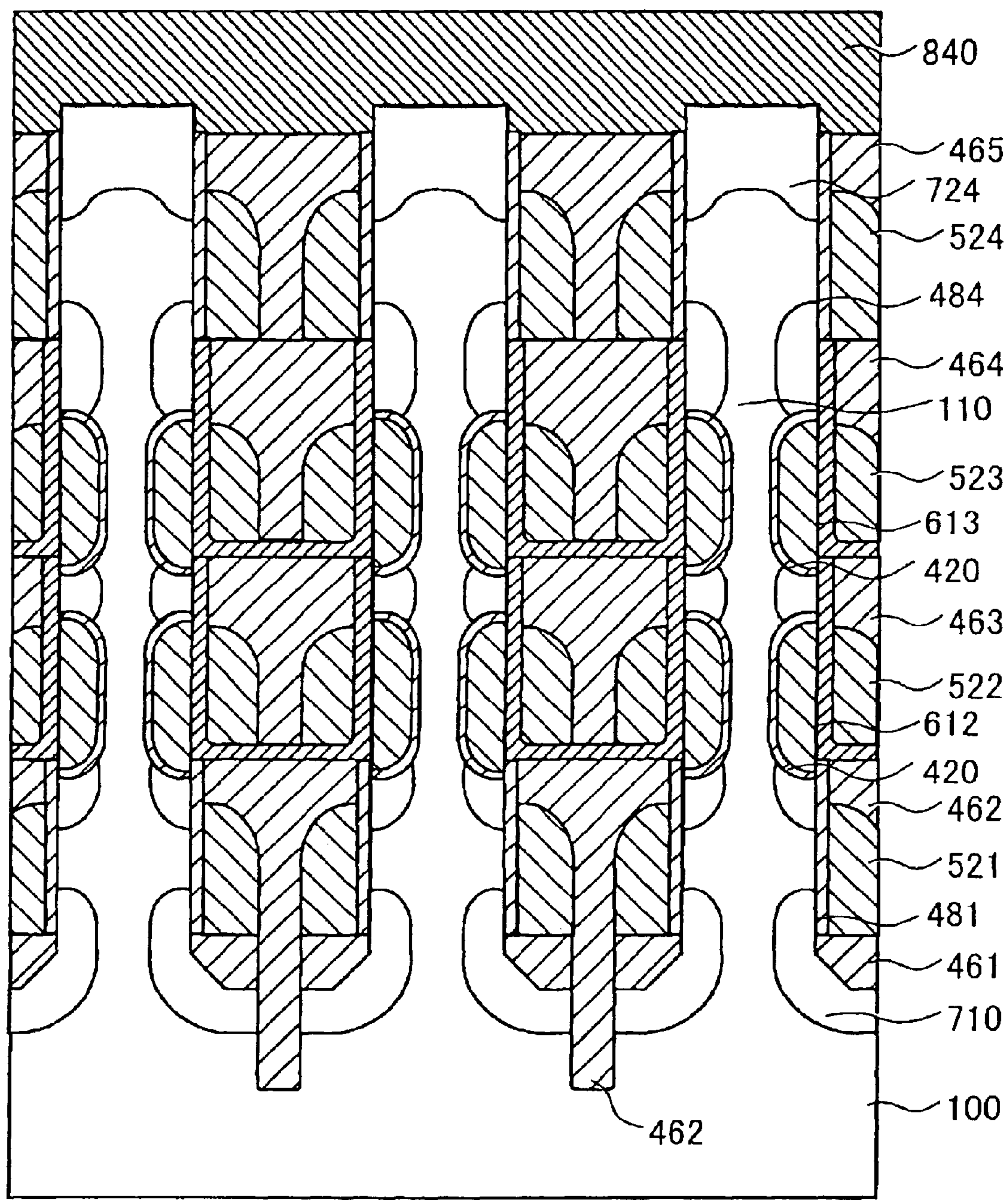

Alternatively, the first lattice-form trench 210 may have a slant shape at its bottom as shown in FIGS. 433 and 434. The bottom of the polysilicon film 521 may or may not reach the slant bottom of the first trench 210.

PRODUCTION EXAMPLE 50

Explanation is given of an example of production process for producing a semiconductor memory in which the bottom of the island-like semiconductor layer 110 does not have a simple columnar shape.

FIGS. 435 and 536 and FIGS. 437 and 438 are sectional views taken on line A–A' and line B–B', respectively, in FIG. 1 which is a cross-sectional view illustrating a memory cell array of an EEPROM.

Figure 435:
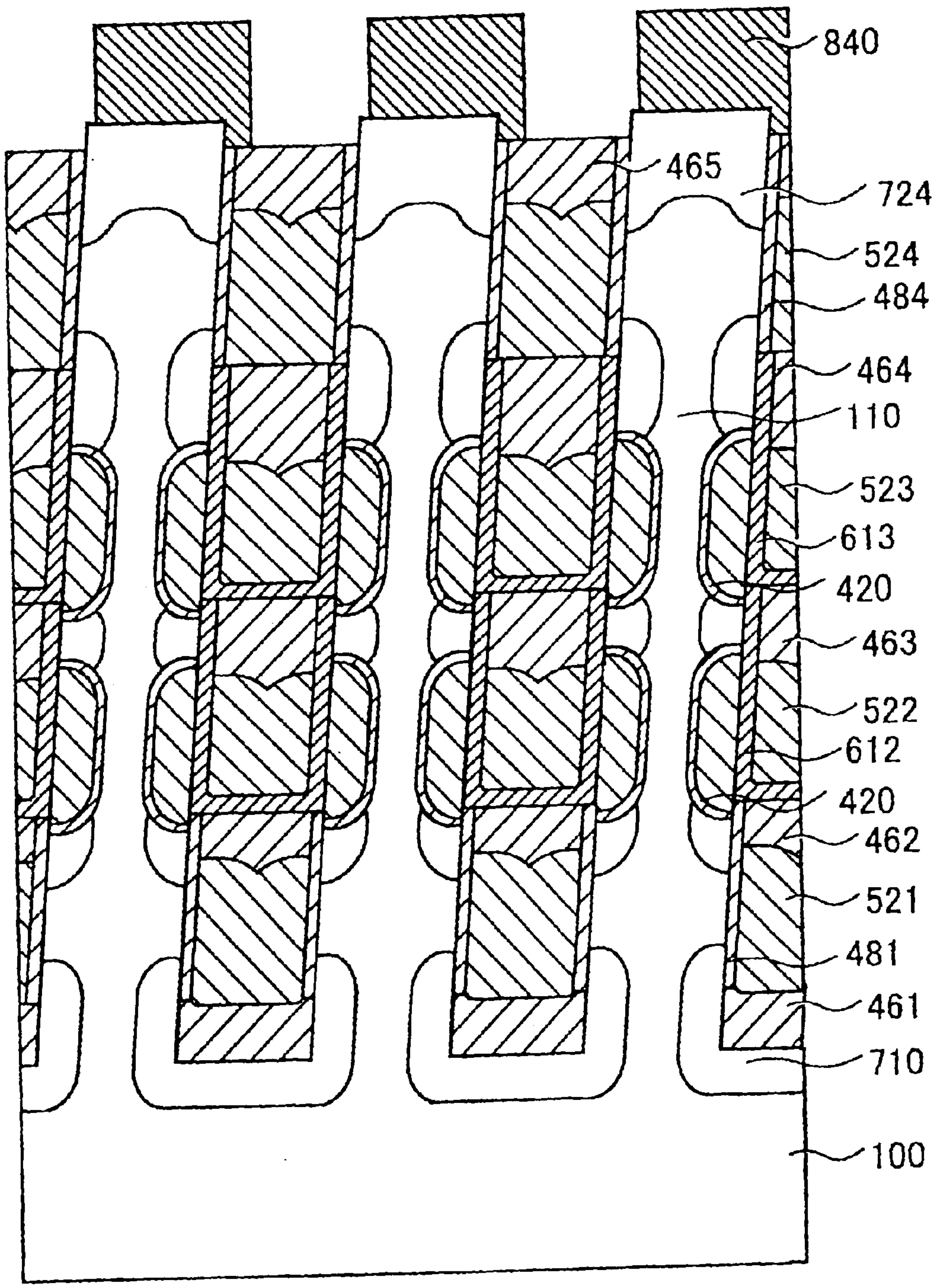
Figure 436:
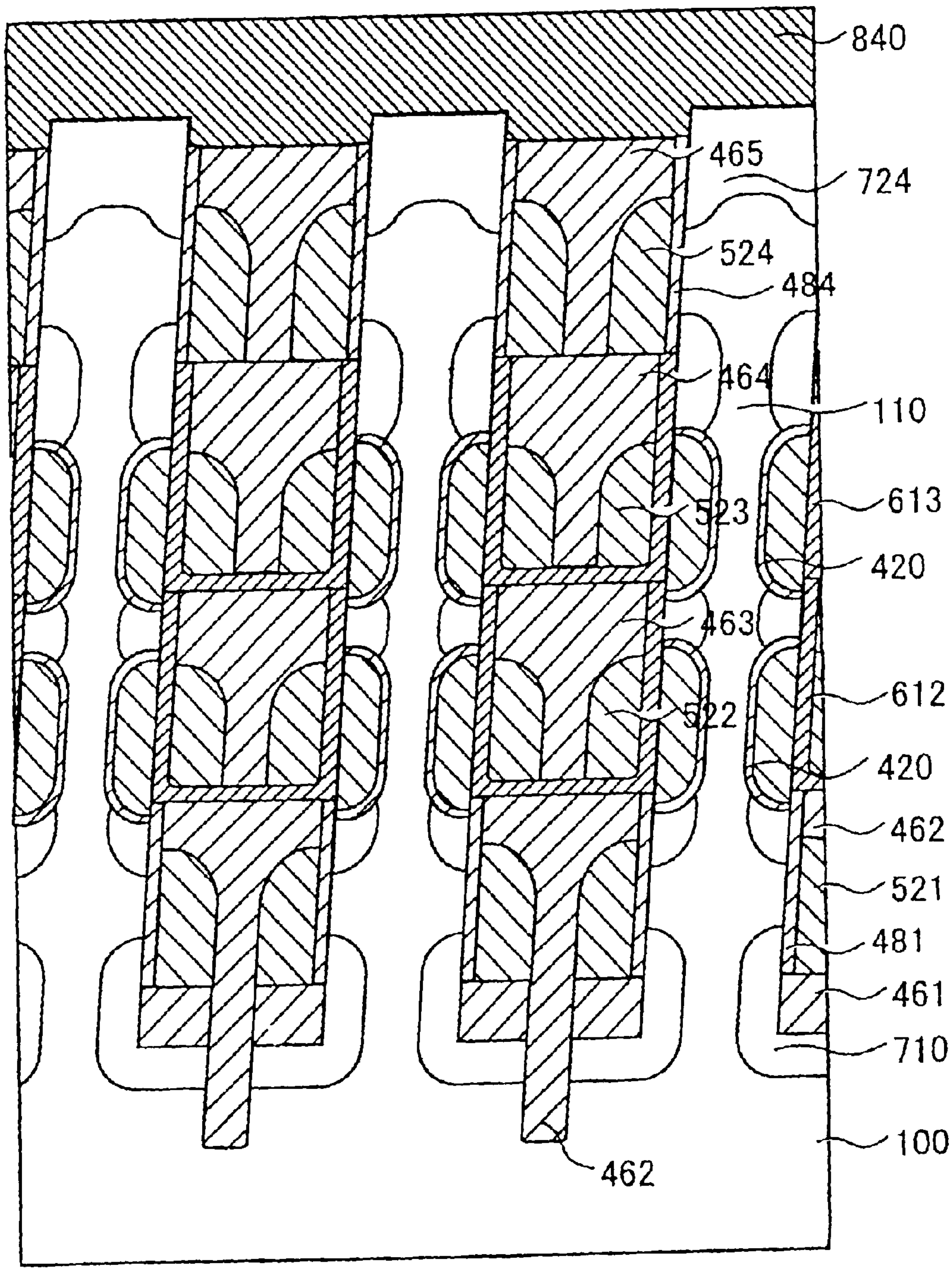

The first trench 210 may be formed by reactive ion etching such that the top and the bottom of the island-like semiconductor layer 110 may be shifted in a horizontal direction as shown in FIG. 435 and FIG. 436. Also, the top and the bottom of the island-like semiconductor layer 110 may have different outward shapes as shown in FIG. 437 and 438.

Figure 437:
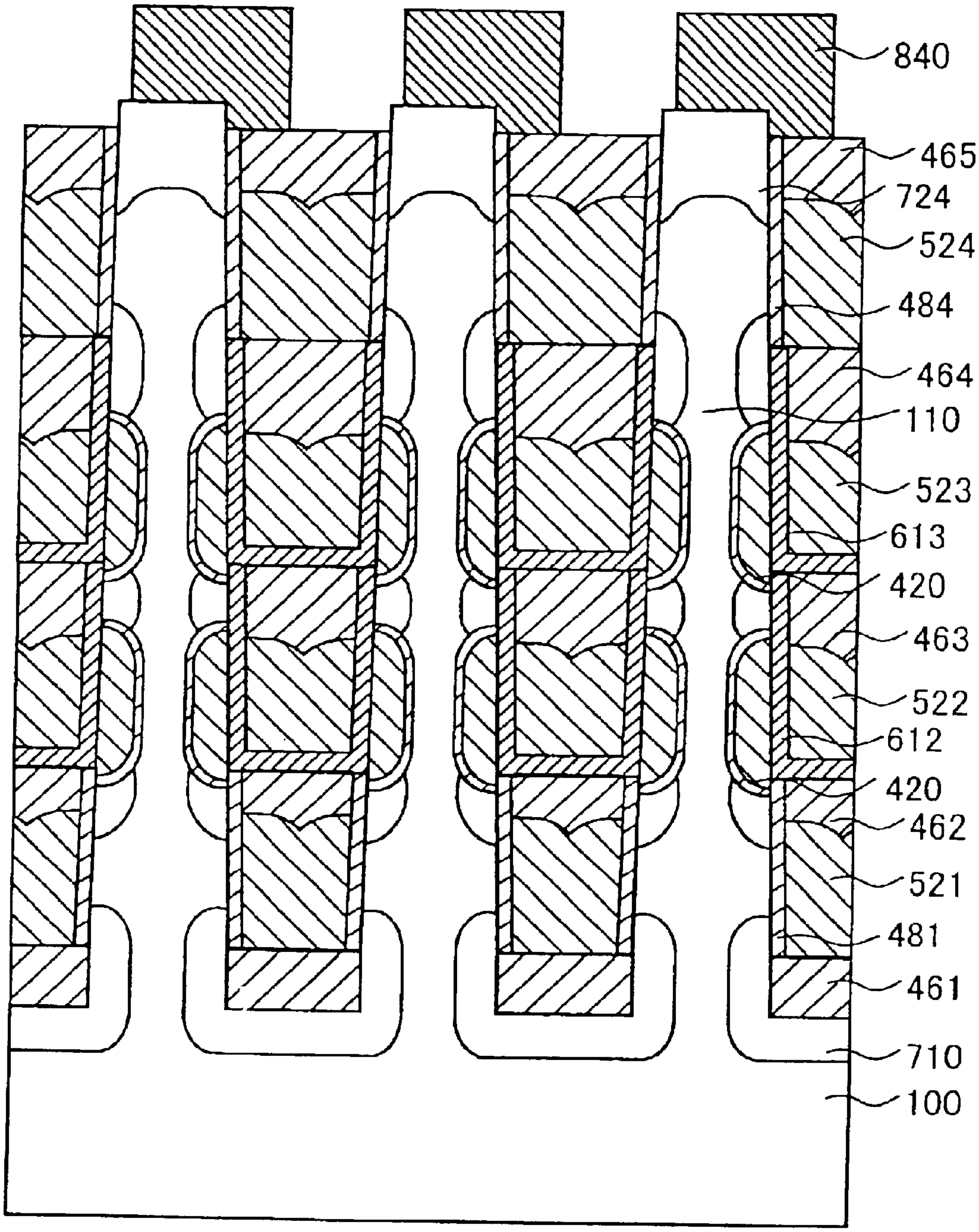
Figure 438:
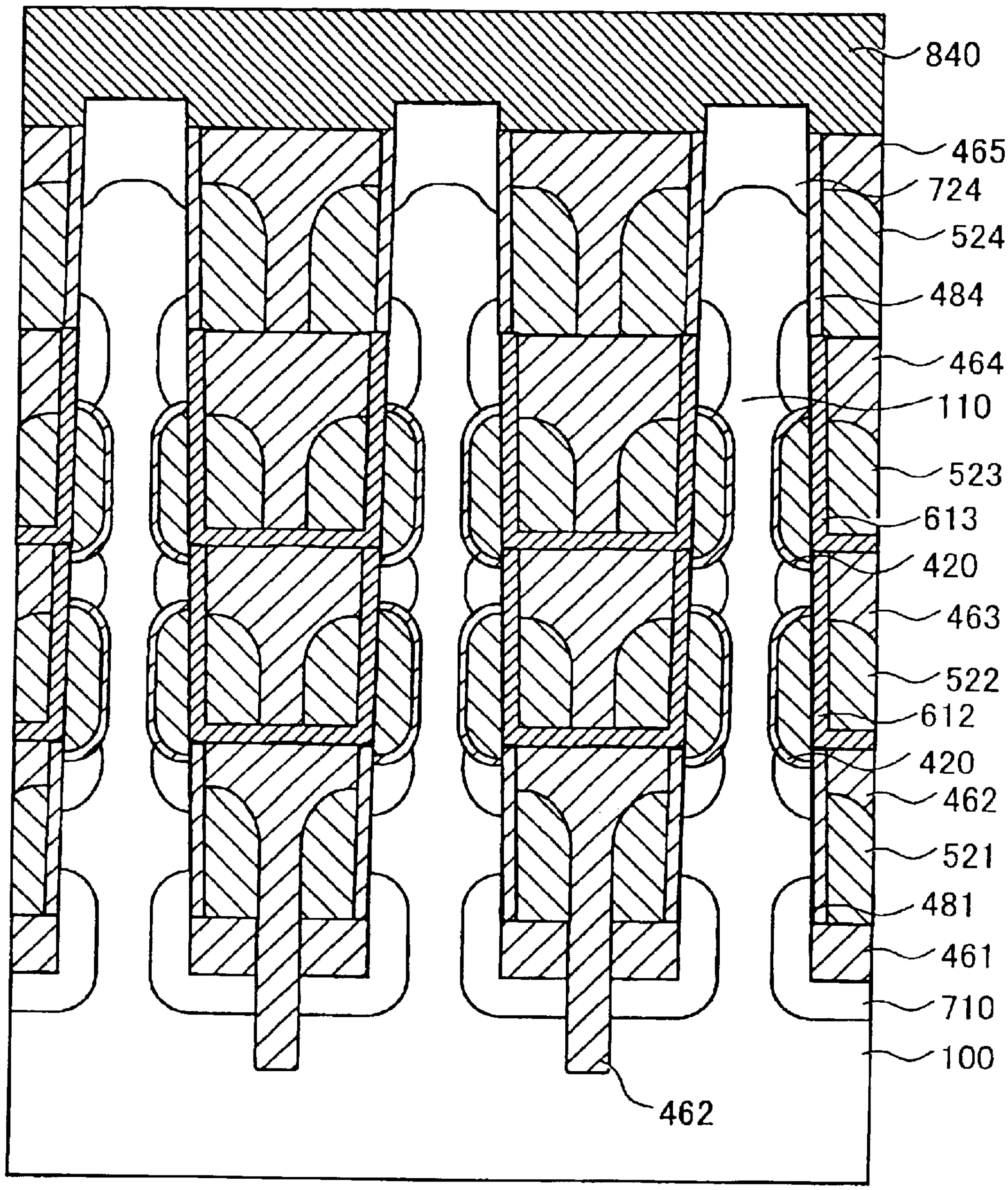
Figure 439:
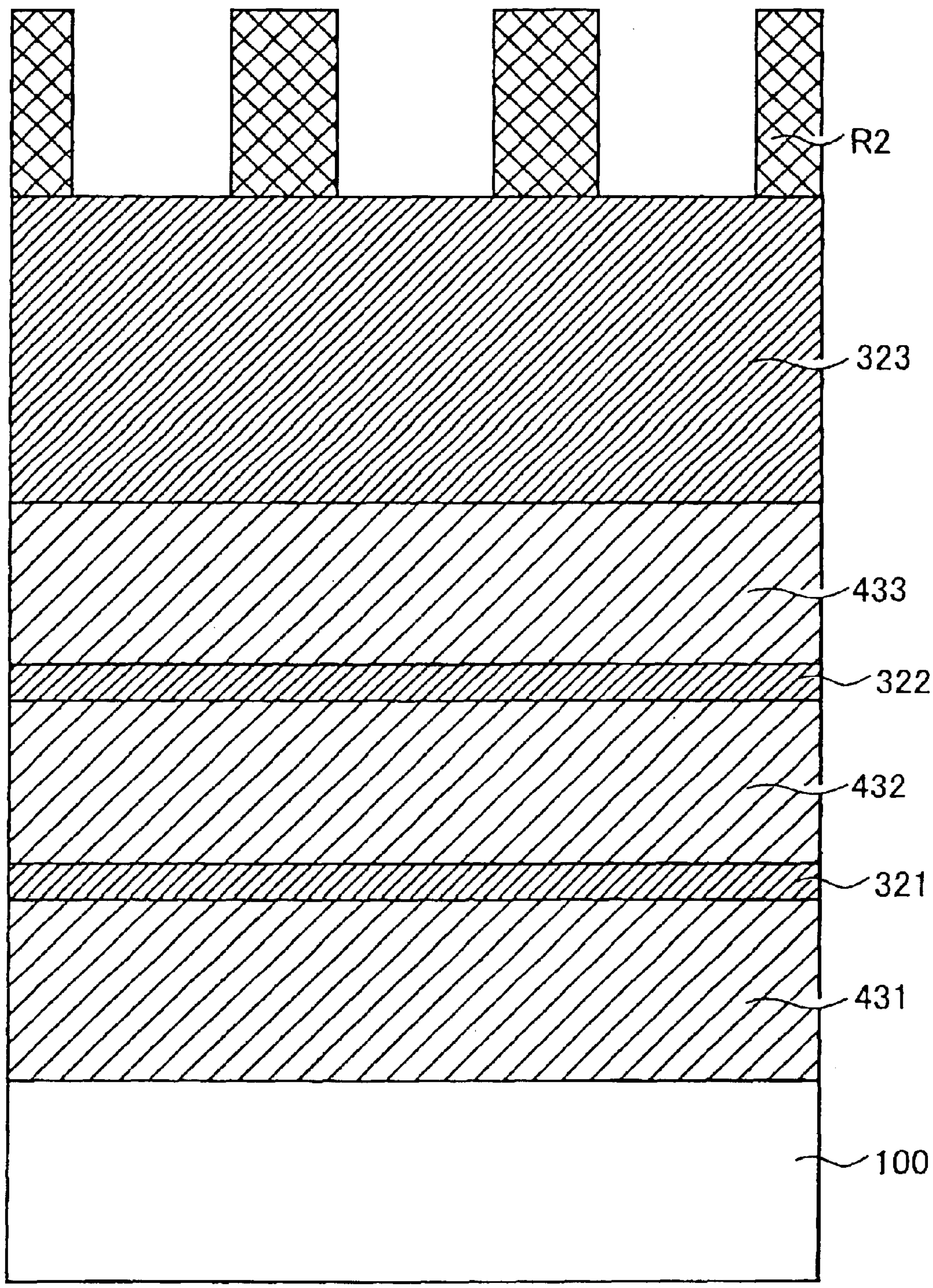

For example, in the case where the island-like semiconductor layer 110 is circular in cross-sectional view as shown in FIG. 1, the island-like semiconductor layer 110 is an inclined column in FIGS. 435 and 436 and is a truncated cone in FIGS. 437 and 438. The shape of the island-like semiconductor layer 110 is not particularly limited so long as the memory cells can be disposed in series in the direction vertical to the semiconductor substrate 100.

PRODUCTION EXAMPLE 51

In a semiconductor memory to be produced in this production example, a region for forming at least one recess on the sidewall of the pillar-form island-like semiconductor layer is determined in advance by a layered film made of plural films, and thereafter, the island-like semiconductor layer in the pillar form is formed by selective epitaxial growth in a hole-form trench opened by using a photoresist mask. Sides of the island-like semiconductor layers make active regions. Tunnel oxide films and floating gates as charge storage layers are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time.

FIGS. 439 to 447 and FIGS. 448 to 456 are sectional views taken on line A–A' and line B–B', respectively, in FIG. 1 which is a cross-sectional view illustrating a memory cell array of an EEPROM.

First, a silicon oxide film 431 is deposited on a surface of a P-type silicon substrate 100 as a fifth insulating film to a thickness of 50 to 500 nm by CVD. Then, a silicon nitride film 321 is deposited to a thickness of 10 to 100 nm as a fourth insulating film, a silicon oxide film 432 is deposited to a thickness of 50 to 500 nm as a fifth insulating film, a silicon nitride film 322 is deposited to a thickness of 10 to 100 nm as a fourth insulating film, a silicon oxide film 433 is deposited to a thickness of 50 to 500 nm as a fifth insulating film, and a silicon nitride film 323 is deposited to a thickness of 100 to 5,000 nm as a fourth insulating film. The thicknesses of the silicon oxide films 432 and 433 are adjusted to a height of the floating gate of the memory cell.

Figure 440:
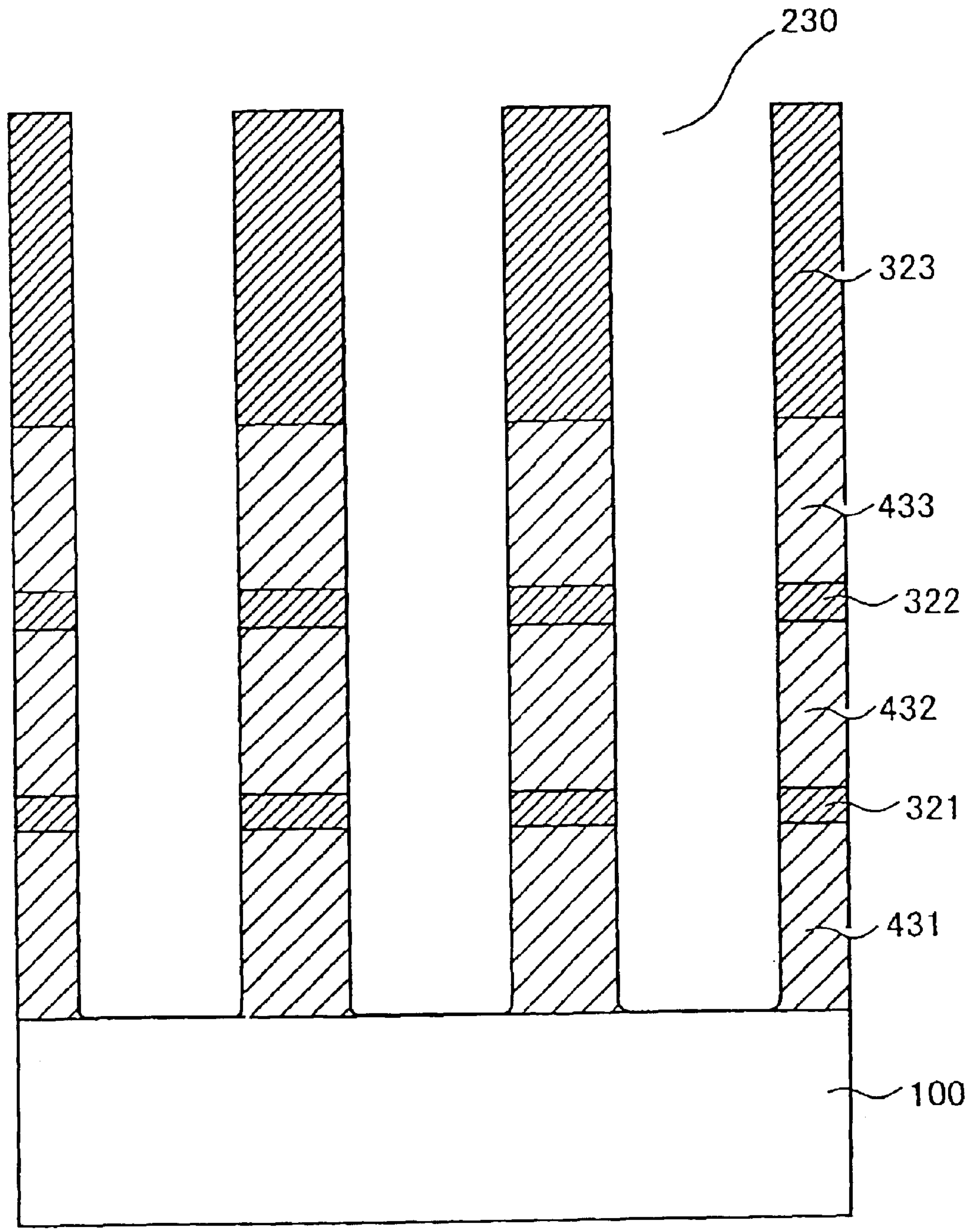
Figure 449:
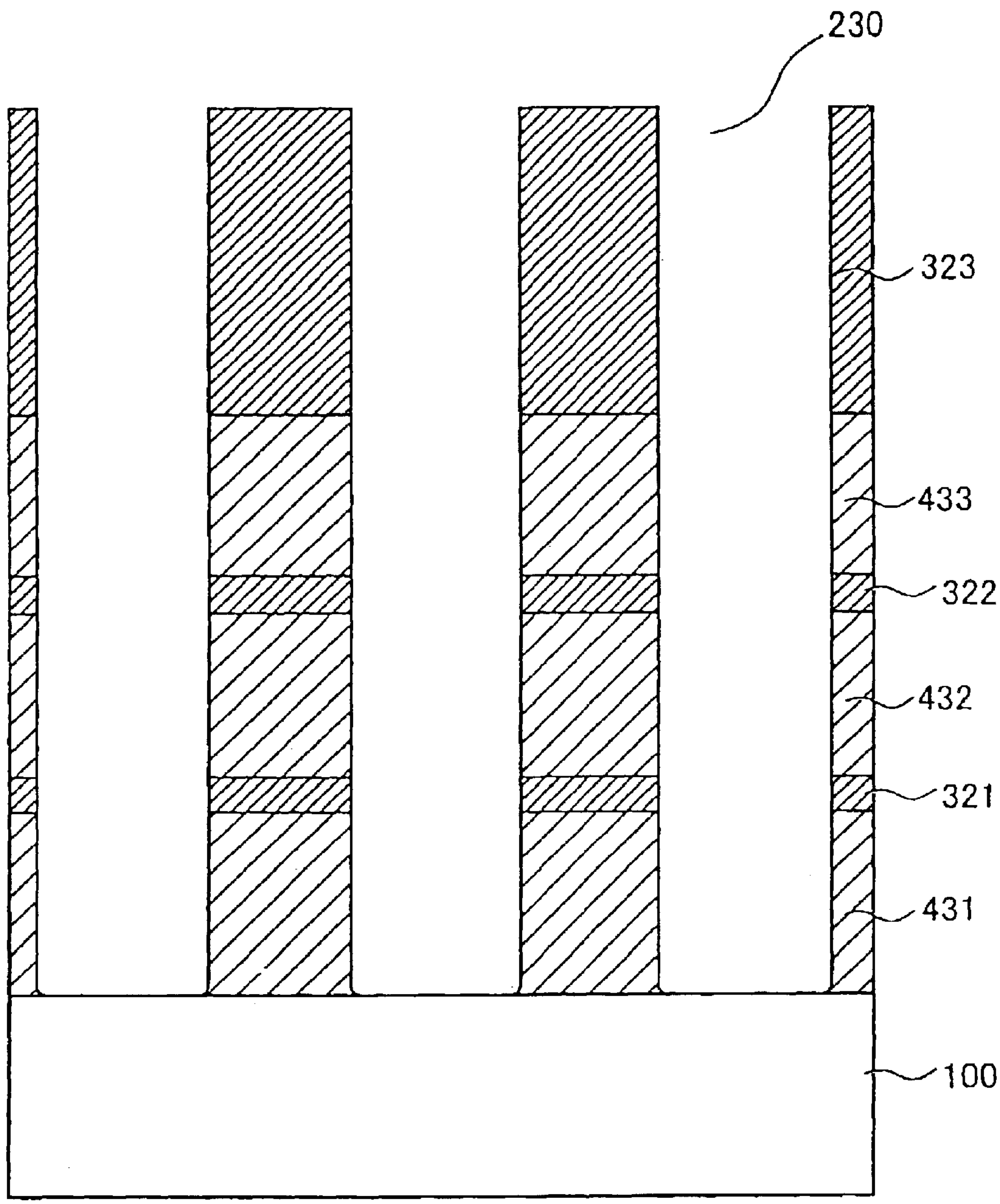

Subsequently, using a resist R2 patterned by a known photolithography technique as a mask (FIG. 439 and FIG. 448), the silicon nitride film 323, the silicon oxide film 433, the silicon nitride film 322, the silicon oxide film 432, the silicon nitride film 321 and the silicon oxide film 431 are etched successively by reactive ion etching to form a third trench 230. Then, the resist R2 is removed (FIG. 440 and FIG. 449).

Figure 441:
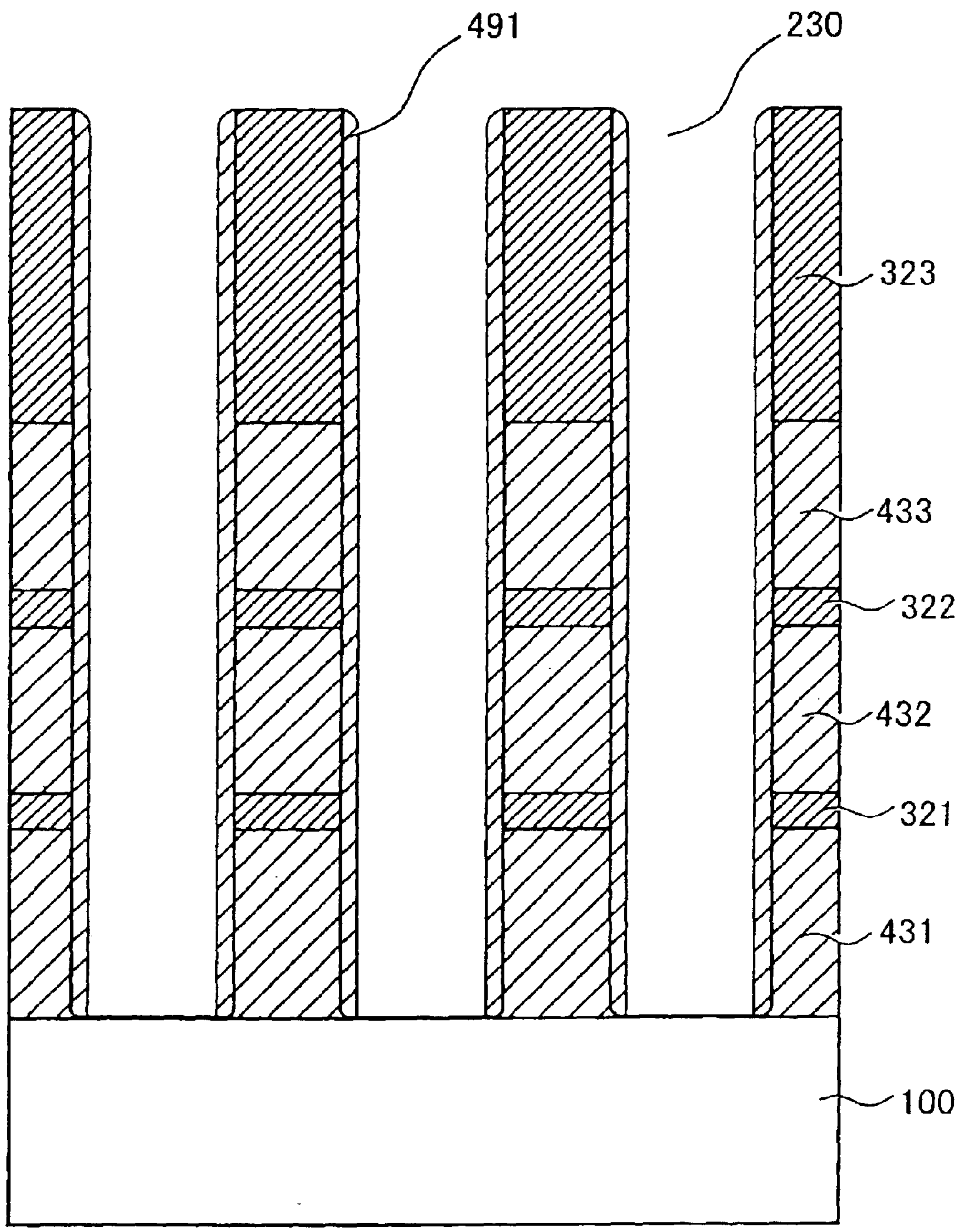
Figure 450:
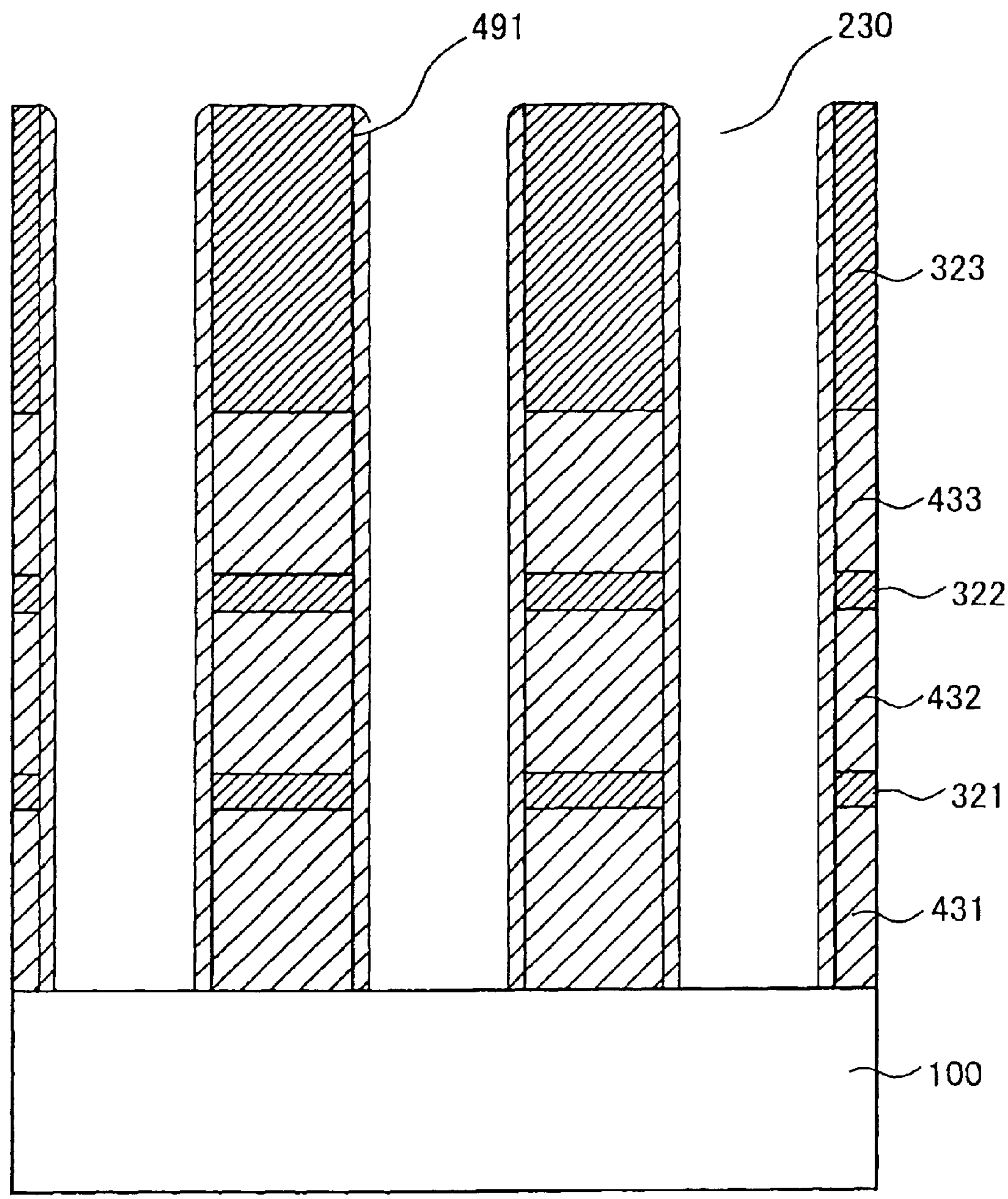

A fifteenth insulating film, for example, a silicon oxide film 491, is deposited to a thickness of 20 to 200 nm and anisotropically etched by about a deposit thickness such that the silicon oxide film 491 remains in the form of a sidewall spacer on the inner wall of the third trench 230 (FIG. 441 and FIG. 450).

Figure 442:
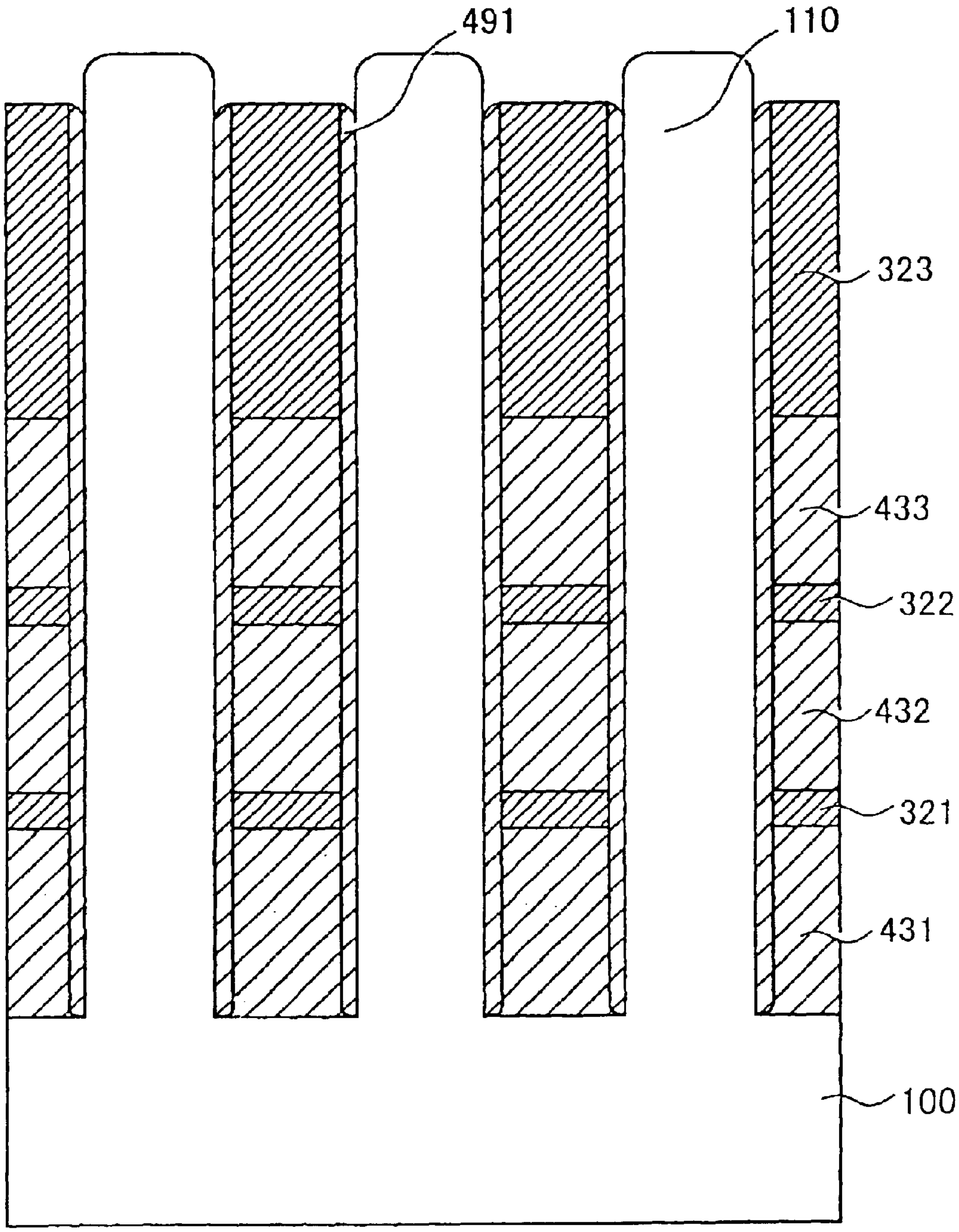
Figure 443:
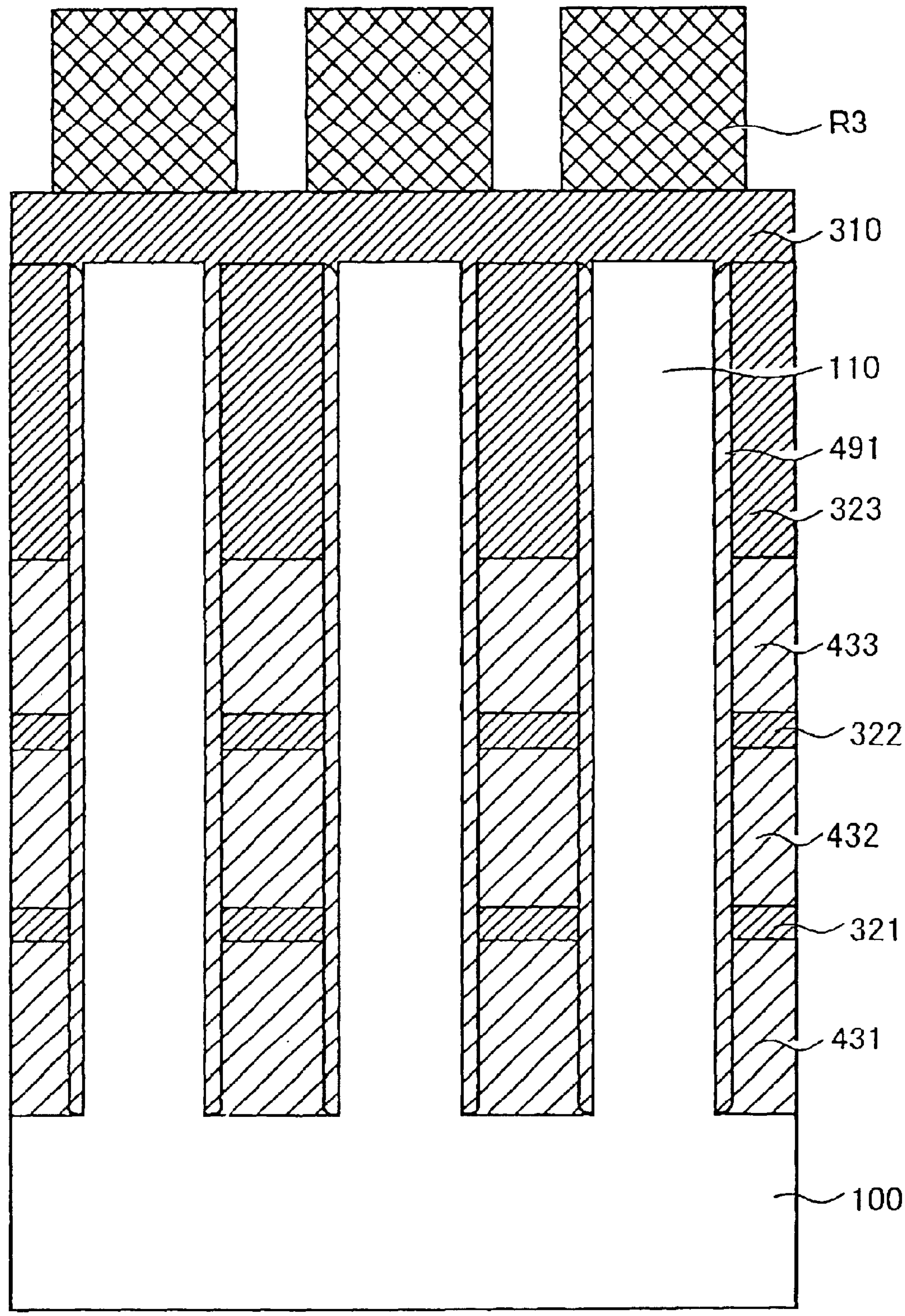
Figure 444:
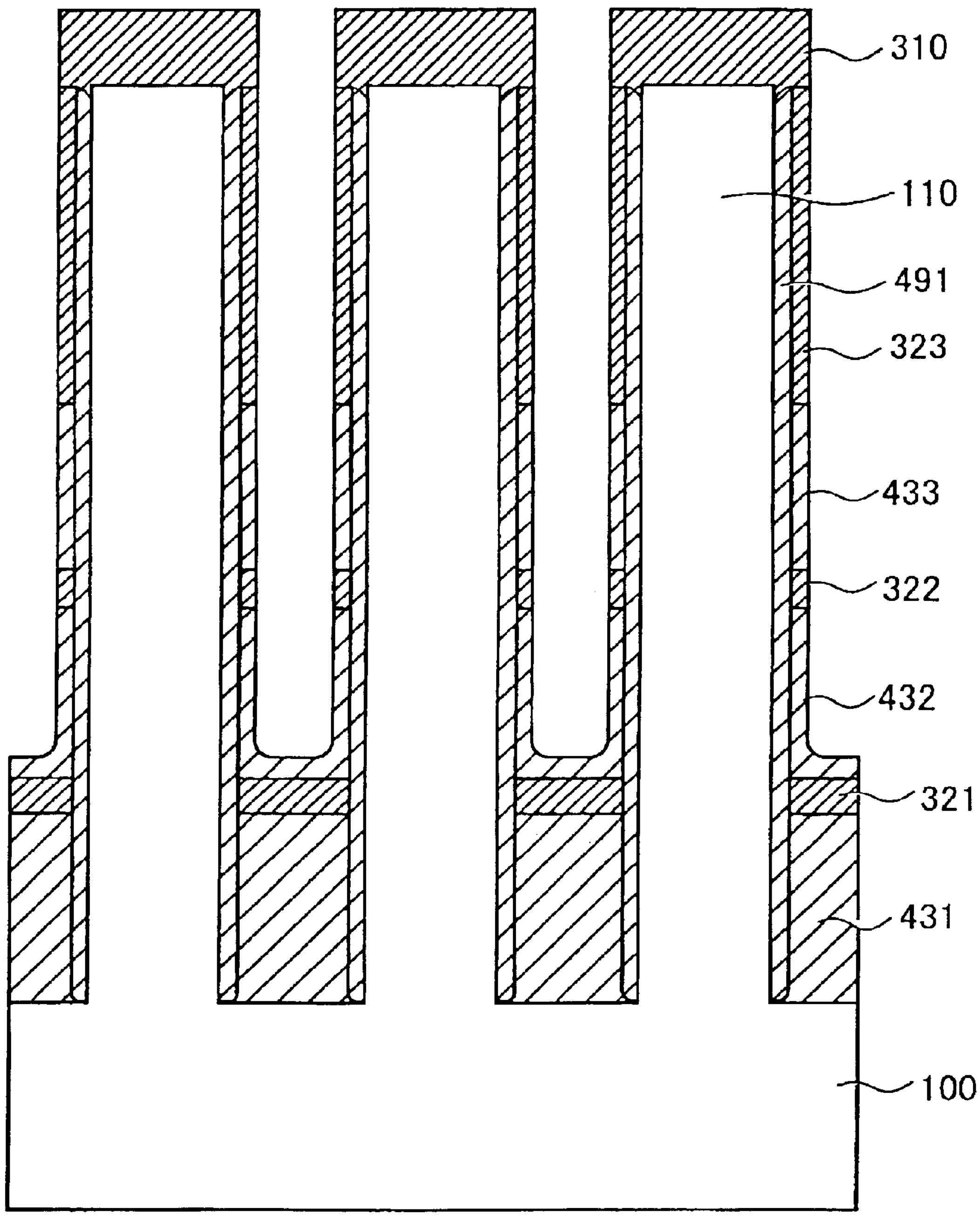
Figure 445:
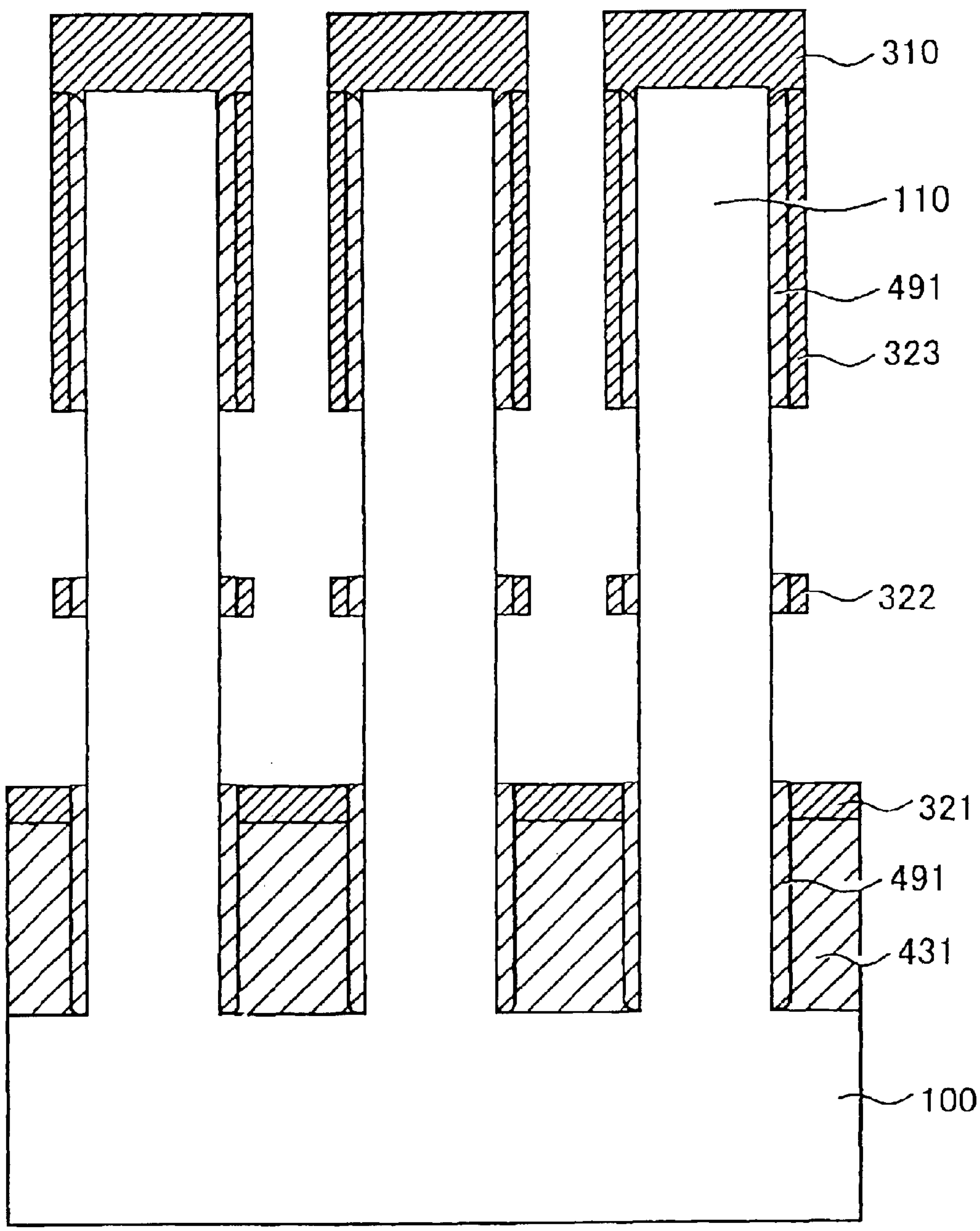
Figure 451:
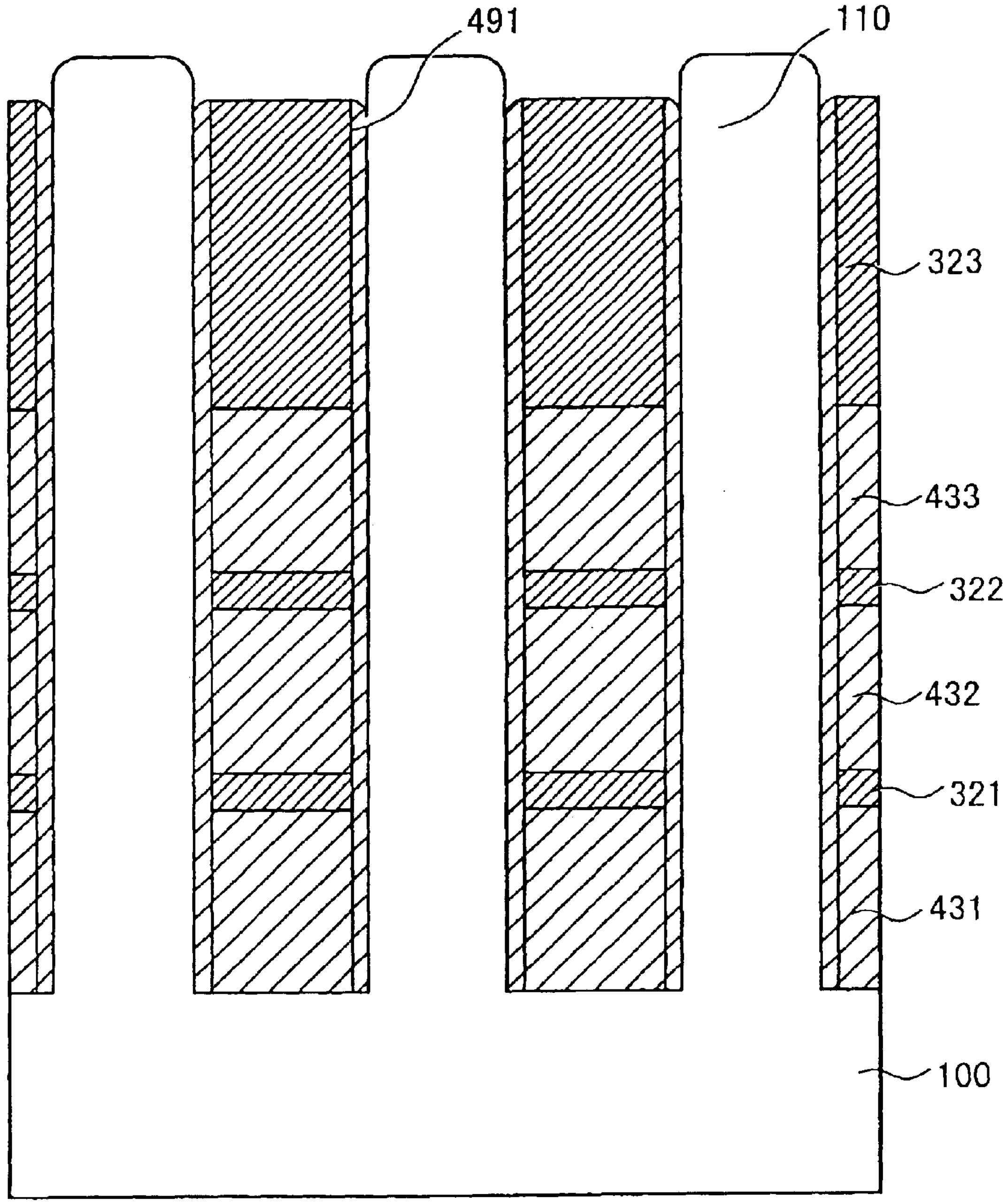
Figure 452:
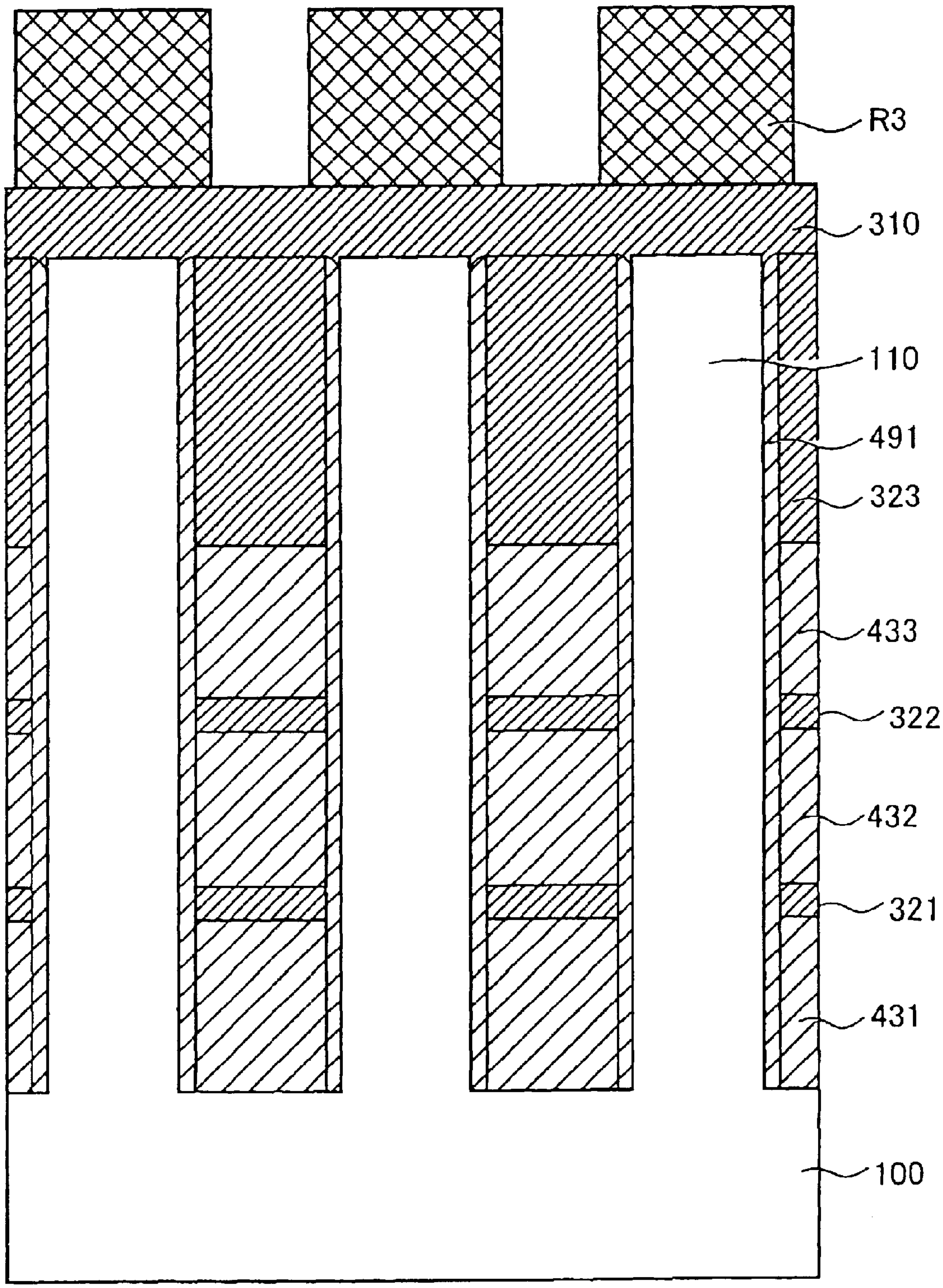
Figure 453:
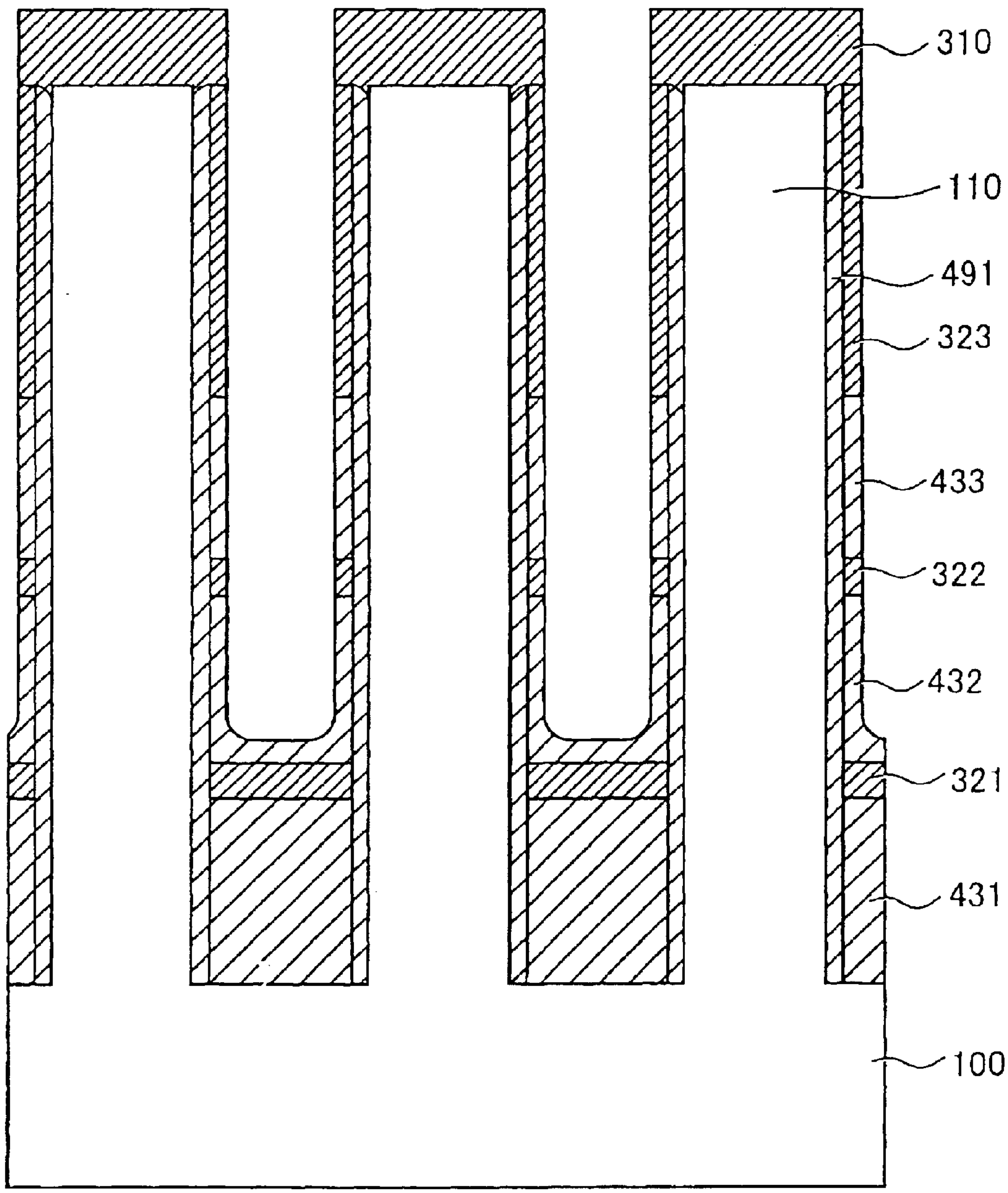
Figure 454:
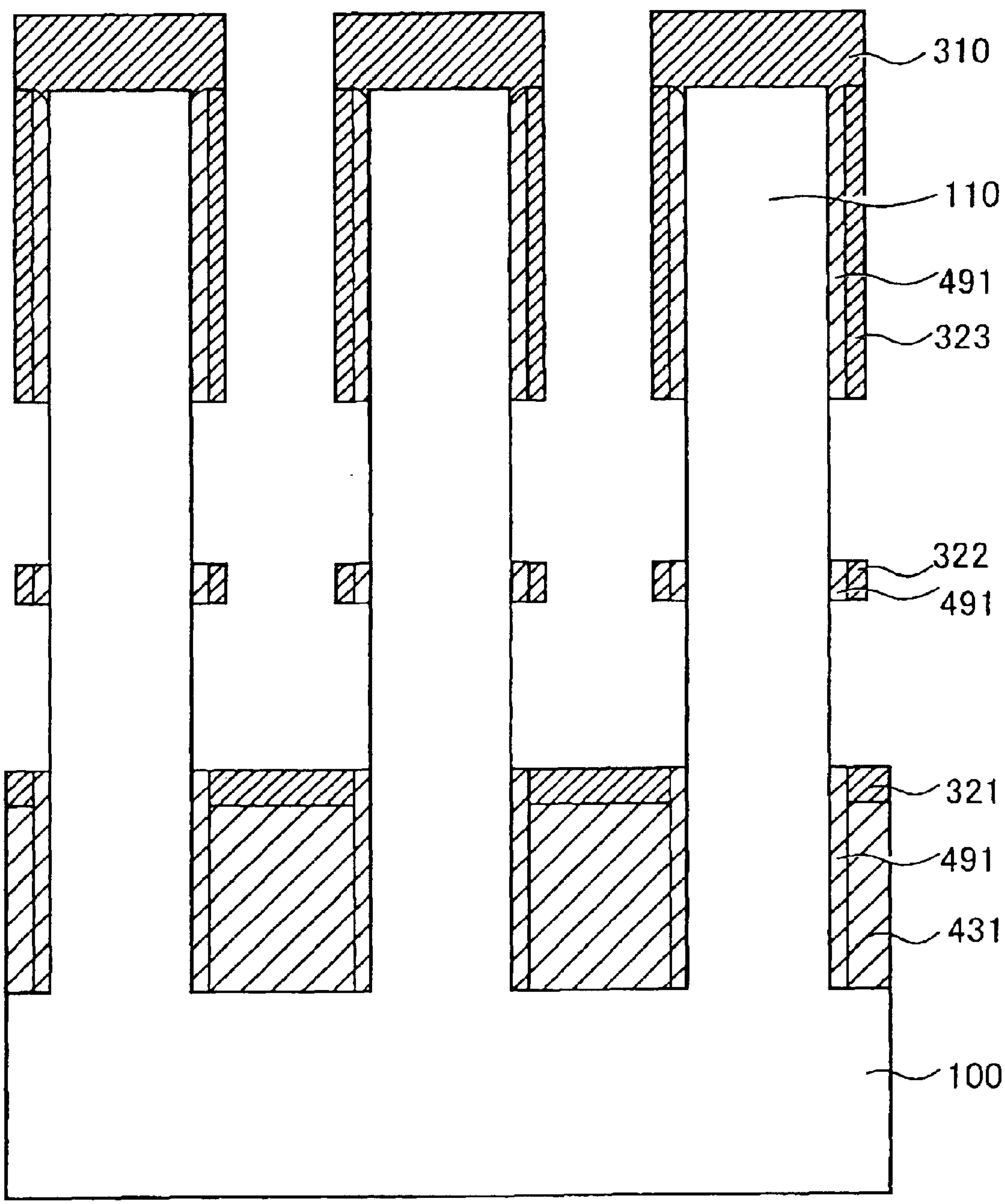

Then, an island-like semiconductor layer 110 is buried in the third trench 230 with the intervention of the silicon oxide film 491. For example, the semiconductor layer is selectively epitaxially grown from the P-type silicon substrate 100 located at the bottom of the third trench 230 (FIG. 442 and FIG. 451).

The island-like semiconductor layer 110 is planarized to be flush with the silicon nitride film 323. At this time, the planarization may be carried out by isotropic etch back, anisotropic etch back, CMP, or these may be combined in various ways. Any means may be used for the planarization.

A silicon nitride film 310 is deposited to a thickness of 100 to 1,000 nm as a first insulating film. Using a resist R3 patterned by a known photolithography technique as a mask (FIG. 443 and FIG. 452), reactive ion etching is performed to successively etch the silicon nitride film 310, the silicon nitride film 323, the silicon oxide film 433, the silicon nitride film 322 and the silicon oxide film 432, thereby exposing the silicon oxide film 432. At this time, the silicon oxide film 432 may be etched until the silicon nitride film 321 is exposed.

Figure 446:
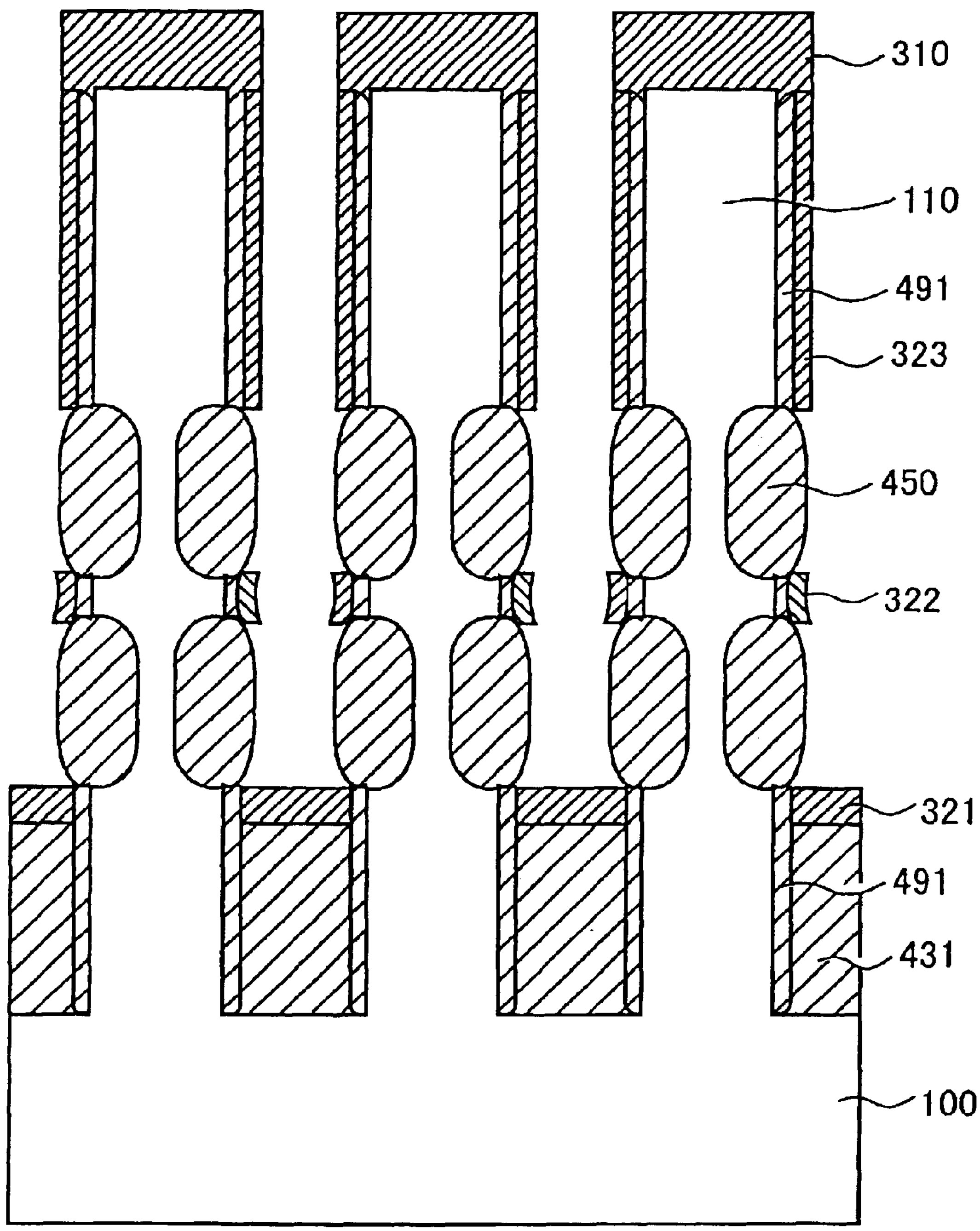
Figure 455:
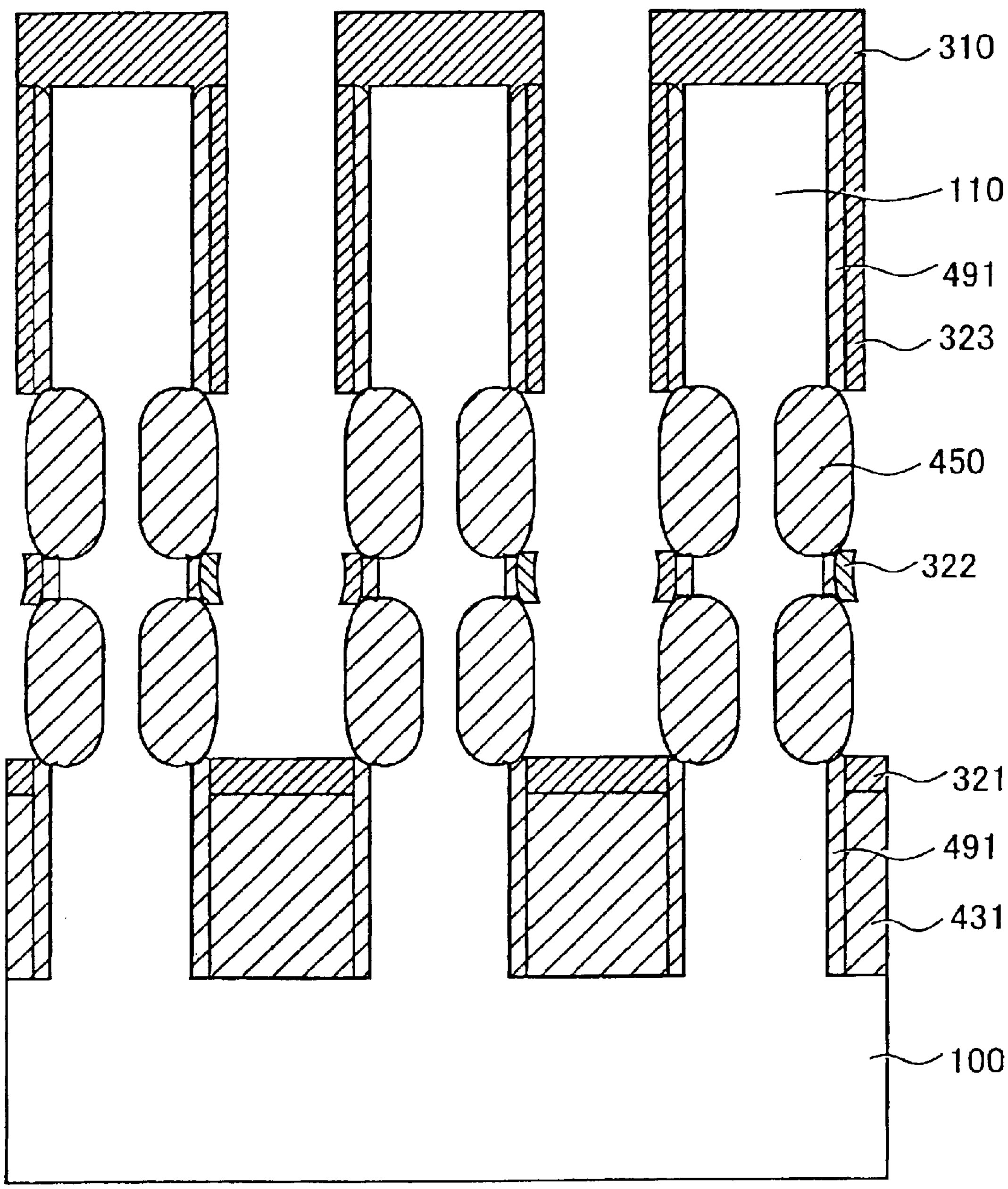

After the resist R3 is removed (FIG. 444 and FIG. 453), the silicon oxide film is entirely removed by isotropic etching (FIG. 445 and FIG. 454) and the exposed island-like semiconductor layer 110 is thermally oxidized to form a silicon oxide film 450 as a seventh insulating film (FIG. 446 and FIG. 455).

Figure 447:
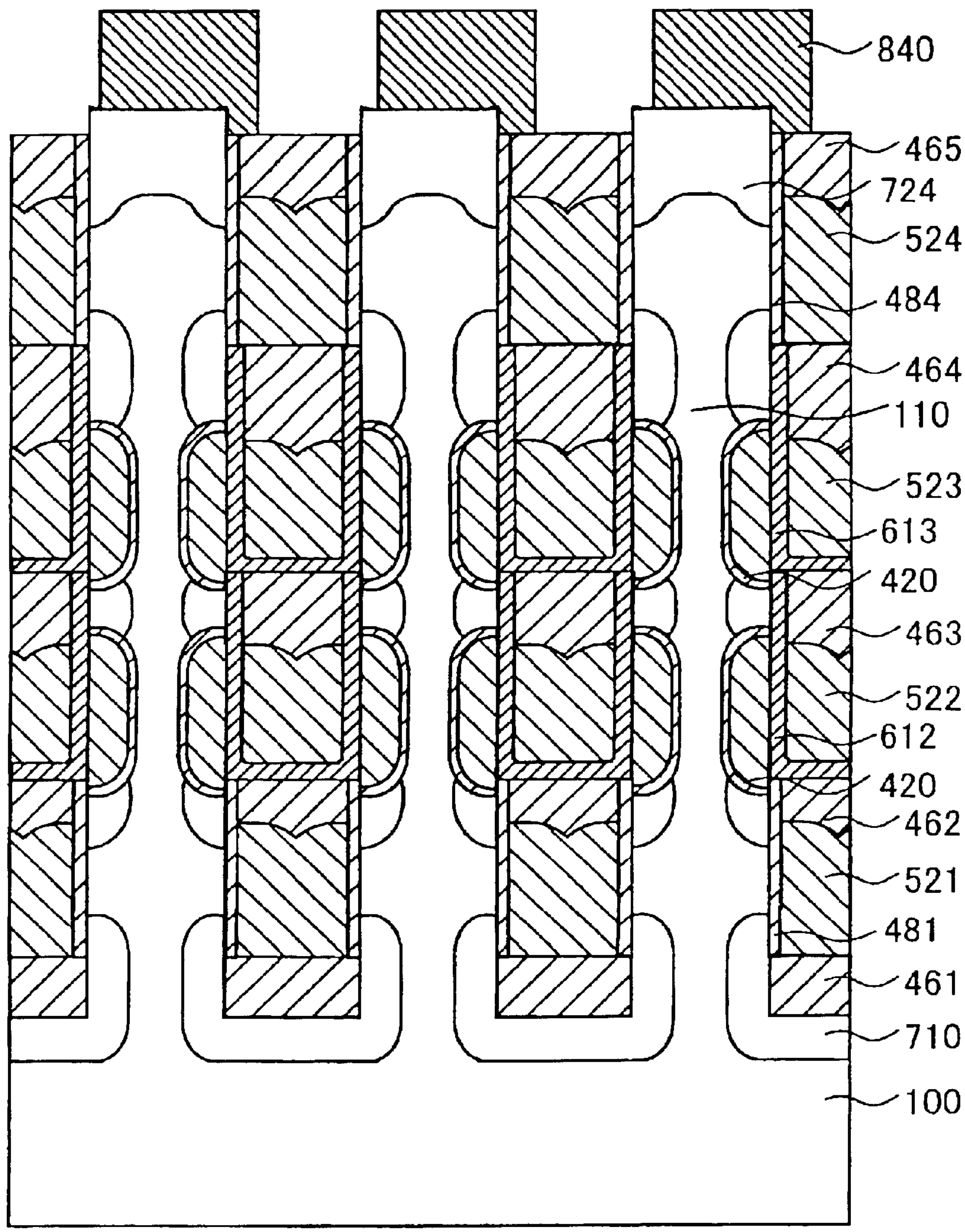
Figure 448:
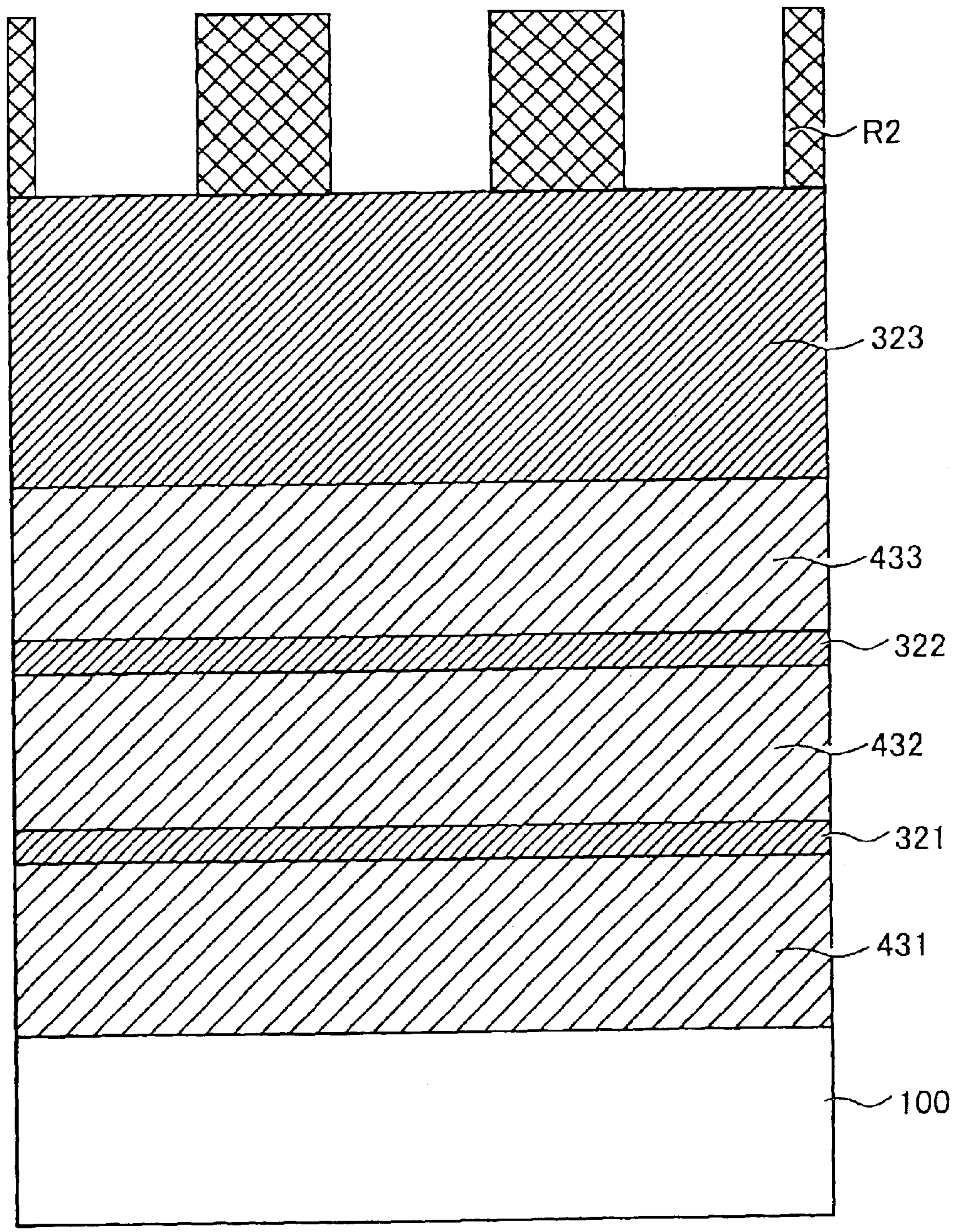
Figure 456:
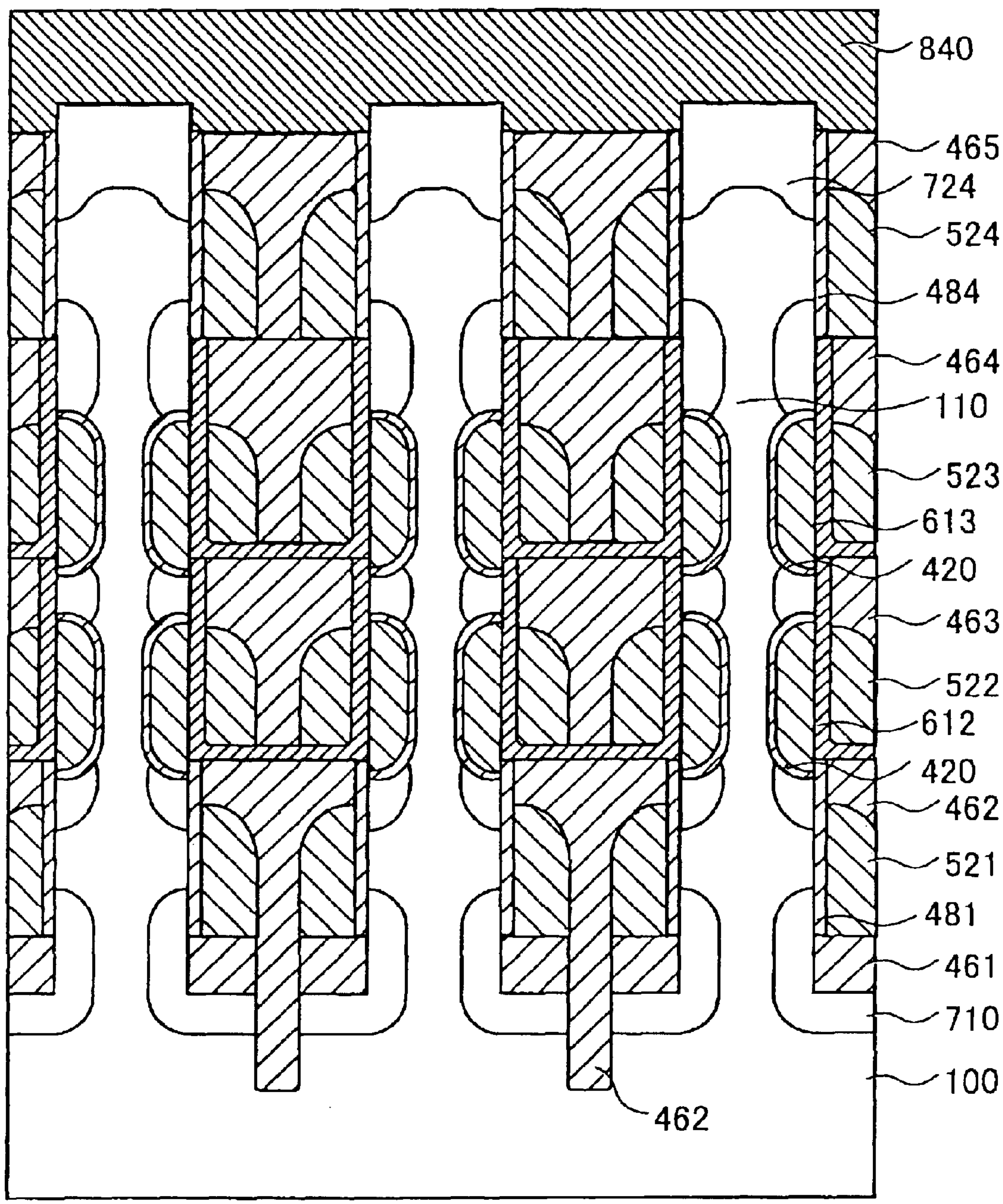

Production steps thereafter follow Production Example 39. Thereby, a semiconductor memory is realized which has a memory function according to the state of a charge in the charge storage layer which is the floating gate made of the polysilicon film as the first conductive film (FIG. 447 and FIG. 456).

Thus, the same effect as obtained by Production Example 39 is obtained. Further, since the region for forming at least one recess on the sidewall of the pillar-form island-like semiconductor layer is determined precisely by the layered film made of plural films, variations in device performance can be reduced.

PRODUCTION EXAMPLE 52

In a semiconductor memory to be produced in this example, a semiconductor substrate is patterned in the form of pillars to form island-like semiconductor layers having at least one recess. Sides of the island-like semiconductor layers make active regions. Tunnel oxide films and floating gates as charge storage layers are formed in the recesses. Selection gate transistors including gate oxide films and selection gates are arranged at the top and the bottom of the island-like semiconductor layers. A plurality of memory transistors, for example, two memory transistors, are placed between the selection gate transistors and are connected in series along the island-like semiconductor layer. The thickness of gate insulating films of the selection gate transistors is larger than the thickness of gate insulating films of the memory transistors. The tunnel oxide films and the floating gates of the memory transistors are formed at the same time. Transmission gates are disposed between the transistors for transmitting potentials to the active regions of the memory cell transistors.

FIG. 457 and FIG. 458, FIG. 459 and FIG. 460 are sectional views taken on line A–A' and line B–B', respectively, in FIG. 1 which is a cross-sectional view illustrating a memory cell array of an EEPROM.

Figure 457:
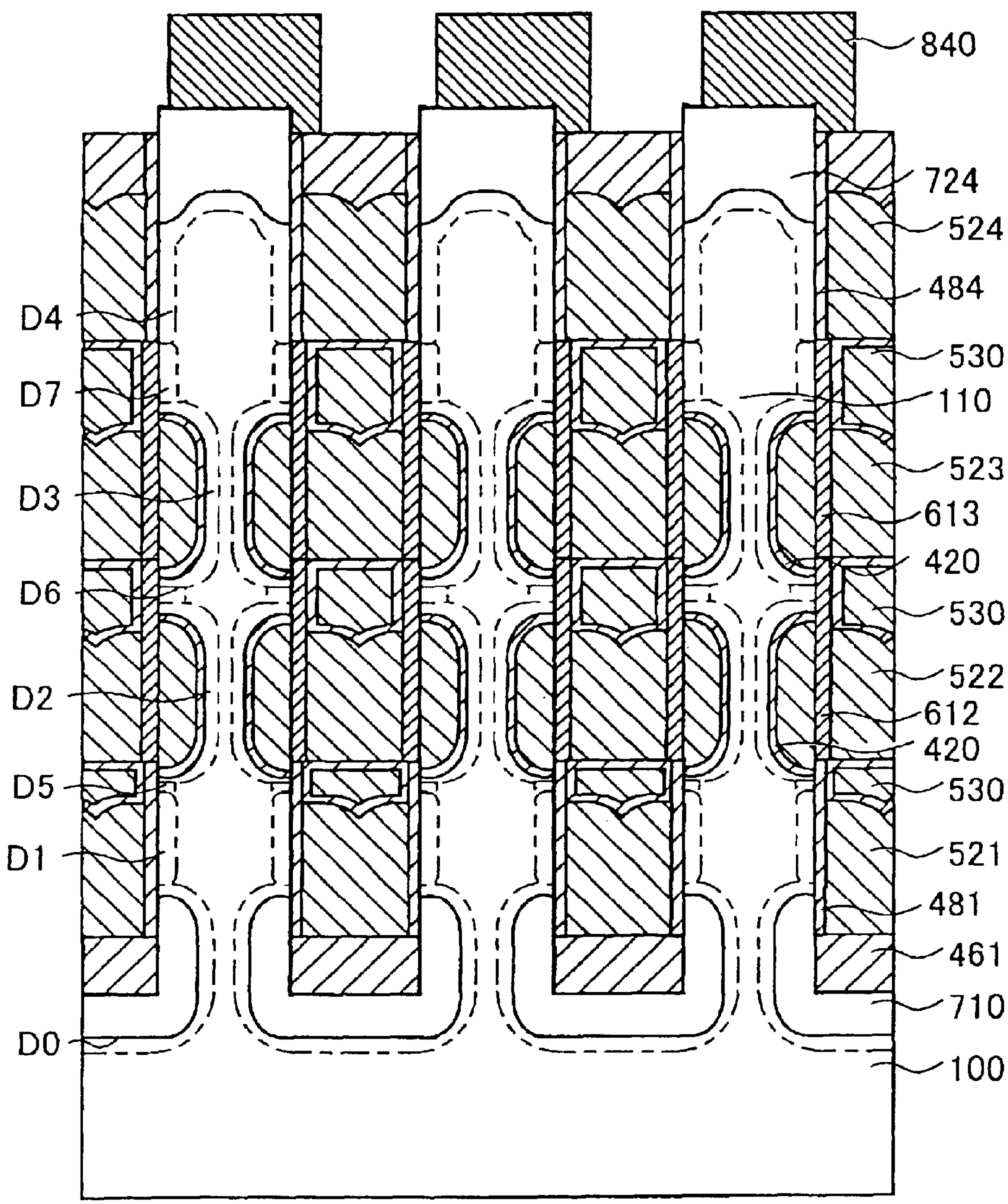
Figure 458:
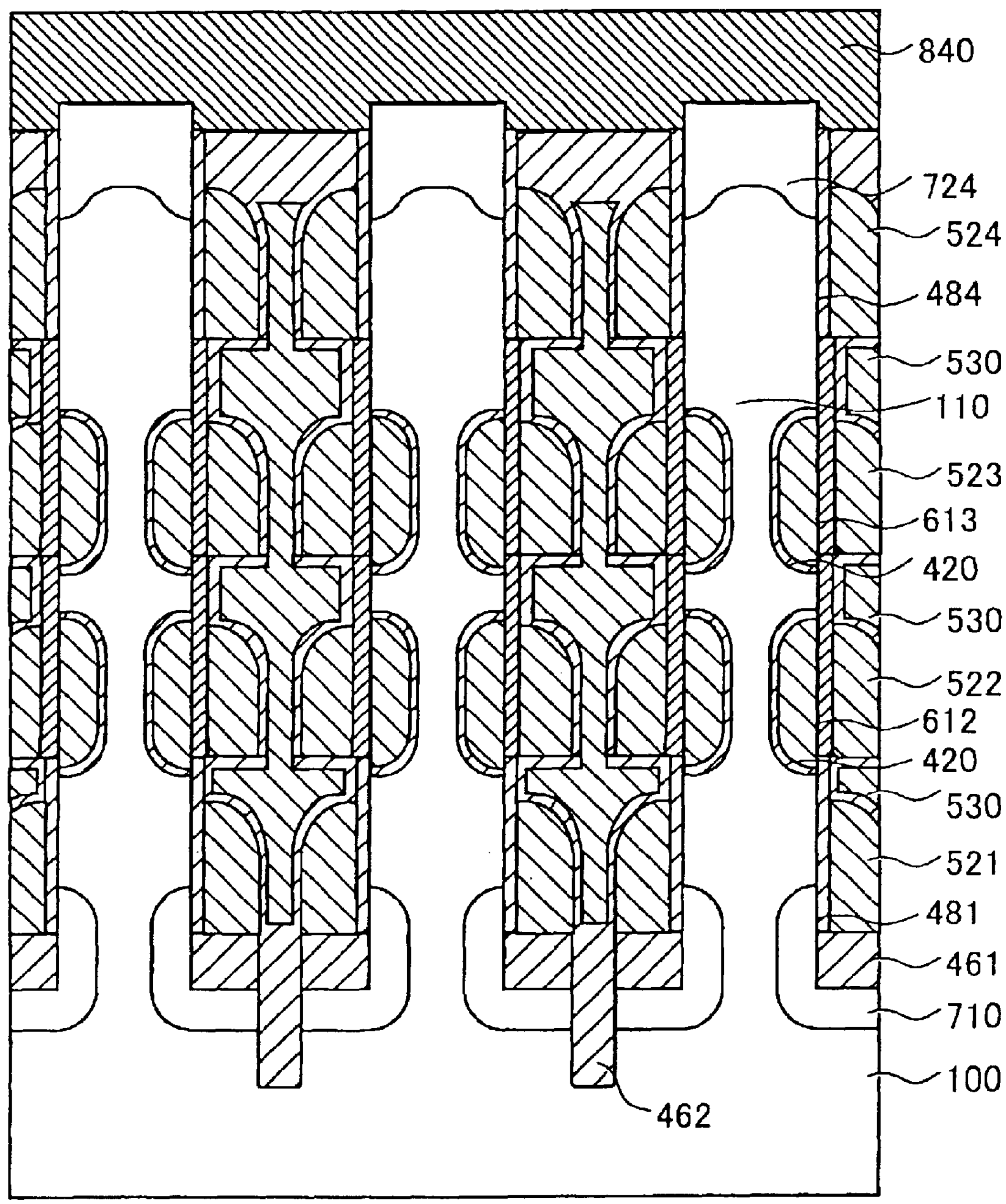

In this production example, a semiconductor memory is realized in the same manner as in Production example 39 except that the impurity diffusion layers 721 to 723 are not introduced and the step of forming a polysilicon film 530 as a third conductive film to be a gate electrode is added after the formation of the polysilicon films 521, 522, 523 and 524 as second conductive films (FIG. 457 and FIG. 458).

At data reading, as shown in FIG. 457, depletion layers and inversion layers shown in D1 to D7 are electrically connected with the gate electrodes 521, 522, 523, 524 and 530, thereby an electric current path is established between the impurity diffusion layers 710 and 725. In this situation, voltages to be applied to the gates 521, 522, 523, 524 and 530 are so set that whether the inversion layers are formed in D2 and D3 or not is selected depending on the condition of the charge storage layers 512 and 513, thereby the data can be read from the memory cell.

Figure 459:
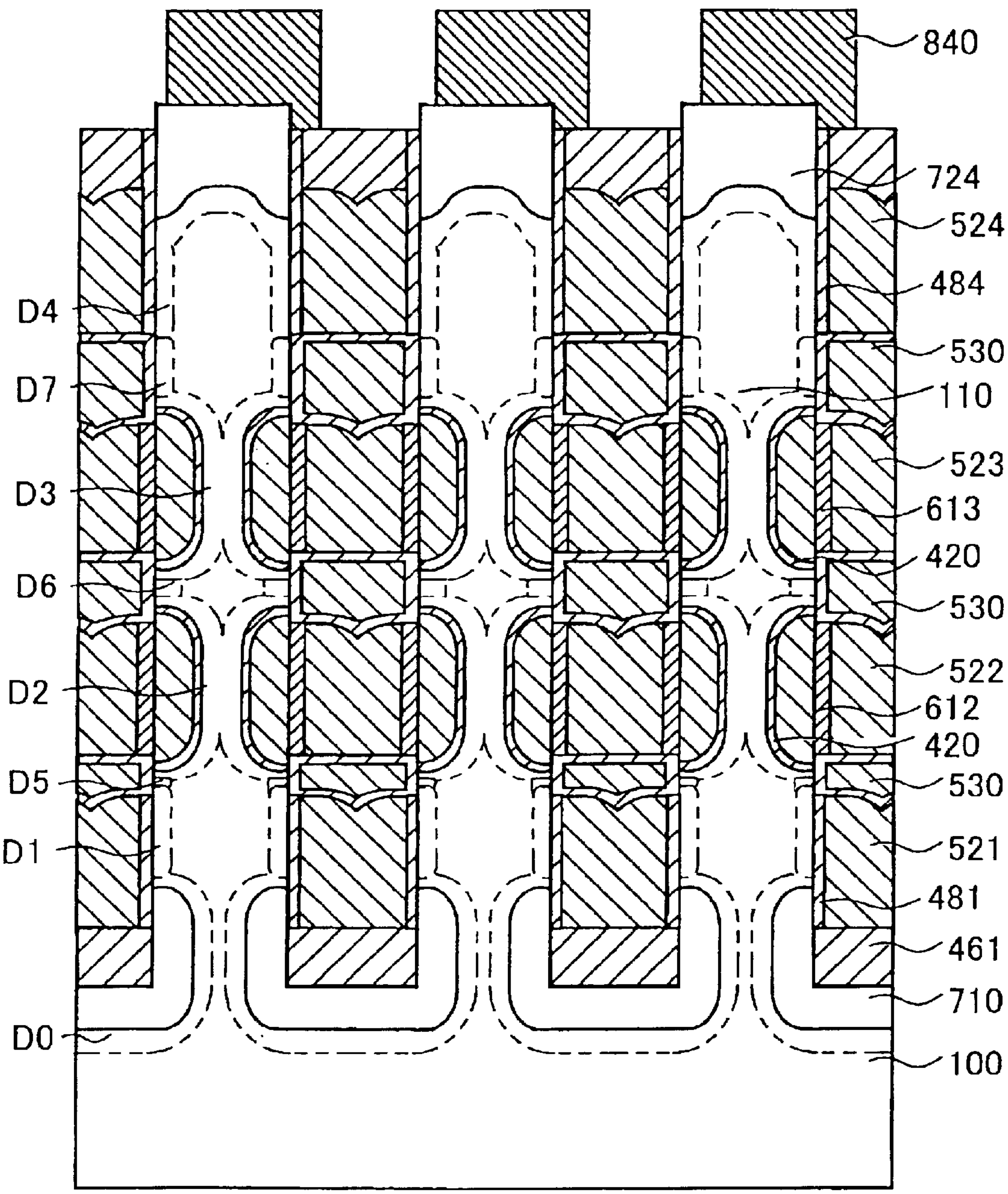

It is desired that the distribution of D2 and D3 is completely depleted as shown in FIG. 459. In this case, it is expected that the back-bias effect is suppressed in the memory cells, which is effective in reducing variations in device performance.

According to this example, the same effect as-obtained by Production example 39 is obtained. Since the production steps are reduced and the required height of the island-like semiconductor layer 110 is reduced, variations during the production process are suppressed.

The top and the bottom of the polysilicon film 530 may be positioned as shown in FIG. 458, in which at least the top is positioned higher than the bottom of the polysilicon film 524 and the bottom is positioned lower than the top of the polysilicon film 521.

PRODUCTION EXAMPLE 53

Explanation is given of an example of production process for producing a semiconductor memory in which the silicon oxide films 461 to 465 to be eighth insulating films are not buried completely.

FIGS. 460 and 461 and FIGS. 462 and 463 are sectional views taken on line A–A' and line B–B', respectively, in FIG. 1 which is a cross-sectional view illustrating a memory cell array of an EEPROM.

In the semiconductor memory of Production example 39, the second trench 220 is formed in the self-alignment manner by reactive ion etching using the polysilicon film 521 (the second conductive film) as a mask. However, the polysilicon film 522, 523 or 524 (the second conductive films) may be used as the mask. Alternatively, a resist patterned by a known photolithography technique may be used for the separation.

Figure 460:
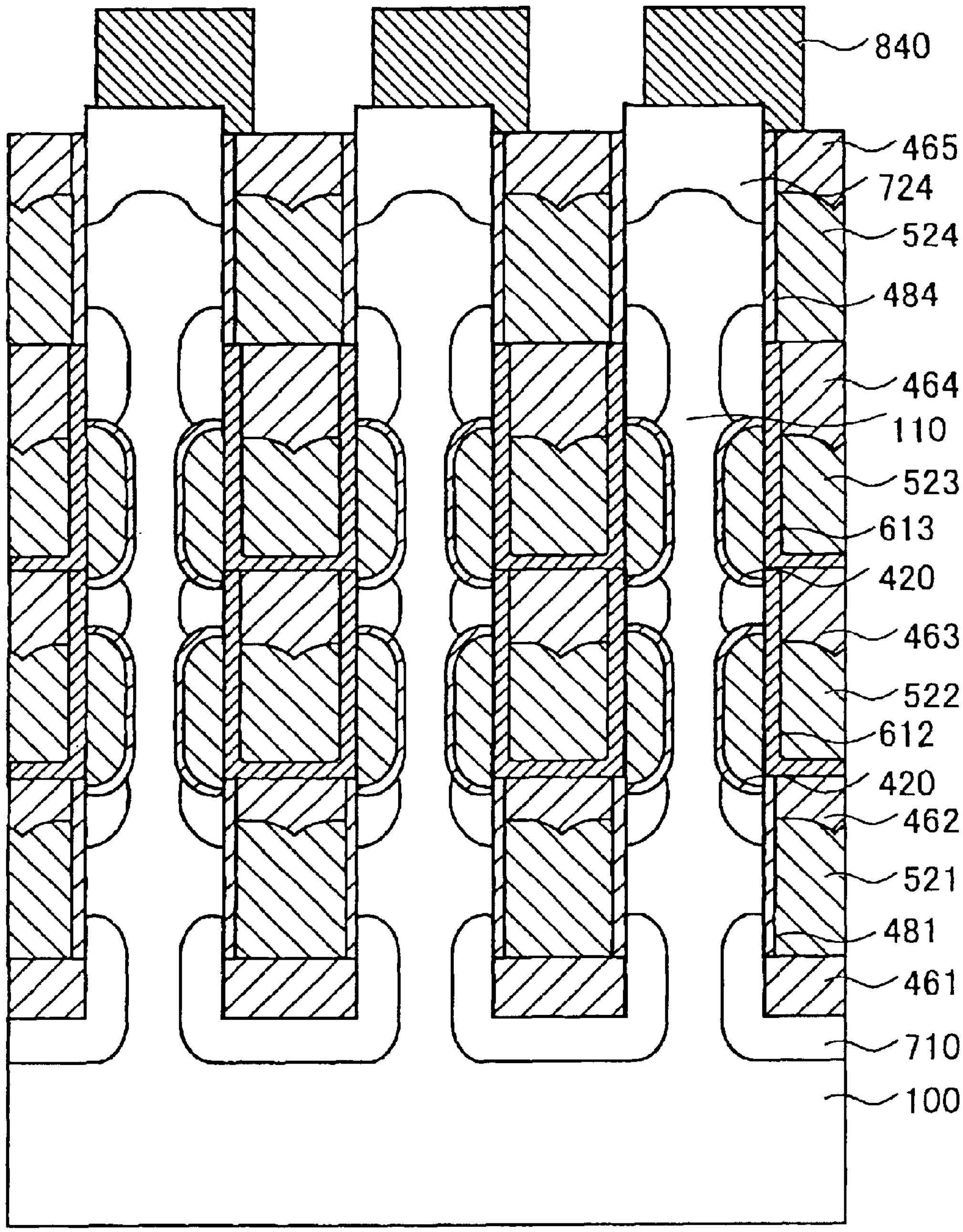
Figure 461:
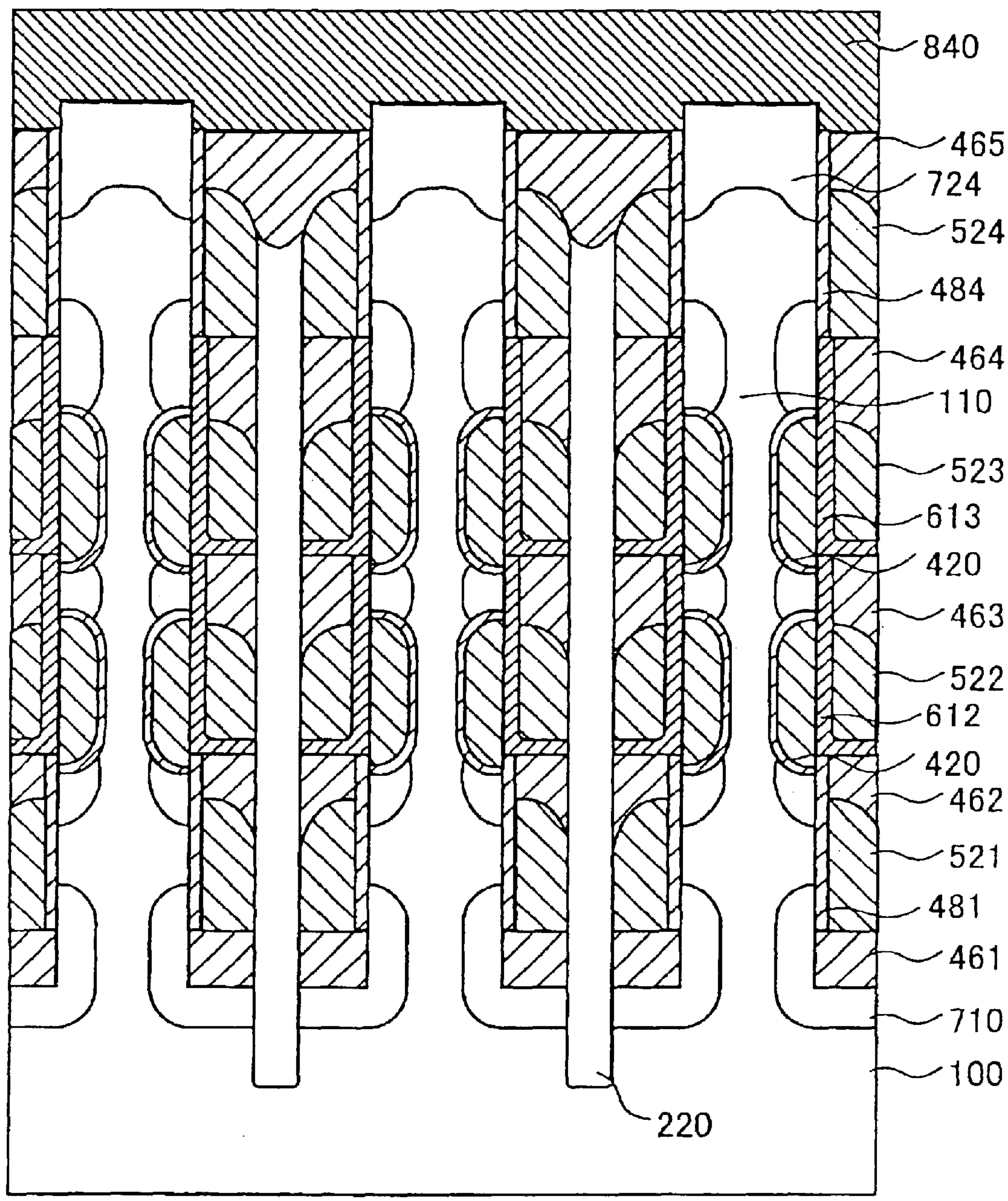

For example, in the case where the second trench 220 is formed in the self-alignment manner by using the polysilicon film 524 as a mask, the silicon oxide film 465 (the eighth insulating film) cannot be buried completely in the thus formed second trench 220 and a hollow is made in the trench as shown in FIG. 460 and FIG. 461. However, this is permissible as long as the hollow serves as an air gap and establishes the insulation between the control gate lines and the selection gate lines.

Figure 462:
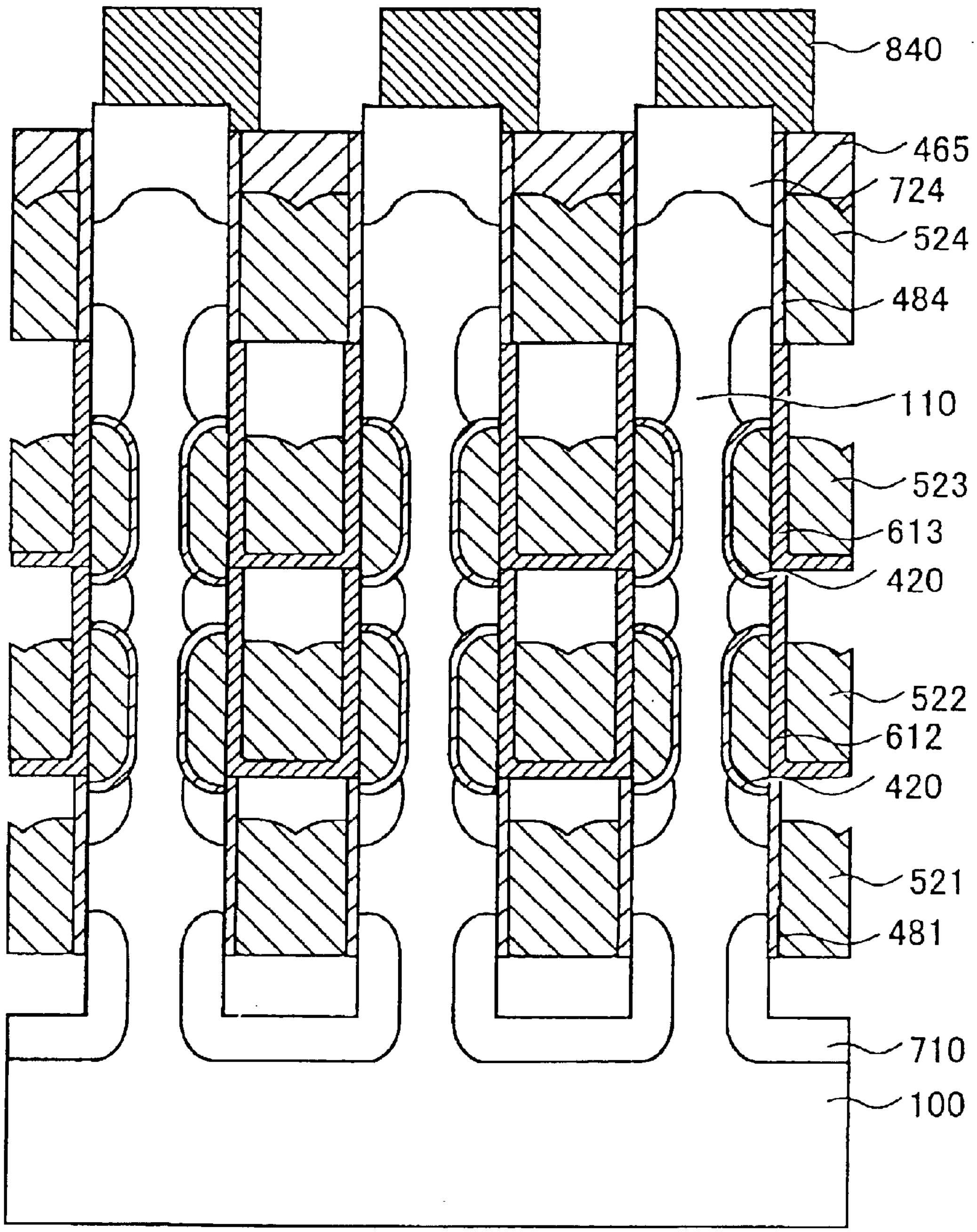
Figure 463:
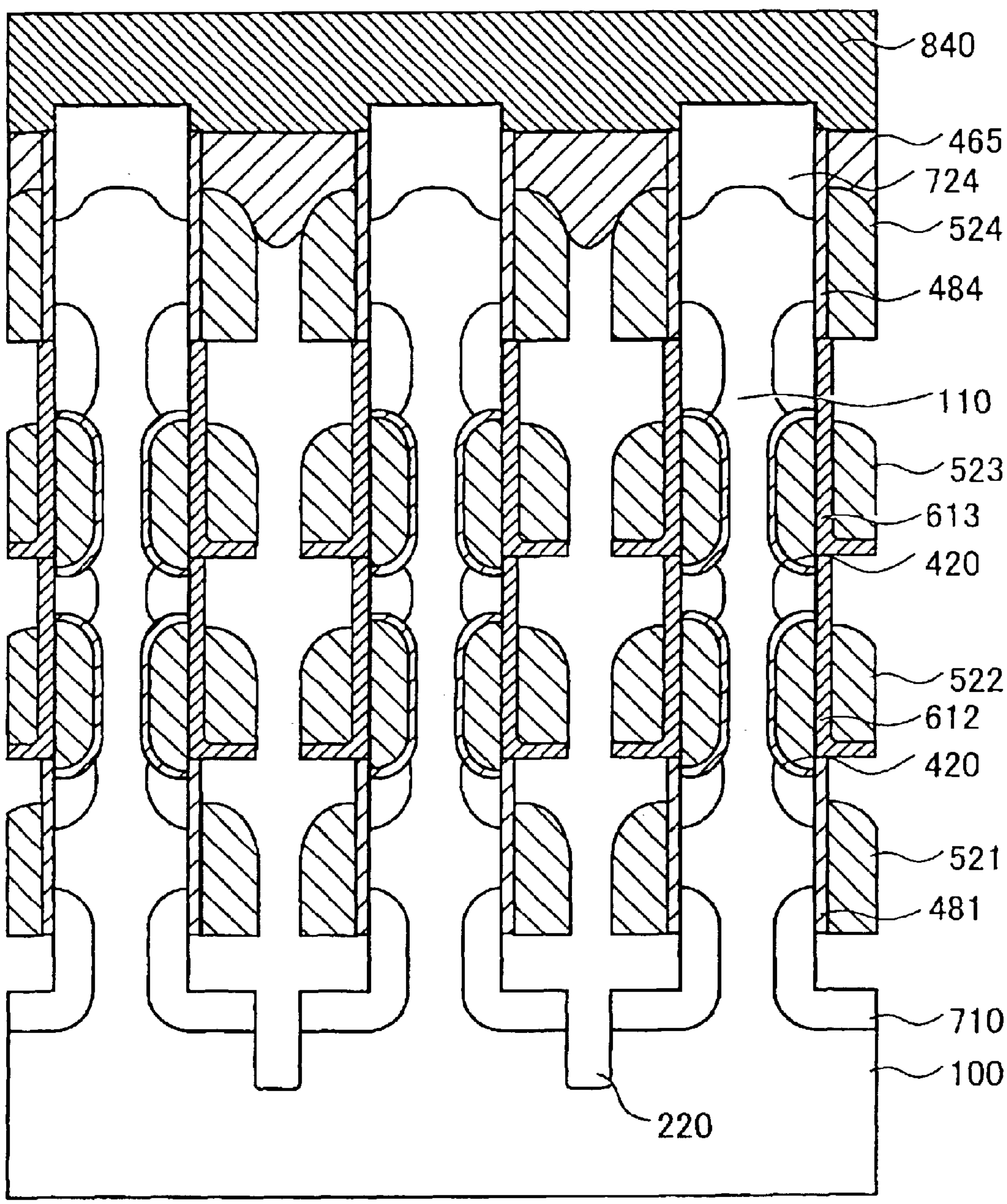

Further, as shown in FIG. 462 and 463, the silicon oxide film may selectively be removed before the silicon oxide film 465 is buried in the second trench 220.

As described above, the presence of the hollow realizes a low dielectric constant. Accordingly, the obtained semiconductor memory is expected to show suppressed parasitic capacitance and high speed characteristics.

PRODUCTION EXAMPLE 54

Explanation is given of an example of production process for producing a semiconductor memory in which the floating gate and the island-like semiconductor layer 110 have different outer circumferences.

FIGS. 464 and 465 and FIGS. 466 and 467 are sectional views taken on line A–A' and line B–B', respectively, in FIG. 1 which is a cross-sectional view illustrating a memory cell array of an EEPROM.

Figure 464:
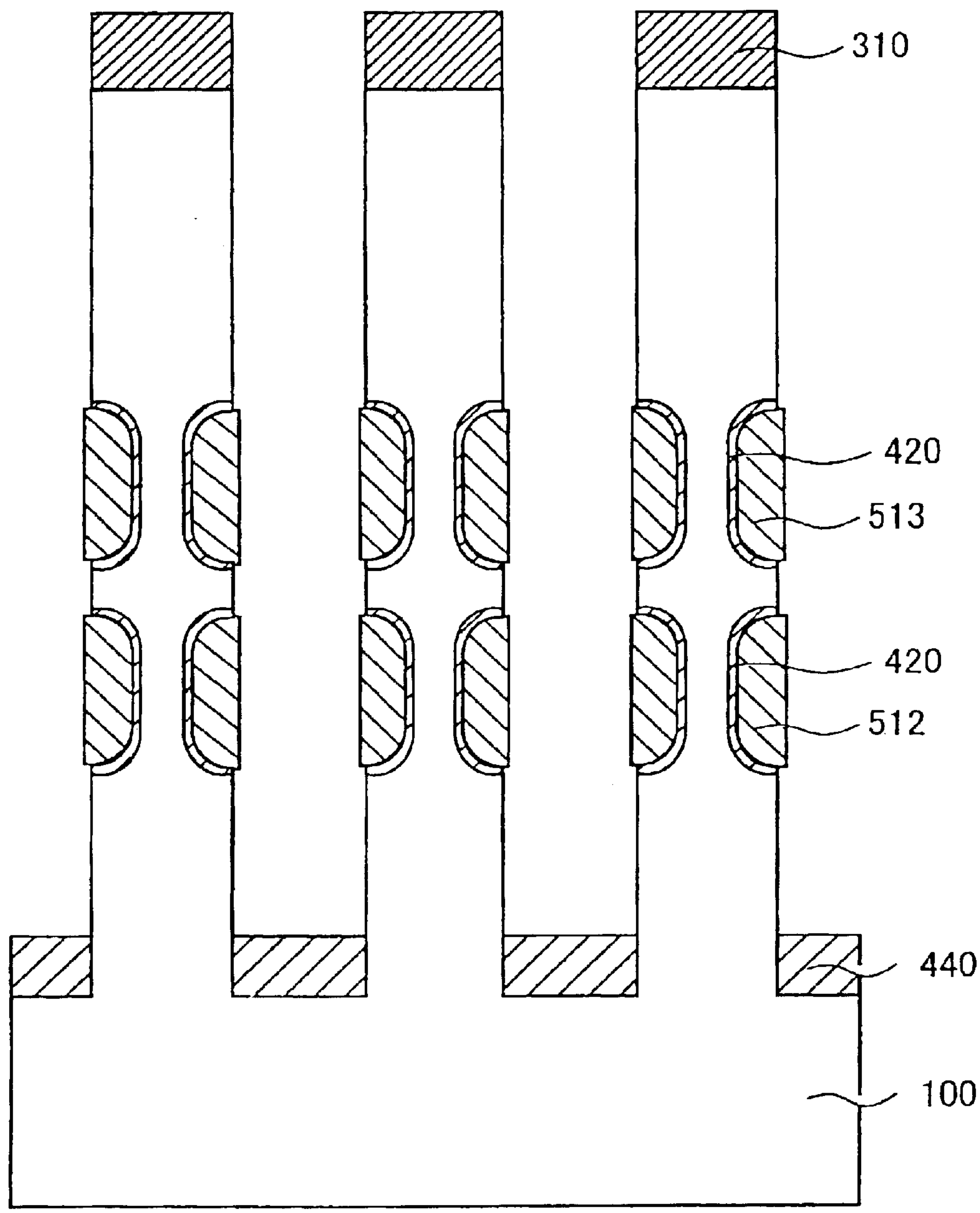
Figure 466:
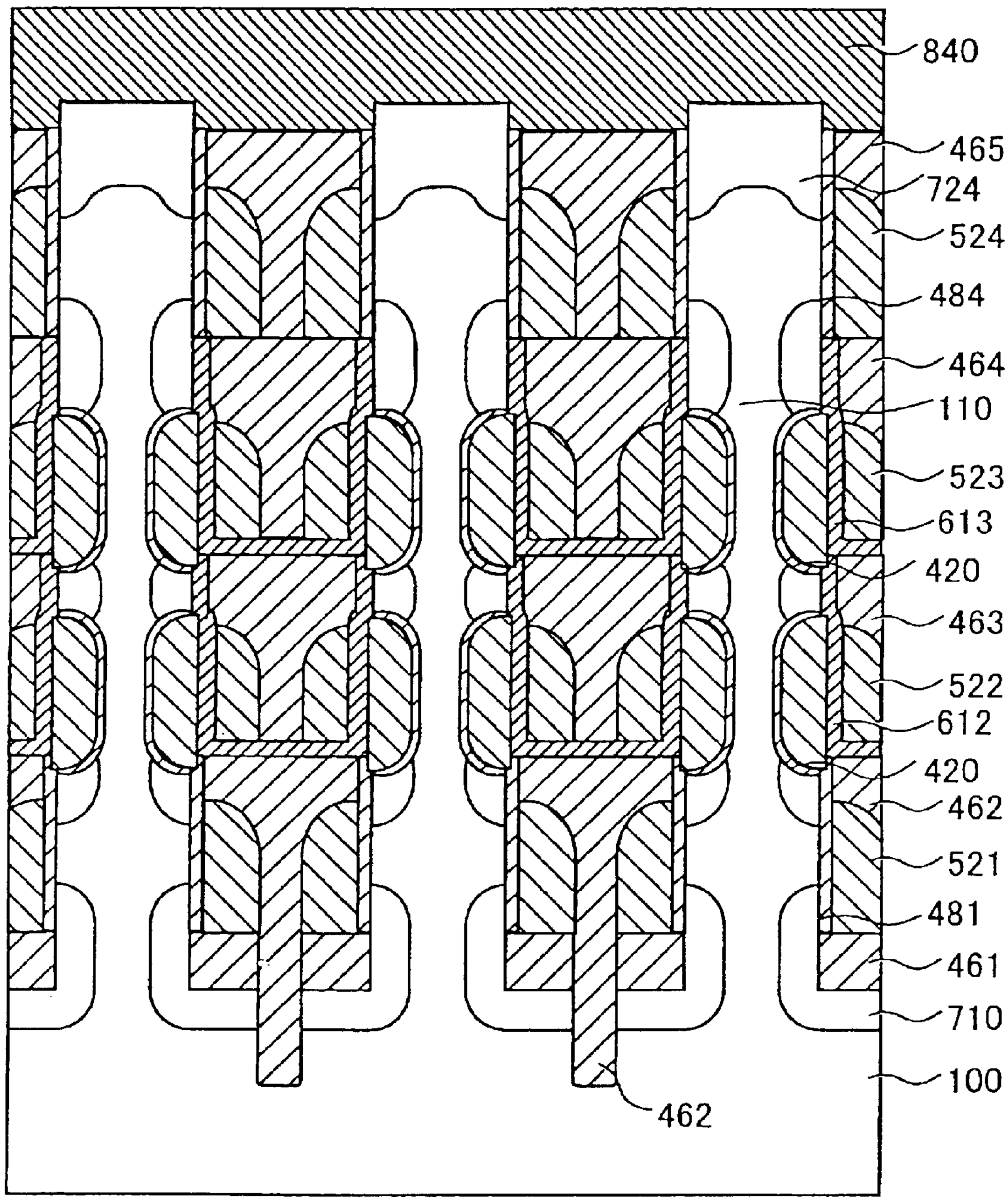

In the semiconductor memory, after the polysilicon films 512 and 513 to be the first conductive films are buried in the recesses formed on the sidewall of the island-like semiconductor layer 110, a silicon oxide film 440 is buried as explained in Production example 39. At this time, a portion of the silicon oxide film 420 which is not buried in the recesses is removed. Therefore, as shown in FIG. 464 and FIG. 466, the outer circumferences of the polysilicon films 512 and 513 become larger than the outer circumference of the island-like semiconductor layer 110 by the thickness of the silicon oxide film 420.

However, the outer circumference of the floating gate may be larger or smaller than that of the island-like semiconductor layer 110. A relationship between the outer circumferences is not important.

Figure 465:
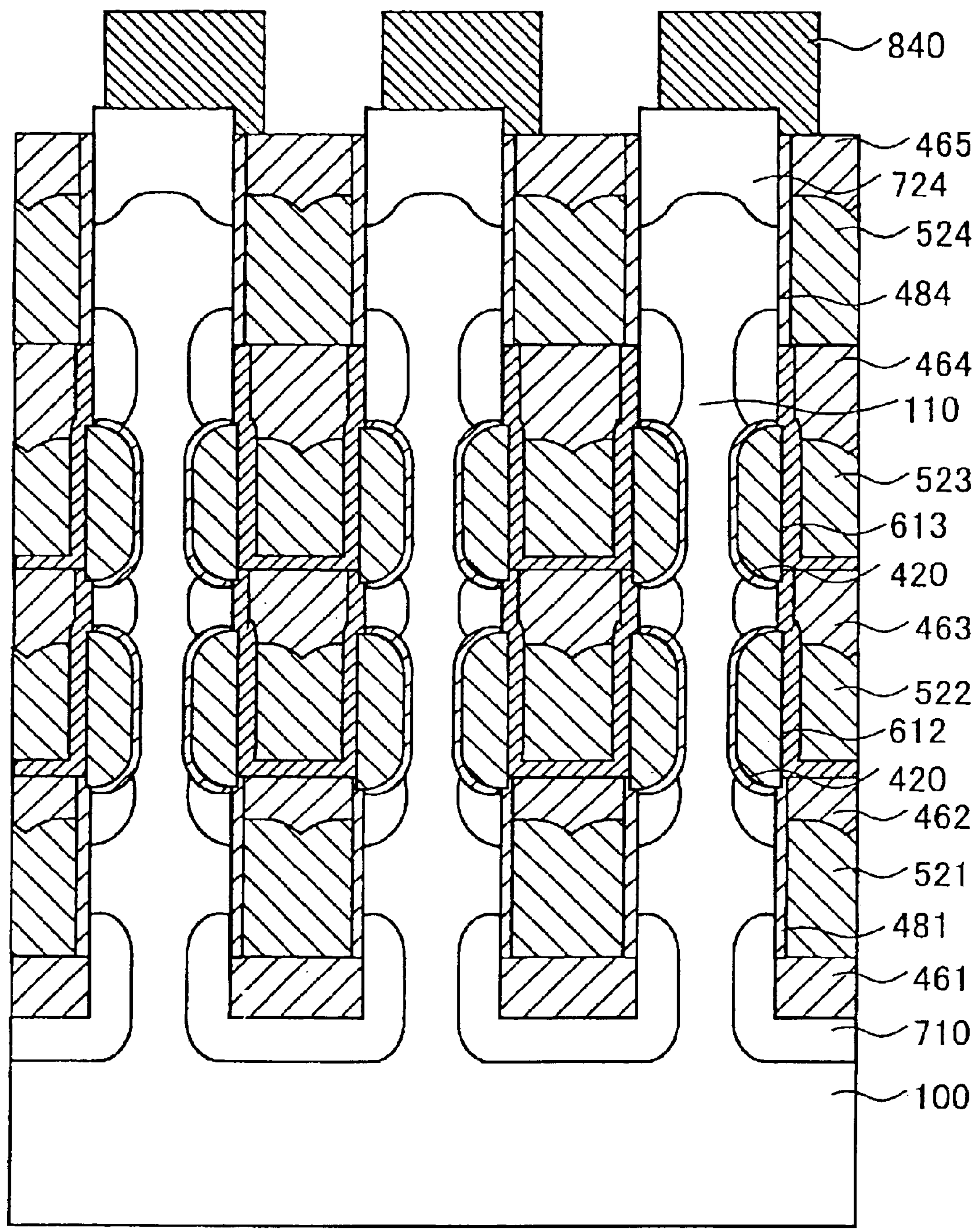
Figure 467:
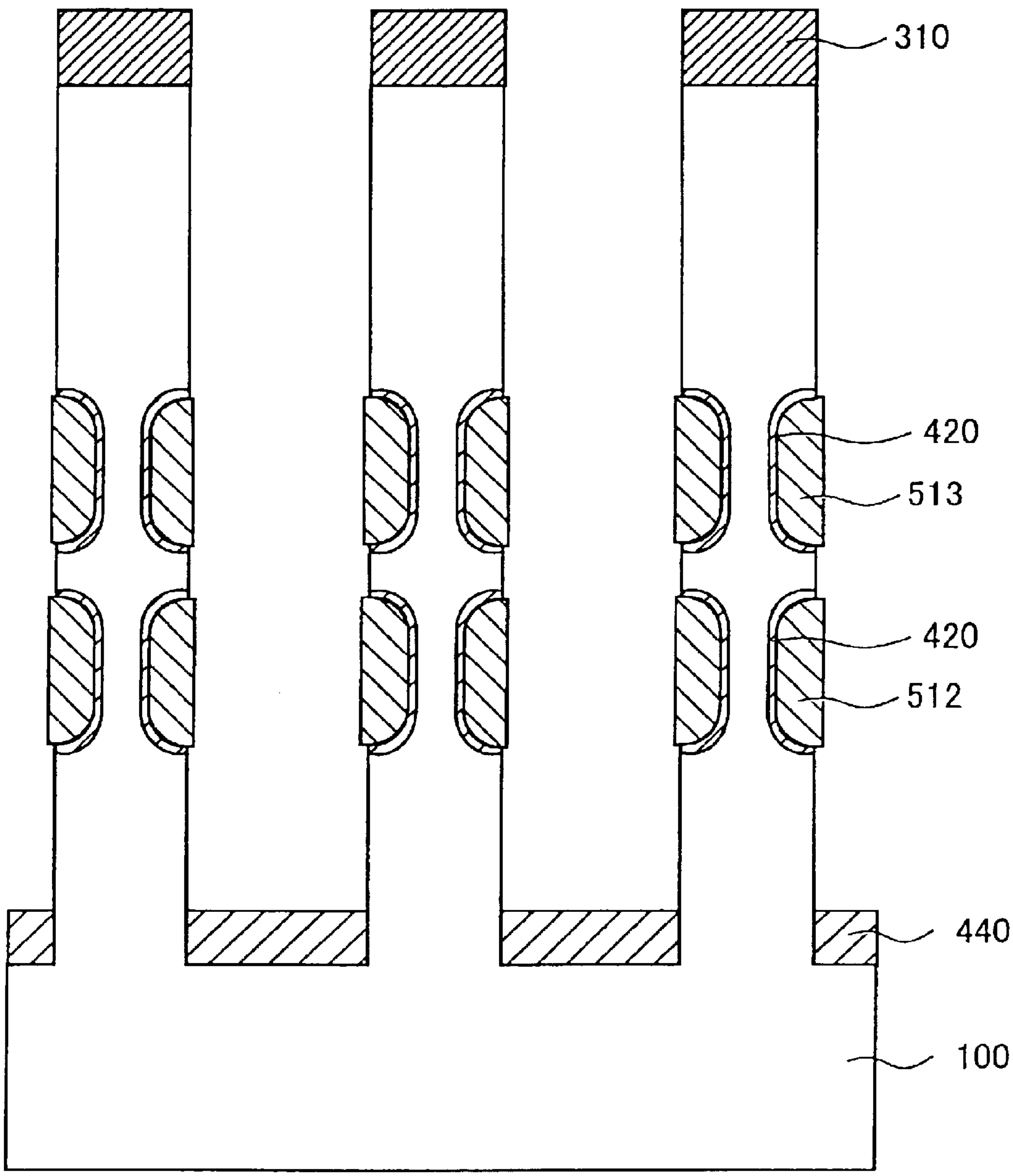
Figure 468:
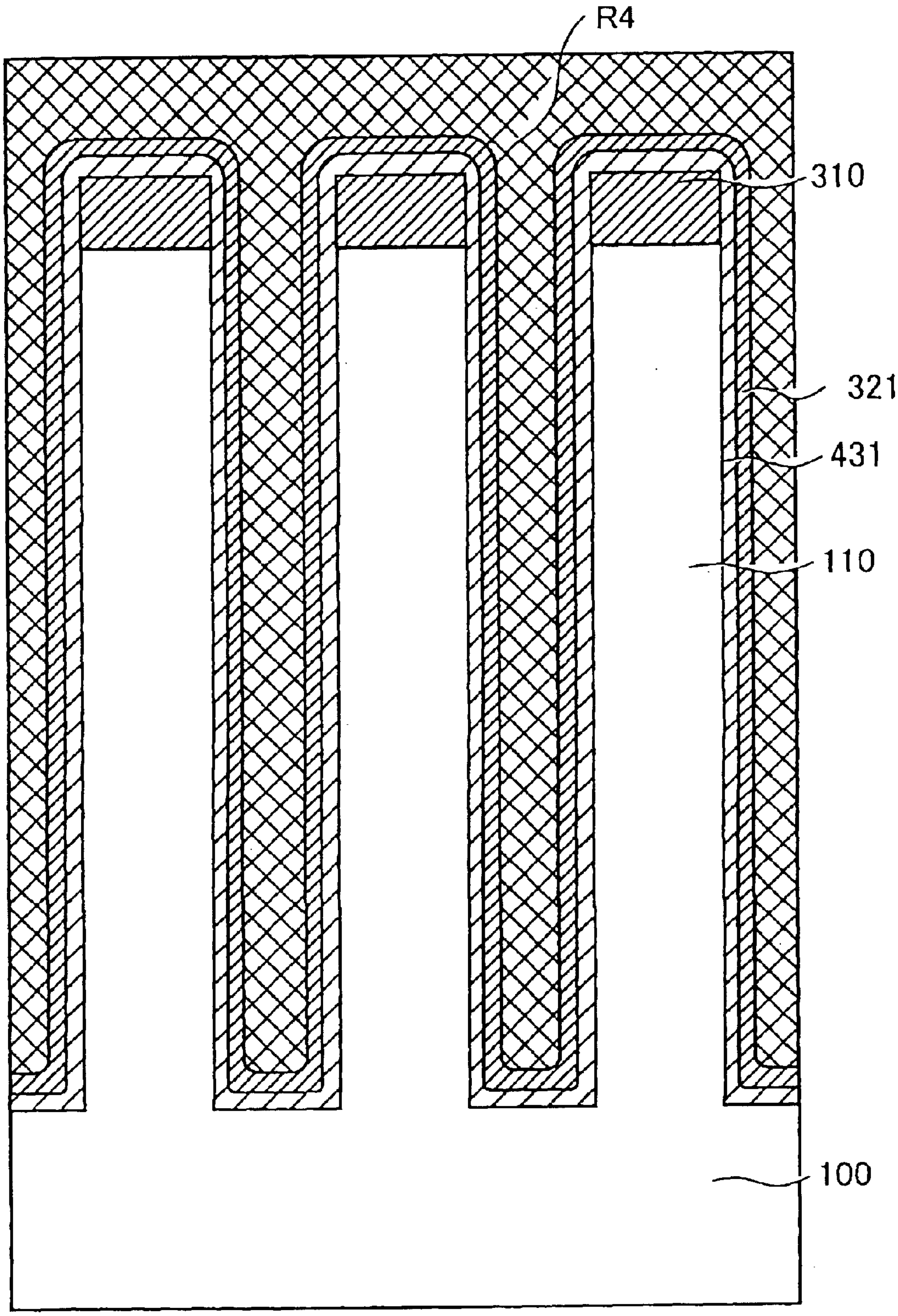

FIG. 465 and FIG. 467 show a completed semiconductor memory in which the outer circumference of the floating gate is larger than that of the island-like semiconductor layer 110.

PRODUCTION EXAMPLE 55

Explanation is given of an example of production process for producing a semiconductor memory in which a resist is used instead of the silicon oxide films 441 and 442.

FIGS. 468 to 472 and FIGS. 473 to 477 are sectional views taken on line A–A' and line B–B', respectively, in FIG. 1 which is a cross-sectional view illustrating a memory cell array of an EEPROM.

Figure 469:
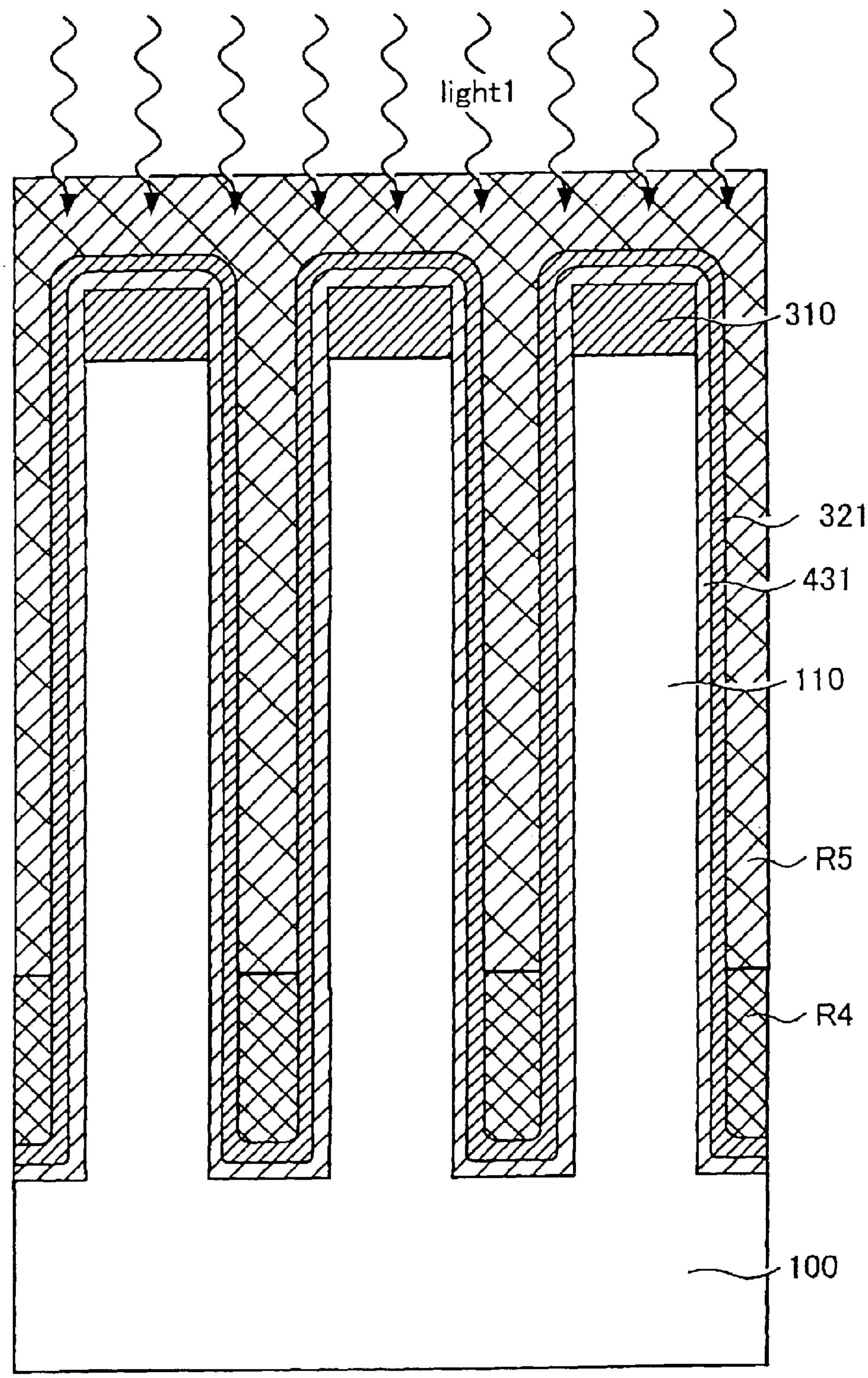
Figure 474:
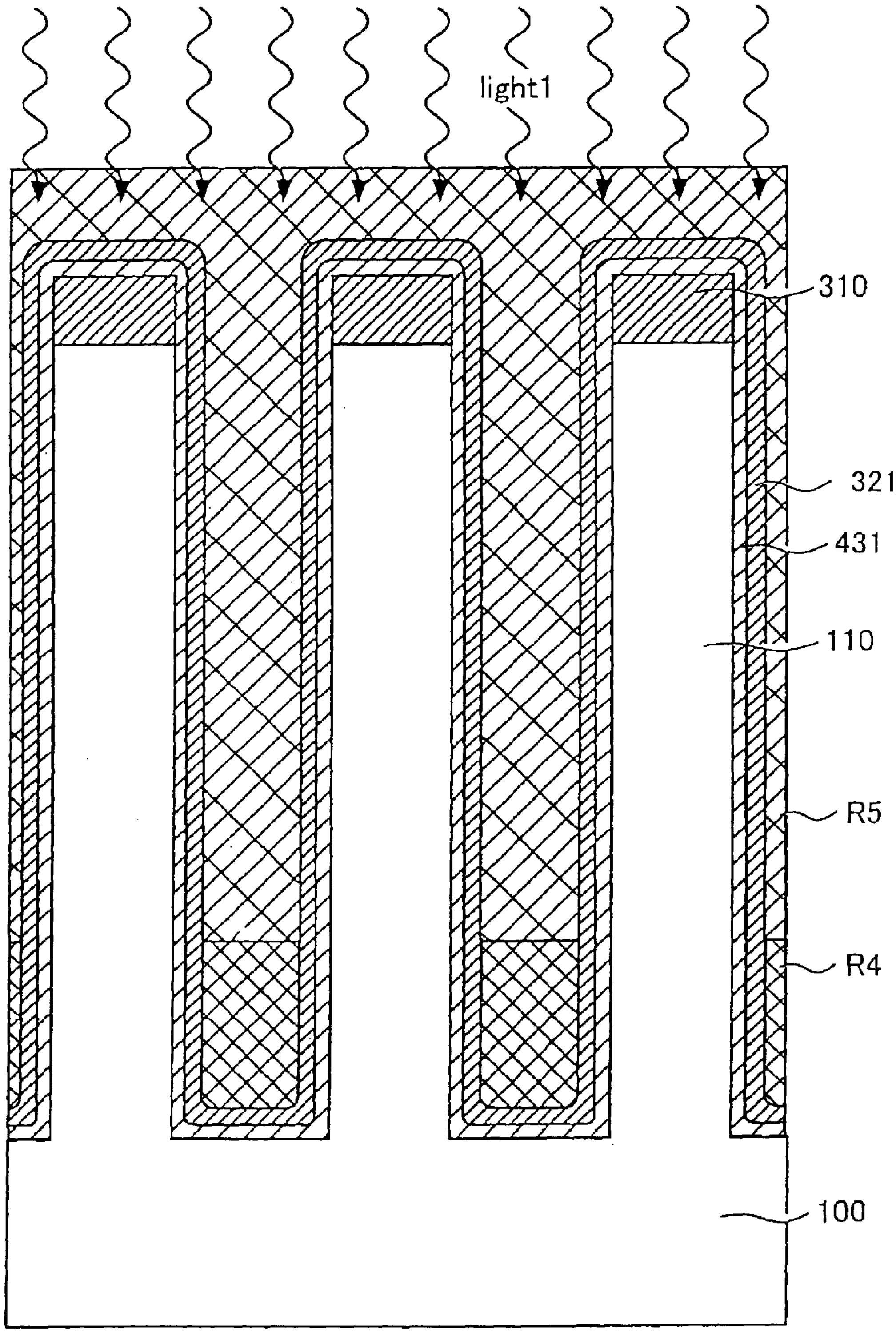

According to Production example 39, the silicon oxide film 321 is deposited as a fifth insulating film and the silicon oxide film 441 is deposited as a fourth insulating film. Further, a resist R4 is applied to a thickness of about 500 to 25,000 nm (FIG. 468 and FIG. 473) and irradiated with light 1 to be exposed to a desired depth (FIG. 469 and FIG. 474). The light exposure to the desired depth may be controlled by exposure time, an amount of light, or both of them. Means of controlling the light exposure including the following development step is not limited.

Figure 470:
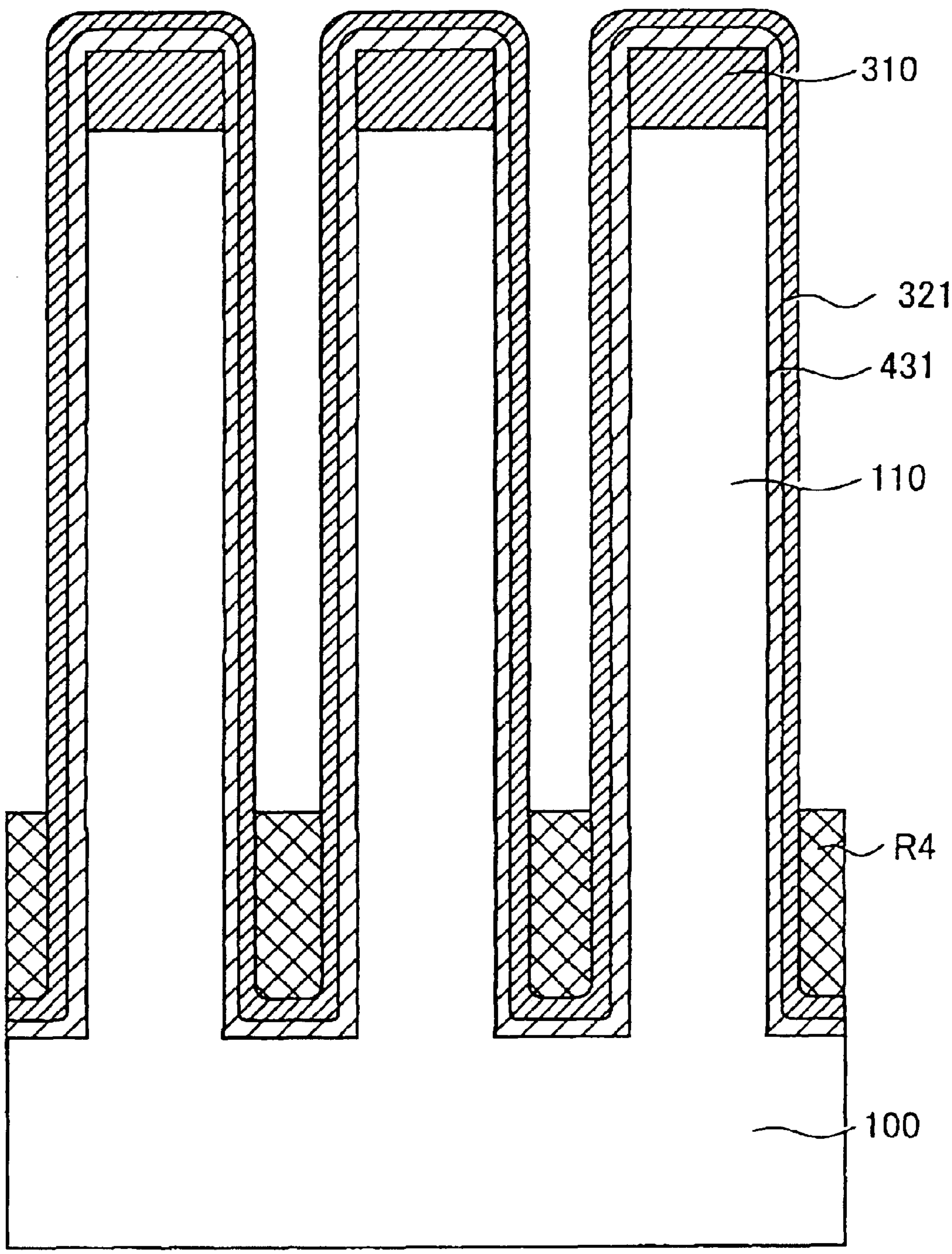
Figure 475:
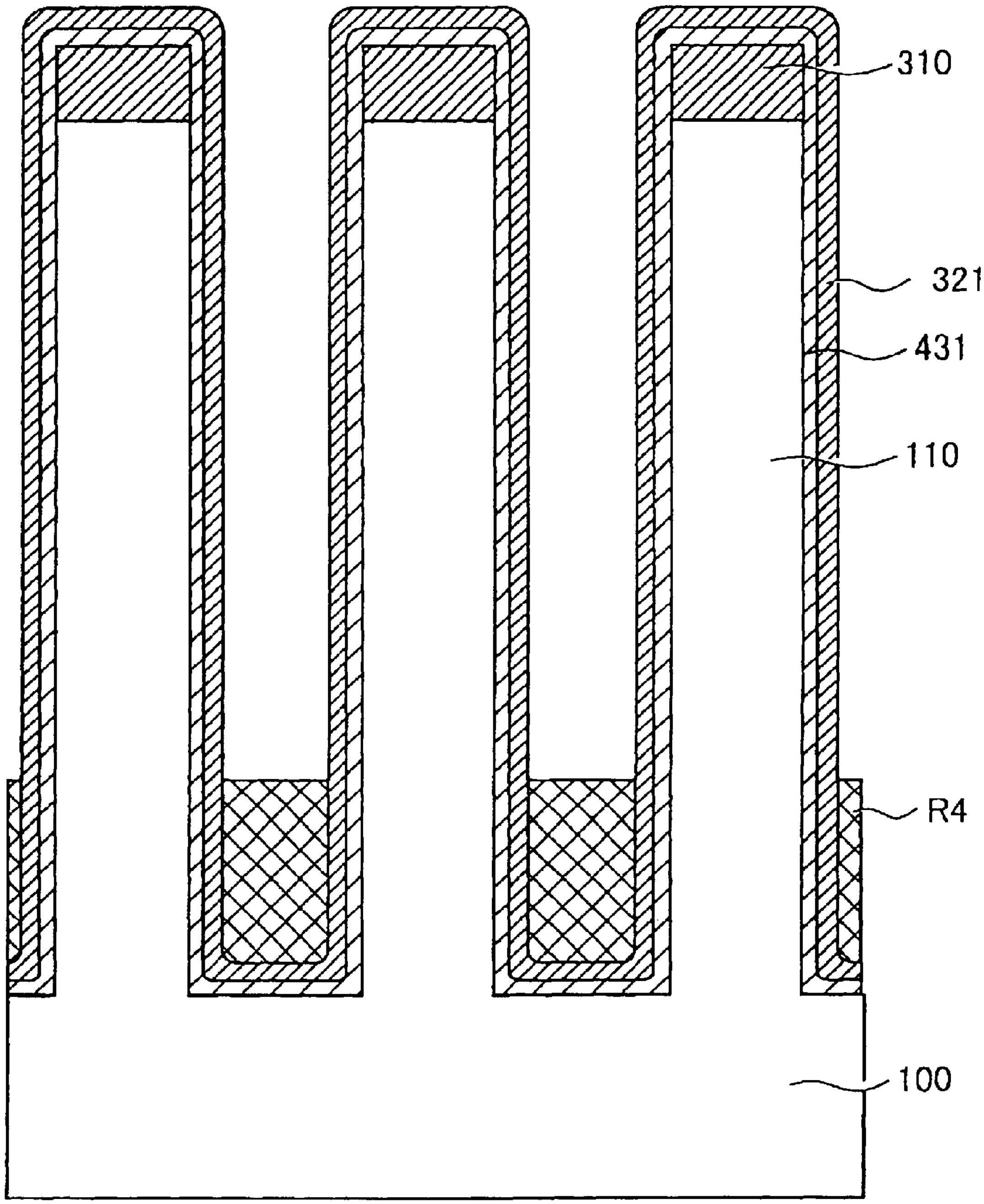

Subsequently, development is carried out by a known technique, and a resist R5, which is an exposed portion of the resist R4, is selectively removed and the resist R4 is buried (FIG. 470 and FIG. 475).

According to the thus performed light exposure, the resist can be etched back with good controllability and variations in device performance are expected to be suppressed. However, the resist R4 may be etched back by ashing, instead of the light exposure. Alternatively, the resist may be applied such that it is buried to a desired depth at the application thereof, without performing the etch back. At this time, it is desirable to use a low-viscosity resist. These techniques may be combined in various ways.

It is desired that the surface on which the resist R4 is applied is hydrophilic, for example, the resist R4 is desirably applied on the silicon oxide film.

Figure 471:
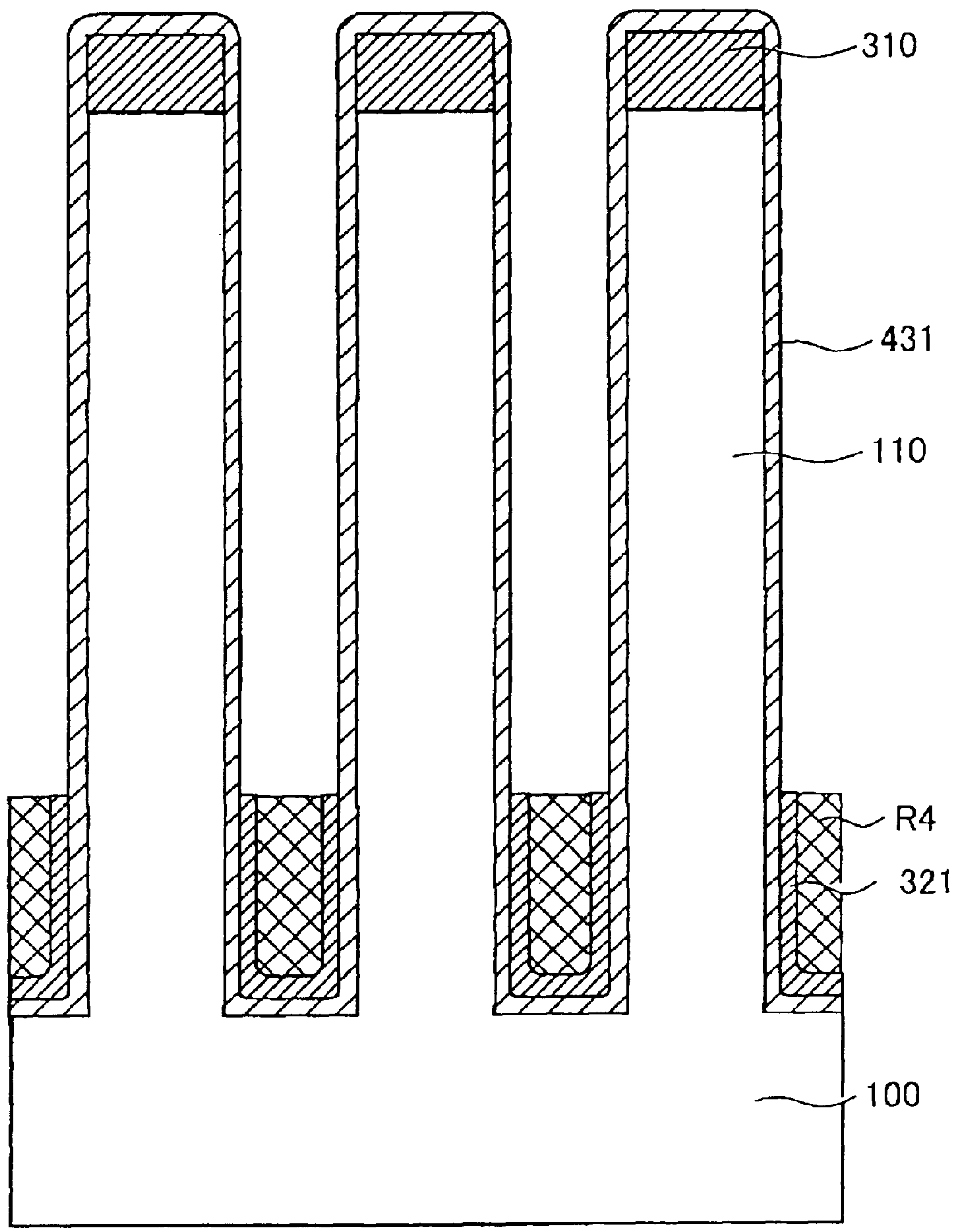
Figure 476:
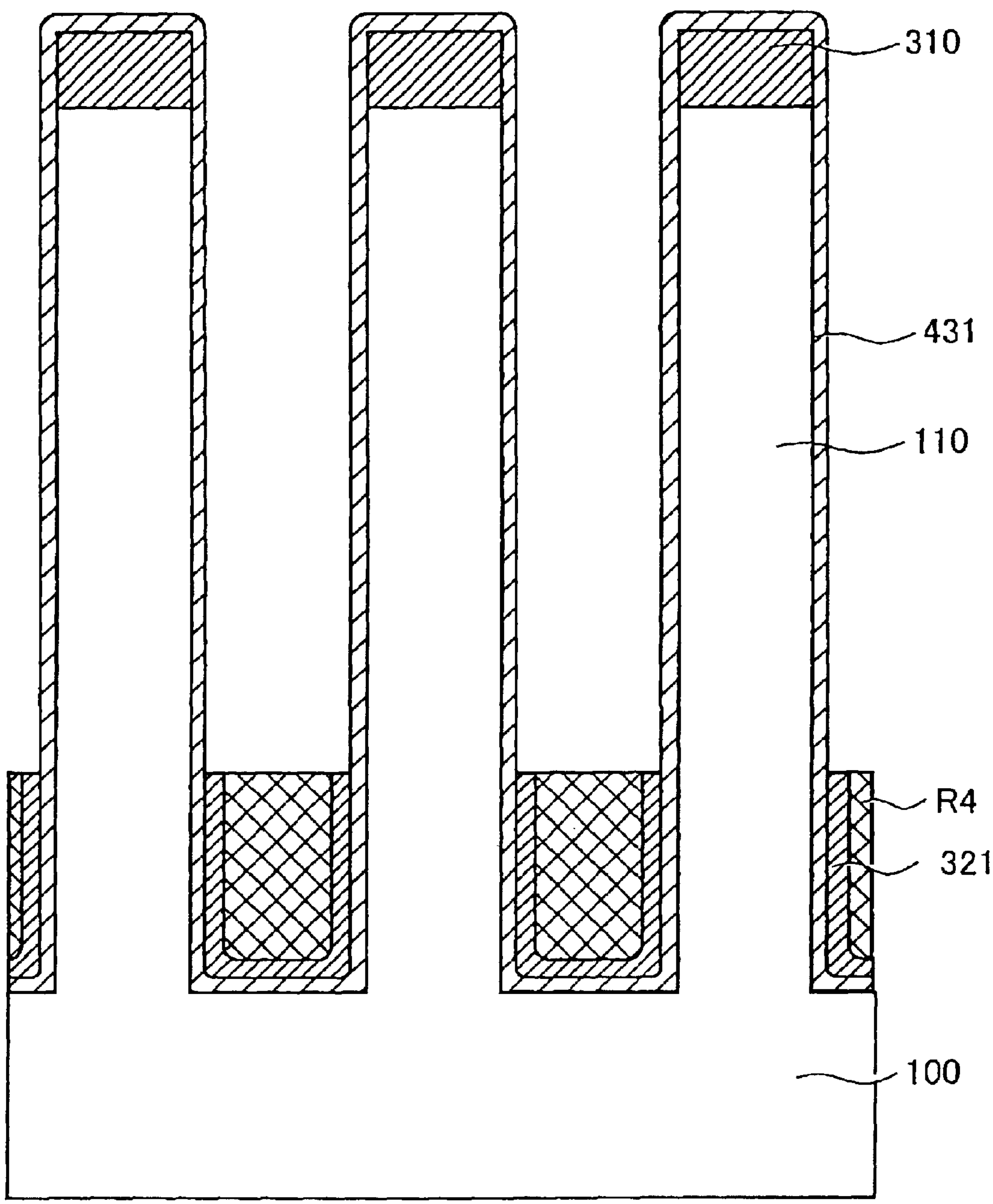

Thereafter, using the resist R4 as a mask, an exposed portion of the silicon nitride film 321 is removed by isotropic etching, for example (FIG. 471 and FIG. 476).

Figure 472:
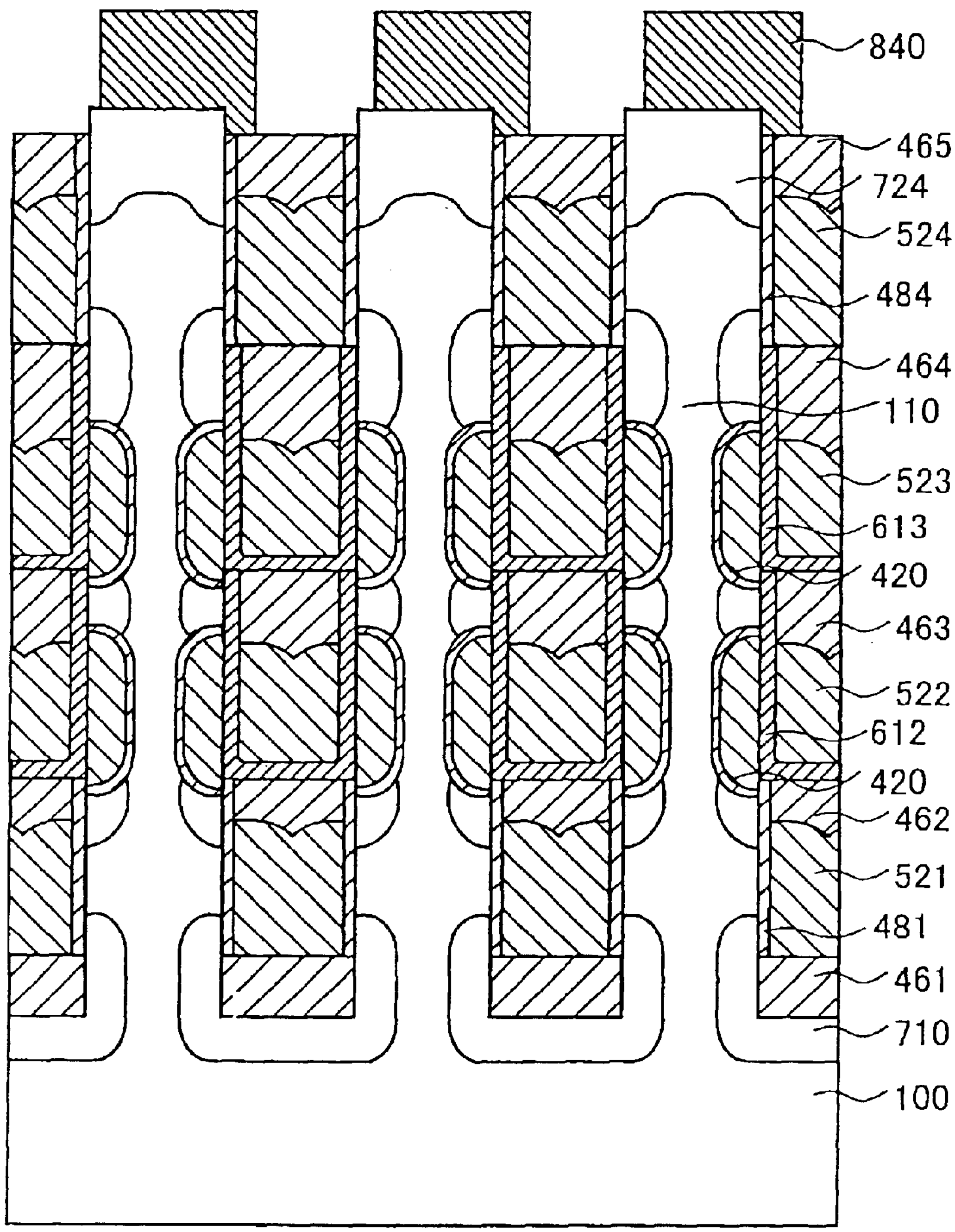
Figure 473:
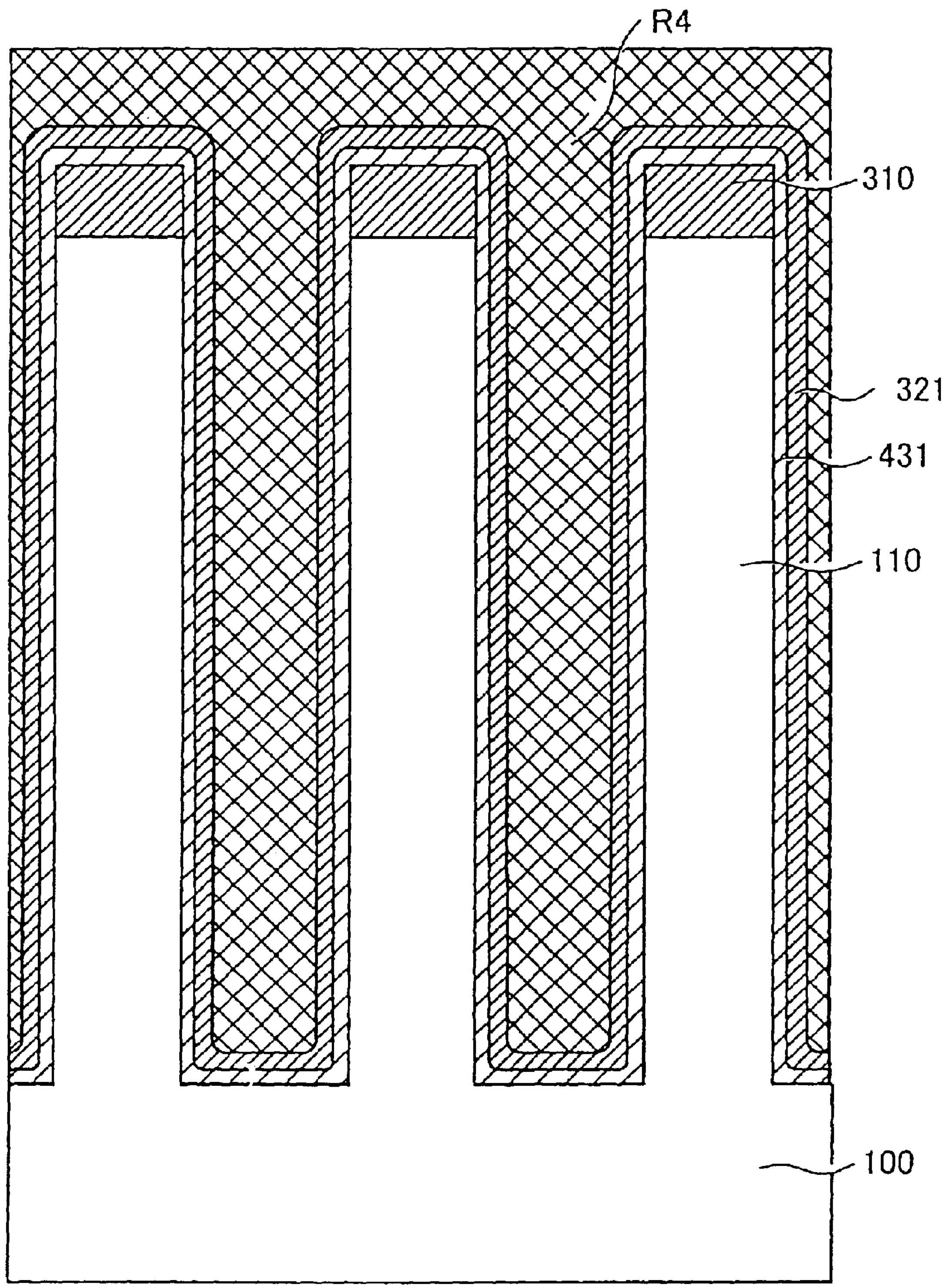
Figure 477:
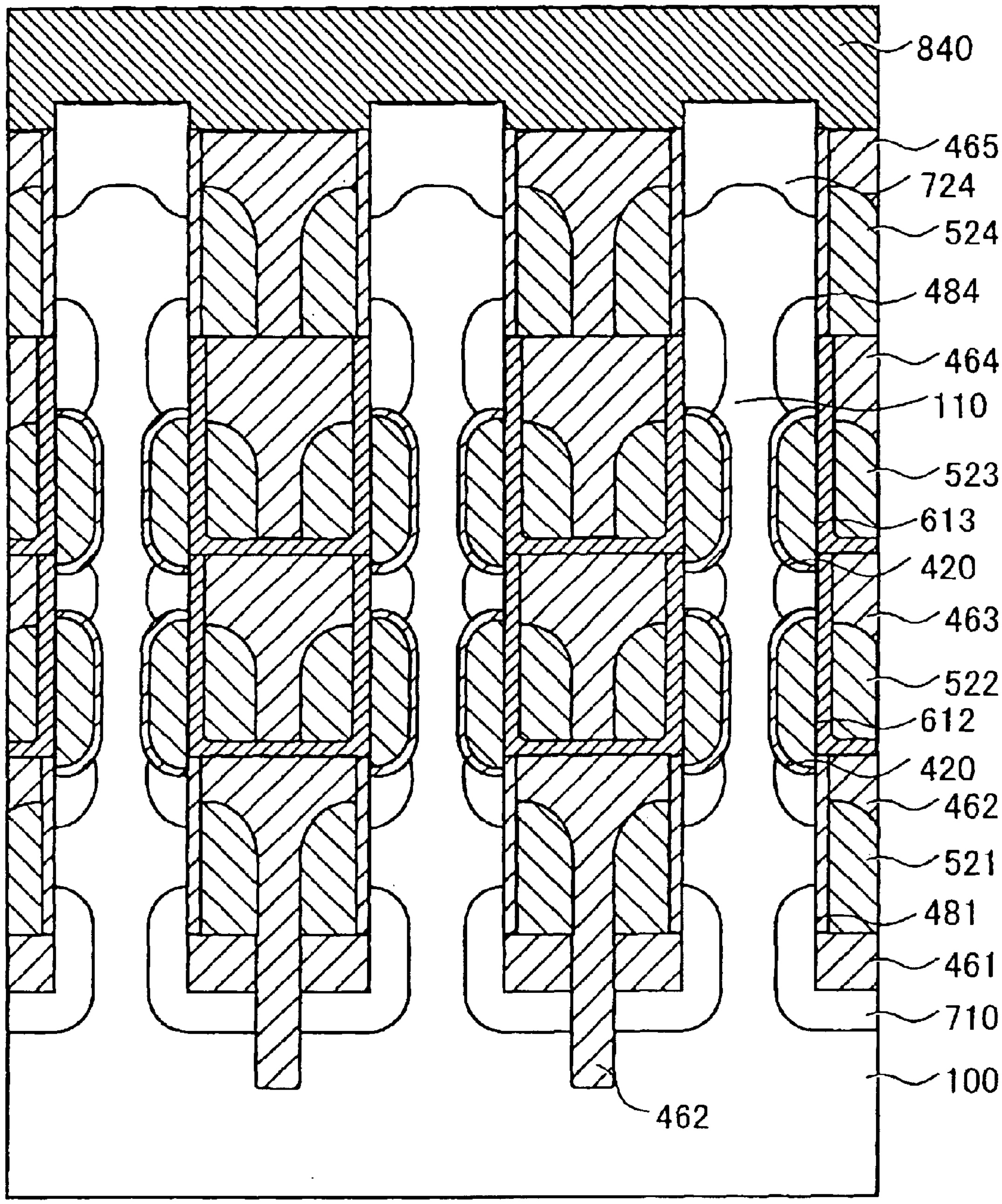

After the resist R4 is removed, production steps follow Production example 39. Thereby, a semiconductor memory is realized (FIG. 472 and FIG. 477).

By making use of the resist instead of the silicon oxide films 441 and 442, thermal history to the tunnel oxide film and the like is reduced and a rework can be done easily.

PRODUCTION EXAMPLE 56

In the semiconductor memory, the P-type silicon substrate 100 is patterned to form the island-like semiconductor layers 110 by using the resist R1 patterned by a known photolithography technique. In connection to this, explanation is given of an example of producing a semiconductor memory, in which the diameter of the island-like semiconductor layer 110, which is determined at the patterning of the resist R1, is increased.

FIGS. 478 to 480 and FIGS. 481 to 483 are sectional views taken on line A–A' and line B–B', respectively, in FIG. 1 which is a cross-sectional view illustrating a memory cell array of an EEPROM.

In the semiconductor memory of Production example 39, the floating gates are formed within the island-like semiconductor layers 110, so that intervals between the island-like semiconductor layers 110 in the memory cell array have a margin. Therefore, the diameter of the island-like semiconductor layers 110 may be increased without changing the intervals therebetween. However, in the case where the island-like semiconductor layers 110 are formed at the minimum photoetching dimension to have the minimum diameter and the minimum intervals, it is impossible to decrease the intervals provided at the minimum photoetching dimension. Therefore, when the diameter of the island-like semiconductor layers 110 increases, the intervals between the island-like semiconductor layers 110 also increase. This is disadvantageous because the device capacitance decreases.

Hereinafter, explanation is given of an example of production process in which the diameter of the island-like semiconductor layers 110 is increased without increasing the intervals between the island-like semiconductor layers 110.

Figure 478:
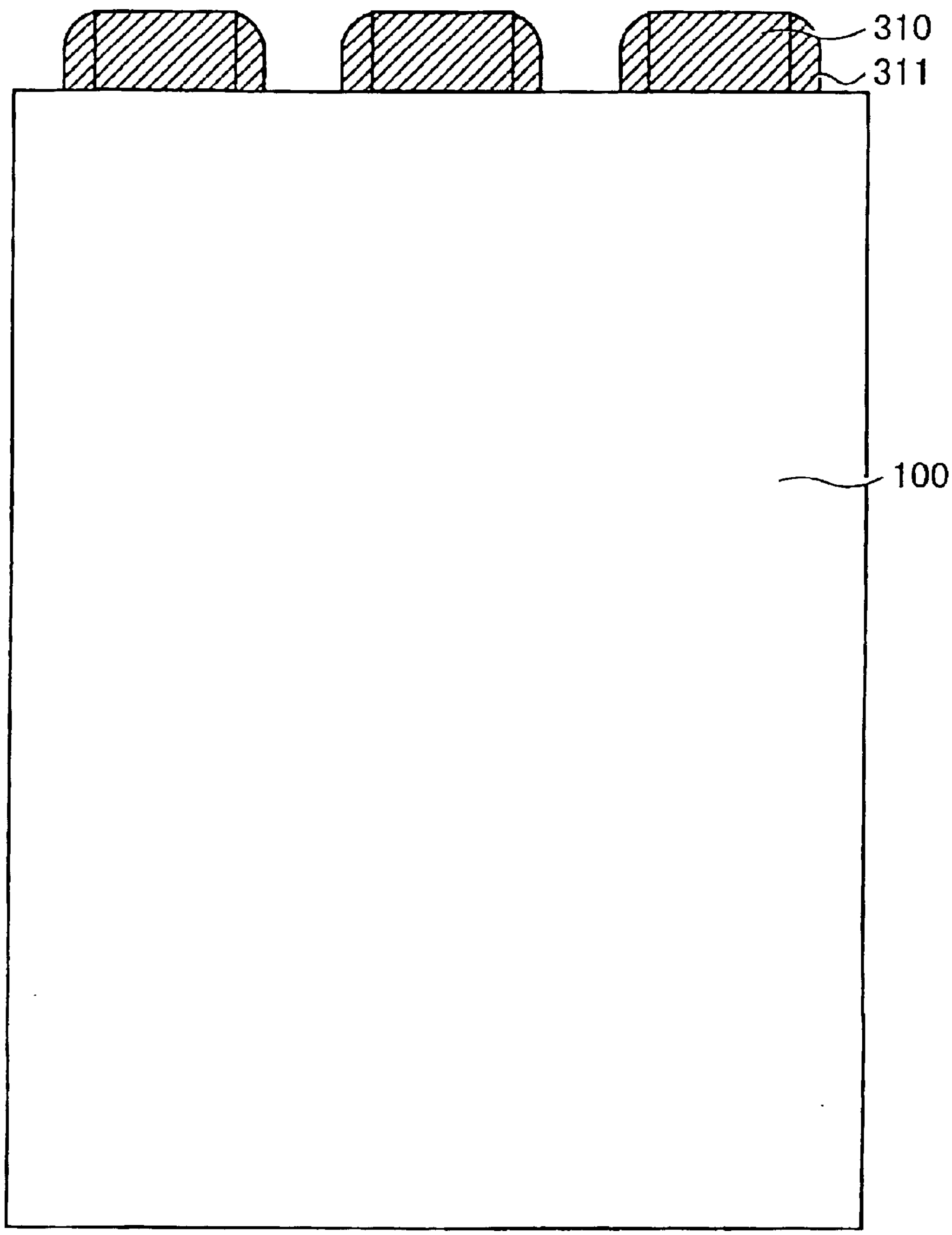
Figure 481:
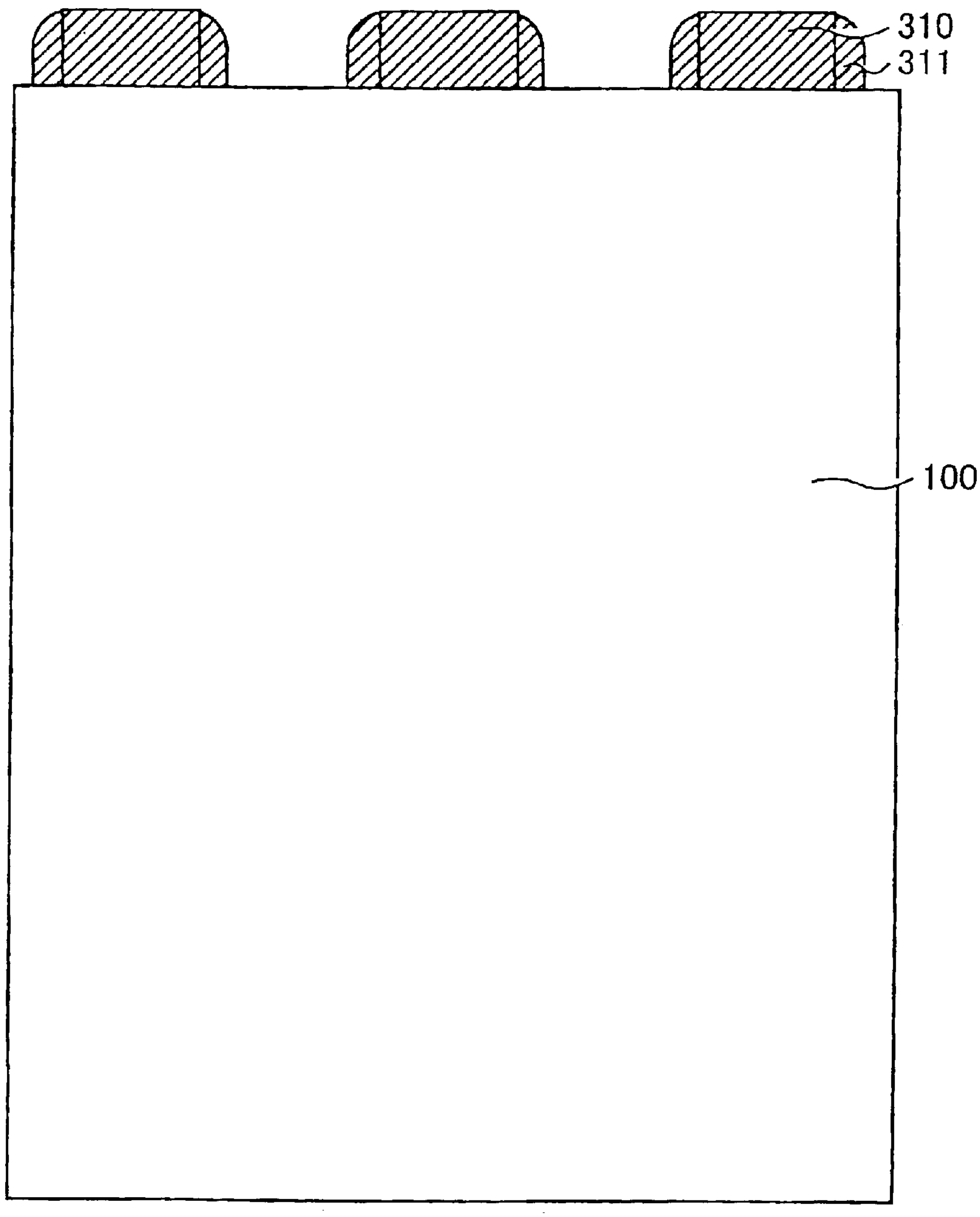

First, a silicon nitride film 310 is deposited to a thickness of 200 to 2,000 nm as a first insulating film to be a mask layer on a surface of a P-type silicon substrate 100 and then etched by reactive ion etching using a resist R1 patterned by a known photolithography technique as a mask as explained in Production example 39. Then, a silicon nitride film 311 is deposited to a thickness of 50 to 500 nm as a first insulating film and anisotropically etched by about a deposit thickness such that the silicon nitride film 311 remains in the form of a sidewall spacer on the sidewall of the silicon nitride film 310 (FIG. 478 and FIG. 481).

Figure 479:
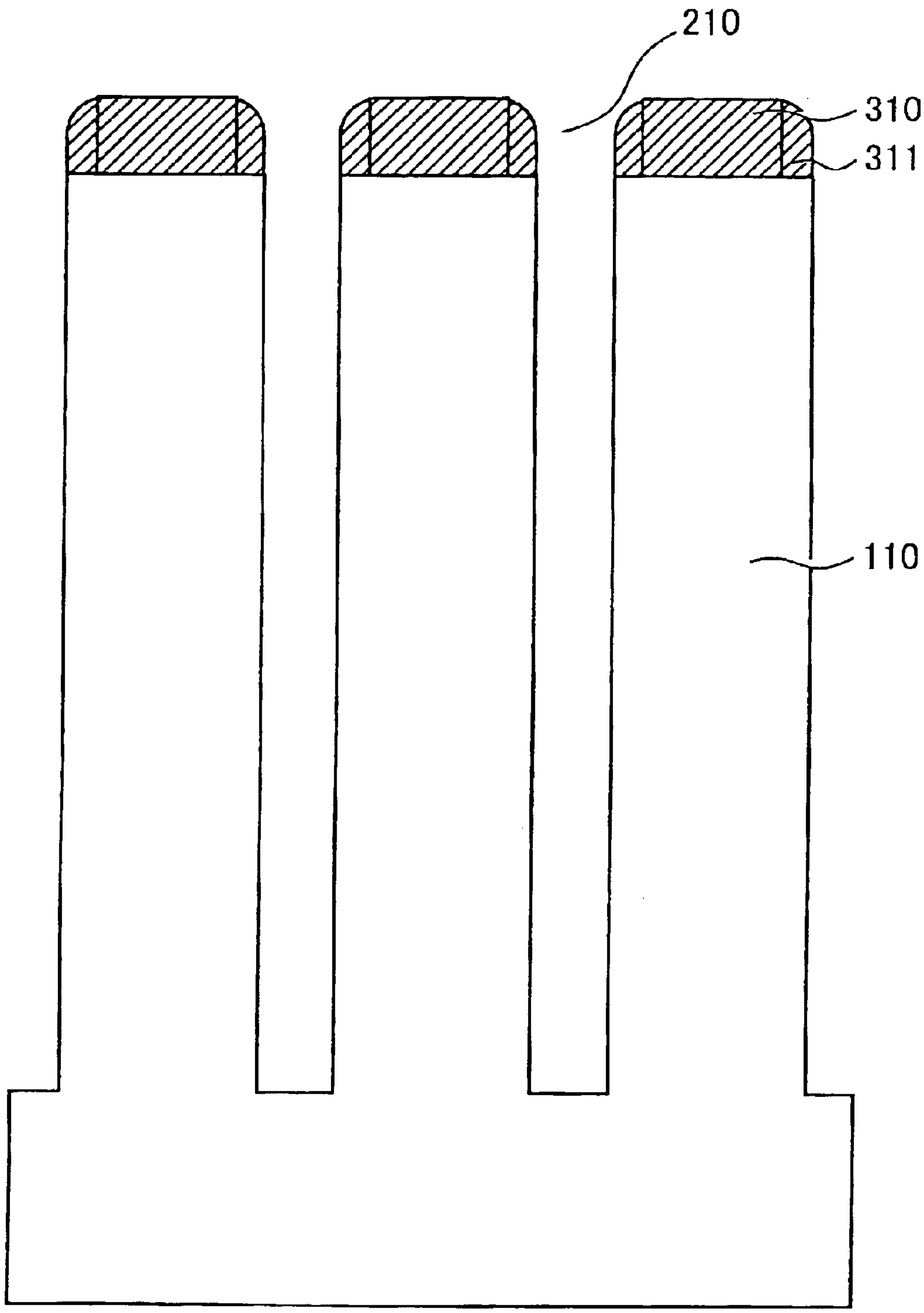
Figure 482:
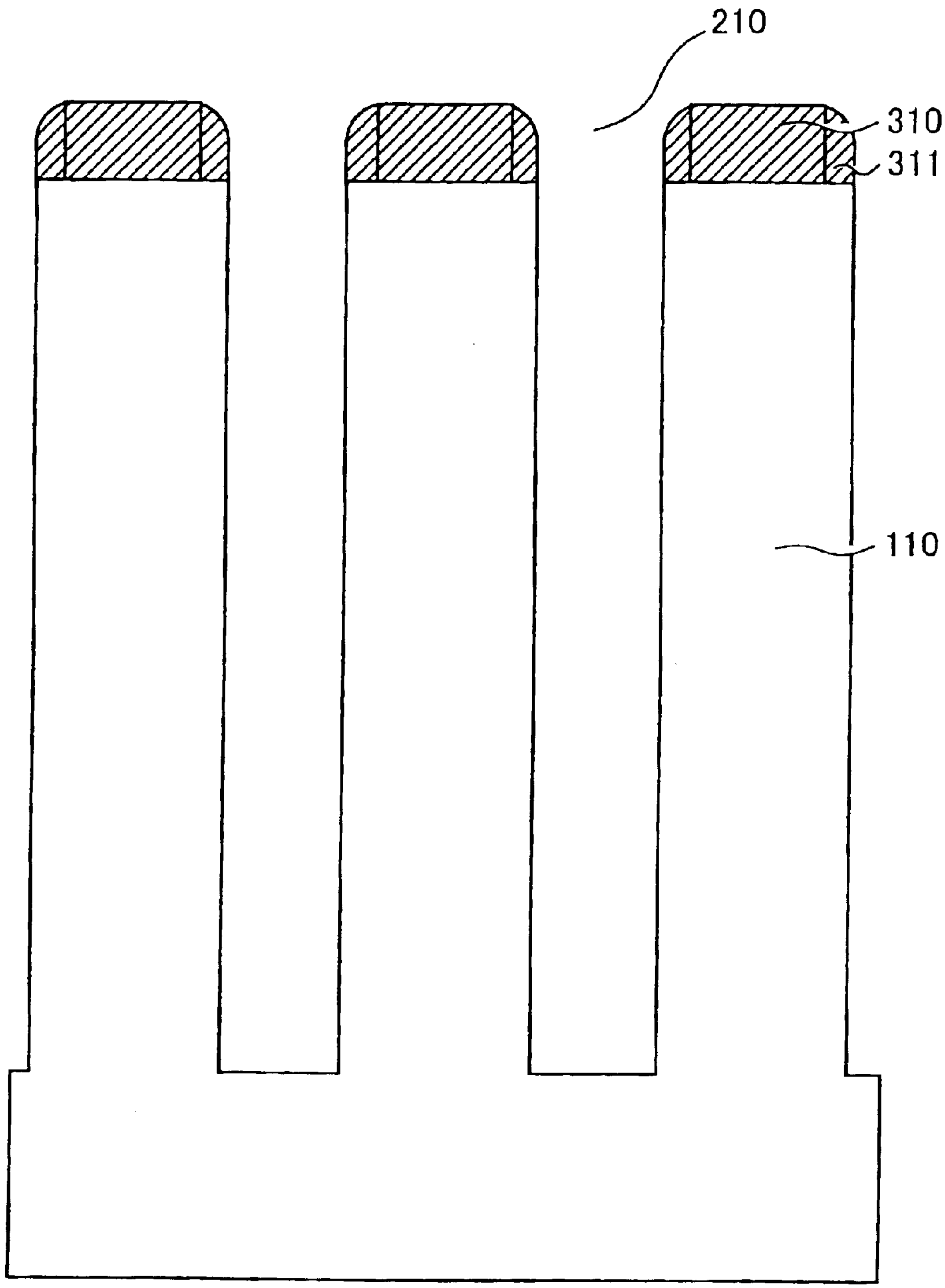

Using the silicon nitride films 310 and 311 as a mask, the P-type silicon substrate 100 is etched by 2,000 to 20,000 nm by reactive ion etching to form a first lattice-form trench 210. Thereby, the island-like semiconductor layers 110 are formed to have an increased diameter, which is determined at the patterning of the resist R1 (FIG. 479 and FIG. 482).

Figure 480:
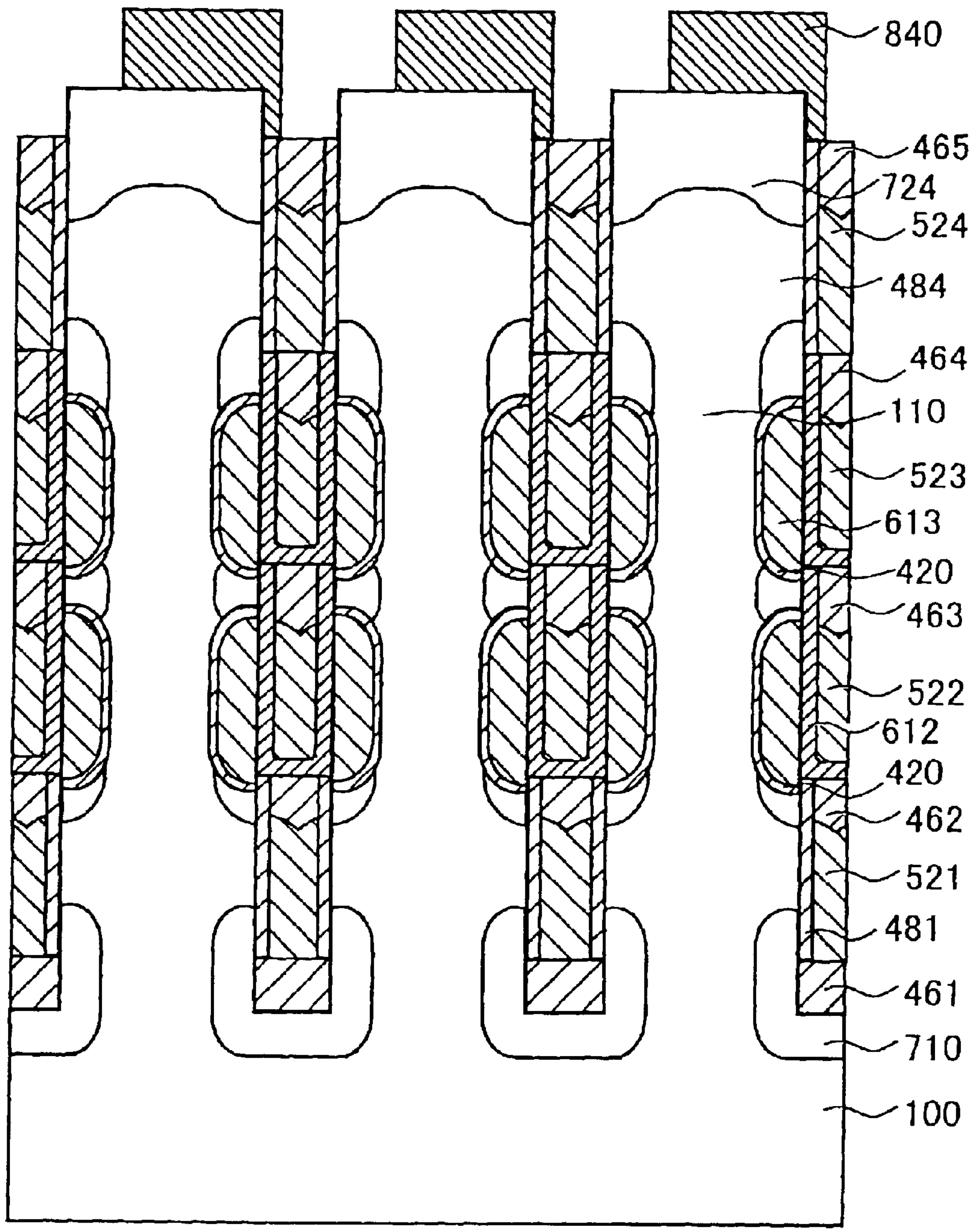
Figure 483:
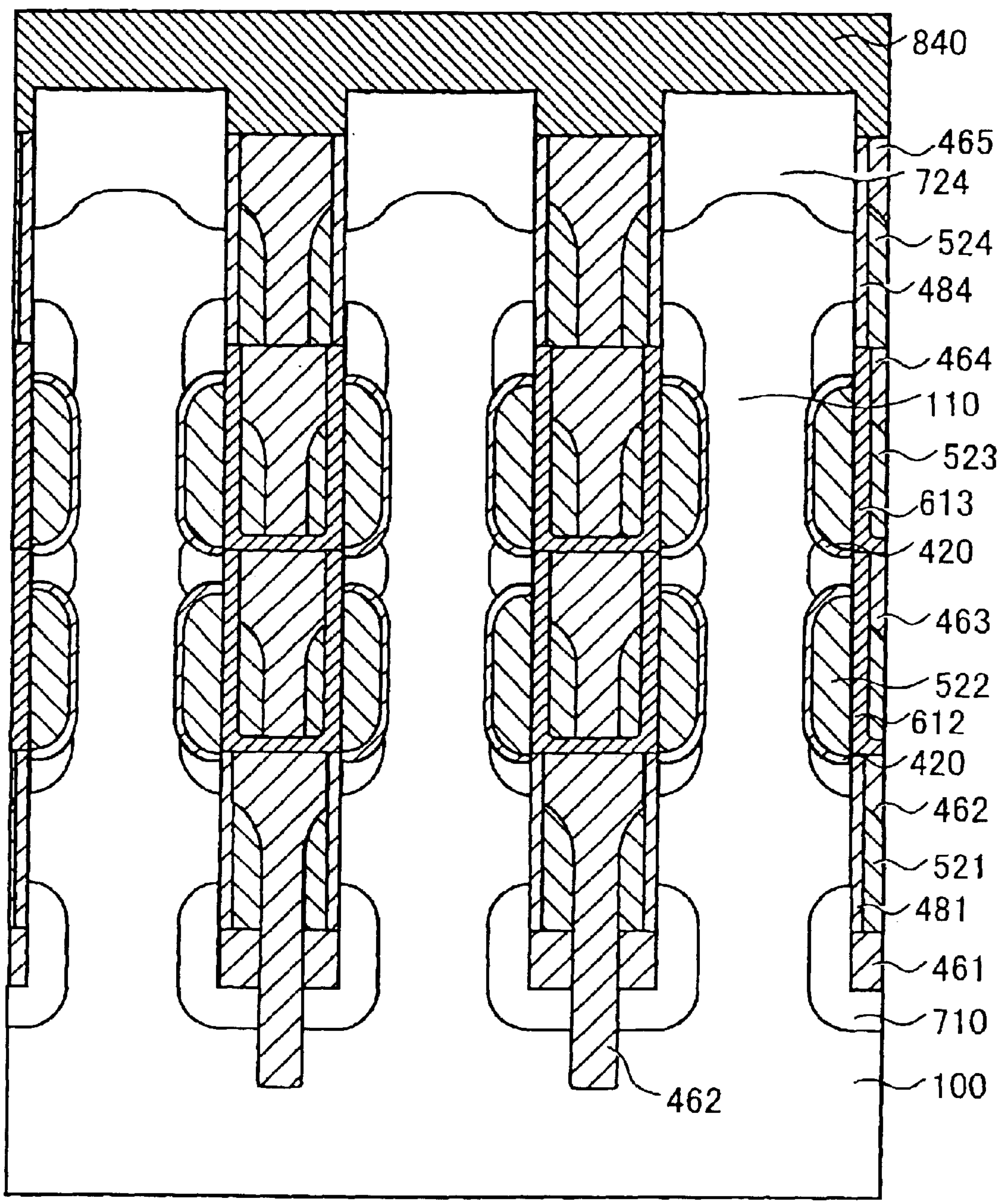

Production steps thereafter follow Production Example 39. Thereby, a semiconductor memory is realized which has a memory function according to the state of a charge in the charge storage layer which is the floating gate made of the polysilicon film as the first conductive film (FIG. 480 and FIG. 483).

Thus, the same effect as obtained by Production Example 39 is obtained. Owing to the increase of the diameter of the island-like semiconductor layers 110, resistance at the top and the bottom of the island-like semiconductor layer 110, i.e., resistance at a source and a drain, is reduced, driving current increases and cell characteristics improve. Further, the back-bias effect is expected to decrease due to the reduction of the source resistance. Moreover, since the open area ratio is reduced in the formation of the island-like semiconductor layers 110, the trench is easily formed by etching and the amount of reaction gas used for the etching is reduced, which allows the reduction of process costs.

PRODUCTION EXAMPLE 57

Figure 484:
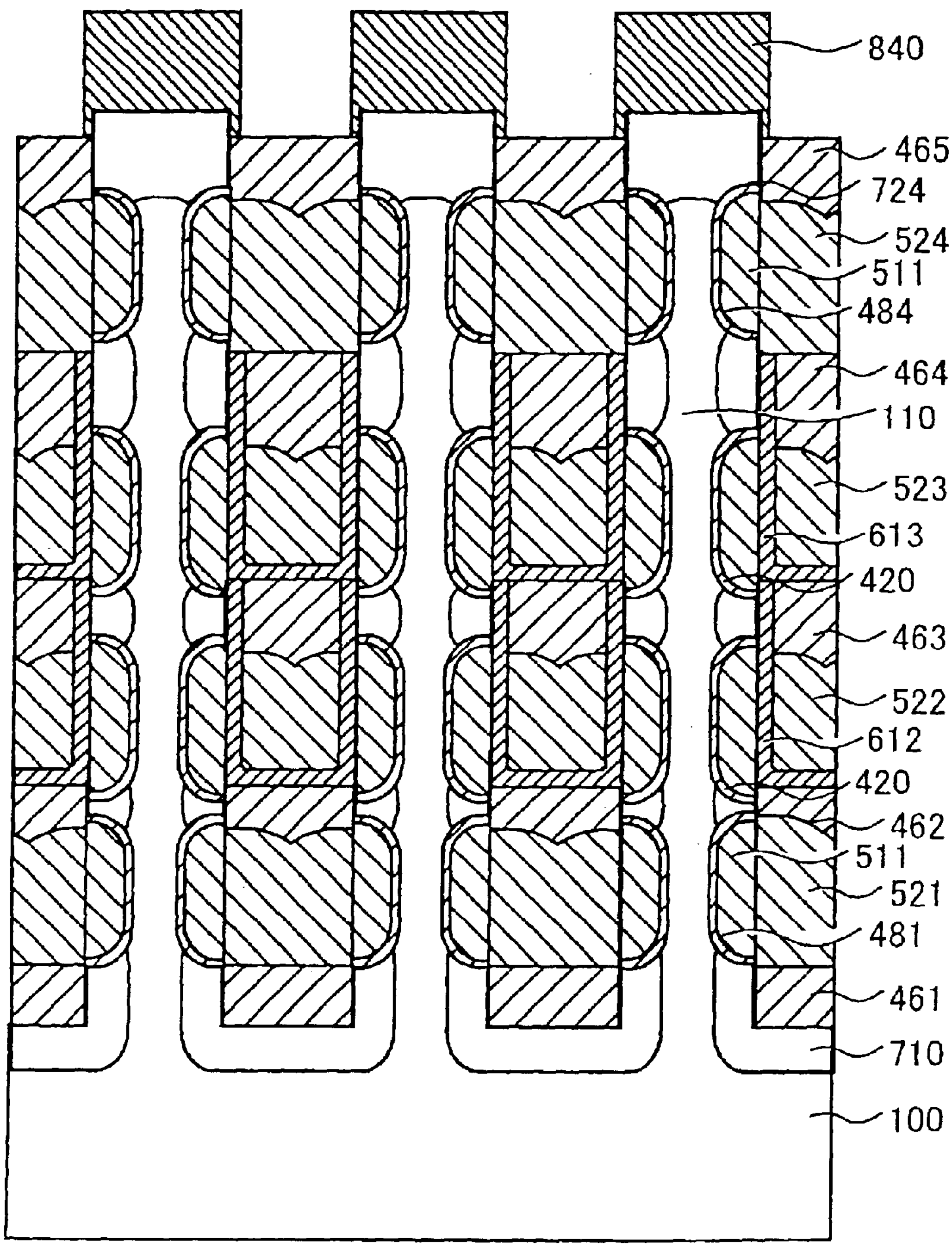
Figure 485:
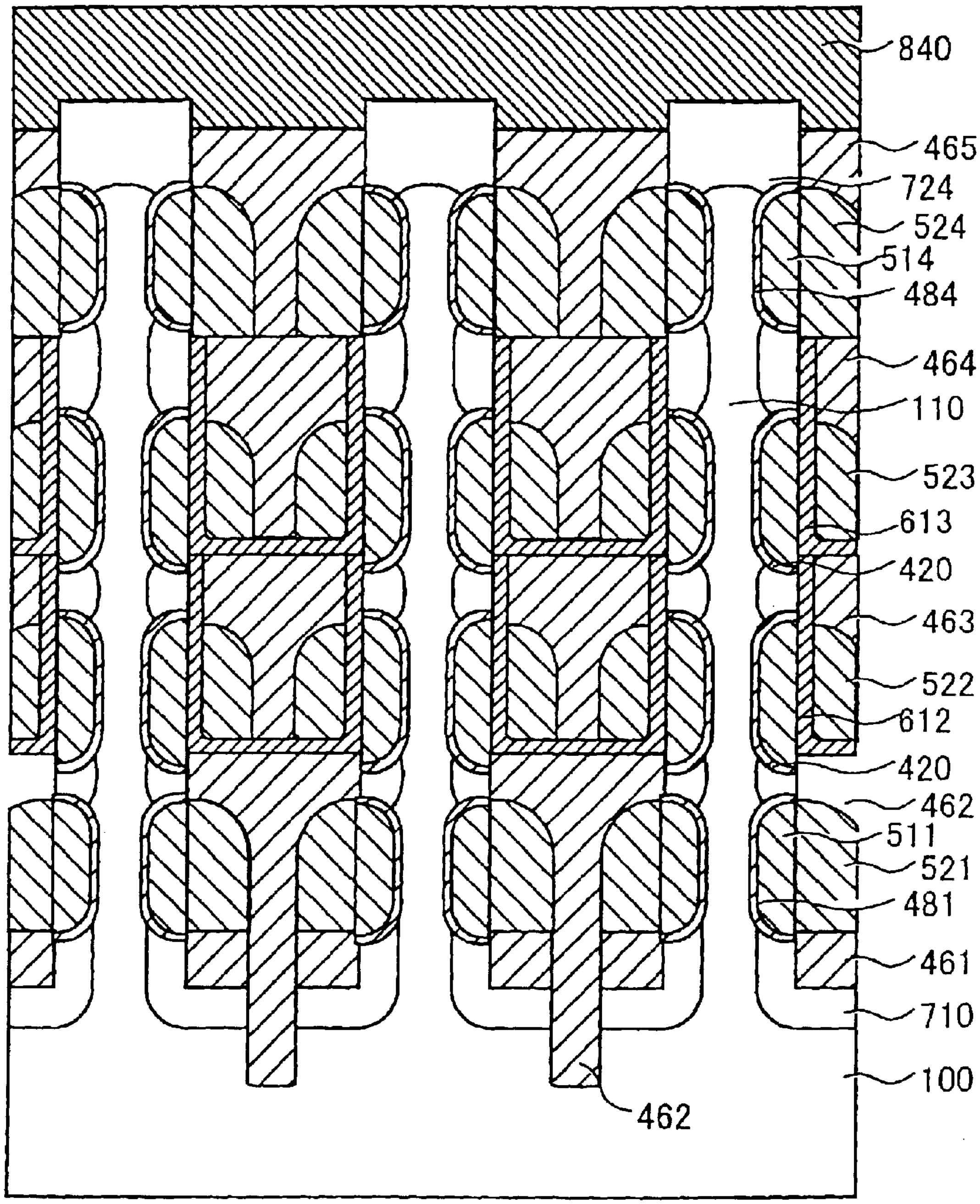
Figure 486:
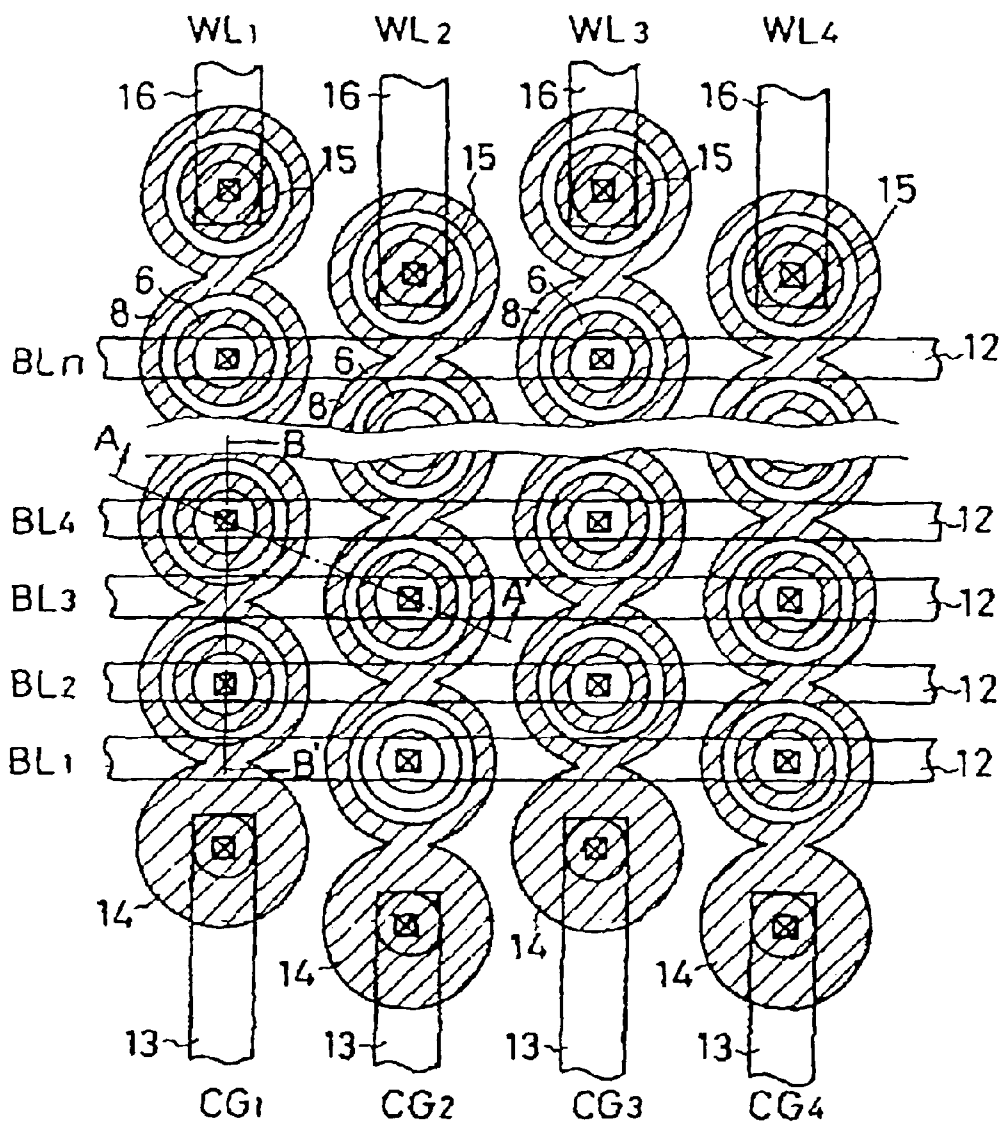
FIG. 486 is a plan view illustrating a prior-art EEPROM.
Figure 487A:
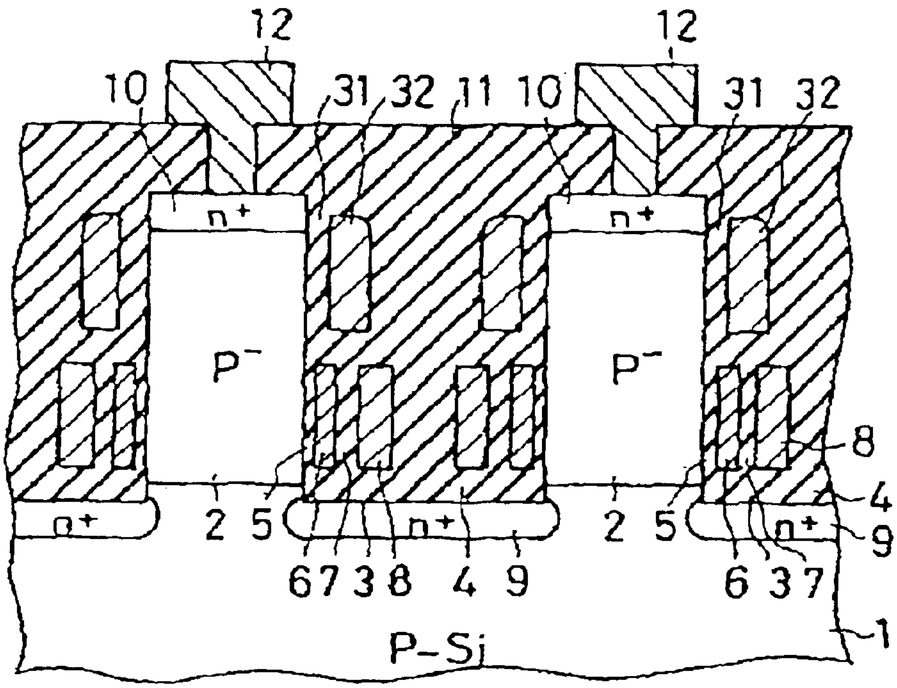
FIG. 487 is a sectional view taken on line A–A' and B–B' in FIG. 1651.
Figure 487B:
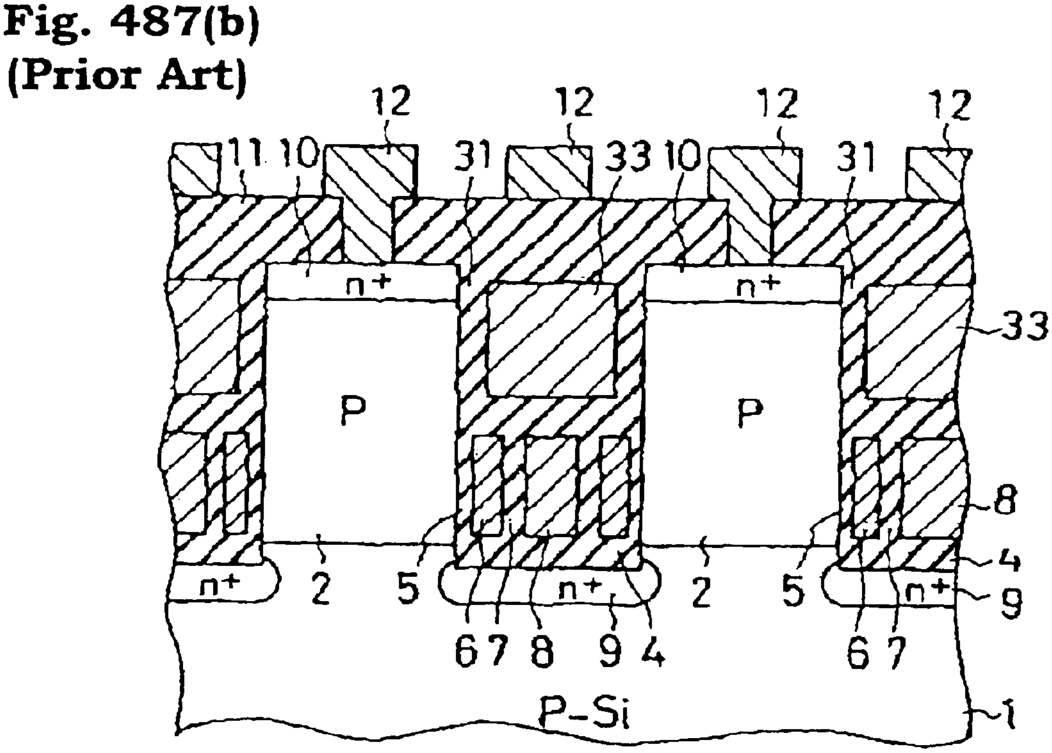
Figure 488A:
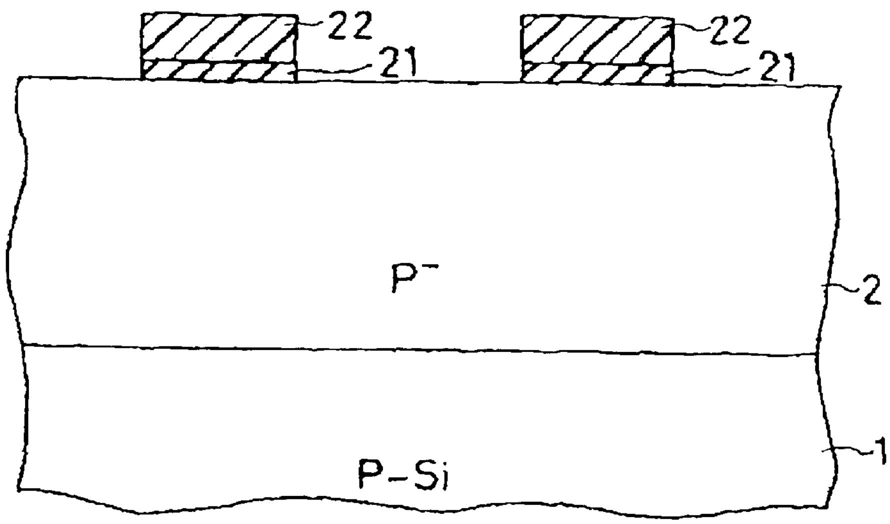
FIGS. 488 to 491 are sectional views illustrating production steps for producing a prior-art EEPROM.
Figure 488B:
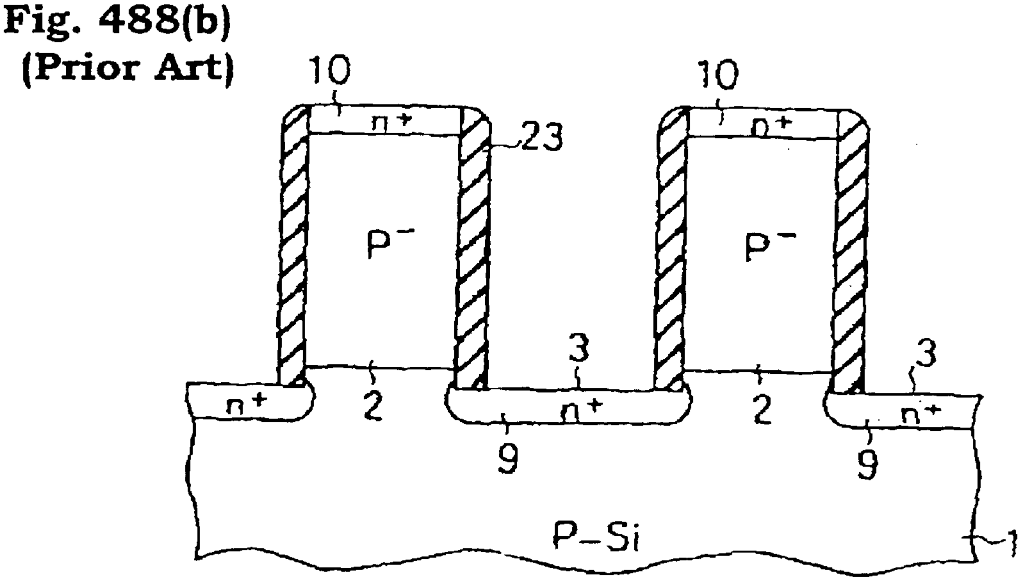
Figure 489C:
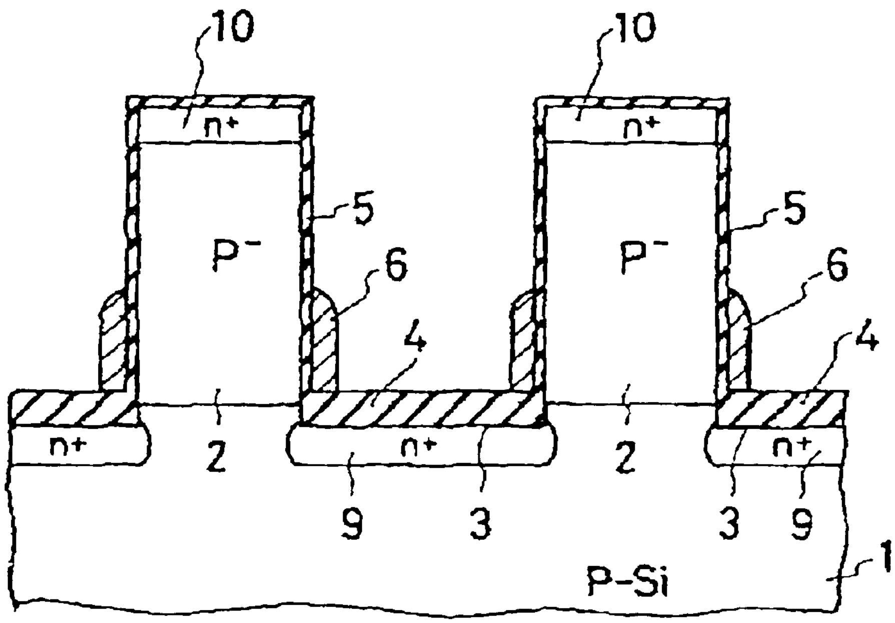
Figure 489D:
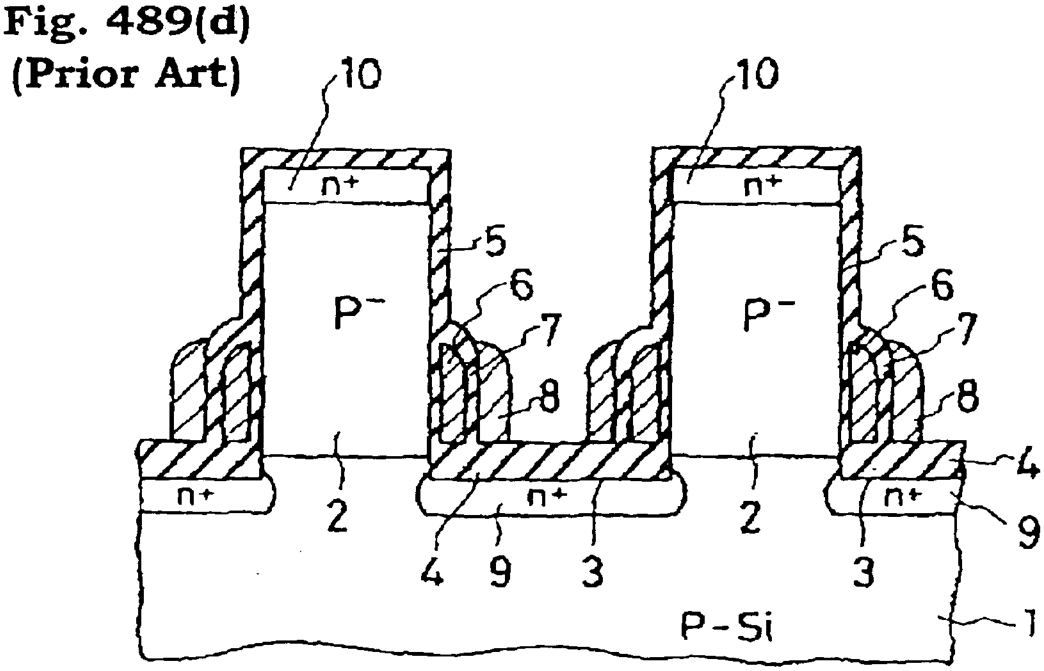
Figure 490E:
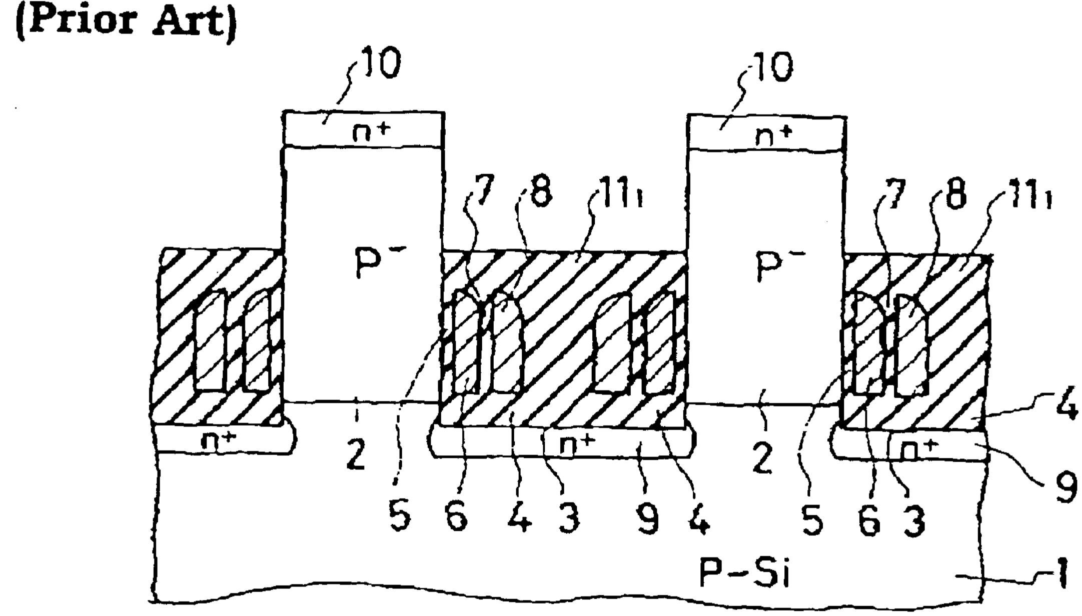
Figure 490F:
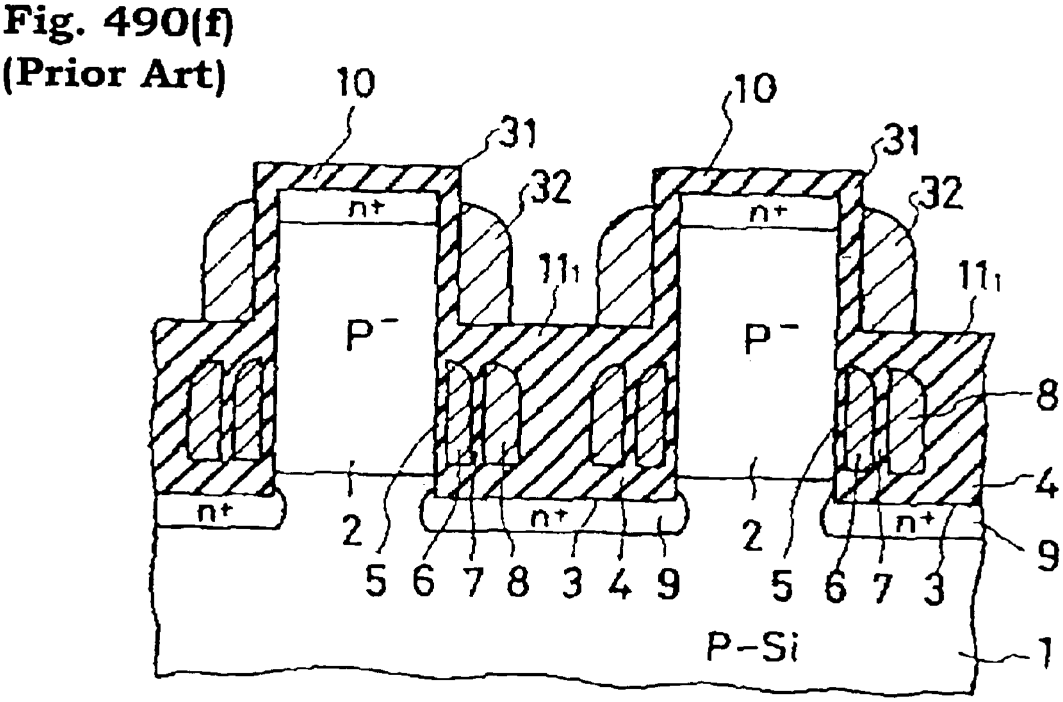
Figure 491G:
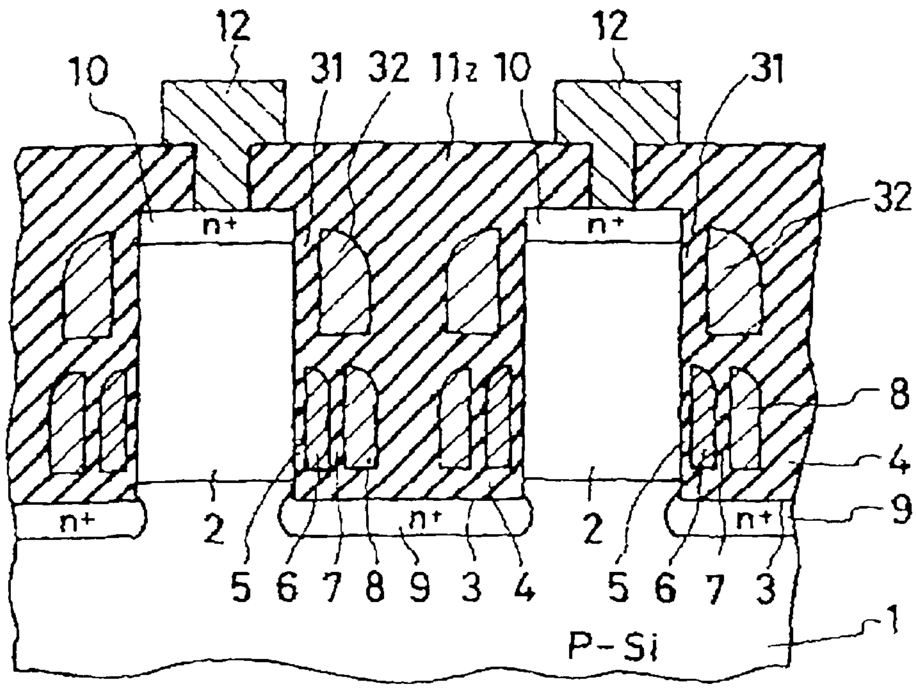
Figure 492A:
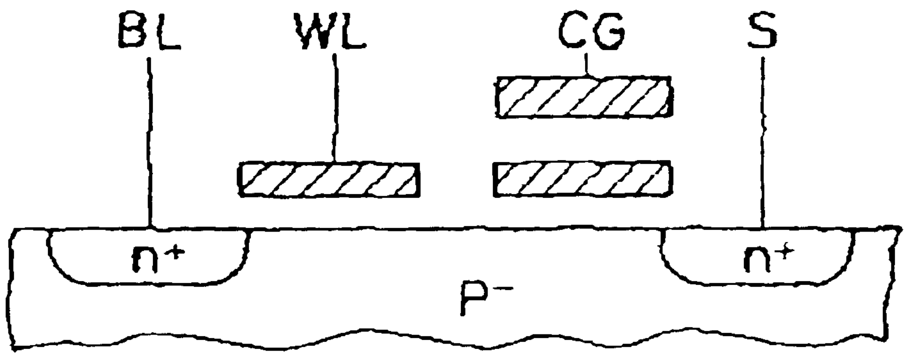
FIG. 492 is a plan view of a prior-art EEPROM and a corresponding equivalent circuit diagram.
Figure 492B:
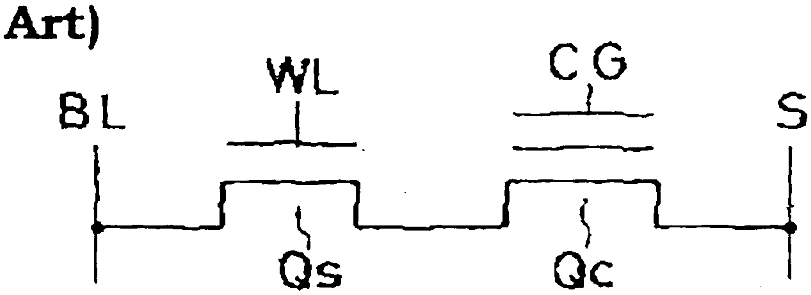
Figure 493:
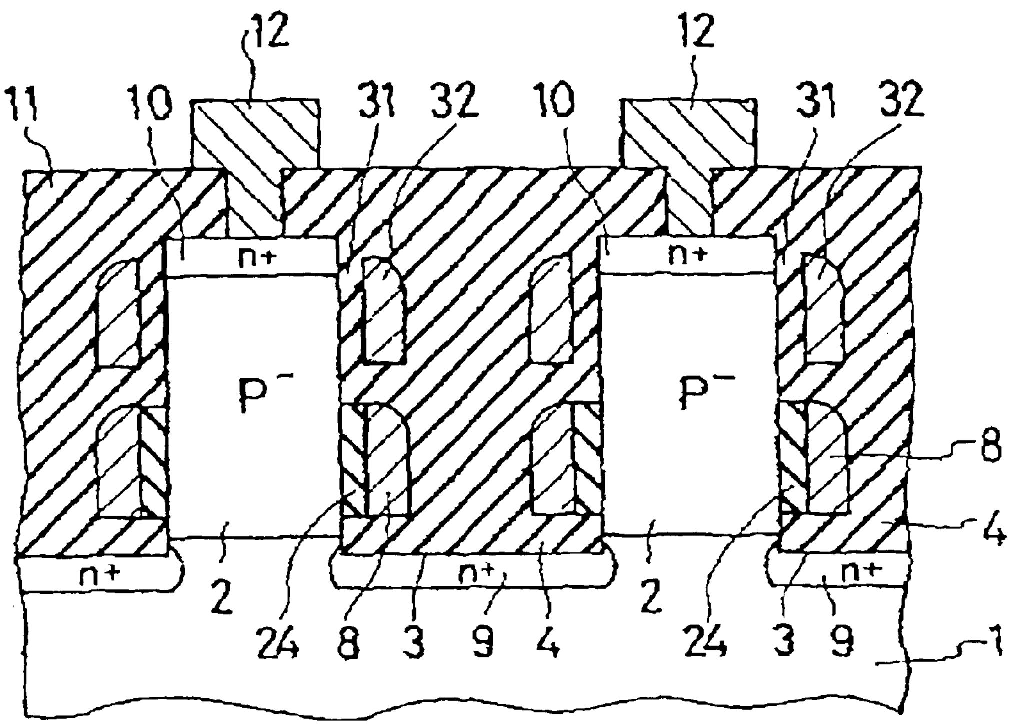
FIGS. 493 to 494 are sectional views of various kinds of prior-art memory cells of MNOS structure.
Figure 494:
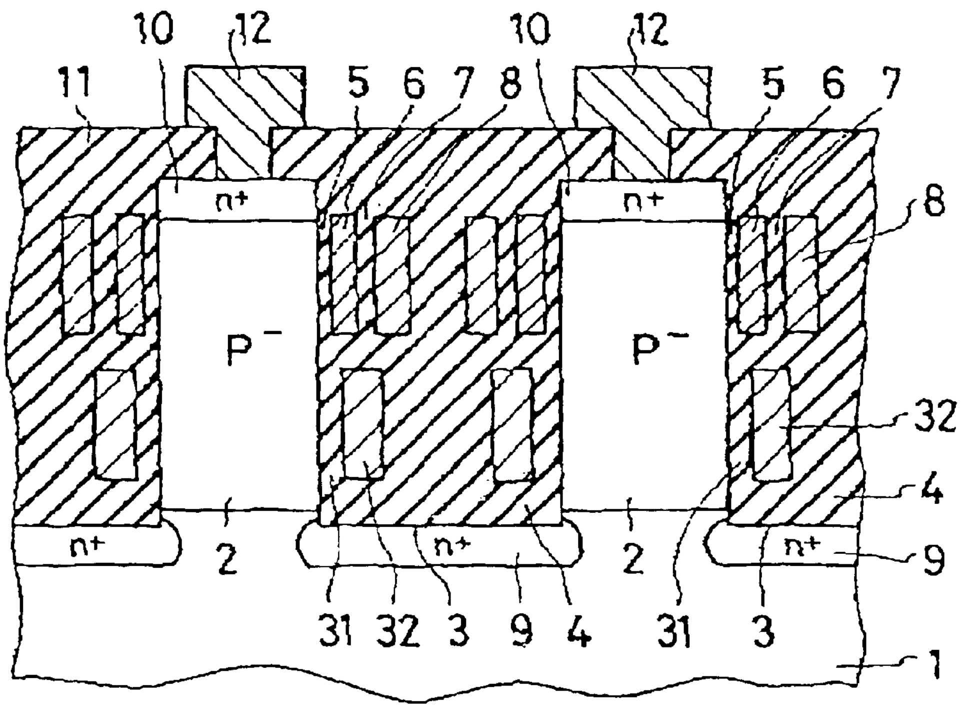
Figure 495:
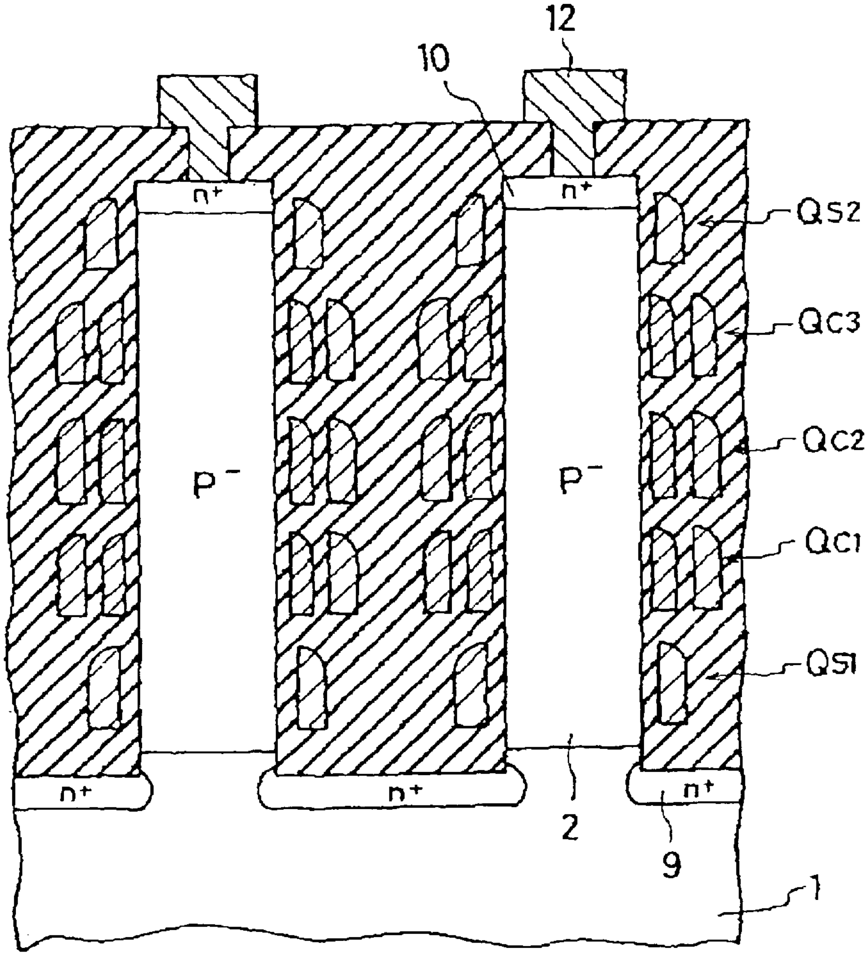
FIG. 495 is a sectional view of a prior-art semiconductor device with a plurality of memory cells formed on each pillar-form silicon layer.

In this production example, as shown in FIG. 484 and FIG. 485, a semiconductor memory having a structure substantially the same as that of the semiconductor memory of Production example 39 is produced according to the process of Production example 39 except that the selection gate is formed in the recesses of the island-like semiconductor layer 110 in the same manner as the charge storage layer.

In the present invention, the structures of the charge storage layers and the control gates in the memory cell transistors and the structures of the selection gates in the selection gate transistors described in Production examples 1 to 57 may optionally be combined.

According to the present invention, the memory transistors are formed in the island-like semiconductor layers. Thereby, capacitance of the memory transistors can be enlarged and a cell area per bit is reduced, which reduces the size and costs of the semiconductor chips. In particular, if the island-like semiconductor layers including the memory transistors are formed at the minimum photoetching dimension to have the minimum diameter (length) and the minimum intervals between them, and if the memory transistors are stacked in two stages in each island-like semiconductor layer, the capacitance is doubled as compared with the prior art devices. That is, the capacitance can be multiplied by the number of the stages of the memory transistors per island-like semiconductor layer. Further, the device performance is determined by the dimensions in the vertical direction, which are independent of the minimum photoetching dimension. Therefore, the device performance can be maintained.

According to the present invention, variations in characteristics of the memory cells are prevented and variations in device performance are suppressed, which allows easy control and cost reduction. More specifically, since the charge storage layers are installed in the island-like semiconductor layers, a margin is created in the intervals between the island-like semiconductor layers in the memory cell array. Therefore, by forming the trench through etching after an insulating film is formed as a sidewall spacer on the sidewall of the mask, the diameter of the island-like semiconductor layers can be increased without changing the intervals between them formed at the minimum photoetching dimension. At this time, resistance at the top and the bottom of the island-like semiconductor layer, i.e., resistance at a source and a drain, is reduced, driving current increases and the cell characteristics improves. Further, since the source resistance is reduced, the back-bias effect is also expected to decrease.

Further, since the open area ratio is reduced in the formation of the island-like semiconductor layers, the trench is easily formed by etching. If it is possible to decrease the intervals between the island-like semiconductor layers formed at the minimum photoetching dimension instead of increasing the diameter of the island-like semiconductor layers, the capacitance can be further increased, the cell area per bit is reduced, and the size and costs of the semiconductor chips are reduced.

In the case where the charge storage layers are installed in the island-like semiconductor layers, transistors of the periphery circuits can also be installed by the same structure. Further, these transistors can be formed simultaneously with the gate electrodes of the selection gate transistors, which realizes an integrated circuit with good alignment. Moreover, since the memory cell portion is buried with the polysilicon film, channel ion implantation is easily carried out only into the channel portion of the selection gate transistor.

Further, since the impurity diffusion layers are disposed such that the active regions of the memory cells are in an electrically floating state with respect to the substrate, the back-bias effect from the substrate is prevented. Thereby, the occurrence of variations is prevented with regard to the characteristics of the memory cells owing to decrease of the threshold of the memory cells at reading data. Accordingly, the number of the cells connected in series between the bit line and the source line increases and thus the capacitance can be enlarged.

Furthermore, the floating gates can be patterned at the same time by burying the charge storage layer in the recesses formed on the sidewall of the island-like semiconductor layer with the intervention of a tunnel oxide film and performing anisotropic etching along the sidewall of the pillar-form island-like semiconductor layer. That is, the tunnel oxide films of the same quality and the charge storage layers of the same quality are obtained in each memory cell.

Further, the control gates can be patterned at the same time by burying a polysilicon film to be control gate electrodes in the recesses formed on the sidewall of the charge storage layer with the intervention of an interlayer insulating film and performing anisotropic etching along the sidewall of the pillar-form island-like semiconductor layer. That is, the interlayer insulating films of the same quality and the control gates of the same quality are obtained in each memory cell.

Furthermore, the selection gates can be patterned at the same time by burying a polysilicon film to be selection gate electrodes in the recesses formed on the sidewall of the island-like semiconductor layer with the intervention of a gate oxide film and performing anisotropic etching along the sidewall of the pillar-form island-like semiconductor layer. That is, the gate oxide films of the same quality and the selection gates of the same quality are obtained in each selection gate transistor.

Still further, in order to pattern the semiconductor substrate into pillars to form island-like semiconductor layers having at least one recess, a mask made of an insulating film is formed on the sidewalls of the island-like semiconductor layers to have openings in regions for forming the recesses, and thermal oxidation is performed or isotropic etching and thermal oxidation are carried out in combination with respect to the openings. Thereby, damages, defects and irregularity on the substrate surface are removed and favorable active regions are obtained. In particular, where a circular pattern is used to surround the recesses, local concentration of electric field is prevented on the active region surface, which allows easy electrical control. Further, the driving current improves and the S factor increases by: placing the gate electrodes of the transistors around the island-like semiconductor layers. The improvement in the driving current and the increase in the S value are further enhanced by an increase in the electric field concentration effect due to the reduction of the diameter of the island-like semiconductor layers in the active regions of the memory cells, which is controlled by the thickness which is subjected to the thermal oxidation or the isotropic etching and the thermal oxidation performed in combination during the formation of the recesses; and by three-dimensional electric field concentration effect owing to the active regions of the memory cells curved in a direction of the height of the island-like semiconductor layers. Thus, excellent device characteristics are obtained which allows higher writing speed.

Since the active region of the memory cell is curved, the length of the active region increases with respect to a unit length of the memory cell, thereby the gate length along the island-like semiconductor layer, i.e., the length from the bottom to the top of the gate, is reduced, and as a result, the height of the island-like semiconductor layer decreases. Accordingly, the island-like semiconductor layer can be formed easily by anisotropic etching. Further, the amount of reaction gas used for the etching is reduced and thus the manufacture costs are reduced. Moreover, since the active region of the memory cell is curved, the edge of the impurity diffusion layer is positioned closer to the gate electrode than the active region surface of the memory cell and an electric current path is generated by punch-through along the active region surface. Thereby, easy control is realized by the voltage applied to the gate electrode and the dielectric strength against the punch-through improves.

What is claimed is:

1. A semiconductor memory comprising:

a first conductivity type semiconductor substrate, at least one memory cell comprising an island-like semiconductor layer having a recess on a sidewall thereof, a charge storage layer formed to entirely or partially encircle a sidewall of the island-like semiconductor layer, and a control gate formed on the charge storage layer, wherein at least one charge storage layer of said at least one memory cell is at least partially situated within the recess formed on the sidewall of the island-like semiconductor layer, and wherein a plurality of memory cells are formed with regard to one island-like semiconductor layer and the memory cells are arranged in series.

2. A semiconductor memory according to claim 1, wherein the control gate is formed to entirely or partially encircle the sidewall of the island-like semiconductor layer with the intervention of the charge storage layer.

3. A semiconductor memory according to claim 1, wherein one or more of the memory cells are electrically insulated from the semiconductor substrate by:

a second conductivity type impurity diffusion layer formed in the semiconductor substrate or the island-like semiconductor layer and a depletion layer formed at a junction between the second conductivity type impurity diffusion layer and the semiconductor substrate or the island-like semiconductor layer.

4. A semiconductor memory according to claim 1, wherein a plurality of island-like semiconductor layers are formed in matrix, impurity diffusion layers for reading a state of a charge stored in a memory cell are formed in the island-like semiconductor layers, a plurality of control gates are provided continuously in a direction to form a control gate line and a plurality of the impurity diffusion layers in a direction crossing the control gate line are connected to form a bit line.

5. A semiconductor memory according to claim 1, further comprising electrodes for electrically connecting channel layers of the memory cells between the control gates.

6. A semiconductor memory according to claim 1, wherein a plurality of island-like semiconductor layers are formed in matrix, and the width of the island-like semiconductor layers in one direction is smaller than a distance between adjacent island-like semiconductor layers in the same direction.

7. A semiconductor memory according to claim 1, wherein a plurality of island-like semiconductor layers are formed in matrix, and a distance between the island-like semiconductor layers in one direction is smaller than a distance between the island-like semiconductor layers in another direction.

8. The semiconductor memory of claim 1, wherein an insulating layer is provided between the control gate and the charge storage layer.

9. The semiconductor memory of claim 1, wherein a plurality of different recesses are provided on the sidewall of the island-like semiconductor layer.

10. The semiconductor memory of claim 1, further comprising at least one selection gate transistor including a selection gate, wherein the selection gate is situated on the sidewall of the island-like semiconductor layer of one or more memory cells in at least an area where the recess is not formed.

11. The semiconductor memory of claim 1, further comprising at least one selection gate transistor including a selection gate, wherein the selection gate is situated over another recess on the sidewall of the island-like semiconductor layer of one or more memory cells.

12. A semiconductor memory according to claim 1 further comprising a gate electrode formed at least at one end of at least one memory cell for selecting memory cells arranged in series with said at least one memory cell.

13. A semiconductor memory according to claim 12, wherein the gate electrode is partially situated within the recess formed on the sidewall of the island-like semiconductor layer.

14. A semiconductor memory according to claim 12, wherein the gate electrode is formed to entirety or partially encircle the sidewall of the island-like semiconductor layer.

15. A semiconductor memory according to claim 12, wherein a part of the island-like semiconductor layer opposed to the gate electrode is electrically insulated from the semiconductor substrate or the memory cell by a second conductivity type impurity diffusion layer formed on the semiconductor substrate or in the island-like semiconductor layer.

16. A semiconductor memory according to claim 12, wherein a second conductivity type impurity diffusion layer, or said second conductivity type impurity diffusion layer and a first conductivity type impurity diffusion layer formed in said second conductivity type impurity diffusion layer is (are) formed to entirely or partially encircle the sidewall of the island-like semiconductor layer in self-alignment with the charge storage layer and the gate electrode so that a channel layer disposed on a part of the island semiconductor layer opposed to the gate electrode is electrically connected with a channel region of the memory cell.

17. A semiconductor memory according to claim 12, wherein the control gate and the gate electrode and/or the control gates are adjacently arranged so that a channel layer formed in a part of the island-like semiconductor layer opposed to the gate electrode and the channel layer of the memory cell and/or the channel layers of the memory cells are electrically connected.

18. A semiconductor memory according to claim 12, further comprising an electrode for electrically connecting a channel layer formed in a part of the island-like semiconductor layer opposed to the gate electrode with a channel layer of the memory cell, between the control gate and the gate electrode and/or between the control gates.

19. A semiconductor memory according to claim 12, wherein all, some or one control gate(s) are formed of the same material as all, some or one gate electrode(s).

20. A semiconductor memory according to claim 12, wherein the charge storage layer and the gate electrode are formed of the same material.

21. A semiconductor memory according to claim 1, comprising one or more of the memory cells, wherein said one or more memory cells are electrically insulated from the semiconductor substrate by:

a second conductivity type impurity diffusion layer formed in the semiconductor substrate or in the island-like semiconductor layer and/or by the second conductivity type impurity diffusion layer and a first conductivity type impurity diffusion layer formed in the second conductivity type impurity diffusion layer.

22. A semiconductor memory according to claim 21, wherein a second conductivity type impurity diffusion layer formed in the semiconductor substrate functions as common wiring for at least one memory cell.

23. A semiconductor memory comprising:

a first conductivity type semiconductor substrate, at least one memory cell comprising an island-like semiconductor layer having a recess on a sidewall thereof, a charge storage layer formed to entirely or partially laterally surround a sidewall of the island-like semiconductor layer. and a control gate formed on the charge storage layer, wherein said charge storage layer of said memory cell is at least partially situated within the recess formed on the sidewall of the island-like semiconductor layer, and wherein a control gate of said memory cell is at least partially situated within the recess formed on the sidewall of the island-like semiconductor layer.

24. The semiconductor memory of claim 23, further comprising at least one selection gate transistor including a selection gate, wherein the selection gate is situated on the sidewall of the island-like semiconductor layer of one or more memory cells in at least an area where the recess is not formed.

25. The semiconductor memory of claim 23, further comprising at least one selection gate transistor including a selection gate, wherein the selection gate is situated over another recess on the sidewall of the island-like semiconductor layer of one or more memory cells.

26. A semiconductor memory comprising:

a first conductivity type semiconductor substrate, at least one memory cell comprising an island-like semiconductor layer having a recess on a sidewall thereof, a charge storage layer formed to entirely or partially laterally surround a sidewall of the island-like semiconductor layer. and a control gate formed on the charge storage layer, wherein said charge storage layer of said memory cell is at least partially situated within the recess formed on the sidewall of the island-like semiconductor layer, and wherein a plurality of memory cells are formed in one island-like semiconductor layer and at least one of the memory cells is electrically insulated from another memory cell by a second conductivity type impurity diffusion layer formed in the island-like semiconductor layer, or by the second conductivity type impurity diffusion layer and a first conductivity type impurity diffusion layer formed in the second conductivity type impurity diffusion layer.

27. The semiconductor memory of claim 26, further comprising at least one selection gate transistor including a selection gate, wherein the selection gate is situated on the sidewall of the island-like semiconductor layer of one or more memory cells in at least an area where the recess is not formed.

28. The semiconductor memory of claim 26, further comprising at least one selection gate transistor including a selection gate, wherein the selection gate is situated over another recess on the sidewall of the island-like semiconductor layer of one or more memory cells.

29. A semiconductor memory comprising:

a first conductivity type semiconductor substrate, at least one memory cell comprising an island-like semiconductor layer having a recess on a sidewall thereof, a charge storage layer formed to entirely or partially laterally surround a sidewall of the island-like semiconductor layer, and a control gate formed on the charge storage layer, wherein said charge storage layer of said memory cell is at least partially situated within the recess formed on the sidewall of the island-like semiconductor layer, and wherein a plurality of memory cells are formed in one island-like semiconductor layer and at least one of the memory cells is electrically insulated from another memory cell by a second conductivity type impurity diffusion layer formed in the island-like semiconductor layer, and a depletion layer formed at a junction between the second conductivity type impurity diffusion layer and the island-like semiconductor layer.

30. The semiconductor memory of claim 29, further comprising at least one selection gate transistor including a selection gate, wherein the selection gate is situated on the sidewall of the island-like semiconductor layer of one or more memory cells in at least an area where the recess is not formed.

31. The semiconductor memory of claim 29, further comprising at least one selection gate transistor including a selection gate, wherein the selection gate is situated over another recess on the sidewall of the island-like semiconductor layer of one or more memory cells.

32. A semiconductor memory comprising:

a first conductivity type semiconductor substrate, at least one memory cell comprising an island-like semiconductor layer having a recess on a sidewall thereof, a charge storage layer formed to entirely or partially laterally surround a sidewall of the island-like semiconductor layer, and a control gate formed on the charge storage layer, wherein said charae storage layer of said memory cell is at least partially situated within the recess formed on the sidewall of the island-like semiconductor layer, and wherein a second conductivity type impurity diffusion layer, or said second conductivity type impurity diffusion layer and a first conductivity type impurity diffusion layer formed in said second conductivity type impurity diffusion layer is (are) formed to entirely or partially encircle the sidewall of the island-like semiconductor layer in self-alignment with the charge storage layer so that channel layers of memory cells are electrically connected to each other.

33. The semiconductor memory of claim 32, further comprising at least one selection gate transistor including a selection gate, wherein the selection gate is situated on the sidewall of the island-like semiconductor layer of one or more memory cells in at least an area where the recess is not formed.

34. The semiconductor memory of claim 32, further comprising at least one selection gate transistor including a selection gate, wherein the selection gate is situated over another recess on the sidewall of the island-like semiconductor layer of one or more memory cells.

35. A semiconductor memory comprising:

a first conductivity type semiconductor substrate, at least one memory cell comprising an island-like semiconductor layer having a recess on a sidewall thereof, a charge storage layer formed to entirely or partially laterally surround a sidewall of the island-like semiconductor layer, and a control nate formed on the charge storage layer, wherein said charge storage layer of said memory cell is at least partially situated within the recess formed on the sidewall of the island-like semiconductor layer, and wherein the control gates of memory cells are arranged adjacently so that channel layers of the memory cells are electrically connected.

36. The semiconductor memory of claim 35, further comprising at least one selection gate transistor including a selection gate, wherein the selection gate is situated on the sidewall of the island-like semiconductor layer of one or more memory cells in at least an area where the recess is not formed.

37. The semiconductor memory of claim 35, further comprising at least one selection gate transistor including a selection gate, wherein the selection gate is situated over another recess on the sidewall of the island-like semiconductor layer of one or more memory cells.

38. A semiconductor memory comprising:

a first conductivity type semiconductor substrate;

an island-like semiconductor layer including at least first and second spaced apart recesses on a sidewall thereof;

first and second memory cells each comprising a charge storage layer formed to entirely or partially laterally surround the sidewall of the island-like semiconductor layer, and a control gate formed on the charge storage layer; and wherein said charge storage layer of said first memory cell is at least partially situated within the first recess formed on the sidewall of the island-like semiconductor layer, and said charge storage layer of said second memory cell is at least partially situated within the second recess formed on the sidewall of the island-like semiconductor layer.

39. The semiconductor memory of claim 38, wherein the control gate of said first memory cell is at least partially situated within the first recess formed on the sidewall of the island-like semiconductor layer.

40. The semiconductor memory of claim 38, wherein the memory comprises an BEPROM.

41. The semiconductor memory of claim 38, wherein a second conductivity type impurity diffusion layer, or said second conductivity type impurity diffusion layer and a first conductivity type impurity diffusion layer formed in said second conductivity type impurity diffusion layer is/are formed to entirely or partially encircle the sidewall of the island-like semiconductor layer in self-alignment with the charge storage layer of at least one of the memory cells so that channel layers of memory cells are electrically connected to each other.

42. A semiconductor memory comprising:

a first conductivity type semiconductor substrate;

at least one memory cell comprising an island-like semiconductor layer having a recess on a sidewall thereof, a charge storage layer formed to entirely or partially laterally surround a sidewall of the island-like semiconductor layer, and a control gate formed on the charge storage layer;

wherein said recess is defined by upper and lower laterally extending walls which extend outwardly from a central portion of the island-like semiconductor layer, and wherein said upper wall of the recess is located vertically below and spaced apart from a drain diffusion layer formed in said island-like semiconductor layer, and said lower wall of the recess is located vertically above a selection gate of a selection transistor, said selection gate being located between said semiconductor substrate and said charge storage layer of the memory cell; and wherein said charge storage layer of the memory cell is at least partially situated within the recess defined by the upper and lower walls that are formed on the sidewall of the island-like semiconductor layer.

43. The semiconductor memory of claim 42, wherein the control gate of said memory cell is at least partially situated within the recess formed on the sidewall of the island-like semiconductor layer.

44. The semiconductor memory of claim 42, wherein the memory comprises an EEPROM.

45. The semiconductor memory of claim 42, wherein a second conductivity type impurity diffusion layer, or said second conductivity type impurity diffusion layer and a first conductivity type impurity diffusion layer formed in said second conductivity type impurity diffusion layer is/are formed to entirely or partially encircle the sidewall of the island-like semiconductor layer in self-alignment with the charge storage layer of the memory cell so that channel layers of memory cells are electrically connected to each other.

46. The semiconductor memory of claim 42, wherein a plurality of memory cells are formed with regard to the island-like semiconductor layer and the memory cells are arranged in series.

* * * * *